US011159166B2

(12) United States Patent
Lee et al.

(10) Patent No.: US 11,159,166 B2
(45) Date of Patent: Oct. 26, 2021

(54) LOGIC DRIVE USING STANDARD COMMODITY PROGRAMMABLE LOGIC IC CHIPS COMPRISING NON-VOLATILE RANDOM ACCESS MEMORY CELLS

(71) Applicant: iCometrue Company Ltd., Zhubei (TW)

(72) Inventors: Jin-Yuan Lee, Hsinchu (TW); Mou-Shiung Lin, Hsinchu (TW)

(73) Assignee: iCometrue Company Ltd., Hsin-Chu County (TW)

( * ) Notice: Subject to any disclaimer, the term of this patent is extended or adjusted under 35 U.S.C. 154(b) by 0 days.

(21) Appl. No.: 16/817,676

(22) Filed: Mar. 13, 2020

(65) Prior Publication Data

US 2020/0212914 A1 Jul. 2, 2020

Related U.S. Application Data

(63) Continuation of application No. 16/253,206, filed on Jan. 21, 2019, now Pat. No. 10,608,642.

(Continued)

(51) Int. Cl.
*H03K 19/177* (2020.01)
*H01L 25/00* (2006.01)

(Continued)

(52) U.S. Cl.
CPC ...... *H03K 19/1776* (2013.01); *G11C 11/1673* (2013.01); *G11C 11/412* (2013.01); *G11C 11/419* (2013.01); *G11C 13/004* (2013.01); *G11C 13/0007* (2013.01); *G11C 13/0038* (2013.01); *G11C 14/009* (2013.01); *G11C 14/0081* (2013.01); *H01L 23/49811* (2013.01); *H01L 23/5386* (2013.01); *H01L 24/13* (2013.01); *H01L 24/16* (2013.01); *H01L 25/18* (2013.01); *H01L 27/11* (2013.01);

(Continued)

(58) Field of Classification Search
None
See application file for complete search history.

(56) References Cited

U.S. PATENT DOCUMENTS

| | | |
|---|---|---|
| 4,870,302 A | 9/1989 | Freeman |
| 5,272,368 A | 12/1993 | Turner et al. |

(Continued)

FOREIGN PATENT DOCUMENTS

| | | |
|---|---|---|
| CN | 103681367 | 3/2014 |
| CN | 105745752 | 7/2016 |

(Continued)

*Primary Examiner* — Anh Q Tran

(57) ABSTRACT

A field-programmable-gate-array (FPGA) integrated-circuit (IC) chip configured to perform a logic function based on a look-up table (LUT), includes: multiple non-volatile memory cells therein configured to store multiple resulting values of the look-up table (LUT); and a programmable logic block therein having multiple static-random-access-memory (SRAM) cells configured to store the resulting values passed from the non-volatile memory cells, wherein the programmable logic block is configured to select, in accordance with one of the combinations of its inputs, one from the resulting values stored in the static-random-access-memory (SRAM) cells into its output.

43 Claims, 217 Drawing Sheets

159

Related U.S. Application Data

(60) Provisional application No. 62/755,415, filed on Nov. 2, 2018, provisional application No. 62/729,527, filed on Sep. 11, 2018, provisional application No. 62/675,785, filed on May 24, 2018, provisional application No. 62/630,369, filed on Feb. 14, 2018, provisional application No. 62/624,825, filed on Feb. 1, 2018.

(51) Int. Cl.

| | |
|---|---|
| ***H03K 19/1776*** | (2020.01) |
| ***H03K 19/0948*** | (2006.01) |
| ***H01L 25/18*** | (2006.01) |
| ***H01L 27/24*** | (2006.01) |
| ***H01L 27/22*** | (2006.01) |
| ***G11C 11/412*** | (2006.01) |
| ***G11C 11/16*** | (2006.01) |
| ***H01L 23/538*** | (2006.01) |
| ***H01L 23/00*** | (2006.01) |
| ***G11C 11/419*** | (2006.01) |
| ***H03K 19/20*** | (2006.01) |
| ***H03K 19/173*** | (2006.01) |
| ***H01L 45/00*** | (2006.01) |
| ***G11C 13/00*** | (2006.01) |
| ***G11C 14/00*** | (2006.01) |
| ***H03K 19/17728*** | (2020.01) |
| ***H01L 27/11*** | (2006.01) |
| ***H01L 23/498*** | (2006.01) |
| *H03K 19/21* | (2006.01) |

(52) U.S. Cl.

CPC ........ *H01L 27/1112* (2013.01); *H01L 27/222* (2013.01); *H01L 27/224* (2013.01); *H01L 27/24* (2013.01); *H01L 27/2409* (2013.01); *H01L 27/2436* (2013.01); *H01L 27/2463* (2013.01); *H01L 45/1233* (2013.01); *H01L 45/1253* (2013.01); *H01L 45/146* (2013.01); *H03K 19/0948* (2013.01); *H03K 19/1737* (2013.01); *H03K 19/17728* (2013.01); *H03K 19/20* (2013.01); *G11C 2213/15* (2013.01); *H01L 2224/13023* (2013.01); *H01L 2224/13024* (2013.01); *H01L 2224/13082* (2013.01); *H01L 2224/13147* (2013.01); *H01L 2224/16227* (2013.01); *H01L 2224/16238* (2013.01); *H01L 2224/73204* (2013.01); *H01L 2224/81005* (2013.01); *H01L 2224/81191* (2013.01); *H01L 2224/81447* (2013.01); *H01L 2224/83104* (2013.01); *H01L 2224/92225* (2013.01); *H01L 2224/97* (2013.01); *H01L 2924/1431* (2013.01); *H01L 2924/1436* (2013.01); *H01L 2924/1437* (2013.01); *H01L 2924/1443* (2013.01); *H03K 19/21* (2013.01)

(56) References Cited

U.S. PATENT DOCUMENTS

| | | | |
|---|---|---|---|
| 5,587,603 | A | 12/1996 | Kowshik |
| 6,020,633 | A | 2/2000 | Erikson |
| 6,356,478 | B1 | 3/2002 | McCollum |
| 6,388,466 | B1 | 5/2002 | Wittig et al. |
| 6,687,167 | B2 | 2/2004 | Guaitini et al. |
| 6,798,240 | B1 | 9/2004 | Pedersen |
| 6,812,086 | B2 | 11/2004 | Cai |
| 6,828,823 | B1 | 12/2004 | Tsui |
| 6,943,580 | B2 | 9/2005 | Lewis et al. |
| 6,998,872 | B1 | 2/2006 | Chirania et al. |
| 7,030,652 | B1 | 4/2006 | Lewis et al. |
| 7,061,271 | B1 | 6/2006 | Young et al. |
| 7,193,433 | B1 | 3/2007 | Young |
| 7,219,237 | B1 | 5/2007 | Trimberger |
| 7,366,306 | B1 | 4/2008 | Trimberger |
| 7,385,417 | B1 | 6/2008 | Agrawal et al. |
| 7,420,390 | B1 | 9/2008 | Hutton et al. |
| 7,550,994 | B1 | 6/2009 | Camarota |
| 7,598,555 | B1 | 10/2009 | Papworth Parkin |
| 7,653,891 | B1 | 1/2010 | Anderson et al. |
| 7,747,025 | B1 | 6/2010 | Trimberger |
| 7,853,799 | B1 | 12/2010 | Trimberger |
| 7,933,140 | B2 | 4/2011 | Wang et al. |
| 7,944,231 | B2 | 5/2011 | Javerliac |
| 7,948,266 | B2 | 5/2011 | Schmit et al. |
| 7,973,556 | B1 | 7/2011 | Noguera Serra et al. |
| 8,064,224 | B2 | 11/2011 | Mahajan et al. |
| 8,159,268 | B1 | 4/2012 | Madurawe |
| 8,243,527 | B2 | 8/2012 | Hung et al. |
| 8,354,297 | B2 | 1/2013 | Pagaila et al. |
| 8,378,407 | B2 | 2/2013 | Audzeyeu et al. |
| 8,531,032 | B2 | 9/2013 | Yu et al. |
| 8,546,955 | B1 | 10/2013 | Wu |
| 8,592,886 | B2 | 11/2013 | Hsu et al. |
| 8,709,865 | B2 | 4/2014 | Hu et al. |
| 8,742,579 | B2 | 6/2014 | Pagaila et al. |
| 8,786,060 | B2 | 7/2014 | Yen et al. |
| 8,796,137 | B2 | 8/2014 | Pagaila et al. |
| 8,866,292 | B2 | 10/2014 | Beer et al. |
| 8,872,349 | B2 | 10/2014 | Chiu et al. |
| 8,878,360 | B2 | 11/2014 | Meyer et al. |
| 8,883,561 | B2 | 11/2014 | Park et al. |
| 8,885,334 | B1 | 11/2014 | Baxter |
| 8,895,440 | B2 | 11/2014 | Choi et al. |
| 8,912,822 | B2 | 12/2014 | Yasuda |
| 8,916,421 | B2 | 12/2014 | Gong et al. |
| 8,941,230 | B2 | 1/2015 | Kyozuka et al. |
| 8,952,489 | B2 | 2/2015 | Elian et al. |
| 8,952,521 | B2 | 2/2015 | Wojnowski et al. |
| 8,987,918 | B2 | 3/2015 | Razdan et al. |
| 8,993,377 | B2 | 3/2015 | Koo et al. |
| 9,003,221 | B1 | 4/2015 | Abugharbieh et al. |
| 9,082,806 | B2 | 7/2015 | Lin et al. |
| 9,106,229 | B1 | 8/2015 | Hutton |
| 9,135,185 | B2 | 9/2015 | Loh et al. |
| 9,147,638 | B2 | 9/2015 | Liu et al. |
| 9,224,647 | B2 | 12/2015 | Koo et al. |
| 9,225,512 | B1 | 12/2015 | Trimberger |
| 9,263,370 | B2 | 2/2016 | Shenoy et al. |
| 9,281,292 | B2 | 3/2016 | Hu et al. |
| 9,324,672 | B2 | 4/2016 | Pagaila et al. |
| 9,331,060 | B2 | 5/2016 | Otremba et al. |
| 9,343,442 | B2 | 5/2016 | Chen et al. |
| 9,349,713 | B2 | 5/2016 | Kim et al. |
| 9,362,187 | B2 | 6/2016 | Ossimitz |
| 9,385,006 | B2 | 7/2016 | Lin |
| 9,385,009 | B2 | 7/2016 | Lin et al. |
| 9,385,105 | B2 | 7/2016 | Meyer et al. |
| 9,396,998 | B2 | 7/2016 | Kurita et al. |
| 9,397,050 | B2 | 7/2016 | Shin et al. |
| 9,406,619 | B2 | 8/2016 | Pagaila et al. |
| 9,406,658 | B2 | 8/2016 | Lee et al. |
| 9,437,260 | B2 | 9/2016 | Prenat et al. |
| 9,449,930 | B2 | 9/2016 | Kim et al. |
| 9,508,626 | B2 | 11/2016 | Pagaila et al. |
| 9,524,955 | B2 | 12/2016 | Huang et al. |
| 9,543,276 | B2 | 1/2017 | Jee et al. |
| 9,583,431 | B1 * | 2/2017 | Rahman ................ G06F 30/394 |
| 9,593,009 | B2 | 3/2017 | Fuergut et al. |
| 9,627,365 | B1 | 4/2017 | Yu et al. |
| 9,640,259 | B2 | 5/2017 | Li et al. |
| 9,679,863 | B2 | 6/2017 | Lin et al. |
| 9,704,843 | B2 | 7/2017 | Kilger et al. |
| 9,735,113 | B2 | 8/2017 | Chi et al. |
| 9,763,329 | B1 | 9/2017 | Mason |
| 9,773,757 | B2 | 9/2017 | Yu et al. |
| 9,806,058 | B2 | 10/2017 | Wei et al. |
| 9,812,337 | B2 | 11/2017 | Chen et al. |
| 9,818,720 | B2 | 11/2017 | Wei et al. |
| 9,831,148 | B2 | 11/2017 | Yu et al. |

(56) References Cited

U.S. PATENT DOCUMENTS 9,859,896 B1 1/2018 Gaide et al.
9,881,850 B2 1/2018 Yu et al.
9,887,206 B2 2/2018 Su et al.
9,899,248 B2 2/2018 Yu et al.
9,899,355 B2 2/2018 Yuan et al.
9,935,113 B2 4/2018 Wu et al.
9,966,325 B2 5/2018 Beyne
9,997,464 B2 6/2018 Hsieh et al.
10,015,916 B1 7/2018 Karp
10,026,681 B2 7/2018 Ko et al.
10,033,383 B1 7/2018 Richter et al.
10,037,963 B2 7/2018 Chen et al.
10,043,768 B2 8/2018 Meyer et al.
10,056,351 B2 * 8/2018 Yu .................... H01L 21/76885
10,056,907 B1 8/2018 Asnaashari
10,062,648 B2 8/2018 Hsieh et al.
10,062,651 B2 8/2018 Liang et al.
10,079,243 B2 9/2018 Ramkumar
10,109,588 B2 10/2018 Jeong et al.
10,109,617 B2 11/2018 Sugiyama et al.
10,153,222 B2 12/2018 Yu et al.
10,153,239 B2 12/2018 Wang et al.
10,157,828 B2 12/2018 Hsu et al.
10,157,849 B2 12/2018 Huang et al.
10,162,139 B1 12/2018 Wang et al.
10,163,802 B2 12/2018 Lin et al.
10,177,188 B2 1/2019 Kang et al.
10,204,684 B2 2/2019 Widjaja
10,211,070 B2 2/2019 Lee et al.
10,211,182 B2 2/2019 Meyer et al.
10,256,219 B2 4/2019 Chew
10,290,611 B2 5/2019 Yu et al.
10,325,882 B2 6/2019 Kang et al.
10,333,623 B1 6/2019 Liao et al.
10,340,249 B1 7/2019 Yu et al.
10,373,885 B2 8/2019 Yu et al.
10,419,001 B2 9/2019 Jo et al.
10,431,536 B2 10/2019 Kim et al.
10,447,274 B2 10/2019 Lee et al.
10,490,521 B2 11/2019 Hu et al.
10,490,540 B2 11/2019 Yu et al.
10,504,835 B1 12/2019 Wang et al.
10,510,634 B2 12/2019 Lin et al.
10,510,650 B2 12/2019 Yu et al.
10,522,449 B2 12/2019 Chen et al.
10,541,227 B2 1/2020 Yeh et al.
10,541,228 B2 1/2020 Chen et al.
10,622,321 B2 4/2020 Yu et al.
10,784,248 B2 9/2020 Yu et al.
10,797,031 B2 10/2020 Liao et al.
10,892,011 B2 1/2021 Lin et al.
2001/0045844 A1 11/2001 New et al.
2003/0122578 A1 7/2003 Masui et al.
2004/0041584 A1 3/2004 Sunaga et al.
2004/0145850 A1 7/2004 Fukumoto
2004/0222817 A1 11/2004 Madurawe
2005/0218929 A1 10/2005 Wang et al.
2007/0166912 A1 7/2007 Fenigstein et al.
2007/0279987 A1 12/2007 Fang et al.
2009/0114971 A1 5/2009 Cai et al.
2009/0243650 A1 10/2009 Madurawe
2009/0243652 A1 10/2009 Dorairaj et al.
2009/0267238 A1 10/2009 Joseph
2010/0039136 A1 2/2010 Chua-Eoan et al.
2010/0157669 A1 6/2010 Audzeyeu
2010/0283085 A1 11/2010 Bemanian
2011/0026232 A1 * 2/2011 Lin ...................... H01L 23/481
361/760
2011/0221470 A1 9/2011 Javerliac et al.
2012/0193785 A1 8/2012 Lin et al.
2012/0217549 A1 8/2012 Widjaja
2013/0257477 A1 10/2013 Yasuda et al.
2014/0017882 A1 1/2014 Lei
2014/0070403 A1 3/2014 Pan et al.
2014/0131858 A1 5/2014 Pan et al.
2014/0210097 A1 7/2014 Chen
2014/0254232 A1 9/2014 Wu
2014/0302659 A1 10/2014 Phatak
2015/0008957 A1 1/2015 Olgiati et al.
2015/0014844 A1 1/2015 Wu et al.
2015/0116965 A1 4/2015 Kim et al.
2015/0327367 A1 11/2015 Shen
2016/0118390 A1 4/2016 Liaw
2016/0133571 A1 5/2016 Lee et al.
2016/0173101 A1 6/2016 Gao et al.
2016/0190113 A1 6/2016 Sharan et al.
2016/0217835 A1 7/2016 Blott et al.
2016/0351626 A1 12/2016 McCollum
2016/0372449 A1 12/2016 Rusu et al.
2017/0301650 A1 10/2017 Yu
2018/0053730 A1 2/2018 Shao
2018/0061742 A1 3/2018 Ananiev
2018/0076179 A1 3/2018 Hsu et al.
2018/0102776 A1 4/2018 Chandrasekar et al.
2018/0150667 A1 5/2018 Yu et al.
2018/0151477 A1 5/2018 Yu et al.
2018/0151501 A1 5/2018 Yu et al.
2018/0158746 A1 6/2018 Lin
2018/0165396 A1 6/2018 Lin et al.
2018/0174865 A1 6/2018 Yu et al.
2018/0204810 A1 7/2018 Yu et al.
2018/0204828 A1 7/2018 Yu et al.
2018/0226349 A1 8/2018 Yu et al.
2018/0247905 A1 8/2018 Yu et al.
2018/0269188 A1 9/2018 Yu et al.
2018/0275193 A1 9/2018 Rouge et al.
2018/0284186 A1 10/2018 Chadha
2018/0286776 A1 10/2018 Yu et al.
2018/0301351 A1 10/2018 Yu et al.
2018/0301376 A1 10/2018 Shih et al.
2018/0350629 A1 12/2018 Liu et al.
2018/0350763 A1 12/2018 Yu et al.
2018/0358312 A1 12/2018 Yu et al.
2018/0374824 A1 12/2018 Yu et al.
2019/0013276 A1 1/2019 Lee et al.
2019/0019756 A1 1/2019 Yu et al.
2019/0020343 A1 1/2019 Lee et al.
2019/0051641 A1 2/2019 Lee et al.
2019/0057932 A1 2/2019 Wu et al.
2019/0097304 A1 3/2019 Hsiao et al.
2019/0221547 A1 7/2019 Drab et al.
2019/0238134 A1 8/2019 Lee et al.
2019/0238135 A1 8/2019 Lin et al.
2019/0245543 A1 8/2019 Lee et al.
2019/0253056 A1 8/2019 Lin et al.
2019/0304803 A1 10/2019 Hu et al.
2019/0333871 A1 10/2019 Chen et al.
2019/0347790 A1 11/2019 Lee et al.
2019/0363715 A1 11/2019 Lee et al.
2019/0372574 A1 12/2019 Lee et al.
2020/0058617 A1 2/2020 Wu et al.

FOREIGN PATENT DOCUMENTS

WO WO00/36748 6/2000
WO WO2005010976 2/2005
WO WO2016160063 10/2016

* cited by examiner

211

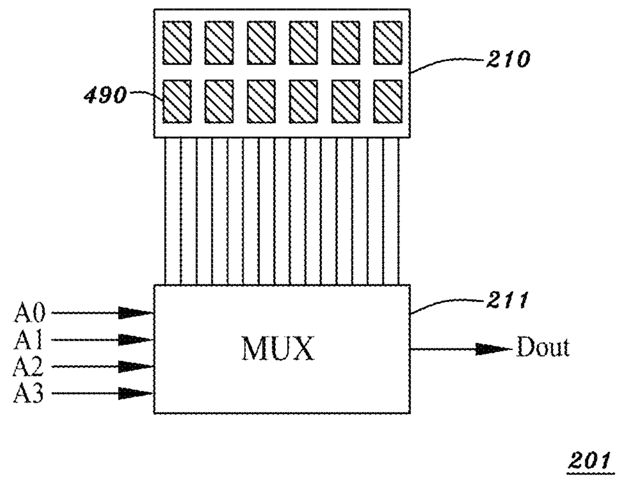
Fig. 6A
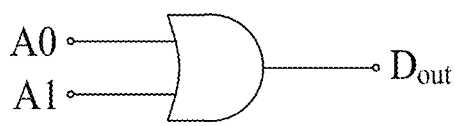
Fig. 6B
| A0 | A1 | Dout | |
|---|---|---|---|
| 0 | 0 | 0 | D0 |
| 0 | 1 | 1 | D1 |
| 1 | 0 | 1 | D2 |
| 1 | 1 | 1 | D3 |
Fig. 6C

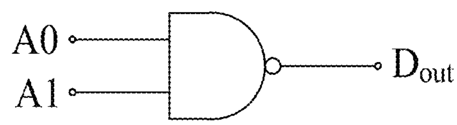
Fig. 6D
| A0 | A1 | Dout | |
|---|---|---|---|
| 0 | 0 | 1 | D0 |
| 0 | 1 | 1 | D1 |
| 1 | 0 | 1 | D2 |
| 1 | 1 | 0 | D3 |
Fig. 6E
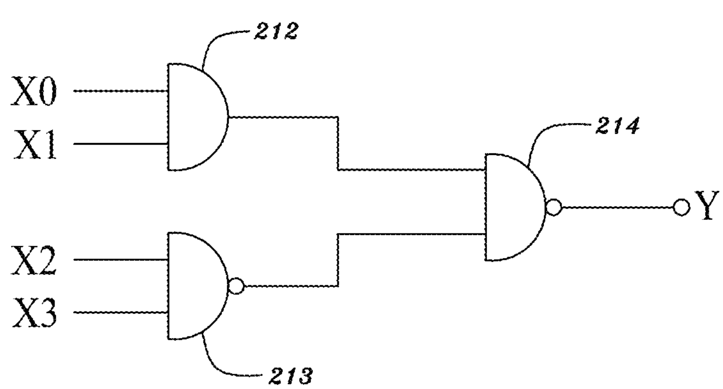
Fig. 6F

| Input | | | | Onput | |
|---|---|---|---|---|---|
| A0 | A1 | A2 | A3 | Dout | |
| 0 | 0 | 0 | 0 | 1 | D0 |
| 0 | 0 | 0 | 1 | 1 | D1 |
| 0 | 0 | 1 | 0 | 1 | D2 |
| 0 | 0 | 1 | 1 | 1 | D3 |
| 0 | 1 | 0 | 0 | 1 | D4 |
| 0 | 1 | 0 | 1 | 1 | D5 |
| 0 | 1 | 1 | 0 | 1 | D6 |
| 0 | 1 | 1 | 1 | 1 | D7 |
| 1 | 0 | 0 | 0 | 1 | D8 |
| 1 | 0 | 0 | 1 | 1 | D9 |
| 1 | 0 | 1 | 0 | 1 | D10 |
| 1 | 0 | 1 | 1 | 1 | D11 |
| 1 | 1 | 0 | 0 | 0 | D12 |
| 1 | 1 | 0 | 1 | 0 | D13 |
| 1 | 1 | 1 | 0 | 0 | D14 |
| 1 | 1 | 1 | 1 | 1 | D15 |

| Input | | | | Output | | | | |
|---|---|---|---|---|---|---|---|---|
| A1 | A0 x | A3 | A2 | Dout C3 | C2 | C1 | C0 | |
| 0 | 0 | 0 | 0 | 0 | 0 | 0 | 0 | D0 |
| 0 | 0 | 0 | 1 | 0 | 0 | 0 | 0 | D1 |
| 0 | 0 | 1 | 0 | 0 | 0 | 0 | 0 | D2 |
| 0 | 0 | 1 | 1 | 0 | 0 | 0 | 0 | D3 |
| 0 | 1 | 0 | 0 | 0 | 0 | 0 | 0 | D4 |
| 0 | 1 | 0 | 1 | 0 | 0 | 0 | 1 | D5 |
| 0 | 1 | 1 | 0 | 0 | 0 | 1 | 0 | D6 |
| 0 | 1 | 1 | 1 | 0 | 0 | 1 | 1 | D7 |
| 1 | 0 | 0 | 0 | 0 | 0 | 0 | 0 | D8 |
| 1 | 0 | 0 | 1 | 0 | 0 | 1 | 0 | D9 |
| 1 | 0 | 1 | 0 | 0 | 1 | 0 | 0 | D10 |
| 1 | 0 | 1 | 1 | 0 | 1 | 1 | 0 | D11 |
| 1 | 1 | 0 | 0 | 0 | 0 | 0 | 0 | D12 |
| 1 | 1 | 0 | 1 | 0 | 0 | 1 | 1 | D13 |
| 1 | 1 | 1 | 0 | 0 | 1 | 1 | 0 | D14 |
| 1 | 1 | 1 | 1 | 1 | 0 | 0 | 1 | D15 |

Fig. 6I

LOGIC DRIVE USING STANDARD COMMODITY PROGRAMMABLE LOGIC IC CHIPS COMPRISING NON-VOLATILE RANDOM ACCESS MEMORY CELLS

PRIORITY CLAIM

This application is a continuation of application Ser. No. 16/253,206, filed Jan. 21, 2019, now U.S. Pat. No. 10,608,642, which claims priority benefits from U.S. provisional application No. 62/624,825, filed on Feb. 1, 2018 and entitled "LOGIC DRIVE BASED ON STANDARD COMMODITY FPGA IC CHIPS"; U.S. provisional application No. 62/630,369, filed on Feb. 14, 2018 and entitled "LOGIC DRIVE WITH BRAIN-LIKE PLASTICITY AND INTEGRALITY"; U.S. provisional application No. 62/675,785, filed on May 24, 2018 and entitled "LOGIC DRIVE WITH BRAIN-LIKE ELASTICITY AND INTEGRALITY"; U.S. provisional application No. 62/729,527, filed on Sep. 11, 2018 and entitled "LOGIC DRIVE WITH BRAIN-LIKE ELASTICITY AND INTEGRALITY USING STANDARD COMMODITY PROGRAMMABLE LOGIC IC CHIPS"; and U.S. provisional application No. 62/755,415, filed on Nov. 2, 2018 and entitled "LOGIC DRIVE BASED ON STANDARDIZED COMMODITY PROGRAMMABLE LOGIC/MEMORY SEMICONDUCTOR IC CHIP SCALE PACKAGES". The present application incorporates the foregoing disclosures herein by reference.

BACKGROUND OF THE DISCLOSURE

Field of the Disclosure

The present invention relates to a logic package, logic package drive, logic device, logic module, logic drive, logic disk, logic disk drive, logic solid-state disk, logic solid-state drive, Field Programmable Gate Array (FPGA) logic disk, or FPGA logic drive (to be abbreviated as "logic drive" below, that is when "logic drive" is mentioned below, it means and reads as "logic package, logic package drive, logic device, logic module, logic drive, logic disk, logic disk drive, logic solid-state disk, logic solid-state drive, FPGA logic disk, or FPGA logic drive") comprising plural FPGA IC chips for field programming purposes, and more particularly to a standardized commodity logic drive formed by using plural standardized commodity FPGA IC chips comprising non-volatile random access memory cells, and to be used for different specific applications when field programmed or user programmed.

Brief Description of the Related Art

The Field Programmable Gate Array (FPGA) semiconductor integrated circuit (IC) has been used for development of new or innovated applications, or for small volume applications or business demands. When an application or business demand expands to a certain volume and extends to a certain time period, the semiconductor IC supplier may usually implement the application in an Application Specific IC (ASIC) chip, or a Customer-Owned Tooling (COT) IC chip. The switch from the FPGA design to the ASIC or COT design is because the current FPGA IC chip, for a given application and compared with an ASIC or COT chip, (1) has a larger semiconductor chip size, lower fabrication yield, and higher fabrication cost, (2) consumes more power, (3) gives lower performance. When the semiconductor technology nodes or generations migrates, following the Moore's Law, to advanced nodes or generations (for example below 20 nm), the Non-Recurring Engineering (NRE) cost for designing an ASIC or COT chip increases greatly (more than US $5M or even exceeding US $10M, US $20M, US $50M or US $100M), FIG. 42. The cost of a photo mask set for an ASIC or COT chip at the 16 nm technology node or generation may be over US $2M, US $5M, or US $10M. The high NRE cost in implementing the innovation and/or application using the advanced IC technology nodes or generations slows down or even stops the innovation and/or application using advanced and useful semiconductor technology nodes or generations. A new approach or technology is needed to inspire the continuing innovation and to lower down the barrier for implementing the innovation in the semiconductor IC chips.

SUMMARY OF THE DISCLOSURE

One aspect of the disclosure provides a standardized commodity logic drive in a multi-chip package comprising plural FPGA IC chips for use in different algorithms, architectures and/or applications requiring logic, computing and/or processing functions by field programming. Uses of the standardized commodity logic drive is analogues to uses of a standardized commodity data storage solid-state disk (drive), data storage hard disk (drive), data storage floppy disk, Universal Serial Bus (USB) flash drive, USB drive, USB stick, flash-disk, or USB memory, and differs in that the latter has memory functions for data storage, while the former has logic functions for processing and/or computing.

Another aspect of the disclosure provides a method to reduce Non-Recurring Engineering (NRE) expenses for implementing an innovation and/or an innovation, accelerating workload processing or an application in semiconductor IC chips by using the standardized commodity logic drive, FIG. 42. A person, user, or developer with an innovation and/or an application concept or idea or an aim for accelerating workload processing needs to purchase the standardized commodity logic drive and develops or writes software codes or programs to load into the standardized commodity logic drive to implement his/her innovation and/or application concept or idea; wherein said innovation and/or application (maybe abbreviated as innovation) comprises (i) innovative algorithms and/or architectures of computing, processing, learning and/or inferencing, and/or (ii) innovative and/or specific applications. Compared to the implementation by developing a logic ASIC or COT IC chip, the NRE cost may be reduced by a factor of larger than 2, 5, or 10. For advanced semiconductor technology nodes or generations (for example more advanced than or below 20 nm), the NRE cost for designing an ASIC or COT chip increases greatly, more than US $5M or even exceeding US $10M, US $20M, US $50M, or US $100M. The cost of a photo mask set for an ASIC or COT chip at the 16 nm technology node or generation may be over US $2M, US $5M, or US $10M. Implementing the same or similar innovation and/or application using the logic drive may reduce the NRE cost down to smaller than US $10M or even less than US $5M, US $3M, US $2M or US $1M. The aspect of the disclosure inspires the innovation and lowers the barrier for implementing the innovation in IC chips designed and fabricated using an advanced IC technology node or generation, for example, a technology node or generation more advanced than or below 20 nm or 10 nm.

Another aspect of the disclosure provides a method to change the current logic ASIC or COT IC chip business into a commodity logic IC chip business, like the current commodity DRAM, or commodity NAND flash memory IC chip business, by using the standardized commodity logic drive. Since the performance, power consumption, and engineering and manufacturing costs of the standardized commodity logic drive may be better or equal to that of the ASIC or COT IC chip for a same innovation (algorithms, architectures and/or applications) or an aim for accelerating workload processing, the standardized commodity logic drive may be used as an alternative for designing an ASIC or COT IC chip. The current logic ASIC or COT IC chip design, manufacturing and/or product companies (including fabless IC design and product companies, IC foundry or contracted manufactures (may be product-less), and/or vertically-integrated IC design, manufacturing and product companies) may become companies like the current commodity DRAM, or flash memory IC chip design, manufacturing, and/or product companies; or like the current DRAM module design, manufacturing, and/or product companies; or like the current flash memory module, flash USB stick or drive, or flash solid-state drive or disk drive design, manufacturing, and/or product companies. The current logic ASIC or COT IC chip design and/or manufacturing companies (including fabless IC design and product companies, IC foundry or contracted manufactures (may be product-less), vertically-integrated IC design, manufacturing and product companies) may become companies in the following business models: (1) designing, manufacturing, and/or selling the standard commodity FPGA IC chips; and/or (2) designing, manufacture, and/or selling the standard commodity logic drives. A person, user, customer, or software developer, or algorithm/architecture/application developer may purchase the standardized commodity logic drive and write software codes to program them for his/her desired algorithms, architectures and/or applications, for example, in algorithms, architectures and/or applications of Artificial Intelligence (AI), machine learning, deep learning, big data, Internet Of Things (IOT), Virtual Reality (VR), Augmented Reality (AR), car electronics, Graphic Processing (GP), Digital Signal Processing (DSP), Micro Controlling (MC), and/or Central Processing (CP). The logic drive may be programed to perform functions like a graphic chip, or a baseband chip, or an Ethernet chip, or a wireless (for example, 802.11ac) chip, or an AI chip. The logic drive may be alternatively programmed to perform functions of all or any combinations of functions of Artificial Intelligence (AI), machine learning, deep learning, big data, Internet Of Things (IOT), Virtual Reality (VR), Augmented Reality (AR), car electronics, Graphic Processing (GP), Digital Signal Processing (DSP), Micro Controlling (MC), and/or Central Processing (CP). The logic drive may be field programmed as an accelerator for, for example, the AI functions, in the user-end, data center or cloud, in the algorithms, architectures and/or applications of training and/or inferring of the AI functions.

Another aspect of the disclosure provides a method to change the current logic ASIC or COT IC chip hardware business into a software business by using the standardized commodity logic drive. Since the performance, power consumption, and engineering and manufacturing costs of the standardized commodity logic drive may be better or equal to that of the ASIC or COT IC chip for a same innovation (algorithms, architectures and/or applications) or an aim for accelerating workload processing, the standardized commodity logic drive may be used as an alternative for designing an ASIC or COT IC chip. The current ASIC or COT IC chip design companies or suppliers may become software developers or suppliers; they may adapt the following business models: (1) become software companies to develop and sell software for their innovation (algorithms, architectures and/or applications), and let their customers or users to install software in the customers' or users' own standard commodity logic drive; and/or (2) still hardware companies by selling hardware without performing ASIC or COT IC chip design and/or production. They may install their in-house developed software for the innovation (algorithms, architectures and/or applications) in one or plural non-volatile memory IC chip or chips in the purchased standard commodity logic drive, or in the non-volatile Random-Access-Memory cells (NVRAM) of the FPGA chips in the logic drive; and sell the program-installed logic drive to their customers or users. They may write software codes into the standard commodity logic drive (that is, loading the software codes in the non-volatile memory IC chip or chips in or of the standardized commodity logic drive, or in the NVRAM cells of the FPGA chips in the logic drive) for their desired algorithms, architectures and/or applications, for example, in algorithms, architectures and/or applications of Artificial Intelligence (AI), machine learning, deep learning, big data, Internet Of Things (IOT), car electronics, Virtual Reality (VR), Augmented Reality (AR), Graphic Processing, Digital Signal Processing, micro controlling, and/or Central Processing. The logic drive may be programed to perform functions like a graphic chip, or a baseband chip, or an Ethernet chip, or a wireless (for example, 802.11ac) chip, or an AI chip. The logic drive may be alternatively programmed to perform functions of all or any combinations of functions of Artificial Intelligence (AI), machine learning, deep learning, big data, Internet Of Things (IOT), car electronics, Virtual Reality (VR), Augmented Reality (AR), car electronics, Graphic Processing (GP), Digital Signal Processing (DSP), Micro Controlling (MC), and/or Central Processing (CP).

Another aspect of the disclosure provides a method to change the current logic ASIC or COT IC chip hardware business into a network business by using the standardized commodity logic drive. Since the performance, power consumption, and engineering and manufacturing costs of the standardized commodity logic drive may be better or equal to that of the ASIC or COT IC chip for a same innovation and/or application or an aim for accelerating workload processing, the standardized commodity logic drive may be used as an alternative for designing an ASIC or COT IC chip. The commodity logic drive comprising standard commodity FPGA chips may be used in a data center or cloud in networks for innovation and/or application or an aim for accelerating workload processing. The commodity logic drive attached to or in the networks may serve to implement and accelerate user's innovation or applications with functions of all or any combinations of functions of Artificial Intelligence (AI), machine learning, deep learning, big data, Internet Of Things (IOT), Virtual Reality (VR), Augmented Reality (AR), car electronics, Graphic Processing (GP), Video Streaming, Digital Signal Processing (DSP), Micro Controlling (MC), and/or Central Processing (CP). The commodity logic drive used in the data center or cloud in the networks offers FPGAs as an IaaS resource to cloud users. Using the commodity logic drive in the data center or cloud, users can rent FPGAs, similarly to renting Virtual Memories (VMs) in the data center or cloud. The commodity logic drive used in the data center or cloud is the Virtual Logics (VLs) just like Virtual Memories (VMs).

Another aspect of the disclosure provides a hardware (the logic drive) and a software (tool) for users or software developers, in addition to current hardware developers, to easily develop their innovated or specific applications by using the standardized commodity logic drive. The software tool provides capabilities for users or software developers to write software using popular, common, or easy-to-learn programming languages, for example, C, Java, C++, C #, Scala, Swift, Matlab, Assembly Language, Pascal, Python, Visual Basic, PL/SQL or JavaScript languages. The users, or software developers may write software codes into the standard commodity logic drive (that is, loading the software codes in the non-volatile memory cells in the one or more non-volatile IC chips in or of the standardized commodity logic drive, or in the non-volatile Random-Access-Memory cells (NVRAM) of the FPGA chips in the logic drive) for their desired applications, for example, in algorithms, architectures and/or applications of Artificial Intelligence (AI), machine learning, deep learning, big data, Internet Of Things (IOT), car electronics, Virtual Reality (VR), Augmented Reality (AR), Graphic Processing, Digital Signal Processing, micro controlling, and/or Central Processing. The logic drive may be programed to perform functions like a graphic chip, or a baseband chip, or an Ethernet chip, or a wireless (for example, 802.11ac) chip, or an AI chip. The logic drive may be alternatively programmed to perform functions of all or any combinations of functions of Artificial Intelligence (AI), machine learning, deep learning, big data, Internet Of Things (IOT), car electronics, Virtual Reality (VR), Augmented Reality (AR), car electronics, Graphic Processing (GP), Digital Signal Processing (DSP), Micro Controlling (MC), and/or Central Processing (CP).

Another aspect of the disclosure provides a method to change the current system design, manufactures and/or product business into a commodity system/product business, like current commodity DRAM, or NAND flash memory business, by using the standardized commodity logic drive. The system, computer, processor, smart-phone, or electronic equipment or device may become a standard commodity hardware comprises mainly a memory drive and a logic drive. The memory drive may be a hard disk drive, a flash drive, and/or a solid-state drive. The logic drive in the aspect of the disclosure may have big enough or adequate number of inputs/outputs (I/Os) to support I/O ports for used for programming all or most applications. The logic drive may have I/Os to support required I/O ports for programming, for example, to perform all or any combinations of functions of Artificial Intelligence (AI), machine learning, deep learning, big data, Internet Of Things (IOT), Virtual Reality (VR), Augmented Reality (AR), car electronics, Graphic Processing (GP), Digital Signal Processing (DSP), Micro Controlling (MC), and/or Central Processing (CP), and etc. The logic drive may comprise (1) programing or configuration I/Os for software, algorithm, architecture and/or application developers to load algorithm, architecture and/or application software or program codes to program or configure the logic drive, through I/O ports or connectors connecting or coupling to the I/Os of the logic drive; and (2) execution or user I/Os for the users to execute and perform their instructions, through I/O ports or connectors connecting or coupling to the I/Os of the logic drive; for example, generating a Microsoft Word file, or a PowerPoint presentation file, or an Excel file. The I/O ports or connectors connecting or coupling to the corresponding I/Os of the logic drive may comprise one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. The I/O ports or connectors connecting or coupling to the corresponding I/Os of the logic drive may also comprise Serial Advanced Technology Attachment (SATA) ports, or Peripheral Components Interconnect express (PCIe) ports for communicating, connecting or coupling with or to the memory drive. The I/O ports or connectors may be placed, located, assembled, or connected on or to a substrate, film or board; for example, a Printed Circuit Board (PCB), a silicon substrate with interconnection schemes, a metal substrate with interconnection schemes, a glass substrate with interconnection schemes, a ceramic substrate with interconnection schemes, a flexible film with interconnection schemes. The logic driver is assembled on the substrate, film or board using solder bumps, copper pillars or bumps, or gold bumps, on or of the logic drive, similar to the flip-chip assembly of the chip packaging technology, or the Chip-On-Film (COF) assembly technology used in the LCD driver packaging technology. The system, computer, processor, smart-phone, or electronic equipment or device design, manufacturing, and/or product companies may become companies to (1) design, manufacturing and/or sell the standard commodity hardware comprising a memory drive and a logic drive; in this case, the companies are still hardware companies; (2) develop system and algorithm, architecture and/or application software for users to install in the users' own standard commodity hardware; in this case, the companies become software companies; (3) install the third party's developed system and algorithm, architecture and/or application software or programs in the standard commodity hardware and sell the software-loaded hardware; (that is, loading the software codes in the non-volatile memory cells in the one or more non-volatile IC chips in or of the standardized commodity logic drive, or in the non-volatile Random-Access-Memory cells (NVRAM) of the FPGA chips of the logic drive) and in this case, the companies are still hardware companies.

Another aspect of the disclosure provides a standard commodity FPGA IC chip for use in the standard commodity logic drive. The standard commodity FPGA IC chip is designed, implemented and fabricated using an advanced semiconductor technology node or generation, for example more advanced than or equal to, or below or equal to 20 nm or 10 nm, and for example using the technology node of 16 nm, 14 nm, 12 nm, 10 nm, 7 nm, 5 nm or 3 nm; with a chip size and manufacturing yield optimized with the minimum manufacturing cost for the used semiconductor technology node or generation. The standard commodity FPGA IC chip may have an area between 400 $mm^2$ and 9 $mm^2$, 144 $mm^2$ and 16 $mm^2$, 75 $mm^2$ and 16 $mm^2$, or 50 $mm^2$ and 16 $mm^2$. Transistors used in the advanced semiconductor technology node or generation may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET. The standard commodity FPGA IC chip may only communicate directly with other chips in or of the logic drive only; its I/O circuits may require only small I/O drivers or receivers, and small or none Electrostatic Discharge (ESD) devices. The driving capability, loading, output capacitance, or input capacitance of I/O drivers or receivers, or I/O circuits may be between 0.1 pF and 2 pF or 0.1 pF and 1 pF. The size of the ESD device may be between 0.05 pF and 2 pF or 0.05 pF and 1 pF. For example, a bi-directional (or tri-state) I/O pad or circuit may comprise an ESD circuit, a receiver, and a driver, and has an input capacitance or output capacitance between 0.1 pF and 2 pF or 0.1 pF and 1 pF. All or most control and/or Input/Output (I/O) circuits or units (for example, the offlogic-drive I/O circuits, i.e., large I/O circuits, communicating with circuits or components external or outside of the logic drive) are outside of, or not included in, the standard commodity FPGA IC chip, but are included in another dedicated control chip, dedicated I/O chip, or dedicated control and I/O chip, packaged in the same logic drive. None or minimal area of the standard commodity FPGA IC chip is used for the control or I/O circuits, for example, less than 15%, 10%, 5%, 2% or 1% area (not counting the seal ring and the dicing area of the chip; that means, only including area upto the inner boundary of the seal ring) is used for the control or IO circuits; or, none or minimal transistors of the standard commodity FPGA IC chip are used for the control or I/O circuits, for example, less than 15%, 10%, 5%, 2% or 1% of the total number of transistors are used for the control or I/O circuits; or all or most area of the standard commodity FPGA IC chip is used for (i) logic blocks comprising logic gate arrays, computing units or operators, and/or Look-Up-Tables (LUTs) and multiplexers, and/or (ii) programmable interconnection. For example, greater than 85%, 90%, 95% or 99% area (not counting the seal ring and the dicing area of the chip; that means, only including area upto the inner boundary of the seal ring) is used for logic blocks, and/or programmable interconnection; or, all or most transistors of the standard commodity FPGA IC chip are used for logic blocks or repetitive arrays, and/or programmable interconnection, for example, greater than 85%, 90%, 95% or 99% of the total number of transistors are used for logic blocks, and/or programmable interconnection.

The logic blocks comprise (i) logic gate arrays comprising Boolean logic operators, for example, NAND, NOR, AND, and/or OR circuits; (ii) computing units comprising, for examples, adder, multiplication, shift register, floating point circuits, and/or division circuits; (iii) Look-Up-Tables (LUTs) and multiplexers. Alternatively, the Boolean operators, the functions of logic gates, or a certain computing, operation or process may be carried out using, for example, Look-Up-Tables (LUTs) and/or multiplexers. The LUTs store or memorize the processing or computing results of logic gates, computing results of calculations, decisions of decision-making processes, or results of operations, events or activities. The LUTs can be used to carry out logic functions based truth tables. The LUTs may store or memorize data or results in, for example, SRAM cells. The SRAM cells may be distributed over all locations in the FPGA chip, and are nearby or close to their corresponding multiplexers in the logic blocks. Alternatively, the SRAM cells may be located in a SRAM array, in a certain area or location of the FPGA chip; wherein the SRAM cell array aggregates or comprises multiple of the SRAM cells of LUTs for the selection multiplexers in logic blocks in the distributed locations. Alternatively, the SRAM cells may be located in one of multiple SRAM arrays, in multiple certain areas of the FPGA chip; each of the SRAM arrays aggregates or comprises multiple of the SRAM cells of LUTs for the selection multiplexers in logic blocks in the distributed locations. The data stored or latched in each of SRAM cells are input to the multiplexer for selection. Each of the SRAM cells may comprise 6 Transistors (6T SRAM), with 2 transfer (write) transistors and 4 data-latch transistors, wherein the two transfer transistors are used for writing the data into the storage or latched nodes of the 4 data-latch transistors. Alternatively, each of the SRAM cells may comprise 5 Transistors (5T SRAM), with 1 transfer (write) transistor and 4 data-latch transistors; wherein the transfer transistor is used for writing the data into the two storage or latched nodes of the 4 data-latch transistors. One of the two latched nodes of the 4 latch transistors in the 5T or 6T SRAM cell is connected or coupled to the multiplexer. The stored data in the 5T or 6T SRAM cell is used for LUTs. When inputting a set of data, requests or conditions, a multiplexer is used to select the corresponding data (or results) stored or memorized in the LUTs, based on the inputted set of data, requests or conditions. As an example, a 4-input NAND gate may be implemented using an operator comprising LUTs and multiplexers as described below: There are 4 inputs for a 4-input NAND gate, and 16 ($2^4$) possible corresponding outputs (results) of the 4-input NAND gate. An operator, used to carry out the 4-input NAND operation using LUTs and multiplexers, comprises (i) 4 inputs, (ii) a LUT for storing and memorizing the 16 possible corresponding outputs (results), (iii) a multiplexer designed and used for selecting the right (corresponding) output, for a given 4-input data set (for example, 1, 0, 0, 1), and (iv) an output. In general, an operator comprises n inputs, a LUT for storing or memorizing $2^n$ corresponding data or results, a multiplexer for selecting the right (corresponding) output for a given n-input data set, and 1 output.

The programmable interconnections of the standard commodity FPGA chip comprise cross-point switches in the middle of interconnection metal lines or traces. For example, n metal lines or traces are connected to the input terminals of the cross-point switches, and m metal lines or traces are connected to the output terminals of the cross-point switches, and the cross-point switches are located between the n metal lines or traces and the m metal lines and traces. The cross-point switches are designed such that each of the n metal lines or traces may be programed to connect to anyone of the m metal lines or traces. Each of the cross-point switches may comprise, for example, a pass/no-pass circuit comprising a n-type and a p-type transistor, in pair, wherein one of the n metal lines or traces are connected to the connected source terminals of the n-type and p-type transistor pairs in the pass-no-pass circuit, while one of the m metal lines and traces are connected to the connected drain terminal of the n-type and p-type transistor pairs in the pass-no-pass circuit. The connection or disconnection (pass or no pass) of the cross-point switch is controlled by the data (0 or 1) stored or latched in a SRAM cell. The SRAM cell may be distributed over all locations in the FPGA chip, and is nearby or close to the corresponding switch. Alternatively, the SRAM cell may be located in a SRAM array, in a certain area or location of the FPGA chip; wherein the SRAM cell array aggregates or comprises multiple of the SRAM cells for controlling corresponding cross-point switches in the distributed locations. Alternatively, the SRAM cell may be located in one of multiple SRAM arrays, in multiple certain areas or locations of the FPGA chip; each of the SRAM arrays aggregates or comprises multiple of the SRAM cells for controlling cross-point switches in the distributed locations. The (control) gates of both n-type and p-type transistors in the switch are connected to the two storage or latch nodes, respectively, of the SRAM cell. Each of the SRAM cells may comprise 6 Transistors (6T SRAM), with 2 transfer (write) transistors and 4 data-latch transistors, wherein the two transfer transistors are used for writing the programing code or data into the two storage nodes of the 4 data-latch transistors. Alternatively, each of the SRAM cells may comprise 5 Transistors (5T SRAM), with 1 transfer (write) transistor and 4 data-latch transistors, wherein the transfer transistor is used for writing the programing code or data into the two storage nodes of the 4 data-latch transistors. The two storage nodes of the 4 latch transistors in the 5T or 6T SRAM cell are connected to the gate of the n-type transistor and the gate of the p-type transistor, respectively, in the pass-no-pass switch circuit. The stored (programming) data in the 5T or 6T SRAM cell is used to program the connection or not-connection of the two metal lines or traces connected to the terminals of the cross-point switch. When the data latched in the two storage nodes of the 5T or 6T SRAM cell is programmed at [1, 0], (may be defined as "1" for the data stored in the SRAM cell), the node of 1 is connected to the gate of the n-type transistor, and the node of 0 is connected to the gate of the p-type transistor; therefore, the pass/no-pass circuit is on, and the two metal lines or traces connected to the two terminals of the pass-no-pass switch circuit are connected. While the data latched in the two storage nodes of the 5T or 6T SRAM cell is programmed at [0, 1], (may be defined as "0" for the data stored in the SRAM cell), the node of 0 is connected to the gate of the n-type transistor, and the node of 1 is connected to the gate of the p-type transistor; therefore, the pass/no-pass switch circuit is off, and the two metal lines or traces connected to the two terminals of the pass/no-pass switch circuit are dis-connected. Since the standard commodity FPGA IC chip comprises mainly the regular and repeated gate arrays or blocks, LUTs and multiplexers, or programmable interconnection, just like standard commodity DRAM, or NAND flash IC chips, the manufacturing yield may be very high, for example, greater than 80%, 90% or 95% for a chip area (the conventional definition of chip area or size) greater than, for example, 50 $mm^2$.

Alternatively, each of the cross-point switches may comprise, for example, a pass/no-pass circuit comprising a switching buffer, wherein the switching buffer comprises two-stages of inverters (buffer), a control N-MOS, and a control P-MOS. Wherein one of the n metal lines or traces is connected to the common (connected) gate terminal of an input-stage inverter of the buffer in the pass-no-pass circuit, while one of the m metal lines and traces is connected to the common (connected) drain terminal of output-stage inverter of buffer in the pass-no-pass circuit. The output-stage inverter is stacked with the control P-MOS at the top (between $V_{cc}$ and the source of the P-MOS of the output-stage inverter) and the control N-MOS at the bottom (between $V_{ss}$ and the source of the N-MOS of the output-stage inverter). The connection or disconnection (pass or no pass) of the cross-point switch is controlled by the data (0 or 1) stored in a 5T or 6T SRAM cell. The 5T or 6T SRAM cell may be distributed over all locations in the FPGA chip, and is nearby or close to the cross-point switch. Alternatively, the 5T or 6T SRAM cell may be located in a 5T or 6T SRAM cell array, in a certain area or location of the FPGA chip; wherein the 5T or 6T SRAM cell array aggregates or comprises multiple of the 5T or 6T SRAM cells for controlling corresponding cross-point switches in the distributed locations. Alternatively, the 5T or 6T SRAM cell may be located in one of multiple 5T or 6T SRAM cell arrays, in multiple certain areas or locations of the FPGA chip; each of the 5T or 6T SRAM cell arrays aggregates or comprises multiple of the 5T or 6T SRAM cells for controlling cross-point switches in the distributed locations. The gates of both control N-MOS and the control P-MOS transistors in the switch are connected or coupled to the two latched nodes, respectively, of the 5T or 6T SRAM cell. One latched node of the 5T or 6T SRAM cell is connected or coupled to the gate of the control N-MOS transistor in the switching buffer circuit, while the other latched node of the 5T or 6T SRAM cell is connected or coupled to the gate of the control P-MOS transistor in the switch buffer circuit. The stored (programming) data in the 5T or 6T SRAM cell is used to program the connection or not-connection of the two metal lines or traces connected to the terminals of the cross-point switch. When the data stored in the 5T or 6T SRAM cell is programmed at 1, the latched node of 1 is connected to the gate of the control N-MOS transistor, and the other latched node of 0 is connected to the gate of the control P-MOS transistor; therefore, the pass/no-pass circuit (the switching buffer) passes the data from input to the output. In other words, the two metal lines or traces connected to the two terminals of the pass-no-pass switch circuit are (virtually) connected. While the data stored in the 5T or 6T SRAM cell is programmed at 0, the latched node of 0 is connected to the gate of the control N-MOS transistor, and the other latched node of 1 is connected to the gate of the control P-MOS transistor; therefore, both the control N-MOS and control P-MOS transistors are off. The data cannot be transferred from the input to the output, and the two metal lines or traces connected to the two terminals of the pass/no-pass switch circuit are dis-connected.

Alternatively, the cross-point switches may comprise, for example, multiplexers and switch buffers. The multiplexer selects one of the n inputting data form the n inputting metal lines based on the data stored in the 5T or 6T SRAM cells; and outputs the selected one of inputs to a switch buffer. The switch buffer passes or does not pass the output data from the multiplexer to one metal line connected to the output of the switch buffer based on the data stored in the 5T or 6T SRAM cells. The switch buffer comprises two-stages of inverters (buffer), a control N-MOS, and a control P-MOS. Wherein the selected data from the multiplexer is connected to the common (connected) gate terminal of input-stage inverter of the buffer, while said one metal line or trace is connected to the common (connected) drain terminal of output-stage inverter of the buffer. The output-stage inverter is stacked with the control P-MOS at the top (between Vcc and the source of the P-MOS of the output-stage inverter) and the control N-MOS at the bottom (between Vss and the source of the N-MOS of the output-stage inverter). The connection or disconnection of the switch buffer is controlled by the data (0 or 1) stored in the 5T or 6T SRAM cell. One latched node of the 5T or 6T SRAM cell is connected or coupled to the gate of the control N-MOS transistor in the switch buffer circuit, and the other latched node of the 5T or 6T SRAM cell is connected or coupled to the gate of the control P-MOS transistor in the switch buffer circuit. For example, two metal lines A and B are crossed at a point, and segmenting metal line A into two segments, $A_1$ and $A_2$, and metal line B into two segments, $B_1$ and $B_2$. Cross-point switches are located at the cross point. The cross-point switches comprise 4 pairs of multiplexers and switch buffers. Each of the multiplexer has 3 inputs and 1 output, that is, each multiplexer selects one from the 3 inputs as the output, based on 2 bits of data stored in two of the 5T or 6T SRAM cells. Each of the switch buffers receives the output data from the corresponding multiplexer and decides to pass or not to pass the selected data, based on the 3rd bit of data stored in the $3^{rd}$ 5T or 6T SRAM cell. The cross-point switches are located between segments $A_1$, $A_2$, $B_1$ and $B_2$, and comprise 4 pairs of multiplexers/switch buffers: (1) The 3 inputs of a first multiplexer may be $A_1$, $B_1$ and $B_2$. If the 2 bits stored in the 5T or 6T SRAM cells are 0 and 0 for the first multiplexer, the $A_1$ segment is selected by the first multiplexer. The $A_1$ segment is connected to the input of a first switch buffer. If the databit stored in the 5T or 6T SRAM cell is 1 for the first switch buffer, the data of $A_1$ segment is passing to the $A_2$ segment. If the data bit stored in the 5T or 6T SRAM cell is 0 for the first switch buffer, the data of $A_1$ segment is not passing to the $A_2$ segment. If the 2 bits stored in the 5T or 6T SRAM cells are 1 and 0 for the first multiplexer, the $B_1$ segment is selected by the first multiplexer. The $B_1$ segment is connected to the input of the first switch buffer. If the data bit stored in the 5T or 6T SRAM cell is 1 for the first switch buffer, the data of $B_1$ segment is passing to the $A_2$ segment. If the data bit stored in the 5T or 6T SRAM cell is 0 for the first switch buffer, the data of $B_1$ segment is not passing to the $A_2$ segment. If the 2 bits stored in the 5T or 6T SRAM cells are 0 and 1 for the first multiplexer, the $B_2$ segment is selected by the first multiplexer. The $B_2$ segment is connected to the input of the first switch buffer. If the data bit stored in the 5T or 6T SRAM cell is 1 for the first switch buffer, the data of $B_2$ segment is passing to the $A_2$ segment. If the data bit stored in the 5T or 6T SRAM cell is 0 for the first switch buffer, the data of $B_2$ segment is not passing to the $A_2$ segment. (2) The 3 inputs of a second multiplexer may be $A_2$, $B_1$ and $B_2$. If the 2 bits stored in the 5T or 6T SRAM cells are 0 and 0 for the second multiplexer, the $A_2$ segment is selected by the second multiplexer. The $A_2$ segment is connected to the input of a second switch buffer. If the data bit stored in the 5T or 6T SRAM cell is 1 for the second switch buffer, the data of $A_2$ segment is passing to the $A_1$ segment. If the data bit stored in the 5T or 6T SRAM cell is 0 for the second switch buffer, the data of $A_2$ segment is not passing to the $A_1$ metal segment. If the 2 bits stored in the 5T or 6T SRAM cells are 1 and 0 for the second multiplexer, the $B_1$ segment is selected by the second multiplexer. The $B_1$ segment is connected to the input of the second switch buffer. If the data bit stored in the 5T or 6T SRAM cell is 1 for the second switch buffer, the data of $B_1$ segment is passing to the $A_1$ segment. If the data bit stored in the 5T or 6T SRAM cell is 0 for the second switch buffer, the data of $B_1$ segment is not passing to the $A_1$ metal segment. If the 2 bits stored in the 5T or 6T SRAM cells are 0 and 1 for the second multiplexer, the $B_2$ segment is selected by the second multiplexer. The $B_2$ segment is connected to the input of the second switch buffer. If the data bit stored in the 5T or 6T SRAM cell is 1 for the second switch buffer, the data of $B_2$ segment is passing to the $A_1$ segment. If the data bit stored in the 5T or 6T SRAM cell is 0 for the second switch buffer, the data of $B_2$ segment is not passing to the $A_1$ metal segment. (3) The 3 inputs of a third multiplexer may be $A_1$, $A_2$ and $B_2$. If the 2 bits stored in the 5T or 6T SRAM cells are 0 and 0 for the third multiplexer, the $A_1$ segment is selected by the third multiplexer. The $A_1$ segment is connected to the input of a third switch buffer. If the data bit stored in the 5T or 6T SRAM cell is 1 for the third switch buffer, the data of $A_1$ segment is passing to the $B_1$ segment. If the data bit stored in the 5T or 6T SRAM cell is 0 for the third switch buffer, the data of $A_1$ segment is not passing to the $B_1$ segment. If the 2 bits stored in the 5T or 6T SRAM cells are 1 and 0 for the third multiplexer, the $A_2$ segment is selected by the third multiplexer. The $A_2$ segment is connected to the input of the third switch buffer. If the databit stored in the 5T or 6T SRAM cell is 1 for the third switch buffer, the data of $A_2$ segment is passing to the $B_1$ segment. If the data bit stored in the 5T or 6T SRAM cell is 0 for the third switch buffer, the data of $A_2$ segment is not passing to the $B_1$ segment. If the 2 bits stored in the 5T or 6T SRAM cells are 0 and 1 for the third multiplexer, the $B_2$ segment is selected by the third multiplexer. The $B_2$ segment is connected to the input of the third switch buffer. If the data bit stored in the 5T or 6T SRAM cell is 1 for the third switch buffer, the data of $B_2$ segment is passing to the $B_1$ segment. If the data bit stored in the 5T or 6T SRAM cell is 0 for the third switch buffer, the data of $B_2$ segment is not passing to the $B_1$ segment. (4) The 3 inputs of a fourth multiplexer may be $A_1$, $A_2$ and $B_1$. If the 2 bits stored in the 5T or 6T SRAM cells are 0 and 0 for the fourth multiplexer, the $A_1$ segment is selected by the fourth multiplexer. The $A_1$ segment is connected to the input of a fourth switch buffer. If the data bit stored in the 5T or 6T SRAM cell is 1 for the fourth switch buffer, the data of $A_1$ segment is passing to the $B_2$ segment. If the data bit stored in the 5T or 6T SRAM cell is 0 for the fourth switch buffer, the data of $A_1$ segment is not passing to the $B_2$ segment. If the 2 bits stored in the 5T or 6T SRAM cells are 1 and 0 for the fourth multiplexer, the $A_2$ segment is selected by the fourth multiplexer. The $A_2$ segment is connected to the input of the fourth switch buffer. If the data bit stored in the 5T or 6T SRAM cell is 1 for the fourth switch buffer, the data of $A_2$ segment is passing to the $B_2$ segment. If the data bit stored in the 5T or 6T SRAM cell is 0 for the fourth switch buffer, the data of $A_2$ segment is not passing to the $B_2$ segment. If the 2 bits stored in the 5T or 6T SRAM cells are 0 and 1 for the fourth multiplexer, the $B_1$ segment is selected by the fourth multiplexer. The $B_1$ segment is connected to the input of the fourth switch buffer. If the data bit stored in the 5T or 6T SRAM cell is 1 for the fourth switch buffer, the data of $B_1$ segment is passing to the $B_2$ segment. If the data bit stored in the 5T or 6T SRAM cell is 0 for the fourth switch buffer, the data of $B_1$ segment is not passing to the $B_2$ segment. In this alternative, the cross-point switches are bi-directional; there are 4 pairs of multiplexers/switch buffers, each pair of the multiplexers/switch buffers is controlled by 3 bits of the 5T or 6T SRAM cells. Totally, 12 bits of the 5T or 6T SRAM cells are required for the cross-point switches. The 5T or 6T SRAM cell may be distributed over all locations in the FPGA chip, and is nearby or close to the corresponding multiplexers and/or switch buffers. Alternatively, the 5T or 6T SRAM cell may be located in a 5T or 6T SRAM cell array, in a certain area or location of the FPGA chip; wherein the 5T or 6T SRAM cell array aggregates or comprises multiple of the 5T or 6T SRAM cells for controlling corresponding multiplexers and/or cross-point switches in the distributed locations. Alternatively, the 5T or 6T SRAM cell may be located in one of multiple 5T or 6T SRAM cell arrays, in multiple certain areas or locations of the FPGA chip; each of the 5T or 6T SRAM cell arrays aggregates or comprises multiple of the 5T or 6T SRAM cells for controlling multiplexers and/or cross-point switches in the distributed locations.

The programmable interconnections of the standard commodity FPGA chip comprise a multiplexer in the middle of interconnection metal lines or traces. The multiplexer selects from n metal interconnection lines connected to the n inputs of the multiplexer, and coupled or connected to one metal interconnection line connected to the output of the multiplexer, based on the data stored or programmed in the 5T or 6T SRAM cells. For example, n=16, 4 bits of the 5T or 6T SRAM cells are required to select any one of the 16 metal interconnection lines connected to the 16 inputs of the multiplexer, and couple or connect the selected one to one metal interconnection line connected to the output of the multiplexer. The data from the selected one of 16 inputs is therefore coupled, passed, or connected to the metal line connected to the output of the multiplexer.

Another aspect of the disclosure provides a FPGA IC chip comprising Magnetoresistive Random Access Memory cell, abbreviated as "MRAM" cell for non-volatile storage of data or information; wherein the FPGA IC chip is used in the logic drive. The MRAM cells are used as configuration memory cells for storing configuration information or data to program (write into) the 5T or 6T SRAMs in this FPGA IC chip for programmable interconnection and/or for data storage of the LUTs. The MRAM cells form arrays in or of the FPGA IC chip, similar to the array design in current non-volatile NOR flash memory, with a word line for selecting the MRAM cell for read, and a bit line for data output. The bit data from MRAM cells are coupled to the bit lines and input or coupled to a sense amplifier. The output data of the sense amplifier are then coupled to the 5T or 6T SRAMs for programmable interconnection and/or for data storage of the LUTs. The MRAM cell is based on the interaction between the electron spin and the magnetic field of the magnetic layers in a Magnetoresisitive Tunneling Junction (MTJ) of the MRAM cell. The MRAM cell uses a spin-polarized current to switch the spin of electrons, the so-called Spin Transfer Torque MRAM, STT-MRAM. The MRAM cell mainly comprises four stacked thin layers: (i) a free magnetic layer, comprising, for example, $Co_2Fe_6B_2$. The free layer has a thickness between 0.5 nm and 3.5 nm, or 1 nm and 3 nm; (ii) a tunneling barrier layer, comprising for example, MgO. The tunneling barrier layer has a thickness between 0.3 nm and 2.5 nm, or 0.5 nm and 1.5 nm; (iii) a pinned or fixed magnetic layer comprising, for example, $Co_2Fe_6B_2$. The pinned layer has a thickness between 0.5 nm and 3.5 nm, or 1 nm and 3 nm. The pinned layer may have a similar material as that of the free layer; and (iv) a pinning layer; comprising, for example, an anti-ferromagnetic (AF) layer. The AF layer may be a synthetic layer comprising, for example, $Co/[CoPt]_4$. The direction of the magnetization of the pinned layer is pinned or fixed by the neighboring pinning layer of the AF layer. The stacked layers of the TMJ may be formed by the Physical Vapor Deposition (PVD) method using a multi-cathode PVD chamber or sputter, followed by etching to form a mesa structure of TMJ. The direction of the magnetization of the free layer or the pinned (fixed layer) may be (i) in-plane with the free or pined (fixed) layer (iTMJ) or (ii) perpendicular to the plane of the free or pinned (fixed) layer (pTMJ). The direction of magnetization of the pinned (fixed) layer is fixed by the bi-layers structure of pinned/pinning layers. The interfacing of the ferromagnetic pinned (fixed) layer and the AF pinning layer results in that the direction of ferromagnetic pinned (fixed) layer is in a fixed direction (for example, up or down in the pTMJ), and become harder to change or flip in external electromagnetic force or field. While the direction of ferromagnetic free layer (for example, up or down in the pTMJ) is easier to change or flip in external electromagnetic force or field. The change or flip the direction of the ferromagnetic free layer is used for programming the TMJ MRAM cell. The state "0" is defined when the magnetization direction of the free layer is in-parallel with or in the same direction of that of the pinned (fixed) layer; and the state "1" is defined when the magnetization direction of the free layer is anti-parallel with or in the reverse direction of that of the pinned (fixed) layer. To write "0", electrons are tunneling from the pinned layer to the free layer. When electrons flow through the pinned or fixed layer, the electron spins will be aligned in-parallel with the magnetization direction of the pinned (fixed) layer. When the tunneling electrons with aligned spins flowing in the free layer, (i) the tunneling electrons may be passing through the free layer if the aligned spins of the tunneling electrons are in-parallel with that of the free layer, (ii) the tunneling electrons may flip or change the direction of the magnetization of the free layer to a direction in-parallel with the fixed layer using the spin torque of the electrons if the aligned spins of the tunneling electrons are not in-parallel with that of the free layer. After writing "0", the direction of the magnetization of the free layer is in-parallel with that of the fixed layer. To write "1" from the original "0", electrons are tunneling from the free layer to the pinned (fixed) layer. Since the directions of the magnetizations of the free layer and the pinned (fixed) layer are the same, the electrons with majority of spin polarity (in-parallel with the magnetization direction of the pinned layer) may flow and pass the pinned (fixed) layer; only electrons with minority spin polarity (not in-parallel with the magnetization direction of the pinned layer) may be reflected from pinned (fixed) layer and back to the free layer. The spin polarity of reflected electrons is in the reverse direction of the magnetization of the free layer, and may flip or change the direction of the magnetization of the free layer to a direction reverse-parallel to the fixed layer using the spin torque of the electrons. After writing "1", the direction of the magnetization of the free layer is anti-parallel to that of the fixed layer. Since write "1" is using the minority spin polarity electrons, a larger current flow through TMJ is required as compared to write "0".

Based on the magnetoresistance theory, the resistance of a TMJ is at low resistance state (LR), the "0" state, when the direction of the magnetization of the free layer is in-parallel with the direction of that of the fixed layer; at high resistance state (HR), the "1" state, when the direction of the magnetization of the free layer is anti-parallel with the direction of that of the fixed layer. The two states of resistance may be used in read the TMJ MRAM cell.

The MRAM cells may be arranged as a cell array as in the conventional memory array (For example, a NOR flash array or a DRAM array). The free layers in MRAM cells are coupled to the bit lines through selection transistors, and the pinned layers in MRAM cells are coupled to reference lines; the control gates of the selection transistors are coupled to the word lines. Alternatively, the free layers in MRAM cells are coupled to the bit lines, and the pinned layers in MRAM cells are coupled to reference lines through selection transistors; the control gates of the selection transistors are coupled to the word lines. The selection transistor is ON when the MRAM cell in the array is selected for programming or read. To write "0" into a selected bit, the word line is at an ON voltage, Vcc, the bit line is at programming voltage, Vpr, and the reference line is at ground voltage, Vss; to write "1" into the selected bit, the word line is at an ON voltage, Vcc, the bit line is at ground voltage, Vss, and the reference line is at programming voltage, Vpr. To read a selected bit, the word line is at an ON voltage, Vcc, the bit line is connected to a current source and a sensing amplifier, and the reference line is at ground voltage, Vss. In the programming or the read stage, when the bit in a MRAM cell is not selected, the word line is at OFF voltage, Vss.

Another aspect of the disclosure provides a FPGA IC chip comprising a Resistive Random Access Memory cell, abbreviated as "RRAM" cell; wherein the FPGA IC chip is used in the logic drive. The RRAM cells are used as configuration memory cells for storing configuration information or data to program (write into) the 5T or 6T SRAMs in this FPGA IC chip for programmable interconnection and/or for data storage of the LUTs. The RRAM cells form arrays in the FPGA IC chip, similar to the array design in current non-volatile NOR flash memory. In an alternative, an RRAM cell in an array may be selected by a transistor (the selecting transistor) in the read mode; and this is a 1T1R RRAM cell array. The bit data from RRAM cells are coupled to the bit lines and input or coupled to a sense amplifier. The output data of the sense amplifier are then coupled to the 5T or 6T SRAMs for programmable interconnection and/or for data storage of the LUTs. The RRAM cell is based on the nano-morphological modifications associated with the formation of oxygen vacancies ($V_o$). The RRAM is based on oxidation-reduction (redox) electrochemical processes of a solid electrolyte. In the electroforming process of oxide-based RRAM devices, the oxide layer undergoes certain nano-morphological modifications associated with the formation of oxygen vacancies ($V_o$). The RRAM cell is switched by the presence or absence of conductive filaments or paths in the oxide layer, depending on the applied electric voltages. The RRAM cell comprises a Metal/Insulator/Metal (MIM) device or structure, and mainly comprises four stacked thin layers: (i) a first metal electrode layer, for example, the metal may comprise titanium nitride (TiN) or tantalum nitride (TaN); (ii) an oxygen reservoir layer which may capture the oxygen atoms from an oxide layer. The oxygen reservoir layer may comprise a metal layer. The metal may comprise titanium (Ti), or tantalum (Ta). Both Ti or Ta material may capture the oxygen atoms to form $TiO_x$ or $TaO_x$. The thickness of Ti layer may be 2 nm, 7 nm, or 12 nm, or between 1 nm and 25 nm, or 3 nm and 15 nm. The oxygen reservoir layer may be formed by Atomic Layer Deposition (ALD) methods; (iii) an oxide layer or an insulator layer, in which conductive filaments or paths may be formed depending on the applied electric voltages. The oxide layer may comprise, for example, hafnium oxide ($HfO_2$) or Tantalum Oxide $Ta_2O_5$. The thickness of $HfO_2$ may be 5 nm, 10 nm, or 15 nm; or, between 1 nm and 30 ηnm 3 nm and 20 nm, or 5 nm and 15 nm. The oxide layer may be formed by Atomic Layer Deposition (ALD) methods; (iv) a second metal electrode layer, for example, the metal may comprise titanium nitride (TiN) or tantalum nitride (TaN). The RRAM cell is a kind of memristors (memory resistors). In the forming process stage, the first electrode of a MIM device (RRAM cell) is biased, connected or coupled to a forming voltage ($V_F$), and the second electrode is biased, connected or coupled to a low operation or ground voltage ($V_{ss}$). The forming voltage will drive or pull oxygen ions from the oxide layer (for example, $HfO_2$) to the oxygen reservoir layer (for example, Ti), to form $TiO_x$. Vacancies in the original oxygen sites in the oxide or insulating layer are created and forming one or more conductive filaments or paths in the oxide or insulting layer. The oxide or insulating layer becomes conductive with the presence of the one or more conductive filaments or paths, and the RRAM cell is at a low resistance state (LR). After the forming process, the RRAM cell is activated as a NVM cell for use. The state "0" is defined when the RRAM is at LR state. To reset or write the RRAM cell to a "1" state (HR), the second electrode of a MIM device (RRAM cell) is biased, connected or coupled to a reset voltage ($V_{Rset}$), and the first electrode is biased, connected or coupled to a low operation or ground voltage ($V_{ss}$). The reset voltage ($V_{Rset}$) will drive or pull oxygen ions out from the oxygen reservoir layer (for example, Ti) and the oxygen ions are hopping or flowing to the oxide or insulating layer. The vacancies in the original oxygen sites are re-occupied by the oxygen ions and the one or more conductive filaments or paths in the oxide or insulting layer are broken or disrupted. The oxide or insulating layer is less-conductive and the RRAM cell is at a high resistance state (HR), and therefore at "1" state. To set or write the RRAM cell to a "0" state (LR), the first electrode of a MIM device (RRAM cell) is biased, connected or coupled to a set voltage ($V_{Set}$), and the second electrode is biased, connected or coupled to a low operation or ground voltage ($V_{ss}$). The set voltage ($V_{Set}$) will drive or pull oxygen atoms or ions from the oxide or insulting layer (for example, $HfO_2$) to the oxygen reservoir layer (for example, Ti), to form $TiO_x$. The vacancies in the original oxygen sites in the oxide or insulating layer are created and forming one or more conductive filaments or paths in the oxide or insulting layer. The oxide or insulating layer becomes conductive and the RRAM cell is at the "0" state (LR).

Based on the conductive filament theory, the resistance of a MIM is at low resistance state (LR), the "0" state, when the set voltage is biased, connected or coupled to the first electrode; while the resistance of a MIM is at high resistance state (LR), the "1" state, when the reset voltage is biased, connected or coupled to the second electrode. The two states of resistance may be used in read the MIM RRAM cell.

The RRAM cells may be arranged as a cell array as in the conventional memory array (For example, a NOR flash array or a DRAM array). Selection transistors are used for selecting RRAM cells for programming and read. This is the 1T1R RRAM cell array. The first metal electrodes in RRAM cells are coupled to the bit lines through selection transistors, and the second metal electrodes in RRAM cells are coupled to reference lines; the control gates of the selection transistors are coupled to the word lines. Alternatively, first metal electrodes in RRAM cells are coupled to the bit lines, and the second metal electrodes in RRAM cells are coupled to reference lines through selection transistors; the control gates of the selection transistors are coupled to the word lines. In the forming process, the word line is at ON voltage, Vcc, the bit line is at forming voltage, Vf, and the reference line is at ground voltage, Vss. After the forming process, the RRAM cells are at the "0" states (LR states). The selection transistor is ON when the RRAM cell in the array is selected for programming or read. To write or reset "1" into a selected bit, the word line is at ON voltage, Vcc, the bit line is at ground voltage, Vss, and the reference line is at a reset voltage ($V_{Rset}$). To write or set "0" into the selected bit, the word line is at ON voltage, Vcc, the bit line is at a set voltage ($V_{Set}$), and the reference line is at ground voltage, Vss. To read the selected bit, the word line is at ON voltage, Vcc, the bit line is connected to a current source and a sensing amplifier, and the reference line is at ground voltage, Vss. In the programming or the read stage, when the bit in a RRAM cell is not selected, the word line is at OFF voltage, Vss.

Another aspect of the disclosure provides a FPGA IC chip comprising a Resistive Random Access Memory cell, abbreviated as "RRAM" cell; wherein the FPGA IC chip is used in the logic drive. The RRAM cells are used as configuration memory cells for storing configuration information or data to program (write into) the 5T or 6T SRAMs in this FPGA IC chip for programmable interconnection and/or for data storage of the LUTs. The RRAM cells may be arranged as a cell array as in the conventional memory array (For example, a NOR flash array or a DRAM array). In this aspect of disclosure, selectors are used for selecting RRAM cells for programming and read. This is the 1S1R RRAM cell array. The selector provides an RRAM cell array in the simple crossbar layout or structure, wherein a bit line and a word line in the cell array run perpendicularly to each other and the RRAM cell is sandwiched at a crosspoint between the bit line at the top and the word line at the bottom. The RRAM cell array is a crosspoint cell array. The selector may be a current-tunneling device based on a metal-insulator-metal structure (MIM). Selector is highly resistive under lower bias while highly conductive under larger bias. As a result, nonlinearity is one of the most significant characteristic of the selector. The selector may be a unipolar tunneling MIM device or a bipolar tunneling MIM device. For the unipolar or bipolar tunneling MIM device in the positive voltage bias, when the voltage bias increases across two electrodes of the MIM device by one volt, the current going through the MIM device in a direction increases by $10^5$ times or greater than $10^5$ times, by $10^4$ times or greater than $10^4$ times, by $10^3$ times or greater than $10^3$ times, or by $10^2$ times or greater than $10^2$ times. For the bipolar tunneling MIM device in the negative voltage bias, when the voltage bias across two electrodes of the MIM device is one volt more negative, the current going through the MIM device in an opposite direction increases by $10^5$ times or greater than $10^5$ times, by $10^4$ times or greater than $10^4$ times, by $10^3$ times or greater than $10^3$ times, or by $10^2$ times or greater than $10^2$ times. In the other word, when the RRAM cell is selected by the word line, the current going through the unipolar or bipolar tunneling MIM device (in series with the RRAM) is greater than that going through the MIM device in series with the RRAM not selected by an order of equal to or greater than 5, 4, 3 or 2. When the RRAM cell is selected, the MIM selector in series with the RRAM cell is at a high voltage bias (between the top and bottom electrodes of the MIM selector); while the RRAM cell is not selected, the MIM selector in series with the RRAM cell is at a low voltage bias (between the top and bottom electrodes of the MIM selector). For the MIM selector, the material used for top electrode may be nickel, platinum or titanium, and the material used for the bottom electrode may be platinum. The tunneling oxide of the MIM structure may be $TiO_2$, $Al_2O_3$, or $HfO_2$, and having a thickness between 5 nm and 20 nm. The tunneling oxide may be formed by Atomic Layer Deposition (ALD). The voltage bias across the MIM selector may be between 0.3 V and 2.5 V, 0.5 V and 2 V or 0.5 V and 1.5 V The selector is in series with the RRAM cell. In the crossbar structure, the selector may be physically stacked on the top of the RRAM. Alternatively, the RRAM may be physically stacked on the top of the selector.

In the 1S1R RRAM cell array, when the selectors are stacked above the RRAM cells, the top electrodes of the selectors are coupled to the bit lines, and the second metal electrodes in RRAM cells are coupled to word lines. Alternatively, when selectors are stacked above the RRAM cells, the first metal electrodes in RRAM cells are coupled to the bit lines, and the bottom electrodes in selectors are coupled to word lines. In the forming process, the bit line is at a voltage Vf+Vsel, wherein Vf is the forming voltage and Vsel is the selection voltage; and the word line is at ground voltage, Vss. After the forming process, the RRAM cells are at the "0" states (LR states). To write or reset "1" into a selected bit (an RRAM cell), the bit line is at ground voltage, Vss, and the word line is at voltage of $V_{Rset}$+Vsel, wherein $V_{Rset}$ is the reset voltage and Vsel is the selection voltage. To write or set "0" into the selected bit (an RRAM cell), the bit line is at a voltage of $V_{Set}$+Vsel, wherein $V_{Set}$ is the set voltage Vsel is the selection voltage. To read the selected bit, the bit line is connected to a current source and a sensing amplifier, and the word line is at ground voltage, Vss. In the programming or the read stage, when the bit in a RRAM cell is not selected, the word line is at Vcc.

Another aspect of the disclosure provides a FPGA IC chip comprising a Resistive Random Access Memory cell, abbreviated as "RRAM" cell; wherein the FPGA IC chip is used in the logic drive. The RRAM cells are used as configuration memory cells for storing configuration information or data to program (write into) the 5T or 6T SRAMs in this FPGA IC chip for programmable interconnection and/or for data storage of the LUTs. The RRAM cells may be arranged as a cell array as in the conventional memory array (For example, a NOR flash array or a DRAM array). In this aspect of disclosure of the RRAM cell provides selectors for selecting RRAM cells for programming and read as integral parts of the RRAM cells; that is, a single MIM structure provides both the RRAM cell and the selector function. The single MIM structure works as the RRAM cell and the selector. This is the Self-Select (SS) RRAM cell array. The SS RRAM provides an RRAM cell array in the simple crossbar layout or structure, wherein a bit line and a word line in the cell array run perpendicularly to each other and the RRAM cell is sandwiched at a crosspoint between the bit line at the top and the word line at the bottom. The SS RRAM cell array is a crosspoint cell array. As an example, the MIM structure used for the SS RRAM cell may be in a stacked MIM structure comprising, from bottom to top: (i) a bottom electrode, for example, a Ni layer formed by sputtering and having a thickness between 20 nm and 200 nm, 50 nm and 150 nm, or 80 nm and 120 nm; (ii) an oxide layer, in which oxygen vacancies or oxygen vacancy conductive filaments or paths may be formed depending on the applied electric voltages. The oxide layer may comprise, for example, hafnium oxide ($HfO_2$). The thickness of $HfO_2$ may be 5 nm, 10 nm, or 15 nm; or, between 1 nm and 30 nm, 3 nm and 20 nm, or 5 nm and 15 nm. The oxide layer may be formed by Atomic Layer Deposition (ALD) methods. Alternatively, the $HfO_2$ layer may be formed by the reactive magnetron DC sputtering using a Hf metal target and with $O_2$/Ar gas flow; (iii) an insulting layer which has a conduction energy band energy lower (more positive) than that of the oxide layer ($hfO_2$); to form an energy barrier at the interface of the insulating layer and the oxide layer. The insulting layer may comprise, for example, a $TiO_2$ layer. The thickness of the $TiO_2$ layer may be 40 nm, 60 nm, or 80 nm; or, between 20 nm and 100 nm, 40 nm and 80 nm, or 50 nm and 70 nm. The insulating layer may be formed by Atomic Layer Deposition (ALD) methods. Alternatively, the $TiO_2$ layer may be formed by the reactive magnetron DC sputtering using a Ti metal target and with $O_2$/Ar gas flow; (iv) a top electrode, for example, a Ni layer formed by sputtering and having a thickness between 20 nm and 200 nm, 50 nm and 150 nm, or 80 nm and 120 nm.

In the SS RRAM cell array, when the $TIO_2$ layer is above the $HfO_2$ layer, the top (first) Ni electrodes of the stacked MIM strictures are coupled to the bit lines, and the bottom (second) Ni metal electrodes of the stacked MIM strictures are coupled to word lines. Alternatively, when the $TIO_2$ layer is under the $HfO_2$ layer, the bottom (first) Ni metal electrodes in SS RRAM cells are coupled to the bit lines, and the top (second) electrodes in the SS RRAM cells are coupled to word lines. A set process is applied to write or set "0" into the selected bit (an RRAM cell). In the set process, the word line is at a voltage+$V_{set}$, wherein $V_{set}$ is the set voltage, and may be at 8V, 7V or 6V, or, may be between 2V and 10 V, 4V and 8V, or 6V and 8V; and the bit line is at ground voltage, $V_{ss}$. In the set process, the oxygen vacancies in the $HfO_2$ layer move to and are accumulated at the $HfO_2/TiO_2$ interface. After the set process, the SS RRAM cells are at the "0" states (Low Resistance, LR states). To write or reset "1" into a selected bit (a SS RRAM cell), the bit line is at +$V_{Set}$ voltage, and the word line is at voltage of ground voltage, $V_{ss}$, wherein $V_{Rset}$ is the reset voltage, and may be at 6V, 5V or 4V, or, may be between 2V and 8V, 4V and 8V, or 4V and 6V. In the reset process, the oxygen vacancies in the $HfO_2$ layer move to and are accumulated at the $HfO_2$/Ni interface, wherein Ni is the second electrode. After the reset process, the SS RRAM cells are at the "1" states (High Resistance, HR states). To read the selected bit, the bit line is connected to a voltage $V_{read}$ and a sensing amplifier, and the word line is at ground voltage, $V_{ss}$, wherein $V_{read}$ is 1.5V, 2V, or 2.5V, or between 1V and 3V, or 1.5V and 2.5V When the first electrode Ni (bit line) is biased at positive $V_{read}$, the electrons from the second electrode Ni (wordline) may be tunneling through the $HfO_2$ oxide layer, then flows through the $TiO_2$ insulting layer to the first electrode Ni (bitline). For the LR state (vacancies accumulate at the $TiO_2/HfO_2$ interface), the electric field across the HfO2 layer is high, therefore, the tunneling current is high and resulting in a LR state. For the HR state (vacancies accumulate at the $HfO_2$/Ni interface), the electric field across the $HfO_2$ layer is low, therefore, the tunneling current is low or zero (no tunneling) and resulting in HR state. For the bit not selected, the voltage difference between the first electrode (bitline) and the second electrode (wordline) may be set 0V, or with the first electrode negatively biased at the first electrode. At these bias conditions, the energy barriers prevent electrons flow or tunneling. Therefore, the bit is not selected. As an example, in the read mode, all the bitlines (the first electrodes) are biased at a positive voltage, for example 2V. The wordline (the second electrode) selected for read is biased at ground Vss, while the wordlines (the second electrode) not selected for read is biased at 2V.

The SS RRAM is also a current-tunneling device in addition to the behavior of RRAM. The SS RRAM is at high conductive (LR state) or at high resistive (HR state) depending the locations of the vacancies. As a result, nonlinearity is one of the most significant characteristic of the SS RRAM. For the tunneling SS RRAM MIM device in the positive voltage bias, when the voltage bias increases across two electrodes of the SS RRAM MIM device by two volts, the current going through the SS RRAM MIM device in a direction increases by $10^3$ times or greater than $10^3$ times.

Another aspect of the disclosure provides the standard commodity logic drive in a multi-chip package comprising the standard commodity plural FPGA IC chips, for use in different algorithms, architectures and/or applications requiring logic, computing and/or processing functions by field programming, wherein the standard commodity plural FPGA IC chips, each is in a bare-die format or in a single-chip or multi-chip package. Each of standard commodity plural FPGA IC chips may have standard common features, counts or specifications: (1) logic blocks including (i) system gates with the count greater than or equal to 2M, 10M, 20M, 50M or 100M, (ii) logic cells or elements with the count greater than or equal to 64K, 128K, 512K, 1M, 4M or 8M, (iii) hard macros, for example DSP slices, microcontroller macros, multiplexer macros, fixed-wired adders, and/or fixed-wired multipliers and/or (iv) blocks of memory with the bit count equal to or greater than 1M, 10M, 50M, 100M, 200M or 500M bits; (2) the number of inputs to each of the logic blocks or operators: the number of inputs to each of the logic block or operator may be greater or equal to 4, 8, 16, 32, 64, 128, or 256; (3) the power supply voltage: the voltage may be between 0.1V and 8V, 0.1V and 6V, 0.1V and 2.5V, 0.1V and 2V, 0.1V and 1.5V, or 0.1V and 1V; (4) the I/O pads, in terms of layout, location, number and function. Since the FPGA chips are standard commodity IC chips, the number of FPGA chip designs or products for each technology node is reduced to a small number, therefore, the expensive photo masks or mask sets for fabricating the FPGA chips using advanced semiconductor nodes or generations are reduced to a few mask sets. For example, reduced down to between 3 and 20 mask sets, 3 and 10 mask sets, or 3 and 5 mask sets for a specific technology node or generation. The NRE and production expenses are therefore greatly reduced. With the few designs and products, the manufacturing processes may be tuned or optimized for the few chip designs or products, and resulting in very high manufacturing chip yields. This is similar to the current advanced standard commodity DRAM or NAND flash memory design and production. Furthermore, the chip inventory management becomes easy, efficient and effective; therefore, resulting in a shorter FPGA chip delivery time and becoming very cost-effective.

Another aspect of the disclosure provides the standard commodity logic drive in a multi-chip package comprising the plural standard commodity FPGA IC chips, for use in different algorithms, architectures and/or applications requiring logic, computing and/or processing functions by field programming, wherein the plural standard commodity FPGA IC chips, each is in a bare-die format or in a single-chip or multi-chip package. Each of the plural standard commodity FPGA IC chips may have standard common features or specifications as described and specified above. Each of the plural standard commodity FPGA IC chip may comprise multiple logic blocks, wherein each logic block may comprise, for example, (1) 1 to 16 of 8-by-8 adders, (2) 1 to 16 of 8-by-8 multipliers, (3) 256 to 2K of logic cells, wherein each logic cell comprises 1 register and 1 to 4 of LUTs (Look-Up-Tables), wherein each LUT comprises 4 to 256 bits of data or information. The above 1 to 16 of 8-by-8 adders and/or 1 to 16 of 8-by-8 multipliers may be designed and formed by fixed metal wires or lines (metal interconnection wires or lines) on each of the FPGA IC chips.

Another aspect of the disclosure provides the standard commodity logic drive in a multi-chip package comprising the plural standard commodity FPGA IC chips, for use in different algorithms, architectures and/or applications requiring logic, computing and/or processing functions by field programming, wherein the plural standard commodity FPGA IC chips, each is in a bare-die format or in a single-chip or multi-chip package. Each of the plural standard commodity FPGA IC chips may have standard common features or specifications as described and specified above. Similar to the standard DRAM IC chips for use in a DRAM module, the standard commodity FPGA IC chips in the logic drive, each chip may further comprise some additional I/O pins or pads, for example: (1) one chip enable pin, (2) one input enable pin, (3) one output enable pin, (4) two input selection pins and/or (5) two output selection pins. Each of the plural standard commodity FPGA IC chips may comprise, for example, 4 I/O ports, and each I/O port may comprise 64 bi-directional I/O circuits.

Another aspect of the disclosure provides the standard commodity logic drive in a multi-chip package comprising plural standard commodity FPGA IC chips, for use in different algorithms, architectures and/or applications requiring logic, computing and/or processing functions by field programming, wherein the plural standard commodity FPGA IC chips, each is in a bare-die format or in a single-chip or multi-chip package format. The standard commodity logic drive may have standard common features, counts or specifications: (1) logic blocks including (i) system gates with the count greater than or equal to 8M, 40M, 80M, 200M or 400M, (ii) logic cells or elements with the count greater than or equal to 256K, 512K, 2M, 4M, 16M or 32M, (iii) hard macros, for example DSP slices, microcontroller macros, multiplexer macros, fixed-wired adders, and/or fixed-wired multipliers and/or (iv) blocks of memory with the bit count equal to or greater than 4M, 40M, 200M, 400M, 800M or 2G bits; (2) the power supply voltage: the voltage may be between 0.1V and 12V, 0.1V and 7V, 0.1V and 3V, 0.1V and 2V, 0.1V and 1.5V, or 0.1V and 1V; (3) the I/O pads in the multi-chip package of the standard commodity logic drive, in terms of layout, location, number and function; wherein the logic drive may comprise the I/O pads, metal pillars or bumps connecting or coupling to one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. The logic drive may also comprise the I/O pads, metal pillars or bumps connecting or coupling to Serial Advanced Technology Attachment (SATA) ports, or Peripheral Components Interconnect express (PCIe) ports for communicating, connecting or coupling with the memory drive. Since the logic drives are standard commodity products, the product inventory management becomes easy, efficient and effective, therefore resulting in a shorter logic drive delivery time and becoming cost-effective.

Another aspect of the disclosure provides the standard commodity logic drive in a multi-chip package further comprising a dedicated control chip. The dedicated control chip is designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the dedicated control chip is 1, 2, 3, 4, 5 or greater than 5 nodes or generations older, more matured or less advanced than that used in the standard commodity FPGA IC chips packaged in the same logic drive. Transistors used in the dedicated control chip may be a FINFET, a Fully Depleted Silicon-on-insulator (FDSOI) MOSFET, a Partially Depleted Silicon-on-insulator (PDSOI) MOSFET or a conventional MOSFET. Transistors used in the dedicated control chip may be different from that used in the standard commodity FPGA IC chips packaged in the same logic drive; for example, the dedicated control chip may use the conventional MOSFET, while the standard commodity FPGA IC chips packaged in the same logic drive may use the FINFET; or the dedicated control chip may use the Fully Depleted Silicon-on-insulator (FDSOI) MOSFET, while the standard commodity FPGA IC chips packaged in the same logic drive may use the FINFET. The dedicated control chip provides control functions of downloading programing codes or data (configuration information or data) from outside (of the logic drive) to the Non-Volatile RAM (NVRAM) cells in the FPGA IC chips of the logic drive; the downloaded programing codes or data are then downloaded from the NVRAM cells to the 5T or 6T SRAM cells of the programmable interconnection or LUTs on the standard commodity FPGA chips. The NVRAM cells are MRAM, RRAM, or SS RRAM cells as described above. The driver in or of the dedicated control chip may amplify the data signals from the external circuits of the logic drive. The dedicated control chip also provides (1) inputting/outputting signals for a user's algorithm, architecture and/or application; (2) power management.

Another aspect of the disclosure provides the standard commodity logic drive in a multi-chip package further comprising a dedicated I/O chip. The dedicated I/O chip is designed, implemented and fabricated using varieties of semiconductor technology nodes or generations, including old or matured technology nodes or generations, for example, a semiconductor node or generation less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the dedicated I/O chip is 1, 2, 3, 4, 5 or greater than 5 nodes or generations older, more matured or less advanced than that used in the standard commodity FPGA IC chips packaged in the same logic drive. Transistors used in the dedicated I/O chip may be a Fully Depleted Silicon-on-insulator (FDSOI) MOSFET, a Partially Depleted Silicon-on-insulator (PDSOI) MOSFET or a conventional MOSFET. Transistors used in the dedicated I/O chip may be different from that used in the standard commodity FPGA IC chips packaged in the same logic drive; for example, the dedicated I/O chip may use the conventional MOSFET, while the standard commodity FPGA IC chips packaged in the same logic drive may use the FINFET; or the dedicated I/O chip may use the Fully Depleted Silicon-on-insulator (FDSOI) MOSFET, while the standard commodity FPGA IC chips packaged in the same logic drive may use the FINFET. The power supply voltage used in the dedicated I/O chip may be greater than or equal to 1.5V, 2.0 V, 2.5V, 3 V, 3.5V, 4V, or 5V, while the power supply voltage used in the standard commodity FPGA IC chips packaged in the same logic drive may be smaller than or equal to 2.5V, 2V, 1.8V, 1.5V, or 1 V. The power supply voltage used in the dedicated I/O chip may be different from that used in the standard commodity FPGA IC chips packaged in the same logic drive; for example, the dedicated I/O chip may use a power supply of 4V, while the standard commodity FPGA IC chips packaged in the same logic drive may use a power supply voltage of 1.5V; or the dedicated I/O chip may use a power supply of 2.5V, while the standard commodity FPGA IC chips packaged in the same logic drive may use a power supply of 0.75V. The gate oxide (physical) thickness of the Field-Effect-Transistors (FETs) may be thicker than or equal to 5 nm, 6 nm, 7.5 nm, 10 nm, 12.5 nm, or 15 nm, while the gate oxide (physical) thickness of FETs used in the standard commodity FPGA IC chips packaged in the same logic drive may be thinner than 4.5 nm, 4 nm, 3 nm or 2 nm. The gate oxide (physical) thickness of FETs used in the dedicated I/O chip may be different from that used in the standard commodity FPGA IC chips packaged in the same logic drive; for example, the dedicated I/O chip may use a gate oxide (physical) thickness of FETs of 10 nm, while the standard commodity FPGA IC chips packaged in the same logic drive may use a gate oxide (physical) thickness of FETs of 3 nm; or the dedicated I/O chip may use a gate oxide (physical) thickness of FETs of 7.5 nm, while the standard commodity FPGA IC chips packaged in the same logic drive may use a gate oxide (physical) thickness of FETs of 2 nm. The dedicated I/O chip provides inputs and outputs, and ESD protection for the logic drive. The dedicated I/O chip provides (i) large drivers or receivers, or I/O circuits for communicating with external or outside (of the logic drive), and (ii) small drivers or receivers, or I/O circuits for communicating with chips in or of the logic drive. The large drivers or receivers, or I/O circuits for communicating with external or outside (of the logic drive) have driving capability, loading, output capacitance or input capacitance lager or bigger than that of the small drivers or receivers, or I/O circuits for communicating with chips in or of the logic drive. The driving capability, loading, output capacitance, or input capacitance of the large I/O drivers or receivers, or I/O circuits for communicating with external or outside (of the logic drive) may be between 3 pF and 100 pF, 3 pF and 30 pF, 3 pF and 15 pF, or 3 pF and 10 pF. The driving capability, loading, output capacitance, or input capacitance of the small I/O drivers or receivers, or I/O circuits for communicating with chips in or of the logic drive may be between 0.1 pF and 2 pF or 0.1 pF and 1 pF. The size of ESD protection device on the dedicated I/O chip is larger than that on other standard commodity FPGA IC chips in the same logic drive. The size of the ESD device in the large I/O circuits may be between 0.5 pF and 15 pF, 0.5 pF and 10 pF or 0.5 pF and 5 pF. For example, a bi-directional (or tri-state) I/O pad or circuit may be used for the large I/O drivers or receivers, or I/O circuits for communicating with external or outside (of the logic drive), and may comprise an ESD circuit, a receiver, and a driver, and may have an input capacitance or output capacitance between 3 pF and 100 pF, 3 pF and 30 pF, 3 pF and 15 pF, or 3 pF and 10 pF. For example, a bi-directional (or tri-state) I/O pad or circuit may be used for the small I/O drivers or receivers, or I/O circuits for communicating with chips in or of the logic drive, and may comprise an ESD circuit, a receiver, and a driver, and may have an input capacitance or output capacitance between 0.1 pF and 2 pF or 0.1 pF and 1 pF.

The dedicated I/O chip (or chips) in the multi-chip package of the standard commodity logic drive may comprise a buffer and/or driver circuits for downloading the programing codes or data (configuration information or data) from the external circuits (of the logic drive) to the NVRAM cells and/or the 5T or 6T SRAM cells of the programmable interconnection or LUTs on the standard commodity FPGA chips. The programming codes or data from the external circuits of the logic drive may go through a buffer or driver in or of the dedicated I/O chip before getting into the NVRAM cells and/or the 5T or 6T SRAM cells of the programmable interconnection or LUTs on the standard commodity FPGA chips. The buffer in or of the dedicated I/O chip may latch the data from the external circuits (of the logic drive) and increase the bit-width of the data. For example, the data bit-width (in a SATA standard) from the external circuits (of the logic drive) is 1 bit, the buffer may latch the 1 bit data in each of the multiple SRAM cells in the buffer, and output the data stored or latched in the multiple SRAM cells in parallel and simultaneously to increase the data bit-width; for example, equal to or greater than 4, 8, 16, 32, or 64 data bit-width. For another example, the data bit-width (in a PCIe standard) from the external circuits (of the logic drive) is 32 bit, the buffer may increase the data bit-width to equal to or greater than 64, 128, or 256 data bit-width. The driver in or of the dedicated I/O chip may amplify the data signals from the external circuits (of the logic drive).

The dedicated I/O chip (or chips) in the multi-chip package of the standard commodity logic drive may comprise I/O circuits or pads (or micro copper pillars or bumps) for connecting or coupling to one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. The dedicated I/O chip may also comprise I/O circuits or pads (or micro copper pillars or bumps) for connecting or coupling to Serial Advanced Technology Attachment (SATA) ports, or Peripheral Components Interconnect express (PCIe) ports for communicating, connecting or coupling with the memory drive.

Another aspect of the disclosure provides the standard commodity logic drive in a multi-chip package further comprising a dedicated control and I/O chip. The dedicated control and I/O chip provides the functions of the dedicated control chip and the dedicated I/O chip, as described in the above paragraphs, in one chip. The dedicated control and I/O chip is designed, implemented and fabricated using varieties of semiconductor technology nodes or generations, including old or matured technology nodes or generations, for example, a semiconductor node or generation less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the dedicated control and I/O chip is 1, 2, 3, 4, 5 or greater than 5 nodes or generations older, more matured or less advanced than that used in the standard commodity FPGA IC chips packaged in the same logic drive. Transistors used in the dedicated control and I/O chip may be a FINFET, a Fully Depleted Silicon-on-insulator (FDSOI) MOSFET, a Partially Depleted Silicon-on-insulator (PDSOI) MOSFET or a conventional MOSFET. Transistors used in the dedicated control and I/O chip may be different from that used in the standard commodity FPGA IC chips packaged in the same logic drive; for example, the dedicated control and I/O chip may use the conventional MOSFET, while the standard commodity FPGA IC chips packaged in the same logic drive may use the FINFET; or the dedicated control and I/O chip may use the Fully Depleted Silicon-On-Insulator (FDSOI) MOSFET, while the standard commodity FPGA IC chips packaged in the same logic drive may use the FINFET. The above-mentioned specification for the small I/O circuits, i.e., small driver or receiver, and the large I/O circuits, i.e., large driver or receiver, in the dedicated I/O chip may be applied to that in the dedicated control and I/O chip.

Another aspect of the disclosure provides the standard commodity logic drive in a multi-chip package comprising the plural standard commodity FPGA IC chips, the dedicated I/O chip, and the dedicated control chip, for use in different algorithms, architectures and/or applications requiring logic, computing and/or processing functions by field programming. The communication between the chips of the logic drive and the communication between each chip of the logic drive and the external or outside (of the logic drive) are described as follows: (1) the dedicated I/O chip communicates directly with the other chip or chips of the logic drive, and also communicates directly with the external or outside (circuits) (of the logic drive). The dedicated I/O chip comprises two types of I/O circuits; one type having large driving capability, loading, output capacitance or input capacitance for communicating with the external or outside of the logic drive, and the other type having small driving capability, loading, output capacitance or input capacitance for communicating directly with the other chip or chips of the logic drive; (2) each of the plural FPGA IC chips only communicates directly with the other chip or chips of the logic drive, but does not communicate directly and/or does not communicate with the external or outside (of the logic drive); wherein an I/O circuit of one of the plural FPGA IC chips may communicate indirectly with the external or outside (of the logic drive) by going through an I/O circuit of the dedicated I/O chip; wherein the driving capability, loading, output capacitance or input capacitance of the I/O circuit of the dedicated I/O chip is significantly larger or bigger than that of the I/O circuit of the one of the plural FPGA IC chips, wherein the I/O circuit (for example, the input or output capacitance is smaller than 2 pF) of the one of the plural FPGA IC chips is connected or coupled to the large or big I/O circuit (for example, the input or output capacitance is larger than 3 pF) of the dedicated I/O chip for communicating with the external or outside circuits of the logic drive; (3) the dedicated control chip only communicates directly with the other chip or chips of the logic drive, but does not communicate directly and/or does not communicate with the external or outside (of the logic drive); wherein an I/O circuit of the dedicated control chip may communicate indirectly with the external or outside (of the logic drive) by going through an I/O circuit of the dedicated I/O chip; wherein the driving capability, loading, output capacitance or input capacitance of the I/O circuit of the dedicated I/O chip is significantly larger or bigger than that of the I/O circuit of the dedicated control chip. Alternatively, wherein the dedicated control chip may communicate directly with the other chip or chips of the logic drive, and may also communicate directly with the external or outside (of the logic drive). In the above, "Object X communicates directly with Object Y" means the Object X (for example, a first chip of the logic drive) communicates or couples electrically and directly with the Object Y without going through or passing through any other chip or chips of the logic drive. In the above, "Object X does not communicate directly with Object Y" means the Object X (for example, a first chip of or in the logic drive) may communicate or couple electrically but indirectly with the Object Y by going through or passing through any other chip or chips of the logic drive. "Object X does not communicate with Object Y" means the Object X (for example, a first chip of the logic drive) does not communicate or couple electrically and directly, and does not communicate or couple electrically and indirectly with the Object Y.

Another aspect of the disclosure provides the standard commodity logic drive in a multi-chip package comprising the plural standard commodity FPGA IC chips, and the dedicated control and I/O chip for use in different algorithms, architectures and/or applications requiring logic, computing and/or processing functions by field programming. The communication between the chips of the logic drive and the communication between each chip of the logic drive and the external or outside (of the logic drive) are described as follows: (1) the dedicated control and I/O chip communicates directly with the other chip or chips of the logic drive, and also communicates directly with the external or outside (circuits) (of the logic drive); The dedicated control and I/O chip comprises two types of I/O circuits; one type having large driving capability, loading, output capacitance or input capacitance for communicating with the external or outside of the logic drive, and the other type having small driving capability, loading, output capacitance or input capacitance for communicating directly with the other chip or chips of the logic drive; (2) each of the plural FPGA IC chips only communicates directly with the other chip or chips of the logic drive, but does not communicate directly and/or does not communicate with the external or outside (of the logic drive); wherein an I/O circuit of one of the plural FPGA IC chips may communicate indirectly with the external or outside (of the logic drive) by going through an I/O circuit of the dedicated control and I/O chip; wherein the driving capability, loading, output capacitance or input capacitance of the I/O circuit of the dedicated control and I/O chip is significantly larger or bigger than that of the I/O circuit of the one of the plural FPGA IC chips. The wordings "Object X communicates directly with Object Y", "Object X does not communicate directly with Object Y", and "Object X does not communicate with Object Y" have the same meanings as defined in the previous paragraph.

Another aspect of the disclosure provides a development kit or tool for a user or developer to implement an innovation and/or an application using the standard commodity logic drive. The user or developer with innovation and/or application concept or idea may purchase the standard commodity logic drive and use the corresponding development kit or tool to develop or to write software codes or programs to load into the non-volatile memory (NVRAM cells on the FPGA IC chips in the logic drive or one or more non-volatile NAND flash memory IC chips in the logic drive) of the standard commodity logic drive for implementing his/her innovation and/or application concept or idea.

Another aspect of the disclosure provides a logic drive in a multi-chip package format further comprising an Innovated ASIC or COT (abbreviated as IAC below) chip for Intellectual Property (IP) circuits, Application Specific (AS) circuits, analog circuits, mixed-mode signal circuits, Radio-Frequency (RF) circuits, and/or transmitter, receiver, transceiver circuits, etc. The IAC chip is designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the IAC chip is 1, 2, 3, 4, 5 or greater than 5 nodes or generations older, more matured or less advanced than that used in the standard commodity FPGA IC chips packaged in the same logic drive. Transistors used in the IAC chip may be a FINFET, a Fully Depleted Silicon-on-insulator (FDSOI) MOSFET, a Partially Depleted Silicon-On-Insulator (PDSOI) MOSFET or a conventional MOSFET. Transistors used in the IAC chip may be different from that used in the standard commodity FPGA IC chips packaged in the same logic drive; for example, the IAC chip may use the conventional MOSFET, while the standard commodity FPGA IC chips packaged in the same logic drive may use the FINFET; or the IAC chip may use the Fully Depleted Silicon-on-insulator (FDSOI) MOSFET, while the standard commodity FPGA IC chips packaged in the same logic drive may use the FINFET. Since the IAC chip in this aspect of disclosure may be designed and fabricated using older or less advanced technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm, its NRE cost is cheaper than or less than that of the current or conventional ASIC or COT chip designed and fabricated using an advanced IC technology node or generation, for example, more advanced than or below 20 nm or 10 nm, and for example using the technology node of 16 nm, 14 nm, 12 nm, 10 nm, 7 nm, 5 nm or 3 nm. The NRE cost for designing a current or conventional ASIC or COT chip using an advanced IC technology node or generation, for example, more advanced than or below 20 nm or 10 nm, may be more than US $5M, US $10M, US $20M or even exceeding US $50M, or US $100M. The cost of a photo mask set for an ASIC or COT chip at the 16 nm technology node or generation is over US $2M, US $5M, or US $10M. Implementing the same or similar innovation and/or application using the logic drive including the IAC chip designed and fabricated using older or less advanced technology nodes or generations may reduce NRE cost down to less than US $10M, US $7M, US $5M, US $3M or US $1M. Compared to the implementation by developing the current conventional logic ASIC or COT IC chip, the NRE cost of developing the IAC chip for the same or similar innovation and/or application may be reduced by a factor of larger than 2, 5, 10, 20, or 30.

Another aspect of the disclosure provides the logic drive in a multi-chip package format may comprises a dedicated control and IAC (abbreviated as DCIAC below) chip by combining the functions of the dedicated control chip and the IAC chip, as described in the above paragraphs, in one single chip. The DCIAC chip now comprises the control circuits, Intellectual Property (IP) circuits, Application Specific (AS) circuits, analog circuits, mixed-mode signal circuits, Radio-Frequency (RF) circuits, and/or transmitter, receiver, transceiver circuits, and etc. The DCIAC chip is designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the DCIAC chip is 1, 2, 3, 4, 5 or greater than 5 nodes or generations older, more matured or less advanced than that used in the standard commodity FPGA IC chips packaged in the same logic drive. Transistors used in the DCIAC chip may be a FINFET, a Fully Depleted Silicon-on-insulator (FDSOI) MOSFET, a Partially Depleted Silicon-on-insulator (PDSOI) MOSFET or a conventional MOSFET. Transistors used in the DCIAC chip may be different from that used in the standard commodity FPGA IC chips packaged in the same logic drive; for example, the DCIAC chip may use the conventional MOSFET, while the standard commodity FPGA IC chips packaged in the same logic drive may use the FINFET; or the DCIAC chip may use the Fully Depleted Silicon-on-insulator (FDSOI) MOSFET, while the standard commodity FPGA IC chips packaged in the same logic drive may use the FINFET. Since the DCIAC chip in this aspect of disclosure may be designed and fabricated using older or less advanced technology nodes or generations, for example, less advanced than or equal to, or more mature than 20 nm or 30 nm, and for example using the technology node of 22 nm, 28 run, 40 nm, 90 nm, 130 nm, 180 nm, 250 nm, 350 nm or 500 nm, its NRE cost is cheaper than or less than that of the current or conventional ASIC or COT chip designed and fabricated using an advanced IC technology node or generation, for example, more advanced than or below 20 nm or 10 nm, and for example using the technology node of 16 nm, 14 nm, 12 nm, 10 nm, 7 nm, 5 nm or 3 nm. The NRE cost for designing a current or conventional ASIC or COT chip using an advanced IC technology node or generation, for example, more advanced than or below 20 nm or 10 nm, may be more than US $5M, US $10M, US $20M or even exceeding US $50M, or US $100M. The cost of a photo mask set for an ASIC or COT chip at the 16 nm technology node or generation is over US $2M, US $5M or US $10M. Implementing the same or similar innovation and/or application using the logic drive including the DCIAC chip designed and fabricated using older or less advanced technology nodes or generations, may reduce NRE cost down to less than US $10M, US $7M, US $5M, US $3M or US $1M. Compared to the implementation by developing a logic ASIC or COT IC chip, the NRE cost of developing the DCIAC chip for the same or similar innovation and/or application may be reduced by a factor of larger than 2, 5, 10, 20, or 30.

Another aspect of the disclosure provides the logic drive in a multi-chip package further comprising a dedicated control, dedicated I/O, and IAC (abbreviated as DCDI/OIAC below) chip by combining the functions of the dedicated control chip, the dedicated I/O chip and the IAC chip, as described in the above paragraphs, in one single chip. The DCDI/OIAC chip comprises the control circuits, I/O circuits, Intellectual Property (IP) circuits, Application Specific (AS) circuits, analog circuits, mixed-mode signal circuits, Radio-Frequency (RF) circuits, and/or transmitter, receiver, transceiver circuits, and etc. The DCDI/OIAC chip is designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the DCDI/OIAC chip is 1, 2, 3, 4, 5 or greater than 5 nodes or generations older, more matured or less advanced than that used in the standard commodity FPGA IC chips packaged in the same logic drive. Transistors used in the DCDI/OIAC chip may be a Fully Depleted Silicon-on-insulator (FDSOI) MOSFET, a Partially Depleted Silicon-on-insulator (PDSOI) MOSFET or a conventional MOSFET. Transistors used in the DCDI/OIAC chip may be different from that used in the standard commodity FPGA IC chips packaged in the same logic drive; for example, the DCDI/OIAC chip may use the conventional MOSFET, while the standard commodity FPGA IC chips packaged in the same logic drive may use the FINFET; or the DCDI/OIAC chip may use the Fully Depleted Silicon-on-insulator (FDSOI) MOSFET, while the standard commodity FPGA IC chips packaged in the same logic drive may use the FINFET. Since the DCDI/OIAC chip in this aspect of disclosure may be designed and fabricated using older or less advanced technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm, its NRE cost is cheaper than or less than that of the current or conventional ASIC or COT chip designed and fabricated using an advanced IC technology node or generation, for example, more advanced than or below 20 nm or 10 nm, and for example using the technology node of 16 nm, 14 nm, 12 nm, 10 nm, 7 nm, 5 nm or 3 nm. The NRE cost for designing a current or conventional ASIC or COT chip using an advanced IC technology node or generation, for example, more advanced than or below 20 nm or 10 nm may be more than US $5M, US $10M, US $20M or even exceeding US $50M, or US $100M. The cost of a photo mask set for an ASIC or COT chip at the 16 nm technology node or generation is over US$2M, US $5M or US $10M. Implementing the same or similar innovation and/or application using the logic drive including the DCDI/OIAC chip designed and fabricated using older or less advanced technology nodes or generations, may reduce NRE cost down to less than US $10M, US $7M, US $5M, US $3M or US $1M. Compared to the implementation by developing a logic ASIC or COT IC chip, the NRE cost of developing the DCDI/OIAC chip for the same or similar innovation and/or application may be reduced by a factor of larger than 2, 5, 10, 20, or 30.

Another aspect of the disclosure provides a method to change the logic ASIC or COT IC chip hardware business into a mainly software business by using the logic drive. Since the performance, power consumption and engineering and manufacturing costs of the logic drive may be better or equal to the current conventional ASIC or COT IC chip for a same or similar innovation and/or application, the current ASIC or COT IC chip design companies or suppliers may become software developers, while only designing the IAC chip, the DCIAC chip, or the DCDI/OIAC chip, as described above, using older or less advanced semiconductor technology nodes or generations. In this aspect of disclosure, they may (1) design and own the IAC chip, the DCIAC chip, or the DCDI/OIAC chip; (2) purchase from a third party the standard commodity FPGA chips and standard commodity non-volatile memory chips in the bare-die or packaged format; (3) design and fabricate (may outsource the manufacturing to a third party of the manufacturing provider) the logic drive including their own IAC, DCIAC, or DCI/OIAC chip, and the purchased third party's standard commodity FPGA chips and standard commodity non-volatile memory chips; (3) install in-house developed software for the innovation and/or application in the non-volatile memory IC chip or chips in the logic drive; and/or (4) sell the program-installed logic drive to their customers. In this case, they still sell hardware without performing the expensive ASIC or COT IC chip design and production using advanced semiconductor technology nodes, for example, nodes or generations more advanced than or below 20 nm or 10 nm. They may write software codes to program the logic drive comprising the plural of standard commodity FPGA chips for their desired algorithms, architectures and/or applications, for example, in algorithms, architectures and/or applications of Artificial Intelligence (AI), machine learning, deep learning, big data, Internet Of Things (IOT), Virtual Reality (VR), Augmented Reality (AR), car electronics, Graphic Processing (GP), Digital Signal Processing (DSP), Micro Controlling (MC), and/or Central Processing (CP).

Another aspect of the disclosure provides the logic drive in a multi-chip package comprising plural standard commodity FPGA IC chips, further comprising a processing and/or computing IC chip, for example, a Central Processing Unit (CPU) chip, a Graphic Processing Unit (GPU) chip, a Digital Signal Processing (DSP) chip, a Tensor Processing Unit (TPU) chip, and/or an Application Processing Unit (APU) chip, designed, implemented and fabricated using an advanced semiconductor technology node or generation, for example more advanced than or equal to, or below or equal to 30 nm, 20 nm or 10 nm, and for example using the technology node of 28 nm, 22 nm, 16 nm, 14 nm, 12 nm, 10 nm, 7 nm, 5 nm or 3 nm, which may be the same as, one or two generation or node less advanced than, or one or two generation or node more advanced than that used for the FPGA IC chips in the same logic drive. The processing and/or computing IC chip may comprise: (1) CPU and DSP unit, (2) CPU and GPU, (3) DSP and GPU or (4) CPU, GPU and DSP unit. Transistors used in the processing and/or computing IC chip may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET. Alternatively, a plurality of the processing and/or computing IC chips may be included, packaged, or incorporated in the logic drive. Alternatively, two processing and/or computing IC chips are included, packaged or incorporated in the logic drive, the combination for the two processing and/or computing IC chips is as below: (1) one of the two processing and/or computing IC chips may be a Central Processing Unit (CPU) chip, and the other one of the two processing and/or computing IC chips may be a Graphic Processing unit (GPU); (2) one of the two processing and/or computing IC chips may be a Central Processing Unit (CPU), and the other one of the two processing and/or computing IC chips may be a Digital Signal Processing (DSP) unit; (3) one of the two processing and/or computing IC chips may be a Central Processing Unit (CPU), and the other one of the two processing and/or computing IC chips may be a Tensor Processing Unit (TPU); (4) one of the two processing and/or computing IC chips may be a Graphic Processing Unit (GPU), and the other one of the two processing and/or computing IC chips may be a Digital Signal Processing (DSP) unit; (5) one of the two processing and/or computing IC chips may be a Graphic Processing Unit (GPU), and the other one of the two processing and/or computing IC chips may be a Tensor Processing Unit (TPU); (6) one of the two processing and/or computing IC chips may be a Digital Signal Processing (DSP) unit, and the other one of the two processing and/or computing IC chips may be a Tensor Processing Unit (TPU). Alternatively, three processing and/or computing IC chips are incorporated in the logic drive, the combination for the three processing and/or computing IC chips is as below: (1) one of the three processing and/or computing IC chips may be a Central Processing Unit (CPU), another one of the three processing and/or computing IC chips may be a graphic Processing Unit (GPU), and the other one of the three processing and/or computing IC chips may be a Digital Signal Processing (DSP) unit; (2) one of the three processing and/or computing IC chips may be a Central Processing Unit (CPU), another one of the three processing and/or computing IC chips may be a Graphic Processing Unit (GPU), and the other one of the three processing and/or computing IC chips may be a Tensor Processing Unit (TPU); (3) one of the three processing and/or computing IC chips may be a Central Processing Unit (CPU), another one of the three processing and/or computing IC chips may be a Digital Signal Processing (DSP) unit, and the other one of the three processing and/or computing IC chips may be a Tensor Processing Unit (TPU); (4) one of the three processing and/or computing IC chips may be a Graphic processing unit (GPU), another one of the three processing and/or computing IC chips may be a Digital Signal Processing (DSP) unit, and the other one of the three processing and/or computing IC chips may be a Tensor Processing Unit (TPU). Alternatively, the combination for the multiple processing and/or computing IC chips may comprise: (1) multiple GPU chips, for example 2, 3, 4 or more than 4 GPU chips, (2) one or more CPU chips and/or one or more GPU chips, (3) one or more CPU chips and/or one or more DSP chips, (3) one or more CPU chips, one or more GPU chips and/or one or more DSP chips, (4) one or more CPU chips and/or one or more TPU chips, or, (5) one or more CPU chips, one or more DSP chips and/or one or more TPU chips. In all of the above alternatives, the logic drive may comprise one or more of the processing and/or computing IC chips, and one or more high speed, high bandwidth cache SRAM chips or DRAM IC chips for high speed parallel processing and/or computing. For example, the logic drive may comprise multiple GPU chips, for example 2, 3, 4 or more than 4 GPU chips, and multiple high speed, high bandwidth cache SRAM chips or DRAM IC chips. The communication between one of GPU chips and one of SRAM or DRAM IC chips may be with data bit-width of equal or greater than 64, 128, 256, 512, 1024, 2048, 4096, 8K, or 16K. For another example, the logic drive may comprise multiple TPU chips, for example 2, 3, 4 or more than 4 TPU chips, and multiple high speed, high bandwidth cache SRAM chips or DRAM IC chips. The communication between one of TPU chips and one of SRAM or DRAM IC chips may be with data bit-width of equal or greater than 64, 128, 256, 512, 1024, 2048, 4096, 8K, or 16K.

The communication, connection, or coupling between one of logic, processing and/or computing chips (for example, FPGA, CPU, GPU, DSP, APU, TPU, and/or ASIC chips) and one of high speed, high bandwidth SRAM, DRAM or NVM chips, through the Fan-Out Interconnection Scheme of the logic Drive (FOISD, to be described and specified below), may be the same or similar as that between internal circuits in a same chip. Alternatively, the communication, connection, or coupling between one of logic, processing and/or computing chips (for example, FPGA, CPU, GPU, DSP, APU, TPU, and/or ASIC chips) and one of high speed, high bandwidth SRAM, DRAM or NVM chips, through the FOISD, may be using small I/O drivers and/or receivers. The driving capability, loading, output capacitance, or input capacitance of the small I/O drivers or receivers, or I/O circuits may be between 0.1 pF and 2 pF or 0.1 pF and 1 pF. For example, a bi-directional (or tri-state) I/O pad or circuit may be used for the small I/O drivers or receivers, or I/O circuits for communicating between high speed, high bandwidth logic and memory chips in the logic drive, and may comprise an ESD circuit, a receiver, and a driver, and may have an input capacitance or output capacitance between 0.1 pF and 2 pF or 0.1 pF and 1 pF.

The processing and/or computing IC chip or chips in the logic drive provide fixed-metal-line (non-field-programmable) interconnects for (non-field-programmable) functions, processors and operations. The standard commodity FPGA IC chips provide (1) programmable-metal-line (field-programmable) interconnects for (field-programmable) functions, processors and operations and (2) fixed-metal-line (non-field-programmable) interconnects for (non-field-programmable) functions, processors and operations. Once the programmable-metal-line interconnects in or of the FPGA IC chips are programmed, the programmed interconnects together with the fixed interconnects in or of the FPGA chips provide some specific functions for some given algorithms, architectures and/or applications. The operational FPGA chips may operate together with the processing and/or computing IC chip or chips in the same logic drive to provide powerful functions and operations in algorithms, architectures and/or applications, for example, Artificial Intelligence (AI), machine learning, deep learning, big data, Internet Of Things (IOT), Virtual Reality (VR), Augmented Reality (AR), driverless car electronics, Graphic Processing (GP), Digital Signal Processing (DSP), Micro Controlling (MC), and/or Central Processing (CP).

Another aspect of the disclosure provides the standard commodity FPGA IC chip for use in the logic drive. The standard commodity FPGA chip is designed, implemented and fabricated using an advanced semiconductor technology node or generation, for example more advanced than or equal to, or below or equal to 20 nm or 10 nm, and for example using the technology node of 16 nm, 14 nm, 12 nm, 10 nm, 7 nm, 5 nm or 3 nm. The standard commodity FPGA IC chip also comprises MRAM, RRAM or SS RRAM cells. The standard commodity FPGA IC chips are fabricated by the flowing process steps described in the following paragraphs:

(1) Providing a semiconductor substrate (for example, a silicon substrate), or a Silicon-On-Insulator (SOI) substrate, with the substrate in the wafer form, and with a wafer size, for example 8", 12" or 18" in the diameter. Transistors are formed in the substrate, and/or on or at the surface of the substrate by a wafer process. Transistors formed in the advanced semiconductor technology node or generation may be a FINFET, a FINFET on Silicon-on-insulator (FINFET SOI), a Fully Depleted Silicon-on-insulator (FDSOI) MOSFET, a Partially Depleted Silicon-on-insulator (PD-SOI) MOSFET or a conventional MOSFET;

(2) Forming a First Interconnection Scheme in, on or of the Chip (FISC) over the substrate and on or over a layer comprising transistors, by a wafer process. The FISC comprises multiple interconnection metal layers, with an inter-metal dielectric layer between each of the multiple interconnection metal layers. The FISC structure may be formed by performing a single damascene copper process and/or a double damascene copper process. As an example, the metal lines and traces of an interconnection metal layer in the multiple interconnection metal layers may be formed by the single damascene copper process as follows: (i) providing a first insulating dielectric layer (may be an inter-metal dielectric layer with the top surfaces of vias or metal pads, lines or traces exposed and formed therein). The top-most layer of the first insulting dielectric layer may be, for example, a low k dielectric layer, for an example, a SiOC layer; (ii) depositing, for example, by Chemical Vapor Deposition (CVD) methods, a second insulting dielectric layer on or over the whole wafer, including on or over the first insulating dielectric layer, and on or over the exposed vias or metal pads in the first insulating dielectric layer. The second insulting dielectric layer is formed by (a) depositing a bottom differentiate etch-stop layer, for example, a Silicon Carbon Nitride layer (SiCN), on or over the top-most layer of the first insulting dielectric layer and on the exposed top surfaces of the vias or metal pads in the first insulating dielectric layer; (b) then depositing a low k dielectric layer, for example, a SiOC layer, on or over the bottom differentiate etch-stop layer. The low k dielectric material has a dielectric constant smaller than that of the $SiO_2$ material. The SiCN and SiOC layers may be deposited by CVD methods. The material used for the first and second insulating dielectric layers of the FISC comprises inorganic material, or material compounds comprising silicon, nitrogen, carbon, and/or oxygen; (iii) then forming trenches or openings in the second insulting dielectric layer by (a) coating, exposing, developing a photoresist layer to form trenches or openings in the photoresist layer, and then (b) forming trenches or openings in the second insulating dielectric layer by etching methods, and then removing the photoresist layer; (iv) followed by depositing an adhesion layer on or over the whole wafer including in the trenches or openings in the second insulating dielectric layer, for example, sputtering or Chemical Vapor Depositing (CVD) a titanium (Ti) or titanium nitride (TiN) layer (with thickness for example, between 1 nm to 50 nm); (v) then depositing an electroplating seed layer on or over the adhesion layer, for example, sputtering or CVD depositing a copper seed layer (with a thickness, for example, between 3 nm and 200 nm); (vi) then electroplating a copper layer (with a thickness, for example, between 10 nm and 3,000 nm, 10 nm and 1,000 nm or 10 nm and 500 nm) on or over the copper seed layer; (vii) then applying a Chemical-Mechanical Process (CMP) to remove the unwanted metals (Ti or TiN)/Seed Cu/electroplated Cu) outside the trenches or openings in the second insulating dielectric layer, until the top surface of the second insulating dielectric layer is exposed. The metals left or remained in trenches or openings in or of the second insulating dielectric layer are used as metal vias, lines or traces for the interconnection metal layer of the FISC.

As another example, the metal lines and traces of an interconnection metal layer of the FISC, and the vias in an inter-metal dielectric layer of the FISC may be form by a double damascene copper process as follows: (i) providing a first insulating dielectric layer with top surfaces of metal lines or traces or metal pads (in the first insulating dielectric layer) exposed. The top-most layer of the first insulting dielectric layer may be, for example, a Silicon Carbon Nitride layer (SiCN) or Silicon Nitride (SiN) layer; (ii) depositing a dielectric stack layer comprising multiple insulating dielectric layers on the top-most layer of the first insulting dielectric layer and the exposed top surfaces of metal lines and traces in the first insulating dielectric layer. The dielectric stack layer comprises, from bottom to top, (a) a bottom low k dielectric layer, for example, a SiOC layer (to be used as the via layer or the inter-metal dielectric layer), (b) a middle differentiate etch-stop layer, for example, a Silicon Carbon Nitride layer (SiCN) or Silicon Nitride layer (SiN), (c) a top low k SiOC layer (to be used as the insulating dielectrics between metal lines or traces in or of the same interconnection metal layer), and (d) a top differentiate etch-stop layer, for example, a Silicon Carbon Nitride layer (SiCN) or Silicon Nitride (SiN) layer. All insulating dielectric layers, (SiCN, SiN, SiOC) may be deposited by CVD methods; (iii) forming trenches, openings or holes in the dielectric stack: (a) coating, exposing and developing a first photoresist layer to form trenches or openings in the first photoresist layer; and then (b) etching the exposed top differentiate etch-stop layer (SiCN or SiN), and the top low k SiOC layer, and stopping at the middle differentiate etch-stop layer, (SiCN or SiN), forming trenches or top openings in the top portion of the dielectric stack layer for the later double-damascene copper process to from metal lines or traces of the interconnection metal layer; (c) then coating, exposing and developing a second photoresist layer to form openings or holes in the second photoresist layer; (d) etching the exposed middle differentiate etch-stop layer (SiCN or SiN), and the bottom low k SiOC layer, and stopping at the metal lines and traces in the first insulating dielectric layer, forming bottom openings or holes in the bottom portion of the dielectric stack layer for the later double-damascene copper process to form the vias in the inter-metal dielectric layer. The trenches or top openings in the top portion of the dielectric stack layer overlap the bottom openings or holes in the bottom portion of the dielectric stack layer, and have a larger size than that of the bottom openings or holes. In other words, the bottom openings or holes in the bottom portion of the dielectric stack layer, are inside or enclosed by the trenches or top openings in the top portion of the dielectric stack layer form a top view; (iv) forming metal lines or traces and vias: (a) depositing an adhesion layer on or over the whole wafer, including on or over the dielectric stack layer, and in the etched trenches or top openings in the top portion of the dielectric stack layer, and in the bottom openings or holes in the bottom portion of the dielectric stack layer. For example, sputtering or CVD depositing a titanium (Ti) or titanium nitride (TiN) layer (with a thickness, for example, between 1 nm to 50 nm), (b) then depositing an electroplating seed layer on or over the adhesion layer, for example, sputtering or CVD depositing a copper seed layer (with a thickness, for example, between 3 nm and 200 nm); (c) then electroplating a copper layer (with a thickness, for example, between 20 nm and 6,000 nm, 10 nm and 3,000 nm, or between 10 nm and 1,000 nm) on or over the copper seed layer; (d) then applying a Chemical-Mechanical Process (CMP) to remove the un-wanted metals (Ti(or TiN)/Seed Cu/electroplated Cu) outside the trenches or top openings, and the bottom openings or holes in the dielectric stack layer, until the top surface of the dielectric stack layer is exposed. The metals left or remained in the trenches or top openings are used as metal lines or traces for the interconnection metal layer, and the metals left or remained in the bottom openings or holes are used as vias in the inter-metal dielectric layer for coupling the metal lines or traces below and above the vias.

In the single-damascene process, the copper electroplating process step and the CMP process step are performed for the metal lines or traces of an interconnection metal layer, and are then performed sequentially again for vias in an inter-metal dielectric layer on the interconnection metal layer. In other words, in the single damascene copper process, the copper electroplating process step and the CMP process step are performed two times for forming the metal lines or traces of an interconnection metal layer, and vias in an inter-metal dielectric layer on the interconnection metal layer. In the double-damascene process, the copper electroplating process step and the CMP process step are performed only one time for forming the metal lines or traces of an interconnection metal layer, and vias in an inter-metal dielectric layer under the interconnection metal layer. The processes for forming metal lines or traces of the interconnection metal layer and vias in the inter-metal dielectric layer using the single damascene copper process or the double damascene copper process may be repeated multiple times to form metal lines or traces of multiple interconnection metal layers and vias in inter-metal dielectric layers of the FISC. The FISC may comprise 4 to 15 layers, or 6 to 12 layers of interconnection metal layers.

The metal lines or traces in the FISC are coupled or connected to the underlying transistors. The thickness of the metal lines or traces of the FISC, either formed by the single-damascene process or by the double-damascene process, is, for example, between 3 nm and 1,000 nm, or between 10 nm and 500 nm, or, thinner than or equal to 5 nm, 10 nm, 30 nm, 50 nm, 100 nm, 200 nm, 300 nm, 500 nm, or 1,000 nm. The width of the metal lines or traces of the FISC is, for example, between 3 nm and 1,000 nm, or between 10 nm and 500 nm, or, narrower than 5 nm, 10 nm, 20 nm, 30 nm, 70 nm, 100 nm, 300 nm, 500 nm or 1,000 nm. The thickness of the inter-metal dielectric layer has a thickness, for example, between 3 nm and 1,000 nm, or between 10 nm and 500 nm, or thinner than 5 nm, 10 nm, 30 nm, 50 nm, 100 nm, 200 nm, 300 nm, 500 nm or 1,000 nm. The metal lines or traces of the FISC may be used for the programmable interconnection.

(3) Depositing a passivation layer on or over the whole wafer and on or over the FISC structure. The passivation is used for protecting the transistors and the FISC structure from water moisture or contamination form the external environment, for example, sodium mobile ions. The passivation comprises a mobile ion-catching layer or layers, for example, SiN, SiON, and/or SiCN layer or layers. The total thickness of the mobile ion catching layer or layers is thicker than or equal to 100 nm, 150 nm, 200 nm, 300 nm, 450 nm, or 500 nm. Openings in the passivation layer may be formed to expose the top surface of the top-most interconnection metal layer of the FISC, and for forming vias in the passivation openings in the following processes later.

(4) Performing process steps to form MRAM, RRAM or SS RRAM cells either embedded in the FISC layers (under the passivation layer), or, on or over the passivation layer. The process steps for forming MRAM, RRAM or SS RRAM cells are as described above.

(5) Forming a Second Interconnection Scheme in, on or of the Chip (SISC) on or over the FISC structure. The SISC comprises multiple interconnection metal layers, with an inter-metal dielectric layer between each of the multiple interconnection metal layers, and may optionally comprise an insulating dielectric layer on or over the passivation layer, and between the bottom-most interconnection metal layer of the SISC and the passivation layer. The insulating dielectric layer is deposited on or over the whole wafer, including passivation layer and in the passivation openings. The insulating dielectric layer may have planarization function. A polymer material may be used for the insulating dielectric layer, for example, polyimide, BenzoCycloButene (BCB), parylene, epoxy-based material or compound, photo epoxy SU-8, elastomer or silicone. The material used for the insulating dielectric layer of SISC comprises organic material, for example, a polymer, or material compounds comprising carbon. The polymer layer may be deposited by methods of spin-on coating, screen-printing, dispensing, or molding. The polymer material may be photosensitive, and may be used as photoresist as well for patterning openings in it for forming metal vias in it by following processes to be performed later; that is, the photosensitive polymer layer is coated, and exposed to light through a photomask, and then developed and etched to form openings in it. The opening in the photosensitive insulating dielectric layer overlaps the opening in the passivation layer, exposing the top surfaces of the top-most metal layer of the FISC. In some applications or designs, the size of opening in the polymer layer is larger than that of the opening in the passivation layer, and the top surface of the passivation layer is exposed in the opening of the polymer layer. The photosensitive polymer layer (the insulating dielectric layer) is then cured at a temperature, for example, at or higher than 100° C., 125° C., 150° C., 175° C., 200° C., 225° C., 250° C., 275° C. or 300° C. An emboss copper process is then performed on or over the cured polymer layer and on or over the exposed top surfaces of the top-most interconnection metal layer of the FISC in openings in the cured polymer layer, or, on or over the exposed surface of the passivation layer in the openings of the cured polymer layer for some cases: (a) first depositing the whole wafer an adhesion layer on or over the cured polymer layer and on or over the exposed top surfaces of the top-most interconnection metal layer of the FISC in openings in the cured polymer layer, or, on or over the exposed surface of the passivation layer in the openings of the cured polymer layer for some cases, for example, sputtering or CVD depositing a titanium (Ti) or titanium nitride (TiN) layer (with a thickness, for example, between 1 nm and 50 nm); (b) then depositing an electroplating seed layer on or over the adhesion layer, for example, sputtering or CVD depositing a copper seed layer (with a thickness, for example, between 3 nm and 200 nm); (c) coating, exposing and developing a photoresist layer on or over the copper seed layer; forming trenches or openings in the photoresist layer for forming metal lines or traces of the interconnection metal layer of SISC by following processes to be performed later, wherein portion of the trench (opening) in the photoresist layer may overlap the whole area of opening in the cured polymer layer for forming vias in the openings of the cured polymer layer by following processes to be performed later; exposing the copper seed layer at the bottom of the trenches or openings; (d) then electroplating a copper layer (with a thickness, for example, between 0.3 μm and 20 μm, 0.5 μm and 5 μm, 1 μm and 10 μm, or 2 μm and 10 μm) on or over the copper seed layer at the bottom of the patterned trenches or openings in the photoresist layer; (e) removing the remained photoresist; (f) removing or etching the copper seed layer and the adhesion layer not under the electroplated copper. The emboss metals (Ti (or TiN)/seed Cu/electroplated Cu) left or remained in the openings of the cured polymer layer are used for vias in the insulating dielectric layer and vias in the passivation layer; and the emboss metals (Ti (or TiN)/seed Cu/electroplated Cu) left or remained in the locations of trenches or openings in the photoresist, (noted: the photoresist is removed after copper electroplating) are used for the metal lines or traces of the interconnection metal layer. The processes of forming the insulating dielectric layer and openings in it, and the emboss copper processes for forming the vias in the insulting dielectric layer and the metal lines or traces of the interconnection metal layer, may be repeated to form multiple interconnection metal layers in or of the SISC; wherein the insulating dielectric layer is used as the inter-metal dielectric layer between two interconnection metal layers of the SISC, and the vias in the insulating dielectric layer (now in the inter-metal dielectric layer) are used for connecting or coupling metal lines or traces of the two interconnection metal layers. The top-most interconnection metal layer of the SISC is covered with a top-most insulating dielectric layer of SISC. The top-most insulating dielectric layer has openings in it to expose top surface of the top-most interconnection metal layer. The SISC may comprise 2 to 6, or 3 to 5 layers of interconnection metal layers. The metal lines or traces of the interconnection metal layers of the SISC have the adhesion layer (Ti or TiN, for example) and the copper seed layer only at the bottom, but not at the sidewalls of the metal lines or traces. The metal lines or traces of the interconnection metal layers of FISC have the adhesion layer (Ti or TiN, for example) and the copper seed layer at both the bottom and the sidewalls of the metal lines or traces.

The SISC interconnection metal lines or traces are coupled or connected to the FSIC interconnection metal lines or traces, or to transistors in the chip, through vias in openings of the passivation layer. The thickness of the metal lines or traces of SISC is between, for example, 0.3 μm and 20 μm, 0.5 μm and 10 μm, 1 μm and 5 μm, 1 μm and 10 μm, or 2 μm and 10 μm; or thicker than or equal to 0.3 μm, 0.5 μm, 0.7 μm, 1 μm, 1.5 μm, 2 μm or 3 μm. The width of the metal lines or traces of SISC is between, for example, 0.3 μm and 20 μm, 0.5 μm and 10 μm, 1 μm and 5 μm, 1 μm and 10 μm, or 2 μm and 10 μm; or wider than or equal to 0.3 μm, 0.5 μm, 0.7 μm, 1 μm, 1.5 μm, 2 μm or 3 μm. The thickness of the inter-metal dielectric layer has a thickness between, for example, 0.3 μm and 20 μm, 0.5 μm and 10 μm, 1 μm and 5 μm, or 1 μm and 10 μm; or thicker than or equal to 0.3 μm, 0.5 μm, 0.7 μm, 1 μm, 1.5 μm, 2 μm or 3 μm. The metal lines or traces of SISC may be used for the programmable interconnection.

(6) Forming micro copper pillars or bumps with solder caps (i) on the top surface of the top-most interconnection metal layer of SISC, exposed in openings in the insulating dielectric layer of the SISC, and/or (ii) on or over the top-most insulating dielectric layer of the SISC. An emboss metal electroplating process, as described in above paragraphs, is performed to form the micro copper pillars or bumps with solder caps as follows: (a) depositing whole wafer an adhesion layer on or over the top-most dielectric layer of the SISC structure, and in the openings of the top-most insulating dielectric layer, for example, sputtering or CVD depositing a titanium (Ti) or titanium nitride (TiN) layer (with thickness for example, between 1 nm to 50 nm); (b) then depositing an electroplating seed layer on or over the adhesion layer, for example, sputtering or CVD depositing a copper seed layer (with a thickness between, for example, 3 nm and 300 nm, or 3 nm and 200 nm); (c) coating, exposing and developing a photoresist layer; forming openings or holes in the photoresist layer for forming the micro pillars or bumps in later processes, exposing (i) a top surface of the top-most interconnection metal layer at the bottom of the openings in the top-most insulating layer of the SISC, and (ii) exposing an area or a ring of the top-most insulating dielectric layer (of the SISC) around the opening in the top-most insulating dielectric layer; (d) then electroplating a copper layer (with a thickness, for example, between 3 μm and 60 μm, 5 μm and 50 μm, 5 μm and 40 μm, 5 μm and 30 μm, 5 μm and 20 μm, or 5 μm and 15 μm) on or over the copper seed layer in the patterned openings or holes in the photoresist layer; (e) then electroplating a solder layer (with a thickness, for example, between 1 μm and 50 μm, 1 μm and 30 μm, 5 μm and 30 μm, 5 μm and 20 μm, 5 μm and 15 μm, 5 μm and 10 μm, 5 μm and 10 μm, 1 μm and 10 μm, or 1 μm and 3 μm) on or over the electroplated copper layer in the openings of the photoresist; optionally, a nickel layer may be electroplated before electroplating the solder cap or layer and after electroplating the copper layer. The nickel layer may have a thickness, for example, between 1 μm and 10 μm, 3 μm and 10 μm, 3 μm and 5 μm, 1 μm and 5 μm, or 1 μm and 3 μm); (f) removing the remained photoresist; (g) removing or etching the copper seed layer and the adhesion layer not under the electroplated copper layer and the electroplated solder layer; (h) reflowing solder to form the solder bumps. The metals (Ti (or TiN)/seed Cu/electroplated Cu/electroplated solder) left or remained and solder-reflowed are used as the solder bumps. The solder material used may be a lead-free solder. Lead-free solders in commercial use may contain tin, copper, silver, bismuth, indium, zinc, antimony, or traces of other metals. For example, the lead-free solder may be Sn—Ag—Cu (SAC) solder, Sn—Ag solder, or Sn—Ag—Cu—Zn solder. The copper micro pillars or bumps with solder caps are coupled or connected to the SISC and FISC interconnection metal lines or traces, and to transistors in or of the chip, through vias in openings in the top-most insulating dielectric layer of the SISC. The height of the micro pillars or bumps is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm. The largest dimension in a cross-section of the micro pillars or bumps (for example, the diameter of a circle shape, or the diagonal length of a square or rectangle shape) is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. The space between a micro pillar or bump to its nearest neighboring pillar or bump is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm.

(7) Cutting or dicing the wafer to obtain separated standard commodity FPGA chips. The standard commodity FPGA chips comprise, from bottom to top: (i) a layer comprising transistors, (ii) the FISC, (iii) a passivation layer, (iv) MRAM, RRAM or SS RRAM cells layer (optionally, may be under the passivation layer), (v) the SISC and (vi) micro copper pillars or bumps, above a level of the top surface of the top-most insulating dielectric layer of the SISC by a height of, for example, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm.

Another aspect of the disclosure provides a Temporary Substrate (T-Sub) with a Fan-Out Interconnection Scheme of the logic Drive (FOISD). The FOISD comprises fan-out interconnection metal lines or traces and micro metal pads, pillars or bumps on or over the T-Sub. The micro metal pads, pillars or bumps are used for flip-chip assembly or packaging in forming the multi-chip package of the logic drive. The multi-chips are flip-chip packaged on the T-Sub using the micro pads, metal pillars or bumps. The T-Sub may be in a wafer format (with 8", 12" or 18" in diameter), or, in a panel format in the square or rectangle format (with a width or a length greater than or equal to 20 cm, 30 cm, 50 cm, 75 cm, 100 cm, 150 cm, 200 cm or 300 cm). The substrate is served as a temporary support for the wafer-level or panel-level processes. The substrate will be removed or released after the processes, to be described and specified in following paragraphs, of (a) FOISD, (b) flip-chip assembly and underfill, and (c) molding. The IC chips or packages to be flip-chip assembled, bonded or packaged, to the substrate (T-Sub) include the chips or packages mentioned, described and specified above: the standard commodity FPGA chips, the dedicated control chip, the dedicated I/O chip, the dedicated control and I/O chip, IAC, DCIAC, DCDI/OIAC chip, and/or the processing and/or computing IC chip, for example CPU, GPU, DSP, TPU, or APU chip. The process steps for forming the FOISD are as follows:

(1) Providing a substrate (T-Sub). The substrate may be in a wafer format (with 8", 12" or 18" in diameter), or, in a panel format in the square or rectangle format (with a width or a length greater than or equal to 20 cm, 30 cm, 50 cm, 75 cm, 100 cm, 150 cm, 200 cm or 300 cm). The material of the substrate may be silicon, metal, ceramics, glass, steel, plastics, polymer, epoxy-based polymer, or epoxy-based compound. As an example, a glass substrate may be used as a temporary substrate in forming FOISD on the glass substrate.

(2) forming a sacrificial bonding layer on the glass substrate. The sacrificial bonding layer is used (i) as a bonding layer to bond the FOISD structures (high density fan-out and interconnection structures and the micro metal pads, pillars or bumps) to be built on it; and (ii) as a substrate-release layer to debond or release the substrate from the structure comprising FOISD, underfill, IC chips and molding compound, after finished the processes of forming the FOISDs, flip-chip assembly/underfill and molding. The material used for the sacrificial bonding layer is a Light-To-Heat Conversion (LTHC) material, and is coating by screen printing, spin-on coating or adhesive film attachment. The LTHC may be in liquid form and deposited on the glass substrate (T-Sub) by printing or spin-on coating and then cured or dried. The sacrificial bonding layer may have a thickness of about 1 micrometer or between 0.5 and 2 micrometers. The LTHC material may be a liquid ink comprising carbon black and binder in a mixture of solvents.

(3) Forming the FOISD (Fan-Out Interconnection Scheme of the logic Drive), mentioned above, on or over the sacrificial bonding layer and the T-Sub. The FOISD comprises multiple interconnection metal layers, with an intermetal dielectric layer between each of the multiple interconnection metal layers. The metal lines or traces and the metal vias are formed by the emboss copper processes as described or specified in forming the metal lines or traces and metal vias in the SISC of FPGA IC chips. The FOISD is formed by first depositing a bottom-most dielectric insulating layer, forming openings in the bottom-most dielectric insulating layer, and then formed a bottom-most metal layer on the bottom-most dielectric insulating layer and in the openings in the bottom-most dielectric insulating layer. The metal in the openings are the metal vias, and the bottom of metal vias are exposed (and to be used as metal via contacts) when the temporary substrate (T-Sub) and the sacrificial bonding layer are removed or released later on. The processes for forming the bottom-most dielectric layer, metal vias in the bottom-most dielectric layer, and the bottom-most interconnection metal layer (metal lines or traces) using the emboss copper process may be repeated multiple times to form metal lines or traces of multiple interconnection metal layers and vias in inter-metal dielectric layers of the FOISD. The processes and materials for forming (a) the bottom-most dielectric insulating layer or inter-metal dielectric layers, (b) the bottom-most metal layer or multiple interconnection metal layers, and (c) metal vias in the inter-metal dielectric layer, are the same as described and specified in forming the SISC of FPGA IC chips. The FOISD may comprise 1 to 7 layers, or 1 to 4 layers of interconnection metal layers.

The thickness of the metal lines or traces of FOISD is between, for example, 0.3 μm and 20 μm, 0.5 μm and 10 μm, 1 μm and 5 μm, 1 μm and 10 μm, or 2 μm and 10 μm; or thicker than or equal to 0.3 μm, 0.5 μm, 0.7 μm, 1 μm, 1.5 μm, 2 μm or 3 μm. The width of the metal lines or traces of FOISD is between, for example, 0.3 μm and 20 μm, 0.5 μm and 10 μm, 1 μm and 5 μm, 1 μm and 10 μm, or 2 μm and 10 μm; or wider than or equal to 0.3 μm, 0.5 μm, 0.7 μm, 1 μm, 1.5 μm, 2 μm or 3 μm. The thickness of the inter-metal dielectric layer has a thickness between, for example, 0.3 μm and 20 μm, 0.5 μm and 10 μm, 1 μm and 5 μm, or 1 μm and 10 μm; or thicker than or equal to 0.3 μm, 0.5 μm, 0.7 μm, 1 μm, 1.5 μm, 2 μm or 3 μm. The metal lines or traces of FOISD may be used as the programmable interconnection.

Forming micro copper pads, pillars or bumps of the FOISD on the top surface of the top-most interconnection metal layer of FOISD, exposed in openings in the topmost insulating dielectric layer of the FOISD. An emboss copper process, as described and specified in above paragraphs, is performed to form the micro copper pillars or bumps on or over the substrate.

The height of the micro pillars or bumps on or over the substrate is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm. The largest dimension in a cross-section of the micro pillars or bumps (for example, the diameter of a circle shape, or the diagonal length of a square or rectangle shape) is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. The space between a micro pillar or bump to its nearest neighboring pillar or bump is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm.

Another aspect of the disclosure provides a method for forming the logic drive in a multi-chip package using a Fan-out Interconnection Technology (FOIT). The FOIT using the temporary substrate (T-Sub) with the FOISD on or over it (as described and specified above), and based on a flip-chip assembled multi-chip packaging technology and process. The process steps for forming the FOIT multi-chip packaged logic drive are described as below:

(1) Performing flip-chip assembling, bonding or packaging: (a) First providing the substrate with FOISD, and IC chips or packages. The substrate with FOISD is formed as described and specified above; (b) The IC chips are then flip-chip assembled, bonded or packaged on or to corresponding micro copper bumps or pillar of the FOISD on or over the substrate with the side or surface of the chip with transistors faced down. The backside of the silicon substrate of the chips (the side or surface without transistors) is faced up; The IC chips or packages to be assembled, bonded or packaged to the substrate include the chips or packages mentioned, described and specified above: the standard commodity FPGA chips, the dedicated control chip, the dedicated I/O chip, the dedicated control and I/O chip, IAC, DCIAC, DCDI/OIAC chip and/or computing and/or processing IC chips, for example, the CPU, GPU, DSP, TPU, APU chips. All chips to be flip-chip packaged in the logic drives comprise micro copper pillars or bumps with solder caps on the top surface of the chips. The top surfaces of micro copper pillars or bumps with solder caps are at a level above the level of the top surface of the top-most insulating dielectric layer of the chips with a height of, for example, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm; (c) Filling the gaps between the substrate and the IC chips (and between micro copper bumps or pillars of the IC chips) with an underfill material by, for example, a dispensing method using a dispenser. The underfill material comprises epoxy resins or compounds, and can be cured at temperature equal to or above 100° C., 120° C., or 150° C.

(2) Applying a material, resin, or compound to fill the gaps between chips and cover the backside surfaces of chips by methods, for example, spin-on coating, screen-printing, dispensing or molding in the wafer or panel format. The molding method includes the compress molding (using top and bottom pieces of molds) or the casting molding (using a dispenser). The material, resin, or compound used may be a polymer material includes, for example, polyimide, BenzoCycloButene (BCB), parylene, epoxy-based material or compound, photo epoxy SU-8, elastomer, or silicone. The polymer may be, for example, photosensitive polyimide/PBO PIMEL™ supplied by Asahi Kasei Corporation, Japan; or epoxy-based molding compounds, resins or sealants provided by Nagase ChemteX Corporation, Japan. The material, resin or compound is applied (by coating, printing, dispensing or molding) on or over the substrate and on or over the backside of the chips to a level to: (i) fill gaps between chips, (ii) cover the top-most backside surface of the chips. The material, resin or compound may be cured or cross-linked by raising a temperature to a certain degree of temperature, for example, at or higher than or equal to 50° C., 70° C., 90° C., 100° C., 125° C., 150° C., 175° C., 200° C., 225° C., 250° C., 275° C. or 300° C. The material may be polymer or molding compound. Applying a CMP, polishing or grinding process to planarize the surface of the applied material, resin or compound. Optionally, the CMP, or grinding process is performed until a level where the backside surfaces of all IC chips are fully exposed.

The interconnection metal lines or traces of the FOISD for the logic drive may comprise: (a) an interconnection net or scheme of metal lines or traces in or of the FOISD of the logic drive for connecting or coupling the transistors, the FISC, the SISC and/or the micro copper pillars or bumps of an FPGA IC chip of the logic drive to the transistors, the FISC, the SISC and/or the micro copper pillars or bumps of another FPGA IC chip packaged in the same logic drive. This interconnection net or scheme of metal lines or traces in or of the FOISD may be connected to the circuits or components outside or external to the logic drive through bottom surfaces of the metal via contacts. This interconnection net or scheme of metal lines or traces in or of the FOISD may be a net or scheme for signals, clocks or the power or ground supply; (b) an interconnection net or scheme of metal lines or traces in or of the FOISD of the logic drive connecting to multiple micro copper pillars or bumps of an IC chip in or of the logic drive logic drive. This interconnection net or scheme of metal lines or traces in or of the FOISD may be connected to the circuits or components outside or external to the logic drive through the bottom surfaces of the metal via contacts. This interconnection net or scheme of metal lines or traces in or of the FOISD may be a net or scheme for signals, clocks or the power or ground supply; (c) an interconnection net or scheme of metal lines or traces in or of the FOISD of the logic drive for connecting or coupling to the circuits or components outside or external to the logic drive, through one or more of bottom surfaces of the metal via contacts. This is the fan-out function of FOISD. The interconnection net or scheme of metal lines or traces in or of the FOISD may be used for signals, clocks, power or ground supplies. In this case, for example, the one or more of bottom surfaces of the metal via contacts may be connected to an I/O circuit of, for example, the dedicated I/O chip of the logic drive. The I/O circuit in this case may be a large I/O circuit, for example, a bi-directional (or tri-state) I/O pad or circuit, comprising an ESD circuit, a receiver, and a driver, and may have an input capacitance or output capacitance between 2 pF and 100 pF, 2 pF and 50 pF, 2 pF and 30 pF, 2 pF and 20 pF, 2 pF and 15 pF, 2 pF and 10 pF, or 2 pF and 5 pF; or larger than 2 pF, 5 pF, 10 pF, 15 pF or 20 pF; (d) an interconnection net or scheme of metal lines or traces in or of the FOISD of the logic drive used for connecting the transistors, the FISC, the SISC and/or the micro copper pillars or bumps of an FPGA IC chip of the logic drive to the transistors, the FISC, the SISC and/or the micro copper pillars or bumps of another FPGA IC chip packaged in the logic drive; but not connected to the circuits or components outside or external to the logic drive. That is, no bottom surfaces of the metal via contacts of the logic drive is connected to the interconnection net or scheme of metal lines or traces in or of the FOISD. In this case, the interconnection net or scheme of metal lines or traces in or of the FOISD may be connected or coupled to the I/O circuits of the FPGA chips packaged in the logic drive. The I/O circuit in this case may be a small I/O circuit, for example, a bi-directional (or tri-state) I/O pad or circuit, comprising an ESD circuit, a receiver, and/or a driver, and may have an input capacitance or output capacitance between 0.1 pF and 5 pF or 0.1 pF and 2 pF; or smaller than 5 pF, 3 pF, 2 pF or 1 pF; (e) an interconnection net or scheme of metal lines or traces in or of the FOISD of the logic drive used for connecting or coupling to multiple micro copper pillars or bumps of an FPGA IC chip in or of the logic drive; but not connecting to the circuits or components outside or external to the FPGA IC chip of the logic drive. No bottom surfaces of the metal via contacts of the logic drive is connected to the interconnection net or scheme of metal lines or traces in or of the FOISD. In this case, the interconnection net or scheme of metal lines or traces in or of the FOISD may be connected or coupled to the transistors, the FISC, the SISC and/or the micro copper pillars or bumps of the FPGA IC chip of the logic drive, without going through any I/O circuit or pad (the driver, receiver or ESD) of the FPGA IC chip. In other word, the interconnection net or scheme of FOISD in this case may be designed as or similar to that of SISC of the FPGA IC chip.

(3) Removing or releasing the temporary substrate (here the T-Sub does not include FOISD) from the structures on or over it by illuminating light from a laser, e.g., YAG laser, on the LTHC layer through the temporary (transparent) glass substrate. The YAG laser having a wavelength of 1,064 nm and an output power between 20 and 50 W may be used for illuminating the sacrificial bonding layer through the temporary substrate, e.g., glass panel or wafer. Typical spot size of the YAG laser at focus point is about 0.3 mm in diameter. The laser spot is scanned at the speed of 8.0 m/s. After light illuminating, the LTHC material is decomposed and the temporary glass substrate could be easily released or removed from the decomposed LTHC material and the underlined structures (here the IC chips are faced up) comprising FOISD, underfill, IC chips and molding compounds. Next, the decomposed LTHC material is removed or peeled using an adhesive (peeling) tape. The bottom surfaces of the metal via contacts in the openings in the bottom-most dielectric insulating layer are then exposed (here the IC chips are faced down).

(4) Forming solder bumps on or under the exposed bottom surfaces of the metal via contacts, (here the IC chips are faced down). When the areas of the exposed bottom surfaces of the metal via contacts are designed large enough for use as bases to form solder bumps on or under the exposed metal surfaces. The solder bumps may be formed by screen printing methods or by solder ball mounting methods, and then followed by the solder reflow process on the exposed surfaces of the metal via contacts. The material used for forming the solder bumps may be lead free solder. The lead-free solders in commercial use may contain tin, copper, silver, bismuth, indium, zinc, antimony, and traces of other metals. For example, the lead-free solder may be Sn—Ag—Cu (SAC) solder, Sn—Ag solder, or Sn—Ag—Cu—Zn solder. The solder bumps are used for connecting or coupling the IC chips of the logic drive to the external circuits or components external or outside of the logic drive. For example, the transistors of a FPGA IC chip may indirectly connected to the external circuits or components external or outside of the logic drive through the dedicated I/O chip with an electrical path comprising in sequence: (i) FISC and/or SISC of the FPGA IC chip, (ii) micro copper pillars or bumps of the FPGA chip, (iii) interconnection lines, traces or metal vias of the FOISD, (iv) micro copper pillars or bumps of the dedicated I/O chip, (v) small I/O circuits of the dedicated I/O chip, (vi) large I/O circuits of the dedicated I/O chip, (vii) micro copper pillars or bumps of the dedicated I/O chip, and (viii) through the FOISD and the metal via contacts of the FOISD. The height of the solder bumps is, for example, between 5 μm and 150 μm, 5 μm and 120 μm, 10 μm and 100 μm, 10 μm and 60 μm, 10 μm and 40 m, or 10 μm and 30 μm, or greater or taller than or equal to 75 μm, 50 μm, 30 μm, 20 μm, 15 μm, or 10 μm. The largest dimension in cross-sections of the solder bumps (for example, the diameter of a circle shape or the diagonal length of a square or rectangle shape) is, for example, between 5 μm and 200 μm, 5 μm and 150 μm, 5 μm and 120 μm, 10 μm and 100 μm, 10 μm and 60 μm, 10 μm and 40 m, or 10 μm and 30 μm; or greater than or equal to 100 μm, 60 μm, 50 μm, 40 μm, 30 μm, 20 μm, 15 μm, or 10 μm. The smallest space between a solder bump and its nearest neighboring solder bump is, for example, between 5 μm and 150 μm, 5 μm and 120 μm, 10 μm and 100 μm, 10 μm and 60 μm, 10 μm and 40 μm, or 10 μm and 30 μm; or greater than or equal to 60 μm, 50 μm, 40 μm, 30 μm, 20 μm, 15 μm or 10 μm. The solder bumps may be used for flip-package assembling the logic drive on or to a substrate, film or board, similar to the flip-chip assembly of the chip packaging technology, or the Chip-On-Film (COF) assembly technology used in the LCD driver packaging technology. The solder bump assembly process may comprise a solder flow or reflow process using solder flux or without using solder flux. The substrate, film or board used may be, for example, a Printed Circuit Board (PCB), a silicon substrate with interconnection schemes, a metal substrate with interconnection schemes, a glass substrate with interconnection schemes, a ceramic substrate with interconnection schemes, or a flexible film with interconnection schemes. The solder bumps may be located at the bottom surface (with the side of IC chips with the layer of transistors are facing down) of the logic drive package with a layout in a Ball-Grid-Array (BGA) having the solder bumps at the peripheral area used for the signal I/Os, and the solder bumps at or near the central area used for the Power/Ground (P/G) I/Os. The signal bumps at the peripheral area may form ring or rings at the peripheral area near the edges of the logic drive package, with 1 ring, or 2, 3, 4, 5, 6 rings. The pitches of the signal I/Os at the peripheral area may be smaller than that of the P/G I/Os at or near the central area of the logic drive package.

Alternatively, copper pillars or bumps may be formed on or under the bottom surfaces of the metal via contacts. For the description purpose, the wafer or panel is turned upside down, with the FOISD at the top and the IC chips at the bottom. The frontside with the transistors of IC chips are now facing up, the molding compound and the backside of the IC chips are now at the bottom. The copper pillars or bumps are formed by performing an emboss copper process in the following process steps: (a) depositing and patterning an insulating layer, for example, a polymer layer, on the whole wafer or panel, and forming openings in the insulating layer to expose the surfaces of the metal via contacts; (b) depositing an adhesion layer on or over the insulating layer, and the exposed surfaces of the metal via contacts, for example, sputtering or CVD depositing a titanium (Ti) or titanium nitride (TiN) layer (with a thickness, for example, between 1 nm to 200 nm, or 5 nm and 50 nm); (c) then depositing an electroplating seed layer on or over the adhesion layer, for example, sputtering or CVD depositing a copper seed layer (with a thickness, for example, between 3 nm and 400 nm, or 10 nm to 200 nm); (d) depositing, patterning and forming openings or holes in a photoresist layer for forming the copper pillars or bumps later, by coating, exposing and developing the photoresist layer, exposing the copper seed layer at the bottom of the openings in the photoresist layer. The opening in the photoresist layer overlaps the opening in the insulating layer; and extends out of the opening of the insulating layer, to an area (where the copper pillars or bumps are to be formed) around the opening in the insulating layer; (e) then electroplating a copper layer (with a thickness, for example, between 5 μm and 120 μm, 10 μm and 100 μm, 10 μm and 60 μm, 10 μm and 40 μm, or 10 μm and 30 μm) on or over the copper seed layer in the openings in the photoresist layer and the openings in the insulating layer; (f) removing the remained photoresist; (g) removing or etching the copper seed layer and the adhesion layer not under the electroplated copper. The metals left or remained are used as the copper pillars or bumps. The copper pillars or bumps are used for connecting or coupling the chips, for example the dedicated I/O chip, of the logic drive to the external circuits or components external or outside of the logic drive. The height of the copper pillars or bumps is, for example, between 5 μm and 120 μm, 10 μm and 100 μm, 10 μm and 60 μm, 10 μm and 40 μm, or 10 μm and 30 μm, or greater or taller than or equal to 50 μm, 30 μm, 20 μm, 15 μm, or 5 μm. The largest dimension in a cross-section of the copper pillars or bumps (for example, the diameter of a circle shape or the diagonal length of a square or rectangle shape) is, for example, between 5 μm and 120 μm, 10 μm and 100 μm, 10 μm and 60 μm, 10 μm and 40 μm, or 10 μm and 30 μm; or greater than or equal to 60 μm, 50 μm, 40 μm, 30 μm, 20 μm, 15 μm, or 10 μm. The smallest space between a copper pillar or bump and its nearest neighboring copper pillar or bump is, for example, between 5 μm and 120 μm, 10 μm and 100 μm, 10 μm and 60 μm, 10 μm and 40 μm, or 10 μm and 30 μm; or greater than or equal to 60 μm, 50 μm, 40 μm, 30 μm, 20 μm, 15 μm or 10 μm. The copper bumps or pillars may be used for flip-package assembling the logic driver on or to a substrate, film or board, similar to the flip-chip assembly of the chip packaging technology, or similar to the Chip-On-Film (COF) assembly technology used in the LCD driver packaging technology. The substrate, film or board used may be, for example, a Printed Circuit Board (PCB), a silicon substrate with interconnection schemes, a metal substrate with interconnection schemes, a glass substrate with interconnection schemes, a ceramic substrate with interconnection schemes, or a flexible film with interconnection schemes. The substrate, film or board may comprise metal bonding pads or bumps at its surface; and the metal bonding pads or bumps may have a layer of solder on their top surface for use in the solder reflow or thermal compressing bonding process for bonding to the copper pillars or bumps on or of the logic drive package. The copper pillars or bumps may be located at the front surface of the logic drive package with a layout of Bump or Pillar Grid-Array, with the pillars or bumps at the peripheral area used for the signal I/Os, and the pillars or bumps at or near the central area used for the Power/Ground (P/G) I/Os. The signal pillars or bumps at the peripheral area may form 1 ring, or 2, 3, 4, 5, or 6 rings along the edges of the logic driver package. The pitches of the signal I/Os at the peripheral area may be smaller than that of the P/G I/Os at or near the central area of the logic drive package.

Alternatively, solder bumps may be formed on or under the exposed bottom surfaces of the metal via contacts. For the description purpose, the wafer or panel is turned upside down, with the FOISD at the top and the IC chips at the bottom. The frontside with the transistors of IC chips are now facing up, the molding compound and the backside of the IC chips are now at the bottom. The solder bumps are formed by performing an emboss copper/solder process in the following process steps: (a) depositing and patterning an insulating layer, for example, a polymer layer, on the whole wafer or panel, and forming openings in the insulating layer to expose the surfaces of the metal via contacts; (b) depositing an adhesion layer on or over the insulating layer, and the exposed surfaces of the metal via contacts, for example, sputtering or CVD depositing a titanium (Ti) or titanium nitride (TiN) layer (with a thickness, for example, between 1 nm to 200 nm, or 5 nm and 50 nm); (c) then depositing an electroplating seed layer on or over the adhesion layer, for example, sputtering or CVD depositing a copper seed layer (with a thickness, for example, between 3 nm and 400 nm, or 10 nm to 200 nm); (d) depositing, patterning and forming openings or holes in a photoresist layer for forming the solder bumps later, by coating, exposing and developing the photoresist layer, exposing the copper seed layer at the bottom of the openings in the photoresist layer. The opening in the photoresist layer overlaps the opening in the insulating layer; and extends out of the opening of the insulating layer, to an area (where the solder bumps are to be formed) around the opening in the insulating layer; (e) then electroplating a copper barrier layer (with a thickness, for example, between 1 μm and 50 μm, 1 μm and 40 μm, 1 μm and 30 μm, 1 μm and 20 μm, 1 μm and 10 μm, 1 μm and 5 μm, or 1 μm and 3 min) on or over the copper seed layer in the openings of the photoresist layer; (f) then electroplating a solder layer (with a thickness, for example, between 1 μm and 150 μm, 1 μm and 120 μm, 5 μm and 120 μm, 5 μm and 100 μm, 5 μm and 75 in, 5 μm and 50 μm, 5 μm and 40 μm, 5 μm and 30 μm, 5 μm and 20 μm, 5 μm and 10 μm, 1 μm and 5 μm, or 1 μm and 3 μm) on or over the electroplated copper layer in the openings of the photoresist; (g) removing the remained photoresist; (h) removing or etching the copper seed layer and the adhesion layer not under the electroplated copper barrier layer and the electroplated solder layer; (i) reflowing solder to form the solder bumps. The metals (Ti(or TiN)/seed Cu/barrier Cu/solder) left or remained are subjected to a solder-reflow process and are used as the solder bumps. The solder material used may be a lead-free solder. Lead-free solders in commercial use may contain tin, copper, silver, bismuth, indium, zinc, antimony, and traces of other metals. For example, the lead-free solder may be Sn—Ag—Cu (SAC) solder, Sn—Ag solder, or Sn—Ag—Cu—Zn solder. The solder bumps are used for connecting or coupling the chips, for example, the dedicated I/O chip, of the logic drive to the external circuits or components external or outside of the logic drive. The height of the solder bumps is, for example, between 5 μm and 150 μm, 5 μm and 120 μm, 10 μm and 100 μm, 10 μm and 60 μm, 10 μm and 40 μm, or 10 μm and 30 μm, or greater or taller than or equal to 75 μm, 50 μm, 30 μm, 20 μm, 15 μm, or 10 min. The solder bump height is measured from the level of the exposed surface of the insulating polymer layer on the substrate to the level of the top surface of the solder bump. The largest dimension in cross-sections of the solder bumps (for example, the diameter of a circle shape or the diagonal length of a square or rectangle shape) is, for example, between 5 μm and 200 μm, 5 μm and 150 μm, 5 μm and 120 μm, 10 μm and 100 μm, 10 μm and 60 μm, 10 μm and 40 μm, or 10 μm and 30 min; or greater than or equal to 100 μm, 60 μm, 50 μm, 40 μm, 30 μm, 20 μm, 15 μm, or 10 μm. The smallest space between a solder bump and its nearest neighboring solder bump is, for example, between 5 μm and 150 in, 5 μm and 120 μm, 10 μm and 100 μm, 10 μm and 60 μm, 10 μm and 40 μm, or 10 μm and 30 μm; or greater than or equal to 60 μm, 50 μm, 40 μm, 30 μm, 20 μm, 15 μm or 10 min. The solder bumps may be used for flip-package assembling the logic driver on or to the substrate, film or board, similar to the flip-chip assembly of the chip packaging technology, or the Chip-On-Film (COF) assembly technology used in the LCD driver packaging technology. The solder bump assembly process may comprise a solder flow or reflow process using solder flux or without using solder flux. The substrate, film or board used may be, for example, a Printed Circuit Board (PCB), a silicon substrate with interconnection schemes, a metal substrate with interconnection schemes, a glass substrate with interconnection schemes, a ceramic substrate with interconnection schemes, or a flexible film with interconnection schemes. The solder bumps may be located at the front surface of the logic drive package with a layout in a Ball-Grid-Array (BGA) with the bumps at the peripheral area used for the signal I/Os, and the bumps at or near the central area used for the Power/Ground (P/G) I/Os. The signal bumps at the peripheral area may form ring or rings at the peripheral area near the edges of the logic driver package, with 1 ring, or 2, 3, 4, 5, 6 rings. The pitches of the signal I/Os at the peripheral area may be smaller than that of the P/G I/Os at or near the central area of the logic drive package.

Alternatively, gold bumps may be formed on or under the exposed bottom surfaces of the metal via contacts. For the description purpose, the wafer or panel is turned upside down, with the FOISD at the top and the IC chips at the bottom. The frontside with the side with transistors of IC chips are now facing up, the molding compound and the backside of the IC chips are now at the bottom. The gold bumps are formed by performing an emboss gold process in the following process steps: (a) depositing and patterning an insulating layer, for example, a polymer layer, on the whole wafer or panel, and forming openings in the insulating layer to expose the surfaces of the metal via contacts; (b) depositing an adhesion layer on or over the insulating layer, and the exposed surfaces of the metal via contacts, for example, sputtering or CVD depositing a titanium (Ti) or titanium nitride (TiN) layer (with a thickness, for example, between 1 nm to 200 nm, or 5 nm and 50 nm); (c) then depositing an electroplating seed layer on or over the adhesion layer, for example, sputtering or CVD depositing a gold seed layer (with a thickness, for example, between 1 nm and 300 nm, or 1 nm to 50 nm); (d) depositing, patterning and forming openings or holes in a photoresist layer for forming gold bumps in later processes, by coating, exposing and developing the photoresist layer, exposing the gold seed layer at the bottom of the openings in the photoresist layer. The opening in the photoresist layer overlaps the opening in the insulating layer, and extends out of the opening of the insulating layer, to an area (where the gold bumps are to be formed) around the opening in the insulating layer; (e) then electroplating a gold layer (with a thickness, for example, between 3 μm and 40 μm, 3 μm and 30 μm, 3 μm and 20 μm, 3 μm and 15 μm, or 3 μm and 10 μm) on or over the gold seed layer in the patterned openings of the photoresist layer; (f) removing the remained photoresist; (g) removing or etching the gold seed layer and the adhesion layer not under the electroplated gold layer. The metals (Ti(or TiN)/seed Au/Electroplated Au) left or remained are used as the gold bumps. The gold bumps are used for connecting or coupling the chips, for example, the dedicated I/O chip, of the logic drive to the external circuits or components external or outside of the logic drive. The height of the gold bumps is, for example, between 3 μm and 40 μm, 3 μm and 30 μm, 3 μm and 20 μm, 3 μm and 15 μm, or 3 μm and 10 μm, or smaller or shorter than or equal to 40 μm, 30 μm, 20 μm, 15 μm, or 10 min. The largest dimension in cross-sections of the gold bumps (for example, the diameter of a circle shape or the diagonal length of a square or rectangle shape) is, for example, between 3 μm and 40 μm, 3 μm and 30 μm, 3 μm and 20 μm, 3 μm and 15 μm, or 3 μm and 10 μm, or smaller than or equal to 40 μm, 30 μm, 20 μm, 15 μm, or 10 min. The smallest space between a gold bump and its nearest neighboring gold bump is, for example, between 3 μm and 40 μm, 3 μm and 30 μm, 3 μm and 20 μm, 3 μm and 15 μm, or 3 μm and 10 μm, or smaller than or equal to 40 μm, 30 μm, 20 μm, 15 μm, or 10 μm. The gold bumps may be used for flip-package assembling the logic driver on or to the substrate, film or board, similar to the flip-chip assembly of the chip packaging technology, or similar to the Chip-On-Film (COF) assembly technology used in the LCD driver packaging technology. The substrate, film or board used may be, for example, a Printed Circuit Board (PCB), a silicon substrate with interconnection schemes, a metal substrate with interconnection schemes, a glass substrate with interconnection schemes, a ceramic substrate with interconnection schemes, or a flexible film or tape with interconnection schemes. When the gold bumps are used for the COF technology, the gold bumps are thermal compress bonded to a flexible circuit film or tape. The COF assembly using gold bumps may provide very high I/Os in a small area. The current COF assembly technology using gold bumps may provide gold bumps with pitches smaller than 20 min. The I/Os or gold bumps used for signal inputs or outputs are designed at the peripheral area along 4 edges of a logic drive package. The number of I/Os or gold bumps used for signal inputs or outputs at the peripheral area along 4 edges of a logic drive package, for example, for a square shaped logic drive package with 10 mm width and having two rings (or two rows) along the 4 edges, may be, for example, greater or equal to 5,000 (with 15 μm gold bump pitch), 4,000 (with 20 μm gold bump pitch), or 2,500 (with 30 μm gold bump pitch). The reason that 2 rings or rows are designed along the edges is for the easy fan-out from the logic drive package when a single-layer film or substrate with one-sided metal lines or traces is used. Alternatively, the gold bumps may be located at the front surface of the logic drive package with a layout in a Ball-Grid-Array (BGA), having the gold bumps at the peripheral area used for the signal I/Os, and the gold bumps at or near the central area used for the Power/Ground (P/G) I/Os. The signal bumps at the peripheral area may form ring or rings along the edges of the logic driver package, with 1 ring, or 2, 3, 4, 5, 6 rings. The pitches of the signal I/Os in the peripheral area may be smaller than that of the P/G I/Os at or near the central area of the logic drive package. The metal pads on the flexible circuit film or tape have a gold layer or a solder layer at the top-most surfaces of the metal pads. The gold-to-gold thermal compressing bonding method is used for the COF assembly technology when the metal pad on the flexible circuit film or tape has a gold layer at its top surface; while the gold-to-solder thermal compressing bonding method is used for the COF assembly technology when the metal pad on the flexible circuit film or tape has a solder layer at its top surface.

(5) Separating, cutting or dicing the molding material, including separating, cutting or dicing through materials or structures between two neighboring logic drives. The material (for example, polymer) filling gaps between chips of two neighboring logic drives is separated, cut or diced to from individual unit of logic drives.

Another aspect of the disclosure provides the standard commodity FOIT multi-chip packaged logic drive. The standard commodity FOIT logic drive may be in a shape of square or rectangle, with a certain widths, lengths and thicknesses. An industry standard may be set for the shape and dimensions of the logic drive. For example, the standard shape of the FOIT-multi-chip packaged logic drive may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the FOIT-multi-chip packaged logic drive may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm. Furthermore, the metal bumps or pillars on or under the substrate in the logic drive may be in a standard footprint, for example, in an area array of M×N with a standard dimension of pitch and space between neighboring two metal bumps or pillars. The location of each metal bumps or pillars is also at a standard location.

Another aspect of the disclosure provides the logic drive comprising plural single-layer-packaged logic drives; and each of single-layer-packaged logic drives in a multiple-chip package is as described and specified above. The multiple single-layer-packaged logic drives, for example, 2, 3, 4, 5, 6, 7, 8 or greater than 8 single-layer-packaged logic drives, may be, for example, (1) flip-package assembled on a printed circuit board (PCB), high-density fine-line PCB, Ball-Grid-Array (BGA) substrate, or flexible circuit film or tape; or (2) stack assembled using the Package-on-Package (POP) assembling technology; that is assembling one single-layer-packaged logic drive on top of the other single-layer-packaged logic drive. The POP assembling technology may apply, for example, the Surface Mount Technology (SMT).

Another aspect of the disclosure provides a method for a single-layer-packaged logic drive suitable for the stacked POP assembling technology. The single-layer-packaged logic drive for use in the POP package assembling are fabricated as the same as the process steps and specifications of the FOIT multi-chip packaged logic drive as described in the above paragraphs, except for forming Through-Package-Vias, or Thought Polymer Vias (TPVs) in the gaps between chips in or of the logic drive, and/or in the peripheral area of the logic drive package and outside the edges of chips in or of the logic drive. The TPVs are used for connecting or coupling circuits or components at the frontside of the logic drive to that at the backside of the logic drive package, the frontside is the side with the FOISD, wherein the chips with the side having transistors are faced down. The single-layer-packaged logic drive with TPVs for use in the stacked logic drive may be in a standard format or having standard sizes. For example, the single-layer-packaged logic drive may be in a shape of square or rectangle, with a certain widths, lengths and thicknesses. An industry standard may be set for the shape and dimensions of the single-layer-packaged logic drive. For example, the standard shape of the single-layer-packaged logic drive may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the single-layer-packaged logic drive may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm. The logic drive with TPVs is formed by forming another set of copper pillars or bumps on or over the Temporary Substrate (TS), with the height of copper bump or pillar taller than that of the micro copper bump or pillar on the FOISD used for the flip-chip assembly (flip-chip micro copper pillars or bumps) on or over the TS. The process steps of forming the flip-chip micro copper bumps or pillars are described or specified above. Here, the process steps of forming the flip-chip micro copper bumps or pillars are described again, and followed by process steps of forming the TPVs (a) on or over the top surfaces of the top-most interconnection metal layer of FOISD, exposed in openings in the top-most insulating dielectric layer of the FOISD. Performing a double emboss copper process to form (a) the micro copper pillars or bumps for use in the flip-chip (IC chips) assembly, and (b) TPVs on or over the TS as described below: (i) depositing whole wafer or panel an adhesion layer on or over the top-most insulting dielectric layer (of FOISD) and the exposed top surfaces of the top-most interconnection layer of FOISD at the bottom of the openings in top-most insulating layer, for example, sputtering or CVD depositing a titanium (Ti) or titanium nitride (TiN) layer (with a thickness, for example, between 1 nm to 200 nm, or 5 nm and 50 nm); (ii) then depositing an electroplating seed layer on or over the adhesion layer, for example, sputtering or CVD depositing a copper seed layer (with a thickness, for example, between 3 nm and 300 nm, or 10 nm and 120 nm); (iii) depositing a first photoresist layer and patterning openings or holes in the first photoresist layer, for forming the flip-chip micro copper pillars or bumps later, by coating, exposing and developing the first photoresist layer, exposing the copper seed layer at the bottom of the openings or holes in the first photoresist layer. The first photoresist layer has a thickness, for example, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm. The opening or hole in the first photoresist layer overlaps the opening in the top-most insulating layer; and may extend out of the opening of the insulating dielectric layer, to an area or a ring of the insulating dielectric layer around the opening in the insulating dielectric layer; (iv) then electroplating a copper layer (with a thickness, for example, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm) on or over the copper seed layer in the patterned openings or holes of the photoresist layer; (v) removing the remained first photoresist, and exposed the surfaces of electroplated copper seed layer; (vi) depositing a second photoresist layer and patterning openings or holes in the second photoresist layer for forming the TPVs later by coating, exposing and developing the second photoresist layer, exposing the copper seed layer at the bottom of the openings or holes in the second photoresist layer. The second photoresist layer has a thickness, for example, between 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm). The locations of the openings or holes in the second photoresist layer are in the gaps between chips in or of the logic drive, and/or in peripheral area of the logic drive package and outside the edges of chips in or of the logic drive, (the chips are to be flip-chip bonded to the flip-chip micro copper pillars or bumps in latter processes); (vii) then electroplating a copper layer (with a thickness, for example, between 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm) on or over the copper seed layer in the patterned openings or holes of the second photoresist layer; (viii) removing the remained second photoresist to expose the copper seed layer; (ix) removing or etching the copper seed layer and the adhesion layer not under the electroplated coppers for both TPVs and flip-chip micro copper pillars or bumps. Alternatively, the micro copper pillars or bumps may be formed at the locations of TPVs while forming the flip-chip micro copper pillars or bumps, process steps (i) to (v). In this case, in the process step (vi), in depositing the second photoresist layer and patterning openings or holes in the second photoresist layer for forming the TPVs later by coating, exposing and developing the second photoresist layer, the surfaces of the micro copper pillars or bumps at the locations of TPVs are exposed, yet the surfaces of the flip-chip micro copper pillars or bumps not at the locations of TPVs are not exposed; and, in the process step (vii), electroplating a copper layer starts from the top surfaces of the micro copper pillars or bumps at the locations of TPVs. The height of TPVs (from the level of top surface of the top-most insulating layer to the level of the top surface of the copper pillars or bumps) is between, for example, 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm, or greater than or taller than or equal to 50 μm, 30 μm, 20 μm, 15 μm, or 5 μm. The largest dimension in a cross-section of the TPVs (for example, the diameter of a circle shape or the diagonal length of a square or rectangle shape) is between, for example, 5 μm and 300 μm, 5 μm and 200 μm, 5 μm and 150 μm, and 120 μm, 10 μm and 100 μm, 10 μm and 60 μm, 10 μm and 40 μm, or 10 μm and 30 μm; or greater than or equal to 150 μm, 100 μm, 60 μm, 50 μm, 40 μm, 30 μm, 20 μm, 15 μm, or 10 μm. The smallest space between a TPV and its nearest neighboring TPV is between, for example, 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm; or greater than or equal to 150 μm, 100 μm, 60 μm, 50 μm, 40 μm, 30 μm, 20 μm, 15 μm, or 10 μm.

The wafer or panel of the TS, with the FOISD, flip-chip micro copper pillars and the tall copper pillars or bumps (TPVs), are then used for flip-chip assembling or bonding the IC chips to the flip-chip micro copper pillars or bumps on or of them for forming a logic drive. The process steps for forming the logic drive with TPVs are the same as described and specified above, including the process steps of flip-chip assembly or bonding, underfill, molding, molding compound planarization, TS removing (not including FOISD, micro copper pillars or bumps and TPV) and formation of metal pads, pillars or bumps on or under the FOISD. Some process steps are mentioned again below: in the Process Step (1) for forming the logic drive described above: Since there are TPVs between IC chips, a clearness of space is needed for the dispenser to perform the underfill dispensing. That is there are no TPVs in the path for dispensing underfill. In the Process Step (2) for forming the logic drive described above: A material, resin, or compound is applied to (i) fill gaps between chips, (ii) cover the backside surfaces of chips (with IC chips faced down), (iii) filling gaps between copper pillars or bumps (TPVs) on or over the TS, (iv) cover the top surfaces of the copper pillars or bumps (TPVs) on or over the wafer or panel of the TS. Applying a CMP process, polishing process or grinding process to planarize the surface of the applied material, resin or compound to a level where (i) all top surfaces of copper pillars or bumps (TPVs) on or over the wafer or panel, are fully exposed. The exposed top surfaces of the TPVs may be used as metal pads for bonding other electronic components (on the top side of the logic drive, the IC chips are facing down) on the logic drive using the POP packaging method. Alternatively, solder bumps may be formed on the exposed top surfaces of the TPVs by the methods of screen printing or solder ball mounting. The solder bumps are used for connecting or assembly the logic drive to other electronic components on the top side of the logic drive (IC chips are facing down).

Another aspect of the disclosure provides a method for forming a stacked logic driver, for an example, by the following process steps: (i) providing a first single-layer-packaged logic drive, either separated or still in the wafer or panel format, with its copper pillars or bumps, solder bumps, or gold bumps faced down, and with the exposed copper pads of TPVs faced up (IC chips are facing down); (ii) Package-On-Package (POP) stacking assembling, by surface-mounting and/or stack-package methods, a second separated single-layer-packaged logic drive on top of the provided first single-layer-packaged logic drive. The surface-mounting process is similar to the Surface-Mount Technology (SMT) used in the assembly of components on or to the Printed Circuit Boards (PCB), by first printing solder or solder cream, or flux on the copper pads of the TPVs, and then stack-package assembling, connecting or coupling the copper pillars or bumps, solder bumps, or gold bumps on or of the second separated single-layer-packaged logic drive to the solder or solder cream or flux printed copper pads of TPVs of the first single-layer-packaged logic drive. The stack-package process is performed, similar to the Package-On-Package technology (POP) used in the IC stacking-package technology, by stack-package assembling, connecting or coupling the copper pillars or bumps, solder bumps, or gold bumps on or of the second separated single-layer-packaged logic drive to the copper pads of TPVs of the first single-layer-packaged logic drive. An underfill material may be filled in the gaps between the first and the second single-layer-packaged logic drivers. A third separated single-layer-packaged logic drive may be stack-package assembled, connected or coupled to the exposed copper pads of TPVs of the second single-layer-packaged logic drive. The Package-On-Package stacking assembling process may be repeated for assembling more separated single-layer-packaged logic drives (for example, up to more than or equal to a nth separated single-layer-packaged logic drive, wherein n is greater than or equal to 2, 3, 4, 5, 6, 7, 8) to form the finished stacking logic drive. When the first single-layer-packaged logic drives are in the separated format, they may be first stack-package assembled to a carrier or substrate, for example a PCB, or a BGA (Ball-Grid-Array) substrate, and then performing the POP processes, in the carrier or substrate format, to form stacked logic drives, and then cutting, dicing the carrier or substrate to obtain the separated finished stacked logic drives. When the first single-layer-packaged logic drives are still in the wafer or panel format, the wafer or panel may be used directly as the carrier or substrate for performing POP stacking processes, in the wafer or panel format, for forming the stacked logic drivers. The wafer or panel is then cut or diced to obtain the separated stacked finished logic drives.

Another aspect of the disclosure provides a method for a single-layer-packaged logic drive suitable for the stacked POP assembling technology. The single-layer-packaged logic drive for use in the POP package assembling are fabricated as the same process steps and specifications of the FOIT multi-chip packages described in the above paragraphs, except for forming a Backside metal Interconnection Scheme (abbreviated as BISD in below) at the backside of the single-layer-packaged logic drive and Through-Package-Vias, or Thought Polymer Vias (TPVs) in the gaps between chips in or of the logic drive, and/or in the peripheral area of the logic drive package and outside the edges of chips in or of the logic drive (the side with transistors of the IC chips are facing down). The BISD may comprise metal lines, traces, or planes in multiple interconnection metal layers, and is formed on or over the backside of the IC chips (the sides of IC chips with the transistors are facing down), the molding compound after the process step of planarization of the molding compound, and the exposed top surfaces of the TPVs. The BISD provides additional interconnection metal layer or layers at the backside of the logic drive package, and provides copper pads, copper pillars or solder bumps in an area array at the backside of the single-layer-packaged logic drive, including at locations directly and vertically over the IC chips of the logic drive (IC chips with the transistors side faced down). The TPVs are used for connecting or coupling circuits or components (for example, the FOISD) of the logic drive to that (for example, the BISD) at the backside of the logic drive package. The single-layer-packaged logic drive with TPVs for use in the stacked logic drive may be in a standard format or having standard sizes. For example, the single-layer-packaged logic drive may be in a shape of square or rectangle, with a certain widths, lengths and thicknesses; and/or with a standard layout of the locations of the copper pads, copper pillars or solder bumps in an area array at the backside of the single-layer-packaged logic drive. The process steps for forming the BISD are: (a) depositing a bottom-most insulting dielectric layer of the BISD, whole wafer or panel, on or over the exposed backside of the IC chips, molding compound and the exposed top surfaces of the TPVs. The bottom-most insulting dielectric layer may be a polymer material includes, for example, polyimide, BenzoCycloButene (BCB), parylene, epoxy-based material or compound, photo epoxy SU-8, elastomer, or silicone. The bottom-most polymer insulating dielectric layer may be deposited by methods of spin-on coating, screen-printing, dispensing, or molding. The polymer material may be photosensitive, and may be used as photoresist as well for patterning openings in it for forming metal vias in it by following processes to be performed later; that is, the photosensitive polymer layer is coated, and exposed to light through a photomask, and then developed and etched to form openings in it. The openings in the photosensitive bottom-most insulating dielectric layer expose the top surfaces of the TPVs. The photosensitive bottom-most polymer layer (the insulating dielectric layer) is then cured at a temperature, for example, at or higher than 100° C., 125° C., 150° C., 175° C., 200° C., 225° C., 250° C., 275° C. or 300° C. The thickness of the cured bottom-most polymer is between, for example, 2 μm and 50 μm, 2 μm and 30 μm, 2 μm and 20 μm, or 2 μm and 15 μm; or thicker than or equal to 2 μm, 5 μm, 10 μm, 20 μm, or 30 μm; (b) performing an emboss copper process to form the metal vias in the openings of the cured bottom-most polymer insulating dielectric layer, and to form metal lines, traces or planes of an bottom-most interconnection metal layer of the BISD: (i) depositing whole wafer or panel an adhesion layer on or over the bottom-most insulting dielectric layer and the exposed top surfaces of TPVs at the bottom of the openings in the cured bottom-most polymer layer, for example, sputtering or CVD depositing a titanium (Ti) or titanium nitride (TiN) layer (with a thickness, for example, between 1 nm to 200 nm, or 5 nm and 50 nm); (ii) then depositing an electroplating seed layer on or over the adhesion layer, for example, sputtering or CVD depositing a copper seed layer (with a thickness, for example, between 3 nm and 300 nm, or 10 nm and 120 nm); (iii) patterning trenches, openings or holes in a photoresist layer for forming metal lines, traces or planes of the bottom-most interconnection metal layer later by coating, exposing and developing the photoresist layer, exposing the copper seed layer at the bottom of the trenches, openings or holes in the photoresist layer. The trench, opening or hole in the photoresist layer overlaps the opening in the bottom-most insulating dielectric layer; and may extend out of the opening of the bottom-most insulating dielectric layer; (iv) then electroplating a copper layer (with a thickness, for example, between 0.3 μm and 50 μm, 0.5 μm and 30 μm, 1 μm and 20 μm, 1 μm and 15 μm, 1 μm and 10 μm, or 0.5 μm to 5 μm, or thicker than or equal to 0.3 μm, 0.7 μm, 1 μm, 2 μm, 3 μm, 5 μm, 7 μm or 10 μm) on or over the copper seed layer in the patterned trenches, openings or holes of the photoresist layer; (e) removing the remained photoresist; (f) removing or etching the copper seed layer and the adhesion layer not under the electroplated copper.

The metals (Ti (or TiN)/seed Cu/electroplated Cu) left or remained in the locations of trenches, openings or holes in the photoresist layer (note that the photoresist is removed now) are used as the metal lines, traces or planes of the bottom-most interconnection metal layer of the BISD; and the metals (Ti (or TiN)/seed Cu/electroplated Cu) left or remained in the openings of the bottom-most insulting dielectric layer are used as the metal vias in the bottom-most insulating dielectric layer of the BISD. The processes of forming the bottom-most insulating dielectric layer and openings in it; and the emboss copper processes for forming the metal vias in the bottom-most insulting dielectric layer and the metal lines, traces, or planes of the bottom-most interconnection metal layer, may be repeated to form a metal layer of multiple interconnection metal layers in or of the BISD; wherein the repeated bottom-most insulating dielectric layer is used as the inter-metal dielectric layer between two interconnection metal layers of the BISD, and the metal vias in the bottom-most insulating dielectric layer (now in the inter-metal dielectric layer) are used for connecting or coupling metal lines, traces, or planes of the two interconnection metal layers, above and below the metal vias, of the BISD. The top-most interconnection metal layer of the BISD is covered with a top-most insulating dielectric layer of the BISD. Forming copper pads, solder bumps, copper pillars on or over the top-most metal layer of BISD exposed in openings in the top-most insulating dielectric layer of BISD using emboss copper process as described and specifies in above. The locations of the solder bumps or copper pillars are on or over: (a) the gaps between chips in or of the logic drive; (b) and/or peripheral area of the logic drive package and outside the edges of chips in or of the logic drive; (c) directly and vertically on or over the backside of the IC chips. The BISD may comprise 1 to 6 layers, or 2 to 5 layers of interconnection metal layers. The interconnection metal lines, traces or planes of the BISD have the adhesion layer (Ti or TiN, for example) and the copper seed layer only at the bottom, but not at the sidewalls of the metal lines or traces. The interconnection metal lines or traces of FISC have the adhesion layer (Ti or TiN, for example) and the copper seed layer at both the bottom and the sidewalls of the metal lines or traces.

The thickness of the metal lines, traces or planes of the BISD is between, for example, 0.3 μm and 40 μm, 0.5 μm and 30 μm, 1 μm and 20 μm, 1 μm and 15 μm, 1 μm and 10 μm, or 0.5 μm to 5 μm, or thicker than or equal to 0.3 μm, 0.7 μm, 1 μm, 2 μm, 3 μm, 5 μm, 7 μm or 10 min. The width of the metal lines or traces of the BISD is between, for example, 0.3 μm and 40 μm, 0.5 μm and 30 μm, 1 μm and 20 μm, 1 μm and 15 μm, 1 μm and 10 μm, or 0.5 μm to 5 μm, or wider than or equal to 0.3 μm, 0.7 μm, 1 μm, 2 μm, 3 μm, 5 μm, 7 μm or 10 min. The thickness of the inter-metal dielectric layer of the BISD is between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. The planes in a metal layer of interconnection metal layers of the BISD may be used for the power, ground planes of a power supply, and/or used as heat dissipaters or spreaders for the heat dissipation or spreading; wherein the metal thickness may be thicker, for example, between 5 μm and 50 μm, 5 μm and 30 μm, 5 μm and 20 m, or 5 μm and 15 μm; or thicker than or equal to 5 μm, 10 μm, 20 μm, or 30 μm. The power, ground plane, and/or heat dissipater or spreader may be layout as interlaced or interleaved shaped structures in a plane of an interconnection metal layer of the BISD; or may be layout in a fork shape.

The BISD interconnection metal lines or traces of the single-layer-packaged logic drive are used: (a) for connecting or coupling the copper pads, solder bumps or copper pillars at the backside (top side, with the side having transistors of IC chips faced down) surface of the single-layer-packaged logic drive to their corresponding TPVs; and through the corresponding TPVs, the copper pads, solder bumps or copper pillars at the backside surface of the single-layer-packaged logic drive are connected or coupled to the metal lines or traces of the FOISD; and further through the micro copper pillars or bumps, the SISC, and the FISC of the IC chips for connecting or coupling to the transistors; (b) for connecting or coupling the copper pads, solder bumps or copper pillars at the backside (top side, with the side having transistors of IC chips faced down) surface of the single-layer-packaged logic drive to their corresponding TPVs; and through the corresponding TPVs, the copper pads, solder bumps or copper pillars at the backside surface of the single-layer-packaged logic drive are connected or coupled to the metal lines or traces of the FOISD, and are further through metal via contacts of the FOISD for connecting or coupling to solder bumps, copper pillars or gold bumps at the frontside (bottom side, with the side having transistors of IC chips faced down) surface of the single-layer-packaged logic drive. Therefore, the copper pads, solder bumps or copper pillars at the backside (top side, with the side having transistors of IC chips faced down) of the single-layer-packaged logic drive are connected or coupled to the copper pads, metal pillars or bumps at the frontside (bottom side, with the side having transistors of IC chips faced down) of the single-layer-packaged logic drive; (c) for connecting or coupling copper pads, solder bumps or copper pillars directly and vertically over a backside of a first FPGA chip (top side, with the side having transistors of the first FPGA chip faced down) of the single-layer-packaged logic drive to copper pads, solder bumps or copper pillars directly and vertically over a second FPGA chip (top side, with the side having transistors of the second FPGA chip faced down) of the single-layer-packaged logic drive by using an interconnection net or scheme of metal lines or traces in or of the BISD. The interconnection net or scheme may be connected or coupled to TPVs of the single-layer-packaged logic drive; (d) for connecting or coupling a copper pad, solder bump or copper pillar directly and vertically over a FPGA chip of the single-layer-packaged logic drive to another copper pad, solder bump or copper pillar, or multiple other copper pads solder bumps or copper pillars directly and vertically over the same FPGA chip by using an interconnection net or scheme of metal lines or traces in or of the BISD. The interconnection net or scheme may be connected or coupled to the TPVs of the single-layer-packaged logic drive; (e) for the power or ground planes and/or heat dissipaters or spreaders.

Another aspect of the disclosure provides a method for forming a stacked logic driver using the single-layer-packaged logic drive with the BISD and TPVs. The stacked logic drive may be formed using the same or similar process steps, as described and specified above; for an example, by the following process steps: (i) providing a first single-layer-packaged logic drive with both TPVs and the BISD, either separated or still in the wafer or panel format, and with its copper pillars or bumps, solder bumps, or gold bumps on or under the metal contact vias of the FOISD (on the bottom side), and with the exposed copper pads, copper pillars, or solder bumps on or over the BISD (on its upside); (ii) Package-On-Package (POP) stacking assembling, by surface-mounting and/or stack-package methods, a second separated single-layer-packaged logic drive (also with both TPVs and the BISD) on top of the provided first single-layer-packaged logic drive. The surface-mounting process is similar to the Surface-Mount Technology (SMT) used in the assembly of components on or to the Printed Circuit Boards (PCB), by, for example, first printing solder or solder cream, or flux on the surfaces of the exposed copper pads, and then stack-package assembling, connecting or coupling the copper pillars or bumps, solder bumps, or gold bumps on or of the second separated single-layer-packaged logic drive to the solder or solder cream or flux printed surfaces of the exposed copper pads of the first single-layer-packaged logic drive. The stack-package process is performed, similar to the Package-On-Package technology (POP) used in the IC stacking-package technology, by stack-package assembling, connecting or coupling the copper pillars or bumps, solder bumps, or gold bumps on or of the second separated single-layer-packaged logic drive to the surfaces of copper pads of the first single-layer-packaged logic drive. Note that the copper pillars or bumps, solder bumps, or gold bumps on or of the second separated single-layer-packaged logic drive bonded to the surfaces of copper pads of the first single-layer-packaged logic drive may be located directly and vertically over or above locations where IC chips are placed in the first single-layer-packaged logic drive; and that the copper pillars or bumps, solder bumps, or gold bumps on or of the second separated single-layer-packaged logic drive bonded to the surfaces of copper pads of the first single-layer-packaged logic drive may be located directly and vertically under or below locations where IC chips are placed in the second single-layer-packaged logic drive. An underfill material may be filled in the gaps between the first and the second single-layer-packaged logic drivers. A third separated single-layer-packaged logic drive (also with both TPVs and the BISD) may be stack-package assembled, connected or coupled to the exposed surfaces of TPVs of the second single-layer-packaged logic drive. The Package-On-Package stacking assembling process may be repeated for assembling more separated single-layer-packaged logic drives (for example, up to more than or equal to a nth separated single-layer-packaged logic drive, wherein n is greater than or equal to 2, 3, 4, 5, 6, 7, 8) to form the finished stacking logic drive. When the first single-layer-packaged logic drives are in the separated format, they may be first stack-package assembled to a carrier or substrate, for example a PCB, or a BGA (Ball-Grid-Array) substrate, and then performing the POP processes, in the carrier or substrate format, to form stacked logic drives, and then cutting, dicing the carrier or substrate to obtain the separated finished stacked logic drives. When the first single-layer-packaged logic drives are still in the wafer or panel format, the wafer or panel may be used directly as the carrier or substrate for performing POP stacking processes, in the wafer or panel format, for forming the stacked logic drives. The wafer or panel is then cut or diced to obtain the separated stacked finished logic drives.

Another aspect of the disclosure provides varieties of interconnection alternatives for the TPVs of a single-layer-packaged logic drive: (a) the TPV may be designed and formed as a through via by stacking the TPV directly over the stacked metal vias of FOISD and directly over copper pad, metal bump, solder bump, copper pillar, or gold bump on or under the FOISD. The TPV for connecting a single-layer-packaged logic drive above the single-layer-packaged logic drive, and a single-layer-packaged logic drive below the single-layer-packaged logic drive; without connecting or coupled to the FOISD or micro copper pillars or bumps on or of any IC chip of the single-layer-packaged logic drive. In this case, a stacked structure is formed, from top to bottom: (i) copper pad, solder bump, copper pillar or metal bump; (ii) stacked interconnection layers and metal vias in the dielectric layer of the BISD; (iii) the TPV; (iv) stacked interconnection layers and metal vias in the dielectric layer of the FOISD; (v) metal via contact at the bottom of the FOISD; (vi) copper pad, metal bump, solder bump, copper pillar, or gold bump on or under metal via contact at the bottom of the FOISD. Alternatively, the stacked TPV/metal layers and vias/metal via contact may be used as a thermal conduction via; (b) the TPV is stacked as a through TPV as in (a), but is connected or coupled to the FOISD or micro copper pillars or bumps on or of one or more IC chips of the single-layer-packaged logic drive, through the metal lines or traces of the FOISD; (c) the TPV is only stacked at the top portion, but not at the bottom portion. In this case, a structure for the TPV connection is formed, from top to bottom: (i) copper pads, solder bump, copper pillar or metal bump on or over the BISD; (ii) stacked interconnection layers and metal vias in the dielectric layer of the BISD; (iii) the TPV; (iv) the bottom of the TPV is connected or coupled to the FOISD or micro copper pillars or bumps on or of one or more IC chips of the single-layer-packaged logic drive, through the interconnection metal layers and metal vias in the dielectric layer of the FOISD. Wherein (1) a copper pad, metal bump, solder bumps, copper pillar or gold bump, directly under the bottom of the TPV, is not connected or coupled to the TPV; (2) a copper pad, metal bump, solder bump, copper pillar or gold bump on and under the FOISD connected or coupled to the bottom of the TPV (through FOISD) is and at a location not directly and vertically under the bottom of the TPV; (d) a structure for the TPV connection is formed, from top to bottom: (i) a copper pad, metal pillar or bump (on the BISD) connected or coupled to the top surface of the TPV, and may be at a location directly and vertically over the backside of the IC chips; (ii) the copper pad, metal pillar or bump (on the BISD) is connected or coupled to the top surface of the TPV (which is located between the gaps of chips or at the peripheral area where no chip is placed) through the interconnection metal layers and metal vias in the dielectric layer of the BISD; (iii) the TPV; (iv) the bottom of the TPV is connected or coupled to the FOISD, or the micro copper pillars or bumps on or of one or more IC chips of the single-layer-packaged logic drive through the interconnection metal layers and metal vias in the dielectric layer of the FOISD; (v) metal via contact (in the FOISD) and a metal pad, pillar or bump (on or under the metal via contact) connected or coupled to the bottom of the TPV, wherein the metal pad, bump or pillar may be at a location not directly under the bottom of the TPV; (e) a structure for the TPV connection is formed, from top to bottom: (i) a metal pad, pillar or bump (on the BISD) directly or vertically over the backside of an IC chip of the single-layer-packaged logic drive; (ii) the metal pad, pillar or bump on the BISD is connected or coupled to the top surface of the TPV (which is located between the gaps of chips or at the peripheral area where no chip is placed) through the interconnection metal layers and metal vias in the dielectric layer of the BISD; (iii) the TPV; (iv) the bottom of the TPV is connected or coupled to the FOISD, and/or micro copper pillars or bumps, SISC, or FISC on or of one or more IC chips of the single-layer-packaged logic drive through the interconnection metal layers and metal vias in the dielectric layer of the FOISD. Wherein no metal via contact (of the FOISD) and no metal pad, pillar or bump (on or under the metal via contact) are connected or coupled to the bottom of the TPV.

Another aspect of the disclosure provides an interconnection net or scheme of metal lines or traces in or of the FOISD of the single-layer-packaged logic drive used for connecting or coupling the transistors, the FISC, the SISC and/or the micro copper pillars or bumps of an FPGA IC chip or multiple FPGA IC chips packaged in the single-layer-packaged logic drive, but the interconnection net or scheme is not connected or coupled to the circuits or components outside or external to the single-layer-packaged logic drive. That is, no metal pads, pillars or bumps (copper pads, pillars or bumps, solder bumps, or gold bumps) on or under the FOISD of the single-layer-packaged logic drive is connected to the interconnection net or scheme of metal lines or traces in or of the FOISD, and no metal pads, pillars or bumps (copper pads, pillars or bumps, solder bumps) on or over the BISD is connected or coupled to the interconnection net or scheme of metal lines or traces in or of the FOISD.

Another aspect of the disclosure provides the logic drive in a multi-chip package format further comprising one or plural dedicated programmable interconnection IC (DPIIC) chip or chips. The DPIIC chip comprises 5T or 6T SRAM cells and cross-point switches, and is used for programming the interconnection between circuits or interconnections of the standard commodity FPGA chips. The programmable interconnections comprise interconnection metal lines or traces of the FOISD between the standard commodity FPGA chips, with cross-point switch circuits in the middle of interconnection metal lines or traces of the FOISD. For example, n metal lines or traces of the FOISD are input to a cross-point switch circuit, and m metal lines or traces of the FOISD are output from the switch circuit. The cross-point switch circuit is designed such that each of the n metal lines or traces of the FOISD can be programed to connect to anyone of the m metal lines or traces of the FOISD. The cross-point switch circuit may be controlled by the programming code stored in, for example, a SRAM cell in or of the DPIIC chip. The SRAM cell may comprise 6-Transistors (6T), with two transfer (write) transistors and 4 data-latch transistors. The two transfer (write) transistors are used for writing the programing code or data into the two storage or latch nodes of the 4 data-latch transistors. Alternatively, the SRAM cell may comprise 5-Transistors (5T), with a transfer (write) transistor and 4 data-latch transistors. The transfer (write) transistor is used for writing the programing code or data into the two storage or latch nodes of the 4 data-latch transistors. The stored (programming) data in the 5T or 6T SRAM cell is used to program the connection or not-connection of metal lines or traces of the FOISD. The cross-point switches are the same as that described in the standard commodity FPGA IC chips. The details of various types of cross-point switches are as specified or described in the paragraphs of FPGA IC chips. The cross-point switches may comprise: (1) n-type and p-type transistor pair circuits; or (2) multiplexers and switch buffers. When the data latched in the 5T or 6T SRAM cell is programmed at 1, a pass/no-pass circuit comprising a n-type and p-type transistor pair is on, and the two metal lines or traces of the FOISD connected to two terminals of the pass-no-pass circuit (the source and drain of the transistor pair, respectively), are connected; while the data latched in the 5T or 6T SRAM cell is programmed at 0, a pass/no-pass circuit comprising a n-type and p-type transistor pair circuit is off, and the two metal lines or traces of the FOISD connected to two terminals of the pass/no-pass circuit (the source and drain of the transistor pair, respectively), are dis-connected. Alternatively, when the data latched in the 5T or 6T SRAM cell is programmed at 1, the control N-MOS transistor and the control P-MOS transistor in the switch buffer are on, the data on the input metal line is passing to the output metal line of the cross-point switch, and the two metal lines or traces of the FOISD connected to two terminals of the cross-point switch are coupled or connected; while the data latched in the 5T or 6T SRAM cell is programmed at 0, the control N-MOS transistor and the control P-MOS transistor in the switch buffer are off, the data on the input metal line is not passing to the output metal line of the cross-point switch, and the two metal lines or traces of the FOISD connected to two terminals of the cross-point switch are not coupled or dis-connected. The DPIIC chip comprises 5T or 6T SRAM cells and cross-point switches used for programmable interconnection of metal lines or traces of the FOISD between the standard commodity FPGA chips in the logic drive. Alternatively, the DPIIC chip comprising 5T or 6T SRAM cells and cross-point switches may be used for programmable interconnection of metal lines or traces of the FOISD between the standard commodity FPGA chips and the TPVs (for example, the bottom surfaces of the TPVs) in the logic drive, in the same or similar method as described above. The stored (programming) data in the 5T or 6T SRAM cell is used to program the connection or not-connection between (i) a first metal line, trace, or net of the FOISD, connecting to one or more micro copper pillars or bumps on or over one or more the IC chips of the logic drive, and/or to one or more metal pads, pillars or bumps on or under the metal via contacts of the FOISD, and (ii) a second metal line, trace or net of the FOISD, connecting or coupling to a TPV (for example, the bottom surface of the TPV), in a same or similar method described above. With this aspect of disclosure, TPVs are programmable; in other words, this aspect of disclosure provides programmable TPVs. The programmable TPVs may, alternatively, use the programmable interconnection, comprising 5T or 6T SRAM cells and cross-point switches, on or of the FPGA chips in or of the logic drive. The programmable TPV may be or not be, by (software) programming, (i) connected or coupled to one or more micro copper pillars or bumps of one or more IC chips (therefor to the metal lines or traces of the SISC and/or the FISC, and/or the transistors) of the logic drive, and/or (ii) connected or coupled to one or more metal pads, pillars or bumps on or under metal via contacts of the FOISD of the logic drive. When a metal pad, bump or pillar (on or over the BISD) at the backside of the logic drive is connected to the programmable TPV, the metal pad, bump or pillar (on or over the BISD) becomes a programmable metal bump or pillar (on or over the BISD). The programmable metal pad, bump or pillar (on or over the BISD) at the backside of the logic drive may be or not be connected or coupled to, by programming and through the programmable TPV, (i) one or more micro copper pillars or bumps of one or more IC chips (therefor to the metal lines or traces of the SISC and/or the FISC, and/or the transistors) at the frontside (the side with the transistors) of the one or more IC chips of the logic drive, and/or (ii) one or more metal pads, pillars or bumps on or under the FOISD of the logic drive. Alternatively, the DPIIP chip comprises 5T or 6T SRAM cells and cross-point switches may be used for programmable interconnection of metal lines or traces of the FOISD between the metal pads, pillars or bumps (copper pads, copper pillars or bumps, solder bumps or gold bumps) on or under the FOISD of the logic drive and one or more micro copper pillars or bumps on or of one or more IC chips of the logic drive, in a same or similar method as described above. The stored (programming) data in the 5T or 6T SRAM cell is used to program the connection or not-connection between (i) a first metal line, trace or net of the FOISD, connecting to one or more micro copper pillars or bumps on or of one or more IC chips of the logic drive, and/or to the metal pads, pillars or bumps on or under the FOISD, and (ii) a second metal line, trace or net of the FOISD, connecting or coupling to the metal pad, pillar or bump on or under the FOISD, in a same or similar method described above. With this aspect of disclosure, metal pads, pillars or bumps on or under the FOISD are programmable; in other words, this aspect of disclosure provides programmable metal pads, pillars or bumps on or under the FOISD. The programmable metal pad, pillar or bump on or under the FOISD may, alternatively, use the programmable interconnection, comprising 5T or 6T SRAM cells and cross-point switches, on or of the FPGA chips in or of the logic drive. The programmable metal pad, pillar or bump on or under the FOISD may be connected or coupled, by programming, to one or more micro copper pillars or bumps of one or more IC chips (therefor to the metal lines or traces of the SISC and/or the FISC, and/or the transistors) of the logic drive.

The DPIIC chip is designed, implemented and fabricated using varieties of semiconductor technology nodes or generations, including old or matured technology nodes or generations, for example, a semiconductor node or generation less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the DPIIC chip is 1, 2, 3, 4, 5 or greater than 5 nodes or generations older, more matured or less advanced than that used in the standard commodity FPGA IC chips packaged in the same logic drive. Transistors used in the DPIIC chip may be a FINFET, a Fully Depleted Silicon-on-insulator (FDSOI) MOSFET, a Partially Depleted Silicon-on-insulator (PDSOI) MOSFET or a conventional MOSFET. Transistors used in the DPIIC chip may be different from that used in the standard commodity FPGA IC chips packaged in the same logic drive; for example, the DPIIC chip may use the conventional MOSFET, while the standard commodity FPGA IC chips packaged in the same logic drive may use the FINFET; or the DPIIC chip may use the Fully Depleted Silicon-On-Insulator (FDSOI) MOSFET, while the standard commodity FPGA IC chips packaged in the same logic drive may use the FINFET.

Another aspect of the disclosure provides the logic drive in a multi-chip package format further comprising one or plural dedicated programmable interconnection and Cache SRAM (DPICSRAM) chip or chips. The DPICSRAM chip comprises (i) 5T or 6T SRAM cells and cross-point switches used for programming interconnection of the metal lines or traces of the FOISD, and therefore programming the interconnection (FOISD) between circuits or interconnections of the standard commodity FPGA chips in or of the logic drive, and (ii) the conventional 6T SRAM cells used for cache memory. The programmable interconnections of the 5T or 6T cells and cross-point switches are described and specified above. The programmable TPV, the programmable metal pads, pillars or bumps on or under the FOISD, the programmable metal pad, bump or pillar on or over the BISD at the backside of the logic drive of the logic drive are the same or similar to that as described and specified in logic drive comprising the DPIIC chips.

The 6T SRAM cell used as cache memory for data latch or storage comprises 2 transistors for bit and bit-bar data transfer, and 4 data-latch transistors for a data latch or storage node. The 6T SRAM cache memory cells provide the 2 transfer transistors for writing data into them and reading data stored in them. A sense amplifier is required for reading (amplifying or detecting) data from the cache memory cells. In comparison, the 5T or 6T SRAM cells used for the programmable interconnection or for the LUTs may not require the reading step, and no sense amplifier is required for sensing the data from the SRAM cell. The DPICSRAM chip comprises 6T SRAM cells for use as cache memory to store data during the processing or computing of the chips of the logic drive. The DPICSRAM chip is designed, implemented and fabricated using varieties of semiconductor technology nodes or generations, including old or matured technology nodes or generations, for example, a semiconductor node or generation less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the DPICSRAM chip is 1, 2, 3, 4, 5 or greater than 5 nodes or generations older, more matured or less advanced than that used in the standard commodity FPGA IC chips packaged in the same logic drive. Transistors used in the DPICSRAM chip may be a FINFET, a Fully Depleted Silicon-on-insulator (FDSOI) MOSFET, a Partially Depleted Silicon-on-insulator (PDSOI) MOSFET or a conventional MOSFET. Transistors used in the DPICSRAM chip may be different from that used in the standard commodity FPGA IC chips packaged in the same logic drive; for example, the DPICSRAM chip may use the conventional MOSFET, while the standard commodity FPGA IC chips packaged in the same logic drive may use the FINFET; or the DPICSRAM chip may use the Fully Depleted Silicon-on-insulator (FDSOI) MOSFET, while the standard commodity FPGA IC chips packaged in the same logic drive may use the FINFET.

Another aspect of the disclosure provides a standardized Temporary Substrate (TS) comprising standardized FOISD, in the wafer from or panel form in the stock or in the inventory for use in the later processing in forming the standard commodity logic drive, as described and specified above. The standardized TS comprises a fixed physical layout or design of the metal via contacts of the FOISD; and a fixed design and layout of the TPVs on or over the FOISD if included in the FOISD. The locations or coordinates of the metal via contacts and the TPVs in or on the TS are the same or of certain types of standards of layouts and designs for the standard TS. For example, connection schemes between metal via contacts and the TPVs, are the same for each of the standard commodity TS. Furthermore, the design or interconnection of the FOISD, and the layout or coordinates of the micro copper pads, pillars or bumps on or over the FOISD are the same or of certain types of standards of layouts and designs for the standard TS. The standard commodity TS in the stock or inventory is then used for forming the standard commodity logic drive by the process described and specified above, including process steps: (1) flip-chip assembling or bonding the IC chips on or to the standard TS with the side or surface of the chip with transistors faced down; (2) Applying a material, resin, or compound to fill the gaps between chips and cover the backside surfaces of IC chips by methods, for example, spin-on coating, screen-printing, dispensing or molding in the wafer or panel format. Applying a CMP process, polishing process, or backside grinding process to planarize the surface of the applied material, resin or compound to a level where the top surfaces of all bumps or pillars (TPVs) on or of the FOISD and the backside of IC chips are fully exposed; (3) forming the BISD; and (4) forming the metal pads, pillars or bumps on or over the BISD. The standard commodity TS with a fixed layout or design may be used and customized, by software coding or programming, using the programmable TPVs, and/or programmable metal pads, pillars or bumps on or under the FOISD as described and specified above, for different algorithms, architectures and/or applications. As described above, the data installed or programed in the 5T or 6T SRAM cells of the DPIIC or DPICSRAM chips may be used for programmable TPVs, the programmable metal pads, pillars or bumps on or under the FOISD, and/or the programmable metal pad, bump or pillar on or over the BISD at the backside of the logic drive of the logic drive. The data installed or programed in the 5T or 6T SRAM cells of the FPGA chips may be alternatively used for programmable TPVs, the programmable metal pads, pillars or bumps on or under the FOISD, and/or the programmable metal pad, bump or pillar on or over the BISD at the backside of the logic drive of the logic drive.

Another aspect of the disclosure provides the standardized commodity logic drive (for example, the single-layer-packaged logic drive) with a fixed design, layout or footprint of (i) the metal pads, pillars or bumps (copper pillars or bumps, solder bumps or gold bumps) on or under the metal via contacts of the FOISD, and (ii) copper pads, copper pillars or solder bumps (on or over the BISD) on the backside (top side, the side with the transistors of IC chips are faced down) of the standard commodity logic drive. The standardized commodity logic drive may be used, customized for different algorithms, architectures and/or applications by software coding or programming, using the programmable metal pads, pillars or bumps on or under the metal via contacts of the FOISD, and/or using programmable copper pads, copper pillars or bumps, or solder bumps on or over the BISD (through programmable TPVs), as described and specified above, for different algorithms, architectures and/or applications. As described above, the codes of the software programs are loaded, installed or programed in the 5T or 6T SRAM cells of the DPIIC or DPICSRAM chip for controlling cross-point switches of the same DPIIC or DPICSRAM chip in or of the standard commodity logic drive for different varieties of algorithms, architectures and/or applications. Alternatively, the codes of the software programs are loaded, installed or programed in the 5T or 6T SRAM cells of one of the FPGA IC chips, in or of the logic drive in or of the standard commodity logic drive, for controlling cross-point switches of the same one FPGA IC chip for different varieties of algorithms, architectures and/or applications. Each of the standard commodity logic drives with the same design, layout or footprint of the metal pads, pillars or bumps on or under the metal via contacts of the FOISD, and the copper pads, copper pillars or bumps, or solder bumps on or over the BISD may be used for different algorithms, architectures and/or applications, purposes or functions, by software coding or programming, using the programmable metal pads, pillars or bumps on or under the metal via contacts of the FOISD, and/or programmable copper pads, copper pillars or bumps, or solder bumps on or over the BISD (through programmable TPVs) of the logic drive.

Another aspect of the disclosure provides the logic drive, either in the single-layer-packaged or in a stacked format, comprising IC chips, logic blocks (comprising LUTs, multiplexers, logic circuits, logic gates, and/or computing circuits) and/or memory cells or arrays, immersed in a super-rich interconnection scheme or environment. The logic blocks (comprising LUTs, multiplexers, logic circuits, logic gates, and/or computing circuits) and/or memory cells or arrays of each of the multiple standard commodity FPGA IC chips (and/or other IC chips in the single-layer-packaged or in a stacked logic drive) are immersed in a programmable 3D Immersive IC Interconnection Environment (IIIE). The programmable 3D IIIE on, in, or of the logic drive package provides the super-rich interconnection scheme or environment, comprising (1) the FISC, the SISC and micro copper pillars or bumps on, in or of the IC chips, (2) the FOISD, TPVs, micro copper pillars or bumps, and metal via contacts of the FOISD, (3) metal pads, pillars or bumps on or under the metal via contacts of the FOISD, (4) the BISD, and (5) copper pads, copper pillars or bumps, or solder bumps on or over the BISD. The programmable 3D IIIE provides a programmable 3-Dimension (3D) super-rich interconnection scheme or system: (1) the FISC, the SISC, the FOISD, and/or the BISD provide the interconnection scheme or system in the x-y directions for interconnecting or coupling the logic blocks and/or memory cells or arrays in or of a same FPGA IC chip, or in or of different FPGA chips in or of the single-layer-packaged logic drive. The interconnection of metal lines or traces in the interconnection scheme or system in the x-y directions is programmable; (2) The metal structures including micro pillars or bumps on the SISC, micro pillars or bumps on the FOISD, metal via contacts, metal pads, pillars or bumps on or under the metal via contacts of the FOISD, TPVs, and/or copper pads, copper pillars or bumps, or solder bumps on or over the BISD provide the interconnection scheme or system in the z direction for interconnecting or coupling the logic blocks, and/or memory cells or arrays in or of different FPGA chips in or of different single-layer-packaged logic drives stacking-packaged in the stacked logic drive. The interconnection of the metal structures in the interconnection scheme or system in the z direction is also programmable. The programmable 3D IIIE provides an almost unlimited number of the transistors or logic blocks, interconnection metal lines or traces, and memory cells/switches at an extremely low cost. The programmable 3D IIIE similar or analogous to the human brain: (i) transistors and/or logic blocks (comprising logic gates, logic circuits, computing operators, computing circuits, LUTs, and/or multiplexers) are similar or analogous to the neurons (cell bodies) or the nerve cells; (ii) the metal lines or traces of the FISC and/or the SISC are similar or analogous to the dendrites connecting to the neurons (cell bodies) or nerve cells. The micro pillars or bumps connecting to the receivers for the inputs of the logic blocks (comprising, for example, logic gates, logic circuits, computing operators, computing circuits, LUTs, and/or multiplexers) in or of the FPGA IC chips are similar or analogous to the post-synaptic cells at the ends of the dendrites; (iii) the long distance connects formed by metal lines or traces of the FISC, the SISC, the FOISD, and/or the BISD, and the metal vias, metal pads, pillars or bumps, including the micro copper pillars or bumps on the SISC, metal via contacts, metal pads, pillars or bumps on or under the metal via contacts of the FOISD, TPVs, and/or copper pads, copper pads, pillars or bumps, or solder bumps on or over the BISD, are similar or analogous to the axons connecting to the neurons (cell bodies) or nerve cells. The micro pillars or bumps connecting the drivers or transmitters for the outputs of the logic blocks (comprising, for example, logic gates, logic circuits, computing operators, computing circuits, LUTs, and/or multiplexers) in or of the FPGA IC chips are similar or analogous to the pre-synaptic cells at the axons' terminals.

Another aspect of the disclosure provides the programmable 3D IIIE with similar or analogous connections, interconnection and/or functions of a human brain: (1) transistors and/or logic blocks (comprising, for example, logic gates, logic circuits, computing operators, computing circuits, LUTs, and/or multiplexers) are similar or analogous to the neurons (cell bodies) or the nerve cells; (2) The interconnection schemes and/or structures of the logic drives are similar or analogous to the axons or dendrites connecting or coupling to the neurons (cell bodies) or the nerve cells. The interconnection schemes and/or structures of the logic drives comprise (i) metal lines or traces of the FISC, the FOISD, and/or BISD and/or (ii) the micro copper pillars or bumps on the SISC, metal via contacts, metal pads, pillars or bumps on or under the metal via contacts of the FOISD, TPVs, and/or copper pads, copper pillars or bumps, or solder bumps on or over the BISD. An axon-like interconnection scheme and/or structure of the logic drive is connected to the driving or transmitting output (a driver) of a logic unit or operator; and having a scheme or structure like a tree, comprising: (i) a trunk or stem connecting to the logic unit or operator; (ii) multiple branches branching from the stem, and the terminal of each branch may be connected or coupled to other logic units or operators. Programmable cross-point switches (5T or 6T SRAM cells/switches of the FPGA IC chips and/or of the DPIICs or DPICSRAMs) are used to control the connection or not-connection between the stem and each of the branches; (iii) sub-branches branching form the branches, and the terminal of each sub-branch may be connected or coupled to other logic units or operators. Programmable cross-point switches (5T or 6T SRAM cells/switches of the FPGA IC chips and/or of the DPIICs or DPICSRAMs) are used to control the connection or not-connection between a branch and each of its sub-branches. A dendrite-like interconnection scheme and/or structure of the logic drive is connected to the receiving or sensing input (a receiver) of a logic unit or operator; and having a scheme or structure like a shrub or bush comprising: (i) a short stem connecting to the logic unit or operator; (ii) multiple branches branching from the stem. Programmable switches (5T or 6T SRAM cells/switches of the FPGA IC chips and/or of the DPIICs or DPICSRAMs) are used to control the connection or not-connection between the stem and each of its branches. There are multiple dendrite-like interconnection scheme or structures connecting or coupling to the logic unit or operator. The end of each branch of the dendrite-like interconnection scheme or structure is connected or coupled to the terminal of a branch or sub-branch of the axon-like interconnection scheme or structure. The dendrite-like interconnection scheme and/or structure of the logic drive may comprise the FISCs and SISCs of the FPGA IC chips.

Another aspect of the disclosure provides a "public innovation platform" for innovators to easily and cheaply implement or realize their innovation (algorithms, architectures and/or applications) in semiconductor IC chips using advanced IC technology nodes more advanced than 20 nm, and for example, using a technology node of 16 nm, 10 nm, 7 nm, 5 nm or 3 nm by using logic drives; wherein said innovation comprises (i) innovative algorithms or architectures of computing, processing, learning and/or inferencing, and/or (ii) innovative and/or specific applications. In early days, 1990's, innovators could implement their innovation (algorithms, architectures and/or applications) by designing IC chips and fabricate their designed IC chips in a semiconductor foundry fab using technology nodes at 1 μm, 0.8 μm, 0.5 μm, 0.35 μm, 0.18 μm or 0.13 μm, at a cost of about several hundred thousands of US dollars. The IC foundry fab was then the "public innovation platform". However, when IC technology nodes migrate to a technology node more advanced than 20 nm, and for example to the technology node of 16 nm, 10 nm, 7 nm, 5 nm or 3 nm, only a few giant system or IC design companies, not the public innovators, can afford to use the semiconductor IC foundry fab. It costs about or over 10 million US dollars to develop and implement an IC chip using these advanced technology nodes. The semiconductor IC foundry fab is now not "public innovation platform" anymore, they are "club innovation platform" for club innovators. The concept of the disclosed logic drives, comprising standard commodity FPGA IC chips, provides public innovators "public innovation platform" back to semiconductor IC industry again; just as in 1990's. The innovators can implement or realize their innovation (algorithms, architectures and/or applications) by using logic drives (comprising FPGA IC chips fabricated using advanced than 20 nm technology nodes) and writing software programs in common programing languages, for example, C, Java, C++, C #, Scala, Swift, Matlab, Assembly Language, Pascal, Python, Visual Basic, PL/SQL or JavaScript languages, at cost of less than 500K or 300K US dollars. The innovators can use their own commodity logic drives or they can rent logic drives in data centers or clouds through networks.

Another aspect of the disclosure provides an innovation platform for an innovator, comprising: multiple logic drives in a data center or a cloud, wherein multiple logic drives comprise multiple standard commodity FPGA IC chips fabricated using a semiconductor IC process more advanced than 20 nm technology node; an innovator's device and multiple users' devices communicating with the multiple logic drives in the data center or the cloud through an internet or a network, wherein the innovator develops and writes software programs to implement his innovation (algorithms, architectures and/or applications) in a common programing language to program, through the internet or the network, the multiple logic drives in the data center or the cloud, wherein the common programing language comprises Java, C++, C #, Scala, Swift, Matlab, Assembly Language, Pascal, Python, Visual Basic, PL/SQL or JavaScript language; after programming the logic drives, the innovator or the multiple users may use the programed logic drives for his or their innovation (algorithms, architectures and/or applications) through the internet or the network; wherein said innovations comprise (i) innovative algorithms or architectures of computing, processing, learning and/or inferencing, and/or (ii) innovative and/or specific applications.

Another aspect of the disclosure provides a reconfigurable plastic and/or integral architecture for system/machine computing or processing using integral and alterable memory units and logic units, in addition to the sequential, parallel, pipelined or Von Neumann computing or processing system architecture and/or algorithm. The disclosure provides a programmable logic device (the logic drive) with elasticity and integrality, comprising integral and alterable memory units and logic units, to alter or reconfigure logic functions and/or computing (or processing) architecture (or algorithm), and/or the memories (data or information) in the memory units. The properties of the elasticity and integrality of the logic drive is similar or analogous to that of a human brain. The brain or nerves have elasticity and integrality. Many aspects of brain or nerves can be altered (or are "plastic") and reconfigured through adulthood. The logic drives (or FPGA IC chips) described and specified above provide capabilities to alter or reconfigure the logic functions and/or computing (or processing) architecture (or algorithm) for a given fixed hardware using the memories (data or information) stored in the near-by Configuration Programing Memory cells (CPM). In the logic drive (or FPGA IC chips), the memories (data or information) stored in the memory cells of CPM are used for altering or reconfiguring the logic functions and/or computing/processing architecture (or algorithm). The data or information stored in the Configuration Programing Memory cells (CPM) are used for LUTs or the programming interconnection in the FPGA IC chips. Configuration Programing Memory cells (CPM) are the NVRAM cells (MRAM, RRAM or SS RRAM cells described and specified above) and/or SRAM cells in the standard commodity FPGA IC chips of the logic drive. Some other memories stored in the memory cells (for example, the SRAM or DRAM cells in the HBM IC chips in the logic drive or NAND flash memory cells in NVM IC chips in the logic drive) are just used for data or information (Data Information Memory cells, DIM); wherein one or more of the NVM (NAND flash memory) IC chips are further included in the logic drive. The NAND flash IC chips are packaged in the logic drive by using the same method that the FPGA IC chips are packaged in the logic drive. The NAND flash IC chips may be used to backup the data or information of DIM cells of the SRAM or DRAM cells in the HBM IC chips. When the power supply of the logic drive is turned off, the data or information stored in the NVM (NAND flash memory) IC chips will be kept. The data or information in the DIM cells are related to the operation, computing or processing, for example: (i) the input data or information required for the operation, computing or processing, or (ii) the output data or information of the operation, computing or processing.

The elasticity and integrality of the logic drive are based on events. The state of the logic drive is evolved or reconfigured based on event. The state (S) of the logic drive comprises an integral unit (IU), a logic state (L), a CPM state and a DIM state, and can be described as S (IU, L, CPM, DIM). The evolution or reconfiguration of the state of the logic drive is as follows: (1) after a $(n-1)^{th}$ Event ($E_n$) and before a $n^{th}$ Event ($E_n$), the logic drive is at a $(n-1)^{th}$ state $S_{n-1}$ ($IU_{n-1}$, $L_{n-1}$, $CPM_{n-1}$, $DIM_{n-1}$), wherein n is a positive integer, 1, 2, 3, . . . ; (2) when the logic drive (or a machine, system or device external of the logic drive) is subject to the $n^{th}$ Event ($E_n$), it detects or senses the $n^{th}$ Event ($E_n$) and generate a $n^{th}$ signal ($F_n$); the detected or sensed signal ($F_n$) is input to the logic drive. The FPGA IC chips of the logic drive perform processing and computing based on $F_n$, generate a $n^{th}$ resulting data or information ($DR_n$) and output $DR_n$ to DIMs of the logic drive; (3) the DIMs store the $DR_n$ and are evolved to a DIM state, $DIMR_n$; (4) the FPGA IC chips or other control, processing or computing IC chips of the logic drive perform comparison between $DIMR_n$ and $DIM_{n-1}$, by detecting the change between them, for example, counting a number ($M_n$) of cells in DIMs in which the data or information is changed or altered between $DIMR_n$ and $DIM_{n-1}$; (5) the FPGA IC chips or other control, processing or computing IC chips of the logic drive compare $M_n$ to a preset criteria $M_c$ for decision making between evolution or reconfiguration of the logic drive. If $M_n$ is equal to or larger than $M_c$, the event $E_n$ is a grand event, then go to the reconfiguration route step (6a). If $M_n$ is smaller than $M_c$, the event $E_n$ is not a grand event, go to the evolution route step (6b).

Step (6a): the logic drive is then under the reconfiguration process by generating a new state of CPMs, $CPMC_n$. For example, based on $DIMR_n$, new truth tables may be generated and then may be transformed into $CPMC_n$. The $CPMC_n$ is loaded to the FPGA IC chips of the logic drive to program circuit interconnection or LUTs therein. After the reconfiguration, the logic drive is at a new state $SC_n$ ($IUC_n$, $LC_n$, $CPMC_n$, $DIMC_n$), comprising new states of $IUC_n$, $LC_n$, $CPMC_n$, and $DIMC_n$. The new state $SC_n$ ($IUC_n$, $LC_n$, $CPMC_n$, $DIMC_n$) will be defined as a final state $S_n$ ($IU_n$, $L_n$, $CPM_n$, DIMn) of the logic drive after the grand event $E_n$.

Step (6b): the logic drive is then under the evolution process. The FPGA IC chips or other control, processing or computing IC chips of the logic drive calculate the accumulated value $M_N$ by summing all $M_n$'s, wherein n is: (A) from 1 to n if no grand event happened; (B) from R+1 to n if a last grand event happened at the $R^{th}$ event $E_R$, wherein R is a positive integer. The FPGA IC chips or other control, processing or computing IC chips of the logic drive compare $M_N$ to $M_c$. If $M_N$ is equal to or larger than $M_c$, go to the reconfiguration route step (6a) as described and specified above. If $M_N$ is smaller than $M_c$, the logic drive is at an evolution state $SE_n$ ($IUE_n$, $LE_E$, $CPME_n$, $DIME_n$), wherein the states of L, CPM do not change from that after Event $E_{n-1}$, that means, $LE_n$ is the same as $L_{n-1}$, $CPME_n$ is the same as $CPM_{n-1}$; while $DIME_n$ is $DIMR_n$. The evolution state $SE_n$ ($IUE_n$, $LE_n$, $CPME_n$, $DIME_n$) will be defined as a final state $S_n$ ($IU_n$, $L_n$, $CPM_n$, $DIM_n$) of the logic drive after the evolution event $E_n$.

The steps (1) to (6a) or (6b) may be repeated for the $(n+1)^{th}$ Event $E_{n+1}$.

The logic drive may further comprises condense or concise processes and learning processes:

I. Condense or Concise Processes:

(A) DIM reconfiguration: (1) A machine/system external of the logic drive (and/or the FPGA IC chips or other control, processing or computing IC chips of the logic drive) checks the $DIM_n$ to find identical memories, and then keeping only one memory of all identical memories, deleting all other identical memories; and/or (2) A machine/system external of the logic drive (and/or the FPGA IC chips or other control, processing or computing IC chips of the logic drive) checks the $DIM_n$ to find similar memories (similarity within a given percentage x %, for example, is equal to or smaller than 2%, 3%, 5% or 10% in difference), and keeping only one or two memories of all similar memories in the SRAM or DRAM cells in the HBM IC chips in the logic drive and NAND flash memory cells in NVM IC chips in the logic drive, and storing all other similar memories in the NAND flash memory cells in NVM IC chips in the logic drive or in the memory storage device external of the logic drive, while not in the SRAM or DRAM cells in the HBM IC chips in the logic drive; alternatively, a representative memory (data or information) of all similar memories may be generated and kept in the SRAM or DRAM cells in the HBM IC chips in the logic drive and NAND flash memory cells in NVM IC chips in the logic drive, and storing all similar memories in the NAND flash memory cells in NVM IC chips in the logic drive or in the memory storage device external of the logic drive, while not in the SRAM or DRAM cells in the HBM IC chips in the logic drive.

(B) Logic reconfiguration: (1) A machine/system external of the logic drive (and/or the FPGA IC chips or other control, processing or computing IC chips of the logic drive) checks the $CPM_n$ for corresponding logic functions to find identical logics (CPMs), and keeping only one logic (CPM) of all identical logics (CPMs), deleting all other identical logics (CPMs); and/or (2) A machine/system external of the logic drive (and/or the FPGA IC chips or other control, processing or computing IC chips of the logic drive) checks the $CPM_n$ for corresponding logic functions to find similar logics (CPMs) (similarity with a given percentage x %, for example, x is equal to or smaller than 2%, 3%, 5% or 10% in difference), and keeping only one or two logics (CPMs)

of all similar logics (CPMs) in the SRAM or DRAM cells in the HBM IC chips in the logic drive and NAND flash memory cells in NVM IC chips in the logic drive, and storing all other similar logics (CPMs) in the NAND flash memory cells in NVM IC chips in the logic drive or in the memory storage device external of the logic drive, while not in the SRAM or DRAM cells in the HBM IC chips in the logic drive. Alternatively, a representative logic (CPM) (data or information in CPM for the corresponding representative logic) of all similar logics (CPMs) may be generated and kept in the SRAM or DRAM cells in the HBM IC chips in the logic drive and NAND flash memory cells in NVM IC chips in the logic drive, and storing all similar logics (CPMs) in the NAND flash memory cells in NVM IC chips in the logic drive or in the memory storage device external of the logic drive, while not in the SRAM or DRAM cells in the HBM IC chips in the logic drive.

II. Learning Processes:

Based on $S_n$ ($IU_n$, $L_n$, $CPM_n$, $DIM_n$), performing a logarithm to select or screen (memorize) useful, significant and important integral units IUs, logics Ls, CPMs and DIMs, and forget non-useful, non-significant or non-important integral units IUs, logics Ls, CPMs or DIMs by storing in a remote memory storage, for example, in the NAND flash memory cells in NVM IC chips in the logic drive or in the memory storage device external of the logic drive. The selection or screening algorithm may be based on a given statistical method, for example, based on the frequency of use of integral units IUs, logics Ls, CPMs and or DIMs in the previous n events. For example, if a logic function of a logic gate is not used frequently, the logic gate may be used for another different function. Another example, the Bayesian inference may be used for generating a new state of the logic drive after learning $SL_n$($IUL_n$, $LL_n$, $CPML_n$, $DIML_n$).

The elasticity and integrality of the logic drive provide capabilities suitable for algorithms, architectures and/or applications in machine learning and artificial intelligence.

Another aspect of the disclosure provides a standard commodity memory drive, package, package drive, device, module, disk, disk drive, solid-state disk, or solid-state drive (to be abbreviated as "drive" below, that is when "drive" is mentioned below, it means and reads as "drive, package, package drive, device, module, disk, disk drive, solid-state disk, or solid-state drive"), in a multi-chip package comprising plural standard commodity non-volatile memory IC chips for use in data storage. The data stored in the standard commodity non-volatile memory drive are kept even if the power supply of the drive is turned off. The plural non-volatile memory IC chips comprise NAND flash chips, in a bare-die format or in a package format. Alternatively, the plural non-volatile memory IC chips may comprise Non-Volatile Random-Access-Memory (NVRAM) IC chips, in a bare-die format or in a package format. The NVRAM may be a Ferroelectric RAM (FRAM), Magnetoresistive RAM (MRAM), Resistive RAM (RRAM) or Phase-change RAM (PRAM). The standard commodity memory drive is formed by the FOIT, using same or similar process steps of the FOIT in forming the standard commodity logic drive, as described and specified in the above paragraphs. The process steps of the FOIT are highlighted below: (1) Providing non-volatile memory IC chips, for example, standard commodity NAND flash IC chips, and a Temporary Substrate (TS) with FOISD; and then flip-chip assembling or bonding the IC chips to and on TS. Each of the plural NAND flash chips may have a standard memory density, capacity or size of greater than or equal to 64 Mb, 512 Mb, 1 Gb, 4 Gb, 16 Gb, 64 Gb, 128 Gb, 256 Gb, or 512 Gb, wherein "b" is bits. The NAND flash chip may be designed and fabricated using advanced NAND flash technology nodes or generations, for example, more advanced than or equal to 40 nm, 28 nm, 20 nm, 16 nm, and/or 10 nm, wherein the advanced NAND flash technology may comprise Single Level Cells (SLC) or multiple level cells (MLC) (for example, Double Level Cells DLC, or triple Level cells TLC), and in a 2D-NAND or a 3D NAND structure. The 3D NAND structures may comprise multiple stacked layers or levels of NAND cells, for example, greater than or equal to 4, 8, 16, 32, 64 stacked layers or levels of NAND cells. Each of the plural NAND flash chips to be packaged in the memory drives may comprise micro copper pillars or bumps on the top surfaces of the chips. The top surfaces of micro copper pillars or bumps are at a level above the level of the top surface of the top-most insulating dielectric layer of the chips with a height of, for example, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm. The chips are flip-chip assembled or bonded on or to the TS with the side or surface of the chip with transistors faced down; (2) Applying a material, resin, or compound to fill the gaps between chips and cover the backside surfaces of chips, and the top surfaces of the TPVs, if exist, by methods, for example, spin-on coating, screen-printing, dispensing or molding in the wafer or panel format. Applying a CMP, polishing or grinding process to planarize the surface of the applied material, resin or compound to a level where the top surfaces of all backsides of the IC chips and top surfaces of TPVs are fully exposed; (3) Forming a Backside Interconnection Scheme in, on or of the memory drive (BISD) on or over the planarized material, resin or compound and on or over the exposed top surfaces of the TPVs by a wafer or panel processing; (4) Forming copper pads, pillars or bumps, or solder bumps on or over the BISD, (5) Forming copper pads, pillars or bumps, or solder bumps on or under the metal via contacts of the FOISD; (6) Separating, cutting or dicing the finished wafer or panel, including separating, cutting or dicing through the material, resin or compound between two neighboring memory drives. The material, resin or compound (for example, polymer) filling gaps between chips of two neighboring memory drives is separated, cut or diced to from individual unit of memory drives.

Another aspect of the disclosure provides a standard commodity memory drive in a multi-chip package comprising plural standard commodity non-volatile memory IC chips may be further comprising the dedicated control chip, the dedicated I/O chip, or the dedicated control and I/O chip; for use in data storage. The data stored in the standard commodity non-volatile memory drive are kept even if the power supply of the drive is turned off. The plural non-volatile memory IC chips comprise NAND flash chips, in a bare-die format or in a package format. Alternatively, the plural non-volatile memory IC chips may comprise Non-Volatile Random-Access-Memory (NVRAM) IC chips, in a bare-die format or in a package format. The NVRAM may be a Ferroelectric RAM (FRAM), Magnetoresistive RAM (MRAM), Resistive RAM (RRAM) or Phase-change RAM (PRAM). The functions of the dedicated control chip, the dedicated I/O chip, or the dedicated control and I/O chip are for the memory control and/or inputs/outputs, and are the same or similar to that described and specified in the above paragraphs for the logic drive. The communication, connection or coupling between the non-volatile memory IC chips, for example the NAND flash chips, and the dedicated control chip, the dedicated I/O chip, or the dedicated control and I/O chip in a same memory drive is the same or similar to that described and specified in the above paragraphs for the logic drive. The standard commodity NAND flash IC chips may be fabricated using an IC manufacturing technology node or generation different from that used for manufacturing the dedicated control chip, the dedicated I/O chip, or the dedicated control and I/O chip used in the same memory drive. The standard commodity NAND flash IC chips comprise small I/O circuits, while the dedicated control chip, the dedicated I/O chip, or the dedicated control and I/O chip used in the memory drive may comprise large I/O circuits, as descried and specified for the logic drive. The standard commodity memory drive comprising the dedicated control chip, the dedicated I/O chip, or the dedicated control and I/O chip is formed by the FOIT, using same or similar process steps of the FOIT in forming the logic drive, as described and specified in the above paragraphs.

Another aspect of the disclosure provides the stacked non-volatile (for example, NAND flash) memory drive comprising plural single-layer-packaged non-volatile memory drives, as described and specified above, each in a multiple-chip package. The single-layer-packaged non-volatile memory drive with TPVs and/or BISD for use in the stacked non-volatile memory drive may be in a standard format or having standard sizes. For example, the single-layer-packaged non-volatile memory drive may be in a shape of square or rectangle, with a certain widths, lengths and thicknesses. An industry standard may be set for the shape and dimensions of the single-layer-packaged non-volatile memory drive. For example, the standard shape of the single-layer-packaged non-volatile memory drive may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the non-volatile memory drive may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm. The stacked non-volatile memory drive may comprise, for example 2, 3, 4, 5, 6, 7, 8 or greater than 8 single-layer-packaged non-volatile memory drives, and may be formed by the similar or the same process steps as described and specified in forming the stacked logic drive. The single-layer-packaged non-volatile memory drives comprise TPVs and/or BISD for the stacking assembly purpose. The process steps for forming TPVs and/or BISD, and the specifications of TPVs and/or BISD are as described and specified in the above paragraphs for use in the stacked logic drive. The stacking methods (for example, POP) using TPVs and/or BISD are as described and specified in above paragraphs for the stacked logic drive.

Another aspect of the disclosure provides a standard commodity memory drive in a multi-chip package comprising plural standard commodity volatile memory IC chips for use in data storage; wherein the plural volatile memory IC chips comprise DRAM IC chips, in a bare-die format or in a package format. The standard commodity DRAM memory drive is formed by the FOIT, using same or similar process steps of the FOITP in forming the logic drive, as described and specified in the above paragraphs. The process steps are highlighted below: (1) Providing standard commodity DRAM IC chips, and a Temporary Substrate (TS) with the FOISD; and then flip-chip assembling or bonding the IC chips to and on the TS. Each of the plural DRAM IC chips may have a standard memory density, capacity or size of greater than or equal to 64 Mb, 512 Mb, 1 Gb, 4 Gb, 16 Gb, 64 Gb, 128 Gb, 256 Gb, or 512 Gb, wherein "b" is bits. The DRAM IC chip may be designed and fabricated using advanced DRAM technology nodes or generations, for example, more advanced than or equal to 45 nm, 28 nm, 20 nm, 16 nm, and/or 10 nm. All DRAM IC chips to be packaged in the memory drives may comprise micro copper pillars or bumps on the top surfaces of the chips. The top surfaces of micro copper pillars or bumps are at a level above the level of the top surface of the top-most insulating dielectric layer of the chips with a height of, for example, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm. The chips are flip-chip assembled or bonded on or to the TS with the side or surface of the chip with transistors faced down; (2) Applying a material, resin, or compound to fill the gaps between chips and cover the backside surfaces of chips and the top surfaces of the TPVs, if exist, by methods, for example, spin-on coating, screen-printing, dispensing or molding in the wafer or panel format. Applying a CMP, polishing or grinding process to planarize the surface of the applied material, resin or compound to a level where the backside surfaces of all the chips and the top surfaces of the all TPVs are fully exposed; (3) Forming a Backside Interconnection Scheme in, on or of the memory drive (BISD) on or over the planarized material, resin or compound and on or over the exposed top surfaces of the TPVs by a wafer or panel processing; (4) Forming copper pads, pillars or bumps, or solder bumps on or over the BISD, (5) Forming copper pads, pillars or bumps, or solder bumps on or under the metal via contacts of the FOISD; (6) Separating, cutting or dicing the finished wafer or panel, including separating, cutting or dicing through the material, resin or compound between two neighboring memory drives. The material, resin or compound (for example, polymer) filling gaps between chips of two neighboring memory drives is separated, cut or diced to from individual unit of memory drives.

Another aspect of the disclosure provides a standard commodity memory drive in a multi-chip package comprising plural standard commodity volatile IC chips may further comprise the dedicated control chip, the dedicated I/O chip, or the dedicated control and I/O chip; for use in data storage; wherein the plural volatile memory IC chips comprise DRAM IC chips, in a bare-die format or in a DRAM package format. The functions of the dedicated control chip, the dedicated I/O chip, or the dedicated control and I/O chip used in the memory drive are for the memory control and/or inputs/outputs, and are the same or similar to that described and specified in the above paragraphs for the logic drive. The communication, connection or coupling between the DRAM IC chips and the dedicated control chip, the dedicated I/O chip, or the dedicated control and I/O chip in a same memory drive is the same or similar to that described and specified in the above paragraphs for the logic drive. The standard commodity DRAM IC chips may be fabricated using an IC manufacturing technology node or generation different from that used for manufacturing the dedicated control chip, the dedicated I/O chip, or the dedicated control and I/O chip. The standard commodity DRAM IC chips comprise small I/O circuits, while the dedicated control chip, the dedicated I/O chip, or the dedicated control and I/O chip used in the memory drive may comprise large I/O circuits, as descried and specified above for the logic drive. The standard commodity memory drive is formed by the same or similar process steps as that in forming the logic drive, as described and specified in the above paragraphs.

Another aspect of the disclosure provides the stacked volatile (for example, DRAM) memory drive comprising plural single-layer-packaged volatile memory drives, as described and specified above, each in a multiple-chip package. The single-layer-packaged volatile memory drive with TPVs and/or BISD for use in the stacked volatile memory drive may be in a standard format or having standard sizes. For example, the single-layer-packaged volatile memory drive may be in a shape of square or rectangle, with a certain widths, lengths and thicknesses. An industry standard may be set for the shape and dimensions of the single-layer-packaged volatile memory drive. For example, the standard shape of the single-layer-packaged volatile memory drive may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the volatile memory drive may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm. The stacked volatile memory drive may comprise, for example 2, 3, 4, 5, 6, 7, 8 or greater than 8 single-layer-packaged volatile memory drives, and may be formed by the similar or the same process steps as described and specified in forming the stacked logic drive. The single-layer-packaged volatile memory drives may comprise TPVs and/or BISD for the stacking assembly purpose. The process steps for forming TPVs and/or BISD, and the specifications of TPVs and/or BISD are described and specified in the above paragraphs for use in the stacked logic drive. The stacking methods (for example, POP) using TPVs and/or BISD are as described and specified in above paragraphs for the stacked logic drive.

Another aspect of the disclosure provides the stacked logic and volatile (for example, DRAM) memory drive comprising plural single-layer-packaged logic drives and plural single-layer-packaged volatile memory drives, each in a multiple-chip package, as described and specified above. Each of plural single-layer-packaged logic drives and each of plural single-layer-packaged volatile memory drives may be in a same standard format or having a same standard shape, size and dimension, may have the same standard footprints of the metal pads, pillars or bumps on the top surface, and the same standard footprints of the metal pads, pillars or bumps at the bottom surface, as described and specified in above. The stacked logic and volatile-memory drive may comprise, for example 2, 3, 4, 5, 6, 7, 8 or greater than 8 single-layer-packaged logic drives or volatile-memory drives (in total), and may be formed by the similar or the same process steps as described and specified in forming the stacked logic drive. The stacking sequence, from bottom to top, may be: (a) all single-layer-packaged logic drives at the bottom and all single-layer-packaged volatile memory drives at the top, or (b) single-layer-packaged logic drives and single-layer-packaged volatile drives are stacked interlaced or interleaved layer over layer, from bottom to top, in sequence: (i) single-layer-packaged logic drive, (ii) single-layer-packaged volatile memory drive, (iii) single-layer-packaged logic drive, (iv) single-layer-packaged volatile memory, and so on. The single-layer-packaged logic drives and single-layer-packaged volatile memory drives used in the stacked logic and volatile-memory drives, each comprises TPVs and/or BISD for the stacking assembly purpose. The process steps for forming TPVs and/or BISD, and the specifications of TPVs and/or BISD are described and specified in the above paragraphs. The stacking methods (POP) using TPVs and/or BISD are as described and specified in above paragraphs.

Another aspect of the disclosure provides the stacked non-volatile (for example, NAND flash) and volatile (for example, DRAM) memory drive comprising plural single-layer-packaged non-volatile drives and plural single-layer-packaged volatile memory drives, each in a multiple-chip package, as described and specified in above paragraphs. Each of plural single-layer-packaged non-volatile drives and each of plural single-layer-packaged volatile memory drives may be in a same standard format or having a same standard shape, size and dimension, and have standard footprints of metal pads, pillars or bumps on the top surface and at the bottom surface, as described and specified above. The stacked non-volatile and volatile-memory drive may comprise, for example 2, 3, 4, 5, 6, 7, 8 or greater than 8 single-layer-packaged non-volatile memory drives or single-layer-packaged volatile-memory drives (in total), and may be formed by the similar or the same process steps as described and specified in forming the stacked logic drive. The stacking sequence, from bottom to top, may be: (a) all single-layer-packaged volatile memory drives at the bottom and all single-layer-packaged non-volatile memory drives at the top, (b) all single-layer-packaged non-volatile memory drives at the bottom and all single-layer-packaged volatile memory drives at the top, or (c) single-layer-packaged non-volatile memory drives and single-layer-packaged volatile drives are stacked interlaced or interleaved layer over layer, from bottom to top, in sequence: (i) single-layer-packaged volatile memory drive, (ii) single-layer-packaged non-volatile memory drive, (iii) single-layer-packaged volatile memory drive, (iv) single-layer-packaged non-volatile memory, and so on. The single-layer-packaged non-volatile drives and single-layer-packaged volatile memory drives used in the stacked non-volatile and volatile-memory drives, each comprises TPVs and/or BISD for the stacking assembly purpose. The process steps for forming TPVs and/or BISD, and the specifications of TPVs and/or BISD are described and specified in the above paragraphs for use in the stacked logic drive. The stacking methods (POP) using TPVs and/or BISD are as described and specified in above paragraphs for forming the stacked logic drive.

Another aspect of the disclosure provides the stacked logic, non-volatile (for example, NAND flash) memory and volatile (for example, DRAM) memory drive comprising plural single-layer-packaged logic drives, plural single-layer-packaged non-volatile memory drives and plural single-layer-packaged volatile memory drives, each in a multiple-chip package, as described and specified above. Each of plural single-layer-packaged logic drives, each of plural single-layer-packaged non-volatile memory drives and each of plural single-layer-packaged volatile memory drives may be in a same standard format or having a same standard shape, size and dimension, and have standard footprints of metal pads, pillars or bumps on the top surface and at the bottom surface, as described and specified above. The stacked logic, non-volatile (flash) memory and volatile (DRAM) memory drive may comprise, for example 2, 3, 4, 5, 6, 7, 8 or greater than 8 single-layer-packaged logic drives, single-layer-packaged non-volatile-memory drives or single-layer-packaged volatile-memory drives (in total), and may be formed by the similar or the same process steps as described and specified in forming the stacked logic drive. The stacking sequence is, from bottom to top, for example: (a) all single-layer-packaged logic drives at the bottom, all single-layer-packaged volatile memory drives in the middle, and all single-layer-packaged non-volatile memory drives at the top, or, (b) single-layer-packaged logic drives, single-layer-packaged volatile memory drives, and single-layer-packaged non-volatile memory drives are stacked interlaced or interleaved layer over layer, from bottom to top, in sequence: (i) single-layer-packaged logic drive, (ii) single-layer-packaged volatile memory drive, (iii) single-layer-packaged non-volatile memory drive, (iv) single-layer-packaged logic drive, (v) single-layer-packaged volatile memory, (vi) single-layer-packaged non-volatile memory drive, and so on. The single-layer-packaged logic drives, single-layer-packaged volatile memory drives, and single-layer-packaged volatile memory drives used in the stacked logic, non-volatile-memory and volatile-memory drives, each comprises TPVs and/or BISD for the stacking assembly purpose. The process steps for forming TPVs and/or BISD, and the specifications of TPVs and/or BISD are described and specified in the above paragraphs for use in the stacked logic drive. The stacking methods (POP) using TPVs and/or BISD are as described and specified in above paragraphs for forming the stacked logic drive.

Another aspect of the disclosure provides a system, hardware, electronic device, computer, processor, mobile phone, communication equipment, and/or robot comprising the logic drive, the non-volatile (for example, NAND flash) memory drive, and/or the volatile (for example, DRAM) memory drive. The logic drive may be the single-layer-packaged logic drive or the stacked logic drive, as described and specified above; the non-volatile flash memory drive may be the single-layer-packaged non-volatile flash memory drive or the stacked non-volatile flash memory drive as described and specified above; and the volatile DRAM memory drive may be the single-layer-packaged DRAM memory drive or the stacked volatile DRAM memory drive as described and specified above. The logic drive, the non-volatile flash memory drive, and/or the volatile DRAM memory drive are stack-package assembled on a Printed Circuit Board (PCB), a Ball-Grid-Array (BGA) substrate, a flexible circuit film or tape, or a ceramic circuit substrate.

Another aspect of the disclosure provides a stacked package or device comprising the single-layer-packaged logic drive and the single-layer-packaged memory drive. The single-layer-packaged logic drive is as described and specified above, and is comprising one or more FPGA chips, the DPIICs or DPICSRAMs, dedicated control chip, the dedicated I/O chip, and/or the dedicated control and I/O chip. The single-layer-packaged logic drive may be further comprising one or more of the processing and/or computing IC chips, for example, one or more CPU chips, GPU chips, DSP chips, and/or TPU chips. The single-layer-packaged memory drive is as described and specified above, and is comprising one or more high speed, high bandwidth cache SRAM chips, one or more high speed, high bandwidth HBM DRAM IC chips, or one or more high speed, high bandwidth NVM chips for high speed parallel processing and/or computing. The one or more high speed, high bandwidth NVMs may comprise MRAM, RRAM or PRAM. The single-layer-packaged logic drive, as described and specified above, is formed using the TS comprising FOISD, TPVs, metal via contacts and metal pads, pillars or bumps on or under the metal via contacts. For high speed, high bandwidth communications with the memory chips of the single-layer-packaged memory drive, the single-layer-packaged logic drive comprises stacked via structures; wherein the stacked vias (in or of the FOISD) are formed directly and vertically on or over the metal via contacts, and micro copper pads, pillars or bumps on or over the FOISD are formed directly and vertically on or over the stacked vias. Multiple stacked via structures, each for a bit data of the high speed, wide bit-width buses, are formed, from top to the bottom, comprise, (1) micro copper pads, pillars or bumps on or of the FOISD; (2) stacked vias by stacking metal vias and metal layers of the FOISD; (3) metal via contacts; and (4) copper pads, metal pillars or bumps on or under the metal via contacts. The micro copper/solder pillars or bumps on or of the IC chips are then flip-chip assembled or bonded on or to the micro copper pads, pillars or bumps (on or over the FOISD) of the stacked structures. The number of stacked structures for each IC chip (that is the data bit-width between each logic chip and each high speed, high bandwidth memory chip) is equal or greater than 64, 128, 256, 512, 1024, 2048, 4096, 8K, or 16K for high speed, high bandwidth parallel processing and/or computing. Similarly, multiple stacked via structures are formed in the single-layer-packaged memory drive. The single-layer-packaged logic drive is the flip-package assembled or packaged on or to the single-layer-packaged memory chip, with the side with transistor of IC chips in the logic drive faced down, and the side with transistor of IC chips in the memory drive faced up. Therefore, a micro copper/solder pillar or bump on or of a FPGA, CPU, GPU, DSP and/or TPU chip can be connected or coupled, with the shortest distance, to a micro copper/solder pillar or bump on a memory chip, for example, DRAM, SRAM or NVM, through: (1) micro copper pads, pillars or bumps on or of the FOISD of the logic drive; (2) stacked vias by stacking metal vias and metal layers of the FOISD of the logic drive; (3) metal via contacts of the FOISD of the logic drive; and (4) copper pads, metal pillars or bumps on or under the metal via contacts of the FOISD of the logic drive; (5) copper pads, metal pillars or bumps on or over the metal via contacts of the FOISD of the memory drive; (6) metal via contacts of the FOISD of the memory drive; (7) stacked vias by stacking metal vias and metal layers of the FOISD of the memory drive; (8) micro copper pads, pillars or bumps on or under the FOISD of the memory drive. With the TPVs and/or BISDs for both the single-layer-packaged logic drive and the single-layer-packaged memory drive, the stacked logic and memory drive or device can communicate, connect or couple to the external circuits or components from the top side (the backside of the single-layer-packaged logic drive, with the side with transistor of IC chips in the logic drive faced down,) and the bottom side (the backside of the single-layer-packaged memory drive, the side with transistor of IC chips in the memory drive faced up) of the stacked logic and memory drive or device. Alternatively, the TPVs and/or BISDs for the single-layer-packaged logic drive may be omitted; and the stacked logic and memory drive or device can communicate, connect or couple to the external circuits or components from the bottom side (the backside of the single-layer-packaged memory drive, the side with transistor of IC chips in the memory drive faced up) of the stacked the stacked logic and memory drive or device, through the TPVs and/or BISD of the memory drive. Alternatively, the TPVs and/or BISDs for the single-layer-packaged memory drive may be omitted; and the stacked logic and memory drive or device can communicate, connect or couple to the external circuits or components from the top side (the backside of the single-layer-packaged logic drive, the side with transistor of IC chips in the logic drive faced up) of the stacked logic and memory drive or device, through the TPVs and/or BISD of the logic drive.

In all of the above alternatives for the logic and memory drive or device, the single-layer-packaged logic drive may comprise one or more of the processing and/or computing IC chips, and the single-layer-packaged memory drive may comprise one or more high speed, high bandwidth cache SRAM chips, high speed, high bandwidth (HBM) DRAM IC chips, or high speed, high bandwidth NVM chips (for example, MRAM, RRAM or PRAM) for high speed parallel processing and/or computing. For example, the single-layer-packaged logic drive may comprise multiple GPU chips, for example 2, 3, 4 or more than 4 GPU chips, and the single-layer-packaged memory drive may comprise multiple high speed, high bandwidth cache SRAM chips, high speed, high bandwidth (HBM) DRAM IC chips, or high speed, high bandwidth NVM chips. The communication between one of GPU chips and one of SRAM, DRAM or NVM chips, through the stacked structures described and specified above, may be with data bit-width equal or greater than 64, 128, 256, 512, 1024, 2048, 4096, 8K, or 16K. For another example, the logic drive may comprise multiple TPU chips, for example 2, 3, 4 or more than 4 TPU chips, and the single-layer-packaged memory drive may comprise multiple high speed, high bandwidth cache SRAM chips, high speed, high bandwidth (HBM) DRAM IC chips or high speed, high bandwidth NVM chips. The communication between one of TPU chips and one of SRAM or DRAM IC chips, through the stacked structures described and specified above, may be with data bit-width equal or greater than 64, 128, 256, 512, 1024, 2048, 4096, 8K, or 16K.

The communication, connection, or coupling between one of logic, processing and/or computing chips (for example, FPGA, CPU, GPU, DSP, APU, TPU, and/or ASIC chips) and one of high speed, high bandwidth SRAM, high speed, high bandwidth (HBM) DRAM or high speed, high bandwidth NVM chips, through the stacked structures described and specified above, may be the same or similar as that between internal circuits in a same chip. Alternatively, the communication, connection, or coupling between one of logic, processing and/or computing chips (for example, FPGA, CPU, GPU, DSP, APU, TPU, and/or ASIC chips) and one of high speed, high bandwidth SRAM, high speed, high bandwidth (HBM) DRAM or high speed, high bandwidth NVM chips, through the stacked structures described and specified above, may be using small I/O drivers and/or receivers. The driving capability, loading, output capacitance, or input capacitance of the small I/O drivers or receivers, or I/O circuits may be between 0.1 pF and 2 pF or 0.1 pF and 1 pF. For example, a bi-directional (or tri-state) I/O pad or circuit may be used for the small I/O drivers or receivers, or I/O circuits for communicating between high speed, high bandwidth logic and memory chips in the logic and memory stacked drive, and may comprise an ESD circuit, a receiver, and a driver, and may have an input capacitance or output capacitance between 0.1 pF and 2 pF or 0.1 pF and 1 pF.

These, as well as other components, steps, features, benefits, and advantages of the present application, will now become clear from a review of the following detailed description of illustrative embodiments, the accompanying drawings, and the claims.

BRIEF DESCRIPTION OF THE DRAWINGS

The drawings disclose illustrative embodiments of the present application. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 6A is a schematic view showing a block diagram of a programmable logic block in accordance with an embodiment of the present application.

FIG. 6B shows an OR gate in accordance with the present application.

FIG. 6C shows a truth table for an OR gate in accordance with the present application.

FIG. 6D shows a NAND gate in accordance with the present application.

FIG. 6E shows a truth table for a NAND gate in accordance with the present application.

FIG. 6F is a circuit diagram of a logic operator in accordance with an embodiment of the present application.

FIG. 6G shows a look-up table for a logic operator in FIG. 6F.

FIG. 6I shows a look-up table for a computation operator in FIG. 6J.

FIGS. 201-20Q are cross-sectional views showing a double damascene process is performed to form a first interconnection scheme in accordance with an embodiment of the present application.

Figure 1A:
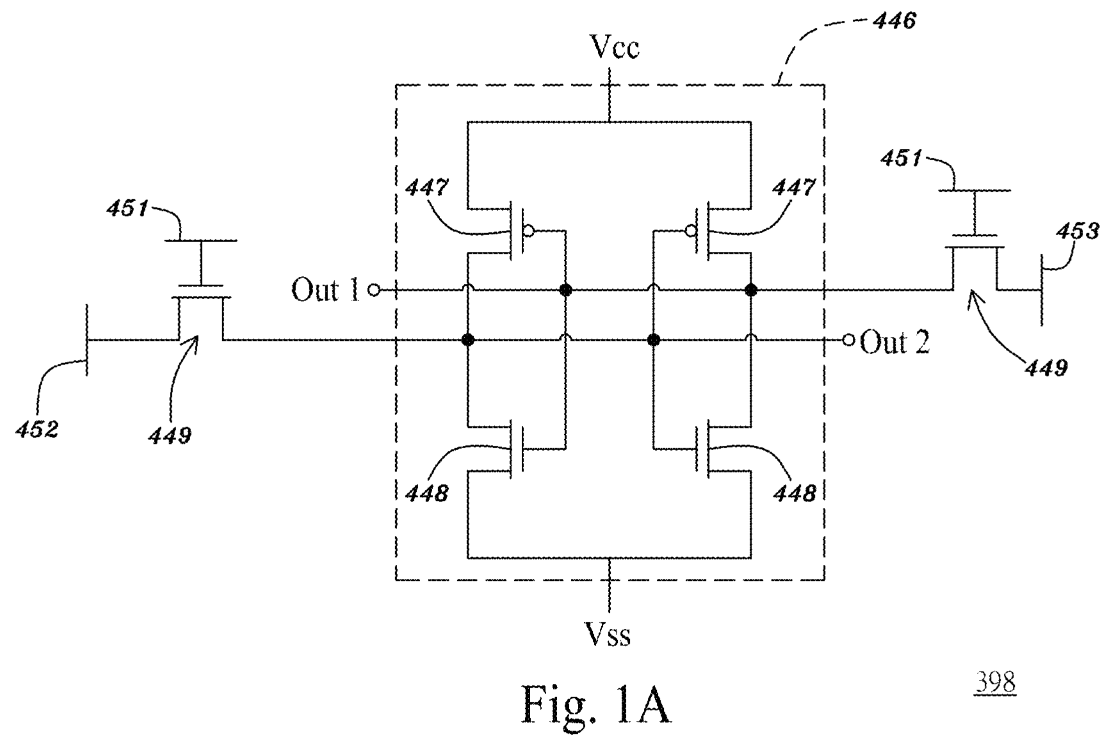
FIGS. 1A and 1B are circuit diagrams illustrating various types of memory cells in accordance with an embodiment of the present application.

While certain embodiments are depicted in the drawings, one skilled in the art will appreciate that the embodiments depicted are illustrative and that variations of those shown, as well as other embodiments described herein, may be envisioned and practiced within the scope of the present application.

DETAILED DESCRIPTION OF THE DISCLOSURE

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Specification for Static Random-Access Memory (SRAM) Cells (1) First Type of SRAM Cell (6T SRAM Cell)

FIG. 1A is a circuit diagram illustrating a 6T SRAM cell in accordance with an embodiment of the present application. Referring to FIG. 1A, a first type of static random-access memory (SRAM) cell 398, i.e., 6T SRAM cell, may have a memory unit 446 composed of 4 data-latch transistors 447 and 448, that is, two pairs of a P-type MOS transistor 447 and N-type MOS transistor 448 both having respective drain terminals coupled to each other, respective gate terminals coupled to each other and respective source terminals coupled to the voltage Vcc of power supply and to the voltage Vss of ground reference. The gate terminals of the P-type and N-type MOS transistors 447 and 448 in the left pair are coupled to the drain terminals of the P-type and N-type MOS transistors 447 and 448 in the right pair, acting as an output Out1 of the memory unit 446. The gate terminals of the P-type and N-type MOS transistors 447 and 448 in the right pair are coupled to the drain terminals of the P-type and N-type MOS transistors 447 and 448 in the left pair, acting as an output Out2 of the memory unit 446.

Referring to FIG. 1A, the first type of SRAM cell 398 may further include two switches or transfer (write) transistor 449, such as N-type or P-type MOS transistors, a first one of which has a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair, and a second one of which has a gate terminal coupled to the word line 451 and a channel having a terminal coupled to a bit-bar line 453 and another terminal coupled to the drain terminals of the P-type and N-type MOS transistors 447 and 448 in the right pair and the gate terminals of the P-type and N-type MOS transistors 447 and 448 in the left pair. A logic level on the bit line 452 is opposite a logic level on the bit-bar line 453. The switch 449 may be considered as a programming transistor for writing a programing code or data into storage nodes of the 4 data-latch transistors 447 and 448, i.e., at the drains and gates of the 4 data-latch transistors 447 and 448. The switches 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the first one of the switches 449, and thereby the logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Further, the bit-bar line 453 may be coupled to the drain terminals of the P-type and N-type MOS transistors 447 and 448 in the right pair and the gate terminals of the P-type and N-type MOS transistors 447 and 448 in the left pair via the channel of the second one of the switches 449, and thereby the logic level on the bit line 453 may be reloaded into the conductive line between the gate terminals of the P-type and N-type MOS transistors 447 and 448 in the left pair and the conductive line between the drain terminals of the P-type and N-type MOS transistors 447 and 448 in the right pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair; a logic level on the bit line 453 may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

(2) Second Type of SRAM Cell (5T SRAM Cell)

Figure 1B:
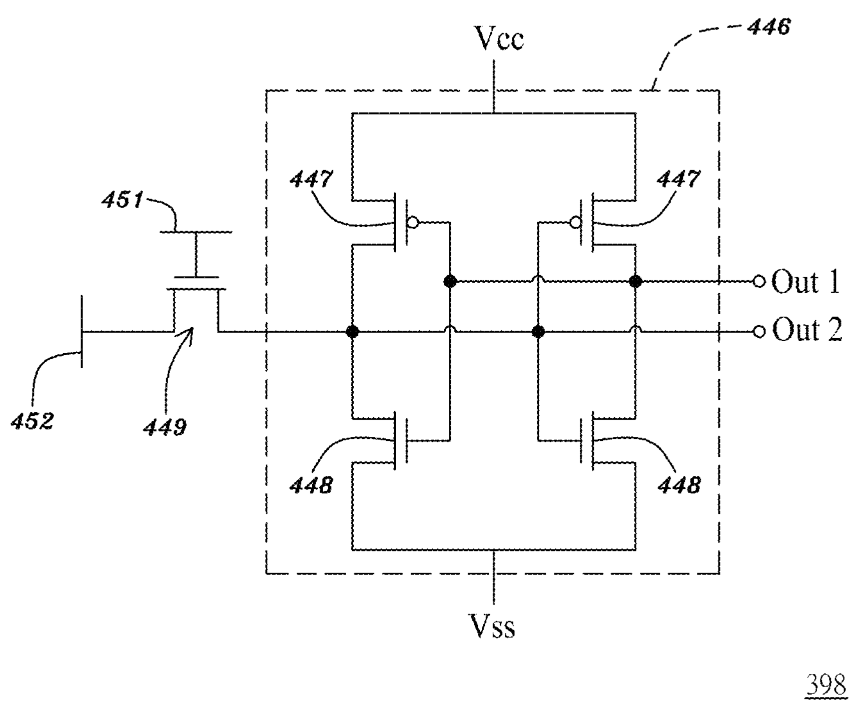

FIG. 1B is a circuit diagram illustrating a 5T SRAM cell in accordance with an embodiment of the present application. Referring to FIG. 1B, a second type of static random-access memory (SRAM) cell 398, i.e., 5T SRAM cell, may have the memory unit 446 as illustrated in FIG. 1A. The second type of static random-access memory (SRAM) cell 398 may further have a switch or transfer (write) transistor 449, such as N-type or P-type MOS transistor, having a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair. The switch 449 may be considered as a programming transistor for writing a programing code or data into storage nodes of the 4 data-latch transistors 447 and 448, i.e., at the drains and gates of the 4 data-latch transistors 447 and 448. The switch 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the switch 449, and thereby a logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair; a logic level, opposite to the logic level on the bit line 452, may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

Specification for Pass/No-Pass Switches (1) First Type of Pass/No-Pass Switch

Figure 2A:
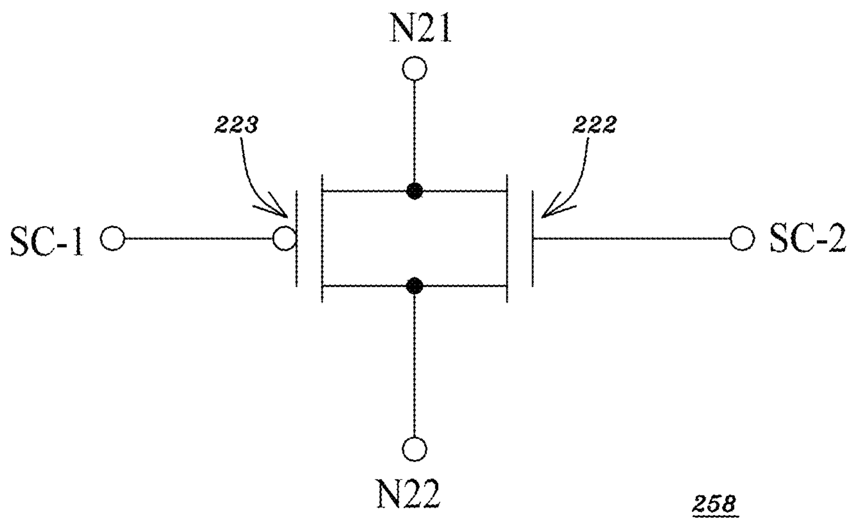
FIGS. 2A-2F are circuit diagrams illustrating various types of pass/no-pass switch in accordance with an embodiment of the present application.

FIG. 2A is a circuit diagram illustrating a first type of pass/no-pass switch in accordance with an embodiment of the present application. Referring to FIG. 2A, a first type of pass/no-pass switch 258 may include an N-type metal-oxide-semiconductor (MOS) transistor 222 and a P-type metal-oxide-semiconductor (MOS) transistor 223 coupling in parallel to each other. Each of the N-type and P-type metal-oxide-semiconductor (MOS) transistors 222 and 223 of the pass/no-pass switch 258 of the first type may be provided with a channel having an end coupling to a node N21 and the other opposite end coupling to a node N22. Thereby, the first type of pass/no-pass switch 258 may be set to turn on or off connection between the nodes N21 and N22. The P-type MOS transistor 223 of the pass/no-pass switch 258 of the first type may have a gate terminal coupling to a node SC-1. The N-type MOS transistor 222 of the pass/no-pass switch 258 of the first type may have a gate terminal coupling to a node SC-2.

(2) Second Type of Pass/No-Pass Switch

Figure 2B:
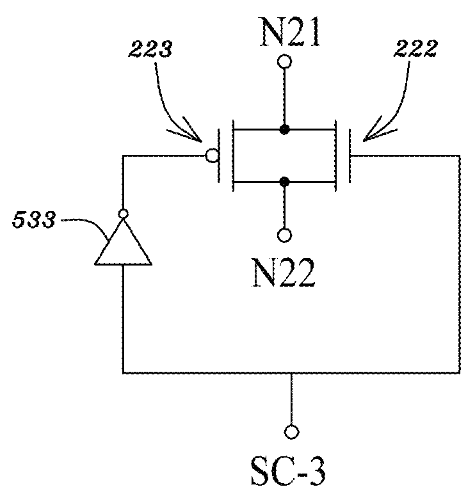

FIG. 2B is a circuit diagram illustrating a second type of pass/no-pass switch in accordance with an embodiment of the present application. Referring to FIG. 2B, a second type of pass/no-pass switch 258 may include the N-type MOS transistor 222 and the P-type MOS transistor 223 that are the same as those of the pass/no-pass switch 258 of the first type as illustrated in FIG. 2A. The second type of pass/no-pass switch 258 may further include an inverter 533 configured to invert its input coupling to a gate terminal of the N-type MOS transistor 222 and a node SC-3 into its output coupling to a gate terminal of the P-type MOS transistor 223.

(3) Third Type of Pass/No-Pass Switch

Figure 2D:
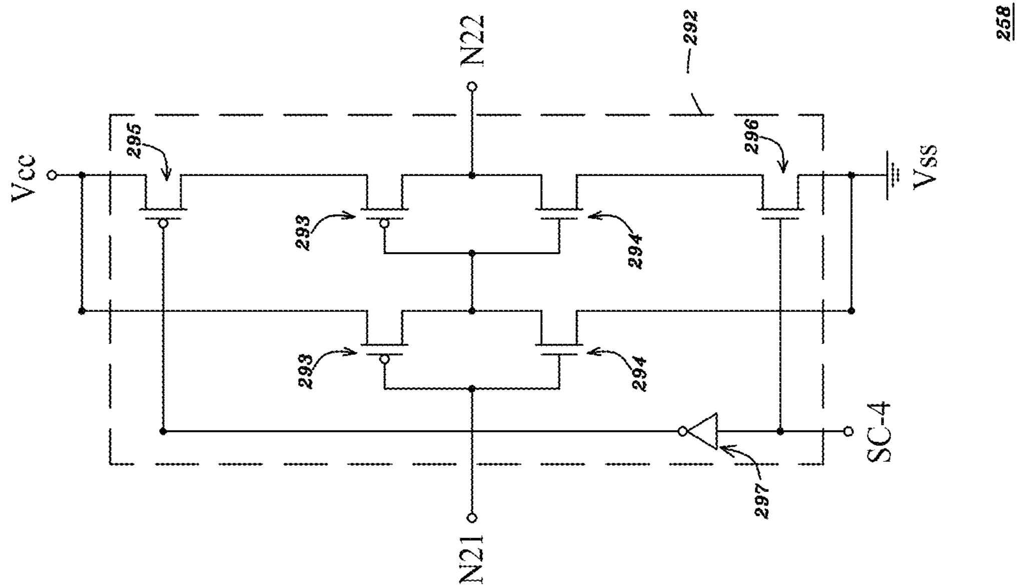
Figure 2C:
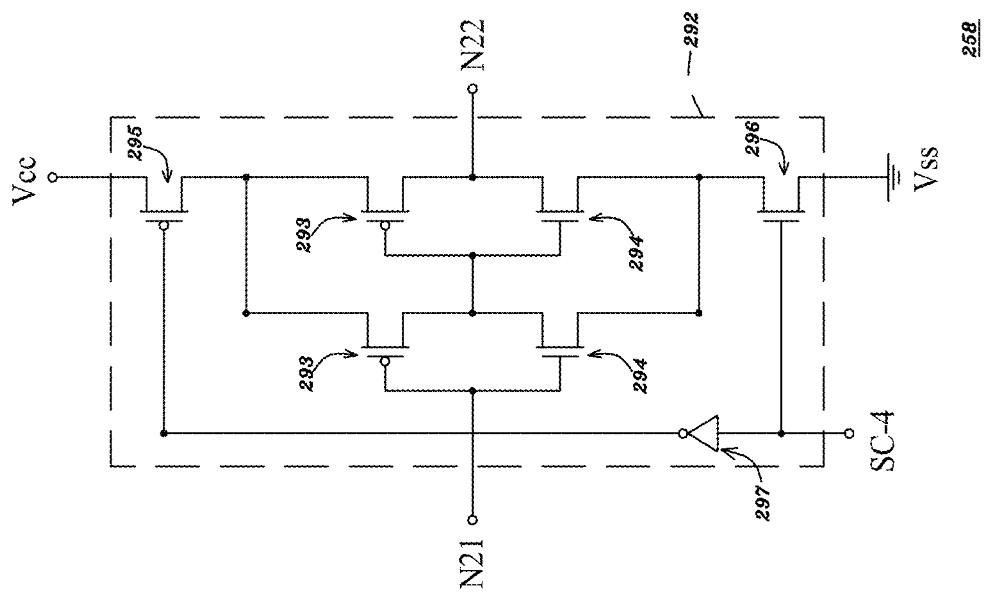

FIG. 2C is a circuit diagram illustrating a third type of pass/no-pass switch in accordance with an embodiment of the present application. Referring to FIG. 2C, a third type of pass/no-pass switch 258 may be a multi-stage tri-state buffer 292, i.e., switch buffer, having a pair of a P-type MOS transistor 293 and N-type MOS transistor 294 in each stage, both having respective drain terminals coupling to each other and respective source terminals configured to couple to the voltage Vcc of power supply and to the voltage Vss of ground reference. In this case, the multi-stage tri-state buffer 292 is two-stage tri-state buffer, i.e., two-stage inverter buffer, having two pairs of the P-type MOS transistor 293 and N-type MOS transistor 294 in the two respective stages, i.e., first and second stages. A node N21 may couple to gate terminals of the P-type MOS and N-type MOS transistors 293 and 294 in the pair in the first stage. The drain terminals of the P-type MOS and N-type MOS transistors 293 and 294 in the pair in the first stage may couple to gate terminals of the P-type MOS and N-type MOS transistors 293 and 294 in the pair in the second stage, i.e., output stage. The drain terminals of the P-type MOS and N-type MOS transistors 293 and 294 in the pair in the second stage, i.e., output stage, may couple to a node N22.

Referring to FIG. 2C, the multi-stage tri-state buffer 292 may further include a switching mechanism configured to enable or disable the multi-stage tri-state buffer 292, wherein the switching mechanism may be composed of (1) a control P-type MOS transistor 295 having a source terminal coupling to the voltage Vcc of power supply and a drain terminal coupling to the source terminals of the P-type MOS transistors 293 in the first and second stages, (2) a control N-type MOS transistor 296 having a source terminal coupling to the voltage Vss of ground reference and a drain terminal coupling to the source terminals of the N-type MOS transistors 294 in the first and second stages and (3) an inverter 297 configured to invert its input coupling to a gate terminal of the control N-type MOS transistor 296 and a node SC-4 into its output coupling to a gate terminal of the control P-type MOS transistor 295.

For example, referring to FIG. 2C, when a logic level of “1” couples to the node SC-4 to turn on the multi-stage tri-state buffer 292, a signal may be transmitted from the node N21 to the node N22. When a logic level of “0” couples to the node SC-4 to turn off the multi-stage tri-state buffer 292, no signal transmission may occur between the nodes N21 and N22.

(4) Fourth Type of Pass/No-Pass Switch

FIG. 2D is a circuit diagram illustrating a fourth type of pass/no-pass switch in accordance with an embodiment of the present application. Referring to FIG. 2D, a fourth type of pass/no-pass switch 258 may be a multi-stage tri-state buffer, i.e., switch buffer, that is similar to the one 292 as illustrated in FIG. 2C. For an element indicated by the same reference number shown in FIGS. 2C and 2D, the specification of the element as seen in FIG. 2D may be referred to that of the element as illustrated in FIG. 2C. The difference between the circuits illustrated in FIG. 2C and the circuits illustrated in FIG. 2D is mentioned as below. Referring to FIG. 2D, the drain terminal of the control P-type MOS transistor 295 may couple to the source terminal of the P-type MOS transistor 293 in the second stage, i.e., output stage, but does not couple to the source terminal of the P-type MOS transistor 293 in the first stage; the source terminal of the P-type MOS transistor 293 in the first stage may couple to the voltage Vcc of power supply and the source terminal of the control P-type MOS transistor 295. The drain terminal of the control N-type MOS transistor 296 may couple to the source terminal of the N-type MOS transistor 294 in the second stage, i.e., output stage, but does not couple to the source terminal of the N-type MOS transistor 294 in the first stage; the source terminal of the N-type MOS transistor 294 in the first stage may couple to the voltage Vss of ground reference and the source terminal of the control N-type MOS transistor 296.

(5) Fifth Type of Pass/No-Pass Switch

Figure 2E:
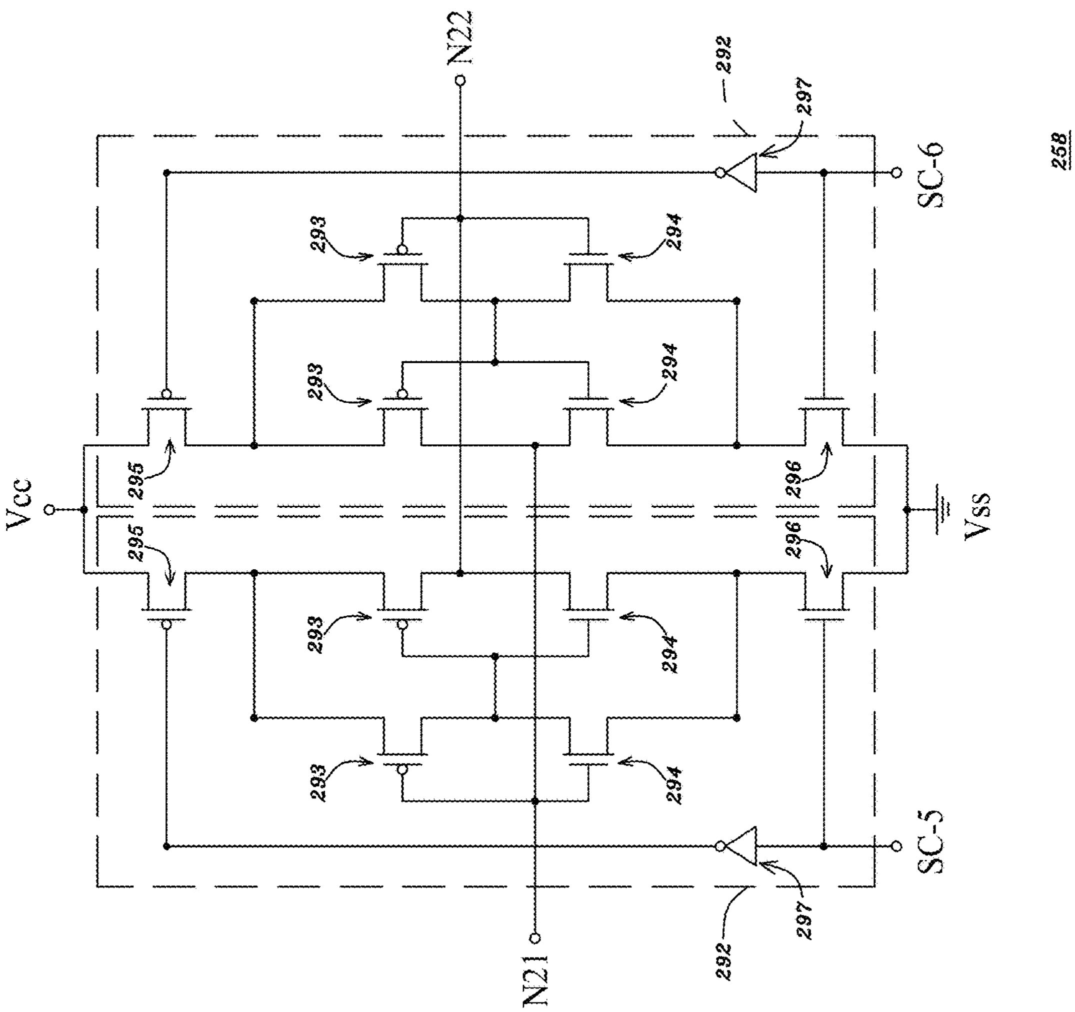

FIG. 2E is a circuit diagram illustrating a fifth type of pass/no-pass switch in accordance with an embodiment of the present application. For an element indicated by the same reference number shown in FIGS. 2C and 2E, the specification of the element as seen in FIG. 2E may be referred to that of the element as illustrated in FIG. 2C. Referring to FIG. 2E, a fifth type of pass/no-pass switch 258 may include a pair of the multi-stage tri-state buffers 292, i.e., switch buffers, as illustrated in FIG. 2C. The gate terminals of the P-type and N-type MOS transistors 293 and 294 in the first stage in the left one of the multi-stage tri-state buffers 292 in the pair may couple to the drain terminals of the P-type and N-type MOS transistors 293 and 294 in the second stage, i.e., output stage, in the right one of the multi-stage tri-state buffers 292 in the pair and to a node N21. The gate terminals of the P-type and N-type MOS transistors 293 and 294 in the first stage in the right one of the multi-stage tri-state buffers 292 in the pair may couple to the drain terminals of the P-type and N-type MOS transistors 293 and 294 in the second stage, i.e., output stage, in the left one of the multi-stage tri-state buffers 292 in the pair and to a node N22. For the left one of the multi-stage tri-state buffers 292 in the pair, its inverter 297 is configured to invert its input coupling to the gate terminal of its control N-type MOS transistor 296 and a node SC-5 into its output coupling to the gate terminal of its control P-type MOS transistor 295. For the right one of the multi-stage tri-state buffers 292 in the pair, its inverter 297 is configured to invert its input coupling to the gate terminal of its control N-type MOS transistor 296 and a node SC-6 into its output coupling to the gate terminal of its control P-type MOS transistor 295.

For example, referring to FIG. 2E, when a logic level of “1” couples to the node SC-5 to turn on the left one of the multi-stage tri-state buffers 292 in the pair and a logic level of “0” couples to the node SC-6 to turn off the right one of the multi-stage tri-state buffers 292 in the pair, a signal may be transmitted from the node N21 to the node N22. When a logic level of “0” couples to the node SC-5 to turn off the left one of the multi-stage tri-state buffers 292 in the pair and a logic level of “l” couples to the node SC-6 to turn on the right one of the multi-stage tri-state buffers 292 in the pair, a signal may be transmitted from the node N22 to the node N21. When a logic level of “0” couples to the node SC-5 to turn off the left one of the multi-stage tri-state buffers 292 in the pair and a logic level of "0" couples to the node SC-6 to turn off the right one of the multi-stage tri-state buffers 292 in the pair, no signal transmission may occur between the nodes N21 and N22. When a logic level of "1" couples to the node SC-5 to turn on the left one of the multi-stage tri-state buffers 292 in the pair and a logic level of "1" couples to the node SC-6 to turn on the right one of the multi-stage tri-state buffers 292 in the pair, signal transmission may occur in either of directions from the node N21 to the node N22 and from the node N22 to the node N21.

(6) Sixth Type of Pass/No-Pass Switch

Figure 2F:
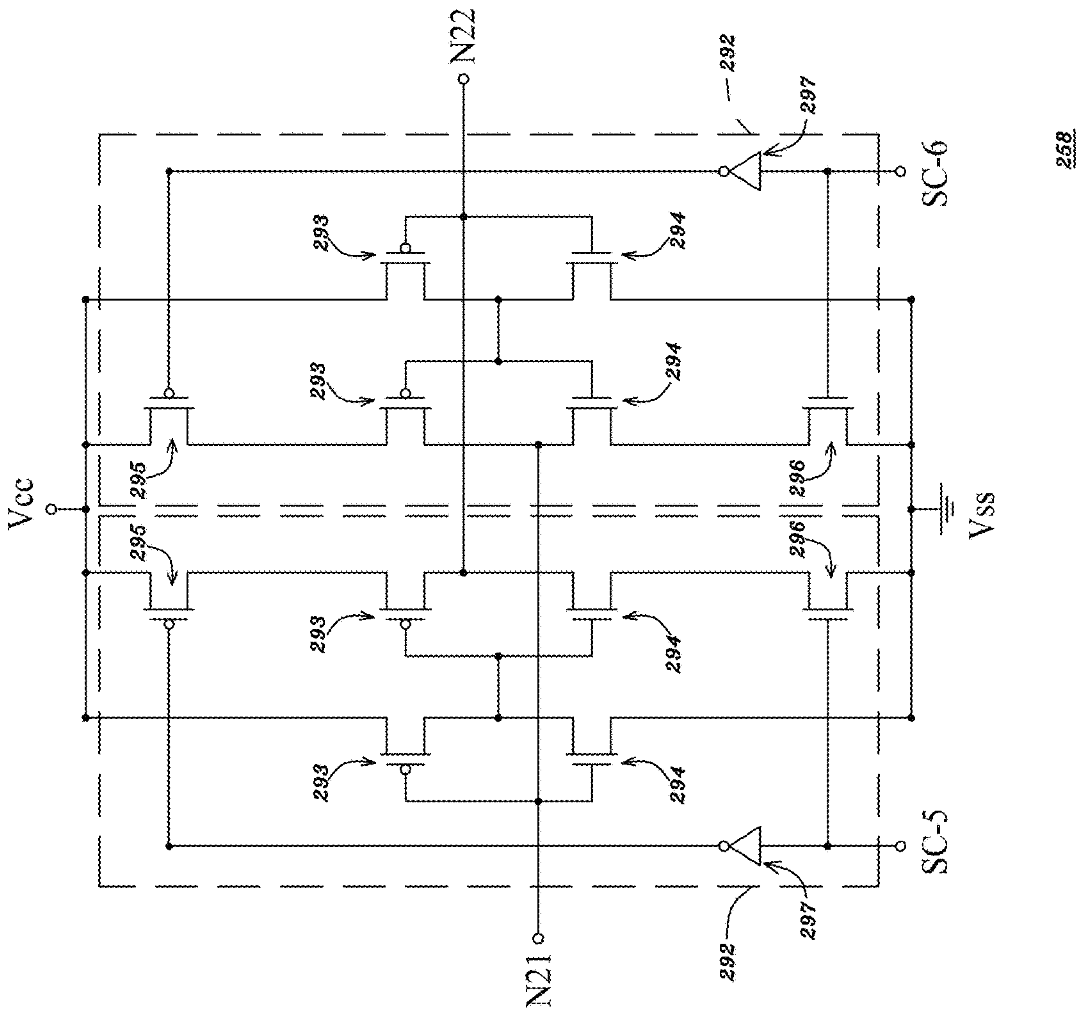

FIG. 2F is a circuit diagram illustrating a sixth type of pass/no-pass switch in accordance with an embodiment of the present application. Referring to FIG. 2F, a sixth type of pass/no-pass switch 258 may be composed of a pair of multi-stage tri-state buffers, i.e., switch buffers, which is similar to the ones 292 as illustrated in FIG. 2E. For an element indicated by the same reference number shown in FIGS. 2E and 2F, the specification of the element as seen in FIG. 2F may be referred to that of the element as illustrated in FIG. 2E. The difference between the circuits illustrated in FIG. 2E and the circuits illustrated in FIG. 2F is mentioned as below. Referring to FIG. 2F, for each of the multi-stage tri-state buffers 292 in the pair, the drain terminal of its control P-type MOS transistor 295 may couple to the source terminal of its P-type MOS transistor 293 in the second stage, i.e., output stage, but does not couple to the source terminal of its P-type MOS transistor 293 in the first stage; the source terminal of its P-type MOS transistor 293 in the first stage may couple to the voltage Vcc of power supply and the source terminal of its control P-type MOS transistor 295. For each of the multi-stage tri-state buffers 292 in the pair, the drain terminal of its control N-type MOS transistor 296 may couple to the source terminal of its N-type MOS transistor 294 in the second stage, i.e., output stage, but does not couple to the source terminal of its N-type MOS transistor 294 in the first stage; the source terminal of its N-type MOS transistor 294 in the first stage may couple to the voltage Vss of ground reference and the source terminal of its control N-type MOS transistor 296.

Figure 3B:
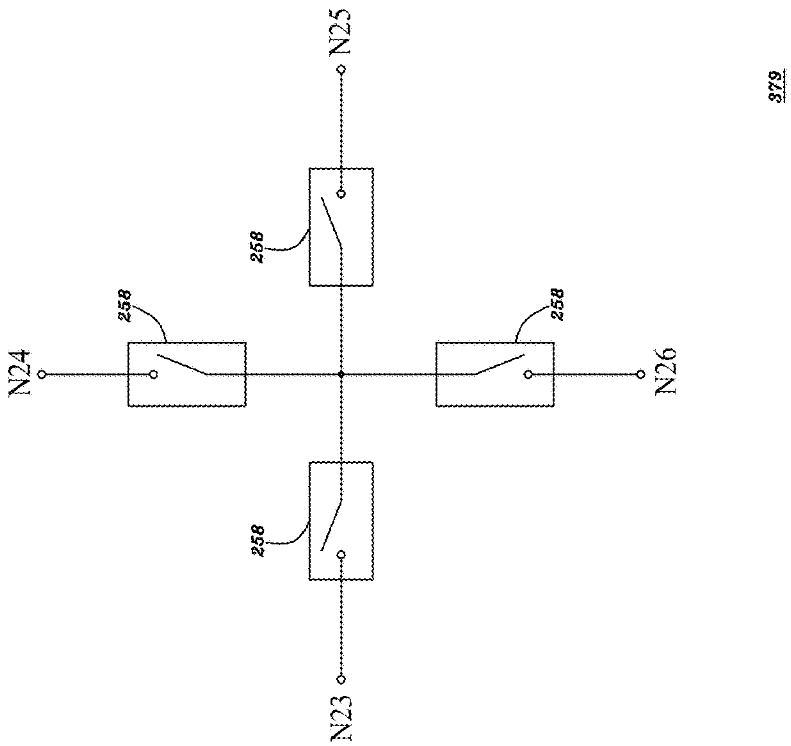
FIGS. 3A-3D are block diagrams illustrating various types of cross-point switches in accordance with an embodiment of the present application.
Figure 3A:
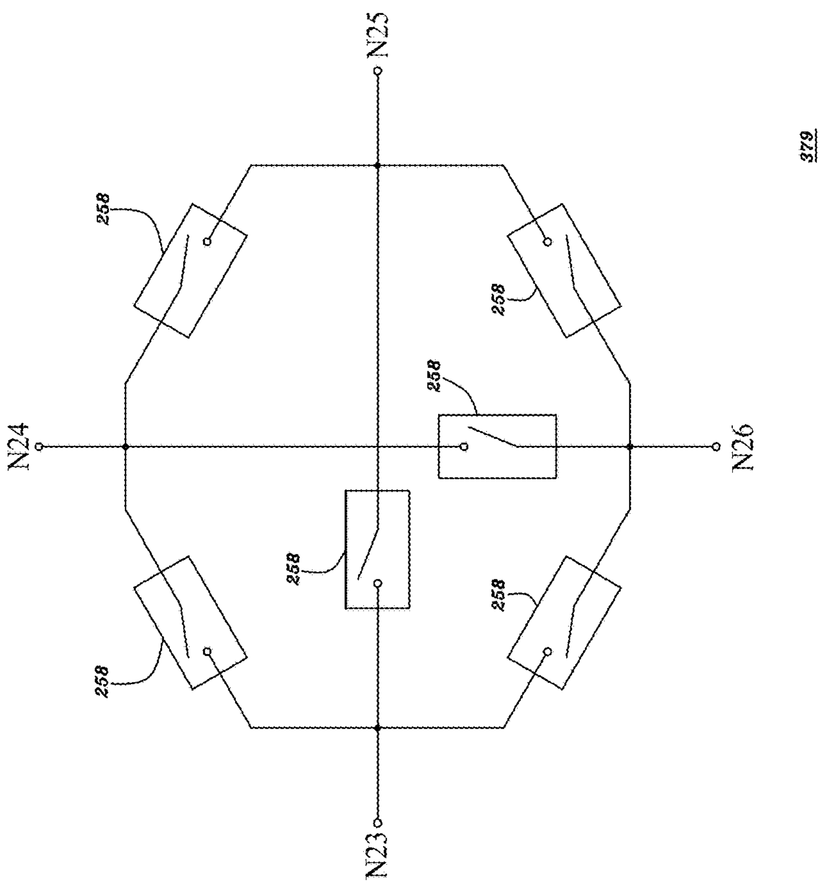

Specification for Cross-Point Switches Constructed from Pass/No-Pass Switches (1) First Type of Cross-Point Switch FIG. 3A is a circuit diagram illustrating a first type of cross-point switch composed of six pass/no-pass switches in accordance with an embodiment of the present application. Referring to FIG. 3A, six pass/no-pass switches 258, each of which may be any one of the first through sixth types of pass/no-pass switches as illustrated in FIGS. 2A-2F respectively, may compose a first type of cross-point switch 379. The first type of cross-point switch 379 may have four terminals N23-N26 each configured to be switched to couple to another one of its four terminals N23-N26 via one of its six pass/no-pass switches 258. One of the first through sixth types of pass/no-pass switches for said each of the pass/no-pass switches 258 may have one of its nodes N21 and N22 coupling to one of the four terminals N23-N26 and the other one of its nodes N21 and N22 coupling to another one of the four terminals N23-N26. For example, the first type of cross-point switch 379 may have its terminal N23 configured to be switched to couple to its terminal N24 via a first one of its six pass/no-pass switches 258 between its terminals N23 and N24, to its terminal N25 via a second one of its six pass/no-pass switches 258 between its terminals N23 and N25 and/or to its terminal N26 via a third one of its six pass/no-pass switches 258 between its terminals N23 and N26.

(2) Second Type of Cross-Point Switch

FIG. 3B is a circuit diagram illustrating a second type of cross-point switch composed of four pass/no-pass switches in accordance with an embodiment of the present application. Referring to FIG. 3B, four pass/no-pass switches 258, each of which may be any one of the first through sixth types of pass/no-pass switches as illustrated in FIGS. 2A-2F respectively, may compose a second type of cross-point switch 379. The second type of cross-point switch 379 may have four terminals N23-N26 each configured to be switched to couple to another one of its four terminals N23-N26 via two of its four pass/no-pass switches 258. The second type of cross-point switch 379 may have a central node configured to couple to its four terminals N23-N26 via its four respective pass/no-pass switches 258. One of the first through sixth types of pass/no-pass switches for said each of the pass/no-pass switches 258 may have one of its nodes N21 and N22 coupling to one of the four terminals N23-N26 and the other one of its nodes N21 and N22 coupling to the central node of the cross-point switch 379 of the second type. For example, the second type of cross-point switch 379 may have its terminal N23 configured to be switched to couple to its terminal N24 via left and top ones of its four pass/no-pass switches 258, to its terminal N25 via left and right ones of its four pass/no-pass switches 258 and/or to its terminal N26 via left and bottom ones of its four pass/no-pass switches 258.

Specification for Multiplexer (MUXER)

(1) First Type of Multiplexer

Figure 4A:
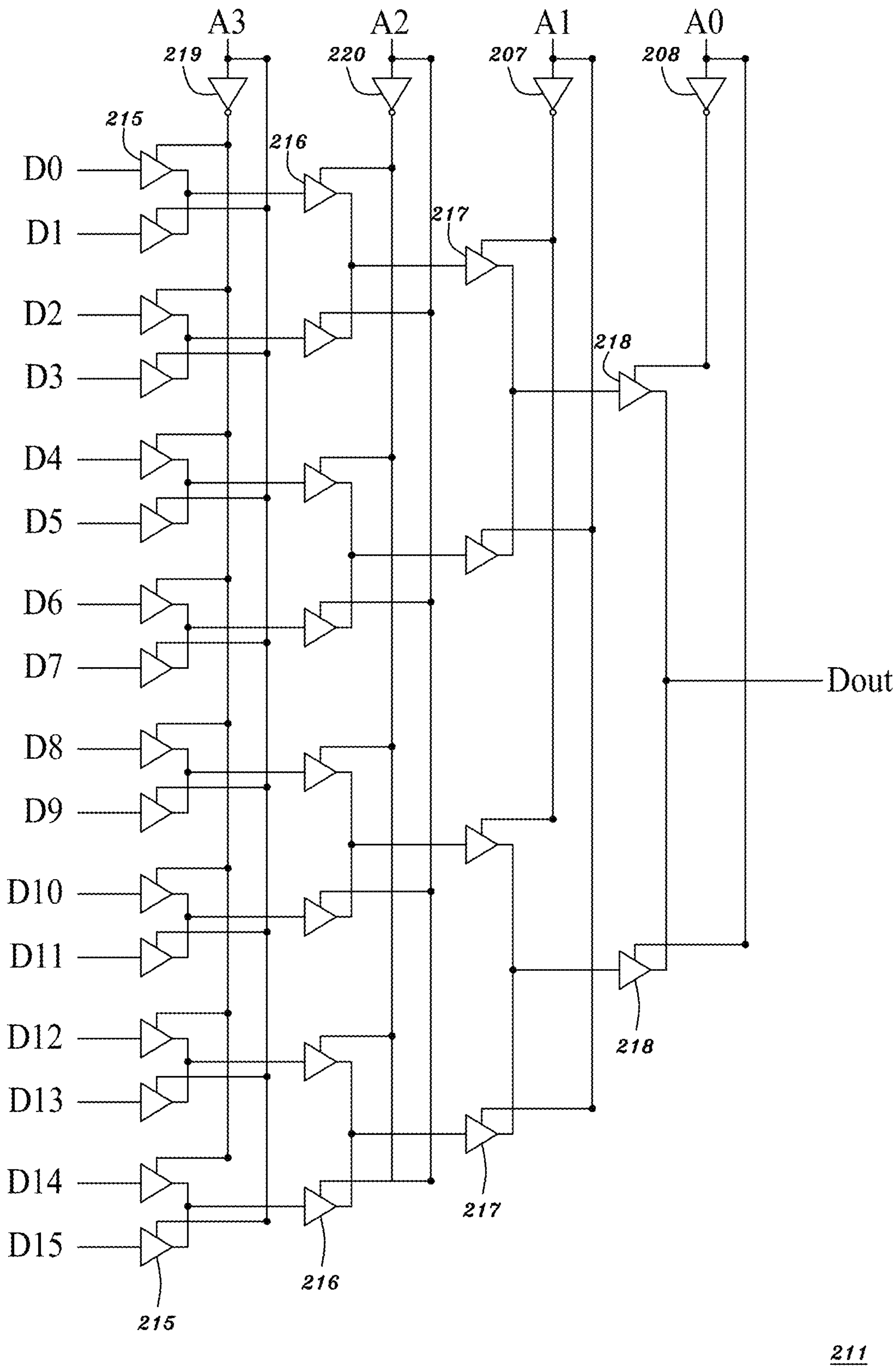
FIGS. 4A and 4C-4L are circuit diagrams illustrating various types of multiplexers in accordance with an embodiment of the present application.

FIG. 4A is a circuit diagram illustrating a first type of multiplexer in accordance with an embodiment of the present application. Referring to FIG. 4A, a first type of multiplexer (MUXER) 211 may select one from its first set of inputs arranged in parallel into its output based on a combination of its second set of inputs arranged in parallel. For example, the first type of multiplexer (MUXER) 211 may have sixteen inputs D0-D15 arranged in parallel to act as its first set of inputs and four inputs A0-A3 arranged in parallel to act as its second set of inputs. The first type of multiplexer (MUXER) 211 may select one from its first set of sixteen inputs D0-D15 into its output Dout based on a combination of its second set of four inputs A0-A3.

Referring to FIG. 4A, the first type of multiplexer 211 may include multiple stages of tri-state buffers, e.g., four stages of tri-state buffers 215, 216, 217 and 218, coupling to one another stage by stage. For more elaboration, the first type of multiplexer 211 may include sixteen tri-state buffers 215 in eight pairs in the first stage, arranged in parallel, each having a first input coupling to one of the sixteen inputs D0-D15 in the first set and a second input associated with the input A3 in the second set. Each of the sixteen tri-state buffers 215 in the first stage may be switched on or off to pass or not to pass its first input into its output in accordance with its second input. The first type of multiplexer 211 may include an inverter 219 configured to invert its input coupling to the input A3 in the second set into its output. One of the tri-state buffers 215 in each pair in the first stage may be switched on in accordance with its second input coupling to one of the input and output of the inverter 219 to pass its first input into its output; the other one of the tri-state buffers 215 in said each pair in the first stage may be switched off in accordance with its second input coupling to the other one of the input and output of the inverter 219 not to pass its first input into its output. The outputs of the tri-state buffers 215 in said each pair in the first stage may couple to each other. For example, a top one of the tri-state buffers 215 in a topmost pair in the first stage may have its first input coupling to the input D0 in the first set and its second input coupling to the output of the inverter 219; a bottom one of the tri-state buffers 215 in the topmost pair in the first stage may have its first input coupling to the input D1 in the first set and its second input coupling to the input of the inverter 219. The top one of the tri-state buffers 215 in the topmost pair in the first stage may be switched on in accordance with its second input to pass its first input into its output; the bottom one of the tri-state buffers 215 in the topmost pair in the first stage may be switched off in accordance with its second input not to pass its first input into its output. Thereby, each of the eight pairs of tri-state buffers 215 in the first stage may be switched in accordance with its two second inputs coupling to the input and output of the inverter 219 respectively to pass one of its two first inputs into its output coupling to a first input of one of the tri-state buffers 216 in the second stage.

Referring to FIG. 4A, the first type of multiplexer 211 may include eight tri-state buffers 216 in four pairs in the second stage, arranged in parallel, each having a first input coupling to the output of one of the eight pairs of tri-state buffers 215 in the first stage and a second input associated with the input A2 in the second set. Each of the eight tri-state buffers 216 in the second stage may be switched on or off to pass or not to pass its first input into its output in accordance with its second input. The first type of multiplexer 211 may include an inverter 220 configured to invert its input coupling to the input A2 in the second set into its output. One of the tri-state buffers 216 in each pair in the second stage may be switched on in accordance with its second input coupling to one of the input and output of the inverter 220 to pass its first input into its output; the other one of the tri-state buffers 216 in said each pair in the second stage may be switched off in accordance with its second input coupling to the other one of the input and output of the inverter 220 not to pass its first input into its output. The outputs of the tri-state buffers 216 in said each pair in the second stage may couple to each other. For example, a top one of the tri-state buffers 216 in a topmost pair in the second stage may have its first input coupling to the output of a topmost one of the eight pairs of tri-state buffers 215 in the first stage and its second input coupling to the output of the inverter 220; a bottom one of the tri-state buffers 216 in the topmost pair in the second stage may have its first input coupling to the output of a second top one of the eight pairs of tri-state buffers 215 in the first stage and its second input coupling to the input of the inverter 220. The top one of the tri-state buffers 216 in the topmost pair in the second stage may be switched on in accordance with its second input to pass its first input into its output; the bottom one of the tri-state buffers 216 in the topmost pair in the second stage may be switched off in accordance with its second input not to pass its first input into its output. Thereby, each of the four pairs of tri-state buffers 216 in the second stage may be switched in accordance with its two second inputs coupling to the input and output of the inverter 220 respectively to pass one of its two first inputs into its output coupling to a first input of one of the tri-state buffers 217 in the third stage.

Referring to FIG. 4A, the first type of multiplexer 211 may include four tri-state buffers 217 in two pairs in the third stage, arranged in parallel, each having a first input coupling to the output of one of the four pairs of tri-state buffers 216 in the second stage and a second input associated with the input A1 in the second set. Each of the four tri-state buffers 217 in the third stage may be switched on or off to pass or not to pass its first input into its output in accordance with its second input. The first type of multiplexer 211 may include an inverter 207 configured to invert its input coupling to the input A1 in the second set into its output. One of the tri-state buffers 217 in each pair in the third stage may be switched on in accordance with its second input coupling to one of the input and output of the inverter 207 to pass its first input into its output; the other one of the tri-state buffers 217 in said each pair in the third stage may be switched off in accordance with its second input coupling to the other one of the input and output of the inverter 207 not to pass its first input into its output. The outputs of the tri-state buffers 217 in said each pair in the third stage may couple to each other. For example, a top one of the tri-state buffers 217 in a top pair in the third stage may have its first input coupling to the output of a topmost one of the four pairs of tri-state buffers 216 in the second stage and its second input coupling to the output of the inverter 207; a bottom one of the tri-state buffers 217 in the top pair in the third stage may have its first input coupling to the output of a second top one of the four pairs of tri-state buffers 216 in the second stage and its second input coupling to the input of the inverter 207. The top one of the tri-state buffers 217 in the top pair in the third stage may be switched on in accordance with its second input to pass its first input into its output; the bottom one of the tri-state buffers 217 in the top pair in the third stage may be switched off in accordance with its second input not to pass its first input into its output. Thereby, each of the two pairs of tri-state buffers 217 in the third stage may be switched in accordance with its two second inputs coupling to the input and output of the inverter 207 respectively to pass one of its two first inputs into its output coupling to a first input of one of the tri-state buffers 218 in the fourth stage.

Referring to FIG. 4A, the first type of multiplexer 211 may include a pair of two tri-state buffers 218 in the fourth stage, i.e., output stage, arranged in parallel, each having a first input coupling to the output of one of the two pairs of tri-state buffers 217 in the third stage and a second input associated with the input A0 in the second set. Each of the two tri-state buffers 218 in the pair in the fourth stage, i.e., output stage, may be switched on or off to pass or not to pass its first input into its output in accordance with its second input. The first type of multiplexer 211 may include an inverter 208 configured to invert its input coupling to the input A0 in the second set into its output. One of the two tri-state buffers 218 in the pair in the fourth stage, i.e., output stage, may be switched on in accordance with its second input coupling to one of the input and output of the inverter 208 to pass its first input into its output; the other one of the two tri-state buffers 218 in the pair in the fourth stage, i.e., output stage, may be switched off in accordance with its second input coupling to the other one of the input and output of the inverter 208 not to pass its first input into its output. The outputs of the two tri-state buffers 218 in the pair in the fourth stage, i.e., output stage, may couple to each other. For example, a top one of the two tri-state buffers 218 in the pair in the fourth stage, i.e., output stage, may have its first input coupling to the output of a top one of the two pairs of tri-state buffers 217 in the third stage and its second input coupling to the output of the inverter 208; a bottom one of the two tri-state buffers 218 in the pair in the fourth stage, i.e., output stage, may have its first input coupling to the output of a bottom one of the two pairs of tri-state buffers 217 in the third stage and its second input coupling to the input of the inverter 208. The top one of the two tri-state buffers 218 in the pair in the fourth stage, i.e., output stage, may be switched on in accordance with its second input to pass its first input into its output; the bottom one of the two tri-state buffers 218 in the pair in the fourth stage, i.e., output stage, may be switched off in accordance with its second input not to pass its first input into its output. Thereby, the pair of the two tri-state buffers 218 in the fourth stage, i.e., output stage, may be switched in accordance with its two second inputs coupling to the input and output of the inverter 208 respectively to pass one of its two first inputs into its output acting as the output Dout of the multiplexer 211 of the first type.

Figure 4B:
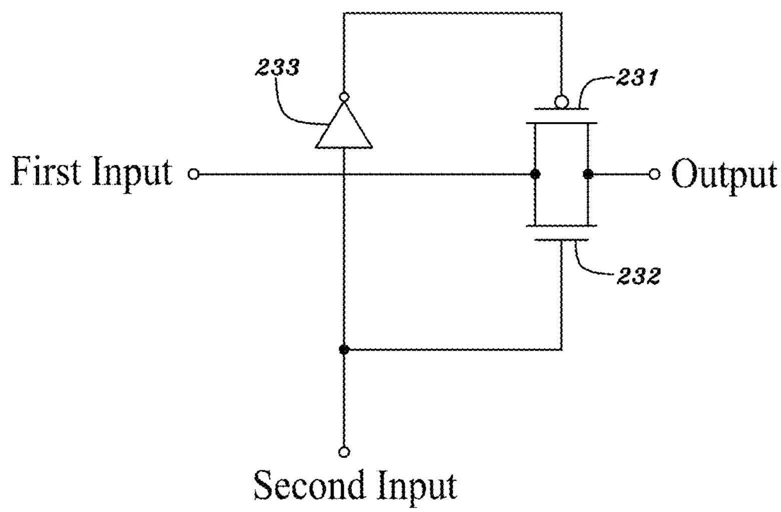
FIG. 4B is a circuit diagram illustrating a tri-state buffer of a multiplexer in accordance with an embodiment of the present application.

FIG. 4B is a circuit diagram illustrating a tri-state buffer of a multiplexer of a first type in accordance with an embodiment of the present application. Referring to FIGS. 4A and 4B, each of the tri-state buffers 215, 216, 217 and 218 may include (1) a P-type MOS transistor 231 configured to form a channel with an end at the first input of said each of the tri-state buffers 215, 216, 217 and 218 and the other opposite end at the output of said each of the tri-state buffers 215, 216, 217 and 218, (2) a N-type MOS transistor 232 configured to form a channel with an end at the first input of said each of the tri-state buffers 215, 216, 217 and 218 and the other opposite end at the output of said each of the tri-state buffers 215, 216, 217 and 218, and (3) an inverter 233 configured to invert its input, at the second input of said each of the tri-state buffers 215, 216, 217 and 218, coupling to a gate terminal of the N-type MOS transistor 232 into its output coupling to a gate terminal of the P-type MOS transistor 231. For each of the tri-state buffers 215, 216, 217 and 218, when its inverter 233 has its input at a logic level of "1", each of its P-type and N-type MOS transistors 231 and 232 may be switched on to pass its first input to its output via the channels of its P-type and N-type MOS transistors 231 and 232; when its inverter 233 has its input at a logic level of "0", each of its P-type and N-type MOS transistors 231 and 232 may be switched off not to form any channel therein such that its first input may not be passed to its output. For the two tri-state buffers 215 in each pair in the first stage, their two respective inverters 233 may have their two respective inputs coupling respectively to the output and input of the inverter 219, which are associated with the input A3 in the second set. For the two tri-state buffers 216 in each pair in the second stage, their two respective inverters 233 may have their two respective inputs coupling respectively to the output and input of the inverter 220, which are associated with the input A2 in the second set. For the two tri-state buffers 217 in each pair in the third stage, their two respective inverters 233 may have their two respective inputs coupling respectively to the output and input of the inverter 207, which are associated with the input A1 in the second set. For the two tri-state buffers 218 in the pair in the fourth stage, i.e., output stage, their two respective inverters 233 may have their two respective inputs coupling respectively to the output and input of the inverter 208, which are associated with the input A0 in the second set.

The first type of multiplexer (MUXER) 211 may select one from its first set of sixteen inputs D0-D15 into its output Dout based on a combination of its second set of four inputs A0-A3.

(2) Second Type of Multiplexer

Figure 4C:
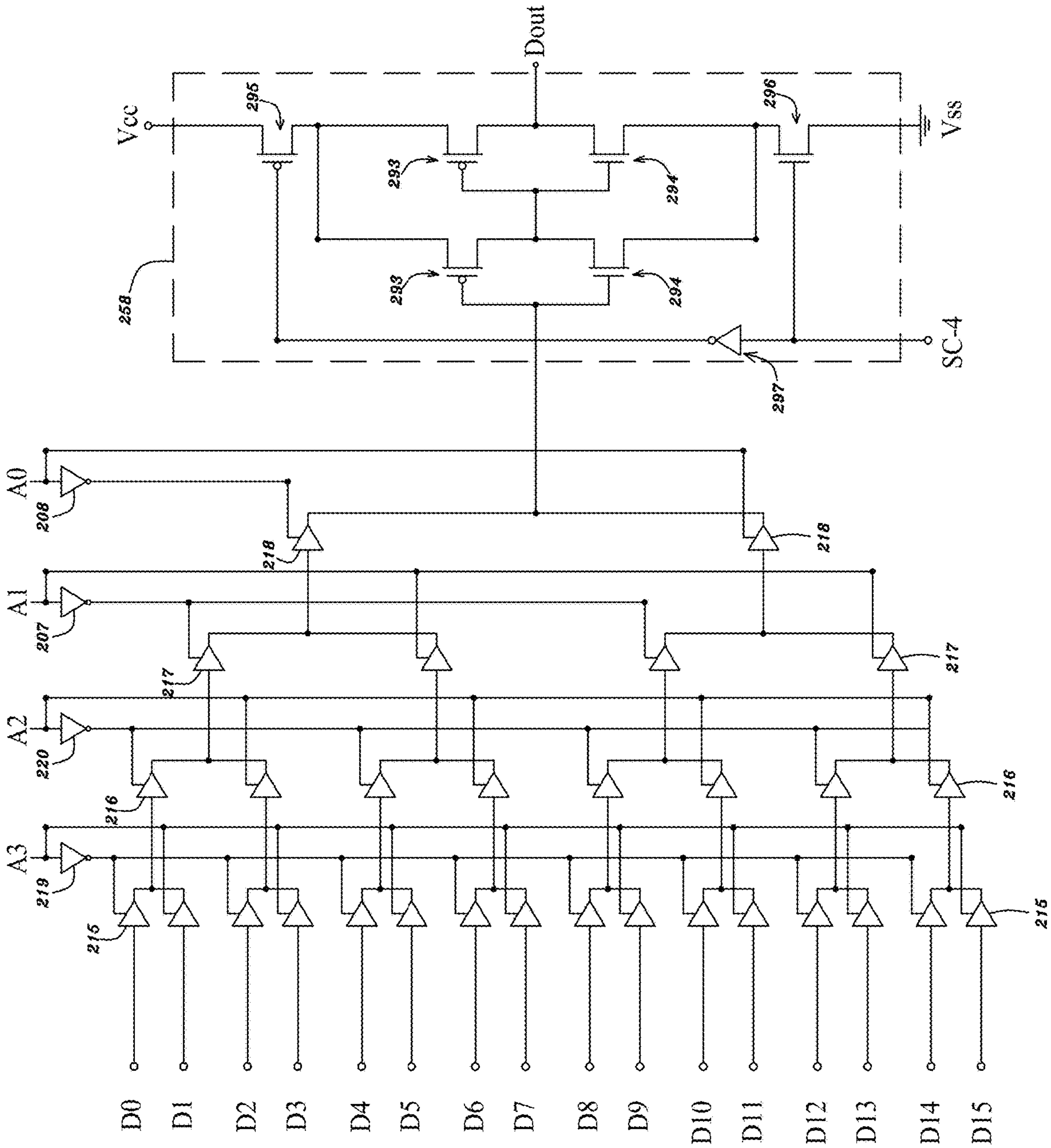

FIG. 4C is a circuit diagram of a second type of multiplexer in accordance with an embodiment of the present application. Referring to FIG. 4C, a second type of multiplexer 211 is similar to the first type of multiplexer 211 as illustrated in FIGS. 4A and 4B but may further include the third type of pass/no-pass switch or switch buffer 292 as seen in FIG. 2C having its input at the node N21 coupling to the output of the pair of tri-state buffers 218 in the last stage, e.g., in the fourth stage or output stage in this case. For an element indicated by the same reference number shown in FIGS. 2C, 4A, 4B and 4C, the specification of the element as seen in FIG. 4C may be referred to that of the element as illustrated in FIG. 2C, 4A or 4B. Accordingly, referring to FIG. 4C, the third type of pass/no-pass switch 292 may amplify its input at the node N21 into its output at the node N22 acting as an output Dout of the multiplexer 211 of the second type.

The second type of multiplexer (MUXER) 211 may select one from its first set of sixteen inputs D0-D15 into its output Dout based on a combination of its second set of four inputs A0-A3.

(3) Third Type of Multiplexer

Figure 4D:
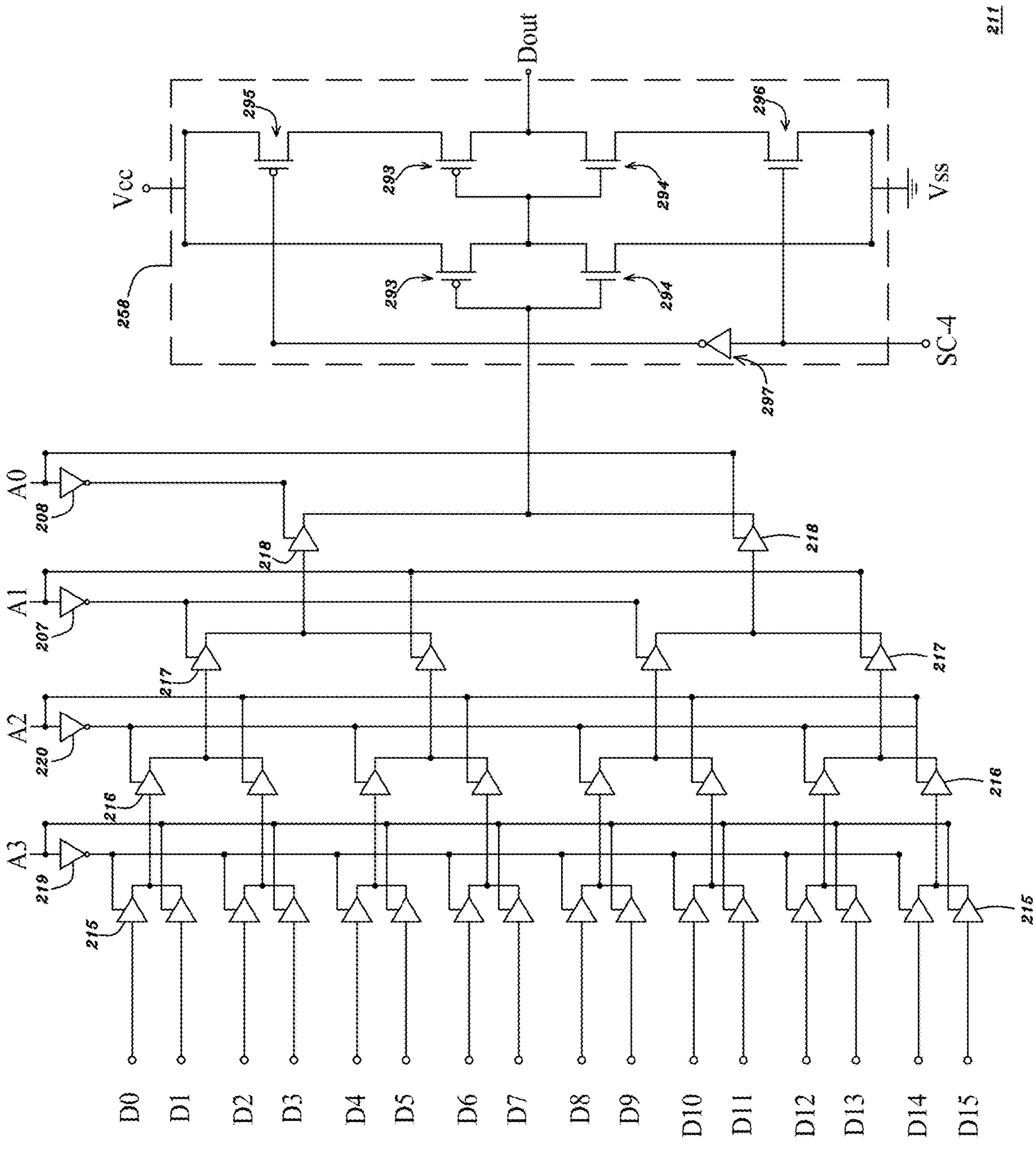

FIG. 4D is a circuit diagram of a third type of multiplexer in accordance with an embodiment of the present application. Referring to FIG. 4D, a third type of multiplexer 211 is similar to the first type of multiplexer 211 as illustrated in FIGS. 4A and 4B but may further include the fourth type of pass/no-pass switch 292 or switch buffer as seen in FIG. 2D having its input at the node N21 coupling to the output of the pair of tri-state buffers 218 in the last stage, e.g., in the fourth stage or output stage in this case. For an element indicated by the same reference number shown in FIGS. 2C, 2D, 4A, 4B, 4C and 4D, the specification of the element as seen in FIG. 4D may be referred to that of the element as illustrated in FIG. 2C, 2D, 4A, 4B or 4C. Accordingly, referring to FIG. 4D, the fourth type of pass/no-pass switch 292 may amplify its input at the node N21 into its output at the node N22 acting as an output Dout of the multiplexer 211 of the third type.

The third type of multiplexer (MUXER) 211 may select one from its first set of sixteen inputs D0-D15 into its output Dout based on a combination of its second set of four inputs A0-A3.

Figure 4E:
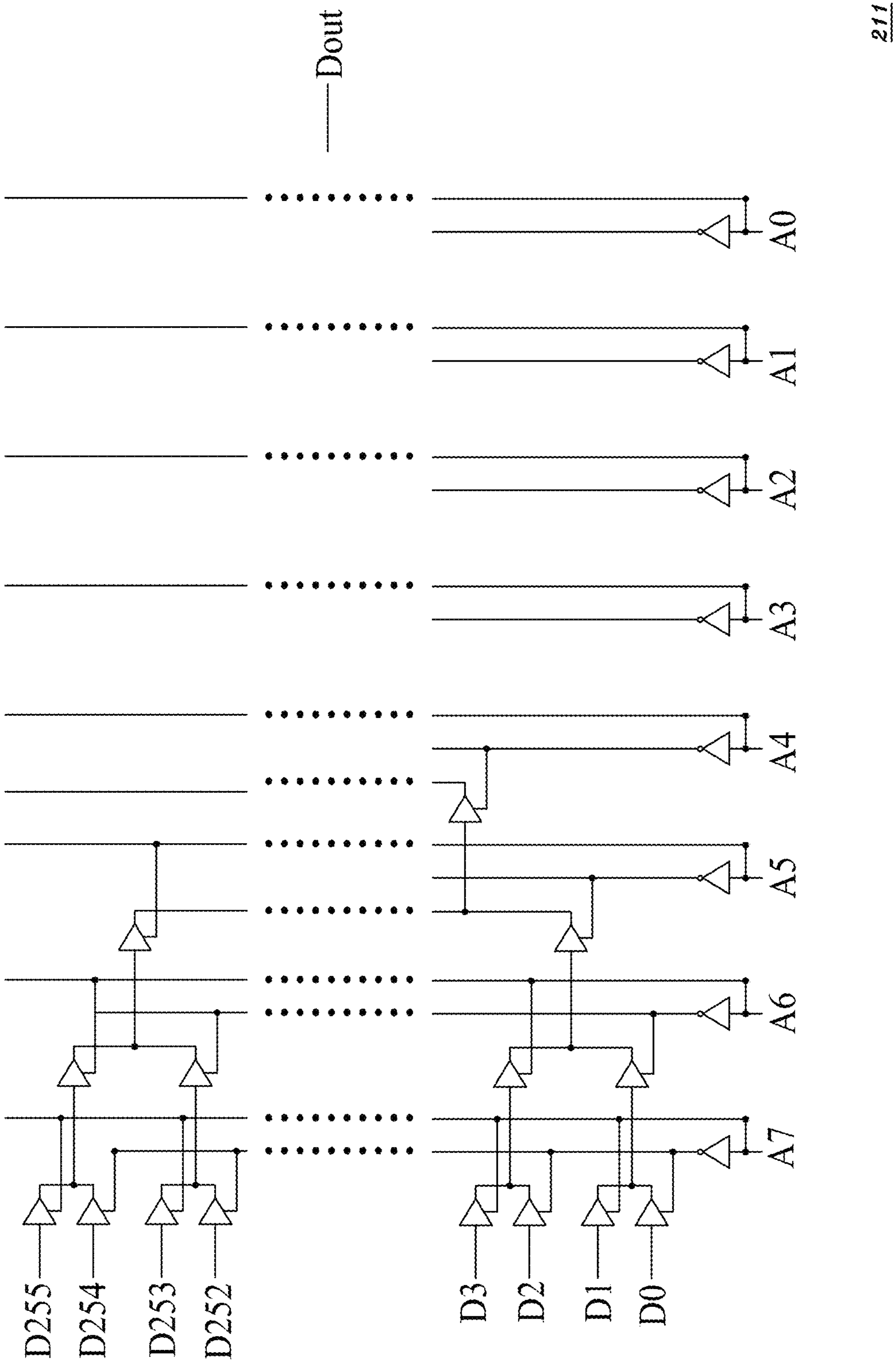

Alternatively, the first, second or third type of multiplexer (MUXER) 211 may have the first set of inputs, arranged in parallel, having the number of 2 to the power of n and the second set of inputs, arranged in parallel, having the number of n, wherein the number n may be any integer greater than or equal to 2, such as between 2 and 64. FIG. 4E is a schematic view showing a circuit diagram of a multiplexer in accordance with an embodiment of the present application. In this example, referring to FIG. 4E, each of the multiplexers 211 of the first through third types as illustrated in FIGS. 4A, 4C and 4D may be modified with its second set of inputs A0-A7, having the number of n equal to 8, and its first set of 256 inputs D0-D255, i.e. the resulting values or programming codes for all combinations of its second set of inputs A0-A7, having the number of 2 to the power of n equal to 8. Each of the multiplexers 211 of the first through third types may include eight stages of tri-state buffers or switch buffers, each having the same architecture as illustrated in FIG. 4B, coupling to one another stage by stage. The tri-state buffers or switch buffers in the first stage, arranged in parallel, may have the number of 256 each having its first input coupling to one of the 256 inputs D0-D255 of the first set of said each of the multiplexers 211 and each may be switched on or off to pass or not to pass its first input into its output in accordance with its second input associated with the input A7 of the second set of said each of the multiplexers 211. The tri-state buffers or switch buffers in each of the second through seventh stages, arranged in parallel, each may have its first input coupling to an output of one of multiple pairs of tri-state buffers or switch buffers in a stage previous to said each of the second through seventh stages and may be switched on or off to pass or not to pass its first input into its output in accordance with its second input associated with one of the respective inputs A6-A1 of the second set of said each of the multiplexers 211. Each of the tri-state buffers or switch buffers in a pair in the eighth stage, i.e., output stage, may have its first input coupling to an output of one of multiple pairs of tri-state buffers or switch buffers in the seventh stage and may be switched on or off to pass or not to pass its first input into its output, which may act as an output Dout of the multiplexer 211, in accordance with its second input associated with the input A0 of the second set of said each of the multiplexers 211. Alternatively, one of the pass/no-pass switches or switch buffers 292 as seen in FIGS. 4C and 4D may be incorporated to amplify its input coupling to the output of the tri-state buffers or switch buffers in the pair in the eighth stage, i.e., output stage, into its output Dout, which may act as an output of the multiplexer 211.

Figure 4F:
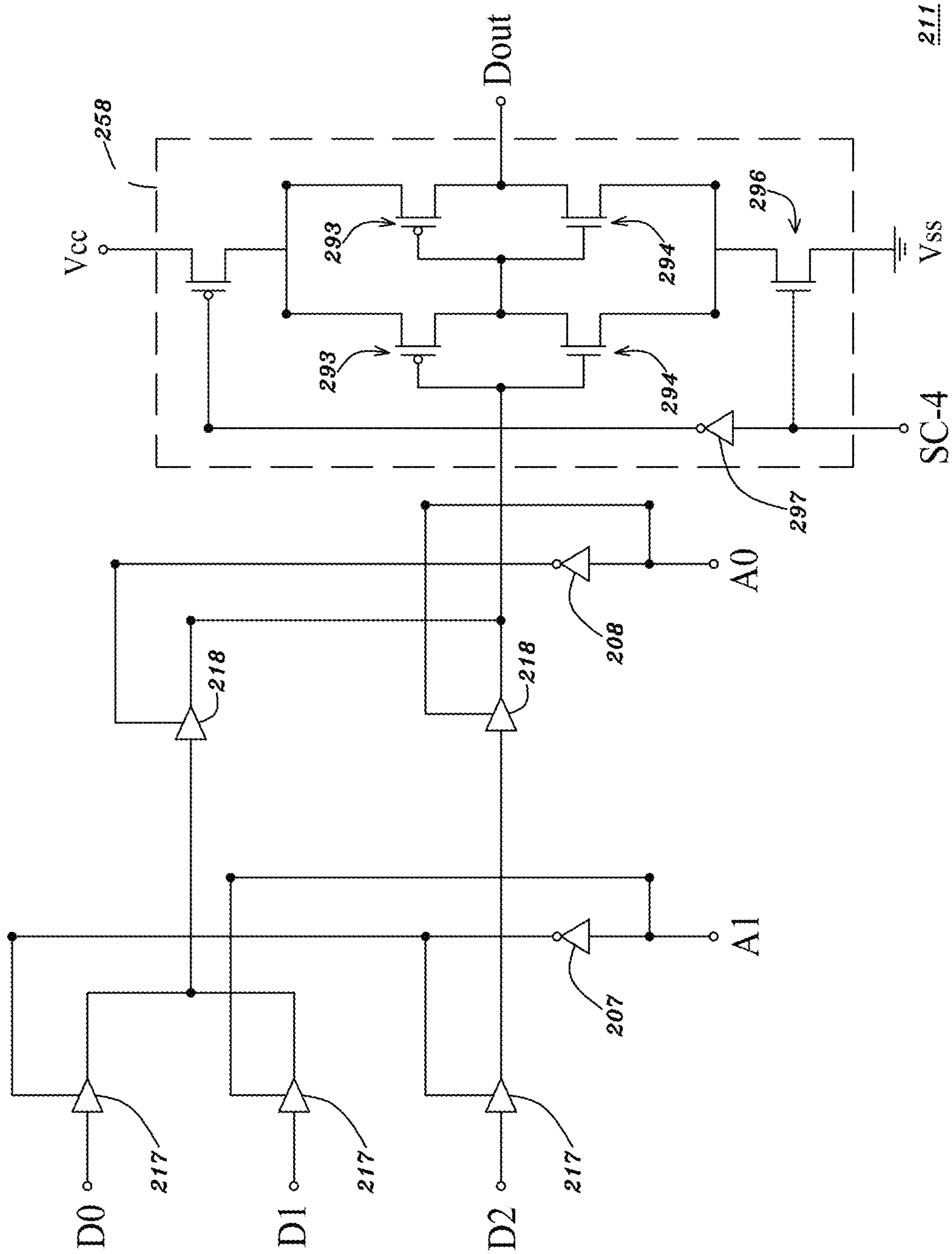

For example, FIG. 4F is a schematic view showing a circuit diagram of a multiplexer in accordance with an embodiment of the present application. Referring to FIG. 4F, the second type of multiplexer 211 may have the first set of inputs D0, D1 and D2 arranged in parallel and the second set of inputs A0 and A1 arranged in parallel. The second type of multiplexer 211 may include two stages of tri-state buffers 217 and 218 coupling to each other stage by stage. For more elaboration, the second type of multiplexer 211 may include third tri-state buffers 217 in the first stage, arranged in parallel, each having a first input coupling to one of the third inputs D0-D2 in the first set and a second input associated with the input A1 in the second set. Each of the three tri-state buffers 217 in the first stage may be switched on or off to pass or not to pass its first input into its output in accordance with its second input. The second type of multiplexer 211 may include the inverter 207 configured to invert its input coupling to the input A1 in the second set into its output. One of the top two tri-state buffers 217 in a pair in the first stage may be switched on in accordance with its second input coupling to one of the input and output of the inverter 207 to pass its first input into its output; the other one of the top two tri-state buffers 217 in the pair in the first stage may be switched off in accordance with its second input coupling to the other one of the input and output of the inverter 207 not to pass its first input into its output. The outputs of the top two tri-state buffers 217 in the pair in the first stage may couple to each other. Thereby, the pair of top two tri-state buffers 217 in the first stage may be switched in accordance with its two second inputs coupling to the input and output of the inverter 207 respectively to pass one of its two first inputs into its output coupling to a first input of one of the tri-state buffers 218 in the second stage. The bottom one of the tri-state buffers 217 in the first stage may be switched on or off in accordance with its second input coupling to the output of the inverter 207 to or not to pass its first input into its output coupling to a first input of the other one of the tri-state buffers 218 in the second stage, i.e., output stage.

Referring to FIG. 4F, the second type of multiplexer 211 may include a pair of two tri-state buffers 218 in the second stage or output stage, arranged in parallel, a top one of which has a first input coupling to the output of the pair of top two tri-state buffers 217 in the first stage and a second input associated with the input A0 in the second set, and a bottom one of which has a first input coupling to the output of the bottom one of the tri-state buffers 217 in the first stage and a second input associated with the input A0 in the second set. Each of the two tri-state buffers 218 in the pair in the second stage, i.e., output stage, may be switched on or off to pass or not to pass its first input into its output in accordance with its second input. The second type of multiplexer 211 may include the inverter 208 configured to invert its input coupling to the input A0 in the second set into its output. One of the two tri-state buffers 218 in the pair in the second stage, i.e., output stage, may be switched on in accordance with its second input coupling to one of the input and output of the inverter 208 to pass its first input into its output; the other one of the two tri-state buffers 218 in the pair in the second stage, i.e., output stage, may be switched off in accordance with its second input coupling to the other one of the input and output of the inverter 208 not to pass its first input into its output. The outputs of the two tri-state buffers 218 in the pair in the second stage, i.e., output stage, may couple to each other. Thereby, the pair of the two tri-state buffers 218 in the second stage, i.e., output stage, may be switched in accordance with its two second inputs coupling to the input and output of the inverter 208 respectively to pass one of its two first inputs into its output. The second type of multiplexer 211 may further include the third type of pass/no-pass switch 292 as seen in FIG. 2C having its input at the node N21 coupling to the output of the pair of tri-state buffers 218 in the second stage, i.e., output stage. The third type of pass/no-pass switch 292 may amplify its input at the node N21 into its output at the node N22 acting as an output Dout of the multiplexer 211 of the second type.

Figure 4G:
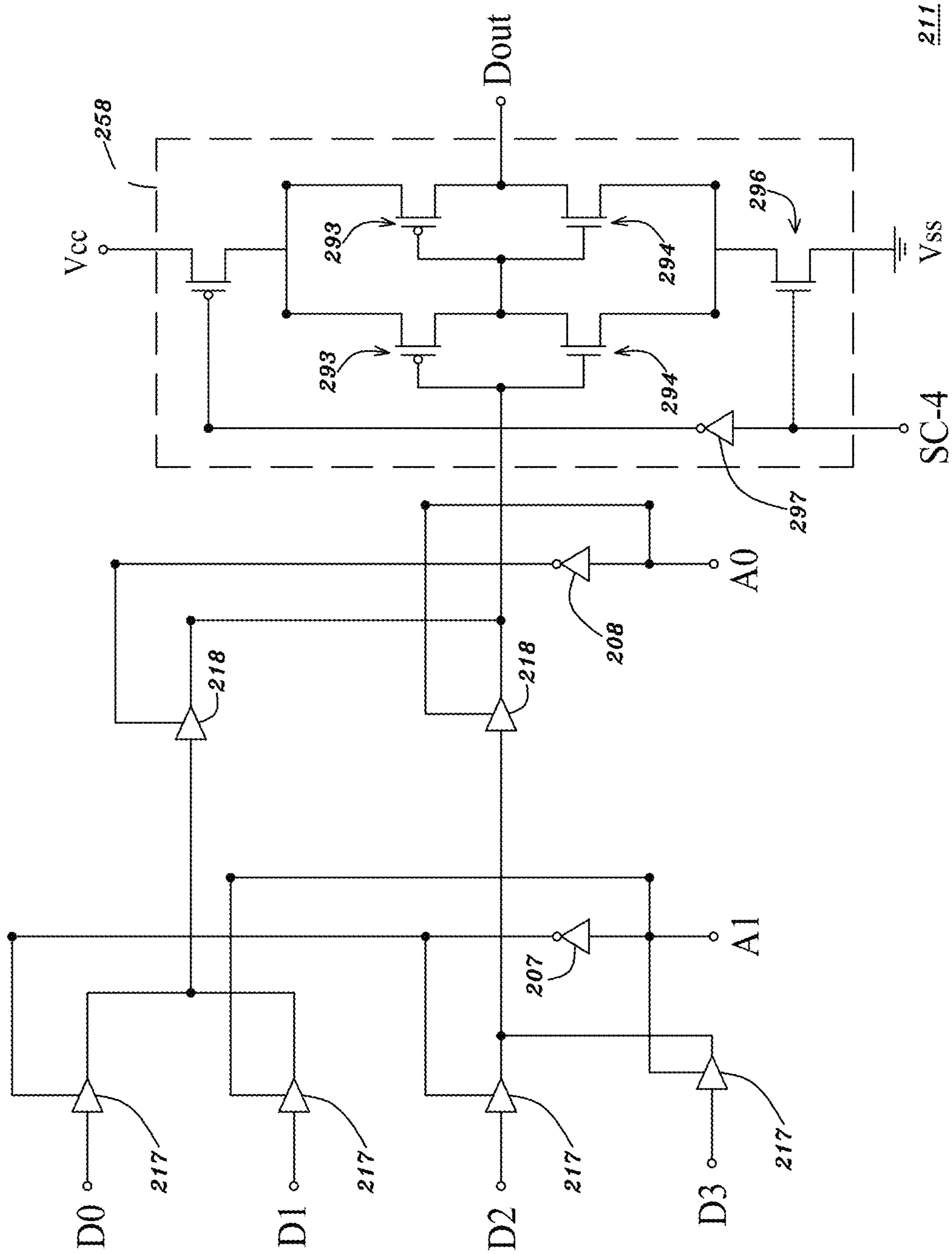

For example, FIG. 4G is a schematic view showing a circuit diagram of a multiplexer in accordance with an embodiment of the present application. Referring to FIG. 4G, the second type of multiplexer 211 may have the first set of inputs D0-D3 arranged in parallel and the second set of inputs A0 and A1 arranged in parallel. The second type of multiplexer 211 may include two stages of tri-state buffers 217 and 218 coupling to each other stage by stage. For more elaboration, the second type of multiplexer 211 may include third tri-state buffers 217 in the first stage, arranged in parallel, each having a first input coupling to one of the third inputs D0-D3 in the first set and a second input associated with the input A1 in the second set. Each of the four tri-state buffers 217 in the first stage may be switched on or off to pass or not to pass its first input into its output in accordance with its second input. The second type of multiplexer 211 may include the inverter 207 configured to invert its input coupling to the input A1 in the second set into its output. One of the top two tri-state buffers 217 in a pair in the first stage may be switched on in accordance with its second input coupling to one of the input and output of the inverter 207 to pass its first input into its output; the other one of the top two tri-state buffers 217 in the pair in the first stage may be switched off in accordance with its second input coupling to the other one of the input and output of the inverter 207 not to pass its first input into its output. The outputs of the top two tri-state buffers 217 in the pair in the first stage may couple to each other. Thereby, the pair of top two tri-state buffers 217 in the first stage may be switched in accordance with its two second inputs coupling to the input and output of the inverter 207 respectively to pass one of its two first inputs into its output coupling to a first input of one of the tri-state buffers 218 in the second stage, i.e., output stage. One of the bottom two tri-state buffers 217 in a pair in the first stage may be switched on in accordance with its second input coupling to one of the input and output of the inverter 207 to pass its first input into its output; the other one of the bottom two tri-state buffers 217 in the pair in the first stage may be switched off in accordance with its second input coupling to the other one of the input and output of the inverter 207 not to pass its first input into its output. The outputs of the bottom two tri-state buffers 217 in the pair in the first stage may couple to each other. Thereby, the pair of bottom two tri-state buffers 217 in the first stage may be switched in accordance with its two second inputs coupling to the input and output of the inverter 207 respectively to pass one of its two first inputs into its output coupling to a first input of the other one of the tri-state buffers 218 in the second stage, i.e., output stage.

Referring to FIG. 4G, the second type of multiplexer 211 may include a pair of two tri-state buffers 218 in the second stage or output stage, arranged in parallel, a top one of which has a first input coupling to the output of the pair of top two tri-state buffers 217 in the first stage and a second input associated with the input A0 in the second set, and a bottom one of which has a first input coupling to the output of the pair of bottom two tri-state buffers 217 in the first stage and a second input associated with the input A0 in the second set. Each of the two tri-state buffers 218 in the pair in the second stage, i.e., output stage, may be switched on or off to pass or not to pass its first input into its output in accordance with its second input. The second type of multiplexer 211 may include the inverter 208 configured to invert its input coupling to the input A0 in the second set into its output. One of the two tri-state buffers 218 in the pair in the second stage, i.e., output stage, may be switched on in accordance with its second input coupling to one of the input and output of the inverter 208 to pass its first input into its output; the other one of the two tri-state buffers 218 in the pair in the second stage, i.e., output stage, may be switched off in accordance with its second input coupling to the other one of the input and output of the inverter 208 not to pass its first input into its output. The outputs of the two tri-state buffers 218 in the pair in the second stage, i.e., output stage, may couple to each other. Thereby, the pair of the two tri-state buffers 218 in the second stage, i.e., output stage, may be switched in accordance with its two second inputs coupling to the input and output of the inverter 208 respectively to pass one of its two first inputs into its output. The second type of multiplexer 211 may further include the third type of pass/no-pass switch 292 as seen in FIG. 2C having its input at the node N21 coupling to the output of the pair of tri-state buffers 218 in the second stage, i.e., output stage. The third type of pass/no-pass switch 292 may amplify its input at the node N21 into its output at the node N22 acting as an output Dout of the multiplexer 211 of the second type.

Figure 4H:
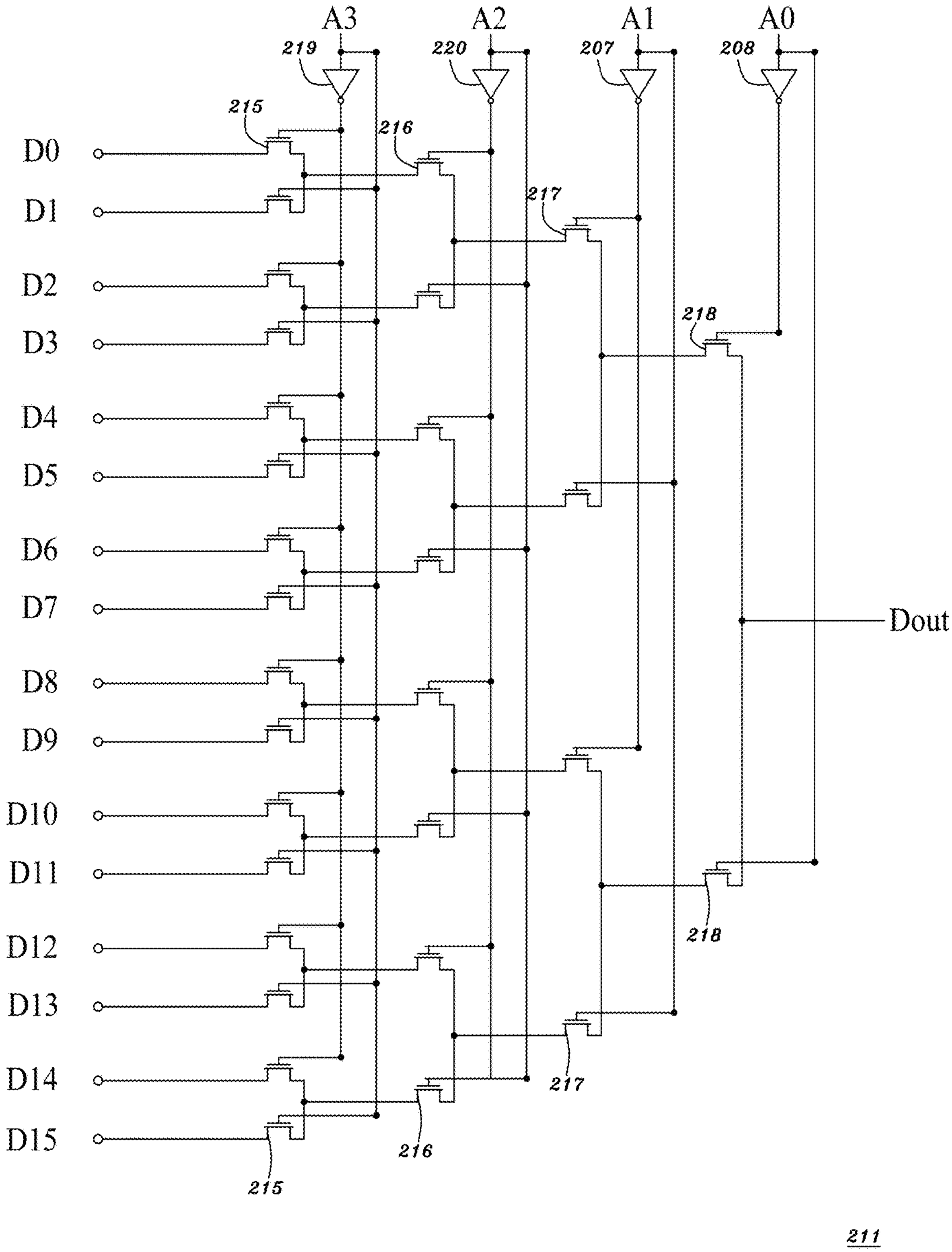
Figure 4I:
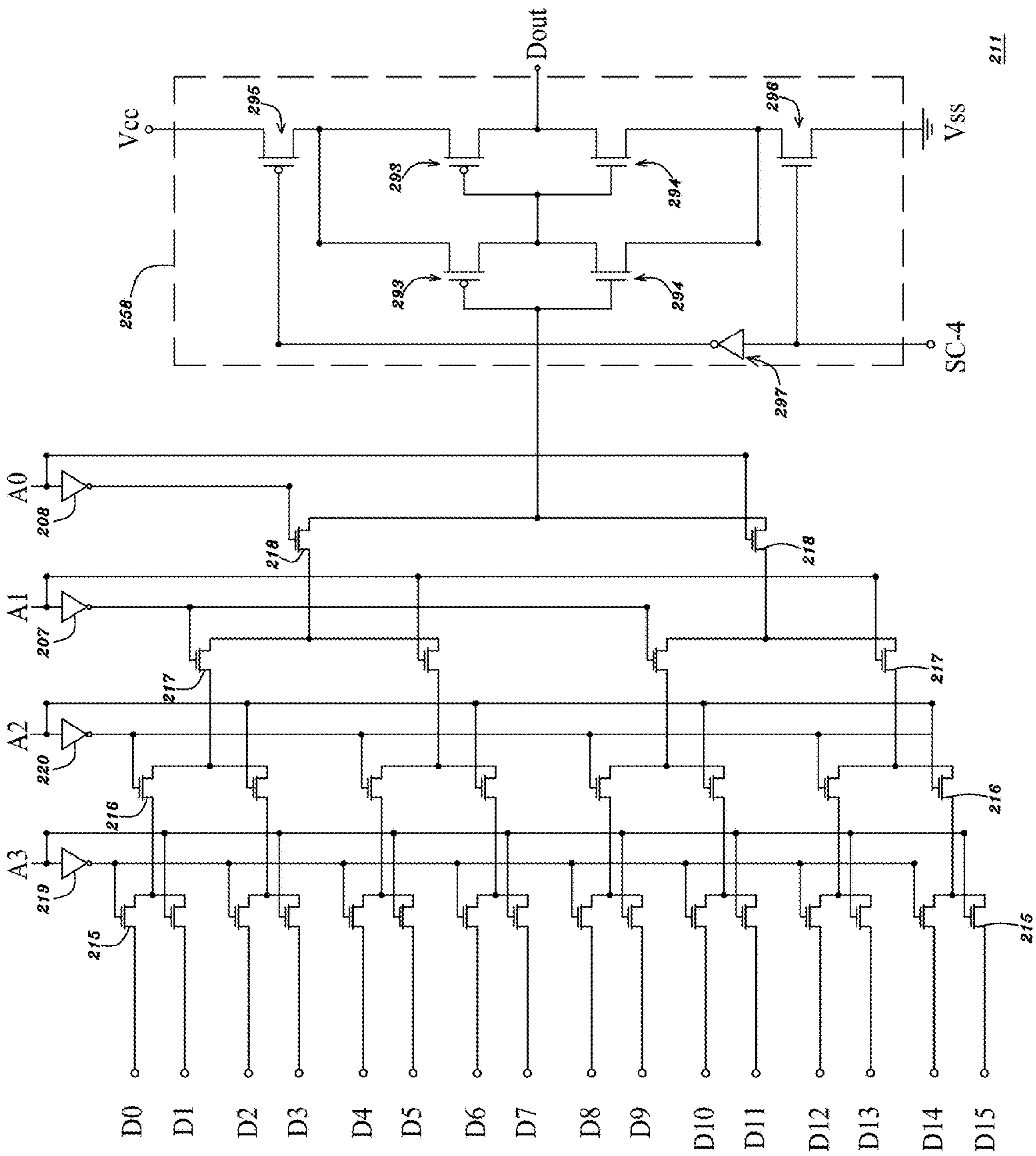
Figure 4J:
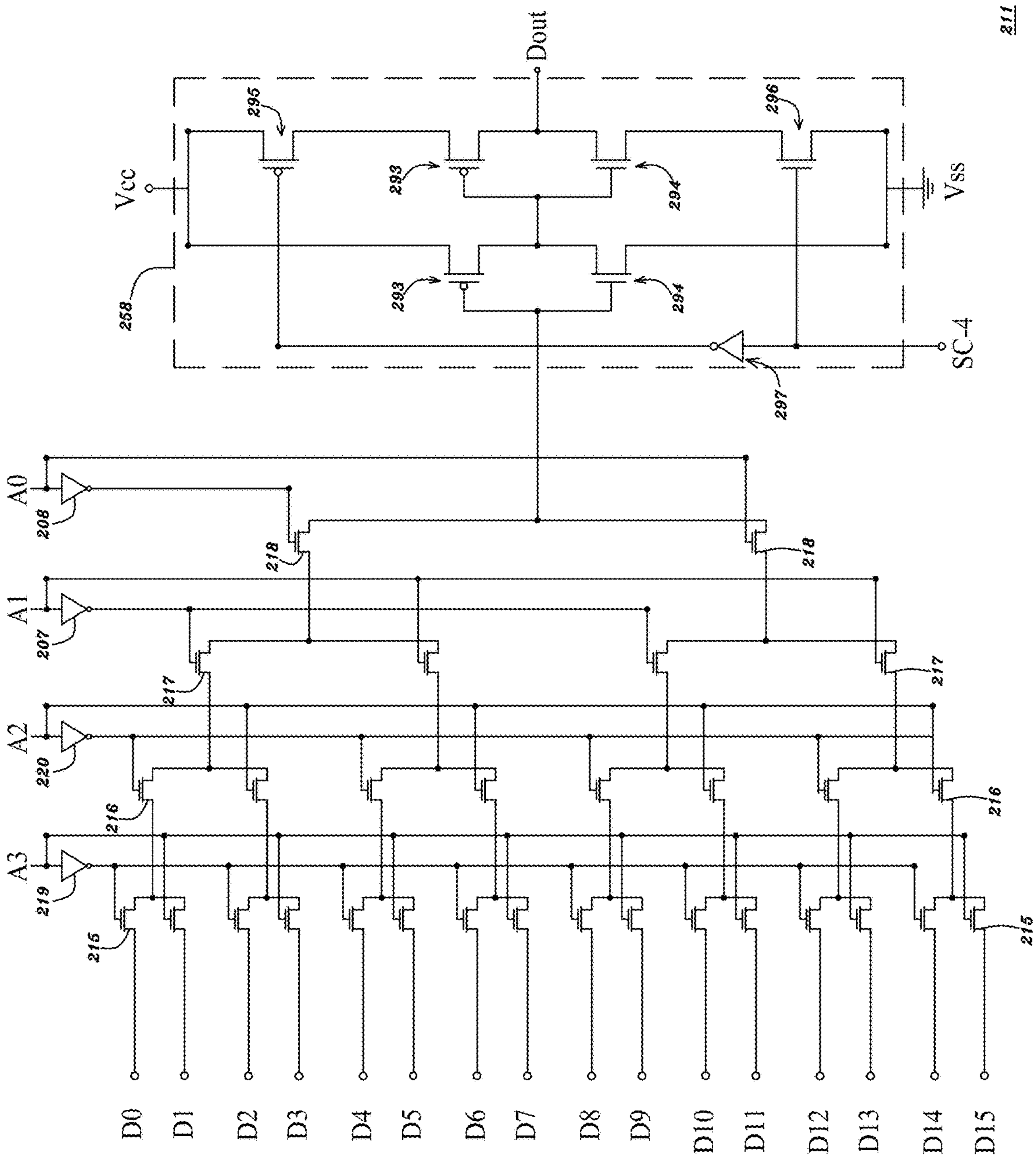
Figure 4K:
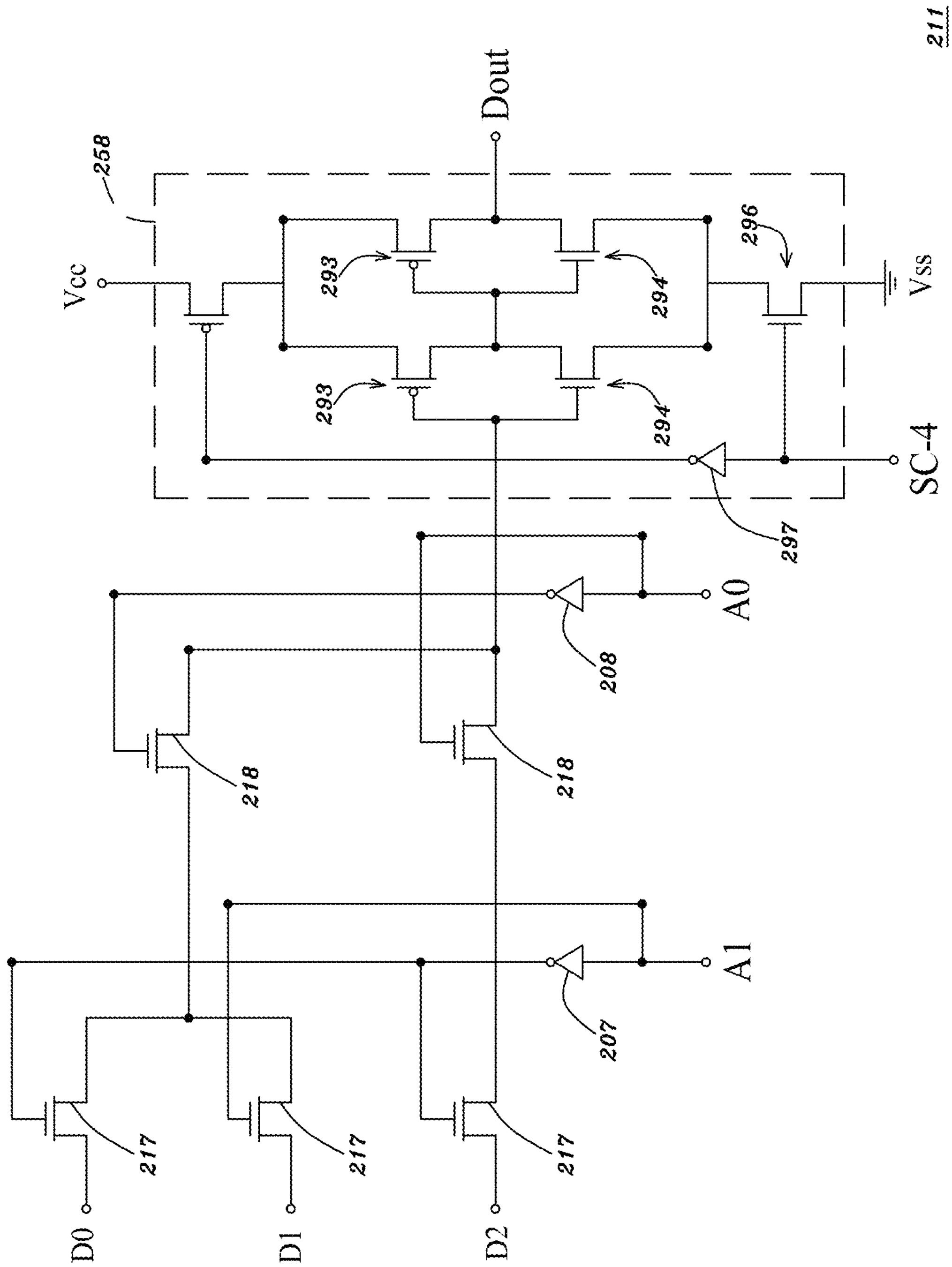
Figure 4L:
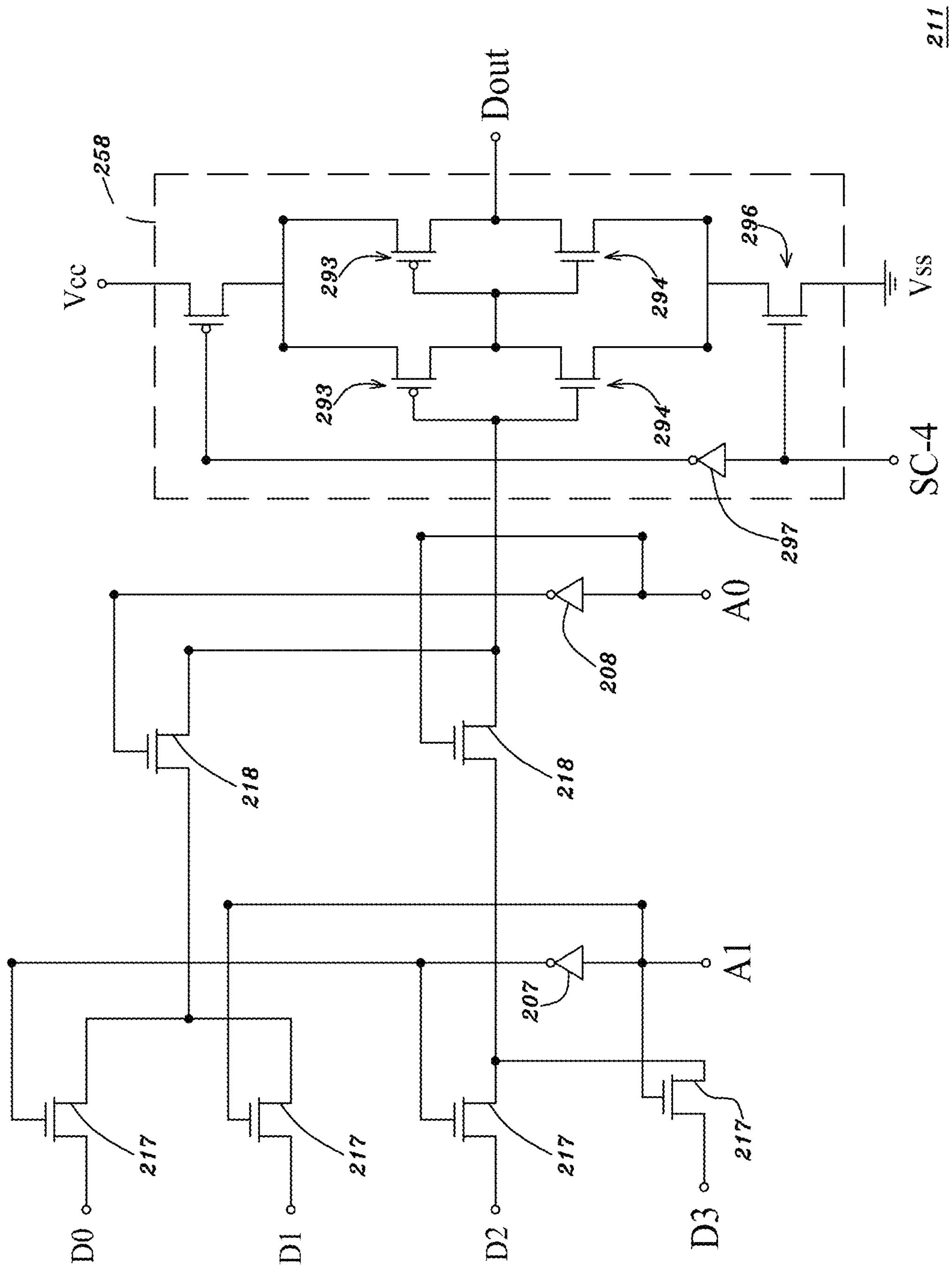

Alternatively, referring to FIGS. 4A-4G, each of the tri-state buffers 215, 216, 217 and 218 may be replaced with a transistor, such as N-type MOS transistor or P-type MOS transistor, as seen in FIGS. 4H-4L. FIGS. 4H-4L are schematic views showing circuit diagrams of multiplexers in accordance with an embodiment of the present application. For more elaboration, the first type of multiplexer 211 as seen in FIG. 4H is similar to that as seen in FIG. 4A, but the difference therebetween is that each of the tri-state buffers 215, 216, 217 and 218 is replaced with a transistor, such as N-type MOS transistor or P-type MOS transistor. The second type of multiplexer 211 as seen in FIG. 4I is similar to that as seen in FIG. 4C, but the difference therebetween is that each of the tri-state buffers 215, 216, 217 and 218 is replaced with a transistor, such as N-type MOS transistor or P-type MOS transistor. The third type of multiplexer 211 as seen in FIG. 4J is similar to that as seen in FIG. 4D, but the difference therebetween is that each of the tri-state buffers 215, 216, 217 and 218 is replaced with a transistor, such as N-type MOS transistor or P-type MOS transistor. The second type of multiplexer 211 as seen in FIG. 4K is similar to that as seen in FIG. 4F, but the difference therebetween is that each of the tri-state buffers 217 and 218 is replaced with a transistor, such as N-type MOS transistor or P-type MOS transistor. The second type of multiplexer 211 as seen in FIG. 4L is similar to that as seen in FIG. 4G, but the difference therebetween is that each of the tri-state buffers 217 and 218 is replaced with a transistor, such as N-type MOS transistor or P-type MOS transistor.

Referring to FIGS. 4H-4L, each of the transistors 215 may be configured to form a channel with an input terminal coupling to what the first input of replaced one of the tri-state buffers 215 seen in FIGS. 4A-4G couples, and an output terminal coupling to what the output of the replaced one of the tri-state buffers 215 seen in FIGS. 4A-4G couples, and may have a gate terminal coupling to what the second input of the replaced one of the tri-state buffers 215 seen in FIGS. 4A-4G couples. Each of the transistors 216 may be configured to form a channel with an input terminal coupling to what the first input of replaced one of the tri-state buffers 216 seen in FIGS. 4A-4G couples, and an output terminal coupling to what the output of the replaced one of the tri-state buffers 216 seen in FIGS. 4A-4G couples, and may have a gate terminal coupling to what the second input of the replaced one of the tri-state buffers 216 seen in FIGS. 4A-4G couples. Each of the transistors 217 may be configured to form a channel with an input terminal coupling to what the first input of replaced one of the tri-state buffers 217 seen in FIGS. 4A-4G couples, and an output terminal coupling to what the output of the replaced one of the tri-state buffers 217 seen in FIGS. 4A-4G couples, and may have a gate terminal coupling to what the second input of the replaced one of the tri-state buffers 217 seen in FIGS. 4A-4G couples. Each of the transistors 218 may be configured to form a channel with an input terminal coupling to what the first input of replaced one of the tri-state buffers 218 seen in FIGS. 4A-4G couples, and an output terminal coupling to what the output of the replaced one of the tri-state buffers 218 seen in FIGS. 4A-4G couples, and may have a gate terminal coupling to what the second input of the replaced one of the tri-state buffers 218 seen in FIGS. 4A-4G couples.

Specification for Cross-Point Switches Constructed from Multiplexers

The first and second types of cross-point switches 379 as illustrated in FIGS. 3A and 3B are fabricated from a plurality of the pass/no-pass switches 258 seen in FIGS. 2A-2F. Alternatively, cross-point switches 379 may be fabricated from either of the first through third types of multiplexers 211, mentioned as below.

(1) Third Type of Cross-Point Switch

Figure 3D:
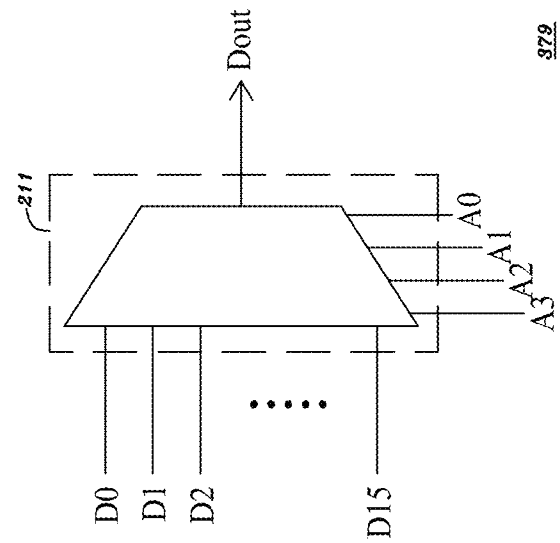
Figure 3C:
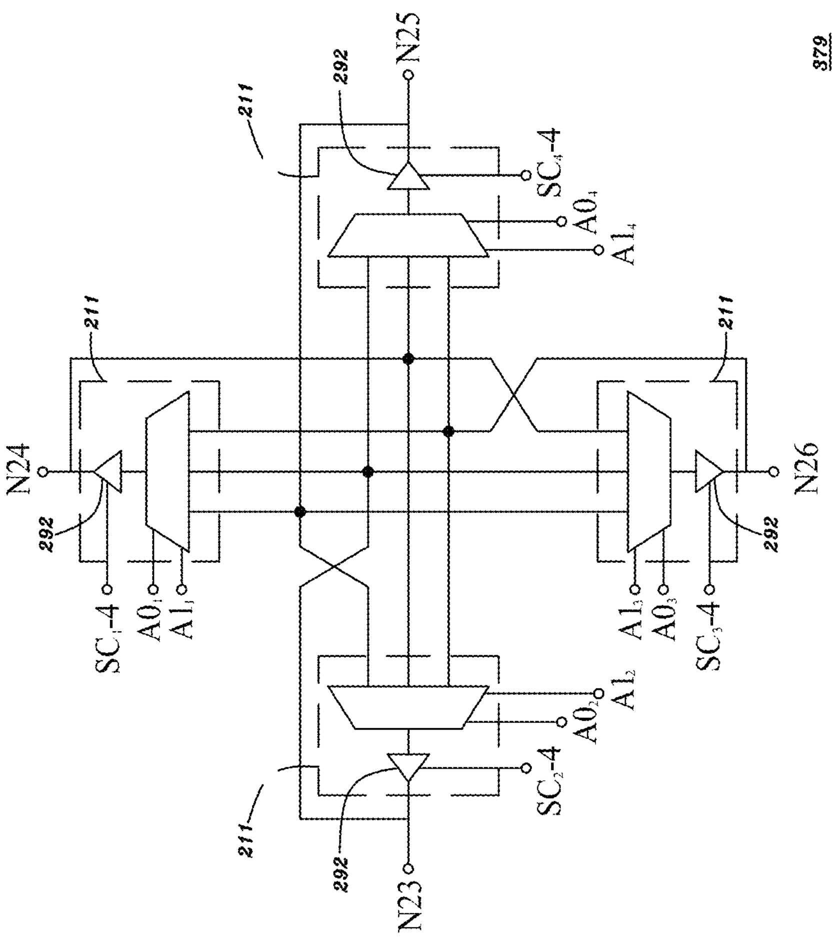

FIG. 3C is a circuit diagram illustrating a third type of cross-point switch composed of multiple multiplexers in accordance with an embodiment of the present application. Referring to FIG. 3C, the third type of cross-point switch 379 may include four multiplexers 211 of the first, second or third type as seen in FIGS. 4A-4L each having three inputs in the first set and two inputs in the second set and being configured to pass one of its three inputs in the first set into its output in accordance with a combination of its two inputs in the second set. Particularly, the second type of the multiplexer 211 employed in the third type of cross-point switch 379 may be referred to that illustrated in FIGS. 4F and 4K. Each of the three inputs D0-D2 of the first set of one of the four multiplexers 211 may couple to one of its three inputs D0-D2 of the first set of another two of the four multiplexers 211 and to an output Dout of the other one of the four multiplexers 211. Thereby, each of the four multiplexers 211 may pass one of its three inputs D0-D2 in the first set coupling to three respective metal lines extending in three different directions to the three outputs Dout of the other three of the four multiplexers 211 into its output Dout in accordance with a combination of its two inputs A0 and A1 in the second set. Each of the four multiplexers 211 may include the pass/no-pass switch or switch buffer 292 configured to be switched on or off in accordance with its input SC-4 to pass or not to pass one of its three inputs D0-D2 in the first set, passed in accordance with the second set of its inputs A0 and A1, into its output Dout. For example, the top one of the four multiplexers 211 may pass one of its three inputs in the first set coupling to the three outputs Dout at nodes N23, N26 and N25 of the left, bottom and right ones of the four multiplexers 211 into its output Dout at a node N24 in accordance with a combination of its two inputs $A0_1$ and $A1_1$ in the second set. The top one of the four multiplexers 211 may include the pass/no-pass switch or switch buffer 292 configured to be switched on or off in accordance with the second set of its input $SC_1$-4 to pass or not to pass one of its three inputs in the first set, passed in accordance with the second set of its inputs $A0_1$ and $A1_1$, into its output Dout at the node N24.

(2) Fourth Type of Cross-Point Switch

FIG. 3D is a circuit diagram illustrating a fourth type of cross-point switch composed of a multiplexer in accordance with an embodiment of the present application. Referring to FIG. 3D, the fourth type of cross-point switch 379 may be provided from any of the multiplexers 211 of the first through third types as illustrated in FIGS. 4A-4L. When the fourth type of cross-point switch 379 is provided by one of the multiplexers 211 as illustrated in FIGS. 4A, 4C, 4D and 4H-4J, it is configured to pass one of its 16 inputs D0-D15 in the first set into its output Dout in accordance with a combination of its four inputs A0-A3 in the second set.

Specification for Large I/O Circuits

Figure 5A:
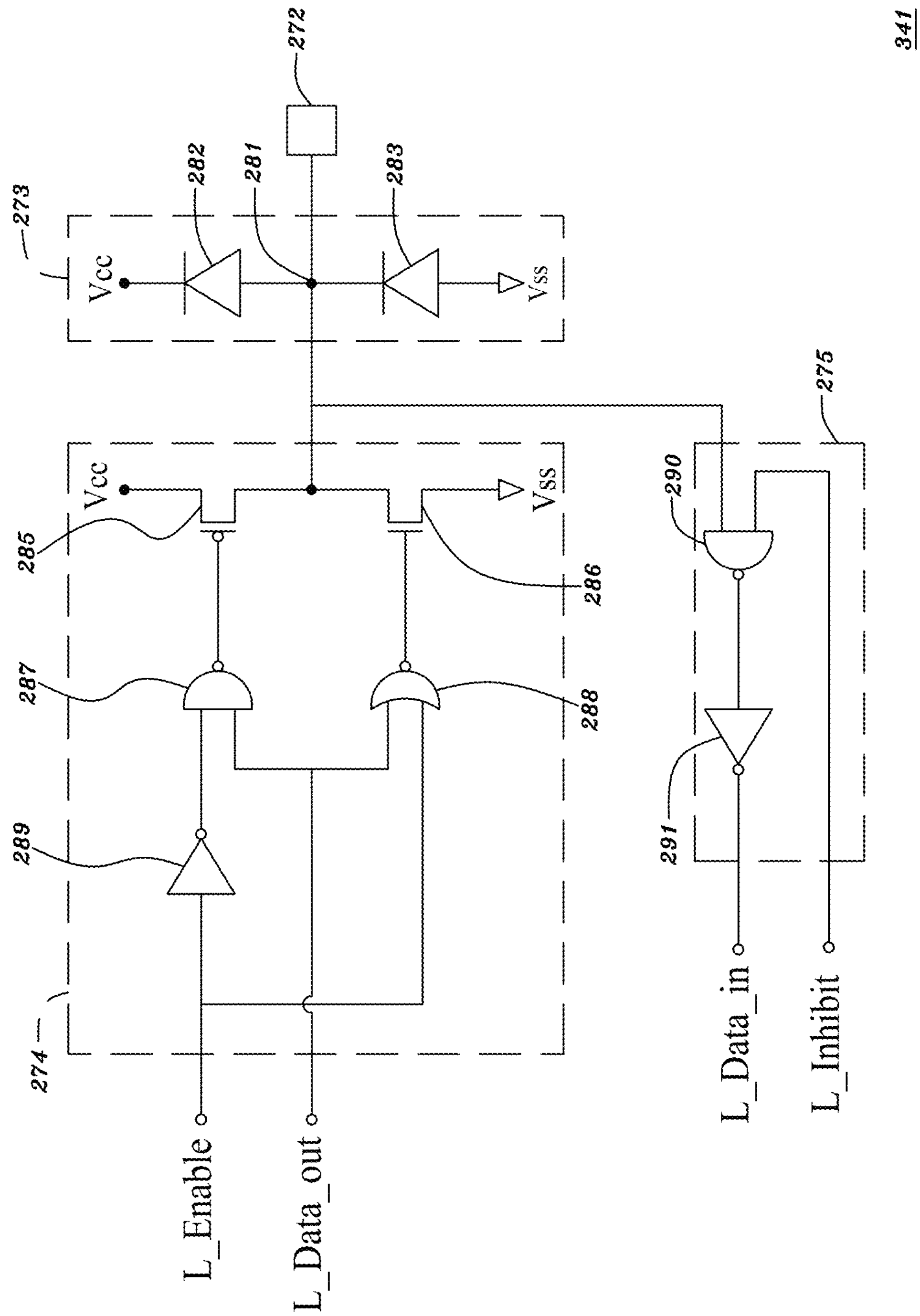
FIG. 5A is a circuit diagram of a large I/O circuit in accordance with an embodiment of the present application.

FIG. 5A is a circuit diagram of a large I/O circuit in accordance with an embodiment of the present application. Referring to FIG. 5A, a semiconductor chip may include multiple I/O pads 272 each coupling to its large ESD protection circuit or device 273, its large driver 274 and its large receiver 275. The large driver 274, large receiver 275 and large ESD protection circuit or device 273 may compose a large I/O circuit 341. The large ESD protection circuit or device 273 may include a diode 282 having a cathode coupling to the voltage Vcc of power supply and an anode coupling to a node 281 and a diode 283 having a cathode coupling to the node 281 and an anode coupling to the voltage Vss of ground reference. The node 281 couples to one of the I/O pads 272.

Referring to FIG. 5A, the large driver 274 may have a first input coupling to an L_Enable signal for enabling the large driver 274 and a second input coupling to data of L_Data_out for amplifying or driving the data of L_Data_out into its output at the node 281 to be transmitted to circuits outside the semiconductor chip through said one of the I/O pads 272. The large driver 274 may include a P-type MOS transistor 285 and N-type MOS transistor 286 both having respective drain terminals coupling to each other as its output at the node 281 and respective source terminals coupling to the voltage Vcc of power supply and to the voltage Vss of ground reference. The large driver 274 may have a NAND gate 287 having an output coupling to a gate terminal of the P-type MOS transistor 285 and a NOR gate 288 having an output coupling to a gate terminal of the N-type MOS transistor 286. The large driver 274 may include the NAND gate 287 having a first input coupling to an output of its inverter 289 and a second input coupling to the data of L_Data_out to perform a NAND operation on its first and second inputs into its output coupling to a gate terminal of its P-type MOS transistor 285. The large driver 274 may include the NOR gate 288 having a first input coupling to the data of L_Data_out and a second input coupling to the L_Enable signal to perform a NOR operation on its first and second inputs into its output coupling to a gate terminal of the N-type MOS transistor 286. The inverter 289 may be configured to invert its input coupling to the L_Enable signal into its output coupling to the first input of the NAND gate 287.

Referring to FIG. 5A, when the L_Enable signal is at a logic level of "1", the output of the NAND gate 287 is always at a logic level of "1" to turn off the P-type MOS transistor 285 and the output of the NOR gate 288 is always at a logic level of "0" to turn off the N-type MOS transistor 286. Thereby, the large driver 274 may be disabled by the L_Enable signal and the data of L_Data_out may not be passed to the output of the large driver 274 at the node 281.

Referring to FIG. 5A, the large driver 274 may be enabled when the L_Enable signal is at a logic level of "0". Meanwhile, if the data of L_Data_out is at a logic level of "0", the outputs of the NAND and NOR gates 287 and 288 are at logic level of "1" to turn off the P-type MOS transistor 285 and on the N-type MOS transistor 286, and thereby the output of the large driver 274 at the node 281 is at a logic level of "0" to be passed to said one of the I/O pads 272. If the data of L_Data_out is at a logic level of "1", the outputs of the NAND and NOR gates 287 and 288 are at logic level of "0" to turn on the P-type MOS transistor 285 and off the N-type MOS transistor 286, and thereby the output of the large driver 274 at the node 281 is at a logic level of "1" to be passed to said one of the I/O pads 272. Accordingly, the large driver 274 may be enabled by the L_Enable signal to amplify or drive the data of L_Data_out into its output at the node 281 coupling to one of the I/O pads 272.

Referring to FIG. 5A, the large receiver 275 may have a first input coupling to said one of the I/O pads 272 to be amplified or driven by the large receiver 275 into its output of L_Data_in and a second input coupling to an L_Inhibit signal to inhibit the large receiver 275 from generating its output of L_Data_in associated with data at its first input. The large receiver 275 may include a NAND gate 290 having a first input coupling to said one of the I/O pads 272 and a second input coupling to the L_Inhibit signal to perform a NAND operation on its first and second inputs into its output coupling to its inverter 291. The inverter 291 may be configured to invert its input coupling to the output of the NAND gate 290 into its output acting as the output of L_Data_in of the large receiver 275.

Referring to FIG. 5A, when the L_Inhibit signal is at a logic level of "0", the output of the NAND gate 290 is always at a logic level of "1" and the output L_Data_in of the large receiver 275 is always at a logic level of "0". Thereby, the large receiver 275 is inhibited from generating its output of L_Data_in associated with its first input at said one of the I/O pads 272.

Referring to FIG. 5A, the large receiver 275 may be activated when the L_Inhibit signal is at a logic level of "1". Meanwhile, if data from circuits outside the chip to said one of the I/O pads 272 is at a logic level of "1", the NAND gate 290 has its output at a logic level of "0", and thereby the large receiver 275 may have its output of L_Data_in at a logic level of "1". If data from circuits outside the chip to said one of the I/O pads 272 is at a logic level of "0", the NAND gate 290 has its output at a logic level of "1", and thereby the large receiver 275 may have its output of L_Data_in at a logic level of "0". Accordingly, the large receiver 275 may be activated by the L_Inhibit signal to amplify or drive data from circuits outside the chip to said one of the I/O pads 272 into its output of L_Data_in.

Referring to FIG. 5A, said one of the I/O pads 272 may have an input capacitance, provided by the large ESD protection circuit or device 273 and large receiver 275 for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF. The large driver 274 may have an output capacitance or driving capability or loading, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF. The size of the large ESD protection circuit or device 273 may be between 0.5 pF and 20 pF, 0.5 pF and 15 pF, 0.5 pF and 10 pF 0.5 pF and 5 pF or 0.5 pF and 2 pF, or larger than 0.5 pF, 1 pF, 2 pF, 3 pF, 5 pF or 10 pF.

Specification for Small I/O Circuits

Figure 5B:
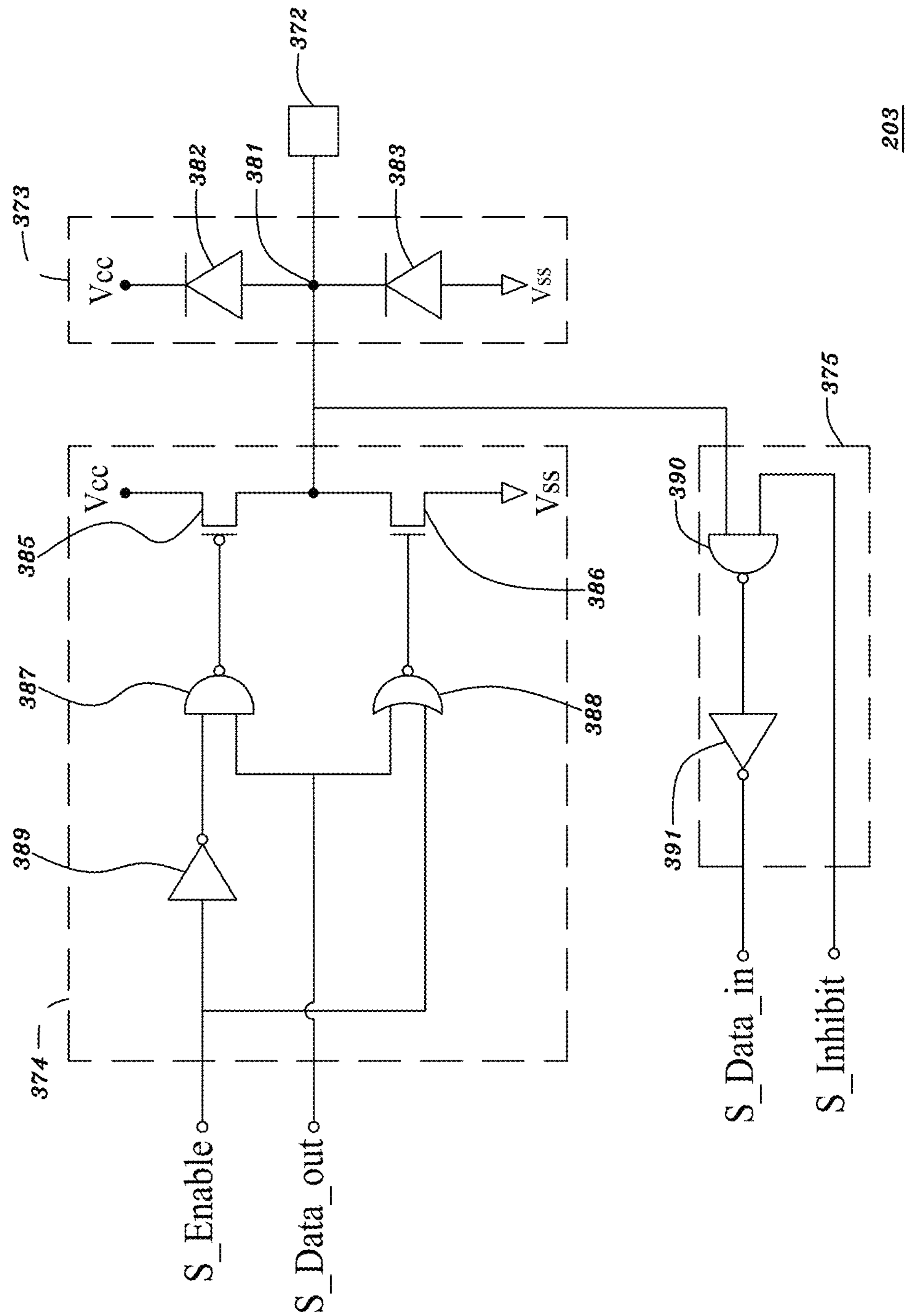
FIG. 5B is a circuit diagram of a small I/O circuit in accordance with an embodiment of the present application.

FIG. 5B is a circuit diagram of a small I/O circuit in accordance with an embodiment of the present application. Referring to FIG. 5B, a semiconductor chip may include multiple I/O pads 372 each coupling to its small ESD protection circuit or device 373, its small driver 374 and its small receiver 375. The small driver 374, small receiver 375 and small ESD protection circuit or device 373 may compose a small I/O circuit 203. The small ESD protection circuit or device 373 may include a diode 382 having a cathode coupling to the voltage Vcc of power supply and an anode coupling to a node 381 and a diode 383 having a cathode coupling to the node 381 and an anode coupling to the voltage Vss of ground reference. The node 381 couples to one of the I/O pads 372.

Referring to FIG. 5B, the small driver 374 may have a first input coupling to an S_Enable signal for enabling the small driver 374 and a second input coupling to data of S_Data_out for amplifying or driving the data of S_Data_out into its output at the node 381 to be transmitted to circuits outside the semiconductor chip through said one of the I/O pads 372. The small driver 374 may include a P-type MOS transistor 385 and N-type MOS transistor 386 both having respective drain terminals coupling to each other as its output at the node 381 and respective source terminals coupling to the voltage Vcc of power supply and to the voltage Vss of ground reference. The small driver 374 may have a NAND gate 387 having an output coupling to a gate terminal of the P-type MOS transistor 385 and a NOR gate 388 having an output coupling to a gate terminal of the N-type MOS transistor 386. The small driver 374 may include the NAND gate 387 having a first input coupling to an output of its inverter 389 and a second input coupling to the data of S_Data_out to perform a NAND operation on its first and second inputs into its output coupling to a gate terminal of its P-type MOS transistor 385. The small driver 374 may include the NOR gate 388 having a first input coupling to the data of S_Data_out and a second input coupling to the S_Enable signal to perform a NOR operation on its first and second inputs into its output coupling to a gate terminal of the N-type MOS transistor 386. The inverter 389 may be configured to invert its input coupling to the S_Enable signal into its output coupling to the first input of the NAND gate 387.

Referring to FIG. 5B, when the S_Enable signal is at a logic level of "1", the output of the NAND gate 387 is always at a logic level of "1" to turn off the P-type MOS transistor 385 and the output of the NOR gate 388 is always at a logic level of "0" to turn off the N-type MOS transistor 386. Thereby, the small driver 374 may be disabled by the S_Enable signal and the data of S_Data_out may not be passed to the output of the small driver 374 at the node 381.

Referring to FIG. 5B, the small driver 374 may be enabled when the S_Enable signal is at a logic level of "0". Meanwhile, if the data of S_Data_out is at a logic level of "0", the outputs of the NAND and NOR gates 387 and 388 are at logic level of "1" to turn off the P-type MOS transistor 385 and on the N-type MOS transistor 386, and thereby the output of the small driver 374 at the node 381 is at a logic level of "0" to be passed to said one of the I/O pads 372. If the data of S_Data_out is at a logic level of "1", the outputs of the NAND and NOR gates 387 and 388 are at logic level of "0" to turn on the P-type MOS transistor 385 and off the N-type MOS transistor 386, and thereby the output of the small driver 374 at the node 381 is at a logic level of "1" to be passed to said one of the I/O pads 372. Accordingly, the small driver 374 may be enabled by the S_Enable signal to amplify or drive the data of S_Data_out into its output at the node 381 coupling to one of the I/O pads 372.

Referring to FIG. 5B, the small receiver 375 may have a first input coupling to said one of the I/O pads 372 to be amplified or driven by the small receiver 375 into its output of S_Data_in and a second input coupling to an S_Inhibit signal to inhibit the small receiver 375 from generating its output of S_Data_in associated with its first input. The small receiver 375 may include a NAND gate 390 having a first input coupling to said one of the I/O pads 372 and a second input coupling to the S_Inhibit signal to perform a NAND operation on its first and second inputs into its output coupling to its inverter 391. The inverter 391 may be configured to invert its input coupling to the output of the NAND gate 390 into its output acting as the output of S_Data_in of the small receiver 375.

Referring to FIG. 5B, when the S_Inhibit signal is at a logic level of "0", the output of the NAND gate 390 is always at a logic level of "1" and the output S_Data_in of the small receiver 375 is always at a logic level of "0". Thereby, the small receiver 375 is inhibited from generating its output of S_Data_in associated with its first input at said one of the I/O pads 372.

Referring to FIG. 5B, the small receiver 375 may be activated when the S_Inhibit signal is at a logic level of "1". Meanwhile, if data from circuits outside the semiconductor chip to said one of the I/O pads 372 is at a logic level of "1", the NAND gate 390 has its output at a logic level of "0", and thereby the small receiver 375 may have its output of S_Data_in at a logic level of "1". If data from circuits outside the chip to said one of the I/O pads 372 is at a logic level of "0", the NAND gate 390 has its output at a logic level of "1", and thereby the small receiver 375 may have its output of S_Data_in at a logic level of "0". Accordingly, the small receiver 375 may be activated by the S_Inhibit signal to amplify or drive data from circuits outside the chip to said one of the I/O pads 372 into its output of S_Data_in.

Referring to FIG. 5B, said one of the I/O pads 372 may have an input capacitance, provided by the small ESD protection circuit or device 373 and small receiver 375 for example, between 0.05 pF and 2 pF or between 0.05 pF and 1 pF, or smaller than 2 pF or 1 pF. The small driver 374 may have an output capacitance or driving capability or loading, for example, between 0.05 pF and 2 pF or between 0.05 pF and 1 pF, or smaller than 2 pF or 1 pF. The size of the small ESD protection circuit or device 373 may be between 0.05 pF and 2 pF or 0.05 pF and 1 pF; or smaller than 2 pF or 1 pF.

Specification for Programmable Logic Blocks

FIG. 6A is a schematic view showing a block diagram of a programmable logic block in accordance with an embodiment of the present application. Referring to FIG. 6A, a programmable logic block (LB) 201 may be of various types, including a look-up table (LUT) 210 and a multiplexer 211 having its first set of inputs, e.g., D0-D15 as illustrated in FIG. 4A, 4C, 4D or 4H-4J or D0-D255 as illustrated in FIG. 4E, each coupling to one of resulting values or programming codes stored in the look-up table (LUT) 210 and its second set of inputs, e.g., four-digit inputs of A0-A3 as illustrated in FIG. 4A, 4C, 4D or 4H-4J or eight-digit inputs of A0-A7 as illustrated in FIG. 4E, configured to determine one of the inputs in its first set into its output, e.g., Dout as illustrated in FIG. 4A, 4C-4E or 4H-4J, acting as an output of the programmable logic block (LB) 201. The inputs, e.g., A0-A3 as illustrated in FIG. 4A, 4C, 4D or 4H-4J or A0-A7 as illustrated in FIG. 4E, of the second set of the multiplexer 211 may act as inputs of the programmable logic block (LB) 201.

Referring to FIG. 6A, the look-up table (LUT) 210 of the programmable logic block (LB) 201 may be composed of multiple memory cells 490 each configured to save or store one of the resulting values, i.e., programming codes. Each of the memory cells 490 may be referred to one 398 as illustrated in FIG. 1A or 1B. Its multiplexer 211 may have its first set of inputs, e.g., D0-D15 as illustrated in FIG. 4A, 4C, 4D or 4H-4J or D0-D255 as illustrated in FIG. 4E, each coupling to one of the outputs of one of the memory cells 490, i.e., one of the outputs Out1 and Out2 of the memory cell 398, for the look-up table (LUT) 210. Thus, each of the resulting values or programming codes stored in the respective memory cells 490 may couple to one of the inputs of the first set of the multiplexer 211 of the programmable logic block (LB) 201.

Furthermore, the programmable logic block (LB) 201 may be composed of another memory cell 490 configured to save or store a programming code, wherein the another memory cell 490 may have an output coupling to the input SC-4 of the multi-stage tri-state buffer 292 as seen in FIG. 4C, 4D, 4I or 4J of the multiplexer 211 of the second or third type for the programmable logic block (LB) 201. Each of the another memory cells 490 may be referred to one 398 as illustrated in FIG. 1A or IB. For its multiplexer 211 of the second or third type as seen in FIG. 4C, 4D, 4I or 4J for the programmable logic block (LB) 201, its multi-stage tri-state buffer 292 may have the input SC-4 coupling to one of the outputs Out1 and Out2 of one of the another memory cells 398 as illustrated in FIG. 1A or lB configured to save or store a programming code to switch on or off it. Alternatively, for the multiplexer 211 of the second or third type as seen in FIG. 4C, 4D, 4I or 4J for the programmable logic block (LB) 201, its multi-stage tri-state buffer 292 may be provided with the control P-type and N-type MOS transistors 295 and 296 having gate terminals coupling respectively to the outputs Out1 and Out2 of one of the another memory cells 398 as illustrated in FIG. 1A or 1B configured to save or store a programming code to switch on or off it, wherein its inverter 297 as seen in FIG. 4C, 4D, 4I or 4J may be removed from it.

The programmable logic block 201 may include the look-up table 210 that may be programed to store or save the resulting values or programing codes for logic operation or Boolean operation, such as AND, NAND, OR, NOR or EXOR operation or an operation combining the two or more of the above operations. For example, the look-up table 210 may be programed to lead the programmable logic block 201 to achieve the same logic operation as a logic operator, i.e., OR operator or gate, as shown in FIG. 6B performs. For this case, the programmable logic block 201 may have two inputs, e.g., A0 and A1, and an output, e.g., Dout. FIG. 6C shows a truth table for an OR operator. The look-up table 210 may carry out logic functions based on the truth table. Referring to FIG. 6C, the look-up table 210 records or stores each of four resulting values or programming codes of the OR operator as illustrated in FIG. 6B that are generated respectively in accordance with four combinations of its inputs A0 and A1. The look-up table 210 may be programmed with the four resulting values or programming codes respectively stored in the four memory cells 490, each of which may be referred to one 398 as illustrated in FIG. 1A or lB having its output Out1 or Out2 coupling to one of the four inputs D0-D3 of the first set of the multiplexer 211, as illustrated in FIG. 4G or 4L, for the programmable logic block (LB) 201. The multiplexer 211 may be configured to determine one of its four inputs, e.g., D0-D3, of the first set into its output, e.g., Dout as illustrated in FIG. 4G or 4L, in accordance with one of the combinations of its inputs A0 and A1 of the second set. The output Dout of the multiplexer 211 as seen in FIG. 6A may act as the output of the programmable logic block (LB) 201.

For example, the look-up table 210 may be programed to lead the programmable logic block 201 to achieve the same logic operation as a logic operator, i.e., NAND gate or operator, as shown in FIG. 6D performs. For this case, the programmable logic block 201 may have two inputs, e.g., A0 and A1, and an output, e.g., Dout. FIG. 6E shows a truth table for a NAND operator. Referring to FIG. 6E, the look-up table 210 records or stores each of four resulting values or programming codes of the NAND operator as illustrated in FIG. 6D that are generated respectively in accordance with four combinations of its inputs A0 and A1. The look-up table 210 may be programmed with the four resulting values or programming codes respectively stored in the four memory cells 490, each of which may be referred to one 398 as illustrated in FIG. 1A or 1B having its output Out1 or Out2 coupling to one of the four inputs D0-D3 of the first set of the multiplexer 211, as illustrated in FIG. 4G or 4L, for the programmable logic block (LB) 201. The multiplexer 211 may be configured to determine one of its four inputs, e.g., D0-D3, of the first set into its output, e.g., Dout as illustrated in FIG. 4G or 4L, in accordance with one of the combinations of its inputs A0 and A1 of the second set. The output Dout of the multiplexer 211 as seen in FIG. 6A may act as the output of the programmable logic block (LB) 201.

For example, the look-up table 210 may be programed to lead the programmable logic block 201 to achieve the same logic operation as a logic operator as shown in FIG. 6F performs. Referring to FIG. 6F, the logic operator may be provided with an AND gate 212 and NAND gate 213 arranged in parallel, wherein the AND gate 212 is configured to perform an AND operation on its two inputs X0 and X1, i.e. two inputs of the logic operator, into its output and the NAND gate 213 is configured to perform an NAND operation on its two inputs X2 and X3, i.e. the other two inputs of the logic operator, into its output, and with an NAND gate 214 having two inputs coupling to the outputs of the AND gate 212 and NAND gate 213 respectively. The NAND gate 214 is configured to perform an NAND operation on its two inputs into its output Y acting as an output of the logic operator. The programmable logic block (LB) 201 as seen in FIG. 6A may achieve the same logic operation as the logic operator as illustrated in FIG. 6F performs. For this case, the programmable logic block 201 may have four inputs, e.g., A0-A3, a first one A0 of which may be equivalent to the input X0, a second one A1 of which may be equivalent to the input X1, a third one A2 of which may be equivalent to the input X2, and a fourth one A3 of which may be equivalent to the input X3. The programmable logic block 201 may have an output, e.g., Dout, which may be equivalent to the output Y of the logic operator.

FIG. 6G shows the look-up table 210 configured for achieving the same logic operation as the logic operator as illustrated in FIG. 6F performs. Referring to FIG. 6G, the look-up table 210 records or stores each of sixteen resulting values or programming codes of the logic operator as illustrated in FIG. 6F that are generated respectively in accordance with sixteen combinations of its inputs X0-X3. The look-up table 210 may be programmed with the sixteen resulting values or programming codes respectively stored in the sixteen memory cells 490, each of which may be referred to one 398 as illustrated in FIG. 1A or lB having its output Out1 or Out2 coupling to one of the sixteen inputs D0-D15 of the first set of the multiplexer 211, as illustrated in FIG. 4A, 4C, 4D or 4H-4J, for the programmable logic block (LB) 201. The multiplexer 211 may be configured to determine one of its sixteen inputs, e.g., D0-D15, of the first set into its output, e.g., Dout as illustrated in FIG. 4A, 4C, 4D or 4H-4J, in accordance with one of the combinations of its inputs A0-A3 of the second set. The output Dout of the multiplexer 211 as seen in FIG. 6A may act as the output of the programmable logic block (LB) 201.

Alternatively, the programmable logic block 201 may be substituted with multiple programmable logic gates to be programmed to perform logic operation or Boolean operation as illustrated in FIG. 6B, 6D or 6F.

Figure 6H:
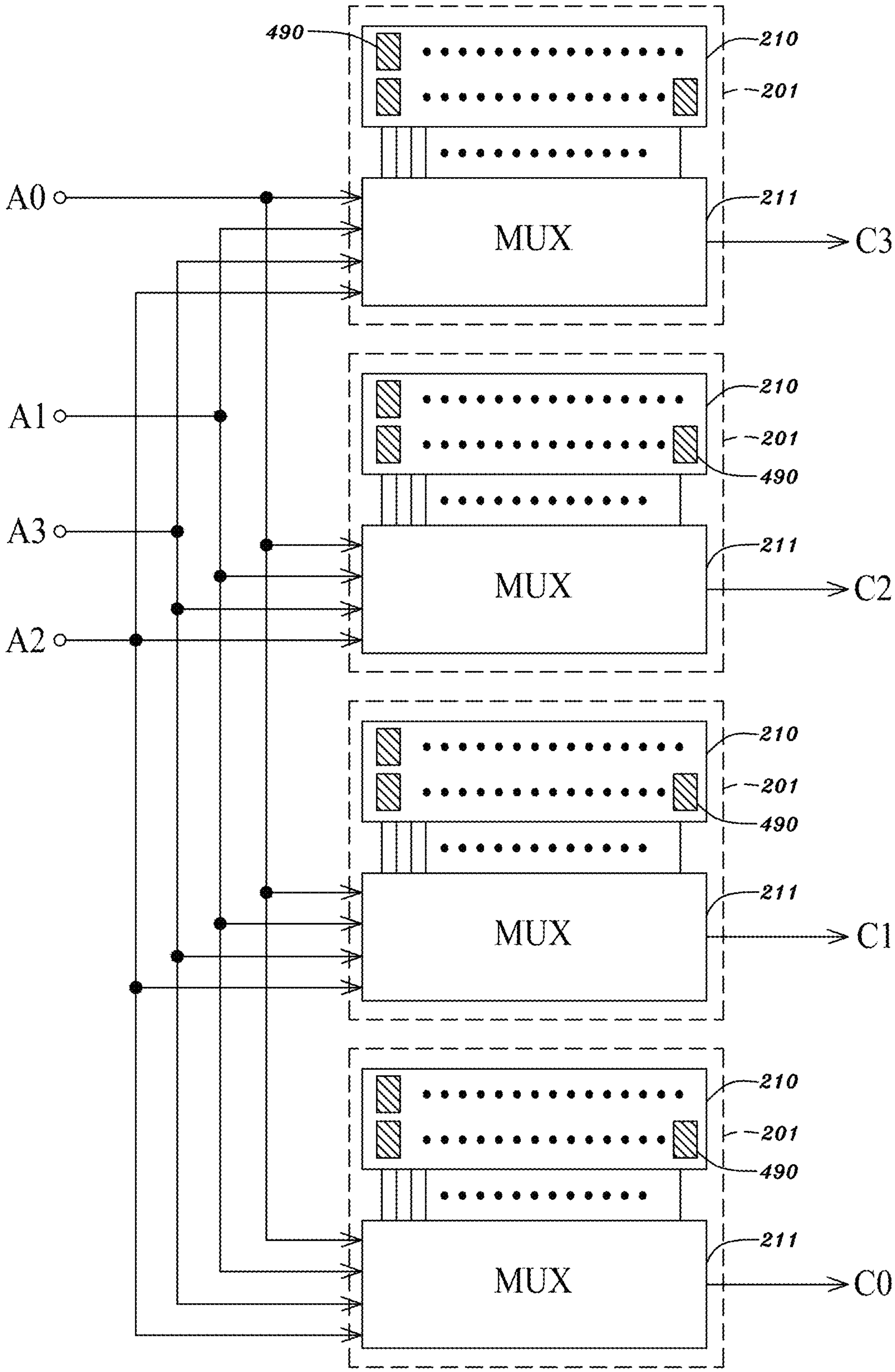
FIG. 6H is a block diagram illustrating a computation operator in accordance with an embodiment of the present application.

Alternatively, a plurality of the programmable logic block 201 may be programed to be integrated into a computation operator to perform computation operation, such as addition, subtraction, multiplication or division operation. The computation operator may be an adder, a multiplier, a multiplexer, a shift register, floating-point circuits and/or division circuits. FIG. 6H is a block diagram illustrating a computation operator in accordance with an embodiment of the present application. For example, the computation operator as seen in FIG. 6H may be configured to multiply two two-binary-digit numbers, i.e., [A1, A0] and [A3, A2], into a four-binary-digit output, i.e., [C3, C2, C1, C0], as seen in FIG. 6I. Referring to FIG. 6H, Four programmable logic blocks 201, each of which may be referred to one as illustrated in FIG. 6A, may be programed to be integrated into the computation operator. The computation operator may have its four inputs [A1, A0, A3, A2] coupling respectively to the four inputs of each of the four programmable logic blocks 201. Each of the programmable logic blocks 201 of the computation operator may generate one of the four binary digits, i.e., C0-C3, based on a combination of its inputs [A1, A0, A3, A2]. In the multiplication of the two-binary-digit number, i.e., [A1, A0], by the two-binary-digit number, i.e., [A3, A2], the four programmable logic blocks 201 may generate their four respective outputs, i.e., the four binary digits C0-C3, based on a common combination of their inputs [A1, A0, A3, A2]. The four programmable logic blocks 201 may be programed with four respective look-up tables 210, i.e., Table-0, Table-1, Table-2 and Table-3.

For example, referring to FIGS. 6A, 6H and 6I, multiple of the memory cells 490, each of which may be referred to one 398 as illustrated in FIG. 1A or 1B, may be composed for each of the four look-up tables 210, i.e., Table-0, Table-1, Table-2 and Table-3, and each of the memory cells 490 for said each of the four look-up tables may be configured to store one of the resulting values, i.e., programming codes, for one of the four binary digits C0-C3. A first one of the four programmable logic blocks 201 may have its multiplexer 211 provided with its first set of inputs, e.g., D0-D15, each coupling to one of the outputs Out1 and Out2 of one of the memory cells 490 for the look-up table (LUT) of Table-0 and its second set of inputs, e.g., A0-A3, configured to determine one of its inputs, e.g., D0-D15, of the first set into its output, e.g., Dout, acting as an output C0 of the first one of the programmable logic block (LB) 201. A second one of the four programmable logic blocks 201 may have its multiplexer 211 provided with its first set of inputs, e.g., D0-D15, each coupling to one of the outputs Out1 and Out2 of one of the memory cells 490 for the look-up table (LUT) of Table-1 and its second set of inputs, e.g., A0-A3, configured to determine one of its inputs, e.g., D0-D15, of the first set into its output, e.g., Dout, acting as an output C1 of the second one of the programmable logic block (LB) 201. A third one of the four programmable logic blocks 201 may have its multiplexer 211 provided with its first set of inputs, e.g., D0-D15, each coupling to one of the outputs Out1 and Out2 of one of the memory cells 490 for the look-up table (LUT) of Table-2 and its second set of inputs, e.g., A0-A3, configured to determine one of its inputs, e.g., D0-D15, of the first set into its output, e.g., Dout, acting as an output C2 of the third one of the programmable logic block (LB) 201. A fourth one of the four programmable logic blocks 201 may have its multiplexer 211 provided with its first set of inputs, e.g., D0-D15, each coupling to one of the outputs Out1 and Out2 of one of the memory cells 490 for the look-up table (LUT) of Table-3 and its second set of inputs, e.g., A0-A3, configured to determine one of its inputs, e.g., D0-D15, of the first set into its output, e.g., Dout, acting as an output C3 of the fourth one of the programmable logic block (LB) 201.

Thereby, referring to FIGS. 6H and 6I, the four programmable logic blocks 201 composing the computation operator may generate their four respective outputs, i.e., the four binary digits C0-C3, based on a common combination of their inputs [A1, A0, A3, A2]. In this case, the inputs A0-A3 of the four programmable logic blocks 201 may act as inputs of the computation operator and the outputs C0-C3 of the four programmable logic blocks 201 may act as an output of the computation operator. The computation operator may generate a four-binary-digit output, i.e., [C3, C2, C1, C0], based on a combination of its four-binary-digit input, i.e., [A1, A0, A3, A2].

Referring to FIGS. 6H and 6I, in a particular case for multiplication of 3 by 3, each of the four programmable logic blocks 201 may have a combination of its inputs, i.e., [A1, A0, A3, A2]=[1, 1, 1, 1], to determine one of the four binary digits, i.e., [C3, C2, C1, C0]=[1, 0, 0, 1]. The first one of the four programmable logic blocks 201 may generate the binary digit C0 at a logic level of “1” based on the combination of its inputs, i.e., [A1, A0, A3, A2]=[1, 1, 1, 1]; the second one of the four programmable logic blocks 201 may generate the binary digit C1 at a logic level of “0” based on the combination of its inputs, i.e., [A1, A0, A3, A2]=[1, 1, 1, 1]; the third one of the four programmable logic blocks 201 may generate the binary digit C2 at a logic level of “0” based on the combination of its inputs, i.e., [A1, A0, A3, A2]=[1, 1, 1, 1]; the fourth one of the four programmable logic blocks 201 may generate the binary digit C3 at a logic level of “1” based on the combination for its inputs, i.e., [A1, A0, A3, A2]=[1, 1, 1, 1].

Figure 6J:
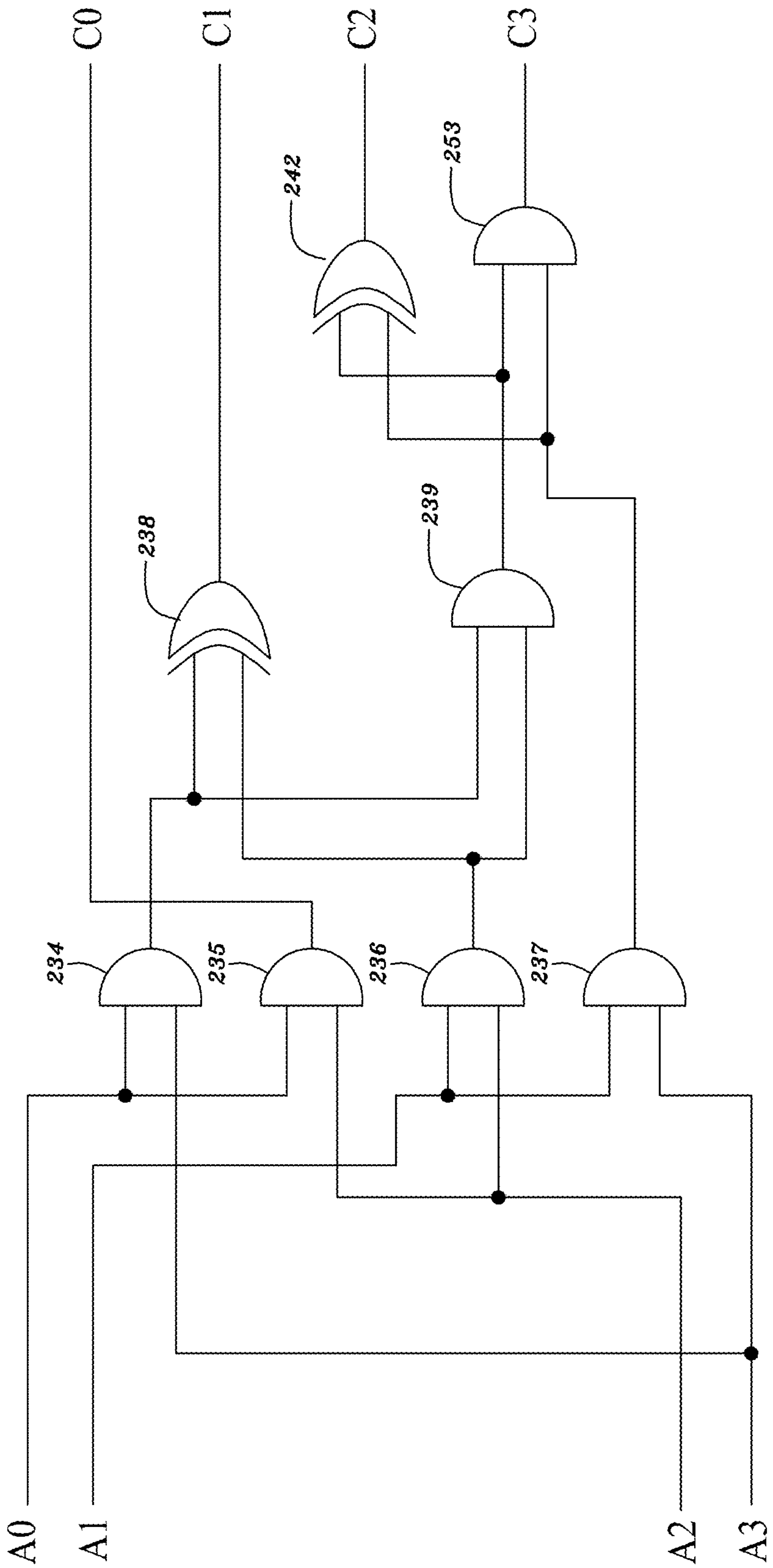
FIG. 6J is a circuit diagram of a computation operator in accordance with an embodiment of the present application.

Alternatively, the four programmable logic blocks 201 may be substituted with multiple programmable logic gates as illustrated in FIG. 6J to be programmed for a computation operator performing the same computation operation as the four programmable logic blocks 201. Referring to FIG. 6J, the computation operator may be programed to perform multiplication on two numbers each expressed by two binary digits, e.g., [A1, A0] and [A3, A2] as illustrated in FIGS. 6H and 6I, into a four-binary-digit output, e.g., [C3, C2, C1, C0] as illustrated in FIGS. 6H and 6I. The computation operator may be programed with an AND gate 234 configured to perform AND operation on its two inputs respectively at the inputs A0 and A3 of the computation operator into its output. The programmable logic gates may be programed with an AND gate 235 configured to perform AND operation on its two inputs respectively at the inputs A0 and A2 of the computation operator into its output acting as the output C0 of the computation operator. The computation operator may be programed with an AND gate 236 configured to perform AND operation on its two inputs respectively at the inputs A1 and A2 of the computation operator into its output. The computation operator may be programed with an AND gate 237 configured to perform AND operation on its two inputs respectively at the inputs A1 and A3 of the computation operator into its output. The computation operator may be programed with an ExOR gate 238 configured to perform Exclusive-OR operation on its two inputs coupling respectively to the outputs of the AND gates 234 and 236 into its output acting as the output C1 of the computation operator. The computation operator may be programed with an AND gate 239 configured to perform AND operation on its two inputs coupling respectively to the outputs of the AND gates 234 and 236 into its output. The computation operator may be programed with an ExOR gate 242 configured to perform Exclusive-OR operation on its two inputs coupling respectively to the outputs of the AND gates 239 and 237 into its output acting as the output C2 of the computation operator. The computation operator may be programed with an AND gate 253 configured to perform AND operation on its two inputs coupling respectively to the outputs of the AND gates 239 and 237 into its output acting as the output C3 of the computation operator.

To sum up, the programmable logic block 201 may be provided with the memory cells 490, having the number of 2 to the power of n, for the look-up table 210 to be programed respectively to store the resulting values or programming codes, having the number of 2 to the power of n, for each combination of its inputs having the number of n. For example, the number of n may be any integer greater than or equal to 2, such as between 2 and 64. For the example as illustrated in FIGS. 6A, 6G, 6H and 6I, each of the programmable logic blocks 201 may be provided with its inputs having the number of n equal to 4, and thus the number of resulting values or programming codes for all combinations of its inputs is 16, i.e., the number of 2 to the power of n equal to 4.

Accordingly, the programmable logic blocks (LB) 201 as seen in FIG. 6A may perform logic operation on its inputs into its output, wherein the logic operation may include Boolean operation such as AND, NAND, OR or NOR operation. Besides, the programmable logic blocks (LB) 201 as seen in FIG. 6A may perform computation operation on its inputs into its output, wherein the computation operation may include addition, subtraction, multiplication or division operation.

Specification for Programmable Interconnect

Figure 7A:
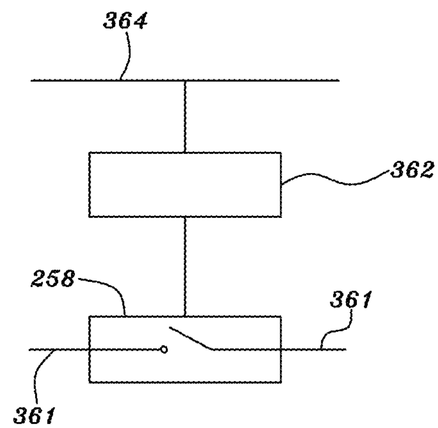
FIGS. 7A-7C are block diagrams illustrating programmable interconnects programmed by a pass/no-pass switch or cross-point switch in accordance with an embodiment of the present application.

FIG. 7A is a block diagram illustrating a programmable interconnect programmed by a pass/no-pass switch in accordance with an embodiment of the present application. Referring to FIG. 7A, two programmable interconnects 361 may be controlled, by the pass/no-pass switch 258 of either of the first through sixth types as seen in FIGS. 2A-2F, to couple to each other. One of the programmable interconnects 361 may couple to the node N21 of the pass/no-pass switch 258, and another of the programmable interconnects 361 may couple to the node N22 of the pass/no-pass switch 258. Accordingly, the pass/no-pass switch 258 may be switched on to connect said one of the programmable interconnects 361 to said another of the programmable interconnects 361; the pass/no-pass switch 258 may be switched off to disconnect said one of the programmable interconnects 361 from said another of the programmable interconnects 361.

Referring to FIG. 7A, a memory cell 362 may couple to the pass/no-pass switch 258 via a fixed interconnect 364, i.e., non-programmable interconnect, to turn on or off the pass/no-pass switch 258, wherein the memory cell 362 may be referred to one 398 as illustrated in FIG. 1A or 1B. For the first type of pass/no-pass switch 258 as illustrated in FIG. 2A used to program the programmable interconnects 361, the first type of pass/no-pass switch 258 may have its nodes SC-1 and SC-2 coupling to two inverted outputs of the memory cell 362, which may be referred to the two outputs Out1 and Out2 of the memory cell 398, and accordingly receiving the two inverted outputs of the memory cell 362 associated with the programming code stored or saved in the memory cell 362 to switch on or off the first type of pass/no-pass switch 258 to couple or decouple two of the programmable interconnects 361 coupling to the two nodes N21 and N22 of the pass/no-pass switch 258 of the first type respectively.

For the second type of pass/no-pass switch 258 as illustrated in FIG. 2B used to program the programmable interconnects 361, the second type of pass/no-pass switch 258 may have its node SC-3 coupling to an output of the memory cell 362, which may be referred to the output Out1 or Out2 of the memory cell 398, and accordingly receiving the output of the memory cell 362 associated with the programming code stored or saved in the memory cell 362 to switch on or off the second type of pass/no-pass switch 258 to couple or decouple two of the programmable interconnects 361 coupling to the two nodes N21 and N22 of the pass/no-pass switch 258 of the second type respectively.

For the third or fourth type of pass/no-pass switch 258 as illustrated in FIG. 2C or 2D used to program the programmable interconnects 361, the third or fourth type of pass/no-pass switch 258 may have its node SC-4 coupling to an output of the memory cell 362, which may be referred to the output Out1 or Out2 of the memory cell 398, and accordingly receiving the output of the memory cell 362 associated with the programming code stored or saved in the memory cell 362 to switch on or off the third or fourth type of pass/no-pass switch 258 to couple or decouple two of the programmable interconnects 361 coupling to the two nodes N21 and N22 of the pass/no-pass switch 258 of the third or fourth type respectively. Alternatively, its control P-type and N-type MOS transistors 295 and 296 may have gate terminals coupling respectively to two inverted outputs of the memory cell 362, which may be referred to the two outputs Out1 and Out2 of the memory cell 398, and accordingly receiving the two inverted outputs of the memory cell 362 associated with the programming code stored or saved in the memory cell 362 to switch on or off the third or fourth type of pass/no-pass switch 258 to couple or decouple two of the programmable interconnects 361 coupling to the two nodes N21 and N22 of the pass/no-pass switch 258 of the third or fourth type respectively, wherein its inverter 297 may be removed from the pass/no-pass switch 258 of the third or fourth type.

For the fifth or sixth type of pass/no-pass switch 258 as illustrated in FIG. 2E or 2F used to program the programmable interconnects 361, the fifth or sixth type of pass/no-pass switch 258 may have its nodes SC-5 and SC-6 coupling to two outputs of the two respective memory cells 362, each of which may be referred to the output Out1 or Out2 of the memory cell 398, and accordingly receiving the two outputs of the two respective memory cells 362 associated with two programming codes stored or saved in the two memory cells 362 respectively to switch on or off the fifth or sixth type of pass/no-pass switch 258 to couple or decouple two of the programmable interconnects 361 coupling to the two nodes N21 and N22 of the pass/no-pass switch 258 of the fifth or sixth type respectively. Alternatively, (1) its control P-type and N-type MOS transistors 295 and 296 at its left side may have gate terminals coupling respectively to two inverted outputs of one of the two memory cells 362, which may be referred to the two outputs Out1 and Out2 of the memory cell 398, and accordingly receiving the two inverted outputs of said one of the two memory cells 362 associated with the programming code stored or saved in said one of the two memory cells 362, and (2) its control P-type and N-type MOS transistors 295 and 296 at its right side may have gate terminals coupling respectively to two inverted outputs of the other of the two memory cells 362, which may be referred to the two outputs Out1 and Out2 of the memory cell 398, and accordingly receiving the two inverted outputs of said the other of the two memory cells 362 associated with the programming code stored or saved in said the other of the two memory cells 362, to switch on or off the fifth or sixth type of pass/no-pass switch 258 to couple or decouple two of the programmable interconnects 361 coupling to the two nodes N21 and N22 of the pass/no-pass switch 258 of the fifth or sixth type respectively, wherein its inverters 297 may be removed from the pass/no-pass switch 258 of the fifth or sixth type.

Before the memory cell(s) 362 are programmed or when the memory cell(s) 362 are being programmed, the programmable interconnects 361 may not be used for signal transmission. The memory cell(s) 362 may be programmed to have the pass/no-pass switch 258 switched on to couple the programmable interconnects 361 for signal transmission or to have the pass/no-pass switch 258 switched off to decouple the programmable interconnects 361. Similarly, each of the first and second types of cross-point switches 379 as seen in FIGS. 3A and 3B may be composed of a plurality of the pass/no-pass switch 258 of any type, wherein each of the pass/no-pass switches 258 may have the node(s) (SC-1 and SC-2), SC-3, SC-4 or (SC-5 and SC-6) coupling to the output(s) of the memory cell(s) 362 as mentioned above, and accordingly receiving the output(s) of the memory cell(s) 362 associated with the programming code(s) stored or saved in the memory cell(s) 362 to switch on or off said each of the pass/no-pass switches 258 to couple or decouple two of the programmable interconnects 361 coupling to the two nodes N21 and N22 of said each of the pass/no-pass switches 258 respectively.

Figure 7B:
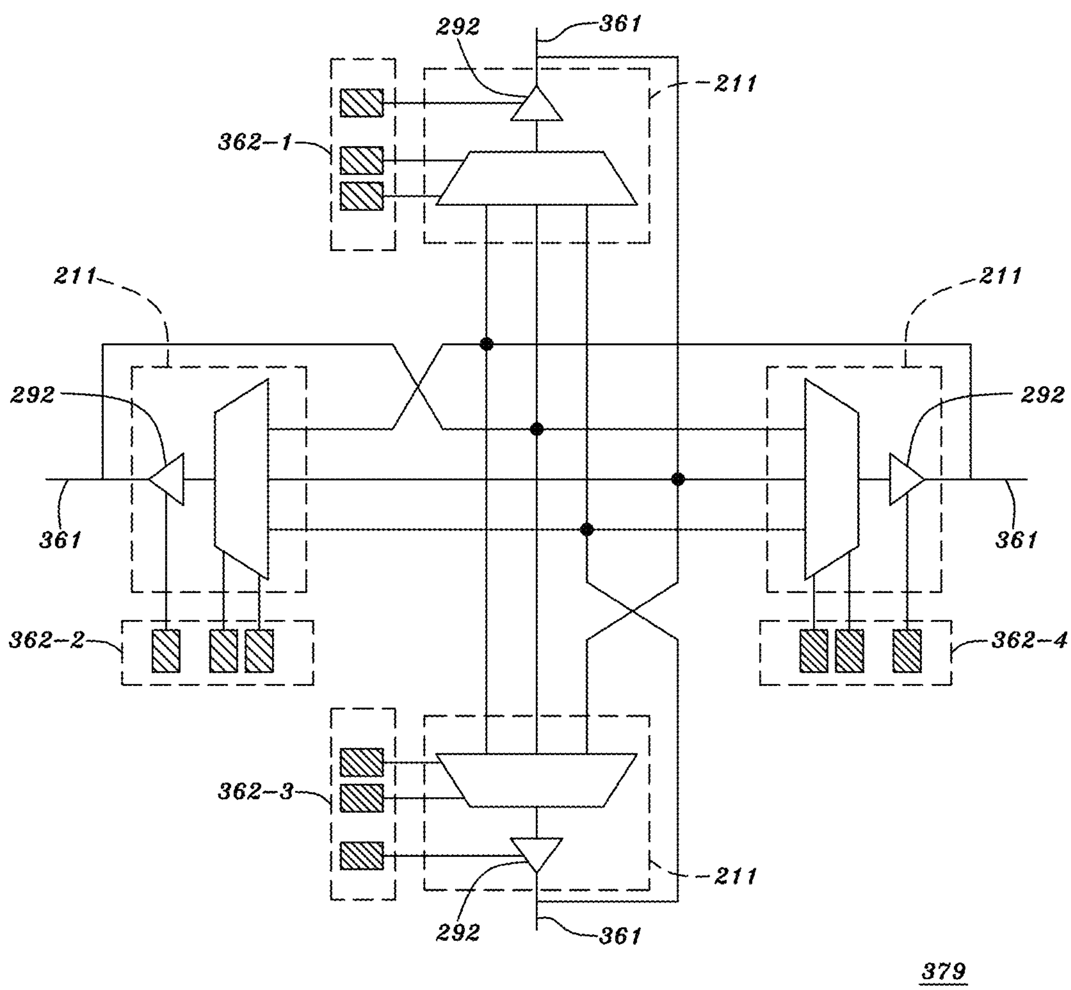

FIG. 7B is a circuit diagram illustrating programmable interconnects programmed by a cross-point switch in accordance with an embodiment of the present application. Referring to FIG. 7B, four programmable interconnects 361 may couple to the respective four nodes N23-N26 of the cross-point switch 379 of the third type as seen in FIG. 3C. Thereby, one of the four programmable interconnects 361 may be switched by the cross-point switch 379 of the third type to couple to another one, two or three of the four programmable interconnects 361. For the cross-point switch 379 composed of four of the multiplexers 211 of the first type, each of the multiplexers 211 may have its second set of two inputs A0 and A1 coupling respectively to the outputs of two of the memory cells 362, each of which may be referred to the output Out1 or Out2 of the memory cell 398, via multiple fixed interconnects 364, i.e., non-programmable interconnects. For the cross-point switch 379 composed of four of the multiplexers 211 of the second or third type as seen in FIG. 4F or 4K, each of the multiplexers 211 may have its second set of two inputs A0 and A1 coupling respectively to the outputs of two of the memory cells 362, each of which may be referred to the output Out1 or Out2 of the memory cell 398, via multiple fixed interconnects 364, i.e., non-programmable interconnects, and its node SC-4 may couple to the output of another of the memory cells 362, which may be referred to the output Out1 or Out2 of the memory cell 398, via another fixed interconnect 364, i.e., non-programmable interconnect. Alternatively, its control P-type and N-type MOS transistors 295 and 296 may have gate terminals coupling respectively to two inverted outputs of another of the memory cells 362, which may be referred to the two outputs Out1 and Out2 of the memory cell 398, and accordingly receiving the two inverted outputs of said another of the memory cells 362 associated with the programming code stored or saved in the memory cell 362 to switch on or off its pass/no-pass switch 258 of the third or fourth type to couple or decouple the input and output Dout of its pass/no-pass switch 258 of the third or fourth type, wherein its inverter 297 may be removed from the pass/no-pass switch 258 of the third or fourth type. Accordingly, each of the multiplexers 211 may pass its first set of three inputs coupling to three of the four programmable interconnects 361 into its output coupling to the other one of the four programmable interconnects 361 in accordance with its second set of two inputs A0 and A1 and alternatively further in accordance with a logic level at the node SC-4 or logic levels at gate terminals of its control P-type and N-type MOS transistors 295 and 296.

For example, referring to FIGS. 3C and 7B, the following description takes the cross-point switch 379 composed of four of the multiplexers 211 of the second or third type as an example. For programming the programmable interconnects 361, the top one of the multiplexers 211 may have its second set of inputs $A0_1$, $A1_1$ and $SC_1$-4 coupling respectively to the outputs of the three memory cells 362-1, each of which may be referred to the output Out1 or Out2 of the memory cell 398, the left one of the multiplexers 211 may have its second set of inputs $A0_2$, $A1_2$ and $SC_2$-4 coupling respectively to the outputs of the three memory cells 362-2, each of which may be referred to the output Out1 or Out2 of the memory cell 398, the bottom one of the multiplexers 211 may have its second set of inputs $A0_3$, $A1_3$ and $SC_3$-4 coupling respectively to the outputs of the three memory cells 362-3, each of which may be referred to the output Out1 or Out2 of the memory cell 398, and the right one of the multiplexers 211 may have its second set of inputs $A0_4$, $A1_4$ and $SC_4$-4 coupling respectively to the outputs of the three memory cells 362-4, each of which may be referred to the output Out1 or Out2 of the memory cell 398. Before the memory cells 362-1, 362-2, 362-3 and 362-4 are programmed or when the memory cells 362-1, 362-2, 362-3 and 362-4 are being programmed, the four programmable interconnects 361 may not be used for signal transmission. The memory cells 362-1, 362-2, 362-3 and 362-4 may be programmed to have each of the multiplexers 211 of the second or third type pass one of its three inputs of the first set into its output such that one of the four programmable interconnects 361 may couple to another, another two or another three of the four programmable interconnects 361 for signal transmission in operation.

Figure 7C:
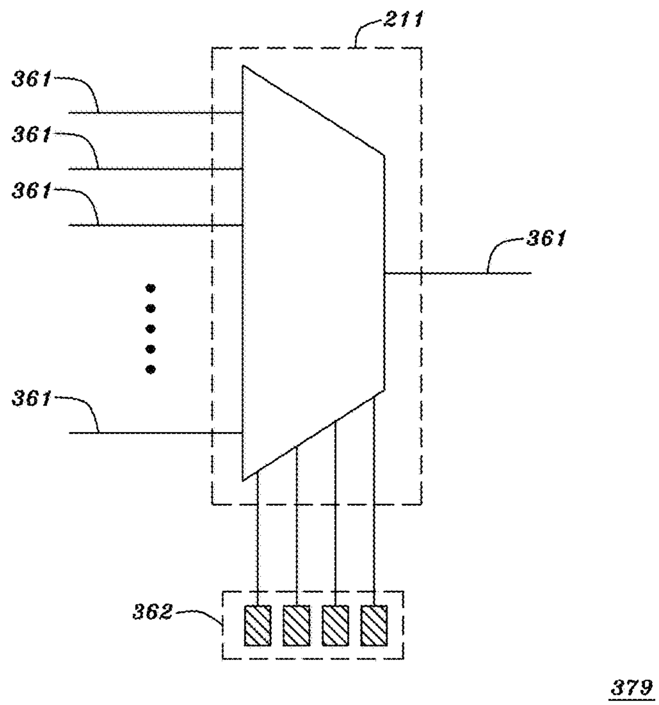

FIG. 7C is a circuit diagram illustrating a programmable interconnect programmed by a cross-point switch in accordance with an embodiment of the present application. Referring to FIG. 7C, the fourth type of cross-point switch 379 illustrated in FIG. 3D may have the first set of its inputs, e.g., 16 inputs D0-D15, coupling respectively to multiple of the programmable interconnects 361, e.g., sixteen of the programmable interconnects 361, and its output, e.g., Dout, coupling to another of the programmable interconnects 361. Thereby, said multiple of the programmable interconnects 361 may have one to be switched by the fourth type of cross-point switch 379 to associate with said another of the programmable interconnects 361. The fourth type of cross-point switch 379 may have its second set of multiple inputs A0-A3 coupling respectively to the outputs of four of the memory cells 362, each of which may be referred to the output Out1 or Out2 of the memory cell 398, and accordingly receiving the outputs of the four respective memory cells 362 associated with the four programming codes stored or saved in the four respective memory cells 362 to pass one of its inputs of the first set, e.g., D0-D15 coupling to the sixteen of the programmable interconnects 361, into its output, e.g., Dout coupling to said another of the programmable interconnects 361. Before the memory cells 362 are programmed or when the memory cells 362 are being programmed, said multiple of the programmable interconnects 361 and said another of the programmable interconnects 361 may not be used for signal transmission. The memory cells 362 may be programmed to have the fourth type of cross-point switch 379 pass one of its inputs of the first set into its output such that one of said multiple of the programmable interconnects 361 may couple to said another of the programmable interconnects 361 for signal transmission in operation.

Specification for Fixed Interconnect

Before the memory cells 490 for the look-up table (LUT) 210 as seen in FIGS. 6A and 6H and the memory cells 362 for the programmable interconnects 361 as seen in FIGS. 7A-7C are programmed or when the memory cells 490 for the look-up table (LUT) 210 and the memory cells 362 for the programmable interconnects 361 are being programmed, multiple fixed interconnects 364 that are not field programmable may be provided for signal transmission or power/ground delivery to (1) the memory cells 490 of the look-up table (LUT) 210 of the programmable logic block (LB) 201 as seen in FIG. 6A or 6H for programming the memory cells 490 and/or (2) the memory cells 362 as seen in FIGS. 7A-7C for the programmable interconnects 361 for programming the memory cells 362. After the memory cells 490 for the look-up table (LUT) 210 and the memory cells 362 for the programmable interconnects 361 are programmed, the fixed interconnects 364 may be used for signal transmission or power/ground delivery in operation.

Figure 8A:
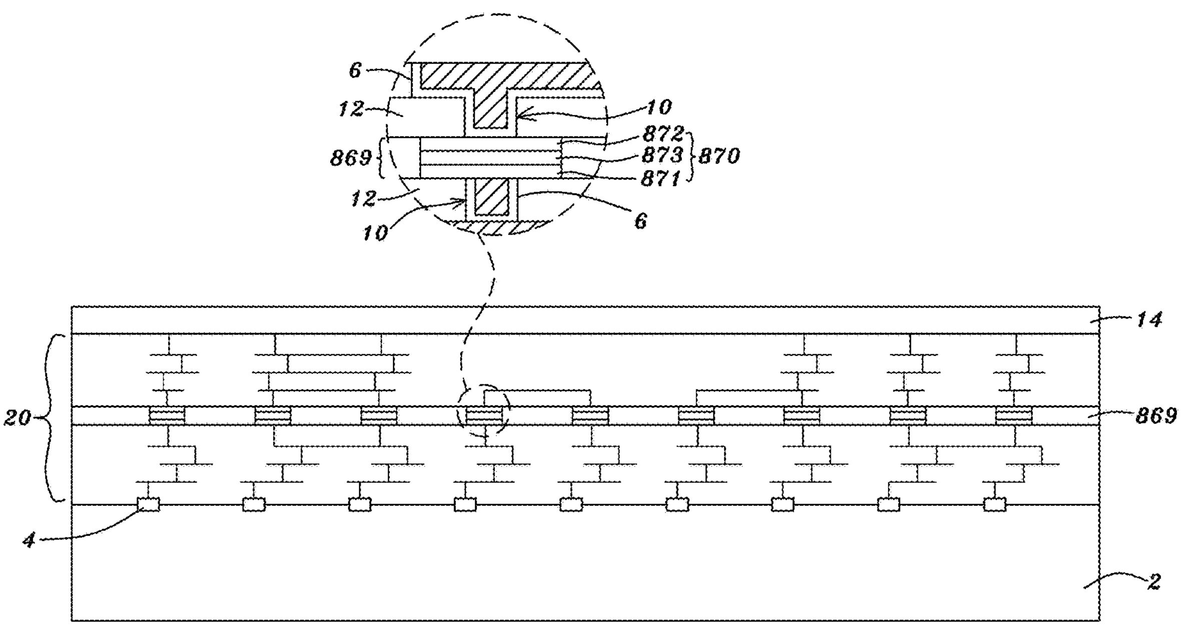
FIGS. 8A-8C are schematically cross-sectional views showing various structures of non-volatile memory cells of a first type for a semiconductor chip in accordance with an embodiment of the present application.
Figure 8B:
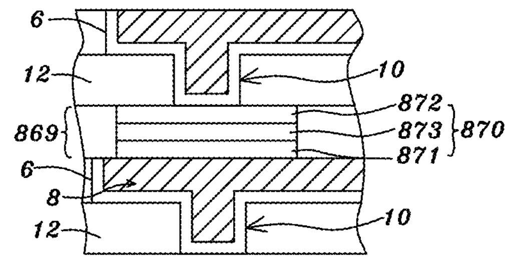
Figure 8C:
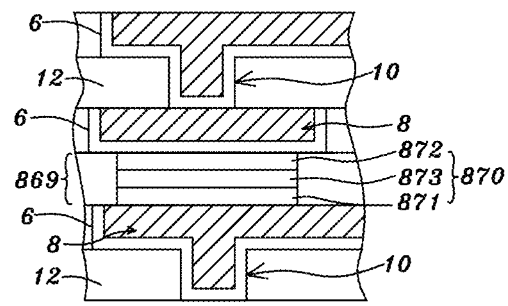

Specification for Non-Volatile Memory (NVM) Cells (1.1) First Type of Non-volatile Memory Cells For the First Alternative FIGS. 8A-8C are schematically cross-sectional views showing various structures of non-volatile memory cells of a first type for a semiconductor chip in accordance with an embodiment of the present application. The first type of non-volatile memory cells may be resistive random access memories (RRAM), i.e., programmable resistors. Referring to FIG. 8A, a semiconductor chip 100, used for the FPGA IC chip 200 for example, may include multiple resistive random access memories 870 formed in an RRAM layer 869 thereof over a semiconductor substrate 2 thereof, in a first interconnection scheme 20 for the semiconductor chip 100 (FISC) and under a passivation layer 14 thereof. Multiple interconnection metal layers 6 in the FISC 20 and between the RRAM layer 869 and semiconductor substrate 2 may couple the resistive random access memories 870 to multiple semiconductor devices 4 on the semiconductor substrate 2. Multiple interconnection metal layers 6 in the FISC 20 and between the RRAM layer 869 and passivation layer 14 may couple the resistive random access memories 870 to external circuits outside the semiconductor chip 100 and may have a line pitch less than 0.5 micrometers. Each of the interconnection metal layers 6 in the FISC 20 and over the RRAM layer 869 may have a thickness greater than each of the interconnection metal layers 6 in the FISC 20 and under the RRAM layer 869. The details for the semiconductor substrate 2, semiconductor devices, interconnection metal layers 6, FISC 20 and passivation layer 14 may be referred to the illustration in FIGS. 20A-20Q.

Referring to FIG. 8A, each of the resistive random access memories 870 may have (i) a bottom electrode 871 made of a layer of nickel, platinum, titanium, titanium nitride, tantalum nitride, copper or an aluminum alloy having a thickness between 1 and 20 nanometers, (ii) a top electrode 872 made of a layer of platinum, titanium nitride, tantalum nitride, copper or an aluminum alloy having a thickness between 1 and 20 nanometers, and (iii) a resistive layer 873 having a thickness between 1 and 20 nanometers between the bottom and top electrodes 871 and 872, wherein the resistive layer 873 may be composed of composite layers of various materials including a colossal magnetoresistance (CMR) material such as $La_{1-x}Ca_xMnO_3$ (0<x<1), $La_{1-x}Sr_xMnO_3$ (0<x<1) or $Pr_{0.7}Ca_{0.3}MnO_3$, a polymer material such as poly(vinylidene fluoride trifluoroethylene), i.e., P(VDF-TrFE), a conductive-bridging random-access-memory (CBRAM) material such as Ag—GeSe based material, a doped metal oxide such as Nb-doped $SrZrO_3$, or a binary metal oxide such as WOx (0<x<1), NiO, $TiO_2$ or $HfO_2$, or a metal such as titanium.

For example, referring to FIG. 8A, the resistive layer 873 may include an oxide layer on the bottom electrode 871, in which conductive filaments or paths may be formed depending on the applied electric voltages. The oxide layer of the resistive layer 873 may comprise, for example, hafnium dioxide ($HfO_2$) or tantalum oxide $Ta_2O_5$ having a thickness of 5 nm, 10 nm or 15 nm or between 1 nm and 30 nm, 3 nm and 20 nm, or 5 nm and 15 nm. The oxide layer of the resistive layer 873 may be formed by atomic-layer-deposition (ALD) methods. The resistive layer 873 may further include an oxygen reservoir layer, which may capture the oxygen atoms from the oxide layer, on its oxide layer. The oxygen reservoir layer may comprise titanium (Ti) or tantalum (Ta) to capture the oxygen atoms or ions from the oxide layer to form $TiO_x$ or $TaO_x$. The oxygen reservoir layer may have a thickness between 1 nm and 25 nm, or 3 nm and 15 nm, such as 2 nm, 7 nm or 12 nm. The oxygen reservior layer may be formed by atomic-layer-deposition (ALD) methods. The top electrode 872 is formed on the oxygen reservoir layer of the resistive layer 873.

For example, referring to FIG. 8A, the resistive layer 873 may include a layer of $HfO_2$ having a thickness between 1 and 20 nanometers on the bottom electrode 871, a layer of titanium dioxide having a thickness between 1 and 20 nanometers on the layer of $HfO_2$ and a titanium layer having a thickness between 1 and 20 nanometers on the layer of titanium dioxide. The top electrode 872 is formed on the titanium layer of the resistive layer 873.

Figure 20A:
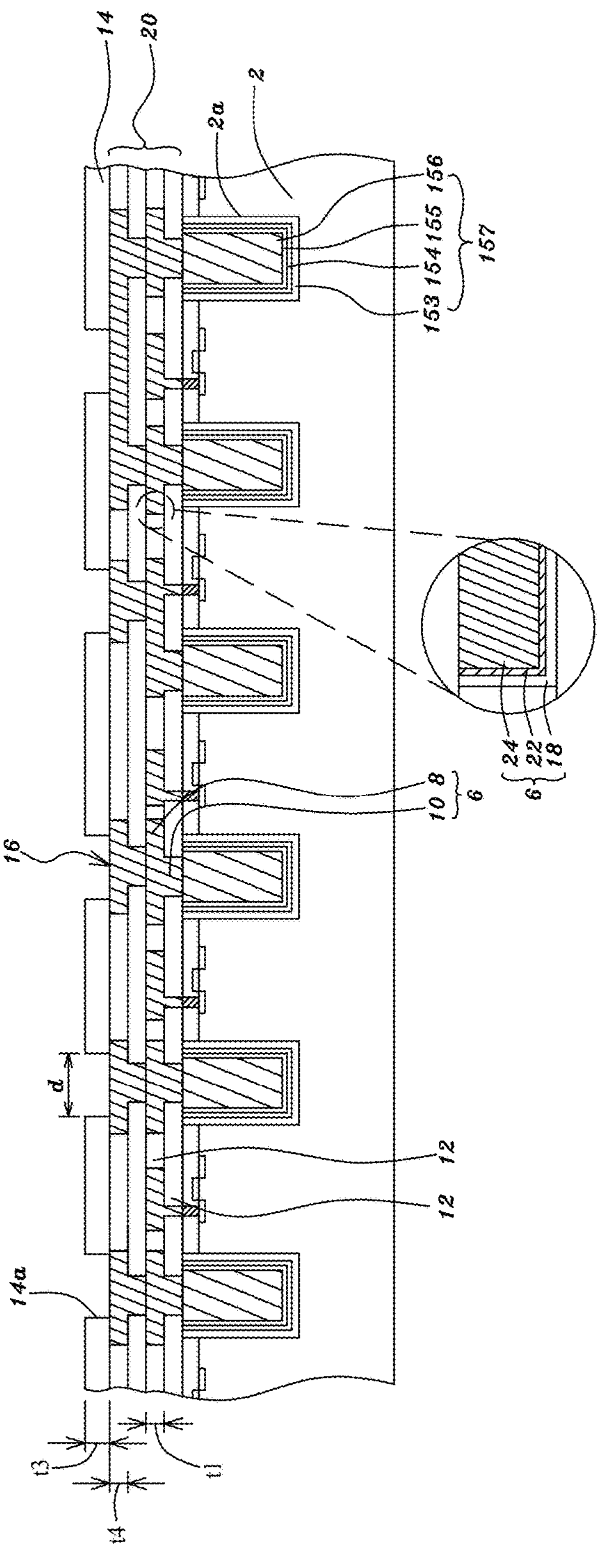
FIG. 20A is a cross-sectional view of a semiconductor wafer in accordance with an embodiment of the present application.
Figure 20B:
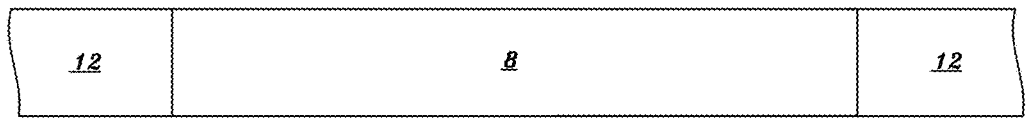
FIGS. 20B-20H are cross-sectional views showing a single damascene process is performed to form a first interconnection scheme in accordance with an embodiment of the present application.
Figure 20C:
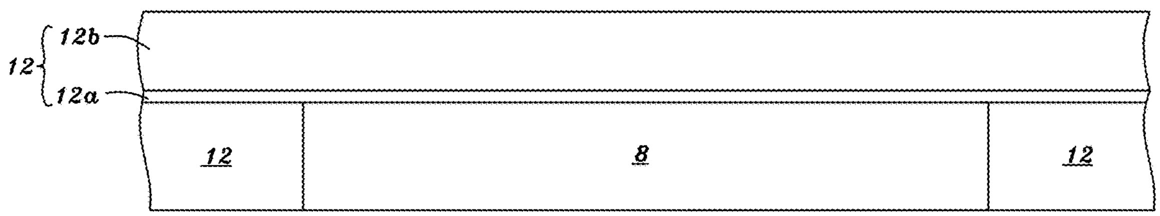
Figure 20D:
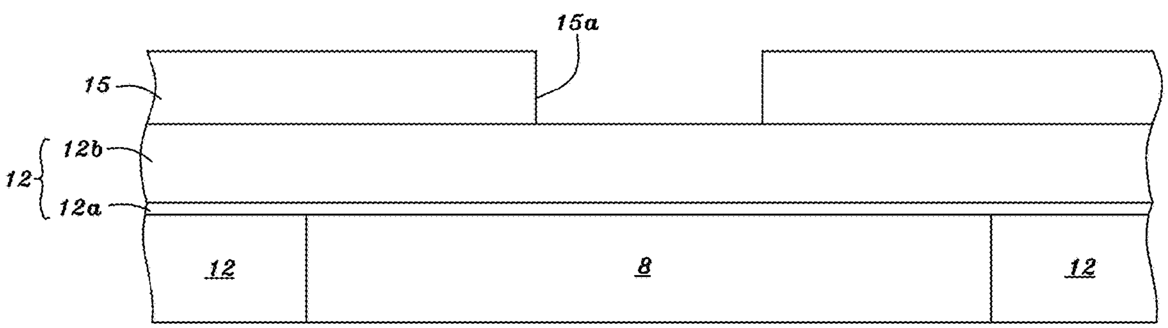
Figure 20E:
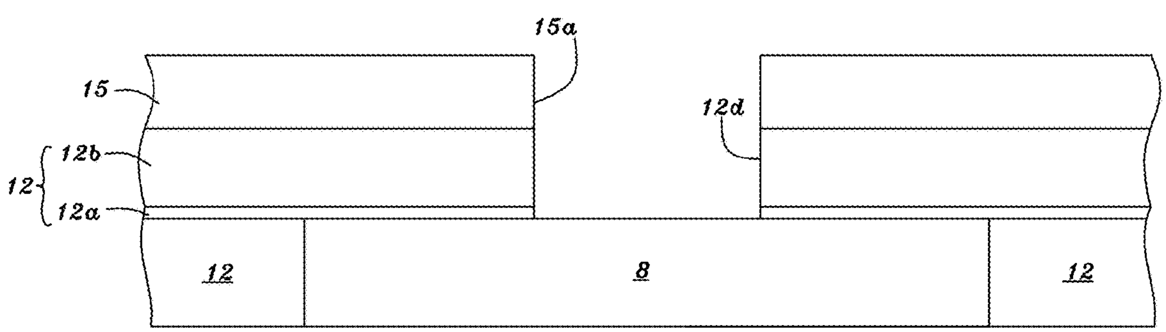
Figure 20F:
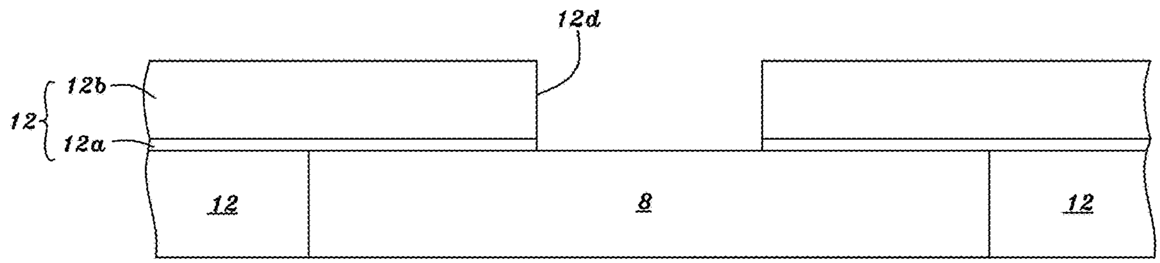
Figure 20G:
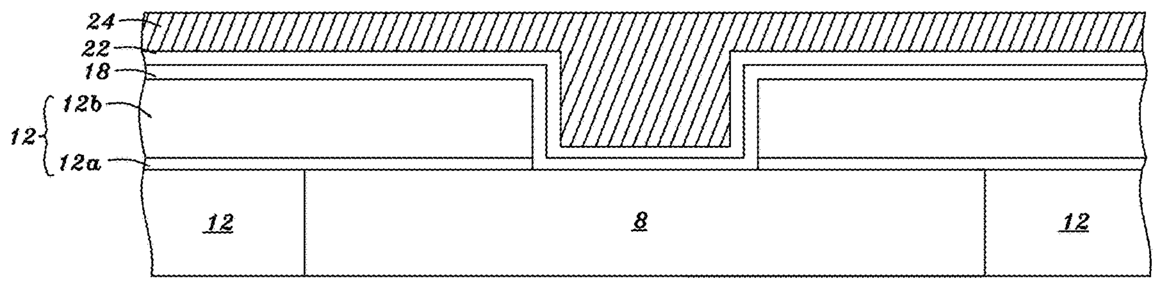
Figure 20H:
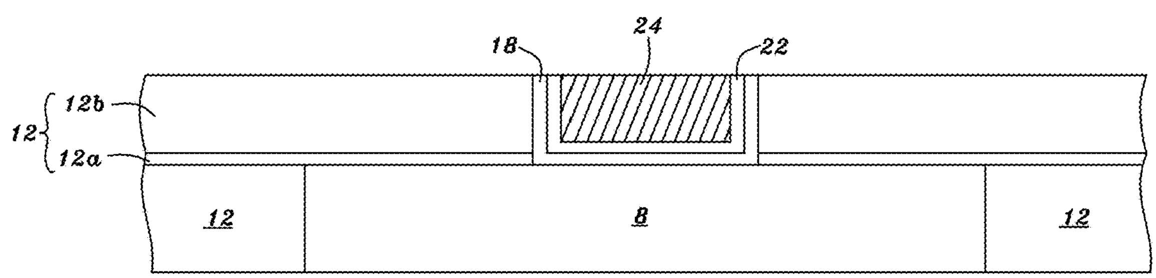
Figure 20I:
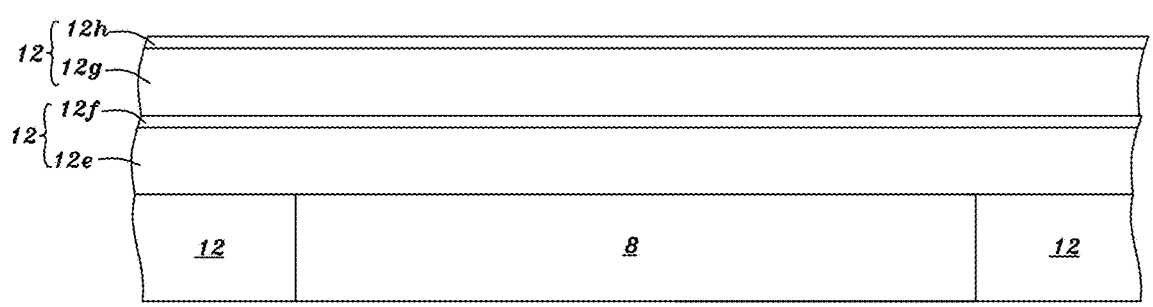
Figure 20J:
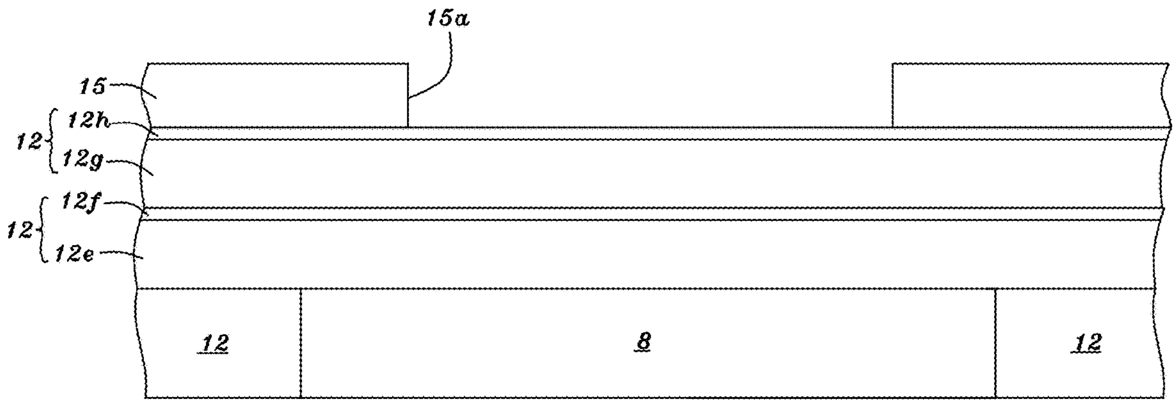
Figure 20K:
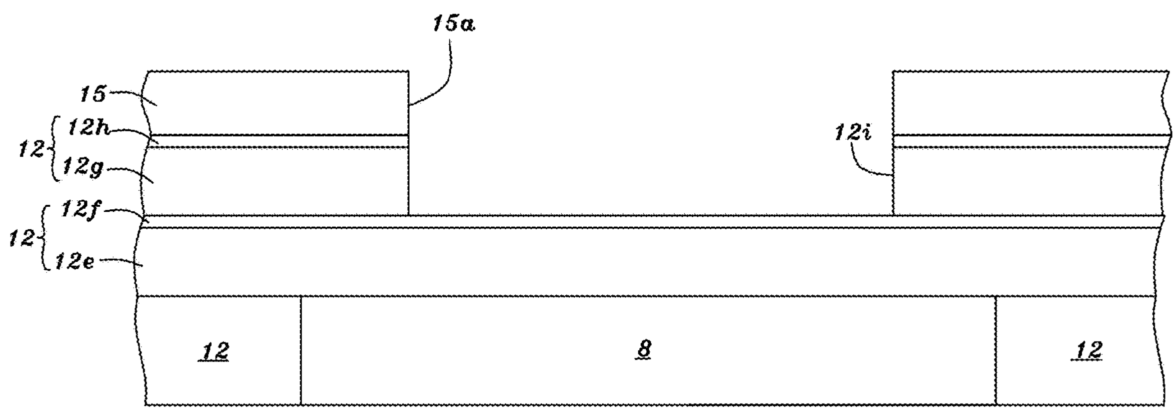
Figure 20L:
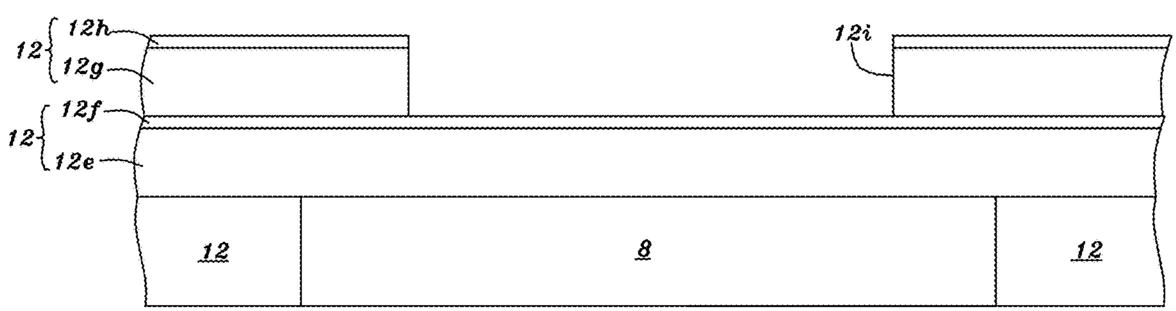
Figure 20M:
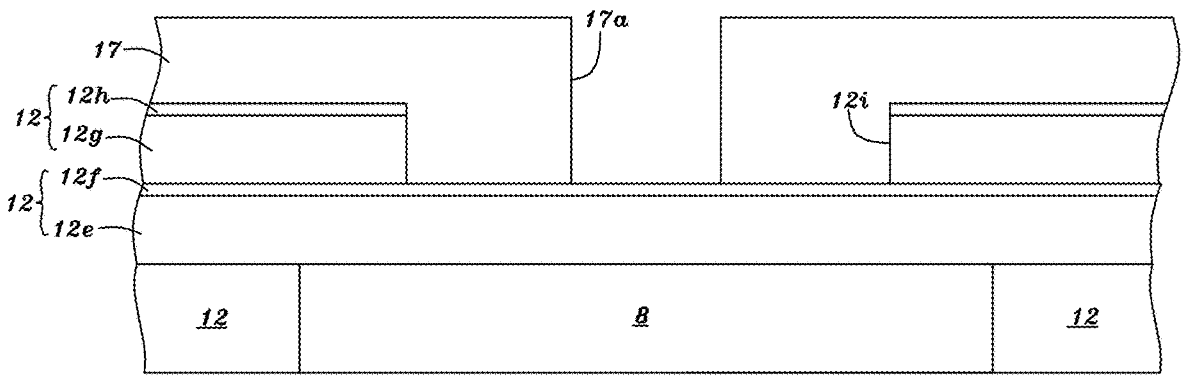
Figure 20N:
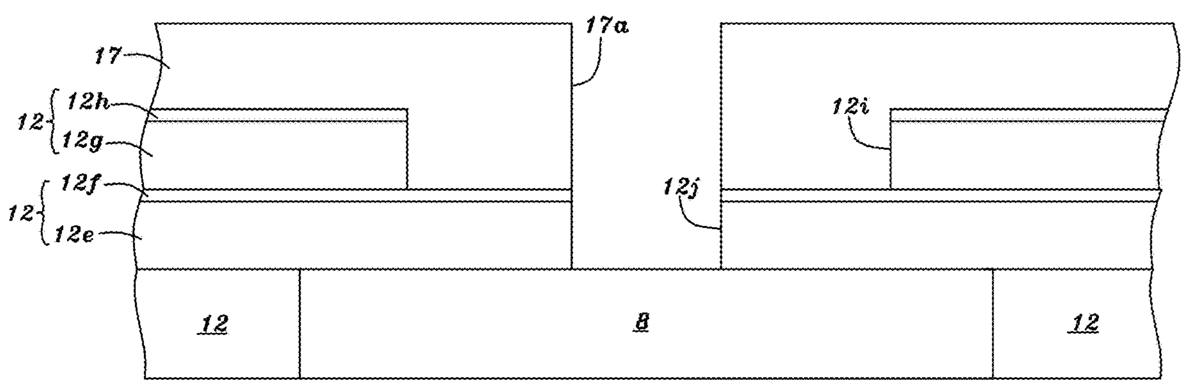
Figure 20O:
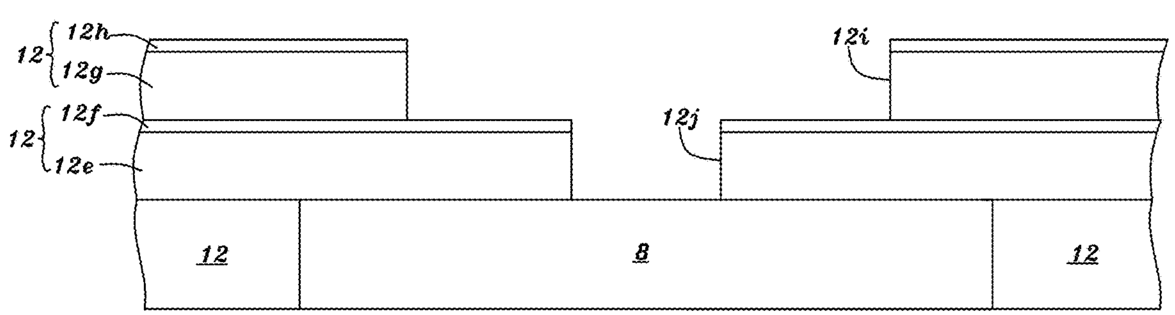
Figure 20P:
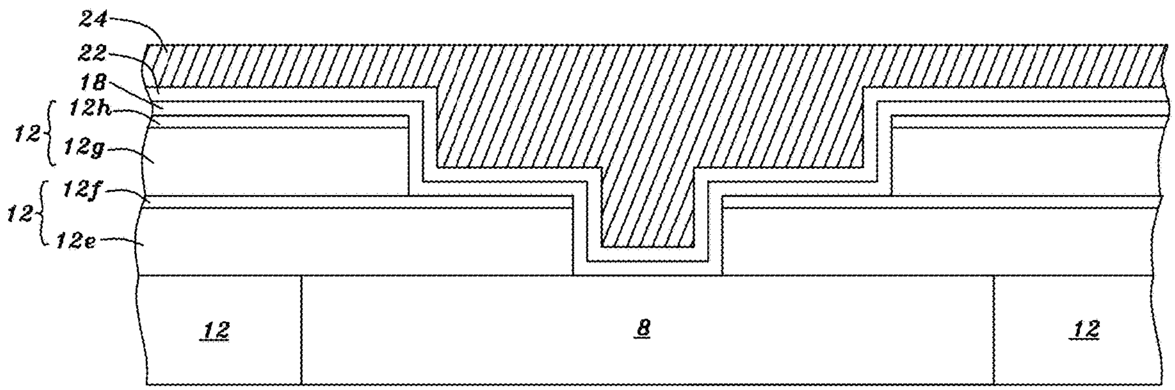
Figure 20Q:
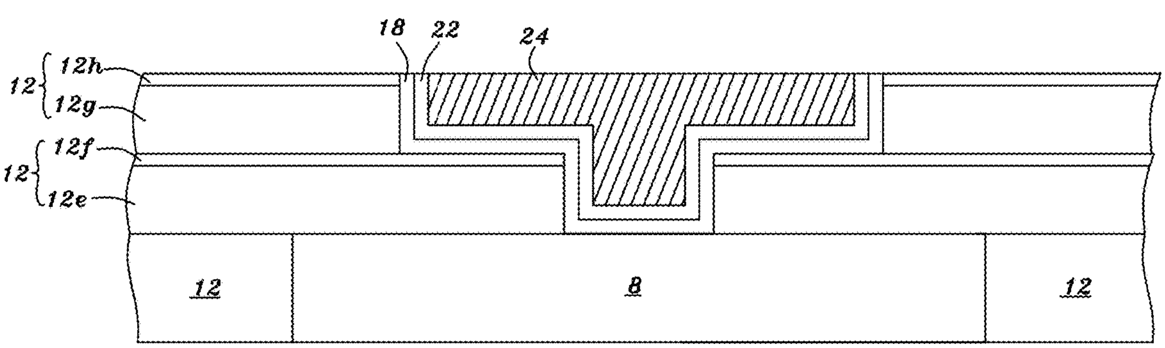

Referring to FIG. 8A, each of the resistive random access memories 870 may have its bottom electrode 871 formed on a top surface of one of the lower metal vias 10 of a lower one of the interconnection metal layers 6 as illustrated in FIGS. 20A-20Q and on a top surface of a lower one of the dielectric layers 12 as illustrated in FIGS. 20A-20Q. An upper one of the dielectric layers 12 as illustrated in FIGS. 20A-20Q may be formed on the top electrode 872 of said one of the resistive random access memories 870 and an upper one of the interconnection metal layers 6 as illustrated in FIGS. 20A-20Q may have the upper metal vias 10 each formed in the upper one of the dielectric layers 12 and on the top electrode 872 of one of the resistive random access memories 870.

Alternatively, referring to FIG. 8B, each of the resistive random access memories 870 may have its bottom electrode 871 formed on a top surface of one of the lower metal pads 8 of a lower one of the interconnection metal layers 6 as illustrated in FIGS. 20A-20Q. An upper one of the dielectric layers 12 as illustrated in FIGS. 20A-20Q may be formed on the top electrode 872 of said one of the resistive random access memories 870 and an upper one of the interconnection metal layers 6 as illustrated in FIGS. 20A-20Q may have the upper metal vias 10 each formed in the upper one of the dielectric layers 12 and on the top electrode 872 of one of the resistive random access memories 870.

Alternatively, referring to FIG. 8C, each of the resistive random access memories 870 may have its bottom electrode 871 formed on a top surface of one of the lower metal pads 8 of a lower one of the interconnection metal layers 6 as illustrated in FIGS. 20A-20Q. An upper one of the interconnection metal layers 6 as illustrated in FIGS. 20A-20Q may have the upper metal pads 8 each formed in an upper one of the dielectric layers 12 and on the top electrode 872 of one of the resistive random access memories 870.

Figure 8D:
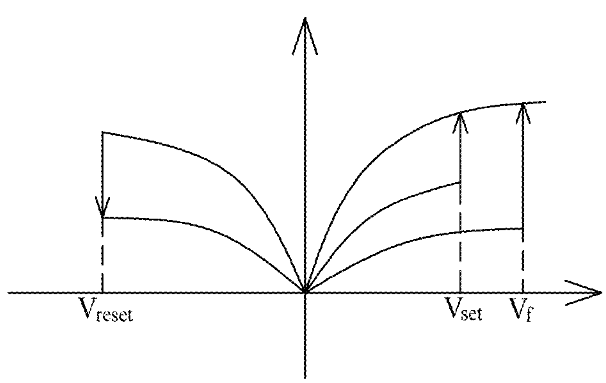
FIG. 8D is a plot showing various states of a resistive random access memory in accordance with an embodiment of the present application, wherein the x-axis indicates a voltage of a resistive random access memory and the y-axis indicates a log value of a current of a resistive random access memory.

FIG. 8D is a plot showing various states of a resistive random access memory in accordance with an embodiment of the present application, wherein the x-axis indicates a voltage of a resistive random access memory and the y-axis indicates a log value of a current of a resistive random access memory. Referring to FIGS. 8A and 8D, when the resistive random access memories 870 start to be first used before a resetting or setting step as illustrated in the following paragraphs, a forming step is performed to each of the resistive random access memories 870 to form vacancies in its resistive layer 873 for electrons capable of moving between its bottom and top electrodes 871 and 872 in a low resistant manner. When each of the resistive random access memories 870 is being formed, a forming voltage $V_f$ ranging from 0.25 to 3.3 volts is applied to its top electrode 872, and a voltage Vss of ground reference is applied to its bottom electrode 871 such that oxygen atoms or ions in the oxide layer, such as hafnium dioxide, of its resistive layer 873 may move toward the oxygen reservoir layer, such as titanium, of its resistive layer 873 by an absorption force from positive charges at its top electrode 872 and a repulsive force against negative charges at its bottom electrode 871 to react with the oxygen reservoir layer of the resistive layer 873 into a transition oxide, such as titanium oxide, at the interface between the oxide layer of the resistive layer 873 and the oxygen reservoir layer of the resistive layer 873. The sites where the oxygen atoms or ions are occupied in the oxide layer of the resistive layer 873 before the forming step become vacancies after the oxygen atoms or ions are left to move toward the oxygen reservoir layer of the resistive layer 873. The vacancies may form conductive filaments or paths in the oxide layer of the resistive layer 873 and thus said each of the resistive random access memories 870 may be formed to a low resistance between 100 and 100,000 ohms.

Referring to FIG. 8D, after the resistive random access memories 870 are formed in the forming step, a resetting step may be performed to one of the resistive random access memories 870. When said one of the resistive random access memories 870 is being reset, a resetting voltage VRE ranging from 0.25 to 3.3 volts may be applied to its bottom electrode 871, and a voltage Vss of ground reference is applied to its top electrode 872 such that the oxygen atoms or ions may move from the transition oxide at the interface between the oxide layer of the resistive layer 873 and the oxygen reservoir layer of the resistive layer 873 to the vacancies in the oxide layer of the resistive layer 873 to fill the vacancies such that the vacancies may be largely reduced in the oxide layer of the resistive layer 873. Also, the conductive filaments or paths may be reduced in the oxide layer of the resistive layer 873, and thereby said one of the resistive random access memories 870 may be reset to a high resistance between 1,000 and 100,000,000,000 ohms, greater than the low resistance. The forming voltage $V_f$ is greater than the resetting voltage $V_{RE}$.

Referring to FIG. 8D, after the resistive random access memories 870 are reset with the high resistance, a setting step may be performed to one of the resistive random access memories 870. When said one of the resistive random access memories 870 is being set, a setting voltage $V_{SE}$ ranging from 0.25 to 3.3 volts may applied to its top electrode 872, and a voltage Vss of ground reference may be applied to its bottom electrode 871 such that oxygen atoms or ions in the oxide layer, such as hafnium dioxide, of its resistive layer 873 may move toward the oxygen reservoir layer, such as titanium, of its resistive layer 873 by an absorption force from positive charges at its top electrode 872 and a repulsive force against negative charges at its bottom electrode 871 to react with the oxygen reservoir layer of the resistive layer 873 into a transition oxide, such as titanium oxide, at the interface between the oxide layer of the resistive layer 873 and the oxygen reservoir layer of the resistive layer 873. The sites where the oxygen atoms or ions are occupied in the oxide layer of the resistive layer 873 before the setting step become vacancies after the oxygen atoms or ions are left to move toward the oxygen reservoir layer of the resistive layer 873. The vacancies may form conductive filaments or paths in the oxide layer of the resistive layer 873 and thus said one of the resistive random access memories 870 may be set to the low resistance between 100 and 100,000 ohms. The forming voltage $V_f$ is greater than the setting voltage $V_{SE}$.

Figure 8E:
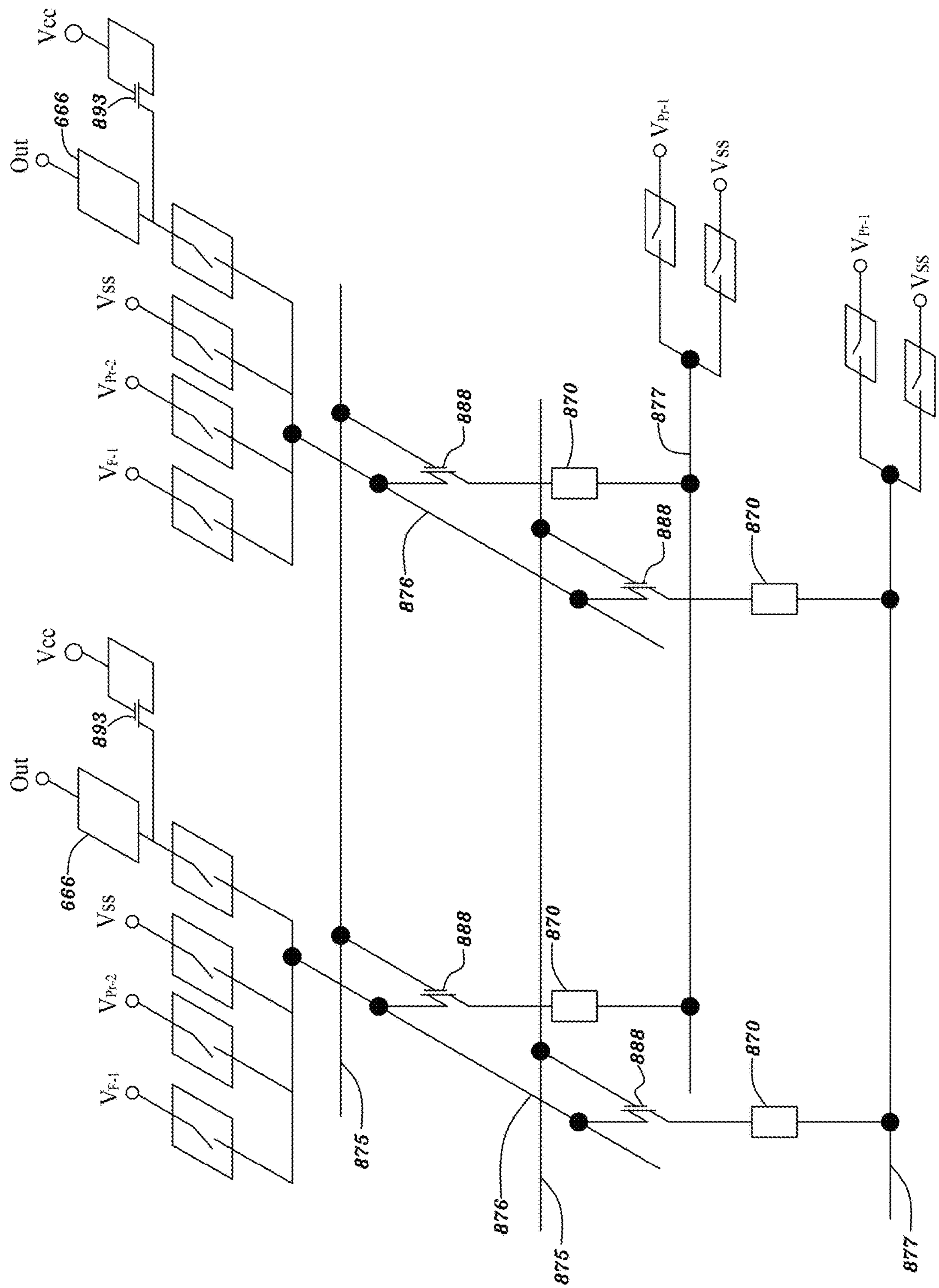
FIG. 8E is a circuit diagram showing a non-volatile memory array in accordance with an embodiment of the present application.

FIG. 8E is a circuit diagram showing a non-volatile memory array in accordance with an embodiment of the present application. Referring to FIG. 8E, multiple of the resistive random access memories 870 are formed in an array in the RRAM layer 869 as seen in FIG. 8A-8C. Multiple of the switches 888, e.g., N-type MOS transistors, are arranged in an array. Alternatively, each of the switches 888 may be a P-type MOS transistor. Each of the N-type MOS transistors 888 is configured to form a channel with two opposite terminals, one of which couples in series to one of the bottom and top electrodes 871 and 872 of one the resistive random access memories 870 and the other of which couples to one of bit lines 876, and has a gate terminal coupling to one of word lines 875. Each of reference lines 877 may couple to the other of the bottom and top electrodes 871 and 872 of each of the resistive random access memories 870 arranged in a row. Each of the word lines 875 may couple to the gate terminals of the N-type MOS transistors 888 arranged in a row that couple in parallel to one another through said each of the word lines 875. Each of the bit lines 876 is configured to couple, one by one and in turn, to one of the bottom and top electrodes 871 and 872 of each of the resistive random access memories 870 in a column through one of the N-type MOS transistors 888 in a column.

In an alternative example, each of the N-type MOS transistors 888 is configured to form a channel with two opposite terminals, one of which couples in series to one of the bottom and top electrodes 871 and 872 of one the resistive random access memories 870 and the other of which couples to one of reference lines 877, and has a gate terminal coupling to one of word lines 875. Each of the reference lines 877 is configured to couple to one of the bottom and top electrodes 871 and 872 of each of the resistive random access memories 870 arranged in a row through one of the N-type MOS transistors 888 in a row.

Referring to FIG. 8E, when the resistive random access memories 870 start to be first used before the resetting or setting step as illustrated in FIG. 8D, the forming step as illustrated in FIG. 8D is performed to each of the resistive random access memories 870 to form vacancies in its resistive layer 873 for electrons capable of moving between its bottom and top electrodes 871 and 872 in the low resistant manner. When each of the resistive random access memories 870 is being formed, (1) all of the bit lines 876 are switched to couple to a first activating voltage $V_{F-1}$ equal to or greater than the forming voltage $V_f$, wherein the first activating voltage $V_{F-1}$ may range from 0.25 to 3.3 volts, (2) all of the word lines 875 are switched to couple to the first activating voltage $V_{F-1}$ to turn on each of the N-type MOS transistors 888 to couple one of the bottom and top electrode 872 of one of the resistive random access memories 870 to one of the bit lines 876 or, in the alternative example, to couple one of the bottom and top electrode 872 of one of the resistive random access memories 870 to one of the reference lines 877 and (3) all of the reference lines 877 are switched to couple to the voltage Vss of ground reference. Alternatively, when each of the switches 888 is a P-type MOS transistor, all of the word lines 875 are switched to couple to the voltage Vss of ground reference to turn on each of the P-type MOS transistors 888 to couple one of the bottom and top electrode 872 of one of the resistive random access memories 870 to one of the bit lines 876 or, in the alternative example, to couple one of the bottom and top electrode 872 of one of the resistive random access memories 870 to one of the reference lines 877. Thereby, when each of the resistive random access memories 870 is being formed, the first activating voltage $V_{F-1}$ may be applied to said one of its bottom and top electrodes 871 and 872, and the voltage Vss of ground reference may be applied to the other of its bottom and top electrodes 871 and 872 such that said each of the resistive random access memories 870 may be formed to the low resistance between 100 and 100,000 ohms, and thus programmed to a logic level of "0".

Next, referring to FIG. 8E, a resetting step as illustrated in FIG. 8D may be performed, one row by one row and in turn, to a first group of the resistive random access memories 870 but not to a second group of the resistive random access memories 870, in which (1) each of the word lines 875 corresponding to the resistive random access memories 870 in a row may be selected one by one and in turn to be switched to couple to a first programming voltage $V_{Pr-1}$ to turn on the N-type MOS transistors 888 in a row to couple each of the resistive random access memories 870 in the row to one of the bit lines 876 or, in the alternative example, to couple all of the resistive random access memories 870 in the row to a same one of the reference lines 877, wherein the unselected word lines 875 corresponding to the resistive random access memories 870 in the other rows may be switched to couple to the voltage Vss of ground reference to turn off the N-type MOS transistors 888 in the other rows to decouple each of the resistive random access memories 870 in the other rows from any of the bit lines 876 or, in the alternative example, to decouple each of the resistive random access memories 870 in the other rows from any of the reference lines 877, wherein the first programming voltage $V_{Pr-1}$ may be between 0.25 and 3.3 volts, equal to or greater than the resetting voltage VRE of the resistive random access memories 870, (2) the reference lines 877 may be switched to couple to the first programming voltage $V_{Pr-1}$, (3) the bit lines 876 in a first group each for one of the resistive random access memories 870 in the first group in the row may be switched to couple to the voltage Vss of ground reference, and (4) the bit lines 876 in a second group each for one of the resistive random access memories 870 in the second group in the row may be switched to couple to the first programming voltage $V_{Pr-1}$. Alternatively, when each of the switches 888 is a P-type MOS transistor, each of the word lines 875 corresponding to the resistive random access memories 870 in the row may be selected one by one and in turn to be switched to couple to the voltage Vss of ground reference to turn on the P-type MOS transistors 888 in the row to couple each of the resistive random access memories 870 in the row to one of the bit lines 876 or, in the alternative example, to couple all of the resistive random access memories 870 in the row to the same one of the reference lines 877, wherein the unselected word lines 875 corresponding to the resistive random access memories 870 in the other rows may be switched to couple to the first programming voltage $V_{Pr-1}$ to turn off the P-type MOS transistors 888 in the other rows to decouple each of the resistive random access memories 870 in the other rows from any of the bit lines 876 or, in the alternative example, to decouple each of the resistive random access memories 870 in the other rows from any of the reference lines 877. Thereby, the resistive random access memories 870 in the first group in the row may be reset to the high resistance between 1,000 and 100,000,000,000 ohms in the resetting step, and thus programmed to a logic level of "1". The resistive random access memories 870 in the second group in the row may have been kept in the previous state.

Referring to FIG. 8E, a setting step as illustrated in FIG. 8D may be performed, one row by one row and in turn, to the second group of the resistive random access memories 870 but not to the first group of the resistive random access memories 870, in which (1) each of the word lines 875 corresponding to the resistive random access memories 870 in the row may be selected one by one and in turn to be switched to couple to a second programming voltage $V_{Pr-2}$ to turn on the N-type MOS transistors 888 in the row to couple each of the resistive random access memories 870 in the row to one of the bit lines 876 or, in the alternative example, to couple all of the resistive random access memories 870 in the row to a same one of the reference lines 877, wherein the unselected word lines 875 corresponding to the resistive random access memories 870 in the other rows may be switched to couple to the voltage Vss of ground reference to turn off the N-type MOS transistors 888 in the other rows to decouple each of the resistive random access memories 870 in the other rows from any of the bit lines 876 or, in the alternative example, to decouple each of the resistive random access memories 870 in the other rows from any of the reference lines 877, wherein the second programming voltage $V_{Pr-2}$ may be between 0.25 and 3.3 volts, equal to or greater than the setting voltage $V_{SE}$ of the resistive random access memories 870, (2) the reference lines 877 may be switched to couple to the voltage Vss of ground reference, (3) the bit lines 876 in the first group each for one of the resistive random access memories 870 in the first group in the row may be switched to couple to the voltage Vss of ground reference, and (4) the bit lines 876 in the second group each for one of the resistive random access memories 870 in the second group in the row may be switched to couple to the second programming voltage $V_{Pr-2}$. Alternatively, when each of the switches 888 is a P-type MOS transistor, each of the word lines 875 corresponding to the resistive random access memories 870 in the row may be selected one by one and in turn to be switched to couple to the voltage Vss of ground reference to turn on the P-type MOS transistors 888 in the row to couple each of the resistive random access memories 870 in the row to one of the bit lines 876 or, in the alternative example, to couple all of the resistive random access memories 870 in the row to the same one of the reference lines 877, wherein the unselected word lines 875 corresponding to the resistive random access memories 870 in the other rows may be switched to couple to the second programming voltage $V_{Pr-2}$ to turn off the P-type MOS transistors 888 in the other rows to decouple each of the resistive random access memories 870 in the other rows from any of the bit lines 876 or, in the alternative example, to decouple each of the resistive random access memories 870 in the other rows from any of the reference lines 877. Thereby, the resistive random access memories 870 in the first group in the row may be set to the low resistance between 100 and 100,000 ohms in the setting step, and thus programmed to a logic level of "0". The resistive random access memories 870 in the second group in the row may have been kept in the previous state.

Figure 8F:
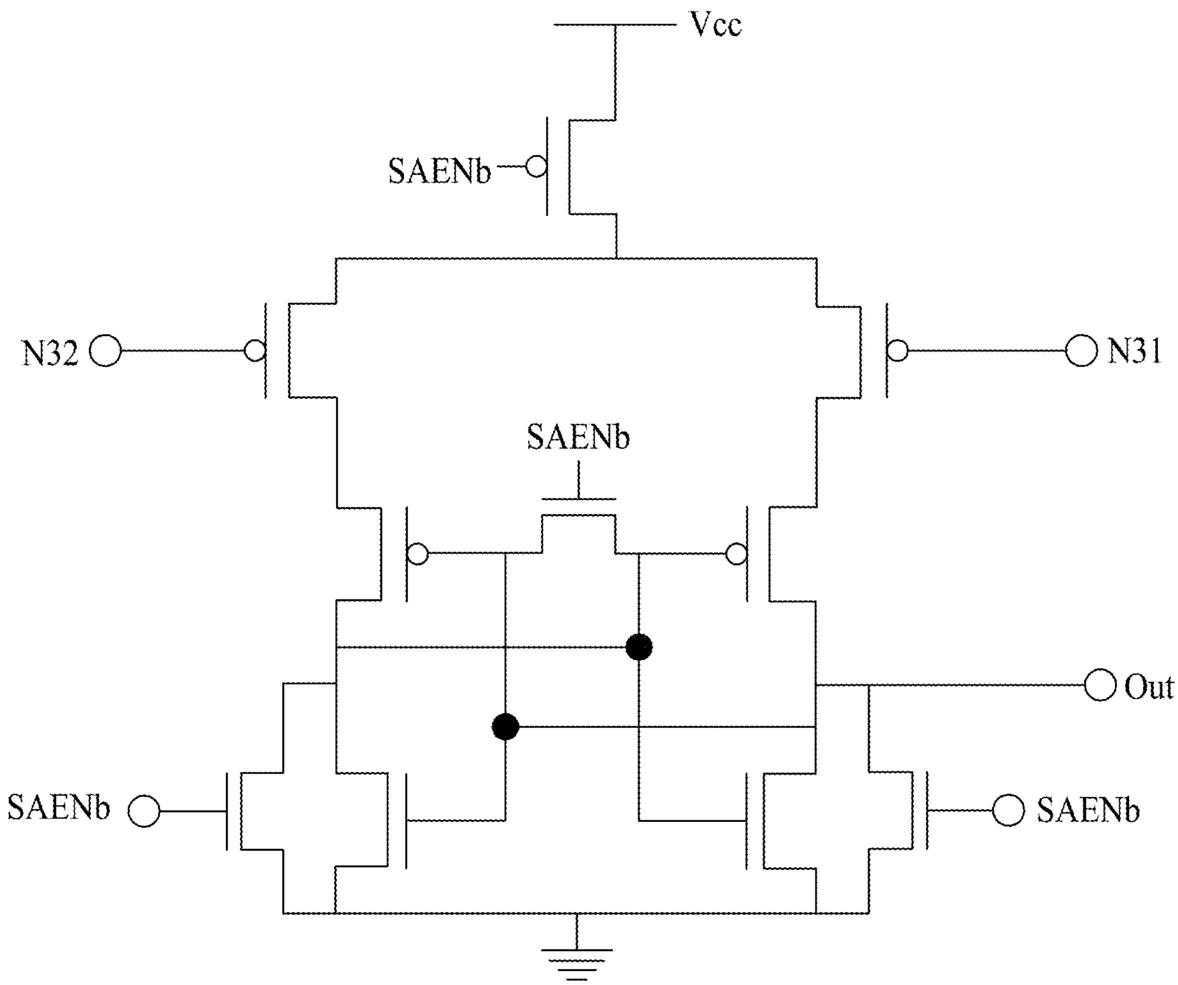
FIG. 8F is a circuit diagram showing a sense amplifier in accordance with an embodiment of the present application.

FIG. 8F is a circuit diagram showing a sense amplifier in accordance with an embodiment of the present application. In operation, referring to FIGS. 8E and 8F, (1) each of the bit lines 876 may be switched to couple to a node N31 of one of multiple sense amplifiers 666 as illustrated in FIG. 8F and to a source terminal of one of multiple N-type MOS transistors 893, (2) each of the reference lines 877 may be switched to couple to the voltage Vss of ground reference, and (3) each of the word lines 875 corresponding to the resistive random access memories 870 in a row may be selected one by one and in turn to be switched to couple to the voltage Vcc of power supply to turn on the N-type MOS transistors 888 in the row to couple each of the resistive random access memories 870 in the row to one of the bit lines 876 or, in the alternative example, to couple all of the resistive random access memories 870 in the row to a same one of the reference lines 877, wherein the unselected word lines 875 corresponding to the resistive random access memories 870 in the other rows may be switched to couple to the voltage Vss of ground reference to turn off the N-type MOS transistors 888 in the other rows to decouple each of the resistive random access memories 870 in the other rows from any of the bit lines 876 or, in the alternative example, to decouple each of the resistive random access memories 870 in the other rows from any of the reference lines 877. The N-type MOS transistor 893 may have a gate terminal coupling to the voltage Vcc of power supply and to a drain terminal of the N-type MOS transistor 893. Alternatively, when each of the switches 888 is a P-type MOS transistor, each of the word lines 875 corresponding to the resistive random access memories 870 in the row may be selected one by one and in turn to be switched to couple to the voltage Vss of ground reference to turn on the P-type MOS transistors 888 in the row to couple each of the resistive random access memories 870 in the row to one of the bit lines 876 or, in the alternative example, to couple all of the resistive random access memories 870 in the row to the same one of the reference lines 877, wherein the unselected word lines 875 corresponding to the resistive random access memories 870 in the other rows may be switched to couple to the voltage Vcc of power supply to turn off the P-type MOS transistors 888 in the other rows to decouple each of the resistive random access memories 870 in the other rows from any of the bit lines 876 or, in the alternative example, to decouple each of the resistive random access memories 870 in the other rows from any of the reference lines 877. Thereby, each of the sense amplifiers 666 may compare a voltage at one of the bit lines 876, i.e., at the node N31 as seen in FIG. 8F, with a comparison voltage at a comparison line, i.e., at the node N32 as seen in FIG. 8F, into a compared data and then generate an output "Out" of one of the resistive random access memories 870 coupling to said one of the bit lines 876 based on the compared data. For example, when the voltage at the node N31 is compared by said each of the sense amplifiers 666 to be smaller than the comparison voltage at the node N32, said each of the sense amplifiers 666 may generate the output "Out" at a logic level of "1" in the case that one of the resistive random access memories 870, which couples to said each of the sense amplifiers 666, has the low resistance. When the voltage at the node N31 is compared by said each of the sense amplifiers 666 to be greater than the comparison voltage at the node N32, said each of the sense amplifiers 666 may generate the output "Out" at a logic level of "0" in the case that one of the resistive random access memories 870, which couples to said each of the sense amplifiers 666, has the high resistance.

Figure 8G:
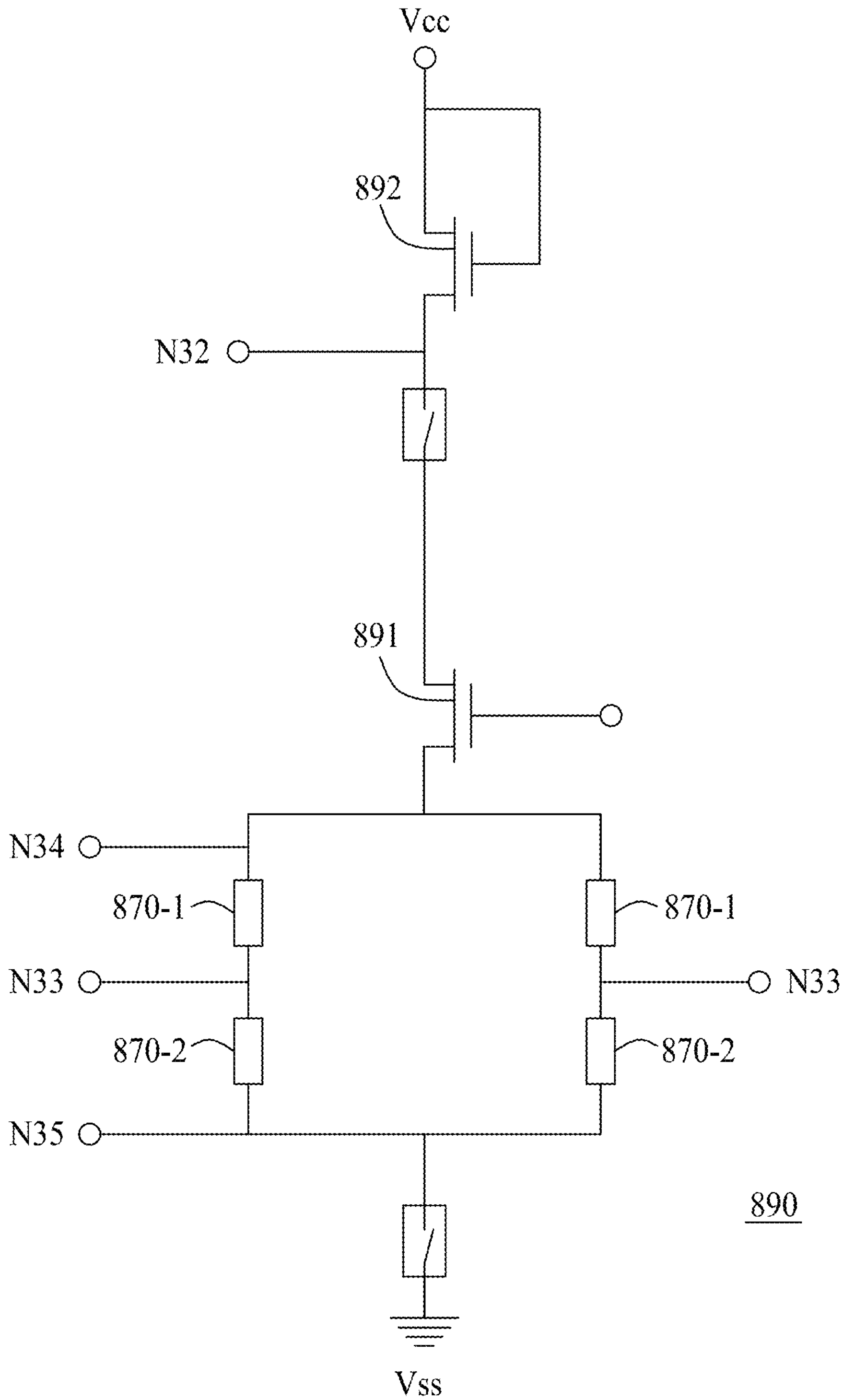
FIG. 8G is a circuit diagram showing a comparison-voltage generating circuit in accordance with an embodiment of the present application.

FIG. 8G is a circuit diagram showing a comparison-voltage generating circuit in accordance with an embodiment of the present application. Referring to FIGS. 8A-8G, a comparison-voltage generating circuit 890 includes two pairs of resistive random access memories 870-1 and 870-2 connected in serial to each other, wherein the pairs of resistive random access memories 870-1 and 870-2 are connected in parallel to each other. In each of the pairs of resistive random access memories 870-1 and 870-2, the resistive random access memory 870-1 may have its top electrode 872 coupling to the top electrode 872 of the resistive random access memory 870-2 and to a node N33, and the resistive random access memory 870-1 may have its bottom electrode 871 coupling to a node N34. The comparison-voltage generating circuit 890 may further include a N-type MOS transistors 891 having a source terminal, in operation, coupling to the bottom electrodes 871 of the resistive random access memories 870-1 in the pairs and to the node N34. The comparison-voltage generating circuit 890 may further include a N-type MOS transistor 892 having a gate terminal coupling to a drain terminal of the N-type MOS transistor 892 and to the voltage Vcc of power supply and a source terminal coupling to the node N32 of the sense amplifier 666 as seen in FIG. 8F via the comparison line. The bottom electrodes 871 of the resistive random access memories 870-2 in the pairs may couple to a node N35.

Referring to FIGS. 8A-8G, when the pairs of resistive random access memories 870-1 and 870-2 in the pairs are being formed in the forming step as illustrated in FIG. 8D, (1) the node N34 may be switched to couple to the voltage Vss of ground reference, (2) the node N33 may be switched to couple to the first activating voltage $V_{F-1}$, (3) the node N35 may be switched to couple to the voltage Vss of ground reference, and (4) the node N32 may be switched not to couple to the bottom electrodes 871 of the resistive random access memories 870-1 in the pairs. Thereby, the resistive random access memories 870-1 and 870-2 in the pairs may be formed to the low resistance.

Referring to FIGS. 8A-8G, after the resistive random access memories 870-1 and 870-2 in the pairs are formed in the forming step, the resetting step as illustrated in FIG. 8D may be performed to the resistive random access memories 870-1 and 870-2 in the pairs. When the pairs of resistive random access memories 870-1 and 870-2 are being reset in the resetting step, (1) the node N34 may be switched to couple to the first programming voltage $V_{Pr-1}$, (2) the node N33 may be switched to couple to the voltage Vss of ground reference, (3) the node N35 may be switched to couple to the first programming voltage $V_{Pr-1}$, and (4) the node N32 may be switched not to couple to the bottom electrodes 871 of the resistive random access memories 870-1 in the pairs. Thereby, the resistive random access memories 870-1 and 870-2 in the pairs may be reset to the high resistance.

Referring to FIGS. 8A-8G, after the resistive random access memories 870-1 and 870-2 in the pairs are reset in the resetting step, the setting step as illustrated in FIG. 8D may be performed to the resistive random access memories 870-2 in the pairs. When the resistive random access memories 870-2 are being set in the setting step, (1) the node N34 may be switched to couple to the second programming voltage $V_{Pr-2}$, (2) the node N33 may be switched to couple to the second programming voltage $V_{Pr-2}$, (3) the node N35 may be switched to couple to the voltage Vss of ground reference, and (4) the node N32 may be switched not to couple to the bottom electrodes 871 of the resistive random access memories 870-1 in the pairs. Thereby, the resistive random access memories 870-2 in the pairs may be set to the low resistance. Accordingly, the resistive random access memories 870-2 in the pairs may be programmed to the low resistance between 100 and 100,000 ohms, and the resistive random access memories 870-1 in the pairs may be programmed to the high resistance between 1,000 and 100,000,000,000 ohms, greater than the low resistance, for example.

Referring to FIGS. 8A-8G, in operation after the resistive random access memories 870-2 in the pairs may be programmed to the low resistance, and the resistive random access memories 870-1 in the pairs may be programmed to the high resistance, (1) the nodes N33, N34 and N35 may be switched to be floating, (2) the node N32 may be switched to couple to the bottom electrodes 871 of the resistive random access memories 870-1 in the pairs, and (3) the bottom electrodes 871 of the resistive random access memories 870-2 in the pairs may be switched to couple to the voltage Vss of ground reference. Thereby, the comparison line, i.e., node N32, of the sense amplifier 666 as seen in FIG. 8F may be at the comparison voltage between a voltage of the node N31 coupling to one of the resistive random access memories 870 programmed to the low resistance and selected by one of the word lines 875 and a voltage of the node N31 coupling to one of the resistive random access memories 870 programmed to the high resistance and selected by one of the word lines 875.

(1.2) First Type of Non-volatile Memory Cells For the Second Alternative

Figure 9A:
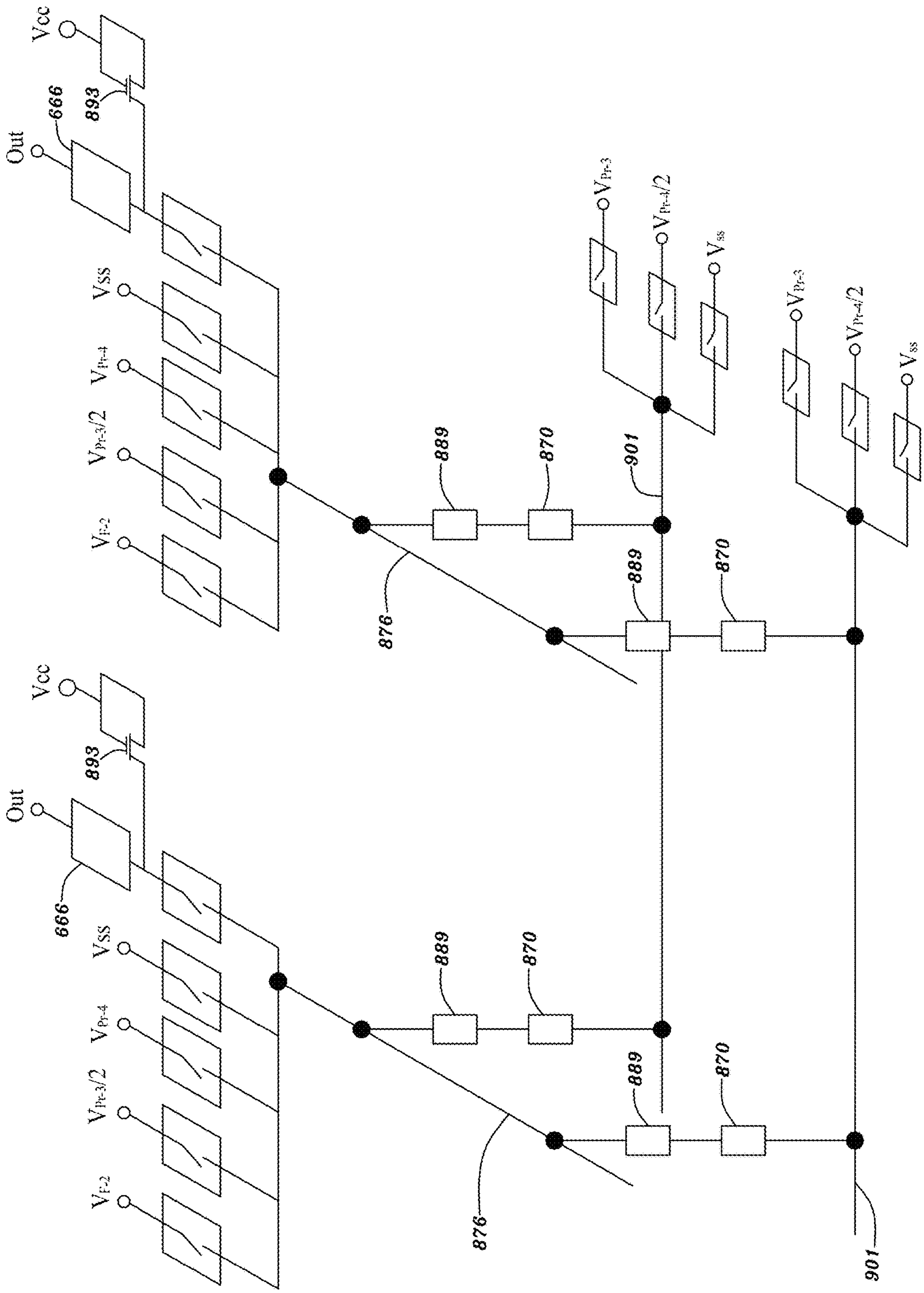
FIG. 9A is a circuit diagram showing another non-volatile memory array in accordance with an embodiment of the present application.

FIG. 9A is a circuit diagram showing another non-volatile memory array in accordance with an embodiment of the present application. The circuits as illustrated in FIG. 8H may be referred to those as illustrated in FIGS. 8A-8G, but the difference therebetween is that the switches 888 arranged in the array as seen in FIG. 8E may be replaced with multiple selectors 889 arranged in the array to couple in series to the resistive random access memories 870 respectively, and the reference lines 877 as illustrated in FIG. 8E are used as word lines 901. Referring to FIG. 9A, multiple of the resistive random access memories 870 may be selected by the selectors 889 in the forming, setting or resetting step and in operation. Each of the selectors 889 may be controlled to be turned on or off in accordance with the voltage bias between two opposite terminals of said each of the selectors 889. For said each of the selectors, the lower bias is applied to its two opposite terminals, the higher resistance it has; the larger bias is applied to its two opposite terminals, the lower resistance it has. Further, its resistance may change with nonlinearity based on the bias applied to its two opposite terminals.

Figure 9D:
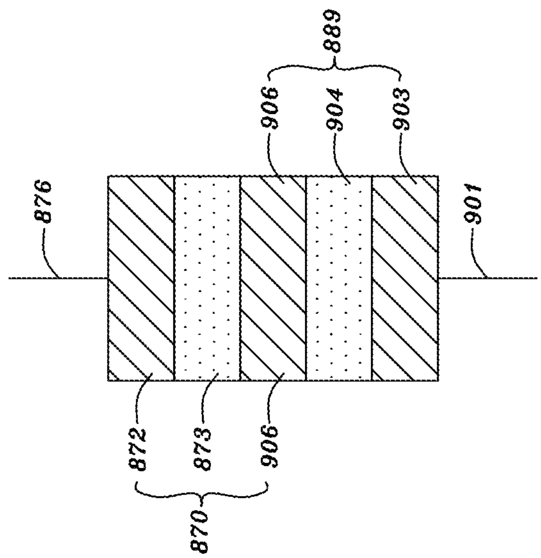
FIGS. 9C and 9D are schematically cross-sectional views showing various structures of a selective resistive random access memory stacked with a selector in accordance with an embodiment of the present application.
Figure 9C:
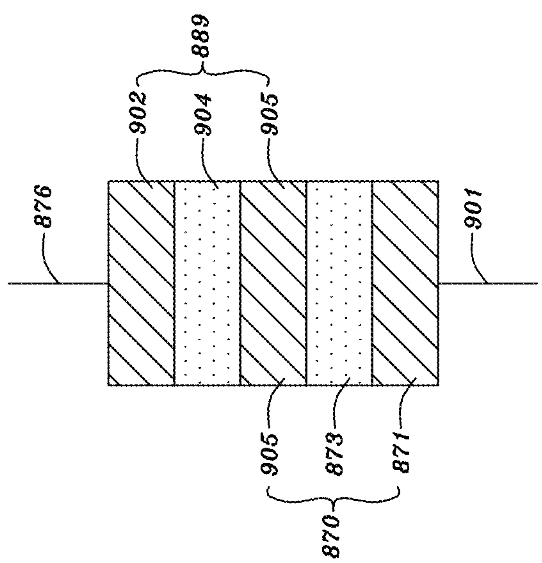
Figure 9B:
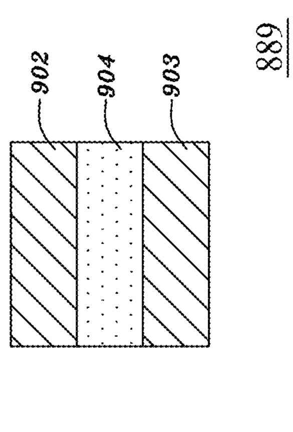
FIG. 9B is a schematically cross-sectional view showing a structure of a selector in accordance with the present application.

FIG. 9B is a schematically cross-sectional view showing a structure of a selector in accordance with the present application. Referring to FIG. 9B, each of the selectors 889 may be a current-tunneling device formed with a metal-insulator-metal (MIM) structure. Each of the selectors 889 may include (1) a top electrode 902, such as a layer of nickel, platinum or titanium, at one of the two opposite terminals thereof, (2) a bottom electrode 903, such as a layer of platinum, at the other of the two opposite terminals thereof and (3) a tunneling oxide layer 904 between its top and bottom electrodes 902 and 903. The tunneling oxide layer 904 may have a layer of $TiO_2$, $Al_2O_3$, or $HfO_2$ with a thickness between 5 nm and 20 nm, which may be formed by an atomic-layer-deposition (ALD) process.

FIGS. 9C and 9D are schematically cross-sectional views showing various structures of a selective resistive random access memory stacked with a selector in accordance with an embodiment of the present application. In an example, as seen in FIGS. 9A and 9C, each of the selectors 889 may be stacked on one of the resistive random access memories 870, and the bottom electrode 903 of said each of the selectors 889 and the top electrode 872 of said one of the resistive random access memories 870 may be made as a singal metal layer 905 such as a layer of platinum having a thickness between 1 and 20 nanometers, wherein said each of the selectors 889 may couple to the bit line 876 via its top electrode 902, and said one of the resistive random access memories 870 may couple to the word line 901 via its bottom electrode 871. In another example, as seen in FIG. 8D, each of the resistive random access memories 870 may be stacked on one of the selectors 889, and the bottom electrode 871 of said each of the resistive random access memories 870 and the top electrode 902 of said one of the selectors 889 may be made as a singal metal layer 906 such as a layer of nickel, platinum or titanium having a thickness between 1 and 20 nanometers, wherein said each of the resistive random access memories 870 may couple to the bit line 876 via its top electrode 872, and said one of the selectors 889 may couple to the word line 901 via its bottom electrode 903.

Referring to FIGS. 9A-9D, each of the selectors 889 may be a bipolar tunneling MIM device. For the bipolar tunneling MIM device, when a positive voltage bias applied to the two opposite terminals thereof increases by one volt, a current flowing through it in a forward direction may increase by $10^5$ times or greater than $10^5$ times, by $10^4$ times or greater than $10^4$ times, by $10^3$ times or greater than $10^3$ times or by $10^2$ times or greater than $10^2$ times; when a negative voltage bias applied to the two opposite terminals thereof increases by one volt, a current flowing through it in a backward direction, opposite to the forward direction, may increase by $10^5$ times or greater than $10^5$ times, by $10^4$ times or greater than $10^4$ times, by $10^3$ times or greater than $10^3$ times or by $10^2$ times or greater than $10^2$ times. The positive threshold-voltage bias to turn on the bipolar tunneling MIM device to allow a current flowing therethrough in the forward direction may range from 0.3 volts to 2.5 volts, 0.5 volts to 2 volts or 0.5 volts to 1.5 volts, and the negative threshold-voltage bias to turn on the bipolar tunneling MIM device to allow a current flowing therethrough in the backard direction may range from 0.3 volts to 2.5 volts, 0.5 volts to 2 volts or 0.5 volts to 1.5 volts.

Alternatively, referring to FIG. 9A, each of the selectors 889 may be composed of two unipolar tunneling MIM devices (not shown) arranged in parallel with two respective terminals coupling in series to one of the resistive random access memories 870. For the two unipolar tunneling MIM devices, when a positive voltage bias applied to the two opposite terminals of each of them increases by one volt, a current flowing through one of them in a forward direction may increase by $10^5$ times or greater than $10^5$ times, by $10^4$ times or greater than $10^4$ times, by $10^3$ times or greater than $10^3$ times or by $10^2$ times or greater than $10^2$ times; when a negative voltage bias applied to the two opposite terminals of each of them increases by one volt, a current flowing through the other of them in a backward direction, opposite to the forward direction, may increase by $10^5$ times or greater than $10^5$ times, by $10^4$ times or greater than $10^4$ times, by $10^3$ times or greater than $10^3$ times or by $10^2$ times or greater than $10^2$ times. The positive threshold-voltage bias to turn on said one of the unipolar tunneling MIM devices to allow a current flowing therethrough in the forward direction and to turn off said the other of the unipolar tunneling MIM devices may range from 0.3 volts to 2.5 volts, 0.5 volts to 2 volts or 0.5 volts to 1.5 volts, and the negative threshold-voltage bias to turn on said the other of the unipolar tunneling MIM devices to allow a current flowing therethrough in the backard direction and to turn off said one of the unipolar tunneling MIM devices may range from 0.3 volts to 2.5 volts, 0.5 volts to 2 volts or 0.5 volts to 1.5 volts.

Referring to FIGS. 9A-9D, when the resistive random access memories 870 start to be first used before the resetting or setting step as illustrated in FIG. 8D, the forming step as illustrated in FIG. 8D is performed to each of the resistive random access memories 870 to form vacancies in its resistive layer 873 for electric charges capable of moving between its bottom and top electrodes 871 and 872 in the low resistant manner. When each of the resistive random access memories 870 is being formed, (1) all of the bit lines 876 are switched to couple to a second activating voltage $V_{F-2}$ greater than or equal to the forming voltage $V_f$ of the resistive random access memories 870 plus the positive threshold-voltage bias of the selectors 889, wherein the second activating voltage $V_{F-2}$ may range from 0.25 to 3.3 volts, and (2) all of the word lines 901 are switched to couple to the voltage Vss of ground reference. Thereby, for the selective resistive random access memories provided with the stacked structure as seen in FIG. 9C, the second activating voltage $V_{F-2}$ may be applied to the top electrode 902 of each of the selectors 889 and a voltage Vss of ground reference may be applied to the bottom electrode 871 of each of the resistive random access memories 870 such that said each of the selectors 889 may be turned on to couple said each of the resistive random access memories 870 to one of the bit lines 876 and the forming step as illustrated in FIG. 8D may be performed to said each of the resistive random access memories 870 to be formed to the low resistance between 100 and 100,000 ohms, i.e., to a logic level of "0". For the selective resistive random access memories provided with the stacked structure as seen in FIG. 9D, the second activating voltage $V_{F-2}$ may be applied to the top electrode 872 of each of the resistive random access memories 870 and the voltage Vss of ground reference may be applied to the bottom electrode 903 of each of the selectors 889 such that said each of the selectors 889 may be turned on to couple said each of the resistive random access memories 870 to one of the word lines 901 and the forming step as illustrated in FIG. 8D may be performed to said each of the resistive random access memories 870 to be formed to the low resistance between 100 and 100,000 ohms, i.e., to a logic level of "0".

Figure 9E:
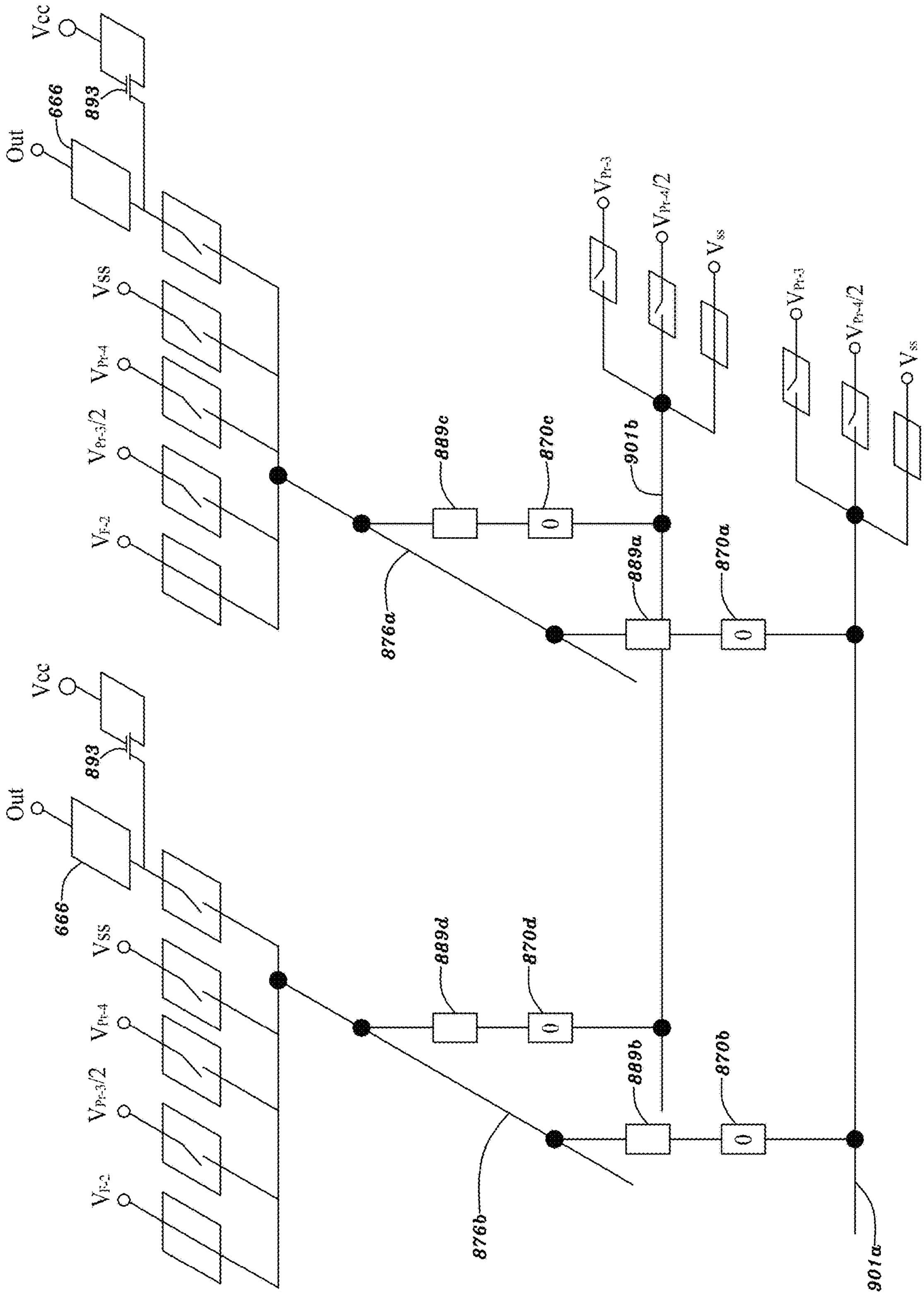
FIG. 9E is a circuit diagram showing selective resistive random access memories in a forming step in accordance with an embodiment of the present application.

For an example, FIG. 9E is a circuit diagram showing selective resistive random access memories in a forming step in accordance with an embodiment of the present application. Referring to FIG. 9E, the selective resistive random access memories may include a first one and second one arranged in a first row (y=y1) and a third one and fourth one arranged in a second row (y=y2). The first selective resistive random access memory at correspondence of (x1, y1) may include a first resistive random access memory 870*a* and a first selector 889*a* stacked as illustrated in FIG. 9C or 9D. The second selective resistive random access memory at correspondence of (x2, y1) may include a second resistive random access memory 870*b* and a second selector 889*b* stacked as illustrated in FIG. 9C or 9D. The third selective resistive random access memory at correspondence of (x1, y2) may include a third resistive random access memory 870*c* and a third selector 889*c* stacked as illustrated in FIG. 9C or 9D. The fourth selective resistive random access memory at correspondence of (x2, y2) may include a fourth resistive random access memory 870*d* and a fourth selector 889*d* stacked as illustrated in FIG. 9C or 9D.

Referring to FIG. 9E, if the first through fourth resistive random access memories (RRAM) 870*a*-870*d* are being formed, in the above forming step, to the low resistance, i.e., to a logic level of "0", (1) a first word line 901*a* corresponding to the first and second RRAMs 870*a* and 870*b* and a second word line 901*b* corresponding to the third and fourth RRAMs 870*c* and 870*d* are switched to couple to the voltage Vss of ground reference, and (2) a first bit line 876*a* for the first and third RRAMs 870*a* and 870*c* and a second bit line 876*b* for the second and fourth RRAMs 870*b* and 870*d* are switched to couple to the second activating voltage $V_{F-2}$.

Next, referring to FIGS. 9A-9D, a resetting step as illustrated in FIG. 8D may be performed, one row by one row and in turn, to a first group of the resistive random access memories 870 but not to a second group of the resistive random access memories 870, in which (1) each of the word lines 901 corresponding to the resistive random access memories 870 in a row may be selected one by one and in turn to be switched to couple to a third programming voltage $V_{Pr-3}$ greater than or equal to the resetting voltage $V_{RE}$ of the resistive random access memories 870 plus the negative threshold-voltage bias of the selectors 889, wherein the third programming voltage $V_{Pr-3}$ may range from 0.25 to 3.3 volts, wherein the unselected word lines 901 corresponding to the resistive random access memories 870 in the other rows may be switched to couple to the voltage Vss of ground reference, (2) the bit lines 876 in a first group each for one of the resistive random access memories 870 in the first group in the row may be switched to couple to the voltage Vss of ground reference, and (3) the bit lines 876 in a second group each for one of the resistive random access memories 870 in the second group in the row may be switched to couple to a voltage between one third and two thirds of the third programming voltage $V_{Pr-3}$, such as an half of the third programming voltage $V_{Pr-3}$. Thereby, for the selective resistive random access memories in the first group in the row provided with the stacked structure as seen in FIG. 9C, the voltage Vss of ground reference may be applied to the top electrode 902 of each of the selectors 889 in a first group in the row and the third programming voltage $V_{Pr-3}$ may be applied to the bottom electrode 871 of each of the resistive random access memories 870 in the first group in the row such that said each of the selectors 889 in the first group in the row may be turned on to couple said each of the resistive random access memories 870 in the first group in the row to one of the bit lines 876 and the resetting step as illustrated in FIG. 8D may be performed to said each of the resistive random access memories 870 in the first group in the row to be reset to the high resistance between 1,000 and 100,000,000,000 ohms, greater than the low resistance, in the resetting step, and thus programmed to a logic level of "1"; for the selective resistive random access memories in the second group in the row provided with the stacked structure as seen in FIG. 9C, between one third and two thirds of the third programming voltage $V_{Pr-3}$, such as an half of the third programming voltage $V_{Pr-3}$, may be applied to the top electrode 902 of each of the selectors 889 in a second group in the row and the third programming voltage $V_{Pr-3}$ may be applied to the bottom electrode 871 of each of the resistive random access memories 870 in the second group in the row such that said each of the selectors 889 in the second group in the row may be turned off to decouple said each of the resistive random access memories 870 in the second group in the row from any of the bit lines 876 and the resistive random access memories 870 in the second group in the row may have been kept in the previous state; the current flowing through said each of the selectors 889 in the first group in the row is greater than that flowing through said each of the selectors 889 in the second group in the row by an order of equal to or greater than 5, 4, 3 or 2. For the selective resistive random access memories in the first group in the row provided with the stacked structure as seen in FIG. 9D, the voltage Vss of ground reference may be applied to the top electrode 872 of each of the resistive random access memories 870 in the first group in the row and the third programming voltage $V_{Pr-3}$ may be applied to the bottom electrode 903 of each of the selectors 889 in a first group in the row such that said each of the selectors 889 in the first group in the row may be turned on to couple said each of the resistive random access memories 870 in the first group in the row to one of the word lines 901 and the resetting step as illustrated in FIG. 8D may be performed to said each of the resistive random access memories 870 in the first group in the row to be reset to the high resistance between 1,000 and 100,000,000,000 ohms in the resetting step, and thus programmed to a logic level of "1"; for the selective resistive random access memories in the second group in the row provided with the stacked structure as seen in FIG. 9D, between one third and two thirds of the third programming voltage $V_{Pr-3}$, such as an half of the third programming voltage $V_{Pr-3}$, may be applied to the top electrode 872 of each of the resistive random access memories 870 in the second group in the row and the third programming voltage $V_{Pr-3}$ may be applied to the bottom electrode 903 of each of the selectors 889 in a second group in the row such that said each of the selectors 889 in the second group in the row may be turned off to decouple said each of the resistive random access memories 870 in the second group in the row from any of the word lines 901 and the resistive random access memories 870 in the second group in the row may have been kept in the previous state; the current flowing through said each of the selectors 889 in the first group in the row is greater than that flowing through said each of the selectors 889 in the second group in the row by an order of equal to or greater than 5, 4, 3 or 2.

Figure 9F:
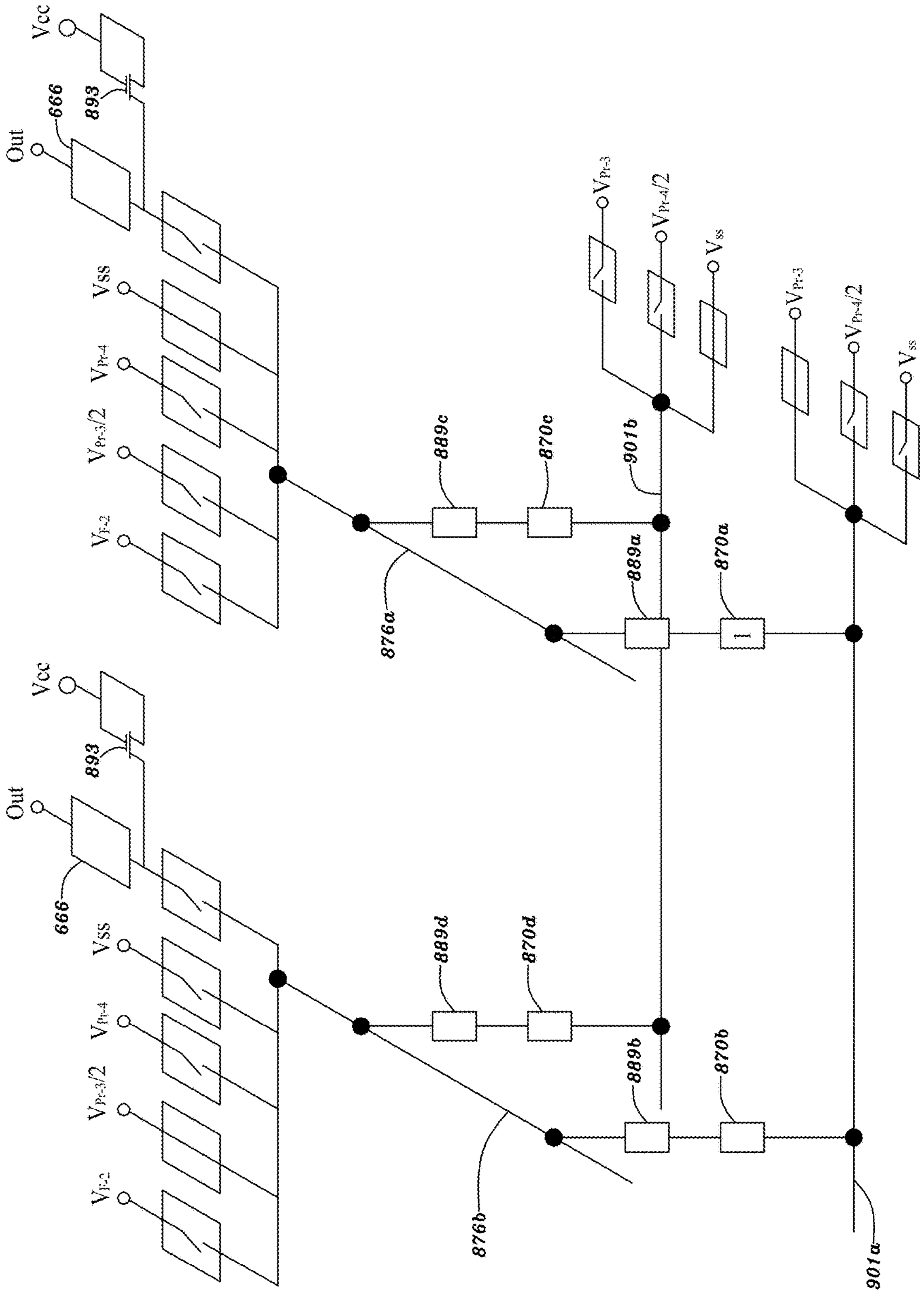
FIG. 9F is a circuit diagram showing selective resistive random access memories in a resetting step in accordance with an embodiment of the present application.

For the example, FIG. 9F is a circuit diagram showing selective resistive random access memories in a resetting step in accordance with an embodiment of the present application. Referring to FIG. 9F, if the first RRAM 870*a* is being reset, in the above resetting step, to a high-resistance (HR) state, i.e., programmed to a logic level of "1", and the second, third and fourth RRAMs 870*b*, 870*c* and 870*d* are kept in the previous state, (1) the first word line 901*a* corresponding to the first and second RRAMs 870*a* and 870*b* is selected and switched to couple to the third programming voltage $V_{Pr-3}$, (2) the first bit line 876*a* for the first RRAM 870*a* is switched to couple to the voltage Vss of ground reference, (3) the second bit line 876*b* for the second RRAM 870*b* is switched to couple to a voltage between one third and two thirds of the third programming voltage $V_{Pr-3}$, such as an half of the third programming voltage $V_{Pr-3}$, and (4) the second word line 901*b* corresponding to the third and fourth RRAMs 870*c* and 870*d* is unselected and switched to couple to the voltage Vss of ground reference.

Referring to FIGS. 9A-9D, a setting step as illustrated in FIG. 8D may be performed, one row by one row and in turn, to the second group of the resistive random access memories 870 but not to the first group of the resistive random access memories 870, in which (1) each of the word lines 901 corresponding to the resistive random access memories 870 in the row may be selected one by one and in turn to be switched to couple to the voltage Vss of ground reference, wherein the unselected word lines 901 corresponding to the resistive random access memories 870 in the other rows may be switched to couple to a voltage between one third and two thirds of a fourth programming voltage $V_{Pr-4}$, such as an half of the fourth programming voltage $V_{Pr-4}$, wherein the fourth programming voltage $V_{Pr-4}$ may be greater than or equal to the setting voltage $V_{SE}$ of the resistive random access memories 870 plus the positive threshold-voltage bias of the selectors 889, wherein the fourth programming voltage $V_{Pr-4}$ may range from 0.25 to 3.3 volts, (2) the bit lines 876 in the first group each for one of the resistive random access memories 870 in the first group in the row may be switched to couple to the voltage Vss of ground reference, and (3) the bit lines 876 in the second group each for one of the resistive random access memories 870 in the second group in the row may be switched to couple to the fourth programming voltage $V_{Pr-4}$. Thereby, for the selective resistive random access memories in the second group in the row provided with the stacked structure as seen in FIG. 9C, the fourth programming voltage $V_{Pr-4}$ may be applied to the top electrode 902 of each of the selectors 889 in the second group in the row and the voltage Vss of ground reference may be applied to the bottom electrode 871 of each of the resistive random access memories 870 in the second group in the row such that said each of the selectors 889 in the second group in the row may be turned on to couple said each of the resistive random access memories 870 in the second group in the row to one of the bit lines 876 and the setting step as illustrated in FIG. 8D may be performed to said each of the resistive random access memories 870 in the second group in the row to be set to the low resistance between 100 and 100,000 ohms in the setting step, and thus programmed to a logic level of "0"; for the selective resistive random access memories in the first group in the row provided with the stacked structure as seen in FIG. 9C, the voltage Vss of ground reference may be applied to the top electrode 902 of each of the selectors 889 in the first group in the row and the voltage Vss of ground reference may be applied to the bottom electrode 871 of each of the resistive random access memories 870 in the first group in the row such that said each of the selectors 889 in the first group in the row may be turned off to decouple said each of the resistive random access memories 870 in the first group in the row from any of the bit lines 876 and the resistive random access memories 870 in the first group in the row may have been kept in the previous state; the current flowing through said each of the selectors 889 in the second group in the row is greater than that flowing through said each of the selectors 889 in the first group in the row by an order of equal to or greater than 5, 4, 3 or 2. For the selective resistive random access memories in the second group in the row provided with the stacked structure as seen in FIG. 9D, the fourth programming voltage $V_{Pr-4}$ may be applied to the top electrode 872 of each of the resistive random access memories 870 in the second group in the row and the voltage Vss of ground reference may be applied to the bottom electrode 903 of each of the selectors 889 in the second group in the row such that said each of the selectors 889 in the second group in the row may be turned on to couple said each of the resistive random access memories 870 in the second group in the row to one of the word lines 901 and the setting step as illustrated in FIG. 8D may be performed to said each of the resistive random access memories 870 in the second group in the row to be set to the low resistance between 100 and 100,000 ohms in the setting step, and thus programmed to a logic level of "0"; for the selective resistive random access memories in the first group in the row provided with the stacked structure as seen in FIG. 9D, the voltage Vss of ground reference may be applied to the top electrode 872 of each of the resistive random access memories 870 in the first group in the row and the voltage Vss of ground reference may be applied to the bottom electrode 903 of each of the selectors 889 in the first group in the row such that said each of the selectors 889 in the first group in the row may be turned off to decouple said each of the resistive random access memories 870 in the first group in the row from any of the word lines 901 and the resistive random access memories 870 in the first group in the row may have been kept in the previous state; the current flowing through said each of the selectors 889 in the second group in the row is greater than that flowing through said each of the selectors 889 in the first group in the row by an order of equal to or greater than 5, 4, 3 or 2.

Figure 9G:
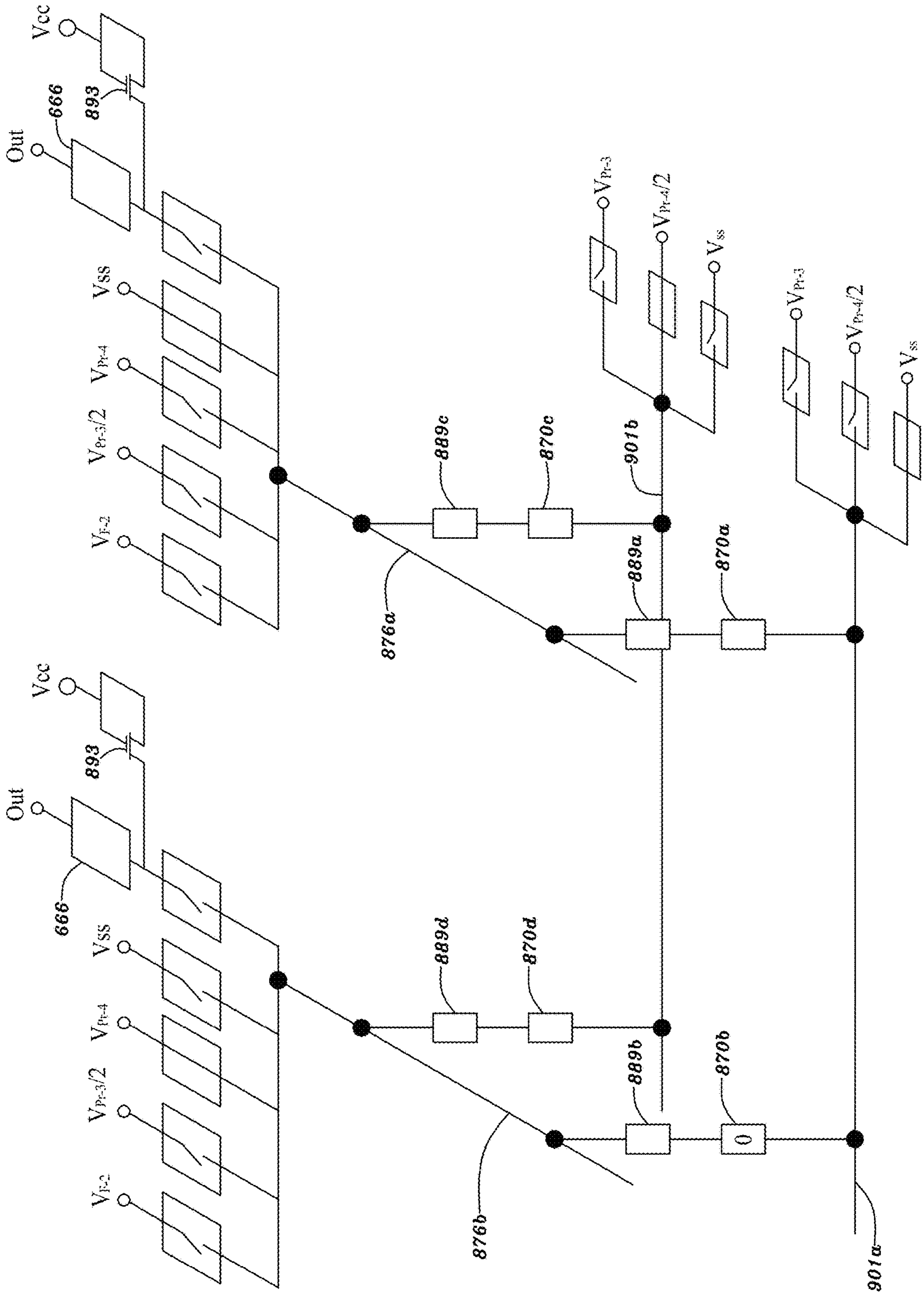
FIG. 9G is a circuit diagram showing selective resistive random access memories in a setting step in accordance with an embodiment of the present application.

For the example, FIG. 9G is a circuit diagram showing selective resistive random access memories in a setting step in accordance with an embodiment of the present application. Referring to FIG. 9G, if the second RRAM 870*b* is being set, in the above setting step, to a low-resistance (LR) state, i.e., programmed to a logic level of "0", and the first, third and fourth RRAMs 870*a*, 870*c* and 870*d* are kept in the previous state, (1) the first word line 901*a* corresponding to the first and second RRAMs 870*a* and 870*b* is selected and switched to couple to the voltage Vss of ground reference, (2) the second bit line 876*b* for the second RRAM 870*b* is switched to couple to the fourth programming voltage $V_{Pr-4}$, (3) the first bit line 876*a* for the first RRAM 870*a* is switched to couple to the voltage Vss of ground reference, and (4) the second word line 901*b* corresponding to the third and fourth RRAMs 870*c* and 870*d* is unselected and switched to couple to a voltage between one third and two thirds of the fourth programming voltage $V_{Pr-4}$, such as an half of the fourth programming voltage $V_{Pr-4}$.

In operation, referring to FIGS. 9A-9D, (1) each of the bit lines 876 may be switched to couple to the node N31 of one of the sense amplifiers 666 as illustrated in FIG. 8F and to the source terminal of one of the N-type MOS transistors 893, and (2) each of the word lines 901 corresponding to the resistive random access memories 870 in a row may be selected one by one and in turn to be switched to couple to the voltage Vss of ground reference to turn on the selectors 889 in a row to couple each of the resistive random access memories 870 in the row to one of the bit lines 876 for the structure of the selective resistive random access memories as illustrated in FIG. 9C or to couple all of the resistive random access memories 870 in the row to a same one of the word lines 901 for the structure of the selective resistive random access memories as illustrated in FIG. 9D, wherein the unselected word lines 901 corresponding to the resistive random access memories 870 in the other rows may be switched to be floating to turn off the selectors 889 in the other rows to decouple each of the resistive random access memories 870 in the other rows from any of the bit lines 876 for the structure of the selective resistive random access memories as illustrated in FIG. 9C or to decouple each of the resistive random access memories 870 in the other rows from any of the word lines 901 for the structure of the selective resistive random access memories as illustrated in FIG. 9D. Thereby, each of the sense amplifiers 666 may compare a voltage at one of the bit lines 876, i.e., at the node N31 as seen in FIG. 8F, with a comparison voltage at a comparison line, i.e., at the node N32 as seen in FIG. 8F, into a compared data and then generate an output "Out" of one of the resistive random access memories 870 coupling to said one of the bit lines 876 based on the compared data. For example, when the voltage at the node N31 is compared by said each of the sense amplifiers 666 to be smaller than the comparison voltage at the node N32, said each of the sense amplifiers 666 may generate the output "Out" at a logic level of "1" in the case that one of the resistive random access memories 870, which couples to said each of the sense amplifiers 666, has the low resistance. When the voltage at the node N31 is compared by said each of the sense amplifiers 666 to be greater than the comparison voltage at the node N32, said each of the sense amplifiers 666 may generate the output "Out" at a logic level of "0" in the case that one of the resistive random access memories 870, which couples to said each of the sense amplifiers 666, has the high resistance.

Figure 9H:
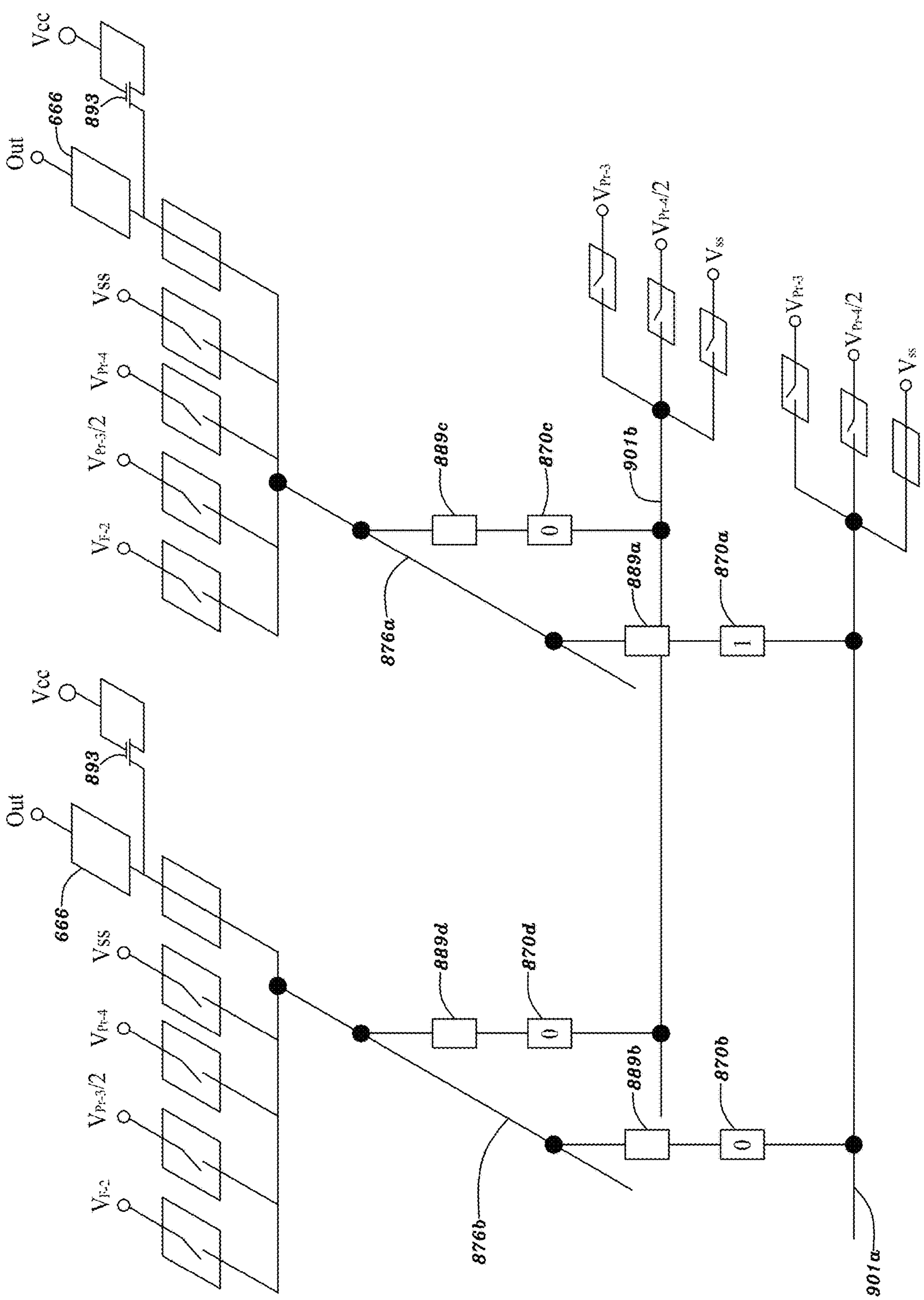
FIG. 9H is a circuit diagram showing selective resistive random access memories in operation in accordance with an embodiment of the present application.

For the example, FIG. 9H is a circuit diagram showing selective resistive random access memories in operation in accordance with an embodiment of the present application. Referring to FIG. 9H, if the first and second RRAMs 870*a* and 870*b* are being read in operation and the third and fourth RRAMs 870*c* and 870*d* are not being read, (1) the first word line 901*a* corresponding to the first and second RRAMs 870*a* and 870*b* is selected and switched to couple to the voltage Vss of ground reference, (2) the first and second bit lines 876*a* and 876*b* for the first and second RRAMs 870*a* and 870*b* are switched to couple to the sense amplifiers 666 respectively, and (3) the second word line 901*b* corresponding to the third and fourth RRAMs 870c and 870d is unselected and switched to be floating.

Figure 9I:
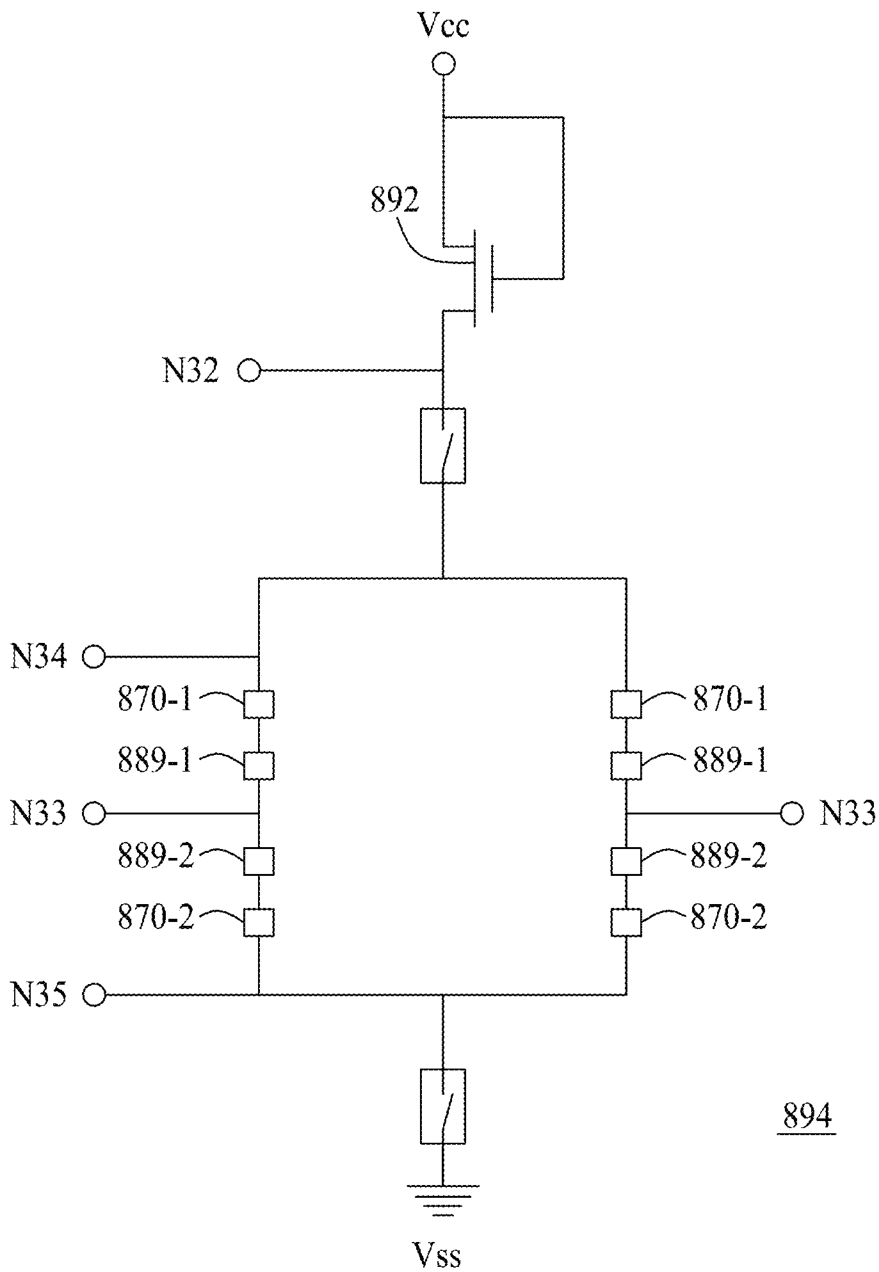
FIG. 9I is a circuit diagram showing a comparison-voltage generating circuit in accordance with an embodiment of the present application.

FIG. 9I is a circuit diagram showing a comparison-voltage generating circuit in accordance with an embodiment of the present application. Referring to FIGS. 9A-9C and 9E-9I, a comparison-voltage generating circuit 894 includes two pairs of a first combination of the resistive random access memory 870-1 and the selector 889-1 connected in serial to each other as seen in FIG. 9C and a second combination of the resistive random access memory 870-2 and the selector 889-2 connected in serial to each other as seen in FIG. 9C, wherein the pairs of the first and second combinations are connected in parallel to each other. In each of the pairs of the first and second combinations, the selector 889-1 may have its top electrode 902 coupling to the top electrode 902 of the selector 889-1 and to a node N33, and the resistive random access memory 870-1 may have its bottom electrode 871 coupling to a node N34. The comparison-voltage generating circuit 894 may include a N-type MOS transistor 892 having a gate terminal coupling to a drain terminal of the N-type MOS transistor 892 and to the voltage Vcc of power supply and a source terminal coupling to the node N32 of the sense amplifier 666 as seen in FIG. 8F via the comparison line. The bottom electrodes 871 of the resistive random access memories 870-2 in the pairs may couple to a node N35.

Referring to FIGS. 9A-9C and 9E-9I, when the resistive random access memories 870-1 and 870-2 in the pairs are being formed in the forming step as illustrated in FIG. 8D, (1) the node N34 may be switched to couple to the voltage Vss of ground reference, (2) the node N33 may be switched to couple to the second activating voltage $V_{Pr-2}$, (3) the node N35 may be switched to couple to the voltage Vss of ground reference, and (4) the node N32 may be switched not to couple to the bottom electrodes 871 of the resistive random access memories 870-1 in the pairs. Thereby, the resistive random access memories 870-1 and 870-2 in the pairs may be formed to the low resistance.

Referring to FIGS. 9A-9C and 9E-9I, after the resistive random access memories 870-1 and 870-2 in the pairs are formed in the forming step, the resetting step as illustrated in FIG. 8D may be performed to the resistive random access memories 870-1 and 870-2 in the pairs. When the pairs of resistive random access memories 870-1 and 870-2 are being reset in the resetting step, (1) the node N34 may be switched to couple to the third programming voltage $V_{Pr-3}$, (2) the node N33 may be switched to couple to the voltage Vss of ground reference, (3) the node N35 may be switched to couple to the third programming voltage $V_{Pr-3}$, and (4) the node N32 may be switched not to couple to the bottom electrodes 871 of the resistive random access memories 870-1 in the pairs. Thereby, the resistive random access memories 870-1 and 870-2 in the pairs may be reset to the high resistance.

Referring to FIGS. 9A-9C and 9E-9I, after the resistive random access memories 870-1 and 870-2 in the pairs are reset in the resetting step, the setting step as illustrated in FIG. 8D may be performed to the resistive random access memories 870-2 in the pairs. When the resistive random access memories 870-2 are being set in the setting step, (1) the node N34 may be switched to couple to the fourth programming voltage $V_{Pr-4}$, (2) the node N33 may be switched to couple to the fourth programming voltage $V_{Pr-4}$, (3) the node N35 may be switched to couple to the voltage Vss of ground reference, and (4) the node N32 may be switched not to couple to the bottom electrodes 871 of the resistive random access memories 870-1 in the pairs. Thereby, the resistive random access memories 870-2 in the pairs may be set to the low resistance. Accordingly, the resistive random access memories 870-2 in the pairs may be programmed to the low resistance between 100 and 100,000 ohms, and the resistive random access memories 870-1 in the pairs may be programmed to the high resistance between 1,000 and 100,000,000,000 ohms, greater than the low resistance, for example.

Referring to FIGS. 9A-9C and 9E-9I, in operation after the resistive random access memories 870-2 in the pairs may be programmed to the low resistance, and the resistive random access memories 870-1 in the pairs may be programmed to the high resistance, (1) the nodes N33, N34 and N35 may be switched to be floating, (2) the node N32 may be switched to couple to the bottom electrodes 871 of the resistive random access memories 870-1 in the pairs, and (3) the bottom electrodes 871 of the resistive random access memories 870-2 in the pairs may be switched to couple to the voltage Vss of ground reference. Thereby, the comparison line, i.e., node N32, of the sense amplifier 666 as seen in FIG. 8F may be at the comparison voltage between a voltage of the node N31 coupling to one of the resistive random access memories 870 programmed to the low resistance and selected by one of the word lines 901 and a voltage of the node N31 coupling to one of the resistive random access memories 870 programmed to the high resistance and selected by one of the word lines 901.

(1.3) First Type of Non-volatile Memory Cells For the Third Alternative

Figure 10A:
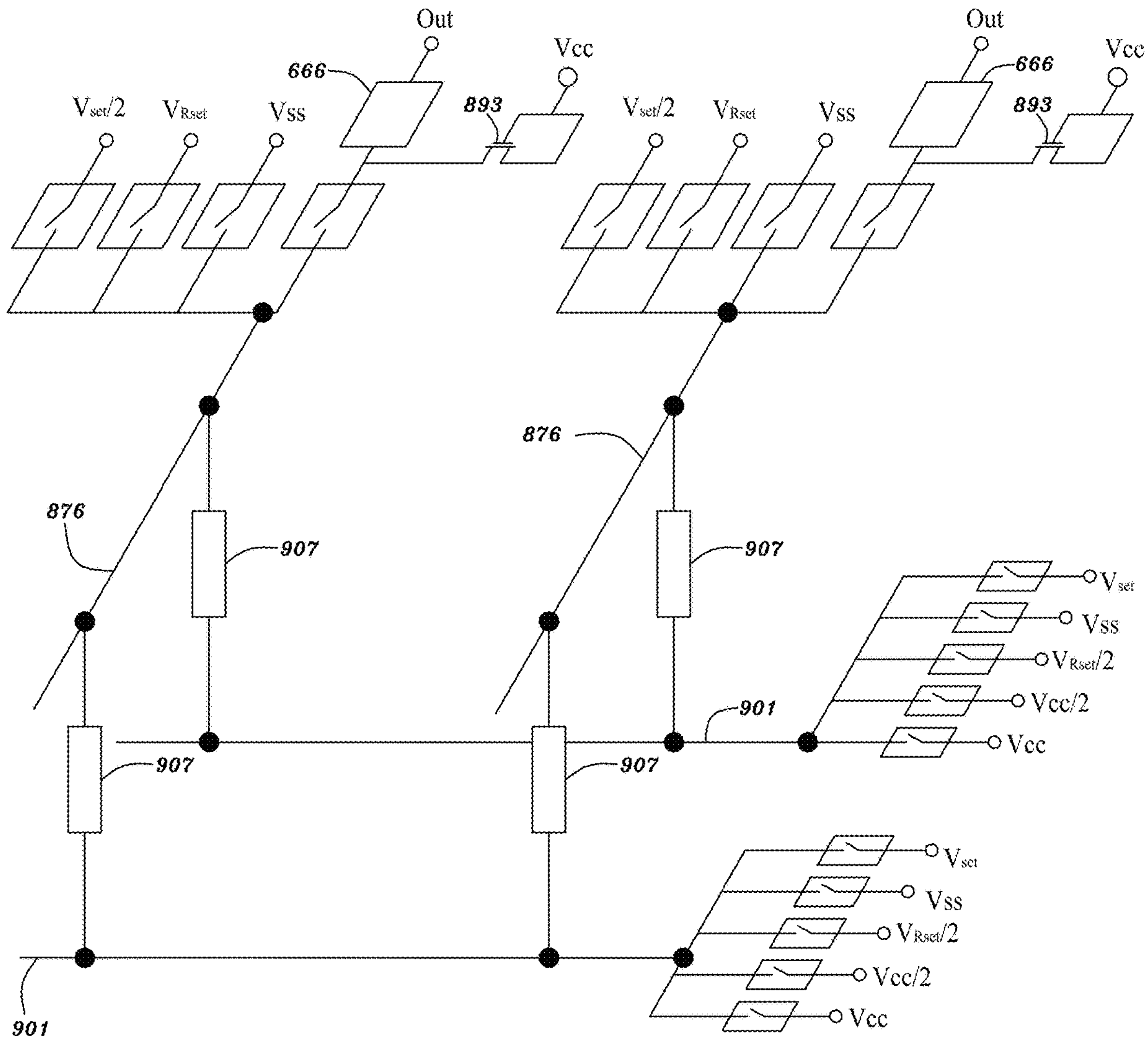
FIG. 10A is a circuit diagram showing another non-volatile memory array in accordance with an embodiment of the present application.
Figure 10B:
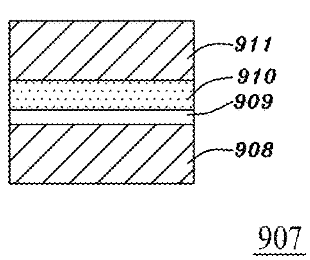
FIG. 10B is a schematically cross-sectional view showing a structure of a self-select (SS) resistive random access memory in accordance with the present application.

FIG. 10A is a circuit diagram showing another non-volatile memory array in accordance with an embodiment of the present application. The circuits as illustrated in FIG. 10A may be referred to those as illustrated in FIG. 9A, but the difference therebetween is that the selectors 889 and resistive random access memories 870 as illustrated in FIG. 9A may be replaced with self-select (SS) resistive random access memory (RRAM) cells 907, i.e., non-volatile memory cells. FIG. 10B is a schematically cross-sectional view showing a structure of a self-select (SS) resistive random access memory in accordance with the present application. Referring to FIGS. 10A and 10B, the self-select (SS) resistive random access memory cell 907 may include (1) a bottom electrode 908, such as a layer of nickel having a thickness between 20 nm and 200 nm, 50 nm and 150 nm, or 80 nm and 120 nm, wherein the layer of nickel may be formed by a sputtering process, (2) an oxide layer 909, such as a layer of hafnium oxide ($HfO_2$) having a thickness greater than 5 nm, 10 nm, or 15 nm or between 1 nm and 30 nm, 3 nm and 20 nm, or 5 nm and 15 nm, on the bottom electrode 908, wherein the layer of hafnium oxide may be formed by an atomic layer deposition (ALD) process or by a reactive magnetron direct-current (DC) sputtering process using hafnium as a target and using oxygen and/or argon as gas flow, (3) an insulting layer 910, such a layer of titanium dioxide having a thickness greater than 40 nm, 60 nm or 80 nm, or between 20 nm and 100 nm, 40 nm and 80 nm, or 50 nm and 70 nm, on the oxide layer 909, wherein the layer of titanium dioxide may be formed by an atomic layer deposition (ALD) process or by a reactive magnetron direct-current (DC) sputtering process using titamium as a target and using oxygen and/or argon as gas flow, and (4) a top electrode 911, such a layer of nickel having a thickness between 20 nm and 200 nm, 50 nm and 150 nm, or 80 nm and 120 nm, wherein the layer of nickel may be formed by a sputtering process. Oxygen vacancies or oxygen vacancy conductive filaments or paths may be formed in the oxide layer 909. The insulating layer 910 may have a conduction energy band energy lower (more positive) than that of the oxide layer 909 such that an energy barrier may be formed at an interface between the insulating layer 910 and oxide layer 909. Each of the self-select (SS) resistive random access memory cells 907 may couple to one of the bit lines 876 via the top electrode 911 thereof and couple to one of the word lines 901 via the bottom electrode 908 thereof.

Figure 10C:
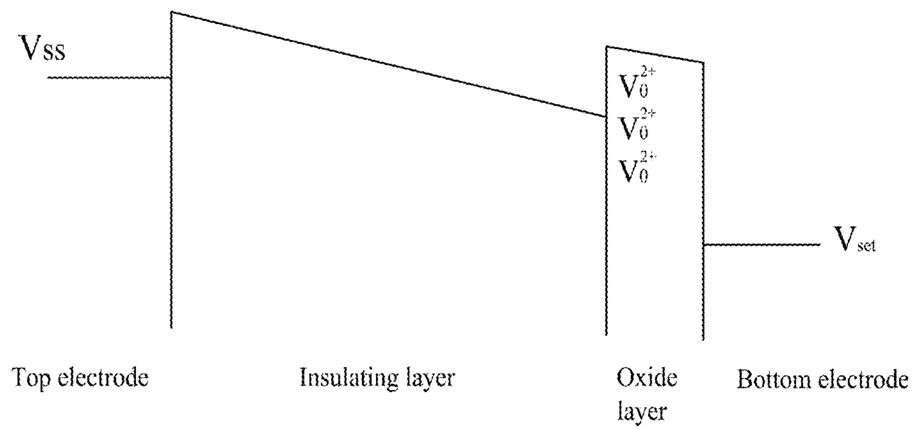
FIG. 10C is a band diagram of a self-select (SS) resistive random access memory (SS RRAM) in a setting step for setting the SS RRAM at a low-resistance (LR) state, i.e., at a logic level of "0", in accordance with an embodiment of the present application.

FIG. 10C is a band diagram of a self-select (SS) resistive random access memory (SS RRAM) in a setting step for setting the SS RRAM at a low-resistance (LR) state, i.e., at a logic level of "0", in accordance with an embodiment of the present application. Referring to FIGS. 10B and 10C, in the setting step, the top electrode 911 is biased at a voltage Vss of ground reference, and the bottom electrode is biased at a setting voltage $V_{set}$. Thereby, oxygen vacancies in the oxide layer 909 may move to and accumulate at the interface between the insulating layer 910 and the oxide layer 909.

Figure 10D:
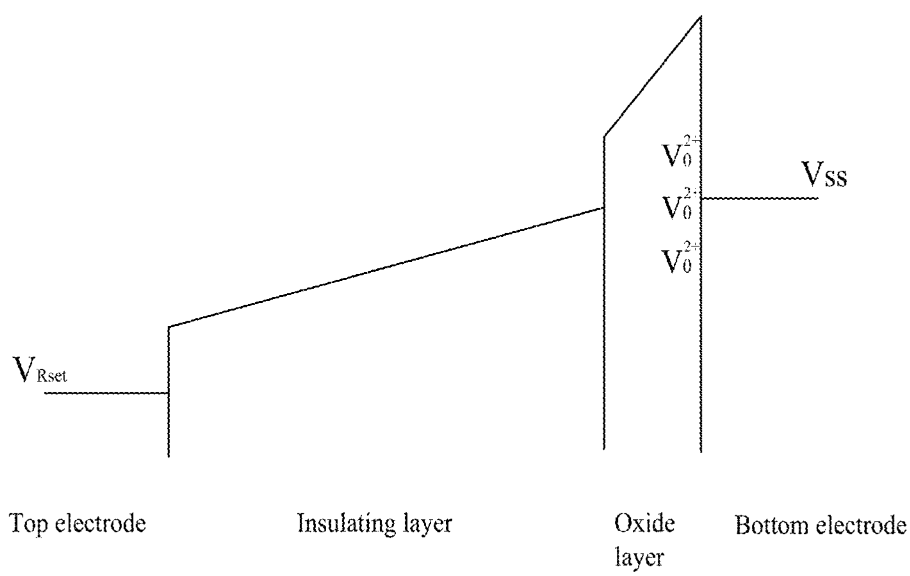
FIG. 10D is a band diagram of a SS RRAM in a resetting step for resetting the SS RRAM at a high-resistance (HR) state, i.e., at a logic level of "1", in accordance with an embodiment of the present application.

FIG. 10D is a band diagram of a SS RRAM in a resetting step for resetting the SS RRAM at a high-resistance (HR) state, i.e., at a logic level of "1", in accordance with an embodiment of the present application. Referring to FIGS. 10B and 10D, in the resetting step, the top electrode 911 is biased at a resetting voltage $V_{Rset}$, and the bottom electrode 908 is biased at the voltage Vss of ground reference. Oxygen vacancies in the oxide layer 909 may move to and accumulate at the interface between the oxide layer 909 and the bottom electrode 908.

Figure 10E:
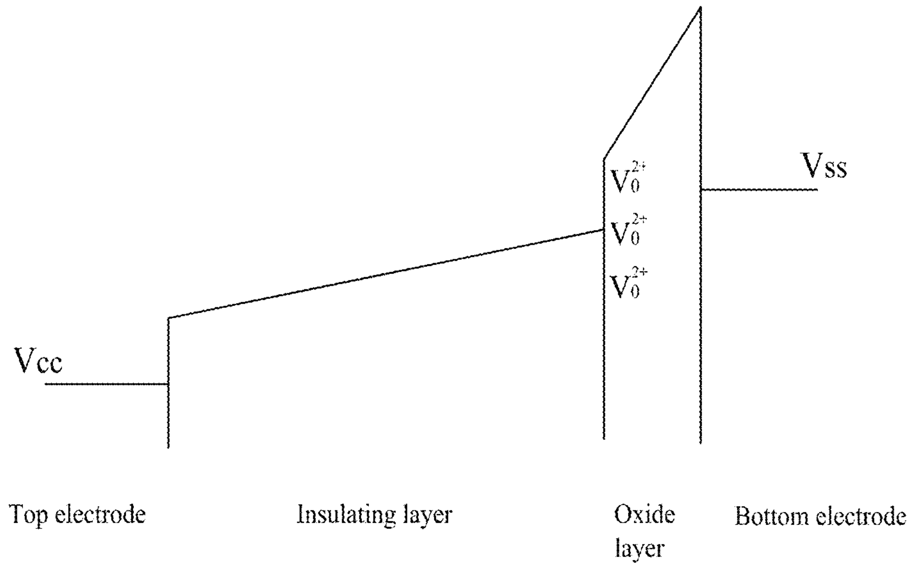
FIGS. 10E and 10F are band diagrams of a SS RRAM having low and high resistances respectively, when being selected for read in operation, in accordance with an embodiment of the present application.
Figure 10F:
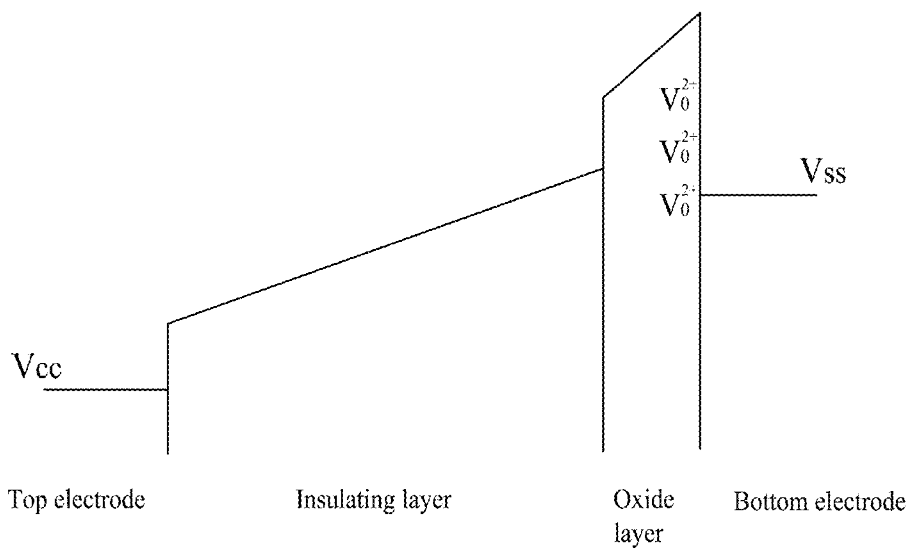

FIGS. 10E and 10F are band diagrams of a SS RRAM having low and high resistances respectively, when being selected for read in operation, in accordance with an embodiment of the present application. In the operation step, the top electrode 911 is biased at a voltage Vcc of power supply, and the bottom electrode is biased at the voltage Vss of ground reference. Based on the band diagram in FIG. 10E, the electrons may flow from the bottom electrode 908 to the top electrode 911 by (i) tunneling through the oxide layer 909 due to relatively large band bending, resulting in a relatively strong electric field, in the oxide layer 909, and then (ii) flowing through the insulating layer 910. Therefore, the SS RRAM 909 is operated at the LR state, i.e., at a logic level of "0".

Based on the band diagram in FIG. 10F, the electrons may not be able to tunnel through the oxide layer 909 due to relatively small band bending, causing a relatively weak electric field, in the oxide layer 909. Therefore, the SS RRAM cells 907 is operated at the HR state, i.e., at a logic level of "1".

For more elaboration, referring to FIG. 10A, a setting step may be performed, one row by one row and in turn, to a first group of the self-select resistive random access memory cells 907 but not to a second group of the self-select resistive random access memory cells 907. In the setting step for the self-select resistive random access memory cells 907, (1) each of the word lines 901 corresponding to the self-select resistive random access memory cells 907 in a row may be selected one by one and in turn to be switched to couple to a setting voltage $V_{set}$, between 2 volts and 10 volts, 4 volts and 8 volts, or 6 volts and 8 volts or equal to 8 volts, 7 volts or 6 volts, wherein the unselected word lines 901 may be switched to couple the self-select resistive random access memory cells 907 in the other rows to a voltage Vss of ground reference, (2) the bit lines 876 in a first group each for one of the self-select resistive random access memory cells 907 in the first group in the row may be switched to couple to the voltage Vss of ground reference, and (3) the bit lines 876 in a second group each for one of the self-select resistive random access memory cells 907 in the second group in the row may be switched to couple to a voltage between one third and two thirds of the setting voltage $V_{set}$, such as an half of the setting voltage $V_{set}$. Thereby, as seen in FIGS. 10A-10C, for one of the self-select resistive random access memory cells 907 in the first group in the row, multiple oxygen vacancies in its oxide layer 909 may move to and accumulate at an interface between its oxide layer 909 and its insulating layer 910. Thus, each of the self-select resistive random access memory cells 907 in the first group in the row may be set to a low resistance between 100 and 100,000 ohms in the setting step, and programmed to a logic level of "0".

Figure 10G:
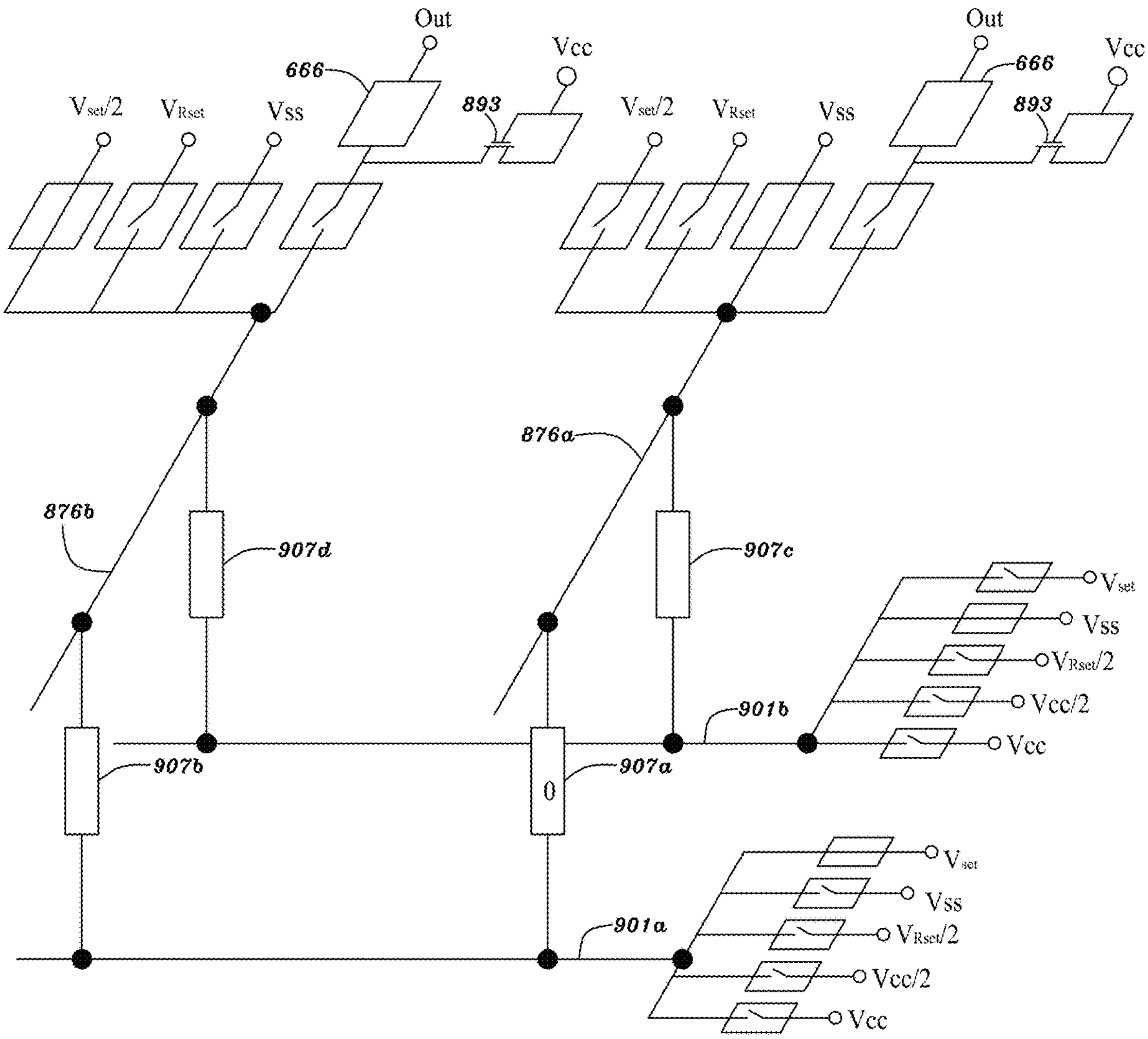
FIG. 10G is a circuit diagram showing SS RRAM in a setting step in accordance with an embodiment of the present application.

For an example, FIG. 10G is a circuit diagram showing SS RRAM in a setting step in accordance with an embodiment of the present application. Referring to FIG. 10G, the self-select resistive random access memory cells 907 may include a first one 907*a* and second one 907*b* arranged in a first row (y=y1) and a third one 907*c* and fourth one 907*d* arranged in a second row (y=y2). For corresponsence, the first self-select resistive random access memory cell 907*a* is at a correspondence (x1, y1), the second self-select resistive random access memory cell 907*b* is at a correspondence (x2, y1), the third self-select resistive random access memory cell 907*c* is at a correspondence (x1, y2), and the fourth self-select resistive random access memory cell 907*d* is at a correspondence (x2, y2).

Referring to FIG. 10G, if the first SS RRAM cell 907*a* is being set, in the above setting step, to the low-resistance (LR) state, i.e., programmed to a logic level of "0", and the second, third and fourth SS RRAM cells 907*b*, 907*c* and 907*d* are kept in the previous state, (1) a first word line 901*a* corresponding to the first and second SS RRAM cells 907*a* and 907*b* is selected and switched to couple to the setting voltage $V_{st}$, for example, between 2 volts and 10 volts, 4 volts and 8 volts, or 6 volts and 8 volts, or equal to 8 volts, 7 volts or 6 volts, (2) a first bit line 876*a* for the first SS RRAM cell 907*a* is switched to couple to the voltage Vss of ground reference, (3) a second bit line 876*b* for the second SS RRAM cell 907*b* is switched to couple to a voltage between one third and two thirds of $V_{set}$, such as at an half of $V_{set}$, and (4) a second word line 901*b* corresponding to the third and fourth SS RRAM cells 907*c* and 907*d* is unselected and switched to couple to the voltage Vss of ground reference.

Referring to FIG. 10A, a resetting step may be performed, one row by one row and in turn, to the second group of the self-select resistive random access memory cells 907 but not to the first group of the self-select resistive random access memory cells 907. In the resetting step for the self-select resistive random access memory cells 907, (1) each of the word lines 901 corresponding to the self-select resistive random access memory cells 907 in the row may be selected one by one and in turn to be switched to couple the self-select resistive random access memory cells 907 in a row to the voltage Vss of ground reference, wherein the unselected word lines 901 may be switched to couple the self-select resistive random access memory cells 907 in the other rows to a voltage between one third and two thirds of a resetting voltage $V_{Rset}$, such as an half of the resetting voltage $V_{Rset}$, wherein the resetting voltage $V_{Rset}$ may be between 2 volts and 8 volts, 4 volts and 8 volts, or 4 volts and 6 volts or equal to 6 volts, 5 volts or 4 volts, (2) the bit lines 876 in the second group each for one of the self-select resistive random access memory cells 907 in the second group in the row may be switched to couple to the resetting voltage $V_{set}$, and (3) the bit lines 876 in the first group each for one of the self-select resistive random access memory cells 907 in the first group in the row may be switched to couple to the the voltage Vss of ground reference. Thereby, as seen in FIGS. 10A, 10B and 10D, for one of the self-select resistive random access memory cells 907 in the second group in the row, multiple oxygen vacancies in its oxide layer 909 may move to and accumulate at an interface between its oxide layer 909 and its bottom electrode 908. Thus, each of the self-select resistive random access memory cells 907 in the second group in the row may be reset to a high resistance between 1,000 and 100,000,000,000 ohms, greater than the low resistance, in the resetting step, and programmed to a logic level of "1".

Figure 10H:
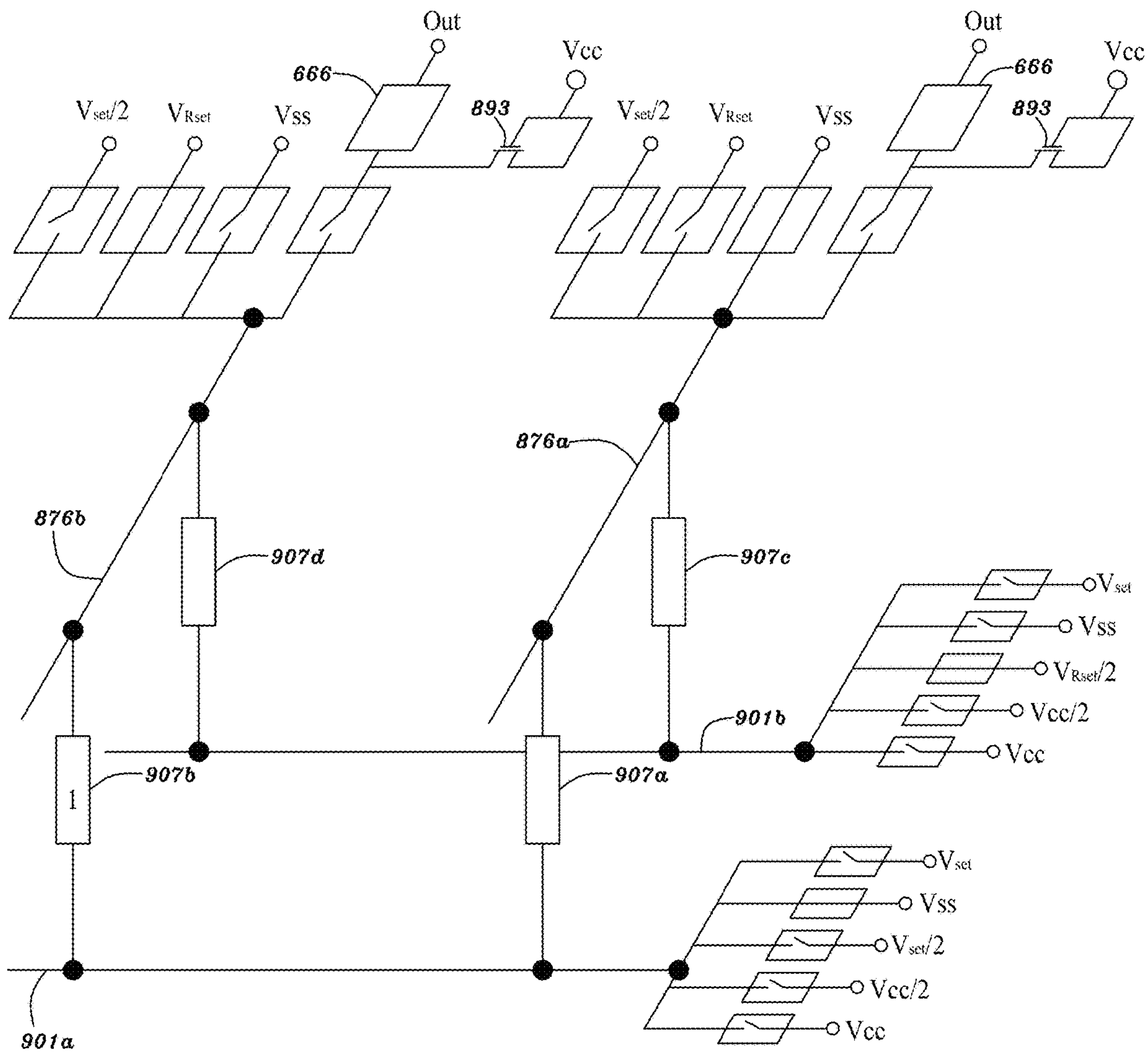
FIG. 10H is a circuit diagram showing SS RRAM in a resetting step in accordance with an embodiment of the present application.

For the example, FIG. 10H is a circuit diagram showing SS RRAM in a resetting step in accordance with an embodiment of the present application. Referring to FIG. 10H, if the second SS RRAM cell 907*b* is being reset, in the above resetting step, to the high-resistance (HR) state, i.e., programmed to a logic level of "1", and the first, third and fourth SS RRAM cells 907*a*, 907*c* and 907*d* are kept in the previous state, (1) the first word line 901*a* corresponding to the first and second SS RRAM cells 907*a* and 907*b* is selected and switched to couple to the voltage Vss of ground reference, (2) the second bit line 876*b* for the second SS RRAM cell 907*b* is switched to couple to the resetting voltage $V_{Rset}$ between 2 volts and 8 volts, 4 volts and 8 volts, or 4 volts and 6 volts or equal to 6 volts, 5 volts or 4 volts, (3) the first bit line 876*a* for the first SS RRAM cell 907*a* is switched to couple to the voltage Vss of ground reference, and (4) the second word line 901*b* corresponding to the third and fourth SS RRAM cells 907*c* and 907*d* is unselected and switched to couple to a voltage between one third and two thirds of the resetting voltage $V_{Rset}$, such as an half of the resetting voltage $V_{Rset}$. In operation, referring to FIGS. 10A, 10B, 10E and 10F, (1) each of the bit lines 876 may be switched to couple to the node N31 of one of the sense amplifiers 666 as illustrated in FIG. 8F and to the source terminal of one of the N-type MOS transistors 893, and (2) each of the word lines 901 corresponding to the self-select resistive random access memory cells 907 in a row may be selected one by one and in turn to be switched to to couple to the voltage Vss of ground reference to allow a tunneling current to pass through the self-select resistive random access memory cells 907 in the row, wherein the unselected word lines 901 corresponding to the self-select resistive random access memory cells 907 in the other rows may be switched to be floating to prevent a tunneling current from passing through the self-select resistive random access memory cells 907 in the other rows. Thereby, each of the sense amplifiers 666 may compare a voltage at one of the bit lines 876, i.e., at the node N31 as seen in FIG. 8F, with a comparison voltage at a comparison line, i.e., at the node N32 as seen in FIG. 8F, into a compared data and then generate an output "Out" of one of the self-select resistive random access memory cells 907 coupling to said one of the bit lines 876 based on the compared data. For example, when the voltage at the node N31 is compared by said each of the sense amplifiers 666 to be smaller than the comparison voltage at the node N32, said each of the sense amplifiers 666 may generate the output "Out" at a logic level of "1" in the case that one of the self-select resistive random access memory cells 907, which couples to said each of the sense amplifiers 666, has the low resistance. When the voltage at the node N31 is compared by said each of the sense amplifiers 666 to be greater than the comparison voltage at the node N32, said each of the sense amplifiers 666 may generate the output "Out" at a logic level of "0" in the case that one of the self-select resistive random access memory cells 907, which couples to said each of the sense amplifiers 666, has the high resistance.

Figure 10I:
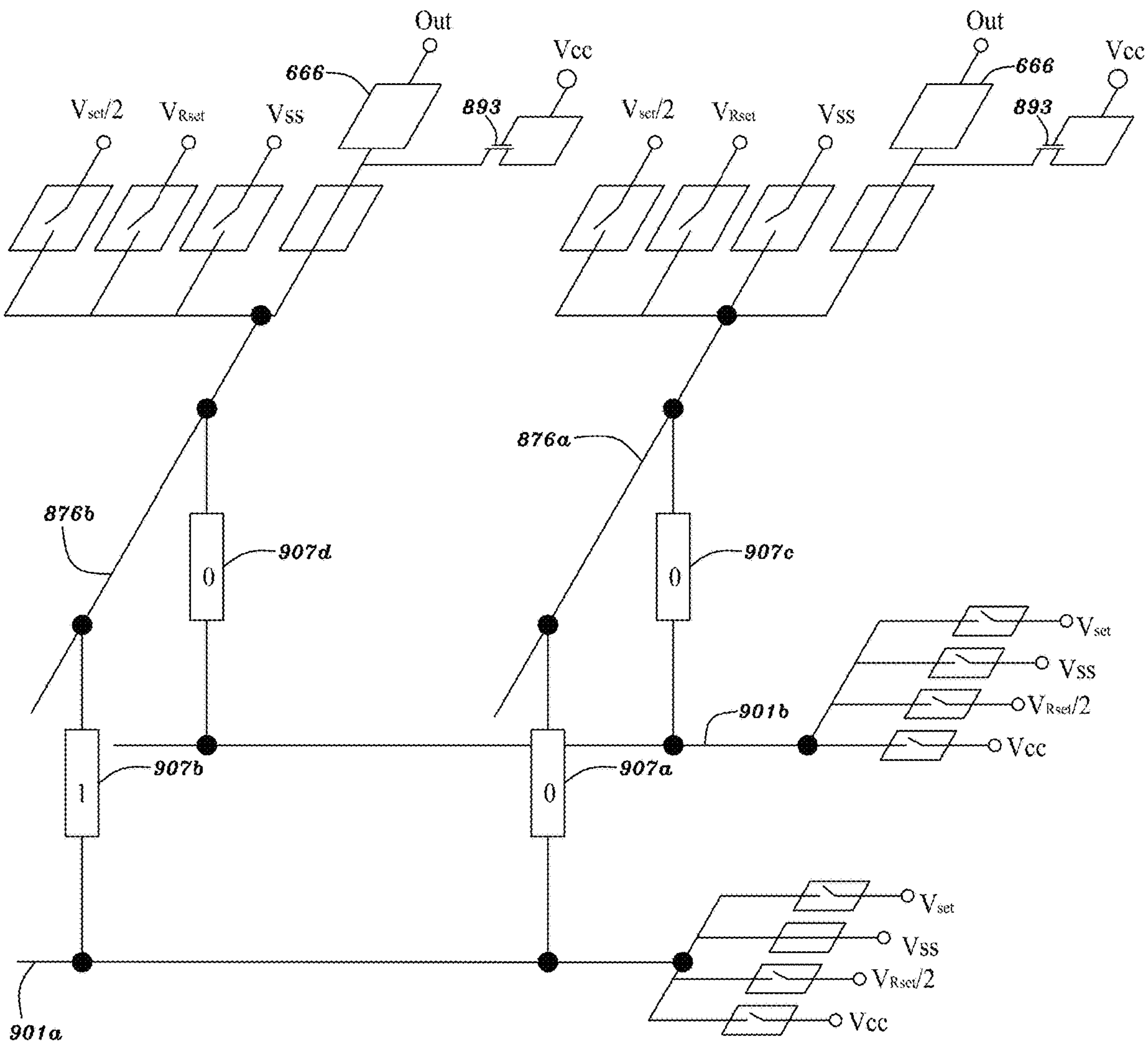
FIG. 10I is a circuit diagram showing SS RRAMs in operation in accordance with an embodiment of the present application.

For the example, FIG. 10I is a circuit diagram showing SS RRAMs in operation in accordance with an embodiment of the present application. Referring to FIG. 10I, if the first and second SS RRAM cells 907*a* and 907*b* are being read in operation and the third and fourth SS RRAM cells 907*c* and 907*d* are not being read, (1) the first word line 901*a* corresponding to the first and second SS RRAM cells 907*a* and 907*b* is selected and switched to couple to the voltage Vss of ground reference, (2) the first and second bit lines 876*a* and 876*b* for the first and second SS RRAM cells 907*a* and 907*b* are switched to couple to the sense amplifiers 666 respectively, and (3) the second word line 901*b* corresponding to the third and fourth SS RRAM cells 907*c* and 907*d* is unselected and switched to be floating.

Figure 10J:
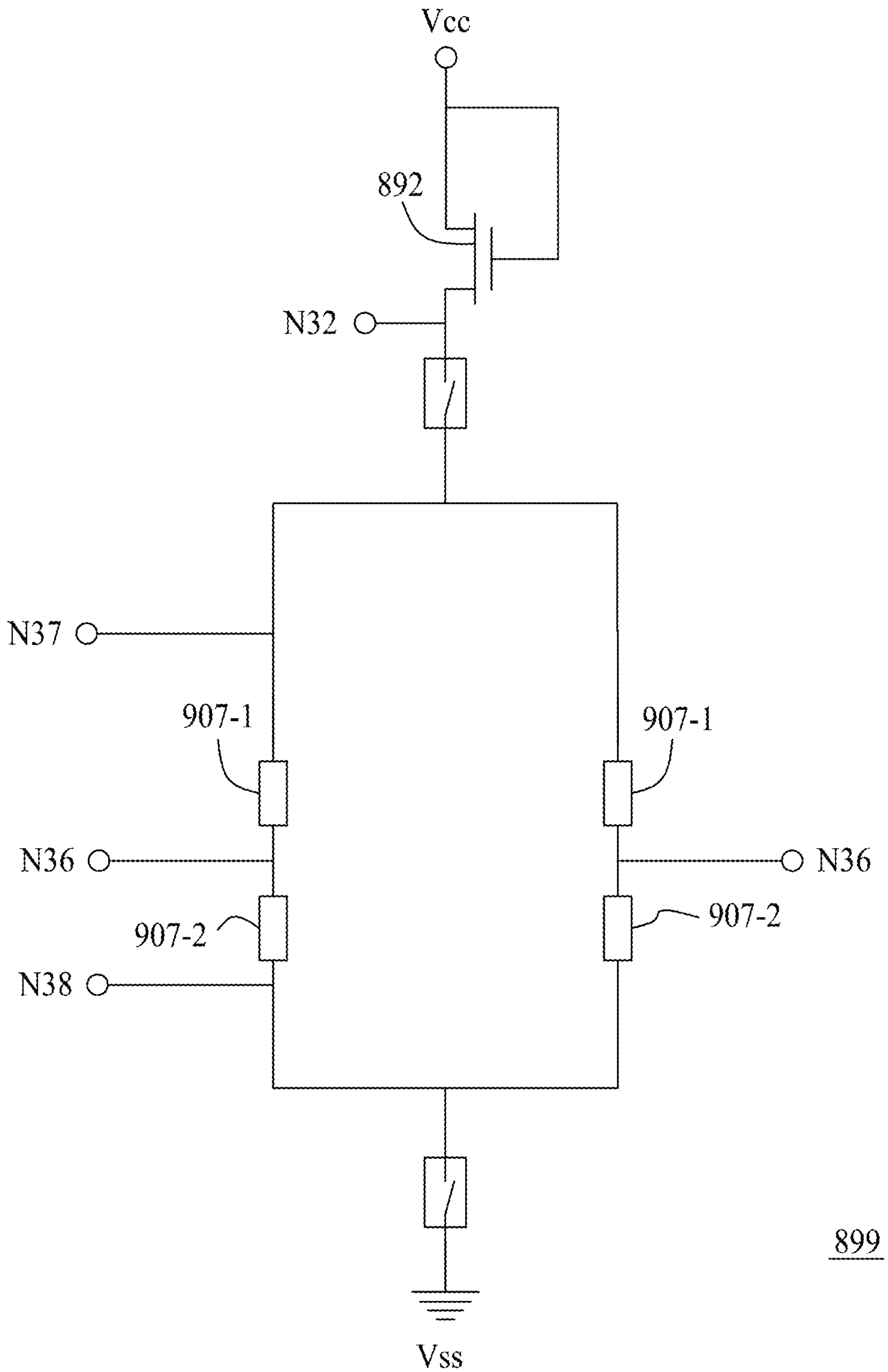
FIG. 10J is a circuit diagram showing a comparison-voltage generating circuit in accordance with an embodiment of the present application.

FIG. 10J is a circuit diagram showing a comparison-voltage generating circuit in accordance with an embodiment of the present application. Referring to FIGS. 10A-10J, a comparison-voltage generating circuit 899 includes two pairs of SS RRAM cells 907-1 and 907-2 connected in serial to each other. In each of the pairs of the SS RRAM cells 907-1 and 907-2, the SS RRAM cell 907-1 may have its top electrode 911 coupling to the top electrode 911 of the SS RRAM cell 907-2 and to a node N36, and the resistive random access memory 870-1 may have its bottom electrode 908 coupling to a node N37. The comparison-voltage generating circuit 899 may include a N-type MOS transistor 892 having a gate terminal coupling to a drain terminal of the N-type MOS transistor 892 and to the voltage Vcc of power supply and a source terminal coupling to the node N32 of the sense amplifier 666 as seen in FIG. 8F via the comparison line. The bottom electrodes 908 of the SS RRAM cells 907-2 in the pairs may couple to a node N38.

Referring to FIGS. 10A-10J, the resetting step may be performed to the SS RRAM cells 907-1 in the pairs. When the SS RRAM cells 907-1 in the pairs are being reset in the resetting step, (1) the node N37 may be switched to couple to the voltage Vss of ground reference, (2) the node N36 may be switched to couple to the resetting voltage $V_{Rset}$, (3) the node N38 may be switched to couple to the resetting voltage $V_{RSet}$, and (4) the node N32 may be switched not to couple to the bottom electrodes 908 of the SS RRAM cells 907-1 in the pairs. Thereby, the SS RRAM cells 907-1 in the pairs may be reset to the high resistance.

Referring to FIGS. 10A-10J, after the SS RRAM cells 907-1 in the pairs are reset in the resetting step, the setting step may be performed to the SS RRAM cells 907-2 in the pairs. When the SS RRAM cells 907-2 are being set in the setting step, (1) the node N37 may be switched to couple to the voltage Vss of ground reference, (2) the node N36 may be switched to couple to the voltage Vss of ground reference, (3) the node N38 may be switched to couple to the setting voltage $V_{set}$, and (4) the node N32 may be switched not to couple to the bottom electrodes 908 of the SS RRAM cells 907-1 in the pairs. Thereby, the SS RRAM cells 907-2 in the pairs may be set to the low resistance. Accordingly, the SS RRAM cells 907-2 in the pairs may be programmed to the low resistance between 100 and 100,000 ohms, and the SS RRAM cells 907-1 in the pairs may be programmed to the high resistance between 1,000 and 100,000,000,000 ohms, greater than the low resistance, for example.

Referring to FIGS. 10A-10J, in operation after the SS RRAM cells 907-2 in the pairs may be programmed to the low resistance, and the SS RRAM cells 907-1 in the pairs may be programmed to the high resistance, (1) the nodes N36, N37 and N38 may be switched to be floating, (2) the node N32 may be switched to couple to the bottom electrodes 908 of the SS RRAM cells 907-1 in the pairs, and (3) the bottom electrodes 908 of the SS RRAM cells 907-2 in the pairs may be switched to couple to the voltage Vss of ground reference. Thereby, the comparison line, i.e., node N32, of the sense amplifier 666 as seen in FIG. 8F may be at the comparison voltage between a voltage of the node N31 coupling to one of the SS RRAM cells 907 programmed to the low resistance and selected by one of the word lines 901 and a voltage of the node N31 coupling to one of the SS RRAM cells 907 programmed to the high resistance and selected by one of the word lines 901.

(2) Second Type of Non-volatile Memory Cells

Figure 11A:
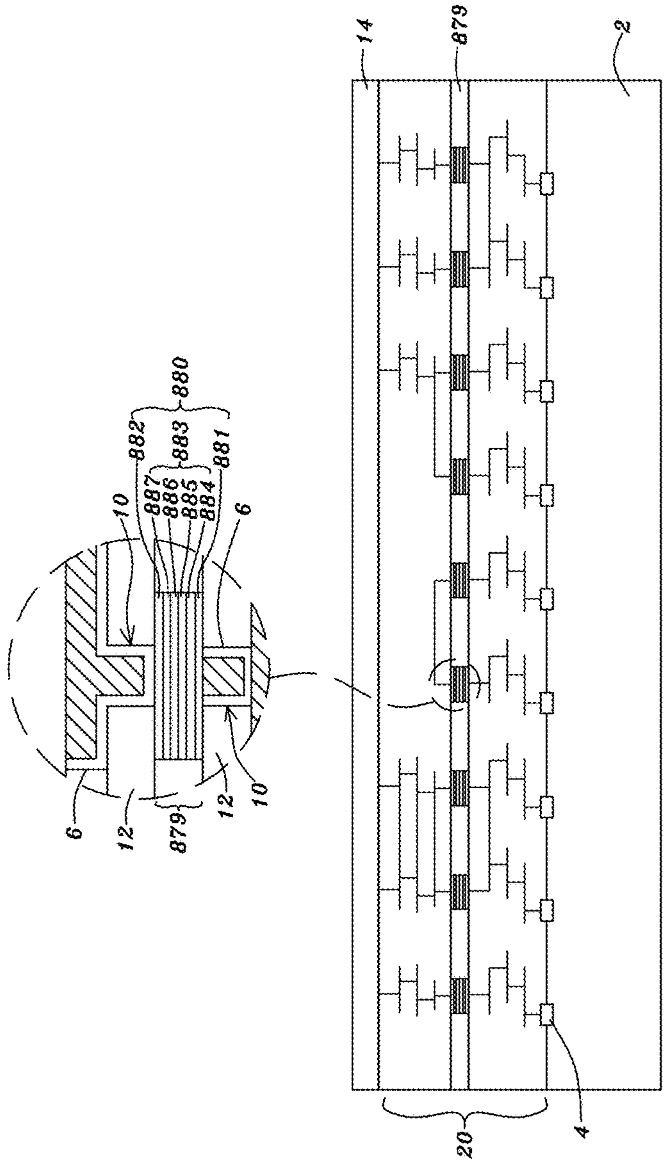
FIGS. 11A-11C are schematically cross-sectional views showing various structures of non-volatile memory cells of a second type for a first alternative for a semiconductor chip in accordance with an embodiment of the present application.
Figure 11C:
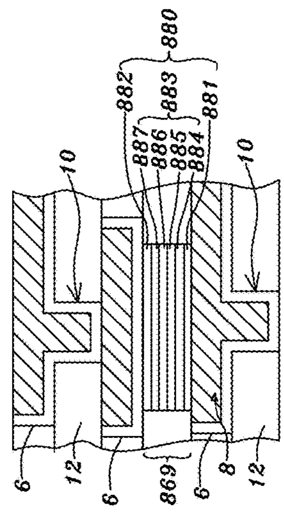
Figure 11B:
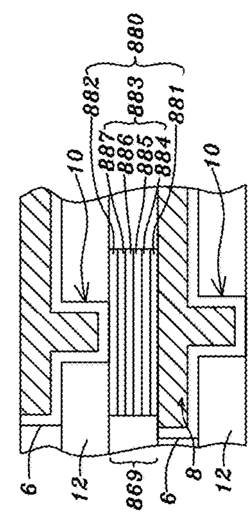

FIGS. 11A-11C are schematically cross-sectional views showing various structures of non-volatile memory cells of a second type for a first alternative for a semiconductor chip in accordance with an embodiment of the present application. The second type of non-volatile memory cells may be magnetoresistive random access memories (MRAM), i.e., programmable resistors. Referring to FIG. 11A, a semiconductor chip 100, used for the FPGA IC chip 200 for example, may include multiple magnetoresistive random access memories 880 formed in an MRAM layer 879 thereof over a semiconductor substrate 2 thereof, in a first interconnection scheme 20 for the semiconductor chip 100 (FISC) and under a passivation layer 14 thereof. Multiple interconnection metal layers 6 in the FISC 20 and between the MRAM layer 879 and semiconductor substrate 2 may couple the magnetoresistive random access memories 880 to multiple semiconductor devices 4 on the semiconductor substrate 2. Multiple interconnection metal layers 6 in the FISC 20 and between the MRAM layer 879 and passivation layer 14 may couple the magnetoresistive random access memories 880 to external circuits outside the semiconductor chip 100 and may have a line pitch less than 0.5 micrometers. Each of the interconnection metal layers 6 in the FISC 20 and over the MRAM layer 879 may have a thickness greater than each of the interconnection metal layers 6 in the FISC 20 and under the MRAM layer 879. The details for the semiconductor substrate 2, semiconductor devices, interconnection metal layers 6, FISC 20 and passivation layer 14 may be referred to the illustration in FIGS. 20A-20Q.

Referring to FIG. 11A, each of the magnetoresistive random access memories 880 may have a bottom electrode 881 made of titanium nitride, copper or an aluminum alloy having a thickness between 1 and 20 nanometers, a top electrode 882 made of titanium nitride, copper or an aluminum alloy having a thickness between 1 and 20 nanometers, and a magnetoresistive layer 883 having a thickness between 1 and 35 nanometers between the bottom and top electrodes 871 and 872. For a first alternative, the magnetoresistive layer 883 may be composed of (1) an antiferromagnetic (AF) layer 884, i.e., pinning layer, such as Cr, Fe—Mn alloy, NiO, FeS, Co/[CoPt]$_4$, having a thickness between 1 and 10 nanometers on the bottom electrode 881, (2) a pinned magnetic layer 885, such as a FeCoB alloy or $Co_2Fe_6B_2$, having a thickness between 1 and 10 nanometers, between 0.5 and 3.5 nanometers, or between 1 and 3 nanometers on the antiferromagnetic layer 884, (3) a tunneling oxide layer 886, i.e., tunneling barrier layer, such as MgO, having a thickness between 0.5 and 5 nanometers, between 0.3 and 2.5 nanometers or between 0.5 and 1.5 nanometers on the pinned magnetic layer 885 and (4) a free magnetic layer 887, such as a FeCoB alloy or $Co_2Fe_6B_2$, having a thickness between 1 and 10 nanometers, between 0.5 and 3.5 nanometers, or between 1 and 3 nanometers on the tunneling oxide layer 886. The top electrode 882 is formed on the free magnetic layer 887 of the magnetoresistive layer 883. The pinned magnetic layer 885 may have the same material as the free magnetic layer 887.

Referring to FIG. 11A, each of the magnetoresistive random access memories 880 may have its bottom electrode 881 formed on a top surface of one of the lower metal vias 10 of a lower one of the interconnection metal layers 6 as illustrated in FIGS. 20A-20Q and on a top surface of a lower one of the dielectric layers 12 as illustrated in FIGS. 20A-20Q. An upper one of the dielectric layers 12 as illustrated in FIGS. 20A-20Q may be formed on the top electrode 882 of said one of the magnetoresistive random access memories 880 and an upper one of the interconnection metal layers 6 as illustrated in FIGS. 20A-20Q may have the upper metal vias 10 each formed in the upper one of the dielectric layers 12 and on the top electrode 882 of one of the magnetoresistive random access memories 880.

Alternatively, referring to FIG. 11B, each of the magnetoresistive random access memories 880 may have its bottom electrode 881 formed on a top surface of one of the lower metal pads 8 of a lower one of the interconnection metal layers 6 as illustrated in FIGS. 20A-20Q. An upper one of the dielectric layers 12 as illustrated in FIGS. 20A-20Q may be formed on the top electrode 882 of said one of the magnetoresistive random access memories 880 and an upper one of the interconnection metal layers 6 as illustrated in FIGS. 20A-20Q may have the upper metal vias 10 each formed in the upper one of the dielectric layers 12 and on the top electrode 882 of one of the magnetoresistive random access memories 880.

Alternatively, referring to FIG. 11C, each of the magnetoresistive random access memories 880 may have its bottom electrode 881 formed on a top surface of one of the lower metal pads 8 of a lower one of the interconnection metal layers 6 as illustrated in FIGS. 20A-20Q. An upper one of the interconnection metal layers 6 as illustrated in FIGS. 20A-20Q may have the upper metal pads 8 each formed in an upper one of the dielectric layers 12 and on the top electrode 882 of one of the magnetoresistive random access memories 880.

Figure 11D:
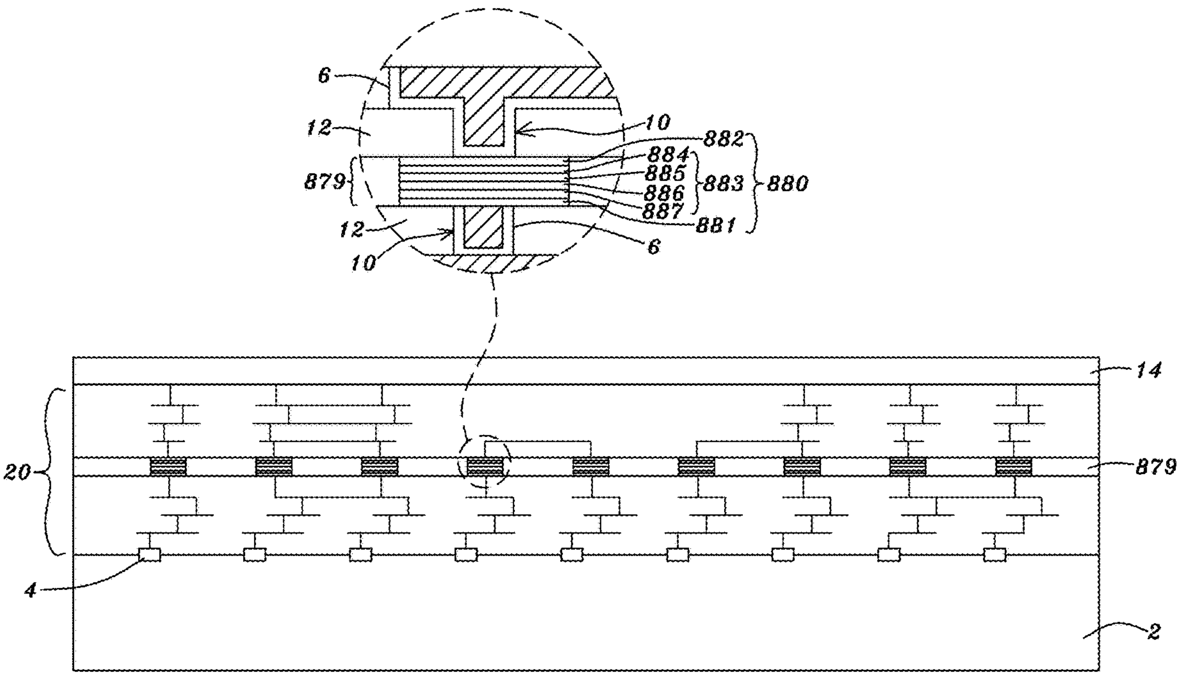
FIG. 11D is a schematically cross-sectional view showing a structure of a non-volatile memory cell of a second type for a second alternative for a semiconductor chip in accordance with an embodiment of the present application.

For a second alternative, FIG. 11D is a schematically cross-sectional view showing a structure of a non-volatile memory cell of a second type for a semiconductor chip in accordance with an embodiment of the present application. The scheme of the semiconductor chip as illustrated in FIG. 11D is similar to that as illustrated in FIG. 11A except for the composition of the magnetoresistive layer 883. Referring to FIG. 11D, the magnetoresistive layer 883 may be composed of the free magnetic layer 887 on the bottom electrode 881, the tunneling oxide layer 886 on the free magnetic layer 887, the pinned magnetic layer 885 on the tunneling oxide layer 886 and the antiferromagnetic layer 884 on the pinned magnetic layer 885. The top electrode 882 is formed on the antiferromagnetic layer 884. The materials and thicknesses of the free magnetic layer 887, tunneling oxide layer 886, pinned magnetic layer 885 and antiferromagnetic layer 884 for the second alternative may be referred to those for the first alternative. The magnetoresistive random access memories 880 for the second alternative may have its bottom electrode 881 formed on a top surface of one of the lower metal vias 10 of a lower one of the interconnection metal layers 6 as illustrated in FIGS. 20A-20Q and on a top surface of a lower one of the dielectric layers 12 as illustrated in FIGS. 20A-20Q. An upper one of the dielectric layers 12 as illustrated in FIGS. 20A-20Q may be formed on the top electrode 882 of said one of the magnetoresistive random access memories 880 and an upper one of the interconnection metal layers 6 as illustrated in FIGS. 20A-20Q may have the upper metal vias 10 each formed in the upper one of the dielectric layers 12 and on the top electrode 882 of one of the magnetoresistive random access memories 880 for the second alternative.

Alternatively, the magnetoresistive random access memories 880 for the second alternative in FIG. 11D may be provided between a lower metal pad 8 and an upper metal via 10 as seen in FIG. 11B. Referring to FIGS. 11B and 11D, each of the magnetoresistive random access memories 880 for the second alternative may have its bottom electrode 881 formed on a top surface of one of the lower metal pads 8 of a lower one of the interconnection metal layers 6 as illustrated in FIGS. 20A-20Q. An upper one of the dielectric layers 12 as illustrated in FIGS. 20A-20Q may be formed on the top electrode 882 of said one of the magnetoresistive random access memories 880 and an upper one of the interconnection metal layers 6 as illustrated in FIGS. 20A-20Q may have the upper metal vias 10 each formed in the upper one of the dielectric layers 12 and on the top electrode 882 of one of the magnetoresistive random access memories 880 for the second alternative.

Alternatively, the magnetoresistive random access memories 880 for the second alternative in FIG. 11D may be provided between a lower metal pad 8 and an upper metal pad 8 as seen in FIG. 11C. Referring to FIGS. 11C and 11D, each of the magnetoresistive random access memories 880 for the second alternative may have its bottom electrode 881 formed on a top surface of one of the lower metal pads 8 of a lower one of the interconnection metal layers 6 as illustrated in FIGS. 20A-20Q. An upper one of the interconnection metal layers 6 as illustrated in FIGS. 20A-20Q may have the upper metal pads 8 each formed in an upper one of the dielectric layers 12 and on the top electrode 882 of one of the magnetoresistive random access memories 880 for the second alternative.

Referring to FIGS. 11A-11D, the pinned magnetic layer 885 may have domains each provided with a magnetic field in a direction pinned by the antiferromagnetic layer 884, that is, hardly changed by a spin-transfer torque induced by an electron flow passing through the pinned magnetic layer 885. The free magnetic layer 887 may have domains each provided with a magnetic field in a direction easily changed by a spin-transfer torque induced by an electron flow passing through the free magnetic layer 887.

Referring to FIGS. 11A-11C, in a setting step for one of the magnetoresistive random access memories 880 for the first alternative, when a setting voltage $V_{MSE}$ ranging from 0.25 to 3.3 volts is applied to its top electrode 882 and a voltage Vss of ground reference is applied to its bottom electrode 881, electrons may flow from its pinned magnetic layer 885 to its free magnetic layer 887 through its tunneling oxide layer 886 such that the direction of the magnetic fields in each of the domains of its free magnetic layer 887 may be set to be the same as that in each of the domains of its pinned magnetic layer 885 by a spin-transfer torque (STT) effect induced by the electrons. Thus, said one of the magnetoresistive random access memories 880 may be set to a low resistance between 10 and 100,000,000,000 ohms. In a resetting step for said one of the magnetoresistive random access memories 880 for the first alternative, when a resetting voltage $V_{MRE}$ ranging from 0.25 to 3.3 volts is applied to its bottom electrode 881 and the voltage Vss of ground reference is applied to its top electrode 882, electrons may flow from its free magnetic layer 887 to its pinned magnetic layer 885 through its tunneling oxide layer 886 such that the direction of the magnetic fields in each of the domains of its free magnetic layer 887 may be reset to be opposite to that in each of the domains of its pinned magnetic layer 885. Thus, said one of the magnetoresistive random access memories 880 may be reset to a high resistance between 15 and 500,000,000,000 ohms greater than the low resistance.

Referring to FIG. 11D, in a setting step for one of the magnetoresistive random access memories 880 for the second alternative, when a setting voltage $V_{MSE}$ ranging from 0.25 to 3.3 volts is applied to its bottom electrode 881 and a voltage Vss of ground reference is applied to its top electrode 882, electrons may flow from its pinned magnetic layer 885 to its free magnetic layer 887 through its tunneling oxide layer 886 such that the direction of the magnetic fields in each of the domains of its free magnetic layer 887 may be set to be the same as that in each of the domains of its pinned magnetic layer 885 by a spin-transfer torque (STT) effect induced by the electrons. Thus, said one of the magnetoresistive random access memories 880 may be set to the low resistance between 10 and 100,000,000,000 ohms. In a resetting step for said one of the magnetoresistive random access memories 880 for the second alternative, when a resetting voltage $V_{MRE}$ ranging from 0.25 to 3.3 volts is applied to its top electrode 882 and the voltage Vss of ground reference is applied to its bottom electrode 881, electrons may flow from its free magnetic layer 887 to its pinned magnetic layer 885 through its tunneling oxide layer 886 such that the direction of the magnetic fields in each of the domains of its free magnetic layer 887 may be reset to be opposite to that in each of the domains of its pinned magnetic layer 885. Thus, said one of the magnetoresistive random access memories 880 may be reset to the high resistance between 15 and 500,000,000,000 ohms.

Figure 11E:
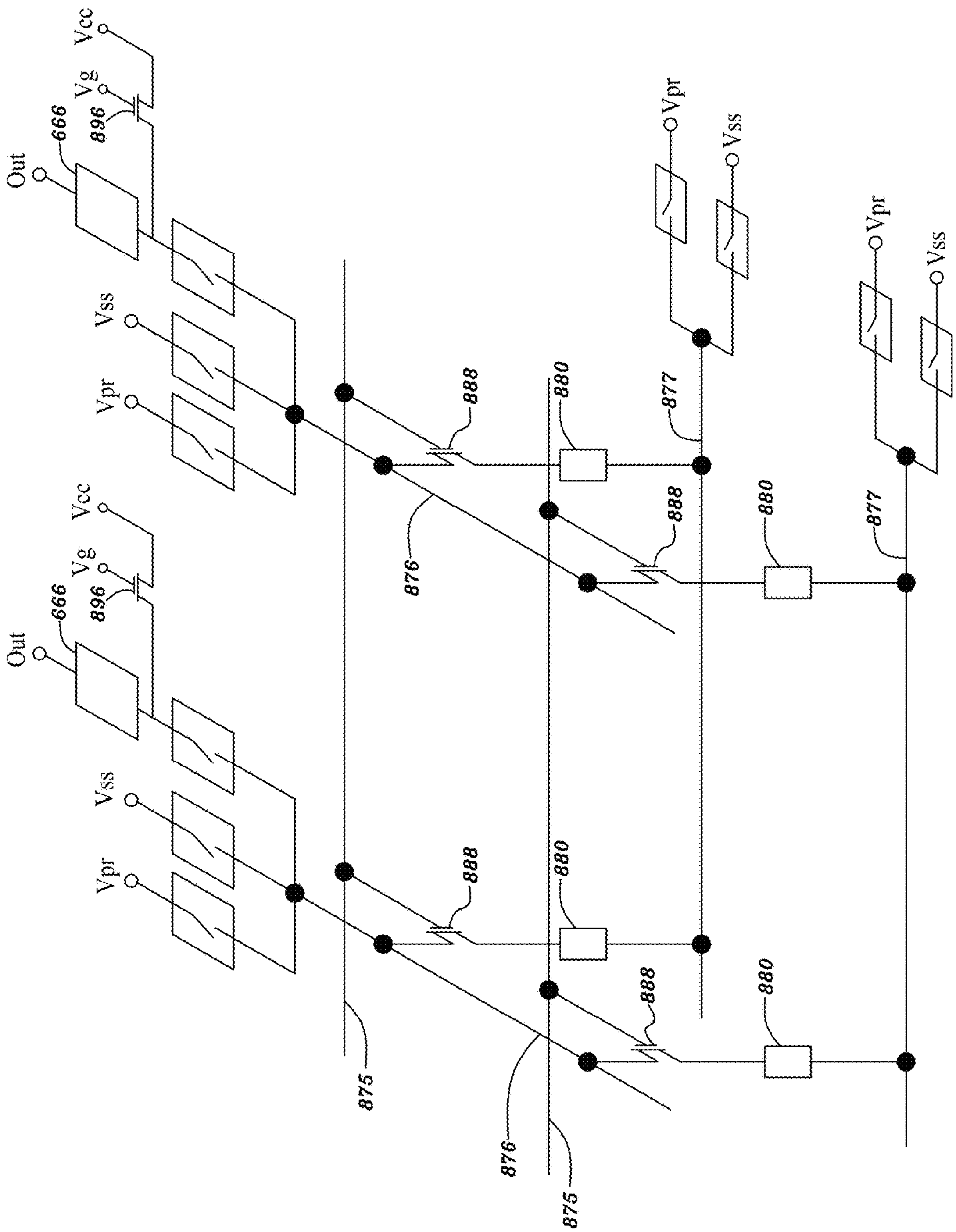
FIG. 11E is a circuit diagram showing a non-volatile memory array in accordance with an embodiment of the present application.

FIG. 11E is a circuit diagram showing a non-volatile memory array in accordance with an embodiment of the present application. Referring to FIG. 11E, multiple of the magnetoresistive random access memories 880 are formed in an array in the MRAM layer 879 as seen in FIG. 11A-11D. Multiple of the switches 888, e.g., N-type MOS transistors, are arranged in an array. Alternatively, each of the switches 888 may be a P-type MOS transistor.

(2.1) Second Type of Non-Volatile Memory Cell for the First Alternative

Referring to FIGS. 11A-11C and 11E, each of the N-type MOS transistors 888 is configured to form a channel with two opposite terminals, one of which couples in series to the top electrode 882 of one the magnetoresistive random access memories 880 for the first alternative and the other of which couples to one of bit lines 876, and has a gate terminal coupling to one of word lines 875. Each of reference lines 877 may couple to the bottom electrodes 881 of the magnetoresistive random access memories 880 for the first alternative arranged in a row. Each of the word lines 875 may couple to the gate terminals of the N-type or P-type MOS transistors 888 arranged in a row that couple in parallel to one another through said each of the word lines 875. Each of the bit lines 876 is configured to couple, one by one and in turn, to the top electrode 882 of each of the magnetoresistive random access memories 880 for the first alternative arranged in a column through one of the N-type or P-type MOS transistors 888 arranged in a column.

In an alternative example, each of the N-type MOS transistors 888 is configured to form a channel with two opposite terminals, one of which couples in series to one of the bottom and top electrodes 881 and 882 of one the magnetoresistive random access memories 880 for the first alternative and the other of which couples to one of reference lines 877, and has a gate terminal coupling to one of word lines 875. Each of the reference lines 877 is configured to couple to the bottom or top electrodes 881 and 882 of the magnetoresistive random access memories 880 for the first alternative in a row through the N-type MOS transistors 888 in a row.

Referring to FIG. 11E, for programming the magnetoresistive random access memories 880 for the first alternative as illustrated in FIGS. 11A-11C, a resetting step may be first performed to all of the magnetoresistive random access memories 880, in which (1) all of the bit lines 876 may be switched to couple to the voltage Vss of ground reference, (2) all of the word lines 875 may be switched to couple to a programming voltage $V_{Pr}$, between 0.25 and 3.3 volts, equal to or greater than the resetting voltage $V_{MRE}$ of the magnetoresistive random access memories 880, to turn on each of the N-type MOS transistors 888 to couple the top electrode 872 of one of the magnetoresistive random access memories 880 to one of the bit lines 876 and (3) all of the reference lines 877 may be switched to couple to the programming voltage $V_{Pr}$, between 0.25 and 3.3 volts, equal to or greater than the resetting voltage $V_{MRE}$ of the magnetoresistive random access memories 880. Alternatively, when each of the switches 888 is a P-type MOS transistor, all of the word lines 875 may be switched to couple to the voltage Vss of ground reference to turn on each of the P-type MOS transistors 888 to couple the top electrode 872 of one of the magnetoresistive random access memories 880 to one of the bit lines 876. Thereby, an electron current may pass from the top electrode 882 of each of the magnetoresistive random access memories 880 to the bottom electrode 881 of said each of the magnetoresistive random access memories 880 to set the direction of the magnetic field in each domain of the free magnetic layer 887 of said each of the magnetoresistive random access memories 880 to be opposite to that in each domain of the pinned magnetic layer 885 of said each of the magnetoresistive random access memories 880. Thus, said each of the magnetoresistive random access memories 880 may be reset with the high resistance between 15 and 500,000,000,000 ohms in the resetting step, and thus programmed to a logic level of "1".

Next, referring to FIG. 11E, a setting step may be performed to a first group of the magnetoresistive random access memories 880 for the first alternative as illustrated in FIGS. 11A-11C but not to a second group of the magnetoresistive random access memories 880 for the first alternative as illustrated in FIGS. 11A-11C, in which, (1) each of the word lines 875 corresponding to the magnetoresistive random access memories 880 in a row may be selected one by one and in turn to be switched to couple to the programming voltage $V_{Pr}$ to turn on the N-type MOS transistors 888 in a row to couple each of the magnetoresistive random access memories 880 in the row to one of the bit lines 876 or, in the alternative example, to couple all of the magnetoresistive random access memories 880 in the row to a same one of the reference lines 877, wherein the unselected word lines 875 corresponding to the magnetoresistive random access memories 880 in the other rows may be switched to couple to the voltage Vss of ground reference to turn off the N-type MOS transistors 888 in the other rows to decouple each of the magnetoresistive random access memories 880 in the other rows from any of the bit lines 876 or, in the alternative example, to decouple each of the magnetoresistive random access memories 880 in the other rows from any of the reference lines 877, wherein the programming voltage $V_{Pr}$ may be between 0.25 and 3.3 volts, equal to or greater than the setting voltage $V_{MSE}$ of the magnetoresistive random access memories 880, (2) the reference lines 877 may be switched to couple to the voltage Vss of ground reference, (3) the bit lines 876 in a first group each for one of the magnetoresistive random access memories 880 in the first group in the row may be switched to couple to the programming voltage $V_{Pr}$ between 0.25 and 3.3 volts, equal to or greater than the setting voltage $V_{MSE}$ of the magnetoresistive random access memories 880, and (4) the bit lines 876 in a second group each for one of the magnetoresistive random access memories 880 in the second group in the row may be switched to couple to the voltage Vss of ground reference. Alternatively, when each of the switches 888 is a P-type MOS transistor, each of the word lines 875 corresponding to the magnetoresistive random access memories 880 in the row may be selected one by one and in turn to be switched to couple to the voltage Vss of ground reference to turn on the P-type MOS transistors 888 in the row to couple each of the magnetoresistive random access memories 880 in the row to one of the bit lines 876 or, in the alternative example, to couple all of the magnetoresistive random access memories 880 in the row to the same one of the reference lines 877, wherein the unselected word lines 875 corresponding to the magnetoresistive random access memories 880 in the other rows may be switched to couple to the programming voltage $V_{Pr}$ to turn off the P-type MOS transistors 888 in the other rows to decouple each of the magnetoresistive random access memories 880 in the other rows from any of the bit lines 876 or, in the alternative example, to decouple each of the magnetoresistive random access memories 880 in the other rows from any of the reference lines 877, wherein the programming voltage $V_{Pr}$ may be between 0.25 and 3.3 volts, equal to or greater than the setting voltage $V_{MSE}$ of the magnetoresistive random access memories 880. Thereby, an electron current may pass from the bottom electrode 881 of each of the magnetoresistive random access memories 880 in the first group in the row to the top electrode 882 of said each of the magnetoresistive random access memories 880 in the first group in the row to set the direction of the magnetic field in each domain of the free magnetic layer 887 of said each of the magnetoresistive random access memories 880 in the first group in the row to be the same as that in each domain of the pinned magnetic layer 885 of said each of the magnetoresistive random access memories 880 in the first group in the row. Thus, said each of the magnetoresistive random access memories 880 in the first group may be set to the low resistance between 10 and 100,000,000,000 ohms in the setting step, and thus programmed to a logic level of "0".

In operation, referring to FIGS. 8F and 11E, (1) each of the bit lines 876 may be switched to couple to the node N31 of the sense amplifier 666 as illustrated in FIG. 8F and to a source terminal of a N-type MOS transistor 896, (2) each of the reference lines 877 may be switched to couple to the voltage Vss of ground reference, and (3) each of the word lines 875 corresponding to the magnetoresistive random access memories 880 in a row may be selected one by one and in turn to be switched to couple to the voltage Vcc of power supply to turn on the N-type MOS transistors 888 in a row to couple each of the magnetoresistive random access memories 880 in the row to one of the bit lines 876 or, in the alternative example, to couple all of the magnetoresistive random access memories 880 in the row to a same one of the reference lines 877, wherein the unselected word lines 875 corresponding to the magnetoresistive random access memories 880 in the other rows may be switched to couple to the voltage Vss of ground reference to turn off the N-type MOS transistors 888 in the other rows to decouple each of the magnetoresistive random access memories 880 in the other rows from any of the bit lines 876 or, in the alternative example, to decouple each of the magnetoresistive random access memories 880 in the other rows from any of the reference lines 877. The N-type MOS transistor 896 may have a gate terminal coupling to a voltage Vg and a drain terminal coupling to the voltage Vcc of power supply. The N-type MOS transistor 896 may be considered as a current source. In operation, the voltage Vg may be applied to the gate of the N-type MOS transistor 896 to control an electric current at a substantially constant level passing through the N-type MOS transistor 896. Alternatively, when each of the switches 888 is a P-type MOS transistor, each of the word lines 875 corresponding to the magnetoresistive random access memories 880 in the row may be selected one by one and in turn to be switched to couple to the voltage Vss of ground reference to turn on the P-type MOS transistors 888 in the row to couple each of the magnetoresistive random access memories 880 in the row to one of the bit lines 876 or, in the alternative example, to couple all of the magnetoresistive random access memories 880 in the row to a same one of the reference lines 877, wherein the unselected word lines 875 corresponding to the magnetoresistive random access memories 880 in the other rows may be switched to couple to the voltage Vcc of power supply to turn off the P-type MOS transistors 888 in the other rows to decouple each of the magnetoresistive random access memories 880 in the other rows from any of the bit lines 876 or, in the alternative example, to decouple each of the magnetoresistive random access memories 880 in the other rows from any of the reference lines 877. Thereby, each of the sense amplifiers 666 may compare a voltage at one of the bit lines 876, i.e., at the node N31 as seen in FIG. 8F, and a comparison voltage at a comparison line, i.e., at the node N32 as seen in FIG. 8F, into a compared data and then generate an output "Out" of one of the magnetoresistive random access memories 880 coupling to said one of the bit lines 876 via one of the switches 888 based on the compared data. For example, when the voltage at the node N31 is compared by said each of the sense amplifiers 666 to be smaller than the voltage at the node N32, said each of the sense amplifiers 666 may generate the output "Out" at a logic level of "1" in the case that one of the magnetoresistive random access memories 880, which couples to said each of the sense amplifiers 666, has the low resistance. When the voltage at the node N31 is compared by said each of the sense amplifiers 666 to be greater than the voltage at the node N32, said each of the sense amplifiers 666 may generate the output "Out" at a logic level of "0" in the case that one of the magnetoresistive random access memories 880, which couples to said each of the sense amplifiers 666, has the high resistance.

Figure 11F:
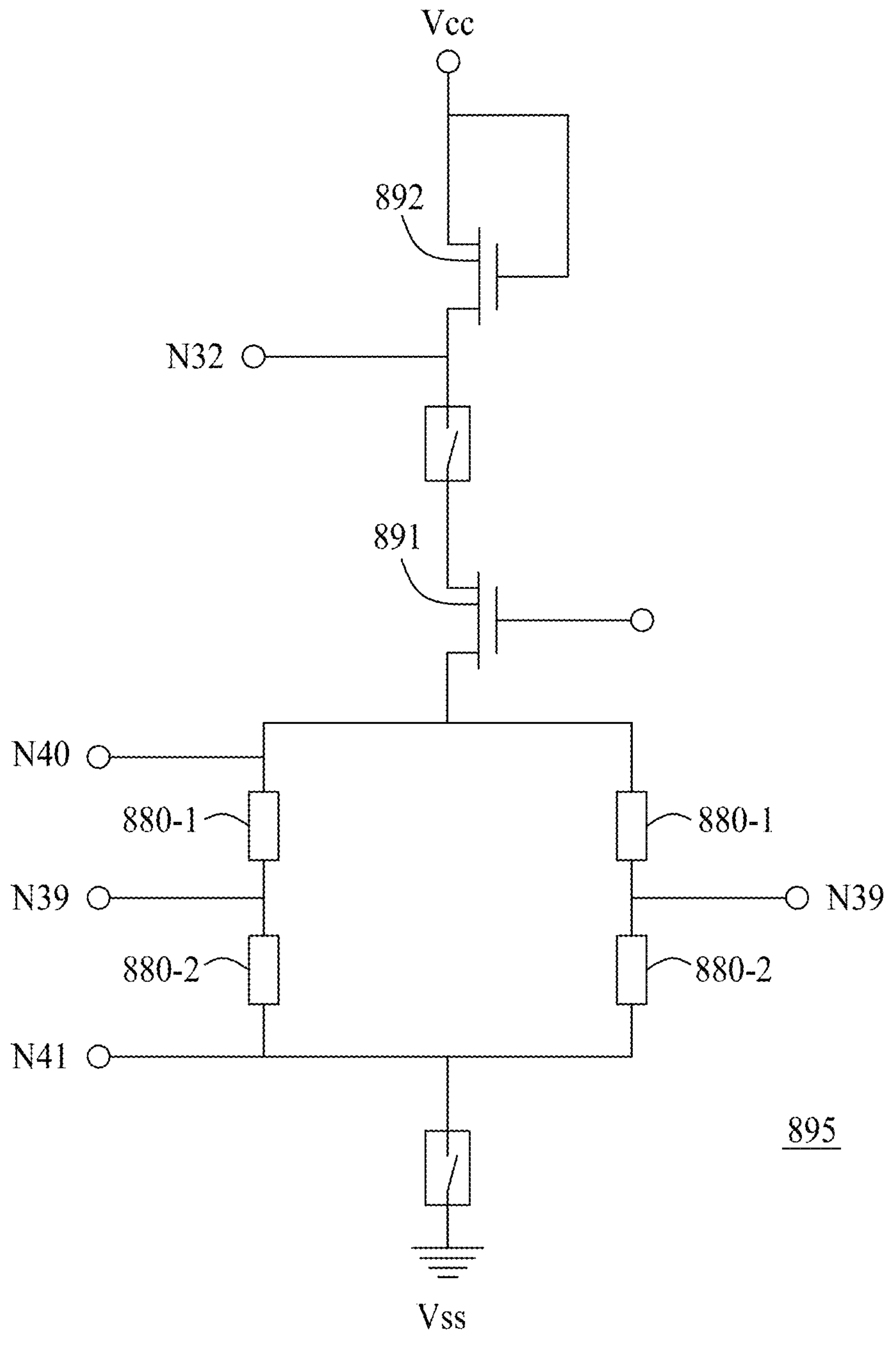
FIG. 11F is a circuit diagram showing a comparison-voltage generating circuit in accordance with an embodiment of the present application.

FIG. 11F is a circuit diagram showing a comparison-voltage generating circuit in accordance with an embodiment of the present application. Referring to FIGS. 11A-11C, 11E and 11F, a comparison-voltage generating circuit 895 includes two pairs of magnetoresistive random access memories 880-1 and 880-2 for the first alternative connected in serial to each other, wherein the pairs of magnetoresistive random access memories 880-1 and 880-2 for the first alternative are connected in parallel to each other. In each of the pairs of magnetoresistive random access memories 880-1 and 880-2 for the first alternative, the magnetoresistive random access memory 880-1 for the first alternative may have its top electrode 882 coupling to the top electrode 882 of the magnetoresistive random access memory 880-2 for the first alternative and to a node N39, and the magnetoresistive random access memory 880-1 for the first alternative may have its bottom electrode 881 coupling to a node N40. The comparison-voltage generating circuit 895 may further include a N-type MOS transistors 891 having a source terminal, in operation, coupling to the bottom electrodes 881 of the magnetoresistive random access memories 880-1 for the first alternative in the pairs and to the node N40. The comparison-voltage generating circuit 895 may further include a N-type MOS transistor 892 having a gate terminal coupling to a drain terminal of the N-type MOS transistor 892 and to the voltage Vcc of power supply and a source terminal coupling to the node N32 of the sense amplifier 666 as seen in FIG. 8F via the comparison line. The bottom electrodes 881 of the magnetoresistive random access memories 880-2 for the first alternative in the pairs may couple to a node N41.

Referring to FIGS. 11A-11C, 11E and 11F, the resetting step may be performed to the magnetoresistive random access memories 880-1 for the first alternative in the pairs. When the magnetoresistive random access memories 880-1 for the first alternative in the pairs are being reset in the resetting step, (1) the node N40 may be switched to couple to the programming voltage $V_{Pr}$, (2) the node N39 may be switched to couple to the voltage Vss of ground reference, (3) the node N41 may be switched to couple to the voltage Vss of ground reference, and (4) the node N32 may be switched not to couple to the bottom electrodes 881 of the magnetoresistive random access memories 880-1 for the first alternative in the pairs. Thereby, the magnetoresistive random access memories 880-1 for the first alternative in the pairs may be reset to the high resistance.

Referring to FIGS. 11A-11C, 11E and 11F, the setting step may be performed to the magnetoresistive random access memories 880-2 for the first alternative in the pairs. When the magnetoresistive random access memories 880-2 for the first alternative in the pairs are being set in the setting step, (1) the node N40 may be switched to couple to the programming voltage $V_{Pr}$, (2) the node N39 may be switched to couple to the programming voltage $V_{Pr}$, (3) the node N41 may be switched to couple to the voltage Vss of ground reference, and (4) the node N32 may be switched not to couple to the bottom electrodes 881 of the magnetoresistive random access memories 880-1 for the first alternative in the pairs. Thereby, the magnetoresistive random access memories 880-2 for the first alternative in the pairs may be set to the low resistance. Accordingly, the magnetoresistive random access memories 880-2 for the first alternative in the pairs may be programmed to the low resistance between 10 and 100,000,000,000 ohms, and the magnetoresistive random access memories 880-1 for the first alternative in the pairs may be programmed to the high resistance between 15 and 500,000,000,000 ohms, greater than the low resistance, for example.

Referring to FIGS. 11A-11C, 11E and 11F, in operation after the magnetoresistive random access memories 880-2 for the first alternative in the pairs may be programmed to the low resistance, and the magnetoresistive random access memories 880-1 for the first alternative in the pairs may be programmed to the high resistance, (1) the nodes N39, N40 and N41 may be switched to be floating, (2) the node N32 may be switched to couple to the bottom electrodes 881 of the magnetoresistive random access memories 880-1 for the first alternative in the pairs, and (3) the bottom electrodes 881 of the magnetoresistive random access memories 880-2 for the first alternative in the pairs may be switched to couple to the voltage Vss of ground reference. Thereby, the comparison line, i.e., node N32, of the sense amplifier 666 as seen in FIG. 8F may be at the comparison voltage between a voltage of the node N31 coupling to one of the magnetoresistive random access memories 880 for the first alternative programmed to the low resistance and selected by one of the word lines 875 and a voltage of the node N31 coupling to one of the magnetoresistive random access memories 880 for the first alternative programmed to the high resistance and selected by one of the word lines 875.

(2.2) Second Type of Non-Volatile Memory Cell for the Second Alternative

Referring to FIGS. 11D and 11E, each of the N-type MOS transistors 888 is configured to form a channel with two opposite terminals, one of which couples in series to the top electrode 882 of one the magnetoresistive random access memories 880 for the second alternative and the other of which couples to one of bit lines 876, and has a gate terminal coupling to one of word lines 875. Each of reference lines 877 may couple to the bottom electrodes 881 of the magnetoresistive random access memories 880 for the second alternative arranged in a row. Each of the word lines 875 may couple to the gate terminals of the N-type or P-type MOS transistors 888 arranged in a row that couple in parallel to one another through said each of the word lines 875. Each of the bit lines 876 is configured to couple, one by one and in turn, to the top electrode 882 of each of the magnetoresistive random access memories 880 for the second alternative arranged in a column through one of the N-type or P-type MOS transistors 888 arranged in a column.

In an alternative example, each of the N-type MOS transistors 888 is configured to form a channel with two opposite terminals, one of which couples in series to one of the bottom and top electrodes 881 and 882 of one the magnetoresistive random access memories 880 for the second alternative and the other of which couples to one of reference lines 877, and has a gate terminal coupling to one of word lines 875. Each of the reference lines 877 is configured to couple to the bottom or top electrodes 881 and 882 of the magnetoresistive random access memories 880 for the second alternative in a row through the N-type MOS transistors 888 in a row.

Referring to FIG. 11E, for programming the magnetoresistive random access memories 880 for the second alternative as illustrated in FIG. 11D, a resetting step may be first performed to all of the magnetoresistive random access memories 880, in which (1) all of the bit lines 876 may be switched to couple to a programming voltage $V_{Pr}$, between 0.25 and 3.3 volts, equal to or greater than the setting voltage $V_{MRE}$ of the magnetoresistive random access memories 880, (2) all of the word lines 875 may be switched to couple to the programming voltage $V_{Pr}$, between 0.25 and 3.3 volts, equal to or greater than the setting voltage $V_{MRE}$ of the magnetoresistive random access memories 880, to turn on each of the N-type MOS transistors 888 to couple the top electrode 872 of one of the magnetoresistive random access memories 880 to one of the bit lines 876 and (3) all of the reference lines 877 may be switched to couple to the voltage Vss of ground reference. Alternatively, when each of the switches 888 is a P-type MOS transistor, all of the word lines 875 may be switched to couple to the voltage Vss of ground reference to turn on each of the P-type MOS transistors 888 to couple the top electrode 872 of one of the magnetoresistive random access memories 880 to one of the bit lines 876. Thereby, an electron current may pass from the bottom electrode 881 of each of the magnetoresistive random access memories 880 to the top electrode 882 of said each of the magnetoresistive random access memories 880 to set the direction of the magnetic field in each domain of the free magnetic layer 887 of said each of the magnetoresistive random access memories 880 to be opposite to that in each domain of the pinned magnetic layer 885 of said each of the magnetoresistive random access memories 880. Thus, said each of the magnetoresistive random access memories 880 may be reset with the high resistance between 15 and 500,000,000,000 ohms in the resetting step, and thus programmed to a logic level of "1".

Next, referring to FIG. 11E, a setting step may be performed to a first group of the magnetoresistive random access memories 880 for the second alternative as illustrated in FIG. 11D but not to a second group of the magnetoresistive random access memories 880 for the second alternative as illustrated in FIG. 11D, in which (1) each of the word lines 875 corresponding to the magnetoresistive random access memories 880 in a row may be selected one by one and in turn to be switched to couple to a programming voltage $V_{Pr}$ to turn on the N-type MOS transistors 888 in a row to couple each of the magnetoresistive random access memories 880 in the row to one of the bit lines 876 or, in the alternative example, to couple all of the magnetoresistive random access memories 880 in the row to a same one of the reference lines 877, wherein the unselected word lines 875 corresponding to the magnetoresistive random access memories 880 in the other rows may be switched to couple to the voltage Vss of ground reference to turn off the N-type MOS transistors 888 in the other rows to decouple each of the magnetoresistive random access memories 880 in the other rows from any of the bit lines 876 or, in the alternative example, to decouple each of the magnetoresistive random access memories 880 in the other rows from any of the reference lines 877, wherein the programming voltage $V_{Pr}$ may be between 0.25 and 3.3 volts, equal to or greater than the resetting voltage $V_{MSE}$ of the magnetoresistive random access memories 880, (2) the reference lines 877 may be switched to couple to the programming voltage $V_{Pr}$ between 0.25 and 3.3 volts, equal to or greater than the resetting voltage $V_{MSE}$ of the magnetoresistive random access memories 880, (3) the bit lines 876 in a first group each for one of the magnetoresistive random access memories 880 in the first group in the row may be switched to couple to the voltage Vss of ground reference, and (4) the bit lines 876 in a second group each for one of the magnetoresistive random access memories 880 in the second group in the row may be switched to couple to the programming voltage $V_{Pr}$, between 0.25 and 3.3 volts, equal to or greater than the resetting voltage $V_{MSE}$ of the magnetoresistive random access memories 880. Alternatively, when each of the switches 888 is a P-type MOS transistor, each of the word lines 875 corresponding to the magnetoresistive random access memories 880 in the row may be selected one by one and in turn to be switched to couple to the voltage Vss of ground reference to turn on the P-type MOS transistors 888 in the row to couple each of the magnetoresistive random access memories 880 in the row to one of the bit lines 876 or, in the alternative example, to couple all of the magnetoresistive random access memories 880 in the row to the same one of the reference lines 877, wherein the unselected word lines 875 corresponding to the magnetoresistive random access memories 880 in the other rows may be switched to couple to the programming voltage VPr to turn off the P-type MOS transistors 888 in the other rows to decouple each of the magnetoresistive random access memories 880 in the other rows from any of the bit lines 876 or, in the alternative example, to decouple each of the magnetoresistive random access memories 880 in the other rows from any of the reference lines 877, wherein the programming voltage $V_{Pr}$ may be between 0.25 and 3.3 volts, equal to or greater than the setting voltage $V_{MSE}$ of the magnetoresistive random access memories 880. Thereby, an electron current may pass from the top electrode 882 of each of the magnetoresistive random access memories 880 in the first group in the row to the bottom electrode 881 of said each of the magnetoresistive random access memories 880 in the first group in the row to set the direction of the magnetic field in each domain of the free magnetic layer 887 of said each of the magnetoresistive random access memories 880 in the first group in the row to be the same as that in each domain of the pinned magnetic layer 885 of said each of the magnetoresistive random access memories 880 in the first group in the row. Thus, said each of the magnetoresistive random access memories 880 in the first group may be set to the low resistance between 10 and 100,000,000,000 ohms in the setting step, and thus programmed to a logic level of "0".

In operation, referring to FIGS. 8F and 11E, (1) each of the bit lines 876 may be switched to couple to the node N31 of the sense amplifier 666 as illustrated in FIG. 8F and to the source terminal of the N-type MOS transistor 896, (2) each of the reference lines 877 may be switched to couple to the voltage Vss of ground reference, and (3) each of the word lines 875 corresponding to the magnetoresistive random access memories 880 in a row may be selected one by one and in turn to be switched to couple to the voltage Vcc of power supply to turn on the N-type MOS transistors 888 in a row to couple each of the magnetoresistive random access memories 880 in the row to one of the bit lines 876 or, in the alternative example, to couple all of the magnetoresistive random access memories 880 in the row to a same one of the reference lines 877, wherein the unselected word lines 875 corresponding to the magnetoresistive random access memories 880 in the other rows may be switched to couple to the voltage Vss of ground reference to turn off the N-type MOS transistors 888 in the other rows to decouple each of the magnetoresistive random access memories 880 in the other rows from any of the bit lines 876 or, in the alternative example, to decouple each of the magnetoresistive random access memories 880 in the other rows from any of the reference lines 877. The N-type MOS transistor 896 may have a gate terminal coupling to a voltage Vg and a drain terminal coupling to the voltage Vcc of power supply. The N-type MOS transistor 896 may be considered as a current source. In operation, the voltage Vg may be applied to the gate of the N-type MOS transistor 896 to control an electric current at a substantially constant level passing through the N-type MOS transistor 896. Alternatively, when each of the switches 888 is a P-type MOS transistor, each of the word lines 875 corresponding to the magnetoresistive random access memories 880 in the row may be selected one by one and in turn to be switched to couple to the voltage Vss of ground reference to turn on the P-type MOS transistors 888 in the row to couple each of the magnetoresistive random access memories 880 in the row to one of the bit lines 876 or, in the alternative example, to couple all of the magnetoresistive random access memories 880 in the row to a same one of the reference lines 877, wherein the unselected word lines 875 corresponding to the magnetoresistive random access memories 880 in the other rows may be switched to couple to the voltage Vcc of power supply to turn off the P-type MOS transistors 888 in the other rows to decouple each of the magnetoresistive random access memories 880 in the other rows from any of the bit lines 876 or, in the alternative example, to decouple each of the magnetoresistive random access memories 880 in the other rows from any of the reference lines 877. Thereby, each of the sense amplifiers 666 may compare a voltage at one of the bit lines 876, i.e., at the node N31 as seen in FIG. 8F, and a voltage at a comparison line, i.e., at the node N32 as seen in FIG. 8F, into a compared data and then generate an output "Out" of one of the magnetoresistive random access memories 880 coupling to said one of the bit lines 876 via one of the switches 888 based on the compared data. For example, when the voltage at the node N31 is compared by said each of the sense amplifiers 666 to be smaller than the voltage at the node N32, said each of the sense amplifiers 666 may generate the output "Out" at a logic level of "1" in the case that one of the magnetoresistive random access memories 880, which couples to said each of the sense amplifiers 666, has the low resistance. When the voltage at the node N31 is compared by said each of the sense amplifiers 666 to be greater than the voltage at the node N32, said each of the sense amplifiers 666 may generate the output "Out" at a logic level of "0" in the case that one of the magnetoresistive random access memories 880, which couples to said each of the sense amplifiers 666, has the high resistance.

The comparison-voltage generating circuit 895 as illustrated in FIG. 11F may be applied hereto, but the magnetoresistive random access memories 880-1 and 880-2 for the first alternative as illustrated in FIG. 11F are changed to ones for the second alternative. Referring to FIGS. 11D-11F, the comparison-voltage generating circuit 895 includes two pairs of magnetoresistive random access memories 880-1 and 880-2 for the second alternative connected in serial to each other, wherein the pairs of magnetoresistive random access memories 880-1 and 880-2 for the second alternative are connected in parallel to each other. In each of the pairs of magnetoresistive random access memories 880-1 and 880-2 for the second alternative, the magnetoresistive random access memory 880-1 for the second alternative may have its top electrode 882 coupling to the top electrode 882 of the magnetoresistive random access memory 880-2 for the second alternative and to a node N39, and the magnetoresistive random access memory 880-1 for the second alternative may have its bottom electrode 881 coupling to the node N40. The N-type MOS transistors 891 may have its source terminal, in operation, coupling to the bottom electrodes 881 of the magnetoresistive random access memories 880-1 for the second alternative in the pairs and to the node N40. The N-type MOS transistor 892 may have its gate terminal coupling to its drain terminal and to the voltage Vcc of power supply and its source terminal coupling to the node N32 of the sense amplifier 666 as seen in FIG. 8F via the comparison line. The bottom electrodes 881 of the magnetoresistive random access memories 880-2 for the second alternative in the pairs may couple to a node N41.

Referring to FIGS. 11D-11F, the resetting step may be performed to the magnetoresistive random access memories 880-1 for the second alternative in the pairs. When the magnetoresistive random access memories 880-1 for the second alternative in the pairs are being reset in the resetting step, (1) the node N40 may be switched to couple to the voltage Vss of ground reference, (2) the node N39 may be switched to couple to the programming voltage $V_{Pr}$, (3) the node N41 may be switched to couple to the programming voltage $V_{Pr}$, and (4) the node N32 may be switched not to couple to the bottom electrodes 881 of the magnetoresistive random access memories 880-1 for the second alternative in the pairs. Thereby, the magnetoresistive random access memories 880-1 for the second alternative in the pairs may be reset to the high resistance.

Referring to FIGS. 11D-11F, the setting step may be performed to the magnetoresistive random access memories 880-2 for the second alternative in the pairs. When the magnetoresistive random access memories 880-2 for the second alternative in the pairs are being set in the setting step, (1) the node N40 may be switched to couple to the voltage Vss of ground reference, (2) the node N39 may be switched to couple to the voltage Vss of ground reference, (3) the node N41 may be switched to couple to the programming voltage $V_{Pr}$, and (4) the node N32 may be switched not to couple to the bottom electrodes 881 of the magnetoresistive random access memories 880-1 for the second alternative in the pairs. Thereby, the magnetoresistive random access memories 880-2 for the second alternative in the pairs may be set to the low resistance. Accordingly, the magnetoresistive random access memories 880-2 for the second alternative in the pairs may be programmed to the low resistance between 10 and 100,000,000,000 ohms, and the magnetoresistive random access memories 880-1 for the second alternative in the pairs may be programmed to the high resistance between 15 and 500,000,000,000 ohms, greater than the low resistance, for example.

Referring to FIGS. 11D-11F, in operation after the magnetoresistive random access memories 880-2 for the second alternative in the pairs may be programmed to the low resistance, and the magnetoresistive random access memories 880-1 for the second alternative in the pairs may be programmed to the high resistance, (1) the nodes N39, N40 and N41 may be switched to be floating, (2) the node N32 may be switched to couple to the bottom electrodes 881 of the magnetoresistive random access memories 880-1 for the second alternative in the pairs, and (3) the bottom electrodes 881 of the magnetoresistive random access memories 880-2 for the second alternative in the pairs may be switched to couple to the voltage Vss of ground reference. Thereby, the comparison line, i.e., node N32, of the sense amplifier 666 as seen in FIG. 8F may be at the comparison voltage between a voltage of the node N31 coupling to one of the magnetoresistive random access memories 880 for the second alternative programmed to the low resistance and selected by one of the word lines 875 and a voltage of the node N31 coupling to one of the magnetoresistive random access memories 880 for the second alternative programmed to the high resistance and selected by one of the word lines 875.

Figure 12A:
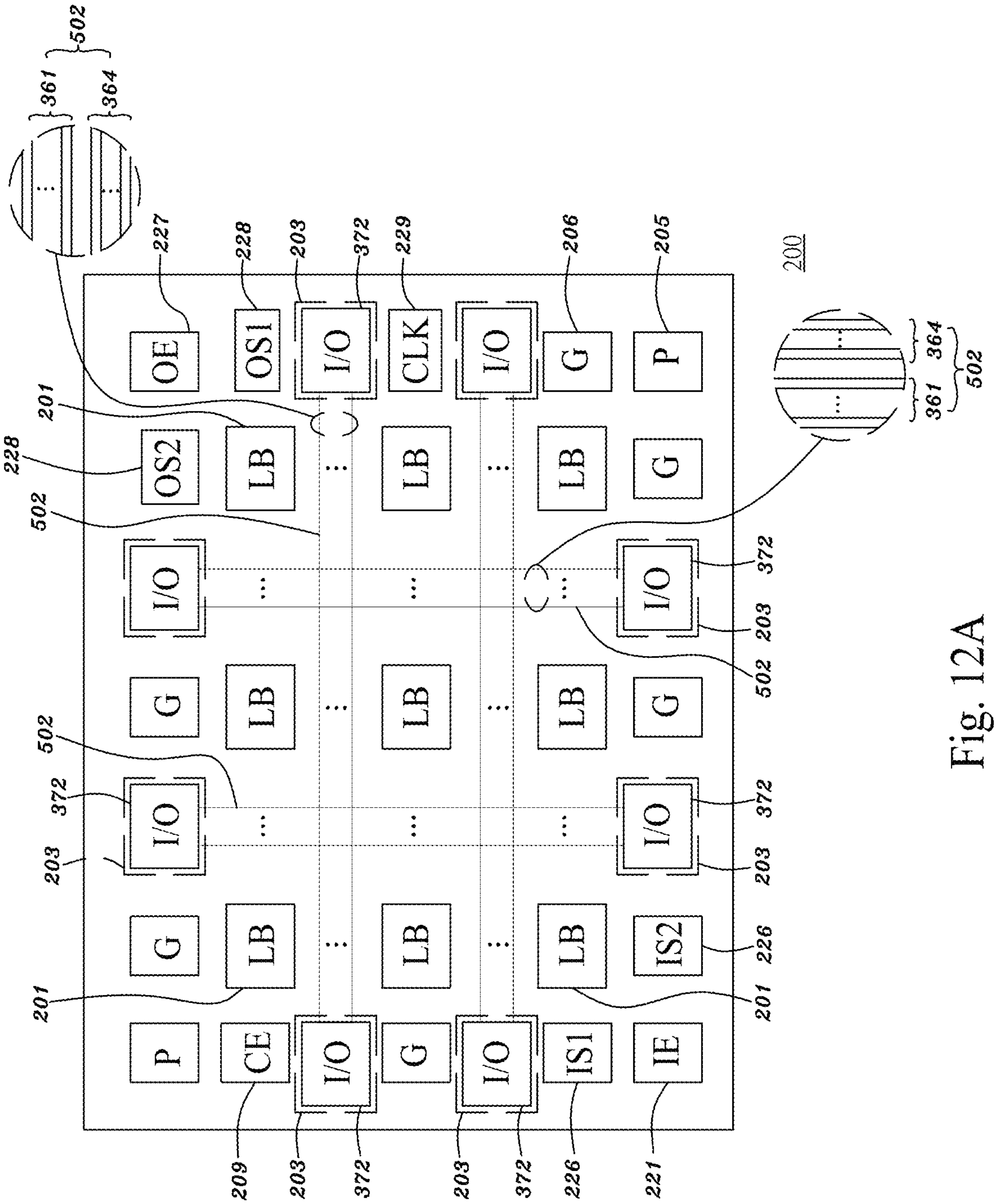
FIGS. 12A-12H are schematically top views showing various arrangements for a standard commodity FPGA IC chip in accordance with an embodiment of the present application.

Specification for Standard Commodity Field-Programmable-Gate-Array (FPGA) Integrated-Circuit (IC) Chip FIG. 12A is a schematically top view showing a block diagram of a standard commodity FPGA IC chip in accordance with an embodiment of the present application. Referring to FIG. 12A, a standard commodity FPGA IC chip 200 is designed, implemented and fabricated using an advanced semiconductor technology node or generation, for example more advanced than or equal to, or below or equal to 20 nm or 10 nm, and for example using the technology node of 16 nm, 14 nm, 12 nm, 10 nm, 7 nm, 5 nm or 3 nm; with a chip size and manufacturing yield optimized with the minimum manufacturing cost for the used semiconductor technology node or generation. The standard commodity FPGA IC chip 200 may have an area between 400 $mm^2$ and 9 $mm^2$, 144 $mm^2$ and 16 $mm^2$, 75 $mm^2$ and 16 $mm^2$, or 50 $mm^2$ and 16 $mm^2$. Transistors or semiconductor devices of the standard commodity FPGA IC chip 200 used in the advanced semiconductor technology node or generation may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET. None or minimal area of the standard commodity FPGA IC chip 200 may be used for the control or I/O circuits, for example, less than 15%, 10%, 5%, 2% or 1% area may be used for the control or IO circuits; alternatively, none or minimal transistors of the standard commodity FPGA IC chip 200 may be used for the control or I/O circuits, for example, less than 15%, 10%, 5%, 2% or 1% of the total number of transistors may be used for the control or I/O circuits.

Referring to FIG. 12A, since the standard commodity FPGA IC chip 200 is a standard commodity IC chip, the number of types of products for the standard commodity FPGA IC chip 200 may be reduced to a small number, and therefore expensive photo masks or mask sets for fabricating the standard commodity FPGA IC chip 200 using advanced semiconductor notes or generations may be reduced to a few mask sets. For example, the mask sets for a specific technology node or generation may be reduced down to between 3 and 20, 3 and 10, or 3 and 5. Its NRE and production expenses are therefore greatly reduced. With the few types of products for the standard commodity FPGA IC chip 200, the manufacturing processes may be optimized to achieve very high manufacturing chip yields. Furthermore, the chip inventory management becomes easy, efficient and effective, therefore resulting in a relatively short chip delivery time and becoming very cost-effective.

Referring to FIG. 12A, the standard commodity FPGA IC chip 200 may be of various types, including (1) multiple of the programmable logic blocks (LB) 201 as illustrated in FIGS. 6A-6J arranged in an array in a central region thereof, (2) multiple cross-point switches 379 as illustrated in FIGS. 3A-3D and 7A-7C arranged around each of the programmable logic blocks (LB) 201, (3) multiple intra-chip interconnects 502 each extending over spaces between neighboring two of the programmable logic blocks 201, (4) multiple of the small input/output (I/O) circuits 203, as illustrated in FIG. 5B, each having its output S_Data_in coupling to one or more of the intra-chip interconnects 502 and its input S_Data_out, S_Enable or S_Inhibit coupling to another one or more of intra-chip interconnects 502 and (5) multiple of the non-volatile memory cells 870, 880 or 907 as illustrated in FIG. 8A-8F, 9A-9H, 10A-10I or 11A-11F. For the standard commodity FPGA IC chip 200, each of its sense amplifiers 666 as illustrated in FIG. 8E or 9E may have the output Out to couple to one or more of the bit lines 452 of the 6T or 5T SRAM cells 398 as seen in FIG. 1A or 1B employed for its memory cells 490 for the look-up tables (LUT) 210 of its programmable logic blocks (LB) 201 as illustrated in FIGS. 6A-6J or for its memory cells 362 for its cross-point switches 379 as illustrated in FIGS. 7A-7C through one or more of its fixed interconnects 364. Thereby, for the standard commodity FPGA IC chip 200, when its non-volatile memory cells 870, 880 or 907 as illustrated in FIG. 8A-8F, 9A-9H, 10A-10I or 11A-11F are in operation, the programming codes or resulting values stored in its non-volatile memory cells 870, 880 or 907 as illustrated in FIG. 8A-8F, 9A-9H, 10A-10I or 11A-11F may be downloaded via its sense amplifiers 666 to its memory cells 490 for the look-up tables (LUT) 210 of its programmable logic blocks (LB) 201 as illustrated in FIG. 6A or 6H or to its memory cells 362 for its cross-point switches 379 as illustrated in FIGS. 7A-7C.

Referring to FIG. 12A, the intra-chip interconnects 502 may be divided into the programmable interconnects 361 and fixed interconnects 364 as illustrated in FIG. 7A-7C. For the standard commodity FPGA IC chip 200, each of the small input/output (I/O) circuits 203, as illustrated in FIG. 5B, may have its output S_Data_in coupling to one or more of the programmable interconnects 361 and/or one or more of the fixed interconnects 364 and its input S_Data_out, S_Enable or S_Inhibit coupling to another one or more of the programmable interconnects 361 and/or another one or more of the fixed interconnects 364.

Referring to FIG. 12A, each of the programmable logic blocks (LB) 201 as illustrated in FIG. 6A or 6H may have its inputs A0-A3 each coupling to one or more of the programmable interconnects 361 of the intra-chip interconnects 502 and/or one or more of the fixed interconnects 364 of the intra-chip interconnects 502 and may be configured to perform logic operation or computation operation on its inputs into its output Dout, C0, C1, C2 or C3 coupling to another one or more of the programmable interconnects 361 of the intra-chip interconnects 502 and/or another one or more of the fixed interconnects 364 of the intra-chip interconnects 502, wherein the computation operation may include an addition, subtraction, multiplication or division operation, and the logic operation may include a Boolean operation such as AND, NAND, OR or NOR operation. All or most area of the standard commodity FPGA IC chip 200 may be used for the programmable logic blocks (LB) 201 and programmable interconnection for the programmable interconnects 361. For example, greater than 85%, 90%, 95% or 99% area thereof is used for the programmable logic blocks (LB) 201 and programmable interconnection for the programmable interconnects 361; alternatively, all or most transistors of the standard commodity FPGA IC chip 200 may be used for the programmable logic blocks (LB) 201 and programmable interconnection for the programmable interconnects 361 and, for example, greater than 85%, 90%, 95% or 99% of the total number of transistors thereof may be used for the programmable logic blocks (LB) 201 and programmable interconnection for the programmable interconnects 361.

Referring to FIG. 12A, the standard commodity FPGA IC chip 200 may include multiple of the I/O pads 372 as seen in FIG. 5B, each vertically over one of its small input/output (I/O) circuits 203, coupling to the node 381 of said one of the small input/output (I/O) circuits 203. In a first clock, the output Dout, C0, C1, C2 or C3 of one of the programmable logic blocks 201 as illustrated in FIG. 6A or 6H may be transmitted to the input S_Data_out of the small driver 374 of one of the small input/output (I/O) circuits 203 through one or more of the programmable interconnects 361 and/or one or more of the cross-point switches 379 each between two of said one or more of the programmable interconnects 361 joining said each thereof, and then the small driver 374 of said one of the small input/output (I/O) circuits 203 may amplify its input S_Data_out to be transmitted to one of the I/O pads 372 vertically over said one of the small input/output (I/O) circuits 203 for external connection to circuits outside the standard commodity FPGA IC chip 200. In a second clock, a signal from circuits outside the standard commodity FPGA IC chip 200 may be transmitted to the small receiver 375 of said one of the small input/output (I/O) circuits 203 through said one of the I/O pads 372, and then the small receiver 375 of said one of the small input/output (I/O) circuits 203 may amplify the signal into its output S_Data_in to be transmitted to one of the inputs A0-A3 of another of the programmable logic blocks 201 as illustrated in FIG. 6A or 6H through another one or more of the programmable interconnects 361 and/or one or more of the cross-point switches 379 each between two of said another one or more of the programmable interconnects 361 joining said each thereof.

Referring to FIG. 12A, the standard commodity FPGA IC chip 200 may be provided with a plurality of the small input/output (I/O) circuit 203 as seen in FIG. 5B, having the number of $2^n$ where n may be an integer ranger from 2 to 8, arranged in parallel for each of multiple input/output (I/O) ports of the standard commodity FPGA IC chip 200. The I/O ports of the standard commodity FPGA IC chip 200 may have the number of $2^n$ where n may be an integer ranger from 1 to 5. For an example, the I/O ports of the standard commodity FPGA IC chip 200 may have the number of four and may be defined as first, second, third and fourth I/O ports respectively. Each of the first, second, third and fourth I/O ports of the standard commodity FPGA IC chip 200 may have sixty four small input/output (I/O) circuits 203, each of which may be referred to one as seen in FIG. 5B, for receiving or transmitting data in a bit width of 64 bits from or to the circuits outside of the standard commodity FPGA IC chip 200.

Referring to FIG. 12A, the standard commodity FPGA IC chip 200 may further include a chip-enable (CE) pad 209 configured for enabling or disabling the standard commodity FPGA IC chip 200. For example, when a logic level of "0" couples to the chip-enable (CE) pad 209, the standard commodity FPGA IC chip 200 may be enabled to process data and/or operate with circuits outside of the standard commodity FPGA IC chip 200; when a logic level of "1" couples to the chip-enable (CE) pad 209, the standard commodity FPGA IC chip 200 may be disabled not to process data and/or operate with circuits outside of the standard commodity FPGA IC chip 200.

Referring to FIG. 12A, for the standard commodity FPGA IC chip 200, it may further include (1) an input-enable (IE) pad 221 coupling to the first input of the small receiver 375 of each of its small input/output (I/O) circuits 203 as seen in FIG. 5B, configured for receiving the S_Inhibit signal from the circuits outside of it to activate or inhibit the small receiver 375 of each of its small input/output (I/O) circuits 203 for each of its I/O ports; and (2) multiple input selection (IS) pads 226 configured for selecting one from its I/O ports to receive data, i.e., S_Data_in illustrated in FIG. 5B, via the metal pads 372 of the selected one of its I/O ports from the circuits outside of it. For the example, for the standard commodity FPGA IC chip 200, its input selection (IS) pads 226 may have the number of two, e.g., IS1 and IS2 pads, for selecting one from its first, second, third and fourth I/O ports to receive data in the bit width of 64 bits, i.e., S_Data_in illustrated in FIG. 5B, via the 64 parallel metal pads 372 of the selected one of its first, second, third and fourth I/O ports from the circuits outside of it. Provided that (1) a logic level of "0" couples to the chip-enable (CE) pad 209, (2) a logic level of "1" couples to the input-enable (IE) pad 221, (3) a logic level of "0" couples to the IS1 pad 226 and (4) a logic level of "0" couples to the IS2 pad 226, the standard commodity FPGA IC chip 200 is enabled to activate the small receivers 375 of its small input/output (I/O) circuits 203 for its first, second, third and fourth I/O ports and to select its first one from its first, second, third and fourth I/O ports for receiving the data in the bit width of 64 bits via the 64 parallel metal pads 372 of its first I/O port from the circuits outside of the standard commodity FPGA IC chip 200, wherein its second, third and fourth I/O ports are not selected to receive the data from the circuits outside of the standard commodity FPGA IC chip 200. Provided that (1) a logic level of "0" couples to the chip-enable (CE) pad 209, (2) a logic level of "1" couples to the input-enable (IE) pad 221, (3) a logic level of "1" couples to the IS1 pad 226 and (4) a logic level of "0" couples to the IS2 pad 226, the standard commodity FPGA IC chip 200 is enabled to activate the small receivers 375 of its small input/output (I/O) circuits 203 for its first, second, third and fourth I/O ports and to select its second one from its first, second, third and fourth I/O ports for receiving the data in the bit width of 64 bits via the 64 parallel metal pads 372 of its second I/O port from the circuits outside of the standard commodity FPGA IC chip 200, wherein its first, third and fourth I/O ports are not selected to receive the data from the circuits outside of the standard commodity FPGA IC chip 200. Provided that (1) a logic level of "0" couples to the chip-enable (CE) pad 209, (2) a logic level of "1" couples to the input-enable (IE) pad 221, (3) a logic level of "0" couples to the IS1 pad 226 and (4) a logic level of "1" couples to the IS2 pad 226, the standard commodity FPGA IC chip 200 is enabled to activate the small receivers 375 of its small input/output (I/O) circuits 203 for its first, second, third and fourth I/O ports and to select its third one from its first, second, third and fourth I/O ports for receiving the data in the bit width of 64 bits via the 64 parallel metal pads 372 of its third I/O port from the circuits outside of the standard commodity FPGA IC chip 200, wherein its first, second and fourth I/O ports are not selected to receive the data from the circuits outside of the standard commodity FPGA IC chip 200. Provided that (1) a logic level of "0" couples to the chip-enable (CE) pad 209, (2) a logic level of "1" couples to the input-enable (IE) pad 221, (3) a logic level of "1" couples to the IS1 pad 226 and (4) a logic level of "1" couples to the IS2 pad 226, the standard commodity FPGA IC chip 200 is enabled to activate the small receivers 375 of its small input/output (I/O) circuits 203 for its first, second, third and fourth I/O ports and to select its fourth one from its first, second, third and fourth I/O ports for receiving the data in the bit width of 64 bits via the 64 parallel metal pads 372 of its fourth I/O port from the circuits outside of the standard commodity FPGA IC chip 200, wherein its first, second and third I/O ports are not selected to receive the data from the circuits outside of the standard commodity FPGA IC chip 200. Provided that (1) a logic level of "0" couples to the chip-enable (CE) pad 209, and (2) a logic level of "0" couples to the input-enable (IE) pad 221, the standard commodity FPGA IC chip 200 is enabled to inhibit the small receivers 375 of its small input/output (I/O) circuits 203 for its first, second, third and fourth I/O ports.

Referring to FIG. 12A, for the standard commodity FPGA IC chip 200, it may further include (1) an output-enable (OE) pad 227 coupling to the second input of the small driver 374 of each of its small input/output (I/O) circuits 203 as seen in FIG. 5B, configured for receiving the S_Enable signal from the circuits outside of it to enable or disable the small driver 374 of each of its small input/output (I/O) circuits 203 for each of its I/O ports; and (2) multiple output selection (OS) pads 228 configured for selecting one from its I/O ports to drive or pass data, i.e., S_Data_out illustrated in FIG. 5B, via the metal pads 372 of the selected one of its I/O ports to the circuits outside of it. For the example, for the standard commodity FPGA IC chip 200, its output selection (OS) pads 226 may have the number of two, e.g., OS1 and OS2 pads, for selecting one from its first, second, third and fourth I/O ports to drive or pass data in the bit width of 64 bits, i.e., S_Data_out illustrated in FIG. 5B, via the 64 parallel metal pads 372 of the selected one of its first, second, third and fourth I/O ports to the circuits outside of it. Provided that (1) a logic level of "0" couples to the chip-enable (CE) pad 209, (2) a logic level of "0" couples to the output-enable (OE) pad 227, (3) a logic level of "0" couples to the OS1 pad 228 and (4) a logic level of "0" couples to the OS2 pad 228, the standard commodity FPGA IC chip 200 is enabled to enable the small drivers 374 of its small input/output (I/O) circuits 203 for its first, second, third and fourth I/O ports and to select its first one from its first, second, third and fourth I/O ports for driving or passing the data in the bit width of 64 bits via the 64 parallel metal pads 372 of its first I/O port to the circuits outside of the standard commodity FPGA IC chip 200, wherein its second, third and fourth I/O ports are not selected to drive or pass the data to the circuits outside of the standard commodity FPGA IC chip 200. Provided that (1) a logic level of "0" couples to the chip-enable (CE) pad 209, (2) a logic level of "0" couples to the output-enable (OE) pad 227, (3) a logic level of "1" couples to the OS1 pad 228 and (4) a logic level of "0" couples to the OS2 pad 228, the standard commodity FPGA IC chip 200 is enabled to enable the small drivers 374 of its small input/output (I/O) circuits 203 for its first, second, third and fourth I/O ports and to select its second one from its first, second, third and fourth I/O ports for driving or passing the data in the bit width of 64 bits via the 64 parallel metal pads 372 of its second I/O port to the circuits outside of the standard commodity FPGA IC chip 200, wherein its first, third and fourth JO ports are not selected to drive or pass the data to the circuits outside of the standard commodity FPGA IC chip 200. Provided that (1) a logic level of "0" couples to the chip-enable (CE) pad 209, (2) a logic level of "0" couples to the output-enable (OE) pad 227, (3) a logic level of "0" couples to the OS 1 pad 228 and (4) a logic level of "1" couples to the OS2 pad 228, the standard commodity FPGA IC chip 200 is enabled to enable the small drivers 374 of its small input/output (JO) circuits 203 for its first, second, third and fourth I/O ports and to select its third one from its first, second, third and fourth I/O ports for driving or passing the data in the bit width of 64 bits via the 64 parallel metal pads 372 of its third I/O port to the circuits outside of the standard commodity FPGA IC chip 200, wherein its first, second and fourth I/O ports are not selected to drive or pass the data to the circuits outside of the standard commodity FPGA IC chip 200. Provided that (1) a logic level of "0" couples to the chip-enable (CE) pad 209, (2) a logic level of "0" couples to the output-enable (OE) pad 227, (3) a logic level of "1" couples to the OS1 pad 228 and (4) a logic level of "l" couples to the OS2 pad 228, the standard commodity FPGA IC chip 200 is enabled to enable the small drivers 374 of its small input/output (I/O) circuits 203 for its first, second, third and fourth I/O ports and to select its fourth one from its first, second, third and fourth I/O ports for driving or passing the data in the bit width of 64 bits via the 64 parallel metal pads 372 of its fourth I/O port to the circuits outside of the standard commodity FPGA IC chip 200, wherein its first, second and third I/O ports are not selected to drive or pass the data to the circuits outside of the standard commodity FPGA IC chip 200. Provided that (1) a logic level of "0" couples to the chip-enable (CE) pad 209 and (2) a logic level of "1" couples to the output-enable (OE) pad 227, the standard commodity FPGA IC chip 200 is enabled to disable the small drivers 374 of its small input/output (I/O) circuits 203 for its first, second, third and fourth I/O ports.

Referring to FIG. 12A, the standard commodity FPGA IC chip 200 may further include (1) multiple power pads 205 configured for applying the voltage Vcc of power supply to the memory cells 490 for the look-up tables (LUT) 210 of the programmable logic blocks (LB) 201 as illustrated in FIG. 6A or 6H, the memory cells 362 for the cross-point switches 379 as illustrated in FIGS. 7A-7C and/or the non-volatile memory cells 870, 880 or 907 as illustrated in FIG. 8A-8F, 9A-9H, 10A-10I or 11A-11F through one or more of the fixed interconnects 364, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 configured for providing the voltage Vss of ground reference to the memory cells 490 for the look-up tables (LUT) 210 of the programmable logic blocks (LB) 201 as illustrated in FIG. 6A or 6H, the memory cells 362 for the cross-point switches 379 as illustrated in FIGS. 7A-7C and/or the non-volatile memory cells 870, 880 or 907 as illustrated in FIG. 8A-8F, 9A-9H, 10A-10I or 11A-11F through one or more of the fixed interconnects 364.

Referring to FIG. 12A, the standard commodity FPGA IC chip 200 may further include a clock pad 229 configured for receiving a clock signal from circuits outside of the standard commodity FPGA IC chip 200.

Referring to FIG. 12A, for the standard commodity FPGA IC chip 200, its programmable logic blocks 201 may be reconfigurable for artificial-intelligence (AI) application. For example, in a first clock, one of its programmable logic blocks 201 may have its look-up table (LUT) 201 to be programmed for OR operation as illustrated in FIGS. 6B and 6C; however, after one or more events happen, in a second clock said one of its programmable logic blocks 201 may have its look-up table (LUT) 201 to be programmed for NAND operation as illustrated in FIGS. 6D and 6E for better AI performance.

Since the standard commodity FPGA IC chip 200 may include mainly the look-up table (LUT) 210, i.e., programmable logic blocks (LB) 201, and programmable interconnection for the programmable interconnects 361, just like standard commodity DRAM, or NAND flash IC chips, the manufacturing yield thereof may be very high, for example, greater than 80%, 90% or 95% for the chip area thereof greater than, for example, 50 $mm^2$.

Figure 12B:
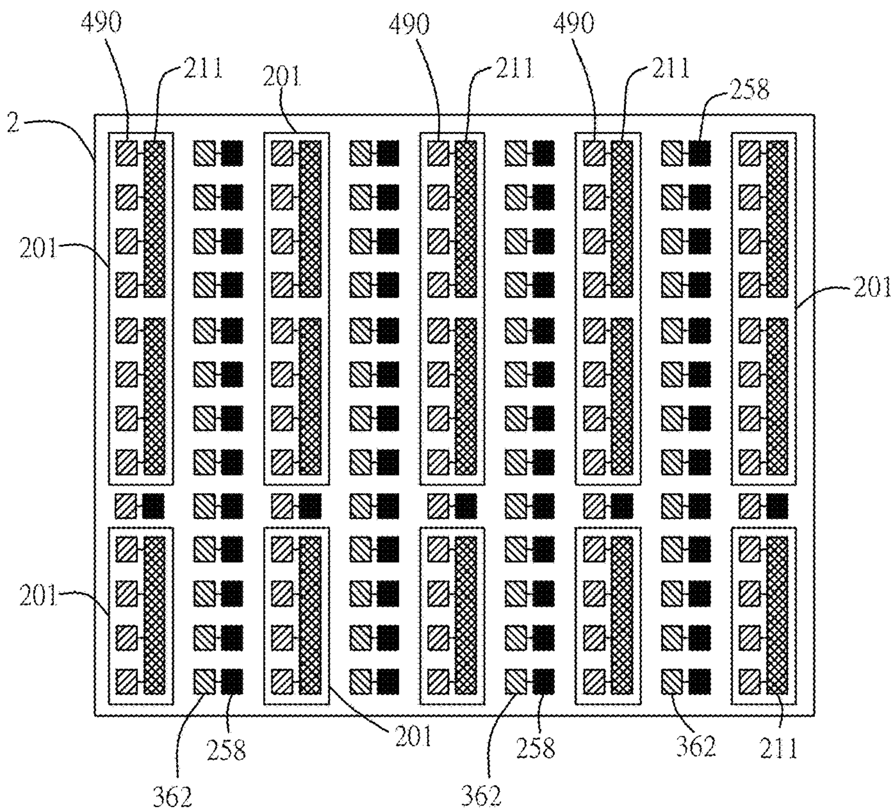

I. Arrangements for Memory Cells, Multiplexers and Pass/No-Pass Switches for Standard Commodity FPGA IC Chip FIGS. 12B-12E are schematic views showing various arrangements for (1) the memory cells 490, employed for the look-up tables 210, and the multiplexers 211 for the programmable logic blocks 201 and (2) the memory cells 362 and the pass/no-pass switches 258 for the programmable interconnects 361 in accordance with an embodiment of the present application. The pass/no-pass switches 258 may compose the first and second types of cross-point switches 379 as illustrated in FIGS. 3A and 3B respectively. The various arrangements are mentioned as below:

(1) First Arrangement for Memory Cells, Multiplexers and Pass/No-Pass Switches for Standard Commodity FPGA IC Chip Referring to FIG. 12B, for each of the programmable logic blocks 201 of the standard commodity FPGA IC chip 200, the memory cells 490 for one of its look-up tables 210 may be distributed on and/or over a first area of a semiconductor substrate 2 of the standard commodity FPGA IC chip 200, and one of its multiplexers 211 coupling to the memory cells 490 for said one of its look-up tables 210 may be distributed on and/or over a second area of the semiconductor substrate 2 of the standard commodity FPGA IC chip 200, wherein the first area is nearby or close to the second area. Each of the programmable logic blocks 201 may include one or more of multiplexers 211 and one or more groups of memory cells 490 employed for one or more of look-up tables 210 respectively and coupled to the first set of inputs, e.g., D0-D15, of said one or more of multiplexers 211 respectively, wherein each of the memory cells 490 in said one or more groups may store one of the resulting values or programming codes for said one or more of look-up tables 210 and may have an output coupling to one of the inputs of the first set, e.g., D0-D15, of said one or more of multiplexers 211.

Referring to FIG. 12B, a group of memory cells 362 employed for the programmable interconnects 361 as seen in FIG. 7A may be distributed in one or more lines between neighboring two of the programmable logic blocks 201. Also, a group of pass/no-pass switches 258 employed for the programmable interconnects 361 as seen in FIG. 7A may be distributed in one or more lines between said neighboring two of the programmable logic blocks 201. The group of pass/no-pass switches 258 and the group of memory cells 362 compose the cross-point switch 379 as seen in FIG. 3A or 3B. Each of the pass/no-pass switches 258 in the group may couple one or more of the memory cells 362 in the group.

Figure 12C:
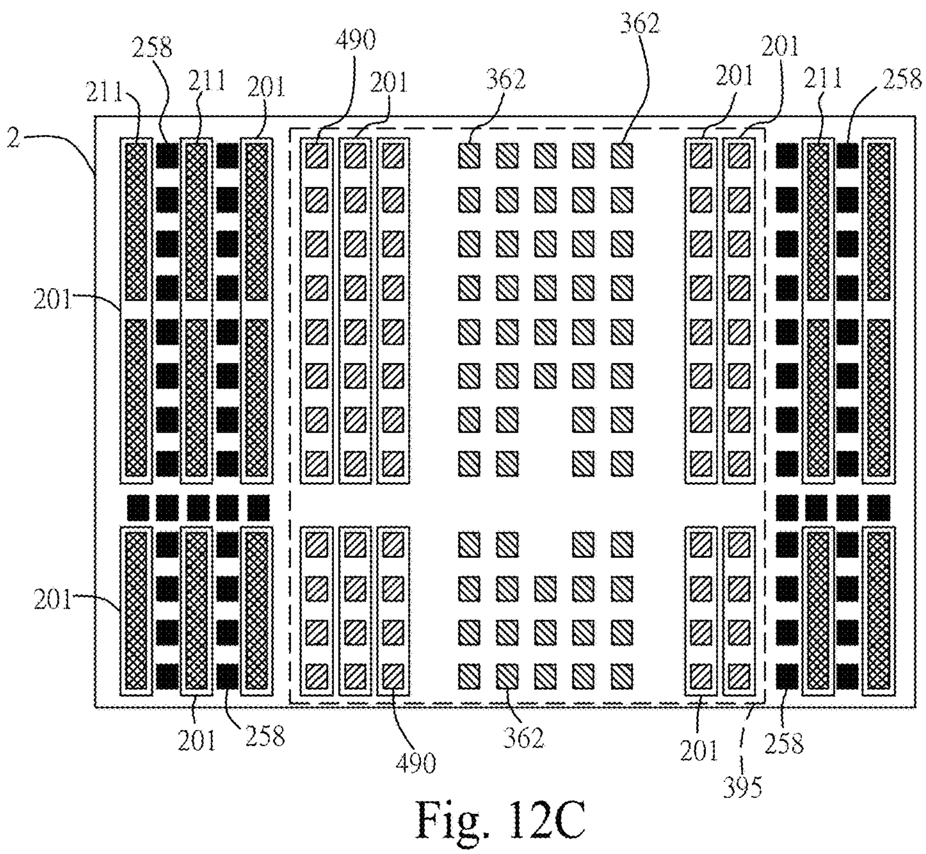

(2) Second Arrangement for Memory Cells, Multiplexers and Pass/No-Pass Switches for Standard Commodity FPGA IC Chip Referring to FIG. 12C, for the standard commodity FPGA IC chip 200, the memory cells 490 employed for all of its look-up tables 210 and the memory cells 362 employed for all of its programmable interconnects 361 may be aggregately distributed in a memory-array block 395 in a certain area of its semiconductor substrate 2. For more elaboration, for the same programmable logic block 201, the memory cells 490 employed for its one or more look-up tables (LUTs) 210 and its one or more multiplexers 211 may be arranged in two separate areas, in one of which are the memory cells 490 employed for its one or more look-up tables (LUTs) 210 and in the other one of which are its one or more multiplexers 211. The pass/no-pass switches 258 employed for programmable interconnects 361 may be distributed in one or more lines between the multiplexers 211 of neighboring two of the programmable logic blocks 201.

Figure 12D:
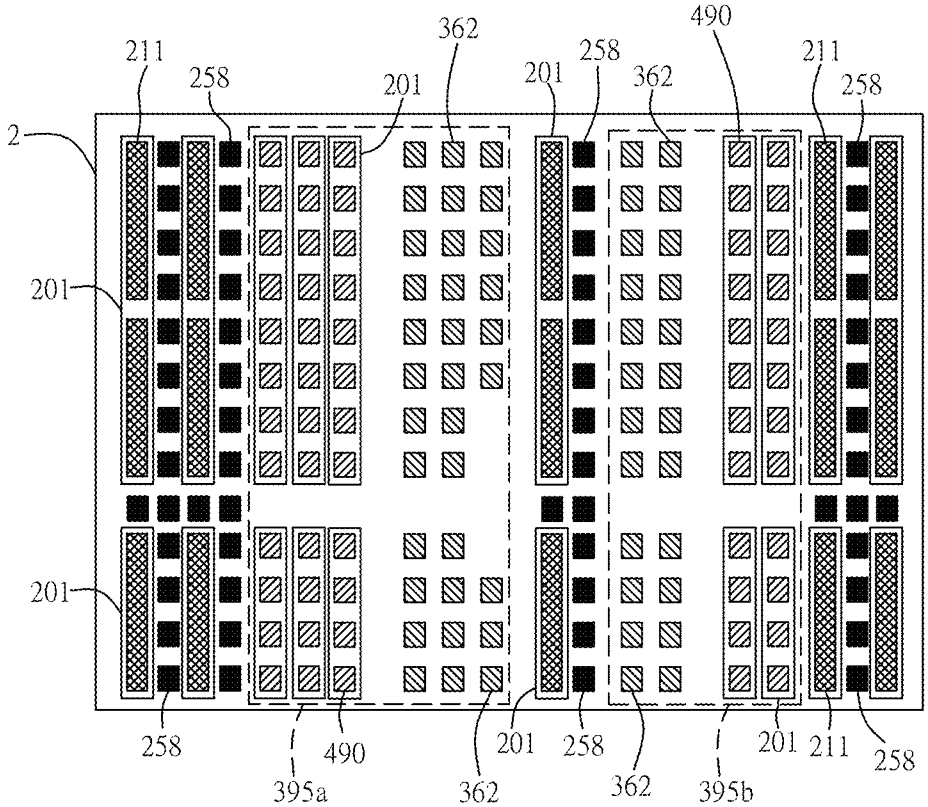

(3) Third Arrangement for Memory Cells, Multiplexers and Pass/No-Pass Switches for Standard Commodity FPGA IC Chip Referring to FIG. 12D, for the standard commodity FPGA IC chip 200, the memory cells 490 employed for all of its look-up tables 210 and the memory cells 362 employed for all of its programmable interconnects 361 may be aggregately distributed in multiple separate memory-array blocks 395*a* and 395*b* in multiple certain areas of its semiconductor substrate 2. For more elaboration, for the same programmable logic block 201, the memory cells 490 employed for its one or more look-up tables (LUTs) 210 and its one or more multiplexers 211 may be arranged in two separate areas, in one of which are the memory cells 490 employed for its one or more look-up tables (LUTs) 210 and in the other one of which are its one or more multiplexers 211. The pass/no-pass switches 258 employed for programmable interconnects 361 may be distributed in one or more lines between the multiplexers 211 of neighboring two of the programmable logic blocks 201. For the standard commodity FPGA IC chip 200, some of its multiplexers 211 and some of the pass/no-pass switches 258 may be arranged between the memory-array blocks 395*a* and 395*b*.

Figure 12E:
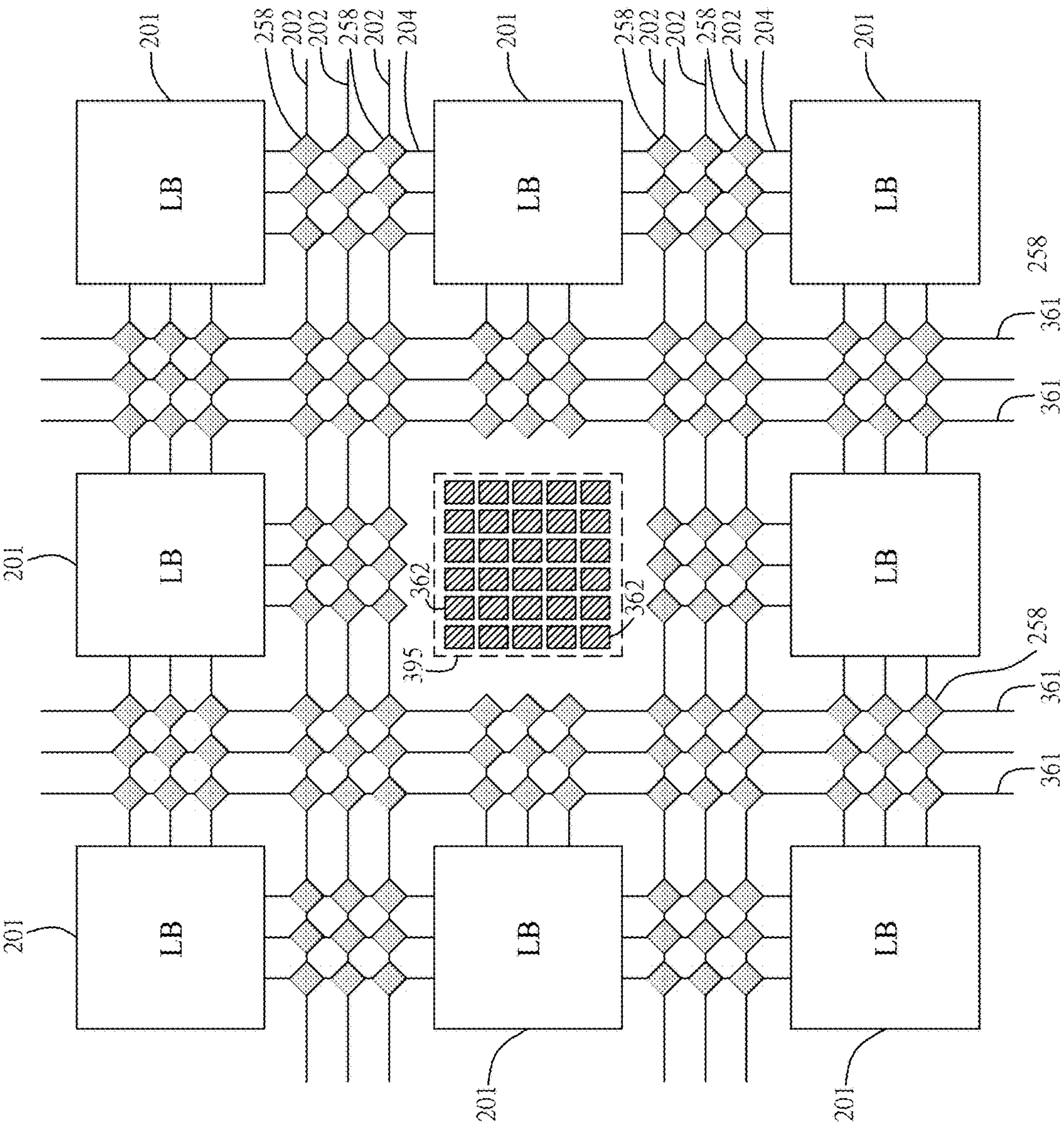

(4) Fourth Arrangement for Memory Cells, Multiplexers and Pass/No-Pass Switches for Standard Commodity FPGA IC Chip Referring to FIG. 12E, for the standard commodity FPGA IC chip 200, the memory cells 362 employed for its programmable interconnects 361 may be aggregately arranged in a memory-array block 395 in a certain area of the semiconductor substrate 2 and coupled to (1) multiple first groups of its pass/no-pass switches 258 arranged on or over its semiconductor substrate 2, wherein each of its pass/no-pass switches 258 in the first groups may be between neighboring two of its programmable logic blocks 201 in the same row or between the memory-array block 395 and one of its programmable logic blocks 201 in the same row, (2) multiple second groups of its pass/no-pass switches 258 arranged on or over its semiconductor substrate 2, wherein each of its pass/no-pass switches 258 in the second groups may be between neighboring two of its programmable logic blocks 201 in the same column or between the memory-array block 395 and one of its programmable logic blocks 201 in the same column, and (3) multiple third groups of the pass/no-pass switches 258 arranged on or over the semiconductor substrate 2, wherein each of its pass/no-pass switches 258 in the third groups may be between neighboring two of the first groups of the pass/no-pass switches 258 in the same column and between neighboring two of the second groups of the pass/no-pass switches 258 in the same row. For the standard commodity FPGA IC chip 200, each of its programmable logic blocks 201 may include one or more multiplexers 211 and one or more groups of memory cells 490 employed for one or more of look-up tables 210 respectively and coupled to the first set of inputs, e.g., D0-D15, of said one or more of multiplexers 211 respectively, as illustrated in FIG. 12B, wherein each of the memory cells 490 in said one or more groups may store one of the resulting values or programming codes for said one or more of look-up tables 210 and may have an output coupling to one of the inputs of the first set, e.g., D0-D15, of said one or more of multiplexers 211.

Figure 12F:
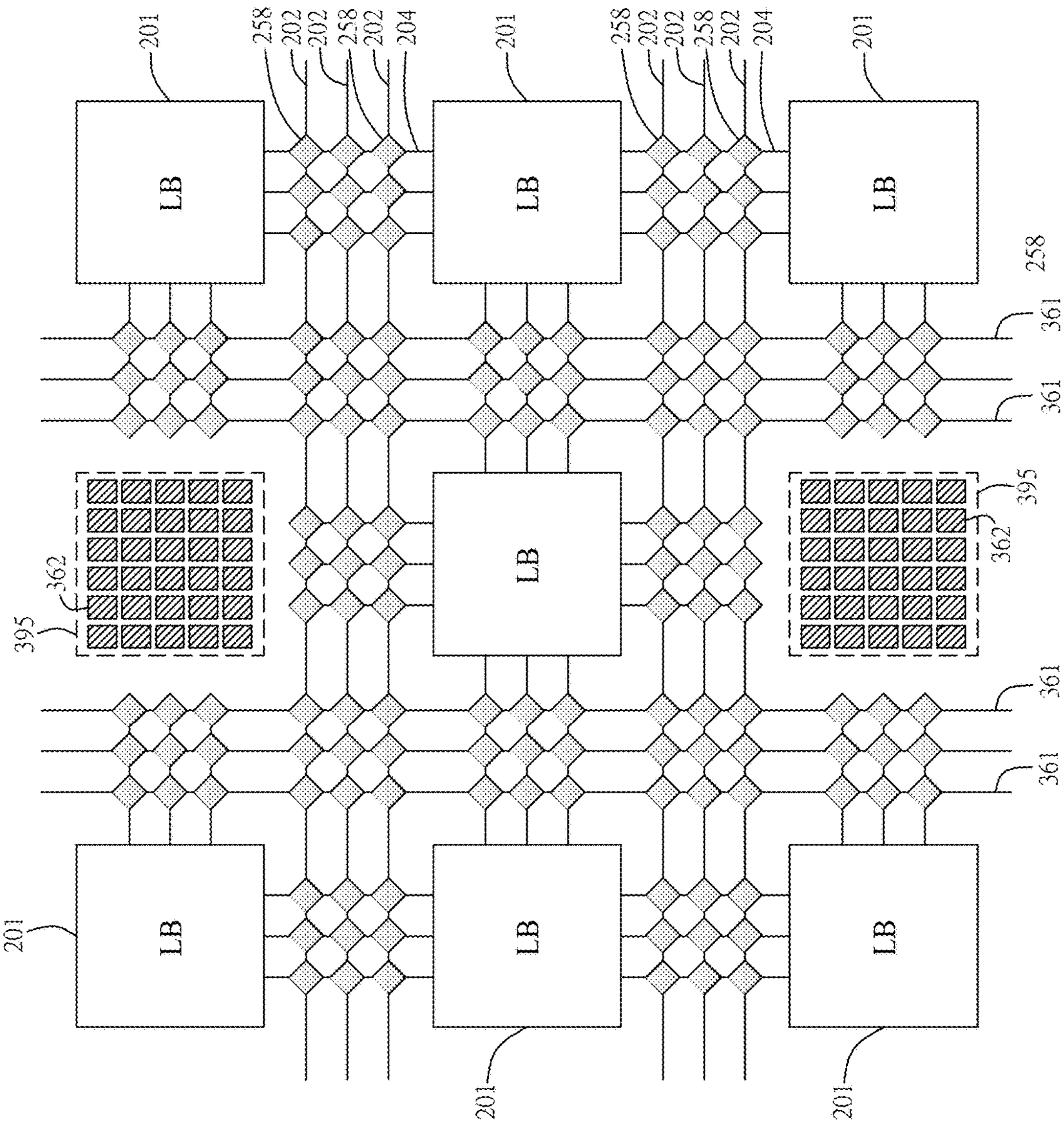

(5) Fifth Arrangement for Memory Cells, Multiplexers and Pass/No-Pass Switches for Standard Commodity FPGA IC Chip Referring to FIG. 12F, for the standard commodity FPGA IC chip 200, the memory cells 262 for the programmable interconnects 361 may be aggregately distributed in multiple memory-array blocks 395 on or over its semiconductor substrate 2 and coupled to (1) multiple first groups of its pass/no-pass switches 258 arranged on or over its semiconductor substrate 2, wherein each of its pass/no-pass switches 258 in the first groups may be between neighboring two of its programmable logic blocks 201 in the same row or between one of the memory-array blocks 395 and one of its programmable logic blocks 201 in the same row, (2) multiple second groups of its pass/no-pass switches 258 arranged on or over its semiconductor substrate 2, wherein each of its pass/no-pass switches 258 in the second groups may be between neighboring two of its programmable logic blocks 201 in the same column or between one of the memory-array blocks 395 and one of its programmable logic blocks 201 in the same column, and (3) multiple third groups of the pass/no-pass switches 258 arranged on or over the semiconductor substrate 2, wherein each of its pass/no-pass switches 258 in the third groups may be between neighboring two of the first groups of the pass/no-pass switches 258 in the same column and between neighboring two of the second groups of the pass/no-pass switches 258 in the same row. For the standard commodity FPGA IC chip 200, each of its programmable logic blocks 201 may include one or more multiplexers 211 and one or more groups of memory cells 490 employed for one or more of look-up tables 210 respectively, as illustrated in FIG. 12B, wherein each of the memory cells 490 in said one or more groups may store one of the resulting values or programming codes for said one or more of look-up tables 210 and may have an output coupling to one of the inputs of the first set, e.g., D0-D15, of said one or more of multiplexers 211. One or more of the programmable logic blocks 201 may be positioned between the memory-array blocks 395.

(6) Memory Cells for First Through Fifth Arrangements

Referring to FIGS. 12B-12F, for the standard commodity FPGA IC chip 200, each of the memory cells 490 for its look-up tables (LUTs) 210 may be referred to one 398 as illustrated in FIG. 1A or 1B having the output Out1 or Out2 coupling to one of the inputs D0-D15 in the first set of the multiplexer 211 of its programmable logic block 201 as illustrated in FIGS. 6A and 6F-6J. For the standard commodity FPGA IC chip 200, each of the memory cells 362 for its programmable interconnects 361 may be referred to one 398 as illustrated in FIG. 1A or 1B having the output Out1 or Out2 coupling to one of its cross-point switches 379 as illustrated in FIG. 7A-7C or one of the pass/no-pass switch 258 of its cross-point switches 379.

II. Arrangement for By-Pass Interconnects for Standard Commodity FPGA IC Chip

Figure 12G:
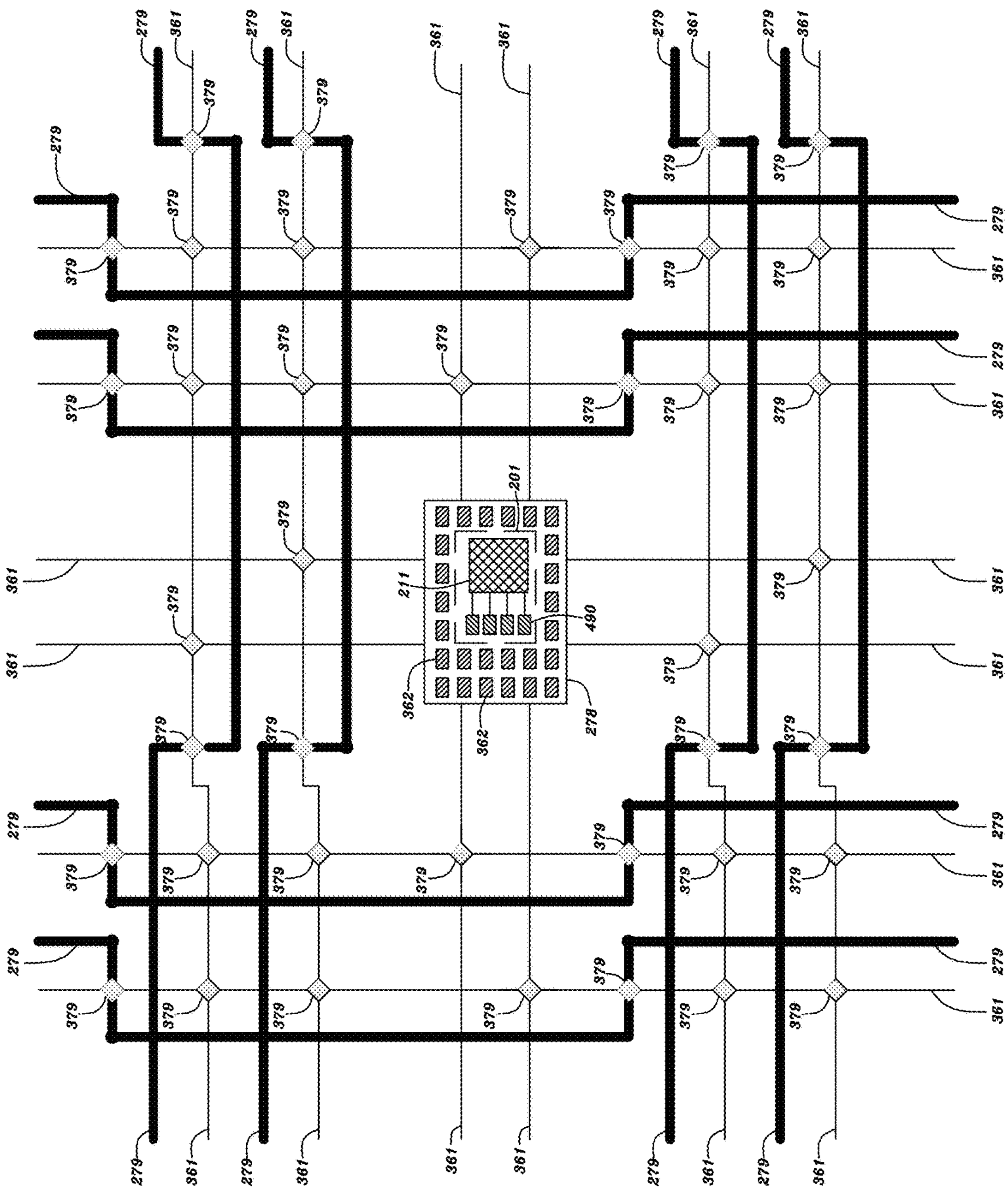

FIG. 12G is a top view showing programmable interconnects serving as by-pass interconnects in accordance with an embodiment of the present application. Referring to FIG. 12G, the standard commodity FPGA IC chip 200 may include (1) a first group of programmable interconnects 361 to serve as by-pass interconnects 279 each coupling one of the cross-point switches 379 to another far one of the cross-point switches 379 by-passing another one or more of the cross-point switches 379, each of which may be one of the cross-point switches 379 as illustrated in FIGS. 3A-3D, and (2) a second group of programmable interconnects 361 not by-passing any of the cross-point switches 379, but each of the by-pass interconnects 279 may be arranged in parallel with an aggregate of multiple of the programmable interconnects 361 in the second group configured to be coupled to each other or one another via one or more of the cross-point switches 379.

For connection between one of the by-pass interconnects 279 and one the programmable interconnects 361 in the second group, one of the cross-point switches 379 as seen in FIGS. 3A-3C may have the nodes N23 and N25 coupling respectively to two of the programmable interconnects 361 in the second group and the nodes N24 and N26 coupling respectively to two of the by-pass interconnects 279. Thereby, said one of the cross-point switches 379 may switch one selected from two of the programmable interconnects 361 in the second group and two of the by-pass interconnects 279 to be coupled to the other one or more selected from them. For example, said one of the cross-point switches 379 may switch the programmable interconnect 361 in the second group coupling to its node N23 to be coupled to the by-pass interconnect 279 coupling to its node N24. Alternatively, said one of the cross-point switches 379 may switch the programmable interconnect 361 in the second group coupling to its node N23 to be coupled to the programmable interconnect 361 in the second group coupling to its node N25. Alternatively, said one of the cross-point switches 379 may switch the by-pass interconnect 279 coupling to its node N24 to be coupled to the by-pass interconnect 279 coupling to its node N26.

For connection between two of the programmable interconnects 361 in the second group, one of the cross-point switches 379 as seen in FIGS. 3A-3C may have its four nodes N23-N26 coupling to four of the programmable interconnects 361 in the second group respectively. Thereby, said one of the cross-point switches 379 may switch one selected from said four of the programmable interconnects 361 in the second group to be coupled to another one selected from them.

Referring to FIG. 12G, for the standard commodity FPGA IC chip 200, multiple of its cross-point switches 379 surrounds a region 278, in which multiple of its memory cells 362 may be arranged, each of which may be referred to one 398 as illustrated in FIG. 1A or 1B having the output Out1 or Out2 coupling to one of said multiple of its cross-point switches 379 as illustrated in FIG. 7A-7C or one of the pass/no-pass switches 258 of said one of its cross-point switches 379. For the standard commodity FPGA IC chip 200, in the region 278 are further multiple of its memory cells 490 for the look-up table (LUT) 210 of its programmable logic block 201, each of which may be referred to one 398 as illustrated in FIG. 1A or 1B having the output Out1 or Out2 coupling to one of the inputs D0-D15 in the first set of the multiplexer 211 of its programmable logic block 201 therein as illustrated in FIG. 6A or 6H. The memory cells 362 for the cross-point switches 379 may be arranged in one or more rings around the programmable logic block 201. Multiple of the programmable interconnects 361 in the second group around the region 278 may couple the second set of inputs, e.g., A0-A3, of the multiplexer 211 of the programmable logic blocks 201 to multiple of the cross-point switches 379 around the region 278 respectively. One of the programmable interconnects 361 in the second group around the region 278 may couple the output, e.g., Dout, of the multiplexer 211 of the programmable logic blocks 201 to one of the cross-point switches 379 around the region 278.

Accordingly, referring to FIG. 12G, the output, e.g., Dout, of the multiplexer 211 of one of the programmable logic blocks 201 may (1) pass to one of the by-pass interconnects 279 alternately through one or more of the programmable interconnects 361 in the second group and one or more of the cross-point switches 379, (2) subsequently pass from said one of the by-pass interconnects 279 to another of the programmable interconnects 361 in the second group alternately through one or more of the cross-point switches 379 and one or more of the by-pass interconnects 279, and (3) finally pass from said another of the programmable interconnects 361 in the second group to one of the inputs in the second set, e.g., A0-A3, of the multiplexer 211 of another of the programmable logic blocks 201 alternately through one or more of the cross-point switches 379 and one or more of the programmable interconnects 361 in the second group.

III. Arrangement for Cross-Point Switches for Standard Commodity FPGA IC Chip

Figure 12H:
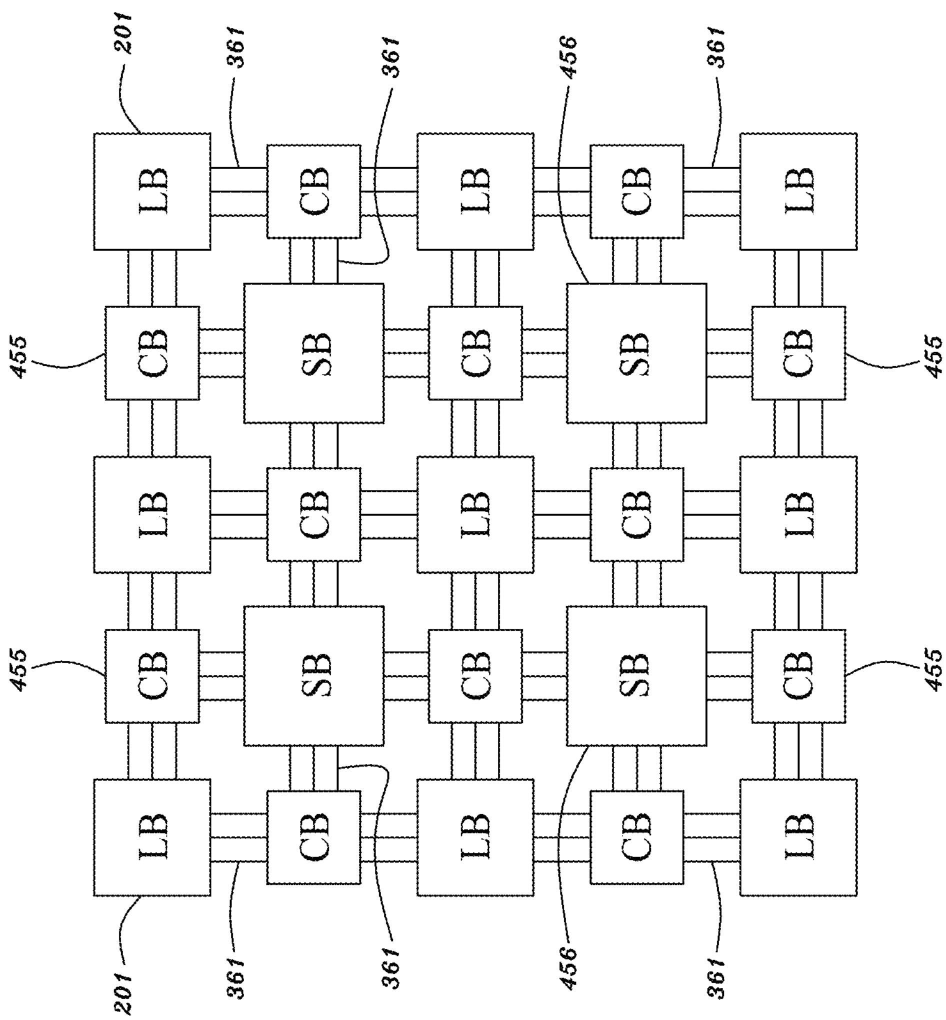

FIG. 12H is a top view showing arrangement for cross-point switches for a standard commodity FPGA IC chip in accordance with an embodiment of the present application. Referring to FIG. 12H, the standard commodity FPGA IC chip 200 may include the programmable logic blocks (LB) 201 arranged in an array, multiple connection blocks (CB) 455 each arranged between neighboring two of the programmable logic blocks (LB) 201 in the same column or row, and multiple switch blocks (SB) 456 each arranged between neighboring two of the connection blocks (CB) 455 in the same column or row. Each of the connection blocks (CB) 455 may be composed of multiple of the cross-point switches 379 of the fourth type as seen in FIGS. 3D and 7C. Each of the switch blocks (SB) 456 may be composed of multiple of the cross-point switches 379 of the third type as seen in FIGS. 3C and 7B.

Referring to FIG. 12H, for each of the connection blocks (CB) 455, each of its cross-point switches 379 of the fourth type may have its inputs, e.g., D0-D15, each coupling to one of the programmable interconnects 361 and its output, e.g., Dout, coupling to another of the programmable interconnects 361. Said one of the programmable interconnects 361 may couple one of the inputs, e.g., D0-D15, of one of the cross-point switches 379 of one of the connection blocks (CB) 455 as illustrated in FIGS. 3D and 7C to (1) the output, e.g., Dout, C0, C1, C2 or C3, of one of the programmable logic blocks (LB) 201 as illustrated in FIG. 6A or 6H or (2) one of nodes N23-N26 of one of the cross-point switches 379 of one of the switch blocks (SB) 456 as illustrated in FIGS. 3C and 7B. Alternatively, said another of the programmable interconnects 361 may couple the output, e.g., Dout, of one of the cross-point switches 379 of one of the connection blocks (CB) 455 as illustrated in FIGS. 3D and 7C to (1) one of the inputs, e.g., A0-A3 of one of the programmable logic blocks (LB) 201 as illustrated in FIG. 6A or 6H or (2) one of the nodes N23-N26 of one of the cross-point switches 379 of one of the switch blocks (SB) 456 as illustrated in FIGS. 3C and 7B.

For example, referring to FIG. 12H, one or more of the inputs, e.g., D0-D15, of the cross-point switch 379 as illustrated in FIGS. 3D and 7C for said one of the connection blocks (CB) 455 may couple to the output Dout, C0, C1, C2 or C3 of the programmable logic block (LB) 201 as illustrated in FIG. 6A or 6H at its first side through one or more of the programmable interconnects 361. Another one or more of the inputs, e.g., D0-D15, of the cross-point switch 379 as illustrated in FIGS. 3D and 7C for said one of the connection blocks (CB) 455 may couple to the output Dout, C0, C1, C2 or C3 of the programmable logic block (LB) 201 as illustrated in FIG. 6A or 6H at its second side opposite to its first side through one or more of the programmable interconnects 361. Another one or more of the inputs, e.g., D0-D15, of the cross-point switch 379 as illustrated in FIGS. 3D and 7C for said one of the connection blocks (CB) 455 may couple to one of the nodes N23-N26 of the cross-point switch 379 as illustrated in FIGS. 3C and 7B for the switch blocks (SB) 456 at its third side through one or more of the programmable interconnects 361. Another one or more of the inputs, e.g., D0-D15, of the cross-point switch 379 as illustrated in FIGS. 3D and 7C for said one of the connection blocks (CB) 455 may couple to one of the nodes N23-N26 of the cross-point switch 379 as illustrated in FIGS. 3C and 7B for the switch block (SB) 456 at its fourth side opposite to its third side through one or more of the programmable interconnects 361. The output, e.g., Dout, of the cross-point switch 379 as illustrated in FIGS. 3D and 7C for said one of the connection blocks (CB) 455 may couple to one of the nodes N23-N26 of the cross-point switch 379 as illustrated in FIGS. 3C and 7B for the switch block (SB) 456 at its third or fourth side through one or more of the programmable interconnects 361 or to one of the inputs A0-A3 of the programmable logic block (LB) 201 as illustrated in FIG. 6A or 6H at its first or second side through one or more of the programmable interconnects 361.

Referring to FIG. 12H, for each of the switch blocks (SB) 456, its cross-point switch 379 of the third type as illustrated in FIGS. 3C and 7B may have its four nodes N23-N26 coupling respectively to four of the programmable interconnects 361 in four different directions. For example, the cross-point switch 379 as illustrated in FIGS. 3C and 7B for said each of the switch blocks (SB) 456 may have its node N23 coupling to one of the inputs D0-D15 and output Dout of the cross-point switch 379 as seen in FIGS. 3D and 7C for the connection block (CB) 455 at its left side through one of said four of the programmable interconnects 361, the cross-point switch 379 as illustrated in FIGS. 3C and 7B for said each of the switch blocks (SB) 456 may have its node N24 coupling to one of the inputs D0-D15 and output Dout of the cross-point switch 379 as seen in FIGS. 3D and 7C for the connection block (CB) 455 at its top side through another of said four of the programmable interconnects 361, the cross-point switch 379 as illustrated in FIGS. 3C and 7B for said each of the switch blocks (SB) 456 may have its node N25 coupling to one of the inputs D0-D15 and output Dout of the cross-point switch 379 as seen in FIGS. 3D and 7C for the connection block (CB) 455 at its right side through another of said four of the programmable interconnects 361, and the cross-point switch 379 as illustrated in FIGS. 3C and 7B for said each of the switch blocks (SB) 456 may have its node N26 coupling to one of the inputs D0-D15 and output Dout of the cross-point switch 379 as seen in FIGS. 3D and 7C for the connectionblock (CB) 455 at its bottom side through the other of said four of the programmable interconnects 361.

Thereby, referring to FIG. 12H, signal transmission may be built from one of the programmable logic blocks (LB) 201 to another of the programmable logic blocks (LB) 201 through multiple of the switch blocks (SB) 456, wherein between each neighboring two of said multiple of the switch blocks (SB) 456 may be arranged one of the connection blocks (CB) 455 for the signal transmission, between said one of the programmable logic blocks (LB) 201 and one of said multiple of the switch blocks (SB) 456 may be arranged one of the connection blocks (CB) 455 for the signal transmission, and between said another of the programmable logic blocks (LB) 201 and one of said multiple of the switch blocks (SB) 456 may be one of the connection blocks (CB) 455 for the signal transmission. For example, a signal may be transmitted from an output, e.g., Dout, C0, C1, C2 or C3, of said one of the programmable logic blocks (LB) 201 as seen in FIG. 6A or 6H to one of the inputs, e.g., D0-D15, of the cross-point switches 379 of the fourth type as seen in FIGS. 3D and 7C for a first one of the connection blocks (CB) 455 through one of the programmable interconnects 361. Next, the cross-point switches 379 of the fourth type for the first one of the connection blocks (CB) 455 may pass the signal from said one of its inputs, e.g., D0-D15, to its output, e.g., Dout, to be transmitted to a node N23 of one of the cross-point switches 379 of the third type as seen in FIGS. 3C and 7B for one of the switch blocks (SB) 456 through another of the programmable interconnects 361. Next, said one of the cross-point switches 379 of the third type for one of the switch blocks (SB) 456 may pass the signal from its node N23 to its node N25 to be transmitted to one of the inputs, e.g., D0-D15, of the cross-point switches 379 of the fourth type as seen in FIGS. 3D and 7C for a second one of the connection blocks (CB) 455 through another of the programmable interconnects 361. Next, the cross-point switches 379 of the fourth type for the second one of the connection blocks (CB) 455 may pass the signal from said one of its inputs, e.g., D0-D15, to its output, e.g., Dout, to be transmitted to one of the inputs, e.g., A0-A3, of said another of the programmable logic blocks (LB) 201 as seen in FIG. 6A or 6H through another of the programmable interconnects 361.

IV. Repair for Standard Commodity FPGA IC Chip

Figure 12I:
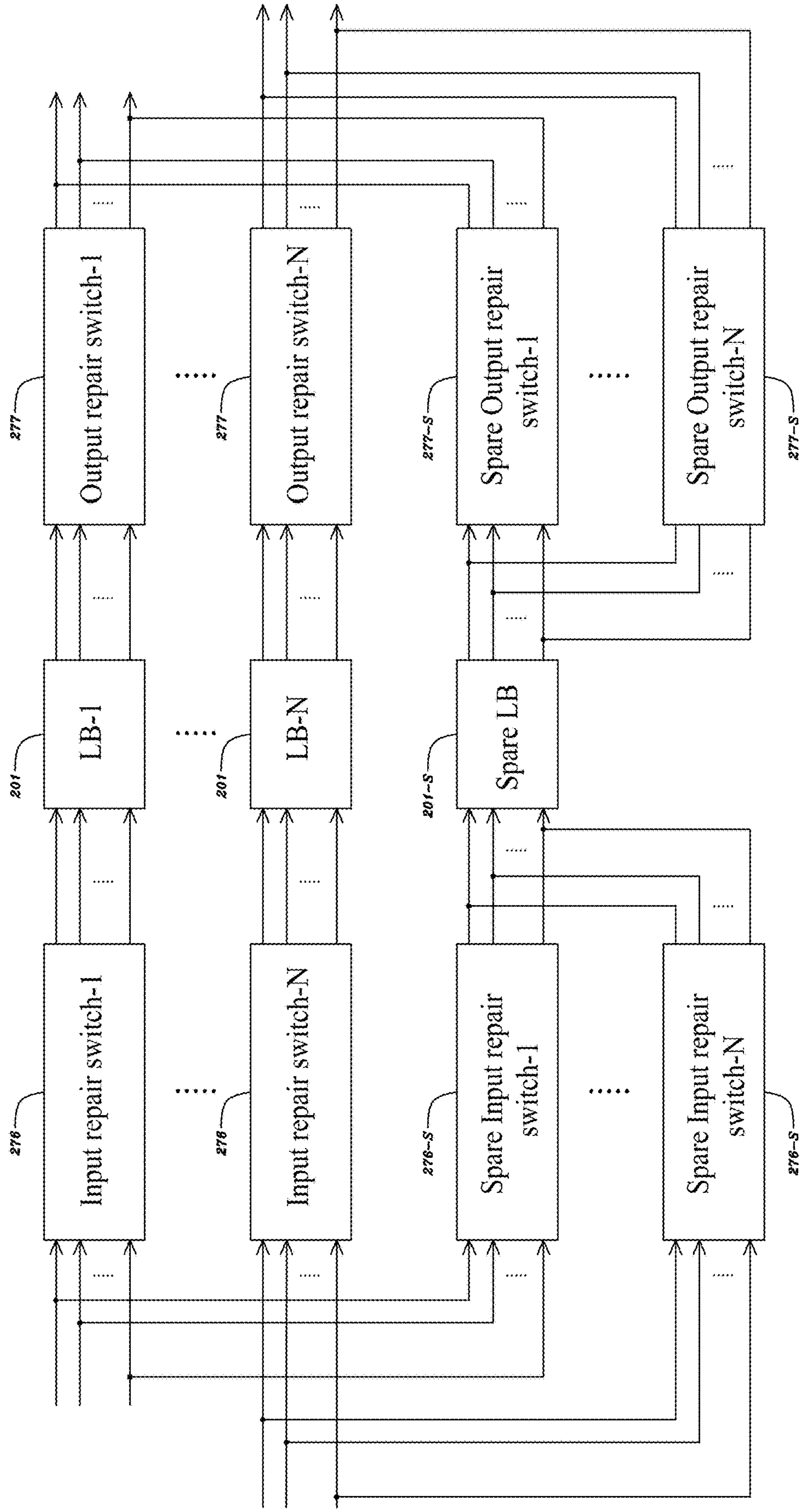
FIGS. 12I and 12J are block diagrams showing various repair algorithms in accordance with an embodiment of the present application.

FIG. 12I is a block diagram showing a repair for a standard commodity FPGA IC chip in accordance with an embodiment of the present application. Referring to FIG. 812, the standard commodity FPGA IC chip 200 may have a spare 201-*s* for the programmable logic blocks 201 configured to replace a broken one of the programmable logic blocks 201. The standard commodity FPGA IC chip 200 may include (1) multiple input repair switch matrixes 276 each having multiple outputs each coupling in series to one of the inputs A0-A3 of one of the programmable logic blocks 201 as illustrated in FIG. 6A or 6H and (2) multiple output repair switch matrixes 277 each having one or more input(s) coupling in series to the one or more output(s) Dout, C0, C1, C2 or C3 of one of the programmable logic blocks 201 as illustrated in FIG. 6A or 6H. Furthermore, the standard commodity FPGA IC chips 200 may include (1) multiple spare input repair switch matrixes 276-*s* each having multiple outputs each coupling in parallel to one of the outputs of each of the others of the spare input repair switch matrixes 276-*s* and coupling in series to one of the inputs A0-A3 of the spare 201-*s* for the programmable logic blocks 201 as illustrated in FIG. 6A or 6H, and (2) multiple spare output repair switch matrixes 277-*s* each having one or more input(s) coupling respectively in parallel to the one or more input(s) of each of the others of the spare output repair switch matrixes 277-*s* and coupling respectively in series to the one or more output(s) Dout, C0, C1, C2 or C3 of the spare 201-*s* for the programmable logic blocks 201 as illustrated in FIG. 6A or 6H. Each of the spare input repair switch matrixes 276-*s* may have multiple inputs each coupling in parallel to one of the inputs of one of the input repair switch matrixes 276. Each of the spare output repair switch matrixes 277-*s* may have one or more outputs coupling respectively in parallel to the one or more outputs of one of the output repair switch matrixes 277.

Thereby, referring to FIG. 12I, when one of the programmable logic blocks 201 is broken, one of the input repair switch matrixes 276 and one of the output repair switch matrixes 277 coupling to the inputs and output(s) of said one of the programmable logic blocks 201 respectively may be turned off; one of the spare input repair switch matrixes 276-*s* having its inputs coupling respectively in parallel to the inputs of said one of the input repair switch matrixes 276 and one of the spare output repair switch matrixes 277-*s* having its output(s) coupling respectively in parallel to the output(s) of said one of the output repair switch matrixes 277 may be turned on; the others of the spare input repair switch matrixes 276-*s* and the others of the spare output repair switch matrixes 277-*s* may be turned off. Accordingly, the broken one of the programmable logic blocks 201 may be replaced with the spare 201-*s* for the programmable logic blocks 201.

Figure 12J:
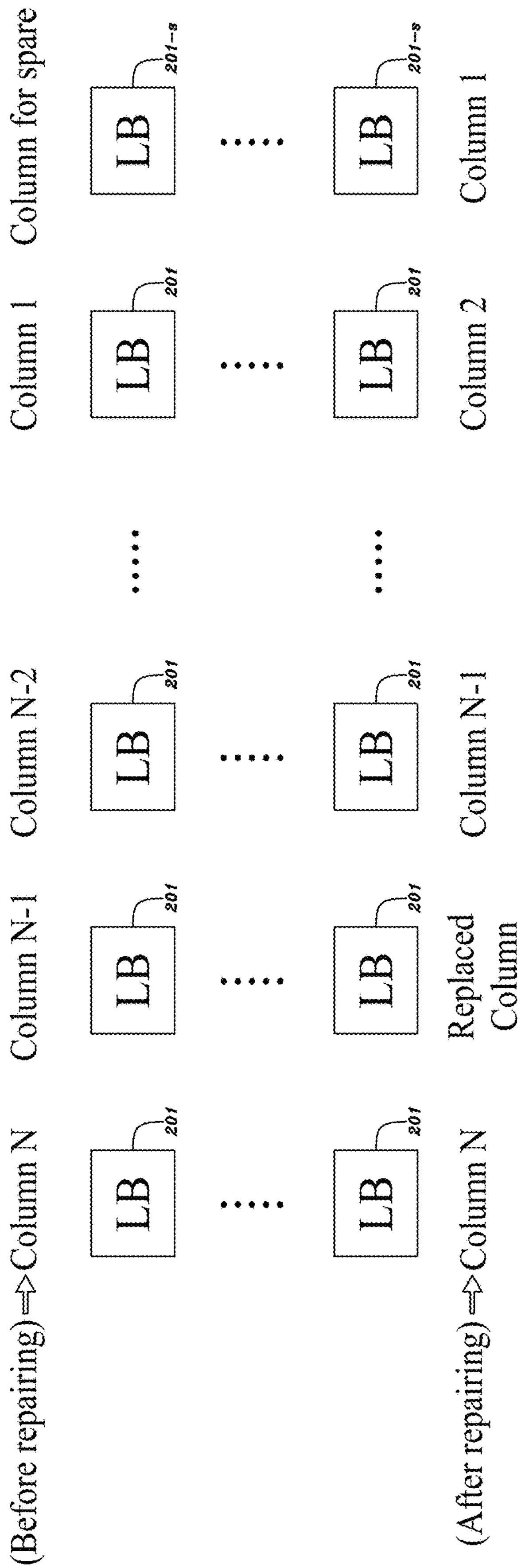

FIG. 12J is a block diagram showing a repair for a standard commodity FPGA IC chip in accordance with an embodiment of the present application. Referring to FIG. 12J, the programmable logic blocks (LB) 201 may be arranged in an array. When one of the programmable logic blocks (LB) 201 arranged in a column is broken, all of the programmable logic blocks (LB) 201 arranged in the column may be turned off and multiple spares 201-*s* for the programmable logic blocks (LB) 201 arranged in a column may be turned on. Next, the columns for the programmable logic blocks (LB) 201 and the spares 201-*s* for the programmable logic blocks (LB) 201 may be renumbered, and each of the programmable logic blocks 201 after repaired in a renumbered column and in a specific row may perform the same operations as one of the programmable logic blocks (LB) 201 before repaired in a column having the same number as the renumbered column and in the specific row. For example, when one of the programmable logic blocks (LB) 201 arranged in the column N−1 is broken, all of the programmable logic blocks (LB) 201 arranged in the column N−1 may be turned off and the spares 201-*s* for the programmable logic blocks (LB) 201 arranged in the rightmost column may be turned on. Next, the columns for the programmable logic blocks (LB) 201 and the spares 201-*s* for the programmable logic blocks (LB) 201 may be renumbered such that the rightmost column arranged for the spare 201-*s* for the programmable logic blocks (LB) 201 before repaired may be renumbered to column 1 after the programmable logic blocks (LB) 201 are repaired, the column 1 arranged for the programmable logic blocks (LB) 201 before repaired may be renumbered to column 2 after the programmable logic blocks (LB) 201 are repaired, and so on. The column n−2 arranged for the programmable logic blocks (LB) 201 before repaired may be renumbered to column n−1 after the programmable logic blocks (LB) 201 are repaired, wherein n is an integer ranging from 3 to N. Each of the programmable logic blocks (LB) 201 after repaired in the renumbered column m and in a specific row may perform the same operation as one of the programmable logic blocks 201 before repaired in the column m and in the specific row, where m is an integer ranging from 1 to N. For example, each of the programmable logic blocks (LB) 201 after repaired in the renumbered column 1 and in a specific row may perform the same operations as one of the programmable logic blocks 201 before repaired in the column 1 and in the specific row.

V. Programmable Logic Blocks for Standard Commodity FPGA IC Chip

Figure 12K:
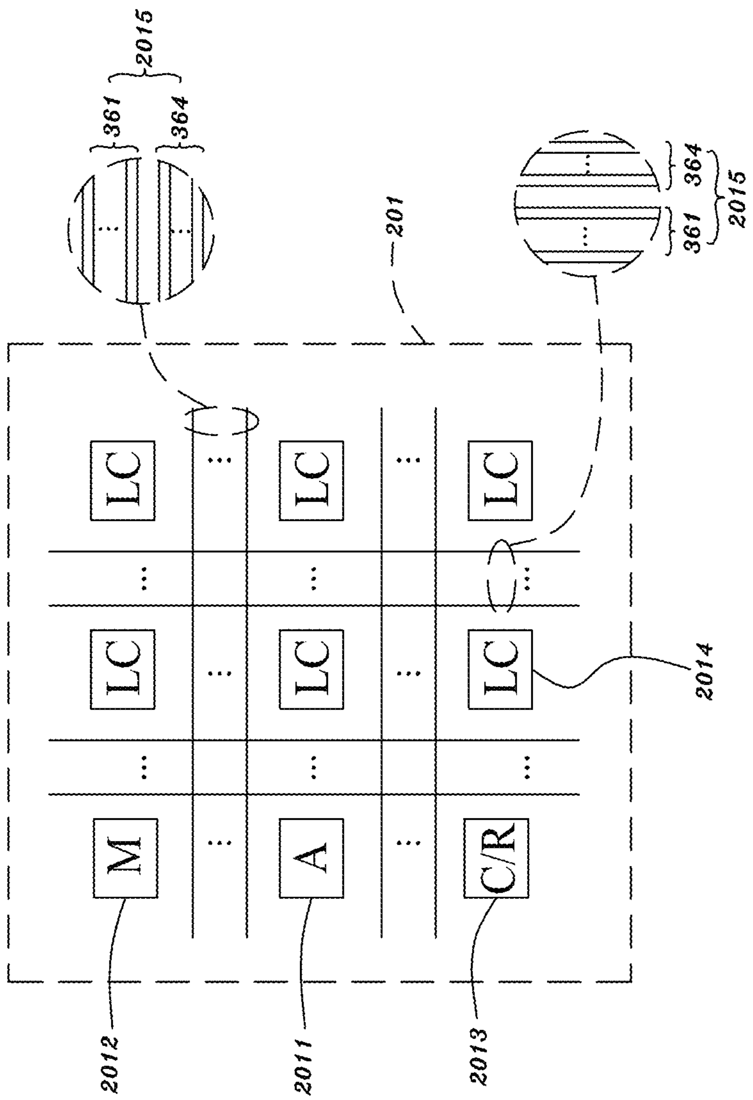
FIG. 12K is a block diagram illustrating a programmable logic block for a standard commodity FPGA IC chip in accordance with an embodiment of the present application.

Alternatively, FIG. 12K is a block diagram illustrating a programmable logic block for a standard commodity FPGA IC chip in accordance with an embodiment of the present application. Referring to FIG. 12K, each of the programmable logic blocks 201 as seen in FIG. 12A may include (1) one or more cells (A) 2011 for fixed-wired adders, having the number ranging from 1 to 16 for example, (2) one or more cells (M) 2012 for fixed-wired multipliers, having the number ranging from 1 to 16 for example, (3) one or more cells (C/R) 2013 for caches and registers, each having capacity ranging from 256 to 2048 bits for example, and (4) multiple cells (LC) 2014 for logic operation, having the number ranging from 64 to 2048 for example. Said each of the programmable logic blocks 201 as seen in FIG. 12A may further include multiple intra-block interconnects 2015 each extending over spaces between neighboring two of its cells 2011, 2012, 2013 and 2014 arranged in an array therein. For said each of the programmable logic blocks, its intra-chip interconnects 502 may be divided into the programmable interconnects 361 and fixed interconnects 364 as illustrated in FIG. 7A-7C; the programmable interconnects 361 of its intra-chip interconnects 2015 may couple to the programmable interconnects 361 of the intra-chip interconnects 502 of the FPGA IC chip 200 respectively, and the fixed interconnects 364 of its intra-chip interconnects 2015 may couple to the fixed interconnects 364 of the intra-chip interconnects 502 of the FPGA IC chip 200 respectively.

Referring to FIGS. 12A and 12K, each of the cells (LC) 2014 for logic operation may be arranged with one or a plurality of the logic architecture as seen in FIG. 6A having its memory cells 490, having the number ranging from 4 to 256 for example, for its look-up table 210 coupling respectively to the first set of inputs of its multiplexer 211 having the number ranging from 4 to 256 for example, one from which may be selected by its multiplexer 211 into its output in accordance with the second set of inputs of its multiplexer 211 having the number ranging from 2 to 8 for example each coupling to one of the programmable interconnects 361 and fixed interconnects 364 of the intra-block interconnects 2015. For example, the logic architecture may have its 16 memory cells 490 for its look-up table 210 coupling respectively to the first set of 16 inputs of its multiplexer 211, one from which may be selected by its multiplexer 211 into its output in accordance with the second set of 4 inputs of its multiplexer 211 each coupling to one of the programmable interconnects 361 and fixed interconnects 364 of the intra-block interconnects 2015, as seen in FIG. 6A. Further, said each of the cells (LC) 2014 for logic operation may be arranged with a register configured for temporally saving the output of the logic architecture or one of the inputs of the second set of the multiplexer 211 of the logic architecture.

Figure 12L:
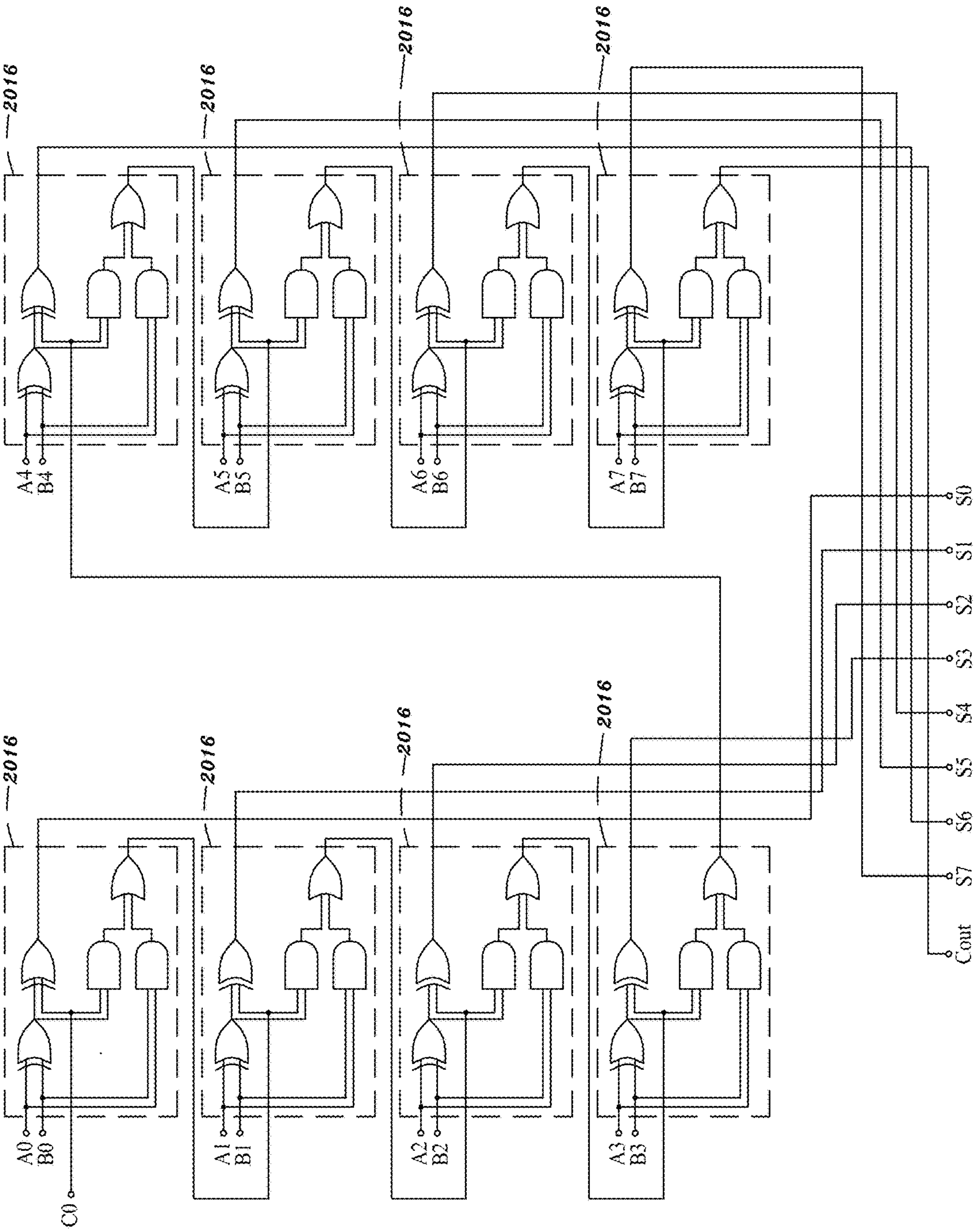
FIG. 12L is a circuit diagram illustrating a cell of an adder in accordance with an embodiment of the present application.
Figure 12M:
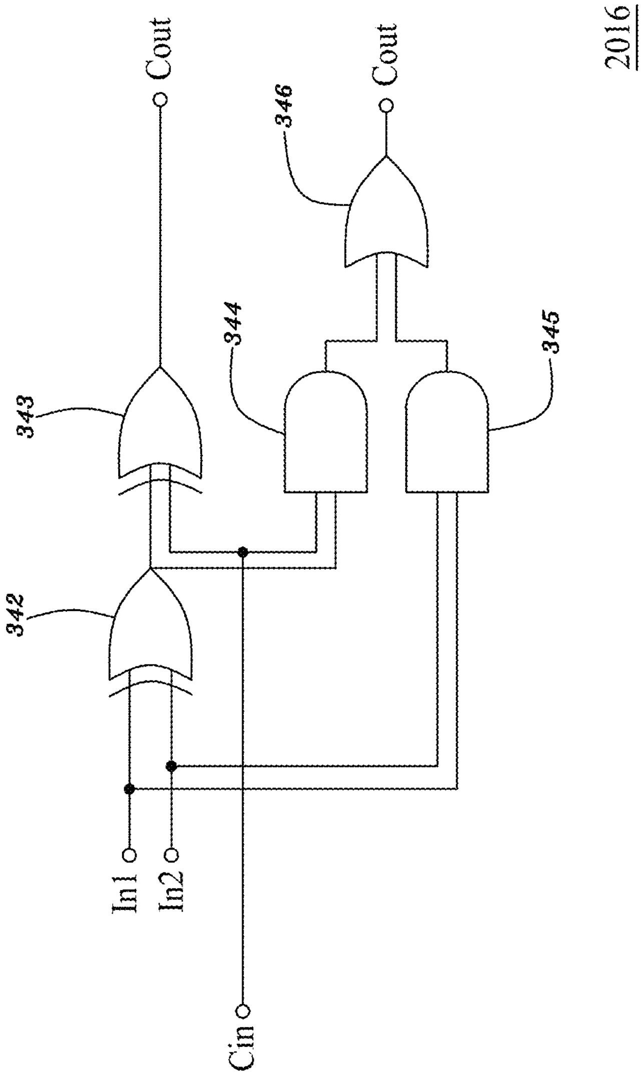
FIG. 12M is a circuit diagram illustrating an adding unit for a cell of an adder in accordance with an embodiment of the present application.

FIG. 12L is a circuit diagram illustrating a cell of an adder in accordance with an embodiment of the present application. FIG. 12M is a circuit diagram illustrating an adding unit for a cell of an adder in accordance with an embodiment of the present application. Referring to FIGS. 12A, 12L and 12, each of the cells (A) 2011 for fixed-wired adders may include multiple adding units 2016 coupling in series and stage by stage to each other or one another. For example, said each of the cells (A) 2011 for fixed-wired adders as seen in FIG. 12 may include 8 stages of the adding unit 2016 coupling in series and stage by stage to one another as seen in FIGS. 12L and 12 to add its first 8-bit input (A7, A6, A5, A4, A3, A2, A1, A0) coupling to eight of the programmable interconnects 361 and fixed interconnects 364 of the intra-block interconnects 2015 by its second 8-bit input (B7, B6, B5, B4, B3, B2, B1, B0) coupling to another eight of the programmable interconnects 361 and fixed interconnects 364 of the intra-block interconnects 2015 into its 9-bit output (Cout, S7, S6, S5, S4, S3, S2, S1, S0) coupling to another nine of the programmable interconnects 361 and fixed interconnects 364 of the intra-block interconnects 2015. Referring to FIGS. 12L and 12M, the first stage of the adding unit 2016 may take its carry-in input Cin from a previous computation result coupling to one of the programmable interconnects 361 and fixed interconnects 364 of the intra-block interconnects 2015 into account to add its first input In1 coupling to the input A0 of said each of the cells (A) 2011 for fixed-wired adders by its second input In2 coupling to the input B0 of said each of the cells (A) 2011 into its two outputs, one of which is an output Out acting as the output S0 of said each of the cells (A) 2011 for fixed-wired adders and the other one of which is a carry-out output Cout coupling to a carry-in input Cin of the adding unit 2016 of the second stage. Each of the adding units 2016 of the second through seventh stages may take its carry-in input Cin from the carry-out output Cout of one of the adding units 2016 of the first through sixth stages previous to said each of the adding units 2016 into account to add its first input In1 coupling to one of the inputs A1, A2, A3, A4, A5 and A6 of said each of the cells (A) 2011 for fixed-wired adders by its second input In2 coupling to one of the inputs B1, B2, B3, B4, B5 and B6 of said each of the cells (A) 2011 into its two outputs, one of which is an output Out acting as one of the outputs S1, S2, S3, S4, S5 and S6 of said each of the cells (A) 2011 for fixed-wired adders and the other one of which is a carry-out output Cout coupling to a carry-in input Cin of one of the adding units 2016 of the third through eighth stages next to said each of the adding units 2016. For example, the seventh stage of adding unit 2016 may take its carry-in input Cin from a carry-out output Cout of the adding unit 2016 of the sixth stage into account to add its first input In1 coupling to the input A6 of said each of the cells (A) 2011 for fixed-wired adders by its second input In2 coupling to the input B6 of said each of the cells (A) 2011 into its two outputs, one of which is an output Out acting as the output S6 of said each of the cells (A) 2011 for fixed-wired adders and the other one of which is a carry-out output Cout coupling to a carry-in input Cin of the adding unit 2016 of the eighth stage. The eighth stage of the adding unit 2016 may take its carry-in input Cin from the carry-out output Cout of the adding unit 2016 of the seventh stage into account to add its first input In1 coupling to the input A7 of said each of the cells (A) 2011 for fixed-wired adders by its second input In2 coupling to the input B7 of said each of the cells (A) 2011 into its two outputs, one of which is an output Out acting as the output S7 of said each of the cells (A) 2011 for fixed-wired adders and the other one of which is a carry-out output Cout acting as the carry-out output Cout of said each of the cells (A) 2011 for fixed-wired adders.

Referring to FIGS. 12L and 12M, each of the adding units 2016 of the first through eighth stages may include (1) an ExOR gate 342 configured to perform Exclusive-OR operation on its first and second inputs coupling respectively to the first and second inputs In1 and In2 of said each of the adding units 2016 of the first through eighth stages into its output, (2) an ExOR gate 343 configured to perform Exclusive-OR operation on its first input coupling to the output of the ExOR gate 342 and its second input coupling to the carry-in input Cin of said each of the adding units 2016 of the first through eighth stages into its output acting as the output Out of said each of the adding units 2016 of the first through eighth stages, (3) an AND gate 344 configured to perform Exclusive-OR operation on its first input coupling to the carry-in input Cin of said each of the adding units 2016 of the first through eighth stages and its second input coupling to the output of the ExOR gate 342 into its output, (4) an AND gate 345 configured to perform Exclusive-OR operation on its first and second inputs coupling respectively to the second and first inputs In2 and In1 of said each of the adding units 2016 of the first through eighth stages into its output, and (5) an OR gate 346 configured to perform OR operation on its first input coupling to the output of the AND gate 344 and its second input coupling to the output of the AND gate 345 into its output acting the Carry-out output Cout of said each of the adding units 2016 of the first through eighth stages.

Figure 12N:
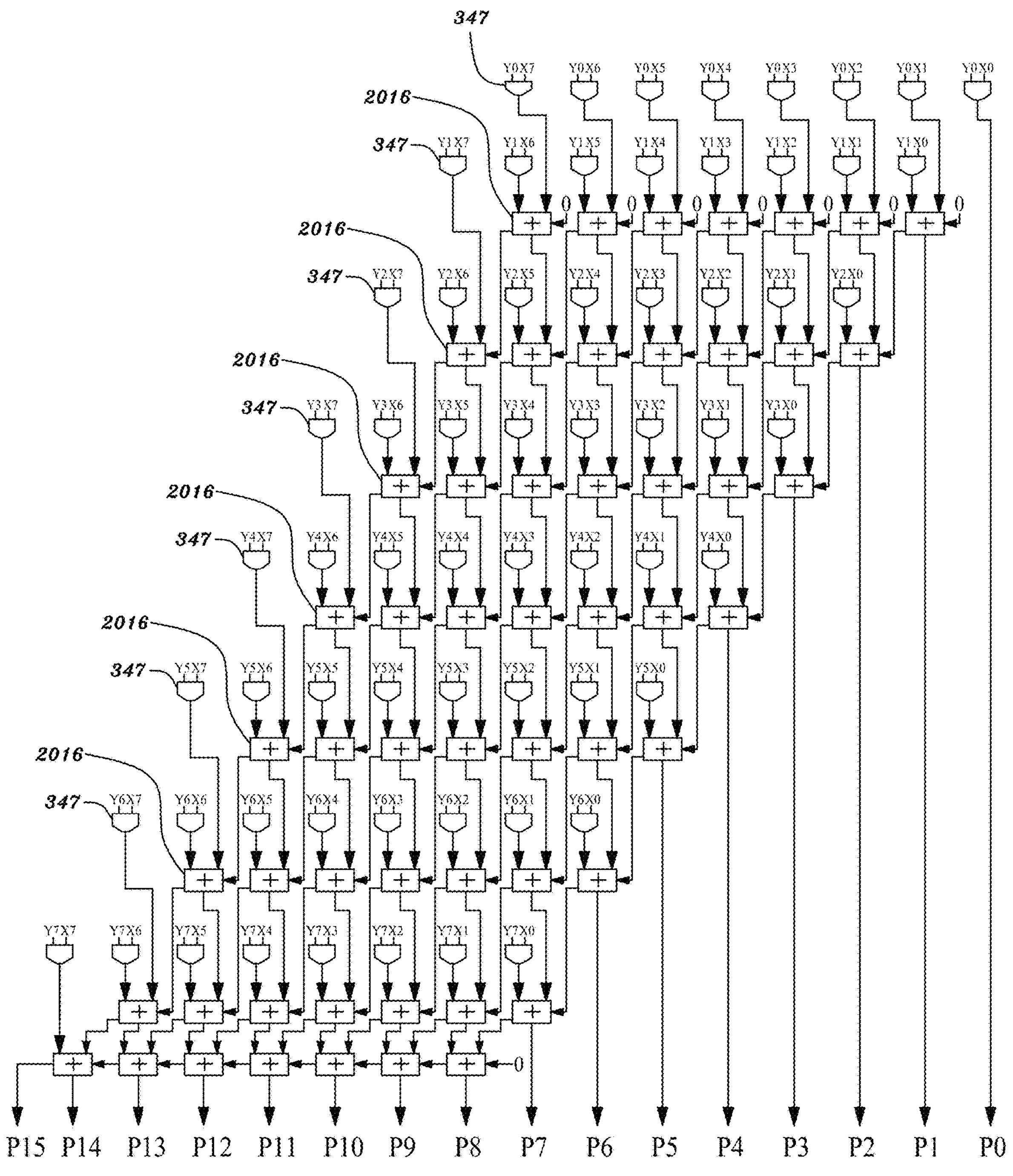
FIG. 12N is a circuit diagram illustrating a cell of a multiplier in accordance with an embodiment of the present application.

FIG. 12N is a circuit diagram illustrating a cell of a fixed-wired multiplier in accordance with an embodiment of the present application. Referring to FIGS. 12A and 12N, each of the cells (M) 2012 for fixed-wired multipliers may include multiple stages of the adding units 2016, each of which may be referred to the architecture as illustrated in FIG. 12M, coupling in series and stage by stage to each other or one another. For example, said each of the cells (M) 2012 for fixed-wired multipliers as seen in FIG. 12K may include 8 stages of the 7 adding units 2016 coupling in series and stage by stage to one another as seen in FIGS. 12N and 12M to multiplies its first 8-bit input (X7, X6, X5, X4, X3, X2, X1, X0) coupling to eight of the programmable interconnects 361 and fixed interconnects 364 of the intra-block interconnects 2015 by its second 8-bit input (Y7, Y6, Y5, Y4, Y3, Y2, Y1, Y0) coupling to another eight of the programmable interconnects 361 and fixed interconnects 364 of the intra-block interconnects 2015 into its 16-bit output (P15, P14, P13, P12, P11, P10, P9, P8, P7, P6, P5, P4, P3, P2, P1, P0) coupling to another sixteen of the programmable interconnects 361 and fixed interconnects 364 of the intra-block interconnects 2015. Referring to FIGS. 12N and 12M, said each of the cells (M) 2012 for fixed-wired multipliers may include 64 AND gates 347 each configured to perform AND operation on its first input coupling to one of the first 8 inputs X7, X6, X5, X4, X3, X2, X1 and X0 of said each of the cells (M) 2012 for fixed-wired multipliers and its second input coupling to one of the second 8 inputs Y7, Y6, Y5, Y4, Y3, Y2, Y1 and Y0 of said each of the cells (M) 2012 for fixed-wired multipliers into its output. For more elaboration, for said each of the cells (M) 2012 for fixed-wired multipliers, its 64 AND gates 347 arranged in 8 rows may have their first and second inputs coupling respectively to 64 (8-by-8) combinations of each of its first 8 inputs X7, X6, X5, X4, X3, X2, X1 and X0 and each of its second 8 inputs Y7, Y6, Y5, Y4, Y3, Y2, Y1 and Y0; its 8 AND gates 347 in the first row may perform AND operation on their first respective inputs coupling respectively to its first 8 inputs X7, X6, X5, X4, X3, X2, X1 and X0 arranged from left to right and their second respective inputs coupling to its second input Y0 into their respective outputs; its 8 AND gates 347 in the second row may perform AND operation on their first respective inputs coupling respectively to its first 8 inputs X7, X6, X5, X4, X3, X2, X1 and X0 arranged from left to right and their second respective inputs coupling to its second input Y1 into their respective outputs; its 8 AND gates 347 in the third row may perform AND operation on their first respective inputs coupling respectively to its first 8 inputs X7, X6, X5, X4, X3, X2, X1 and X0 arranged from left to right and their second respective inputs coupling to its second input Y2 into their respective outputs; its 8 AND gates 347 in the fourth row may perform AND operation on their first respective inputs coupling respectively to its first 8 inputs X7, X6, X5, X4, X3, X2, X1 and X0 arranged from left to right and their second respective inputs coupling to its second input Y3 into their respective outputs; its 8 AND gates 347 in the fifth row may perform AND operation on their first respective inputs coupling respectively to its first 8 inputs X7, X6, X5, X4, X3, X2, X1 and X0 arranged from left to right and their second respective inputs coupling to its second input Y4 into their respective outputs; its 8 AND gates 347 in the sixth row may perform AND operation on their first respective inputs coupling respectively to its first 8 inputs X7, X6, X5, X4, X3, X2, X1 and X0 arranged from left to right and their second respective inputs coupling to its second input Y5 into their respective outputs; its 8 AND gates 347 in the seventh row may perform AND operation on their first respective inputs coupling respectively to its first 8 inputs X7, X6, X5, X4, X3, X2, X1 and X0 arranged from left to right and their second respective inputs coupling to its second input Y6 into their respective outputs; its 8 AND gates 347 in the eighth row may perform AND operation on their first respective inputs coupling respectively to its first 8 inputs X7, X6, X5, X4, X3, X2, X1 and X0 arranged from left to right and their second respective inputs coupling to its second input Y7 into their respective outputs.

Referring to FIGS. 12M and 12N, for said each of the cells (M) 2012 for fixed-wired multipliers, the output of the rightmost one of its AND gates 347 in the first row may act as its output P0. For said each of the cells (M) 2012 for fixed-wired multipliers, the outputs of the left seven of its AND gates 347 in the first row may couple respectively to the first inputs In1 of its 7 adding units 2016 of the second stage. For said each of the cells (M) 2012 for fixed-wired multipliers, the outputs of the right seven of its AND gates 347 in the second row may couple respectively to the second inputs In2 of its 7 adding units 2016 of the second stage.

Referring to FIGS. 12M and 12N, for said each of the cells (M) 2012 for fixed-wired multipliers, its 7 adding units 2016 of the first stage may take their respective carry-in inputs Cin at a logic level of “0” into account to add their first respective inputs In1 by their second respective inputs In2 into their respective outputs Out, the rightmost one of which may act as its output P1 and the left six of which may couple respectively to the first inputs In1 of the right six of its 7 adding units 2016 of the second stage, and their respective carry-out outputs Cout coupling respectively to the carry-in inputs Cin of its 7 adding units 2016 of the second stage. For said each of the cells (M) 2012 for fixed-wired multipliers, the output of the leftmost one of its AND gates 347 in the second row may couple to the first input In1 of the leftmost one of its adding units 2016 of the second stage. For said each of the cells (M) 2012 for fixed-wired multipliers, the outputs of the right seven of its AND gates 347 in the third row may couple respectively to the second inputs In2 of its 7 adding units 2016 of the second stage.

Referring to FIGS. 12M and 12N, for said each of the cells (M) 2012 for fixed-wired multipliers, its 7 adding units 2016 of each of the second through sixth stages may take their respective carry-in inputs Cin into account to add their first respective inputs In1 by their second respective inputs In2 into their respective outputs Out, the rightmost one of which may act as one of its outputs P2-P6 and the left six of which may couple respectively to the first inputs In1 of the right six of its 7 adding units 2016 of next one of the third through seventh stages next to said each of the second through sixth stages, and their respective carry-out outputs Cout coupling respectively to the carry-in inputs Cin of its 7 adding units 2016 of said next one of the third through seventh stages. For said each of the cells (M) 2012 for fixed-wired multipliers, the output of the leftmost one of its AND gates 347 in each of the third through seventh rows may couple to the first input In1 of the leftmost one of its adding units 2016 of one of the third through seventh stages. For said each of the cells (M) 2012 for fixed-wired multipliers, the outputs of the right seven of its AND gates 347 in each of the fourth through eighth rows may couple respectively to the second inputs In2 of its 7 adding units 2016 of one of the third through seventh stages.

For example, referring to FIGS. 12M and 12N, for said each of the cells (M) 2012 for fixed-wired multipliers, its 7 adding units 2016 of the second stage may take their respective carry-in inputs Cin into account to add their first respective inputs In1 by their second respective inputs In2 into their respective outputs Out, the rightmost one of which may act as its output P2 and the left six of which may couple respectively to the first inputs In1 of the right six of its 7 adding units 2016 of the third stage, and their respective carry-out outputs Cout coupling respectively to the carry-in inputs Cin of its 7 adding units 2016 of the third stage. For said each of the cells (M) 2012 for fixed-wired multipliers, the output of the leftmost one of its AND gates 347 in the third row may couple to the first input In1 of the leftmost one of its adding units 2016 of the third stage. For said each of the cells (M) 2012 for fixed-wired multipliers, the outputs of the right seven of its AND gates 347 in the fourth row may couple respectively to the second inputs In2 of its 7 adding units 2016 of the third stage.

Referring to FIGS. 12M and 12N, for said each of the cells (M) 2012 for fixed-wired multipliers, its 7 adding units 2016 of the seventh stage may take their respective carry-in inputs Cin into account to add their first respective inputs In1 by their second respective inputs In2 into their respective outputs Out, the rightmost one of which may act as its output P7 and the left six of which may couple respectively to the second inputs In2 of the right six of its 7 adding units 2016 of the eighth stage, and their respective carry-out outputs Cout coupling respectively to the first inputs In1 of its 7 adding units 2016 of the eighth stage. For said each of the cells (M) 2012 for fixed-wired multipliers, the output of the leftmost one of its AND gates 347 in the eighth row may couple to the second input In2 of the leftmost one of its adding units 2016 of the eighth stage.

Referring to FIGS. 12M and 12N, the rightmost one of its 7 adding units 2016 of the eighth stage of said each of the cells (M) 2012 for fixed-wired multipliers may take its carry-in input Cin at a logic level of "0" into account to add its first input In1 by its second input In2 into its output Out acting as the output P8 of said each of the cells (M) 2012 for fixed-wired multipliers and its carry-out output Cout coupling to the carry-in input Cin of the second rightmost one of its 7 adding units 2016 of the eighth stage of said each of the cells (M) 2012 for fixed-wired multipliers left to the rightmost one thereof. Each of the second rightmost one through second leftmost one of its 7 adding units 2016 of the eighth stage of said each of the cells (M) 2012 for fixed-wired multipliers may take its respective carry-in inputs Cin into account to add its first input In1 by its second input In2 into its outputs Out acting as one of the outputs P9-P13 of said each of the cells (M) 2012 for fixed-wired multipliers and its carry-out output Cout coupling to the carry-in input Cin of one of the third rightmost one through leftmost one of its 7 adding units 2016 of the eighth stage of said each of the cells (M) 2012 for fixed-wired multipliers left to said each of the second rightmost one through second leftmost one thereof. The leftmost one of its 7 adding units 2016 of the eighth stage of said each of the cells (M) 2012 for fixed-wired multipliers may take its carry-in input Cin into account to add its first input In1 by its second input In2 into its output Out acting as the output P14 of said each of the cells (M) 2012 for fixed-wired multipliers and its carry-out output Cout acting as the output P15 thereof.

Each of the cells (C/R) 2013 for caches and registers as seen in FIG. 12K may be configured for temporally save or store (1) the inputs and outputs of the cells (A) 2011 for fixed-wired adders, such as the carry-in input Cin of its adding unit of the first stage, its first and second 8-bit inputs (A7, A6, A5, A4, A3, A2, A1, A0) and (B7, B6, B5, B4, B3, B2, B1, B0) and/or its 9-bit output (Cout, S7, S6, S5, S4, S3, S2, S1, S0) as illustrated in FIGS. 12L and 12M, (2) the inputs and outputs of the cells (M) 2012 for fixed-wired multipliers, such as its first and second 8-bit inputs (X7, X6, X5, X4, X3, X2, X1, X0) and (Y7, Y6, Y5, Y4, Y3, Y2, Y1, Y0) and/or its 16-bit output (P15, P14, P13, P12, P11, P10, P9, P8, P7, P6, P5, P4, P3, P2, P1, P0) as illustrated in FIGS. 12M and 12N, and/or (3) the inputs and outputs of the cells (LC) 2014 for logic operation, i.e., the output of its logic architecture or one of the inputs of the second set of the multiplexer 211 of its logic architecture.

Figure 13:
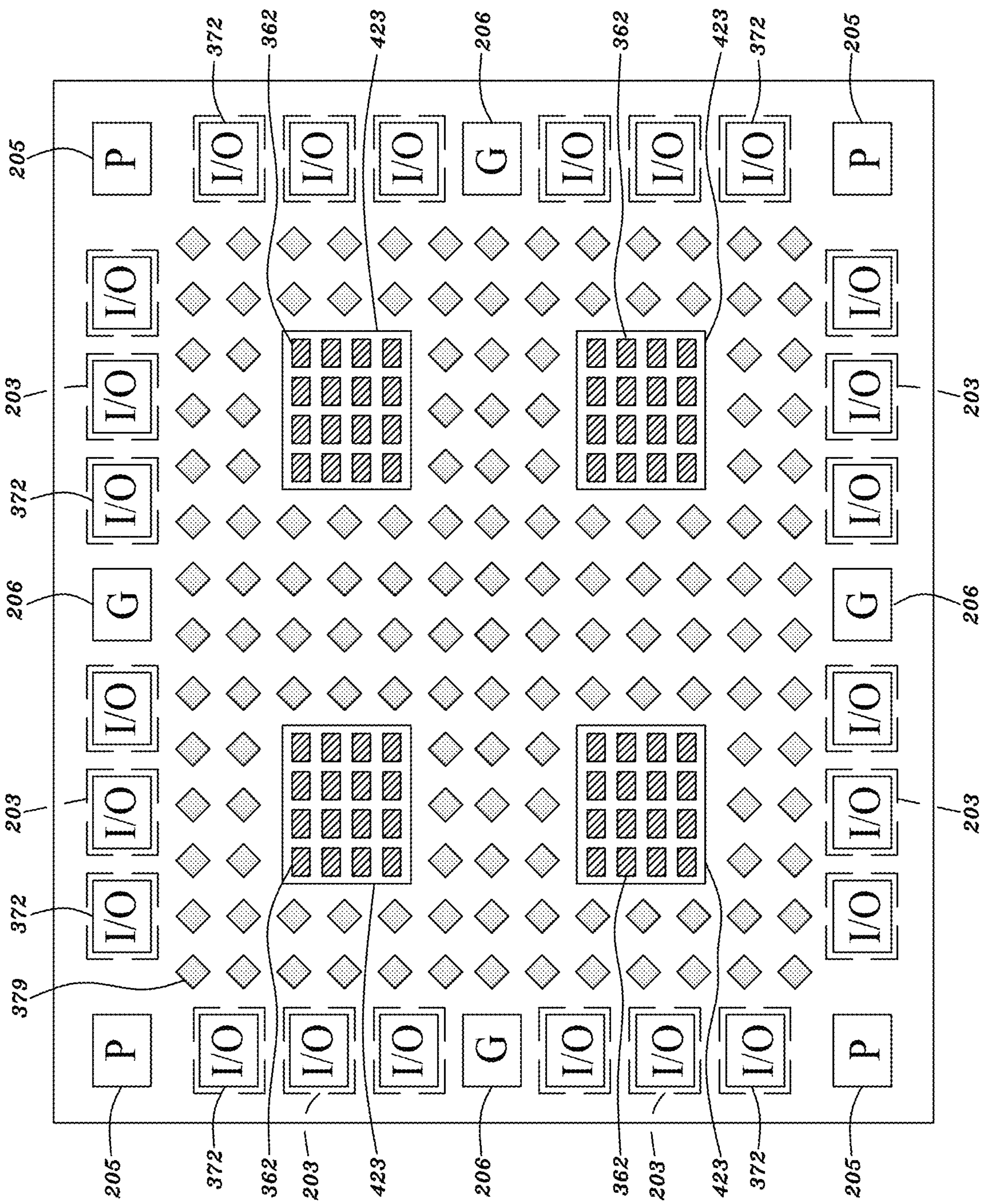
FIG. 13 is a schematically top view showing a block diagram of a dedicated programmable interconnection (DPI) integrated-circuit (IC) chip in accordance with an embodiment of the present application.

Specification for Dedicated Programmable Interconnection (DPI) Integrated-Circuit (IC) Chip FIG. 13 is a schematically top view showing a block diagram of a dedicated programmable interconnection (DPI) integrated-circuit (IC) chip in accordance with an embodiment of the present application. Referring to FIG. 13, a dedicated programmable interconnection (DPI) integrated-circuit (IC) chip 410 is designed, implemented and fabricated using varieties of semiconductor technology nodes or generations, including old or matured technology nodes or generations, for example, a semiconductor node or generation less advanced than or equal to, or more mature than 20 nm or 30 nm, and for example using the technology node of 22 nm, 28 nm, 40 nm, 90 nm, 130 nm, 180 nm, 250 nm, 350 nm or 500 nm; with a chip size and manufacturing yield optimized with the minimum manufacturing cost for the used semiconductor technology node or generation. The dedicated IP IC chip 410 may have an area between 400 $mm^2$ and 9 $mm^2$, 144 $mm^2$ and 16 $mm^2$, 75 $mm^2$ and 16 $mm^2$, or 50 $mm^2$ and 16 $mm^2$. Transistors or semiconductor devices of the dedicated IP IC chip 410 used in the advanced semiconductor technology node or generation may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET.

Referring to FIG. 13, since the dedicated programmable interconnection (DPI) integrated-circuit (IC) chip 410 is a standard commodity IC chip, the number of types of products for the DPIIC chip 410 may be reduced to a small number, and therefore expensive photo masks or mask sets for fabricating the DPIIC chip 410 using advanced semiconductor nodes or generations may be reduced to a few mask sets. For example, the mask sets for a specific technology node or generation may be reduced down to between 3 and 20, 3 and 10, or 3 and 5. Its NRE and production expenses are therefore greatly reduced. With the few types of products for the DPIIC chip 410, the manufacturing processes may be optimized to achieve very high manufacturing chip yields. Furthermore, the chip inventory management becomes easy, efficient and effective, therefore resulting in a relatively short chip delivery time and becoming very cost-effective.

Referring to FIG. 13, the DPIIC chip 410 may be of various types, including (1) multiple memory-array blocks 423 arranged in an array in a central region thereof, (2) multiple groups of cross-point switches 379 as illustrated in FIG. 3A, 3B, 3C or 3D, each group of which is arranged in one or more rings around one of the memory-array blocks 423, and (3) multiple small input/output (I/O) circuits 203, as illustrated in FIG. 5B, each having the node of S_Data_in coupling to one of the nodes N23-N26 of one of its cross-point switches 379 as illustrated in FIGS. 3A-3C through one of the programmable interconnects 361 or to one of the inputs D0-D15 of one of its cross-point switches 379 as illustrated in FIG. 3D through one of the programmable interconnects 361 and the node of S_Data_out coupling to one of the nodes N23-N26 of another of its cross-point switches 379 as illustrated in FIGS. 3A-3C through another of the programmable interconnects 361 or to the output Dout of another of its cross-point switches 379 as illustrated in FIG. 3D through another of the programmable interconnects 361. In each of the memory-array blocks 423 are multiple of memory cells 362, each of which may be referred to one 398 as illustrated in FIG. 1A or 1B, each having an output Out1 and/or Out2 coupling to one of the pass/no-pass switches 258 for one of the cross-point switches 379 as illustrated in FIGS. 3A, 3B and 7A close to said each of the memory-array blocks 423 to switch on or off said one of the pass/no-pass switches 258. Alternatively, in each of the memory-array blocks 423 are multiple of memory cells 362, each of which may be referred to one as illustrated in FIG. 1A or 1B, each having an output Out1 or Out2 coupling to one of the inputs, e.g., A0 and A1, of the second set and inputs SC-4 of one of the multiplexers 211 of one of the cross-point switches 379 as illustrated in FIGS. 3C and 7B close to said each of the memory-array blocks 423. Alternatively, in each of the memory-array blocks 423 are multiple of memory cells 362, each of which may be referred to one as illustrated in FIG. 1A or 1B, each having an output Out1 or Out2 coupling to one of the inputs, e.g., A0-A3, of the second set of the multiplexer 211 of one of the cross-point switches 379 as illustrated in FIGS. 3D and 7C close to said each of the memory-array blocks 423.

Referring to FIG. 13, the DPIIC chip 410 may include multiple intra-chip interconnects (not shown) each extending over spaces between neighboring two of the memory-array blocks 423, wherein said each of the intra-chip interconnects may be the programmable interconnect 361 or fixed interconnect 364 as illustrated in FIGS. 7A-7C. For the DPIIC chip 410, each of its small input/output (I/O) circuits 203, as illustrated in FIG. 5B, may have its output S_Data_in coupling to one or more of its programmable interconnects 361 and/or one or more of its fixed interconnects 364 and its input S_Data_out, S_Enable or S_Inhibit coupling to another one or more of its programmable interconnects 361 and/or another one or more of its fixed interconnects 364.

Referring to FIG. 13, the DPIIC chip 410 may further include multiple of the non-volatile memory cells 870, 880 or 907 as illustrated in FIG. 8A-8F, 9A-9H, 10A-10I or 11A-11F therein. For the DPIIC chip 410, each of its sense amplifiers 666 as illustrated in FIG. 8A-8F, 9A-9H, 10A-10I or 11A-11F may have the output Out to couple to one or more of the bit lines 452 of the 6T or 5T SRAM cells 398 as seen in FIG. 1A or 1B employed for its memory cells 362 for its cross-point switches 379 as illustrated in FIGS. 7A-7C through one or more of the fixed interconnects 364. Thereby, for the DPIIC chip 410, when its non-volatile memory cells 870, 880 or 907 as illustrated in FIG. 8A-8F, 9A-9H, 10A-10I or 11A-11F are in operation, the programming codes stored in its non-volatile memory cells 870, 880 or 907 as illustrated in FIG. 8A-8F, 9A-9H, 10A-10I or 11A-11F may be downloaded via its sense amplifiers 666 to its memory cells 362 for its cross-point switches 379 as illustrated in FIGS. 7A-7C.

Referring to FIG. 13, the DPIIC chip 410 may include multiple of the I/O pads 372 as seen in FIG. 5B, each vertically over one of its small input/output (I/O) circuits 203, coupling to the node 381 of said one of its small input/output (I/O) circuits 203. In a first clock, a signal from one of the nodes N23-N26 of one of the cross-point switches 379 as illustrated in FIGS. 3A-3C, 7A and 7B, or the output Dout of one of the cross-point switches 379 as illustrated in FIGS. 3D and 7C, may be transmitted to the input S_Data_out of the small driver 374 of one of the small input/output (I/O) circuits 203 through one or more of the programmable interconnects 361, and then the small driver 374 of said one of the small input/output (I/O) circuits 203 may amplify its input S_Data_out to be transmitted to one of the I/O pads 372 vertically over said one of the small input/output (I/O) circuits 203 for external connection to circuits outside the DPIIC chip 410. In a second clock, a signal from circuits outside the DPIIC chip 410 may be transmitted to the small receiver 375 of said one of the small input/output (I/O) circuits 203 through said one of the I/O pads 372, and then the small receiver 375 of said one of the small input/output (I/O) circuits 203 may amplify the signal into its output S_Data_in to be transmitted to one of the nodes N23-N26 of another of the cross-point switches 379 as illustrated in FIGS. 3A-3C, 7A and 7B, or to one of the inputs D0-D15 of another of the cross-point switches 379 as illustrated in FIGS. 3D and 7C, through another one or more of the programmable interconnects 361.

Referring to FIG. 13, the DPIIC chip 410 may further include (1) multiple power pads 205 for applying the voltage Vcc of power supply to the memory cells 362 for the cross-point switches 379 as illustrated in FIGS. 7A-7C and/or the non-volatile memory cells 870, 880 or 907 as illustrated in FIG. 8A-8F, 9A-9H, 10A-10I or 11A-11F through one or more of the fixed interconnects 364, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 for providing the voltage Vss of ground reference to the memory cells 362 for the cross-point switches 379 as illustrated in FIGS. 7A-7C and/or the non-volatile memory cells 870, 880 or 907 as illustrated in FIG. 8A-8F, 9A-9H, 10A-10I or 11A-11F through one or more of the fixed interconnects 364.

Figure 15A:
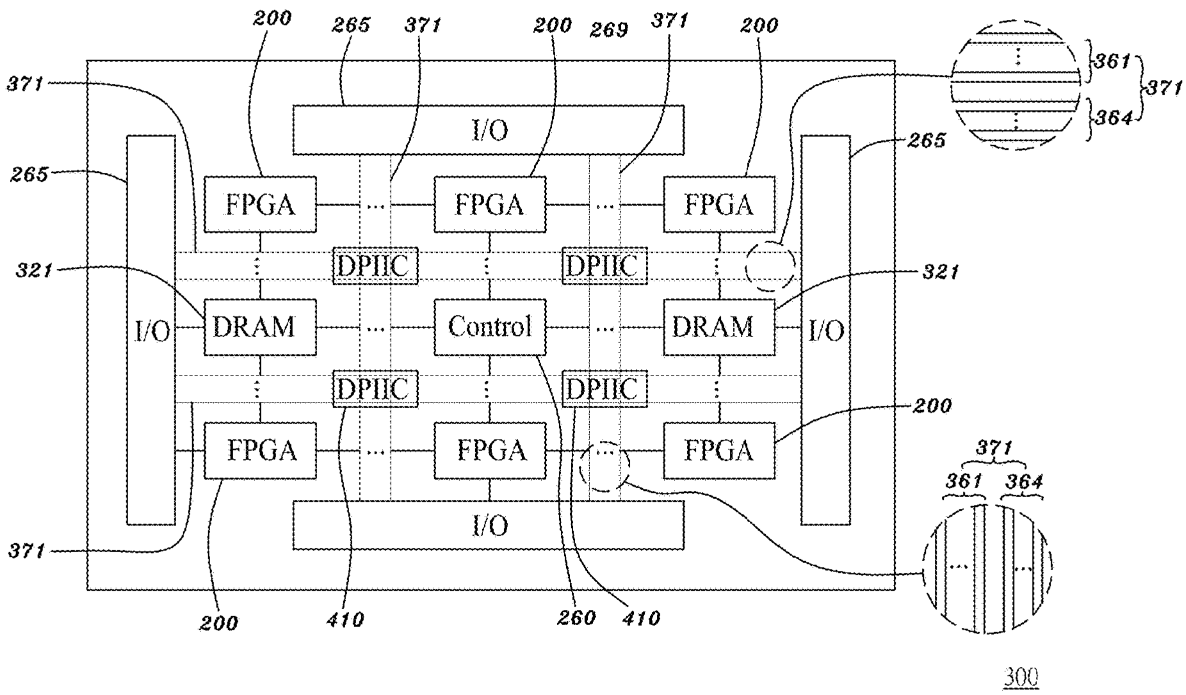
FIGS. 15A-15O are schematically top views showing various arrangement for a logic drive in accordance with an embodiment of the present application.

Referring to FIG. 13, the DPIIC chip 410 may further include multiple 6T SRAM cells 398 as illustrated in FIG. 1A used as cache memory for data latch or storage. Each of the 6T SRAM cells 398 may include two switches 449, such as N-type or P-type MOS transistors, for bit and bit-bar data transfer, and two pairs of P-type and N-type MOS transistors 447 and 448 for data latch or storage nodes. Each of the 6T SRAM cells 398 acting as the cache memory provides the two switches 449 for writing data into it and reading data stored in it. The DPIIC chip 410 may further include a sense amplifier for reading (amplifying or detecting) data from the 6T SRAM cells 398 acting as the cache memory. Accordingly, the 6T SRAM cells 398 of the DPIIC chip 410 may act as cache memory to store data from any of the semiconductor chips 200, 250, 251, 260, 265, 266, 267, 268, 269, 269*a*, 269*b*, 269*c*, 324 and 402 of one of the standard commodity logic drive 300 as seen in FIGS. 15A-15O during the processing or computing of the standard commodity logic drive 300. In this case, the DPIIC chip 410 may be called as a dedicated programmable interconnection and cache SRAM (DPICSRAM) chip.

Specification for Dedicated Input/Output (I/O) Chip

Figure 14:
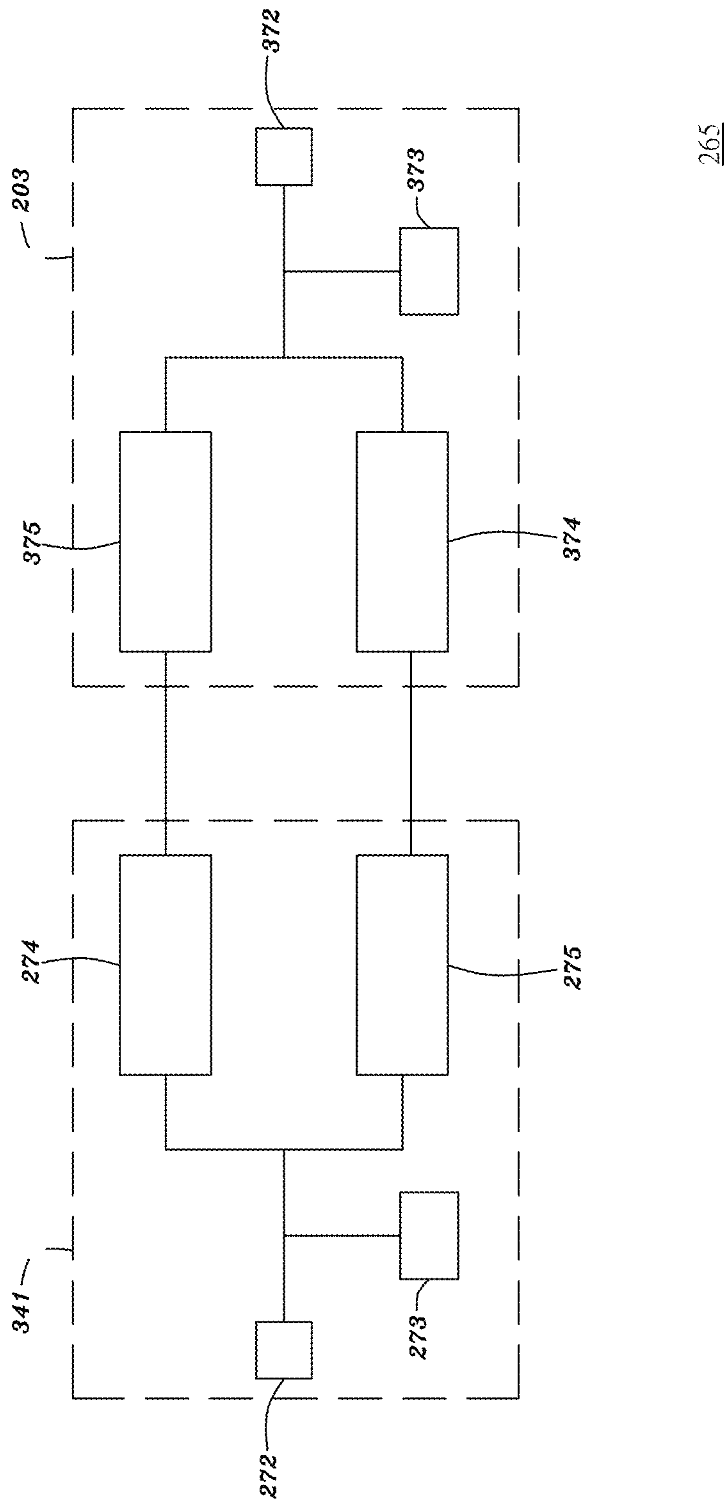
FIG. 14 is a schematically top view showing a block diagram of a dedicated input/output (I/O) chip in accordance with an embodiment of the present application.

FIG. 14 is a block diagram for a dedicated input/output (I/O) chip in accordance with an embodiment of the present application. Referring to FIG. 14, a dedicated input/output (I/O) chip 265 may include a plurality of the large I/O circuit 341 (only one is shown) and a plurality of the small I/O circuit 203 (only one is shown). The large I/O circuit 341 may be referred to one as illustrated in FIG. 5A; the small I/O circuit 203 may be referred to one as illustrated in FIG. 5B.

Referring to FIGS. 5A, 5B and 14, each of the large I/O circuits 341 may be provided with the large driver 274 having the input L_Data_out coupling to the output S_Data_in of the small receiver 375 of one of the small I/O circuits 203. Each of the large I/O circuits 341 may be provided with the large receiver 275 having the node of L_Data_in coupling to the node of S_Data_out of the small driver 374 of one of the small I/O circuits 203. When the large driver 274 is enabled by the L_Ebable signal, the small receiver 375 is activated by the S_Inhibit signal, the large receiver 275 is inhibited by the L_Inhibit signal and the small driver 374 is disabled by the S_Ebable signal, data from the I/O pad 372 of the small I/O circuit 203 may pass to the I/O pad 272 of the large I/O circuit 341 through, in sequence, the small receiver 375 and large driver 274. When the large receiver 275 is activated by the L_Inhibit signal, the small driver 374 is enabled by the S_Ebable signal, the large driver 274 is disabled by the L_Ebable signal and the small receiver 375 is inhibited by the S_Inhibit signal, data from the I/O pad 272 of the large I/O circuit 341 may pass to the I/O pad 372 of the small I/O circuit 203 through, in sequence, the large receiver 275 and small driver 374.

Specification for Logic Drive

Various types of standard commodity logic drives, packages, package drives, devices, modules, disks or disk drives (to be abbreviated as "drive" below, that is when "drive" is mentioned below, it means and reads as "drive, package, package drive, device, module, disk or disk drive") are introduced in the following paragraphs.

I. First Type of Logic Drive

FIG. 15A is a schematically top view showing arrangement for various chips packaged in a first type of standard commodity logic drive in accordance with an embodiment of the present application. Referring to FIG. 15A, the standard commodity logic drive 300 may be packaged with a plurality of the standard commodity FPGA IC chip 200 as illustrated in FIGS. 12A-12N, one or more dynamic random-access memory (DRAM) chips 321 and a dedicated control chip 260, which are arranged in an array, wherein the dedicated control chip 260 may be surrounded by the standard commodity FPGA IC chips 200 and DRAM IC chips 321 and arranged between the DRAM IC chips 321 and/or between the standard commodity FPGA IC chips 200. One of the DRAM IC chips 321 at a right middle side of the logic drive 300 may be arranged between two of the standard commodity FPGA IC chips 200 at right top and right bottom sides of the logic drive 300. One of the DRAM IC chips 321 at a left middle side of the logic drive 300 may be arranged between two of the standard commodity FPGA IC chips 200 at left top and left bottom sides of the logic drive 300. Some of the FPGA IC chips 200 may be arranged in a line at a top side of the logic drive 300. Some of the FPGA IC chips 200 may be arranged in a line at a bottom side of the logic drive 300.

Referring to FIG. 15A, the logic drive 300 may include multiple inter-chip interconnects 371 each extending under spaces between neighboring two of the standard commodity FPGA IC chips 200, DRAM IC chips 321 and dedicated control chip 260. The logic drive 300 may include a plurality of the DPIIC chip 410 aligned with a cross of a vertical bundle of inter-chip interconnects 371 and a horizontal bundle of inter-chip interconnects 371. Each of the DPIIC chips 410 is at corners of four of the standard commodity FPGA IC chips 200, DRAM IC chips 321 and dedicated control chip 260 around said each of the DPIIC chips 410. For example, one of the DPIIC chips 410 at a left top corner of the dedicated control chip 260 may have a first minimum distance to a first one of the standard commodity FPGA IC chips 200 at a left top corner of said one of the DPIIC chips 410, wherein the first minimum distance is the one between the right bottom corner of the first one of the standard commodity FPGA IC chips 200 and the left top corner of said one of the DPIIC chips 410; said one of the DPIIC chips 410 may have a second minimum distance to a second one of the standard commodity FPGA IC chips 200 at a right top corner of said one of the DPIIC chips 410, wherein the second minimum distance is the one between the left bottom corner of the second one of the standard commodity FPGA IC chips 200 and the right top corner of said one of the DPIIC chips 410; said one of the DPIIC chips 410 may have a third minimum distance to one of the DRAM IC chips 321 at a left bottom corner of said one of the DPIIC chips 410, wherein the third minimum distance is the one between the right top corner of said one of the DRAM IC chips 321 and the left bottom corner of said one of the DPIIC chips 410; said one of the DPIIC chips 410 may have a fourth minimum distance to the dedicated control chip 260 at a right bottom corner of said one of the DPIIC chips 410, wherein the fourth minimum distance is the one between the left top corner of the dedicated control chip 260 and the right bottom corner of said one of the DPIIC chips 410.

Referring to FIG. 15A, each of the inter-chip interconnects 371 may be the programmable or fixed interconnect 361 or 364 as illustrated in FIGS. 7A-7C in the sections of "Specification for Programmable Interconnect" and "Specification for Fixed Interconnect". Signal transmission may be built (1) between one of the programmable interconnects 361 of the inter-chip interconnects 371 and one of the programmable interconnects 361 of the intra-chip interconnects 502 of one of the standard commodity FPGA IC chips 200 via one of the small input/output (I/O) circuits 203 of said one of the standard commodity FPGA IC chips 200 or (2) between one of the programmable interconnects 361 of the inter-chip interconnects 371 and one of the programmable interconnects 361 of the intra-chip interconnects of one of the DPIIC chips 410 via one of the small input/output (I/O) circuits 203 of said one of the DPIIC chips 410. Signal transmission may be built (1) between one of the fixed interconnects 364 of the inter-chip interconnects 371 and one of the fixed interconnects 364 of the intra-chip interconnects 502 of one of the standard commodity FPGA IC chips 200 via one of the small input/output (I/O) circuits 203 of said one of the standard commodity FPGA IC chips 200 or (2) between one of the fixed interconnects 364 of the inter-chip interconnects 371 and one of the fixed interconnects 364 of the intra-chip interconnects of one of the DPIIC chips 410 via one of the small input/output (I/O) circuits 203 of said one of the DPIIC chips 410.

Referring to FIG. 15A, one or more of the programmable or fixed interconnects 361 or 364 of the inter-chip interconnects 371 may couple from each of the standard commodity FPGA IC chips 200 to all of the DPIIC chips 410. One or more of the programmable or fixed interconnects 361 or 364 of the inter-chip interconnects 371 may couple from each of the standard commodity FPGA IC chips 200 to the dedicated control chip 260. One or more of the programmable or fixed interconnects 361 or 364 of the inter-chip interconnects 371 may couple from each of the standard commodity FPGA IC chips 200 to both of the DRAM IC chips 321. One or more of the programmable or fixed interconnects 361 or 364 of the inter-chip interconnects 371 may couple from each of the standard commodity FPGA IC chips 200 to the others of the standard commodity FPGA IC chips 200. One or more of the programmable or fixed interconnects 361 or 364 of the inter-chip interconnects 371 may couple from each of the DPIIC chips 410 to the dedicated control chip 260. One or more of the programmable or fixed interconnects 361 or 364 of the inter-chip interconnects 371 may couple from each of the DPIIC chips 410 to both of the DRAM IC chips 321. One or more of the programmable or fixed interconnects 361 or 364 of the inter-chip interconnects 371 may couple from each of the DPIIC chips 410 to the others of the DPIIC chips 410. One or more of the programmable or fixed interconnects 361 or 364 of the inter-chip interconnects 371 may couple from each of the DRAM IC chips 321 to the dedicated control chip 260. One or more of the programmable or fixed interconnects 361 or 364 of the inter-chip interconnects 371 may couple from each of the DRAM IC chips 321 to the other of the DRAM IC chips 321.

Accordingly, referring to FIG. 15A, a first one of the standard commodity FPGA IC chips 200 may have a first one of the programmable logic blocks 201, as illustrated in FIG. 6A or 6H, to transmit its output Dout, C0, C1, C2 or C3 to one of the inputs A0-A3 of a second one of the programmable logic blocks 201, as illustrated in FIG. 6A or 6H, of a second one of the standard commodity FPGA IC chips 200 through one of the cross-point switches 379 of one of the DPIIC chips 410. The output Dout of the first one of the programmable logic blocks 201 may be passed to said one of the inputs A0-A3 of the second one of the programmable logic blocks 201 through, in sequence, (1) the programmable interconnects 361 of the intra-chip interconnects 520 of the first one of the standard commodity FPGA IC chips 200, (2) a first group of programmable interconnects 361 of the inter-chip interconnects 371, (3) a first group of programmable interconnects 361 of the intra-chip interconnects of said one of the DPIIC chips 410, (4) said one of the cross-point switches 379 of said one of the DPIIC chips 410, (5) a second group of programmable interconnects 361 of the intra-chip interconnects of said one of the DPIIC chips 410, (6) a second group of programmable interconnects 361 of the inter-chip interconnects 371 and (7) the programmable interconnects 361 of the intra-chip interconnects 502 of the second one of the standard commodity FPGA IC chips 200.

Alternatively, referring to FIG. 15A, one of the standard commodity FPGA IC chips 200 may have a first one of the programmable logic blocks 201, as illustrated in FIG. 6A or 6H, to transmit its output Dout, C0, C1, C2 or C3 to one of the inputs A0-A3 of a second one of the programmable logic blocks 201, as illustrated in FIG. 6A or 6H, of said one of the standard commodity FPGAIC chips 200 through one of the cross-point switches 379 of one of the DPIIC chips 410. The output Dout of the first one of the programmable logic blocks 201 may be passed to one of the inputs A0-A3 of the second one of the programmable logic blocks 201 through, in sequence, (1) a first group of programmable interconnects 361 of the intra-chip interconnects 502 of said one of the standard commodity FPGA IC chips 200, (2) a first group of programmable interconnects 361 of the inter-chip interconnects 371, (3) a first group of programmable interconnects 361 of the intra-chip interconnects of said one of the DPIIC chips 410, (4) said one of the cross-point switches 379 of said one of DPIIC chips 410, (5) a second group of programmable interconnects 361 of the intra-chip interconnects of said one of the DPIIC chips 410, (6) a second group of programmable interconnects 361 of the inter-chip interconnects 371 and (7) a second group of programmable interconnects 361 of the intra-chip interconnects 502 of said one of the standard commodity FPGA IC chips 200.

Referring to FIG. 15A, the logic drive 300 may include multiple dedicated input/output (I/O) chips 265 in a peripheral region thereof surrounding a central region thereof having the standard commodity FPGA IC chips 200, DRAM IC chips 321, dedicated control chip 260 and DPIIC chips 410 located therein. One or more of the programmable or fixed interconnects 361 or 364 of the inter-chip interconnects 371 may couple from each of the standard commodity FPGA IC chips 200 to all of the dedicated input/output (I/O) chips 265. One or more of the programmable or fixed interconnects 361 or 364 of the inter-chip interconnects 371 may couple from one of the DPIIC chips 410 to one of the dedicated input/output (I/O) chips 265. One or more of the programmable or fixed interconnects 361 or 364 of the inter-chip interconnects 371 may couple from one of the DRAM IC chips 321 to all of the dedicated input/output (I/O) chips 265. One or more of the programmable or fixed interconnects 361 or 364 of the inter-chip interconnects 371 may couple from the dedicated control chip 260 to all of the dedicated input/output (I/O) chips 265. One or more of the programmable or fixed interconnects 361 or 364 of the inter-chip interconnects 371 may couple from each of the dedicated input/output (I/O) chips 265 to the others of the dedicated input/output (I/O) chips 265.

Referring to FIG. 15A, each of the standard commodity FPGA IC chips 200 may be referred to ones as illustrated in FIGS. 12A-12N, and each of the DPIIC chips 410 may be referred to ones as illustrated in FIG. 13.

Referring to FIG. 15A, each of the dedicated I/O chips 265 and dedicated control chip 260 may be designed, implemented and fabricated using varieties of semiconductor technology nodes or generations, including old or matured technology nodes or generations, for example, a semiconductor node or generation less advanced than, equal to, or more mature than 20 nm or 30 nm, and for example using the technology node of 22 nm, 28 nm, 40 nm, 90 n, 130 n, 180 n, 250 n, 350 nm or 500 nm. Packaged in the same logic drive 300, the semiconductor technology node or generation used in each of the dedicated I/O chip 265 and dedicated control chip 260 is 1, 2, 3, 4, 5 or greater than 5 nodes or generations older, more matured or less advanced than that used in each of the standard commodity FPGA IC chips 200 and DPIIC chips 410.

Referring to FIG. 15A, transistors or semiconductor devices used in each of the dedicated I/O chips 265 and dedicated control chip 260 may be a Fully Depleted Silicon-on-insulator (FDSOI) MOSFET, a Partially Depleted Silicon-on-insulator (PDSOI) MOSFET or a conventional MOSFET. Packaged in the same logic drive 300, transistors or semiconductor devices used in each of the dedicated I/O chips 265 and dedicated control chip 260 may be different from those used in each of the standard commodity FPGA IC chips 200 and DPIIC chips 410; for example, packaged in the same logic drive 300, each of the dedicated I/O chips 265 and dedicated control chip 260 may use the conventional MOSFET, while each of the standard commodity FPGA IC chips 200 and DPIIC chips 410 may use the FINFET; alternatively, packaged in the same logic drive 300, each of the dedicated I/O chips 265 and dedicated control chip 260 may use the Fully Depleted Silicon-on-insulator (FDSOI) MOSFET, while each of the standard commodity FPGA IC chips 200 and DPIIC chips 410 may use the FINFET.

Referring to FIG. 15A, the logic drive 300 may include a high-speed DRAM IC chip or chips 321 for fast access of data for processing and/or computing. Each of the DRAM IC chips 321 may be fabricated using a technology generation or node, for example, more advanced than or smaller than or equal to 40 nm, 28 nm, 20 nm, 16 nm or 10 nm. Each of the DRAM IC chips 321 may have a standard memory density, capacity or size of greater than or equal to 64 Mb, 512 Mb, 1 Gb, 4 Gb, 16 Gb, 64 Gb, 128 Gb, 256 Gb, or 512 Gb, wherein “b” is bits. The data needed in the processing or computing may be taken or accessed from the data stored in the DRAM IC chips 321 and the resulting data from the processing or computing of the standard commodity FPGA IC chips 200 may be stored in the DRAM IC chips 321.

Referring to FIG. 15A, packaged in the same logic drive 300, the voltage Vcc of power supply used in each of the dedicated I/O chips 265 and dedicated control chip 260 may be greater than or equal to 1.5V, 2.0V, 2.5V, 3V, 3.5V, 4V, or 5V, while the voltage Vcc of power supply used in each of the standard commodity FPGA IC chips 200 and DPIIC chips 410 may be between 0.2V and 2.5V, between 0.2V and 2V, between 0.2V and 1.5V, between 0.1V and 1V, or between 0.2V and 1V, or smaller or lower than or equal to 2.5V, 2V, 1.8V, 1.5V or 1V. Packaged in the same logic drive 300, the voltage Vcc of power supply used in each of the dedicated I/O chips 265 and dedicated control chip 260 may be different from that used in each of the standard commodity FPGA IC chips 200 and DPIIC chips 410; for example, packaged in the same logic drive 300, each of the dedicated I/O chips 265 and dedicated control chip 260 may use the voltage Vcc of power supply at 4V, while each of the standard commodity FPGA IC chips 200 and DPIIC chips 410 may use the voltage Vcc of power supply at 1.5V; alternatively, packaged in the same logic drive 300, each of the dedicated I/O chips 265 and dedicated control chip 260 may use the voltage Vcc of power supply at 2.5V, while each of the standard commodity FPGA IC chips 200 and DPIIC chips 410 packaged in the same logic drive 300 may use the voltage Vcc of power supply at 0.75V.

Referring to FIG. 15A, packaged in the same logic drive 300, the gate oxide (physical) thickness of the Field-Effect-Transistors (FETs) of semiconductor devices used in each of the dedicated I/O chips 265 and dedicated control chip 260 may be thicker than or equal to 5 nm, 6 nm, 7.5 nm, 10 nm, 12.5 nm, or 15 nm, while the gate oxide (physical) thickness of FETs of semiconductor devices used in each of the standard commodity FPGA IC chips 200 and DPIIC chips 410 may be thinner than 4.5 nm, 4 nm, 3 nm or 2 nm. Packaged in the same logic drive 300, the gate oxide (physical) thickness of FETs of the semiconductor devices used in each of the dedicated I/O chips 265 and dedicated control chip 260 may be different from that used in each of the standard commodity FPGA IC chips 200 and DPIIC chips 410; for example, packaged in the same logic drive 300, each of the dedicated I/O chips 265 and dedicated control chip 260 may use a gate oxide (physical) thickness of FETs of 10 nm, while each of the standard commodity FPGA IC chips 200 and DPIIC chips 410 may use a gate oxide (physical) thickness of FETs of 3 nm; alternatively, packaged in the same logic drive 300, each of the dedicated I/O chips 265 and dedicated control chip 260 may use a gate oxide (physical) thickness of FETs of 7.5 nm, while each of the standard commodity FPGA IC chips 200 and DPIIC chips 410 may use a gate oxide (physical) thickness of FETs of 2 nm.

Referring to FIG. 15A, each of the dedicated I/O chip(s) 165 in the multi-chip package of the standard commodity logic drive 300 may have the circuits as illustrated in FIG. 14. Each of the dedicated I/O chip(s) 165 may arrange a plurality of the large I/O circuit 341 and I/O pad 272, as seen in FIGS. 5A and 14, for the logic drive 300 to employ one or multiple (2, 3, 4, or more than 4) Universal Serial Bus (USB) ports, one or more IEEE 1394 ports, one or more Ethernet ports, one or more HDMI ports, one or more VGA ports, one or more audio ports or serial ports, for example, RS-232 or COM (communication) ports, wireless transceiver I/Os, and/or Bluetooth transceiver I/Os, and etc. Each of the dedicated I/O chips 165 may have a plurality of the large I/O circuit 341 and I/O pad 272, as seen in FIGS. 5A and 14, for the logic drive 300 to employ Serial Advanced Technology Attachment (SATA) ports, or Peripheral Components Interconnect express (PCIe) ports to communicate, connect or couple with a memory drive.

Referring to FIG. 15A, each of the standard commodity FPGA IC chips 200 may have standard common features, counts or specifications, mentioned as below: (1) its programmable logic blocks (LB) 201 including (i) system gates with the count greater than or equal to 2M, 10M, 20M, 50M or 100M in total, (ii) logic cells or elements with the count greater than or equal to 64K, 128K, 512K, 1M, 4M or 8M in total, (iii) hard macros, for example DSP slices, microcontroller macros, multiplexer macros, fixed-wired adders as seen in FIG. 12K, and/or fixed-wired multipliers as seen in FIG. 12N and/or (iv) blocks of memory with the bit count equal to or greater than 1M, 10M, 50M, 100M, 200M or 500M bits in total; (2) the number of the inputs of each of its programmable logic blocks (LB) 201 being greater or equal to 4, 8, 16, 32, 64, 128, or 256; (3) the voltage Vcc of power supply applied to its power pads 205 being between 0.1V and 8V, between 0.1V and 6V, between 0.1V and 2.5V, between 0.1V and 2V, between 0.1V and 1.5V, or between 0.1V and 1V; (4) its I/O pads 372, input-enable pads 221, input-selection pads 226, chip-enable pads 209, output-enable pads 227, output-selection pads 228, power pads 205 and ground pads 206 as illustrated in FIG. 12A, in terms of layout, location, number and function.

II. Second Type of Logic Drive

Figure 15B:
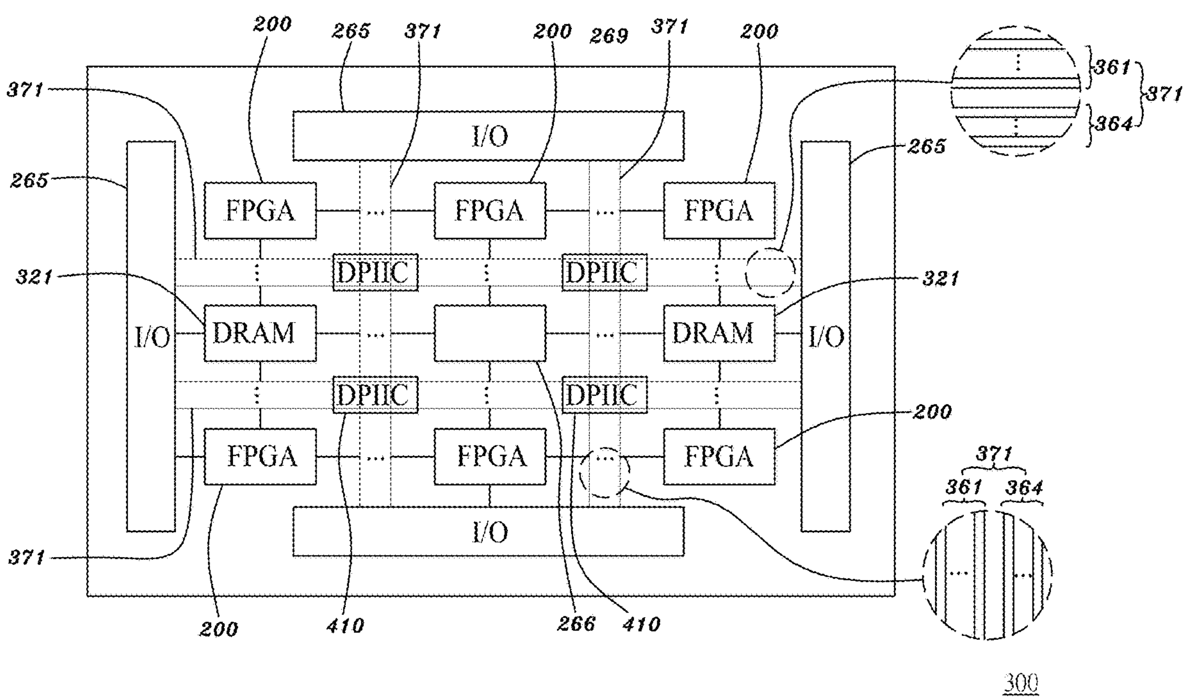

FIG. 15B is a schematically top view showing arrangement for various chips packaged in a second type of standard commodity logic drive in accordance with an embodiment of the present application. Referring to FIG. 15B, the dedicated control chip 260 and dedicated I/O chips 265 have functions that may be combined into a single chip 266, i.e., dedicated control and I/O chip, to perform above-mentioned functions of the dedicated control chip 260 and dedicated I/O chips 265. The dedicated control and I/O chip 266 may include the architecture as seen in FIG. 14. The dedicated control chip 260 as seen in FIG. 15A may be replaced with the dedicated control and I/O chip 266 to be packaged at the place where the dedicated control chip 260 is arranged. For an element indicated by the same reference number shown in FIGS. 15A and 15B, the specification of the element as seen in FIG. 15B and the process for forming the same may be referred to that of the element as illustrated in FIG. 15A and the process for forming the same.

For interconnection, referring to FIG. 15B, one or more of the programmable or fixed interconnects 361 or 364 of the inter-chip interconnects 371 may couple from each of the standard commodity FPGA IC chips 200 to the dedicated control and I/O chip 266. One or more of the programmable or fixed interconnects 361 or 364 of the inter-chip interconnects 371 may couple from each of the DPIIC chips 410 to the dedicated control and I/O chip 266. One or more of the programmable or fixed interconnects 361 or 364 of the inter-chip interconnects 371 may couple from the dedicated control and I/O chip 266 to all of the dedicated input/output (I/O) chips 265. One or more of the programmable or fixed interconnects 361 or 364 of the inter-chip interconnects 371 may couple from the dedicated control and I/O chip 266 to both of the DRAM IC chips 321.

Referring to FIG. 15B, each of the dedicated I/O chips 265 and dedicated control and I/O chip 266 is designed, implemented and fabricated using varieties of semiconductor technology nodes or generations, including old or matured technology nodes or generations, for example, a semiconductor node or generation less advanced than, equal to or more mature than 20 nm or 30 nm, and for example using the technology node of 22 nm, 28 nm, 40 nm, 90 nm, 130 nm, 180 nm, 250 nm, 350 nm or 500 nm. Packaged in the same logic drive 300, the semiconductor technology node or generation used in each of the dedicated I/O chip 265 and dedicated control and I/O chip 266 is 1, 2, 3, 4, 5 or greater than 5 nodes or generations older, more matured or less advanced than that used in each of the standard commodity FPGA IC chips 200 and DPIIC chips 410.

Referring to FIG. 15B, transistors or semiconductor devices used in each of the dedicated I/O chips 265 and dedicated control and I/O chip 266 may be a Fully Depleted Silicon-on-insulator (FDSOI) MOSFET, a Partially Depleted Silicon-on-insulator (PDSOI) MOSFET or a conventional MOSFET. Packaged in the same logic drive 300, transistors or semiconductor devices used in each of the dedicated I/O chips 265 and dedicated control and I/O chip 266 may be different from that used in each of the standard commodity FPGA IC chips 200 and DPIIC chips 410; for example, packaged in the same logic drive 300, each of the dedicated I/O chips 265 and dedicated control and I/O chip 266 may use the conventional MOSFET, while each of the standard commodity FPGA IC chips 200 and DPIIC chips 410 may use the FINFET; alternatively, packaged in the same logic drive 300, each of the dedicated I/O chips 265 and dedicated control and I/O chip 266 may use the Fully Depleted Silicon-on-insulator (FDSOI) MOSFET, while each of the standard commodity FPGA IC chips 200 and DPIIC chips 410 may use the FINFET.

Referring to FIG. 15B, packaged in the same logic drive 300, the voltage Vcc of power supply used in each of the dedicated I/O chips 265 and dedicated control and I/O chip 266 may be greater than or equal to 1.5V, 2.0V, 2.5V, 3V, 3.5V, 4V, or 5V, while the voltage Vcc of power supply used in each of the standard commodity FPGA IC chips 200 and DPIIC chips 410 may be between 0.2V and 2.5V, between 0.2V and 2V, between 0.2V and 1.5V, between 0.1V and 1V, or between 0.2V and 1V, or smaller or lower than or equal to 2.5V, 2V, 1.8V, 1.5V or 1V. Packaged in the same logic drive 300, the voltage Vcc of power supply used in each of the dedicated I/O chips 265 and dedicated control and I/O chip 266 may be different from that used in each of the standard commodity FPGA IC chips 200 and DPIIC chips 410; for example, packaged in the same logic drive 300, each of the dedicated I/O chips 265 and dedicated control and I/O chip 266 may use the voltage Vcc of power supply at 4V, while each of the standard commodity FPGA IC chips 200 and DPIIC chips 410 may use the voltage Vcc of power supply at 1.5V; alternatively, packaged in the same logic drive 300, each of the dedicated I/O chips 265 and dedicated control and I/O chip 266 may use the voltage Vcc of power supply at 2.5V, while each of the standard commodity FPGA IC chips 200 and DPIIC chips 410 may use the voltage Vcc of power supply at 0.75V.

Referring to FIG. 15B, packaged in the same logic drive 300, the gate oxide (physical) thickness of the Field-Effect-Transistors (FETs) of semiconductor devices used in each of the dedicated I/O chips 265 and dedicated control and I/O chip 266 may be thicker than or equal to 5 nm, 6 nm, 7.5 nm, 10 nm, 12.5 nm, or 15 nm, while the gate oxide (physical) thickness of FETs of semiconductor devices used in each of the standard commodity FPGA IC chips 200 and DPIIC chips 410 may be thinner than 4.5 nm, 4 nm, 3 nm or 2 nm. Packaged in the same logic drive 300, the gate oxide (physical) thickness of FETs of the semiconductor devices used in each of the dedicated I/O chips 265 and dedicated control and I/O chip 266 may be different from that used in each of the standard commodity FPGA IC chips 200 and DPIIC chips 410; for example, packaged in the same logic drive 300, each of the dedicated I/O chips 265 and dedicated control and I/O chip 266 may use a gate oxide (physical) thickness of FETs of 10 nm, while each of the standard commodity FPGA IC chips 200 and DPIIC chips 410 may use a gate oxide (physical) thickness of FETs of 3 nm; alternatively, packaged in the same logic drive 300, each of the dedicated I/O chips 265 and dedicated control and I/O chip 266 may use a gate oxide (physical) thickness of FETs of 7.5 nm, while each of the standard commodity FPGA IC chips 200 and DPIIC chips 410 may use a gate oxide (physical) thickness of FETs of 2 nm.

III. Third Type of Logic Drive

Figure 15C:
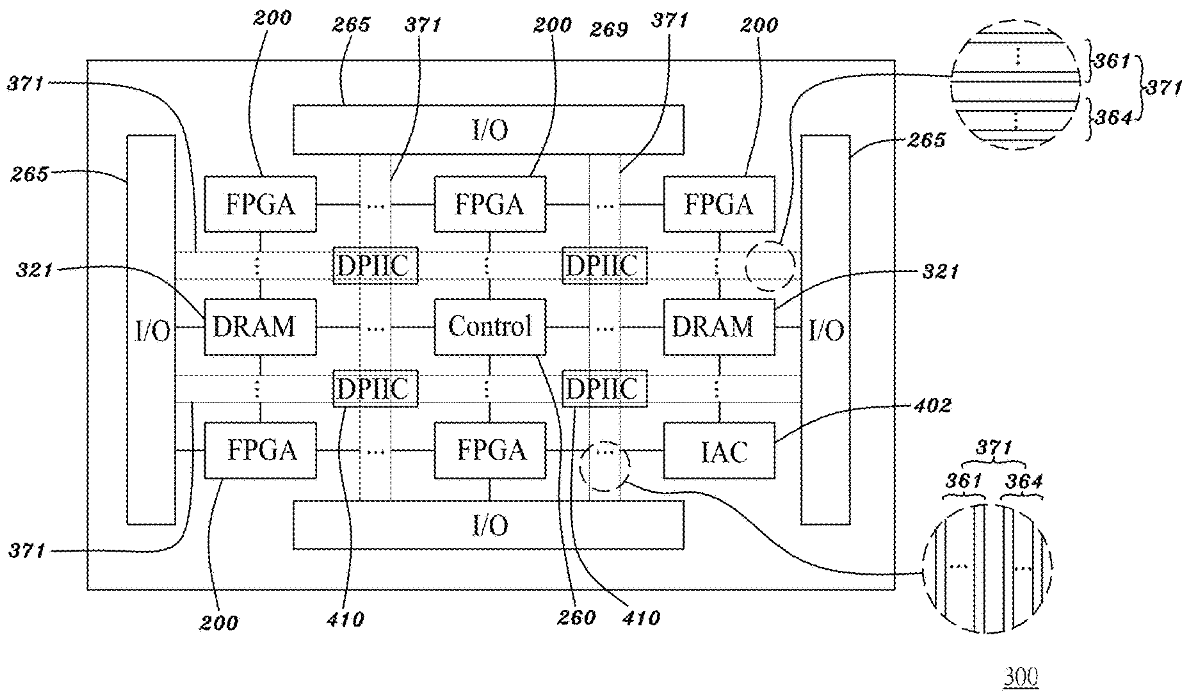

FIG. 15C is a schematically top view showing arrangement for various chips packaged in a third type of standard commodity logic drive in accordance with an embodiment of the present application. The structure shown in FIG. 15C is similar to that shown in FIG. 15A but the difference therebetween is that an Innovated ASIC or COT (abbreviated as IAC below) chip 402 may be further provided to be packaged in the logic drive 300. For an element indicated by the same reference number shown in FIGS. 15A and 15C, the specification of the element as seen in FIG. 15C and the process for forming the same may be referred to that of the element as illustrated in FIG. 15A and the process for forming the same.

Referring to FIG. 15C, the IAC chip 402 may be configured for Intellectual Property (IP) circuits, Application Specific (AS) circuits, analog circuits, mixed-mode signal circuits, Radio-Frequency (RF) circuits, and/or transmitter, receiver, transceiver circuits, etc. Each of the dedicated I/O chips 265, dedicated control chip 260 and IAC chip 402 is designed, implemented and fabricated using varieties of semiconductor technology nodes or generations, including old or matured technology nodes or generations, for example, less advanced than, equal to or more mature than 20 nm or 30 nm, and for example using the technology node of 22 nm, 28 nm, 40 nm, 90 nm, 130 nm, 180 nm, 250 nm, 350 nm or 500 nm. Packaged in the same logic drive 300, the semiconductor technology node or generation used in each of the dedicated I/O chips 265, dedicated control chip 260 and IAC chip 402 is 1, 2, 3, 4, 5 or greater than 5 nodes or generations older, more matured or less advanced than that used in each of the standard commodity FPGA IC chips 200 and DPIIC chips 410. Transistors or semiconductor devices used in the IAC chip 402 may be a FINFET, a FINFET on Silicon-On-Insulator (FINFET SOI), a Fully Depleted Silicon-on-insulator (FDSOI) MOSFET, a Partially Depleted Silicon-on-insulator (PDSOI) MOSFET or a conventional MOSFET. Packaged in the same logic drive 300, transistors or semiconductor devices used in each of the dedicated I/O chips 265, dedicated control chip 260 and IAC chip 402 may be different from that used in each of the standard commodity FPGA IC chips 200 and DPIIC chips 410; for example, packaged in the same logic drive 300, each of the dedicated I/O chips 265, dedicated control chip 260 and IAC chip 402 may use the conventional MOSFET, while each of the standard commodity FPGA IC chips 200 and DPIIC chips 410 may use the FINFET; alternatively, packaged in the same logic drive 300, each of the dedicated I/O chips 265, dedicated control chip 260 and IAC chip 402 may use the Fully Depleted Silicon-on-insulator (FDSOI) MOSFET, while each of the standard commodity FPGA IC chips 200 and DPIIC chips 410 may use the FINFET.

Since the IAC chip 402 in this aspect of disclosure may be designed and fabricated using older or less advanced technology nodes or generations, for example, less advanced than, equal to or more mature than 20 nm or 30 nm, and for example using the technology node of 22 nm, 28 nm, 40 nm, 90 nm, 130 nm, 180 nm, 250 nm, 350 nm or 500 nm, its NRE cost is cheaper than or less than that of the current or conventional ASIC or COT chip designed and fabricated using an advanced IC technology node or generation, for example, more advanced than or below 20 nm or 10 nm, and for example using the technology node of 16 nm, 14 nm, 12 nm, 10 nm, 7 nm, 5 nm or 3 nm. The NRE cost for designing a current or conventional ASIC or COT chip using an advanced IC technology node or generation, for example, more advanced than or below 20 nm or 10 nm, may be more than US $5M, US $10M, US $20M or even exceeding US $50M, or US $100M. The cost of a photo mask set for an ASIC or COT chip at the 16 nm technology node or generation is over US $2M, US $5M, or US $10M. Implementing the same or similar innovation and/or application using the third type of logic drive 300 including the IAC chip 402 designed and fabricated using older or less advanced technology nodes or generations, may reduce NRE cost down to less than US $10M, US $7M, US $5M, US $3M or US $1M. Compared to the implementation by developing the current or conventional ASIC or COT chip, the NRE cost of developing the IAC chip 402 for the same or similar innovation and/or application used in the third type of logic drive 300 may be reduced by a factor of larger than 2, 5, 10, 20, or 30.

For interconnection, referring to FIG. 15C, one or more of the programmable or fixed interconnects 361 or 364 of the inter-chip interconnects 371 may couple from each of the standard commodity FPGA IC chips 200 to the IAC chip 402. One or more of the programmable or fixed interconnects 361 or 364 of the inter-chip interconnects 371 may couple from each of the DPIIC chips 410 to the IAC chip 402. One or more of the programmable or fixed interconnects 361 or 364 of the inter-chip interconnects 371 may couple from the IAC chip 402 to all of the dedicated input/output (I/O) chips 265. One or more of the programmable or fixed interconnects 361 or 364 of the inter-chip interconnects 371 may couple from the IAC chip 402 to the dedicated control chip 260. One or more of the programmable or fixed interconnects 361 or 364 of the inter-chip interconnects 371 may couple from the IAC chip 402 to both of the DRAM IC chips 321.

IV. Fourth Type of Logic Drive

Figure 15D:
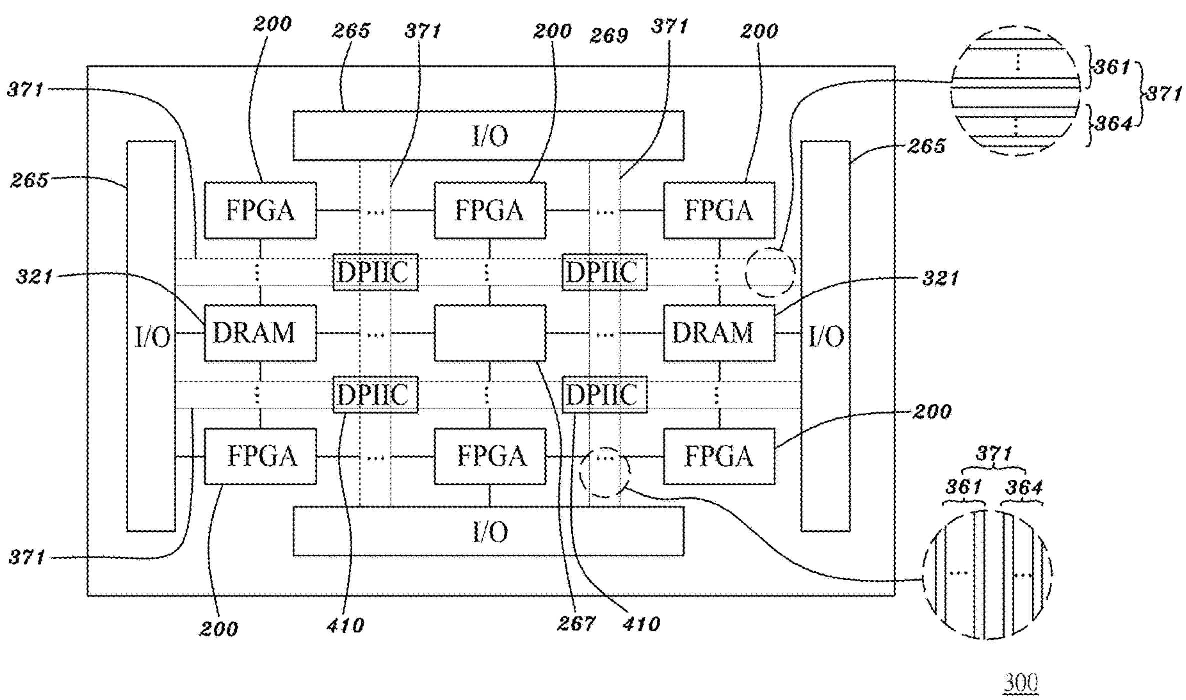

FIG. 15D is a schematically top view showing arrangement for various chips packaged in a fourth type of standard commodity logic drive in accordance with an embodiment of the present application. Referring to FIG. 15D, the functions of the dedicated control chip 260 and IAC chip 402 as seen in FIG. 15C may be incorporated into a single chip 267, i.e., dedicated control and IAC (abbreviated as DCIAC below) chip. The structure shown in FIG. 15D is similar to that shown in FIG. 15A but the difference therebetween is that the DCIAC chip 267 may be further provided to be packaged in the logic drive 300. The dedicated control chip 260 as seen in FIG. 15A may be replaced with the DCIAC chip 267 to be packaged at the place where the dedicated control chip 260 is arranged. For an element indicated by the same reference number shown in FIGS. 15A and 15D, the specification of the element as seen in FIG. 15D and the process for forming the same may be referred to that of the element as illustrated in FIG. 15A and the process for forming the same. The DCIAC chip 267 now comprises the control circuits, Intellectual Property (IP) circuits, Application Specific (AS) circuits, analog circuits, mixed-mode signal circuits, Radio-Frequency (RF) circuits, and/or transmitter, receiver, transceiver circuits, and etc.

Referring to FIG. 15D, each of the dedicated I/O chips 265 and DCIAC chip 267 is designed, implemented and fabricated using varieties of semiconductor technology nodes or generations, including old or matured technology nodes or generations, for example, less advanced than, equal to or more mature than 20 nm or 30 nm, and for example using the technology node of 22 nm, 28 nm, 40 nm, 90 nm, 130 nm, 180 nm, 250 nm, 350 nm or 500 nm. Packaged in the same logic drive 300, the semiconductor technology node or generation used in each of the dedicated I/O chips 265 and DCIAC chip 267 is 1, 2, 3, 4, 5 or greater than 5 nodes or generations older, more matured or less advanced than that used in each of the standard commodity FPGA IC chips 200 and DPIIC chips 410. Transistors or semiconductor devices used in the DCIAC chip 267 may be a FINFET, a FINFET on Silicon-On-Insulator (FINFET SOI), a Fully Depleted Silicon-on-insulator (FDSOI) MOSFET, a Partially Depleted Silicon-on-insulator (PDSOI) MOSFET or a conventional MOSFET. Packaged in the same logic drive 300, transistors or semiconductor devices used in each of the dedicated I/O chips 265 and DCIAC chip 267 may be different from that used in each of the standard commodity FPGA IC chips 200 and DPIIC chips 410; for example, packaged in the same logic drive 300, each of the dedicated I/O chips 265 and DCIAC chip 267 may use the conventional MOSFET, while each of the standard commodity FPGA IC chips 200 and DPIIC chips 410 may use the FINFET; alternatively, packaged in the same logic drive 300, each of the dedicated I/O chips 265 and DCIAC chip 267 may use the Fully Depleted Silicon-on-insulator (FD-SOI) MOSFET, while one of the standard commodity FPGA IC chips 200 and DPIIC chips 410 may use the FINFET.

Since the DCIAC chip 267 in this aspect of disclosure may be designed and fabricated using older or less advanced technology nodes or generations, for example, less advanced than, equal to or more mature than 20 nm or 30 nm, and for example using the technology node of 22 nm, 28 nm, 40 nm, 90 nm, 130 nm, 180 nm, 250 nm, 350 nm or 500 nm, its NRE cost is cheaper than or less than that of the current or conventional ASIC or COT chip designed and fabricated using an advanced IC technology node or generation, for example, more advanced than or below 20 nm or 10 nm, and for example using the technology node of 16 nm, 14 nm, 12 nm, 10 nm, 7 nm, 5 nm or 3 nm. The NRE cost for designing a current or conventional ASIC or COT chip using an advanced IC technology node or generation, for example, more advanced than or below 20 nm or 10 nm, may be more than US $5M, US $10M, US $20M or even exceeding US $50M, or US $100M. The cost of a photo mask set for an ASIC or COT chip at the 16 nm technology node or generation is over US $2M, US $5M or US $10M. Implementing the same or similar innovation and/or application using the fourth type of logic drive 300 including the DCIAC chip 267 designed and fabricated using older or less advanced technology nodes or generations may reduce NRE cost down to less than US $10M, US $7M, US $5M, US $3M or US $1M. Compared to the implementation by developing a current or conventional ASIC or COT chip, the NRE cost of developing the DCIAC chip 267 for the same or similar innovation and/or application used in the fourth type of logic drive 300 may be reduced by a factor of larger than 2, 5, 10, 20 or 30.

For interconnection, referring to FIG. 15D, one or more of the programmable or fixed interconnects 361 or 364 of the inter-chip interconnects 371 may couple from each of the standard commodity FPGA IC chips 200 to the DCIAC chip 267. One or more of the programmable or fixed interconnects 361 or 364 of the inter-chip interconnects 371 may couple from each of the DPIIC chips 410 to the DCIAC chip 267. One or more of the programmable or fixed interconnects 361 or 364 of the inter-chip interconnects 371 may couple from the DCIAC chip 267 to all of the dedicated input/output (I/O) chips 265. One or more of the programmable or fixed interconnects 361 or 364 of the inter-chip interconnects 371 may couple from the DCIAC chip 267 to both of the DRAM IC chips 321.

V. Fifth Type of Logic Drive

Figure 15E:
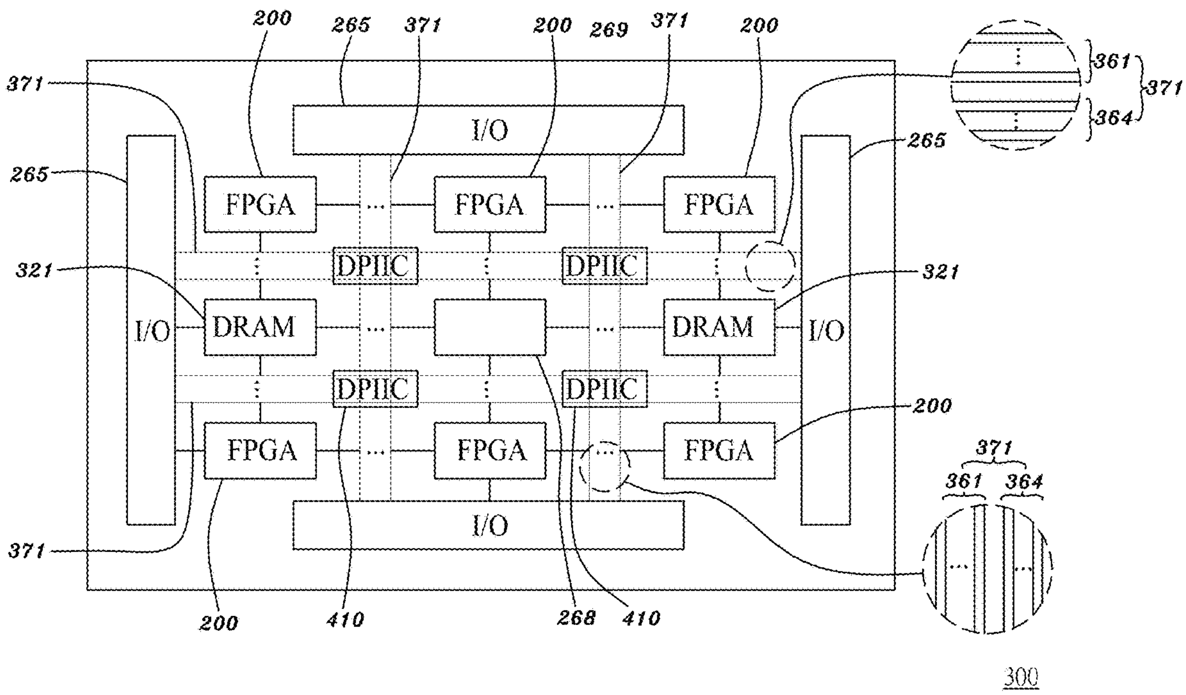

FIG. 15E is a schematically top view showing arrangement for various chips packaged in a fifth type of standard commodity logic drive in accordance with an embodiment of the present application. Referring to FIG. 15E, the functions of the dedicated control chip 260, dedicated I/O chips 265 and IAC chip 402 as seen in FIG. 15C may be incorporated into a single chip 268, i.e., dedicated control, dedicated I/O, and IAC (abbreviated as DCDI/OIAC below) chip. The structure shown in FIG. 15E is similar to that shown in FIG. 15A but the difference therebetween is that the DCDI/OIAC chip 268 may be further provided to be packaged in the logic drive 300. The dedicated control chip 260 as seen in FIG. 15A may be replaced with the DCDI/OIAC chip 268 to be packaged at the place where the dedicated control chip 260 is arranged. For an element indicated by the same reference number shown in FIGS. 15A and 15E, the specification of the element as seen in FIG. 15E and the process for forming the same may be referred to that of the element as illustrated in FIG. 15A and the process for forming the same. The DCDI/OIAC chip 268 may include the architecture as seen in FIG. 14. Further, the DCDI/OIAC chip 268 now comprises the control circuits, Intellectual Property (IP) circuits, Application Specific (AS) circuits, analog circuits, mixed-mode signal circuits, Radio-Frequency (RF) circuits, and/or transmitter, receiver, transceiver circuits, and etc.

Referring to FIG. 15E, the DCDI/OIAC chip 268 is designed, implemented and fabricated using varieties of semiconductor technology nodes or generations, including old or matured technology nodes or generations, for example, less advanced than, equal to or more mature than 20 nm or 30 nm, and for example using the technology node of 22 nm, 28 nm, 40 nm, 90 nm, 130 nm, 180 nm, 250 nm, 350 nm or 500 nm. Packaged in the same logic drive 300, the semiconductor technology node or generation used in the DCDI/OIAC chip 268 is 1, 2, 3, 4, 5 or greater than 5 nodes or generations older, more matured or less advanced than that used in each of the standard commodity FPGA IC chips 200 and DPIIC chips 410. Transistors or semiconductor devices used in the DCDI/OIAC chip 268 may be a FINFET, a FINFET on Silicon-On-Insulator (FINFET SOI), a Fully Depleted Silicon-on-insulator (FDSOI) MOSFET, a Partially Depleted Silicon-on-insulator (PDSOI) MOSFET or a conventional MOSFET. Packaged in the same logic drive 300, transistors or semiconductor devices used in the DCDI/OIAC chip 268 may be different from that used in each of the standard commodity FPGA IC chips 200 and DPIIC chips 410; for example, packaged in the same logic drive 300, the DCDI/OIAC chip 268 may use the conventional MOSFET, while each of the standard commodity FPGA IC chips 200 and DPIIC chips 410 may use the FINFET; alternatively, packaged in the same logic drive 300, the DCDI/OIAC chip 268 may use the Fully Depleted Silicon-on-insulator (FDSOI) MOSFET, while each of the standard commodity FPGA IC chips 200 and DPIIC chips 410 may use the FINFET.

Since the DCDI/OIAC chip 268 in this aspect of disclosure may be designed and fabricated using older or less advanced technology nodes or generations, for example, less advanced than, equal to or more mature than 20 nm or 30 nm, and for example using the technology node of 22 nm, 28 nm, 40 nm, 90 nm, 130 nm, 180 nm, 250 nm, 350 nm or 500 nm, its NRE cost is cheaper than or less than that of the current or conventional ASIC or COT chip designed and fabricated using an advanced IC technology node or generation, for example, a technology node or generation more advanced than or below 20 nm or 10 nm, and for example using the technology node of 16 nm, 14 nm, 12 nm, 10 nm, 7 nm, 5 nm or 3 nm. The NRE cost for designing an current or conventional ASIC or COT chip using an advanced IC technology node or generation, for example, a technology node or generation more advanced than or below 20 nm or 10 nm, may be more than US $5M, US $10M, US $20M or even exceeding US $50M, or US $100M. The cost of a photo mask set for an ASIC or COT chip at the 16 nm technology node or generation is over US $2M, US $5M or US $10M. Implementing the same or similar innovation and/or application using the fifth type of logic drive 300 including the DCDI/OIAC chip 268 designed and fabricated using older or less advanced technology nodes or generations, may reduce NRE cost down to less than US $10M, US $7M, US $5M, US $3M or US $1M. Compared to the implementation by developing a current or conventional ASIC or COT chip, the NRE cost of developing the DCDI/OIAC chip 268 for the same or similar innovation and/or application used in the fifth type of logic drive 300 may be reduced by a factor of larger than 2, 5, 10, 20 or 30.

For interconnection, referring to FIG. 15E, one or more of the programmable or fixed interconnects 361 or 364 of the inter-chip interconnects 371 may couple from each of the standard commodity FPGA IC chips 200 to the DCDI/OIAC chip 268. One or more of the programmable or fixed interconnects 361 or 364 of the inter-chip interconnects 371 may couple from each of the DPIIC chips 410 to the DCDI/OIAC chip 268. One or more of the programmable or fixed interconnects 361 or 364 of the inter-chip interconnects 371 may couple from the DCDI/OIAC chip 268 to all of the dedicated input/output (I/O) chips 265. One or more of the programmable or fixed interconnects 361 or 364 of the inter-chip interconnects 371 may couple from the DCDI/OIAC chip 268 to both of the DRAM IC chips 321.

VI. Sixth Type of Logic Drive

Figure 15F:
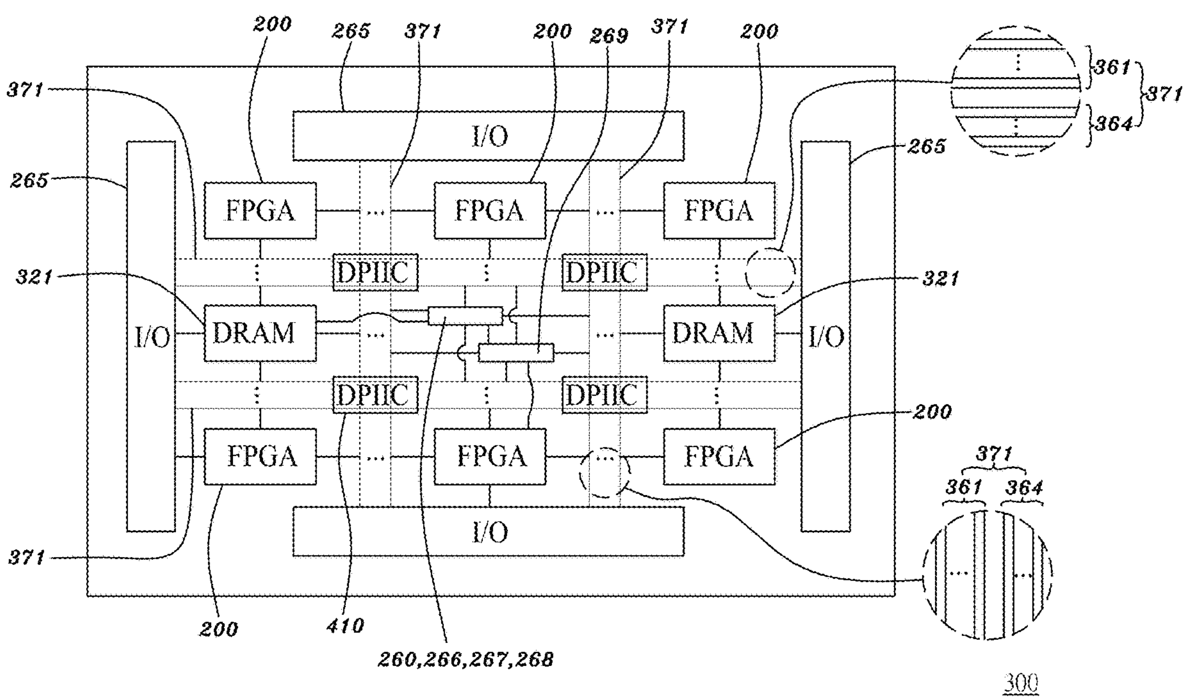
Figure 15G:
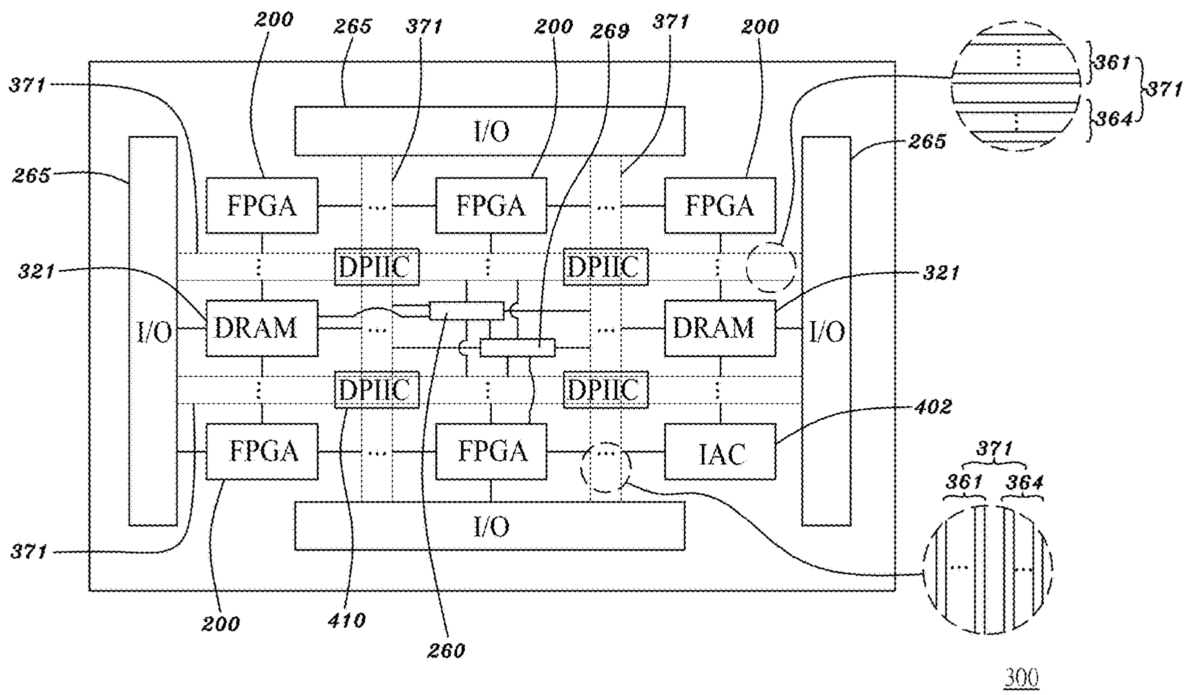

FIGS. 15F and 15G are schematically top views showing arrangement for various chips packaged in a sixth type of standard commodity logic drive in accordance with an embodiment of the present application. Referring to FIGS. 15F and 15G, the logic drive 300 as illustrated in FIGS. 15A-15E may further include a processing and/or computing (PC) IC chip 269, such as central processing unit (CPU) chip, graphic processing unit (GPU) chip, digital signal processing (DSP) chip, tensor processing unit (TPU) chip or application processing unit (APU) chip. The APU chip may be (1) a combination of CPU and DSP unit operating with each other, (2) a combination of CPU and GPU operating with each other, (3) a combination of GPU and DSP unit operating with each other, or (4) a combination of CPU, GPU and DSP unit operating with one another. The structure shown in FIG. 15F is similar to those shown in FIGS. 15A, 15B, 15D and 15E but the difference therebetween is that the PCIC chip 269 may be further provided to be packaged in the logic drive 300 and close to the dedicated control chip 260 for the scheme in FIG. 15A, the dedicated control and I/O chip 266 for the scheme in FIG. 15B, the DCIAC chip 267 for the scheme in FIG. 15D or the DCDI/OIAC chip 268 for the scheme in FIG. 15E. The structure shown in FIG. 15G is similar to that shown in FIG. 15C but the difference therebetween is that the PCIC chip 269 may be further provided to be packaged in the logic drive 300 and close to the dedicated control chip 260. For an element indicated by the same reference number shown in FIGS. 15A, 15B, 15D, 15E and 15F, the specification of the element as seen in FIG. 15F and the process for forming the same may be referred to that of the element as illustrated in FIGS. 15A, 15B, 15D and 15E and the process for forming the same. For an element indicated by the same reference number shown in FIGS. 15A, 15C and 15G, the specification of the element as seen in FIG. 15G and the process for forming the same may be referred to that of the element as illustrated in FIGS. 15A and 15C and the process for forming the same.

Referring to FIGS. 15F and 15G, in a center region between neighboring two of the vertical bundles of inter-chip interconnects 371 and between neighboring two of the horizontal bundles of inter-chip interconnects 371 may be arranged the PCIC chip 269 and one of the dedicated control chip 260, dedicated control and I/O chip 266, DCIAC chip 267 and DCDI/OIAC chip 268. For interconnection, referring to FIGS. 15F and 15G, one or more of the programmable or fixed interconnects 361 or 364 of the inter-chip interconnects 371 may couple from each of the standard commodity FPGA IC chips 200 to the PCIC chip 269. One or more of the programmable or fixed interconnects 361 or 364 of the inter-chip interconnects 371 may couple from each of the DPIIC chips 410 to the PCIC chip 269. One or more of the programmable or fixed interconnects 361 or 364 of the inter-chip interconnects 371 may couple from the PCIC chip 269 to all of the dedicated input/output (I/O) chips 265. One or more of the programmable or fixed interconnects 361 or 364 of the inter-chip interconnects 371 may couple from the PCIC chip 269 to the dedicated control chip 260, dedicated control and I/O chip 266, DCIAC chip 267 or DCDI/OIAC chip 268. One or more of the programmable or fixed interconnects 361 or 364 of the inter-chip interconnects 371 may couple from the PCIC chip 269 to both of the DRAM IC chips 321. One or more of the programmable or fixed interconnects 361 or 364 of the inter-chip interconnects 371 may couple from the PCIC chip 269 to the IAC chip 402 as seen in FIG. 15G. The PCIC chip 269 is designed, implemented and fabricated using an advanced semiconductor technology node or generation, for example more advanced than or equal to, or below or equal to 30 nm, 20 nm or 10 nm, and for example using the technology node of 28 nm, 22 nm, 16 nm, 14 nm, 12 nm, 10 nm, 7 nm, 5 nm or 3 nm, which may be the same as, one or two generation or node less advanced than or one or two generation or node more advanced than that used for each of the standard commodity FPGA IC chips 200 and DPIIC chips 410. Transistors or semiconductor devices used in the PCIC chip 269 may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET.

VII. Seventh Type of Logic Drive

Figure 15H:
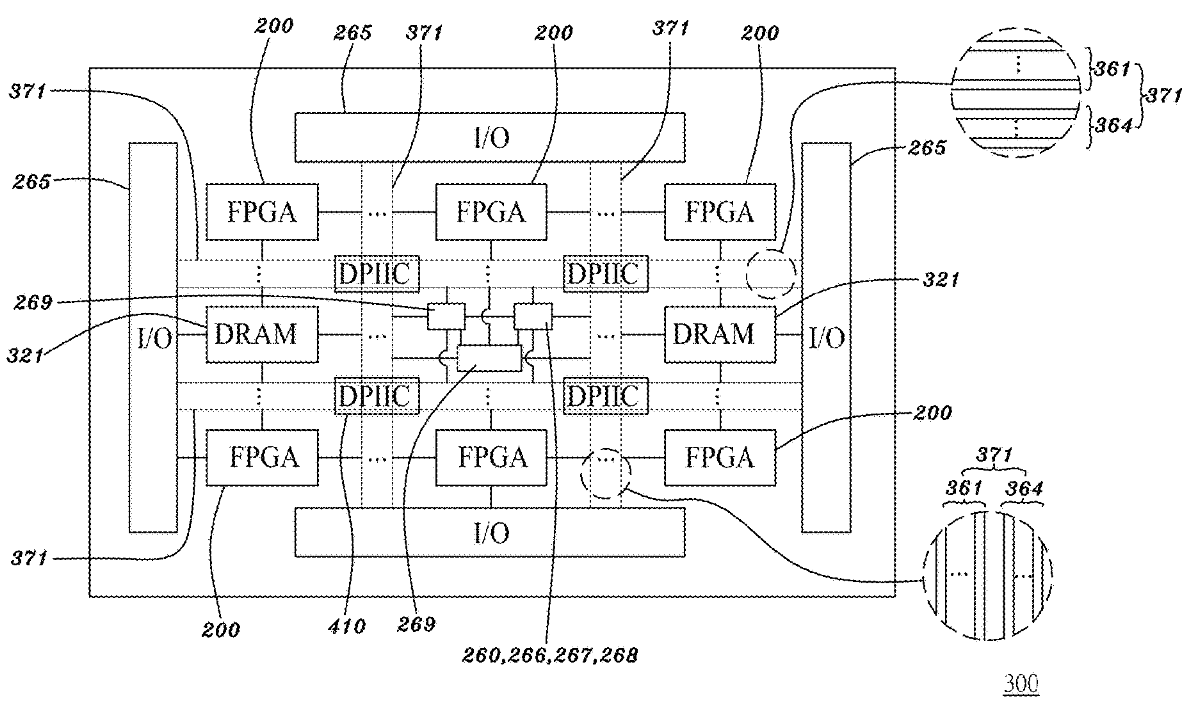
Figure 15I:
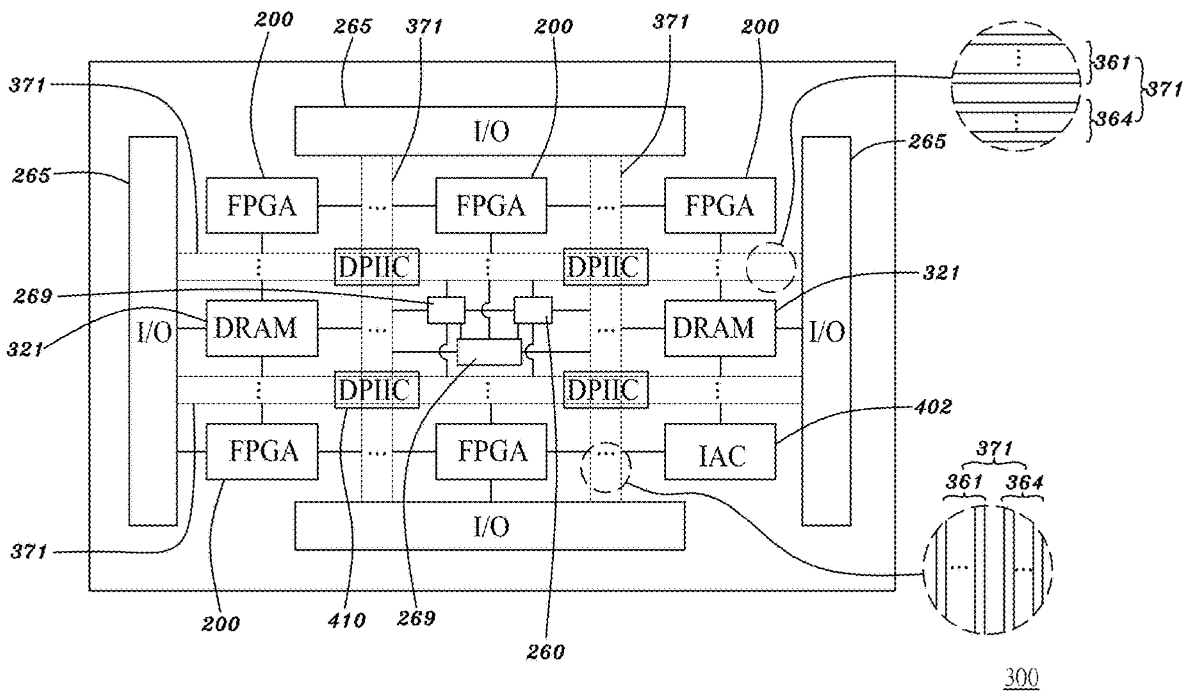

FIGS. 15H and 15I are schematically top views showing arrangement for various chips packaged in a seventh type of standard commodity logic drive in accordance with an embodiment of the present application. Referring to FIGS. 15H and 15I, the logic drive 300 as illustrated in FIGS. 15A-15E may further include two PCIC chips 269, a combination of which may be two selected from a central processing unit (CPU) chip, graphic processing unit (GPU) chip, digital signal processing (DSP) chip and tensor processing unit (TPU) chip. For example, (1) one of the two PCIC chips 269 may be a central processing unit (CPU) chip, and the other one of the two PCIC chips 269 may be a graphic processing unit (GPU) chip; (2) one of the two PCIC chips 269 may be a central processing unit (CPU) chip, and the other one of the two PCIC chips 269 may be a digital signal processing (DSP) chip; (3) one of the two PCIC chips 269 may be a central processing unit (CPU) chip, and the other one of the two PCIC chips 269 may be a tensor processing unit (TPU) chip; (4) one of the two PCIC chips 269 may be a graphic processing unit (GPU) chip, and the other one of the two PCIC chips 269 may be a digital signal processing (DSP) chip; (5) one of the two PCIC chips 269 may be a graphic processing unit (GPU) chip, and the other one of the two PCIC chips 269 may be a tensor processing unit (TPU) chip; (6) one of the two PCIC chips 269 may be a digital signal processing (DSP) chip, and the other one of the two PCIC chips 269 may be a tensor processing unit (TPU) chip. The structure shown in FIG. 15H is similar to those shown in FIGS. 15A, 15B, 15D and 15E but the difference therebetween is that the two PCIC chips 269 may be further provided to be packaged in the logic drive 300 and close to the dedicated control chip 260 for the scheme in FIG. 15A, the dedicated control and I/O chip 266 for the scheme in FIG. 15B, the DCIAC chip 267 for the scheme in FIG. 15D or the DCDI/OIAC chip 268 for the scheme in FIG. 15E. The structure shown in FIG. 15I is similar to that shown in FIG. 15C but the difference therebetween is that the two PCIC chips 269 may be further provided to be packaged in the logic drive 300 and close to the dedicated control chip 260. For an element indicated by the same reference number shown in FIGS. 15A, 15B, 15D, 15E and 15H, the specification of the element as seen in FIG. 15H and the process for forming the same may be referred to that of the element as illustrated in FIGS. 15A, 15B, 15D and 15E and the process for forming the same. For an element indicated by the same reference number shown in FIGS. 15A, 15C and 15I, the specification of the element as seen in FIG. 15I and the process for forming the same may be referred to that of the element as illustrated in FIGS. 15A and 15C and the process for forming the same.

Referring to FIGS. 15H and 15I, in a center region between neighboring two of the vertical bundles of inter-chip interconnects 371 and between neighboring two of the horizontal bundles of inter-chip interconnects 371 may be arranged the two PCIC chips 269 and one of the dedicated control chip 260, dedicated control and I/O chip 266, DCIAC chip 267 and DCDI/OIAC chip 268. For interconnection, referring to FIGS. 15H and 15I, one or more of the programmable or fixed interconnects 361 and 364 of the inter-chip interconnects 371 may couple from each of the standard commodity FPGA IC chips 200 to both of the PCIC chips 269. One or more of the programmable or fixed interconnects 361 or 364 of the inter-chip interconnects 371 may couple from each of the DPIIC chips 410 to both of the PCIC chips 269. One or more of the programmable or fixed interconnects 361 or 364 of the inter-chip interconnects 371 may couple from each of the PCIC chips 269 to all of the dedicated input/output (I/O) chips 265. One or more of the programmable or fixed interconnects 361 or 364 of the inter-chip interconnects 371 may couple from each of the PCIC chips 269 to the dedicated control chip 260, dedicated control and I/O chip 266, DCIAC chip 267 or DCDI/OIAC chip 268. One or more of the programmable or fixed interconnects 361 or 364 of the inter-chip interconnects 371 may couple from each of the PCIC chips 269 to both of the DRAM IC chips 321. One or more of the programmable or fixed interconnects 361 or 364 of the inter-chip interconnects 371 may couple from each of the PCIC chips 269 to the other of the PCIC chips 269. One or more of the programmable or fixed interconnects 361 or 364 of the inter-chip interconnects 371 may couple from each of the PCIC chips 269 to the IAC chip 402 as seen in FIG. 15G. Each of the PCIC chips 269 is designed, implemented and fabricated using an advanced semiconductor technology node or generation, for example more advanced than or equal to, or below or equal to 30 nm, 20 nm or 10 nm, and for example using the technology node of 28 nm, 22 nm, 16 nm, 14 nm, 12 nm, 10 nm, 7 nm, 5 nm or 3 nm, which may be the same as, one or two generation or node less advanced than or one or two generation or node more advanced than that used for each of the standard commodity FPGA IC chips 200 and DPIIC chips 410. Transistors or semiconductor devices used in each of the PCIC chips 269 may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET.

VIII. Eighth Type of Logic Drive

Figure 15J:
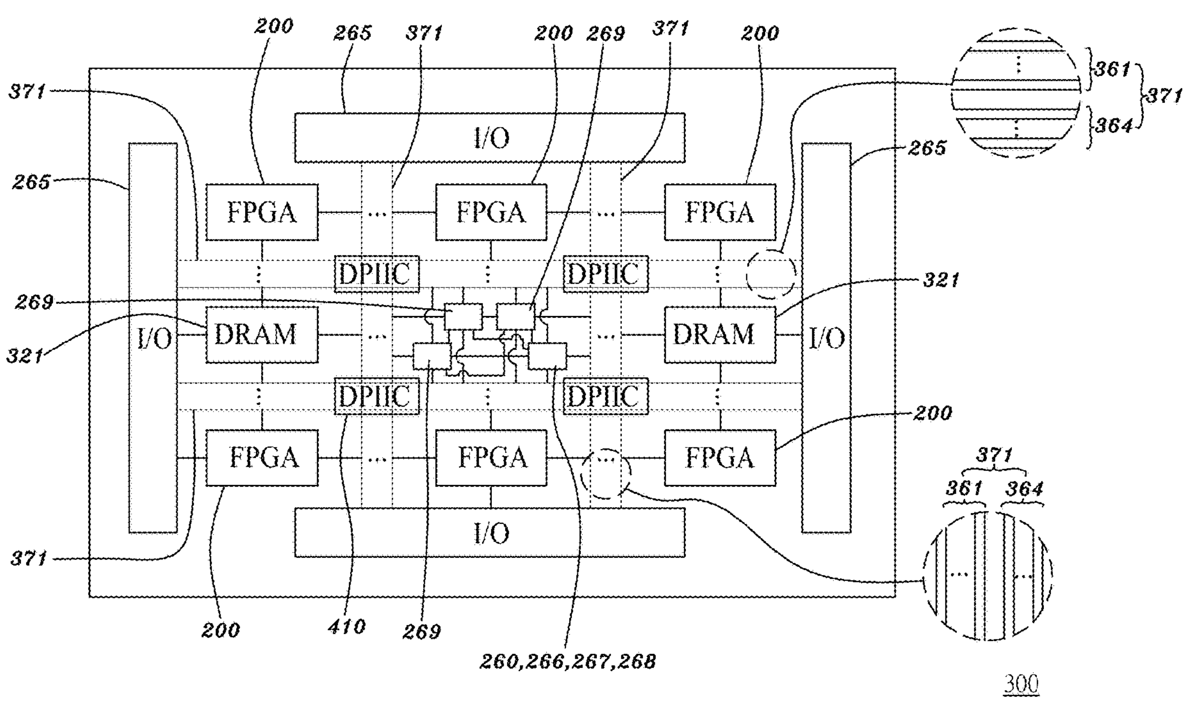
Figure 15K:
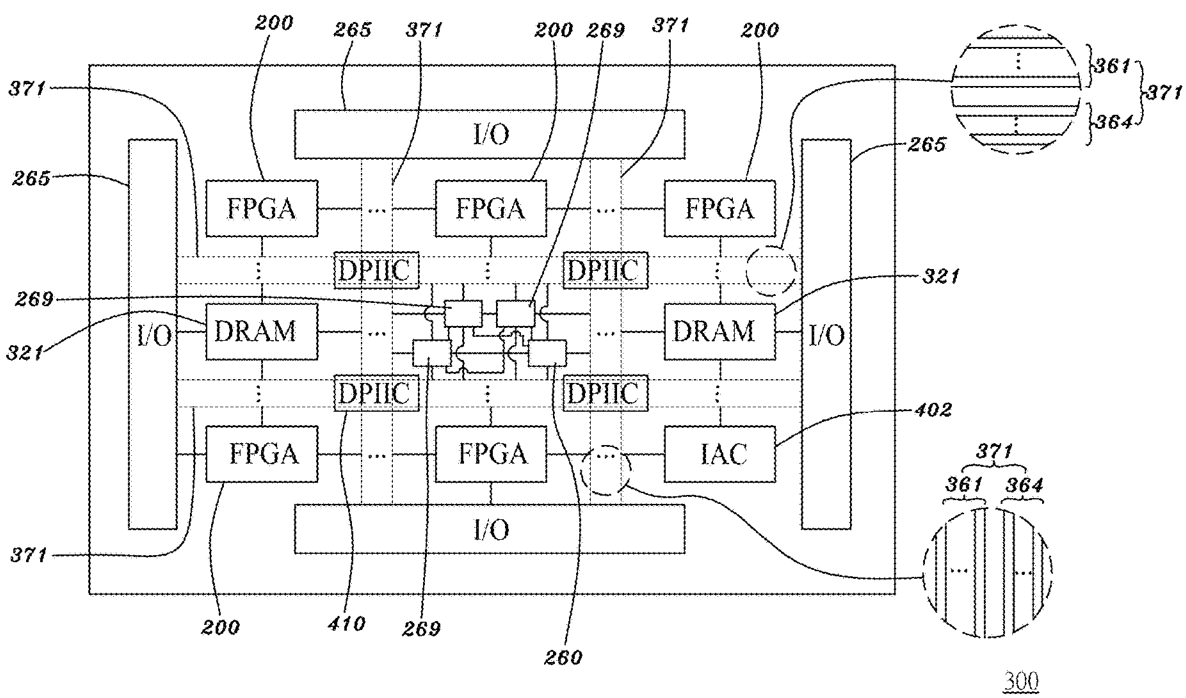

FIGS. 15J and 15K are schematically top views showing arrangement for various chips packaged in an eighth type of standard commodity logic drive in accordance with an embodiment of the present application. Referring to FIGS. 15J and 15K, the logic drive 300 as illustrated in FIGS. 15A-15E may further include three PCIC chips 269, a combination of which may be three selected from a central processing unit (CPU) chip, graphic processing unit (GPU) chip, digital signal processing (DSP) chip or tensor processing unit (TPU) chip. For example, (1) one of the three PCIC chips 269 may be a central processing unit (CPU) chip, another one of the three PCIC chips 269 may be a graphic processing unit (GPU) chip, the other one of the three PCIC chips 269 may be a digital signal processing (DSP) chip; (2) one of the three PCIC chips 269 may be a central processing unit (CPU) chip, another one of the three PCIC chips 269 may be a graphic processing unit (GPU) chip, the other one of the three PCIC chips 269 may be a tensor processing unit (TPU) chip; (3) one of the three PCIC chips 269 may be a central processing unit (CPU) chip, another one of the three PCIC chips 269 may be a digital signal processing (DSP) chip, the other one of the three PCIC chips 269 may be a tensor processing unit (TPU) chip; (4) one of the three PCIC chips 269 may be a graphic processing unit (GPU) chip, another one of the three PCIC chips 269 may be a digital signal processing (DSP) chip, the other one of the three PCIC chips 269 may be a tensor processing unit (TPU) chip. The structure shown in FIG. 15J is similar to those shown in FIGS. 15A, 15B, 15D and 15E but the difference therebetween is that the three PCIC chips 269 may be further provided to be packaged in the logic drive 300 and close to the dedicated control chip 260 for the scheme in FIG. 15A, the dedicated control and I/O chip 266 for the scheme in FIG. 15B, the DCIAC chip 267 for the scheme in FIG. 15D or the DCDI/OIAC chip 268 for the scheme in FIG. 15E. The structure shown in FIG. 15K is similar to that shown in FIG. 15C but the difference therebetween is that the three PCIC chips 269 may be further provided to be packaged in the logic drive 300 and close to the dedicated control chip 260. For an element indicated by the same reference number shown in FIGS. 15A, 15B, 15D, 15E and 15J, the specification of the element as seen in FIG. 15J and the process for forming the same may be referred to that of the element as illustrated in FIGS. 15A, 15B, 15D and 15E and the process for forming the same. For an element indicated by the same reference number shown in FIGS. 15A, 15C and 15K, the specification of the element as seen in FIG. 15K and the process for forming the same may be referred to that of the element as illustrated in FIGS. 15A and 15C and the process for forming the same.

Referring to FIGS. 15J and 15K, in a center region between neighboring two of the vertical bundles of inter-chip interconnects 371 and between neighboring two of the horizontal bundles of inter-chip interconnects 371 may be arranged the three PCIC chips 269 and one of the dedicated control chip 260, dedicated control and I/O chip 266, DCIAC chip 267 and DCDI/OIAC chip 268. For interconnection, referring to FIGS. 15J and 15K, one or more of the programmable or fixed interconnects 361 or 364 of the inter-chip interconnects 371 may couple from each of the standard commodity FPGA IC chips 200 to all of the PCIC chips 269. One or more of the programmable or fixed interconnects 361 or 364 of the inter-chip interconnects 371 may couple from each of the DPIIC chips 410 to all of the PCIC chips 269. One or more of the programmable or fixed interconnects 361 or 364 of the inter-chip interconnects 371 may couple from each of the PCIC chips 269 to all of the dedicated input/output (I/O) chips 265. One or more of the programmable or fixed interconnects 361 or 364 of the inter-chip interconnects 371 may couple from each of the PCIC chips 269 to the dedicated control chip 260, dedicated control and I/O chip 266, DCIAC chip 267 or DCDI/OIAC chip 268. One or more of the programmable or fixed interconnects 361 or 364 of the inter-chip interconnects 371 may couple from each of the PCIC chips 269 to both of the DRAM IC chips 321. One or more of the programmable or fixed interconnects 361 or 364 of the inter-chip interconnects 371 may couple from each of the PCIC chips 269 to the other two of the PCIC chips 269. One or more of the programmable or fixed interconnects 361 or 364 of the inter-chip interconnects 371 may couple from each of the PCIC chips 269 to the IAC chip 402 as seen in FIG. 15G. Each of the PCIC chips 269 is designed, implemented and fabricated using an advanced semiconductor technology node or generation, for example more advanced than or equal to, or below or equal to 30 nm, 20 nm or 10 nm, and for example using the technology node of 28 nm, 22 nm, 16 nm, 14 nm, 12 nm, 10 nm, 7 nm, 5 nm or 3 nm, which may be the same as, one or two generation or node less advanced than or one or two generation or node more advanced than that used for each of the standard commodity FPGA IC chips 200 and DPIIC chips 410. Transistors or semiconductor devices used in each of the PCIC chips 269 may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET.

IX. Ninth Type of Logic Drive

Figure 15L:
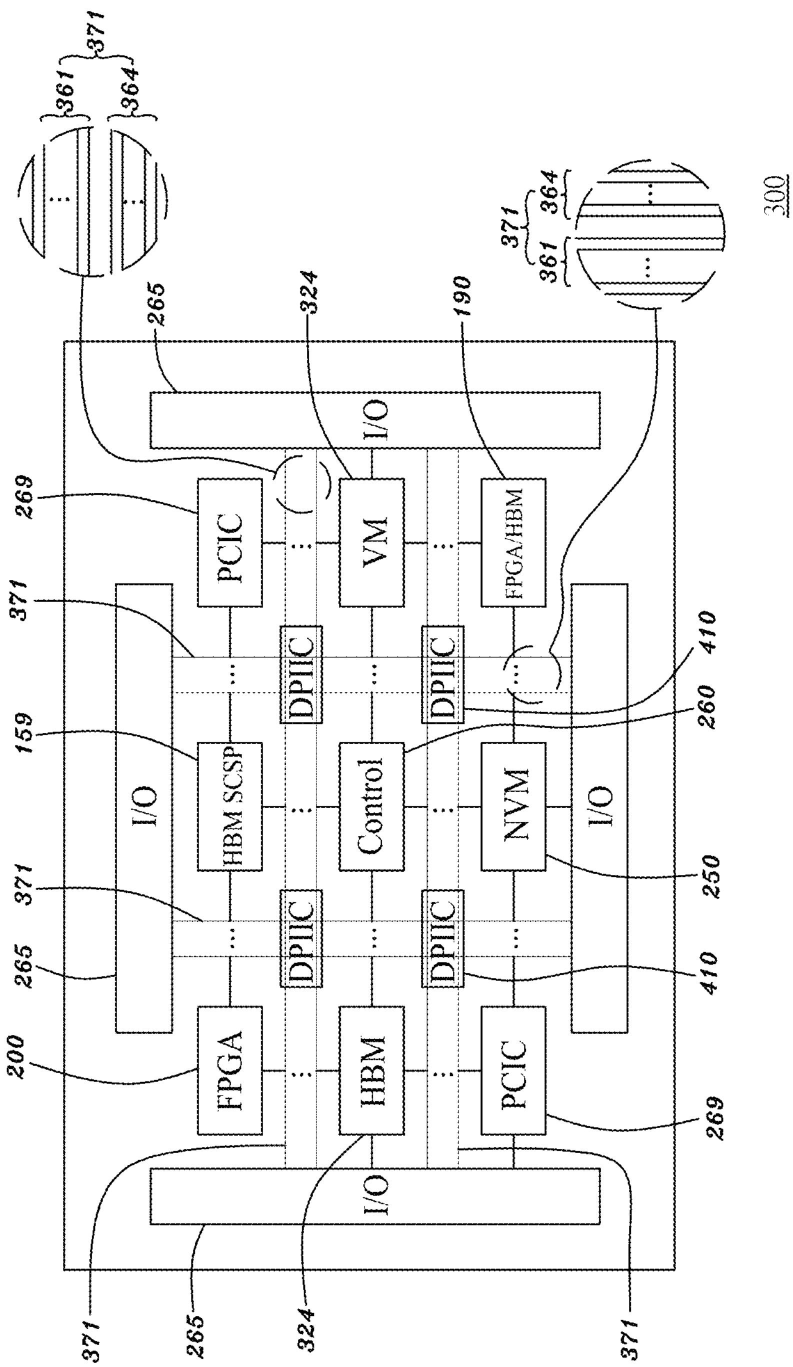
Figure 23:
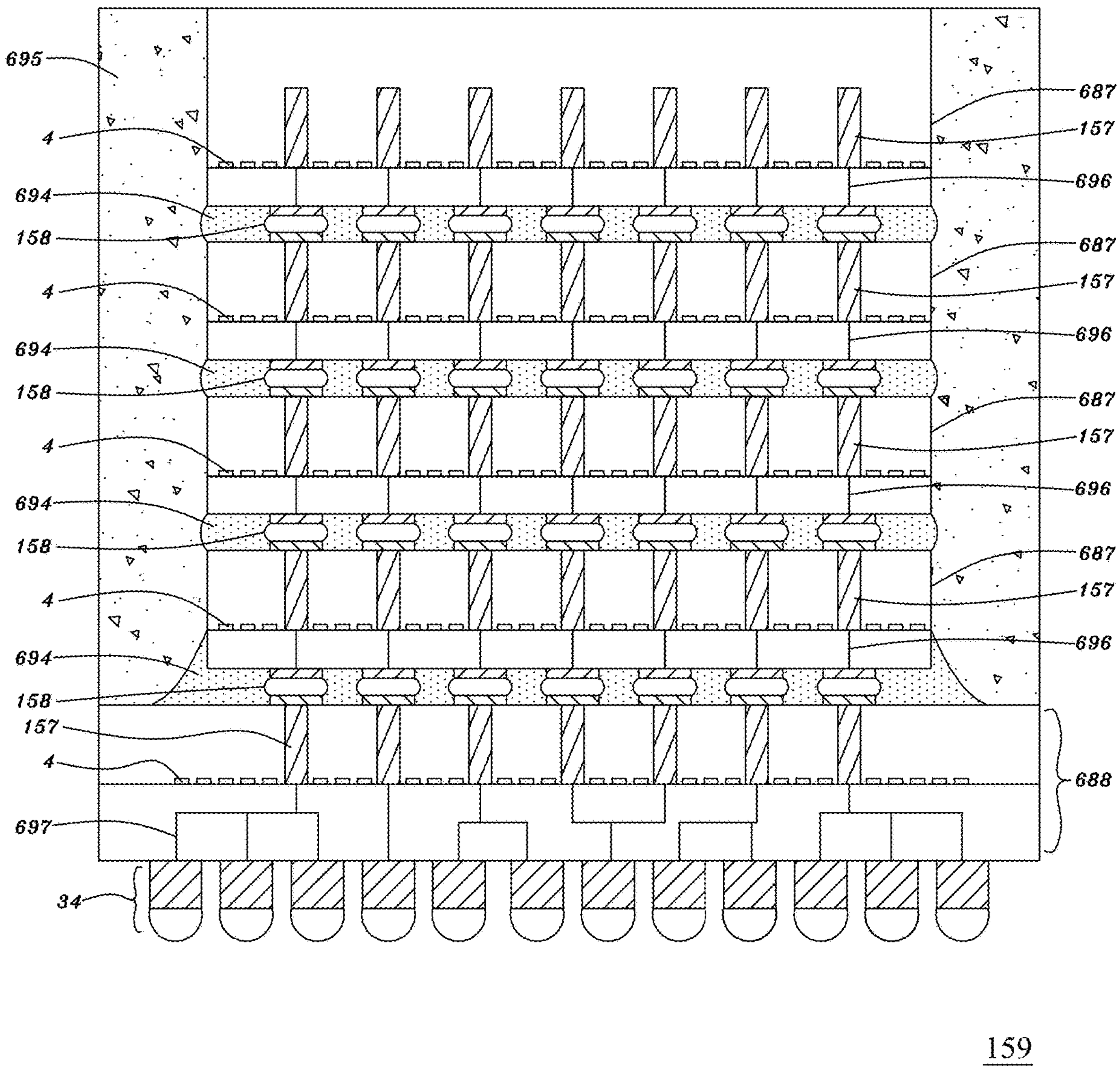
FIG. 23 is a schematically cross-sectional view showing a memory module in accordance with the present application.

FIG. 15L is a schematically top view showing arrangement for various chips packaged in a ninth type of standard commodity logic drive in accordance with an embodiment of the present application. For an element indicated by the same reference number shown in FIGS. 15A-15L, the specification of the element as seen in FIG. 15L and the process for forming the same may be referred to that of the element as illustrated in FIGS. 15A-15K and the process for forming the same. Referring to FIG. 15L, a ninth type of standard commodity logic drive 300 may be packaged with one or more processing and/or computing (PC) integrated circuit (IC) chips 269, one or more standard commodity FPGA IC chips 200 as illustrated in FIGS. 12A-12N, one or more non-volatile memory (NVM) IC chips 250, one or more volatile memory (VM) integrated circuit (IC) chips 324, one or more high speed, high bandwidth memory (HBM) IC chips 251, a dedicated control chip 260, one or more memory modules 159 as seen in FIG. 23 and one or more operation modules 190 as seen in FIG. 24G, which are arranged in an array, wherein the dedicated control chip 260 may be arranged in a center region surrounded by the PCIC chips 269, standard commodity FPGA IC chips 200, NVM IC chips 250 and VMIC chips 324. The combination for the PCIC chips 269 may comprise: (1) multiple GPU chips, for example 2, 3, 4 or more than 4 GPU chips, (2) one or more CPU chips and/or one or more GPU chips, (3) one or more CPU chips and/or one or more DSP chips, (4) one or more CPU chips, one or more GPU chips and/or one or more DSP chips, (5) one or more CPU chips and/or one or more TPU chips, or (6) one or more CPU chips, one or more DSP chips and/or one or more TPU chips. Each of the HBM IC chips 251 may be a high speed, high bandwidth, wide bitwidth DRAM IC chip, high speed, high bandwidth, wide bitwidth cache SRAM chip, high speed, high bandwidth, wide bitwidth NVM chip, high speed, high bandwidth, wide bitwidth magnetoresistive random-access-memory (MRAM) chip or high speed, high bandwidth, wide bitwidth resistive random-access-memory (RRAM) chip. The PCIC chips 269 and standard commodity FPGA IC chips 200 may operate with the HBM IC chips 251 for high speed, high bandwidth, wide bitwidth parallel processing and/or parallel computing.

Referring to FIG. 15L, the logic drive 300 may include the inter-chip interconnects 371 each extending under spaces between neighboring two of the standard commodity FPGA IC chip 200, NVM IC chip 250, VMIC chip 324, dedicated control chip 260, PCIC chips 269 and HBMIC chip 251. The logic drive 300 may include a plurality of the DPIIC chip 410 aligned with a cross of a vertical bundle of inter-chip interconnects 371 and a horizontal bundle of inter-chip interconnects 371. Each of the DPIIC chips 410 is at corners of four of the standard commodity FPGA IC chip 200, NVM IC chip 250, VMIC chip 324, dedicated control chip 260, PCIC chips 269, HBMIC chips 251, memory module 159 and operation module 190 around said each of the DPIIC chips 410. Each of the inter-chip interconnects 371 may be the programmable or fixed interconnect 361 or 364 as mentioned above in the sections of "Specification for Programmable Interconnect" and "Specification for Fixed Interconnect". Signal transmission may be built (1) between one of the programmable interconnects 361 of the inter-chip interconnects 371 and one of the programmable interconnects 361 of the intra-chip interconnects 371 of one of the standard commodity FPGA IC chips 200, e.g., one in a single-die type or one in a operation module 190 as seen in FIG. 24G, via one of the small input/output (I/O) circuits 203 of said one of the standard commodity FPGA IC chips 200 and (2) between one of the programmable interconnects 361 of the inter-chip interconnects 371 and one of the programmable interconnects 361 of the intra-chip interconnects of one of the DPIIC chips 410 via one of the small input/output (I/O) circuits 203 of said one of the DPIIC chips 410. Signal transmission may be built (1) between one of the fixed interconnects 364 of the inter-chip interconnects 371 and one of the fixed interconnects 364 of the intra-chip interconnects 502 of one of the standard commodity FPGA IC chips 200, e.g., one in a single-die type or one in a operation module 190 as seen in FIG. 24G, via one of the small input/output (I/O) circuits 203 of said one of the standard commodity FPGA IC chips 200, (2) between one of the fixed interconnects 364 of the inter-chip interconnects 371 and one of the fixed interconnects 364 of the intra-chip interconnects of one of the DPIIC chips 410 via one of the small input/output (I/O) circuits 203 of said one of the DPIIC chips 410.

Referring to FIG. 15L, one or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to all of the DPIIC chips 410. One or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to the dedicated control chip 260. One or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to the NVM IC chip 250. One or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to the VMIC chip 324. One or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to all of the PCIC chips 269. One or more of the programmable or fixed interconnects 361 or 364 of the inter-chip interconnects 371 may couple from one of the standard commodity FPGA IC chips 200, e.g., one in a single-die type, to the HBMIC chip 251 next to said one of the standard commodity FPGA IC chips 200 and the communication between said one of the standard commodity FPGA IC chips 200 and the HBMIC chip 251 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from one of the standard commodity FPGA IC chips 200, e.g. one in a single-die type, to one of memory chips 687 of the memory module 159 as seen in FIG. 23 next to said one of the standard commodity FPGA IC chips 200 and the communication between said one of the standard commodity FPGA IC chips 200 and said one of memory chips 687 of the memory module 159 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from each of the DPIIC chips 410 to the dedicated control chip 260. One or more of the programmable or fixed interconnects 361 or 364 of the inter-chip interconnects 371 may couple from each of the DPIIC chips 410 to the NVM IC chips 250. One or more of the programmable or fixed interconnects 361 or 364 of the inter-chip interconnects 371 may couple from each of the DPIIC chips 410 to the VMIC chip 324. One or more of the programmable or fixed interconnects 361 or 364 of the inter-chip interconnects 371 may couple from each of the DPIIC chips 410 to all of the PCIC chips 269. One or more of the programmable or fixed interconnects 361 or 364 of the inter-chip interconnects 371 may couple from each of the DPIIC chips 410 to the HBMIC chip 251. One or more of the programmable or fixed interconnects 361 or 364 of the inter-chip interconnects 371 may couple from each of the DPIIC chips 410 to the others of the DPIIC chips 410. One or more of the programmable or fixed interconnects 361 or 364 of the inter-chip interconnects 371 may couple from one of the PCIC chips 269 to the HBMIC chip 251 next to said one of the PCIC chips 269 and the communication between said one of the PCIC chips 269 and the HBMIC chip 251 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from one of the PCIC chips 269 to one of memory chips 687 of the memory module 159 as seen in FIG. 23 next to said one of the PCIC chips 269 and the communication between said one of the PCIC chips 269 and said one of memory chips 687 of the memory module 159 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from each of the PCIC chips 269 to the dedicated control chip 260. One or more of the programmable or fixed interconnects 361 or 364 of the inter-chip interconnects 371 may couple from each of the PCIC chips 269 to the NVM IC chip 250. One or more of the programmable or fixed interconnects 361 or 364 of the inter-chip interconnects 371 may couple from each of the PCIC chips 269 to the VMIC chip 324. One or more of the programmable or fixed interconnects 361 or 364 of the inter-chip interconnects 371 may couple from the NVM IC chip 250 to the dedicated control chip 260. One or more of the programmable or fixed interconnects 361 or 364 of the inter-chip interconnects 371 may couple from the NVM IC chip 250 to the VMIC chip 324. One or more of the programmable or fixed interconnects 361 or 364 of the inter-chip interconnects 371 may couple from the NVM IC chip 250 to the HBMIC chip 251. One or more of the programmable or fixed interconnects 361 or 364 of the inter-chip interconnects 371 may couple from the VMIC chip 324 to the dedicated control chip 260. One or more of the programmable or fixed interconnects 361 or 364 of the inter-chip interconnects 371 may couple from the VMIC chip 324 to the HBMIC chip 251. One or more of the programmable or fixed interconnects 361 or 364 of the inter-chip interconnects 371 may couple from the HBMIC chip 251 to the dedicated control chip 260. One or more of the programmable or fixed interconnects 361 or 364 of the inter-chip interconnects 371 may couple from each of the PCIC chips 269 to all the others of the PCIC chips 269.

Referring to FIG. 15L, the logic drive 300 may include multiple dedicated input/output (I/O) chips 265 in a peripheral region thereof surrounding a central region thereof having the standard commodity FPGA IC chip 200, NVM IC chip 250, VMIC chip 321, dedicated control chip 260, PCIC chips 269, HBMIC chip 251, DPIIC chips 410, memory module 159 and operation module 190 located therein. One or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to all of the dedicated input/output (I/O) chips 265. One or more of the programmable or fixed interconnects 361 or 364 of the inter-chip interconnects 371 may couple from each of the DPIIC chips 410 to all of the dedicated input/output (I/O) chips 265. One or more of the programmable or fixed interconnects 361 or 364 of the inter-chip interconnects 371 may couple from the NVM IC chip 250 to all of the dedicated input/output (I/O) chips 265. One or more of the programmable or fixed interconnects 361 or 364 of the inter-chip interconnects 371 may couple from the VMIC chip 321 to all of the dedicated input/output (I/O) chips 265. One or more of the programmable or fixed interconnects 361 or 364 of the inter-chip interconnects 371 may couple from the dedicated control chip 260 to all of the dedicated input/output (I/O) chips 265. One or more of the programmable or fixed interconnects 361 or 364 of the inter-chip interconnects 371 may couple from each of the PCIC chips 269 to all of the dedicated input/output (I/O) chips 265. One or more of the programmable or fixed interconnects 361 or 364 of the inter-chip interconnects 371 may couple from the HBMIC chip 251 to all of the dedicated input/output (I/O) chips 265. One or more of the programmable or fixed interconnects 361 or 364 of the inter-chip interconnects 371 may couple from each of the dedicated input/output (I/O) chips 265 to the others of the dedicated input/output (I/O) chips 265. One or more of the programmable or fixed interconnects 361 or 364 of the inter-chip interconnects 371 may couple from the memory module 159 to all of the dedicated input/output (I/O) chips 265.

Referring to FIG. 15L, the standard commodity FPGA IC chip 200 may be referred to one as illustrated in FIGS. 12A-12N, and each of the DPIIC chips 410 may be referred to one as illustrated in FIG. 13. The specification of the commodity standard FPGA IC chip 200, DPIIC chips 410, dedicated I/O chips 265 and dedicated control chip 260 may be referred to that as illustrated in FIG. 15A.

For example, referring to FIG. 15L, all of the PCIC chips 269 in the logic drive 300 may be GPU chips, for example 2, 3, 4 or more than 4 GPU chips and the HBM IC chip 251 in the logic drive 300 may be a high speed, high bandwidth, wide bitwidth DRAM IC chip, high speed, high bandwidth, wide bitwidth cache SRAM chip, magnetoresistive random-access-memory (MRAM) chip or resistive random-access-memory (RRAM) chip. The communication between one of the PCIC chips 269, i.e., GPU chips, and the HBM IC chip 251 may have a data bit width of equal to or greater than 64, 128, 256, 512, 1024, 2048, 4096, 8K, or 16K.

For example, referring to FIG. 15L, all of the PCIC chips 269 in the logic drive 300 may be TPU chips, for example 2, 3, 4 or more than 4 TPU chips and the HBM IC chip 251 in the logic drive 300 may be a high speed, high bandwidth, wide bitwidth DRAM IC chip, high speed, high bandwidth, wide bitwidth cache SRAM chip, magnetoresistive random-access-memory (MRAM) chip or resistive random-access-memory (RRAM) chip. The communication between one of the PCIC chips 269, i.e., TPU chips, and the HBM IC chip 251 may have a data bit width of equal to or greater than 64, 128, 256, 512, 1024, 2048, 4096, 8K, or 16K.

Referring to FIG. 15L, the NVM IC chip 250 may be designed and fabricated using advanced NAND flash technology nodes or generations, for example, more advanced than or smaller than or equal to 40 nm, 28 nm, 20 nm, 16 nm or 10 nm, wherein the advanced NAND flash technology may comprise Single Level Cells (SLC) or multiple level cells (MLC) (for example, Double Level Cells DLC, or triple Level cells TLC), and in a 2D-NAND or a 3D NAND structure. The 3D NAND structure may comprise multiple stacked layers or levels of NAND cells, for example, greater than or equal to 4, 8, 16, 32 stacked layers or levels of NAND cells. Accordingly, the standard commodity logic drive 300 may have a standard non-volatile memory density, capacity or size of greater than or equal to 8 MB, 64 MB, 128 MB, 512 MB, 1 GB, 4 GB, 16 GB, 64 GB, 256 GB, or 512 GB, wherein "B" is bytes, each byte has 8 bits.

X. Tenth Type of Logic Drive

Figure 15M:
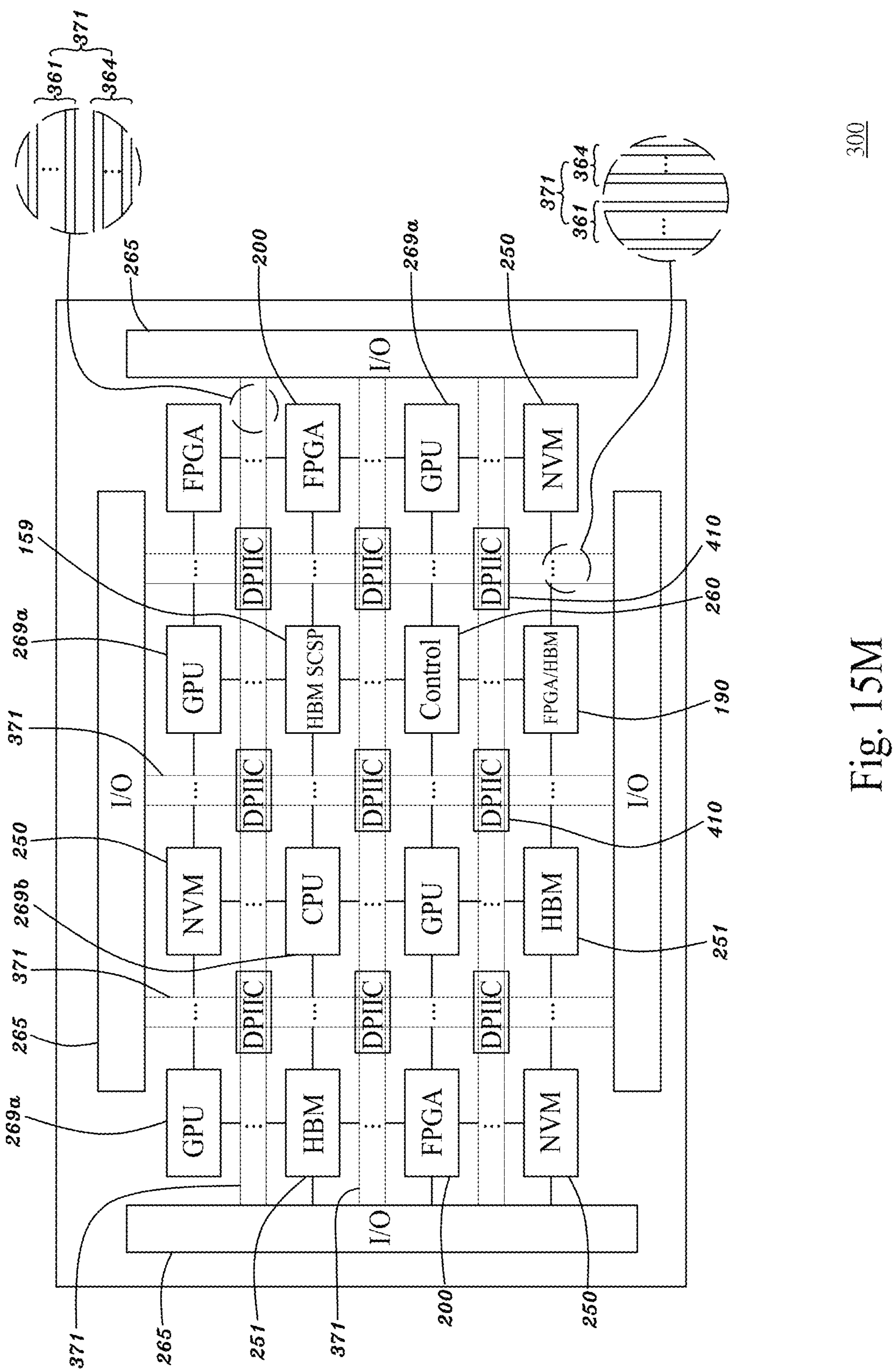

FIG. 15M is a schematically top view showing arrangement for various chips packaged in a tenth type of standard commodity logic drive in accordance with an embodiment of the present application. For an element indicated by the same reference number shown in FIGS. 15A-15M, the specification of the element as seen in FIG. 15M and the process for forming the same may be referred to that of the element as illustrated in FIGS. 15A-15L and the process for forming the same. Referring to FIG. 15M, the logic drive 300 may be packaged with multiple GPU chips 269*a* and a CPU chip 269*b* for the PCIC chips 269 as above mentioned. Further, the logic drive 300 may be packaged with multiple HBMIC chips 251 each arranged next to one of the GPU chips 269*a* for communication with said one of the GPU chips 269*a* in a high speed, high bandwidth and wide bitwidth. Each of the HBM IC chips 251 in the logic drive 300 may be a high speed, high bandwidth, wide bitwidth DRAM IC chip, high speed, high bandwidth, wide bitwidth cache SRAM chip, high speed, high bandwidth, wide bitwidth magnetoresistive random-access-memory (MRAM) chip or high speed, high bandwidth, wide bitwidth resistive random-access-memory (RRAM) chip. The logic drive 300 may be further packaged with a plurality of the standard commodity FPGA IC chip 200, including one in a single-die type and one in a operation module 190 as seen in FIG. 24G, and one or more of the NVM IC chips 250 configured to store the resulting values or programming codes in a non-volatile manner for programming the programmable logic blocks 201 or cross-point switches 379 of the standard commodity FPGA IC chips 200 and for programming the cross-point switches 379 of the DPIIC chips 410. The logic drive 300 may be further packaged with a memory module 159 as illustrated in FIG. 23 configured to have one of the GPU chips 269*a* and CPU chip 269*b* next to the memory module 159 be access thereto for signal transmission in a high bandwidth. The CPU chip 269*b*, dedicated control chip 260, standard commodity FPGA IC chips 200, GPU chips 269*a*, NVM IC chips 250, HBMIC chips 251, operation module 190 and memory module 159 may be arranged in an array, wherein the CPU chip 269*b* and dedicated control chip 260 may be arranged in a center region surrounded by a periphery region having the standard commodity FPGA IC chips 200, GPU chips 269*a*, NVM IC chips 250, HBMIC chips 251, operation module 190 and memory module 159 mounted thereto.

Referring to FIG. 15M, the logic drive 300 may include the inter-chip interconnects 371 each extending under spaces between neighboring two of the standard commodity FPGA IC chips 200, NVM IC chips 250, dedicated control chip 260, GPU chips 269*a*, CPU chip 269*b*, HBMIC chips 251, memory module 159 and operation module 190. The logic drive 300 may include a plurality of the DPIIC chip 410 aligned with a cross of a vertical bundle of inter-chip interconnects 371 and a horizontal bundle of inter-chip interconnects 371. Each of the DPIIC chips 410 is at corners of four of the standard commodity FPGA IC chips 200, NVM IC chips 250, dedicated control chip 260, GPU chips 269*a*, CPU chip 269*b*, HBMIC chips 251, memory module 159 and operation module 190 around said each of the DPIIC chips 410. Each of the inter-chip interconnects 371 may be the programmable or fixed interconnect 361 or 364 as mentioned above in the sections of "Specification for Programmable Interconnect" and "Specification for Fixed Interconnect". Signal transmission may be built (1) between one of the programmable interconnects 361 of the inter-chip interconnects 371 and one of the programmable interconnects 361 of the intra-chip interconnects 371 of one of the standard commodity FPGA IC chips 200, e.g., one in a single-die type or one in a operation module 190 as seen in FIG. 24G, via one of the small input/output (I/O) circuits 203 of said one of the standard commodity FPGA IC chips 200, and (2) between one of the programmable interconnects 361 of the inter-chip interconnects 371 and one of the programmable interconnects 361 of the intra-chip interconnects of one of the DPIIC chips 410 via one of the small input/output (I/O) circuits 203 of said one of the DPIIC chips 410. Signal transmission may be built (1) between one of the fixed interconnects 364 of the inter-chip interconnects 371 and one of the fixed interconnects 364 of the intra-chip interconnects 502 of one of the standard commodity FPGA IC chips 200, e.g., one in a single-die type or one in a operation module 190 as seen in FIG. 24G, via one of the small input/output (I/O) circuits 203 of said one of the standard commodity FPGA IC chips 200, and (2) between one of the fixed interconnects 364 of the inter-chip interconnects 371 and one of the fixed interconnects 364 of the intra-chip interconnects of one of the DPIIC chips 410 via one of the small input/output (I/O) circuits 203 of said one of the DPIIC chips 410.

Referring to FIG. 15M, one or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to all of the DPIIC chips 410. One or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to the dedicated control chip 260. One or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to both of the NVM IC chips 250. One or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to all of the GPU chips 269*a*. One or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to the CPU chip 269*b*. One or more of the programmable or fixed interconnects 361 or 364 of the inter-chip interconnects 371 may couple from one of the standard commodity FPGA IC chips 200, e.g., one in a single-die type, to one of the HBMIC chips 251 next to said one of the standard commodity FPGA IC chips 200 and the communication between said one of the standard commodity FPGA IC chips 200 and said one of the HBMIC chips 251 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from one of the standard commodity FPGA IC chips 200, e.g., one in a single-die type, to one of memory chips 687 of the memory module 159 as seen in FIG. 23 and the communication between said one of the standard commodity FPGA IC chips 200 and said one of memory chips 687 of the memory module 159 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to the other of the standard commodity FPGA IC chips 200. One or more of the programmable or fixed interconnects 361 or 364 of the inter-chip interconnects 371 may couple from each of the DPIIC chips 410 to the dedicated control chip 260. One or more the programmable or fixed interconnects 361 or 364 of the inter-chip interconnects 371 may couple from each of the DPIIC chips 410 to both of the NVM IC chips 250. One or more of the programmable or fixed interconnects 361 or 364 of the inter-chip interconnects 371 may couple from each of the DPIIC chips 410 to all of the GPU chips 269*a*. One or more of the programmable or fixed interconnects 361 or 364 of the inter-chip interconnects 371 may couple from each of the DPIIC chips 410 to the CPU chip 269*b*. One or more of the programmable or fixed interconnects 361 or 364 of the inter-chip interconnects 371 may couple from each of the DPIIC chips 410 to all of the HBMIC chips 251. One or more of the programmable or fixed interconnects 361 or 364 of the inter-chip interconnects 371 may couple from each of the DPIIC chips 410 to the others of the DPIIC chips 410. One or more of the programmable or fixed interconnects 361 or 364 of the inter-chip interconnects 371 may couple from the CPU chip 269*b* to all of the GPU chips 269*a*. One or more of the programmable or fixed interconnects 361 or 364 of the inter-chip interconnects 371 may couple from the CPU chip 269*b* to both of the NVM IC chips 250. One or more of the programmable or fixed interconnects 361 or 364 of the inter-chip interconnects 371 may couple from the CPU chip 269*b* to one of the HBMIC chips 251 next to the CPU chip 269*b* and the communication between the CPU chip 269*b* and said one of the HBM IC chips 251 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from the CPU chip 269*b* to one of memory chips 687 of the memory module 159 as seen in FIG. 23 next to the CPU chip 269*b* and the communication between the CPU chip 269*b* and said one of memory chips 687 of the memory module 159 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from one of the GPU chips 269*a* to one of the HBMIC chips 251 next to said one of the GPU chips 269*a* and the communication between said one of the GPU chips 269*a* and said one of the HBM IC chips 251 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from one of the GPU chips 269*a* to one of memory chips 687 of the memory module 159 as seen in FIG. 23 next to said one of the GPU chips 269*a* and the communication between said one of the GPU chips 269*a* and said one of memory chips 687 of the memory module 159 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from each of the GPU chips 269*a* to both of the NVM IC chips 250. One or more of the programmable or fixed interconnects 361 or 364 of the inter-chip interconnects 371 may couple from each of the GPU chips 269*a* to the others of the GPU chips 269*a*. One or more of the programmable or fixed interconnects 361 or 364 of the inter-chip interconnects 371 may couple from each of the NVM IC chips 250 to the dedicated control chip 260. One or more of the programmable or fixed interconnects 361 or 364 of the inter-chip interconnects 371 may couple from each of the HBMIC chips 251 to the dedicated control chip 260. One or more of the programmable or fixed interconnects 361 or 364 of the inter-chip interconnects 371 may couple from each of the GPU chips 269*a* to the dedicated control chip 260. One or more of the programmable or fixed interconnects 361 or 364 of the inter-chip interconnects 371 may couple from the CPU chip 269*b* to the dedicated control chip 260. One or more of the programmable or fixed interconnects 361 or 364 of the inter-chip interconnects 371 may couple from each of the NVM IC chips 250 to all of the HBMIC chips 251. One or more of the programmable or fixed interconnects 361 or 364 of the inter-chip interconnects 371 may couple from each of the NVM IC chips 250 to the other of the NVM IC chips 250. One or more of the programmable or fixed interconnects 361 or 364 of the inter-chip interconnects 371 may couple from each of the HBMIC chips 251 to the others of the HBMIC chips 251.

Referring to FIG. 15M, the logic drive 300 may include multiple dedicated input/output (I/O) chips 265 in a peripheral region thereof surrounding a central region thereof having the standard commodity FPGA IC chips 200, NVM IC chips 250, dedicated control chip 260, GPU chips 269*a*, CPU chip 269*b*, HBMIC chips 251, DPIIC chips 410, memory module 159 and operation module 190 located therein. One or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to all of the dedicated input/output (I/O) chips 265. One or more of the programmable or fixed interconnects 361 or 364 of the inter-chip interconnects 371 may couple from each of the DPIIC chips 410 to all of the dedicated input/output (I/O) chips 265. One or more of the programmable or fixed interconnects 361 or 364 of the inter-chip interconnects 371 may couple from each of the NVM IC chips 250 to all of the dedicated input/output (I/O) chips 265. One or more of the programmable or fixed interconnects 361 or 364 of the inter-chip interconnects 371 may couple from the dedicated control chip 260 to all of the dedicated input/output (I/O) chips 265. One or more of the programmable or fixed interconnects 361 or 364 of the inter-chip interconnects 371 may couple from each of the GPU chips 269*a* to all of the dedicated input/output (I/O) chips 265. One or more of the programmable or fixed interconnects 361 or 364 of the inter-chip interconnects 371 may couple from the CPU chip 269*b* to all of the dedicated input/output (I/O) chips 265. One or more of the programmable or fixed interconnects 361 or 364 of the inter-chip interconnects 371 may couple from each of the HBMIC chips 251 to all of the dedicated input/output (I/O) chips 265. One or more of the programmable or fixed interconnects 361 or 364 of the inter-chip interconnects 371 may couple from the memory module 159 to all of the dedicated input/output (I/O) chips 265.

Accordingly, in the tenth type of logic drive 300, the GPU chips 269*a* may operate with the HBM IC chips 251 for high speed, high bandwidth, wide bitwidth parallel processing and/or computing. Referring to FIG. 15M, each of the standard commodity FPGA IC chips 200 may be referred to one as illustrated in FIGS. 12A-12N, and each of the DPIIC chips 410 may be referred to one as illustrated in FIG. 13. The specification of the commodity standard FPGA IC chips 200, DPIIC chips 410, dedicated I/O chips 265 and dedicated control chip 260 may be referred to that as illustrated in FIG. 15A. The specification of the NVM IC chips 250 may be referred to that as illustrated in FIG. 15L.

XI. Eleventh Type of Logic Drive

Figure 15N:
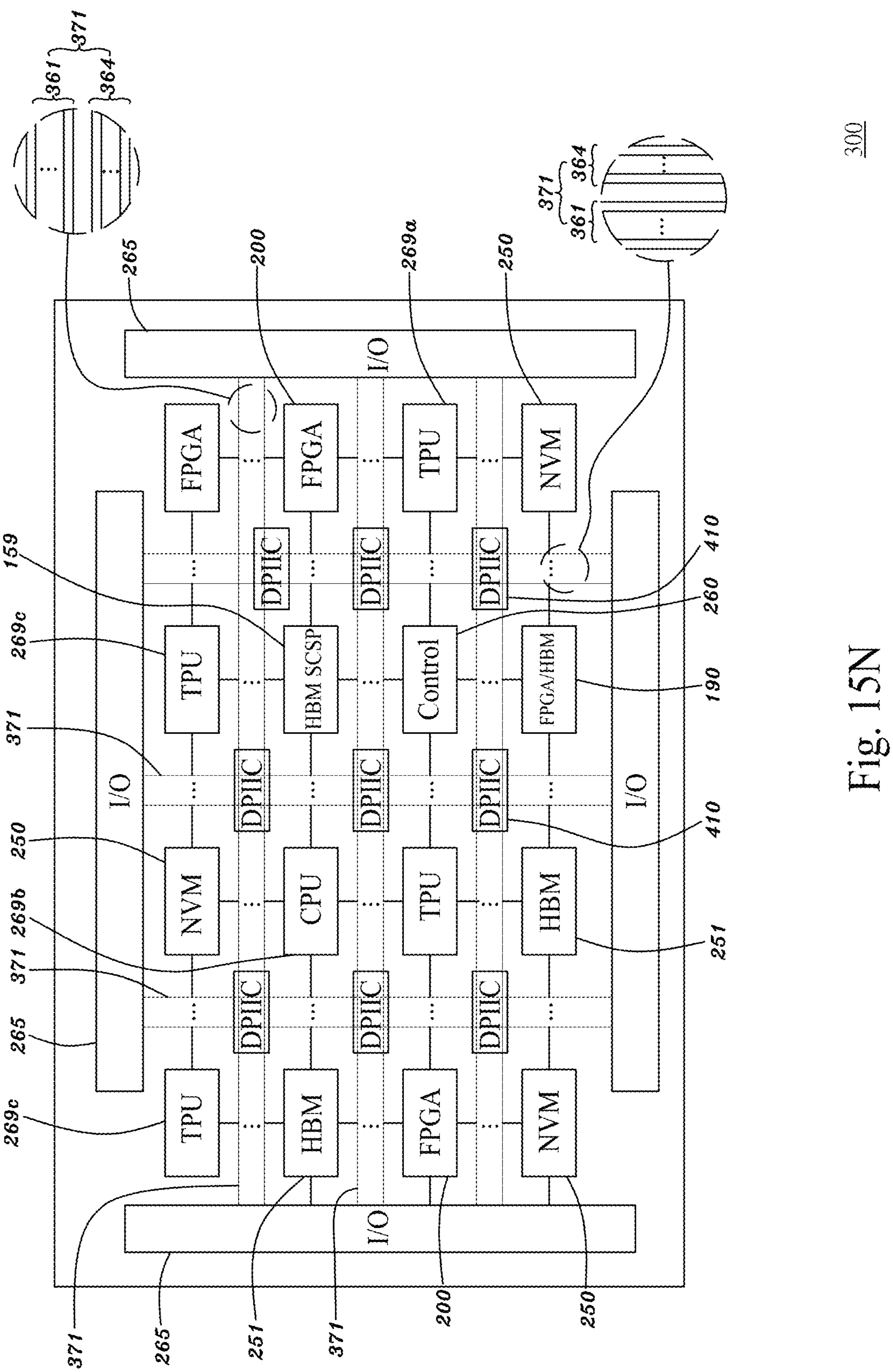
Figure 150:
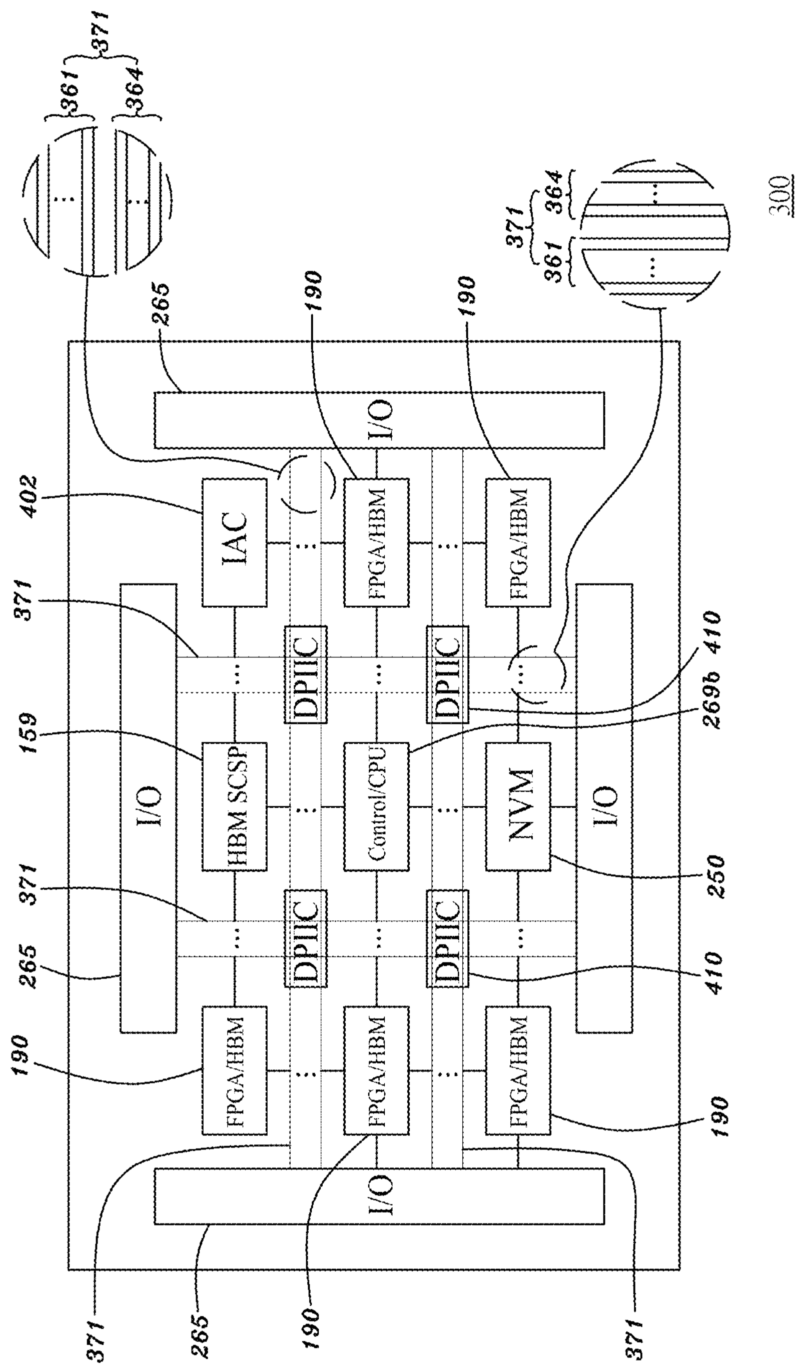

FIG. 15N is a schematically top view showing arrangement for various chips packaged in an eleventh type of standard commodity logic drive in accordance with an embodiment of the present application. For an element indicated by the same reference number shown in FIGS. 11A-15N, the specification of the element as seen in FIG. 15N and the process for forming the same may be referred to that of the element as illustrated in FIGS. 15A-15M and the process for forming the same. Referring to FIG. 15N, the logic drive 300 may be packaged with multiple TPU chips 269*c* and a CPU chip 269*b* for the PCIC chips 269 as above mentioned. Further, the logic drive 300 may be packaged with multiple HBMIC chips 251 each arranged next to one of the TPU chips 269*c* for communication with said one of the TPU chips 269*c* in a high speed, high bandwidth and wide bitwidth. Each of the HBM IC chips 251 in the logic drive 300 may be a high speed, high bandwidth, wide bitwidth DRAM IC chip, high speed, high bandwidth, wide bitwidth cache SRAM chip, high speed, high bandwidth, wide bitwidth magnetoresistive random-access-memory (MRAM) chip or high speed, high bandwidth, wide bitwidth resistive random-access-memory (RRAM) chip. The logic drive 300 may be further packaged with a plurality of the standard commodity FPGA IC chip 200, including one in a single-die type and one in a operation module 190 as seen in FIG. 24G, and one or more of the NVM IC chips 250 configured to store the resulting values or programming codes in a non-volatile manner for programming the programmable logic blocks 201 or cross-point switches 379 of the standard commodity FPGA IC chips 200 and for programming the cross-point switches 379 of the DPIIC chips 410. The logic drive 300 may be further packaged with a memory module 159 as illustrated in FIG. 23 configured to have one of the TPU chips 269*c* and CPU chip 269*b* next to the memory module 159 be access thereto for signal transmission in a high bandwidth. The CPU chip 269*b*, dedicated control chip 260, standard commodity FPGA IC chips 200, TPU chips 269*c*, NVM IC chips 250, HBMIC chips 251, operation module 190 and memory module 159 may be arranged in an array, wherein the CPU chip 269*b* and dedicated control chip 260 may be arranged in a center region surrounded by a periphery region having the standard commodity FPGA IC chips 200, TPU chips 269*c*, NVM IC chips 250, HBMIC chips 251, operation module 190 and memory module 159 mounted thereto.

Referring to FIG. 15N, the logic drive 300 may include the inter-chip interconnects 371 each extending under spaces between neighboring two of the standard commodity FPGA IC chips 200, NVM IC chips 250, dedicated control chip 260, TPU chips 269*c*, CPU chip 269*b*, HBMIC chips 251, memory module 159 and operation module 190. The logic drive 300 may include a plurality of the DPIIC chip 410 aligned with a cross of a vertical bundle of inter-chip interconnects 371 and a horizontal bundle of inter-chip interconnects 371. Each of the DPIIC chips 410 is at corners of four of the standard commodity FPGA IC chips 200, NVM IC chips 250, dedicated control chip 260, TPU chips 269*c*, CPU chip 269*b*, HBMIC chips 251, memory module 159 and operation module 190 around said each of the DPIIC chips 410. Each of the inter-chip interconnects 371 may be the programmable or fixed interconnect 361 or 364 as mentioned above in the sections of "Specification for Programmable Interconnect" and "Specification for Fixed Interconnect". Signal transmission may be built (1) between one of the programmable interconnects 361 of the inter-chip interconnects 371 and one of the programmable interconnects 361 of the intra-chip interconnects 371 of one of the standard commodity FPGA IC chips 200, e.g., one in a single-die type or one in a operation module 190 as seen in FIG. 24G, via one of the small input/output (I/O) circuits 203 of said one of the standard commodity FPGA IC chips 200, and (2) between one of the programmable interconnects 361 of the inter-chip interconnects 371 and one of the programmable interconnects 361 of the intra-chip interconnects of one of the DPIIC chips 410 via one of the small input/output (I/O) circuits 203 of said one of the DPIIC chips 410. Signal transmission may be built (1) between one of the fixed interconnects 364 of the inter-chip interconnects 371 and one of the fixed interconnects 364 of the intra-chip interconnects 502 of one of the standard commodity FPGA IC chips 200, e.g., one in a single-die type or one in a operation module 190 as seen in FIG. 21S, via one of the small input/output (I/O) circuits 203 of said one of the standard commodity FPGA IC chips 200, and (2) between one of the fixed interconnects 364 of the inter-chip interconnects 371 and one of the fixed interconnects 364 of the intra-chip interconnects of one of the DPIIC chips 410 via one of the small input/output (I/O) circuits 203 of said one of the DPIIC chips 410.

Referring to FIG. 15N, one or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to all of the DPIIC chips 410. One or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to the dedicated control chip 260. One or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to both of the NVM IC chips 250. One or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to all of the TPU chips 269*c*. One or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to the CPU chip 269*b*. One or more of the programmable or fixed interconnects 361 or 364 of the inter-chip interconnects 371 may couple from one of the standard commodity FPGA IC chips 200, e.g., one in a single-die type, to one of the HBMIC chips 251 next to said one of the standard commodity FPGA IC chips 200 and the communication between said one of the standard commodity FPGA IC chips 200 and said one of the HBMIC chips 251 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from one of the standard commodity FPGA IC chips 200, e.g., one in a single-die type, to one of memory chips 687 of the memory module 159 as seen in FIG. 23 and the communication between said one of the standard commodity FPGA IC chips 200 and said one of memory chips 687 of the memory module 159 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to the other of the standard commodity FPGA IC chips 200. One or more of the programmable or fixed interconnects 361 or 364 of the inter-chip interconnects 371 may couple from each of the DPIIC chips 410 to the dedicated control chip 260. One or more the programmable or fixed interconnects 361 or 364 of the inter-chip interconnects 371 may couple from each of the DPIIC chips 410 to both of the NVM IC chips 250. One or more of the programmable or fixed interconnects 361 or 364 of the inter-chip interconnects 371 may couple from each of the DPIIC chips 410 to all of the TPU chips 269*c*. One or more of the programmable or fixed interconnects 361 or 364 of the inter-chip interconnects 371 may couple from each of the DPIIC chips 410 to the CPU chip 269*b*. One or more of the programmable or fixed interconnects 361 or 364 of the inter-chip interconnects 371 may couple from each of the DPIIC chips 410 to all of the HBMIC chips 251. One or more of the programmable or fixed interconnects 361 or 364 of the inter-chip interconnects 371 may couple from each of the DPIIC chips 410 to the others of the DPIIC chips 410. One or more of the programmable or fixed interconnects 361 or 364 of the inter-chip interconnects 371 may couple from the CPU chip 269*b* to all of the TPU chips 269*c*. One or more of the programmable or fixed interconnects 361 or 364 of the inter-chip interconnects 371 may couple from the CPU chip 269*b* to both of the NVM IC chips 250. One or more of the programmable or fixed interconnects 361 or 364 of the inter-chip interconnects 371 may couple from the CPU chip 269*b* to one of the HBMIC chips 251 next to the CPU chip 269*b* and the communication between the CPU chip 269*b* and said one of the HBM IC chips 251 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from the CPU chip 269*b* to one of memory chips 687 of the memory module 159 as seen in FIG. 23 next to the CPU chip 269*b* and the communication between the CPU chip 269*b* and said one of memory chips 687 of the memory module 159 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from one of the TPU chips 269*c* to one of the HBMIC chips 251 next to said one of the TPU chips 269*c* and the communication between said one of the TPU chips 269*c* and said one of the HBM IC chips 251 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from one of the TPU chips 269*c* to one of memory chips 687 of the memory module 159 as seen in FIG. 23 next to said one of the TPU chips 269*c* and the communication between said one of the TPU chips 269*c* and said one of memory chips 687 of the memory module 159 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from each of the TPU chips 269*c* to both of the NVM IC chips 250. One or more of the programmable or fixed interconnects 361 or 364 of the inter-chip interconnects 371 may couple from each of the TPU chips 269*c* to the others of the TPU chips 269*c*. One or more of the programmable or fixed interconnects 361 or 364 of the inter-chip interconnects 371 may couple from each of the NVM IC chips 250 to the dedicated control chip 260. One or more of the programmable or fixed interconnects 361 or 364 of the inter-chip interconnects 371 may couple from each of the HBMIC chips 251 to the dedicated control chip 260. One or more of the programmable or fixed interconnects 361 or 364 of the inter-chip interconnects 371 may couple from each of the TPU chips 269*c* to the dedicated control chip 260. One or more of the programmable or fixed interconnects 361 or 364 of the inter-chip interconnects 371 may couple from the CPU chip 269*b* to the dedicated control chip 260. One or more of the programmable or fixed interconnects 361 or 364 of the inter-chip interconnects 371 may couple from each of the NVM IC chips 250 to all of the HBMIC chips 251. One or more of the programmable or fixed interconnects 361 or 364 of the inter-chip interconnects 371 may couple from each of the NVM IC chips 250 to the other of the NVM IC chips 250. One or more of the programmable or fixed interconnects 361 or 364 of the inter-chip interconnects 371 may couple from each of the HBMIC chips 251 to the others of the HBMIC chips 251.

Referring to FIG. 15N, the logic drive 300 may include multiple dedicated input/output (I/O) chips 265 in a peripheral region thereof surrounding a central region thereof having the standard commodity FPGA IC chips 200, NVM IC chips 250, dedicated control chip 260, TPU chips 269*c*, CPU chip 269*b*, HBMIC chips 251, DPIIC chips 410, memory module 159 and operation module 190 located therein. One or more of the programmable or fixed interconnects 361 or 364 of the inter-chip interconnects 371 may couple from each of the standard commodity FPGA IC chips 200, including one in a single-die type and one in the operation module 190 as seen in FIG. 24G, to all of the dedicated input/output (I/O) chips 265. One or more of the programmable or fixed interconnects 361 or 364 of the inter-chip interconnects 371 may couple from each of the DPIIC chips 410 to all of the dedicated input/output (I/O) chips 265. One or more of the programmable or fixed interconnects 361 or 364 of the inter-chip interconnects 371 may couple from each of the NVM IC chips 250 to all of the dedicated input/output (I/O) chips 265. One or more of the programmable or fixed interconnects 361 or 364 of the inter-chip interconnects 371 may couple from the dedicated control chip 260 to all of the dedicated input/output (I/O) chips 265. One or more of the programmable or fixed interconnects 361 or 364 of the inter-chip interconnects 371 may couple from each of the TPU chips 269*c* to all of the dedicated input/output (I/O) chips 265. One or more of the programmable or fixed interconnects 361 or 364 of the inter-chip interconnects 371 may couple from the CPU chip 269*b* to all of the dedicated input/output (I/O) chips 265. One or more of the programmable or fixed interconnects 361 oe 364 of the inter-chip interconnects 371 may couple from each of the HBMIC chips 251 to all of the dedicated input/output (I/O) chips 265. One or more of the programmable or fixed interconnects 361 or 364 of the inter-chip interconnects 371 may couple from the memory module 159 to all of the dedicated input/output (I/O) chips 265.

Accordingly, in the eleventh type of logic drive 300, the TPU chips 269*c* may operate with the HBM IC chips 251 for high speed, high bandwidth, wide bitwidth parallel processing and/or computing. Referring to FIG. 15N, each of the standard commodity FPGA IC chips 200 may be referred to one as illustrated in FIGS. 12A-12N, and each of the DPIIC chips 410 may be referred to one as illustrated in FIG. 13. The specification of the commodity standard FPGA IC chips 200, DPIIC chips 410, dedicated I/O chips 265 and dedicated control chip 260 may be referred to that as illustrated in FIG. 15A. The specification of the NVM IC chips 250 may be referred to that as illustrated in FIG. 15L.

XII. Twelfth Type of Logic Drive

FIG. 15O is a schematically top view showing arrangement for various chips packaged in an eleventh type of standard commodity logic drive in accordance with an embodiment of the present application. For an element indicated by the same reference number shown in FIGS. 15A-15O, the specification of the element as seen in FIG. 15O and the process for forming the same may be referred to that of the element as illustrated in FIGS. 15A-15O and the process for forming the same. Referring to FIG. 15O, the logic drive 300 may be packaged with the standard commodity FPGA IC chips 200 each in one of the operation modules 190 as seen in FIG. 24G, and one or more of the NVM IC chips 250 configured to store the resulting values or programming codes in a non-volatile manner for programming the programmable logic blocks 201 or cross-point switches 379 of the standard commodity FPGA IC chips 200 and for programming the cross-point switches 379 of the DPIIC chips 410. The logic drive 300 may be further packaged with a memory module 159 as illustrated in FIG. 23 configured to have the CPU chip 269*b*, or dedicated control chip, next to the memory module 159 be access thereto for signal transmission in a high bandwidth.

Referring to FIG. 15O, the logic drive 300 may include the inter-chip interconnects 371 each extending under spaces between neighboring two of the operation modules 159, memory module 159, CPU chip 269*b* (or dedicated control chip), NVM IC chip 250 and IAC chip 402. The logic drive 300 may include a plurality of the DPIIC chip 410 aligned with a cross of a vertical bundle of inter-chip interconnects 371 and a horizontal bundle of inter-chip interconnects 371. Each of the DPIIC chips 410 is at corners of four of the operation modules 159, memory module 159, CPU chip 269*b* (or dedicated control chip), NVM IC chip 250 and IAC chip 402 around said each of the DPIIC chips 410. Each of the inter-chip interconnects 371 may be the programmable or fixed interconnect 361 or 364 as mentioned above in the sections of "Specification for Programmable Interconnect" and "Specification for Fixed Interconnect". Signal transmission may be built (1) between one of the programmable interconnects 361 of the inter-chip interconnects 371 and one of the programmable interconnects 361 of the intra-chip interconnects 371 of one of the standard commodity FPGA IC chips 200, e.g., one in a single-die type or one in a operation module 190 as seen in FIG. 24G, via one of the small input/output (I/O) circuits 203 of said one of the standard commodity FPGA IC chips 200, and (2) between one of the programmable interconnects 361 of the inter-chip interconnects 371 and one of the programmable interconnects 361 of the intra-chip interconnects of one of the DPIIC chips 410 via one of the small input/output (I/O) circuits 203 of said one of the DPIIC chips 410. Signal transmission may be built (1) between one of the fixed interconnects 364 of the inter-chip interconnects 371 and one of the fixed interconnects 364 of the intra-chip interconnects 502 of one of the standard commodity FPGA IC chips 200, e.g., one in a single-die type or one in a operation module 190 as seen in FIG. 24G, via one of the small input/output (I/O) circuits 203 of said one of the standard commodity FPGA IC chips 200, and (2) between one of the fixed interconnects 364 of the inter-chip interconnects 371 and one of the fixed interconnects 364 of the intra-chip interconnects of one of the DPIIC chips 410 via one of the small input/output (I/O) circuits 203 of said one of the DPIIC chips 410.

Referring to FIG. 15O, one or more of the programmable or fixed interconnects 361 or 364 of the inter-chip interconnects 371 may couple from the standard commodity FPGA IC chip 200 of each of the operation modules 190 as seen in FIG. 24G to all of the DPIIC chips 410. One or more of the programmable or fixed interconnects 361 or 364 of the inter-chip interconnects 371 may couple from the standard commodity FPGA IC chip 200 of each of the operation modules 190 as seen in FIG. 24G to the CPU chip 269*b* or dedicated control chip. One or more of the programmable or fixed interconnects 361 or 364 of the inter-chip interconnects 371 may couple from the standard commodity FPGA IC chip 200 of each of the operation modules 190 as seen in FIG. 24G to the NVM IC chip 250. One or more of the programmable or fixed interconnects 361 or 364 of the inter-chip interconnects 371 may couple from the standard commodity FPGA IC chip 200 of each of the operation modules 190 as seen in FIG. 24G to the other of the standard commodity FPGA IC chips 200. One or more of the programmable or fixed interconnects 361 or 364 of the inter-chip interconnects 371 may couple from each of the DPIIC chips 410 to the CPU chip 269*b* or dedicated control chip. One or more the programmable or fixed interconnects 361 or 364 of the inter-chip interconnects 371 may couple from each of the DPIIC chips 410 to the NVM IC chip 250. One or more of the programmable or fixed interconnects 361 or 364 of the inter-chip interconnects 371 may couple from each of the DPIIC chips 410 to the others of the DPIIC chips 410. One or more of the programmable or fixed interconnects 361 or 364 of the inter-chip interconnects 371 may couple from the CPU chip 269*b* or dedicated control chip to the NVM IC chip 250. One or more of the programmable or fixed interconnects 361 or 364 of the inter-chip interconnects 371 may couple from the CPU chip 269*b* or dedicated control chip to one of memory chips 687 of the memory module 159 as seen in FIG. 23 next to the CPU chip 269*b* or dedicated control chip and the communication between the CPU chip 269*b* or dedicated control chip and said one of memory chips 687 of the memory module 159 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from the IAC chip 402 to one of memory chips 687 of the memory module 159 as seen in FIG. 23 next to the IAC chip 402 and the communication between the IAC chip 402 and said one of memory chips 687 of the memory module 159 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from the standard commodity FPGA IC chip 200 of each of the operation modules 190 as seen in FIG. 24G to the IAC chip 402. One or more of the programmable or fixed interconnects 361 or 364 of the inter-chip interconnects 371 may couple from each of the DPIIC chips 410 to the IAC chip 402. One or more of the programmable or fixed interconnects 361 or 364 of the inter-chip interconnects 371 may couple from the NVM IC chip 250 to the IAC chip 402. One or more of the programmable or fixed interconnects 361 or 364 of the inter-chip interconnects 371 may couple from the CPU chip 269*b* or dedicated control chip to the IAC chip 402.

Referring to FIG. 15O, the logic drive 300 may include multiple dedicated input/output (I/O) chips 265 in a peripheral region thereof surrounding a central region thereof having the operation modules 190, memory module 159, NVM IC chip 250, IAC chip 402 and CPU chip 269*b* located therein. One or more of the programmable or fixed interconnects 361 or 364 of the inter-chip interconnects 371 may couple from the standard commodity FPGA IC chip 200 of each of the operation modules 190 as seen in FIG. 24G, to all of the dedicated input/output (I/O) chips 265. One or more of the programmable or fixed interconnects 361 or 364 of the inter-chip interconnects 371 may couple from each of the DPIIC chips 410 to all of the dedicated input/output (I/O) chips 265. One or more of the programmable or fixed interconnects 361 or 364 of the inter-chip interconnects 371 may couple from the NVM IC chip 250 to all of the dedicated input/output (I/O) chips 265. One or more of the programmable or fixed interconnects 361 or 364 of the inter-chip interconnects 371 may couple from the CPU chip 269*b* or dedicated control chip to all of the dedicated input/output (I/O) chips 265. One or more of the programmable or fixed interconnects 361 or 364 of the inter-chip interconnects 371 may couple from one of memory chips 687 of the memory module 159 to all of the dedicated input/output (I/O) chips 265.

Accordingly, in the twelfth type of logic drive 300, the CPU chip 269*b* or dedicated control chip may operate with the memory module 159 for high speed, high bandwidth, wide bitwidth parallel processing and/or computing. Referring to FIG. 15O, each of the standard commodity FPGA IC chips 200 of the operation module 190 may be referred to one as illustrated in FIGS. 12A-12N, and each of the DPIIC chips 410 may be referred to one as illustrated in FIG. 13. The specification of the commodity standard FPGA IC chips 200, DPIIC chips 410, dedicated I/O chips 265 and dedicated control chip may be referred to that as illustrated in FIG. 15A. The specification of the NVM IC chips 250 may be referred to that as illustrated in FIG. 15L.

Accordingly, referring to FIGS. 15F-15O, once the programmable interconnects 361 of the FPGA IC chips 200 and DPIIC chips 410 are programmed, the programmed programmable interconnects 361 together with the fixed interconnects 364 of the standard commodity FPGA IC chips 200 and DPIIC chips 410 may provide some specific functions for some given applications. The standard commodity FPGA IC chip or chips 200 may operate together with the PCIC chip or chips 269, e.g., GPU chip(s), CPU chip(s), TPU chip(s) or DSP chip(s), in the same logic drive 300 to provide powerful functions and operations in applications, for example, Artificial Intelligence (AI), machine learning, deep learning, big data, Internet Of Things (IOT), industry computing, Virtual Reality (VR), Augmented Reality (AR), driverless car electronics, Graphic Processing (GP), Digital Signal Processing (DSP), Micro Controlling (MC), and/or Central Processing (CP).

Referring to FIGS. 15A-15O, the logic drive 300 and a software tool may be provided for users or software developers, in addition to current hardware developers, to easily develop their innovated or specific applications by using the standardized commodity logic drive 300. The software tool provides capabilities for users or software developers to write software using popular, common, or easy-to-learn programming languages, for example, C, Java, C++, C #, Scala, Swift, Matlab, Assembly Language, Pascal, Python, Visual Basic, PL/SQL or JavaScript languages. The users or software developers may write software codes into the standard commodity logic drive 300, and the software codes may be transformed into the resulting values or programming codes to be loaded to the non-volatile memory cells 870, 880 or 907 in or of the standardized commodity logic drive 300 for their desired applications, for example, in algorithms, architectures and/or applications of artificial intelligence (AI), machine learning, deep learning, big data, internet of things (IOT), car electronics, virtual reality (VR), augmented reality (AR), graphic processing, digital signal processing, micro controlling, and/or central processing.

The standard commodity logic drive 300 as seen in FIGS. 15A-15O may have standard common features, counts or specifications: (1) its programmable logic blocks (LB) 201 including (i) system gates with the count greater than or equal to 8M, 40M, 80M, 200M or 400M in total, (ii) logic cells or elements with the count greater than or equal to 256K, 512K, 2M, 4M, 16M or 32M in total, (iii) hard macros, for example DSP slices, microcontroller macros, multiplexer macros, fixed-wired adders as seen in FIG. 12K, and/or fixed-wired multipliers as seen in FIG. 12N and/or (iv) blocks of memory with the bit count equal to or greater than 4M, 40M, 200M, 400M, 800M or 2G bits in total; (2) its power supply voltage being between 0.1V and 12V, between 0.1V and 7V, between 0.1V and 3V, between 0.1V and 2V, between 0.1V and 1.5V, or between 0.1V and 1V; (3) its I/O pads in terms of layout, location, number and function, wherein the standard commodity logic drive 300 may comprise the I/O pads 77*e*, metal pillars or bumps 570 and/or 583, as seen in FIG. 26D, 26E, 301, 30K, 32L or 32N, connecting or coupling to one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. The standard commodity logic drive 300 may also include the I/O pads 77*e*, metal pillars or bumps 570 and/or 583, as seen in FIG. 26D, 26E, 301, 30K, 32L or 32N, connecting or coupling to Serial Advanced Technology Attachment (SATA) ports, or Peripheral Components Interconnect express (PCIe) ports for communicating, connecting or coupling with the memory drive. Since the standard commodity logic drives 300 are standard commodity products, the product inventory management becomes easy, efficient and effective, therefore resulting in a shorter logic drive delivery time and becoming cost-effective.

Alternatively, the standard commodity logic drive 300 as seen in FIGS. 15A-15O may have hard macros arranged in its dedicated control chip 260, dedicated I/O chip 265, dedicated control and I/O chip 266, IAC chip 402, DCIAC chip 267, DCDI/OIAC chip 268, or DPIIC chip 410, but instead not in any of its standard commodity FPGA IC chips 200.

Interconnection for Logic Drive

Figure 16A:
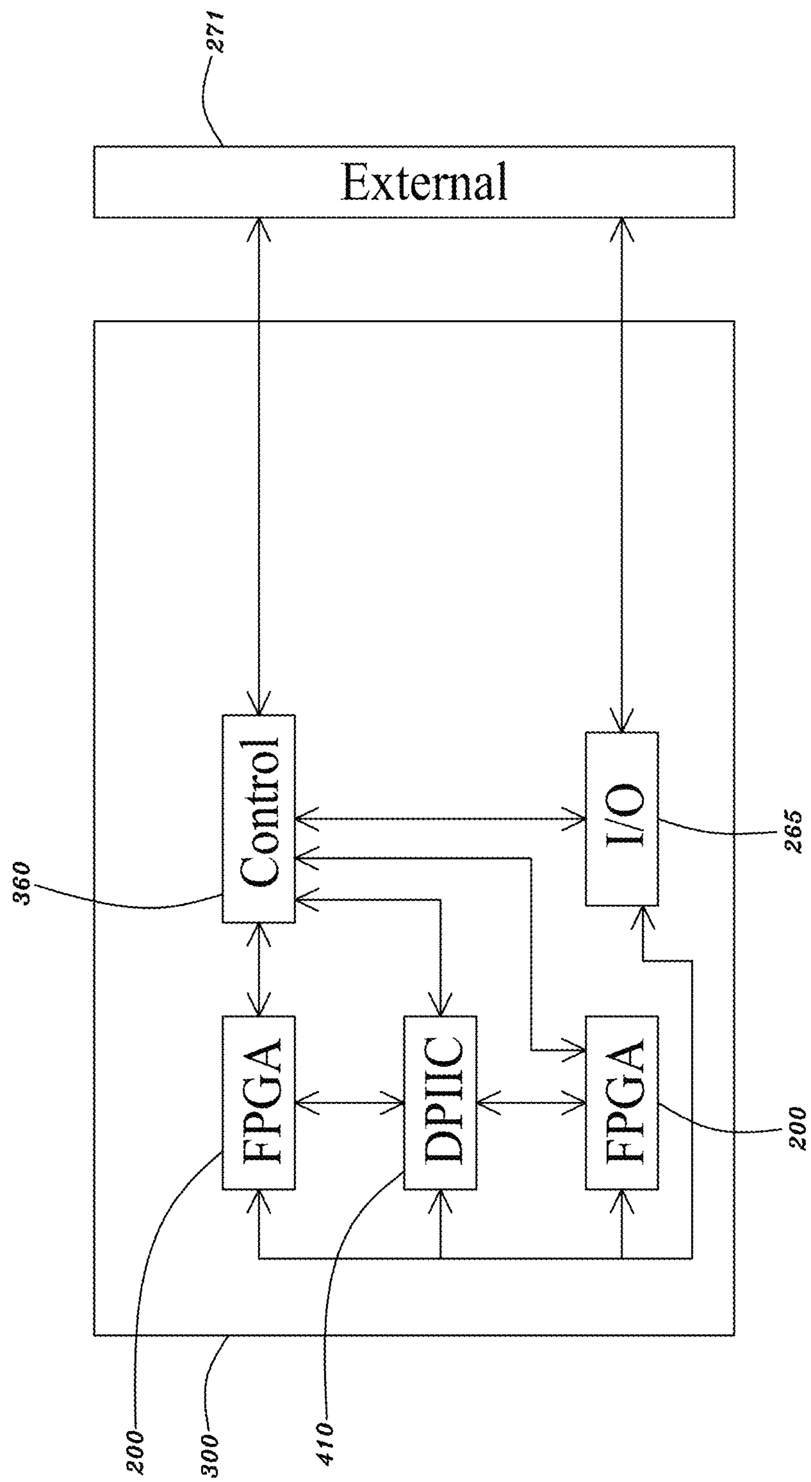
FIGS. 16A and 16B are various block diagrams showing various connections between chips in a logic drive in accordance with an embodiment of the present application.
Figure 16B:
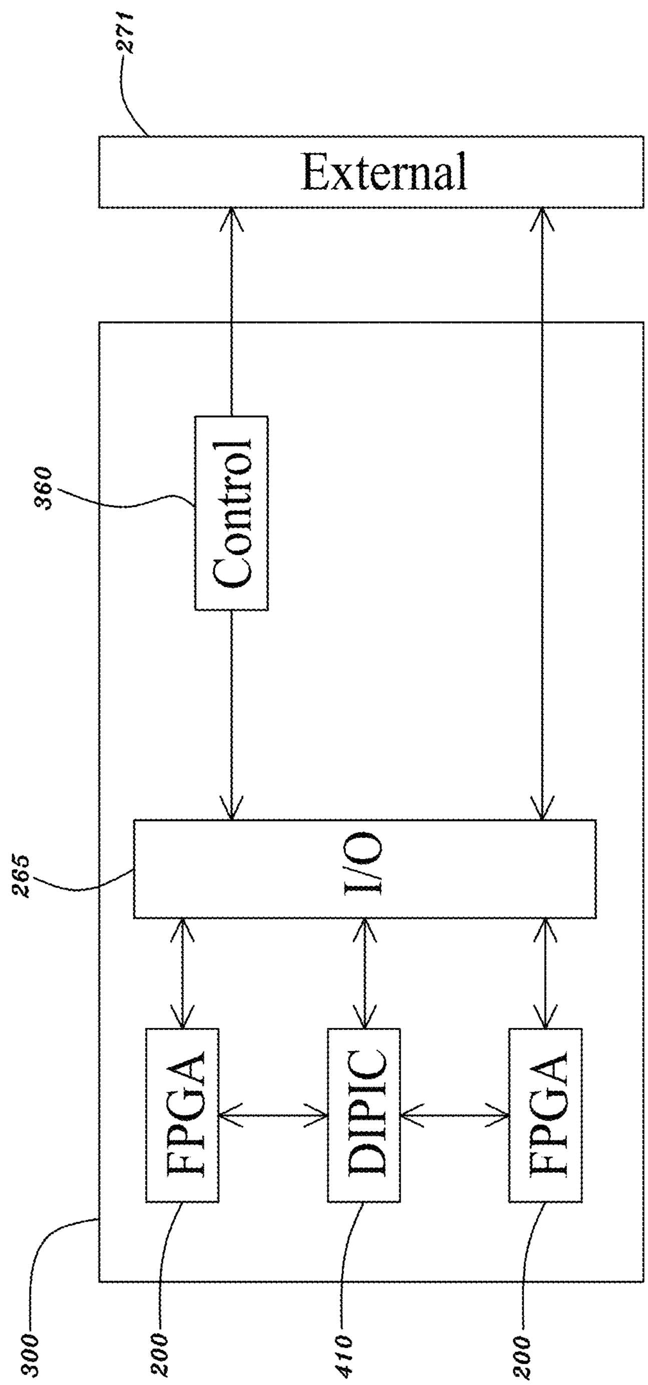

FIGS. 16A and 16B are various block diagrams showing various interconnections between chips in a standard commodity logic drive in accordance with an embodiment of the present application. Referring to FIGS. 16A and 16B, two blocks 200 may be two different groups of the standard commodity FPGA IC chips 200 in the logic drive 300 illustrated in FIGS. 15A-15O; a block 410 may be a combination of the DPIIC chips 410 in the logic drive 300 illustrated in FIGS. 15A-15O; a block 265 may be a combination of the dedicated I/O chips 265 in the logic drive 300 illustrated in FIGS. 15A-15O; a block 360 may be the dedicated control chip 260, dedicated control and I/O chip 266, DCIAC chip 267 or DCDI/OIAC chip 268 in the standard commodity logic drive 300 as illustrated in FIGS. 15A-15O.

I. First Type of Interconnection for Standard Commodity Logic Drive

Referring to FIGS. 15A-15O and 16A, one or more of the programmable interconnects 361 of the inter-chip interconnects 371 may couple one or more of the small I/O circuits 203 of each of the dedicated I/O chips 265 to one or more of the small I/O circuits 203 of all of the standard commodity FPGA IC chips 200. One or more of the programmable interconnects 361 of the inter-chip interconnects 371 may couple one or more of the small I/O circuits 203 of each of the dedicated I/O chips 265 to one or more of the small I/O circuits 203 of all of the DPIIC chips 410. One or more of the programmable interconnects 361 of the inter-chip interconnects 371 may couple one or more of the small I/O circuits 203 of each of the dedicated I/O chips 265 to one or more of the small I/O circuits 203 of all the others of the dedicated I/O chips 265. One or more of the fixed interconnects 364 of the inter-chip interconnects 371 may couple one or more of the small I/O circuits 203 of each of the dedicated I/O chips 265 to one or more of the small I/O circuits 203 of all of the standard commodity FPGA IC chips 200. One or more of the fixed interconnects 364 of the inter-chip interconnects 371 may couple one or more of the small I/O circuits 203 of each of the dedicated I/O chips 265 to one or more of the small I/O circuits 203 of all of the DPIIC chips 410. One or more of the fixed interconnects 364 of the inter-chip interconnects 371 may couple one or more of the small I/O circuits 203 of each of the dedicated I/O chips 265 to one or more of the small I/O circuits 203 of all the others of the dedicated I/O chips 265.

Referring to FIGS. 15A-15O and 16A, one or more of the programmable interconnects 361 of the inter-chip interconnects 371 may couple one or more of the small I/O circuits 203 of each of the DPIIC chips 410 to one or more of the small I/O circuits 203 of all of the standard commodity FPGA IC chips 200. One or more of the programmable interconnects 361 of the inter-chip interconnects 371 may couple one or more of the small I/O circuits 203 of each of the DPIIC chips 410 to one or more of the small I/O circuits 203 of all the others of the DPIIC chips 410. One or more of the fixed interconnects 364 of the inter-chip interconnects 371 may couple one or more of the small I/O circuits 203 of each of the DPIIC chips 410 to one or more of the small I/O circuits 203 of all of the standard commodity FPGA IC chips 200. One or more of the fixed interconnects 364 of the inter-chip interconnects 371 may couple one or more of the small I/O circuits 203 of each of the DPIIC chips 410 to one or more of the small I/O circuits 203 of all the others of the DPIIC chips 410.

Referring to FIGS. 15A-15O and 16A, one or more of the programmable interconnects 361 of the inter-chip interconnects 371 may couple one or more of the small I/O circuits 203 of each of the standard commodity FPGA IC chips 200 to one or more of the small I/O circuits 203 of all the others of the standard commodity FPGA IC chips 200. One or more of the fixed interconnects 364 of the inter-chip interconnects 371 may couple one or more of the small I/O circuits 203 of each of the standard commodity FPGA IC chips 200 to one or more of the small I/O circuits 203 of all the others of the standard commodity FPGA IC chips 200.

Referring to FIGS. 15A-15O and 16A, one or more of the programmable interconnects 361 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the standard commodity FPGA IC chips 200. One more of the fixed interconnects 364 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the standard commodity FPGA IC chips 200. One or more of the programmable interconnects 361 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the DPIIC chips 410. One more of the fixed interconnects 364 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the DPIIC chips 410. One or more of the fixed interconnects 364 of the inter-chip interconnects 371 may couple one or more of the large I/O circuits 341 of the dedicated control chip 260, dedicated control and I/O chip 266, DCIAC chip 267 or DCDI/OIAC chip 268 in the control block 360 to one or more of the large I/O circuits 341 of all of the dedicated I/O chips 265. One or more of the large I/O circuits 341 of the dedicated control chip 260, dedicated control and I/O chip 266, DCIAC chip 267 or DCDI/OIAC chip 268 in the control block 360 may couple to the external circuitry 271 outside the logic drive 300.

Referring to FIGS. 15A-15O and 16A, one or more of the fixed interconnects 364 of the inter-chip interconnects 371 may couple one or more of the large I/O circuits 341 of each of the dedicated I/O chips 265 to one or more of the large I/O circuits 341 of the others of the dedicated I/O chips 265. One or more of the large I/O circuits 341 of each of the dedicated I/O chips 265 may couple to the external circuitry 271 outside the logic drive 300.

II. Second Type of Interconnection for Standard Commodity Logic Drive

The interconnections as illustrated in FIG. 16A may be applied to that as seen in FIG. 16B except for the interconnections between the standard commodity FPGA IC chips 200 and the dedicated control chip 260, dedicated control and I/O chip 266, DCIAC chip 267 or DCDI/OIAC chip 268 in the control block 360 and between the DPIIC chips 410 and the dedicated control chip 260, dedicated control and I/O chip 266, DCIAC chip 267 or DCDI/OIAC chip 268 in the control block 360. Referring to FIG. 16B, the dedicated control chip 260, dedicated control and I/O chip 266, DCIAC chip 267 or DCDI/OIAC chip 268 in the control block 360 may have none of the small I/O circuits 203 for the interconnections between the standard commodity FPGA IC chips 200 and the dedicated control chip 260, dedicated control and 1/O chip 266, DCIAC chip 267 or DCDI/OIAC chip 268 in the control block 360 and between the DPIIC chips 410 and the dedicated control chip 260, dedicated control and I/O chip 266, DCIAC chip 267 or DCDI/OIAC chip 268 in the control block 360.

(1) Interconnection for Reloading Resulting Values or Programming Codes to Non-Volatile Memory Cells of Standard Commodity FPGA IC Chips Before operation, referring to FIGS. 15A-15O, 16A and 16B, each of the dedicated I/O chips 265 may have a first one of its large I/O circuits 341 to drive a resulting value or first programming code from the external circuitry 271 outside the standard commodity logic drive 300 to a first one of its small I/O circuits 203. For said each of the dedicated I/O chips 265, the first one of its small I/O circuits 203 may drive the resulting value or first programming code to a first one of the small I/O circuits 203 of one of the standard commodity FPGA IC chips 200 via one or more of the fixed interconnects 364 of the inter-chip interconnects 371. For said one of the standard commodity FPGA IC chips 200, the first one of its small I/O circuits 203 may drive the resulting value or first programming code to a first one of its non-volatile memory cells 870, 880 or 907, and thereby the resulting value or first programming code may be stored in the first one of its non-volatile memory cells 870, 880 or 907.

Furthermore, referring to FIGS. 15A-15O, 16A and 16B, said each of the dedicated I/O chips 265 may have a second one of its large I/O circuits 341 to drive a second programming code from the external circuitry 271 outside the standard commodity logic drive 300 to a second one of its small I/O circuits 203. For said each of the dedicated I/O chips 265, the second one of its small I/O circuits 203 may drive the second programming code to a second one of the small I/O circuits 203 of said one of the standard commodity FPGA IC chips 200 via one or more of the fixed interconnects 364 of the inter-chip interconnects 371. For said one of the standard commodity FPGA IC chips 200, the second one of its small I/O circuits 203 may drive the second programming code to a second one of its non-volatile memory cells 870, 880 or 907, and thereby the second programming code may be stored in the second one of its non-volatile memory cells 870, 880 or 907.

Furthermore, referring to FIGS. 15A-15O, 16A and 16B, said each of the dedicated I/O chips 265 may have a third one of its large I/O circuits 341 to drive a third programming codes from the external circuitry 271 outside the standard commodity logic drive 300 to a third one of its small I/O circuits 203. For said each of the dedicated I/O chips 265, the third one of its small I/O circuits 203 may drive the third programming code to one of the small I/O circuits 203 of one of the DPIIC chips 410 via one or more of the fixed interconnects 364 of the inter-chip interconnects 371. For said one of the DPIIC chips 410, said one of its small I/O circuits 203 may drive the third programming code to one of its non-volatile memory cells 870, 880 or 907, and thereby the third programming code may be stored in said one of its non-volatile memory cells 870, 880 or 907.

(2) Interconnection for Operation

Referring to FIGS. 15A-15O, 16A and 16B, said each of the standard commodity FPGA IC chips 200 may reload the resulting value or first programming code from the first one of its non-volatile memory cells 870, 880 or 907 to one of its memory cells 490 via one or more of the fixed interconnects 364 of its intra-chip interconnects 502, and thereby the resulting value or first programming code may be stored or latched in said one of its memory cells 490 for programing one of its programmable logic blocks 201 as illustrated in FIG. 6A-6J. Said each of the standard commodity FPGA IC chips 200 may reload the second programming code from the second one of its non-volatile memory cells 870, 880 or 907 to one of its memory cells 362 via one or more of the fixed interconnects 364 of its intra-chip interconnects 502, and thereby the second programming code may be stored or latched in said one of its memory cells 362 for programing one of its pass/no-pass switches 258 or cross-point switches 379 as illustrated in FIGS. 2A-2F, 3A-3D and 7A-7C. Said each of the DPIIC chips 410 may reload the third programming code from said one of its non-volatile memory cells 870, 880 or 907 to one of its memory cells 362, and thereby the third programming code may be stored or latched in said one of its memory cells 362 for programing one of its pass/no-pass switches 258 or cross-point switches 379 as illustrated in FIGS. 2A-2F, 3A-3D and 7A-7C.

Thereby, referring to FIGS. 15A-15O, 16A and 16B, one of the dedicated I/O chips 265 may have one of its large I/O circuits 341 to drive a signal from the external circuitry 271 outside the logic drive 300 to one of its small I/O circuits 203. For said one of the dedicated I/O chips 265, said one of its small I/O circuits 203 may drive the signal to a first one of the small I/O circuits 203 of one of the DPIIC chips 410 via one or more of the programmable interconnects 361 of the inter-chip interconnects 371. For said one of the dedicated DPIIC chips 410, the first one of its small I/O circuits 203 may drive the signal to one of its cross-point switches 379 via a first one of the programmable interconnects 361 of its intra-chip interconnects; said one of its cross-point switches 379 may switch the signal from the first one of the programmable interconnects 361 of its intra-chip interconnects to a second one of the programmable interconnects 361 of its intra-chip interconnects to be passed to a second one of its small I/O circuits 203; the second one of its small I/O circuits 203 may drive the signal to one of the small I/O circuits 203 of one of the standard commodity FPGA IC chips 200 via one or more of the programmable interconnects 361 of the inter-chip interconnects 371. For said one of the standard commodity FPGA IC chips 200, said one of its small I/O circuits 203 may drive the signal to one of its cross-point switches 379 through a first group of the programmable interconnects 361 and by-pass interconnects 279 of its intra-chip interconnects 502 as seen in FIG. 12G; said one of its cross-point switches 379 may switch the signal to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of the inputs A0-A3 of one of its programmable logic blocks (LB) 201 as seen in FIG. 6A or 6H.

Referring to FIGS. 15A-15O, 16A and 16B, in another aspect, for a first one of the standard commodity FPGA IC chips 200, one of its programmable logic blocks (LB) 201 as seen in FIG. 6A or 6H may generate an output Dout, C0, C1, C2 or C3 to be passed to one of its cross-point switches 379 via a first group of the programmable interconnects 361 and by-pass interconnects 279 of its intra-chip interconnects 502; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of its small I/O circuits 203; said one of its small I/O circuits 203 may drive the output Dout to a first one of the small I/O circuits 203 of one of the DPIIC chips 410 via one or more of the programmable interconnects 361 of the inter-chip interconnects 371. For said one of the DPIIC chips 410, the first one of its small I/O circuits 203 may drive the output Dout to one of its cross-point switches 379 via a first group of the programmable interconnects 361 of its intra-chip interconnects; said one of its cross-point switches 379 may switch the output Dout to pass from the first group of the programmable interconnects 361 of its intra-chip interconnects to a second group of the programmable interconnects 361 of its intra-chip interconnects to be passed to a second one of its small I/O circuits 203; the second one of its small I/O circuits 203 may drive the output Dout to one of the small I/O circuits 203 of a second one of the standard commodity FPGA IC chips 200 via one or more of the programmable interconnects 361 of the inter-chip interconnects 371. For the second one of the FPGA IC chips 200, said one of its small I/O circuits 203 may drive the output Dout to one of its cross-point switches 379 through a first group of the programmable interconnects 361 and by-pass interconnects 279 of its intra-chip interconnects 502 as seen in FIG. 12G; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of the inputs A0-A3 of one of its programmable logic blocks (LB) 201 as seen in FIG. 6A or 6H.

Referring to FIGS. 15A-15O, 16A and 16B, in the other aspect, for one of the standard commodity FPGA IC chips 200, one of its programmable logic blocks (LB) 201 as seen in FIG. 6A may generate an output Dout, C0, C1, C2 or C3 to be passed to one of its cross-point switches 379 via a first group of the programmable interconnects 361 and by-pass interconnects 279 of its intra-chip interconnects 502; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of its small I/O circuits 203; said one of its small I/O circuits 203 may drive the output Dout to a first one of the small I/O circuits 203 of one of the DPIIC chips 410 via one or more of the programmable interconnects 361 of the inter-chip interconnects 371. For said one of the DPIIC chips 410, the first one of its small I/O circuits 203 may drive the output Dout to one of its cross-point switches 379 via a first group of the programmable interconnects 361 of its intra-chip interconnects; said one of its cross-point switches 379 may switch the output Dout to pass from the first group of the programmable interconnects 361 of its intra-chip interconnects to a second group of the programmable interconnects 361 of its intra-chip interconnects to be passed to a second one of its small I/O circuits 203; the second one of its small I/O circuits 203 may drive the output Dout to one of the small I/O circuits 203 of one of the dedicated I/O chips 265 via one or more of the programmable interconnects 361 of the inter-chip interconnects 371. For said one of the dedicated I/O chips 265, said one of its small I/O circuits 203 may drive the output Dout to one of its large I/O circuits 341 to be passed to the external circuitry 271 outside the logic drive 300.

(3) Interconnection for Controlling

Referring to FIGS. 15A-15O, 16A and 16B, for the dedicated control chip 260, dedicated control and I/O chip 266, DCIAC chip 267 or DCDI/OIAC chip 268 in the control block 360, one of its large I/O circuits 341 may receive or drive a control command from or to the external circuitry 271 outside the logic drive 300.

Further, referring to FIGS. 15A-15O, 16A and 16B, one of the dedicated I/O chips 265 may have a first one of its large I/O circuits 341 to drive a control command from the external circuitry 271 outside the logic drive 300 to a second one of its large I/O circuits 341. For said one of the dedicated I/O chips 265, the second one of its large I/O circuits 341 may drive the control command to one of the large I/O circuits 341 of the dedicated control chip 260, dedicated control and I/O chip 266, DCIAC chip 267 or DCDI/OIAC chip 268 in the control block 360 via one or more of the fixed interconnects 364 of the inter-chip interconnects 371.

Further, referring to FIGS. 15A-15O, 16A and 16B, for the dedicated control chip 260, dedicated control and I/O chip 266, DCIAC chip 267 or DCDI/OIAC chip 268 in the control block 360, one of its large I/O circuits 341 may drive a control command to a first one of the large I/O circuits 341 of one of the dedicated I/O chips 265 via one or more of the fixed interconnects 364 of the inter-chip interconnects 371. For said one of the dedicated I/O chips 265, the first one of its large I/O circuits 341 may drive the control command to a second one of its large I/O circuits 341 to be passed to the external circuitry 271 outside the standard commodity logic drive 300.

Thereby, referring to FIGS. 15A-15O and 16A, a control command may be provided from the external circuitry 271 outside the standard commodity logic drive 300 to the dedicated control chip 260, dedicated control and I/O chip 266, DCIAC chip 267 or DCDI/OIAC chip 268 in the control block 360 or from the dedicated control chip 260, dedicated control and I/O chip 266, DCIAC chip 267 or DCDI/OIAC chip 268 in the control block 360 to the external circuitry 271 outside the logic drive 300.

(4) Accessibility

Referring to FIGS. 15A-15O, 16A and 16B, the external circuitry 271 may not be allowed to reload the resulting values and first, second and third programming codes from any of the standard commodity FPGA IC chips 200 and DPIIC chips 410 in the standard commodity logic drive 300. Alternatively, the external circuitry 271 may be allowed to reload the resulting values and first, second and third programming codes from one or all of the standard commodity FPGA IC chips 200 and DPIIC chips 410 in the standard commodity logic drive 300.

Figure 17:
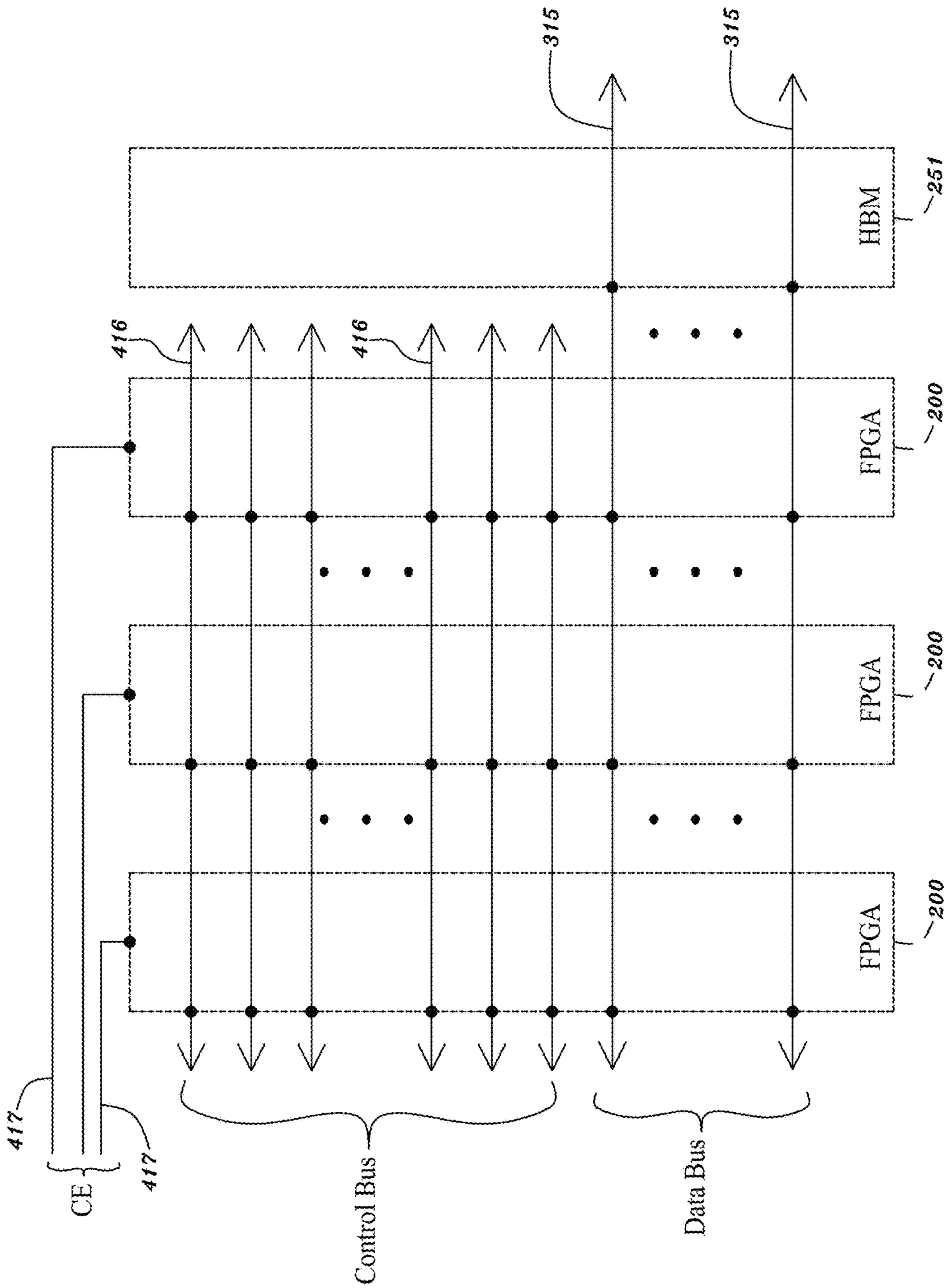
FIG. 17 is a block diagram illustrating multiple control buses for one or more standard commodity FPGA IC chips and multiple data buses for one or more standard commodity FPGA IC chips and high bandwidth memory (HBM) IC chips in accordance with the present application.

Data Buses for Standard Commodity FPGA IC Chips and High Bandwidth Memory (IIBM) IC Chips FIG. 17 is a block diagram illustrating multiple control buses for one or more standard commodity FPGA IC chips and multiple data buses for one or more standard commodity FPGA IC chips and high bandwidth memory (HBM) IC chips in accordance with the present application. Referring to FIGS. 12A, 15L-15O and 17, the standard commodity logic drive 300 may be provided with multiple control buses 416 each constructed from multiple of the programmable interconnects 361 and/or multiple of the fixed interconnects 364. Alternatively, multiple of its programmable interconnects 361 may be programmed to be combined with multiple of its fixed interconnects 364 into one of its control buses 416. Alternatively, multiple of its fixed interconnects 364 may be combined into one of its control buses 416. For example, for the standard commodity logic drive 300, one of its control buses 416 may couple the input-enable (IE) pad 221, as seen in FIG. 12A, of one of its standard commodity FPGA IC chips 200 to the input-enable (IE) pad(s) 221 of the other(s) of its standard commodity FPGA IC chips 200. Alternatively, one of its control buses 416 may couple one of the input-selection (IS) pads 226, such as IS1 pad as seen in FIG. 12A, of one of its standard commodity FPGA IC chips 200 to one of the input-selection (IS) pads 226, such as IS1 pad as seen in FIG. 12A, of the other or each of the others of its standard commodity FPGA IC chips 200. Alternatively, one of its control buses 416 may couple the out-enable (OE) pad 227, as seen in FIG. 12A, of one of its standard commodity FPGA IC chips 200 to the output-enable (OE) pad(s) 221 of the other(s) of its standard commodity FPGA IC chips 200. Alternatively, one of its control buses 416 may couple one of the output-selection (OS) pads 228, such as OS1 pad as seen in FIG. 12A, of one of its standard commodity FPGA IC chips 200 to one of the output-selection (OS) pads 226, such as OS1 pad as seen in FIG. 12A, of the other or each of the others of its standard commodity FPGA IC chips 200. The standard commodity logic drive 300 may be provided with multiple chip-enable (CE) lines 417 each constructed from multiple of the programmable interconnects 361 and/or multiple of the fixed interconnects 364 to couple to the chip-enable (CE) pad 209 of one of its standard commodity FPGA IC chips 200. Alternatively, multiple of its programmable interconnects 361 may be programmed to be combined with multiple of its fixed interconnects 364 into one of its chip-enable (CE) lines 417 to couple to the chip-enable (CE) pad 209 of one of its standard commodity FPGA IC chips 200. Alternatively, multiple of its fixed interconnects 364 may be combined into one of its chip-enable (CE) lines 417 to couple to the chip-enable (CE) pad 209 of one of its standard commodity FPGA IC chips 200.

Furthermore, referring to FIGS. 15L-15O and 17, the standard commodity logic drive 300 may be provided with multiple data buses 315 each constructed from multiple of the programmable interconnects 361 and/or multiple of the fixed interconnects 364. For example, for the standard commodity logic drive 300, multiple of its programmable interconnects 361 may be programmed into one of its data buses 315. Alternatively, multiple of its programmable interconnects 361 may be programmed to be combined with multiple of its fixed interconnects 364 into one of its data buses 315. Alternatively, multiple of its fixed interconnects 364 may be combined into one of its data buses 315.

Referring to FIG. 17, for the standard commodity logic drive 300, one of its data buses 315 may couple one or more of its standard commodity FPGA IC chips 200 and one or more of its high bandwidth memory (HBM) IC chips 251 (only one is shown). For example, in a first clock, said one of its data buses 315 may be switched to couple one of the I/O ports of a first one of its standard commodity FPGA IC chips 200 to one of the I/O ports of a second one of its standard commodity FPGA IC chips 200. Said one of the I/O ports of the first one of its standard commodity FPGA IC chips 200 is selected in accordance with the logic levels at the chip-enable pad 209, input-enable pad 221, input-selection pads 226 and output-enable pad 227 of the first one of its standard commodity FPGA IC chips 200 as illustrated in FIG. 12A to receive data from said one of its data buses 315; said one of the I/O ports of the second one of its standard commodity FPGA IC chips 200 is selected in accordance with the logic levels at the chip-enable pad 209, input-enable pad 221, output-enable pad 227 and output-selection pads 228 of the second one of its standard commodity FPGA IC chips 200 as illustrated in FIG. 12A to drive or pass data to said one of its data buses 315. Thereby, in the first clock, said one of the I/O ports of the second one of its standard commodity FPGA IC chips 200 may drive or pass data to said one of the I/O ports of the first one of its standard commodity FPGA IC chips 200 through said one of its data buses 315. In the first clock, said one of its data buses 315 is not used for data transmission by the other(s) of its standard commodity FPGA IC chips 200 coupling thereto or by its high bandwidth memory (HBM) IC chips 251 coupling thereto.

Further, referring to FIG. 17, in a second clock, said one of the data buses 315 may be switched to couple said one of the I/O ports of the first one of its standard commodity FPGA IC chips 200 to one of I/O ports of a first one of its high bandwidth memory (HBM) IC chips 251. Said one of the I/O ports of the first one of its standard commodity FPGA IC chips 200 is selected in accordance with the logic levels at the chip-enable pad 209, input-enable pad 221, input-selection pads 226 and output-enable pad 227 of the first one of its standard commodity FPGA IC chips 200 as illustrated in FIG. 12A to receive data from said one of the data buses 315; said one of the I/O ports of the first one of its high bandwidth memory (HBM) IC chips 251 is selected to drive or pass data to said one of its data buses 315. Thereby, in the second clock, said one of the I/O ports of the first one of its high bandwidth memory (HBM) IC chips 251 may drive or pass data to said one of the I/O ports of the first one of its standard commodity FPGA IC chips 200 through said one of its data buses 315. In the second clock, said one of its data buses 315 is not used for data transmission by the other(s) of its standard commodity FPGA IC chips 200 coupling thereto or by the other(s) of its high bandwidth memory (HBM) IC chips 251 coupling thereto.

Further, referring to FIG. 17, in a third clock said one of its data buses 315 may be switched to couple said one of the I/O ports of the first one of its standard commodity FPGA IC chips 200 to said one of the I/O ports of the first one of its high bandwidth memory (HBM) IC chips 251. Said one of the I/O ports of the first one of its standard commodity FPGA IC chips 200 is selected in accordance with the logic levels at the chip-enable pad 209, input-enable pad 221, output-enable pad 227 and output-selection pads 228 of the first one of its standard commodity FPGA IC chips 200 as illustrated in FIG. 12A to drive or pass data to said one of its data buses 315; said one of the I/O ports of the first one of its high bandwidth memory (HBM) IC chips 251 is selected to receive data from said one of its data buses 315. Thereby, in the third clock, said one of the I/O ports of the first one of its standard commodity FPGA IC chips 200 may drive or pass data to said one of the I/O ports of the first one of its high bandwidth memory (HBM) IC chips 251 through said one of its data buses 315. In the third clock, said one of its data buses 315 is not used for data transmission by the other(s) of its standard commodity FPGA IC chips 200 coupling thereto or by the other(s) of its high bandwidth memory (HBM) IC chips 251 coupling thereto.

Further, referring to FIG. 17, in a fourth clock said one of its data buses 315 may be switched to couple said one of the I/O ports of the first one of its high bandwidth memory (HBM) IC chips 251 to one of I/O ports of a second one of its high bandwidth memory (HBM) IC chips 251. Said one of the I/O ports of the second one of its high bandwidth memory (HBM) IC chips 251 is selected to drive or pass data to said one of its data buses 315; said one of the I/O ports of the first one of its high bandwidth memory (HBM) IC chips 251 is selected to receive data from said one of its data buses 315. Thereby, in the fourth clock, said one of the I/O ports of the second one of its high bandwidth memory (HBM) IC chips 251 may drive or pass data to said one of the I/O ports of the first one of its high bandwidth memory (HBM) IC chips 251 through said one of its data buses 315. In the fourth clock, said one of its data buses 315 is not used for data transmission by its standard commodity FPGA IC chips 200 coupling thereto or by the other(s) of its high bandwidth memory (HBM) IC chips 251 coupling thereto.

Algorithm for Data Loading to Memory Cells

Figure 18A:
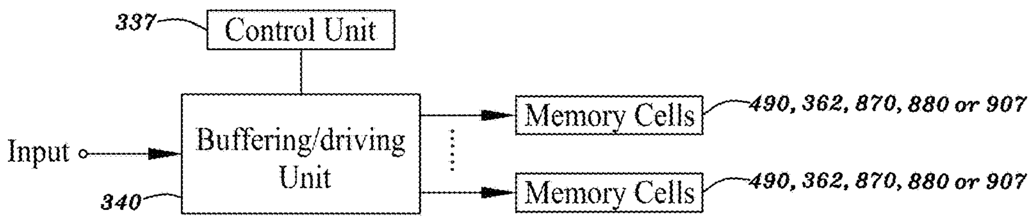
FIGS. 18A and 18B are block diagrams showing an algorithm for data loading to memory cells in accordance with an embodiment of the present application.

FIG. 18A is a block diagram showing an algorithm for data loading to memory cells in accordance with an embodiment of the present application. Referring to FIG. 18A, for loading data to the memory cells 490 and 362 of the standard commodity FPGA IC chip 200 as seen in FIGS. 12A-12J and to the memory cells 362 of the memory-array blocks 423 of the DPIIC chip 410 as seen in FIG. 13, a buffering/driving unit or buffer 340 may be provided for buffering data, such as the resulting values or programming codes, transmitted in series thereto and driving or amplifying the data in parallel to the memory cells 490 and 362 of the standard commodity FPGA IC chip 200 and/or to the memory cells 362 of the DPIIC chip 410. Furthermore, a control unit 337 may be provided for controlling the buffering/driving unit 340 to buffer the resulting values or programming codes transmitted in series to an input of the buffering/driving unit 340 and drive them in parallel from multiple outputs of the buffering/driving unit 340. Each of the outputs of the buffering/driving unit 340 may couple to one of the memory cells 490 and 362 of the standard commodity FPGA IC chip 200 as seen in FIGS. 12A-12J or couple to one of the memory cells 362 of the memory-array blocks 423 of the DPIIC chip 410 as seen in FIG. 13.

Figure 18B:
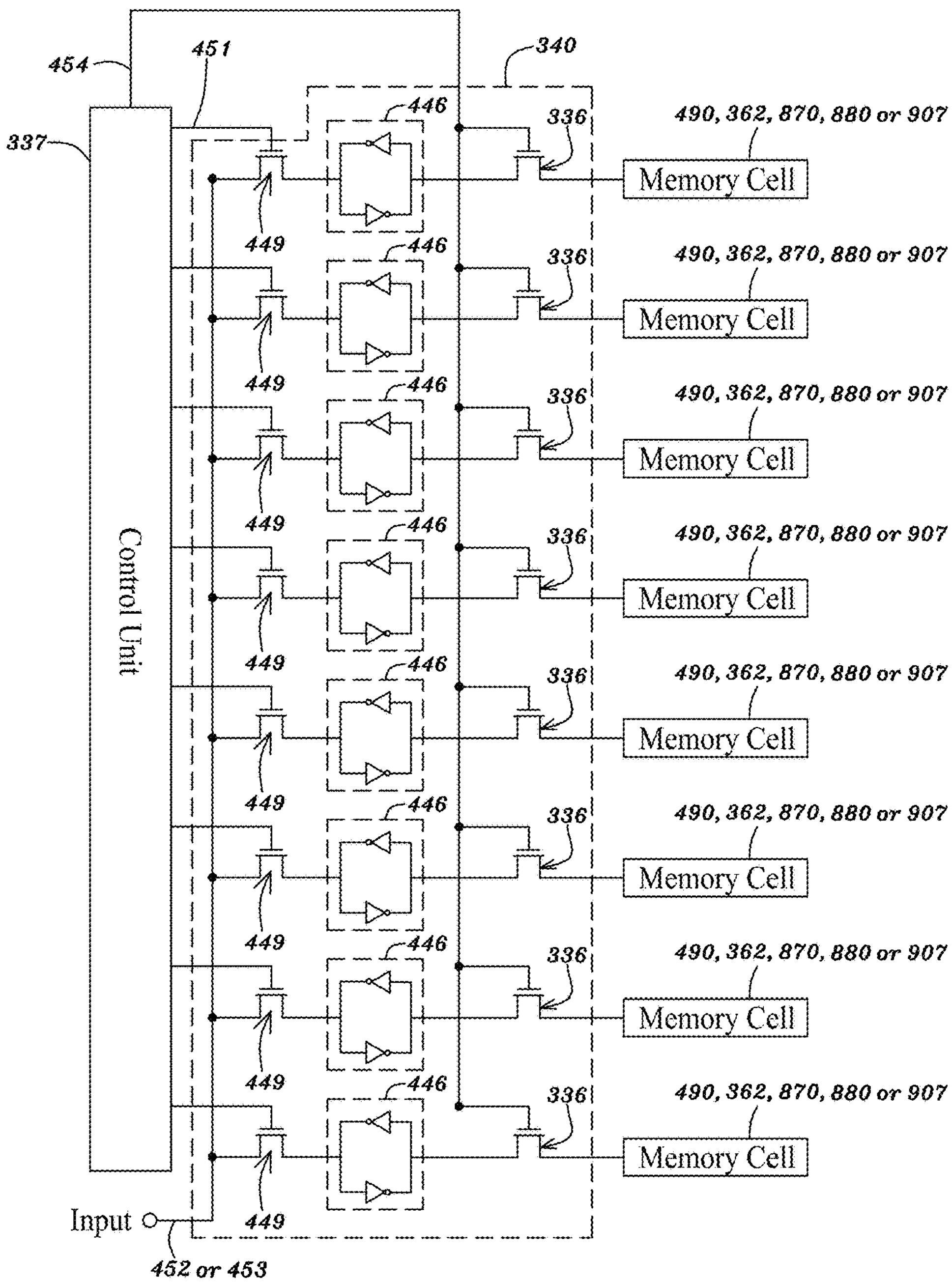

FIG. 18B is a circuit diagram showing architecture for data loading in accordance with an embodiment of the present application. Referring to FIG. 18B, in a serial-advanced-technology-attachment (SATA) standard, the buffering/driving unit 340 may include (1) a plurality of the memory unit 446, which may be the first type of SRAM cell as illustrated in FIG. 1A, being arranged in parallel, (2) a plurality of the switch 449 as illustrated in FIG. 1A, which has a channel with an end coupling to the input of the buffering/driving unit 340 through the bit line 452 or bit-bar line 453 as illustrated in FIG. 1A and the other end coupling to one of the memory units 446, coupling in parallel to each other or one another through the bit line 452 or bit-bar line 453 and (3) a plurality of switch 336 having a channel with an end coupling to one of the memory units 446 and the other end coupling to one of the memory cells 490 and 362 of the standard commodity FPGA IC chip 200 as seen in FIGS. 12A-12J or one of the memory cells 362 of the memory-array blocks 423 of the DPIIC chip 410 as seen in FIG. 13.

Referring to FIG. 18B, the control unit 337 couples to gate terminals of the switches 449 through a plurality of the word line 451 as illustrated in FIG. 1A respectively and to gate terminals of the switches 336 through another word line 454. Thereby, the control unit 337 is configured in turn and one by one to turn on one of the switches 449 and off the others of the switches 449 in each of first clock periods in each of clock cycles and configured to turn off all of the switches 449 in a second clock period in said each of clock cycles. The control unit 337 is configured to turn on all of the switches 336 in the second clock period in said each of clock cycles and off all of the switches 336 in said each of first clock periods in said each of clock cycles with a data bit-width of equal to or greater than 2, 4, 8, 16, 32 or 64 between the buffering/driving unit 340 and the memory cells 490 and 362 of the standard commodity FPGA IC chip 200 or between the buffering/driving unit 340 and the memory cells 362 of the DPIIC chip 410.

For example, referring to FIG. 18B, in a first one of the first clock periods in a first one of the clock cycles, the control unit 337 may turn on the bottommost one of the switches 449 and off the others of the switches 449, and thereby first data, such as a first one of the resulting values or programming codes, from the input of the buffering/driving unit 340 may pass through the channel of the bottommost one of the switches 449 to be latched or stored in the bottommost one of the memory units 446. Next, in a second one of the first clock periods in the first one of the clock cycles, the control unit 337 may turn on the second bottom one of the switches 449 and off the others of the switches 449, and thereby second data, such as a second one of the resulting values or programming codes, from the input of the buffering/driving unit 340 may pass through the channel of the second bottom one of the switches 449 to be latched or stored in the second bottom one of the memory units 446. In the first one of the clock cycles, the control unit 337 may turn on the switches 449, in turn and one by one, and off the others of the switches 449 in the first clock periods, and thereby data, such as a first set of resulting values or programming codes, from the input of the buffering/driving unit 340 may, in turn and one by one, pass through the channels of the switches 449 to be latched or stored in the memory units 446, respectively. In the first one of the clock cycles, after the data from the input of the buffering/driving unit 340 are latched or stored, in turn and one by one, in all of the memory units 446, the control unit 337 may turn on all of the switches 336 and off all of the switches 449 in the second clock period, and thereby the data latched or stored in the memory units 446 may pass in parallel through the channels of the switches 336 to a first group of the memory cells 490 and/or 362 of the standard commodity FPGA IC chip 200 as seen in FIGS. 12A-12J or the memory cells 362 of the memory-array blocks 423 of the DPIIC chip 410 as seen in FIG. 13, respectively.

Next, referring to FIG. 18B, in a second one of the clock cycles, the control unit 337 and buffering/driving unit 340 may perform the same steps as illustrated above in the first one of the clock cycles. In the second one of the clock cycles, the control unit 337 may turn on the switches 449, in turn and one by one, and off the others of the switches 449 in the first clock periods, and thereby data, such as a second set of resulting values or programming codes, from the input of the buffering/driving unit 340 may, in turn and one by one, pass through the channels of the switches 449 to be latched or stored in the memory units 446, respectively. In the second one of the clock cycles, after the data from the input of the buffering/driving unit 340 are latched or stored, in turn and one by one, in all of the memory units 446, the control unit 337 may turn on all of the switches 336 and off all of the switches 449 in the second clock period, and thereby the data latched or stored in the memory units 446 may pass in parallel through the channels of the switches 336 to a second group of the memory cells 490 and/or 362 of the standard commodity FPGA IC chip 200 as seen in FIGS. 12A-12J or the memory cells 362 of the memory-array blocks 423 of the DPIIC chip 410 as seen in FIG. 13, respectively.

Referring to FIG. 18B, the above steps may be repeated for multiple times to have data, such as the resulting values or programming codes, from the input of the buffering/driving unit 340 to be loaded in the memory cells 490 and/or 362 of the standard commodity FPGA IC chip 200 as seen in FIGS. 12A-12J or the memory cells 362 of the memory-array blocks 423 of the DPIIC chip 410 as seen in FIG. 13. The buffering/driving unit 340 may latch the data from its single input and increase data bit-width to the memory cells 490 and/or 362 of the standard commodity FPGA IC chip(s) 200 as seen in FIGS. 12A-12J or the memory cells 362 of the memory-array blocks 423 of the DPIIC chips 410 as seen in FIG. 13 in the standard commodity logic drive 300 as seen in FIGS. 15A-15O.

Alternatively, in a peripheral-component-interconnect (PCI) standard, referring to FIGS. 18A and 18B, a plurality of the buffering/driving unit 340 having the number equal to or greater than 4, 8, 16, 32, or 64, for example, may be provided in parallel to buffer data, such as the resulting values or programming codes, in parallel from its inputs and drive or amplify the data to the memory cells 490 and/or 362 of the standard commodity FPGA IC chip(s) 200 as seen in FIGS. 12A-12J or the memory cells 362 of the memory-array blocks 423 of the DPIIC chips 410 as seen in FIG. 13 in the standard commodity logic drive 300 as seen in FIGS. 15A-15O. Each of the buffering/driving units 340 may perform the same function as mentioned above.

I. First Arrangement for Control Unit and Buffering/Driving Unit for Standard Commodity FPGA IC Chip Referring to FIGS. 18A and 18B, a plurality of the buffering/driving unit 340 and control unit 337 may be set in each of the standard commodity FPGA IC chips 200 in the standard commodity logic drive as illustrated in FIGS. 15A-15O. Each of the buffering/driving units 340 may have its input coupling to the output "Out" of one of the sense amplifiers 666 for sensing the non-volatile memory cells 870, 880 or 907 as illustrated in FIG. 8A-8F, 9A-9H, 10A-10I or 11A-11F and FIGS. 12A-12J. In a case that a bit width between the plurality of the buffering/driving unit 340 and the sense amplifiers 666 is 32 bits, the buffering/driving units 340 having the number of 32 may be set in parallel in said each of the standard commodity FPGA IC chips 200 to buffer data, such as the resulting values or programming codes, from their 32 respective inputs coupling to the outputs "Out" of the 32 respective sense amplifiers 666, i.e., with a bit width of 32 bits in parallel, and drive or amplify the data to the memory cells 490 and/or 362 of said each of the standard commodity FPGA IC chips 200 as seen in FIGS. 12A-12J. In each of the clock cycles, each of the control units 337 may turn on the switches 449, in turn and one by one, of one of the 32 buffering/driving units 340 and off the others of the switches 449 of said one of the 32 buffering/driving units 340 in the first clock periods and turn off all of the switches 336 of said one of the 32 buffering/driving units 340 in the first clock periods, and thereby data, such as the resulting values or programming codes, from the input of said one of the 32 buffering/driving units 340 may, in turn and one by one, pass through the channels of the switches 449 of said one of the 32 buffering/driving units 340 to be latched or stored in the memory units 446 of said one of the 32 buffering/driving units 340, respectively. In said each of the clock cycles, after the data from their 32 respective inputs in parallel are latched or stored, in turn and one by one, in all of the memory units 446 of the 32 buffering/driving units 340, the control units 337 may turn on all of the switches 336 of the 32 buffering/driving units 340 and off all of the switches 449 of the 32 buffering/driving units 340 in the second clock period, and thereby the data latched or stored in all of the memory units 446 of the 32 buffering/driving units 340 may pass in parallel through the channels of the switches 336 of the 32 buffering/driving units 340 to the memory cells 490 and/or 362 of said each of the standard commodity FPGA IC chips 200 as seen in FIGS. 12A-12J, respectively.

Each of the memory cells 490 for the look-up tables (LUTs) 210 may be referred to one 398 as illustrated in FIG. 1A or 1B, and the memory cells 362 for the cross-point switches 379 may be referred to one 398 as illustrated in FIG. 1A or 1B. For each of the standard commodity logic drives 300 as seen in FIGS. 15A-15O, each of the standard commodity FPGA IC chips 200 may be provided with the first arrangement for the control units 337 and buffering/driving units 340 as mentioned above.

II. Second Arrangement for Control Unit and Buffering/Driving Unit for Standard Commodity FPGA IC Chip Referring to FIGS. 18A and 18B, a plurality of the buffering/driving unit 340 and control unit 337 may be set in each of the standard commodity FPGA IC chips 200 in the standard commodity logic drive as illustrated in FIGS. 15A-15O. Each of the buffering/driving units 340 may have its input coupling to the output S_Data_in of the small receiver 375 of one of the small I/O circuits 203 of said each of the standard commodity FPGA IC chips 200 as illustrated in FIG. 5B. In a case that a bit width between the plurality of the buffering/driving unit 340 and the small receivers 375 of the small I/O circuits 203 is 32 bits, the buffering/driving units 340 having the number of 32 may be set in parallel in said each of the standard commodity FPGA IC chips 200 to buffer data, such as the resulting values or programming codes, from their 32 respective inputs coupling to the outputs S_Data_in of the small receivers 375 of the 32 respective small I/O circuits 203, i.e., with a bit width of 32 bits in parallel, and drive or amplify the data to be passed to a determined group of the non-volatile memory cells 870, 880 or 907 of said each of the standard commodity FPGA IC chips 200 as illustrated in FIG. 8A-8F, 9A-9H, 10A-10I or 11A-11F and FIGS. 12A-12J. In each of the clock cycles, each of the control units 337 may turn on the switches 449, in turn and one by one, of one of the 32 buffering/driving units 340 and off the others of the switches 449 of said one of the 32 buffering/driving units 340 in the first clock periods and turn off all of the switches 336 of said one of the 32 buffering/driving units 340 in the first clock periods, and thereby data, such as the resulting values or programming codes, from the input of said one of the 32 buffering/driving units 340 may, in turn and one by one, pass through the channels of the switches 449 of said one of the 32 buffering/driving units 340 to be latched or stored in the memory units 446 of said one of the 32 buffering/driving units 340, respectively. In said each of the clock cycles, after the data from their 32 respective inputs in parallel are latched or stored, in turn and one by one, in all of the memory units 446 of the 32 buffering/driving units 340, the control units 337 may turn on all of the switches 336 of the 32 buffering/driving units 340 and off all of the switches 449 of the 32 buffering/driving units 340 in the second clock period, and thereby the data latched or stored in all of the memory units 446 of the 32 buffering/driving units 340 may pass in parallel through the channels of the switches 336 of the 32 buffering/driving units 340 to a determined group of the non-volatile memory cells 870, 880 or 907 of said each of the standard commodity FPGA IC chips 200 as illustrated in FIG. 8A-8F, 9A-9H, 10A-10I or 11A-11F and FIGS. 12A-12J, respectively.

For each of the standard commodity logic drives 300 as seen in FIGS. 15A-15O, each of the standard commodity FPGA IC chips 200 may be provided with the second arrangement for the control units 337 and buffering/driving units 340 as mentioned above.

III. Third Arrangement for Control Unit and Buffering/Driving Unit for DPIIC Chip Referring to FIGS. 18A and 18B, a plurality of the buffering/driving unit 340 and control unit 337 may be set in each of the DPIIC chips 410 in the standard commodity logic drive as illustrated in FIGS. 15A-15O. Each of the buffering/driving units 340 may have its input coupling to the output “Out” of one of the sense amplifiers 666 for sensing the non-volatile memory cells 870, 880 or 907 as illustrated in FIG. 8A-8F, 9A-9H, 10A-10I or 11A-11F and FIG. 13. In a case that a bit width between the plurality of the buffering/driving unit 340 and the sense amplifiers 666 is 32 bits, the buffering/driving units 340 having the number of 32 may be set in parallel in said each of the DPIIC chips 410 to buffer data, such as the programming codes, from their 32 respective inputs coupling to the outputs “Out” of the 32 respective sense amplifiers 666, i.e., with a bit width of 32 bits in parallel, and drive or amplify the data to the memory cells 362 of the memory-array blocks 423 of said each of the DPIIC chips 410 as seen in FIG. 13. In each of the clock cycles, each of the control units 337 may turn on the switches 449, in turn and one by one, of one of the 32 buffering/driving units 340 and off the others of the switches 449 of said one of the 32 buffering/driving units 340 in the first clock periods and turn off all of the switches 336 of said one of the 32 buffering/driving units 340 in the first clock periods, and thereby data, such as the programming codes, from the input of said one of the 32 buffering/driving units 340 may, in turn and one by one, pass through the channels of the switches 449 of said one of the 32 buffering/driving units 340 to be latched or stored in the memory units 446 of said one of the 32 buffering/driving units 340, respectively. In said each of the clock cycles, after the data from their 32 respective inputs in parallel are latched or stored, in turn and one by one, in all of the memory units 446 of the 32 buffering/driving units 340, the control units 337 may turn on all of the switches 336 of the 32 buffering/driving units 340 and off all of the switches 449 of the 32 buffering/driving units 340 in the second clock period, and thereby the data latched or stored in all of the memory units 446 of the 32 buffering/driving units 340 may pass in parallel through the channels of the switches 336 of the 32 buffering/driving units 340 to the memory cells 362 of the memory-array blocks 423 of said each of the DPIIC chips 410 as seen in FIG. 13, respectively.

Each of the memory cells 362 for the cross-point switches 379 may be referred to one 398 as illustrated in FIG. 1A or IB. For each of the standard commodity logic drives 300 as seen in FIGS. 15A-15O, each of the DPIIC chips 410 may be provided with the third arrangement for the control units 337 and buffering/driving units 340 as mentioned above.

IV. Fourth Arrangement for Control Unit and Buffering/Driving Unit for DPIIC Chip Referring to FIGS. 18A and 18B, a plurality of the buffering/driving unit 340 and control unit 337 may be set in each of the DPIIC chips 410 in the standard commodity logic drive as illustrated in FIGS. 15A-15O. Each of the buffering/driving units 340 may have its input coupling to the output S_Data_in of the small receiver 375 of one of the small I/O circuits 203 of said each of the DPIIC chips 410 as illustrated in FIG. 5B. In a case that a bit width between the plurality of the buffering/driving unit 340 and the small receivers 375 of the small I/O circuits 203 is 32 bits, the buffering/driving units 340 having the number of 32 may be set in parallel in said each of the DPIIC chips 410 to buffer data, such as the programming codes, from their 32 respective inputs coupling to the outputs S_Data_in of the small receivers 375 of the 32 respective small JO circuits 203, i.e., with a bit width of 32 bits in parallel, and drive or amplify the data to be passed to a determined group of the non-volatile memory cells 870, 880 or 907 of said each of the DPIIC chips 410 as illustrated in FIG. 8A-8F, 9A-9H, 10A-10I or 11A-11F and FIG. 13. In each of the clock cycles, each of the control units 337 may turn on the switches 449, in turn and one by one, of one of the 32 buffering/driving units 340 and off the others of the switches 449 of said one of the 32 buffering/driving units 340 in the first clock periods and turn off all of the switches 336 of said one of the 32 buffering/driving units 340 in the first clock periods, and thereby data, such as the resulting values or programming codes, from the input of said one of the 32 buffering/driving units 340 may, in turn and one by one, pass through the channels of the switches 449 of said one of the 32 buffering/driving units 340 to be latched or stored in the memory units 446 of said one of the 32 buffering/driving units 340, respectively. In said each of the clock cycles, after the data from their 32 respective inputs in parallel are latched or stored, in turn and one by one, in all of the memory units 446 of the 32 buffering/driving units 340, the control units 337 may turn on all of the switches 336 of the 32 buffering/driving units 340 and off all of the switches 449 of the 32 buffering/driving units 340 in the second clock period, and thereby the data latched or stored in all of the memory units 446 of the 32 buffering/driving units 340 may pass in parallel through the channels of the switches 336 of the 32 buffering/driving units 340 to a determined group of the non-volatile memory cells 870, 880 or 907 of said each of the DPIIC chips 410 as illustrated in FIG. 8A-8F, 9A-9H, 10A-10I or 11A-11F and FIG. 13, respectively.

For each of the standard commodity logic drives 300 as seen in FIGS. 15A-15O, each of the DPIIC chips 410 may be provided with the fourth arrangement for the control units 337 and buffering/driving units 340 as mentioned above.

Architecture of Operation in Standard Commodity FPGA IC Chip

Figure 18C:
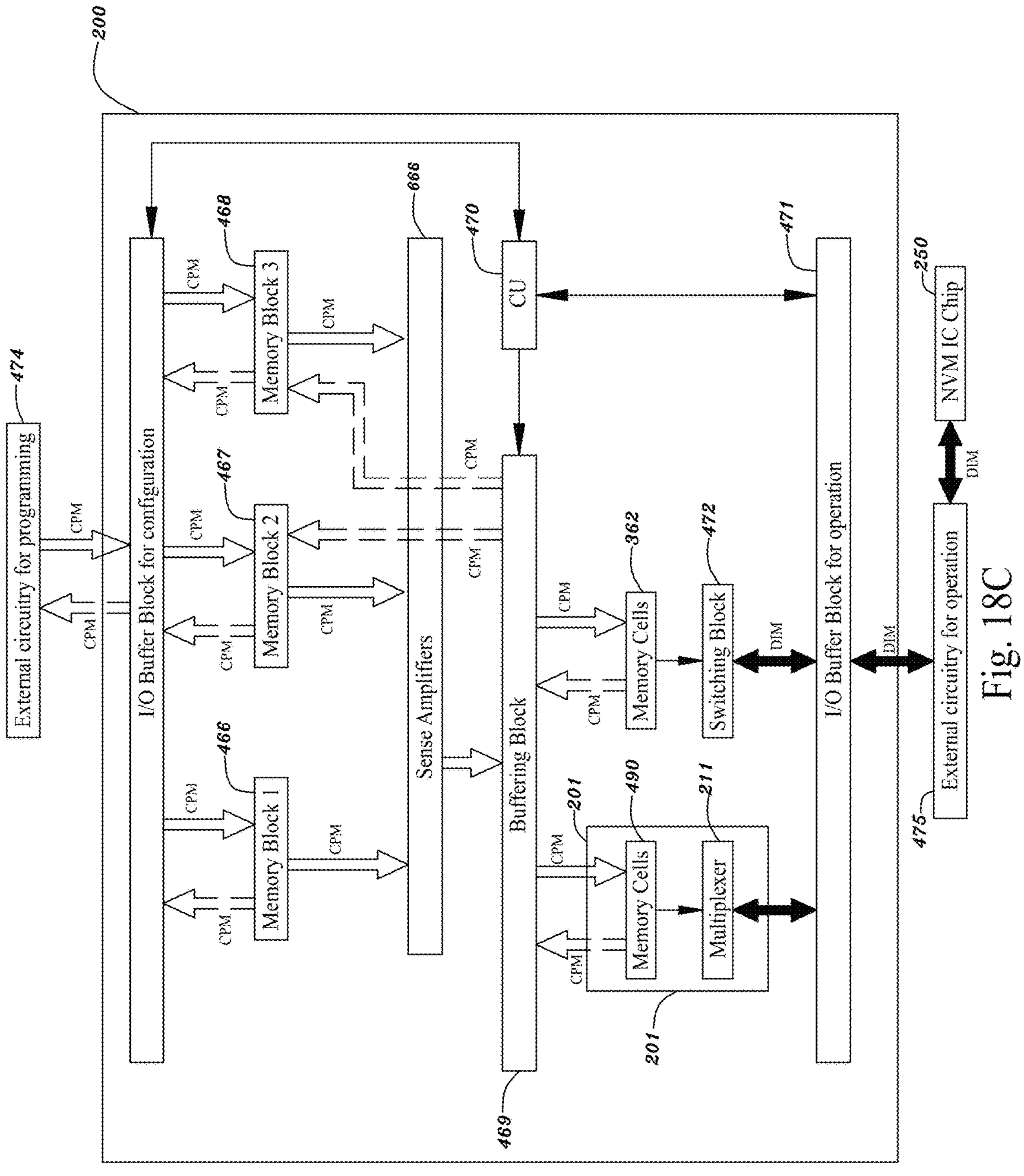
FIG. 18C is a block diagrams showing architecture of programming and operation in a standard commodity FPGA IC chip in accordance with the present application.

FIG. 18C is a block diagrams showing architecture of programming and operation in a standard commodity FPGA IC chip in accordance with the present application. Referring to FIG. 18C, each of the standard commodity FPGA IC chips 200 in the standard commodity logic drive 300 as illustrated in FIGS. 15A-15O may include three non-volatile memory blocks 466, 467 and 468 each composed of the non-volatile memory cells 870, 880 or 907 as seen in FIG. 8A-8F, 9A-9H, 10A-10I or 11A-11F arranged in an array. The non-volatile memory cells 870, 880 or 907, i.e., configuration programming memory (CPM) cells, in the non-volatile memory block 466 are configured to save or store original resulting values or programming codes for the look-up tables (LUT) 210 as seen in FIGS. 6A-6N or programming codes for the cross-point switches 379 or pass/no-pass switches 258 as seen in FIGS. 7A-7C, i.e., configuration programming memory (CPM) data. The original resulting values or programming codes, i.e., configuration programming memory (CPM) data, may be passed from configuration programming memory (CPM) cells of circuits 474 external of said each of the standard commodity FPGA IC chips 200, such as configuration programming memory (CPM) cells of the NVM IC chips 250 in the standard commodity logic drive 300 as illustrated in FIGS. 15A-15O or configuration programming memory (CPM) cells of circuits outside the standard commodity logic drive 300 as illustrated in FIGS. 15A-15O, to the non-volatile memory cells 870, 880 or 907, i.e., configuration programming memory (CPM) cells, in the non-volatile memory block 466 through, in sequence, a plurality of the small I/O circuit 203 as seen in FIG. 5B in an I/O buffering block 473 of said each of the standard commodity FPGA IC chips 200 and a plurality of the buffering/driving unit 340 as illustrated in FIGS. 18A and 18B in the I/O buffering block 473 of said each of the standard commodity FPGA IC chips 200, as arranged in the second arrangement for the control units 337 and buffering/driving units 340 as illustrated in FIGS. 18A and 18B, to be stored or saved in the non-volatile memory cells 870, 880 or 907, i.e., configuration programming memory (CPM) cells, in the non-volatile memory block 466.

Referring to FIG. 18C, the non-volatile memory cells 870, 880 or 907, i.e., configuration programming memory (CPM) cells, in the non-volatile memory block 467 are configured to save or store immediately-previously self-configured resulting values or programming codes for the look-up tables (LUT) 210 as seen in FIGS. 6A-6J or programming codes for the cross-point switches 379 or pass/no-pass switches 258 as seen in FIGS. 7A-7C, i.e., configuration programming memory (CPM) data. The non-volatile memory cells 870, 880 or 907, i.e., configuration programming memory (CPM) cells, in the non-volatile memory block 468 are configured to save or store currently self-configured resulting values or programming codes for the look-up tables (LUT) 210 of the programmable logic block (LB) 201 as seen in FIGS. 6A-6J or programming codes for the cross-point switches 379 or pass/no-pass switches 258 as seen in FIGS. 7A-7C, i.e., configuration programming memory (CPM) data.

Referring to FIG. 18C, said each of the standard commodity FPGA IC chips 200 may include the sense amplifiers 666 as illustrated in FIG. 8A-8F, 9A-9H, 10A-10I or 11A-11F each configured to sense configuration programming memory (CPM) data saved or stored in one of the non-volatile memory cells 870, 880 or 907, i.e., configuration programming memory (CPM) cells, in one of the non-volatile memory blocks 466, 467 and 468 into the output "Out" of said each of the sense amplifiers 666 coupling to the input of one of the buffering/driving units 340 in the buffering block 469 as arranged in the first arrangement for the control units 337 and buffering/driving units 340 as illustrated in FIGS. 18A and 18B. For an example, said each of the standard commodity FPGA IC chips 200 may include a plurality of the control unit (CU) 337 in a control block 470 as illustrated in FIGS. 18A and 18B configured (1) to send control commands to circuits external of said each of the standard commodity FPGA IC chips 200 through the small I/O circuits 203 as seen in FIG. 5B in the I/O buffering blocks 471 and/or 473 and/or (2) to receive control commands from circuits external of said each of the standard commodity FPGA IC chips 200 through the small I/O circuits 203 as seen in FIG. 5B in the I/O buffering blocks 471 and/or 473. Further, each of the control units (CU) 337 in the control block 470 is configured to send control commands to one of the buffering/driving units 340 in the buffering block 469 to control the memory cells 446 of said one of the buffering/driving units 340 (1) to store, save or register, in turn and one by one, the input of the buffering/driving units 340 from one of the outputs "Out" of the sense amplifiers 666 and (2) to generate parallel outputs to a determined group of the memory cells 490, i.e., configuration programming memory (CPM) cells, for the look-up tables (LUT) 210 of the programmable logic block (LB) 201 as illustrated in FIGS. 6A-6J and/or the memory cells 362, i.e., configuration programming memory (CPM) cells, for the cross-point switches 379 or pass/no-pass switches 258 as illustrated in FIGS. 7A-7C in a switching block 472. The configuration programming memory (CPM) data stored in a group of the memory cells 490 couple to the first set of inputs of the multiplexer 211 of the programmable logic block (LB) 201 to define a function of the programmable logic block (LB) 201 as illustrated in FIGS. 6A-6J; the configuration programming memory (CPM) data stored in a group of the memory cells 362 couple to the cross-point switches 379 or pass/no-pass switches 258 as seen in FIGS. 7A-7C in the switching block 472 to program the cross-point switches 379 or pass/no-pass switches 258.

Referring to FIG. 18, a data information memory (DIM) stream may pass from data information memory (DIM) cells of circuits 475 external of said each of the standard commodity FPGA IC chips 200, such as SRAM or DRAM cells of the HBM IC chips 251 in the standard commodity logic drive 300 as illustrated in FIGS. 15A-15O, to the second set of the multiplexer 211 of the programmable logic block (LB) 201 through the small I/O circuits 203 as seen in FIG. 5B in the I/O buffering block 471 of said each of the standard commodity FPGA IC chips 200. Alternatively, the multiplexer 211 of the programmable logic block (LB) 201 may generate its output to data information memory (DIM) cells of the circuits 475 external of said each of the standard commodity FPGA IC chips 200, such as SRAM or DRAM cells of the HBM IC chips 251 in the standard commodity logic drive 300 as illustrated in FIGS. 15A-15O, through one of the small I/O circuits 203 as seen in FIG. 5B in the I/O buffering block 471. The cross-point switches 379 or pass/no-pass switches 258 in the switching block 472 may pass a data information memory (DIM) stream to or from data information memory (DIM) cells of the circuits 475 external of said each of the standard commodity FPGA IC chips 200, such as SRAM or DRAM cells of the HBM IC chips 251 in the standard commodity logic drive 300 as illustrated in FIGS. 15A-15O, through one of the small I/O circuits 203 as seen in FIG. 5B in the I/O buffering block 471.

Referring to FIG. 18C, the data for the data information memory (DIM) stream saved or stored in the SRAM or DRAM cells, i.e., data information memory (DIM) cells, in the HBM IC chips may be backed up or stored in the NVM IC chips 250 in the standard commodity logic drive 300 as illustrated in FIGS. 15A-15O or circuits outside the standard commodity logic drive 300 as illustrated in FIGS. 15A-15O. Thereby, when the power supply of the standard commodity logic drive 300 is turned off, the data for the data information memory (DIM) stream stored in the NVM IC chips 250 may be kept.

For reconfiguration for artificial intelligence (AI), machine learning or deep learning, the current operation, such as AND logic operation, of the programmable logic blocks (LB) 201 as illustrated in FIG. 6A or 6H may be self-reconfigured to another operation, such as NAND logic operation, by reconfiguring the resulting values or programming codes, i.e., configuration programming memory (CPM) data, in the memory cells 490 for the look-up table (LUT) 210 as seen in FIG. 6A or 6H. The current switching state of the cross-point switches 379 or pass/no-pass switches 258 as seen in FIGS. 7A-7C may be self-reconfigured to another switching state by reconfiguring the programming codes, i.e., configuration programming memory (CPM) data, in the memory cells 362. The currently self-reconfigured resulting values or programming codes, i.e., configuration programming memory (CPM) data, in the memory cells 490 and 362 may be passed to the non-volatile memory cells 870, 880 or 907, i.e., configuration programming memory (CPM) cells, in the non-volatile memory block 468 through the input of the plurality of the buffering/driving unit 340 as illustrated in FIGS. 18A and 18B in the buffering block 469, as arranged in the second arrangement for the control units 337 and buffering/driving units 340 as illustrated in FIGS. 18A and 18B, and then saved or stored in the non-volatile memory cells 870, 880 or 907 in the non-volatile memory block 468. Also, the immediately-previously self-reconfigured resulting values or programming codes, i.e., configuration programming memory (CPM) data, in the memory cells 490 and 362 may be passed to the non-volatile memory cells 870, 880 or 907, i.e., configuration programming memory (CPM) cells, in the non-volatile memory block 467 through the input of the plurality of the buffering/driving unit 340 as illustrated in FIGS. 18A and 18B in the buffering block 469, as arranged in the second arrangement for the control units 337 and buffering/driving units 340 as illustrated in FIGS. 18A and 18B, and then saved or stored in the non-volatile memory cells 870, 880 or 907 in the non-volatile memory block 467. Further, the original, immediately-previously self-reconfigured and currently self-reconfigured resulting values or programming codes may be passed from the non-volatile memory cells 870, 880 or 907 in the respective non-volatile memory blocks 466, 467 and 468 to configuration programming memory (CPM) cells of the circuits 474 external of said each of the standard commodity FPGA IC chips 200 through a plurality of the small I/O circuit 203 as seen in FIG. 5B in the I/O buffering block 473. The configuration programming memory (CPM) data, i.e., the resulting values or programming codes for the look-up tables (LUT) 210 as seen in FIGS. 6A-6J or programming codes for the cross-point switches 379 or pass/no-pass switches 258 as seen in FIGS. 7A-7C, may be passed from the configuration programming memory (CPM) cells of the circuits 474 external of said each of the standard commodity FPGA IC chips 200 to the non-volatile memory cells 870, 880 or 907 in either of the non-volatile memory blocks 467 and 468 through, in sequence, a plurality of the small I/O circuit 203 as seen in FIG. 5B in the I/O buffering block 473 and the plurality of the buffering/driving unit 340 as illustrated in FIGS. 18A and 18B in the I/O buffering block 473, as arranged in the second arrangement for the control units 337 and buffering/driving units 340 as illustrated in FIGS. 18A and 18B, to be stored or saved in the non-volatile memory cells 870, 880 or 907 in said either of the memory blocks 467 and 468 to reconfigure the programmable logic blocks (LB) 201 and/or the cross-point switches 379 or pass/no-pass switches 258.

Accordingly, referring to FIG. 18C, for each of the standard commodity logic drives 300 as illustrated in FIGS. 15A-15O, when it is powered on, each of its standard commodity FPGA IC chips 200 may reload the configuration programming memory (CPM) data stored or saved in the non-volatile memory cells 870, 880 or 907 in one of the three non-volatile memory blocks 466, 467 and 468 of said each of its standard commodity FPGA IC chips 200 to the memory cells 490 and 362 of said each of its standard commodity FPGA IC chips 200. During operation, said each of its standard commodity FPGA IC chips 200 may be reset to reload the configuration programming memory (CPM) data stored or saved in the non-volatile memory cells 870, 880 or 907 in the non-volatile memory block 466 or 467 of said each of its standard commodity FPGA IC chips 200 to the memory cells 490 and 362 of said each of its standard commodity FPGA IC chips 200.

Specification for Processes

Each of the standard commodity FPGA IC chips 200, DPIIC chips 410, dedicated I/O chips 265, dedicated control chip 260, dedicated control and I/O chip 266, IAC chip 402, DCIAC chip 267, DCDI/OIAC chip 268, NVM IC chips 250, DRAM IC chips 321, HBM IC chips 251 and PCIC chips 269 may be formed by following steps for forming through silicon vias, first interconnection scheme for a chip (FISC), passivation layer, second interconnection scheme for a chip (SISC) and/or micro-bumps or micro-pillars.

Through Silicon Vias and Process for Forming the Same

Figure 19A:
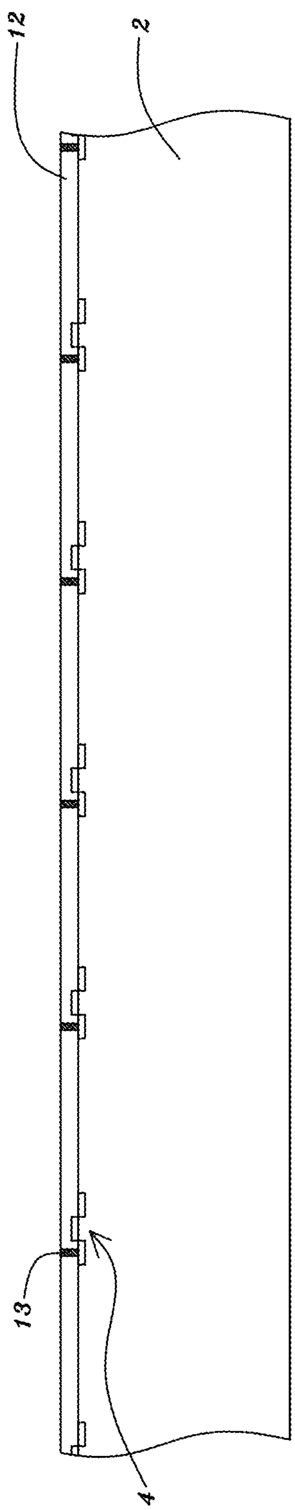
FIGS. 19A-19I are cross-sectional views showing a process for forming through silicon vias (TSV) in a semiconductor wafer in accordance with an embodiment of the present application.

FIGS. 19A-19I are cross-sectional views showing a process for forming through silicon vias (TSV) in a semiconductor wafer in accordance with an embodiment of the present application. Referring to FIG. 19A, a semiconductor substrate or semiconductor blank wafer 2 may be a silicon substrate or silicon wafer, a GaAs substrate, GaAs wafer, a SiGe substrate, SiGe wafer, Silicon-On-Insulator (SOI) substrate with the substrate wafer size, for example 8", 12" or 18" in the diameter.

Referring to FIG. 19A, multiple semiconductor devices 4 are formed in or over a semiconductor-device area of the semiconductor substrate 2. The semiconductor devices 4 may comprise a memory cell, a logic circuit, a passive device, such as a resistor, a capacitor, an inductor or a filter, or an active device, such as p-channel MOS device, n-channel MOS device, CMOS (Complementary Metal Oxide Semiconductor) device, BJT (Bipolar Junction Transistor) device, BiCMOS (Bipolar CMOS) device or FIN Field-Effect-Transistor (FINFET), FINFET on Silicon-On-Insulator (FINFET SOI), Fully Depleted Silicon-On-Insulator (FDSOI) MOSFET, Partially Depleted Silicon-On-Insulator (PDSOI) MOSFET or conventional MOSFET, used for the transistors of the standard commodity FPGA IC chips 200, DPIIC chips 410, dedicated I/O chips 265, dedicated control chip 260, dedicated control and I/O chip 266, IAC chip 402, DCIAC chip 267, DCDI/OIAC chip 268, NVM IC chips 250, DRAM IC chips 321, HBM IC chips 251 and PCIC chips 269.

With regards to the logic drive 300 as seen in FIGS. 15A-15O, the semiconductor devices 4 may compose the multiplexer 211 of the programmable logic blocks (LB) 201, cells (A) 2011 for fixed-wired adders of the programmable logic blocks (LB) 201, cells (M) 2012 for fixed-wired multipliers of the programmable logic blocks (LB) 201, cells (C/R) 2013 for caches and registers of the programmable logic blocks (LB) 201, memory cells 490 for the look-up table 210 of the programmable logic blocks (LB) 201, memory cells 362 for the pass/no-pass switches 258, pass/no-pass switches 258, cross-point switches 379 and small I/O circuits 203, as illustrated in FIGS. 12A-12N, for each of its standard commodity FPGA IC chips 200. The semiconductor devices 4 may compose the memory cells 362 for the pass/no-pass switches 258, pass/no-pass switches 258, cross-point switches 379 and small I/O circuits 203, as illustrated in FIG. 13, for each of its DPIIC chips 410. The semiconductor devices 4 may compose the large and small I/O circuits 341 and 203, as illustrated in FIG. 14, for each of its dedicated I/O chips 265, its dedicated control and I/O chip 266 or its DCDI/OIAC chip 268. The semiconductor devices 4 may compose the control unit 337 as seen in FIGS. 18A and 18B set in each of its standard commodity FPGA IC chips 200 and each of its DPIIC chips 410. The semiconductor devices 4 may compose the buffering/driving unit 340 as seen in FIGS. 18A and 18B set in each of its standard commodity FPGA IC chips 200 and each of its DPIIC chips 410.

Referring to FIG. 19A, after the semiconductor devices 4 are formed in and on the semiconductor substrate 2, an insulating dielectric layer 12 may be formed on the semiconductor substrate 2 and semiconductor devices 4. The insulating dielectric layer 12 may include an oxide layer, oxynitride layer or nitride layer having a thickness, for example, between 3 nm and 500 nm, between 10 run and 1,000 nm, between 10 nm and 2,000 nm or between 10 nm and 3,000 nm, or thinner than 5 nm, 10 nm, 30 nm, 50 nm, 100 nm, 200 nm, 300 nm, 500 nm, 1,000 nm or 2,000 nm. Next, multiple openings are formed, using photolithography and etching processes, in the insulating dielectric layer 12 to expose respective terminals of the semiconductor devices 4, such as source terminals, drain terminals and gate terminals of MOS transistors. Next, multiple tungsten plugs 13 are formed, using a chemical vapor deposition (CVD) process, in the openings in the insulating dielectric layer 12.

Figure 19B:
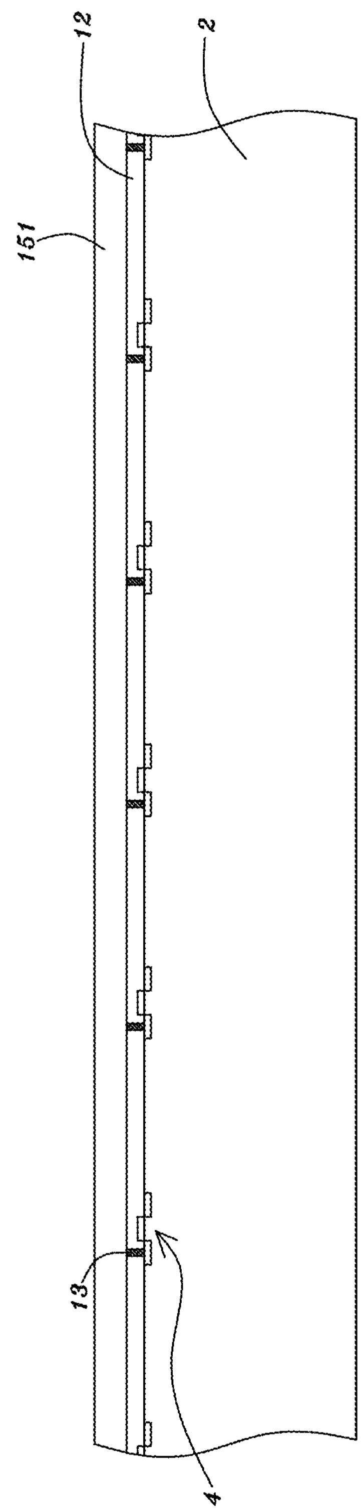

Next, referring to FIG. 19B, a masking insulating layer 151 may be formed, using a heating process or chemical vapor deposition (CVD) process, on the insulating layer 12 and tungsten plugs 13. The masking insulating layer 151 may include thermally grown silicon oxide ($SiO_2$) and/or CVD silicon nitride ($Si_3N_4$). Alternatively, the masking insulating layer 151 may include an oxide layer, oxynitride layer or nitride layer having a thickness between, for example, 3 nm and 500 nm, between 10 nm and 1,000 nm, between 10 nm and 2,000 nm or between 10 nm and 3,000 nm, or thinner than 5 nm, 10 nm, 30 nm, 50 nm, 100 nm, 200 nm, 300 nm, 500 nm, 1,000 nm or 2,000 nm.

Figure 19C:
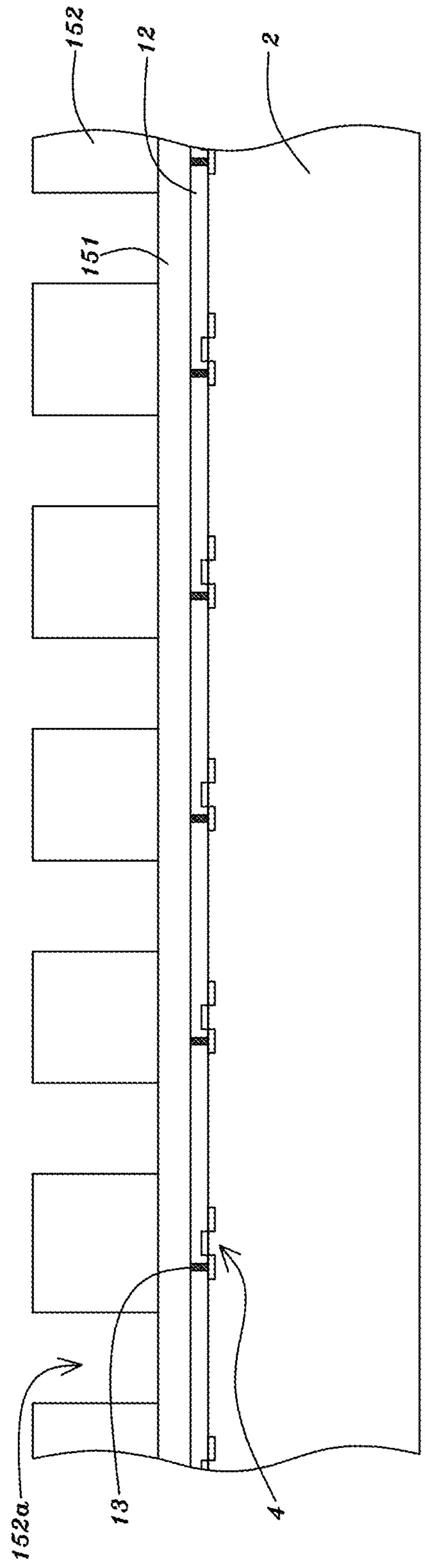

Next, referring to FIG. 19C, a photoresist layer 152 may be formed, using a spin-on coating process, on the masking insulating layer 151. Next, multiple openings 152*a* may be formed, using a photolithography process, in the photoresist layer 152 to expose the masking insulating layer 151.

Figure 19D:
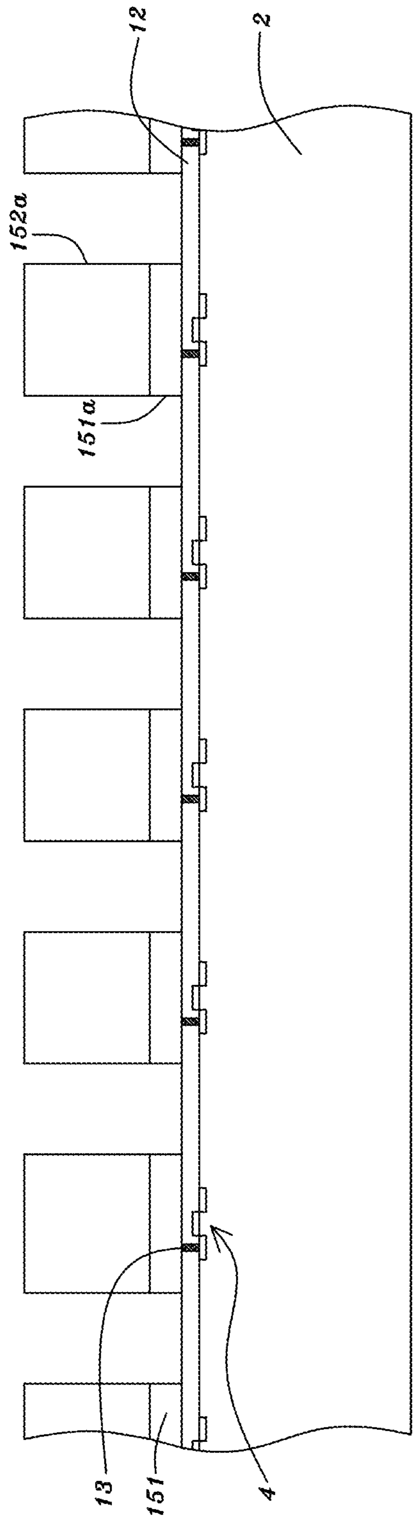

Next, referring to FIG. 19D, multiple openings 151*a* may be formed, using an etching process, in the masking insulating layer 151 under the openings 152*a* in the photoresist layer 152 to expose the insulating dielectric layer 12.

Figure 19E:
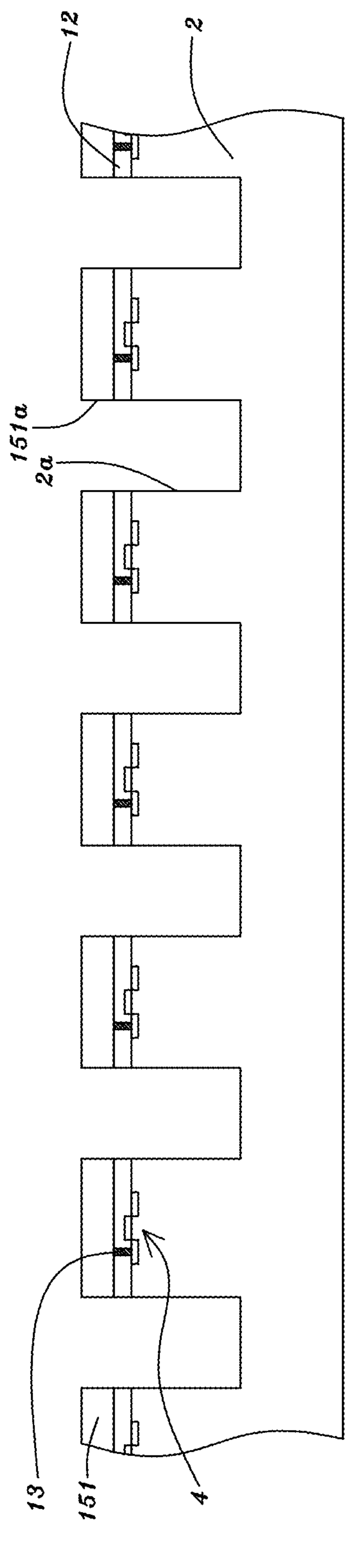

Next, referring to FIG. 19E, the photoresist layer 152 may be removed. Next, multiple blind holes 2*a* may be formed in the insulating dielectric layer 12 and silicon substrate 2 under the openings 151*a* in the masking insulating layer 151 by etching the insulating dielectric layer 12 and silicon substrate 2 for a predetermined time period. Each of the blind holes 2*a* may have a depth between 10 μm and 100 μm or between 20 μm and 60 μm and a diameter or largest transverse dimension between 2 μm and 60 μm or between 5 μm and 20 μm.

Figure 19F:
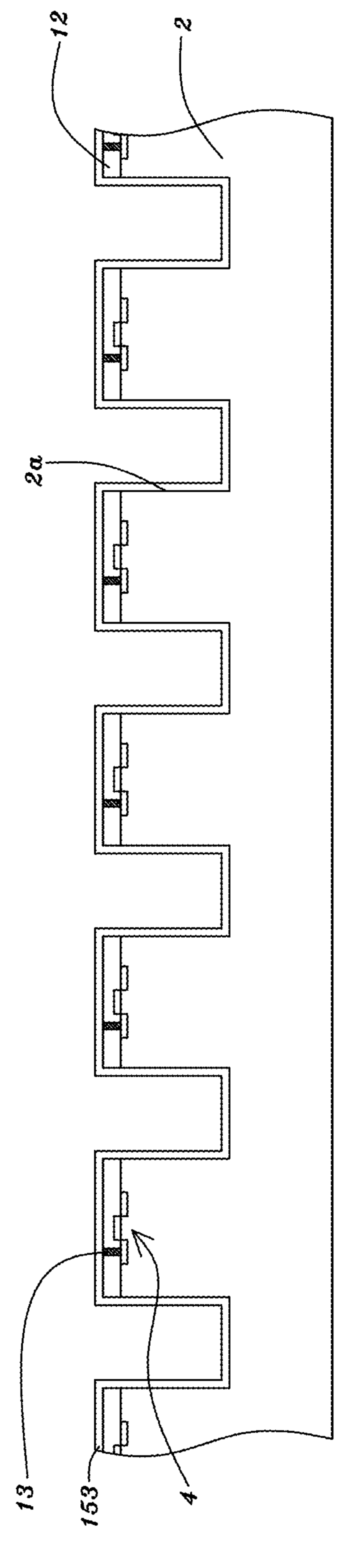

Next, referring to FIG. 19F, the masking insulating layer 151 may be removed. Next, an insulating lining layer 153 may be formed, using a heating process or chemical vapor deposition (CVD) process, on the sidewalls and bottoms of the blind holes 2*a* and on the insulating dielectric layer 12. The insulating lining layer 153 may be, for example, a thermally grown silicon oxide ($SiO_2$) and/or a CVD silicon nitride ($Si_3N_4$).

Figure 19G:
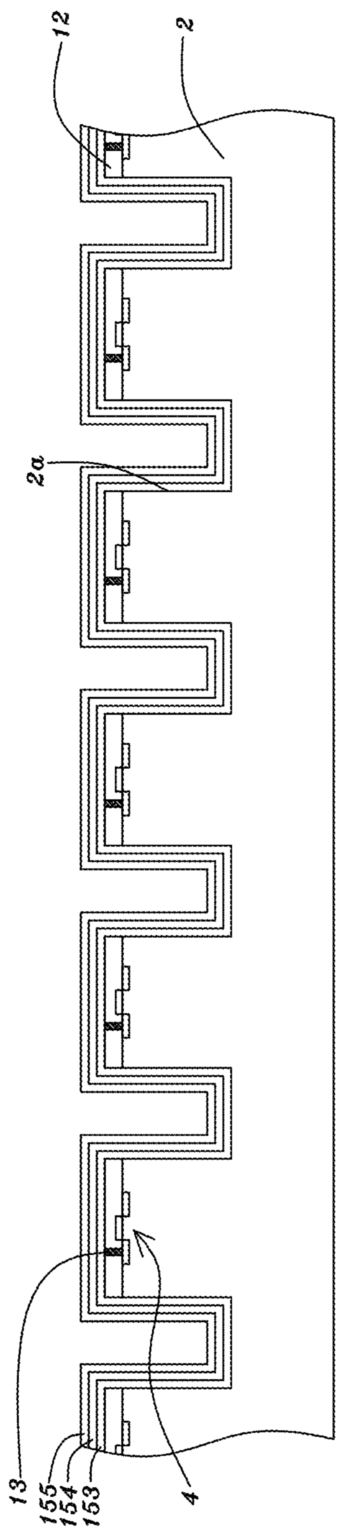

Next, referring to FIG. 19G, an adhesion layer 154 may be deposited on the insulating lining layer 153 by, for example, sputtering or chemical vapor depositing (CVD) a titanium (Ti) or titanium nitride (TiN) layer 154 having a thickness between 1 nm to 50 nm on the insulating lining layer 153. Next, an electroplating seed layer 155 may be deposited on the adhesion layer 154 by, for example, sputtering or chemical vapor depositing (CVD) a copper seed layer 155 having a thickness between 3 nm and 200 nm on the adhesion layer 154.

Figure 19H:
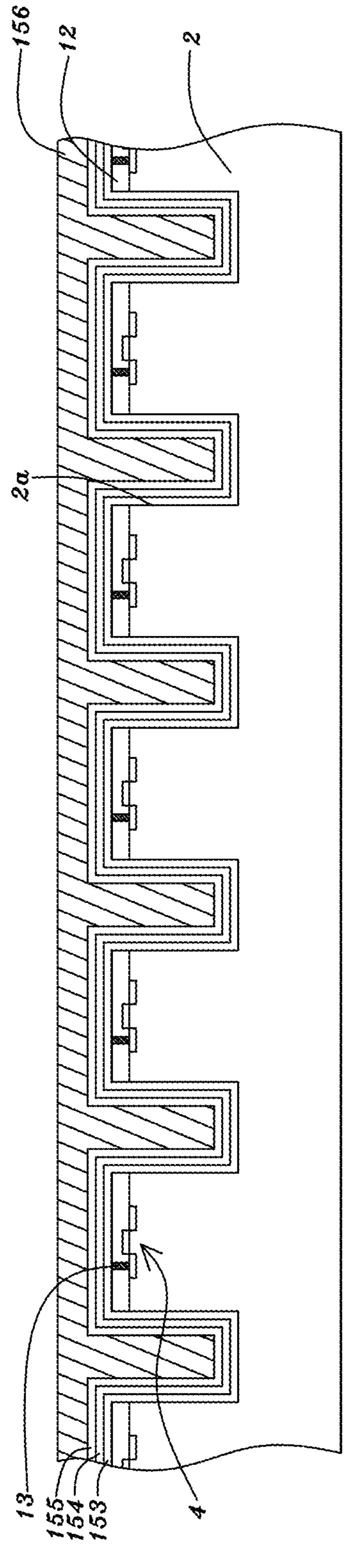

Next, referring to FIG. 19H, a copper layer 156 having a thickness, for example, between 10 nm and 3,000 nm, between 10 nm and 1,000 nm or between 10 nm and 500 nm may be electroplated on the copper seed layer 155.

Figure 19I:
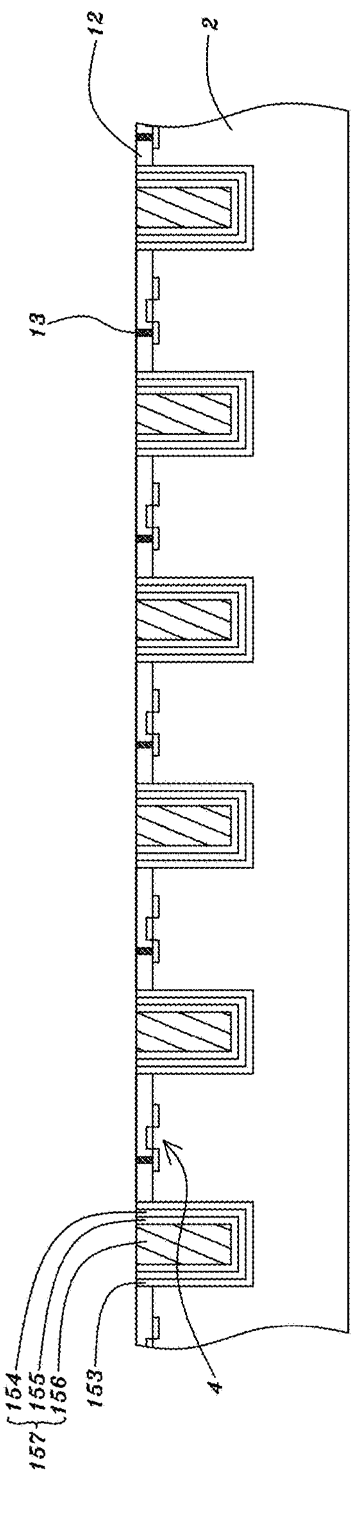

Next, referring to FIG. 19I, the copper layer 156, electroplating seed layer 155, adhesion layer 154 and insulating lining layer 153 outside the blind holes 2*a* and over the insulating dielectric layer 12 may be removed by a chemical-mechanical polishing (CMP) process to expose the top surface of the insulating dielectric layer 12 and the top ends of the tungsten plugs 13. The copper layer 156, electroplating seed layer 155 and adhesion layer 154 in the blind holes 2*a* may be employed for multiple through silicon vias (TSV) 157 as seen in FIG. 19I.

Alternatively, the through silicon vias (TSV) 157 may not be formed in the semiconductor substrate 2 and the steps as illustrated in FIGS. 19B-19I may be omitted.

First Interconnection Scheme for Chip (FISC) and Process for Forming the Same

Referring to FIG. 20A, a first interconnection scheme 20 is formed over the semiconductor substrate 2, semiconductor devices 4 and the copper layer 156 in the blind holes 2*a*. The first interconnection scheme 20 is connected to the semiconductor devices 4 and the copper layer 156 in the blind holes 2*a*. The first interconnection scheme 20 in, on or of the Chip (FISC) is formed over the semiconductor substrate 2 by a wafer process. The FISC 20 may comprise 4 to 15 layers, or 6 to 12 layers of interconnection metal layers 6 (only three layers are shown) patterned with multiple metal pads, lines or traces 8 and multiple metal vias 10. The metal pads, lines or traces 8 and metal vias 10 of the FISC 20 may be used for the programmable and fixed interconnects 361 and 364 of the intra-chip interconnects 502, as seen in FIG. 12A, of each of the standard commodity FPGA IC chips 200. The first interconnection scheme 20 in, on or of the Chip (FISC) may include multiple insulating dielectric layers 12 and multiple interconnection metal layers 6 each in neighboring two of the insulating dielectric layers 12. Each of the interconnection metal layers 6 of the FISC 20 may include the metal pads, lines or traces 8 at a top portion thereof and the metal vias 10 at a bottom portion thereof. One of the insulating dielectric layers 12 of the FISC 20 may be between the metal pads, lines or traces 8 of neighboring two of the interconnection metal layers 6, a top one of which may have the metal vias 10 in said one of the insulating dielectric layers 12. For each of the interconnection metal layers 6 of the FISC 20, its metal pads, lines or traces 8 may have a thickness t1 of less than 3 μm (such as between 3 nm and 2,000 nm, between 3 nm and 500 nm, between 10 nm and 1,000 nm, between 10 nm and 2,000 nm, or between 10 nm and 3,000 nm, or thinner than or equal to 5 nm, 10 nm, 30 nm, 50 nm, 100 nm, 200 nm, 300 nm, 500 nm, 1,000 nm, 1,500 nm or 2,000 nm) and may have a minimum width, for example, between 3 nm and 2,000 nm, between 3 nm and 500 nm, or between 10 nm and 1,000 nm, or, narrower than 5 nm, 10 nm, 20 nm, 30 nm, 50 nm, 70 nm, 100 nm, 150 nm, 200 nm, 300 nm, 500 nm, 1,000 nm, 1,500 nm or 2,000 nm. For example, the metal pads, lines or traces 8 and metal vias 10 of the FISC 20 are principally made of copper by a damascene process such as single-damascene process or double-damascene process, mentioned as below. For each of the interconnection metal layers 6 of the FISC 20, its metal pads, lines or traces 8 may include a copper layer having a thickness of less than 3 μm (such as between 0.2 and 2 μm). Each of the insulating dielectric layers 12 of the FISC 20 may include an oxide layer, oxynitride layer or nitride layer having a thickness, for example, between 3 nm and 2,000 nm, between 3 nm and 500 nm, between 10 nm and 1,000 nm, between 10 nm and 2,000 nm or between 10 nm and 3,000 nm, or thinner than 5 nm, 10 nm, 30 nm, 50 nm, 100 nm, 200 nm, 300 nm, 500 nm, 1,000 nm or 2,000 nm.

I. Single Damascene Process for FISC

In the following, a single damascene process for the FISC 20 is illustrated in FIGS. 20B-20H. Referring to FIG. 20B, a first insulating dielectric layer 12 is provided and multiple metal vias 10 or metal pads, lines or traces 8 (only one is shown) having exposed top surfaces are provided in the first insulating dielectric layer 12. A top-most layer of the first insulating dielectric layer 12 may be, for example, a low k dielectric layer, such as SiOC layer.

Referring to FIG. 20C, a chemical vapor deposition (CVD) method may be performed to deposit a second insulating dielectric layer 12 (upper one) on or over the first insulating dielectric layer 12 (lower one) and on the exposed vias 10 or metal pads, lines or traces 8 in the first insulating dielectric layer 12. The second insulting dielectric layer 12 (upper one) may be formed by (a) depositing a bottom differentiate etch-stop layer 12*a*, for example, a Silicon Carbon Nitride layer (SiCN), on the top-most layer of the first insulting dielectric layer 12 (lower one) and on the exposed top surfaces of the vias 10 or metal pads, lines or traces 8 in the first insulating dielectric layer 12 (lower one), and (b) next depositing a low k dielectric layer 12*b*, for example, a SiOC layer, on the bottom differentiate etch-stop layer 12*a*. The low k dielectric layer 12*b* may have low k dielectric material having a dielectric constant smaller than that of the $SiO_2$ material. The SiCN, SiOC, and $SiO_2$ layers may be deposited by CVD methods. The material used for the first and second insulating dielectric layers 12 of the FISC 20 comprises inorganic material, or material compounds comprising silicon, nitrogen, carbon, and/or oxygen.

Next, referring to FIG. 20D, a photoresist layer 15 is coated on the second insulting dielectric layer 12 (upper one), and then the photoresist layer 15 is exposed and developed to form multiple trenches or openings 15*a* (only one is shown) in the photoresist layer 15. Next, referring to FIG. 20E, an etching process is performed to form trenches or openings 12*d* (only one is shown) in the second insulating dielectric layer 12 (upper one) and under the trenches or openings 15*a* in the photoresist layer 15. Next, referring to FIG. 20F, the photoresist layer 15 may be removed.

Next, referring to FIG. 20G, an adhesion layer 18 may be deposited on a top surface of the second insulating dielectric layer 12 (upper one), a sidewall of the trenches or openings 12*d* in the second insulating dielectric layer 12 (upper one) and a top surface of the vias 10 or metal pads, lines or traces 8 in the first insulating dielectric layer 12 (lower one) by, for example, sputtering or Chemical Vapor Depositing (CVD) a titanium (Ti) or titanium nitride (TiN) layer 18 (with thickness for example, between 1 nm to 50 nm). Next, an electroplating seed layer 22 may be deposited on the adhesion layer 18 by, for example, sputtering or CVD depositing a copper seed layer 22 (with a thickness, for example, between 3 nm and 200 nm) on the adhesion layer 18. Next, a copper layer 24 (with a thickness, for example, between 10 nm and 3,000 nm, 10 nm and 1,000 nm or 10 nm and 500 nm) may be electroplated on the copper seed layer 22.

Next, referring to FIG. 20H, a chemical-mechanical polishing (CMP) process may be applied to remove the adhesion layer 18, electroplating seed layer 22 and copper layer 24 outside the trenches or openings 12*d* in the second insulating dielectric layer 12 (upper one) until the top surface of the second insulating dielectric layer 12 (upper one) is exposed. The metals left or remained in trenches or openings 12*d* in the second insulating dielectric layer 12 (upper one) are used as the metal vias 10 or metal pads, lines or traces 8 for each of the interconnection metal layers 6 of the FISC 20.

In the single-damascene process, the copper electroplating process step and the CMP process step are performed for the metal pads, lines or traces 8 of a lower one of the interconnection metal layers 6, and are then performed sequentially again for the metal vias 10 of an upper one of the interconnection metal layers 6 in the insulating dielectric layer 12 on the lower one of the interconnection metal layers 6. In other words, in the single damascene copper process, the copper electroplating process step and the CMP process step are performed two times for forming the metal pads, lines or traces 8 of the lower one of the interconnection metal layers 6, and metal vias 10 of the upper one of the interconnection metal layers 6 in the insulating dielectric layer 12 on the lower one of interconnection metal layers 6.

II. Double Damascene Process for FISC

Alternatively, a double damascene process may be performed for fabricating the metal vias 10 and metal pads, lines or traces 8 of the FISC 20, as illustrated in FIGS. 201-20Q. Referring to FIG. 20I, a first insulating dielectric layer 12 is provided and multiple metal pads, lines or traces 8 (only one is shown) having exposed top surfaces are provided in the first insulating dielectric layer 12. A top-most layer of the first insulating dielectric layer 12 may be, for example, a Silicon Carbon Nitride layer (SiCN) or Silicon Nitride (SiN). Next, a dielectric stack layer comprising second and third insulating dielectric layers 12 are deposited on the top-most layer of the first insulting dielectric layer 12 and the exposed top surfaces of metal pads, lines or traces 8 in the first insulating dielectric layer 12. The dielectric stack layer comprises, from bottom to top, (a) a bottom low k dielectric layer 12*e*, such as SiOC layer, (to be used as an inter-metal dielectric layer to have the metal vias 10 formed therein) on the first insulating dielectric layer 12 (lower one), (b) a middle differentiate etch-stop layer 12*f*, such as Silicon Carbon Nitride layer (SiCN) or Silicon Nitride layer (SiN), on the bottom low k dielectric layer 12*e*, (c) a top low k SiOC layer 12*g* (to be used as the insulating dielectrics between the metal pads, lines or traces 8 in or of the same interconnection metal layer 6) on the middle differentiate etch-stop layer 12*f*, and (d) a top differentiate etch-stop layer 12*h*, such as Silicon Carbon Nitride layer (SiCN) or Silicon Nitride (SiN) layer, on the top low k SiOC layer 12*g*. All layers of SiCN, SiN or SiOC may be deposited by CVD methods. The bottom low k dielectric layer 12*e* and middle differentiate etch-stop layer 12*f* may compose the second insulating dielectric layer 12 (middle one); the top low k SiOC layer 12*g* and top differentiate etch-stop layer 12*h* may compose the third insulating dielectric layer 12 (top one).

Next, referring to FIG. 20J, a first photoresist layer 15 is coated on the top differentiate etch-stop layer 12*h* of the third insulting dielectric layer 12 (top one), and then the first photoresist layer 15 is exposed and developed to form multiple trenches or openings 15*a* (only one is shown) in the first photoresist layer 15 to expose the top differentiate etch-stop layer 12*h* of the third insulting dielectric layer 12 (top one). Next, referring to FIG. 20K, an etching process is performed to form trenches or top openings 12*i* (only one is shown) in the third insulating dielectric layer 12 (top one) and under the trenches or openings 15*a* in the first photoresist layer 15 and to stop at the middle differentiate etch-stop layer 12*f* of the second insulting dielectric layer 12 (middle one) for the later double-damascene copper process to from the metal pads, lines or traces 8 of the interconnection metal layer 6. Next, referring to FIG. 20L, the first photoresist layer 15 may be removed.

Next, referring to FIG. 20M, a second photoresist layer 17 is coated on the top differentiate etch-stop layer 12*h* of the third insulting dielectric layer 12 (top one) and the middle differentiate etch-stop layer 12*f* of the second insulting dielectric layer 12 (middle one), and then the second photoresist layer 17 is exposed and developed to form multiple trenches or openings 17*a* (only one is shown) in the second photoresist layer 17 to expose the middle differentiate etch-stop layer 12*f* of the second insulting dielectric layer 12 (middle one). Next, referring to FIG. 20N, an etching process is performed to form holes or bottom openings 12*j* (only one is shown) in the second insulating dielectric layer 12 (middle one) and under the trenches or openings 17*a* in the second photoresist layer 17 and to stop at the metal pads, lines or traces 8 (only one is shown) in the first insulating dielectric layer 12 for the later double-damascene copper process to from the metal vias 10 in the second insulating dielectric layer 12, i.e., inter-metal dielectric layer. Next, referring to FIG. 20O, the second photoresist layer 17 may be removed. The second and third insulating dielectric layers 12 (middle and upper ones) may compose a dielectric stack layer. One of the trenches or top openings 12*i* in the top portion of the dielectric stack layer, i.e., third insulating dielectric layer 12 (upper one), may overlap one of the bottom openings or holes 12*j* in the bottom portion of the dielectric stack layer, i.e., second insulating dielectric layer 12 (middle one), and have a larger size than that of said one of the bottom openings or holes 12*j*. In other words, the bottom openings or holes 12*j* in the bottom portion of the dielectric stack layer, i.e., second insulating dielectric layer 12 (middle one), are inside or enclosed by the trenches or top openings 12*i* in the top portion of the dielectric stack layer, i.e., third insulating dielectric layer 12 (upper one), form a top view.

Next, referring to FIG. 20P, an adhesion layer 18 may be deposited on top surfaces of the second and third insulating dielectric layers 12 (middle and upper ones), a sidewall of the trenches or top openings 12*i* in the third insulating dielectric layer 12 (upper one), a sidewall of the holes or bottom openings 12*j* in the second insulating dielectric layer 12 (middle one) and a top surface of the metal pads, lines or traces 8 in the first insulating dielectric layer 12 (bottom one) by, for example, sputtering or Chemical Vapor Depositing (CVD) a titanium (Ti) or titanium nitride (TiN) layer 18 (with thickness for example, between 1 nm to 50 nm). Next, an electroplating seed layer 22 may be deposited on the adhesion layer 18 by, for example, sputtering or CVD depositing a copper seed layer 22 (with a thickness, for example, between 3 nm and 200 nm) on the adhesion layer 18. Next, a copper layer 24 (with a thickness, for example, between 20 nm and 6,000 nm, 10 nm and 3,000 nm or 10 nm and 1,000 nm) may be electroplated on the copper seed layer 22.

Next, referring to FIG. 20Q, a chemical-mechanical polishing (CMP) process may be applied to remove the adhesion layer 18, electroplating seed layer 22 and copper layer 24 outside the holes or bottom openings 12*j* and trenches or top openings 12*i* in the second and third insulating dielectric layers 12 (middle and top ones) until the top surface of the third insulating dielectric layer 12 (top one) is exposed. The metals left or remained in the trenches or top openings 12*i* in the third insulating dielectric layer 12 (top one) are used as the metal pads, lines or traces 8 for each of the interconnection metal layers 6 of the FISC 20. The metals left or remained in the holes or bottom openings 12*j* in the second insulating dielectric layer 12 (middle one) are used as the metal vias 10 for each of the interconnection metal layers 6 of the FISC 20 for coupling the metal pads, lines or traces 8 below and above the metal vias 10.

In the double-damascene process, the copper electroplating process step and CMP process step are performed one time for forming the metal pads, lines or traces 8 and metal vias 10 in two of the insulating dielectric layers 12.

Accordingly, the processes for forming the metal pads, lines or traces 8 and metal vias 10 using the single damascene copper process as illustrated in FIGS. 20B-20H or the double damascene copper process as illustrated in FIGS. 201-20Q may be repeated multiple times to form a plurality of the interconnection metal layer 6 for the FISC 20. The FISC 20 may comprise 4 to 15 layers or 6 to 12 layers of interconnection metal layers 6. The topmost one of the interconnection metal layers 6 of the FISC may have multiple metal pads 16, such as copper pads formed by the above-mentioned single or double damascene process or aluminum pads formed by a sputter process.

III. Passivation Layer for Chip

Referring to FIG. 20A, a passivation layer 14 is formed over the first interconnection scheme 20 of the chip (FISC) and over the insulating dielectric layers 12. The passivation layer 14 can protect the semiconductor devices 4 and the interconnection metal layers 6 from being damaged by moisture foreign ion contamination, or from water moisture or contamination form external environment, for example sodium mobile ions. In other words, mobile ions (such as sodium ion), transition metals (such as gold, silver and copper) and impurities may be prevented from penetrating through the passivation layer 14 to the semiconductor devices 4, such as transistors, polysilicon resistor elements and polysilicon-polysilicon capacitor elements, and to the interconnection metal layers 6.

Referring to FIG. 20A, the passivation layer 14 is commonly made of a mobile ion-catching layer or layers, for example, a combination of SiN, SiON, and/or SiCN layer or layers deposited by a chemical vapor deposition (CVD) process. The passivation layer 14 commonly has a thickness t3 of more than 0.3 m, such as between 0.3 and 1.5 μm. In a preferred case, the passivation layer 14 may have a silicon-nitride layer having a thickness of more than 0.3 μm. The total thickness of the mobile ion catching layer or layers, i.e., a combination of SiN, SiON, and/or SiCN layer or layers, may be thicker than or equal to 100 nm, 150 nm, 200 nm, 300 nm, 450 nm or 500 nm.

Referring to FIG. 20A, an opening 14*a* in the passivation layer 14 is formed to expose a metal pad 16 of a topmost one of the interconnection metal layers 6 of the FISC 20. The metal pad 16 may be used for signal transmission or for connection to a power source or a ground reference. The metal pad 16 may have a thickness t4 of between 0.4 and 3 μm or between 0.2 and 2 μm. For example, the metal pad 16 may be composed of a sputtered aluminum layer or a sputtered aluminum-copper-alloy layer with a thickness of between 0.2 and 2 μm. Alternatively, the metal pad 16 may include the electroplated copper layer 24 formed by the single damascene process as seen in FIG. 20H or by the double damascene process as seen in FIG. 20Q.

Referring to FIG. 20A, the opening 14*a* may have a transverse dimension d, from a top view, of between 0.5 and 20 μm or between 20 and 200 μm. The shape of the opening 14*a* from a top view may be a circle, and the diameter of the circle-shaped opening 14*a* may be between 0.5 and 20 μm or between 20 and 200 μm. Alternatively, the shape of the opening 14*a* from a top view may be a square, and the width of the square-shaped opening 14*a* may be between 0.5 and 20 μm or between 20 and 200 μm. Alternatively, the shape of the opening 14*a* from a top view may be a polygon, such as hexagon or octagon, and the polygon-shaped opening 14*a* may have a width of between 0.5 and 20 μm or between 20 and 200 μm. Alternatively, the shape of the opening 14*a* from a top view may be a rectangle, and the rectangle-shaped opening 14*a* may have a shorter width of between 0.5 and 20 μm or between 20 and 200 μm. Further, there may be some of the semiconductor devices 4 under the metal pad 16 exposed by the opening 14*a*. Alternatively, there may be no active devices under the metal pad 16 exposed by the opening 14*a*.

First Type of Micro-Bump

FIGS. 21A-21G are schematically cross-sectional views showing a process for forming a chip with a first type of micro-bump or micro-pillar thereon in accordance with an embodiment of the present application. For connection to circuitry outside a chip, multiple micro-bumps may be formed over the metal pads 16 exposed by the openings 14*a* in the passivation layer 14.

Figure 21A:
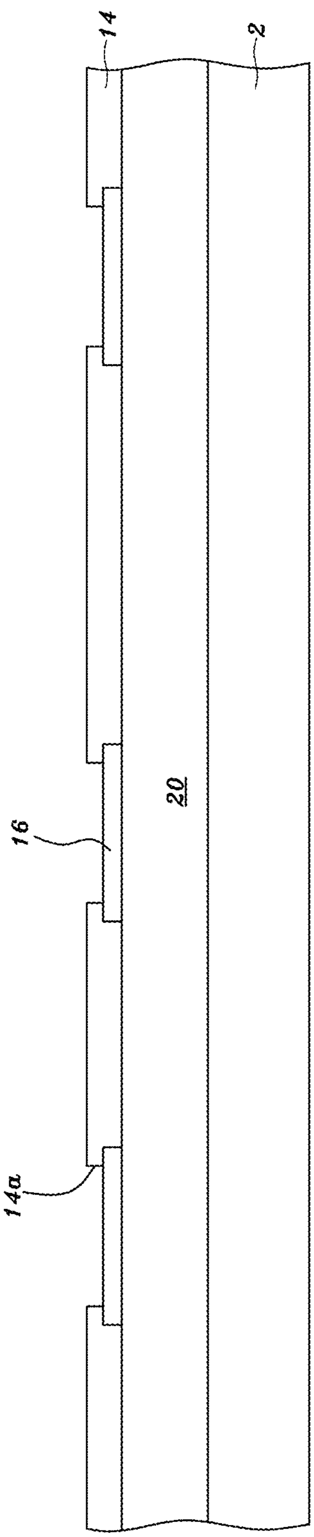
FIGS. 21A-21J are schematically cross-sectional views showing a process for forming a chip with a micro-bump or micro-pillar thereon in accordance with an embodiment of the present application.
Figure 21B:
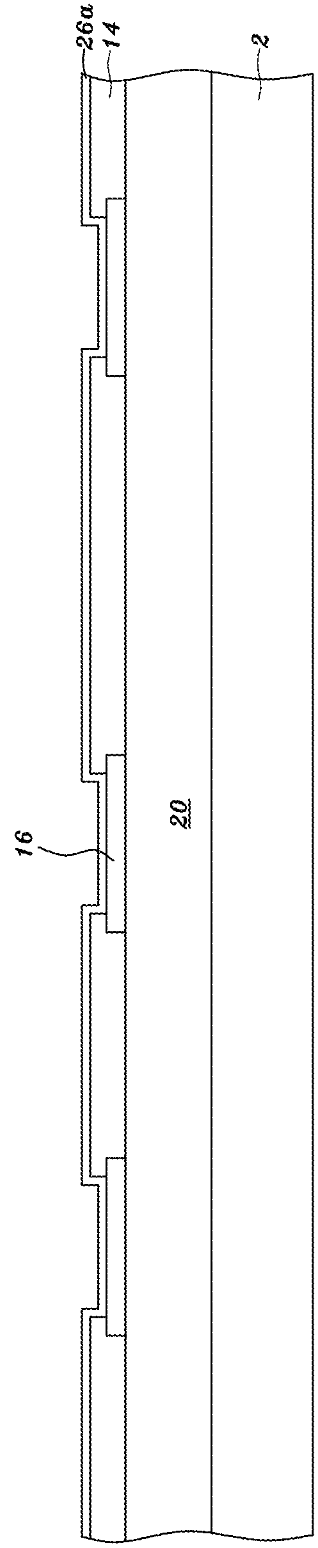

FIG. 21A is a simplified drawing from FIG. 20A. Referring to FIG. 21B, an adhesion layer 26*a* having a thickness of between 0.001 and 0.7 μm, between 0.01 and 0.5 μm or between 0.03 and 0.35 μm may be sputtered on the passivation layer 14 and on the metal pad 16, such as aluminum pad or copper pad, exposed by opening 14*a*. The material of the adhesion layer 26*a* may include titanium, a titanium-tungsten alloy, titanium nitride, chromium, titanium-tungsten-alloy layer, tantalum nitride, or a composite of the abovementioned materials. The adhesion layer 26*a* may be formed by an atomic-layer-deposition (ALD) process, chemical vapor deposition (CVD) process or evaporation process. For example, the adhesion layer 26*a* may be formed by sputtering or CVD depositing a titanium (Ti) or titanium nitride (TiN) layer (with a thickness, for example, between 1 nm and 50 nm) on the passivation layer 14 and on the metal pads 16 at a bottom of the openings 14 in the passivation layer 14.

Figure 21C:
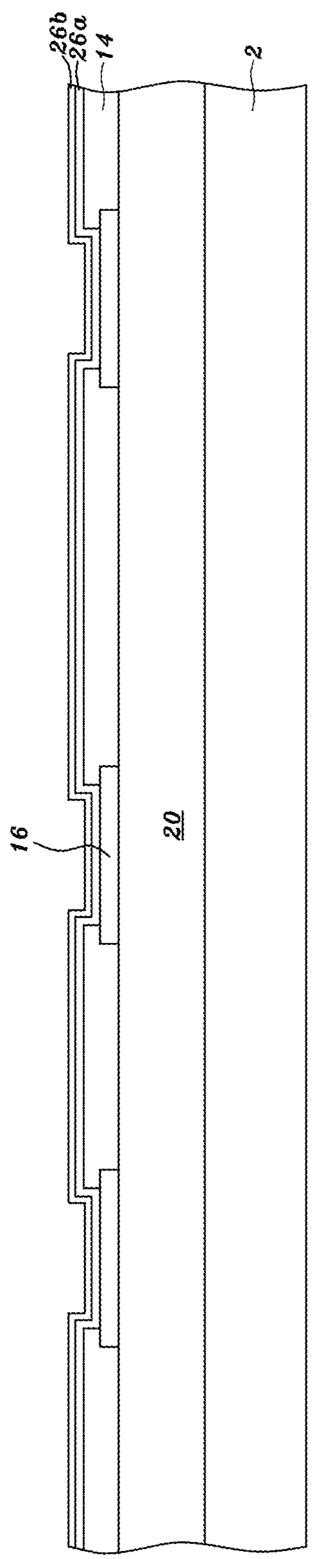

Next, referring to FIG. 21C, an electroplating seed layer 26*b* having a thickness of between 0.001 and 1 μm, between 0.03 and 2 μm or between 0.05 and 0.5 μm may be sputtered on the adhesion layer 26*a*. Alternatively, the electroplating seed layer 26*b* may be formed by an atomic-layer-deposition (ALD) process, chemical-vapor-deposition (CVD) process, vapor deposition method, electroless plating method or PVD (Physical Vapor Deposition) method. The electroplating seed layer 26*b* is beneficial to electroplating a metal layer thereon. Thus, the material of the electroplating seed layer 26*b* varies with the material of a metal layer to be electroplated on the electroplating seed layer 26*b*. When a copper layer is to be electroplated on the electroplating seed layer 26*b*, copper is a preferable material to the electroplating seed layer 26*b*. For example, the electroplating seed layer 26*b* may be deposited on or over the adhesion layer 26*a* by, for example, sputtering or CVD depositing a copper seed layer (with a thickness between, for example, 3 nm and 300 nm or 3 nm and 200 nm) on the adhesion layer 26*a*.

Figure 21D:
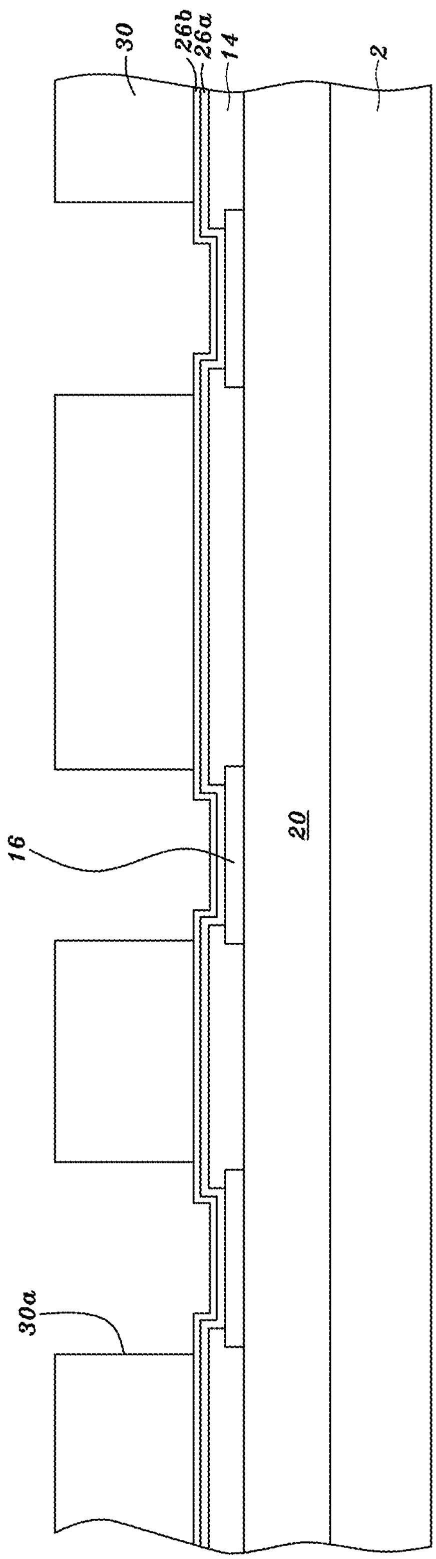

Next, referring to FIG. 21D, a photoresist layer 30, such as positive-type photoresist layer, having a thickness of between 2 μm and 60 μm, 5 μm and 50 μm, 5 μm and 40 μm, 5 μm and 30 μm, 5 μm and 20 μm, 2 μm and 15 μm, or 2 μm and 10 μm, between 5 and 300 μm or between 20 and 50 μm, or smaller than or equal to 60 μm, 30 μm, 20 μm, 15 μm, 10 μm or 5 μm is spin-on coated on the electroplating seed layer 26*b*. The photoresist layer 30 is patterned with the processes of exposure, development, etc., to form an opening 30*a* in the photoresist layer 30 exposing the electroplating seed layer 26*b* over the pad 16. A1× stepper, 1× contact aligner or laser scanner may be used to expose the photoresist layer 30 during the process of exposure.

For example, the photoresist layer 30 may be formed by spin-on coating a positive-type photosensitive polymer layer having a thickness of between 5 and 100 μm on the electroplating seed layer 26*b*, then exposing the photosensitive polymer layer by using a 1× stepper, 1× contact aligner or laser scanner with at least two of G-line having a wavelength ranging from 434 to 438 nm, H-line having a wavelength ranging from 403 to 407 nm, and I-line having a wavelength ranging from 363 to 367 nm, to illuminate the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the electroplating seed layer 26*b* with an $O_2$ plasma or a plasma containing fluorine of below 200 PPM and oxygen, such that the photoresist layer 30 may be patterned with multiple openings 30*a* in the photoresist layer 30 exposing the electroplating seed layer 26*b* over the pad 16.

Referring to FIG. 21D, each of the openings 30*a* in the photoresist layer 30 may overlap one of the openings 14*a* in the passivation layer 14 for forming one of micro-pillars or micro-bumps in said one of the openings 30*a* by following processes to be performed later, exposing the electroplating seed layer 26*b* at the bottom of said one of the openings 30*a*, and may extend out of said one of the openings 14*a* to an area or ring of the passivation layer 14 around said one of the openings 14*a*.

Figure 21E:
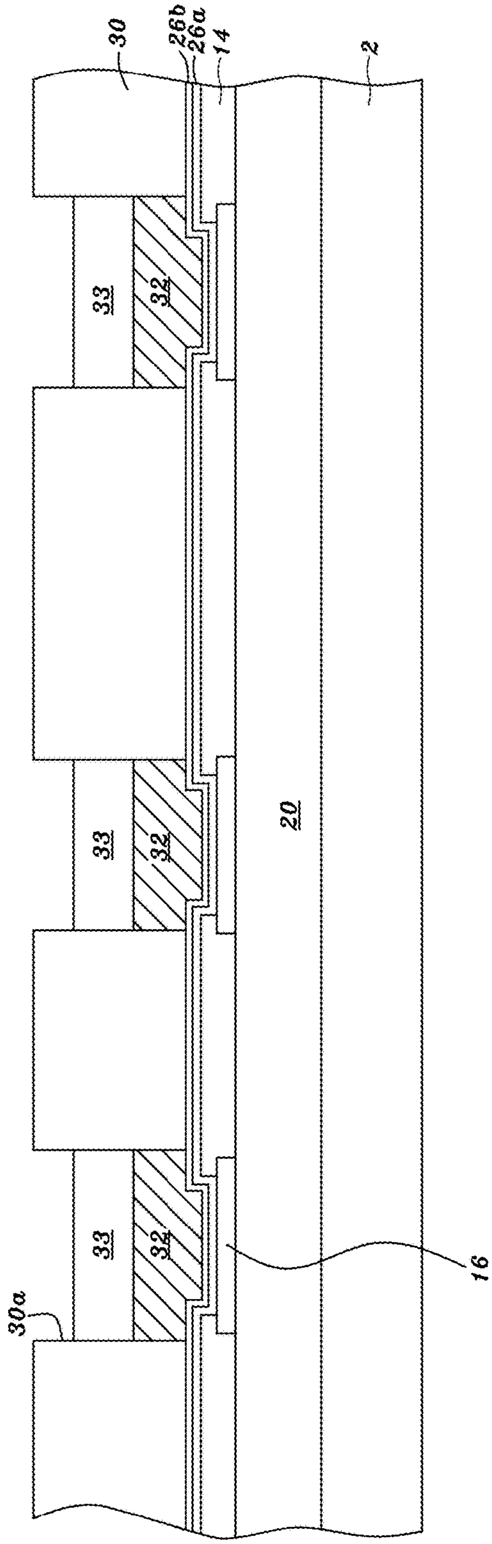

Next, referring to FIG. 21E, a metal layer 32, such as copper, may be electroplated on the electroplating seed layer 26*b* exposed by the trenches or openings 30*a*. For example, in a first aspect, the metal layer 32 may be formed by electroplating a copper layer with a thickness between 1 μm and 60 μm, 3 μm and 60 μm, 5 μm and 50 μm, 5 μm and 40 μm, 5 μm and 30 μm, 5 μm and 20 μm, 1 μm and 15 μm, 5 μm and 15 μm, 1 μm and 10 μm or 3 μm and 10 μm, or greater than or equal to 60 μm, 50 μm, 40 μm, 30 μm, 20 μm, 15 μm, 10 μm, 5 μm or 3 μm on the electroplating seed layer 26*b*, made of copper, exposed by the trenches or openings 30*a*. In another example for the first aspect, the metal layer 32 may be formed by electroplating a copper layer with a thickness smaller than or equal to 60 μm, 50 μm, 40 μm, 30 μm, 20 μm, 15 μm, 10 μm, 5 μm or 3 μm on the electroplating seed layer 26*b*, made of copper, exposed by the trenches or openings 30*a*. Alternatively, in a second aspect, the metal layer 32 may be formed by electroplating a copper layer with a thickness between 1 μm and 60 μm, 3 μm and 60 μm, 5 μm and 50 μm, 5 μm and 40 μm, 5 μm and 30 μm, 5 μm and 20 μm, 1 μm and 15 μm, 5 μm and 15 μm, 1 μm and 10 μm or 3 μm and 10 μm, or greater than or equal to 60 μm, 50 μm, 40 μm, 30 μm, 20 μm, 15 μm, 10 μm, 5 μm or 3 μm on the electroplating seed layer 26*b*, made of copper, exposed by the trenches or openings 30*a* and then electroplating a nickel layer with a thickness between 0.5 μm and 3 μm on the electroplated copper layer in the trenches or openings 30*a*. In another example for the second aspect, the metal layer 32 may be formed by electroplating a copper layer with a thickness smaller than or equal to 60 μm, 50 μm, 40 μm, 30 μm, 20 μm, 15 μm, 10 μm, 5 μm or 3 μm on the electroplating seed layer 26*b*, made of copper, exposed by the trenches or openings 30*a* and then electroplating a nickel layer with a thickness between 0.5 μm and 3 μm on the electroplated copper layer in the trenches or openings 30*a*. Next, a solder cap or layer 33, such as tin, a tin-lead alloy, tin-copper alloy, tin-silver alloy, tin-silver-copper alloy (SAC) or tin-silver-copper-zin alloy, having a thickness, for example, between 1 μm and 50 μm, 1 μm and 30 μm, 5 μm and 30 μm, 5 μm and 20 μm, 5 μm and 15 μm, 5 μm and 10 μm, 5 μm and 10 μm, 1 μm and 10 μm, or 1 μm and 3 μm may be electroplated on the metal layer 32 in the trenches or openings 30*a*. For example, the solder cap 33 may be electroplated on the copper layer of the metal layer 32 for the first aspect or on the nickel layer of the metal layer 32 for the second aspect. The solder cap or layer 33 may be a lead-free solder containing tin, copper, silver, bismuth, indium, zinc and/or antimony.

Figure 21F:
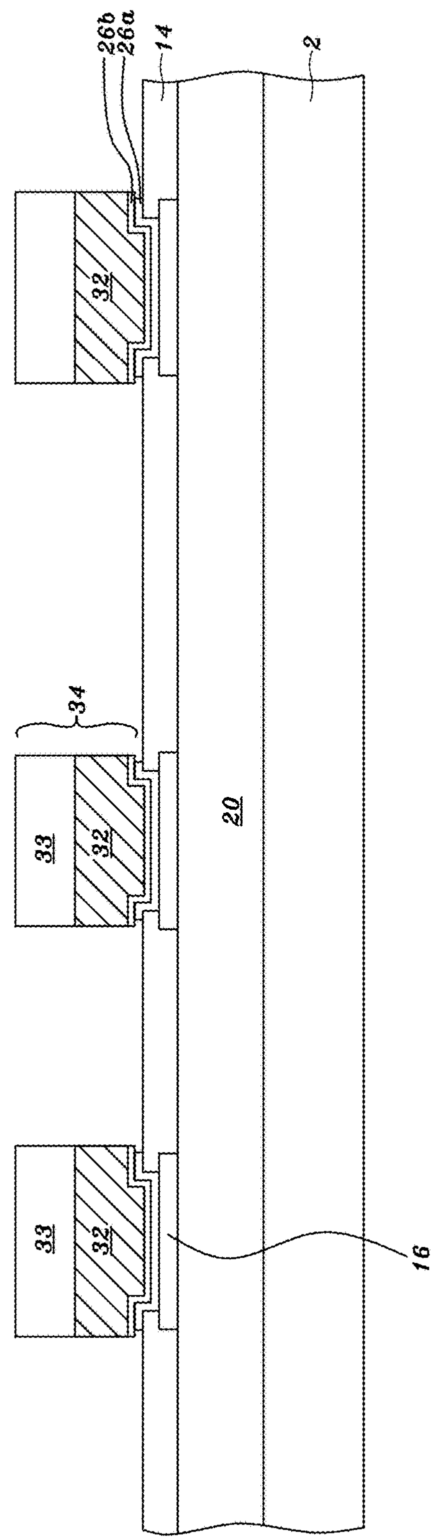

Referring to FIG. 21F, after the solder cap 33 is formed, most of the photoresist layer 30 may be removed using an organic solution with amide. However, some residuals from the photoresist layer 30 could remain on the metal layer 32 and/or solder cap 33 and on the electroplating seed layer 26*b*. Thereafter, the residuals may be removed from the metal layer 32 and/or solder cap 33 and from the electroplating seed layer 26*b* with a plasma, such as $O_2$ plasma or plasma containing fluorine of below 200 PPM and oxygen. Next, the electroplating seed layer 26*b* and adhesion layer 26*a* not under the metal layer 32 are subsequently removed with a dry etching method or a wet etching method. As to the wet etching method, when the adhesion layer 26*a* is a titanium-tungsten-alloy layer, it may be etched with a solution containing hydrogen peroxide; when the adhesion layer 26*a* is a titanium layer, it may be etched with a solution containing hydrogen fluoride; when the electroplating seed layer 26*b* is a copper layer, it may be etched with a solution containing $NH_4OH$. As to the dry etching method, when the adhesion layer 26*a* is a titanium layer or a titanium-tungsten-alloy layer, it may be etched with a chlorine-containing plasma etching process or with an RIE process. Generally, the dry etching method to etch the electroplating seed layer 26*b* and the adhesion layer 26*a* not under the metal layer 32 may include a chemical plasma etching process, a sputtering etching process, such as argon sputter process, or a chemical vapor etching process.

Figure 21G:
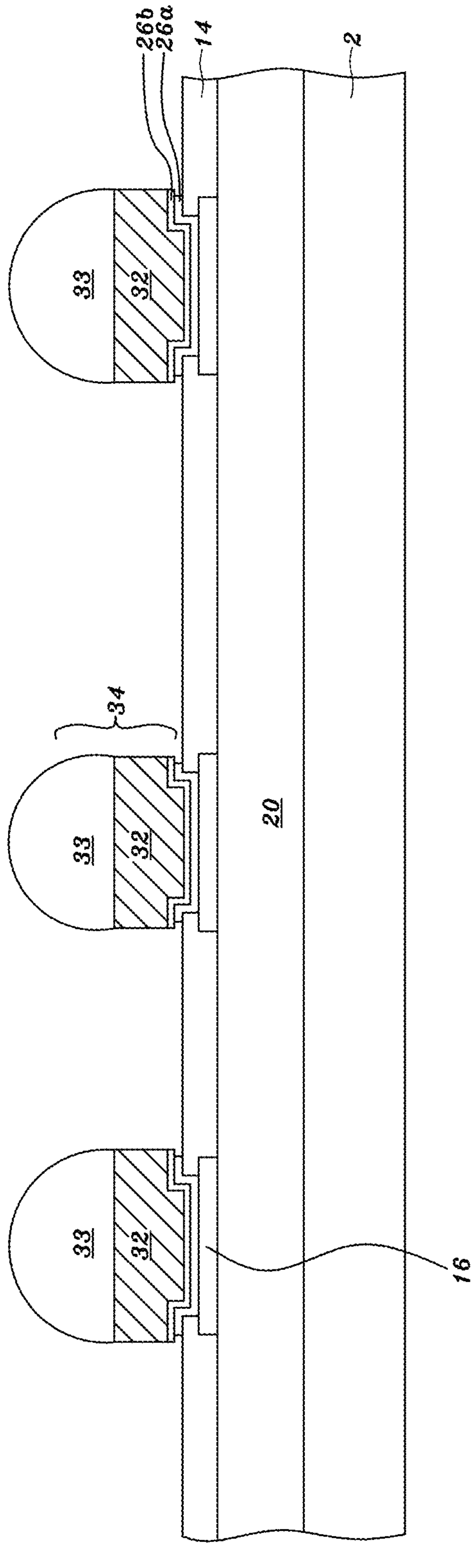

Next, referring to FIG. 21G, the solder cap or layer 33 may be reflowed into multiple solder bumps. Thereby, the adhesion layer 26*a*, electroplating seed layer 26*b*, electroplated metal layer 32 and solder bumps 33 may compose a first type of micro-pillars or micro-bumps 34 on the metal pads 16 at bottoms of the openings 14*a* in the passivation layer 14. Each of the micro-pillars or micro-bumps 34 of the first type may have a height, protruding from a top surface of the passivation layer 14, between 1 μm and 60 μm, 3 μm and 60 μm, 5 μm and 50 μm, 5 μm and 40 μm, 5 μm and 30 μm, 5 μm and 20 μm, 1 μm and 15 μm, 5 μm and 15 μm, 1 μm and 10 μm or 3 μm and 10 μm, or greater than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm. The space from one of the micro-pillars or micro-bumps 34 of the first type to its nearest one of the micro-pillars or micro-bumps 34 is between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm or smaller than or equal to 60 μm, 50 μm, 40 μm, 30 μm, 20 μm, 15 μm, 10 μm or 5 μm. Alternatively, each of the micro-pillars or micro-bumps 34 of the first type may have a height, protruding from a top surface of the passivation layer 14, smaller than or equal to 60 μm, 50 μm, 40 μm, 30 μm, 20 μm, 15 μm, 10m, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm.

Figure 21H:
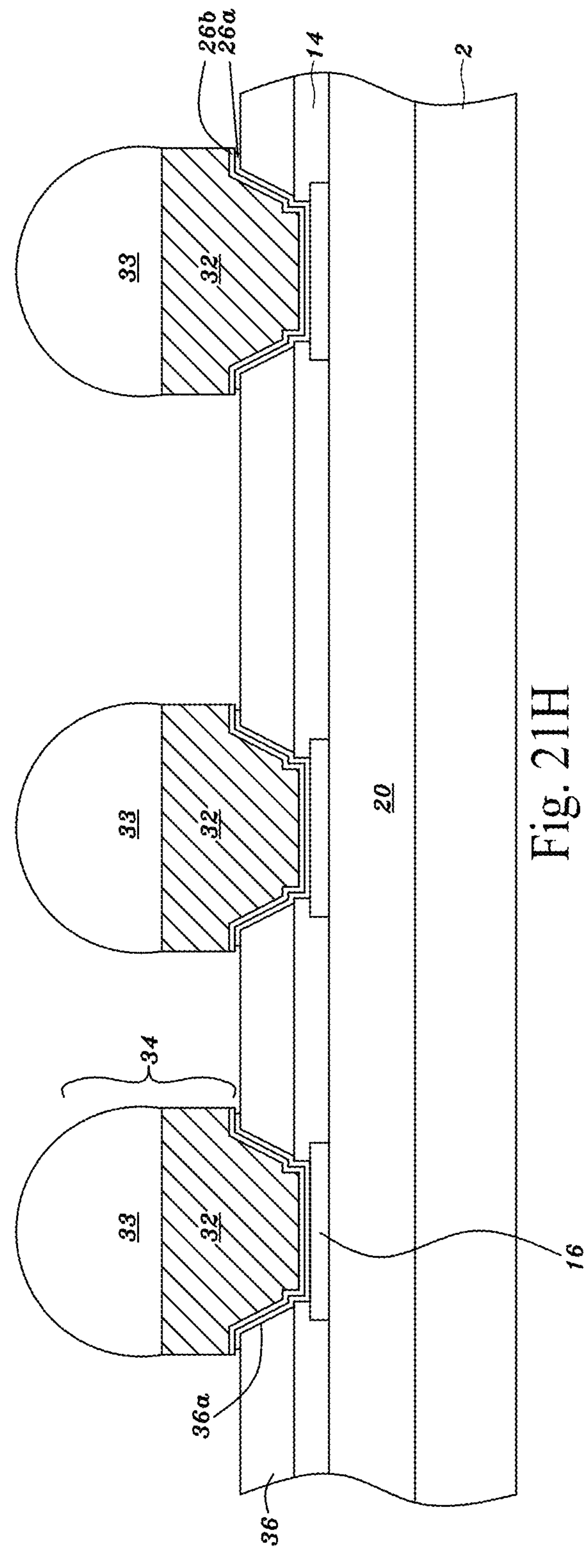

Alternatively, FIG. 21H is a schematically cross-sectional view showing a second type of micro-bump or micro-pillar on a chip in accordance with an embodiment of the present application; Referring to FIG. 21H, before the adhesion layer 26*a* is formed as shown in FIG. 21B, a polymer layer 36, that is, an insulating dielectric layer contains an organic material, for example, a polymer, or material compounds comprising carbon, may be formed on the passivation layer 14 by a process including a spin-on coating process, a lamination process, a screen-printing process, a spraying process or a molding process, and multiple openings in the polymer layer 36 are formed over the metal pads 16. The polymer layer 36 has a thickness between 3 and 30 micrometers or between 5 and 15 micrometers and the material of the polymer layer 36 may include benzocyclobutane (BCB), parylene, photoepoxy SU-8, elastomer, silicone, polyimide (PI), polybenzoxazole (PBO) or epoxy resin.

In a case, the polymer layer 36 may be formed by spin-on coating a negative-type photosensitive polyimide layer having a thickness between 6 and 50 micrometers on the passivation layer 14 and on the pads 16, then baking the spin-on coated polyimide layer, then exposing the baked polyimide layer using a 1× stepper, 1× contact aligner or laser scanner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form multiple openings exposing the pads 16, then curing or heating the developed polyimide layer at a temperature between 180 and 400° C. or higher than or equal to 100° C., 125° C., 150° C., 175° C., 200° C., 225° C., 250° C., 275° C. or 300° C. for a time between 20 and 150 minutes in a nitrogen ambient or in an oxygen-free ambient, the cured polyimide layer having a thickness between 3 and 30 micrometers, and then removing the residual polymeric material or other contaminants from the pads 16 with an $O_2$ plasma or a plasma containing fluorine of below 200 PPM and oxygen.

Thereby, referring to FIG. 21H, the first type of micro-pillars or micro-bumps 34 may be formed on the metal pads 16 at bottoms of the openings 14*a* in the passivation layer 14 and on the polymer layer 26 around the metal pads 16. The specification of the micro-pillars or micro-bumps 34 as seen in FIG. 21H may be referred to that of the micro-pillars or micro-bumps 34 as illustrated in FIG. 21G. Each of the micro-pillars or micro-bumps 34 of the first type may have a height, protruding from a top surface of the polymer layer 26, between 1 μm and 60 μm, 3 μm and 60 μm, 5 μm and 50 μm, 5 μm and 40 μm, 5 μm and 30 μm, 5 μm and 20 μm, 1 μm and 15 μm, 5 μm and 15 μm, 1 μm and 10 μm or 3 μm and 10 μm, or greater than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm. The space from one of the micro-pillars or micro-bumps 34 of the first type to its nearest one of the micro-pillars or micro-bumps 34 is between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm or smaller than or equal to 60 μm, 50 μm, 40 μm, 30 μm, 20 μm, 15 μm, 10 μm or 5 μm. Alternatively, each of the micro-pillars or micro-bumps 34 of the first type may have a height, protruding from a top surface of the polymer layer 26, smaller than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm.

Second Type of Micro-Bumps

Figure 21I:
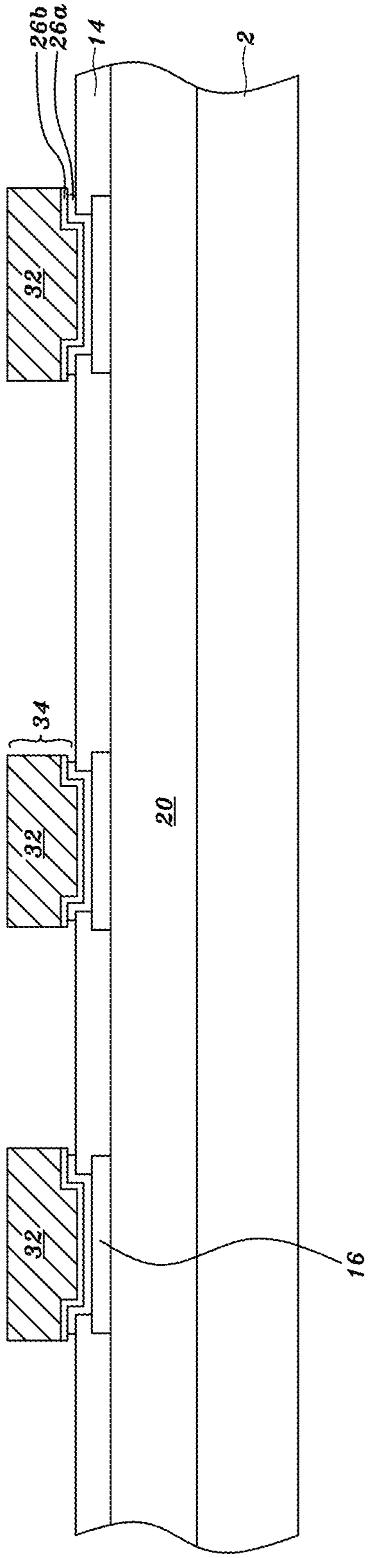
Figure 21J:
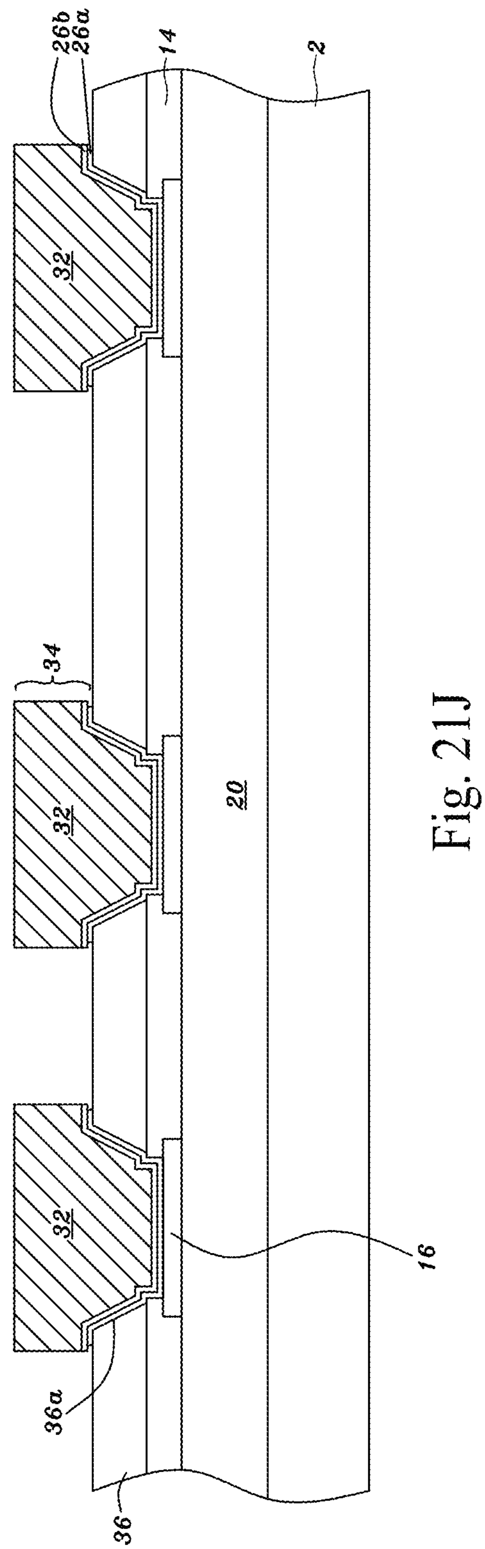

Alternatively, FIGS. 21I and 21J are schematically cross-sectional views showing a second type of micro-bump or micro-pillar on chip in accordance with an embodiment of the present application. Referring to FIGS. 21I and 21J, the process for forming the second type of micro-bump or micro-pillar 34 may be referred to that for forming the first type of micro-bump or micro-pillar 34 as seen in FIGS. 21A-21H, but the difference therebetween is that the solder cap 33 formed for the first type of micro-bump or micro-pillar 34 as seen in FIGS. 21E-21H is skipped not to be formed for the second type of micro-bump or micro-pillar 34. Thus, the reflowing process for the first type of micro-bump or micro-pillar 34 as seen in FIG. 21G may be skipped in the process for forming the second type of micro-bump or micro-pillar 34 as seen in FIGS. 21I and 21J.

Referring to FIG. 21I, the adhesion layer 26*a*, electroplating seed layer 26*b*, electroplated metal layer 32 may compose the second type of micro-pillars or micro-bumps 34 on the metal pads 16 at bottoms of the openings 14*a* in the passivation layer 14. Each of the micro-pillars or micro-bumps 34 of the second type may have a height, protruding from a top surface of the passivation layer 14, between 1 μm and 60 μm, 3 μm and 60 μm, 5 μm and 50 μm, 5 μm and 40 μm, 5 μm and 30 μm, 5 μm and 20 μm, 1 μm and 15 μm, 5 μm and 15 μm, 1 μm and 10 μm or 3 μm and 10 μm, or greater than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm. The space from one of the micro-pillars or micro-bumps 34 of the second type to its nearest one of the micro-pillars or micro-bumps 34 is between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm or smaller than or equal to 60 μm, 50 μm, 40 μm, 30 μm, 20 μm, 15 μm, 10 μm or 5 μm. Alternatively, each of the micro-pillars or micro-bumps 34 of the second type may have a height, protruding from a top surface of the passivation layer 14, smaller than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm.

Referring to FIG. 21J, the second type of micro-pillars or micro-bumps 34 may be formed on the metal pads 16 at bottoms of the openings 14*a* in the passivation layer 14 and on the polymer layer 26 around the metal pads 16. Each of the micro-pillars or micro-bumps 34 of the second type may have a height, protruding from a top surface of the polymer layer 26, between 1 μm and 60 μm, 3 μm and 60 μm, 5 μm and 50 μm, 5 μm and 40 μm, 5 μm and 30 μm, 5 μm and 20 μm, 1 μm and 15 μm, 5 μm and 15 μm, 1 μm and 10 μm or 3 μm and 10 μm, or greater than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm. The space from one of the micro-pillars or micro-bumps 34 of the second type to its nearest one of the micro-pillars or micro-bumps 34 is between, for example, 1

μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm or smaller than or equal to 60 μm, 50 μm, 40 μm, 30 μm, 20 μm, 15 μm, 10 μm or 5 μm. Alternatively, each of the micro-pillars or micro-bumps 34 of the second type may have a height, protruding from a top surface of the polymer layer 26, smaller than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm.

Embodiment for SISC over Passivation Layer

Alternatively, before the micro-pillars or micro-bumps 34 are formed, a Second Interconnection Scheme in, on or of the Chip (SISC) may be formed on or over the passivation layer 14 and the FISC 20. FIGS. 22A-22D are schematically cross-sectional views showing a process for forming an interconnection metal layer over a passivation layer in accordance with an embodiment of the present application.

Figure 22A:
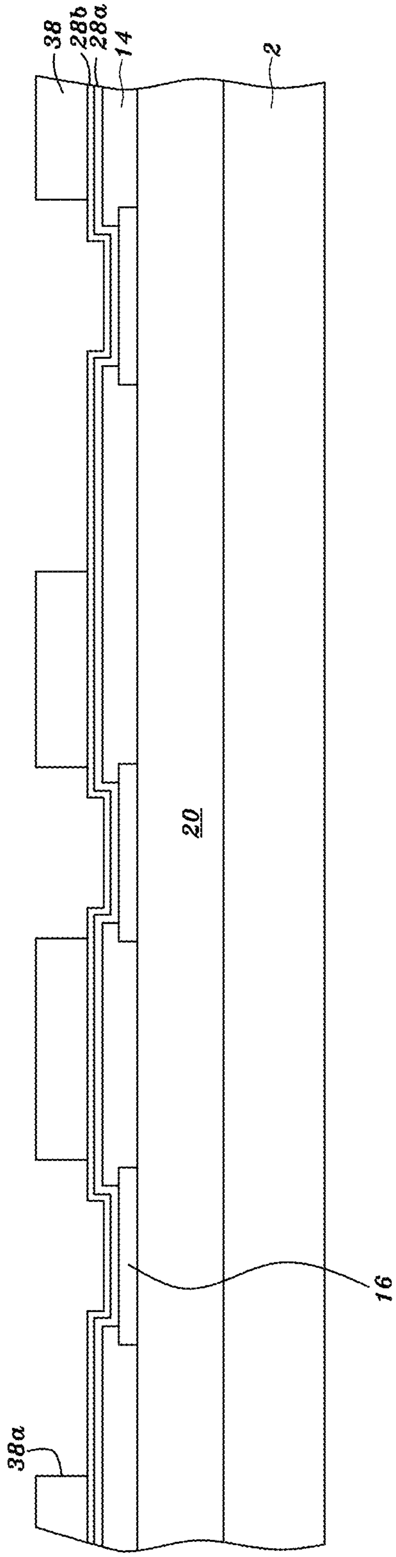
FIGS. 22A-22Y are schematically cross-sectional views showing a process for forming a chip in accordance with an embodiment of the present application.

Referring to FIG. 22A, an adhesion layer 28*a* may be first sputtered on the passivation layer 14 and on the metal pad 16, such as aluminum pad or copper pad, exposed by opening 14*a*. The specification for the adhesion layer 28*a* and the process for forming the same may be referred to the specification for the adhesion layer 26*a* and the process for forming the same as illustrated in FIG. 21B. Next, an electroplating seed layer 28*b* may be first sputtered on the adhesion layer 28*a*. The specification for the electroplating seed layer 28*b* and the process for forming the same may be referred to the specification for the electroplating seed layer 26*b* and the process for forming the same as illustrated in FIG. 21C. Next, a photoresist layer 38, such as positive-type photoresist layer, having a thickness of between 1 and 50 μm is spin-on coated or laminated on the electroplating seed layer 28*b*. The photoresist layer 38 is patterned with the processes of exposure, development, etc., to form multiple trenches or openings 38*a* in the photoresist layer 38 exposing the electroplating seed layer 28*b*. A 1× stepper, 1× contact aligner or laser scanner may be used to expose the photoresist layer 38 with at least two of G-line having a wavelength ranging from 434 to 438 nm, H-line having a wavelength ranging from 403 to 407 nm, and I-line having a wavelength ranging from 363 to 367 nm, illuminating the photoresist layer 96, that is, G-line and H-line, G-line and I-line, H-line and I-line, or G-line, H-line and I-line illuminate the photoresist layer 38, then developing the exposed photoresist layer 38, and then removing the residual polymeric material or other contaminants on the electroplating seed layer 28*b* with an $O_2$ plasma or a plasma containing fluorine of below 200 PPM and oxygen, such that the photoresist layer 38 may be patterned with multiple trenches or openings 38*a* in the photoresist layer 38 exposing the electroplating seed layer 28*b* for forming metal pads, lines or traces in the trenches or openings 38*a* and on the electroplating seed layer 28*b* by following processes to be performed later. One of the trenches or openings 38*a* in the photoresist layer 38 may overlap the whole area of one of the openings 14*a* in the passivation layer 14.

Figure 22B:
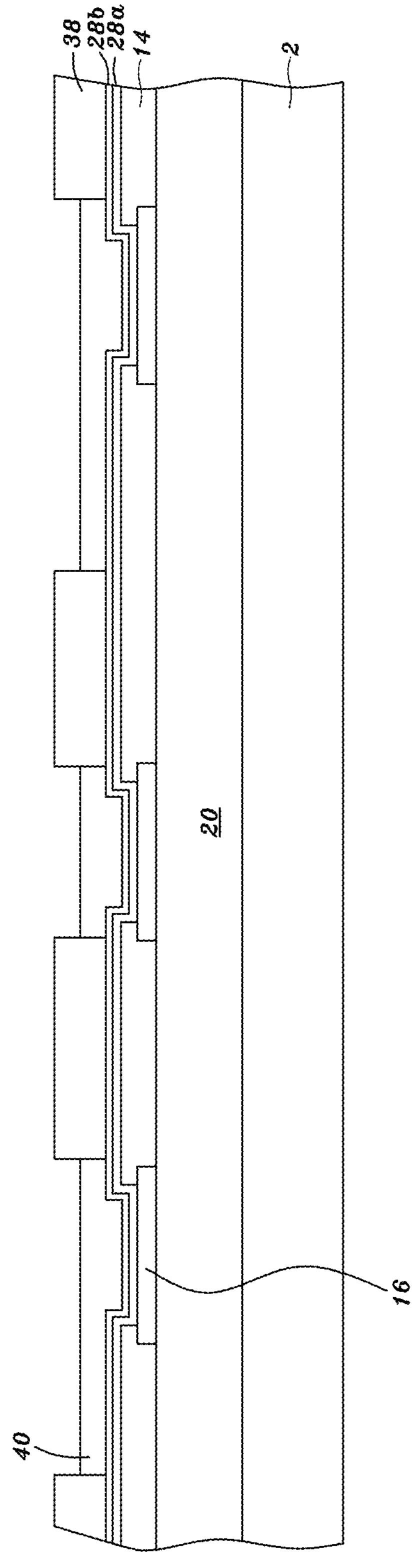

Next, referring to FIG. 22B, a metal layer 40, such as copper, may be electroplated on the electroplating seed layer 28*b* exposed by the trenches or openings 38*a*. For example, the metal layer 40 may be formed by electroplating a copper layer with a thickness of between 0.3 and 20 μm, 0.5 and 5 μm, 1 μm and 10 μm or 2 μm and 10 μm on the electroplating seed layer 28*b*, made of copper, exposed by the trenches or openings 38*a*.

Figure 22C:
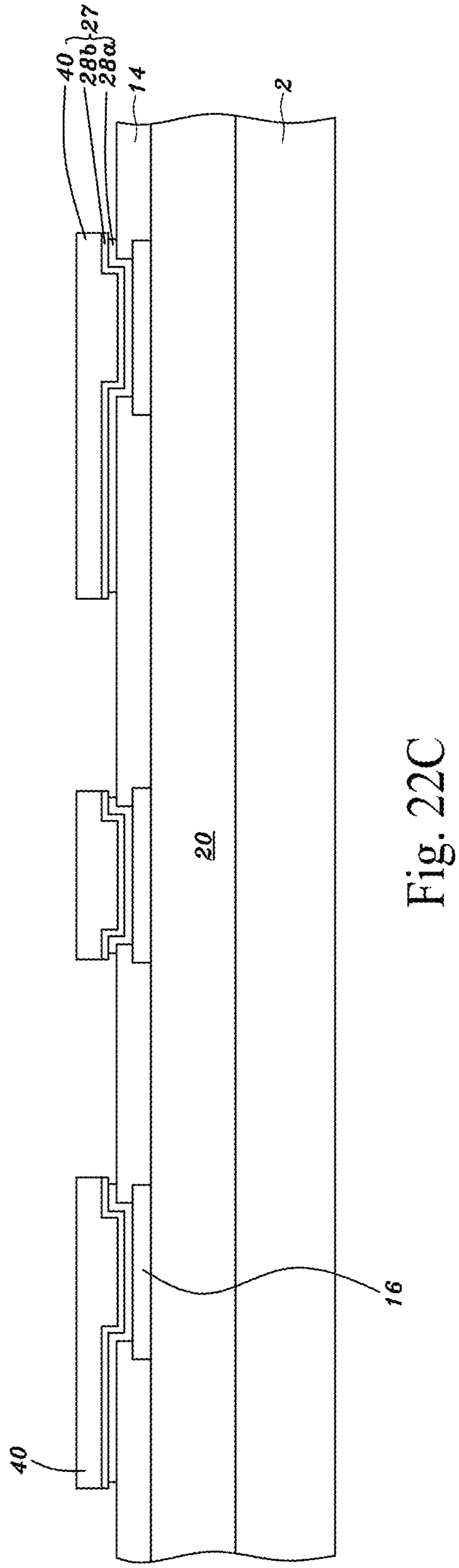

Referring to FIG. 22C, after the metal layer 40 is formed, most of the photoresist layer 38 may be removed and then the electroplating seed layer 28*b* and adhesion layer 28*a* not under the metal layer 40 may be etched. The removing and etching processes may be referred respectively to the process for removing the photoresist layer 30 and etching the electroplating seed layer 26*b* and adhesion layer 26*a* as illustrated in FIG. 21F. Thereby, the adhesion layer 28*a*, electroplating seed layer 28*b* and electroplated metal layer 40 may be patterned to form an interconnection metal layer 27 over the passivation layer 14.

Figure 22D:
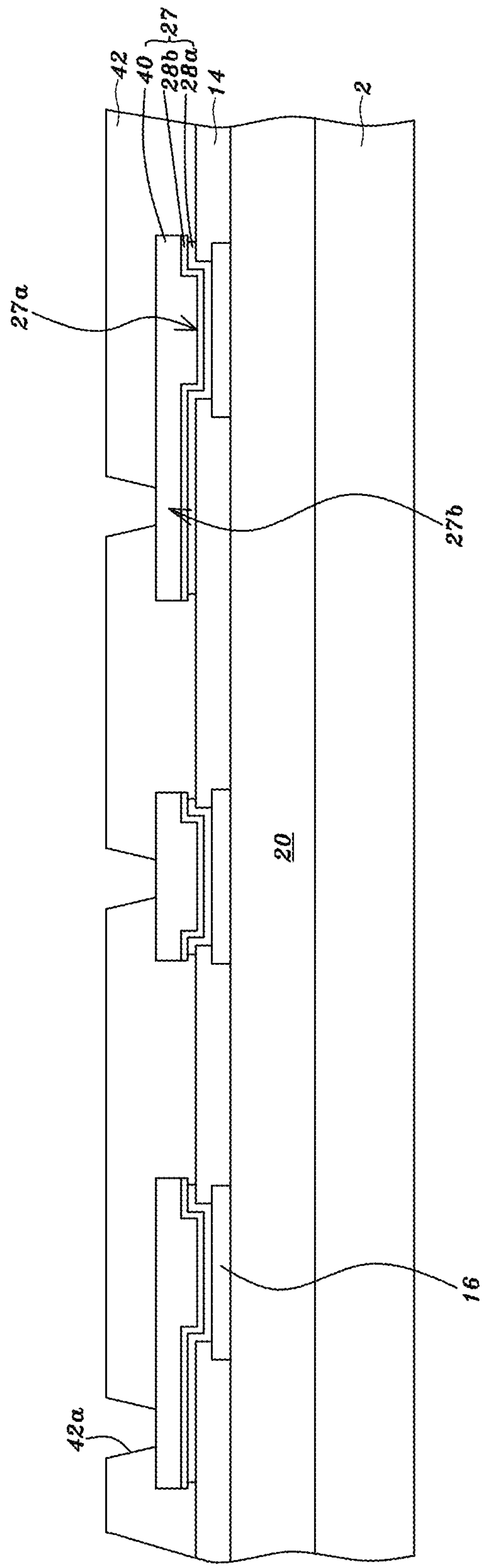

Next, referring to FIG. 22D, a polymer layer 42, i.e., insulting or inter-metal dielectric layer, is formed on the passivation layer 14 and metal layer 40 and multiple openings 42*a* in the polymer layer 42 are over multiple contact points of the interconnection metal layer 27. The material of the polymer layer 42 and the process for forming the same may be referred to that of the polymer layer 36 and the process for forming the same as illustrated in FIG. 21H.

Figure 22E:
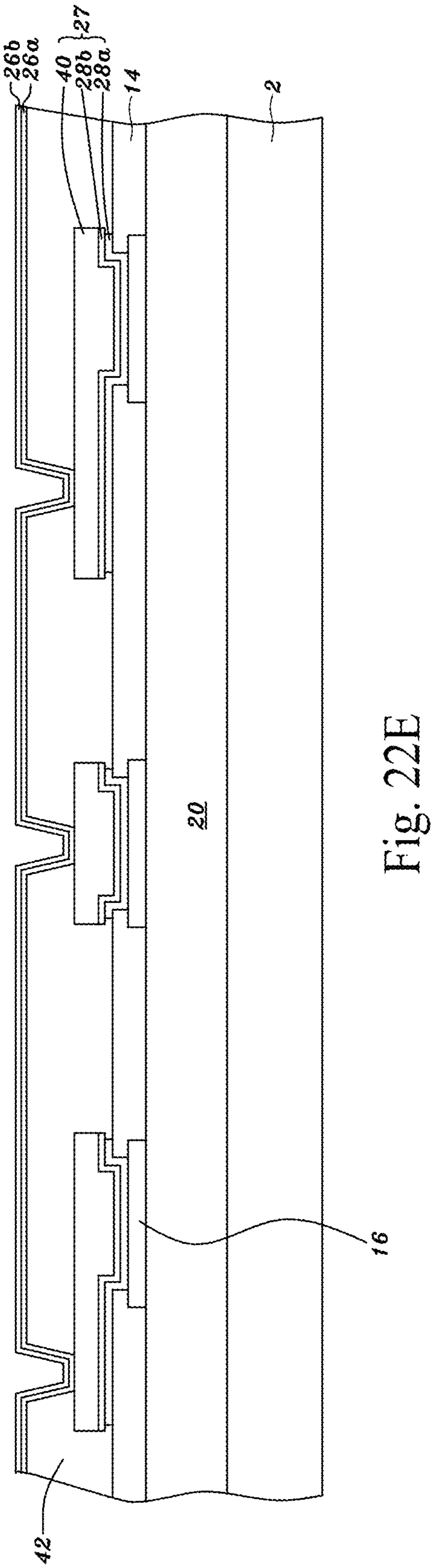
Figure 22F:
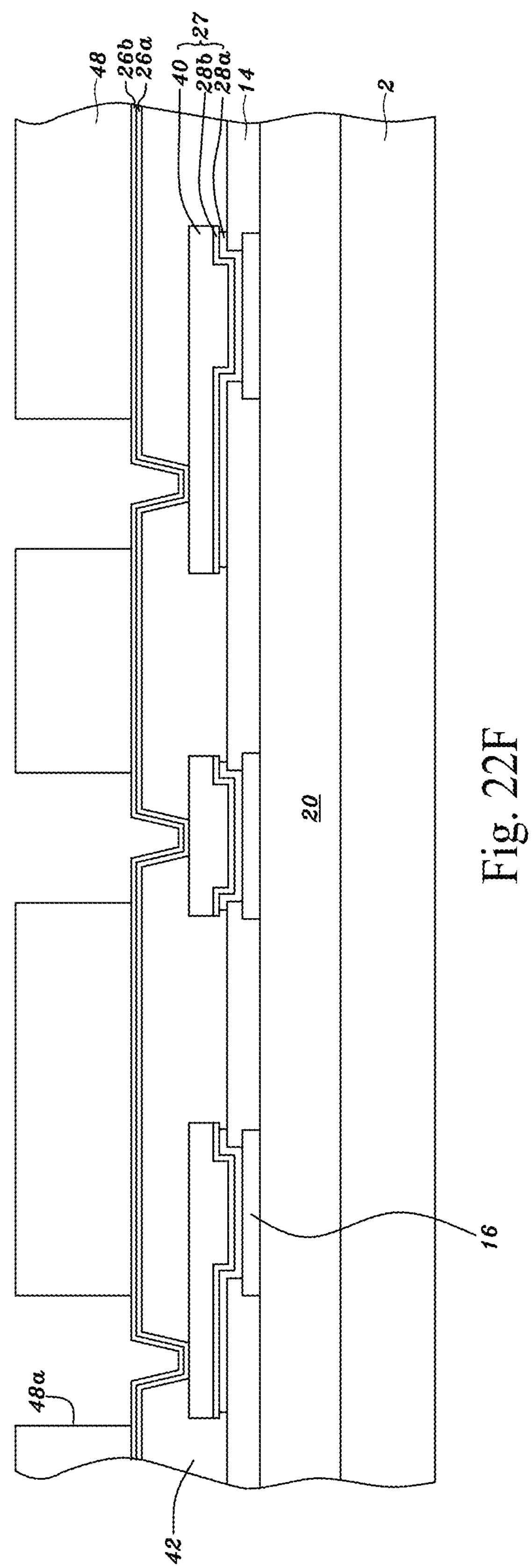
Figure 22G:
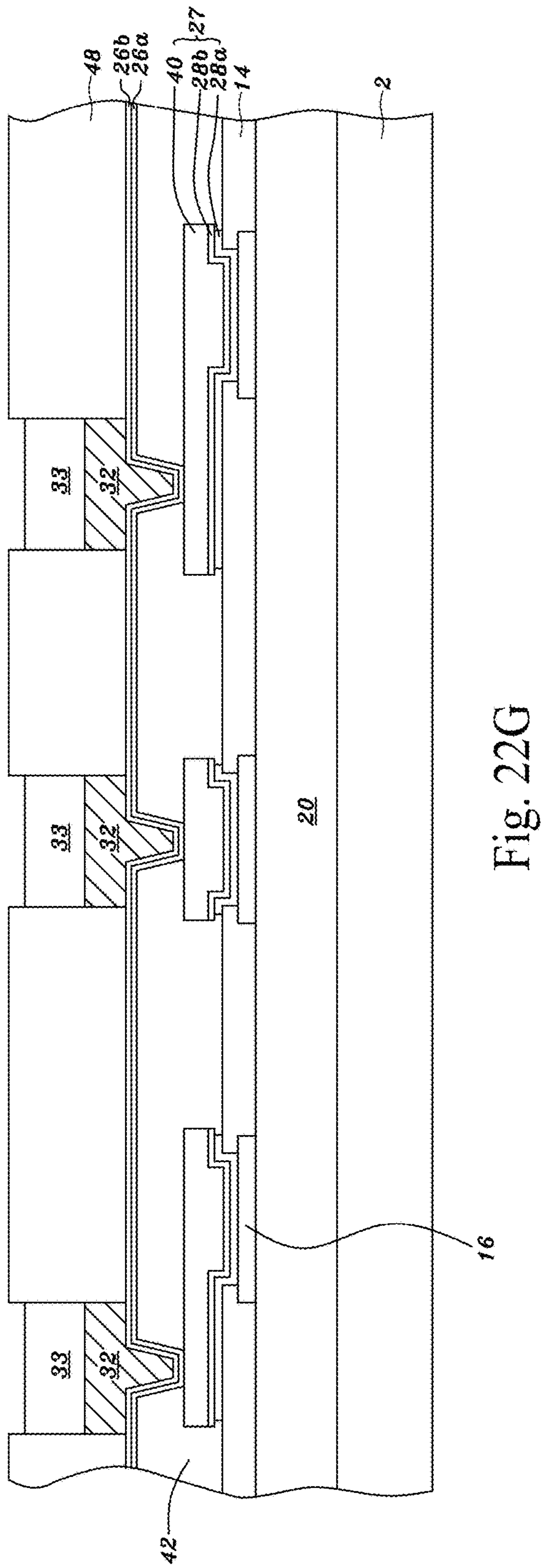
Figure 22H:
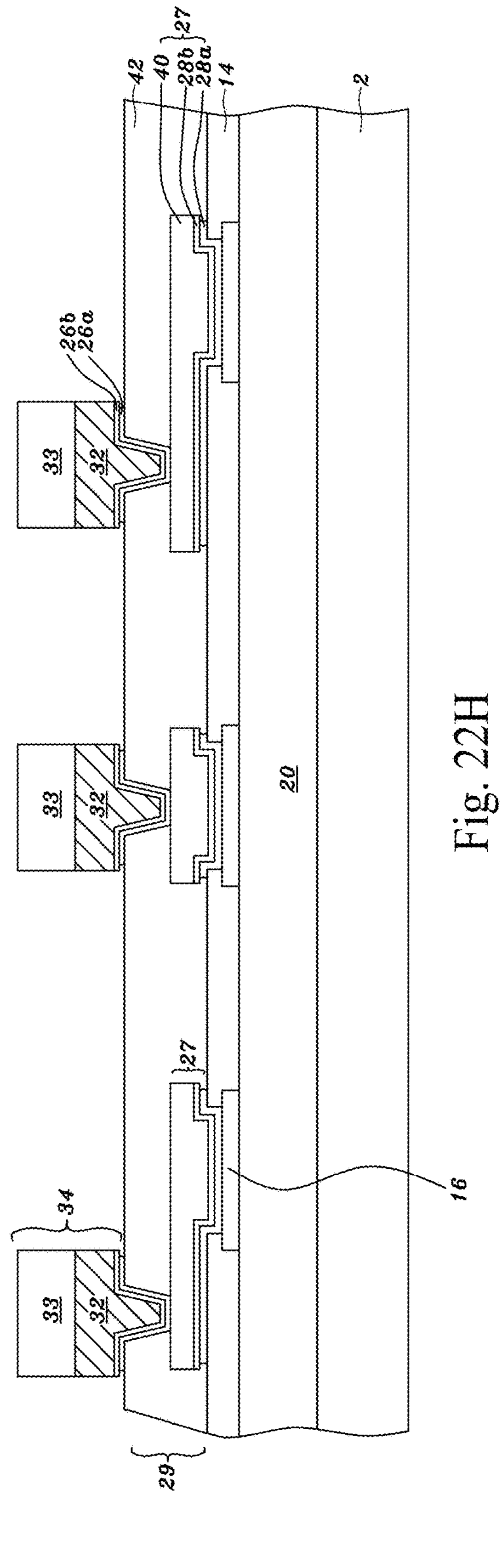
Figure 22I:
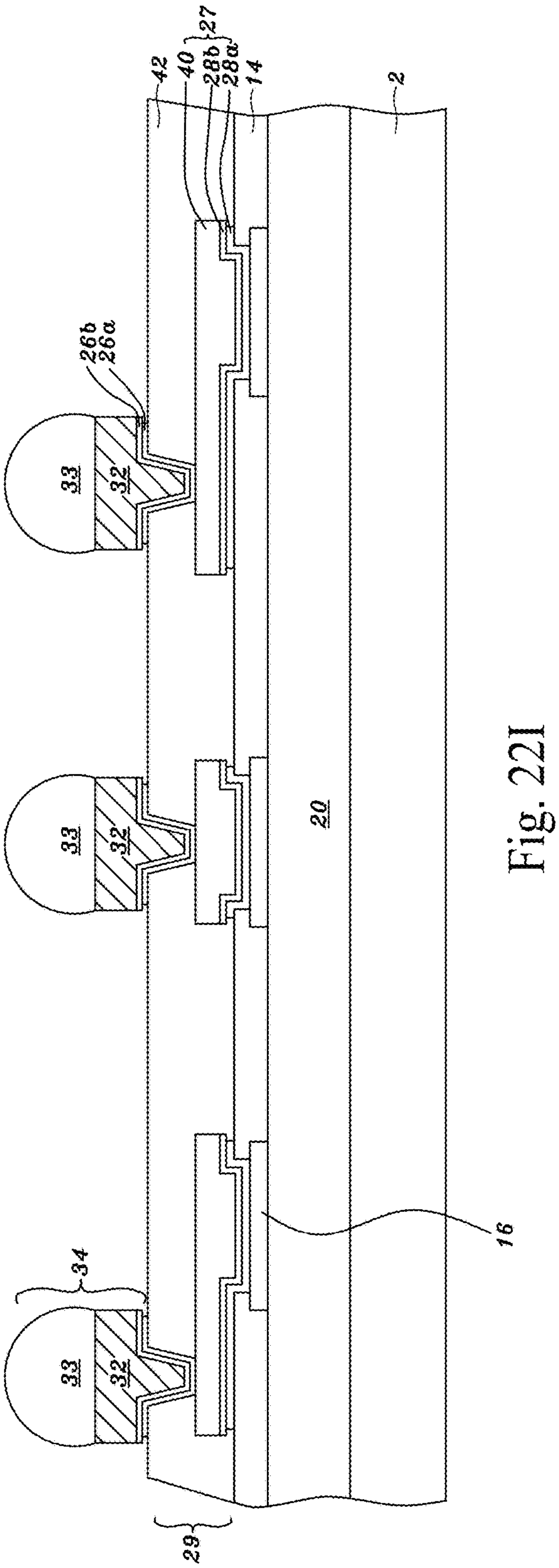
Figure 22J:
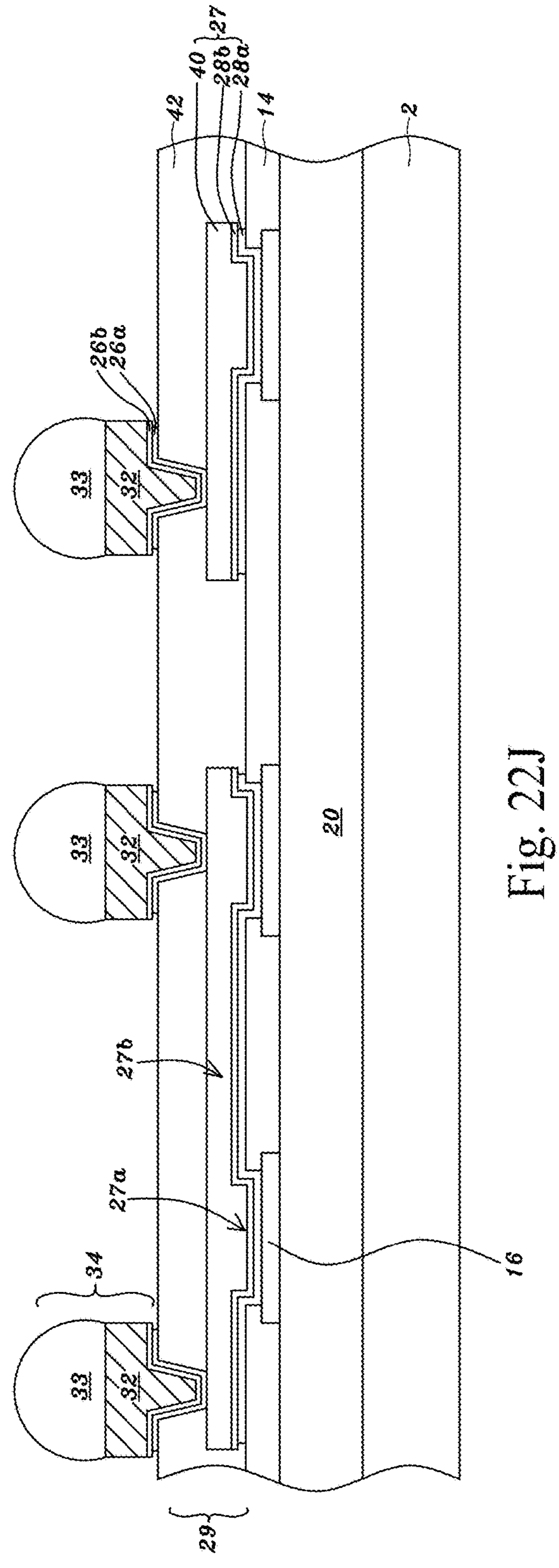
Figure 22K:
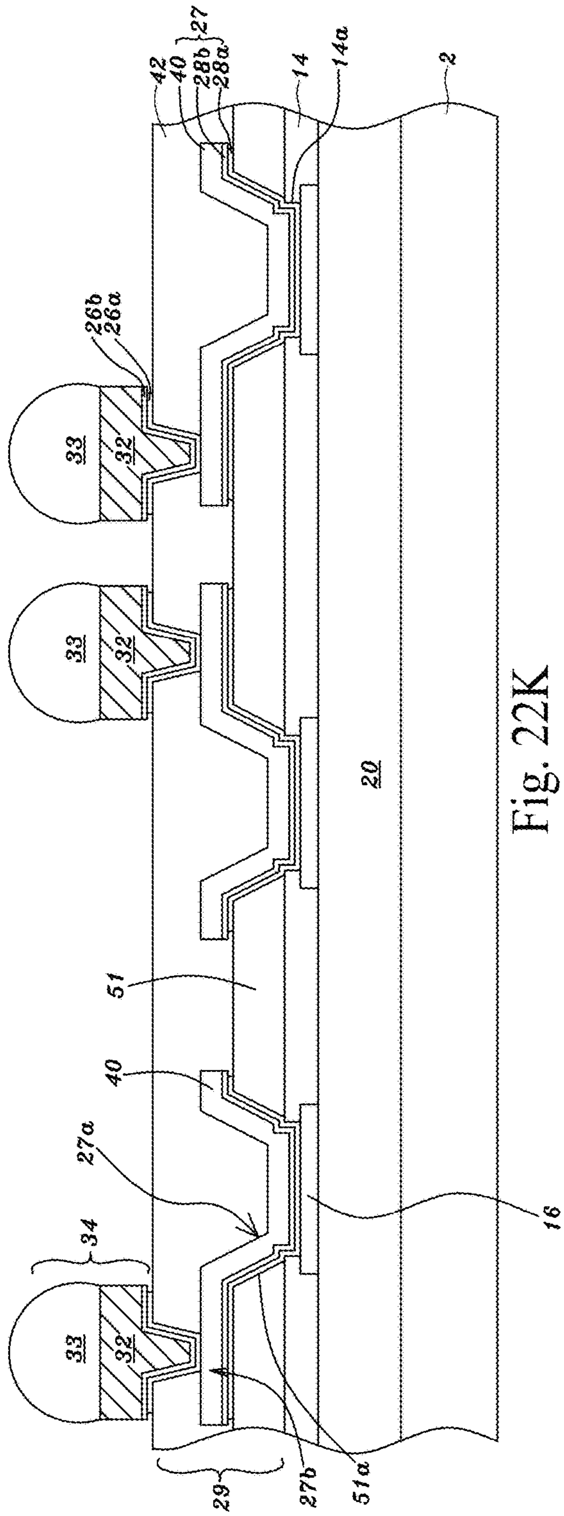
Figure 22L:
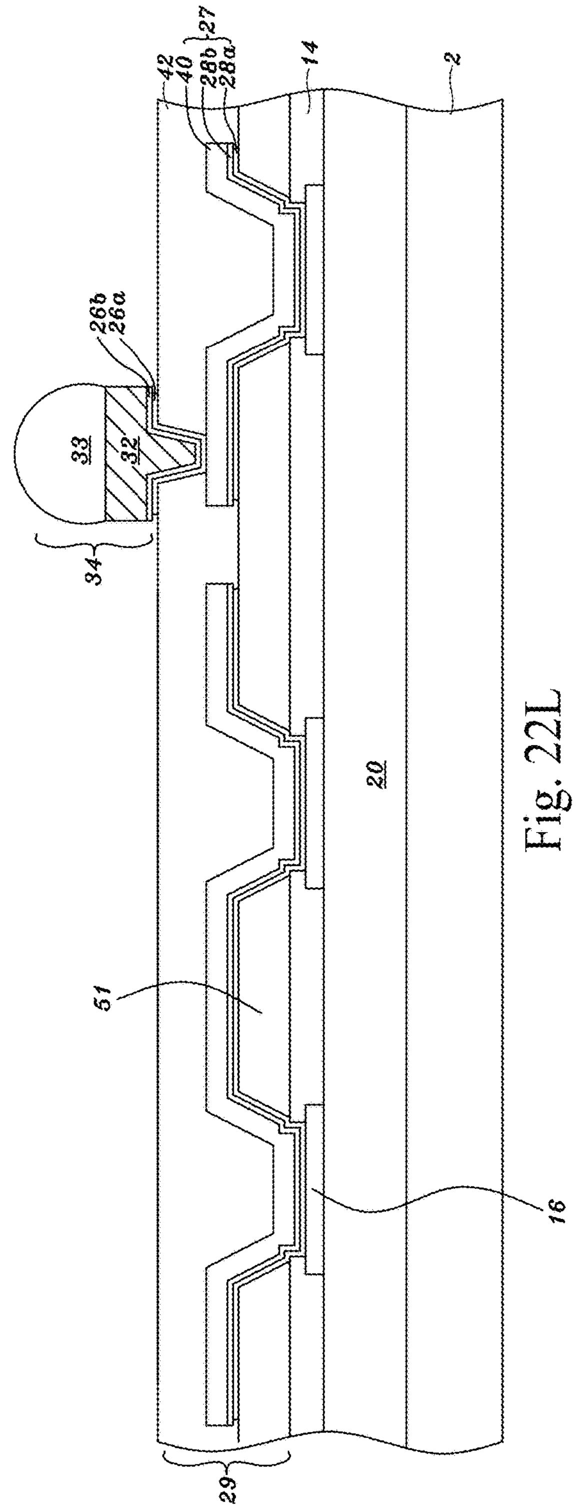
Figure 22M:
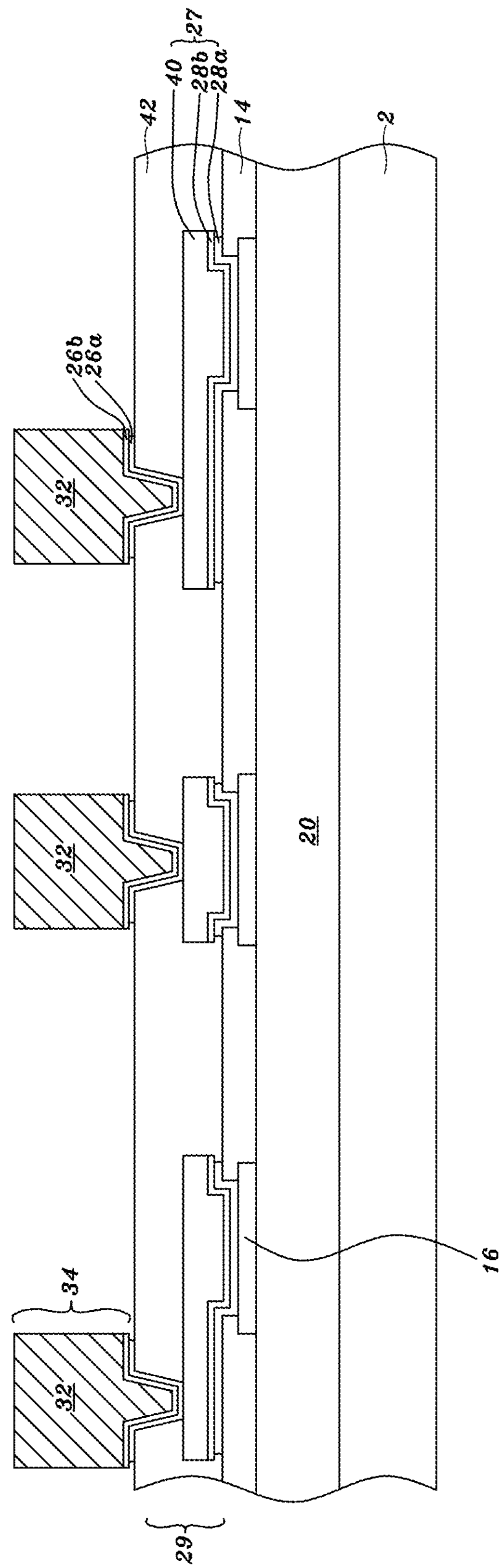
Figure 22N:
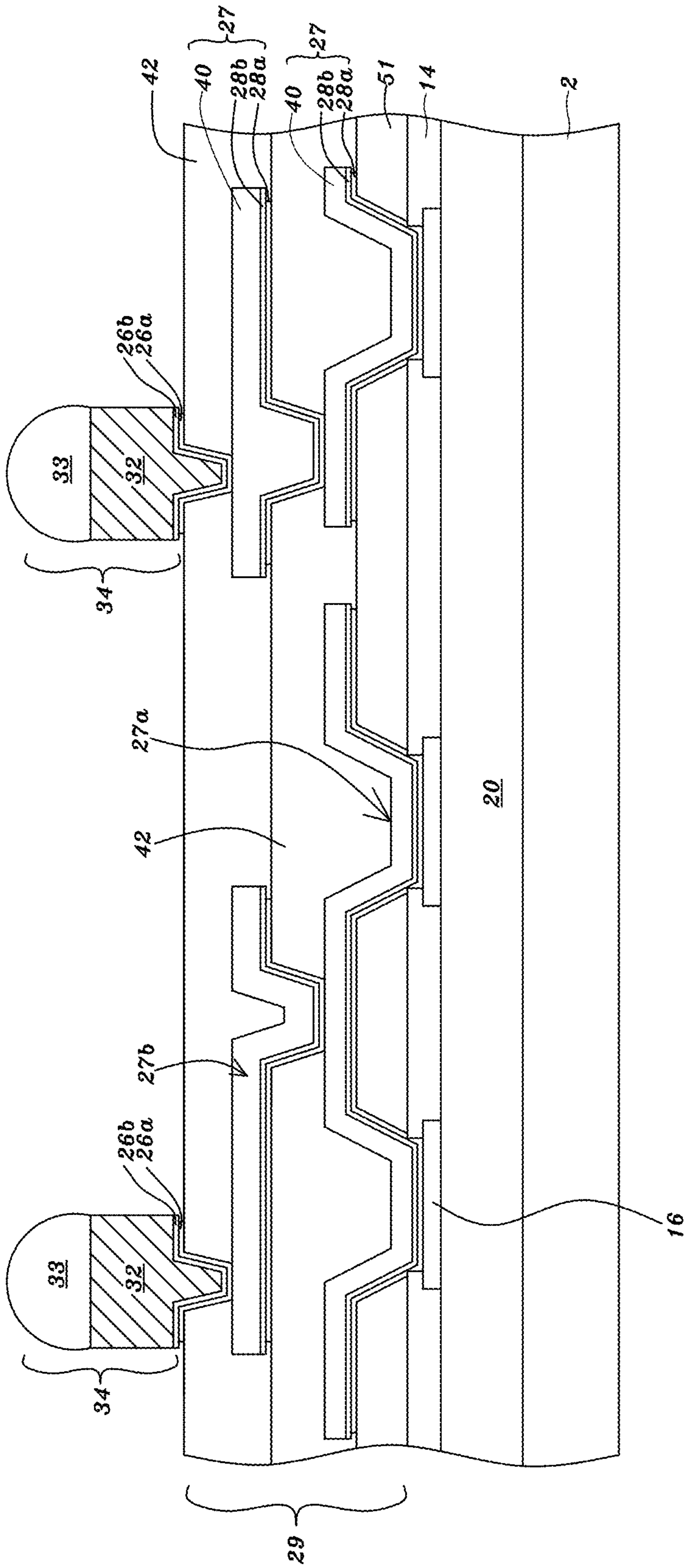

The process for forming the interconnection metal layer 27 as illustrated in FIGS. 21A, 21B and 22A-22C and the process for forming the polymer layer 42 as seen in FIG. 22D may be alternately performed more than one times to fabricate the SISC 29 as seen in FIG. 22N. FIG. 22N is a cross-sectional view showing a second interconnection scheme of a chip (SISC) is formed with multiple interconnection metal layers 27 and multiple polymer layers 42 and 51, i.e., insulating or inter-metal dielectric layers, alternatively arranged in accordance with an embodiment of the present application. Referring to FIG. 22N, the SISC 29 may include an upper one of the interconnection metal layers 27 formed with multiple metal vias 27*a* in the openings 42*a* in one of the polymer layers 42 and multiple metal pads, lines or traces 27*b* on said one of the polymer layers 42. The upper one of the interconnection metal layers 27 may be connected to a lower one of the interconnection metal layers 27 through the metal vias 27*a* of the upper one of the interconnection metal layers 27 in the openings 42*a* in said one of the polymer layers 42. The SISC 29 may include the bottommost one of the interconnection metal layers 27 formed with multiple metal vias 27*a* in the openings 14*a* in the passivation layer 14 and multiple metal pads, lines or traces 27*b* on the passivation layer 14. The bottommost one of the interconnection metal layers 27 may be connected to the interconnection metal layers 6 of the FISC 20 through the metal vias 27*a* of the bottommost one of the interconnection metal layers 27 in the openings 14*a* in the passivation layer 14.

Alternatively, referring to FIGS. 22K, 22L and 22N, a polymer layer 51 may be formed on the passivation layer 14 before the bottommost one of the interconnection metal layers 27 is formed. The material of the polymer layer 51 and the process for forming the same may be referred to the polymer layer 36 and the process for forming the same as shown in FIG. 21H. In this case, the SISC 29 may include the bottommost one of the interconnection metal layers 27 formed with multiple metal vias 27*a* in the openings 51*a* in the polymer layer 51 and multiple metal pads, lines or traces 27*b* on the polymer layer 51. The bottommost one of the interconnection metal layers 27 may be connected to the interconnection metal layers 6 of the FISC 20 through the metal vias 27*a* of the bottommost one of the interconnection metal layers 27 in the openings 14*a* in the passivation layer 14 and in the openings 51*a* in the polymer layer 51.

Accordingly, the SISC 29 may be optionally formed with 2 to 6 layers or 3 to 5 layers of interconnection metal layers 27 over the passivation layer 14. For each of the interconnection metal layers 27 of the SISC 29, its metal pads, line or traces 27*b* may have a thickness between, for example, 0.3 μm and 20 μm, 0.5 μm and 10 μm, 1 μm and 5 μm, 1 μm and 10 μm or 2 μm and 10 μm, or thicker than or equal to 0.3 μm, 0.5 μm, 0.7 μm, 1 μm, 1.5 μm, 2 μm or 3 μm and a width between, for example, 0.3 μm and 20 μm, 0.5 μm and 10 μm, 1 μm and 5 μm, 1 μm and 10 μm or 2 μm and 10 μm, or wider than or equal to 0.3 μm, 0.5 μm, 0.7 μm, 1 μm, 1.5 μm, 2 μm or 3 μm. Each of the polymer layers 42 and 51 may have a thickness between, for example, 0.3 μm and 20 μm, 0.5 μm and 10 μm, 1 μm and 5 μm, or 1 μm and 10 μm, or thicker than or equal to 0.3 μm, 0.5 μm, 0.7 μm, 1 μm, 1.5 μm, 2 μm or 3 μm. The metal pads, lines or traces 27*b* of the interconnection metal layers 27 of the SISC 29 may be used for the programmable interconnects 202.

FIGS. 22E-22I are schematically cross-sectional views showing a process for forming a first type of micro-pillars or micro-bumps on an interconnection metal layer over a passivation layer in accordance with an embodiment of the present application. Referring to FIG. 22E, an adhesion layer 26*a* may be sputtered on the polymer layer 42 and on the metal layer 40 exposed by the opening 42*a*. The specification of the adhesion layer 26*a* and the process for forming the same may be referred to those as illustrated in FIG. 21B. Next, an electroplating seed layer 26*b* may be sputtered on the adhesion layer 26*a*. The specification of the electroplating seed layer 26*b* and the process for forming the same may be referred to those as illustrated in FIG. 21C.

Next, referring to FIG. 22F, a photoresist layer 48 is formed on the electroplating seed layer 26*b*. The photoresist layer 48 is patterned with the processes of exposure, development, etc., to form an opening 48*a* in the photoresist layer 48 exposing the electroplating seed layer 26*b*. The specification of the photoresist layer 48 and the process for forming the same may be referred to that of the photoresist layer 48 and the process for forming the same as illustrated in FIG. 21D.

Next, referring to FIG. 22G, the metal layer 32 is electroplated on the electroplating seed layer 26*b* exposed by the opening 48*a*. The specification of the metal layer 32 and the process for forming the same may be referred to those as illustrated in FIG. 21E. Next, a solder cap or layer 33 is electroplated on the metal layer 32 in the opening 48*a*. The specification of the solder cap 33 and the process for forming the same as illustrated herein may be referred to those as illustrated in FIG. 21E.

Next, referring to FIG. 22H, most of the photoresist layer 48 may be removed and then the electroplating seed layer 26*b* and adhesion layer 26*a* not under the metal layer 32 may be etched. The processes for removing the photoresist layer 48 and etching electroplating seed layer 26*b* and adhesion layer 26*a* may be referred respectively to the processes for removing the photoresist layer 30 and etching the electroplating seed layer 26*b* and adhesion layer 26*a* as illustrated in FIG. 21F.

Next, referring to FIG. 22I, the solder cap or layer 33 may be reflowed into multiple solder bumps. Thereby, the adhesion layer 26*a*, electroplating seed layer 26*b*, electroplated metal layer 32 and solder bumps 33 may compose the first type of micro-pillars or micro-bumps 34 on the topmost one of the interconnection metal layers 27 of the SISC 29 at bottoms of the openings 42*a* in the topmost one of the polymer layers 42 of the SISC 29. The specification of the micro-pillars or micro-bumps 34 of the first type as seen in FIG. 22I may be referred to that as illustrated in FIG. 21G. Each of the micro-pillars or micro-bumps 34 of the first type may have a height, protruding from a top surface of a topmost one of the polymer layers 42 of the SISC 29, between 1 μm and 60 μm, 3 μm and 60 μm, 5 μm and 50 μm, 5 μm and 40 μm, 5 μm and 30 μm, 5 μm and 20 μm, 1 μm and 15 μm, 5 μm and 15 μm, 1 μm and 10 μm or 3 μm and 10 μm, or greater than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm. The space from one of the micro-pillars or micro-bumps 34 of the first type to its nearest one of the micro-pillars or micro-bumps 34 is between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm or smaller than or equal to 60 μm, 50 μm, 40 μm, 30 μm, 20 μm, 15 μm, 10 μm or 5 μm. Alternatively, each of the micro-pillars or micro-bumps 34 of the first type may have a height, protruding from a top surface of a topmost one of the polymer layers 42 of the SISC 29, smaller than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm.

Alternatively, referring to FIG. 22M, the second type of micro-bump or micro-pillar 34 as seen in FIG. 21I or 21J may be formed on the topmost one of the interconnection metal layers 27 of the SISC 29 at bottoms of the openings 42*a* in the topmost one of the polymer layers 42 of the SISC 29. The adhesion layer 26*a*, electroplating seed layer 26*b*, electroplated metal layer 32 as seen in FIG. 21I or 21J may compose the second type of micro-pillars or micro-bumps 34. Each of the micro-pillars or micro-bumps 34 of the second type may have a height, protruding from a top surface of a topmost one of the polymer layers 42 of the SISC 29, between 1 μm and 60 μm, 3 μm and 60 μm, 5 μm and 50 μm, 5 μm and 40 μm, 5 μm and 30 μm, 5 μm and 20 μm, 1 μm and 15 μm, 5 μm and 15 μm, 1 μm and 10 μm or 3 μm and 10 μm, or greater than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm. The space from one of the micro-pillars or micro-bumps 34 of the second type to its nearest one of the micro-pillars or micro-bumps 34 is between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm or smaller than or equal to 60 μm, 50 μm, 40 μm, 30 μm, 20 μm, 15 μm, 10 μm or 5 μm. Alternatively, each of the micro-pillars or micro-bumps 34 of the second type may have a height, protruding from a top surface of a topmost one of the polymer layers 42 of the SISC 29, smaller than or equal to 60 μm, 50 μm, 40 μm, 30 μm, 20 μm, 15 μm, 10 μm, 5 μm or 3 μm, and a largest dimension in a horizontal cross-section (for example, the diameter of a circle shape, or the diagonal length of a square or rectangle shape) between, for example, 1 μm and 60 μm, 3 μm and 60 μm, 5 μm and 50 μm, 5 μm and 40 μm, 5 μm and 30 μm, 5 μm and 20 μm, 5 μm and 15 μm, 3 μm and 10 μm, 1 μm and 15 μm or 1 μm and 10 μm, or smaller than or equal to 60 μm, 50 μm, 40 μm, 30 μm, 20 μm, 15 μm, 10 μm or 5 μm.

Referring to FIG. 22J, the above-mentioned interconnection metal layers 27 may comprise a power interconnection metal trace or a ground interconnection metal trace to connect multiple of the metal pads 16 and to have the micro-pillars or micro-bumps 34 formed thereon. Referring to FIG. 22L, the above-mentioned interconnection metal layers 27 may comprise an interconnection metal trace to connect multiple of the metal pads 16 and to have no micro-pillar or micro-bump formed thereon.

Referring to FIGS. 22I-22L and 22N, the interconnection metal layers 27 of the FISC 29 may be used for the programmable and fixed interconnects 361 and 364 of the intra-chip interconnects 502, as seen in FIG. 12A, of each of the standard commodity FPGA IC chips 200.

Figure 22O:
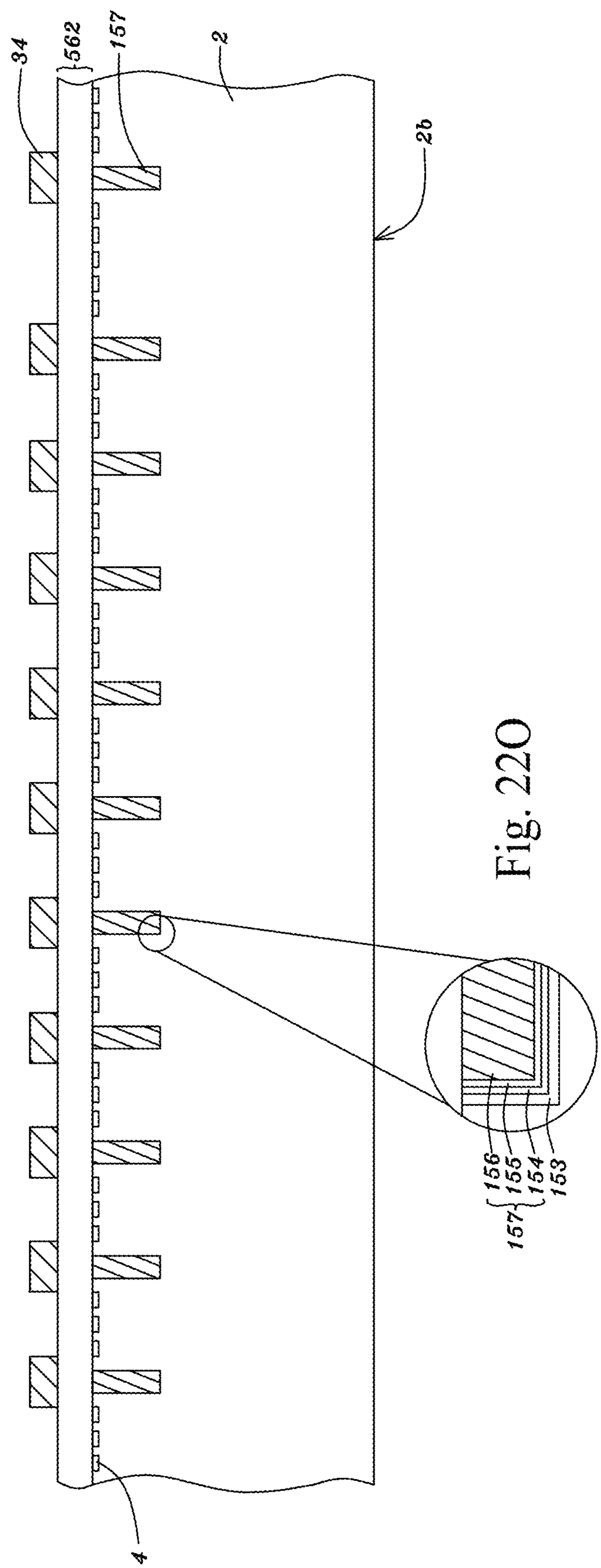

FIG. 22O is a simplified drawing of a semiconductor wafer after the semiconductor devices, through silicon vias, first and/or second interconnection scheme and micro-bumps or micro-pillars as illustrate in FIGS. 19A-22N are formed in accordance with an embodiment of the present application. The specification for the micro bumps 34 may be referred to those for the semiconductor chip 100 as illustrated in FIGS. 21A-21J and 22E-22M.

Referring to FIG. 22O, an interconnection scheme 562 may be composed of the FISC 20 and passivation layer 14 as illustrated in FIG. 20A, and each of the micro-pillars or micro-bumps 34 of the first or second type as illustrated in FIGS. 21A-21J and 22E-22M may have the adhesion layer 26*a* formed on one of the metal pads 16 and on the passivation layer 14 around one of the openings 14*a*.

Alternatively, referring to FIG. 22O, the interconnection scheme 562 may be composed of the FISC 20 and passivation layer 14 as illustrated in FIG. 20A and further of a polymer layer, like the one 36 as seen in FIG. 21H, on the passivation layer 14, wherein each opening in the polymer layer, like the one 36*a* as seen in FIG. 21H, may expose one of the metal pads 16, and each of the micro-pillars or micro-bumps 34 of the first or second type as illustrated in FIGS. 21A-21J and 22E-22M may have the adhesion layer 26*a* formed on one of the metal pads 16 and on the polymer layer around one of the openings in the polymer layer.

Alternatively, referring to FIG. 22O, the interconnection scheme 562 may be composed of the FISC 20 and passivation layer 14 as illustrated in FIG. 20A and further of the SISC 29 as illustrated in FIGS. 22I-22N over the passivation layer 14, wherein each opening 42*a* in a topmost one of the polymer layers 42 of the SISC 29 may expose a metal pad of a topmost one of the interconnection metal layers 27 of the SISC 29 and each of the micro-pillars or micro-bumps 34 of the first or second type as illustrated in FIGS. 21A-21J and 22E-22M may have the adhesion layer 26*a* formed on one of the metal pad and on the topmost one of the polymer layers 42 around one of the openings 42*a* in the topmost one of the polymer layers 42.

For explaining the subsequent processes, the interconnection scheme 562 is simplified as seen in FIG. 22O.

Figure 22P:
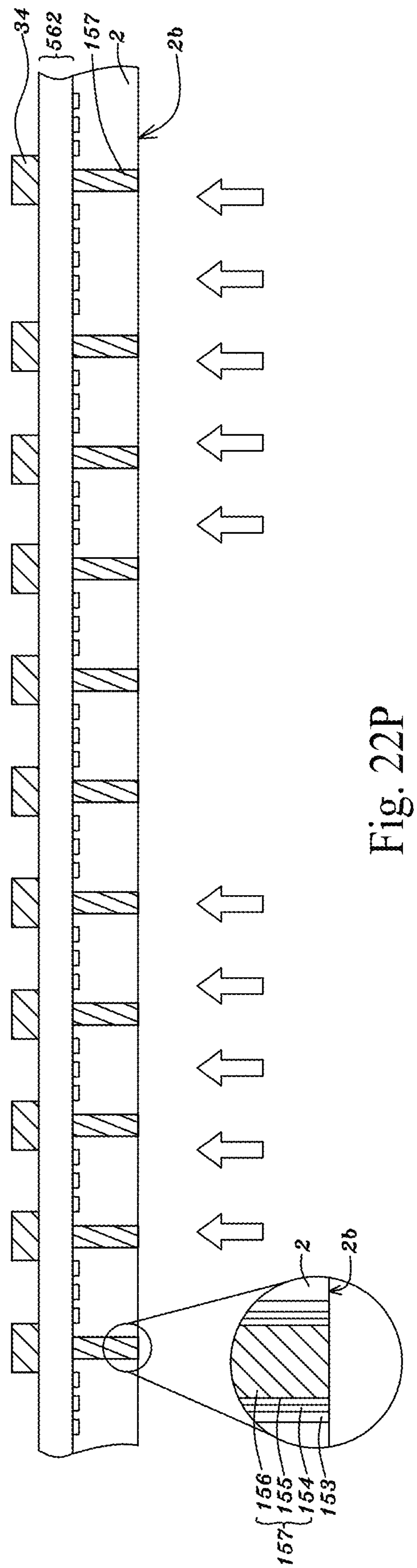

Next, referring to FIG. 22P, the semiconductor wafer has a backside 2*b* to be polished by a CMP process or a wafer backside grinding process until each of the through silicon vias 157 is exposed, that is, its insulating lining layer 153 at its backside 2*b* is removed into an insulating lining surrounding its adhesion layer 154, electroplating seed layer 155 and electroplated copper layer 156, and a bottom end of its electroplated copper layer 156 is exposed. Each of the through silicon vias 157 in the silicon substrate 2 may have a height between 10 μm and 100 μm or between 20 μm and 60 μm and a diameter or largest transverse dimension between 2 μm and 60 μm or between 5 μm and 20 μm.

Figure 22Q:
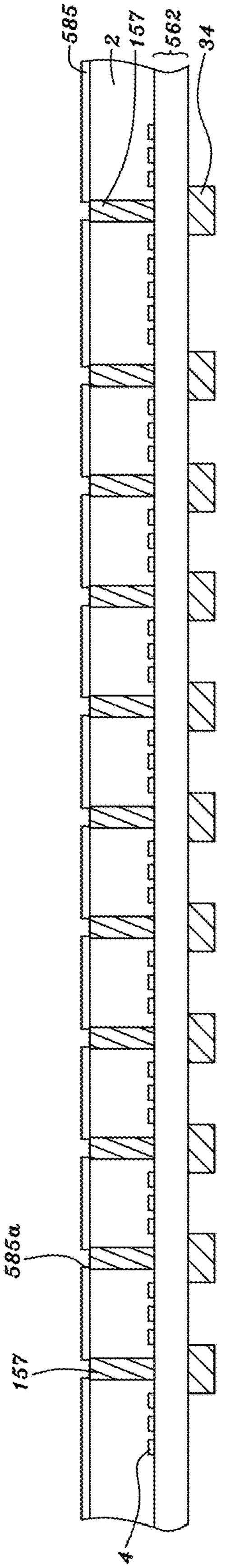

Referring to FIG. 22Q, a polymer layer 585, i.e., insulating dielectric layer, may be formed on the backside 2*b* of the semiconductor wafer and the backsides of the through silicon vias (TSV) 157 by a method of spin-on coating, screen-printing, dispensing or molding, and multiple openings 585*a* in the polymer layer 585 may be formed over and expose the through silicon vias (TSV) 157. The polymer layer 585 may contain, for example, polyimide, BenzoCycloButene (BCB), parylene, epoxy-based material or compound, photo epoxy SU-8, elastomer or silicone. The polymer layer 585 may comprise organic material, for example, a polymer, or materials or compounds comprising carbon. The polymer layer 585 may be photosensitive, and may be used as photoresist as well for patterning multiple openings 585*a* therein to expose the through silicon vias (TSV) 157. That is, the polymer layer 585 may be coated, exposed to light through a photomask, and then developed to form the openings 585*a* therein. The openings 585*a* in the polymer layer 585 overlap and expose the top surfaces of the through silicon vias (TSV) 157 respectively. Next, the polymer layer 585, i.e., insulating dielectric layer, is cured at a temperature, for example, at or higher than 100° C., 125° C., 150° C., 175° C., 200° C., 225° C., 250° C., 275° C. or 300° C. In some applications or designs, the size or transverse largest dimension of one of the openings 585*a* in the polymer layer 585 may be smaller than that of the area of the backside of one of the through silicon vias (TSV) 157 under said one of the openings 585*a*. In other applications or designs, the size or transverse largest dimension of one of the openings 585*a* in the polymer layer 585 may be greater than that of the area of the backside of one of the through silicon vias (TSV) 157 under said one of the openings 585*a*. The polymer layer 585 has a thickness between 3 and 30 micrometers or between 5 and 15 micrometers. The polymer layer 585 may be added with some dielectric particles or glass fibers. The material of the polymer layer 585 and the process for forming the same may be referred to that of the polymer layer 36 and the process for forming the same as illustrated in FIG. 21H.

Metal Bumps at Backside of Semiconductor Wafer

Next, multiple metal pads, pillars or bumps may be formed on a backside of the semiconductor wafer, as seen in FIGS. 22R-22V. FIGS. 22R-22V are schematically cross-sectional views showing a process for forming metal pads, pillars or bumps on the through silicon vias in a semiconductor wafer in accordance with an embodiment of the present application.

Figure 22R:
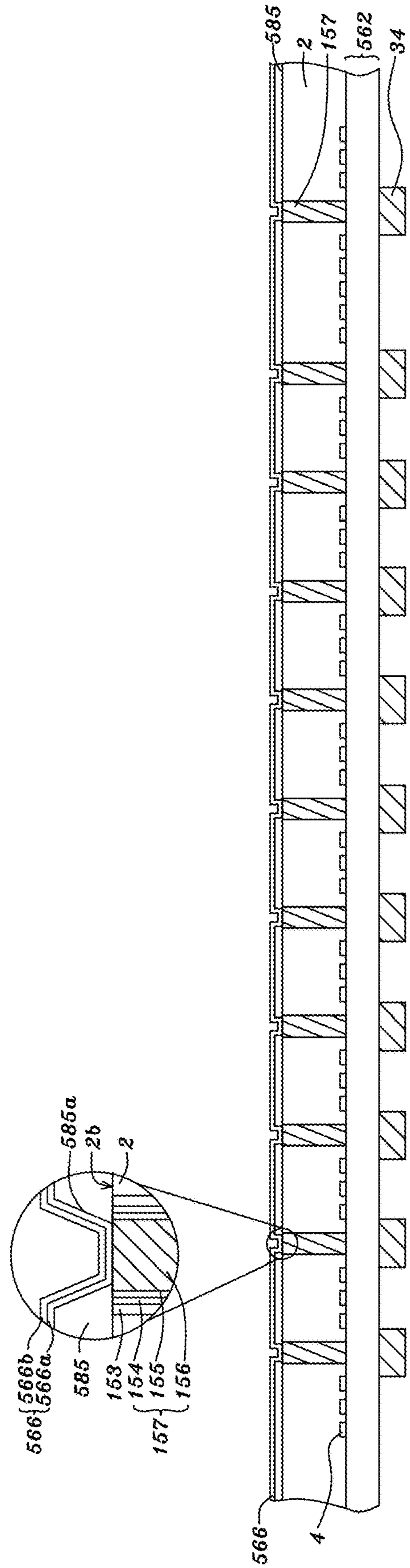

Referring to FIG. 22R, an adhesion/seed layer 566 is formed on the polymer layer 585 and on the backside of the through silicon vias (TSV) 157. With regard to the adhesion/seed layer 566, an adhesion layer 566*a* having a thickness of between 0.001 and 0.7 μm, between 0.01 and 0.5 μm or between 0.03 and 0.35 μm may be first sputtered on the polymer layer 585 and on the copper layer 156, adhesion layer 154 or electroplating seed layer 155 at the backsides of the through silicon vias (TSV) 157. With regard to the adhesion/seed layer 566, the material of its adhesion layer 566*a* may include titanium, a titanium-tungsten alloy, titanium nitride, chromium, titanium-tungsten-alloy layer, tantalum nitride, or a composite of the abovementioned materials. The adhesion layer 566*a* may be formed by an atomic-layer-deposition (ALD) process, chemical vapor deposition (CVD) process or evaporation process. For example, its adhesion layer 566*a* may be formed by sputtering or CVD depositing a titanium (Ti) or titanium nitride (TiN) layer (with a thickness, for example, between 1 nm and 200 nm or between 5 nm and 50 nm) on the polymer layer 585 and on the copper layer 156, adhesion layer 154 or electroplating seed layer 155 at the backsides of the through silicon vias (TSV) 157.

Next, with regard to the adhesion/seed layer 566, an electroplating seed layer 566*b* having a thickness of between 0.001 and 1 μm, between 0.03 and 2 μm or between 0.05 and 0.5 μm may be sputtered on a whole top surface of its adhesion layer 566*a*. Alternatively, the electroplating seed layer 566*b* may be formed by an atomic-layer-deposition (ALD) process, chemical-vapor-deposition (CVD) process, vapor deposition method, electroless plating method or PVD (Physical Vapor Deposition) method. The electroplating seed layer 566*b* is beneficial to electroplating a metal layer thereon. Thus, the material of the electroplating seed layer 566*b* varies with the material of a metal layer to be electroplated on the electroplating seed layer 566*b*. When a copper layer, for a first type of metal bumps 570 to be formed in the following steps, is to be electroplated on the electroplating seed layer 566*b*, copper is a preferable material to the electroplating seed layer 566*b*. When a barrier layer, for multiple metal pads 571 to be formed in the following steps or for a second type of metal bumps 570 to be formed in the following steps, is to be electroplated on the electroplating seed layer 566*b*, copper is a preferable material to the electroplating seed layer 566*b*. When a gold layer, for a third type of metal bumps 570 to be formed in the following steps, is to be electroplated on the electroplating seed layer 566*b*, gold is a preferable material to the electroplating seed layer 566*b*. For example, the electroplating seed layer 566*b*, for the metal pads 571 or first or second type of metal bumps 570 to be formed in the following steps, may be deposited on or over the adhesion layer 566*a* by, for example, sputtering or CVD depositing a copper seed layer (with a thickness between, for example, 3 nm and 400 nm or 10 nm and 200 nm) on the adhesion layer 566*a*. The electroplating seed layer 566*b*, for the third type of metal bumps 570 to be formed in the following steps, may be deposited on or over the adhesion layer 566*a* by, for example, sputtering or CVD depositing a gold seed layer (with a thickness between, for example, 1 nm and 300 nm or 1 nm and 50 nm) on the adhesion layer 566*a*. The adhesion layer 566*a* and electroplating seed layer 566*b* compose the adhesion/seed layer 566 as seen in FIG. 22R.

Figure 22S:
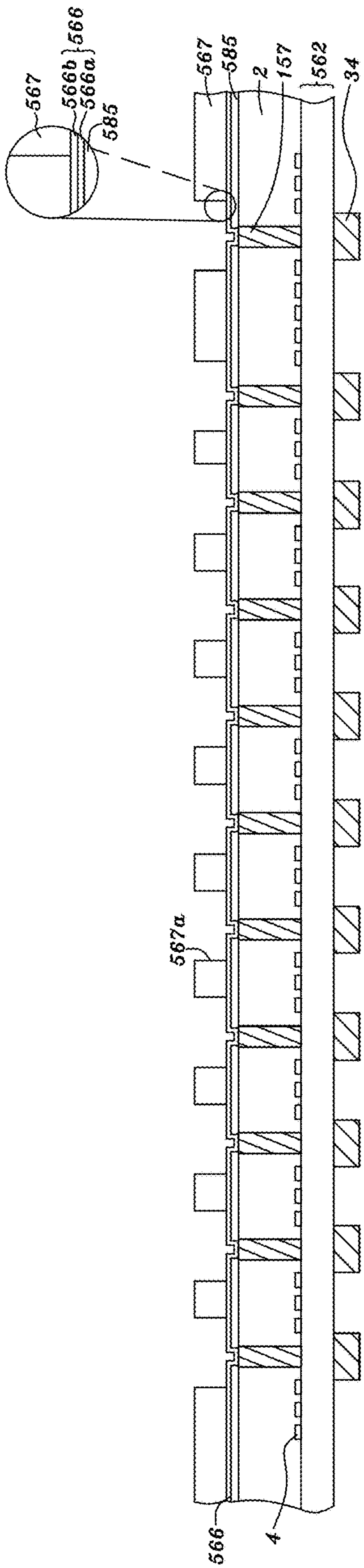

Next, referring to FIG. 22S, a photoresist layer 567, such as positive-type photoresist layer, having a thickness of between 5 and 500 μm is spin-on coated or laminated on the electroplating seed layer 566*b* of the adhesion/seed layer 566. The photoresist layer 567 is patterned with the processes of exposure, development, etc., to form multiple openings 567*a* in the photoresist layer 567 exposing the electroplating seed layer 566*b* of the adhesion/seed layer 566. A 1× stepper, 1× contact aligner or laser scanner may be used to expose the photoresist layer 567 with at least two of G-line having a wavelength ranging from 434 to 438 nm, H-line having a wavelength ranging from 403 to 407 nm, and I-line having a wavelength ranging from 363 to 367 nm, illuminating the photoresist layer 567, that is, G-line and H-line, G-line and I-line, H-line and I-line, or G-line, H-line and I-line illuminate the photoresist layer 567, then developing the exposed photoresist layer 567, and then removing the residual polymeric material or other contaminants on the electroplating seed layer 566*b* of the adhesion/seed layer 566 with an $O_2$ plasma or a plasma containing fluorine of below 200 PPM and oxygen, such that the photoresist layer 567 may be patterned with multiple openings 567*a* in the photoresist layer 567 exposing the electroplating seed layer 566*b* of the adhesion/seed layer 566 over the through silicon vias (TSV) 157.

Referring to FIG. 22S, one of the openings 567*a* in the photoresist layer 567 may overlap one of the openings 585*a* in the polymer layer 585 for forming one of metal pads or bumps by following processes to be performed later, exposing the electroplating seed layer 566*b* of the adhesion/seed layer 566 at the bottom of said one of the openings 567*a*, and may extend out of said one of the openings 585*a* to an area or ring of the polymer layer 585 around said one of the openings 585*a*.

Figure 22T:
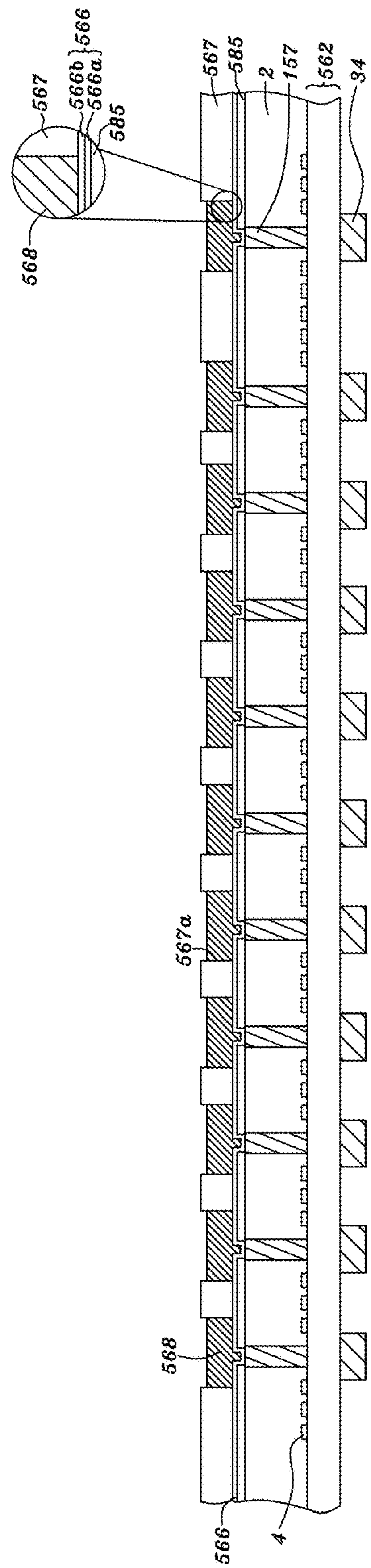

Referring to FIG. 22T, a metal layer 568 is electroplated on the electroplating seed layer 566*b* of the adhesion/seed layer 566 exposed by the openings 567*a*. For forming multiple metal pads 571, the metal layer 568 may be formed by electroplating a barrier layer, such as nickel layer or copper layer, with a thickness, for example, between 1 μm and 50 μm, 1 μm and 40 μm, 1 μm and 30 μm, 1 μm and 20 μm, 1 μm and 10 μm, 1 μm and 5 μm or 1 μm and 3 μm on the electroplating seed layer 566*b*, made of copper, exposed by the openings 567*a*.

Figure 22U:
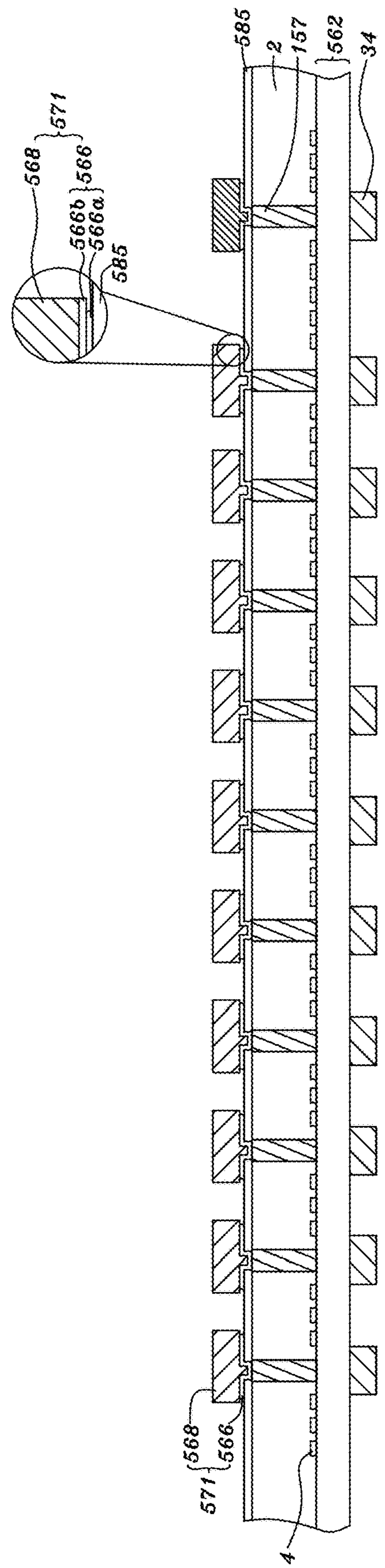

Referring to FIG. 22U, after the metal layer 568 is formed, most of the photoresist layer 567 may be removed and then the adhesion/seed layer 566 not under the metal layer 568 may be etched. The removing and etching processes may be referred respectively to the processes for removing the photoresist layer 30 and etching the electroplating seed layer 28 and adhesion layer 26 as illustrated in FIG. 21F. Thereby, the adhesion/seed layer 566 and electroplated metal layer 568 may be patterned to form multiple metal pads 571 on the through silicon vias (TSV) 157 and on the polymer layer 585. Each of the metal pads 571 may be composed of the adhesion/seed layer 566 and the electroplated metal layer 568 on the electroplating seed layer 566*b* of the adhesion/seed layer 566.

Figure 22V:
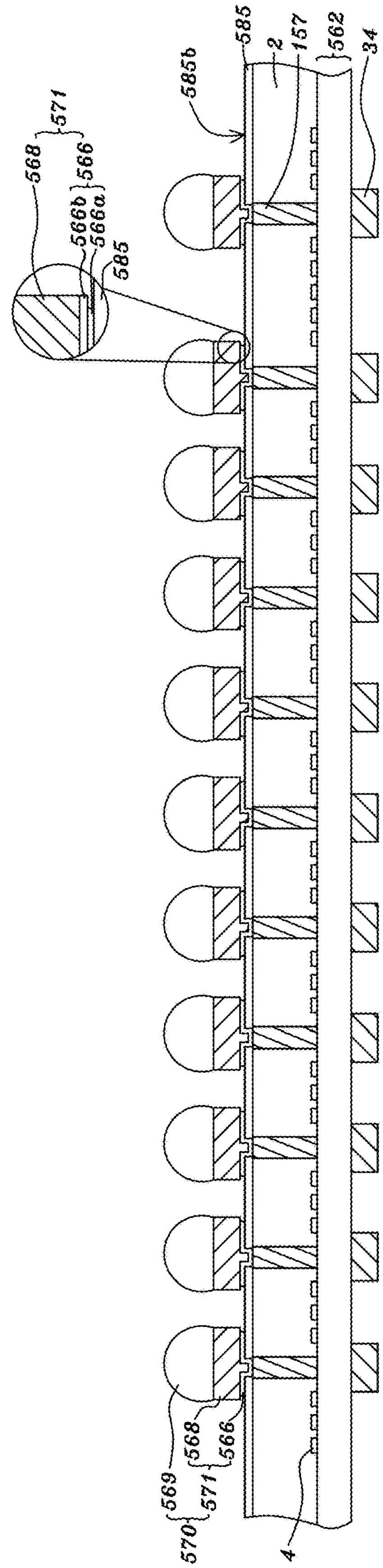

Next, referring to FIG. 22V, multiple solder bumps 569 may be formed on the metal pads 571 by a screen printing method or a solder-ball mounting method, and then by a solder reflow process. The solder bumps 569 may be a lead-free solder containing tin, copper, silver, bismuth, indium, zinc, antimony, and/or traces of other metals, for example, Sn—Ag—Cu (SAC) solder, Sn—Ag solder, or Sn—Ag—Cu—Zn solder. The solder bumps 569 and metal pads 571 may compose a fourth type of metal bumps 570.

Each of the metal bumps 570 of the fourth type may have a height, protruding from a backside surface of the semiconductor wafer or a backside surface 585*b* of the polymer layer 585 at the backside surface of the semiconductor wafer, between 5 μm and 150 μm, between 5 μm and 120 μm, between 10 μm and 100 μm, between 10 μm and 60 μm, between 10 μm and 40 μm or between 10 μm and 30 μm, or greater or taller than or equal to 75 μm, 50 μm, 30 μm, 20 μm, 15 μm or 10 μm, for example, and a largest dimension in cross-sections, such as a diameter of a circle shape or a diagonal length of a square or rectangle shape, between 5 μm and 200 μm, between 5 μm and 150 μm, between 5 μm and 120 μm, between 10 μm and 100 μm, between 10 μm and 60

μm, between 10 μm and 40 μm, or between 10 μm and 30 μm, or greater than or equal to 100 μm, 60 μm, 50 μm, 40 μm, 30 μm, 20 μm, 15 μm or 10 μm, for example. The smallest space from one of the solderbumps 569 to its nearest one of the solder bumps 569 is, for example, between 5 μm and 150 μm, between 5 μm and 120 μm, between 10 μm and 100 μm, between 10 μm and 60 μm, between 10 μm and 40 μm, or between 10 μm and 30 μm, or greater than or equal to 60 μm, 50 μm, 40 μm, 30 μm, 20 μm, 15 μm or 10 μm.

Alternatively, for the first type of metal pillars or bumps 570, the metal layer 568 as seen in FIG. 22T may be formed by electroplating a copper layer with a thickness of between 5 μm and 120 μm, 10 μm and 100 μm, 10 μm and 60 μm, 10 μm and 40 m, or 10 μm and 30 μm on the electroplating seed layer 566*b*, made of copper, exposed by the openings 567*a*.

Referring to FIG. 22U, after the metal layer 568 is formed, most of the photoresist layer 567 may be removed and then the adhesion/seed layer 566 not under the metal layer 568 may be etched. The removing and etching processes may be referred respectively to the processes for removing the photoresist layer 30 and etching the electroplating seed layer 26*b* and adhesion layer 26*a* as illustrated in FIG. 21F. Thereby, the adhesion/seed layer 566 and electroplated metal layer 568 may be patterned to form the first type of metal bumps 570 on the through silicon vias (TSV) 157 and on the polymer layer 585. Each of the metal pillars or bumps 570 of the first type may be composed of the adhesion/seed layer 566 and the electroplated metal layer 568 on the adhesion/seed layer 566.

The first type of metal pillars or bumps 570 may have a height, protruding from a backside surface of the semiconductor wafer or a backside surface 585*b* of the polymer layer 585 at the backside surface of the semiconductor wafer, between 5 μm and 120 μm, 10 μm and 100 μm, 10 μm and 60 μm, 10 μm and 40 μm or 10 μm and 30 μm, or greater or taller than or equal to 50 μm, 30 μm, 20 μm, 15 μm, or 5 μm, and a largest dimension in a cross-section (for example, the diameter of a circle shape or the diagonal length of a square or rectangle shape), for example, between 5 μm and 120 μm, 10 μm and 100 μm, 10 μm and 60 μm, 10 μm and 40 μm or 10 μm and 30 μm, or greater than or equal to 60 μm, 50 μm, 40 μm, 30 μm, 20 μm, 15 μm or 10 μm. The smallest space between neighboring two of the metal pillars or bumps 570 of the first type may be, for example, between 5 μm and 120 μm, 10 μm and 100 μm, 10 μm and 60 μm, 10 μm and 40 μm or 10 μm and 30 μm, or greater than or equal to 60 μm, 50 μm, 40 μm, 30 μm, 20 μm, 15 μm or 10 μm.

Alternatively, for a second type of metal pillars or bumps 570, the metal layer 568 as seen in FIG. 22T may be formed by electroplating a barrier layer, such as nickel layer or copper layer, with a thickness, for example, between 1 μm and 50 μm, 1 μm and 40 μm, 1 μm and 30 μm, 1 μm and 20 μm, 1 μm and 10 μm, 1 μm and 5 μm or 1 μm and 3 μm on the electroplating seed layer 566*b*, made of copper, exposed by the openings 657*a*, and then electroplating a solder layer with a thickness, for example, between 1 μm and 150 μm, 1 μm and 120 μm, 5 μm and 120 μm, 5 μm and 100 μm, 5 μm and 75 μm, 5 μm and 50 μm, 5 μm and 40 μm, 5 μm and 30 μm, 5 μm and 20 μm, 5 μm and 10 μm, 1 μm and 5 μm, or 1 μm and 3 μm on the barrier layer in the openings 657*a*. The solder layer may be a lead-free solder containing tin, copper, silver, bismuth, indium, zinc, antimony, and/or traces of other metals, for example, Sn—Ag—Cu (SAC) solder, Sn—Ag solder, or Sn—Ag—Cu—Zn solder. Furthermore, after most of the photoresist layer 567 is removed and the adhesion/seed layer 566 not under the metal layer 568 is etched as seen in FIG. 22U, a reflow process may be performed to reflow the solder layer into multiple solder balls or bumps in a circular shape for the second type of metal bumps 570. Thereby, each of the metal pillars or bumps 570 of the second type formed on one of the through silicon vias (TSV) 157 and on the polymer layer 585 may be composed of the adhesion/seed layer 566, the barrier layer on the adhesion/seed layer 566 and one of the solder balls or bumps on the barrier layer.

The second type of metal pillars or bumps 570 may have a height, protruding from a backside surface of the semiconductor wafer or a backside surface 585*b* of the polymer layer 585 at the backside surface of the semiconductor wafer, between 5 μm and 150 μm, 5 μm and 120 μm, 10 μm and 100 μm, 10 μm and 60 μm, 10 μm and 40 μm, or 10 μm and 30 μm, or greater or taller than or equal to 75 μm, 50 μm, 30 μm, 20 μm, 15 μm, or 10 μm and a largest dimension in a cross-section (for example, the diameter of a circle shape or the diagonal length of a square or rectangle shape), for example, between 5 μm and 200 μm, 5 μm and 150 μm, 5 μm and 120 μm, 10 μm and 100 μm, 10 μm and 60 μm, 10 μm and 40 μm, or 10 μm and 30 μm, or greater than or equal to 100 μm, 60 μm, 50 μm, 40 μm, 30 μm, 20 μm, 15 μm, or 10 μm. The smallest space between neighboring two of the metal pillars or bumps 570 of the second type may be, for example, between 5 μm and 150 μm, 5 μm and 120 μm, 10 μm and 100 μm, 10 μm and 60 μm, 10 μm and 40 μm, or 10 μm and 30 μm, or greater than or equal to 60 μm, 50 μm, 40 μm, 30 μm, 20 μm, 15 μm or 10 μm.

Alternatively, for a third type of metal pillars or bumps 570, the electroplating seed layer 566*b* as illustrated in FIG. 22R may be formed by sputtering or CVD depositing a gold seed layer (with a thickness, for example, between 1 nm and 300 nm, or 1 nm to 100 nm) on the adhesion layer 566*a*. The adhesion layer 566*a* and electroplating seed layer 566*b* compose the adhesion/seed layer 566 as seen in FIG. 22R. The metal layer 568, as seen in FIG. 22T, may be formed by electroplating a gold layer with a thickness, for example, between 3 μm and 40 μm, 3 μm and 30 μm, 3 μm and 20 μm, 3 μm and 15 m, or 3 μm and 10 μm on the electroplating seed layer 566*b*, made of gold, exposed by the openings 567*a*. Next, most of the photoresist layer 567 may be removed and then the adhesion/seed layer 566 not under the metal layer 568 may be etched to form the third type of metal bumps on the through silicon vias (TSV) 157 and on the polymer layer 585. Each of the metal pillars or bumps 570 of the third type may be composed of the adhesion/seed layer 566 and the electroplated gold layer 568 on the adhesion/seed layer 566.

The third type of metal pillars or bumps 570 may have a height, protruding from a backside surface of the semiconductor wafer or a backside surface 585*b* of the polymer layer 585 at the backside surface of the semiconductor wafer, between 3 μm and 40 μm, 3 μm and 30 μm, 3 μm and 20 μm, 3 μm and 15 μm, or 3 μm and 10 μm, or smaller or shorter than or equal to 40 μm, 30 μm, 20 μm, 15 μm, or 10 μm and a largest dimension in a cross-section (for example, the diameter of a circle shape or the diagonal length of a square or rectangle shape), for example, between 3 μm and 40 μm, 3 μm and 30 μm, 3 μm and 20 μm, 3 μm and 15 μm, or 3 μm and 10 μm, or smaller than or equal to 40 μm, 30 μm, 20 μm, 15 μm, or 10 μm. The smallest space between neighboring two of the metal pillars or bumps 570 of the third type may be, for example, between 3 μm and 40 μm, 3 μm and 30 μm, 3 μm and 20 μm, 3 μm and 15 μm, or 3 μm and 10 μm, or smaller than or equal to 40 μm, 30 μm, 20 μm, 15 μm, or 10 μm.

Figure 22W:
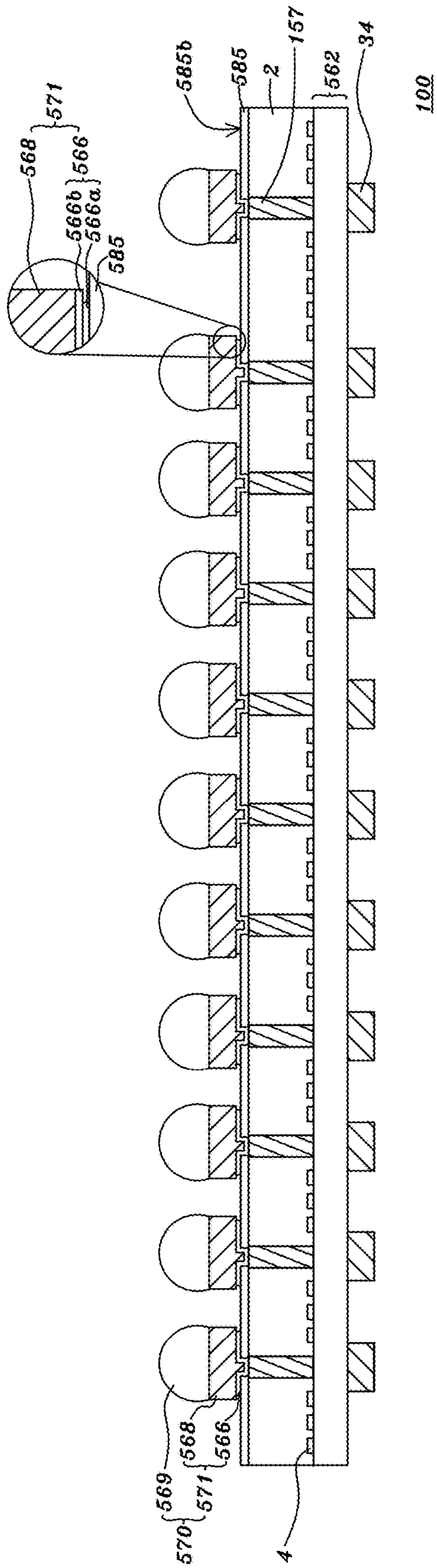

Next, the semiconductor wafer shown in FIG. 22V may be separated, cut or diced into multiple individual semiconductor chips 100 as shown in FIG. 22W by a laser cutting process or by a mechanical cutting process.

Figure 22X:
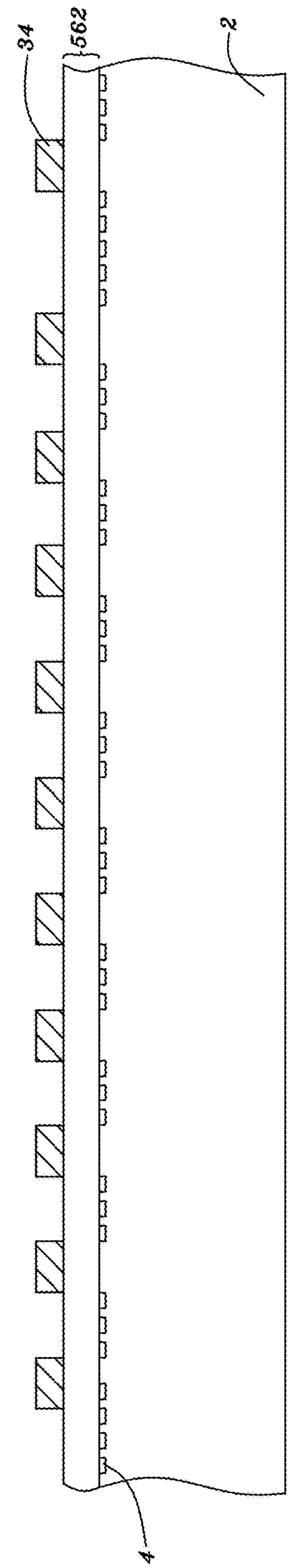
Figure 22Y:
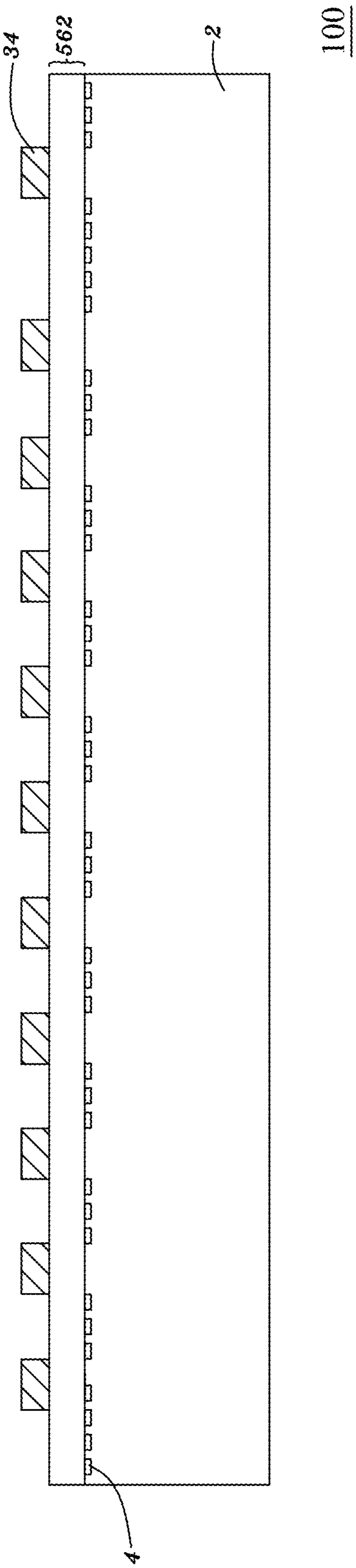

Alternatively, if none of the through silicon vias (TSV) 157 is formed in the silicon substrate 2, the steps as illustrated in FIGS. 22P-22V may be omitted as seen in FIG. 22X for a semiconductor wafer without any of the through silicon vias (TSV) 157. Next, the semiconductor wafer shown in FIG. 22X may be separated, cut or diced into multiple individual semiconductor chips 100 in a single-die type as shown in FIG. 22Y by a laser cutting process or by a mechanical cutting process.

Embodiment for HBM Stacked Chip Scale Package (IBM SCSP)

FIG. 23 is a schematically cross-sectional view showing a memory module in accordance with the present application. Referring to FIG. 23, each of the NVM module or stacked chip scale package, VM module or stacked chip scale package and HBM module or stacked chip scale package, i.e., memory module 159 or stacked chip scale package, may have the following structure including (1) multiple memory chips 687, such as NVM IC chips for the NVM module, VM IC chips for the VM module or HBM IC chips, e.g. DRAM IC chips, for the HBM module, vertically stacked together, wherein the number of the memory chips 687 in the memory module 159 may have the number equal to or greater than 2, 4, 8, 16, 32, (2) a control chip 688, i.e., ASIC or logic chip, under the memory chips 687, (3) multiple bonded contacts 563 between neighboring two of the memory chips 687 and between the bottommost one of the memory chips 687 and the control chip 688, and (4) multiple micro-pillars or micro-bumps 34 on a bottom surface of the control chip 688.

Referring to FIG. 23, each of the memory chips 687 may include multiple through silicon vias (TSV) 157, made of copper, therein each aligned with and connected to one or more of the bonded contacts 563 on a bottom surface of said each of the memory chips 687. The specification of the through silicon vias (TSV) 157 in said each of the memory chips 687 and the process for forming the same may be referred to those as illustrated in FIGS. 19A-19I.

For a first case, referring to FIG. 23, an upper one of the memory chips 687 may have the micro-pillars or micro-bumps 34 of the first type to be bonded to the first type of metal bumps or pillars 570 of a lower one of the memory chips 687. For example, the first type of micro-pillars or micro-bumps 34 of the upper one of the memory chips 687 may have the solder bumps 33 to be bonded onto the electroplated copper layer of the metal bumps or pillars 570 of the first type of the lower one of the memory chips 687 into multiple bonded contacts 158 between the upper and lower ones of the memory chips 687. Each of the micro-pillars or micro-bumps 34 of the first type of the upper one of the memory chips 687 may have its metal layer 32 formed with the electroplated copper layer having a thickness greater than that of the electroplated copper layer of the metal layer 568 of each of the metal bumps or pillars 570 of the first type of the lower one of the memory chips 687.

For a second case, an upper one of the memory chips 687 may have the micro-pillars or micro-bumps 34 of the second type to be bonded to the second type of metal bumps or pillars 570 of a lower one of the memory chips 687. For example, the second type of micro-pillars or micro-bumps 34 of the upper one of the memory chips 687 may have the electroplated metal layer 32, e.g. copper layer, to be bonded onto the solder balls or bumps of the metal bumps or pillars 570 of the second type of the lower one of the memory chips 687 into multiple bonded contacts 158 between the upper and lower ones of the memory chips 687.

For a third case, referring to FIG. 23, an upper one of the memory chips 687 may have the micro-pillars or micro-bumps 34 of the second type to be bonded to the fourth type of metal bumps or pillars 570 of a lower one of the memory chips 687. For example, the second type of micro-pillars or micro-bumps 34 of the upper one of the memory chips 687 may have the electroplated metal layer 32, e.g. copper layer, to be bonded onto the solder bumps 569 of the metal bumps or pillars 570 of the fourth type of the lower one of the memory chips 687 into multiple bonded contacts 158 between the upper and lower ones of the memory chips 687. Each of the micro-pillars or micro-bumps 34 of the second type of the upper one of the memory chips 687 may have its metal layer 32 formed with the electroplated copper layer having a thickness greater than that of the electroplated copper layer of the metal layer 568 of each of the metal bumps or pillars 570 of the fourth type of the lower one of the memory chips 687.

For a fourth case, referring to FIG. 23, an upper one of the memory chips 687 may have the micro-pillars or micro-bumps 34 of the first type to be bonded to the second type of metal bumps or pillars 570 of a lower one of the memory chips 687. For example, the first type of micro-pillars or micro-bumps 34 of the upper one of the memory chips 687 may have the solder bumps 33 to be bonded onto the solder balls or bumps of the metal bumps or pillars 570 of the second type of the lower one of the memory chips 687 into multiple bonded contacts 158 between the upper and lower ones of the memory chips 687.

For a fifth case, referring to FIG. 23, an upper one of the memory chips 687 may have the micro-pillars or micro-bumps 34 of the first type to be bonded to the fourth type of metal bumps or pillars 570 of a lower one of the memory chips 687. For example, the first type of micro-pillars or micro-bumps 34 of the upper one of the memory chips 687 may have the solder bumps 33 to be bonded onto the solder bumps 569 of the metal bumps or pillars 570 of the fourth type of the lower one of the memory chips 687 into multiple bonded contacts 158 between the upper and lower ones of the memory chips 687. Each of the micro-pillars or micro-bumps 34 of the first type of the upper one of the memory chips 687 may have its metal layer 32 formed with the electroplated copper layer having a thickness greater than that of the electroplated copper layer of the metal layer 568 of each of the metal bumps or pillars 570 of the fourth type of the lower one of the memory chips 687.

For the first through fifth cases, the specification of the micro-pillars or micro-bumps 34 of the memory chips 687 may be referred to that as illustrated in FIGS. 21G-21J, 221 and 22M.

Referring to FIG. 23, the bottommost one of the memory chips 687 may provide the micro-pillars or micro-bumps 34 on its bottom surface to be bonded to the metal bumps or pillars 570 on a top surface of the control chip 688 into multiple bonded contacts 158 between the control chip 688 and the bottommost one of the memory chips 687. The specification of the bonded contacts 158 between the control chip 688 and the bottommost one of the memory chips 687 and the process for forming the same may be referred to the specification of those between the upper and lower ones of the memory chips 687 as above illustrated in FIG. 23 and the above-mentioned process for forming the same.

Referring to FIG. 23, the through silicon vias 157 in the memory chips 687, which are aligned in a vertical direction, may couple to each other or one another through the bonded contacts 158 therebetween aligned in the vertical direction and with the through silicon vias 157 therein in the vertical direction. Each of the memory chips 687 may include multiple interconnects 696 each provided by the interconnection metal layers 6 of FISC 20 and/or the interconnection metal layers 27 of SISC 29 to connect one or more of its through silicon vias 157 to one or more of the bonded contacts 158 at its bottom surface. An underfill 694, e.g., a polymer, may be provided between each neighboring two of the memory chips 687 and between the bottommost one of the memory chips 687 and the control chip 688. A molding compound 695, e.g. a polymer, may be formed around the memory chips 687 and over the control chip 688, wherein the topmost one of the memory chips 687 may have a top surface coplanar with a top surface of the molding compound 695.

Each of the memory chips 687 may be a HBM IC chip, i.e., DRAM IC chip, having memory density of 512 Mb, 1 Gb, 4 Gb, 8 Gb, 16 Gb, 32 Gb, 64 Gb, or equal to or greater than 256 Mb, 1 Gb, 8 Gb, 16 Gb, wherein "b" is a bit. Each of the memory chips 687 may have data bit-width of equal or greater than 64, 128, 256, 512, 1024, 2048, 4096, 8K, or 16K. Each of the memory chips 687 may be provided with the small I/O circuits 203 as seen in FIG. 5B having the driving capability, loading, output capacitance or input capacitance between 0.05 pF and 2 pF, or 0.05 pF and 1 pF, or smaller than 2 pF or 1 pF.

Referring to FIG. 23, the control chip 688 may be configured to control data access for the memory chips 687. The control chip 688 may be used for buffering data to be passed to the memory chips 687 and controlling the memory chips 687. The control chip 688 may include multiple through silicon vias (TSV) 157, made of copper, therein each aligned with and connected to one or more of its micro-pillars or micro-bumps 34 on its bottom surface. The specification of the through silicon vias (TSV) 157 in the control chip 688 and the process for forming the same may be referred to those as illustrated in FIGS. 19A-19I. The control chip 688 may include multiple interconnects 697 each provided by the interconnection metal layers 6 of FISC 20 and/or the interconnection metal layers 27 of SISC 29 to connect one or more of its through silicon vias 157 to one or more of its micro-pillars or micro-bumps 34 at its bottom surface. The specification of the micro-pillars or micro-bumps 34 of the control chip 688 may be referred to that as illustrated in FIGS. 21G-21J, 22I and 22M.

Embodiment for Standard Commodity FPGA/HBM CSPs

Figure 24A:
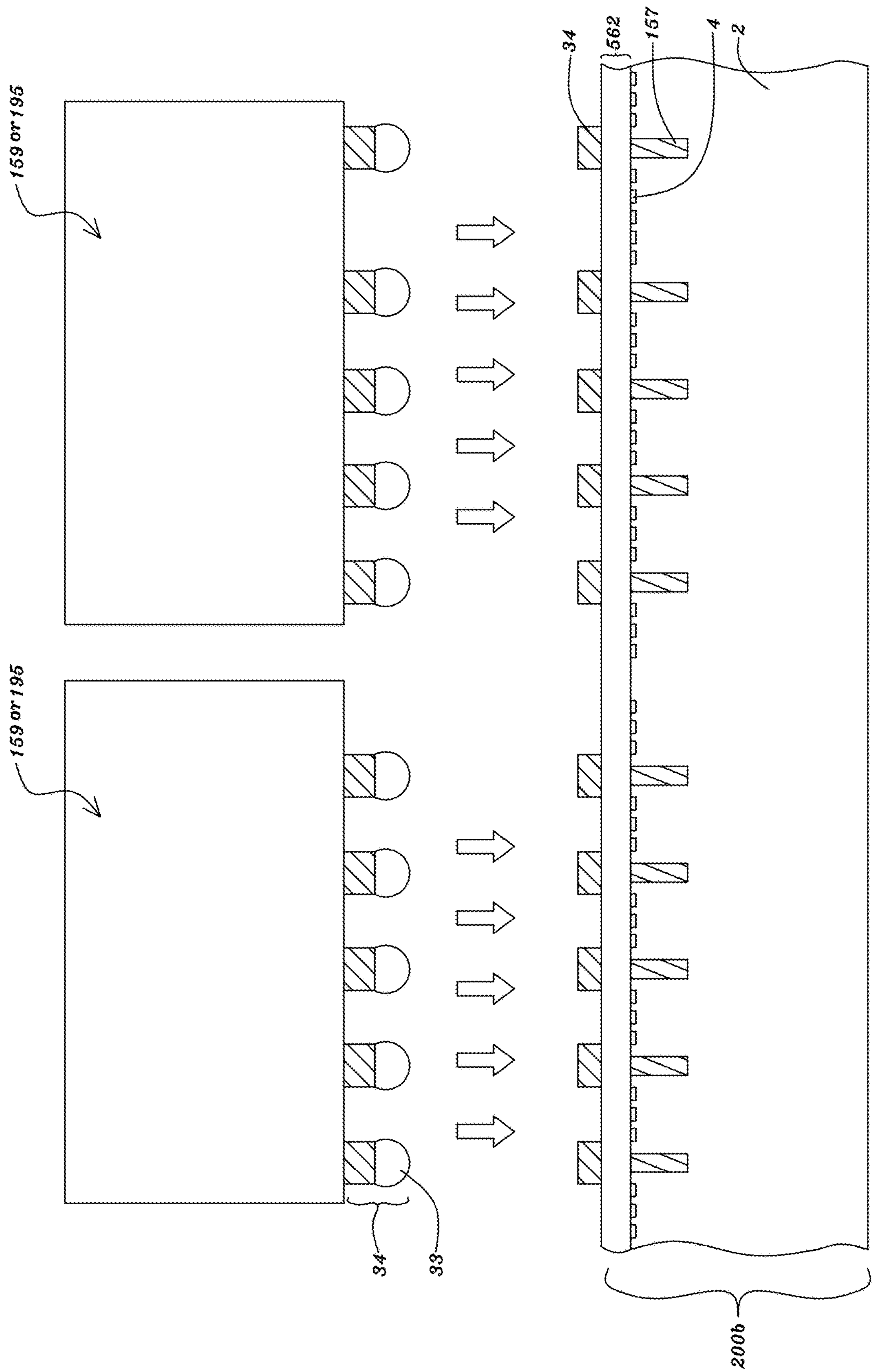
FIGS. 24A-24G are schematic views showing a processes for forming a FPGA/HBM chip scale package (CSP) in accordance with an embodiment of the present application.
Figure 24B:
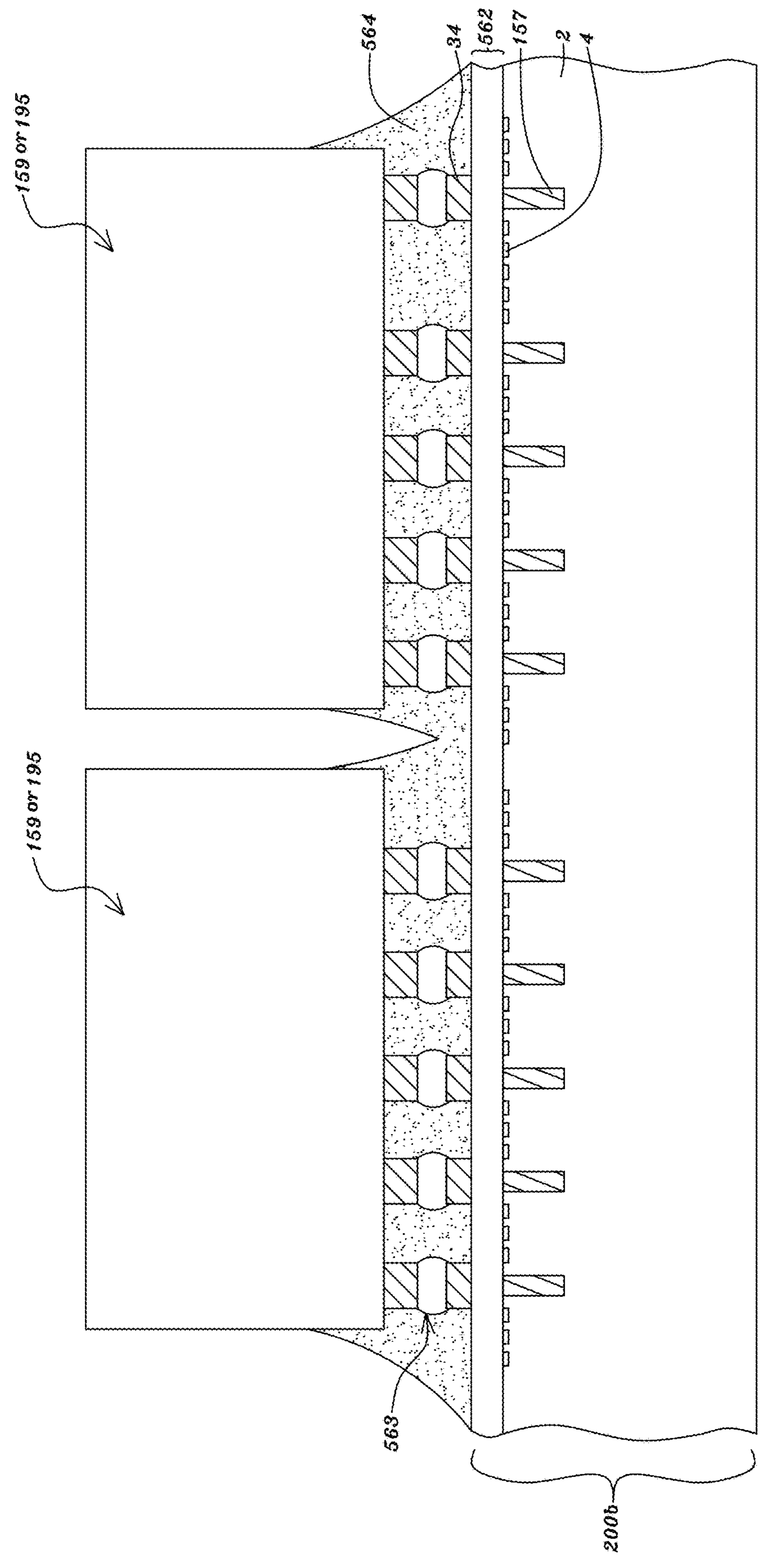
Figure 24C:
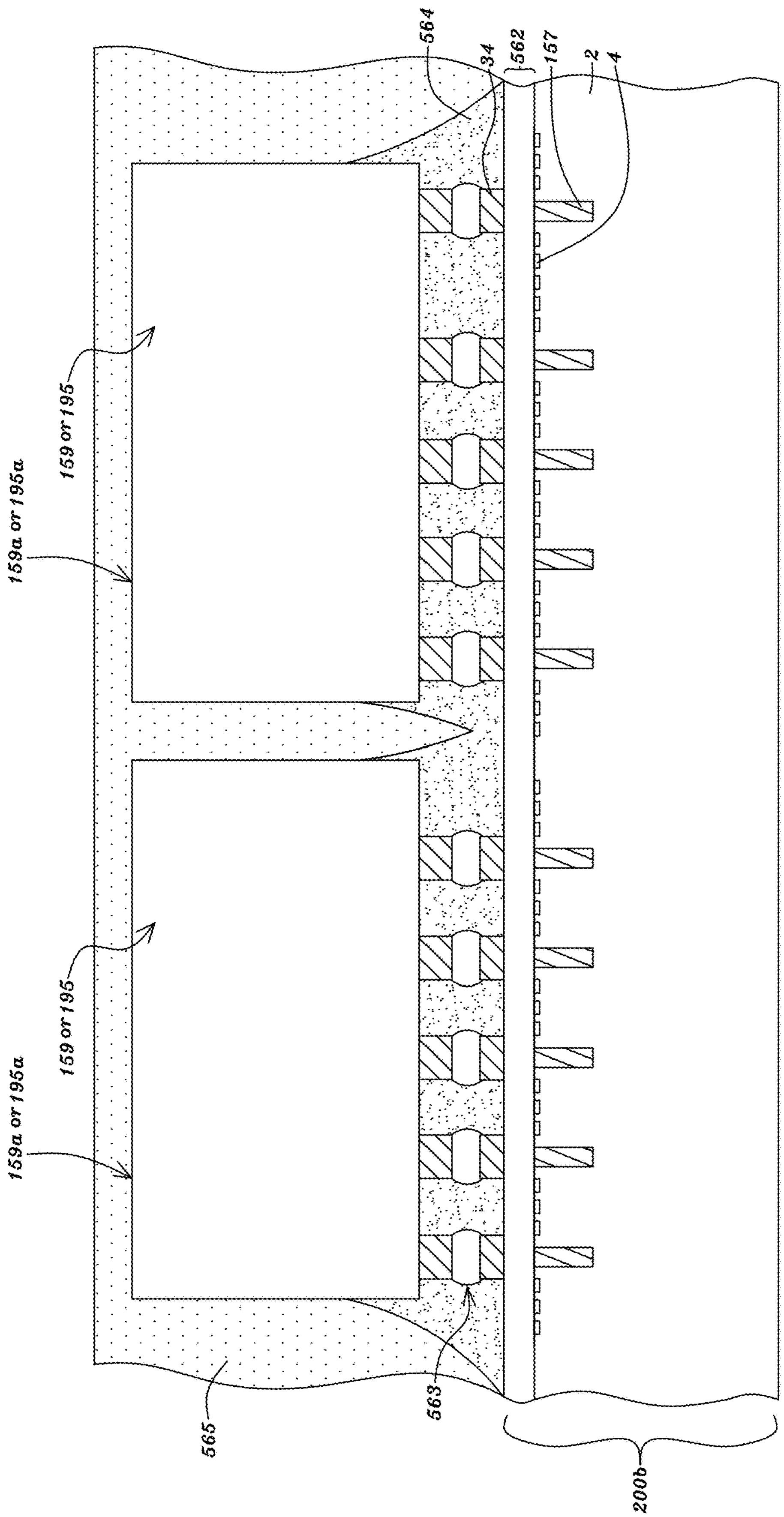
Figure 24D:
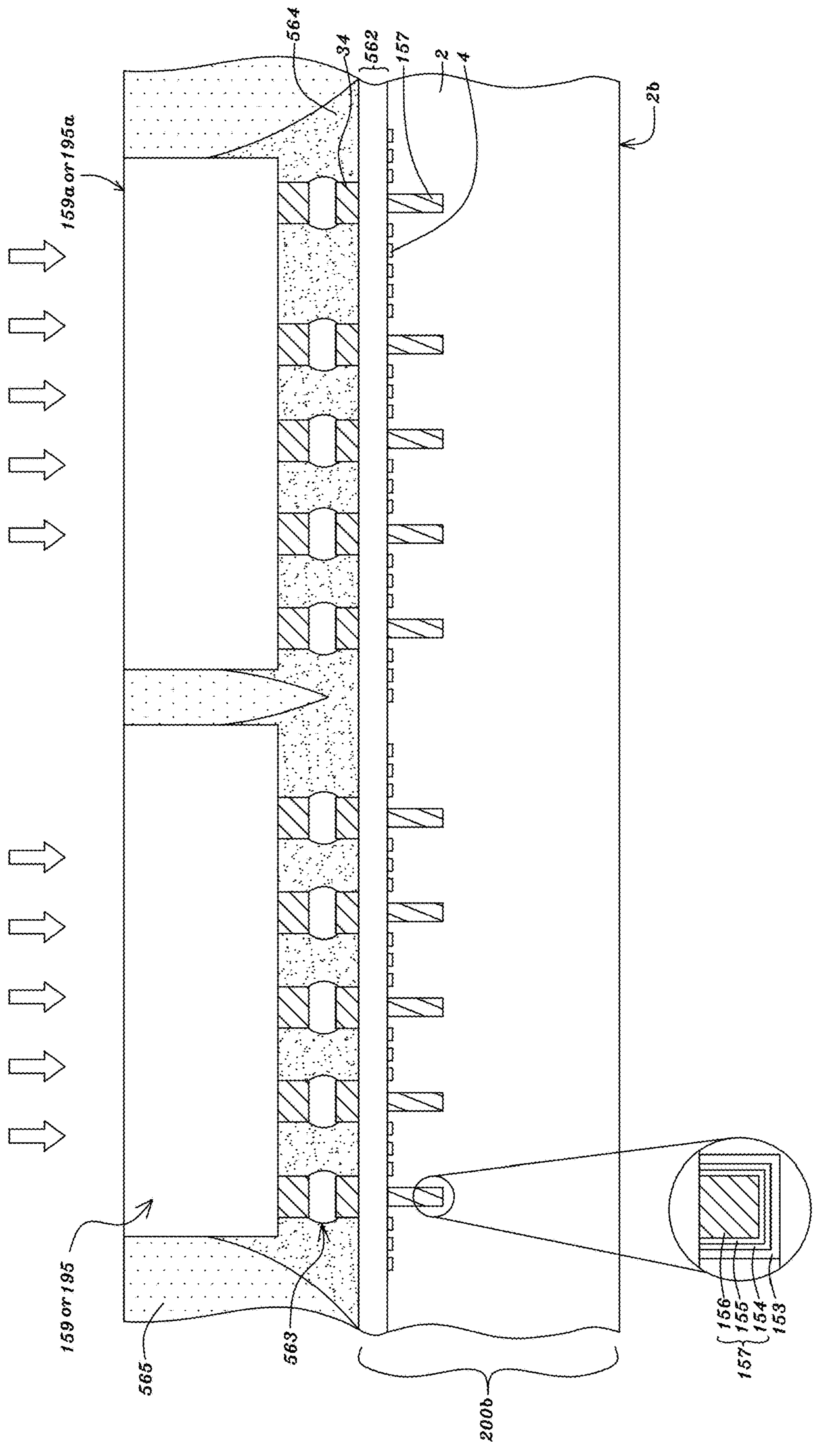
Figure 24E:
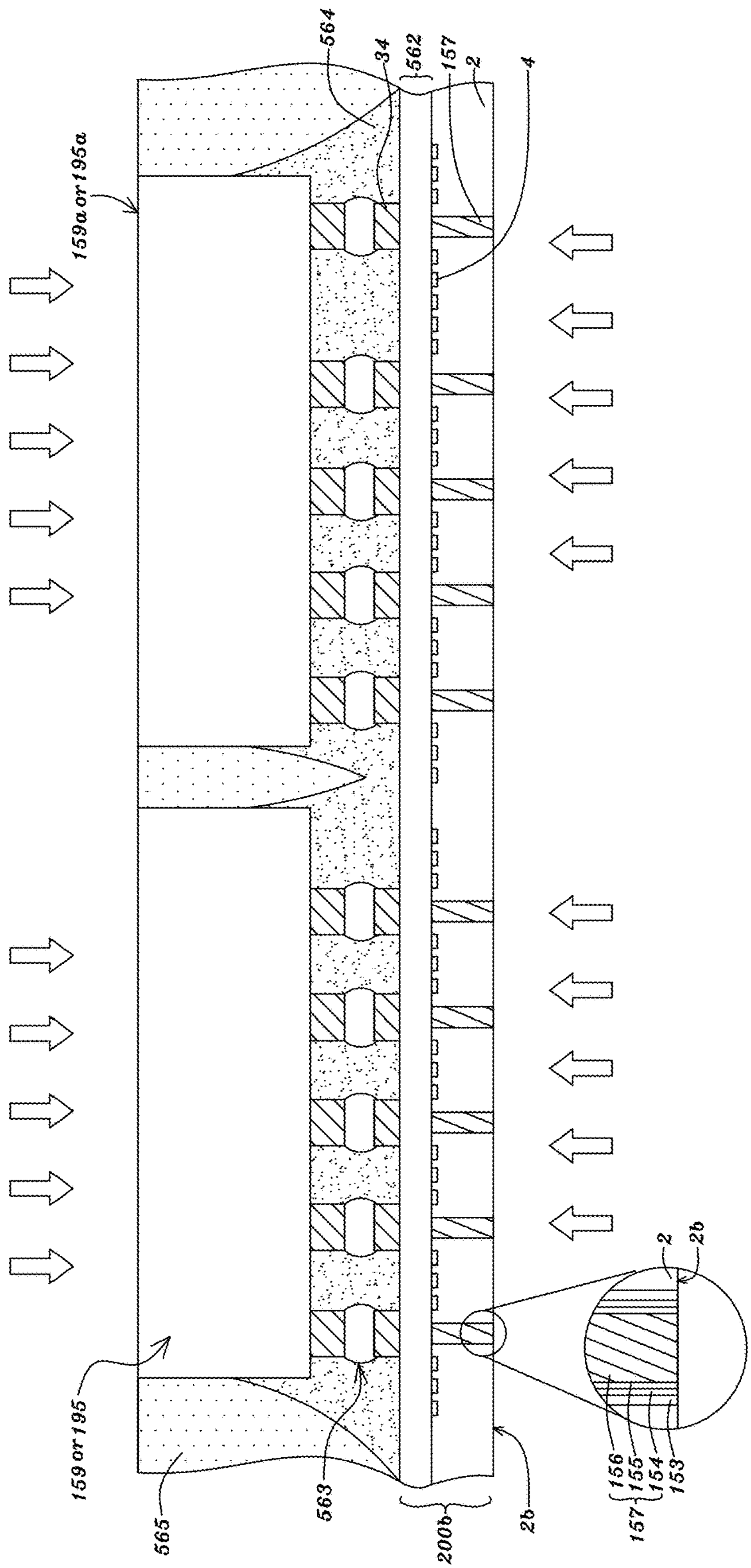
Figure 24F:
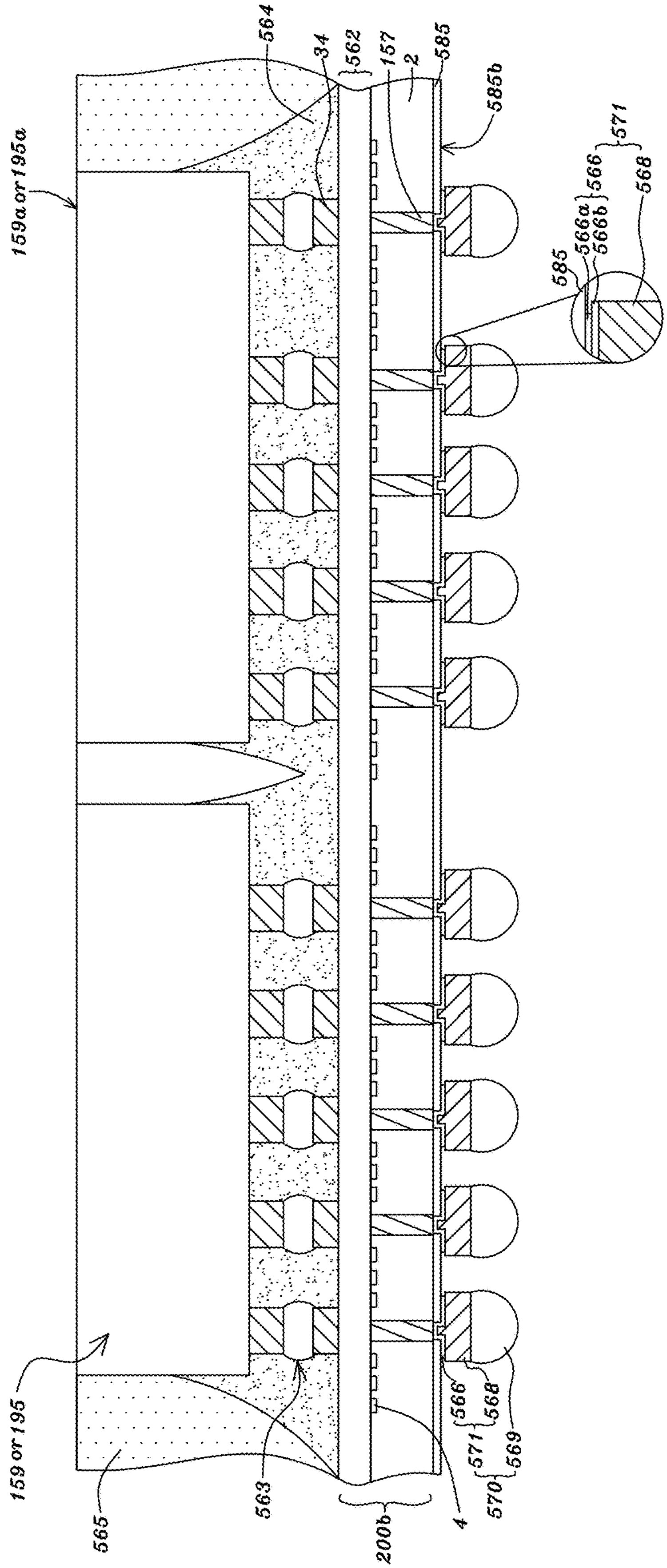
Figure 24G:
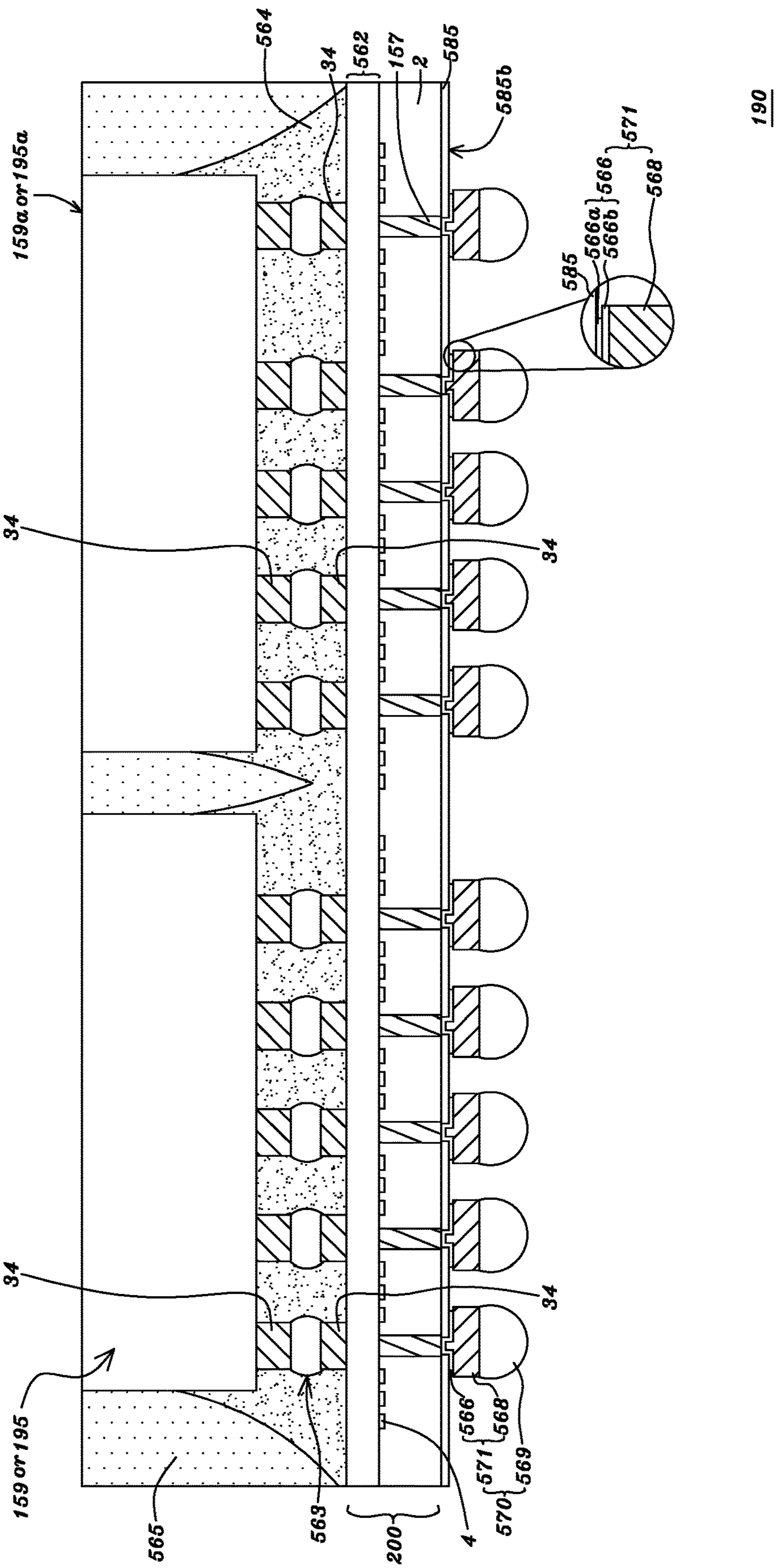

FIGS. 24A-24G are schematic views showing a process for forming a FPGA/HBM chip scale package (CSP) in accordance with an embodiment of the present application. Referring to FIGS. 24A and 24B, after the memory module 159 is formed as illustrated in FIG. 24A, each of the memory modules 159 may have its micro-pillars or micro-bumps 34 of the first or second type to be bonded to the first or second type of micro-pillars or micro-bumps 34 of the semiconductor wafer as seen in FIG. 22O, wherein the semiconductor wafer may be the one 200*b* subsequently processed for the standard commodity FPGA IC chips 200. Alternatively, a memory chip 195, which may be a NVM IC chip, VM IC chip or HBM IC chip, e.g., DRAM IC chip, may be fabricated as the semiconductor chip 100 seen in FIG. 22Y with its micro-pillars or micro-bumps 34 of the first or second type to be bonded to the first or second type of micro-pillars or micro-bumps 34 of the semiconductor wafer as seen in FIG. 22O, wherein the semiconductor wafer may be the one 200*b* subsequently processed for the standard commodity FPGA IC chips 200.

For a first case, referring to FIG. 24A, each of the memory modules 159 as seen in FIG. 23 or memory chips 195 may have its micro-pillars or micro-bumps 34 of the first type to be bonded to the second type of micro-pillars or micro-bumps 34 of the semiconductor wafer 200*b*. For example, the first type of micro-pillars or micro-bumps 34 of said each of the memory modules 159 or memory chips 195 may have its solder bumps 33 to be bonded onto the electroplated copper layer 32 of the micro-pillars or micro-bumps 34 of the second type of the semiconductor wafer 200*b* into multiple bonded contacts 563 as seen in FIG. 24B, wherein each of the micro-pillars or micro-bumps 34 of the first type of said each of the memory modules 159 or memory chips 195 may have its metal layer 32 formed with the electroplated copper layer having a thickness greater than that of the electroplated copper layer of the metal layer 32 of each of the micro-pillars or micro-bumps 34 of the second type of the semiconductor wafer 200*b*.

For a second case, referring to FIG. 24A, each of the memory modules 159 as seen in FIG. 23 or memory chips 195 may have its micro-pillars or micro-bumps 34 of the second type to be bonded to the first type of micro-pillars or micro-bumps 34 of the semiconductor wafer 200*b*. For example, the second type of micro-pillars or micro-bumps 34 of said each of the memory modules 159 or memory chips 195 may have its electroplated metal layer 32, e.g. copper layer, to be bonded onto the solder caps 33 of the micro-pillars or micro-bumps 34 of the first type of the semiconductor wafer 200*b* into multiple bonded contacts 563 as seen in FIG. 24B, wherein each of micro-pillars or micro-bumps 34 of the second type of said each of the memory modules 159 or memory chips 195 may have its metal layer 32 formed with the electroplated copper layer having a thickness greater than that of the electroplated copper layer of the metal layer 32 of each of the micro-pillars or micro-bumps 34 of the first type of the semiconductor wafer 200*b*.

For a third case, referring to FIG. 24A, each of the memory modules 159 as seen in FIG. 23 or memory chips 195 may have its micro-pillars or micro-bumps 34 of the first type to be bonded to the first type of micro-pillars or micro-bumps 34 of the semiconductor wafer 200*b*. For example, the first type of micro-pillars or micro-bumps 34 of said each of the memory modules 159 or memory chips 195 may have its solder bumps 33 to be bonded onto the solder caps 33 of the micro-pillars or micro-bumps 34 of the first type of the semiconductor wafer 200*b* into multiple bonded contacts 563 as seen in FIG. 24B, wherein each of micro-pillars or micro-bumps 34 of the first type of said each of the memory modules 159 or memory chips 195 may have its metal layer 32 formed with the electroplated copper layer having a thickness greater than that of the electroplated copper layer of the metal layer 32 of each of the micro-pillars or micro-bumps 34 of the first type of the semiconductor wafer 200*b*.

Next, referring to FIG. 24B, an underfill 564, such as epoxy resins or compounds, may be filled into a gap between each of the memory modules 159 or memory chips 195 and the semiconductor wafer 200*b* by a dispensing method performed using a dispenser. The underfill 564 may then be cured at temperature equal to or above 100° C., 120° C., or 150° C.

Next, referring to FIG. 24C, a polymer layer 565, e.g., resin or compound, may be applied to fill the gaps between the memory modules 159 or memory chips 195 and cover a backside 159*a* of each of the memory modules 159, wherein said each of the memory modules 159 has its backside 159*a* composed of the backside of the topmost one of its memory chips 687 and the top surface of its molding compound 695 as seen in FIG. 23, or a backside 195*a* of each of the memory chips 195 by methods, for example, spin-on coating, screen-printing, dispensing or molding in a wafer or panel format. For the molding method, a compress molding method (using top and bottom pieces of molds) or casting molding (using a dispenser) may be employed. The polymer layer 565 may be, for example, polyimide, BenzoCycloButene (BCB), parylene, epoxy-based material or compound, photo epoxy SU-8, elastomer, or silicone. For more elaboration, the polymer layer 565 may be, for example, photosensitive polyimide/PBO PIMEL™ supplied by Asahi Kasei Corporation, Japan, or epoxy-based molding compounds, resins or sealants provided by Nagase ChemteX Corporation, Japan. The polymer layer 565 may be then cured or cross-linked by raising a temperature to a certain temperature degree, for example, higher than or equal to 50° C., 70° C., 90° C., 100° C., 125° C., 150° C., 175° C., 200° C., 225° C., 250° C., 275° C. or 300° C.

Next, referring to FIG. 24D, a chemical mechanical polishing (CMP), polishing or grinding process may be applied to remove a top portion of the polymer layer 565 and the backside 159*a* or 195*a* of each of the memory modules 159 or memory chips 195 and to planarize a top surface of the polymer layer 565 and the backside 159*a* or 195*a* of said each of the memory modules 159 or memory chips 195 until the backside 159*a* of each of the memory modules 159 or the backside 195*a* of each of the memory chips 195 is fully exposed.

Next, referring to FIG. 24E, the semiconductor wafer 200*b* has a backside 2*b* to be polished by a CMP process or a wafer backside grinding process until each of the through silicon vias 157 is exposed, that is, its insulating lining layer 153 at its backside 2*b* is removed into an insulating lining surrounding its adhesion layer 154, electroplating seed layer 155 and electroplated copper layer 156, and a bottom side of its electroplated copper layer 156 is exposed. Each of the through silicon vias 157 in the silicon substrate 2 may have a height between 10 μm and 100 μm or between 20 μm and 60 μm and a diameter or largest transverse dimension between 2 μm and 60 μm or between 5 μm and 20 μm.

Next, referring to FIG. 24F, the polymer layer 585 and metal bumps 570 may be formed on the backside 2*b* of the semiconductor wafer 200*b*. The specification of the polymer layer 585 and metal bumps 570 and the process for forming the same may be referred to those as illustrated in FIGS. 22Q-22V.

Next, the semiconductor wafer 200*b* and polymer layer 565 shown in FIG. 24F may be separated, cut or diced into multiple individual operation modules 190, i.e. FPGA/HBM chip scale packages (CSPs), as shown in FIG. 24G by a laser cutting process or by a mechanical cutting process. The semiconductor wafer 200*b* may be cut into multiple standard commodity FPGA IC chips 200 each in one of the operation modules 190, wherein the memory modules 159 or memory chips 195 may be separated with one or more arranged in said one of the operation modules 190 and mounted onto said each of the standard commodity FPGA IC chips 200 via the bonded contacts 563 between said one or more of the memory modules 159 or memory chips 195 and said each of the standard commodity FPGA IC chips 200.

Embodiment for Fan-Out Interconnection Scheme of Logic Drive (FOISD)

One or more semiconductor chips 100 as seen in FIGS. 22W and/or 22Y, one or more memory modules 159 as seen in FIG. 23 and/or one or more operation modules 190 as seen in FIG. 24G may be packaged using a fan-out interconnection technology (FOIT). For achieving the fan-out interconnection technology (FOIT), the semiconductor chips 100, memory modules 159 and/or operation modules 190 may be mounted on a fan-out interconnection scheme of a logic drive (FOISD). The fan-out interconnection scheme may be provided with high density interconnects for fan-out of the semiconductor chips 100, memory modules 159 and/or operation modules 190 and interconnectionbetween two of the semiconductor chips 100, memory modules 159 and/or operation modules 190.

Figure 25A:
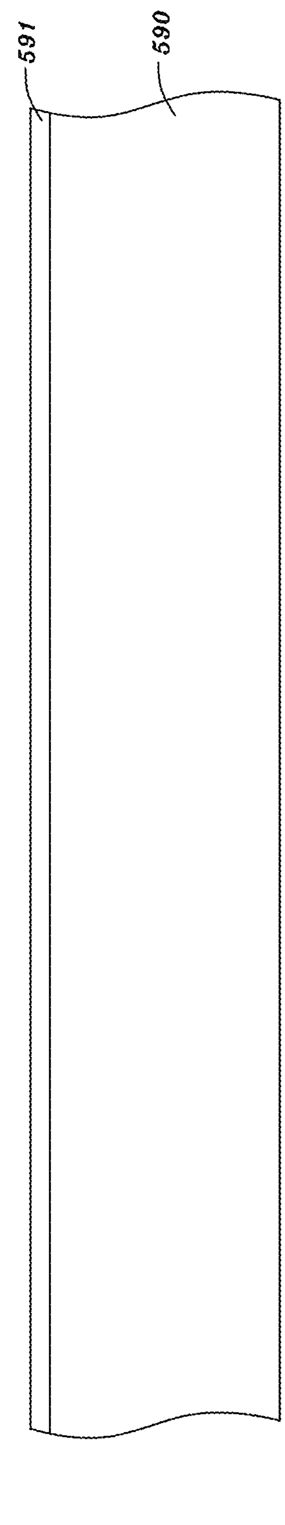
FIGS. 25A-25D are schematically cross-sectional views showing a process for forming a fan-out intersconnection scheme of a logic drive (FOISD) in accordance with an embodiment of the present application.

FIGS. 25A-25D are schematically cross-sectional views showing a process for forming a fan-out interconnection scheme of a logic drive (FOISD) in accordance with an embodiment of the present application. Referring to FIG. 25A, a temporary substrate (T-Sub) 590 may be provided in a wafer format (with 8", 12" or 18" in diameter) or in a panel format, e.g., square or rectangle shape with a width or length greater than or equal to 20 cm, 30 cm, 50 cm, 75 cm, 100 cm, 150 cm, 200 cm or 300 cm. The temporary substrate (T-sub) 590 may be a panel or wafer of silicon, metal, ceramics, glass, steel, plastics, polymer, epoxy-based polymer or epoxy-based compound, for example. Next, a sacrificial bonding layer 591 may be formed on the temporary substrate (T-sub) 590, e.g., glass wafer or panel, by screen printing, spin-on coating, laminating or attaching. The sacrificial bonding layer 591, i.e., substrate-release layer, may have the FOISD with a high density fan-out and interconnection structure and micro-pillars or micro-bumps formed thereon. Further, the sacrificial bonding layer 591 may have the temporary substrate (T-sub) 590 to be easily debonded or released from the FOISD. For example, the sacrificial bonding layer 591 may be a material of light-to-heat conversion (LTHC) in a liquid form that may be deposited on the temporary substrate (T-sub) 590, e.g., glass wafer or panel, by printing or spin-on coating and then cured or dried with a thickness of about 1 micrometer or between 0.5 and 2 micrometers. The LTHC material may be a liquid ink containing carbon black and binder in a mixture of solvents.

Figure 25B:
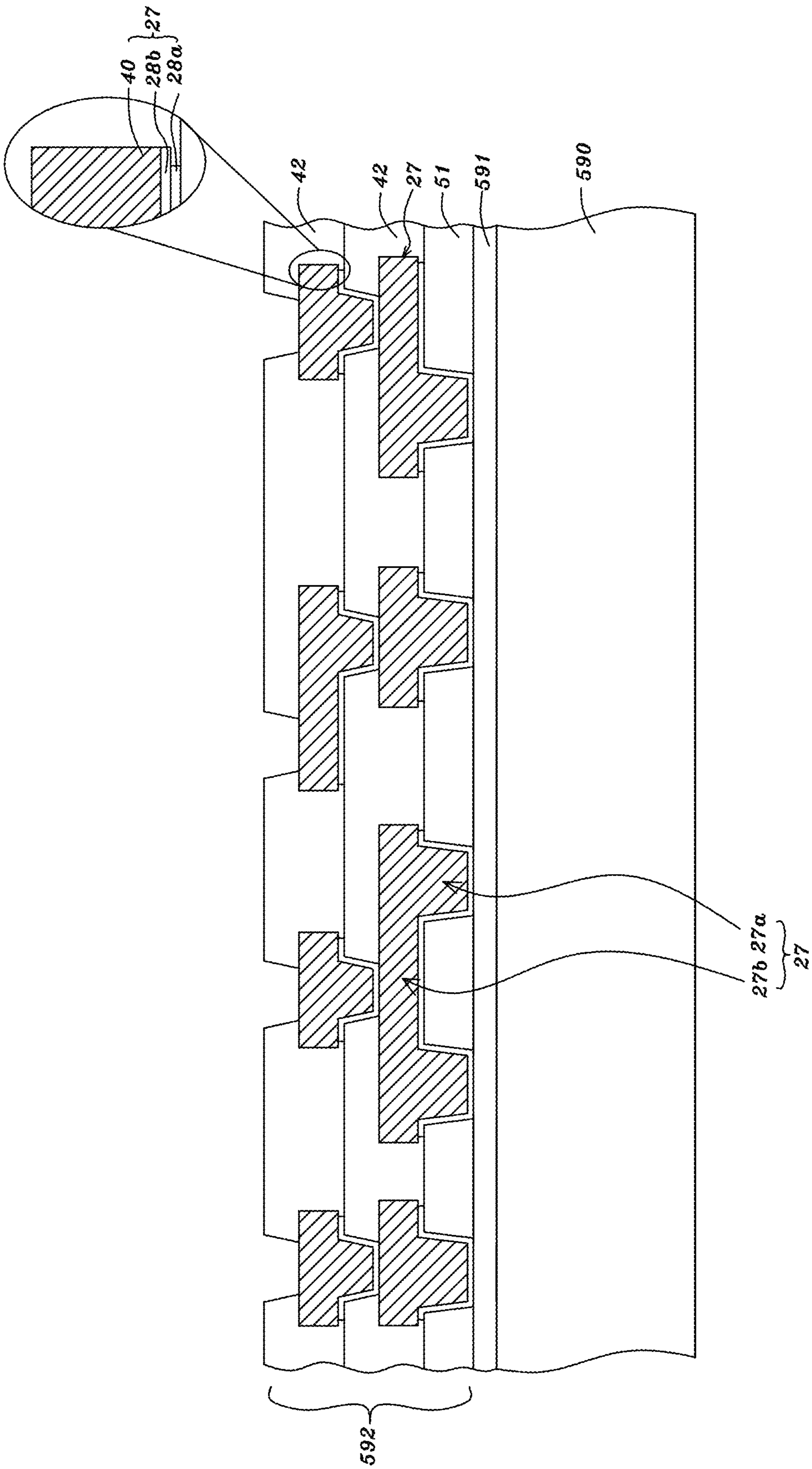

Referring to FIG. 25B, a fan-out interconnection scheme 592 of a logic drive (FOISD) may be formed on the sacrificial bonding layer 591. The specification for the FOISD 592 and the process for forming the same may be referred to the specification for the SISC 29 and the process for forming the same as illustrated in FIGS. 22A-22N. The FOISD 592 may include one or more interconnection metal layers 27 as illustrated in FIGS. 22A-22N and one or more dielectric or polymer layers 42 and/or 51 as illustrated in FIGS. 22A-22N. For example, the FOISD 592 may include the polymer layer 51 as illustrated in FIGS. 22K, 22L and 22N directly on the sacrificial bonding layer 591 and under the bottommost one of its one or more interconnection metal layers 27. The FOISD 592 may include one of the polymer layers 42 as illustrated in FIG. 22N between neighboring two of its interconnection metal layers 27. The FOISD 592 may include one of the polymer layers 42 as illustrated in FIGS. 22I-22N on the topmost one of its one or more interconnection metal layers 27. Each of the interconnection metal layers 27 of the FOISD 592 may include the adhesion layer 28*a*, the electroplating seed layer 28*b* on the adhesion layer 28*a* and the metal layer 40 on the electroplating seed layer 28*b* as illustrated in FIGS. 22A-22N. The interconnection metal layers 27 of the FOISD 592 may be used for the programmable and fixed interconnects 361 and 364 of the inter-chip interconnects 371 as seen in FIGS. 15A-15O. The FOISD 592 may include 1 to 7 layers, or 1 to 4 layers, of interconnection metal layers 27.

Micro-bumps at Front Side of FOISD

Figure 25C:
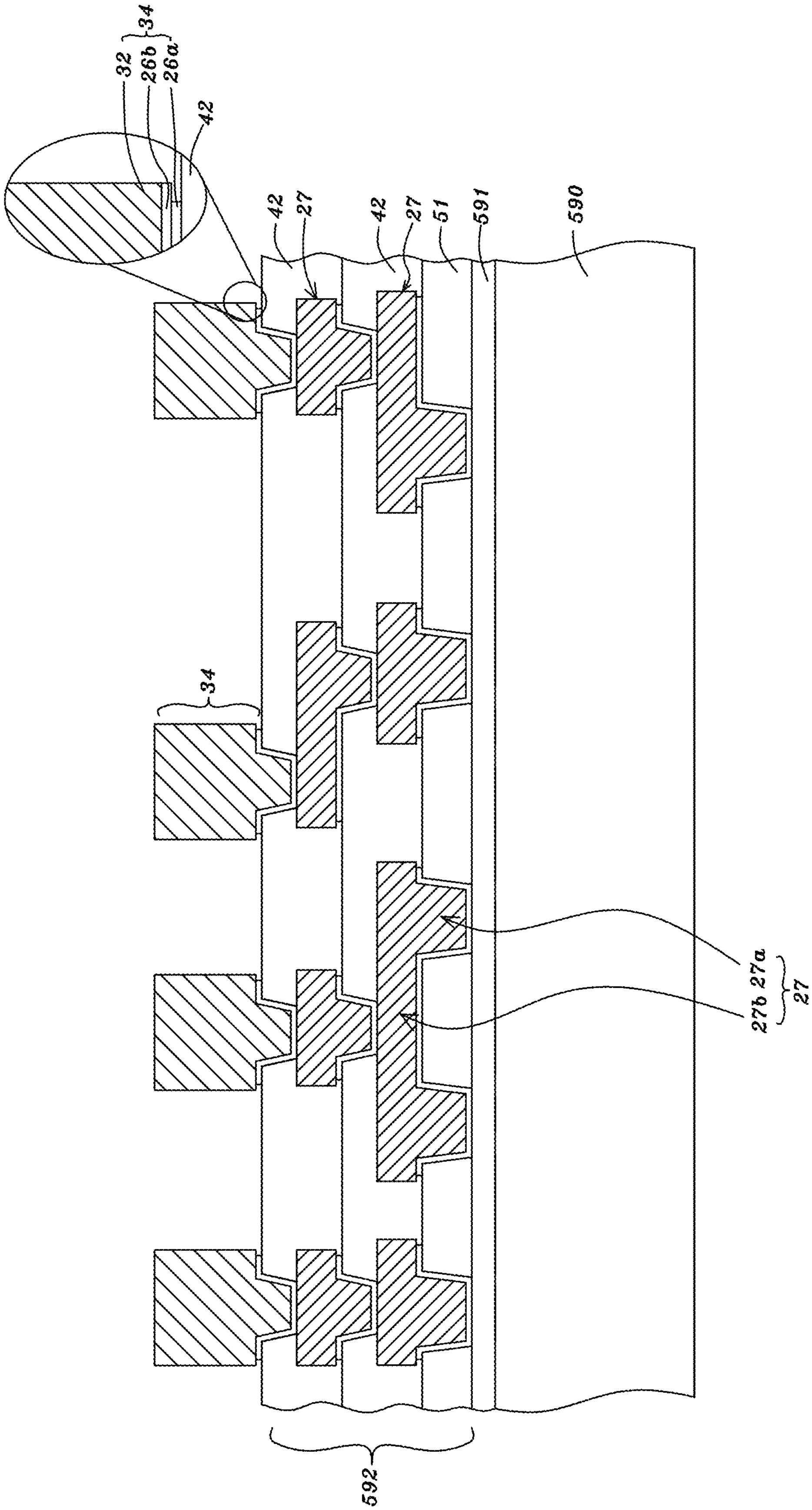
Figure 25D:
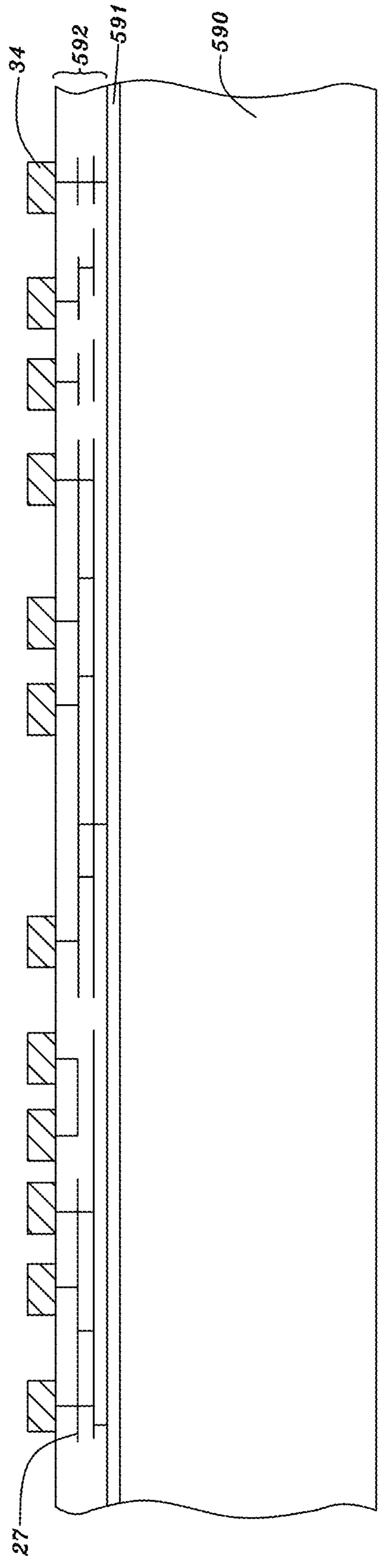

Next, referring to FIG. 25C, multiple micro-bumps or micro-pillars 34 of the first or second type as illustrated in FIGS. 21A-21J and 22E-22N may be formed on the topmost one of the interconnection metal layers 27 of the FOISD 592. The specification for the micro-bumps or micro-pillars 34 of the first or second type to be formed on the topmost one of the interconnection metal layers 27 of the FOISD 592 and the process for forming the same may be referred to those for the semiconductor chip 100 as illustrated in FIGS. 21A-21J and 22E-22N. With regard to this embodiment for the FOISD 592, each of its micro-bumps or micro-pillars 34 may be of the first type, including the adhesion layer 26*a* on the topmost one of the interconnection metal layers 27 of the FOISD 592, the electroplating seed layer 26*b* on the adhesion layer 26*a*, the metal layer 32 on the electroplating seed layer 26*b* and the solder cap or layer 33 on the metal layer 32, as illustrated in FIGS. 21G, 21H, 22I-22L and 22N. Alternatively, each of its micro-bumps or micro-pillars 34 may be of the second type, including the adhesion layer 26*a* on the topmost one of the interconnection metal layers 27 of the FOISD 592, the electroplating seed layer 26*b* on the adhesion layer 26*a*, and the metal layer 32 on the electroplating seed layer 26*b*, as illustrated in FIGS. 21I, 21J and 22M. In FIG. 25C, the second type of micro-bumps 34 are shown to be formed on the topmost one of the interconnection metal layers 27 of the FOISD 592. For explaining the subsequent processes, the FOISD 592 is simplified as seen in FIG. 25D.

Chip-to-FOISD Assembly

Figure 25E:
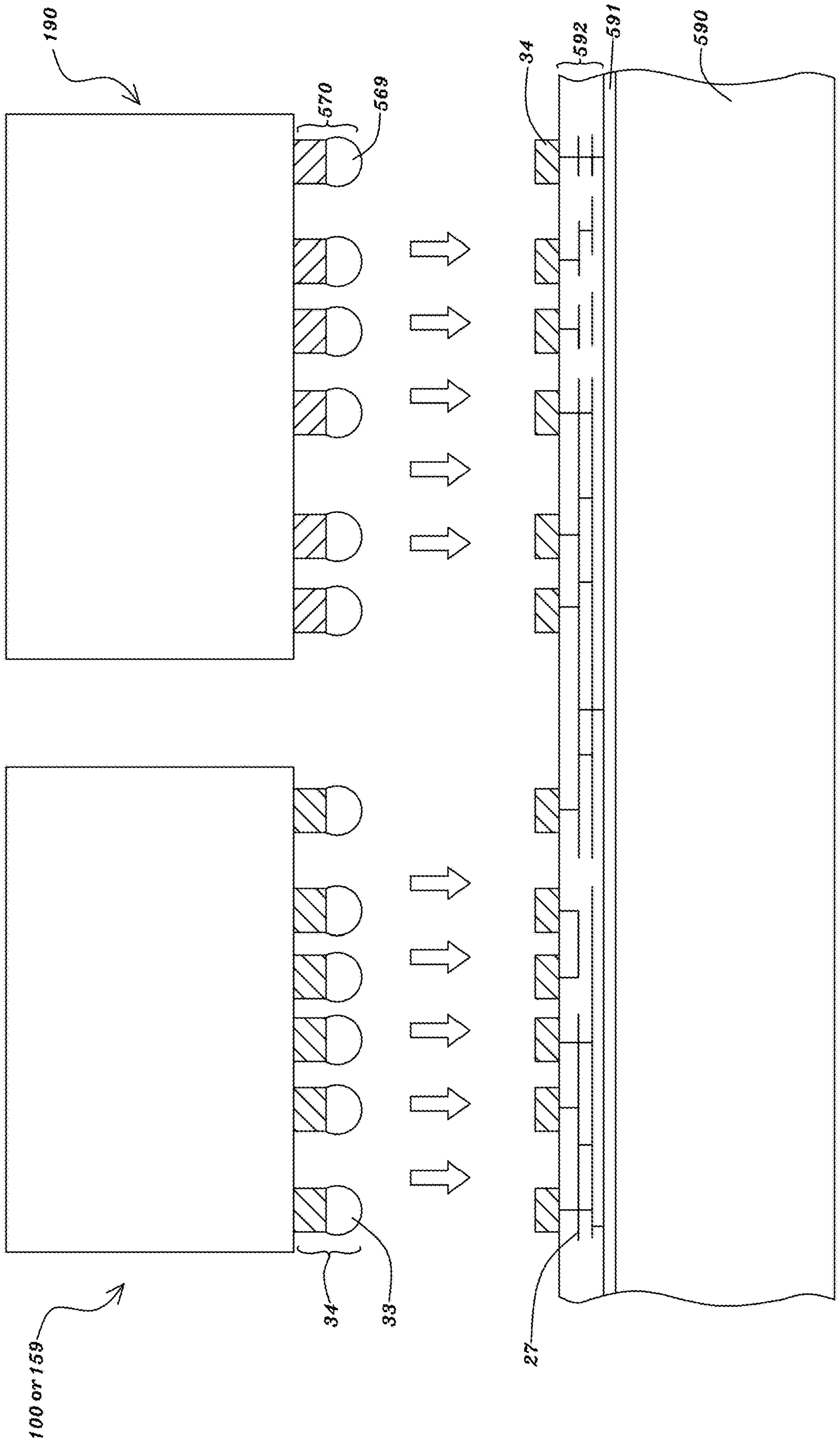
FIGS. 25E-25J are schematic views showing a process for assembling semiconductor chips, memory modules or operation modules on the FOISD in accordance with an embodiment of the present application.
Figure 25F:
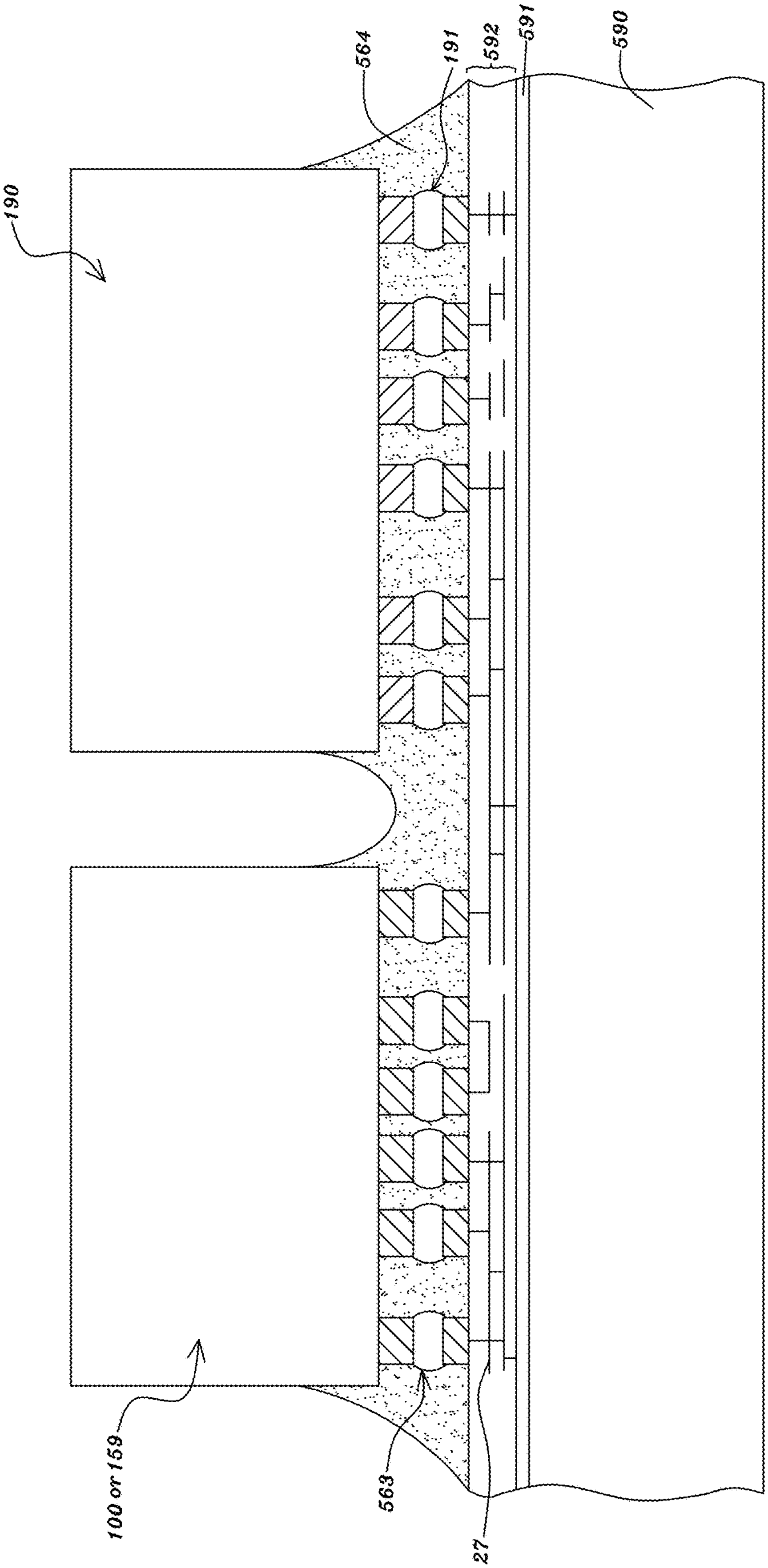

FIGS. 25E-25J are schematic views showing a process for assembling semiconductor chips, memory modules or operation modules on the FOISD in accordance with an embodiment of the present application. Referring to FIGS. 25E and 25F, each of the semiconductor chips 100 in a single-die type as seen in FIG. 22Y and/or memory modules 159 as seen in FIG. 23 in a single-module type may have its micro-pillars or micro-bumps 34 of the first or second type to be bonded to the first or second type of micro-pillars or micro-bumps 34 of the FOISD 592. Further, each of the operation modules 190 as seen in FIG. 24G may have its metal bumps 570 of the first, second or fourth type to be bonded to the first or second type of micro-pillars or micro-bumps 34 of the FOISD 592.

(1) Bonding of Semiconductor Chip or Memory Module to FOISD

For a first case, referring to FIG. 25E, each of the semiconductor chips 100 in a single-die type as seen in FIG. 22Y and/or memory modules 159 as seen in FIG. 23 in a single-module type may have the micro-pillars or micro-bumps 34 of the first type to be bonded to the second type of micro-pillars or micro-bumps 34 of the FOISD 592. For example, the first type of micro-pillars or micro-bumps 34 of said each of the semiconductor chips 100 and/or memory modules 159 may have the solder bumps 33 to be bonded onto the electroplated copper layer of the micro-pillars or micro-bumps 34 of the second type of the FOISD 592 into multiple bonded contacts 563 as seen in FIG. 25F, wherein each of the micro-pillars or micro-bumps 34 of the first type of said each of the semiconductor chips 100 and/or memory modules 159 may have its metal layer 32 formed with the electroplated copper layer having a thickness greater than that of the electroplated copper layer of the metal layer 32 of the micro-pillars or micro-bumps 34 of the second type of the FOISD 592.

For a second case, referring to FIG. 25E, each of the semiconductor chips 100 in a single-die type as seen in FIG. 22Y and/or memory modules 159 as seen in FIG. 23 in a single-module type may have the micro-pillars or micro-bumps 34 of the second type to be bonded to the first type of micro-pillars or micro-bumps 34 of the FOISD 592. For example, the second type of micro-pillars or micro-bumps 34 of said each of the semiconductor chips 100 and/or memory modules 159 may have the electroplated metal layer 32, e.g. copper layer, to be bonded onto the solder caps 33 of the micro-pillars or micro-bumps 34 of the first type of the FOISD 592 into multiple bonded contacts 563 as seen in FIG. 25F, wherein each of the micro-pillars or micro-bumps 34 of the second type of said each of the semiconductor chips 100 and/or memory modules 159 may have its metal layer 32 formed with the electroplated copper layer having a thickness greater than that of the electroplated copper layer of the metal layer 32 of the micro-pillars or micro-bumps 34 of the first type of the FOISD 592.

For a third case, referring to FIG. 25E, each of the semiconductor chips 100 in a single-die type as seen in FIG. 22Y and/or memory modules 159 as seen in FIG. 23 in a single-module type may have the micro-pillars or micro-bumps 34 of the first type to be bonded to the first type of micro-pillars or micro-bumps 34 of the FOISD 592. For example, the first type of micro-pillars or micro-bumps 34 of said each of the semiconductor chips 100 and/or memory modules 159 may have the solder bumps 33 to be bonded onto the solder caps 33 of the micro-pillars or micro-bumps 34 of the first type of the FOISD 592 into multiple bonded contacts 563 as seen in FIG. 25F, wherein each of micro-pillars or micro-bumps 34 of the first type of said each of the semiconductor chips 100 and/or memory modules 159 may have its metal layer 32 formed with the electroplated copper layer having a thickness greater than that of the electroplated copper layer of the metal layer 32 of each of the micro-pillars or micro-bumps 34 of the first type of the FOISD 592.

In view of the logic drives 300 shown in FIGS. 15A-15O, each of the semiconductor chips 100 to be bonded to the FOISD 592 may be one of the standard commodity FPGA IC chips 200, DPIIC chips 410, NVM IC chips 250, HBM IC chips 251, dedicated I/O chips 265, PCIC chips 269 (such as CPU chips, GPU chips, TPU chips or APU chips), DRAM IC chips 321, dedicated control chips 260, dedicated control and I/O chips 266, IAC chips 402, DCIAC chips 267 and DCDI/OIAC chips 268.

(2) Bonding of Operation Module to FOISD

For a first case, referring to FIG. 25E, each of the operation modules 190 as seen in FIG. 24G may have its metal bumps 570 of the first type to be bonded to the first type of micro-pillars or micro-bumps 34 of the FOISD 592. For example, the first type of metal bumps or pillars 570 of said each of the operation modules 190 may have its electroplated copper layer to be bonded to the solder bumps 33 of the micro-pillars or micro-bumps 34 of the first type of the FOISD 592 into multiple bonded contacts 191 as seen in FIG. 25F. Each of the metal bumps or pillars 570 of the first type of said each of the operation modules 190 may have its metal layer 568 formed with the electroplated copper layer having a thickness greater than that of the electroplated copper layer of the metal layer 32 of the micro-pillars or micro-bumps 34 of the first type of the FOISD 592.

For a second case, referring to FIG. 25E, each of the operation modules 190 as seen in FIG. 24G may have its metal bumps 570 of the second type to be bonded to the second type of micro-pillars or micro-bumps 34 of the FOISD 592. For example, the second type of metal bumps or pillars 570 of said each of the operation modules 190 may have its solder balls or bumps to be bonded to the electroplated metal layer 32, e.g. copper layer, of the micro-pillars or micro-bumps 34 of the second type of the FOISD 592 into multiple bonded contacts 191 as seen in FIG. 25F.

For a third case, referring to FIG. 25E, each of the operation modules 190 as seen in FIG. 24G may have its metal bumps 570 of the fourth type to be bonded to the second type of micro-pillars or micro-bumps 34 of the FOISD 592. For example, the fourth type of metal bumps or pillars 570 of said each of the operation modules 190 may have its solder bumps 569 to be bonded to the electroplated metal layer 32, e.g. copper layer, of the micro-pillars or micro-bumps 34 of the second type of the FOISD 592 into multiple bonded contacts 191 as seen in FIG. 25F. Each of the metal bumps or pillars 570 of the fourth type of said each of the operation modules 190 may have its metal layer 568 formed with the electroplated copper layer having a thickness greater than that of the electroplated copper layer of the metal layer 32 of the micro-pillars or micro-bumps 34 of the second type of the FOISD 592.

For a fourth case, referring to FIG. 25E, each of the operation modules 190 as seen in FIG. 24G may have its metal bumps 570 of the second type to be bonded to the first type of micro-pillars or micro-bumps 34 of the FOISD 592. For example, the second type of metal bumps or pillars 570 of said each of the operation modules 190 may have its solder balls or bumps to be bonded to the solder bumps 33 of the micro-pillars or micro-bumps 34 of the first type of the FOISD 592 into multiple bonded contacts 191 as seen in FIG. 25F.

For a fifth case, referring to FIG. 25E, each of the operation modules 190 as seen in FIG. 24G may have its metal bumps 570 of the fourth type to be bonded to the first type of micro-pillars or micro-bumps 34 of the FOISD 592. For example, the fourth type of metal bumps or pillars 570 of said each of the operation modules 190 may have its solder bumps 569 to be bonded to the solder bumps 33 of the micro-pillars or micro-bumps 34 of the first type of the FOISD 592 into multiple bonded contacts 191 as seen in FIG. 25F. Each of the metal bumps or pillars 570 of the fourth type of said each of the operation modules 190 may have its metal layer 568 formed with the electroplated copper layer having a thickness greater than that of the electroplated copper layer of the metal layer 32 of the micro-pillars or micro-bumps 34 of the first type of the FOISD 592.

Next, referring to FIG. 25F, an underfill 564, such as epoxy resins or compounds, may be filled into a gap between each of the semiconductor chips 100 and/or memory modules 159 and the FOISD 592 and/or a gap between each of the operation modules 159 and the FOISD 592 by a dispensing method performed using a dispenser. The underfill 564 may then be cured at temperature equal to or above 100° C., 120° C., or 150° C.

Figure 25G:
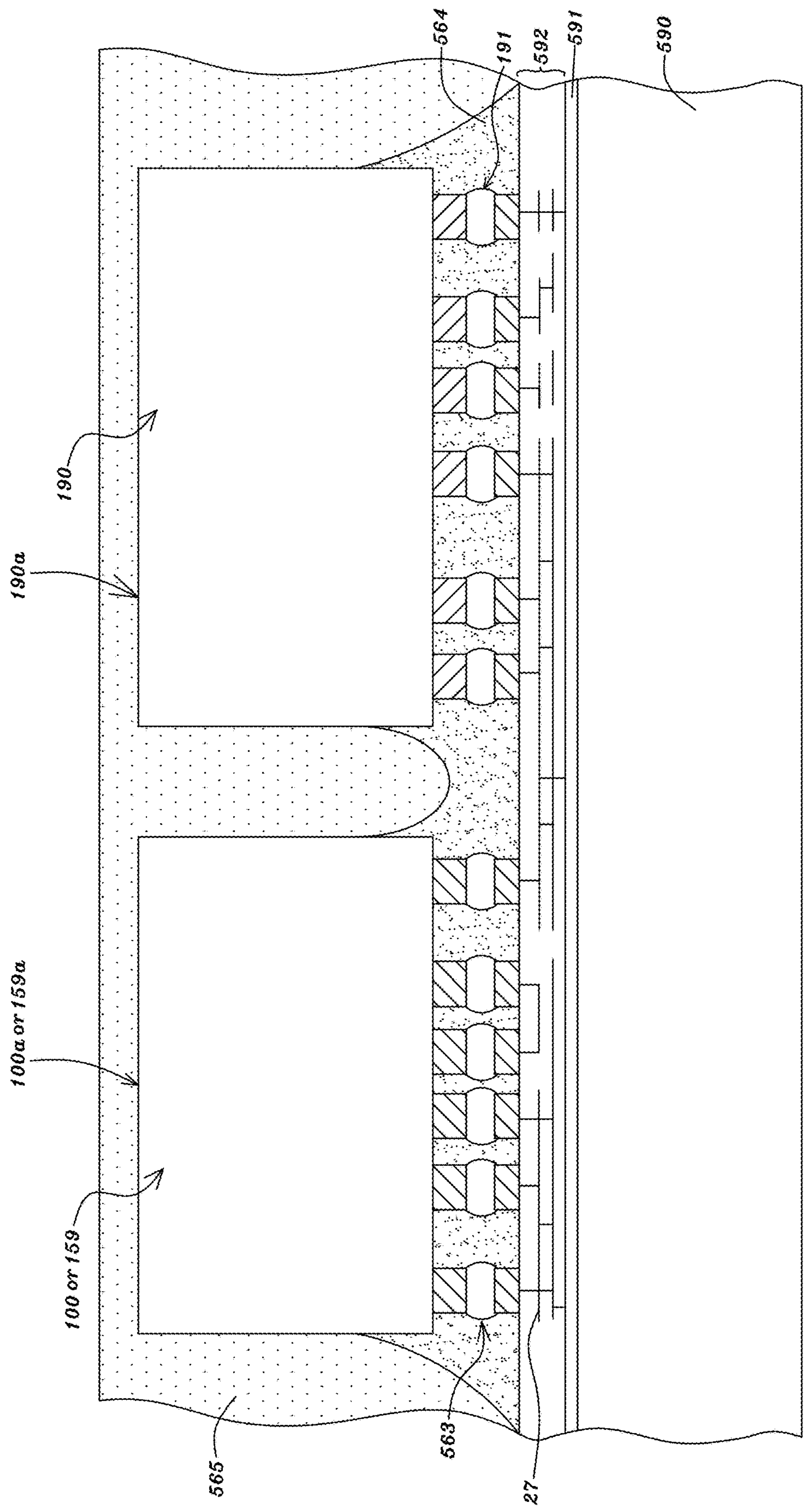

Next, referring to FIG. 25G, a polymer layer 565, e.g., resin or compound, may be applied to fill a gap between each neighboring two of the semiconductor chips 100, between each neighboring two of the memory modules 159, between each neighboring two of the operation modules 190, between one of the semiconductor chips 100 and one of the memory modules 159, between one of the semiconductor chips 100 and one of the operation modules 190, and/or between one of the memory modules 159 and one of the operation modules 190, and to cover a backside 100*a* of each of the semiconductor chips 100, a backside 159*b* of each of the memory modules 159 and/or a backside 190*a* of each of the operation modules 190, wherein said each of the memory modules 159 has its backside 159*b* composed of the backside of the topmost one of its memory chips 687 and the top surface of its molding compound 695 as seen in FIG. 23, and said each of the operation modules 190 has its backside 190*a* composed of the backside 159*a* or 195*a* of its memory module 159 or memory chip 195 and a top surface of its molding compound 565 as seen in FIG. 24G, by methods, for example, spin-on coating, screen-printing, dispensing or molding in a wafer or panel format. For the molding method, a compress molding method (using top and bottom pieces of molds) or casting molding (using a dispenser) may be employed. The polymer layer 565 may be, for example, polyimide, BenzoCycloButene (BCB), parylene, epoxy-based material or compound, photo epoxy SU-8, elastomer, or silicone. For more elaboration, the polymer layer 565 may be, for example, photosensitive polyimide/PBO PIMEL™ supplied by Asahi Kasei Corporation, Japan, or epoxy-based molding compounds, resins or sealants provided by Nagase ChemteX Corporation, Japan. The polymer layer 565 may be then cured or cross-linked by raising a temperature to a certain temperature degree, for example, higher than or equal to 50° C., 70° C., 90° C., 100° C., 125° C., 150° C., 175° C., 200° C., 225° C., 250° C., 275° C. or 300° C.

Figure 25H:
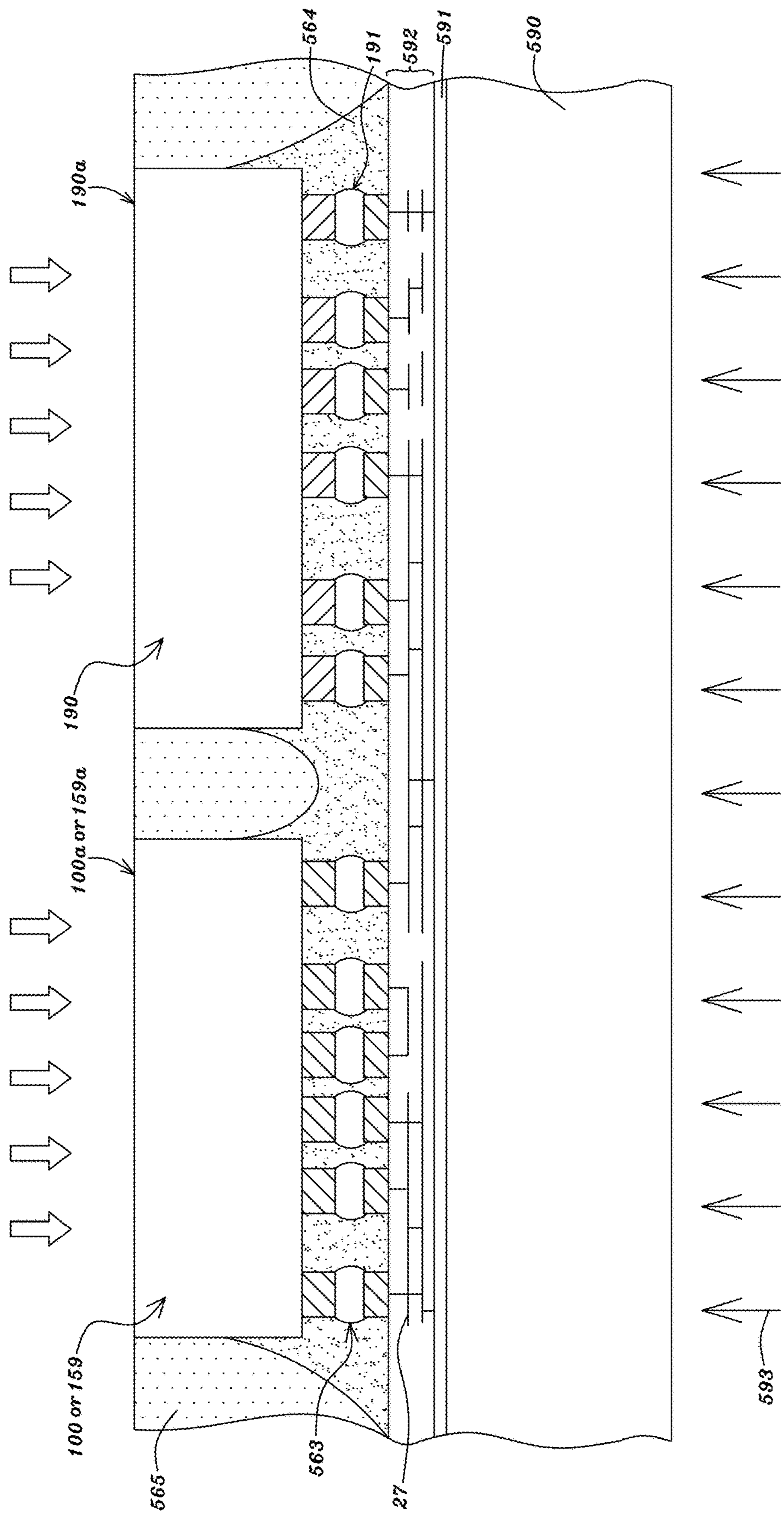

Next, referring to FIG. 25H, a chemical mechanical polishing (CMP), polishing or grinding process may be applied to remove a top portion of the polymer layer 565 and a top portion of one or more of the semiconductor chips 100, memory modules 159 and/or operation modules 190 and to planarize a top surface of the polymer layer 565 and the backside 100*a*, 159*b* or 190*a* of said one or more of the semiconductor chips 100, memory modules 159 and/or operation modules 190.

Figure 25I:
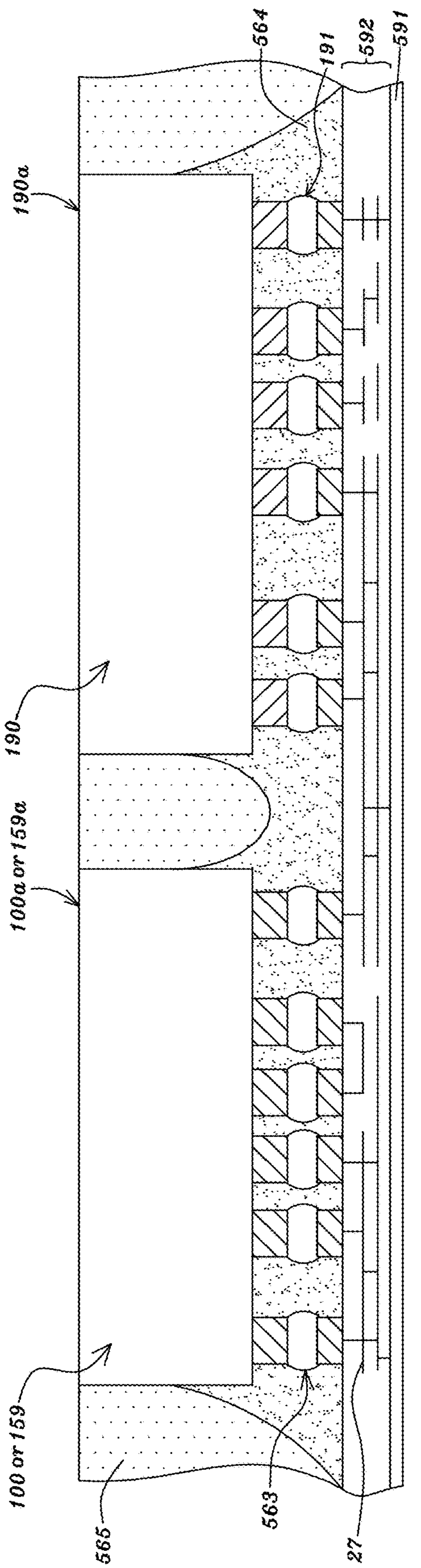
Figure 25J:
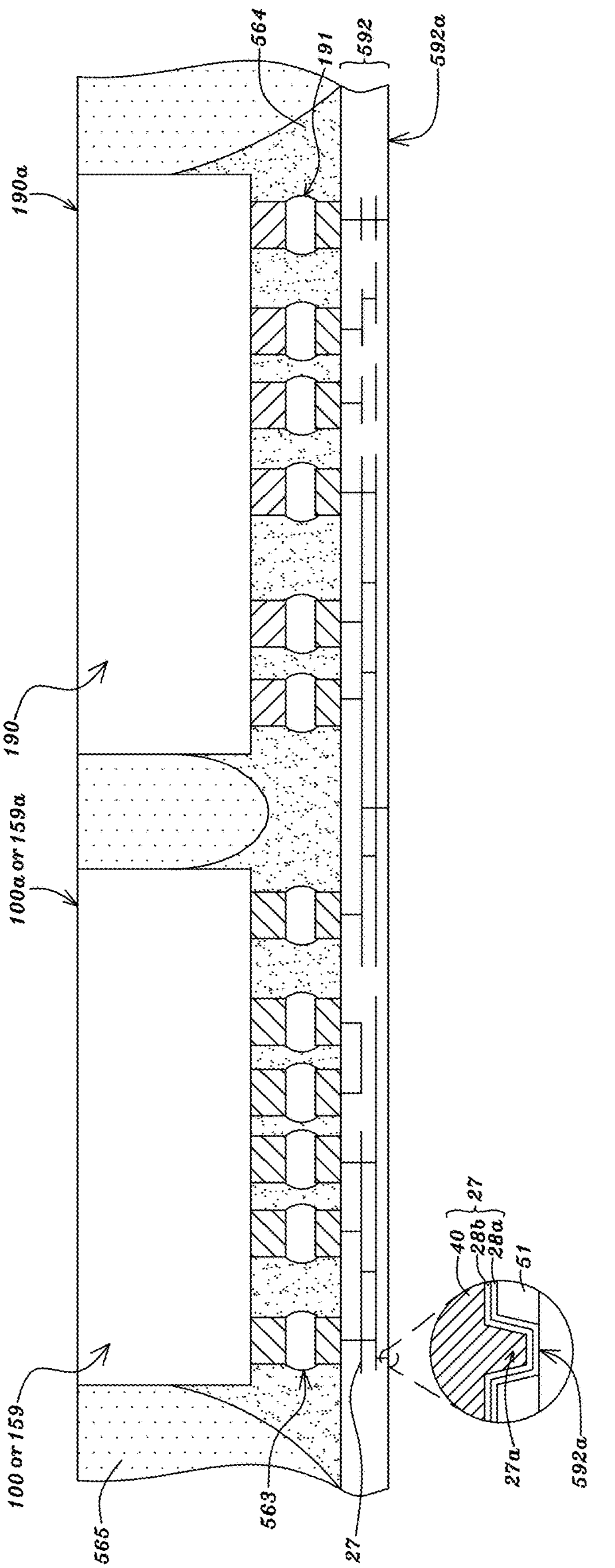

Next, referring to FIGS. 25H and 25I, the temporary substrate (T-sub) 590 may be released from the FOISD 592. For example, in the case that the sacrificial bonding layer 591 is the material of light-to-heat conversion (LTHC) and the temporary substrate (T-sub) 590 is a glass wafer or panel, a laser light 593, such as YAG laser having a wavelength of about 1064 nm, an output power between 20 and 50 W and a spot size of 0.3 mm in diameter at a focal point, may be generated to pass from the backside of the temporary substrate (T-sub) 590 to the sacrificial bonding layer 591 through the temporary substrate (T-sub) 590 to scan the sacrificial bonding layer 591 at a speed of 8.0 m/s, for example, such that the sacrificial bonding layer 591 may be decomposed and the temporary substrate 590 may be easily released from the sacrificial bonding layer 591 as seen in FIG. 25I. Next, an adhesive peeling tape (not shown) may be attached to a backside of the sacrificial bonding layer 591, opposite to a front side thereof having the FOISD 592 formed thereon. Next, the sacrificial bonding layer 591 may be released or peeled from the FOISD 592 by pulling the adhesive peeling tape, as seen in FIG. 25J. Thereby, for the FOISD 592, each of the metal vias 27*a* of its bottommost interconnection metal layer 27 in its bottommost polymer layer 51 is exposed as a contact to join a metal pad, pillar or bump, that is, the adhesion layer 28*a* of its bottommost interconnection metal layer 27 is exposed at the surface of the contact.

Figure 26A:
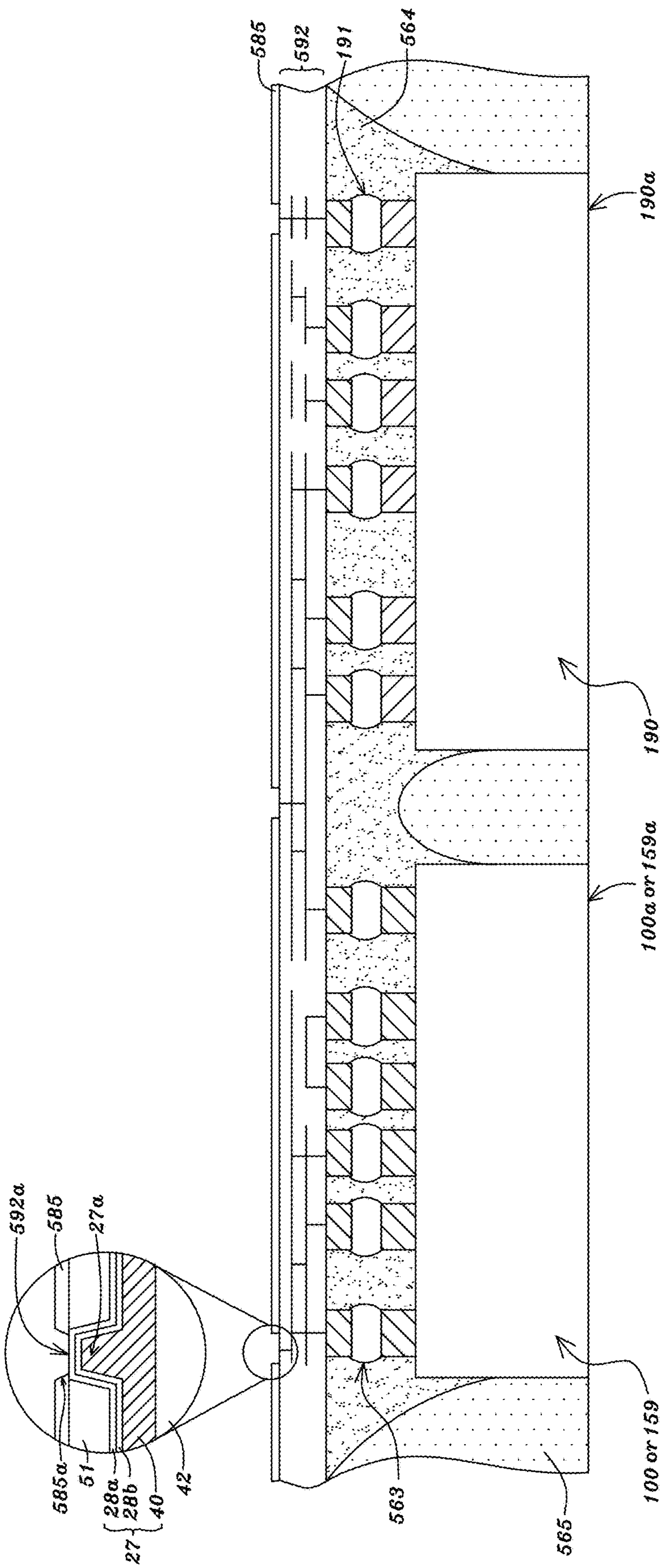
FIGS. 26A, 26B and 26D are cross-sectional views showing a process for forming a logic drive in accordance with an embodiment of the present application.
Figure 26B:
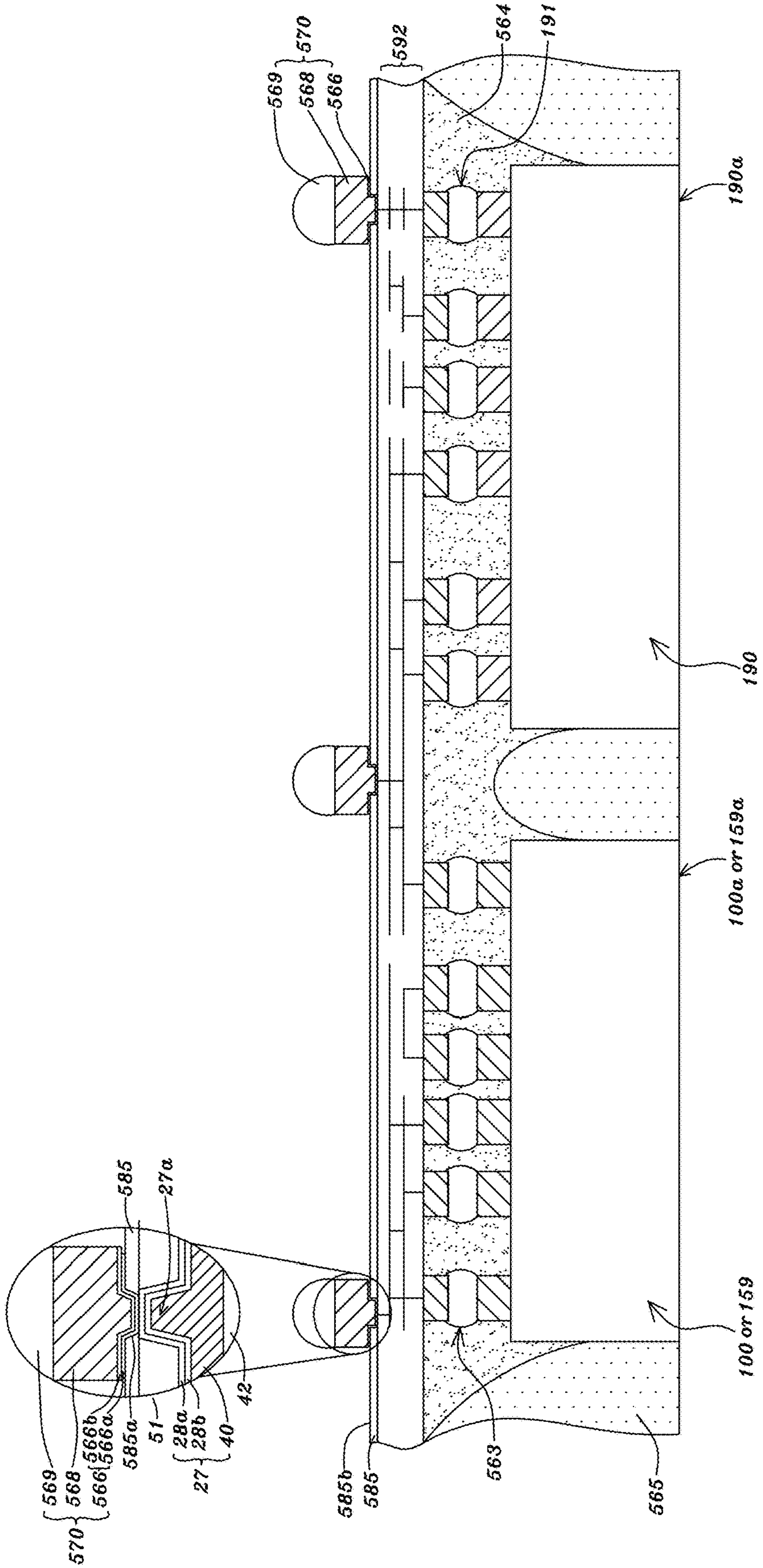
Figure 26C:
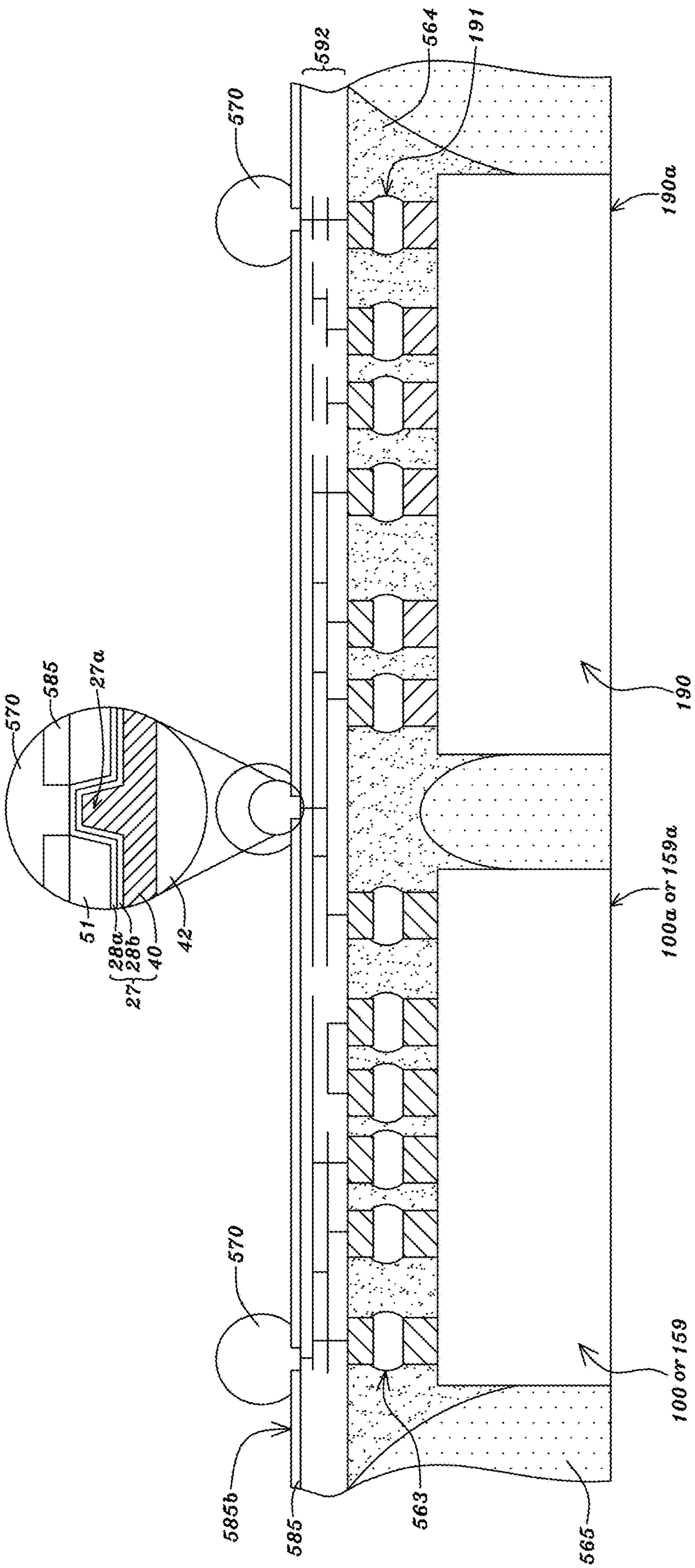
FIGS. 26C and 26E are cross-sectional views showing a process for forming a logic drive in accordance with another embodiment of the present application.
Figure 26D:
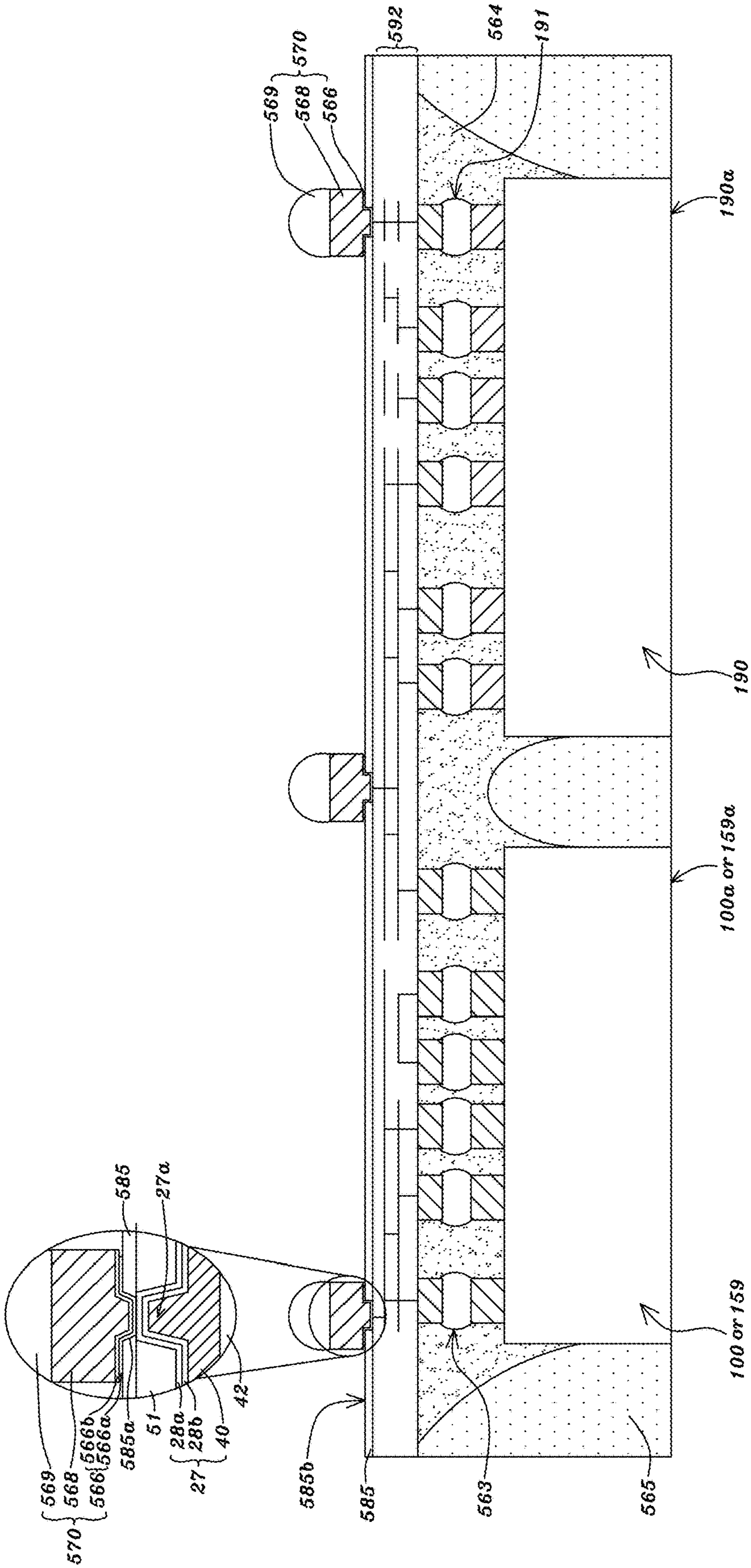
Figure 26E:
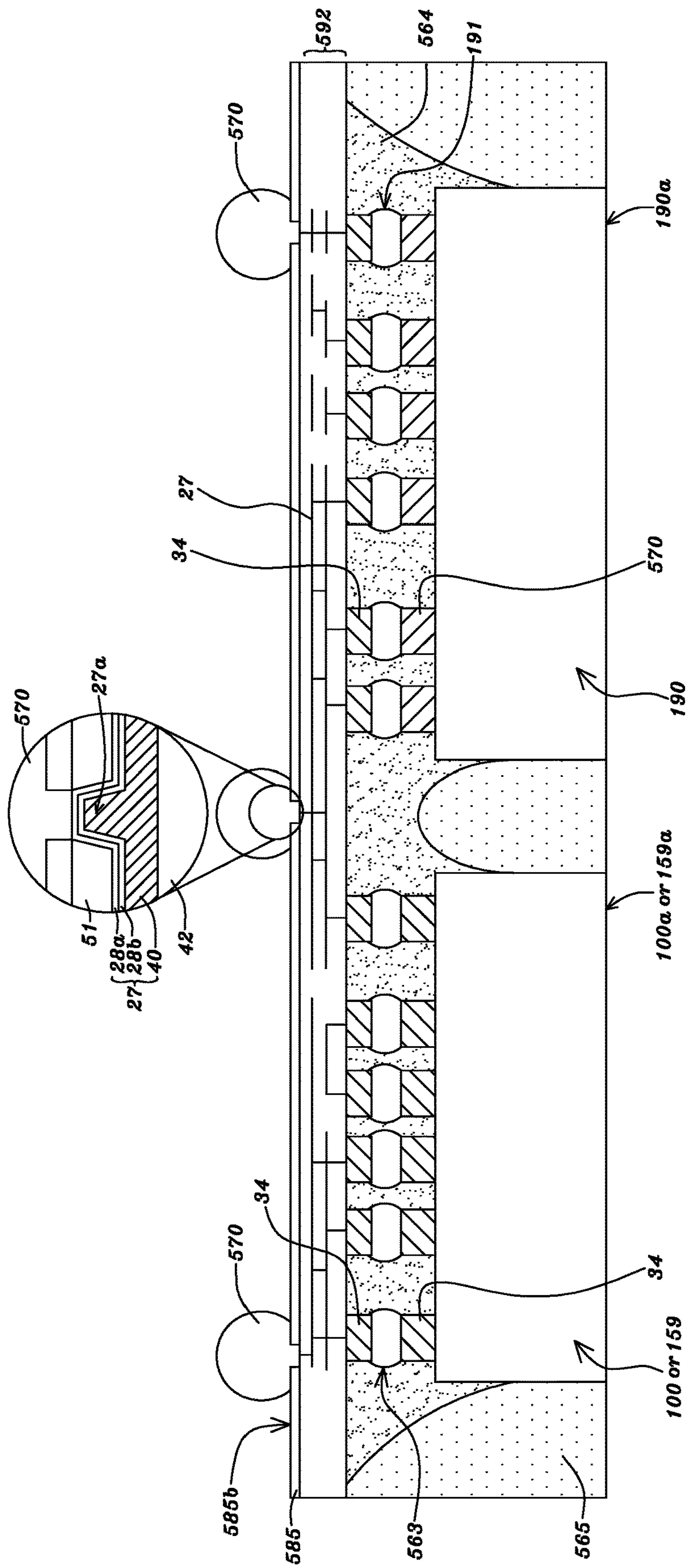

Processes for Forming Metal Pads, Pillars or Bumps at Backside of Logic Drive and Singulating for Logic Drives FIGS. 26A, 26B and 26D are cross-sectional views showing a process for forming a logic drive in accordance with an embodiment of the present application. FIGS. 26C and 26E are cross-sectional views showing a process for forming a logic drive in accordance with another embodiment of the present application. Referring to FIG. 26A, after the sacrificial bonding layer 591 is released as illustrated in FIG. 25J, a polymer layer 585, i.e., insulating dielectric layer, may be formed on the backside 592*a* of the FOISD 592 and the backsides of the metal vias 27*a* by a method of spin-on coating, screen-printing, dispensing or molding, and multiple openings 585*a* in the polymer layer 585 are formed over and expose the metal vias 27*a*. The polymer layer 585 may be photosensitive, and may be used as photoresist as well for patterning multiple openings 585*a* therein to allow multiple metal pads, bumps or pillars to be formed on the metal vias 27*a* by following processes to be performed later. The openings 585*a* in the polymer layer 585 overlap and expose the metal vias 27*a* respectively. In some applications or designs, the size or transverse largest dimension of one of the openings 585*a* in the polymer layer 585 may be smaller than that of the area of the backside of one of the metal vias 27*a* under said one of the openings 585*a*. In other applications or designs, the size or transverse largest dimension of one of the openings 585*a* in the polymer layer 585 may be greater than that of the area of the backside of one of the vias 27*a* under said one of the openings 585*a*. The specification of the polymer layer 585 on the FOISD 592 and the process for forming the same may be referred to that of the polymer layer 592 on the backside 2*b* of the semiconductor wafer and the process for forming the same as illustrated in FIG. 22Q.

Next, referring to FIG. 26B, multiple metal pads, pillars or bumps 570 may be formed on the metal vias 27*a* of the bottommost one of the interconnection metal layers 27 of the FOISD 592 at close ends of the openings 585*a* in the polymer layer 585 and may be of the first, second, third or fourth type, the specifications of which may be the same as those as illustrated in FIGS. 22R-22V and the process for forming the same may be referred to the process for forming the metal pads, pillars or bumps 570 on the backside 2*b* of the semiconductor wafer as illustrated in FIGS. 22R-22V. Each of the first through third types of metal bumps 570, which may be referred to the first through third types of ones as illustrated in FIGS. 22R-22U respectively, may have the adhesion/seed layer 566 formed with the adhesion layer 566*a* on one of the metal vias 27*a* of the bottommost one of the interconnection metal layers 27 of the FOISD 592 and the electroplating seed layer 566*b* on the adhesion layer 566*a*, and the metal layer 568 on the electroplating seed layer of the adhesion/seed layer 566. Each of the fourth type of metal bumps 583, which may be referred to the fourth type of ones as illustrated in FIGS. 22R-22V, may have the adhesion/seed layer 566 formed with the adhesion layer 566*a* on one of the metal vias 27*a* of the bottommost one of the interconnection metal layers 27 of the FOISD 592 and the electroplating seed layer 566*b* on the adhesion layer 566*a*, the metal layer 568 on the electroplating seed layer 566*b* of the adhesion/seed layer 566 and the solder bumps 569 on the metal layer 568.

Alternatively, referring to FIG. 26C, a fifth type of metal bumps 570 may be on the backside 592*a* of the FOISD 592 by forming multiple solder bumps on the metal vias 27*a* of the bottommost one of the interconnection metal layers 27 of the FOISD 592 using a screen printing method or solder-ball mounting and then using a solder reflow process. The material used for forming the solder bumps for the fifth type of metal bumps 570 may be a lead-free solder containing tin, copper, silver, bismuth, indium, zinc, antimony, and/or traces of other metals, for example, Sn—Ag—Cu (SAC) solder, Sn—Ag solder, or Sn—Ag—Cu—Zn solder. Each of the metal bumps 570 of the fifth type may be used for connecting or coupling the interconnection metal layers 27 of the FOISD 592 to the external circuits or components outside of the standard commodity logic drive 300. Each of the metal bumps 570 of the fifth type may have a height, from a backside surface of the FOISD 592 or a backside surface 585*b* of the polymer layer 585 at the backside of the FOISD 592, between 5 μm and 150 μm, between 5 μm and 120 μm, between 10 μm and 100 μm, between 10 μm and 60 μm, between 10 μm and 40 μm or between 10 μm and 30 μm, or greater or taller than or equal to 75 μm, 50 μm, 30 μm, 20 μm, 15 μm or 10 μm, for example, and a largest dimension in cross-sections, such as a diameter of a circle shape or a diagonal length of a square or rectangle shape, between 5 μm and 200 μm, between 5 μm and 150 μm, between 5 μm and 120 μm, between 10 μm and 100 μm, between 10 μm and 60 μm, between 10 μm and 40 μm, or between 10 μm and 30 μm, or greater than or equal to 100 μm, 60 μm, 50 μm, 40 μm, 30 μm, 20 μm, 15 μm or 10 μm, for example. The smallest space from one of the metal bumps 570 of the fifth type to its nearest neighboring one of the metal bumps 570 of the fifth type is, for example, between 5 μm and 150 μm, between 5 μm and 120 μm, between 10 μm and 100 μm, between 10 μm and 60 μm, between 10 μm and 40 μm, or between 10 μm and 30 μm, or greater than or equal to 60 μm, 50 μm, 40 μm, 30 μm, 20 μm, 15 μm or 10 μm.

Next, the package structure shown in FIG. 26B or 26C may be separated, cut or diced into multiple individual chip packages, i.e., standard commodity FOIT logic drives 300 or single-layer-packaged logic drive, as shown in FIG. 26D or 26E by a laser cutting process or by a mechanical cutting process.

The standard commodity FOIT logic drive 300 may be in a shape of square or rectangle with a certain widths, lengths and thicknesses. An industry standard may be set for the shape and dimensions of the standard commodity FOIT logic drive 300. For example, the standard shape of the FOIT logic drive 300 may be a square with a width greater than or equal to 4 mm, 7 mm, 10 mm, 12 mm, 15 mm, 20 mm, 25 mm, 30 mm, 35 mm or 40 mm, and a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the standard commodity FOIT logic drive 300 may be a rectangle with a width greater than or equal to 3 mm, 5 mm, 7 mm, 10 mm, 12 mm, 15 mm, 20 mm, 25 mm, 30 mm, 35 mm or 40 mm, a length greater than or equal to 5 mm, 7 mm, 10 mm, 12 mm, 15 mm, 20 mm, 25 mm, 30 mm, 35 mm, 40 mm, 45 mm or 50 mm, and a thickness greater than or equal to 0.03 mm, 0.05 mm, 0.1 mm, 0.3 mm, 0.5 mm, 1 mm, 2 mm, 3 mm, 4 mm, or 5 mm. Furthermore, the metal bumps or pillars 570 at a backside of the FOISD 592 in the logic drive 300 may be in a standard footprint, for example, in an area array of M×N with a standard dimension of pitch and space between neighboring two of the metal bumps or pillars 570. The locations of the metal bumps or pillars 570 are also at a standard location.

Interconnection for FOIT Logic Drive

Figure 27A:
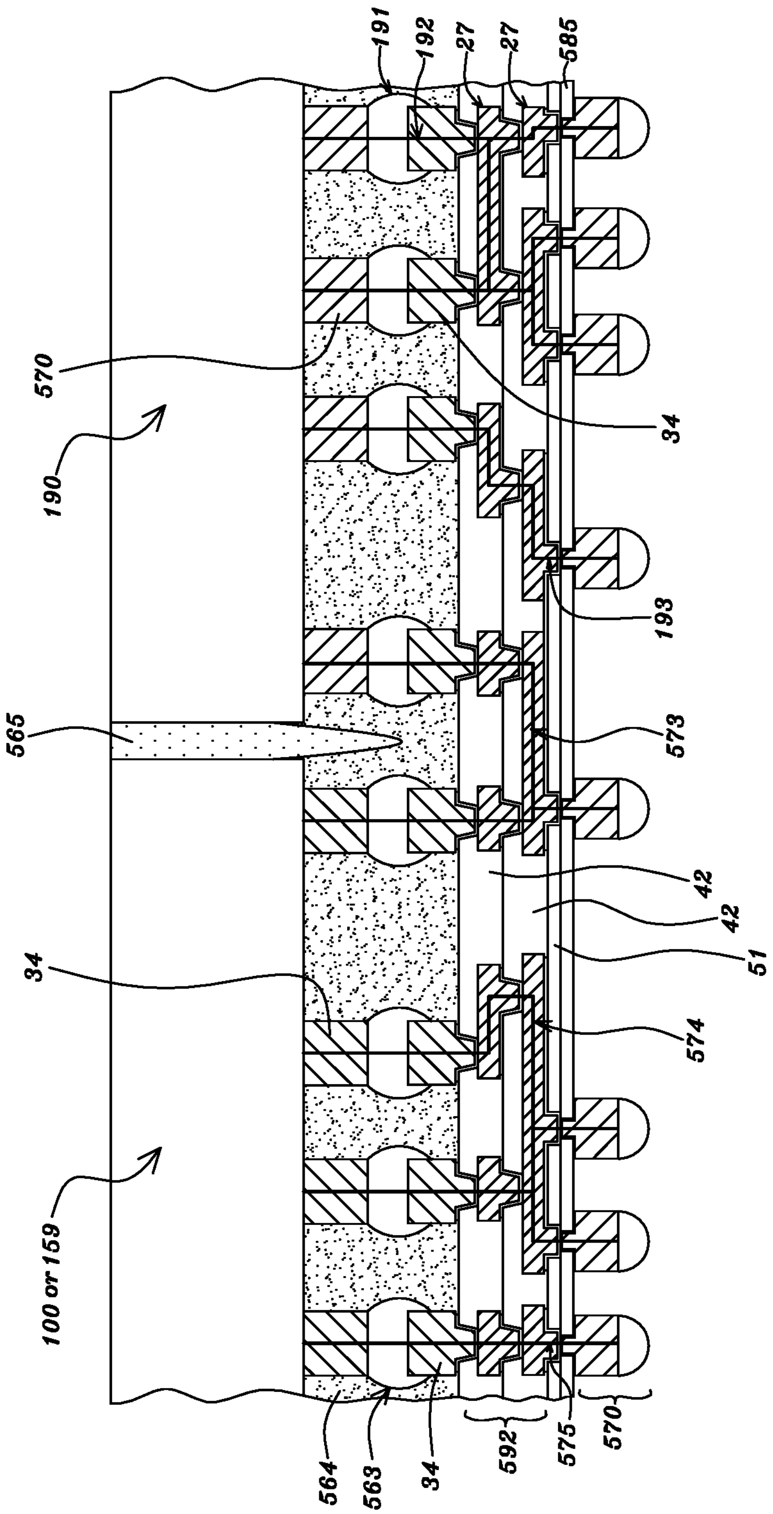
FIGS. 27A and 27B are schematically cross-sectional views showing various interconnection for the FOISD in accordance with an embodiment of the present application.
Figure 27B:
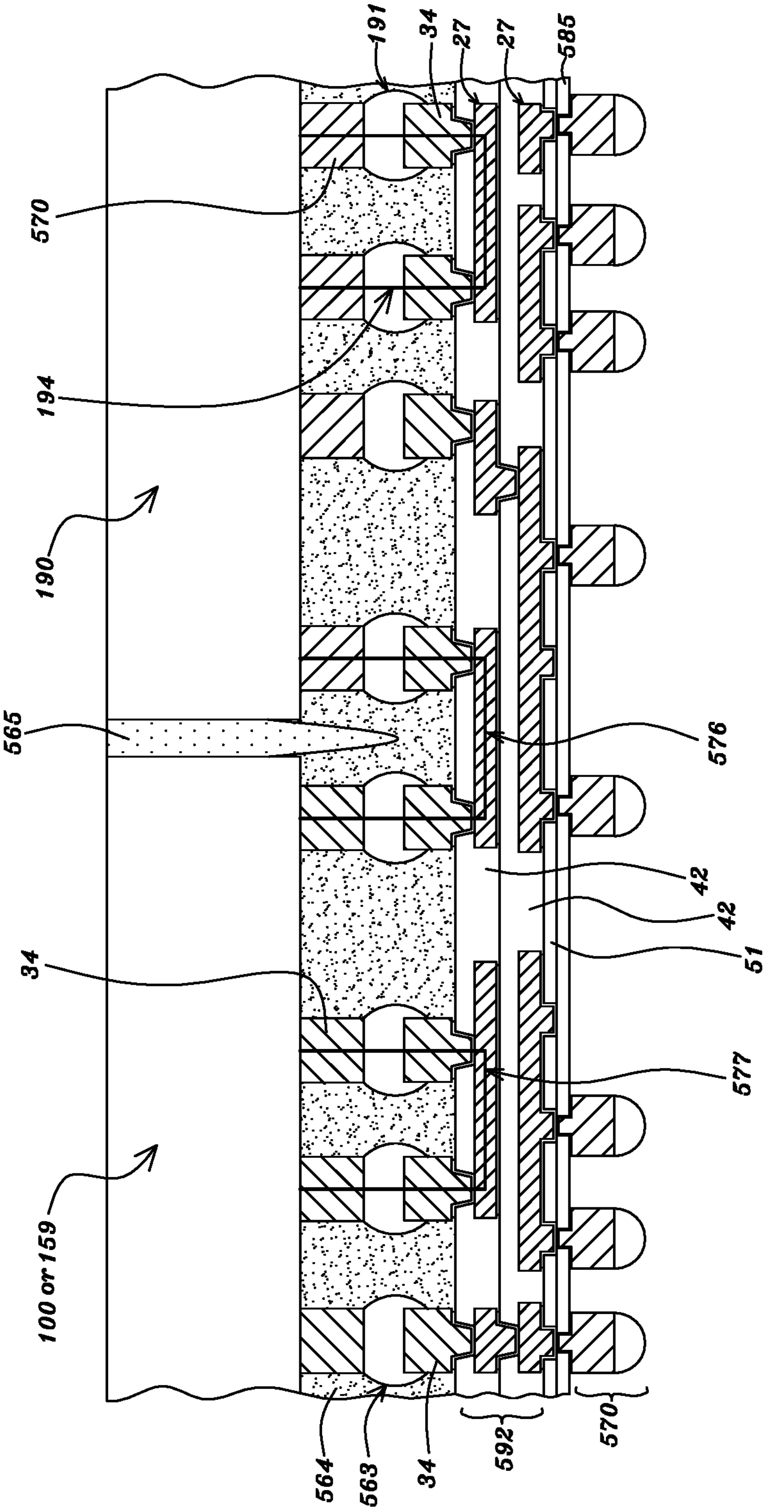

FIGS. 27A and 27B are schematically cross-sectional views showing various interconnection for the FOISD in accordance with an embodiment of the present application. The first, second, third, fourth or fifth type of metal bumps 570 may be formed at the backside of the FOISD 592. For illustration, the fourth type of metal bumps 570 is taken as an example in FIGS. 27A and 27B.

Referring to FIG. 27A, the interconnection metal layers 27 of the FOISD 592 may connect one or more of the metal pillars or bumps 570 under the FOISD 592 to one of the semiconductor chips 100, memory modules 159 and/or operation modules 190 and connect one of the semiconductor chips 100, memory modules 159 and/or operation modules 190 to another of the semiconductor chips 100, memory modules 159 and/or operation modules 190. For a first case, the interconnection metal layers 27 of the FOISD 592 may compose a first interconnection net 573 connecting multiple of the metal pillars or bumps 570 under the FOISD 592 to each other or one another and connecting multiple of the semiconductor chips 100, memory modules 159 and/or operation modules 190 to each other or one another. Said multiple of the metal pillars or bumps 570 under the FOISD 592 and said multiple of the semiconductor chips 100, memory modules 159 and/or operation modules 190 may be connected together by the first interconnection net 573. The first interconnection net 573 may be a power or ground plane or bus for delivering power or ground supply.

Referring to FIG. 27A, for a second case, the interconnection metal layers 27 of the FOISD 592 may compose a second interconnection net 574 connecting one or more of the metal pillars or bumps 570 under the FOISD 592 to each other or one another and connecting multiple of the bonded contacts 563 between one of the semiconductor chips 100 and/or memory modules 159 and the FOISD 592 to each other or one another. Said multiple of the metal pillars or bumps 570 and said multiple of the bonded contacts 563 may be connected together by the second interconnection net 574. The second interconnection net 574 may be a power or ground plane or bus for delivering power or ground supply. Referring to FIG. 27A, for a third case, the interconnection metal layers 27 of the FOISD 592 may compose a third interconnection net 575 connecting one of the metal pillars or bumps 570 under the FOISD 592 to one of the bonded contacts 563 between one of the semiconductor chips 100 and/or memory modules 159 and the FOISD 592. For example, the third interconnection net 575 may be a signal bus or trace coupling to one of the large I/O circuits 341, as seen in FIG. 5A, of said one of the semiconductor chips 100 and/or memory modules 159, e.g., the control chip 688 of one of the memory modules 159, via said one of the bonded contacts 563.

Referring to FIG. 27B, for a fourth case, the interconnection metal layers 27 of the FOISD 592 may compose a fourth interconnection net 576 not connecting to any of the metal pillars or bumps 570 of the FOIT logic drive 300, which are under the FOISD 592, but connecting multiple of the semiconductor chips 100, memory modules 159 and/or operation modules 190 to each other or one another. The fourth interconnection net 576 may be one of the programmable interconnects 361 of the inter-chip interconnects 371 for signal transmission. For example, the fourth interconnection net 576 may be a signal bus or trace coupling one of the small I/O circuits 203, as seen in FIG. 5B, of one of the semiconductor chips 100, memory modules 159 and/or operation modules 190, e.g., the control chip 688 of one of the memory modules 159 or the standard commodity FPGA IC chip 200 of one of the operation modules 190, to one of the small I/O circuits 203 of another of the semiconductor chips 100, memory modules 159 and/or operation modules 190, e.g., the control chip 688 of another of the memory modules 159 or the standard commodity FPGA IC chip 200 of another of the operation modules 190.

Referring to FIG. 27B, for a fifth case, the interconnection metal layers 27 of the FOISD 592 may compose a fifth interconnection net 577 not connecting to any of the metal pillars or bumps 570 of the FOIT logic drive 300, which are under the FOISD 592, but connecting multiple of the bonded contacts 563 between one of the semiconductor chips 100 or memory modules 159 and the FOISD 592 to each other or one another. The fifth interconnection net 577 may be a signal bus or trace for signal transmission.

Referring to FIG. 27A, for a sixth case, the interconnection metal layers 27 of the FOISD 592 may compose a sixth interconnection net 192 connecting one or more of the metal pillars or bumps 570 under the FOISD 592 to each other or one another and connecting multiple of the bonded contacts 191 between one of the operation modules 190 and the FOISD 592 to each other or one another. Said multiple of the metal pillars or bumps 570 and said multiple of the bonded contacts 191 may be connected together by the sixth interconnection net 192. The sixth interconnection net 192 may be a power or ground plane or bus for delivering power or ground supply.

Referring to FIG. 27A, for a seventh case, the interconnection metal layers 27 of the FOISD 592 may compose a seventh interconnection net 193 connecting one of the metal pillars or bumps 570 under the FOISD 592 to one of the bonded contacts 191 between one of the operation modules 190 and the FOISD 592. The seventh interconnection net 193 may be a signal bus or trace for signal transmission or a power or ground plane or bus for delivering power or ground supply. For example, the seventh interconnection net 193 may be a signal bus or trace coupling to one of the large I/O circuits 341, as seen in FIG. 5A, of the standard commodity FPGA IC chip 200 of said one of the operation modules 190 via said one of the bonded contacts 191.

Referring to FIG. 27B, for an eighth case, the interconnection metal layers 27 of the FOISD 592 may compose an eighth interconnection net 194 not connecting to any of the metal pillars or bumps 570 of the FOIT logic drive 300, which are under the FOISD 592, but connecting multiple of the bonded contacts 191 between one of the operation modules 190 and the FOISD 592 to each other or one another. The eighth interconnection net 194 may be a signal bus or trace for signal transmission.

Figure 28A:
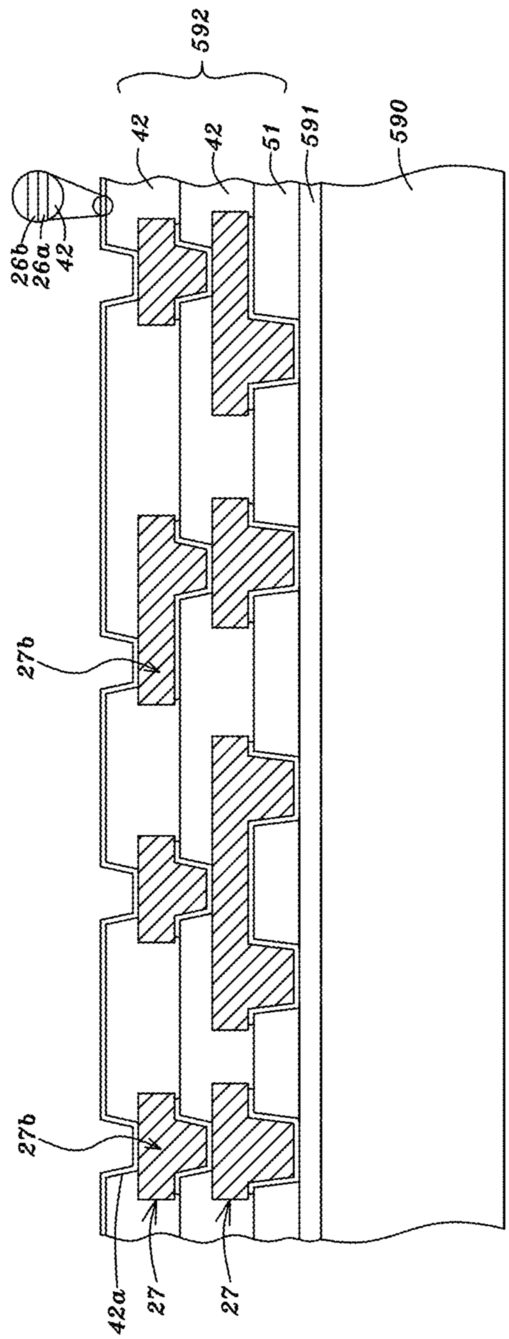
FIGS. 28A-28F are cross-sectional views showing a first process for forming multiple through package vias (TPVs) and micro-bumps and micro-pillars in accordance with the present application.

Embodiment for Chip Package with TPVs (1) First Embodiment for Forming TPVs and Micro-Bumps on FOISD Alternatively, the FOIT logic drive 300 may be provided with multiple through package vias, or thought polymer vias (TPVs) in the polymer layer 565 on a front side of the FOISD 592. FIGS. 28A-28F are cross-sectional views showing a first process for forming multiple through package vias (TPVs) and micro-bumps and micro-pillars in accordance with the present application. Referring to FIGS. 28A-28F, the through package vias (TPVs) 582 may be formed on the front side of the FOISD 592 using the adhesion layer **26*a* and seed layer 26*b* for forming the micro-bumps 34 as seen in FIG. 25C. Referring to FIG. 28A, the adhesion layer 26*a* and seed layer 26*b* used for forming the micro-bumps 34 and the through package vias (TPVs) may be first formed on the FOISD 592, i.e., on its polymer layer 42 and its metal pads 27*b* at the bottoms of its openings 42*a*. The specification of the adhesion layer 26*a* and seed layer 26*b* as seen in FIG. 28A and the process for forming the same may be referred to those as illustrated in FIGS. 21B and 21C. In this case, the adhesion layer 26*a* may be formed on its polymer layer 42 and its metal pads 27*b* at the bottoms of its openings 42*a*, and then the seed layer 26*b* may be formed on the adhesion layer 26*a***.

Figure 28B:
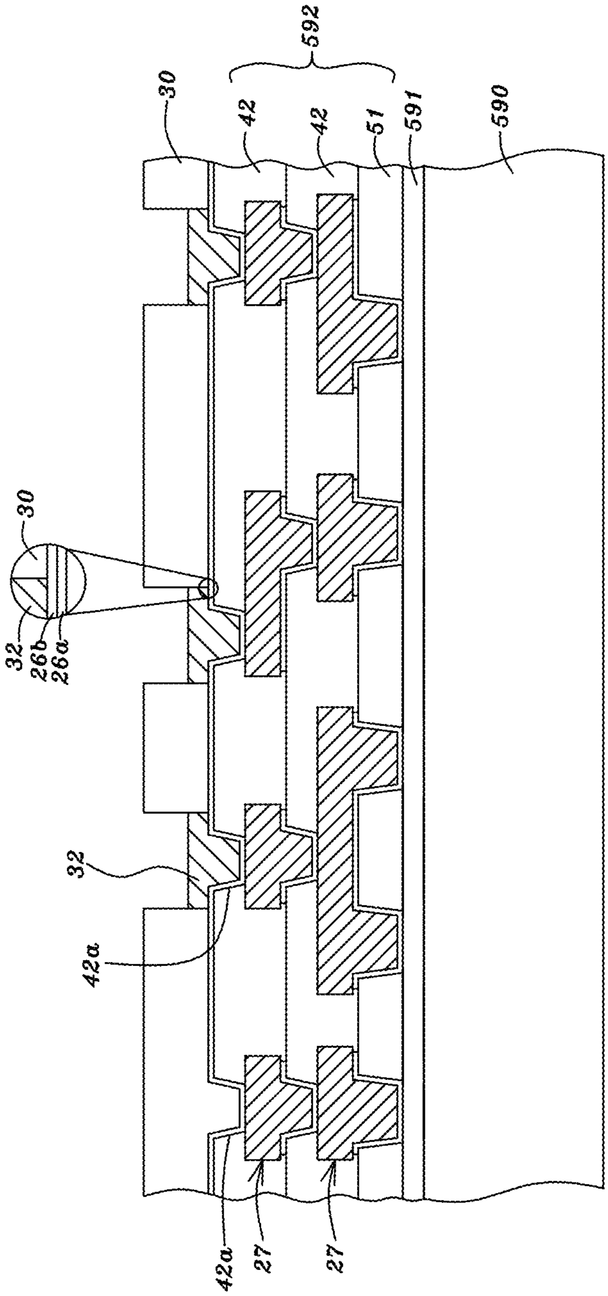

Next, referring to FIG. 28B, a photoresist layer 30 is formed on the seed layer 26*b*. The specification of the photoresist layer 30 as seen in FIG. 28B and the process for forming the same may be referred to those as illustrated in FIG. 21D. Each of openings 30*a* in the photoresist layer 30 may overlap one of the openings 42*a* in the polymer layer 42 for forming one of miro-pillars or micro-bumps in said each of the openings 30*a* by following processes to be performed later, exposing the electroplating seed layer 26*b* at the bottom of said one of the openings 30*a*, and may extend out of said one of the openings 42*a* to an area or ring of the polymer layer 42 around said one of the openings 42*a*.

Next, referring to FIG. 28B, for forming the second type of micro-pillars or micro-bumps, a metal layer 32, such as copper, may be electroplated on the electroplating seed layer 26*b* exposed by the openings 30*a*. The specification of the metal layer 32 as seen in FIG. 28B and the process for forming the same may be referred to those as illustrated in FIGS. 21I and 21J. Alternatively, for forming the first type of micro-pillars or micro-bumps, a metal layer 32, such as copper, may be electroplated on the electroplating seed layer 26*b* exposed by the openings 30*a*, and a solder cap 33 may be electroplated on the metal layer 32. The specification of the metal layer 32 and solder cap 33 illustrated herein and the process for forming the same may be referred to those as illustrated in FIG. 21E.

Figure 28C:
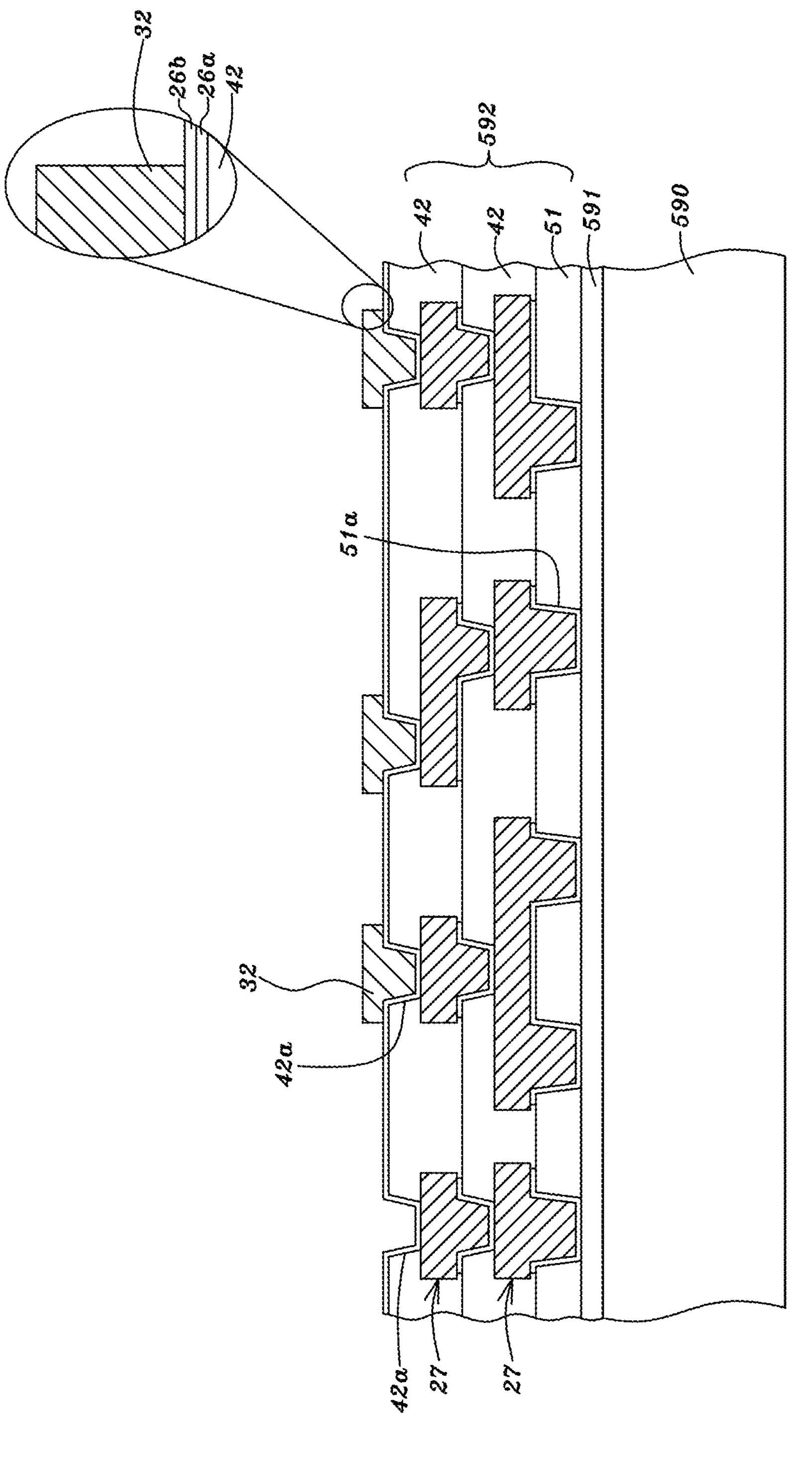

Next, referring to FIG. 28C, most of the photoresist layer 30 may be removed using an organic solution with amide. The process for removing the photoresist layer 30 may be referred to that as illustrated in FIG. 21F.

Figure 28D:
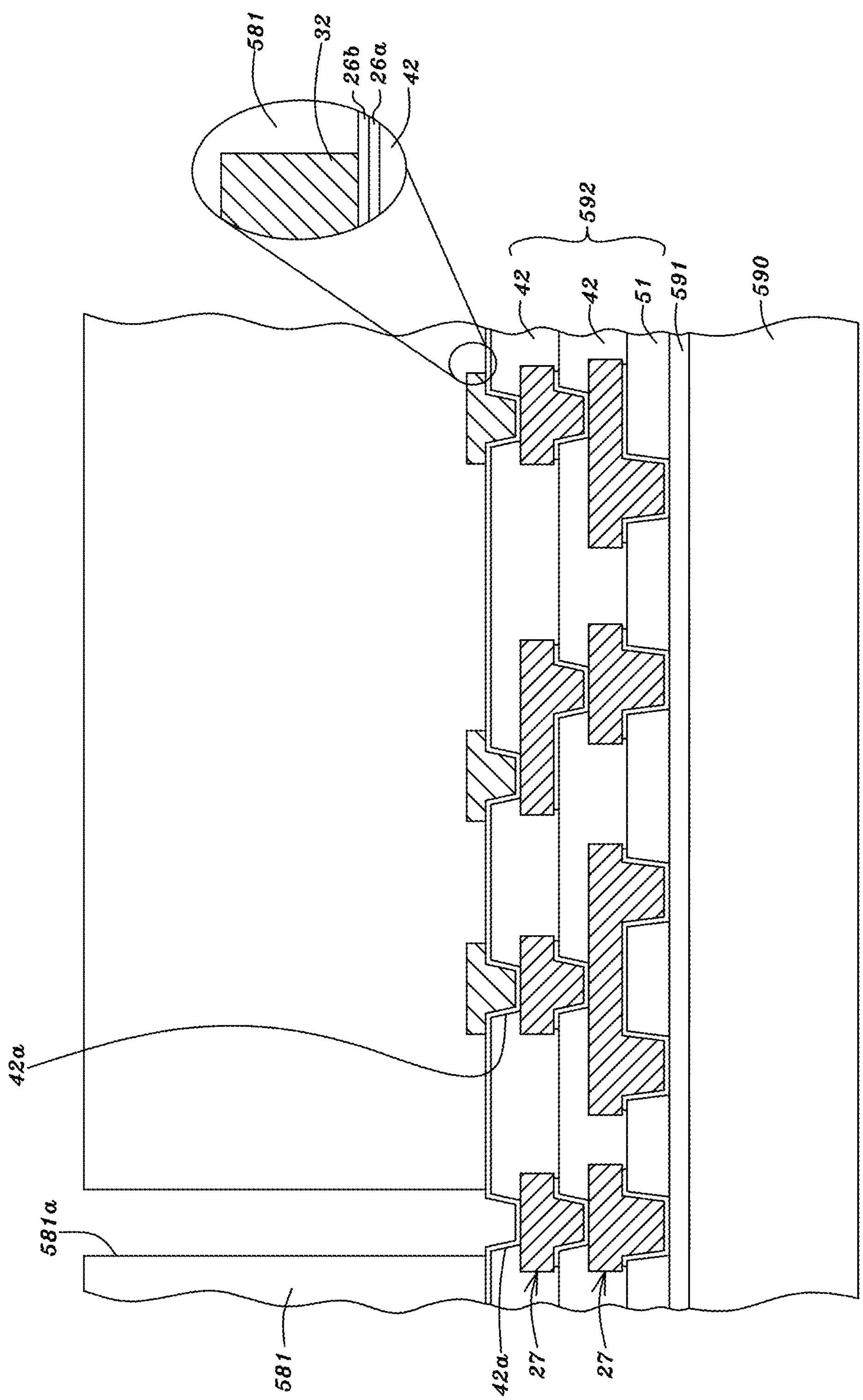

Next, referring to FIG. 28D, a photoresist layer 581 is formed on the electroplating seed layer 26*b* and on the metal layer 32 for forming the second type of micro-pillars or micro-bumps or metal cap 33 for forming the first type of micro-pillars or micro-bumps. The specification of the photoresist layer 581 as seen in FIG. 28D and the process for forming the same may be referred to the specification of the photoresist layer 30 as illustrated in FIG. 21D. Each of openings 581*a* in the photoresist layer 581 may overlap one of the openings 42*a* in the polymer layer 42 for forming one of the through package vias (TPV) in said one of the openings 581*a* by following processes to be performed later, exposing the electroplating seed layer 26*b* at the bottom of said one of the openings 581*a*, and may extend out of said one of the openings 42*a* to an area or ring of the polymer layer 42 around said one of the openings 42*a*. For example, the photoresist layer 581 may have a thickness between 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm.

Figure 28E:
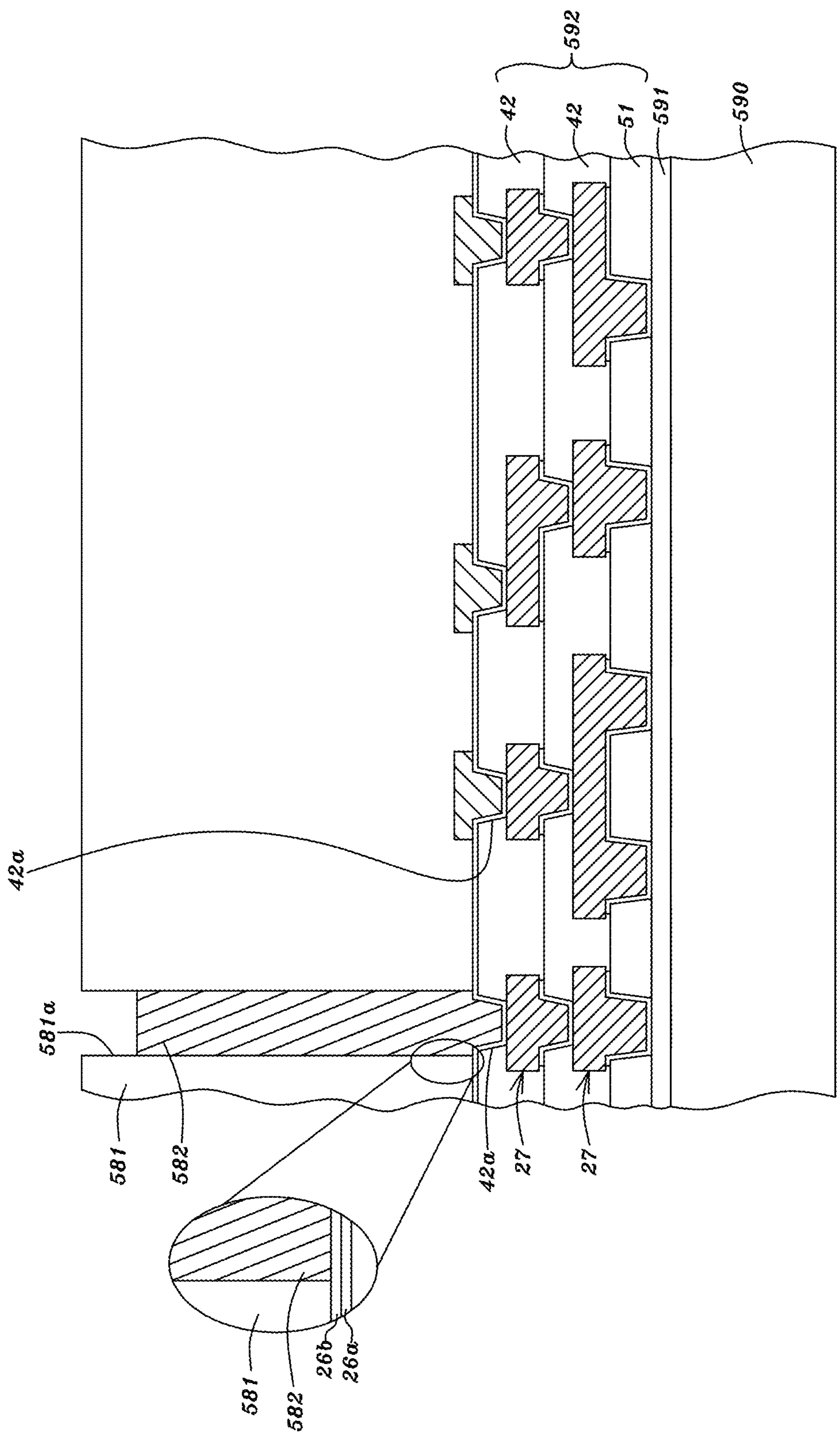

Next, referring to FIG. 28E, a metal layer 582, such as copper, may be electroplated on the electroplating seed layer 26*b* exposed by the openings 581*a*. For example, the metal layer 582 may be formed by electroplating a copper layer with a thickness between 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm on the electroplating seed layer 26*b*, made of copper, exposed by the openings 581*a*.

Figure 28F:
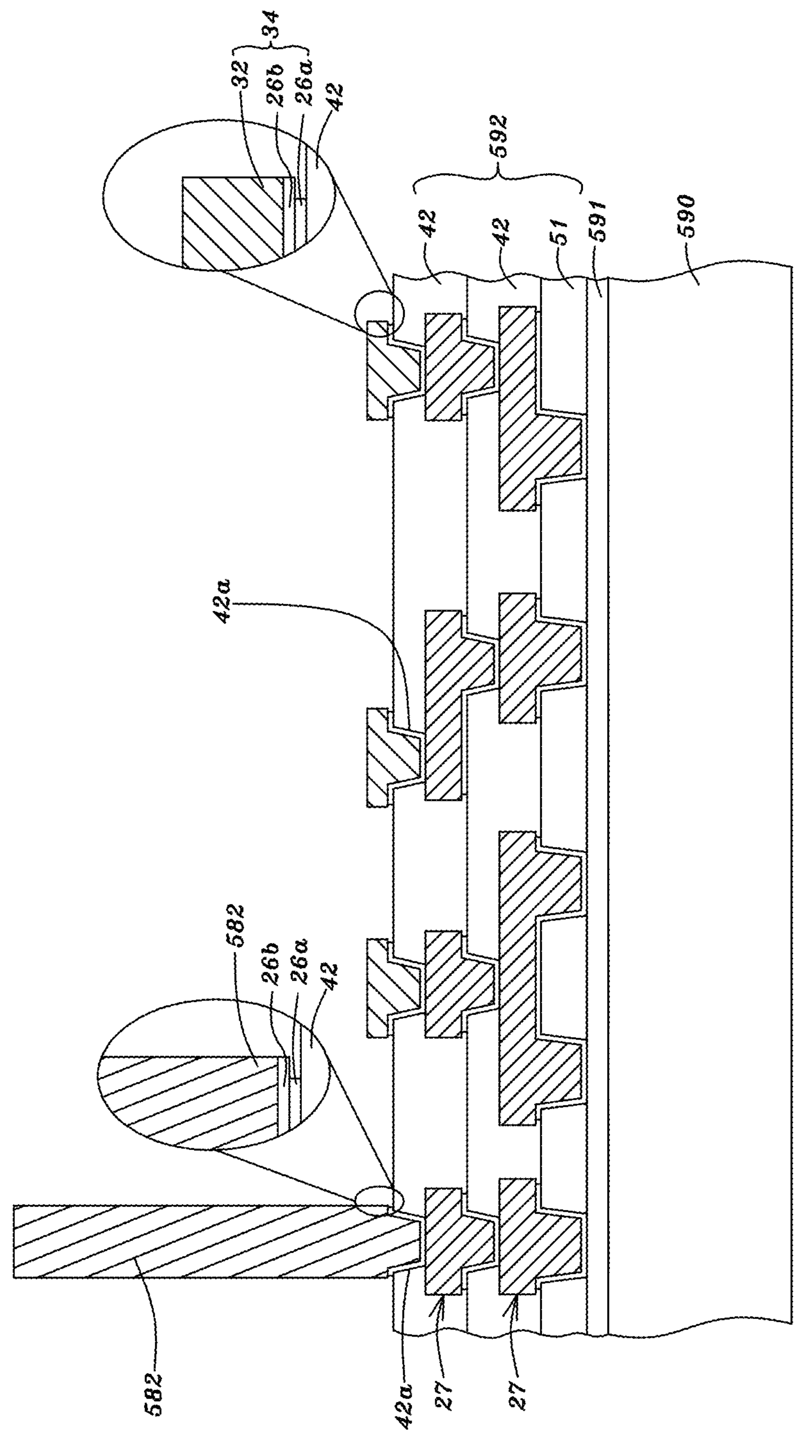

Next, referring to FIG. 28F, most of the photoresist layer 581 may be removed using an organic solution with amide and then the electroplating seed layer 26*b* and adhesion layer 26*a* not under the metal layers 32 and 582 may be etched. The removing and etching processes may be referred respectively to the process for removing the photoresist layer 30 and etching the electroplating seed layer 26*b* and adhesion layer 26*a* as illustrated in FIG. 21F. Thereby, the micro-bumps 34 and through package vias (TPVs) 582 may be formed on the FOISD 592. So far, a first type of temporary substrate (TS) may be provided.

(2) Second Embodiment for Forming TPVs and Micro-Bumps on FOISD

Figure 29A:
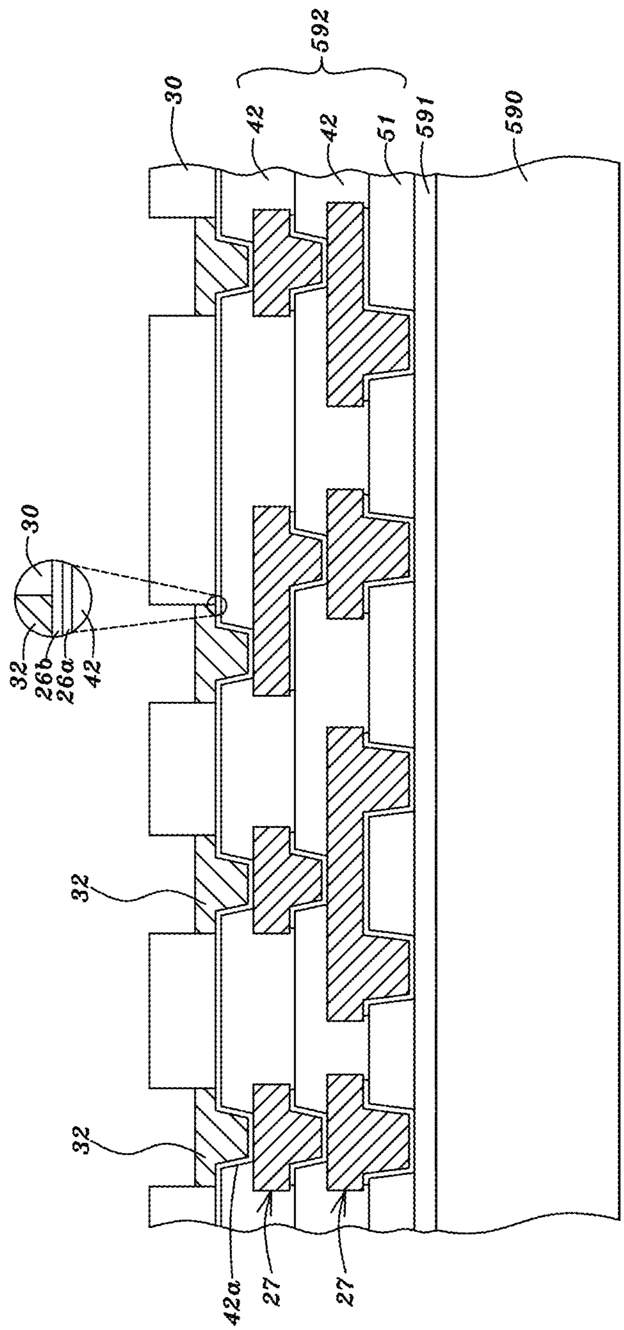
FIGS. 29A-29E are cross-sectional views showing a second process for forming TPVs and micro-bumps or micro-pillars on the FOISD in accordance with the present application.

Alternatively, the TPVs 582 may be formed on the micro-pillars or micro-bumps 34. FIGS. 29A-29E are cross-sectional views showing a second process for forming TPVs and micro-bumps or micro-pillars on the FOISD in accordance with the present application. Referring to FIG. 29A following the step illustrated in FIG. 28A, a photoresist layer 30 is formed on the electroplating seed layer 26*b*. The specification of the photoresist layer 30 as seen in FIG. 29A and the process for forming the same may be referred to those as illustrated in FIG. 21D. Each of openings 30*a* in the photoresist layer 30 may overlap one of the openings 42*a* in the polymer layer 42 for forming one of the micro-pillars or micro-bumps and pads for the TPVs in said one of the openings 30*a* by following processes to be performed later, exposing the electroplating seed layer 26*b* at the bottom of said one of the openings 30*a*, and may extend out of said one of the openings 42*a* to an area or ring of the polymer layer 42 around said one of the openings 42*a*.

Next, referring to FIG. 29A, for forming the second type of micro-pillars or micro-bumps, a metal layer 32, such as copper, may be electroplated on the electroplating seed layer 26*b* exposed by the openings 30*a*. The specification of the metal layer 32 as seen in FIG. 29A and the process for forming the same may be referred to those as illustrated in FIGS. 21I and 21J.

Figure 29B:
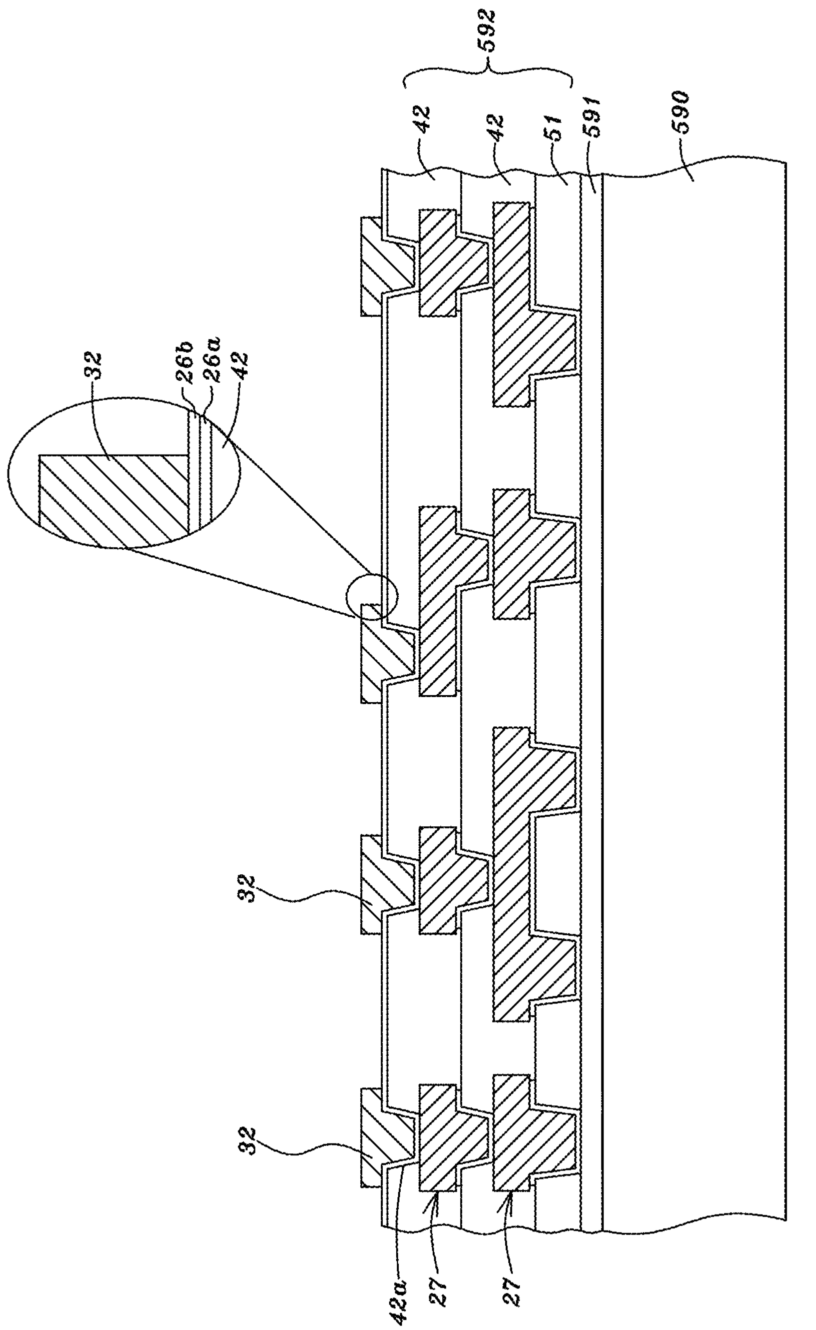

Next, referring to FIG. 29B, most of the photoresist layer 30 may be removed using an organic solution with amide. The process for removing the photoresist layer 30 may be referred to that as illustrated in FIG. 21F.

Figure 29C:
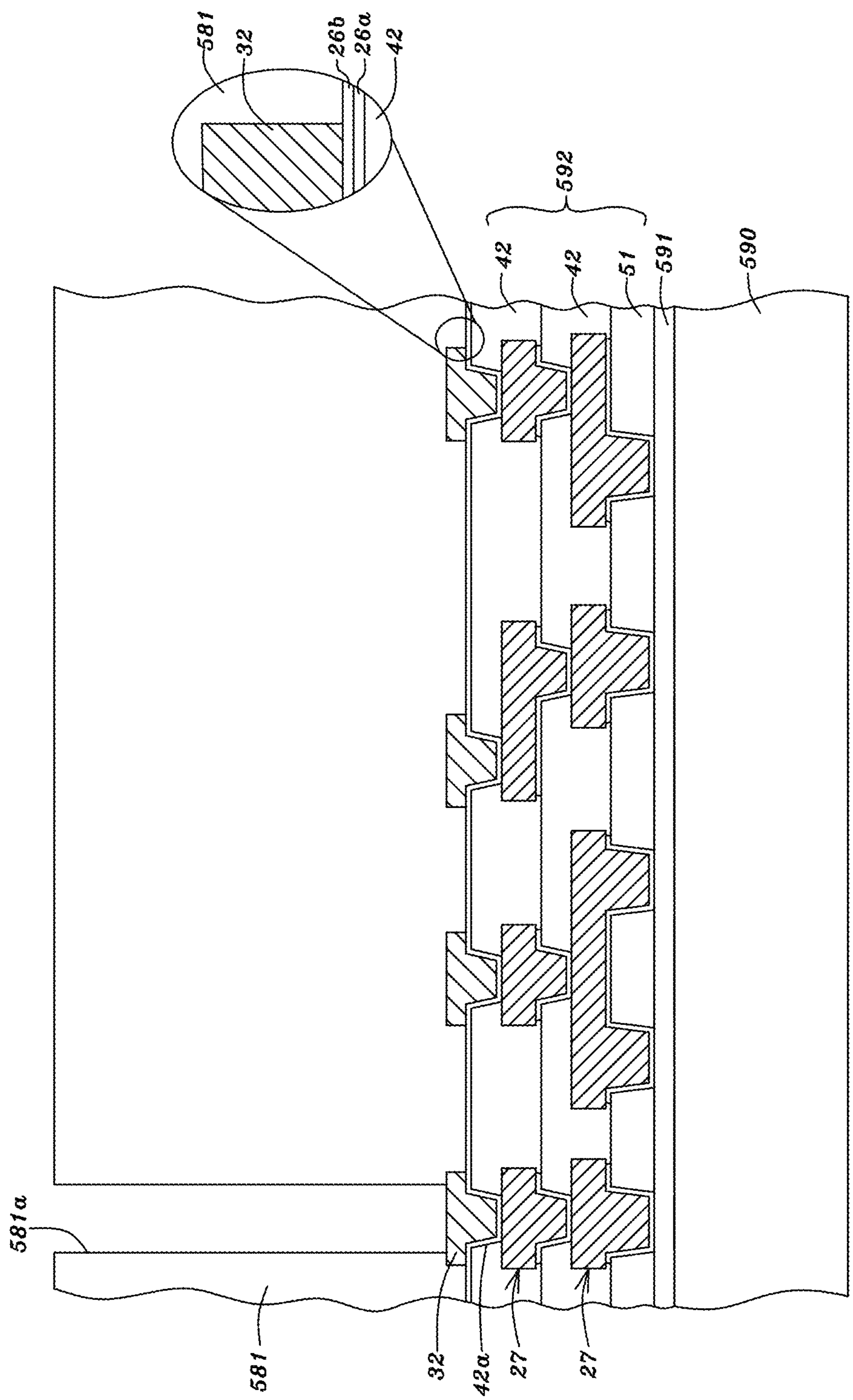

Next, referring to FIG. 29C, a photoresist layer 581 is formed on the electroplating seed layer 26*b* and on the metal layer 32 for forming the second type of micro-pillars or micro-bumps and the pads for the TPVs. The specification of the photoresist layer 581 as seen in FIG. 29C and the process for forming the same may be referred to the specification of the photoresist layer 30 as illustrated in FIG. 21D. Each of openings 581*a* in the photoresist layer 581 may overlap the metal layer 32 for one of the pads for the TPVs and may expose the metal layer 32 for said one of the pads for the TPVs at the bottom of said one of the openings 581*a*. For example, the photoresist layer 581 may have a thickness between 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm.

Figure 29D:
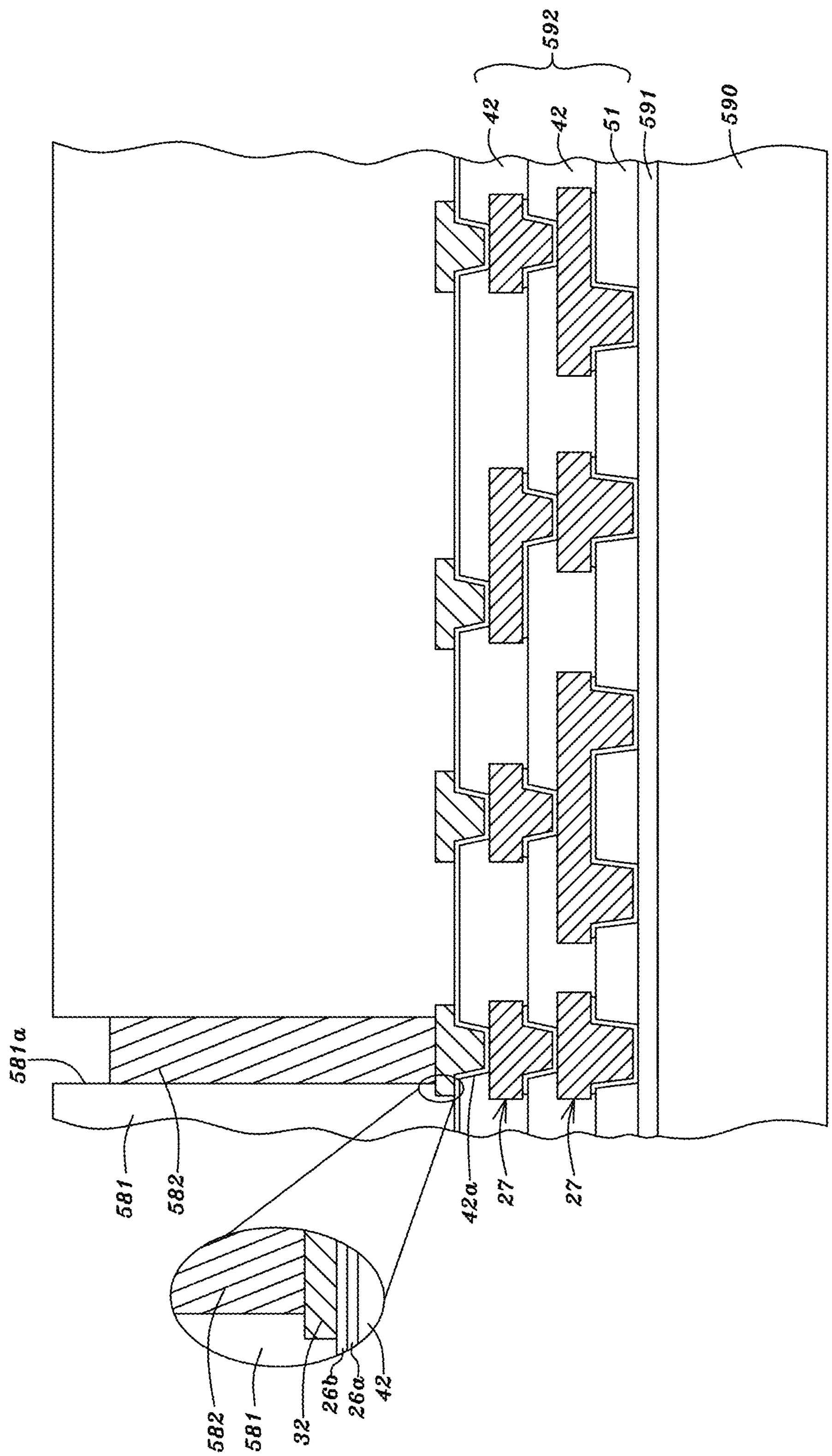

Next, referring to FIG. 29D, a metal layer 582, such as copper, may be electroplated on the metal layer 32 for the pads for the TPVs exposed by the openings 581*a*. For example, the metal layer 582 may be formed by electroplating a copper layer with a thickness between 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm on the metal layer 32 for the pads for the TPVs, made of copper, exposed by the openings 581*a*.

Figure 29E:
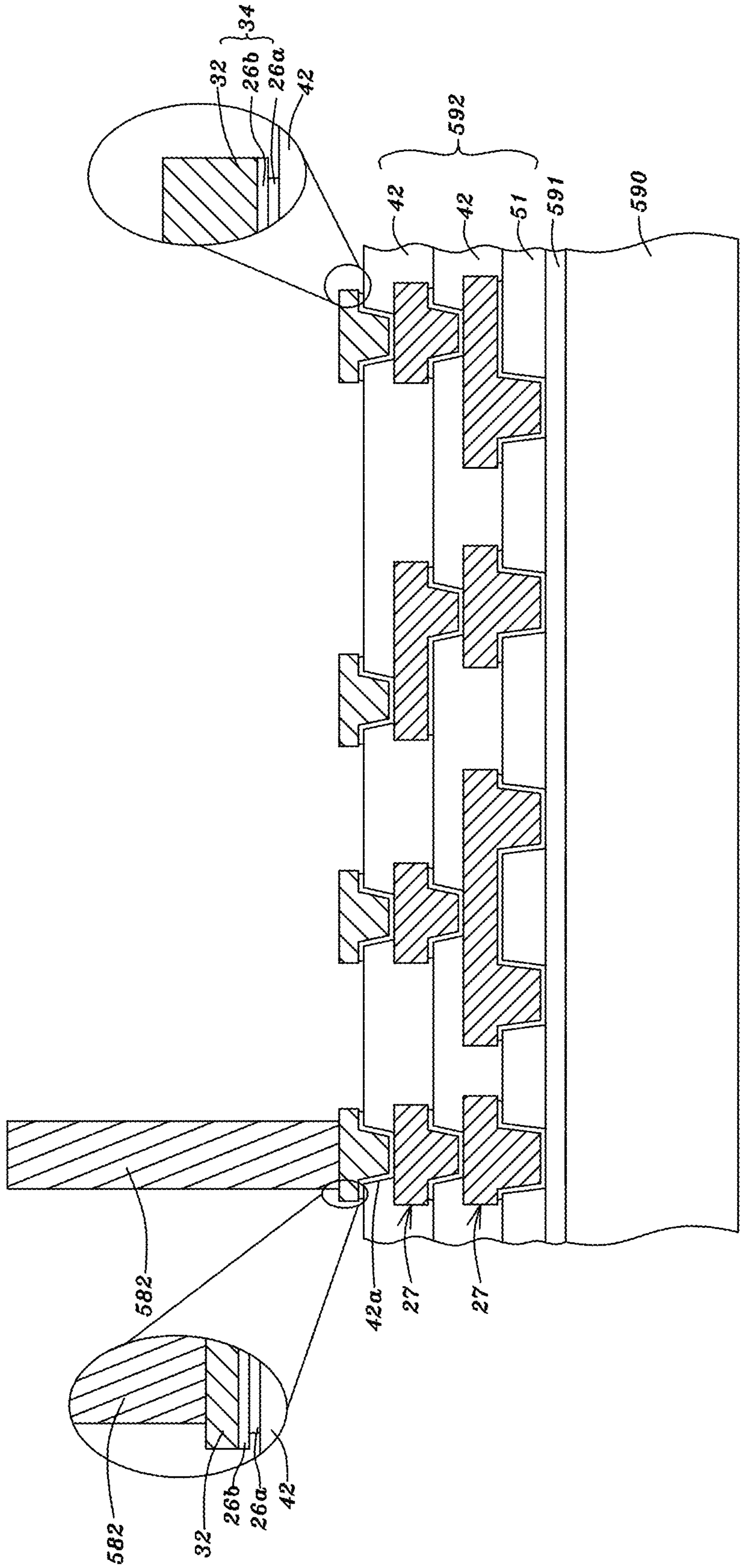

Next, referring to FIG. 29E, most of the photoresist layer 581 may be removed using an organic solution with amide and then the electroplating seed layer 26*b* and adhesion layer 26*a* not under the metal layer 32 may be etched. The removing and etching processes may be referred respectively to the process for removing the photoresist layer 30 and etching the electroplating seed layer 26*b* and adhesion layer 26*a* as illustrated in FIG. 21F. Thereby, the micro-bumps 34 and through package vias (TPVs) 582 may be formed on the FOISD 592. So far, a second type of temporary substrate (TS) may be provided.

(3) Package for FOIT Logic Drive

Figure 30A:
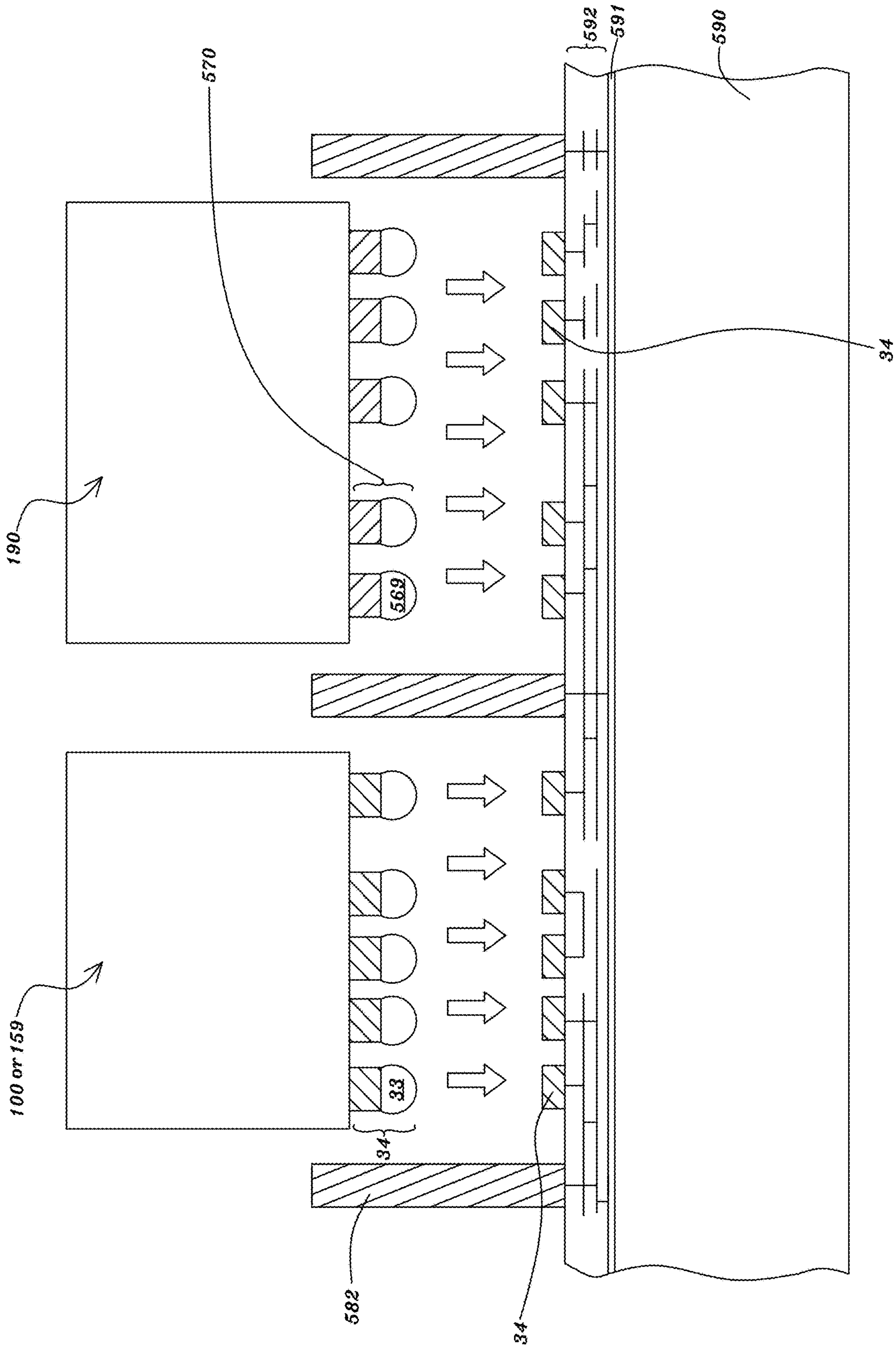
FIGS. 30A-30K are cross-sectional views showing a process for packaging a FOIT logic drive in accordance with an embodiment of the present application.
Figure 30B:
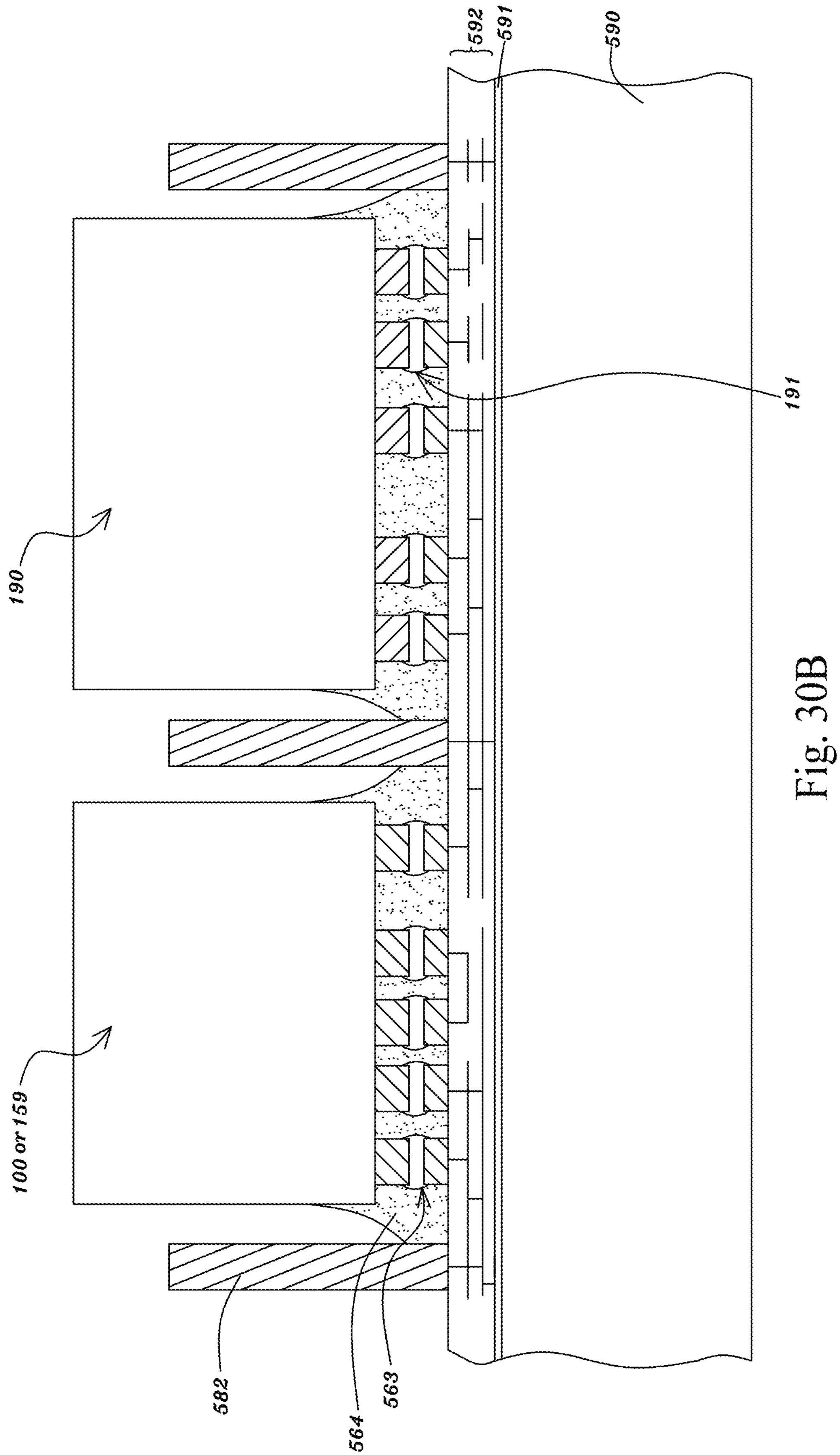

FIGS. 30A-30K are cross-sectional views showing a process for packaging a FOIT logic drive in accordance with an embodiment of the present application. Next, referring to FIG. 30A, each of the semiconductor chips 100 in a single-die type as seen in FIG. 22Y and memory modules 159 as seen in FIG. 23 in a single-module type may have its micro-bumps 34 of the first or second type to be bonded to the first or second type of micro-pillars or micro-bumps 34 of the temporary substrate (TS) of the first or second type as illustrated in FIG. 28F or 29E into multiple bonded contacts 563 as seen in FIG. 30B. The bonding process may be referred to the process for bonding each of the semiconductor chips 100 and/or memory modules 159 to the FOISD 592 as illustrated in FIGS. 25E and 25F.

Further, each of the operation modules 190 as seen in FIG. 24G may have its metal bumps 570 of the first, second or fourth type to be bonded to the first or second type of micro-pillars or micro-bumps 34 of the FOISD 592 as illustrated in FIG. 28F or 29E into the bonded contacts 191 as seen in FIG. 30B. The bonding process may be referred to the process for bonding each of the operation modules 190 to the FOISD 592 as illustrated in FIGS. 25E and 25F.

Figure 30C:
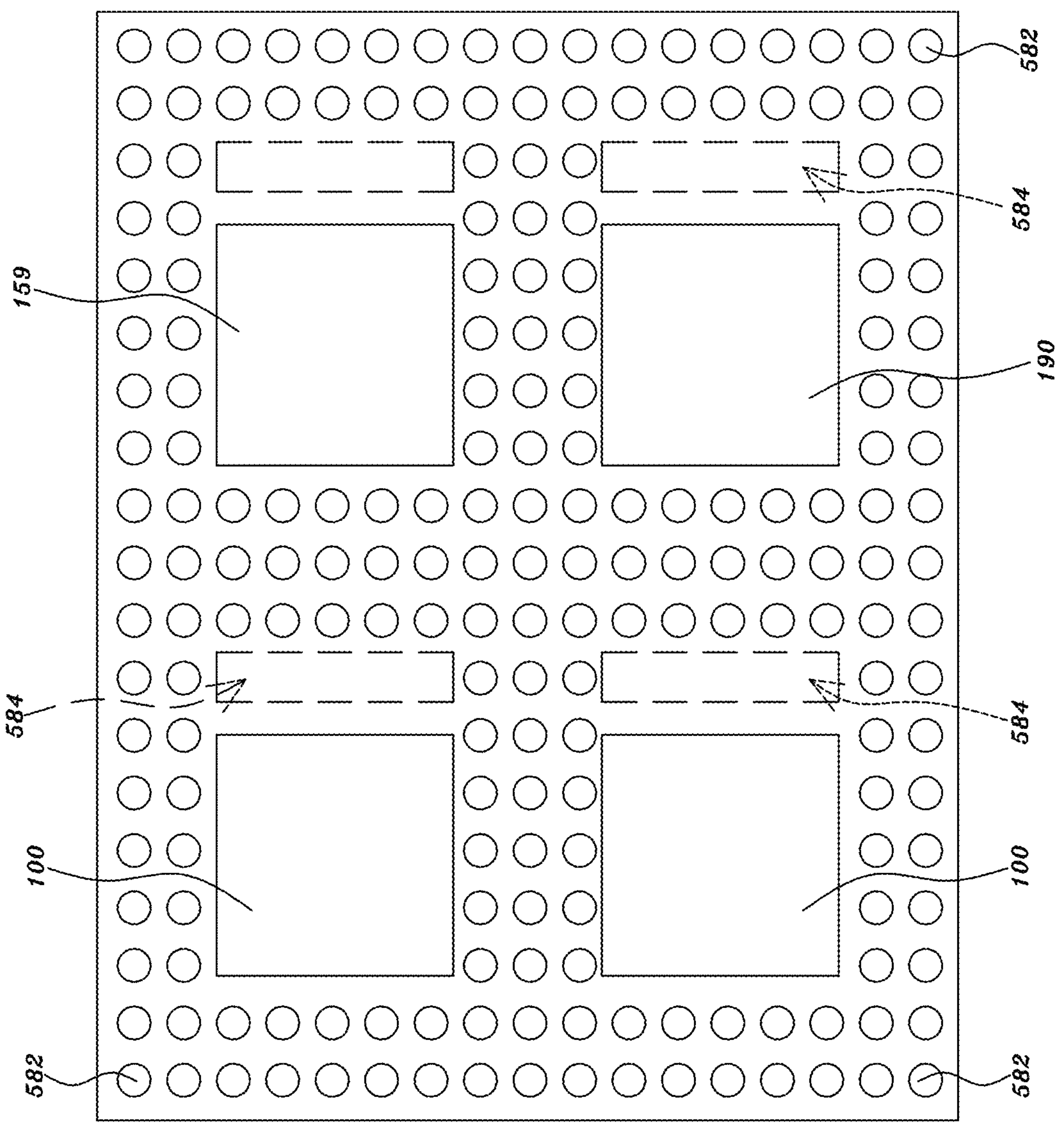

Next, referring to FIG. 30B, an underfill 564, such as epoxy resins or compounds, may be filled into a gap between each of the semiconductor chips 100 and/or memory modules 159 and the FOISD 592 as illustrated in FIG. 28F or 29E and/or a gap between each of the operation modules 190 and the FOISD 592 by a dispensing method performed using a dispenser. The underfill 564 may then be cured at temperature equal to or above 100° C., 120° C., or 150° C. FIG. 30C is a top view showing a path for a dispenser moving to fill an underfill into a gap between a semiconductor chip and the FOISD, a gap between a memory module and the FOISD and a gap between an operation module and the FOISD in accordance with the present application. Referring to FIG. 30C, a dispenser may move along multiple paths or clearness 584 each arranged between multiple of the TPVs 582 arranged in a line and one of the semiconductor chips 100, memory modules 159 and/or operation modules 190 to dispense the underfill 564 into the gap between said one of the semiconductor chips 100, memory modules 159 and/or operation modules 190 and the FOISD 592 as illustrated in FIG. 30B.

Figure 30D:
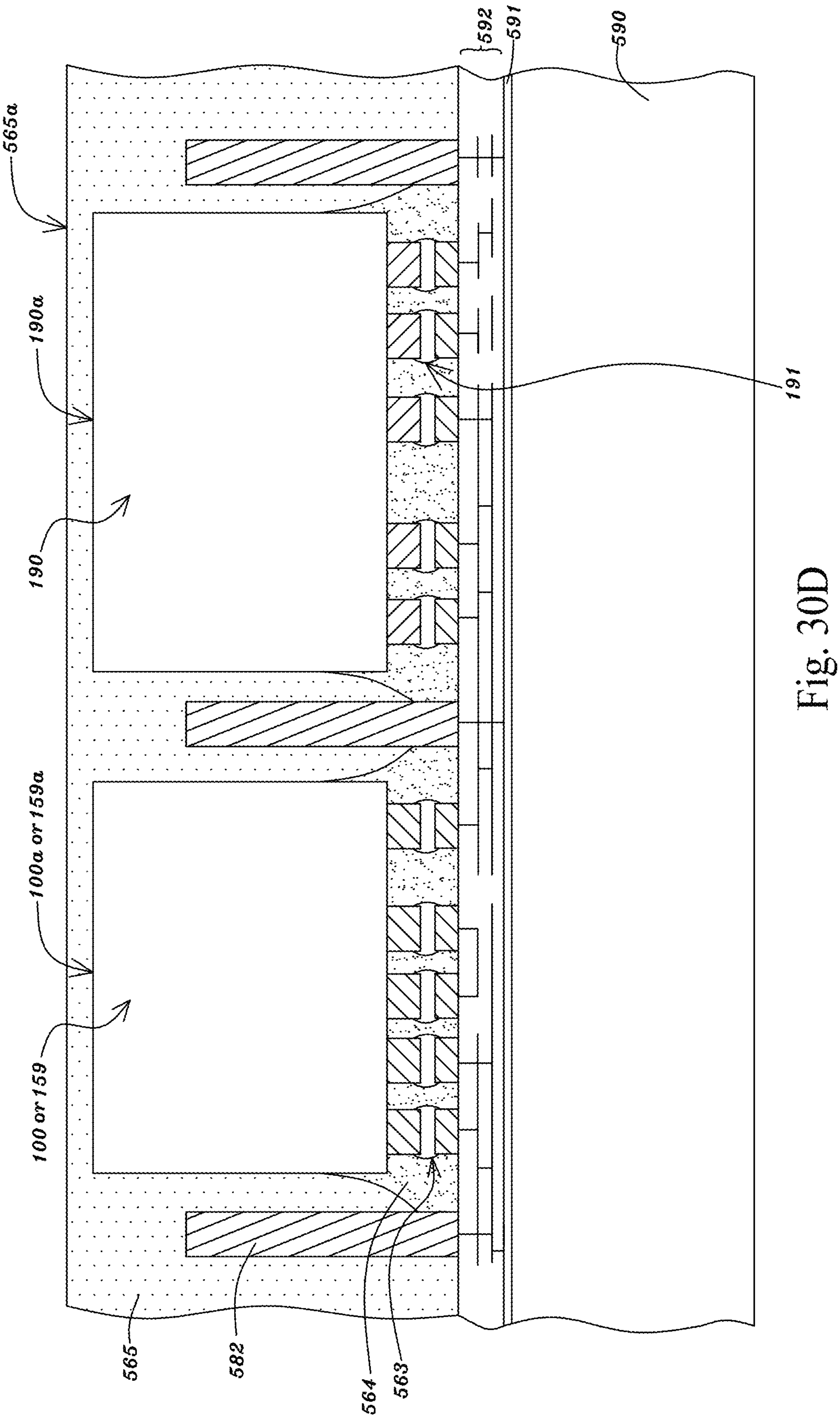

Next, referring to FIG. 30D, a polymer layer 565, e.g., resin or compound, may be applied to fill multiple gaps each between neighboring two of the semiconductor chips 100, between neighboring two of the memory modules 159, between neighboring two of the operation modules 190, between one of the semiconductor chips 100 and one of the memory modules 159, between one of the semiconductor chips 100 and one of the operation modules 190, or between one of the memory modules 159 and one of the operation modules 190 and multiple gaps each between neighboring two of the TPVs 582, to cover the backside 100*a* of each of the semiconductor chips 100 and a backside 159*b* of each of the memory modules 159 and/or a backside 190*a* of each of the operation modules 190, wherein said each of the memory modules 159 has its backside 159*b* composed of the backside of the topmost one of its memory chips 687 and the top surface of its molding compound 695 as seen in FIG. 23, and said each of the operation modules 190 has its backside 190*a* composed of the backside 159*a* or 195*a* of its memory module 159 or memory chip 195 and a top surface of its molding compound 565 as seen in FIG. 34G, and to cover the tips of the TPVs 582 by methods, for example, spin-on coating, screen-printing, dispensing or molding in a wafer or panel format. The specification of the polymer layer 565 and the process for forming the same may be referred to those as illustrated in FIG. 25G.

Figure 30E:
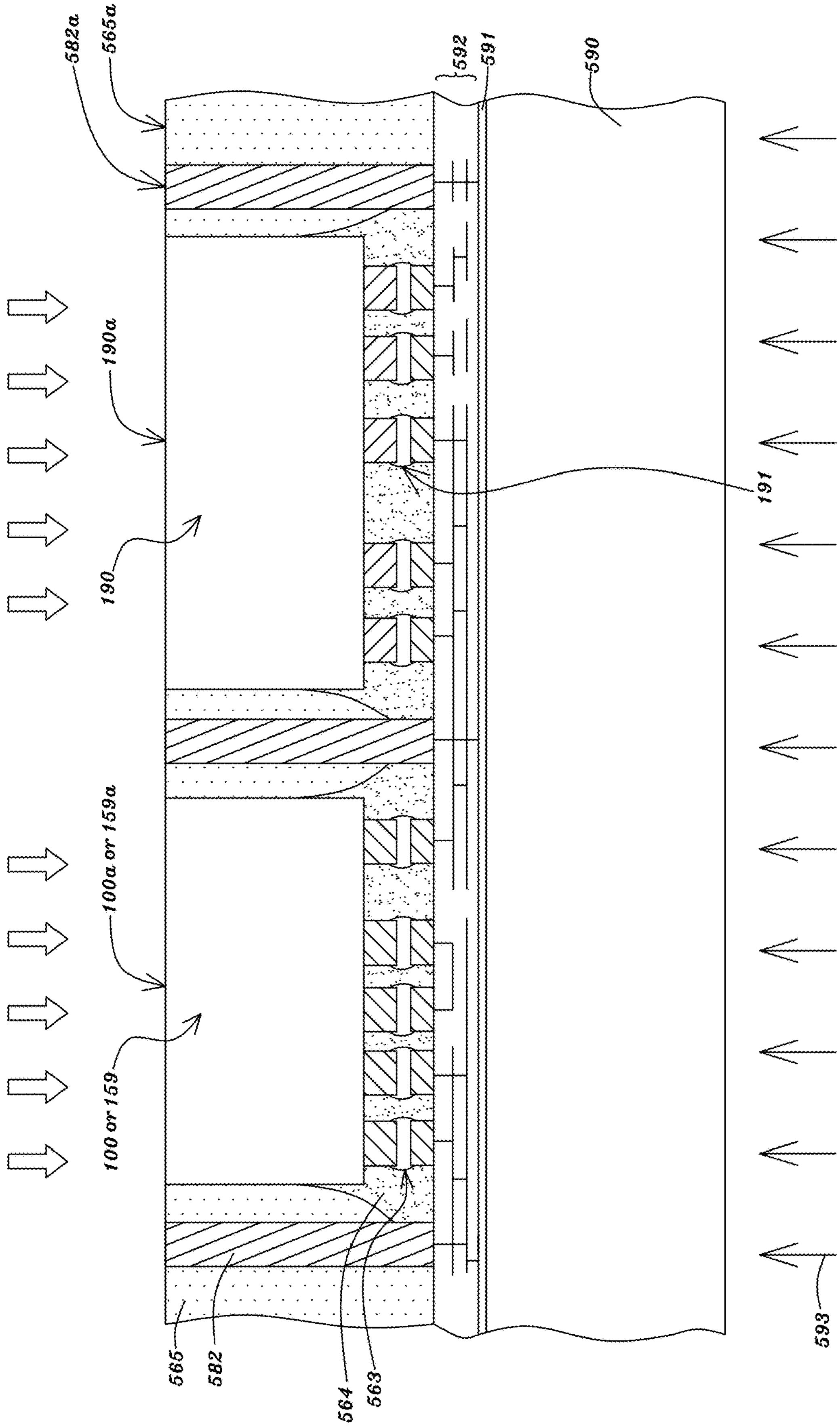

Next, referring to FIG. 30E, a chemical mechanical polishing (CMP), polishing or grinding process may be applied to remove a backside 565*a* of the polymer layer 565 and a top portion of each of the semiconductor chips 100, memory modules 159 and/or operation modules 190 and to planarize a backside 565*a* of the polymer layer 565 and the backside 100*a*, 159*b* or 190*a* of said each of the semiconductor chips 100, memory modules 159 and/or operation modules 190 and a tip 582*a* of each of the TPVs 582 until the tip 582*a* of said each of the TPVs 582 is fully exposed.

Figure 30F:
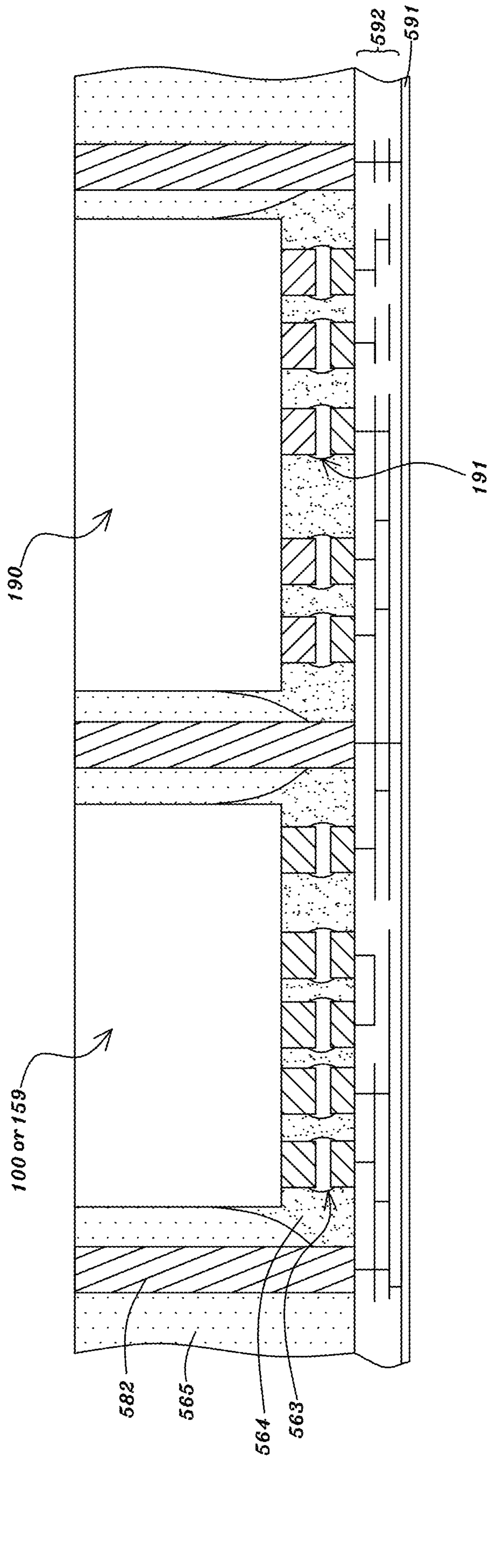
Figure 30G:
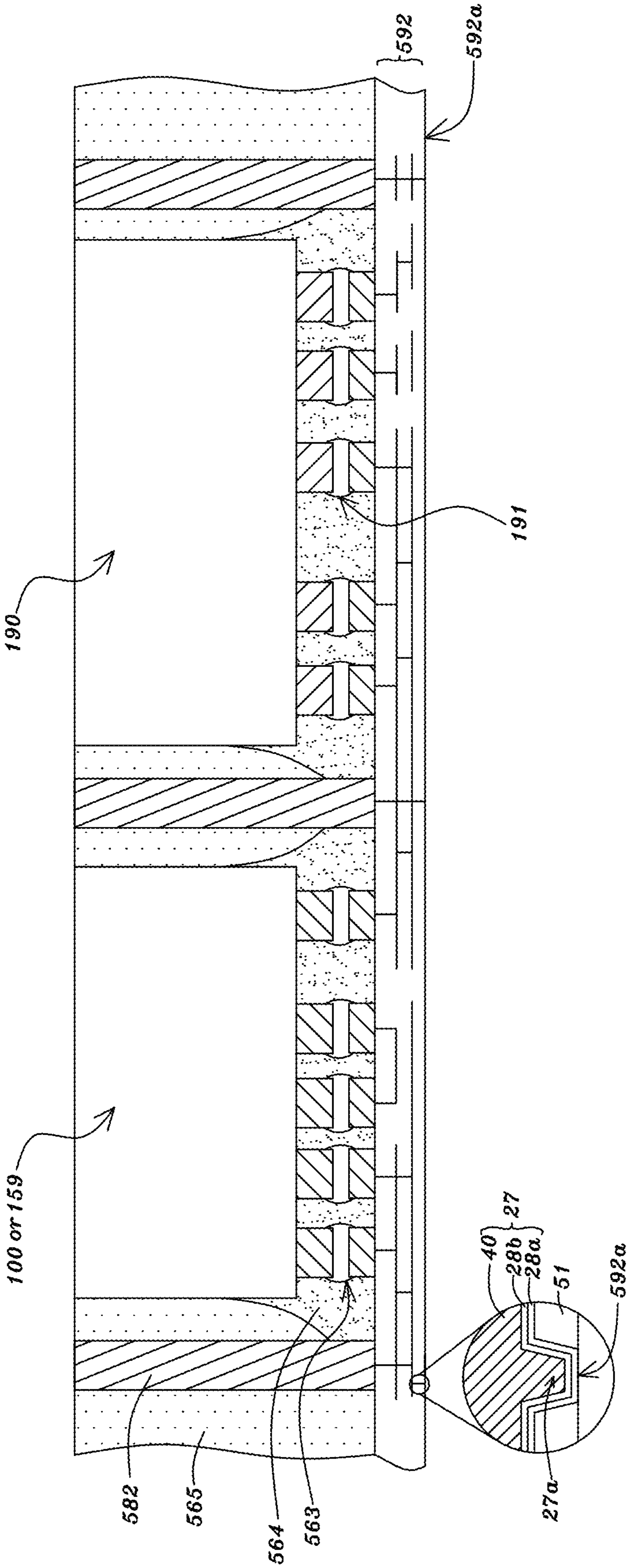

Next, referring to FIGS. 30E-30G, the temporary substrate (T-sub) 590 and sacrificial bonding layer 591 may be released from the FOISD 592. The process for releasing the temporary substrate (T-sub) 590 and sacrificial bonding layer 591 from the FOISD 592 may be referred to that as illustrated in FIGS. 25H-25J. Thereby, for the FOISD 592, each of the metal vias 27*a* of its bottommost interconnection metal layer 27 in its bottommost polymer layer 51 is exposed as a contact to join a metal pad, pillar or bump, that is, the adhesion layer 28*a* of its bottommost interconnection metal layer 27 is exposed at the surface of the contact.

Figure 30H:
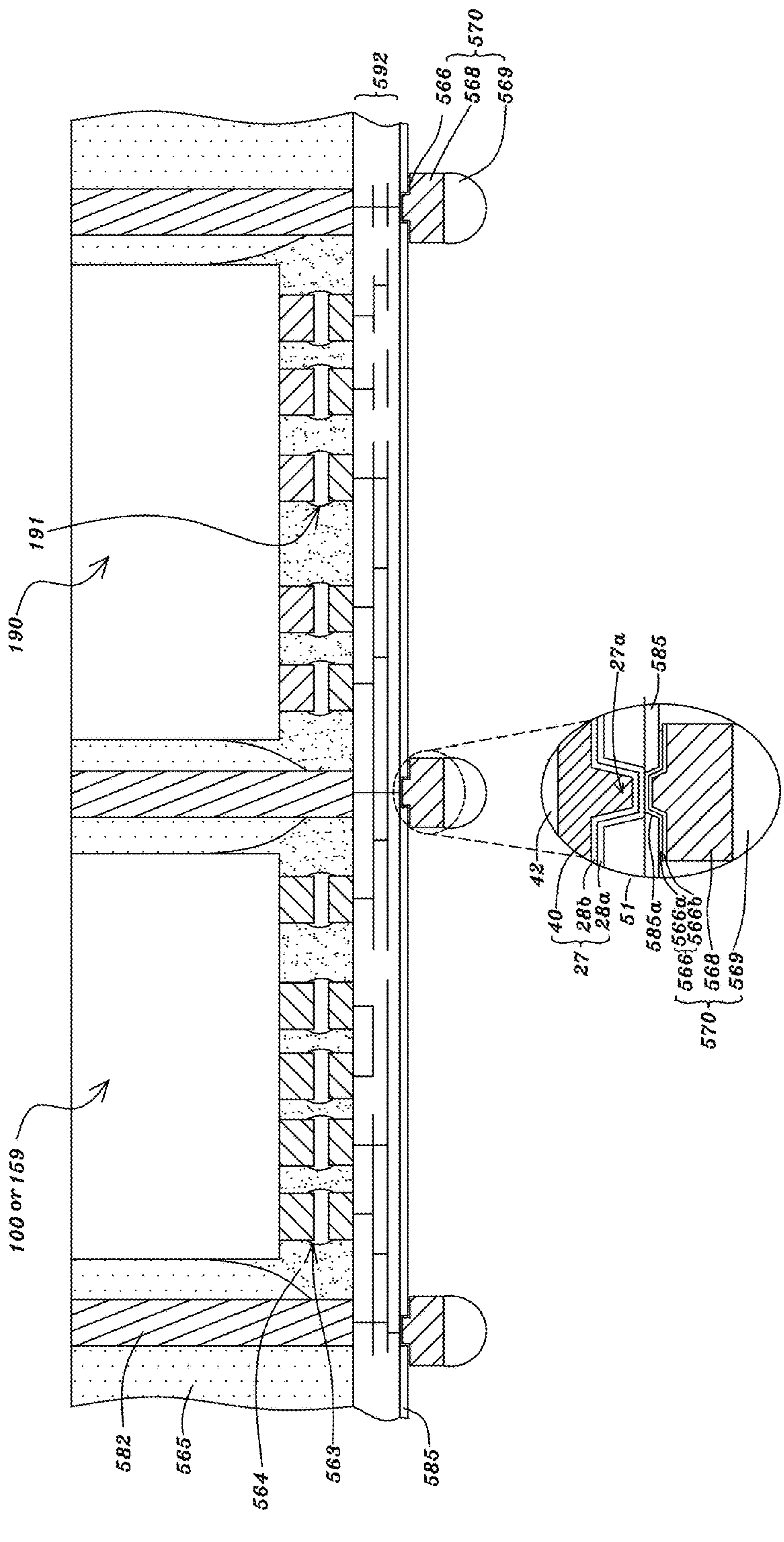

Referring to FIG. 30H, after the sacrificial bonding layer 591 is released as illustrated in FIG. 30G, a polymer layer 585, i.e., insulating dielectric layer, may be formed on the backside 592*a* of the FOISD 592 and the backsides of the metal vias 27*a*, and multiple openings 585*a* in the polymer layer 585 are formed over and expose the metal vias 27*a*. The specification of the polymer layer 585 on the FOISD 592 and the process for forming the same may be referred to those as illustrated in FIG. 26A.

Referring to FIG. 30H, after the polymer layer 585 is formed on the FOISD 592, multiple metal pads, pillars or bumps 570 may be formed on the metal vias 27*a* of the bottommost one of the interconnection metal layers 27 of the FOISD 592 at close ends of the openings 585*a* in the polymer layer 585. The specification of the metal pads, pillars or bumps 570 and the process for forming the same may be referred to those as illustrated in FIGS. 26B and 26C.

Figure 30I:
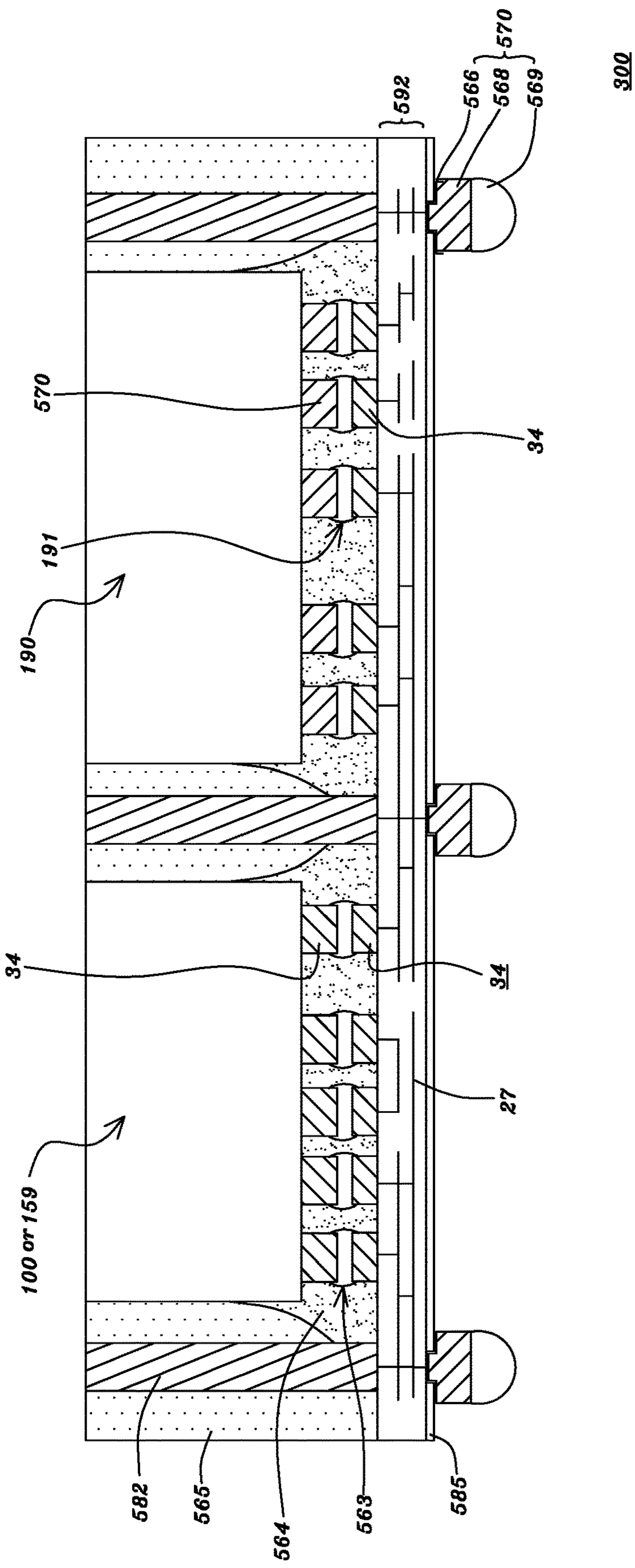

Next, the package structure shown in FIG. 30H may be separated, cut or diced into multiple individual chip packages, i.e., standard commodity FOIT logic drives 300 or single-layer-packaged logic drive, as shown in FIG. 30I by a laser cutting process or by a mechanical cutting process.

Figure 30J:
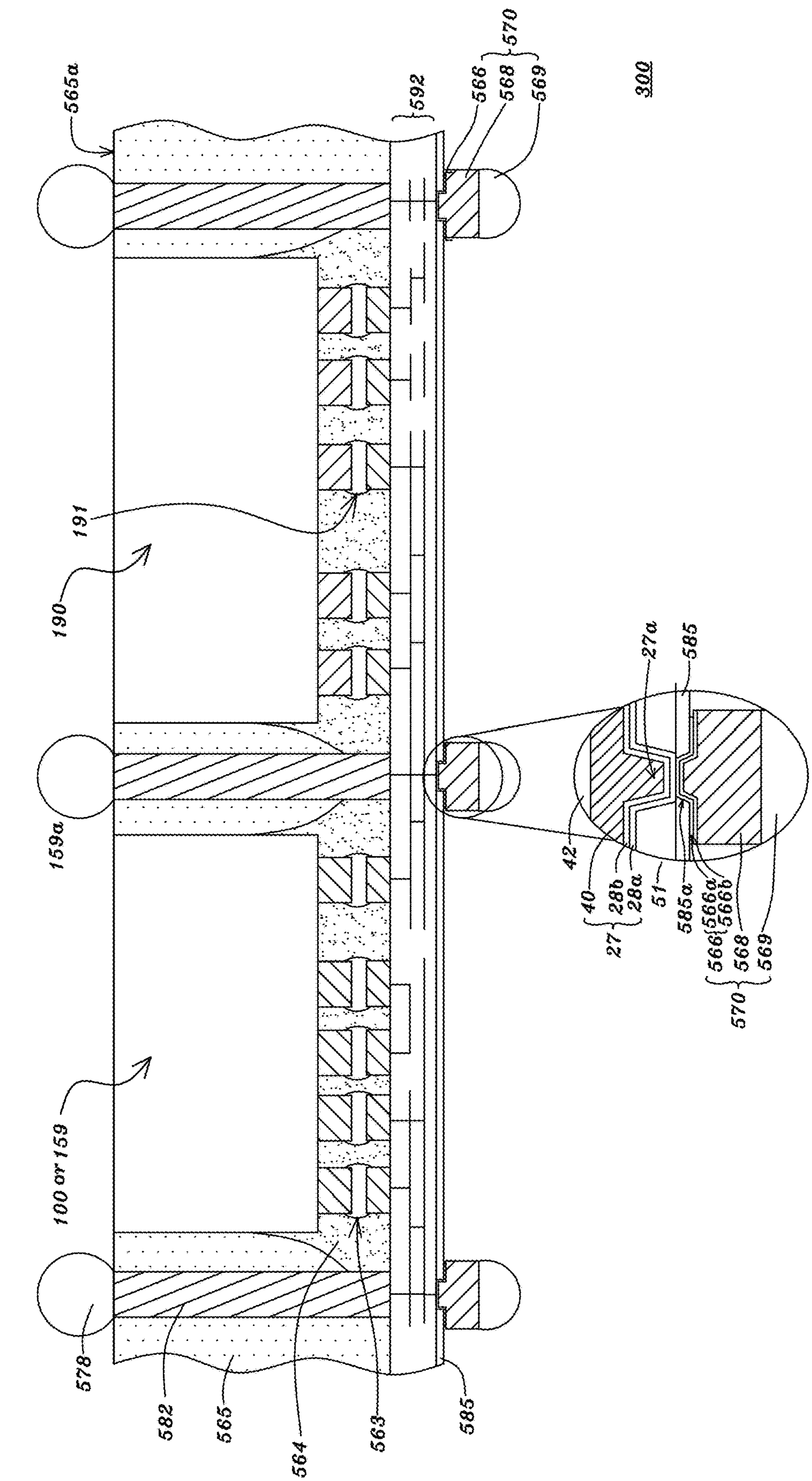
Figure 30K:
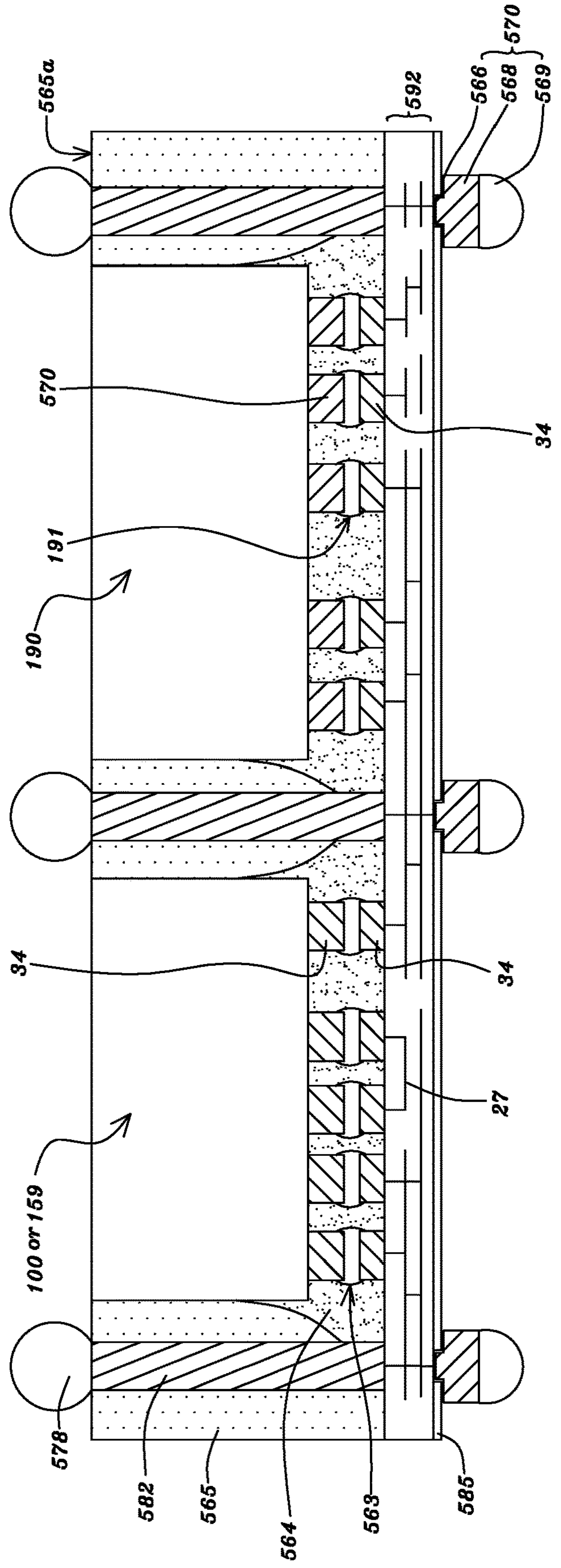

Alternatively, referring to FIG. 30J, after the metal bumps 570 are formed at the backside of the FOISD 592 as seen in FIG. 30H, multiple solder bumps 578 may be formed on the exposed tips of the TPVs 582 by a method of screen printing or solder ball mounting. Next, the package structure shown in FIG. 30J formed with the solder bumps 578 may be separated, cut or diced into multiple individual chip packages, i.e., standard commodity FOIT logic drives 300 or single-layer-packaged logic drive, as shown in FIG. 30K by a laser cutting process or by a mechanical cutting process. The solder bumps 578 may join an external electronic component to connect the FOIT logic drive 300 to the external electronic component. The material used for forming the solder bumps 578 may be a lead-free solder containing tin, copper, silver, bismuth, indium, zinc, antimony, and/or traces of other metals, for example, Sn—Ag—Cu (SAC) solder, Sn—Ag solder, or Sn—Ag—Cu—Zn solder. Each of the solder bumps 578 may have a height, from a backside surface 565*a* of the polymer layer 565, between 5

μm and 150 μm, between 5 μm and 120 μm, between 10 μm and 100 μm, between 10 μm and 60 μm, between 10 μm and 40 μm or between 10 μm and 30 μm, or greater or taller than or equal to 75 μm, 50 μm, 30 μm, 20 μm, 15 μm or 10 μm, for example, and a largest dimension in cross-sections, such as a diameter of a circle shape or a diagonal length of a square or rectangle shape, between 5 μm and 200 μm, between 5 μm and 150 μm, between 5 μm and 120 μm, between 10 μm and 100 μm, between 10 μm and 60 μm, between 10 μm and 40 μm, or between 10 μm and 30 μm, or greater than or equal to 100 μm, 60 μm, 50 μm, 40 μm, 30 μm, 20 μm, 15 μm or 10 μm, for example. The smallest space from one of the solder bumps 578 to its nearest neighboring one of the solder bumps 578 of the fifth type is, for example, between 5 μm and 150 μm, between 5 μm and 120 μm, between 10 μm and 100 μm, between 10 μm and 60 μm, between 10 μm and 40 μm, or between 10 μm and 30 μm, or greater than or equal to 60 μm, 50 μm, 40 μm, 30 μm, 20 μm, 15 μm or 10 μm.

The standard commodity FOIT logic drive 300 as shown in FIG. 30I or 30K may be in a shape of square or rectangle with a certain widths, lengths and thicknesses. An industry standard may be set for the shape and dimensions of the standard commodity FOIT logic drive 300. For example, the standard shape of the FOIT logic drive 300 may be a square with a width greater than or equal to 4 mm, 7 mm, 10 mm, 12 mm, 15 mm, 20 mm, 25 mm, 30 mm, 35 mm or 40 mm, and a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the standard commodity FOIT logic drive 300 may be a rectangle with a width greater than or equal to 3 mm, 5 mm, 7 mm, 10 mm, 12 mm, 15 mm, 20 mm, 25 mm, 30 mm, 35 mm or 40 mm, a length greater than or equal to 5 mm, 7 mm, 10 mm, 12 mm, 15 mm, 20 mm, 25 mm, 30 mm, 35 mm, 40 mm, 45 mm or 50 mm, and a thickness greater than or equal to 0.03 mm, 0.05 mm, 0.1 mm, 0.3 mm, 0.5 mm, 1 mm, 2 mm, 3 mm, 4 mm, or 5 mm. Furthermore, the metal bumps or pillars 570 at a backside of the FOISD 592 in the logic drive 300 may be in a standard footprint, for example, in an area array of M×N with a standard dimension of pitch and space between neighboring two of the metal bumps or pillars 570. The locations of the metal bumps or pillars 570 are also at a standard location.

Package-on-Package (POP) or Stack-Package Assembly for FOIT LOGIC Drives

Figure 31A:
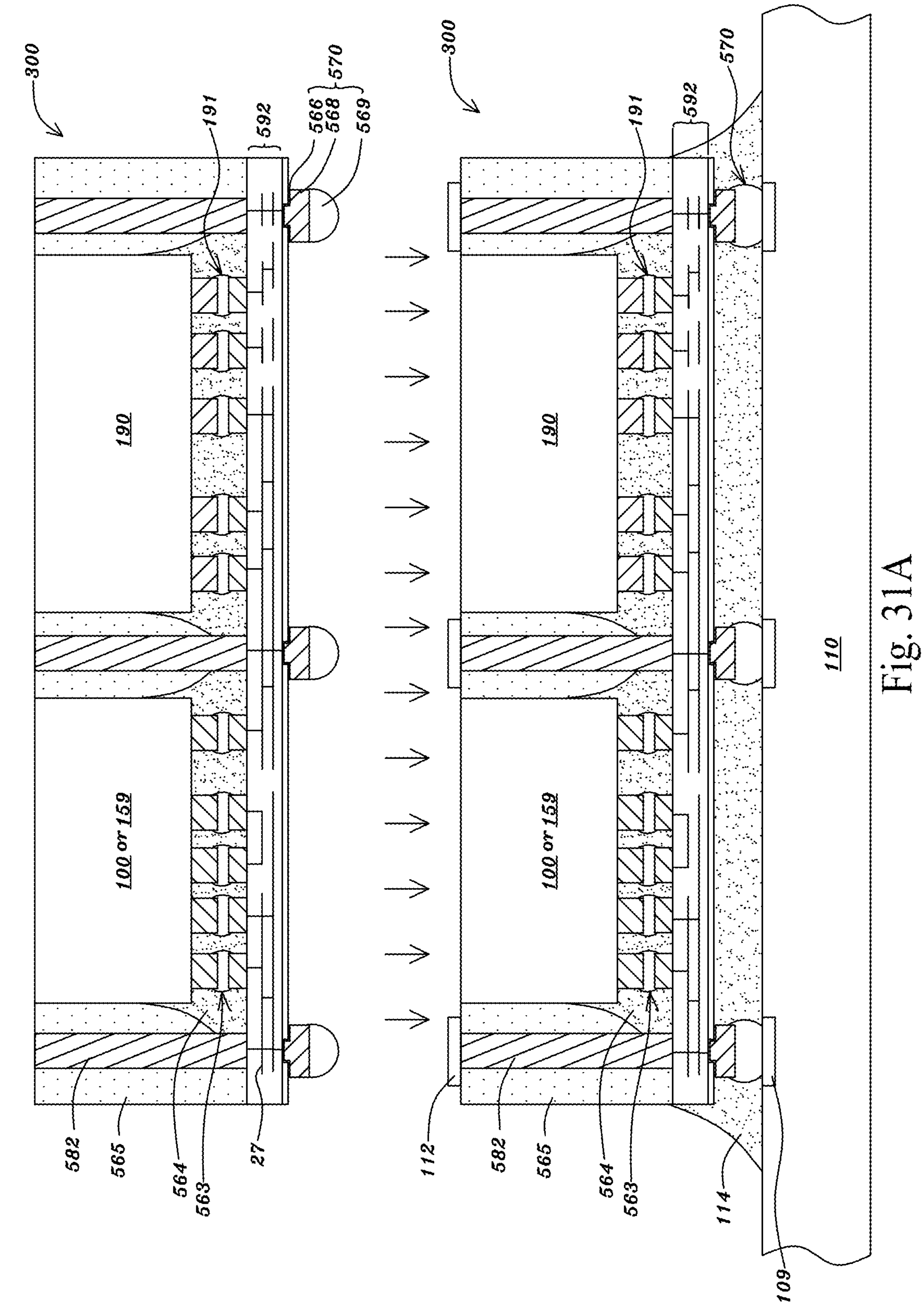
FIGS. 31A-31F are schematically views showing a process for fabricating a package-on-package assembly in accordance with an embodiment of the present application.
Figure 31B:
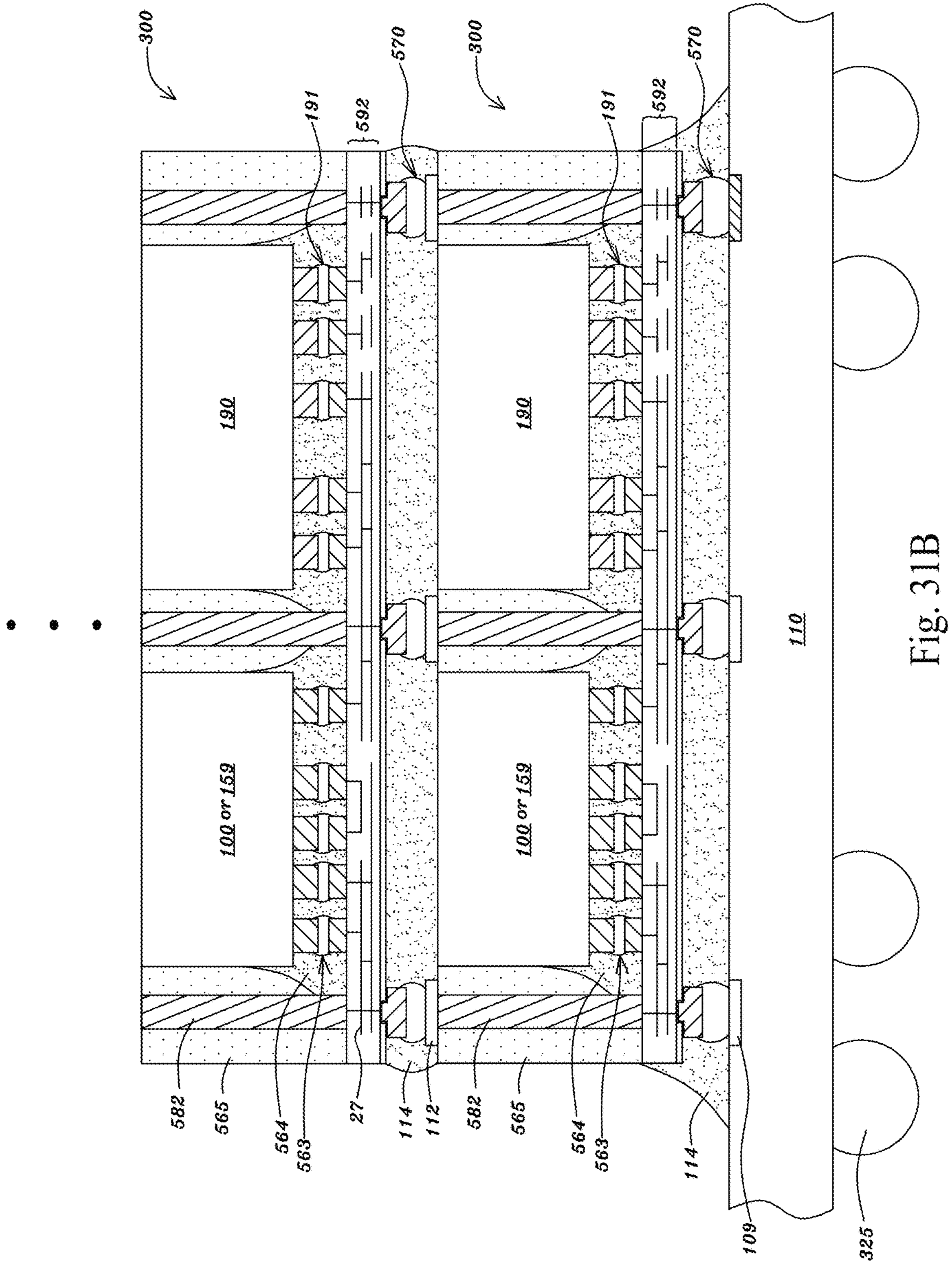
Figure 31C:
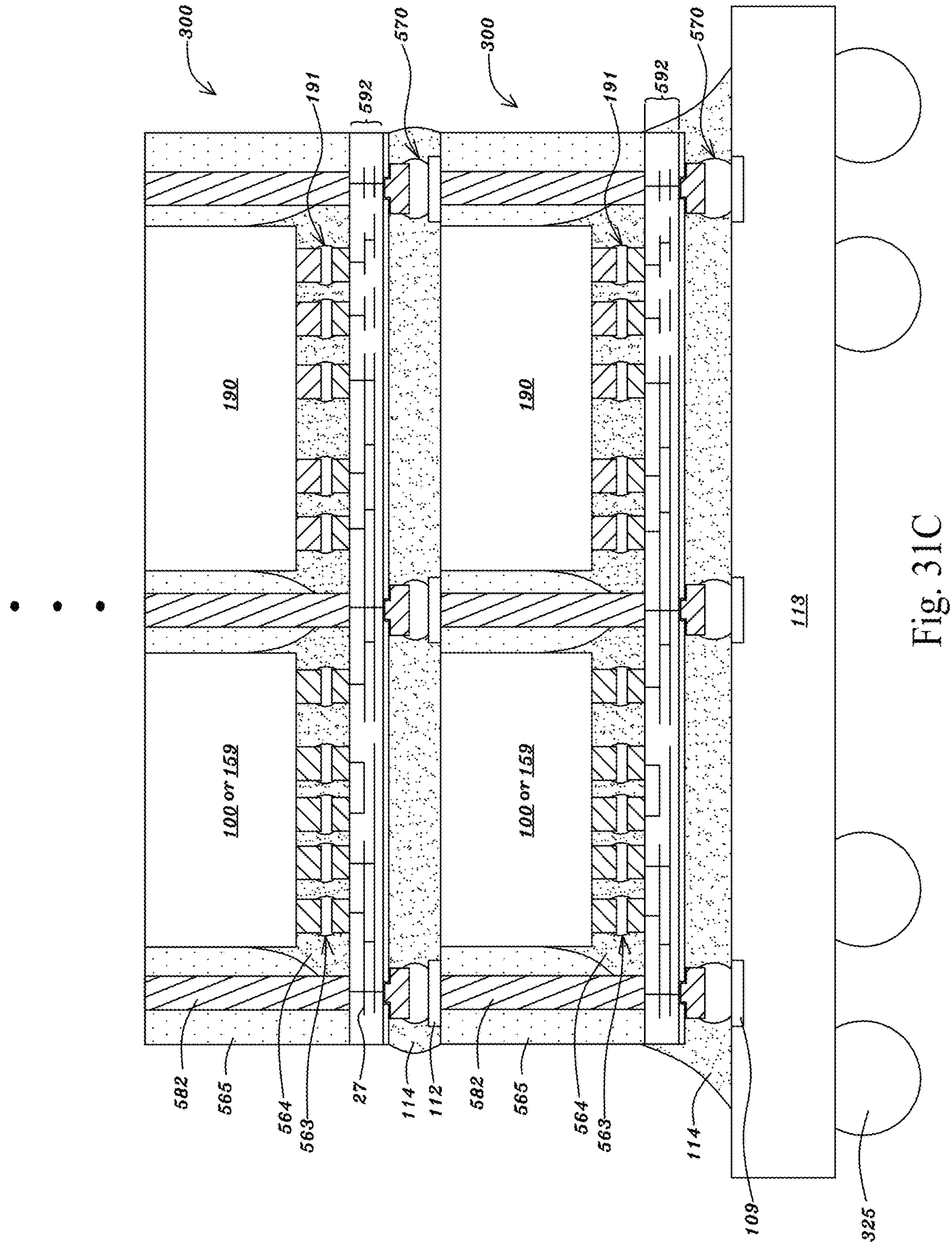

FIGS. 31A-31C are schematically views showing a process for fabricating a package-on-package assembly in accordance with an embodiment of the present application. Referring to FIGS. 31A-31C, when a top one of the FOIT logic drives 300 as seen in FIG. 30I is mounted onto a bottom one of the FOIT logic drives 300, the bottom one of the FOIT logic drives 300 may have its TPVs 582 in its polymer layer 565 to couple to circuits, interconnection metal schemes, metal pads, metal pillars or bumps, and/or components of the top one of the FOIT logic drives 300 at the backside of the bottom one of the FOIT logic drives 300. The process for fabricating a package-on-package assembly is mentioned as below:

First, referring to FIG. 31A, a plurality of the bottom one of the FOIT logic drives 300 (only one is shown) may have its metal pillars or bumps 570 mounted onto multiple metal pads 109 of a circuit carrier or substrate 110 at a topside thereof, such as printed circuit board (PCB), ball-grid-array (BGA) substrate, flexible circuit film or tape, or ceramic circuit substrate. An underfill 114 may be filled into a gap between the circuit carrier or substrate 110 and the bottom one of the FOIT logic drives 300. Alternatively, the underfill 114 between the circuit carrier or substrate 110 and the bottom one of the FOIT logic drives 300 may be skipped. Next, a surface-mount technology (SMT) may be used to mount a plurality of the top one of the FOIT logic drives 300 (only one is shown) onto the plurality of the bottom one of the FOIT logic drives 300, respectively.

For the surface-mount technology (SMT), solder or solder cream or flux 112 may be first printed on the backside surface 582*a* of the TPVs 582 of the bottom one of the FOIT logic drives 300. Next, referring to FIG. 31B, the top one of the FOIT logic drives 300 may have its metal pillars or bumps 570 placed on the solder or solder cream or flux 112. Next, a reflowing or heating process may be performed to fix the metal pillars or bumps 570 of the top one of the FOIT logic drives 300 to the TPVs 582 of the bottom one of the FOIT logic drives 300. Next, an underfill 114 may be filled into a gap between the top and bottom ones of the FOIT logic drives 300. Alternatively, the underfill 114 between the top and bottom ones of the FOIT logic drives 300 may be skipped.

In the next optional step, referring to FIG. 31B, another plurality of the FOIT logic drives 300 as seen in FIG. 30I may have its metal pillars or bumps 570 mounted onto the TSVs 582 of the plurality of the top one of the FOIT logic drives 300 using the surface-mount technology (SMT) and the underfill 114 is then optionally formed therebetween. The step may be repeated by multiple times to form three or more than three of the FOIT logic drives 300 stacked on the circuit carrier or substrate 110.

Next, referring to FIG. 31B, multiple solder balls 325 are planted on a backside of the circuit carrier or substrate 110. Next, referring to FIG. 31C, the circuit carrier or structure 110 may be separated, cut or diced into multiple individual substrate units 113, such as printed circuit boards (PCBs), ball-grid-array (BGA) substrates, flexible circuit films or tapes, or ceramic circuit substrates, by a laser cutting process or by a mechanical cutting process. Thereby, the number i of the FOIT logic drives 300 may be stacked on one of the substrate units 113, wherein the number i may be equal to or greater than 2, 3, 4, 5, 6, 7 or 8.

Figure 31D:
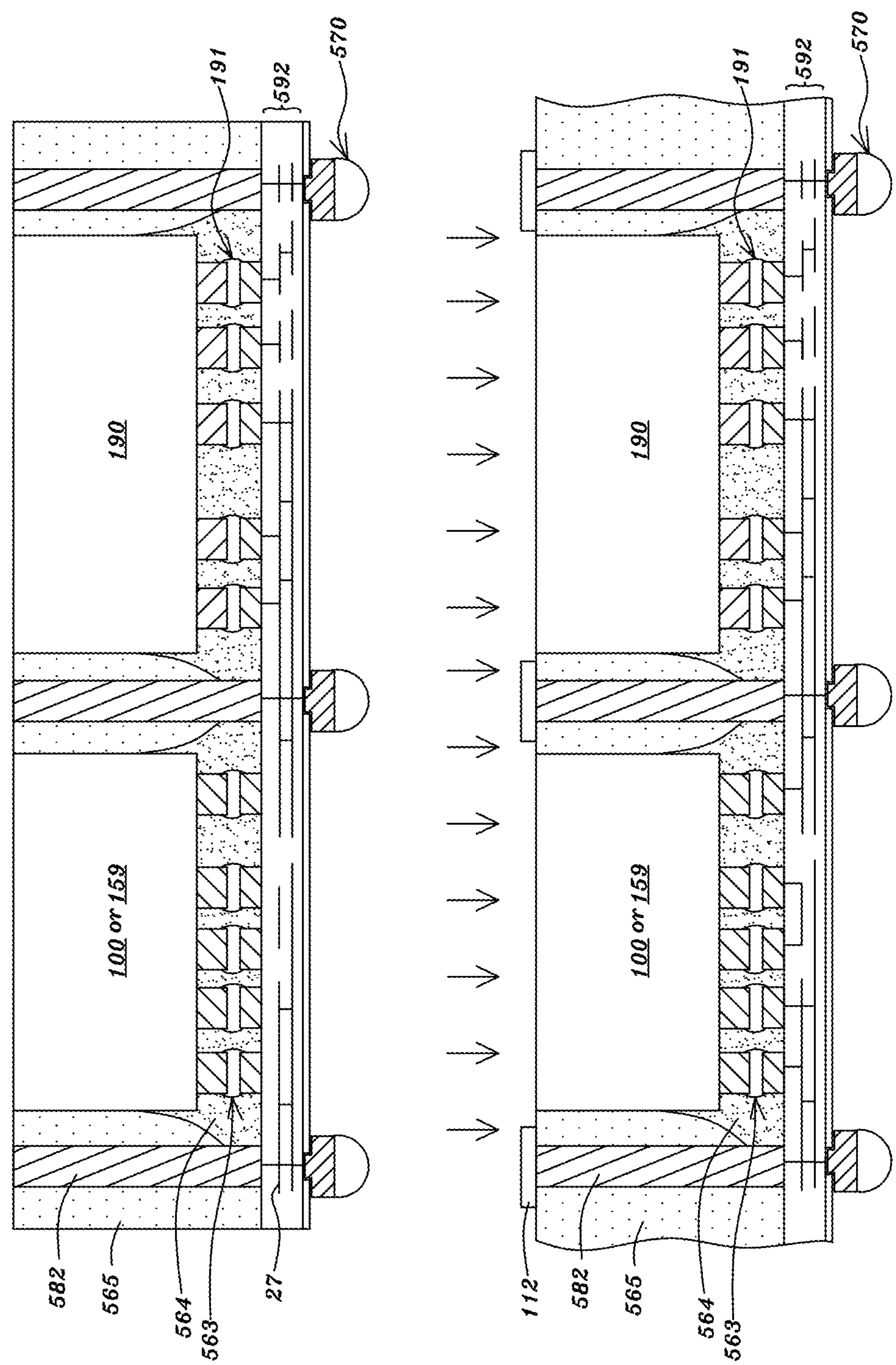
Figure 31E:
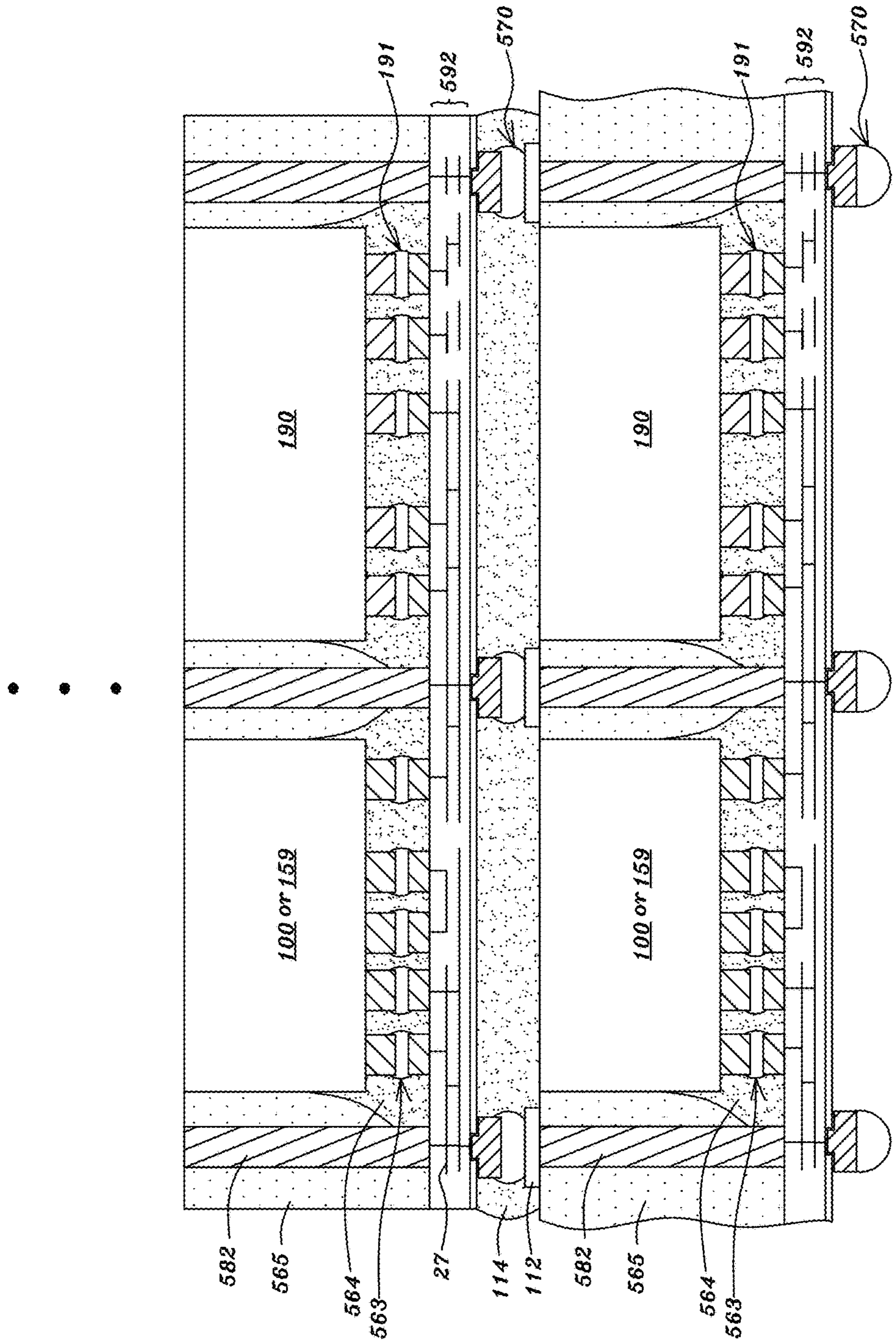
Figure 31F:
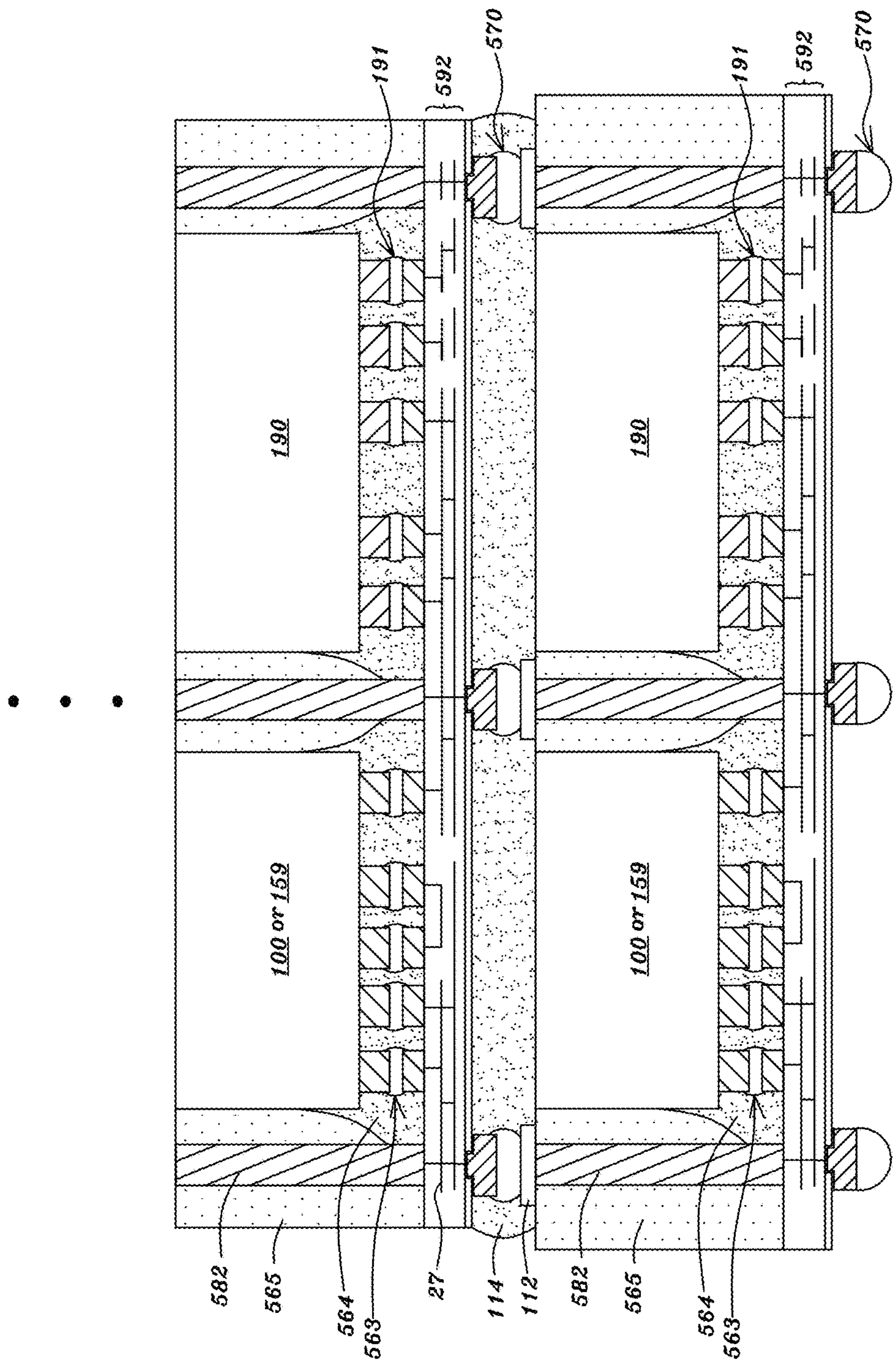

Alternatively, FIGS. 31D-31F are schematically views showing a process for fabricating a package-on-package assembly in accordance with another embodiment of the present application. Referring to FIGS. 31D and 31E, a plurality of the top one of the FOIT logic drives 300 as seen in FIG. 30I may have its metal pillars or bumps 570 fixed or mounted, using the SMT technology, to the TPVs 582 of the structure in a wafer or panel level as seen in FIG. 30H before being separated into a plurality of the bottom one of the FOIT logic drives 300.

Next, referring to FIG. 31E, the underfill 114 may be filled into a gap between each of the top ones of the FOIT logic drives 300 as seen in FIG. 30I and the structure in a wafer or panel level as seen in FIG. 30H. Alternatively, the underfill 114 between each of the top ones of the FOIT logic drives 300 as seen in FIG. 30I and the structure in a wafer or panel level as seen in FIG. 30H may be skipped.

In the next optional step, referring to FIG. 31E, other multiple of the FOIT logic drives 300 as seen in FIG. 30I may have its metal pillars or bumps 570 mounted onto the TSVs 582 of the top ones of the FOIT logic drives 300 using the surface-mount technology (SMT) and the underfill 114 is then optionally formed therebetween. The step may be repeated by multiple times to form two or more than two of the FOIT logic drives 300 stacked on the structure in a wafer or panel level as seen in FIG. 30H.

Next, referring to FIG. 31F, the structure in a wafer or panel level as seen in FIG. 30H may be separated, cut or diced into a plurality of the bottom one of the FOIT logic drives 300 by a laser cutting process or by a mechanical cutting process. Thereby, the number i of the FOIT logic drives 300 may be stacked together, wherein the number i may be equal to or greater than 2, 3, 4, 5, 6, 7 or 8. Next, the FOIT logic drives 300 stacked together may have a bottommost one provided with the metal pillars or bumps 570 to be mounted onto the multiple metal pads 109 of the circuit carrier or substrate 110 as seen in FIG. 31B, such as ball-grid-array substrate, at the topside thereof. Next, an underfill 114 may be filled into a gap between the circuit carrier or substrate 110 and the bottommost one of the FOIT logic drives 300. Alternatively, the underfill 114 between the circuit carrier or substrate 110 and the bottommost one of the FOIT logic drives 300 may be skipped. Next, multiple solder balls 325 are planted on a backside of the circuit carrier or substrate 110. Next, the circuit carrier or structure 110 may be separated, cut or diced into multiple individual substrate units 113, such as printed circuit boards (PCB) or BGA (Ball-Grid-array) substrates, by a laser cutting process or by a mechanical cutting process, as seen in FIG. 31C. Thereby, the number i of the FOIT logic drives 300 may be stacked on one of the substrate units 113, wherein the number i may be equal to or greater than 2, 3, 4, 5, 6, 7 or 8.

The FOIT logic drives 300 with the TPVs 582 to be stacked in a vertical direction to form the POP assembly may be in a standard format or have standard sizes. For example, the FOIT logic drives 300 and their combination as mentioned below may be in a shape of square or rectangle, with a certain widths, lengths and thicknesses. An industry standard may be set for the shape and dimensions of the FOIT logic drives 300. For example, the standard shape of the FOIT logic drives 300 may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm or 5 mm. Alternatively, the standard shape of the FOIT logic drives 300 and their combination as mentioned below may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm or 5 mm.

Embodiment for Chip Package with TPVs and BISD

Alternatively, a backside metal interconnection scheme for the FOIT logic drive (BISD) 79 may be formed for interconnection over the backside 100*a*, 159*b* or 190*a* of each of the semiconductor chips 100, memory modules 159 and/or operation modules 190. FIGS. 32A-32G are schematic views showing a process for forming a backside metal interconnection scheme for a FOIT logic drive (BISD) in accordance with an embodiment of the present application.

Figure 32A:
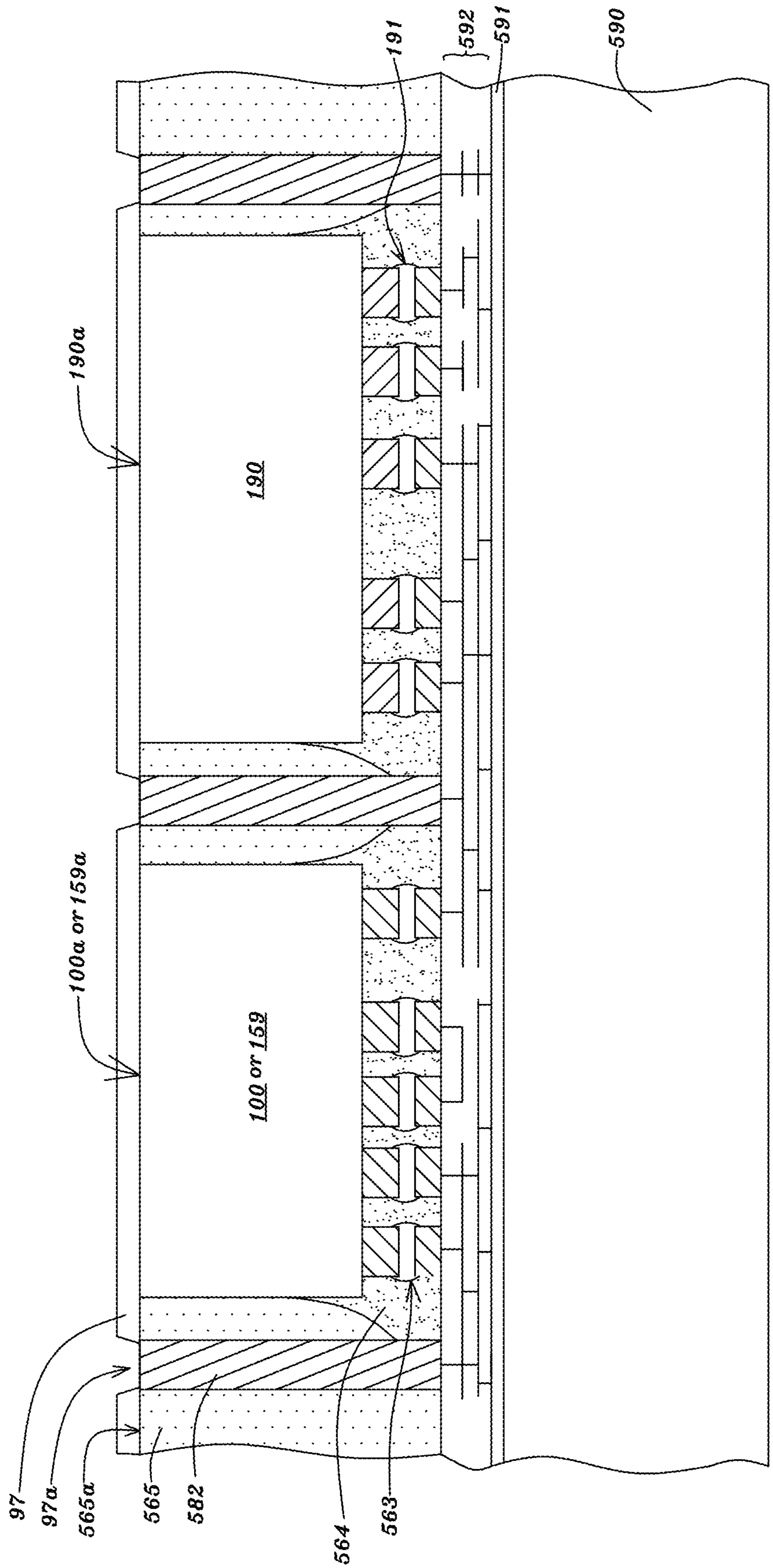
FIGS. 32A-32N are schematic views showing a process for forming a standard commodity logic drive with a backside metal interconnection scheme for a FOIT logic drive (BISD) in accordance with an embodiment of the present application.

Referring to FIG. 32A following the step as illustrated in FIG. 30E, a method of spin-on coating, screen-printing, dispensing or molding may be applied to form a polymer layer 97, i.e., insulating dielectric layer, on the backside 100*a*, 159*b* or 190*a* of each of the semiconductor chips 100, memory modules 159 and/or operation modules 190 and on the backside surface 565*a* of the polymer layer 565 with multiple openings 97*a* therein each formed over the tip of one of the TPVs 582 to expose the tip of said one of the TPVs 582. The polymer layer 97 may contain, for example, polyimide, BenzoCycloButene (BCB), parylene, epoxy-based material or compound, photo epoxy SU-8, elastomer or silicone. The polymer layer 97 may comprise organic material, for example, a polymer, or material compounds comprising carbon. The polymer layer 97 may be photosensitive, and may be used as photoresist as well for patterning multiple openings 97*a* therein to have metal vias formed therein by following processes to be performed later. The polymer layer 97 may be coated, exposed to light through a photomask, and then developed to form the openings 97*a* therein. Next, the polymer layer 97, i.e., insulating dielectric layer, is cured at a temperature, for example, at or higher than 100° C., 125° C., 150° C., 175° C., 200° C., 225° C., 250° C., 275° C. or 300° C. The polymer layer 97 after cured may have a thickness between, for example, 3 μm and 50 μm, 3 μm and 30 μm, 3 μm and 20 μm, or 3 μm and 15 μm, or thicker than or equal to 3 μm, 5 μm, 10 μm, 20 μm, or 30 μm. The polymer layer 97 may be added with some dielectric particles or glass fibers. The material of the polymer layer 97 and the process for forming the same may be referred to that of the polymer layer 36 and the process for forming the same as illustrated in FIG. 21H.

Figure 32B:
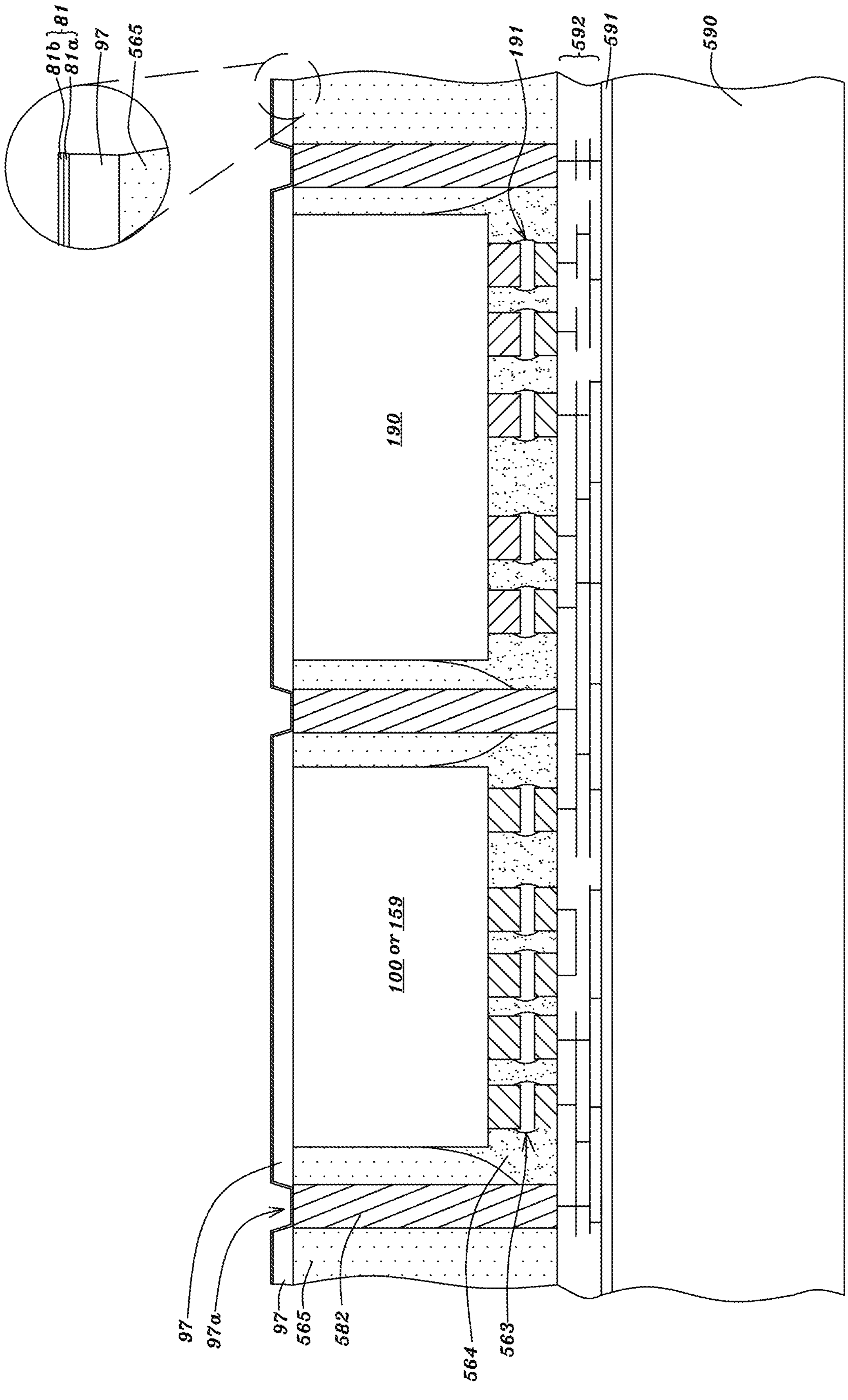
FIG. 32O is a top view showing a metal plane in accordance with an embodiment of the present application.

Next, an emboss process is performed on the polymer layer 97 and on the exposed tips of the TPVs 582 to form the BISD 79. Referring to FIG. 32B, an adhesion layer 81*a* having a thickness of between 0.001 and 0.7 μm, between 0.01 and 0.5 μm or between 0.03 and 0.35 μm may be sputtered on the polymer layer 97 and on the tips of the TPVs 582. The material of the adhesion layer 81*a* may include titanium, a titanium-tungsten alloy, titanium nitride, chromium, titanium-tungsten-alloy layer, tantalum nitride, or a composite of the abovementioned materials. The adhesion layer 81*a* may be formed by an atomic-layer-deposition (ALD) process, chemical vapor deposition (CVD) process or evaporation process. For example, the adhesion layer 81*a* may be formed by sputtering or CVD depositing a titanium (Ti) or titanium nitride (TiN) layer (with a thickness, for example, between 1 nm and 200 nm or between 5 nm and 50 nm) on the polymer layer 97 and on the tips of the TPVs 582.

Next, referring to FIG. 32B, an electroplating seed layer 81*b* having a thickness of between 0.001 and 1 μm, between 0.03 and 2 μm or between 0.05 and 0.5 μm may be sputtered on a whole top surface of the adhesion layer 81*a*. Alternatively, the electroplating seed layer 81*b* may be formed by an atomic-layer-deposition (ALD) process, chemical-vapor-deposition (CVD) process, vapor deposition method, electroless plating method or PVD (Physical Vapor Deposition) method. The electroplating seed layer 81*b* is beneficial to electroplating a metal layer thereon. Thus, the material of the electroplating seed layer 81*b* varies with the material of a metal layer to be electroplated on the electroplating seed layer 81*b*. When a copper layer is to be electroplated on the electroplating seed layer 81*b*, copper is a preferable material to the electroplating seed layer 81*b*. For example, the electroplating seed layer 81*b* may be deposited on or over the adhesion layer 81*a* by, for example, sputtering or CVD depositing a copper seed layer (with a thickness between, for example, 3 nm and 300 nm or 10 nm and 120 nm) on the adhesion layer 81*a*. The adhesion layer 81*a* and electroplating seed layer 81*b* may compose the adhesion/seed layer 81.

Figure 32C:
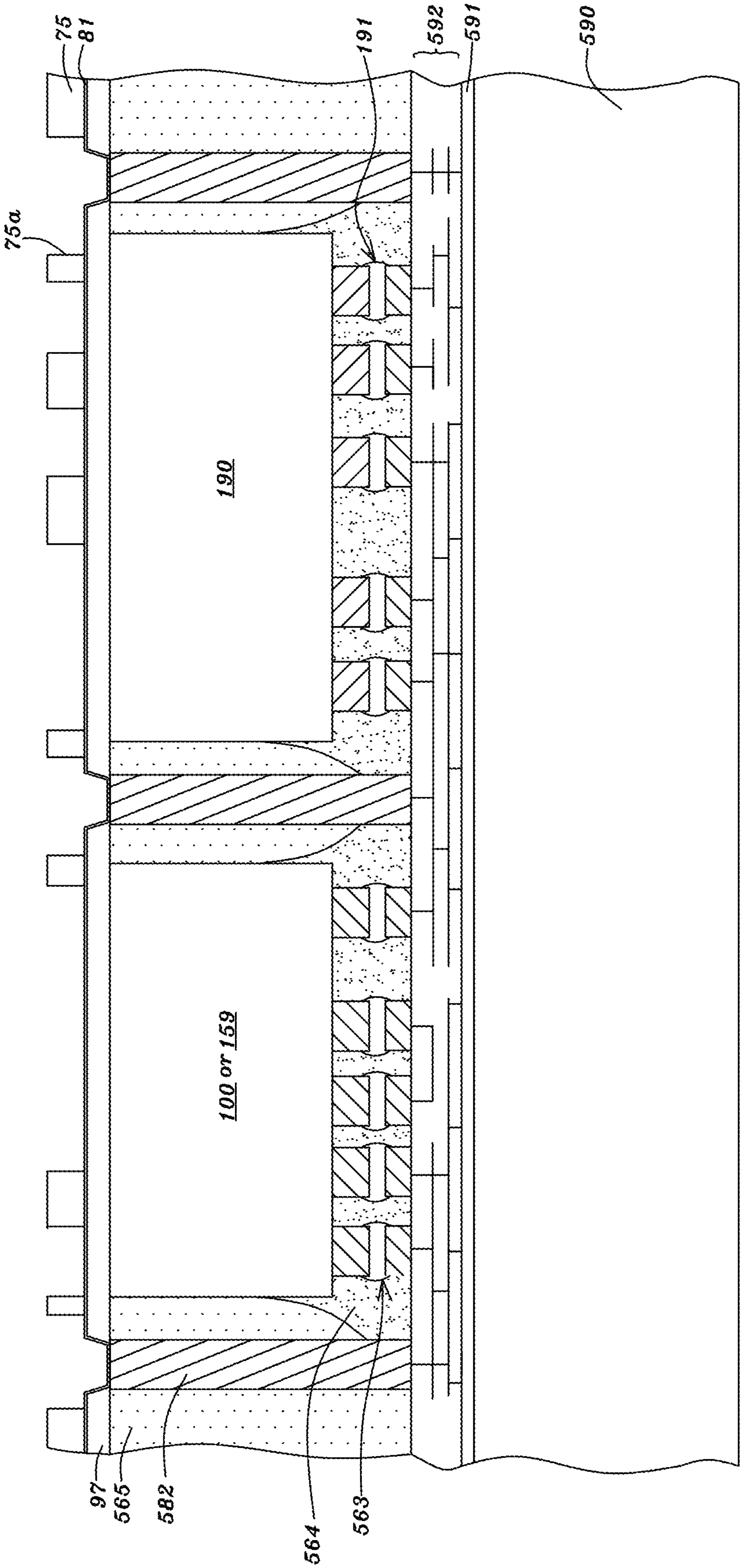

Next, referring to FIG. 32C, a photoresist layer 75, such as positive-type photoresist layer, having a thickness of between 5 and 50 μm is spin-on coated or laminated on the electroplating seed layer 81*b* of the adhesion/seed layer 81. The photoresist layer 75 is patterned with the processes of exposure, development and etc., to form multiple trenches or openings 75*a* in the photoresist layer 75 exposing the electroplating seed layer 81*b*. A 1× stepper, 1× contact aligner or laser scanner may be used to expose the photoresist layer 75 with at least two of G-line having a wavelength ranging from 434 to 438 nm, H-line having a wavelength ranging from 403 to 407 nm, and I-line having a wavelength ranging from 363 to 367 nm, illuminating the photoresist layer 75, that is, G-line and H-line, G-line and I-line, H-line and I-line, or G-line, H-line and I-line illuminate the photoresist layer 75, then developing the exposed polymer layer 75, and then removing the residual polymeric material or other contaminants on the electroplating seed layer 81*b* of the adhesion/seed layer 81 with an $O_2$ plasma or a plasma containing fluorine of below 200 PPM and oxygen, such that the photoresist layer 75 may be patterned with multiple openings 75*a* in the photoresist layer 75 exposing the electroplating seed layer 81*b* of the adhesion/seed layer 81 for forming metal pads, lines or traces in the trenches or openings 75*a* and on the electroplating seed layer 83 of the adhesion/seed layer 579 by following processes to be performed later. One of the trenches or openings 75*a* in the photoresist layer 75 may overlap the whole area of one of the openings 97*a* in the polymer layer 97.

Figure 32D:
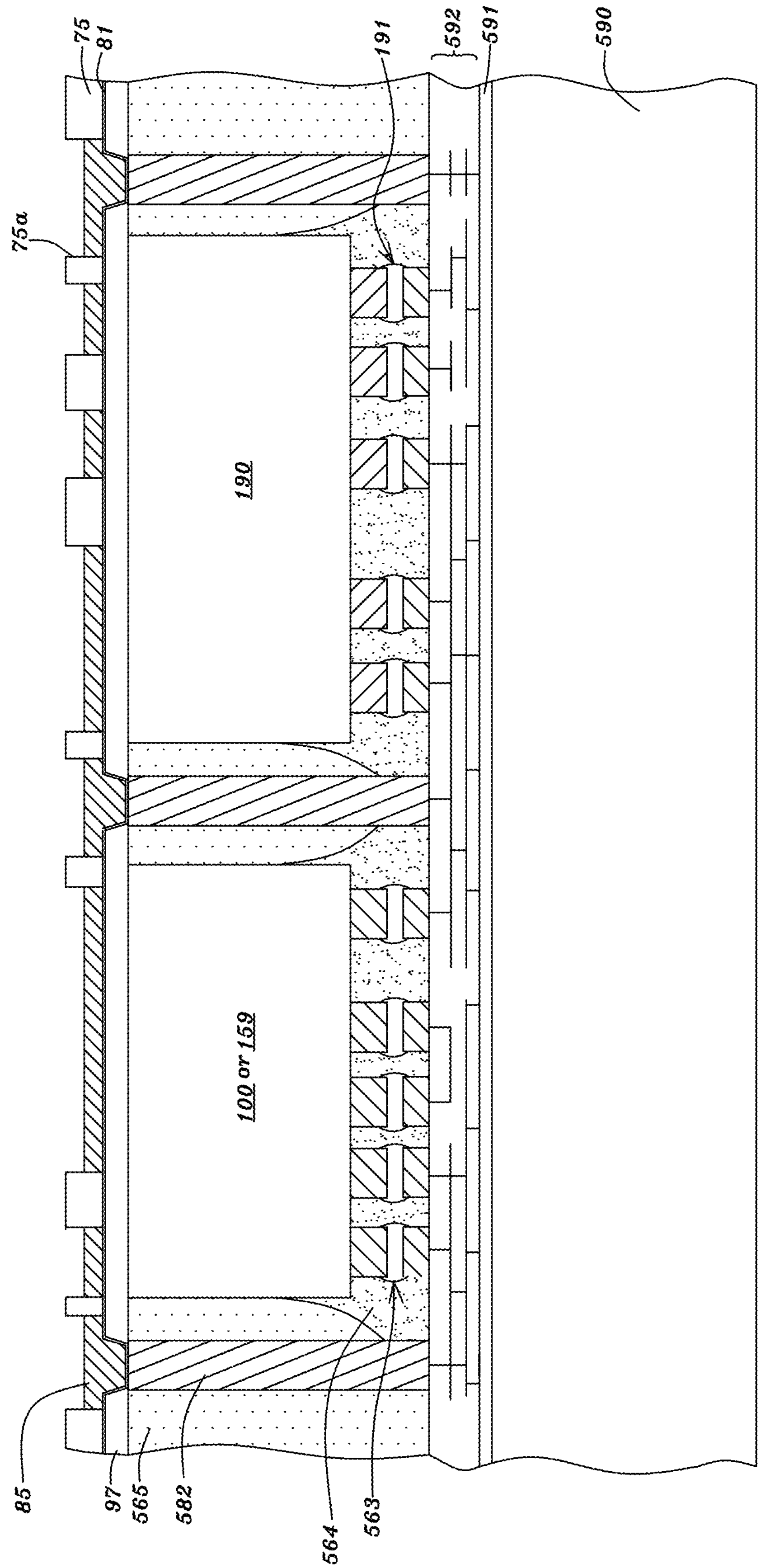

Next, referring to FIG. 32D, a metal layer 85, such as copper, is electroplated on the electroplating seed layer 83 of the adhesion/seed layer 579 exposed by the trenches or openings 75*a*. For example, the metal layer 85 may be formed by electroplating a copper layer with a thickness between 0.3 μm and 50 μm, 0.5 μm and 30 μm, 1 μm and 20 μm, 1 μm and 15 μm, 1 μm and 10 μm, or 0.5 μm to 5 μm, or greater than or equal to 0.3 μm, 0.7 μm, 1 μm, 2 μm, 3 μm, 5 μm, 7 μm or 10 μm on the electroplating seed layer 83, made of copper, of the adhesion/seed layer 579 exposed by the trenches or openings 75*a*.

Figure 32E:
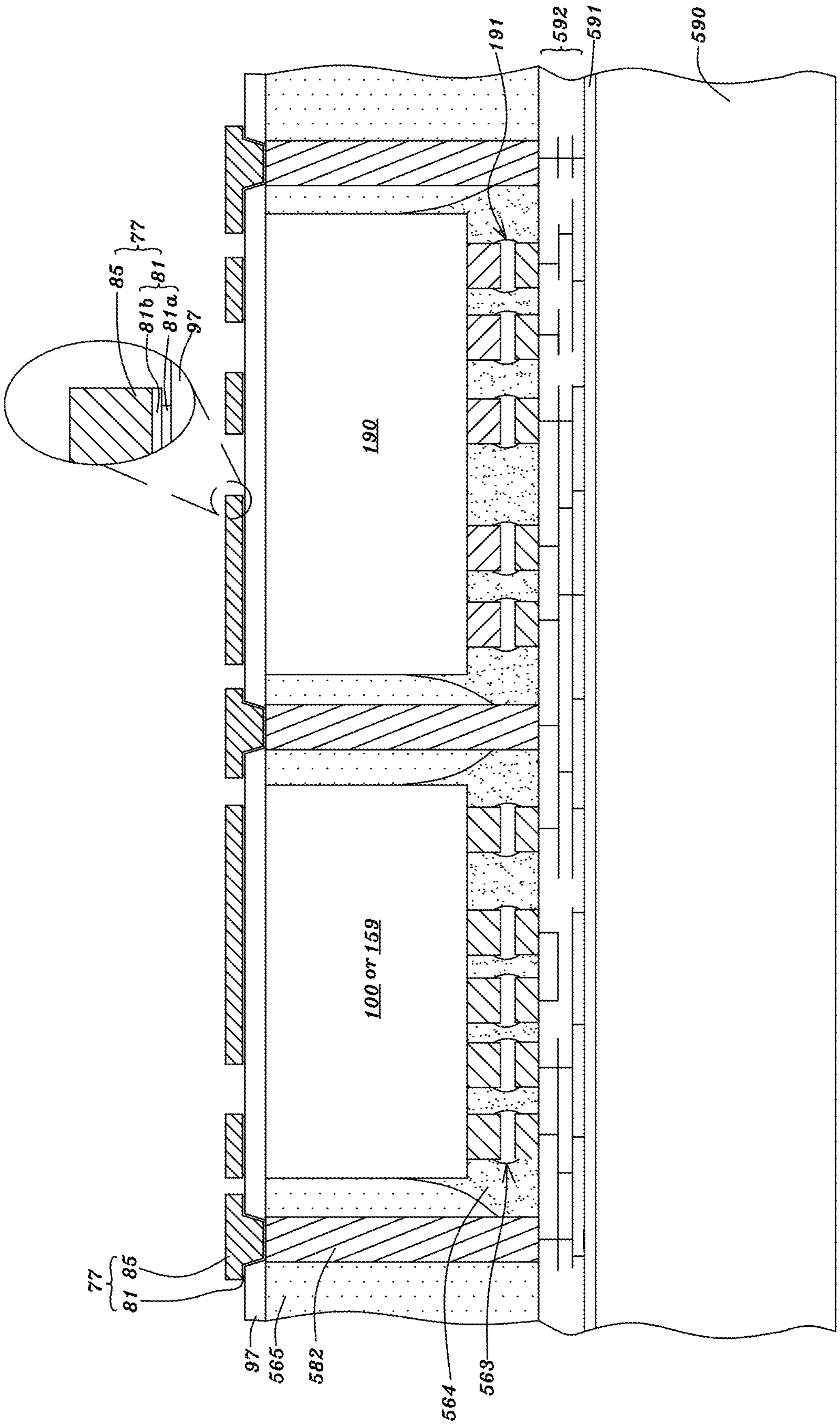

Referring to FIG. 32E, after the metal layer 85 is formed, most of the photoresist layer 75 may be removed and then the adhesion layer 81 and electroplating seed layer 83 not under the metal layer 85 may be etched. The removing and etching processes may be referred respectively to the processes for removing the photoresist layer 30 and etching the electroplating seed layer 28 and adhesion layer 26 as illustrated in FIG. 21F. Thereby, the adhesion layer 81, electroplating seed layer 83 and electroplated metal layer 85 may be patterned to form an interconnection metal layer 77 on the polymer layer 97 and in the openings 97*a* in the polymer layer 97. The interconnection metal layer 77 may be formed with multiple metal vias 77*a* in the openings 97*a* in the polymer layer 97 and multiple metal pads, lines or traces 77*b* on the polymer layer 97.

Figure 32F:
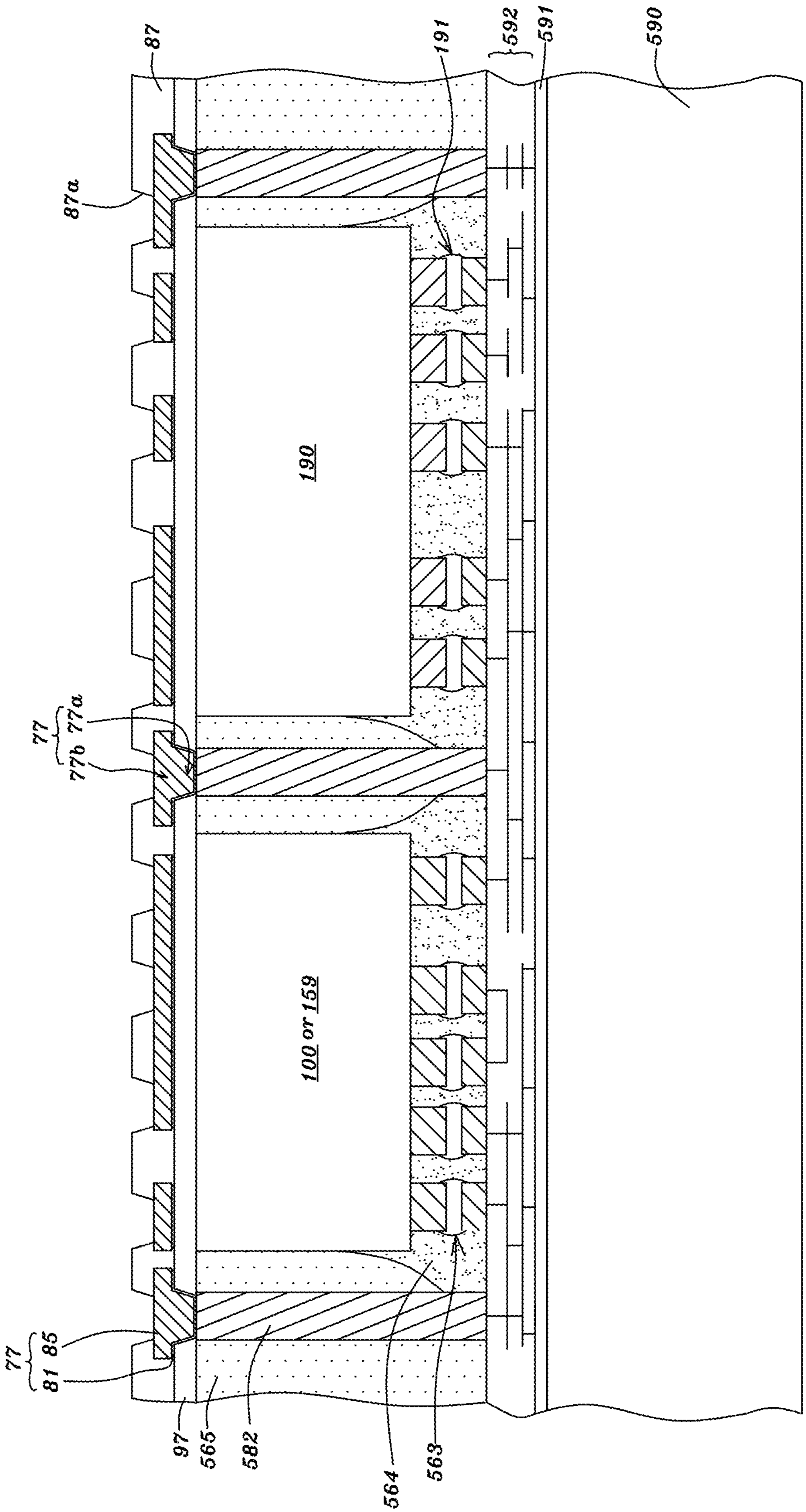

Next, referring to FIG. 32F, a polymer layer 87, i.e., insulting or inter-metal dielectric layer, is formed on the polymer layer 97 and metal layer 85 and multiple openings 87*a* in the polymer layer 87 are over multiple contact points of the interconnection metal layer 77. The polymer layer 87 has a thickness between 3 and 30 micrometers or between 5 and 15 micrometers. The polymer layer 87 may be added with some dielectric particles or glass fibers. The specification of the polymer layer 87 and the process for forming the same may be referred to that of the polymer layer 97 and the process for forming the same as illustrated in FIG. 32A.

Figure 32G:
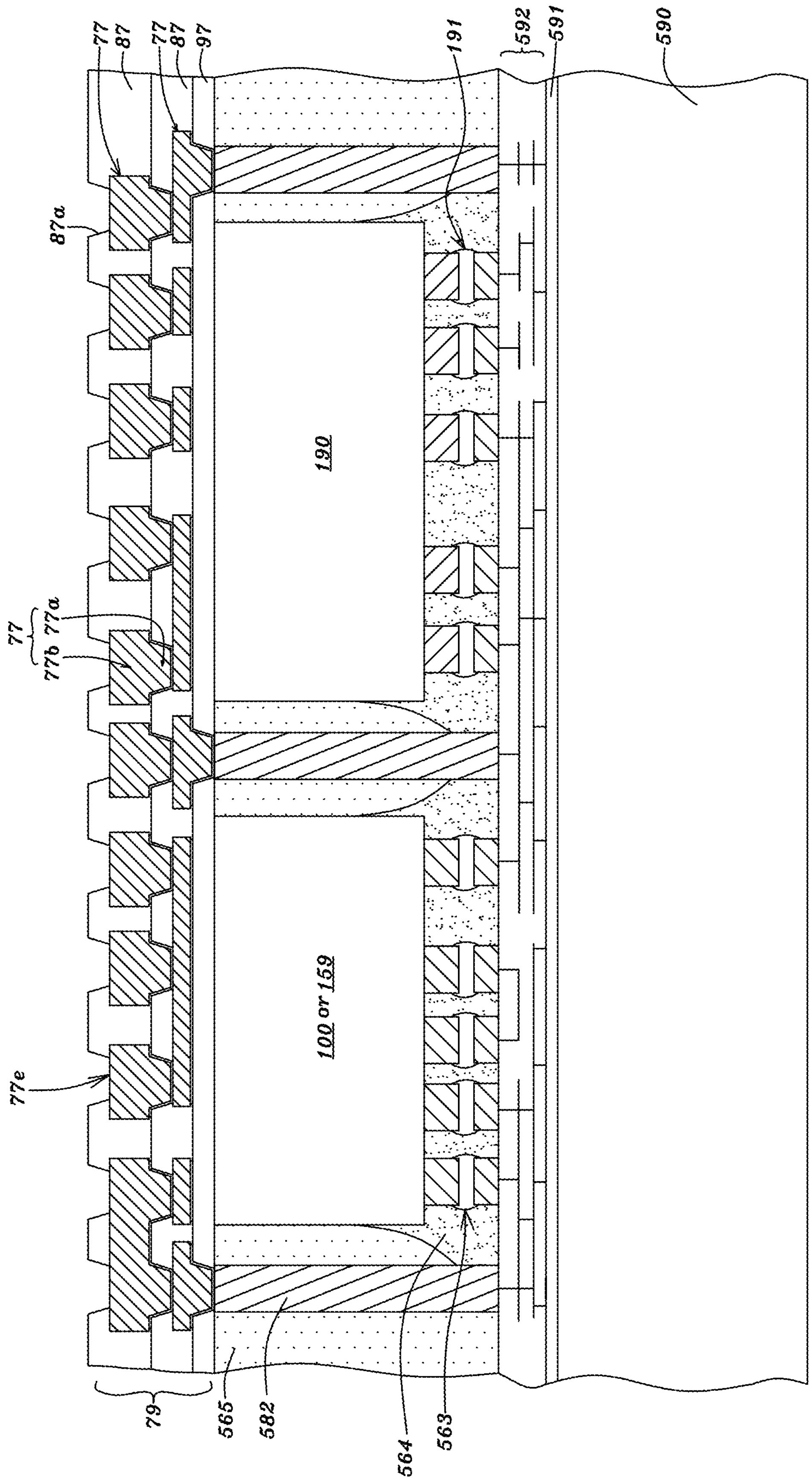

The process for forming the interconnection metal layer 77 as illustrated in FIGS. 32B-32E and the process for forming the polymer layer 87 as illustrated in FIG. 32F may be alternately performed more than one times to fabricate the BISD 79 as seen in FIG. 32G. Referring to FIG. 32G, the BISD 79 may include an upper one of the interconnection metal layers 77 formed with multiple metal vias 77*a* in the openings 87*a* in one of the polymer layers 87 and multiple metal pads, lines or traces 77*b* on said one of the polymer layers 87. The upper one of the interconnection metal layers 77 may be connected to a lower one of the interconnection metal layers 77 through the metal vias 77*a* of the upper one of the interconnection metal layers 77 in the openings 87*a* in said one of the polymer layers 87. The BISD 79 may include the bottommost one of the interconnection metal layers 77 formed with multiple metal vias 77*a* in the openings 97*a* in the polymer layer 97 and on the TPVs 582 and multiple metal pads, lines or traces 77*b* on the polymer layer 97.

Figure 32H:
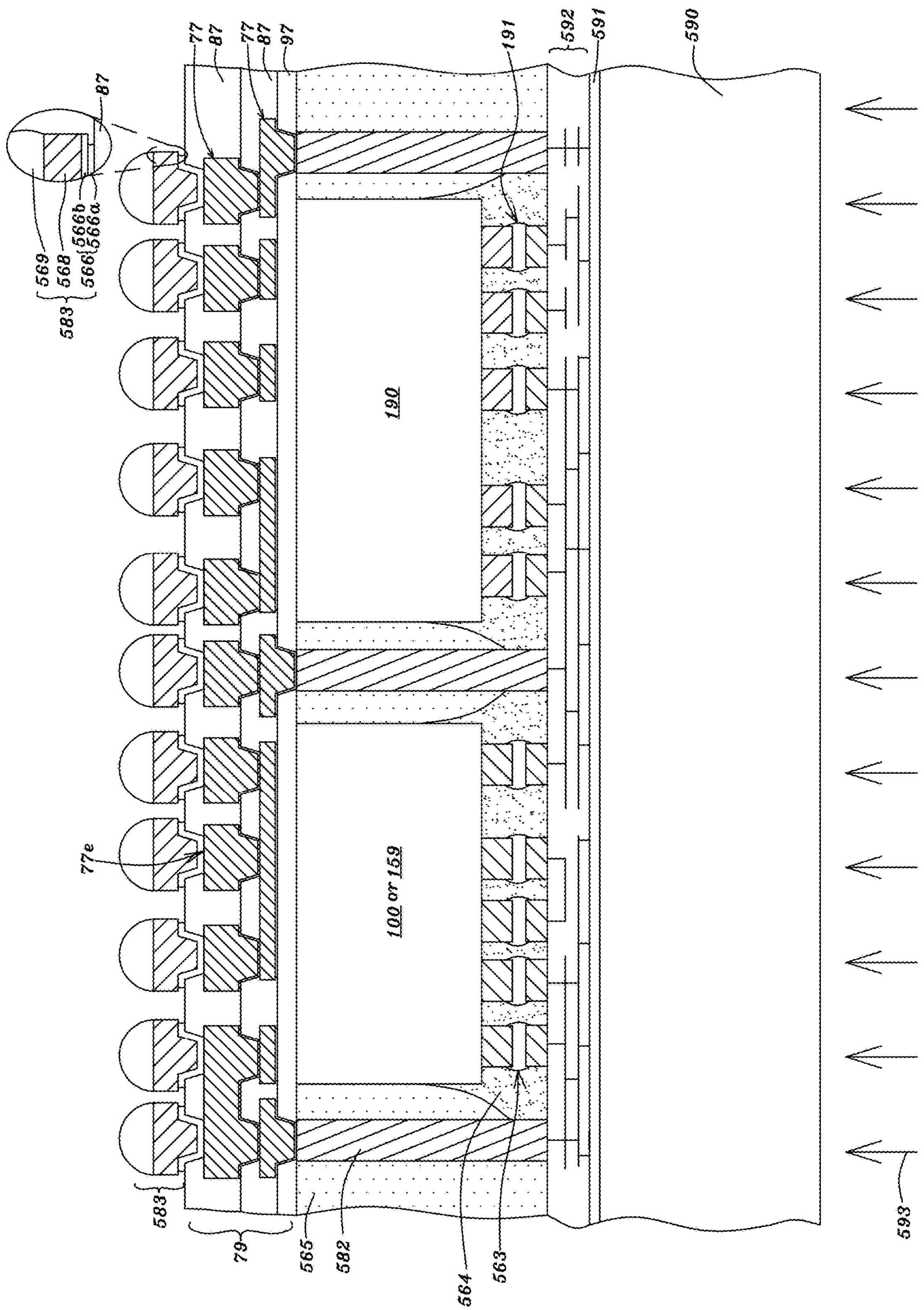

Next, referring to FIG. 32H, multiple metal bumps 583 may be optionally formed on metal pads 77*e* of the topmost one of the interconnection metal layers 77 at close ends of openings in the topmost one of the polymer layers 87 of the BISD 79. The metal bumps 583 may have five types like the first through fifth types of metal bumps 570 as illustrated in FIGS. 26B and 26C. The specification of the metal bumps 583 and the process for forming the same may be referred to the specification of the metal bumps 570 of any type and the process for forming the same as illustrated in FIGS. 22R-22V, 26B and 26C.

Each of the first through third types of metal bumps 583, which can be referred to the first through third types of metal bumps 570 as illustrated in FIGS. 22R-22U and 26B respectively, may have the adhesion/seed layer 566 formed with the adhesion layer 566*a* on one of the metal pads 77*e* of the topmost one of the interconnection metal layers 77 of the BISD 79 and the electroplating seed layer 566*b* on the adhesion layer 566*a*, and the metal layer 568 on the electroplating seed layer of the adhesion/seed layer 566. Each of the fourth type of metal bumps 583, which can be referred to the fourth type of metal bumps 570 as illustrated in FIGS. 22R-22V and 26B, may have the adhesion/seed layer 566 formed with the adhesion layer 566*a* on one of the metal pads 77*e* of the topmost one of the interconnection metal layers 77 of the BISD 79 and the electroplating seed layer 566*b* on the adhesion layer 566*a*, the metal layer 568 on the electroplating seed layer 566*b* of the adhesion/seed layer 566 and the solder bumps 569 on the metal layer 568. Each of the fifth type of metal bumps 583, which can be referred to the fifth type of metal bumps 570 as illustrated in 26C, may have the solder bumps formed directly on one of the metal pads 77*e* of the topmost one of the interconnection metal layers 77 of the BISD 79.

Alternatively, the metal bumps 583 may be skipped from being formed on the metal pads 77*e* of the topmost one of the interconnection metal layers 77 of the BISD 79.

Figure 32I:
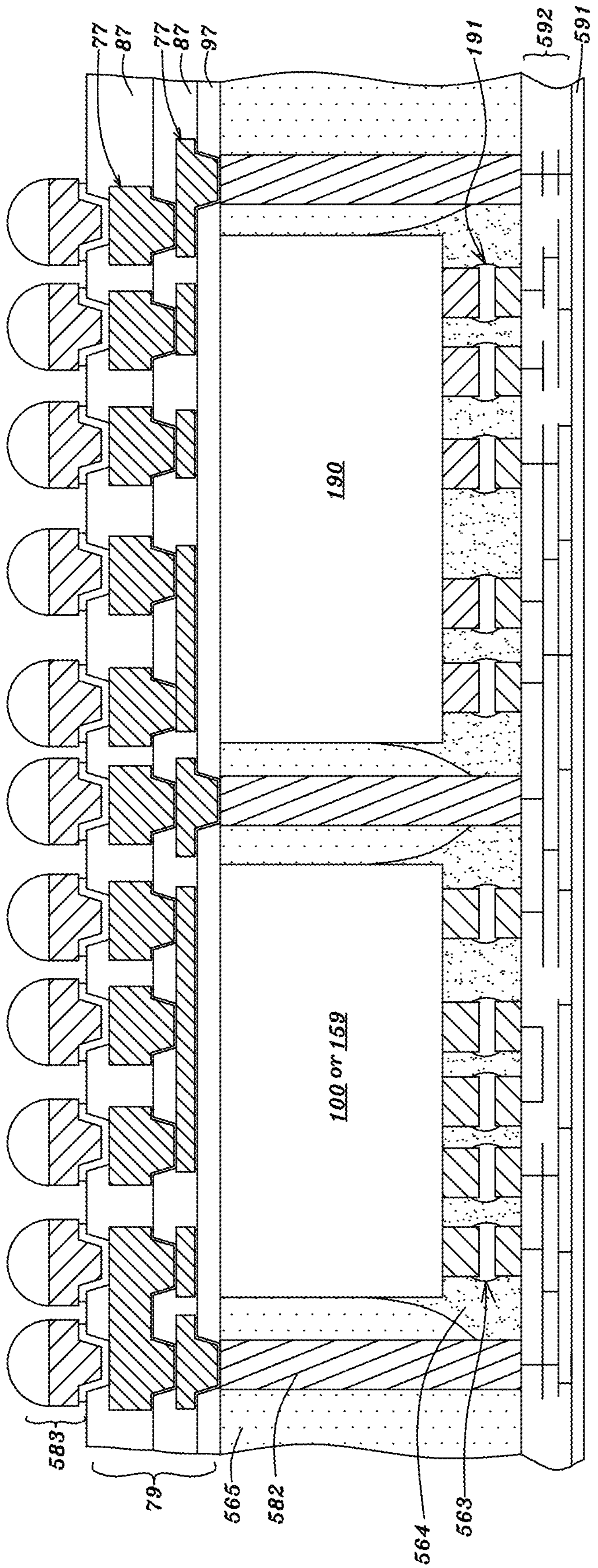
Figure 32J:
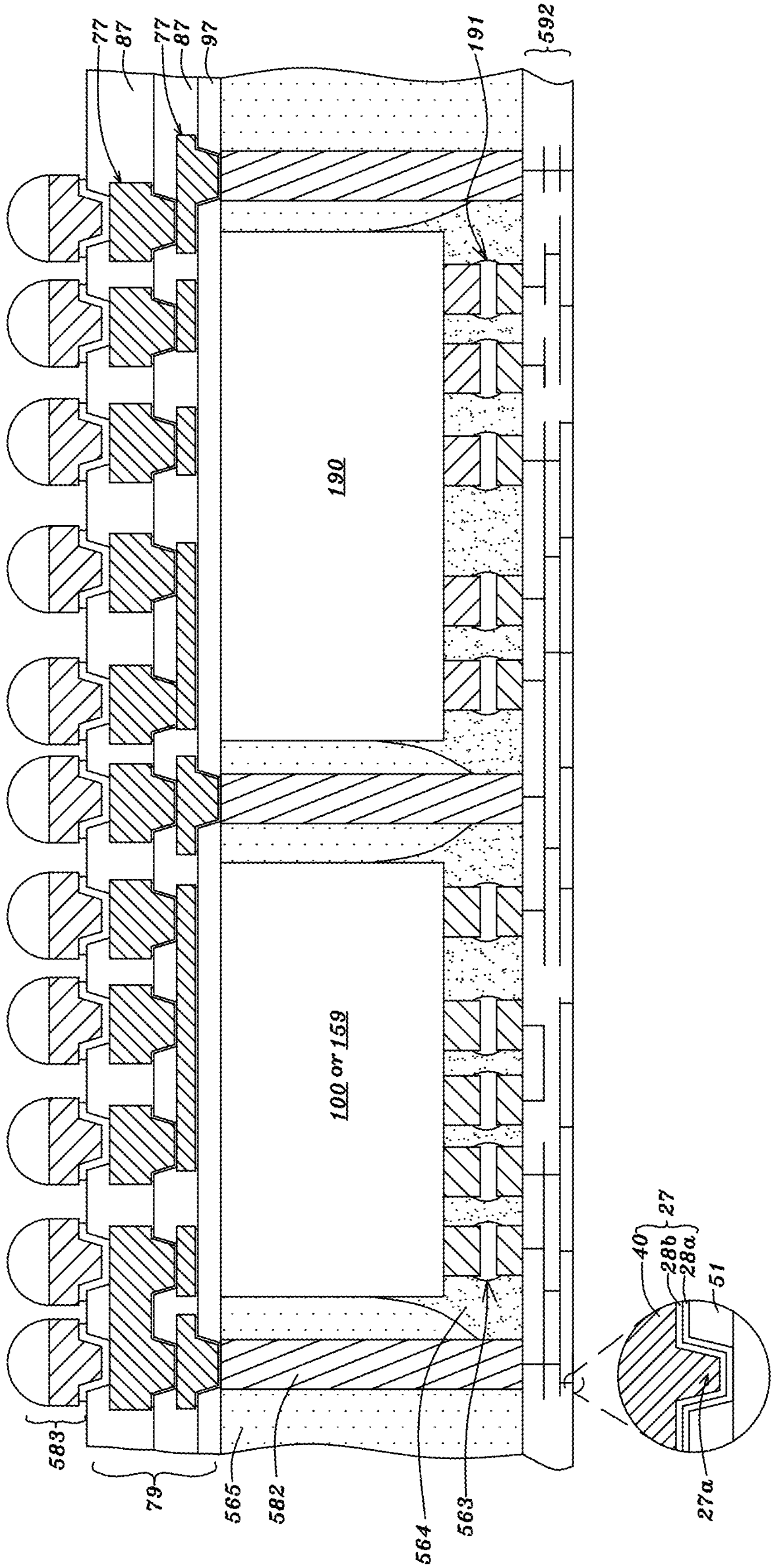

Next, referring to FIGS. 32H-32J, the temporary substrate (T-sub) 590 and sacrificial bonding layer 591 may be released from the FOISD 592. The process for releasing the temporary substrate (T-sub) 590 and sacrificial bonding layer 591 from the FOISD 592 may be referred to that as illustrated in FIGS. 25H-25J. Thereby, for the FOISD 592, each of the metal vias 27*a* of its bottommost interconnection metal layer 27 in its bottommost polymer layer 51 is exposed as a contact to join a metal pad, pillar or bump, that is, the adhesion layer 28*a* of its bottommost interconnection metal layer 27 is exposed at the surface of the contact.

Figure 32K:
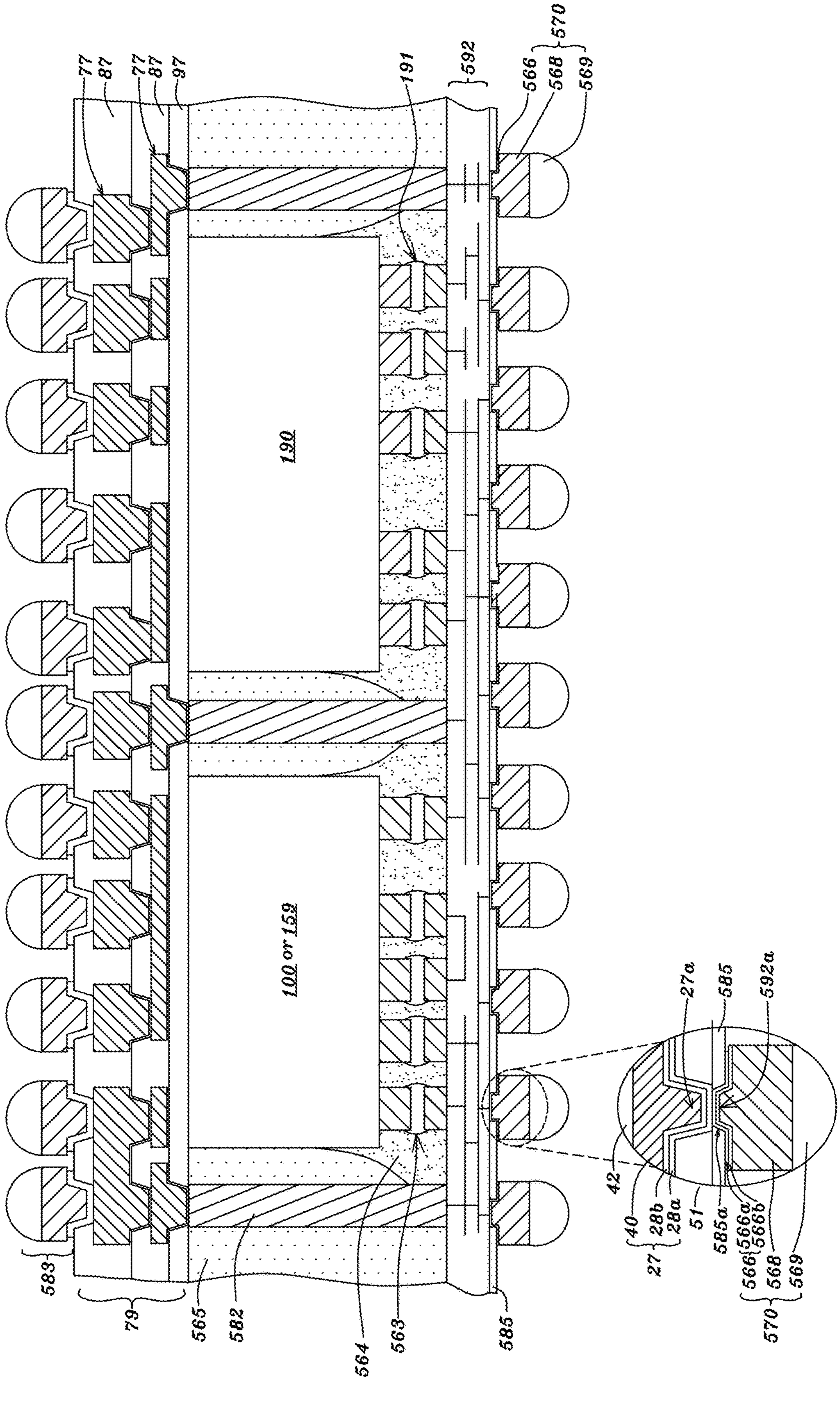

Referring to FIG. 32K, after the sacrificial bonding layer 591 is released as illustrated in FIG. 32J, a polymer layer 585, i.e., insulating dielectric layer, may be formed on the backside 592*a* of the FOISD 592 and the backsides of the metal vias 27*a*, and multiple openings 585*a* in the polymer layer 585 are formed over and expose the metal vias 27*a*. The specification of the polymer layer 585 on the FOISD

592 and the process for forming the same may be referred to those as illustrated in FIG. 26A.

Referring to FIG. 32K, after the polymer layer 585 is formed on the FOISD 592, multiple metal pads, pillars or bumps 570 may be formed on the metal vias 27*a* of the bottommost one of the interconnection metal layers 27 of the FOISD 592 at close ends of the openings 585*a* in the polymer layer 585. The specification of the metal pads, pillars or bumps 570 and the process for forming the same may be referred to those as illustrated in FIGS. 26B and 26C. In the case that none of the metal bumps 583 as seen in FIG. 32K are formed on the metal pads 77*e* of the topmost one of the interconnection metal layers 77 of the BISD 79, the resulting structure may be seen in FIG. 32M.

Figure 32L:
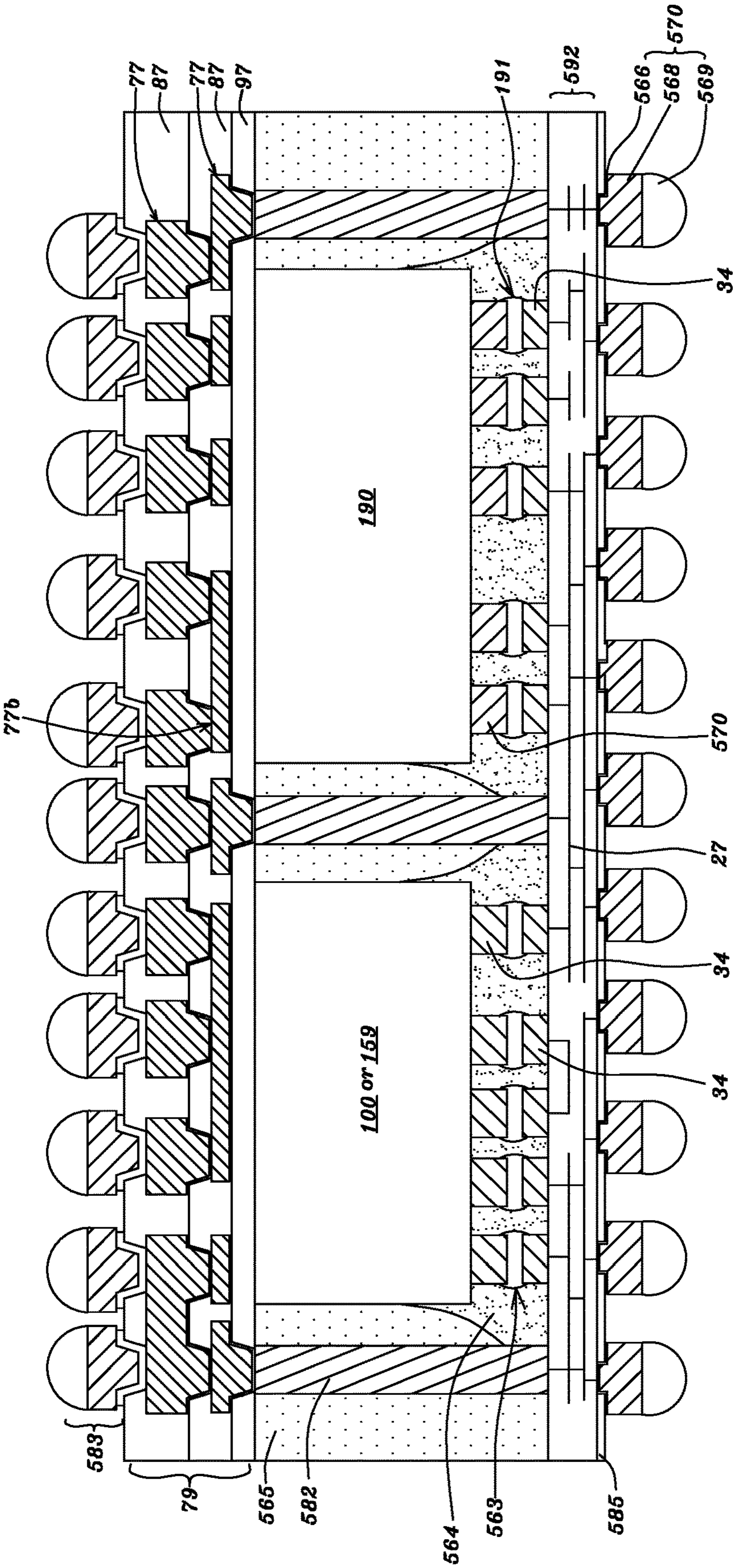
Figure 32M:
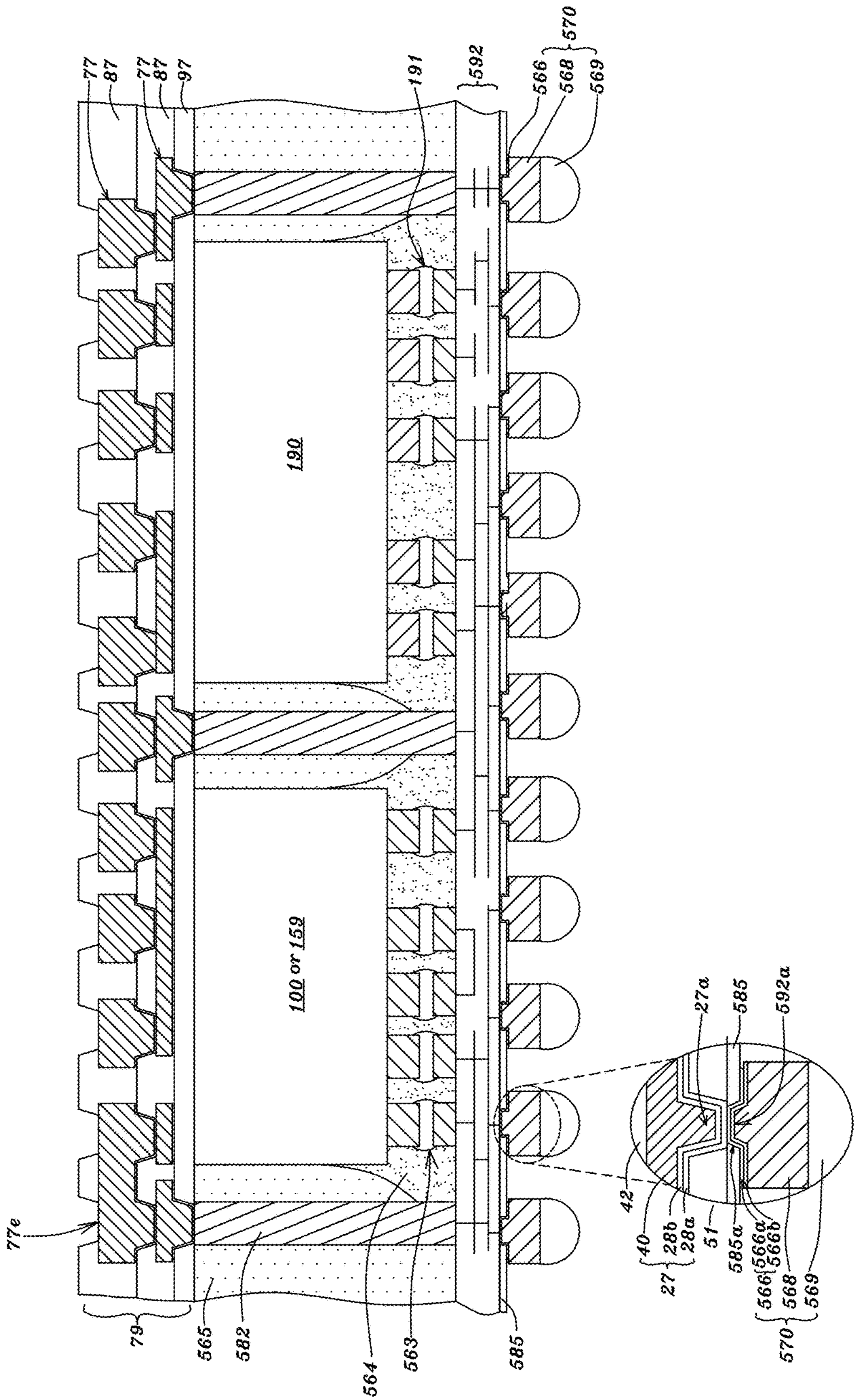
Figure 32N:
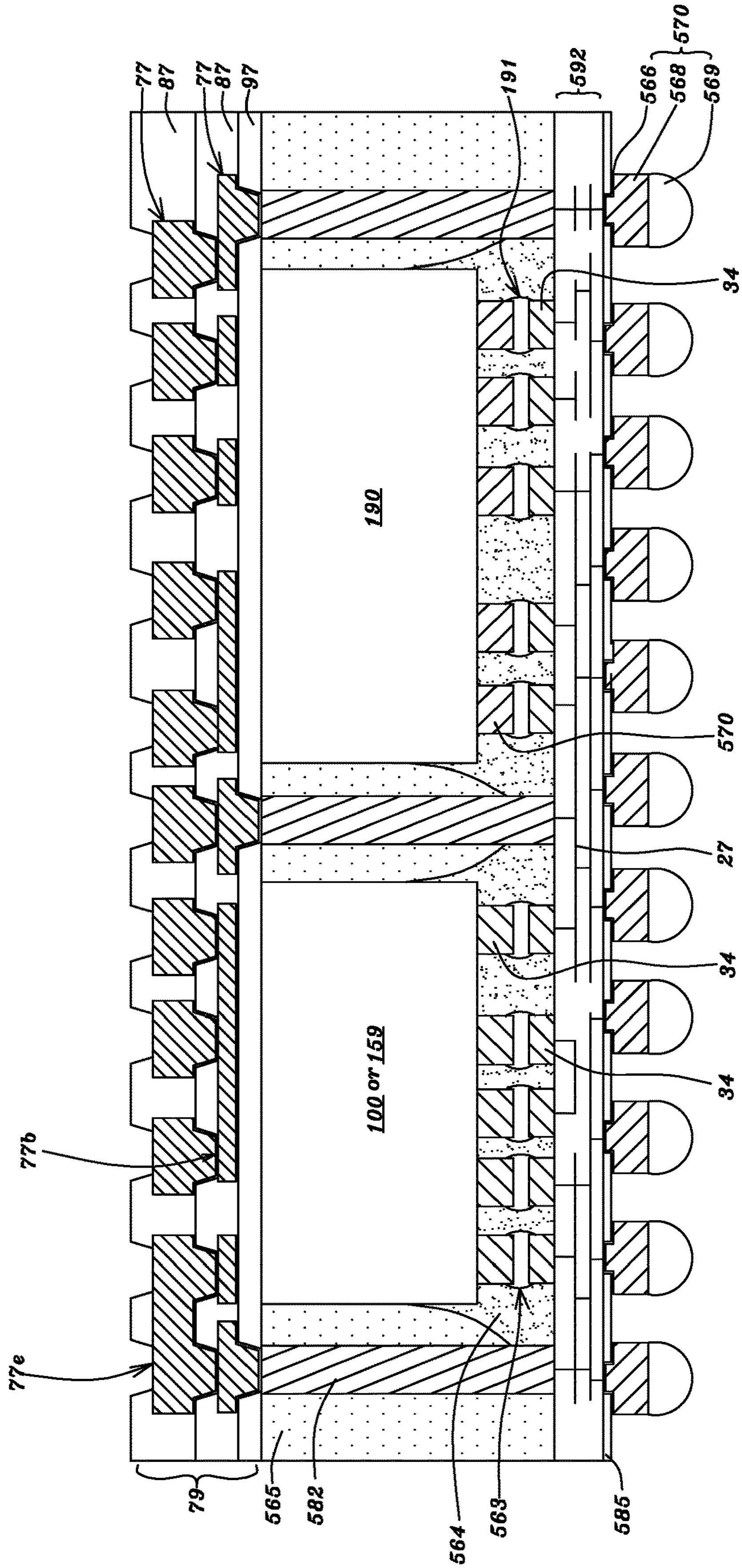

Next, the package structure shown in FIG. 32K or 32M may be separated, cut or diced into multiple individual chip packages, i.e., standard commodity FOIT logic drives 300 or single-layer-packaged logic drive, as shown in FIG. 32L or 32N respectively by a laser cutting process or by a mechanical cutting process.

Referring to FIGS. 32L and 32N, the metal bumps 583 or metal pads 77*e* may be formed over (1) multiple gaps each between neighboring two of the semiconductor chips 100, memory modules 159 and/or operation modules 190 in or of the FOIT logic drive 300, (2) a peripheral area of the FOIT logic drive 300 and outside the edges of the semiconductor chips 100, memory modules 159 and/or operation modules 190 of the COIP logic drive 300, and (3) the backside of each of the semiconductor chips 100, memory modules 159 and/or operation modules 190. The BISD 79 may comprise 1 to 6 layers, or 2 to 5 layers of interconnection metal layers 77. One of the metal pads, lines or traces 77*b* of each of the interconnection metal layers 77 of the BISD 79 may have the adhesion layer 81*a* and electroplating seed layer 81*b* of the adhesion/seed layer 81 only at the bottom thereof, but not at the sidewalls thereof.

Referring to FIGS. 32L and 32N, one of the metal pads, lines or traces 77*b* of each of the interconnection metal layers 77 of the BISD 79 may have a thickness between, for example, 0.3 μm and 40 μm, 0.5 μm and 30 μm, 1 μm and 20 μm, 1 μm and 15 μm, 1 μm and 10 μm, or 0.5 μm to 5 μm, or thicker than or equal to 0.3 μm, 0.7 μm, 1 μm, 2 μm, 3 μm, 5 μm, 7 μm or 10 μm, and a width between, for example, 0.3 μm and 40 μm, 0.5 μm and 30 μm, 1 μm and 20 μm, 1 μm and 15 μm, 1 μm and 10 μm, or 0.5 μm to 5 μm, or wider than or equal to 0.3 μm, 0.7 μm, 1 μm, 2 μm, 3 μm, 5 μm, 7 μm or 10 μm. The polymer layer 87 between neighboring two of the interconnection metal layers 77 of the BISD 79 may have a thickness between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm.

Figure 32O:
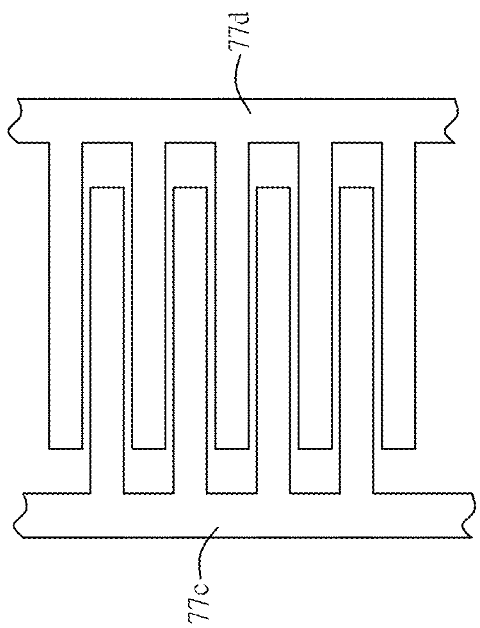

FIG. 32O is a top view showing a metal plane in accordance with an embodiment of the present application.

Referring to FIG. 32O, one of the interconnection metal layers 77 of the BISD 79 as seen in FIG. 32L or 32N may include two metal planes 77*c* and 77*d* used as a power plane and ground plane respectively, wherein the metal planes 77*c* and 77*d* may have a thickness, for example, between 5 μm and 50 μm, 5 μm and 30 μm, 5 μm and 20 μm or 5 μm and 15 μm, or thicker than or equal to 5 μm, 10 μm, 20 μm or 30 μm. Each of the metal planes 77*c* and 77*d* may be layout as an interlaced or interleaved shaped structure or fork-shaped structure, that is, each of the metal planes 77*c* and 77*d* may have multiple parallel-extension sections and a transverse connection section coupling the parallel-extension sections. One of the metal planes 77*c* and 77*d* may have one of the parallel-extension sections arranged between neighboring two of the parallel-extension sections of the other of the metal planes 77*c* and 77*d*.

Alternatively, referring to FIG. 32L or 32N, one of the interconnection metal layers 77, e.g., the topmost one, may include a metal plane, used as a heat dissipater or spreader for heat dissipation or spreading, having a thickness, for example, between 5 μm and 50 μm, 5 μm and 30 μm, 5 μm and 20 μm or 5 μm and 15 μm, or thicker than or equal to 5 μm, 10 μm, 20 μm or 30 μm.

Programing for TSVs, Metal Pads and Metal Pillars or Bumps

Referring to FIGS. 32L and 32N, one of the TPVs 582 may be programmed by one or more of the memory cells 362 in one or more of the DPIIC chips 410, wherein said one or more of the memory cells 362 may be programmed to switch on or off one or more of the cross-point switches 379 distributed in said one or more of the DPIIC chips 410 as seen in FIGS. 3A-3C and 13 to form a signal path from said one of the TPVs 582 to any of the standard commodity FPGA IC chips 200 in a single-die type or in the operation module 190 as seen in FIG. 24G, dedicated I/O chips 265, VMIC chip 324, NVM IC chips 250, HBM IC chips 251, DRAM IC chips 321, PCIC chips 269, dedicated control chip 260, dedicated control and I/O chip 266, DCIAC chip 267, DCDI/OIAC chip 268, memory chips 687 and control chip 688 in each of the memory modules 159 as seen in FIG. 23 in a single-module type or in the operation module 190 as seen in FIG. 24G, and/or memory chip 195 in each of the operation modules 190 as seen in FIG. 24G, in the logic drive 300 as seen in FIGS. 15A-15O through one or more of the programmable interconnects 361 of the inter-chip interconnects 371 provided by the interconnection metal layers 27 of the FOISD 592 and/or the interconnection metal layers 77 of the BISD 79. Thereby, the TPVs 582 may be programmable.

Furthermore, referring to FIGS. 32L and 32N, one of the metal bumps or pillars 570 may be programmed by one or more of the memory cells 362 in one or more of the DPIIC chips 410, wherein said one or more of the memory cells 362 may switch on or off one or more of the cross-point switches 379 distributed in said one or more of the DPIIC chips 410 as seen in FIGS. 3A-3C and 13 to form a signal path from said one of the metal bumps or pillars 570 to any of the standard commodity FPGA IC chips 200 in a single-die type or in the operation module 190 as seen in FIG. 24G, dedicated I/O chips 265, VMIC chip 324, NVM IC chips 250, HBM IC chips 251, DRAM IC chips 321, PCIC chips 269, dedicated control chip 260, dedicated control and I/O chip 266, DCIAC chip 267, DCDI/OIAC chip 268, memory chips 687 and control chip 688 in each of the memory modules 159 as seen in FIG. 23 in a single-module type or in the operation module 190 as seen in FIG. 24G, and/or memory chip 195 in each of the operation modules 190 as seen in FIG. 24G, in the logic drive 300 as seen in FIGS. 15A-15O through one or more of the programmable interconnects 361 of the inter-chip interconnects 371 provided by the interconnection metal layers 27 of the FOISD 592 and/or the interconnection metal layers 77 of the BISD 79. Thereby, the metal bumps or pillars 570 may be programmable.

Furthermore, referring to FIG. 32L or 32N, one of the metal bumps 583 or metal pads 77*e* may be programmed by one or more of the memory cells 362 in one or more of the DPIIC chips 410, wherein said one or more of the memory cells 362 may switch on or off one or more of the cross-point switches 379 distributed in said one or more of the DPIIC chips 410 as seen in FIGS. 3A-3C and 13 to form a signal path from said one of the metal bumps 583 or metal pads 77*e* to any of the standard commodity FPGA IC chips 200 in a single-die type or in the operation module 190 as seen in FIG. 24G, dedicated I/O chips 265, VMIC chip 324, NVM IC chips 250, HBM IC chips 251, DRAM IC chips 321, PCIC chips 269, dedicated control chip 260, dedicated control and I/O chip 266, DCIAC chip 267, DCDI/OIAC chip 268, memory chips 687 and control chip 688 in each of the memory modules 159 as seen in FIG. 23 in a single-module type or in the operation module 190 as seen in FIG. 24G, and/or memory chip 195 in each of the operation modules 190 as seen in FIG. 24G, in the logic drive 300 as seen in FIGS. 15A-15O through one or more of the programmable interconnects 361 of the inter-chip interconnects 371 provided by the interconnection metal layers 27 of the FOISD 592 and/or the interconnection metal layers 77 of the BISD 79. Thereby, the metal bumps 583 or metal pads 77*e* may be programmable.

Interconnection for FOIT Logic Drive with FOISD and BISD

Figure 33A:
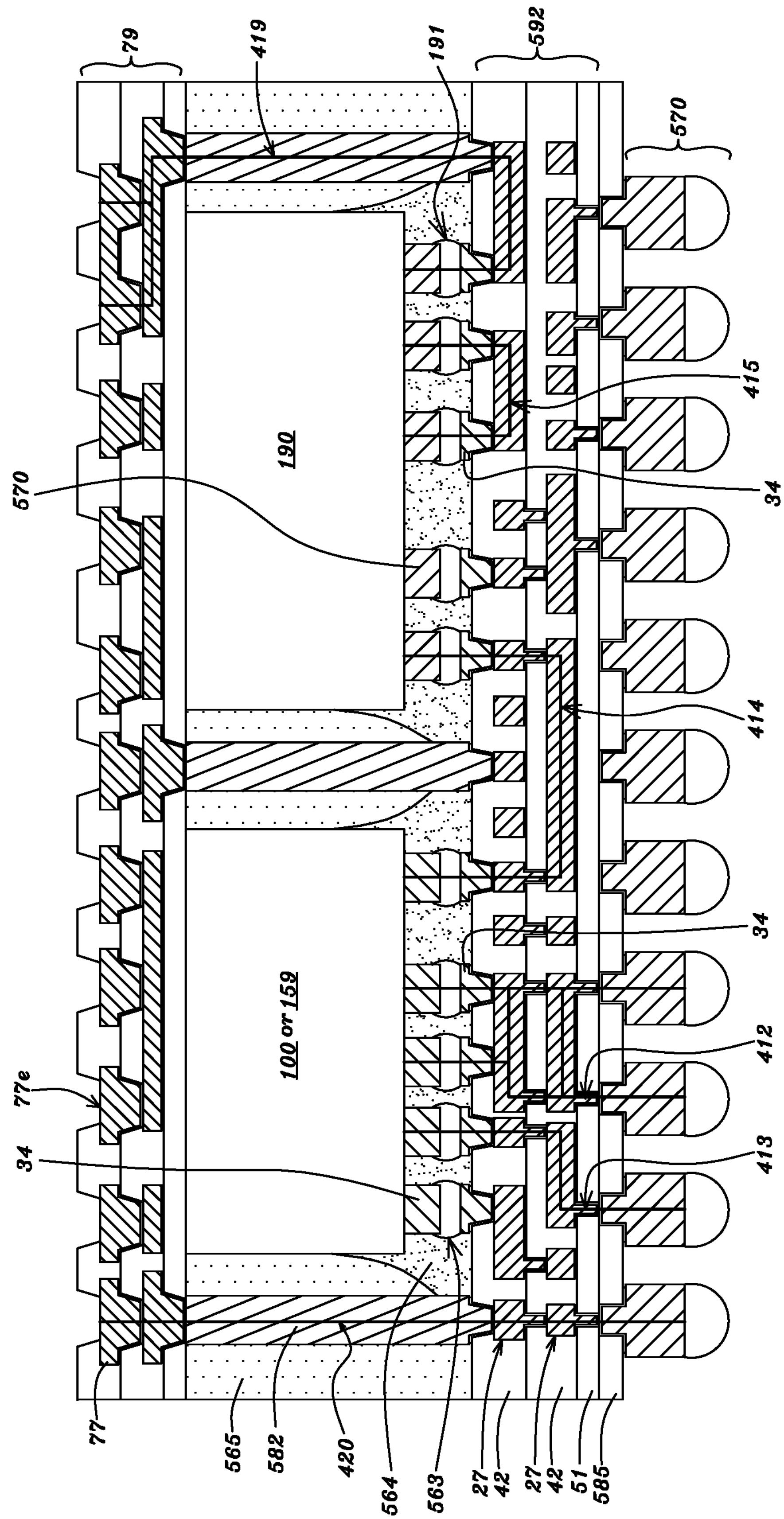
FIGS. 33A-33C are cross-sectional views showing various interconnection nets in a FOIT logic drive in accordance with various embodiments of the present application.
Figure 33B:
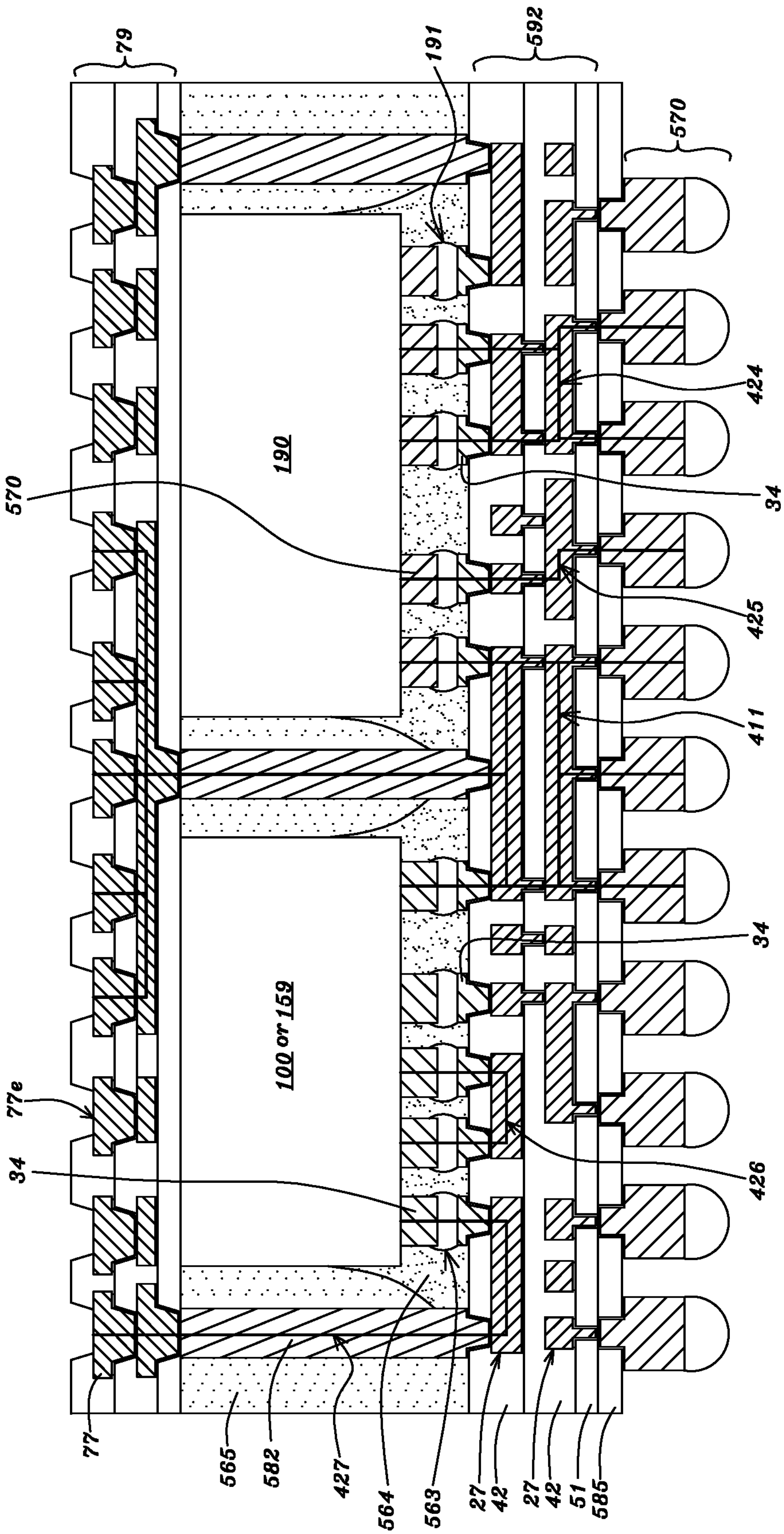
Figure 33C:
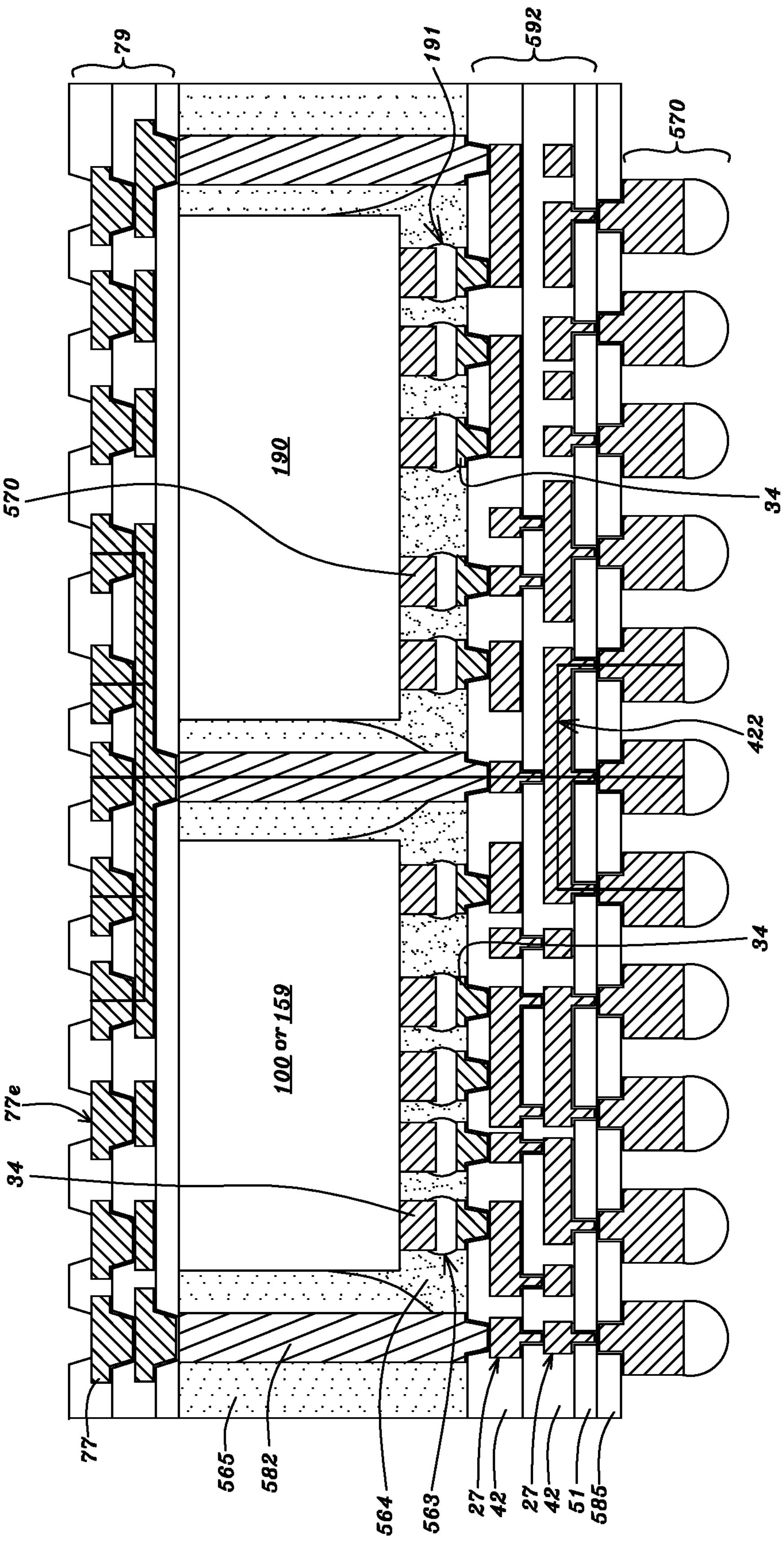

FIGS. 33A-33C are cross-sectional views showing various interconnection nets in a FOIT logic drive in accordance with various embodiments of the present application.

Referring to FIG. 33B, the interconnection metal layers 27 of the FOISD 592 may connect one or more of the metal pillars or bumps 570 to one or more of the semiconductor chips 100, memory modules 159 and/or operation modules 190 and connect one of the semiconductor chips 100, memory modules 159 and/or operation modules 190 to another of the semiconductor chips 100, memory modules 159 and/or operation modules 190. For a first case, the interconnection metal layers 27 of the FOISD 592, the interconnection metal layers 77 of the BISD 79 and the TPVs 582 may compose a first interconnection net 411 connecting multiple of the metal pillars or bumps 570 to each other or one another, connecting multiple of the semiconductor chips 100, memory modules 159 and/or operation modules 190 to each other or one another and connecting multiple of the metal pads 77*e* to each other or one another. Said multiple of the metal pillars or bumps 570, said multiple of the semiconductor chips 100, memory modules 159 and/or operation modules 190 and said multiple of the metal pads 77*e* may be connected together by the first interconnection net 411. The first interconnection net 411 may be a signal bus for delivering signals or a power or ground plane or bus for delivering power or ground supply.

Referring to FIG. 33A, for a second case, the interconnection metal layers 27 of the FOISD 592 may compose a second interconnection net 412 connecting multiple of the metal pillars or bumps 570 to each other or one another and connecting multiple of the bonded contacts 563 between one of the semiconductor chips 100 and/or memory modules 159 and the FOISD 592 to each other or one another. Said multiple of the metal pillars or bumps 570 and said multiple of the bonded contacts 563 may be connected together by the second interconnection net 412. The second interconnection net 412 may be a signal bus for delivering signals or a power or ground plane or bus for delivering power or ground supply.

Referring to FIG. 33B, for a third case, the interconnection metal layers 27 of the FOISD 592 may compose a third interconnection net 424 connecting multiple of the metal pillars or bumps 570 to each other or one another and connecting multiple of the bonded contacts 191 between one of the operation modules 190 and the FOISD 592 to each other or one another. Said multiple of the metal pillars or bumps 570 and said multiple of the bonded contacts 191 may be connected together by the third interconnection net 424. The third interconnection net 424 may be a signal bus for delivering signals or a power or ground plane or bus for delivering power or ground supply.

Referring to FIG. 33A, for a fourth case, the interconnection metal layers 27 of the FOISD 592 may compose a fourth interconnection net 413 connecting one of the metal pillars or bumps 570 to one of the bonded contacts 563 between one of the semiconductor chips 100 and/or memory modules 159 and the FOISD 592. The fourth interconnection net 413 may be a signal bus or trace for signal transmission or a power or ground plane or bus for delivering power or ground supply.

Referring to FIG. 33B, for a fifth case, the interconnection metal layers 27 of the FOISD 592 may compose a fifth interconnection net 425 connecting one of the metal pillars or bumps 570 to one of the bonded contacts 191 between one of the operation modules 190 and the FOISD 592. The fifth interconnection net 425 may be a signal bus or trace for signal transmission or a power or ground plane or bus for delivering power or ground supply.

Referring to FIG. 33A, for a sixth case, the interconnection metal layers 27 of the FOISD 592 may compose a sixth interconnection net 414 not connecting to any of the metal pillars or bumps 570 and metal pads 77*e* of the FOIT logic drive 300 but connecting multiple of the semiconductor chips 100, memory modules 159 and/or operation modules 190 to each other or one another. The sixth interconnection net 414 may be one of the programmable interconnects 361 of the inter-chip interconnects 371 for signal transmission.

Referring to FIG. 33A, for a seventh case, the interconnection metal layers 27 of the FOISD 592 may compose a seventh interconnection net 415 not connecting to any of the metal pillars or bumps 570 and metal pads 77*e* of the FOIT logic drive 300 but connecting multiple of the bonded contacts 191 between one of the operation modules 190 and the FOISD 592 to each other or one another. The seventh interconnection net 415 may be a signal bus or trace for signal transmission or a power or ground plane or bus for delivering power or ground supply.

Referring to FIG. 33B, for an eighth case, the interconnection metal layers 27 of the FOISD 592 may compose an eighth interconnection net 426 not connecting to any of the metal pillars or bumps 570 and metal pads 77*e* of the FOIT logic drive 300 but connecting multiple of the bonded contacts 563 between one of the semiconductor chips 100 and/or memory modules 159 and the FOISD 592 to each other or one another. The eighth interconnection net 426 may be a signal bus or trace for signal transmission or a power or ground plane or bus for delivering power or ground supply.

Referring to FIG. 33A-33C, the interconnection metal layers 77 of the BISD 79 may be connected to the interconnection metal layers 27 of the FOISD 592 through the TPVs 582. For example, each of the metal pads 77*e* of the BISD 79 in a first group may be connected to one of the semiconductor chips 100, memory modules 159 and/or operation modules 190 through the interconnection metal layers 77 of the BISD 79, one or more of the TPVs 582 and the interconnection metal layers 27 of the FOISD 592, in sequence, as provided by the first interconnection net 411. Furthermore, one of the metal pads 77*e* in the first group may be further connected to one or more of the metal pillars or bumps 570 through, in sequence, the interconnection metal layers 77 of the BISD 79, one or more of the TPVs 582 and the interconnection metal layers 27 of the FOISD 592, as provided by the first interconnection net 411. Alternatively, multiple of the metal pads 77*e* in the first group may be connected to each other or one another through the interconnection metal layers 77 of the BISD 79 and to one or more of the metal pillars or bumps 570 through, in sequence, the interconnection metal layers 77 of the BISD 79, one or more of the TPVs 582 and the interconnection metal layers 27 of the FOISD 592, wherein said multiple of the metal pads 77*e* in the first group may be divided into a first subset of one or ones over a backside of one of the semiconductor chips 100 and/or memory modules 159 and a second subset of one or ones over a backside of one of the operation modules 190, as provided by the first interconnection net 411. Alternatively, one or multiple of the metal pads 77*e* in the first group may be connected to one of the operation modules 190 but not connected to any of the metal pillars or bumps 570 of the FOIT logic drive 300, as provided by a ninth interconnection net 419 in FIG. 33A. Alternatively, one or multiple of the metal pads 77*e* in the first group may be connected to one of the semiconductor chips 100 and/or memory modules 159 but not connected to any of the metal pillars or bumps 570 of the FOIT logic drive 300, as provided by a tenth interconnection net 427 in FIG. 33B.

Referring to FIGS. 33A-33C, each of the metal pads 77*e* of the BISD 79 in a second group may not be connected to any of the semiconductor chips 100, memory modules 159 and/or operation modules 190 of the FOIT logic drive 300 but connected to one or more of the metal pillars or bumps 570 through the interconnection metal layers 77 of the BISD 79, one or more of the TPVs 582 and the interconnection metal layers 27 of the FOISD 592, in sequence, as provided by an eleventh interconnection net 420 in FIG. 33A and a twelfth interconnection net 422 in FIG. 33C. Alternatively, multiple of the metal pads 77*e* of the BISD 79 in the second group may not be connected to any of the semiconductor chips 100, memory modules 159 and/or operation modules 190 of the FOIT logic drive 300 but connected to each other or one another through the interconnection metal layers 77 of the BISD 79 and to one or more of the metal pillars or bumps 570 through, in sequence, the interconnection metal layers 77 of the BISD 79, one or more of the TPVs 582 and the interconnection metal layers 27 of the FOISD 592, wherein said multiple of the metal pads 77*e* in the second group may be divided into a first subset of one or ones over a backside of one of the semiconductor chips 100 and/or memory modules 159 and a second subset of one or ones over a backside of one of the operation modules 190, as provided by the eighth interconnection net 422 in FIG. 33C.

Figure 33D:
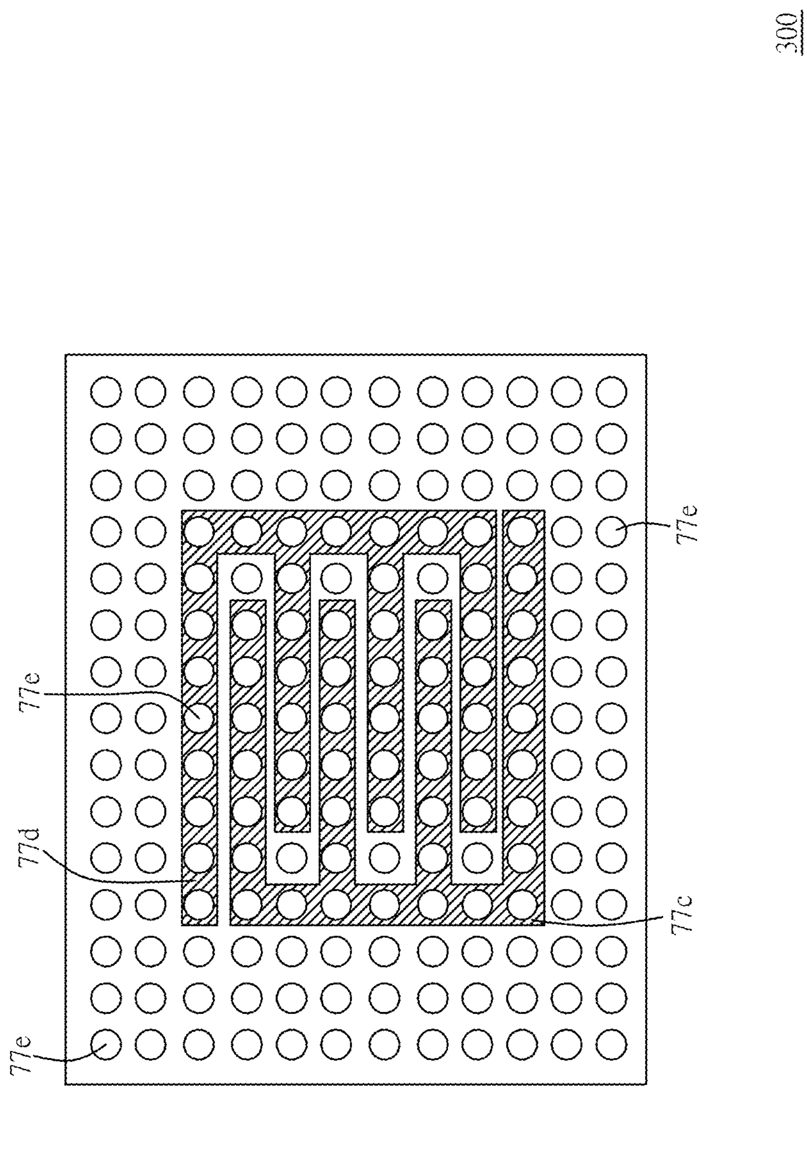
FIG. 33D is a top view of FIGS. 33A-33C, showing a layout of metal pads of a logic drive in accordance with an embodiment of the present application.

Referring to FIGS. 33A-33C, one of the interconnection metal layers 77 in the BISD 79 may include the power plane 77*c* and ground plane 77*d* of a power supply as shown in FIG. 33D. FIG. 33D is a top view of FIGS. 33A-33C, showing a layout of metal pads of a logic drive in accordance with an embodiment of the present application. Referring to FIG. 33D, the metal pads 77*e* may be layout in an array at a backside of the FOIT logic drive 300. Some of the metal pads 77*e* may be vertically aligned with the semiconductor chips 100, memory modules 159 and/or operation modules 190. A first group of the metal pads 77*e* is arranged in an array in a central region of a backside surface of the chip package, i.e., FOIT logic drive 300, and a second group of the metal pads 77*e* may be arranged in an array in a peripheral region, surrounding the central region, of the backside surface of the chip package, i.e., FOIT logic drive 300. More than 90% or 80% of the metal pads 77*e* in the first group may be used for power supply or ground reference. More than 50% or 60% of the metal pads 77*e* in the second group may be used for signal transmission. The metal pads 77*e* in the second group may be arranged from one or more rings, such as 1 2, 3, 4, 5 or 6 rings, along the edges of the backside surface of the chip package, i.e., FOIT logic drive 300. The minimum pitch of the metal pads 77*e* in the second group may be smaller than that of the metal pads 77*e* in the first group.

Alternatively, referring to FIGS. 33A-33C, one of the interconnection metal layers 77 of the BISD 79, such as the topmost one, may include a thermal plane for heat dispassion and one or more of the TPVs 582 may be provided as thermal vias formed under the thermal plane for heat dispassion.

Package-on-Package (POP) or Stack-Package Assembly for FOIT Logic Drives

Figure 34A:
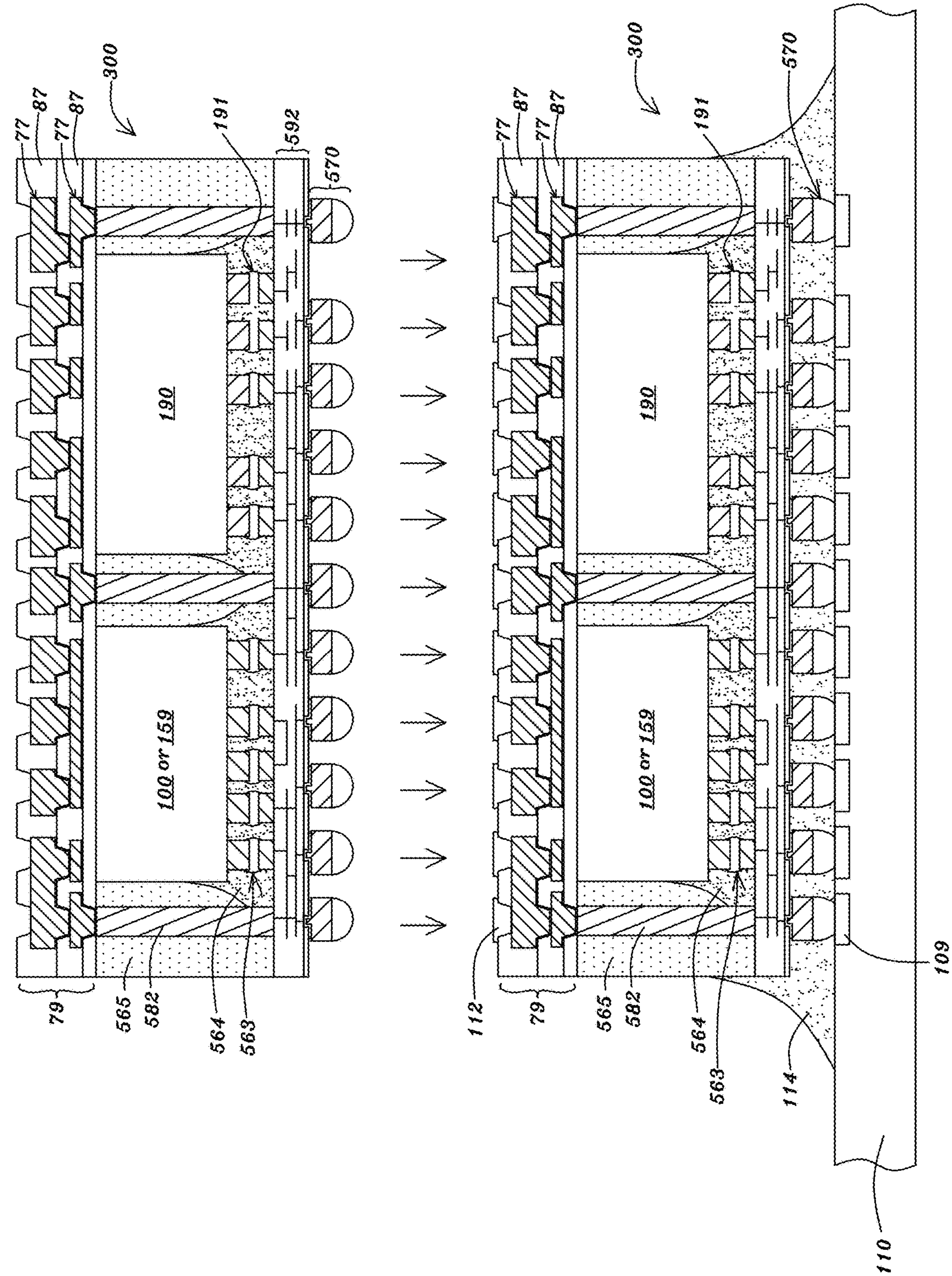
FIGS. 34A-34F are schematically views showing a process for fabricating a package-on-package assembly in accordance with an embodiment of the present application.

FIGS. 34A-34F are schematically views showing a process for fabricating a package-on-package assembly in accordance with an embodiment of the present application. Referring to FIG. 34A, when a top one of the FOIT logic drives 300 as seen in FIG. 32N is mounted onto a bottom one of the FOIT logic drives 300 as seen in FIG. 32N, the bottom one of the FOIT logic drives 300 may have its BISD 79 to couple the FOISD 592 of the top one of the FOIT logic drives 300 via the metal pillars or bumps 570 provided from the top one of the FOIT logic drives 300. The process for fabricating a package-on-package assembly is mentioned as below:

First, referring to FIG. 34A, a plurality of the bottom one of the FOIT logic drive 300 (only one is shown) as seen in FIG. 32N may have its metal pillars or bumps 570 mounted onto multiple metal pads 109 of a circuit carrier or substrate 110 at a topside thereof, such as Printed Circuit Board (PCB), Ball-Grid-Array (BGA) substrate, flexible circuit film or tape, or ceramic circuit substrate. An underfill 114 may be filled into a gap between the circuit carrier or substrate 110 and the bottom one of the FOIT logic drives 300. Alternatively, the underfill 114 may be skipped. Next, a surface-mount technology (SMT) may be used to mount a plurality of the top one of the FOIT logic drives 300 (only one is shown) as seen in FIG. 32N onto the plurality of the bottom one of the FOIT logic drives 300. Solder or solder cream or flux 112 may be first printed on the metal pads 77*e* of the BISD 79 of the bottom one of the FOIT logic drives 300.

Figure 34B:
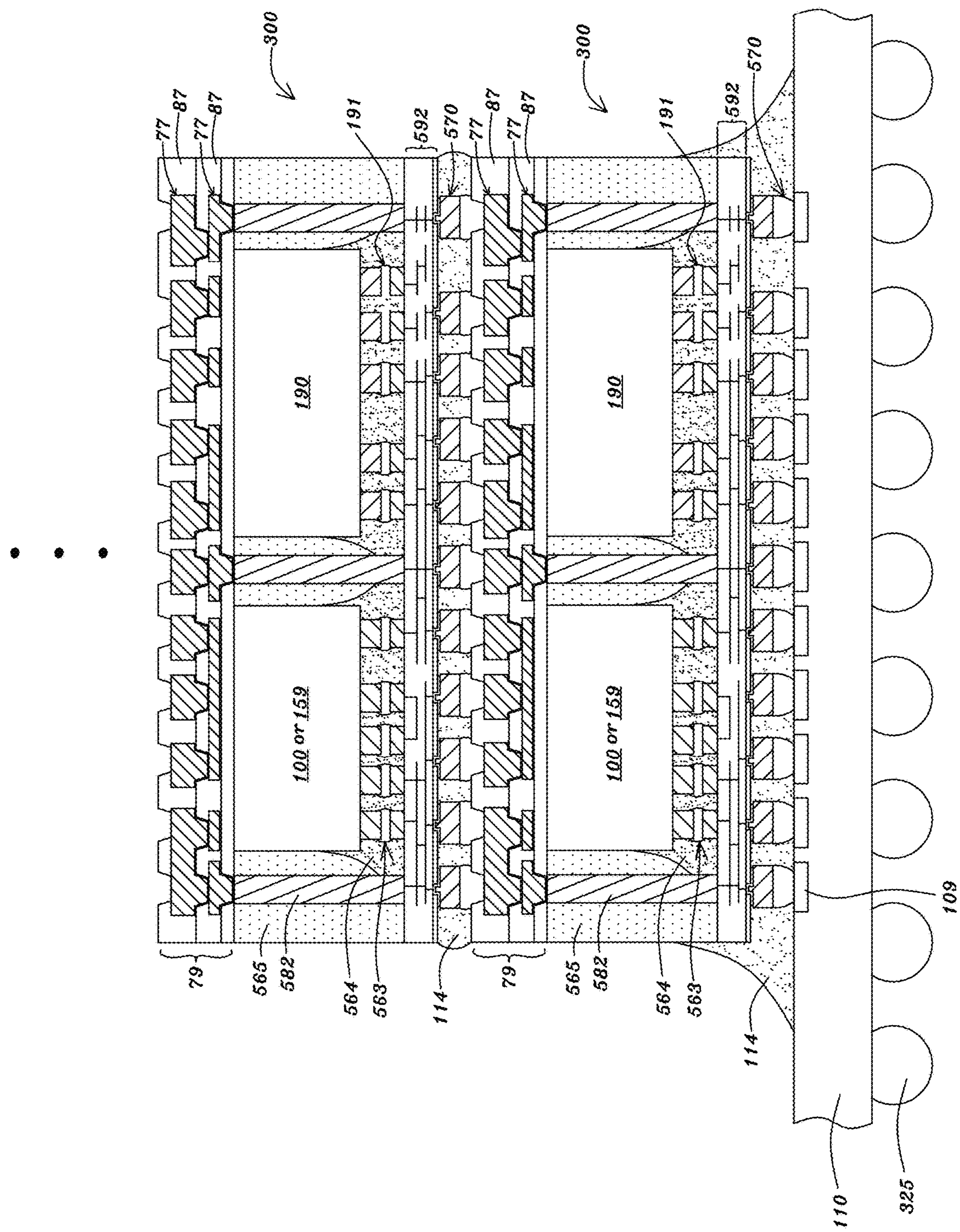

Next, referring to FIGS. 34A and 34B, the top one of the FOIT logic drives 300 may have its metal pillars or bumps 570 placed on the solder or solder cream or flux 112. Next, referring to FIG. 34B, a reflowing or heating process may be performed to fix the metal pillars or bumps 570 of the top one of the FOIT logic drives 300 to the metal pads 77*e* of the BISD 79 of the bottom one of the FOIT logic drives 300. Next, an underfill 114 may be filled into a gap between the top and bottom ones of the FOIT logic drives 300. Alternatively, the underfill 114 may be skipped.

In the next optional step, referring to FIG. 34B, other multiple of the FOIT logic drives 300 as seen in FIG. 32N may have its metal pillars or bumps 570 to be mounted onto the metal pads 77*e* of the BISD 79 of the plurality of the top one of the FOIT logic drives 300 using the surface-mount technology (SMT) and the underfill 114 is then optionally formed therebetween. The step may be repeated by multiple times to form the FOIT logic drives 300 stacked in three-layered fashion or more-than-three-layered fashion on the circuit carrier or substrate 110.

Next, referring to FIG. 34B, multiple solder balls 325 are planted on a backside of the circuit carrier or substrate 110. Next, referring to FIG. 34C, the circuit carrier or structure 110 may be separated, cut or diced into multiple individual substrate units 113, such as Printed Circuit Boards (PCBs), Ball-Grid-Array (BGA) substrates, flexible circuit films or tapes, or ceramic circuit substrates, by a laser cutting process or by a mechanical cutting process. Thereby, the number i of the FOIT logic drives 300 may be stacked on one of the substrate units 113, wherein the number i may be equal to or greater than 2, 3, 4, 5, 6, 7 or 8.

Figure 34C:
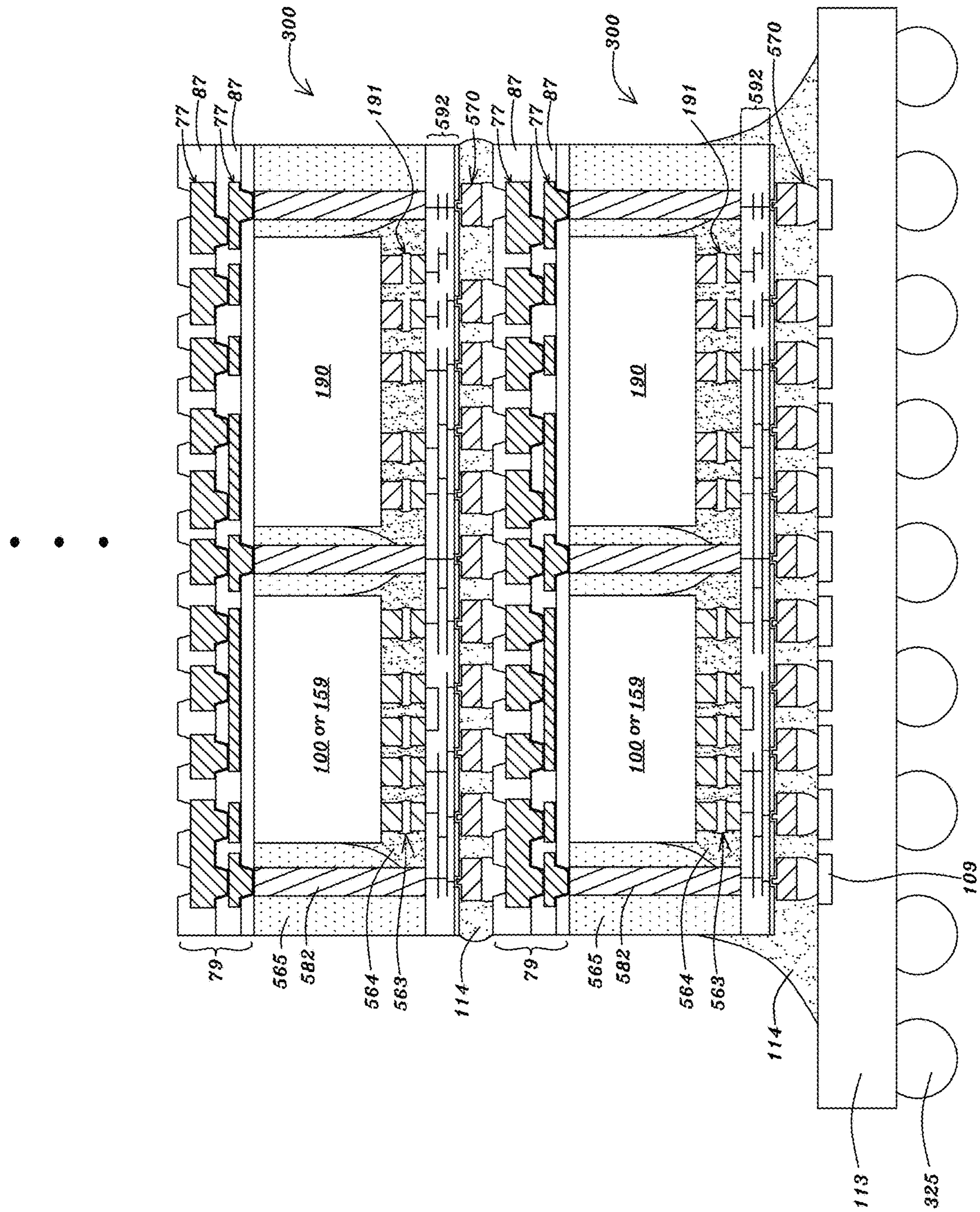
Figure 34D:
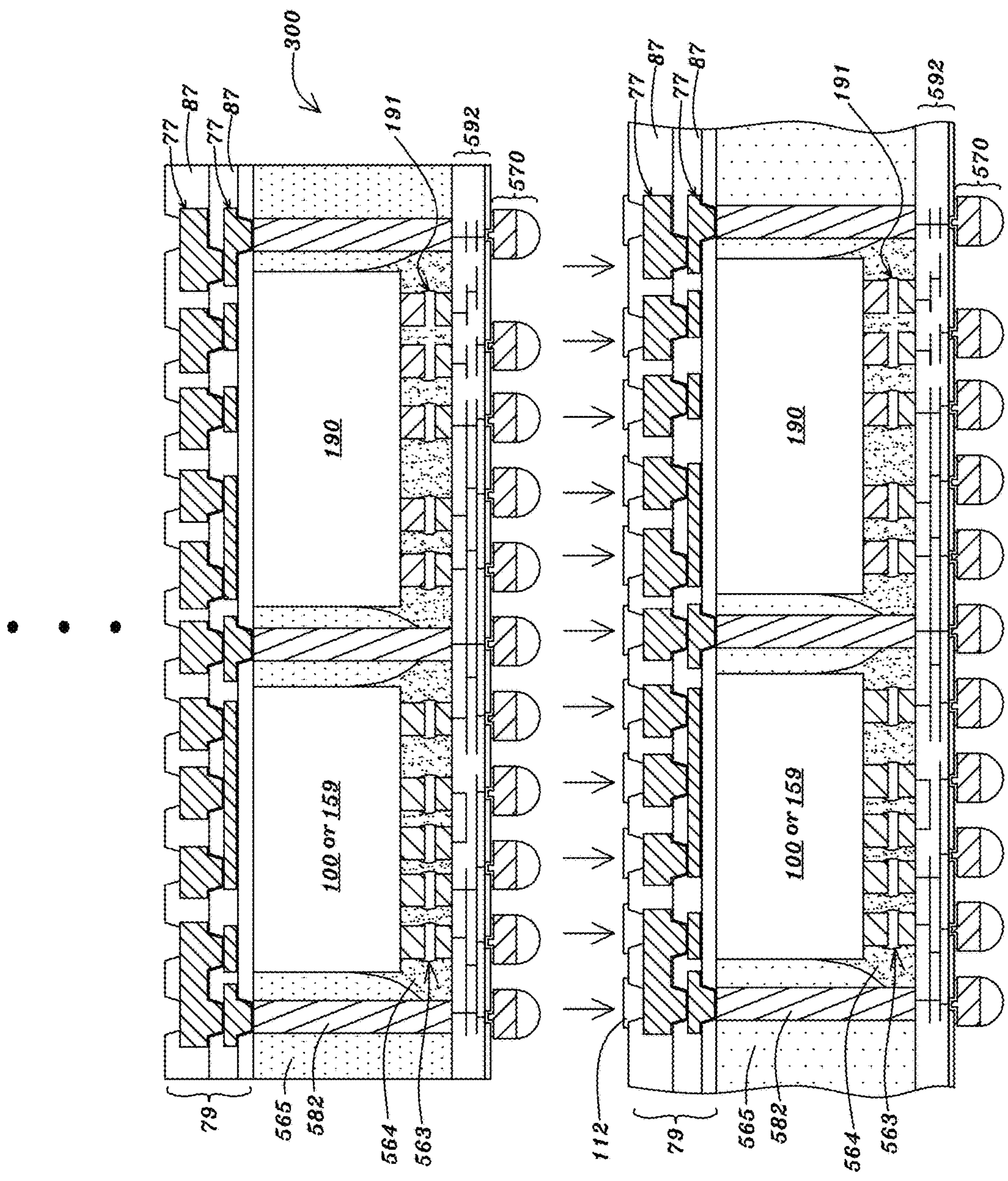
Figure 34E:
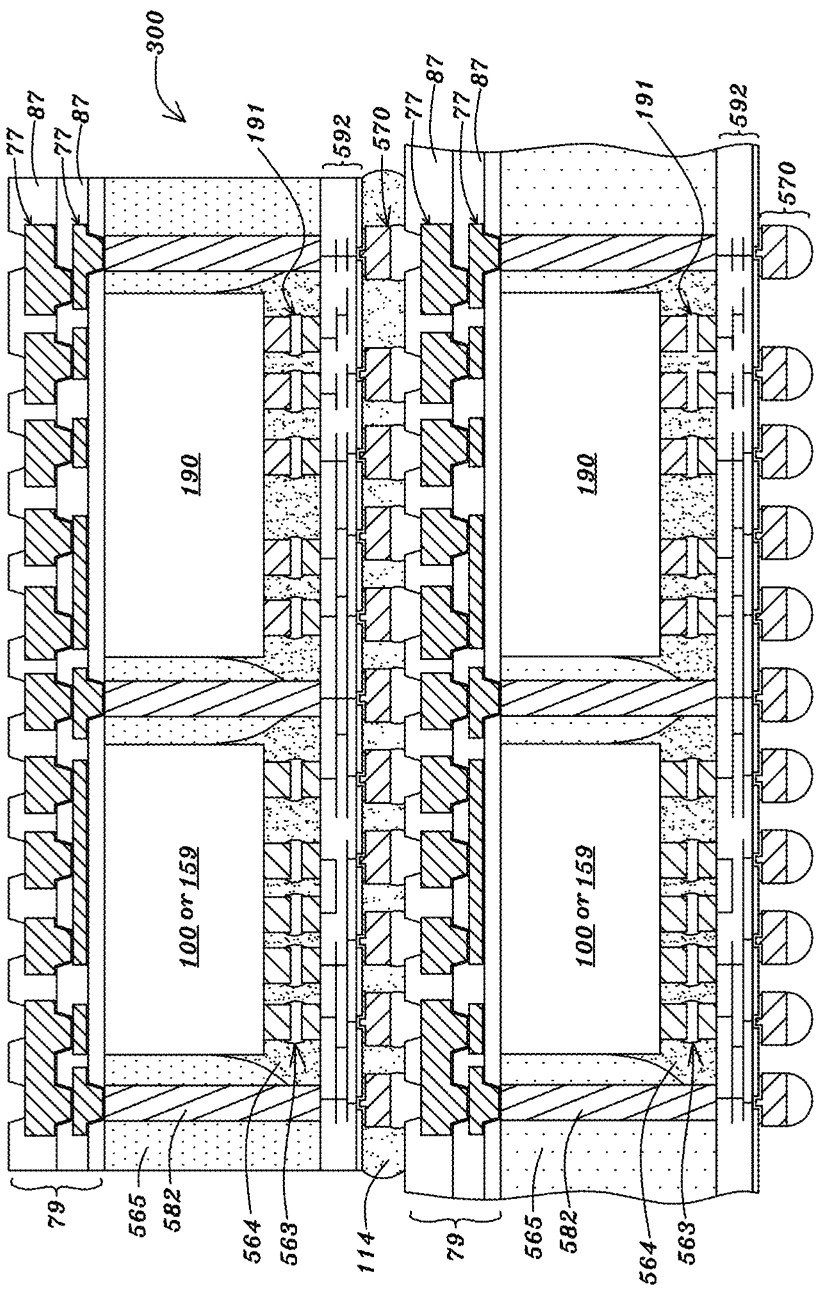
Figure 34F:
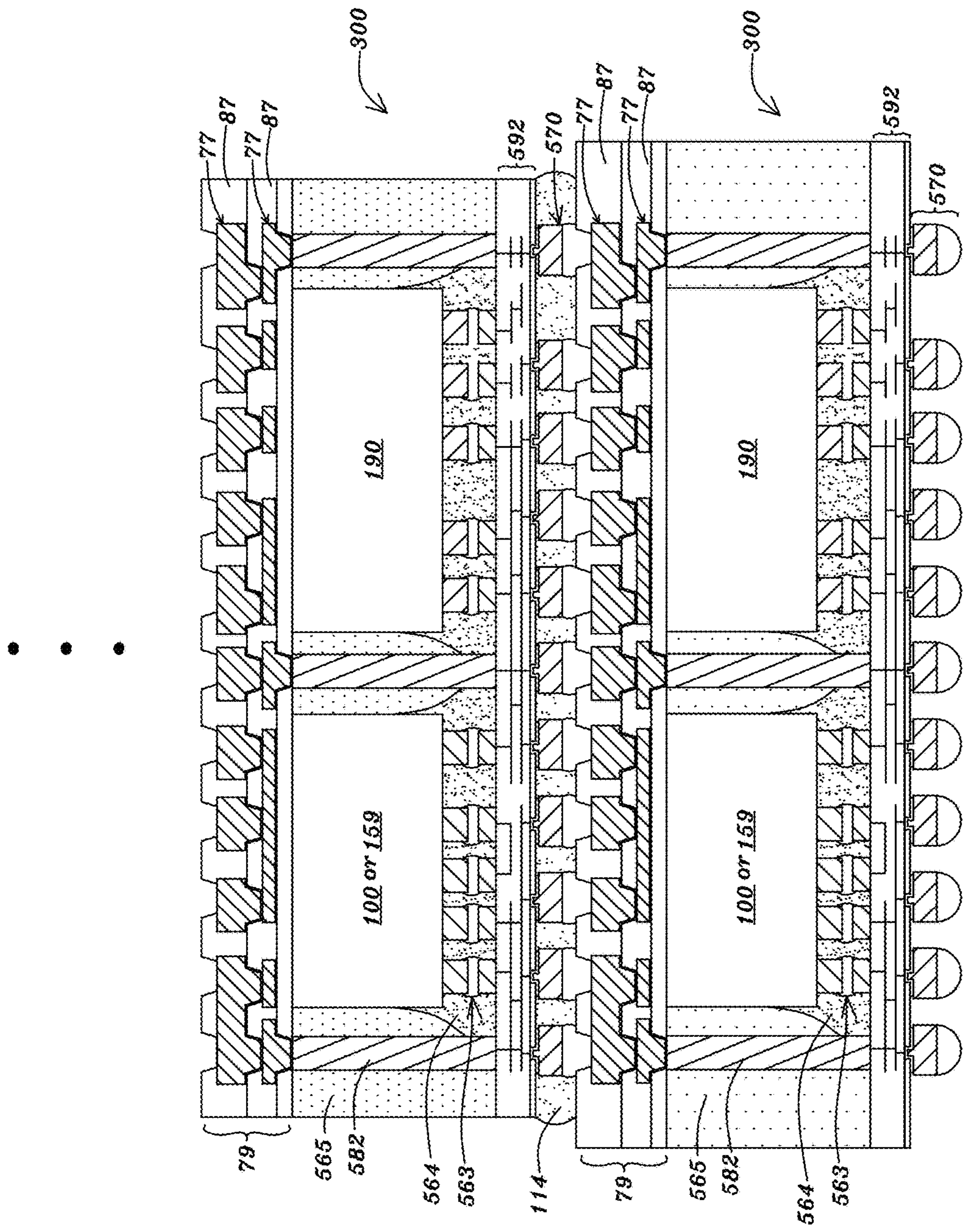

Alternatively, FIGS. 34D-34F are schematically views showing a process for fabricating a package-on-package assembly in accordance with an embodiment of the present application. Referring to FIGS. 34D and 34E, a plurality of the top one of the FOIT logic drive 300 as seen in FIG. 32N may have its metal pillars or bumps 570 fixed or mounted, using the SMT technology, to the metal pads 77*e* of the BISD 79 of the structure in a wafer or panel level as seen in FIG. 32M before being separated into a plurality of the bottom one of the FOIT logic drives 300.

Next, referring to FIG. 34E, the underfill 114 may be filled into a gap between each of the top ones of the FOIT logic drives 300 and the structure in a wafer or panel level as seen in FIG. 32M. Alternatively, the underfill 114 may be skipped.

In the next optional step, referring to FIG. 34E, other multiple of the FOIT logic drives 300 as seen in FIG. 32N may have its metal pillars or bumps 570 to be mounted onto the metal pads 77*e* of the BISD 79 of the plurality of the top one of the FOIT logic drives 300 using the surface-mount technology (SMT) and the underfill 114 is then optionally formed therebetween. The step may be repeated by multiple times to form the FOIT logic drives 300 stacked in two-layered fashion or more-than-two-layered fashion on the structure in a wafer or panel level as seen in FIG. 32M.

Next, referring to FIG. 34F, the structure in a wafer or panel level as seen in FIG. 32M may be separated, cut or diced into a plurality of the bottom one of the FOIT logic drives 300 by a laser cutting process or by a mechanical cutting process. Thereby, the number i of the FOIT logic drives 300 may be stacked together, wherein the number i may be equal to or greater than 2, 3, 4, 5, 6, 7 or 8. Next, the FOIT logic drives 300 stacked together may have a bottommost one provided with the metal pillars or bumps 570 to be mounted onto the multiple metal pads 109 of the circuit carrier or substrate 110 as seen in FIG. 34A, such as ball-grid-array substrate, at a topside thereof. Next, an underfill 114 may be filled into a gap between the circuit carrier or substrate 110 and the bottommost one of the FOIT logic drives 300. Alternatively, the underfill 114 may be skipped. Next, multiple solder balls 325 are planted on a backside of the circuit carrier or substrate 110. Next, the circuit carrier or structure 110 may be separated, cut or diced into multiple individual substrate units 113, such as printed circuit boards (PCB) or BGA (Ball-Grid-array) substrates, by a laser cutting process or by a mechanical cutting process, as seen in FIG. 34C. Thereby, the number i of the FOIT logic drives 300 may be stacked on one of the substrate units 113, wherein the number i may be equal to or greater than 2, 3, 4, 5, 6, 7 or 8.

The FOIT logic drives 300 with the TPVs 582 to be stacked in a vertical direction to form the POP assembly may be in a standard format or have standard sizes. For example, the FOIT logic drives 300 may be in a shape of square or rectangle, with a certain widths, lengths and thicknesses. An industry standard may be set for the shape and dimensions of the FOIT logic drives 300. For example, the standard shape of each of the FOIT logic drives 300 may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm or 5 mm. Alternatively, the standard shape of each of the FOIT logic drives 300 may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm or 5 mm.

Interconnection for Multiple FOIT Logic Drives Stacked together

Figure 35A:
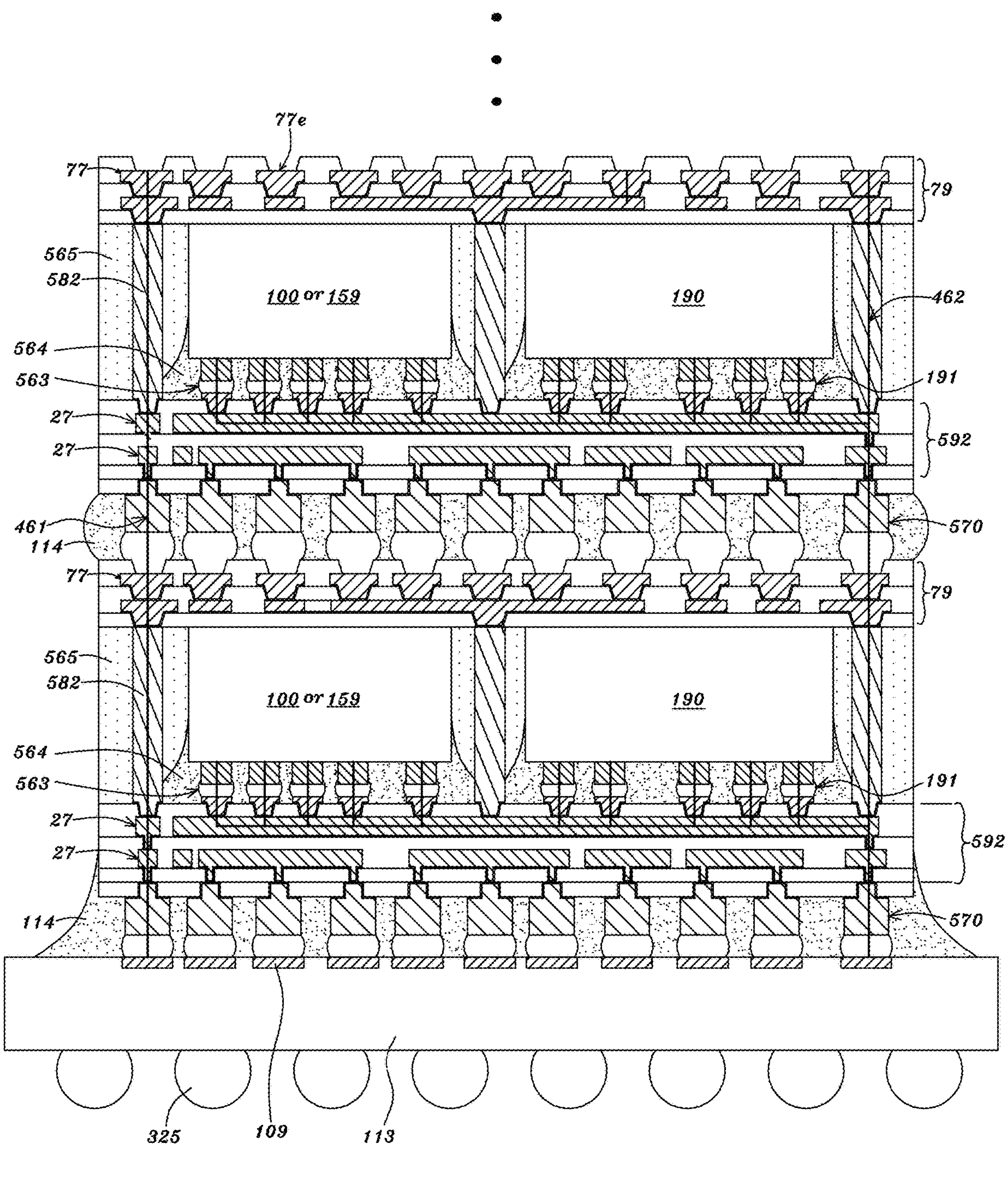
FIGS. 35A-35C are cross-sectional views showing various connection of multiple FOIT logic drives in POP assembly in accordance with embodiment of the present application.
Figure 35B:
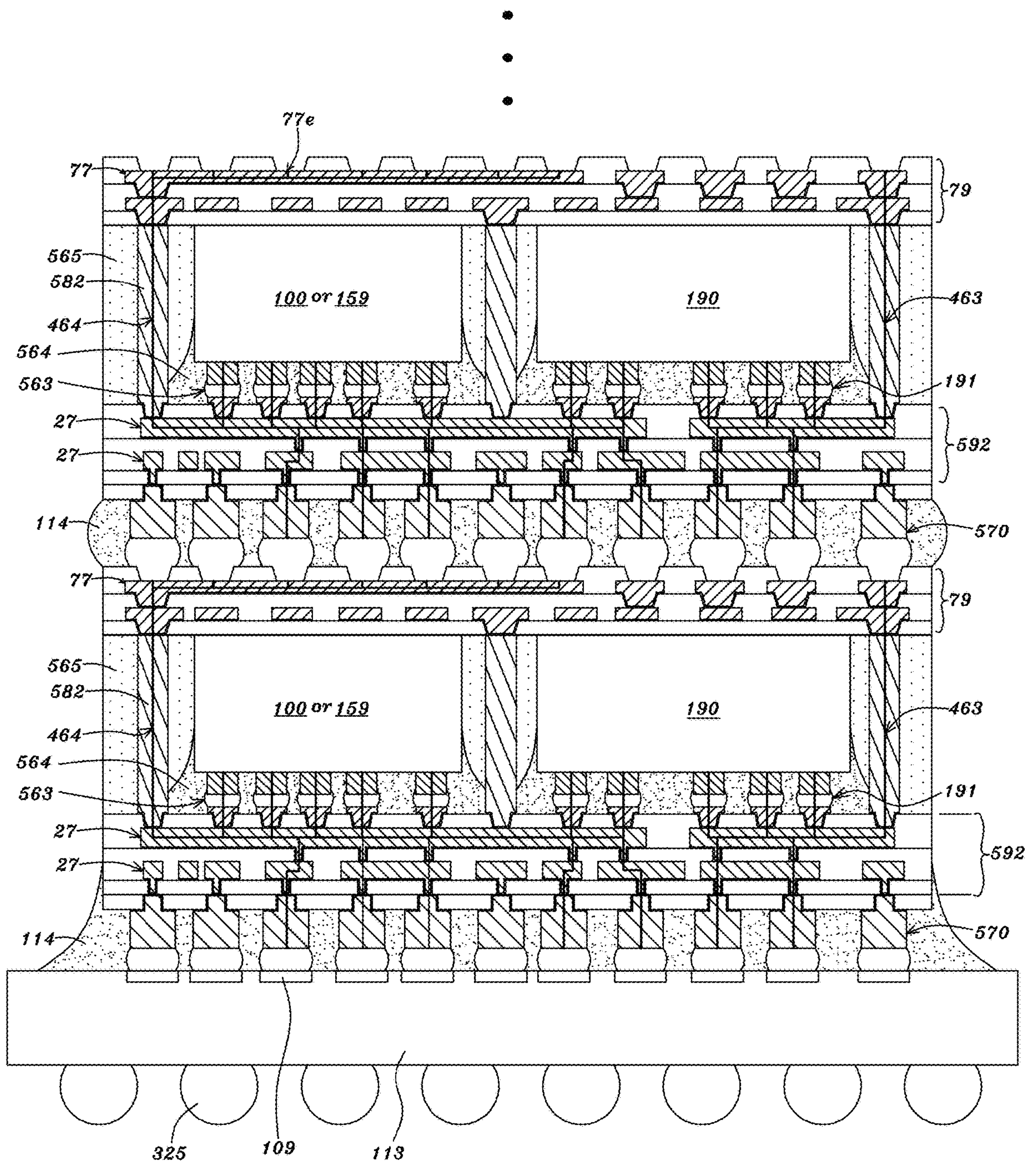
Figure 35C:
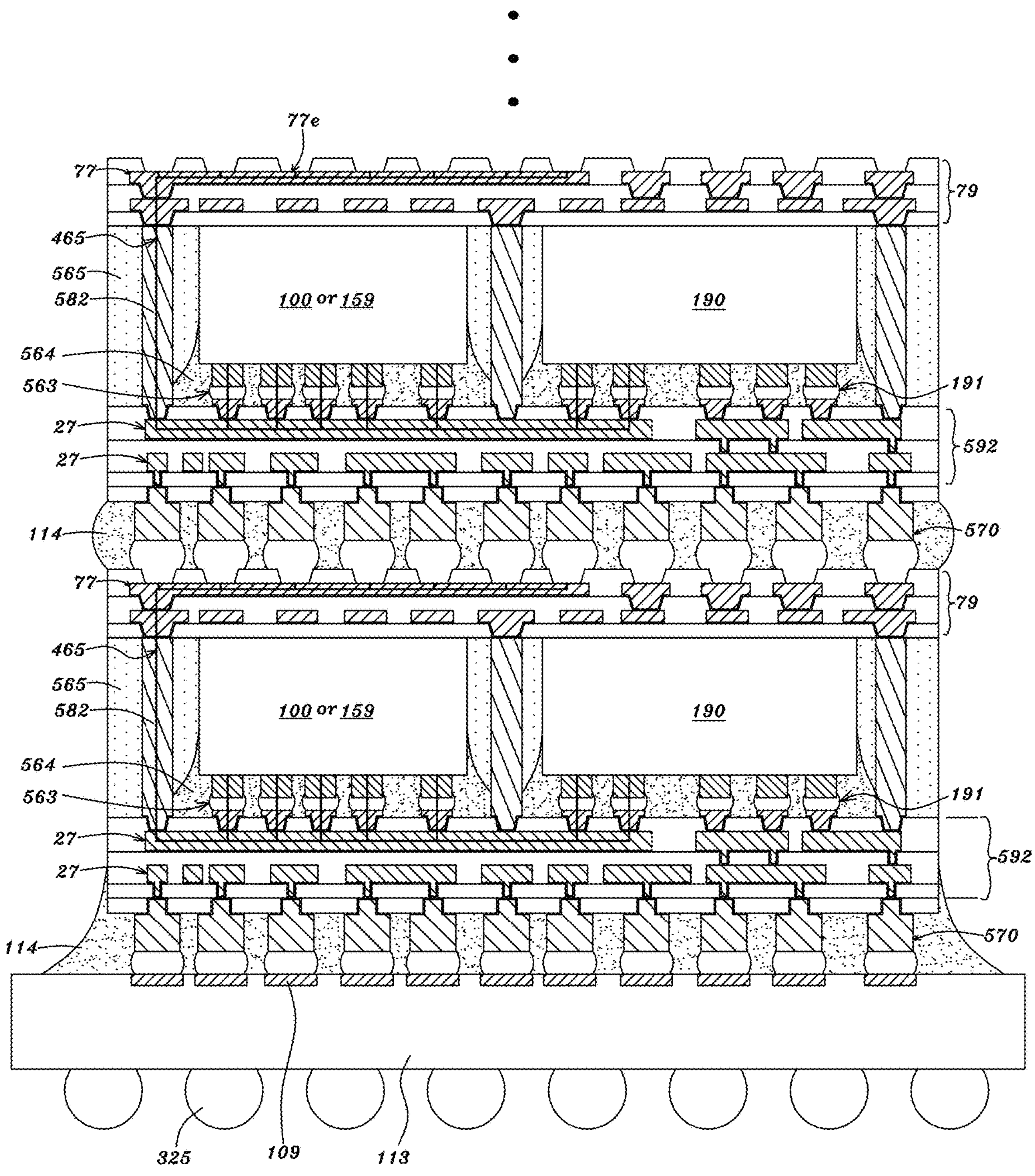

FIGS. 35A-35C are cross-sectional views showing various connection of multiple FOIT logic drives in POP assembly in accordance with embodiment of the present application. Referring to FIG. 35A, in the POP assembly, each of the FOIT logic drives 300 may include one or more of the TPVs 582 used as first inter-drive interconnects 461 stacked and coupled to each other or one another for connecting to an upper one of the FOIT logic drives 300 and/or to a lower one of the FOIT logic drives 300, without connecting or coupling to any of the semiconductor chips 100, memory modules 159 and/or operation modules 190 in the POP assembly. In each of the FOIT logic drives 300, each of the first inter-drive interconnects 461 is formed, from top to bottom, of: (i) one of the metal pads 77*e* of its BISD 79, (ii) a stacked portion of the interconnection metal layers 77 of its BISD 79, (iii) one of its TPVs 582, (iv) a stacked portion of the interconnection metal layers 27 of its FOISD 592, and (v) one of its metal pillars or bumps 570.

Alternatively, referring to FIG. 35A, a second inter-drive interconnect 462 in the POP assembly may be provided like the first inter-drive interconnect 461, but the second inter-drive interconnect 462 may connect or couple to one or more of the semiconductor chips 100, memory modules 159 and/or operation modules 190 through the interconnection metal layers 27 of its FOISD 592.

Alternatively, referring to FIG. 35B, each of the FOIT logic drives 300 may provide a third inter-drive interconnect 463 like the second inter-drive interconnect 462 in FIG. 35A, but the third inter-drive interconnect 463 is not stacked down to one of the metal pillars or bumps 570, which is positioned vertically under the third inter-drive interconnect 463, joining a lower one of the FOIT logic drives 300 or the substrate unit 113. Its third inter-drive interconnect 463 may couple to another one or more of its metal pillars or bumps 570, which are positioned not vertically under its TPVs 582 but vertically under one of its semiconductor chips 100, memory modules 159 and/or operation modules 190, joining a lower one of the FOIT logic drives 300 or the substrate unit 113. Further, its third inter-drive interconnect 463 may connect or couple to one or more of the semiconductor chips 100, memory modules 159 and/or operation modules 190 through the interconnection metal layers 27 of its FOISD 592.

Alternatively, referring to FIG. 35B, each of the FOIT logic drives 300 may provide a fourth inter-drive interconnect 464 composed of (i) a first horizontally-distributed portion of the interconnection metal layers 77 of its BISD 79, (ii) one of its TPVs 582 coupling to one or more of the metal pads 77*e* of the first horizontally-distributed portion, which are vertically over one or more of its semiconductor chips 100, memory modules 159 and/or operation modules 190, and (iii) a second horizontally-distributed portion of the interconnection metal layers 27 of its FOISD 592 connecting or coupling said one of its TPVs 582 to one or more of its semiconductor chips 100, memory modules 159 and/or operation modules 190. The second horizontally-distributed portion of its fourth inter-drive interconnect 464 may couple to its metal pillars or bumps 570, which are positioned not vertically under said one of its TPVs 582 but vertically under said one or more of its semiconductor chips 100, memory modules 159 and/or operation modules 190, joining a lower one of the FOIT logic drives 300 or the substrate unit 113.

Alternatively, referring to FIG. 35C, each of the FOIT logic drives 300 may provide a fifth inter-drive interconnect 465 composed of (i) a first horizontally-distributed portion of the interconnection metal layers 77 of its BISD 79, (ii) one of its TPVs 582 coupling to one or more of the metal pads 77*e* of the first horizontally-distributed portion, which are vertically over one or more of its semiconductor chips 100, memory modules 159 and/or operation modules 190, and (iii) a second horizontally-distributed portion of the interconnection metal layers 27 of its FOISD 592 connecting or coupling said one of its TPVs 582 to one or more of its semiconductor chips 100, memory modules 159 and/or operation modules 190. The second horizontally-distributed portion of its fifth inter-drive interconnect 465 may not couple to any of its metal pillars or bumps 570 joining a lower one of the FOIT logic drives 300 or the substrate unit 113.

Immersive IC Interconnection Environment (IIIE)

Referring to FIGS. 35A-35C, the standard commodity logic drives 300 may be stacked to form a super-rich interconnection scheme or environment, wherein their semiconductor chips 100 represented for the standard commodity FPGA IC chips 200 either in a single-die type and/or in the operation module 190 as seen in FIG. 24G, provided with the programmable logic blocks 201 as illustrated in FIGS. 6A-6J and the cross-point switches 379 as illustrated in FIGS. 3A-3D, immerses in the super-rich interconnection scheme or environment, i.e., programmable 3D Immersive IC Interconnection Environment (IIIE). For one of the standard commodity FPGA IC chips 200 either in a single-die type and/or in the operation module 190 as seen in FIG. 24G in one of the FOIT logic drives 300, (1) the interconnection metal layers 6 and/or 27 of the FISC 20 and/or SISC 29 of said one of the standard commodity FPGA IC chips 200, the bonded contacts 563 or 191 between said one of the standard commodity FPGA IC chips 200 and the FOISD 592 of said one of the FOIT logic drives 300, the interconnection metal layers 27, i.e., inter-chip interconnects 371, of the FOISD 592 of said one of the FOIT logic drives 300, and the metal pillars or bumps 570 between a lower one and said one of the FOIT logic drives 300 are provided under the programmable logic blocks 201 and cross-point switches 379 of said one of the standard commodity FPGA IC chips 200; (2) the interconnection metal layers 77 of the BISD 79 of said one of the FOIT logic drives 300 and the copper pads 77*e* of the BISD 79 of said one of the FOIT logic drives 300 are provided over the programmable logic blocks 201 and cross-point switches 379 of said one of the standard commodity FPGA IC chips 200; and (3) the TPVs 582 of said one of the FOIT logic drives 300 are provided surrounding the programmable logic blocks 201 and cross-point switches 379 of said one of the standard commodity FPGA IC chips 200. The programmable 3D IIIE provides the super-rich interconnection scheme or environment, comprising the FISC 20 and/or SISC 29 of each of the semiconductor chips 100 for the standard commodity FPGA IC chips 200 and DPIIC chips 410, the bonded contacts 563 or 191 between each of the semiconductor chips 100 and one of the FOISD 592, the FOISD 592, BISD 79 of each of the FOIT logic drives, TPVs 582 of each of the FOIT logic drives 300 and metal pillars or bumps 570 between each two of the FOIT logic drives 300, for constructing an interconnection scheme or system in three dimensions (3D). The interconnection scheme or system in a horizontal direction may be programmed by the cross-point switches 379 of each of the standard commodity FPGA IC chips 200 and DPIIC chips 410 of each of the FOIT logic drives 300. Also, the interconnection scheme or system in a vertical direction may be programmed by the cross-point switches 379 of each of the standard commodity FPGA IC chips 200 and DPIIC chips 410 of each of the FOIT logic drives 300.

Figure 36A:
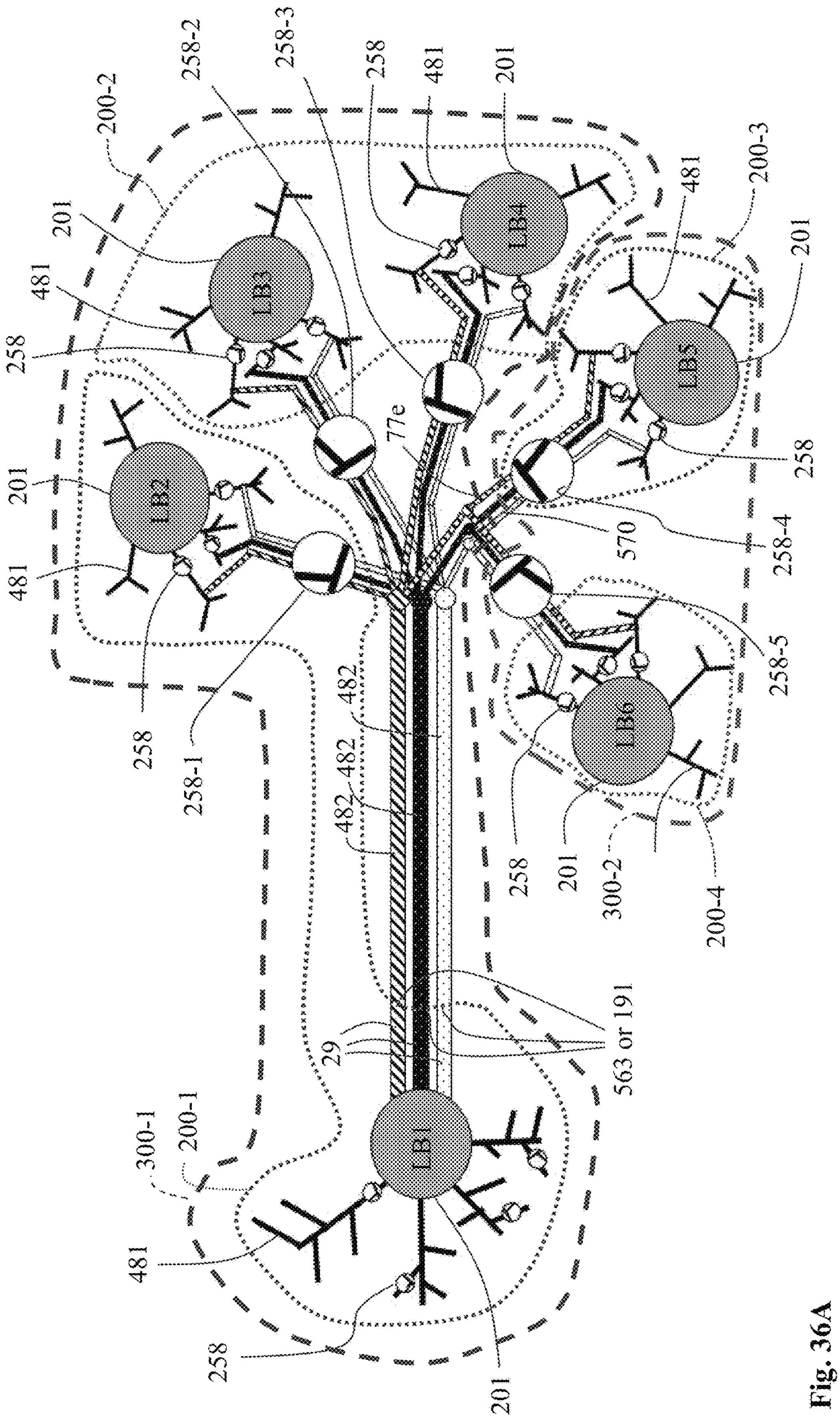
FIGS. 36A and 36B are conceptual views showing interconnection between multiple programmable logic blocks from an aspect of human's nerve system in accordance with an embodiment of the present application.
Figure 36B:
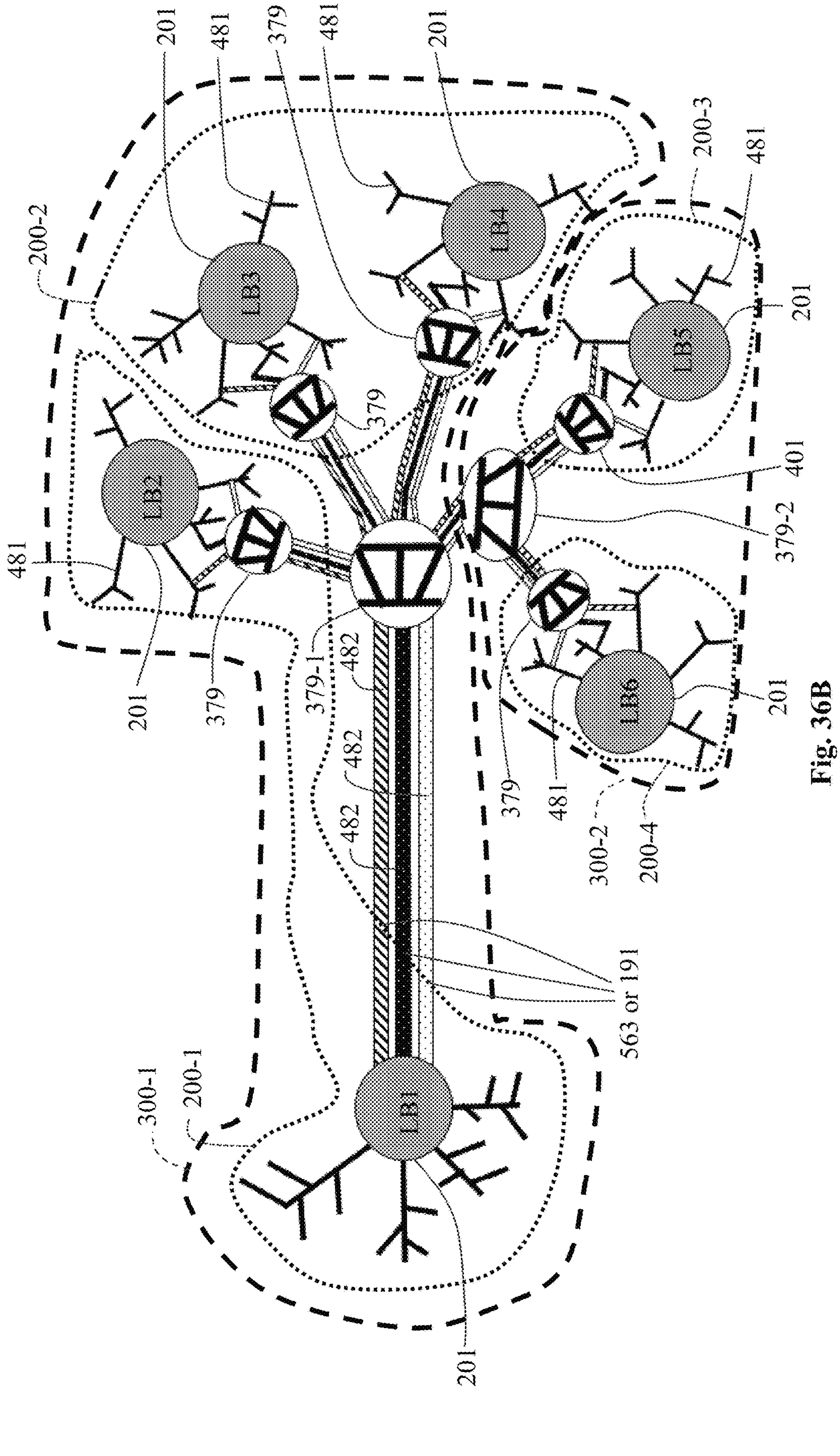

FIGS. 36A and 36B are conceptual views showing interconnection between multiple programmable logic blocks from an aspect of human's nerve system in accordance with an embodiment of the present application. For an element indicated by the same reference number shown in FIGS. 36A and 36B and in above-illustrated figures, the specification of the element as seen in FIGS. 36A and 36B may be referred to that of the element as above illustrated in the figures. Referring to FIG. 36A, the programmable 3D IIIE is similar or analogous to a human brain. The programmable logic blocks 201 as seen in FIG. 6A or 6H are similar or analogous to neurons or nerve cells; the interconnection metal layers 6 of the FISC 20 and/or the interconnection metal layers 27 of the SISC 29 are similar or analogous to the dendrites connecting to the neurons or nerve cells 201. The bonded contacts 563 or 191 connecting to the small receivers 375 of the small I/O circuits 203 of said one of the standard commodity FPGA IC chips 200 for the inputs of the programmable logic blocks 201 of said one of the standard commodity FPGA IC chips 200 are similar or analogous to post-synaptic cells at ends of the dendrites. For a short distance between two of the programmable logic blocks 201 in one of the standard commodity FPGA IC chips 200, the interconnection metal layers 6 of its FISC 20 and/or the interconnection metal layers 27 of its SISC 29 may construct an interconnect 482 like an axon connecting from one of the neurons or nerve cells 201 to another of the neurons or nerve cells 201. For a long distance between two of the standard commodity FPGA IC chips 200, the interconnection metal layers 27 of the FOISDs 592 of the FOIT logic drives 300, the interconnection metal layers 77 of the BISDs 79 of the FOIT logic drives 300 and the TPVs 582 of the FOIT logic drives 300 may construct the axon-like interconnect 482 connecting from one of the neurons or nerve cells 201 to another of the neurons or nerve cells 201. One of the bonded contacts 563 or 191 physically between a first one of the standard commodity FPGA IC chips 200 and one of the FOISDs 592 for physically connecting to the axon-like interconnect 482 may be programmed to connect to the small drivers 374 of the small I/O circuits 203 of a second one of the standard commodity FPGA IC chips 200 and thus is similar or analogous to pre-synaptic cells at a terminal of the axon 482.

For more elaboration, referring to FIG. 36A, a first one 200-1 of the standard commodity FPGA IC chips 200 may include first and second ones LB1 and LB2 of the programmable logic blocks 201 like the neurons, its FISC 20 and/or SISC 29 like the dendrites 481 coupling to the first and second ones LB1 and LB2 of the programmable logic blocks 201 and the cross-point switches 379 programmed for connection of its FISC 20 and/or SISC 29 to the first and second ones LB1 and LB2 of the programmable logic blocks 201. A second one 200-2 of the standard commodity FPGA IC chips 200 may include third and fourth ones LB3 and LB4 of the programmable logic blocks 210 like the neurons, its FISC 20 and/or SISC 29 like the dendrites 481 coupling to the third and fourth ones LB3 and LB4 of the programmable logic blocks 210 and the cross-point switches 379 programmed for connection of its FISC 20 and/or SISC 29 to the third and fourth ones LB3 and LB4 of the programmable logic blocks 210. A first one 300-1 of the FOIP logic drives 300 may include the first and second ones 200-1 and 200-2 of the standard commodity FPGA IC chips 200. A third one 200-3 of the standard commodity FPGA IC chips 200 may include a fifth one LB5 of the programmable logic blocks 201 like the neurons, its FISC 20 and/or SISC 29 like the dendrites 481 coupling to the fifth one LB5 of the programmable logic blocks 201 and its cross-point switches 379 programmed for connection of its FISC 20 and/or SISC 29 to the fifth one LB5 of the programmable logic blocks 201. A fourth one 200-4 of the standard commodity FPGA IC chips 200 may include a sixth one LB6 of the programmable logic blocks 201 like the neurons, its FISC 20 and/or SISC 29 like the dendrites 481 coupling to the sixth one LB6 of the programmable logic blocks 201 and the cross-point switches 379 programmed for connection of its FISC 20 and/or SISC 29 to the sixth one LB6 of the programmable logic blocks 201. A second one 300-2 of the FOIP logic drives 300 may include the third and fourth ones 200-3 and 200-4 of the standard commodity FPGA IC chips 200. (1) A first portion, which is provided by the interconnection metal layers 6 and 27 of the FISC 20 and/or SISC 29 of the first one 200-1 of the standard commodity FPGA IC chips 200, extending from the programmable logic block LB1, (2) one of the bonded contacts 563 or 191 extending from the first portion, (3) a second portion, which is provided by the interconnection metal layers 27 of the FOISD 592 and/or the TPVs 582 of the first one 300-1 of the FOIT logic drives 300 and/or the interconnection metal layers 77 of the BISD 79 of the first one 300-1 of the FOIT logic drives 300, extending from said one of the bonded contacts 563 or 191, (4) the other one of the bonded contacts 563 or 191 extending from the second portion, and (5) a third portion, which is provided by the interconnection metal layers 6 and 27 of the FISC 20 and/or SISC 29 of the first one 200-1 of the standard commodity FPGA IC chips 200, extending from the other one of the bonded contacts 563 or 191 to the programmable logic block LB2 may compose the axon-like interconnect 482. The axon-like interconnect 482 may be programmed to connect the first one LB1 of the programmable logic block 201 to one or more of the second through sixth ones LB2, LB3, LB4, LB5 and LB6 of the programmable logic blocks 201 according to switching of first through fifth ones 258-1 through 258-5 of the pass/no-pass switches 258 of the cross-point switches 379 set on the axon-like interconnect 482. The first one 258-1 of the pass/no-pass switches 258 may be arranged in the first one 200-1 of the standard commodity FPGA IC chips 200. The second and third ones 258-2 and 258-3 of the pass/no-pass switches 258 may be arranged in one of the DPIIC chips 410 in the first one 300-1 of the FOIT logic drives 300. The fourth one 258-4 of the pass/no-pass switches 258 may be arranged in the third one 200-3 of the standard commodity FPGA IC chips 200. The fifth one 258-5 of the pass/no-pass switches 258 may be arranged in one of the DPIIC chips 410 in the second one 300-2 of the FOIT logic drives 300. The first one 300-1 of the FOIT logic drives 300 may have the metal pads 77*e* coupling to the second one 300-2 of the FOIT logic drives 300 through the metal bumps or pillars 570. Alternatively, the first through fifth ones 258-1 through 258-5 of the pass/no-pass switches 258 set on the axon-like interconnect 482 may be omitted. Alternatively, the pass/no-pass switches 258 set on the dendrites-like interconnect 481 may be omitted.

Furthermore, referring to FIG. 36B, the axon-like interconnect 482 may be considered as a scheme or structure of a tree including (i) a trunk or stem connecting to the first one LB1 of the programmable logic blocks 201, (ii) multiple branches branching from the trunk or stem for connecting its trunk or stem to one or more of the second and sixth ones LB2-LB6 of the programmable logic blocks 201, (iii) a first one 379-1 of the cross-point switches 379 set between its trunk or stem and each of its branches for switching the connection between its trunk or stem and one of its branches, (iv) multiple sub-branches branching from one of its branches for connecting said one of its branches to one or more of the fifth and sixth ones LB5 and LB6 of the programmable logic blocks 201, and (v) a second one 379-2 of the cross-point switches 379 set between said one of its branches and each of its sub-branches for switching the connection between said one of its branches and one or more of its sub-branches. The first one 379-1 of the cross-point switches 379 may be provided in one of the DPIIC chips 410 in the first one 300-1 of the FOIT logic drives 300, and the second one 379-2 of the cross-point switches 379 may be provided in one of the DPIIC chips 410 in the second one 300-2 of the FOIT logic drives 300. Each of the dendrite-like interconnects 481 may include (i) a stem connecting to one of the first through sixth ones LB1-LB6 of the programmable logic blocks 201, (ii) multiple branches branching from the stem, (iii) a cross-point switch 379 set between its stem and each of its branches for switching the connection between its stem and one or more of its branches. Each of the programmable logic blocks 201 of one of the standard commodity FPGA IC chips 200-1 through 200-4 may couple to multiple of the dendrite-like interconnects 481 composed of the interconnection metal layers 6 and/or 27 of the FISC 20 and/or SISC 29 of said one of the standard commodity FPGA IC chips 200-1 through 200-4. Each of the programmable logic blocks 201 may be coupled to a distal terminal of one or more of the axon-like interconnects 482 through the dendrite-like interconnects 481 extending from said each of the programmable logic blocks 201.

Referring to FIGS. 36A and 36B, each of the FOIT logic drives 300-1 and 300-2 may provide a reconfigurable plastic, elastic and/or integral (granular) architecture for system/machine computing or processing using integral (granular) and alterable memory units and logic units in each of the programmable logic blocks 201, in addition to the sequential, parallel, pipelined or Von Neumann computing or processing system architecture and/or algorithm. Each of the FOIT logic devices 300-1 and 300-2 with plasticity, elasticity and integrality (granularity) may include integral, granular and alterable memory units and logic units to alter or reconfigure logic functions and/or computing (or processing) architecture (or algorithm) and/or memories (data or information) in the memory units. The properties of the plasticity, elasticity and integrality (granularity) of the FOIT logic drive 300-1 or 300-2 is similar or analogous to that of a human brain. The brain or nerves have plasticity, elasticity and integrality (granularity). Many aspects of brain or nerves can be altered (or are "plastic" or "elastic") and reconfigured through adulthood. The FOIT logic drives 300-1 and 300-2, or standard commodity FPGA IC chips 200-1, 200-2, 200-3 and 200-4, described and specified above provide capabilities to alter or reconfigure the logic functions and/or computing (or processing) architecture (or algorithm) for a given fixed hardware by changing configuration programing memory (CPM) (data or information) stored in the near-by configuration programing memory (CPM) cells in the standard commodity FPGA IC chips 200 in a single-die type or in the operation modules 190 as seen in FIG. 15A-15O, e.g., programming codes stored in the memory cells 362 in the standard commodity FPGA IC chips 200 in a single-die type or in the operation modules 190 as seen in FIG. 15A-15O for the cross-point switches 379 or pass/no-pass switches 258 as seen in FIGS. 7A-7C and programming codes or resulting values stored in the memory cells 490 in the standard commodity FPGA IC chips 200 in a single-die type or in the operation modules 190 as seen in FIG. 15A-15O for the look-up tables 210 as seen in FIG. 6A or 6H. In the FOIT logic drives 300-1 and 300-2, the data or information stored in the configuration programming memory (CPM) cells of are used for altering or reconfiguring the logic functions and/or computing/processing architecture (or algorithm). In the FOIT logic drives 300-1 and 300-2, multiple data information memory (DIM) cells of the HBM IC chips 251, VMIC chip 324, DRAM IC chips 321, or memory chips 687 in the memory modules 159 in a single-module type as illustrated in FIG. 23 or in the operation modules 190 as illustrated in FIGS. 24A-24G are used for storing data or information, i.e., data information memory (DIM).

Figure 36C:
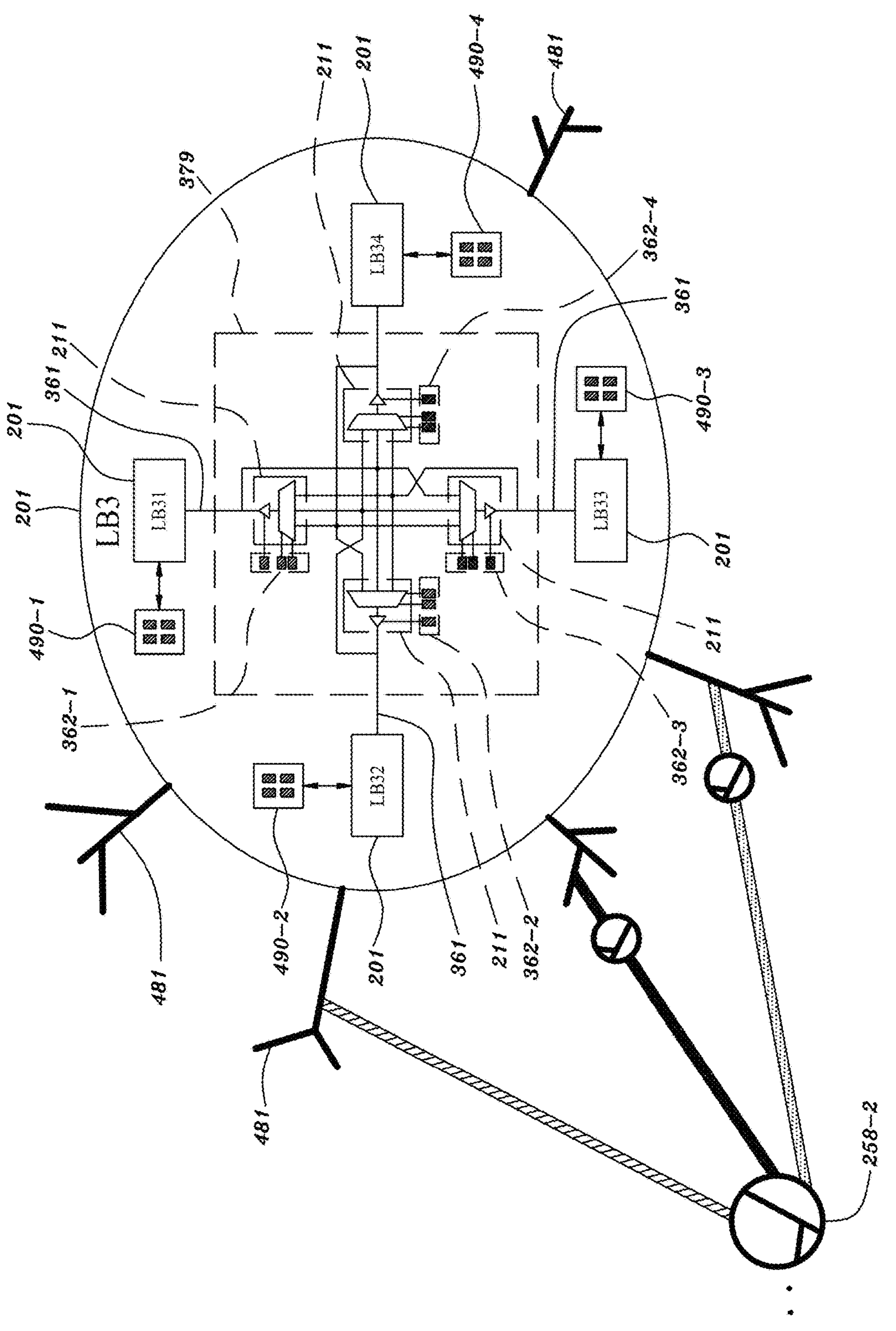
FIG. 36C is a schematic diagram for a reconfigurable plastic, elastic and/or integral architecture in accordance with an embodiment of the present application.

For example, FIG. 36C is a schematic diagram for a reconfigurable plastic, elastic and/or integral architecture in accordance with an embodiment of the present application. Referring to FIG. 36C, the third one LB3 of the programmable logic blocks 201 may include four logic units LB31, LB32, LB33 and LB34, a cross-point switch 379, eight sets of configuration programing memory (CPM) cells 362-1, 362-2, 362-3, 362-4, 490-1, 490-2, 490-3 and 490-4. The cross-point switch 379 may be referred to one as illustrated in FIG. 7B. For an element indicated by the same reference number shown in FIGS. 36C and 7B, the specification of the element as seen in FIG. 36C may be referred to that of the element as illustrated in FIG. 7B. The four programmable interconnects 361 at four ends of the cross-point switch 379 may couple to the four logic units LB31, LB32, LB33 and LB34. Each of the logic units LB31, LB32, LB33 and LB34 may have the same architecture as the logic block 201 illustrated in FIG. 6A or 6H with its output Dout or one of its inputs A0-A3 coupling to one of the four programmable interconnects 361 at the four ends of the cross-point switch 379. Each of the logic units LB31, LB32, LB33 and LB34 may couple to one of the four sets of configuration programing memory (CPM) cells 490-1, 490-2, 490-3 and 490-4 for storing data for each event and/or storing resulting values or programming codes acting as its look-up table 210 for example. Thereby, the logic functions and/or computing/processing architecture or algorithm of the programmable logic block LB3 may be altered or reconfigured when the data stored in any of the four sets of configuration programing memory (CPM) cells 490-1, 490-2, 490-3 and 490-4 are altered or reconfigured.

Figure 36D:
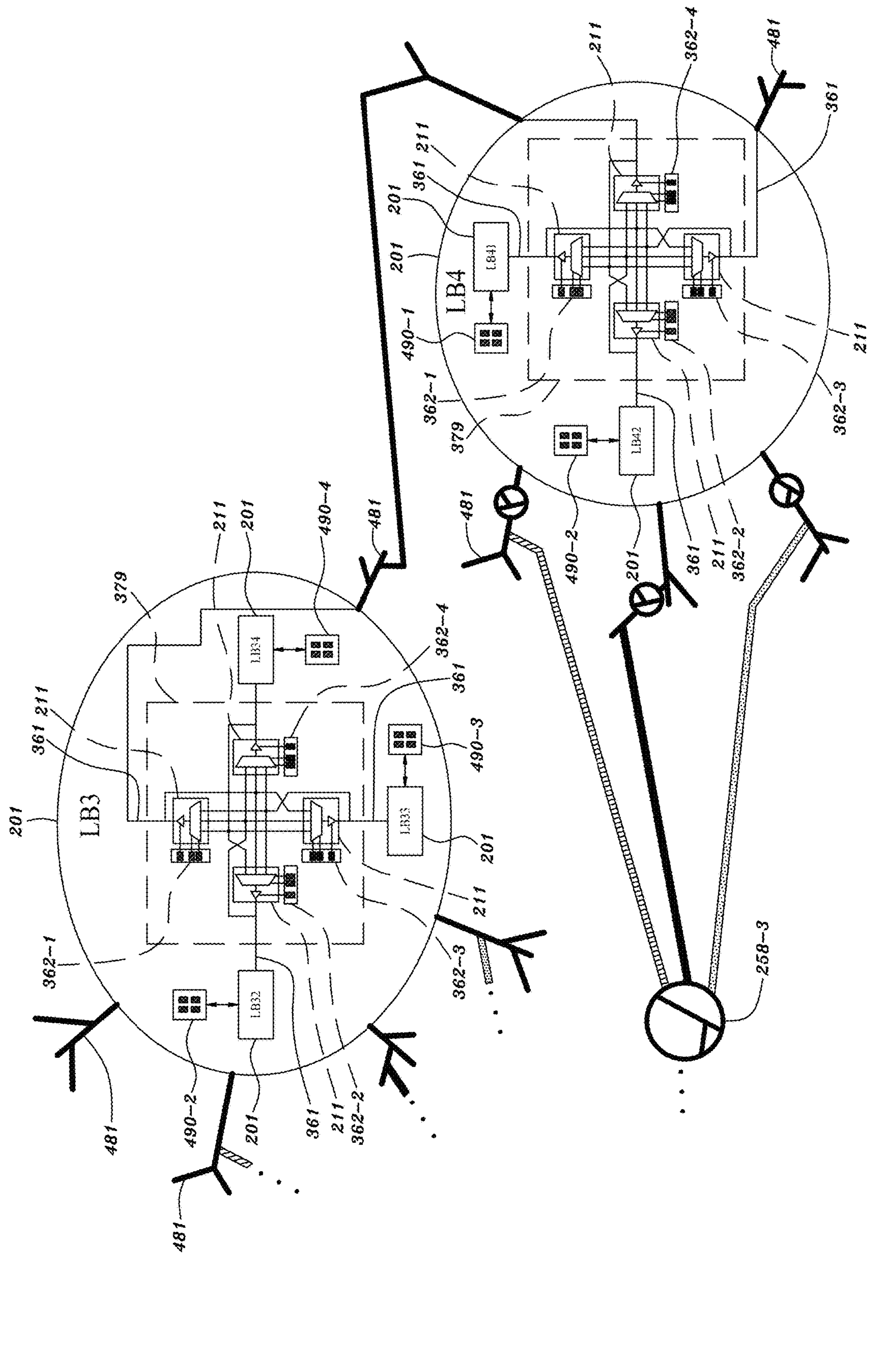
FIG. 36D is a schematic diagram for a reconfigurable plastic, elastic and/or integral architecture for the eighth event E8 in accordance with an embodiment of the present application.

The plasticity, elasticity and integrality (granularity) of the FOIT logic drive are based on events. The state of the commodity standard logic drive 300 as seen in FIGS. 15A-15O is evolved or reconfigured based on event. FIG. 36F is a block diagram illustrating an algorithm or flowchart for evolution and reconfiguration for a commodity standard logic drive in accordance with an embodiment of the present application. Referring to FIGS. 36A, 36B and 36F, the state (S) of the standard commodity logic drive 300 comprises an integral unit (IU), a logic state (L), a CPM state and a DIM state, and can be described as S (IU, L, CPM, DIM). The evolution or reconfiguration of the state of the standard commodity logic drive 300 is performed as follows:

In a step S321, after a $(n-1)^{th}$ Event ($E_{n-1}$) and before a $n^{th}$ Event ($E_n$), the standard commodity logic drive 300 is at a $(n-1)^{th}$ state $S_{n-1}$ ($IU_{n-1}$, $L_{n-1}$, $CPM_{n-1}$, $DIM_{n-1}$), wherein n is a positive integer, i.e., 1, 2, 3, . . . or N.

In a step S322, when the standard commodity logic drive 300, or a machine, system or device external of the standard commodity logic drive 300, is subject to the $n^{th}$ Event ($E_n$), it detects or senses the $n^{th}$ Event ($E_n$) and generate a $n^{th}$ signal ($F_n$); the detected or sensed signal ($F_n$) is input to the standard commodity logic drive 300. The standard commodity FPGA IC chips 200 of the standard commodity logic drive 300 perform processing and computing based on the $n^{th}$ signal ($F_n$), generate a $n^{th}$ resulting data or information ($DR_n$) and output the $n^{th}$ resulting data or information ($DR_n$) to be stored in the data information memory (DIM) cells, such as in the HBM IC chips 251, of the standard commodity logic drive 300.

In a step S323, the data information memory (DIM) cells store the $n^{th}$ resulting data or information ($DR_n$) and are evolved to a data infirmary memory (DIM) state for the $n^{th}$ resulting data or information ($DR_n$), i.e., $DIMR_n$.

In a step S324, the standard commodity FPGA IC chips 200, or other control, processing or computing IC chips, such as dedicated control chip 260, dedicated control and I/O chip 266, DCIAC chip 267, DCDI/OIAC chip 268, PCIC chips 269, GPU chips 269*a*, CPU chips 269*b* and/or TPU chips 269*c*, of the standard commodity logic drive 300 may perform comparison between the $n^{th}$ resulting data or information ($DR_n$) for $DIMR_n$ and the $(n-1)^{th}$ resulting data or information for data information memory cells, i.e., $DIM_{n-1}$, by detecting the changes between them, for example, and then may count a number ($M_n$) of the data information memory (DIM) cells in which the data information memory (DIM) is changed or altered between $DIMR_n$ and $DIM_{n-1}$.

In a step S325, the standard commodity FPGA IC chips 200 or the other control, processing or computing IC chips of the standard commodity logic drive 300 compare the number ($M_n$) to preset criteria ($M_c$) for decision making between evolution or reconfiguration of the standard commodity logic drive 200.

Figure 36E:
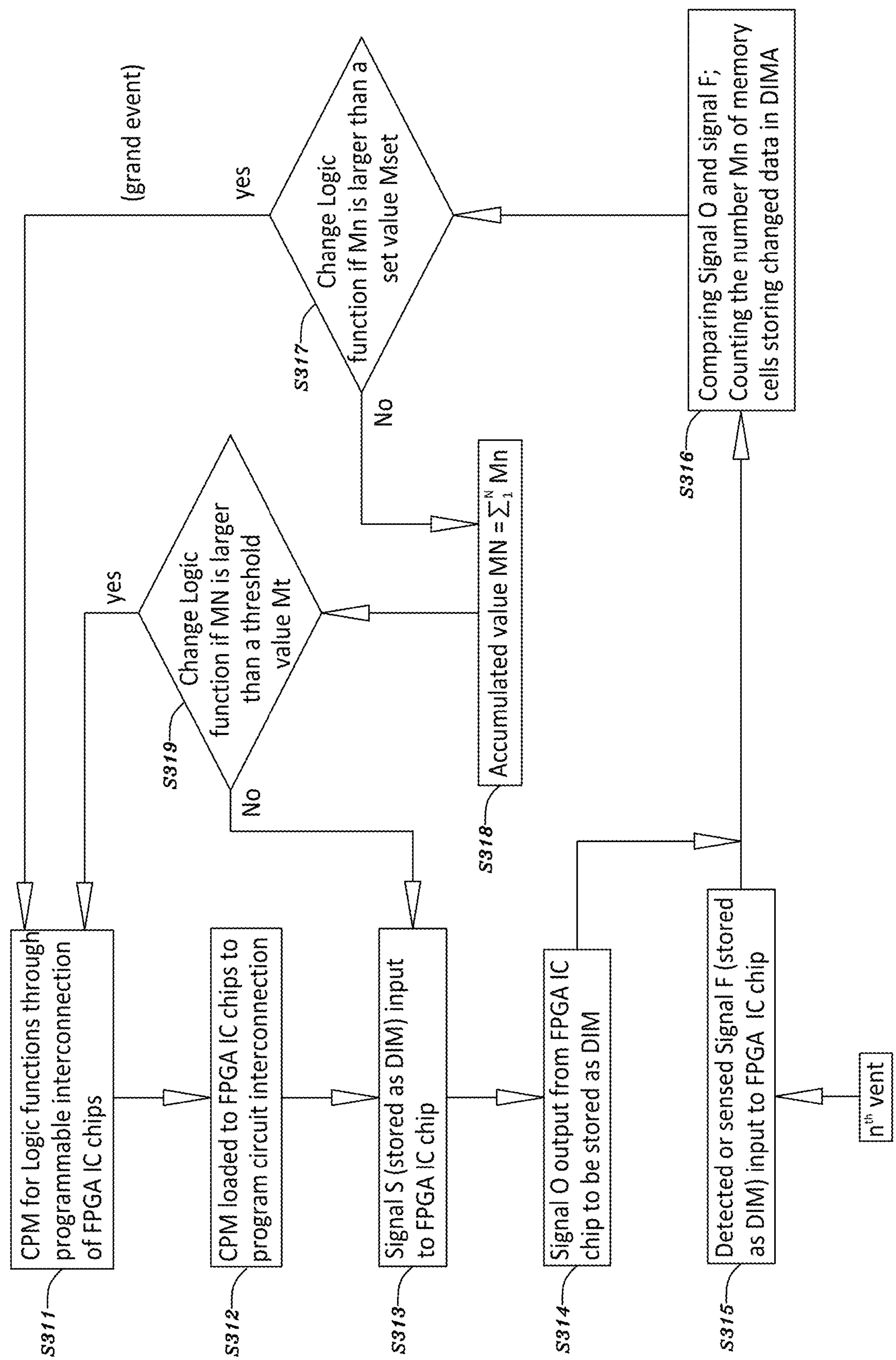
FIG. 36E is a block diagram illustrating an algorithm or flowchart for self-reconfiguration logic function in accordance with an embodiment of the present application.
Figure 36F:
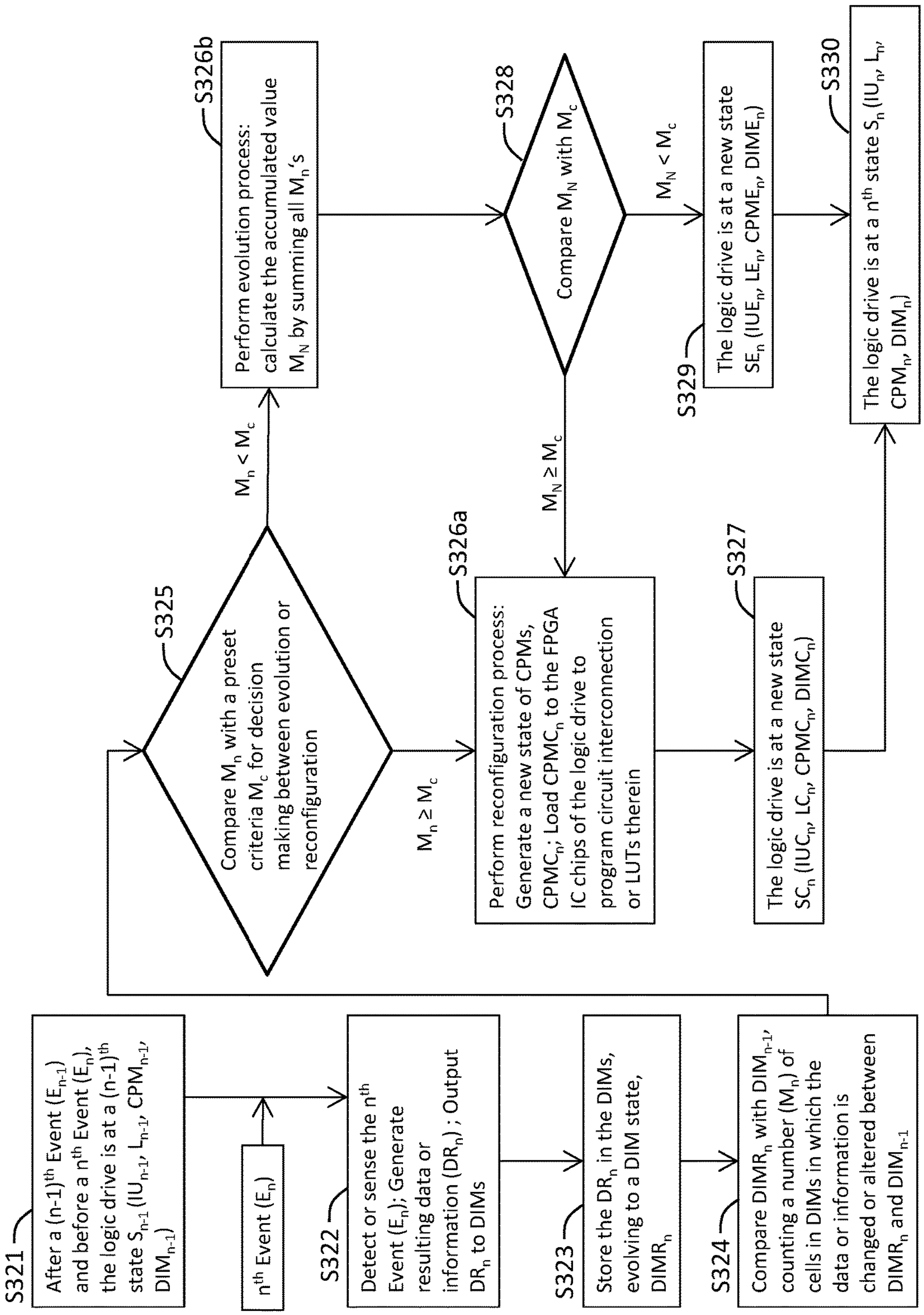
FIG. 36F is a block diagram illustrating an algorithm or flowchart for evolution and reconfiguration for a commodity standard logic drive in accordance with an embodiment of the present application.

Referring to FIGS. 36A, 36B and 36E, if the number ($M_n$) is equal to or larger than the preset criteria ($M_c$), the event $E_n$ is a grand event, and a step S326*a* continues for the reconfiguration route. If the bumber ($M_n$) is smaller than the preset criteria ($M_c$), the event $E_n$ is not a grand event, and a step S326*b* continues for the evolution route.

In the step S326*a* the standard commodity logic drive 300 may perform the reconfiguration process to generate a new state of configuration programming memory (CPMs) (data or information), i.e., $CPMC_n$. For example, based on the $n^{th}$ resulting data or information ($DR_n$) for $DIMR_n$, new truth tables may be generated and then may be transformed into the new state of configuration programming memory ($CPMC_n$). The configuration programming memory ($CPMC_n$) (data or information) is loaded to the standard commodity FPGA IC chips 200 of the standard commodity logic drive 300 to program the programmable interconnects 361 as illustrated in FIGS. 7A-7C and/or look-up tables 210 (LUTs) as illustrated in FIG. 6A therein. After the reconfiguration, in a step S327, the standard commodity logic drive 300 is at a new state $SC_n$ ($IUC_n$, $LC_n$, $CPMC_n$, $DIMC_n$), comprising the new states of $IUC_n$, $LC_n$, $CPMC_n$, and $DIMC_n$. The new state $SC_n$ ($IUC_n$, $LC_n$, $CPMC_n$, $DIMC_n$) will be defined, in a step S330, as a final state $S_n$ ($IU_n$, $L_n$, $CPM_n$, $DIM_n$) of the standard commodity logic drive 300 after the grand event $E_n$.

In the step S326*b*, the standard commodity logic drive 300 may perform the evolution process. The standard commodity FPGA IC chips 200, or the other control, processing or computing IC chips of the standard commodity logic drive 300, may calculate the accumulated value ($M_N$) by summing all of the numbers ($M_n$'s), wherein n is: (A) from 1 to n if no grand event happened; or (B) from (R+1) to n if a last grand event happened at the $R^{th}$ event $E_R$, wherein R is a positive integer. In a step S328, the standard commodity FPGA IC chips 200, or the other control, processing or computing IC chips, of the standard commodity logic drive 300 may compare the number $M_N$ to M. If the number $M_N$ is equal to or larger than the preset criteria $M_c$, the reconfiguration process in the step S326*a* as described and specified above continues. If the number $M_N$ is smaller than the preset criteria $M_c$, a step S329 for evolution continues. In the step S329, the standard commodity logic drive 300 is at an evolution state $SE_n$ ($IUE_n$, $LE_n$, $CPME_n$, $DIME_n$), wherein the states of L, CPM do not change from that after the event $E_{n-1}$, that means, $LE_n$ is the same as $L_{n-1}$, $CPME_n$ is the same as $CPM_{n-1}$; while $DIME_n$ is $DIMR_n$. The evolution state $SE_n$ ($IUE_n$, $LE_n$, $CPME_n$, $DIME_n$) may be defined, in the step S330, as a final state $S_n$ ($IU_n$, $L_n$, $CPM_n$, $DIM_{n-1}$) of the logic drive after the evolution event $E_n$.

Referring to FIGS. 36A, 36B and 36E, the steps S311 through S320 may be repeated for the $(n+1)^{th}$ Event $E_{n+1}$.

The Grand Reconfiguration comprises condense or concise processes and learning processes:

I. Condense or Concise Processes:

(A) DIM reconfiguration: (1) A machine/system external of the logic drive 300 (and/or the FPGAIC chips 200 or the other control, processing or computing IC chips of the logic drive 300) checks the $DIM_n$, e.g., resulting values or programming codes in the data memory cells 490 as illustrated in FIGS. 36C, 6A and 6H, to find identical memories, and then keeping only one memory of all identical memories, deleting all other identical memories; and (2) The machine/system checks the $DIM_n$, e.g., resulting values or programming codes in the data memory cells 490 as illustrated in FIGS. 36C, 6A and 6H, to find similar memories (similarity of the data in the memories within a given percentage x %, for example, x % is equal to or smaller than 1%, 2%, 3%, 5% or 10% in difference), and keeping only one or two memories of all similar memories in the SRAM or DRAM cells in the HBM IC chips 251 in the logic drive 300 as illustrated in FIGS. 15A-15O and NAND flash memory cells in the NVM IC chips 250 in the logic drive 300 as illustrated in FIGS. 15A-15O, and storing all other similar memories in the NAND flash memory cells in NVM IC chips 250 in the logic drive 300 as illustrated in FIGS. 15A-15O or in the memory storage device external of the logic drive 300, while not in the SRAM or DRAM cells in the HBM IC chips 251 in the logic drive 300; alternatively, representative data or information (for example, average data or information of all similar memories) and standard deviation from the representative data or information may be generated and kept in the SRAM or DRAM cells in the HBM IC chips 251 in the logic drive 300 as illustrated in FIGS. 15A-15O and NAND flash memory cells in the NVM IC chips 250 in the logic drive 300 as illustrated in FIGS. 15A-15O, and storing all similar memories in the NAND flash memory cells in the NVM IC chips 250 in the logic drive 300 as illustrated in FIGS. 15A-15O or in the memory storage device external of the logic drive 300, while not in the SRAM or DRAM cells in the HBM IC chips 251 in the logic drive 300.

(B) Logic reconfiguration: (1) The machine/system checks the configuration programming memory ($CPM_n$) for corresponding logic functions to find identical logic functions or configuration programing memory (CPM), and keeping only one of the identical logic functions or configuration programing memory (CPM), deleting the others of the identical logic functions or configuration programing memory (CPM); (2) The machine/system checks the configuration programming memory ($CPM_n$) for corresponding logic functions to find similar logic functions or configuration programing memory (CPM) (similarity of the data in the memories with a given percentage x % of difference, for example, x % is equal to or smaller than 1%, 2%, 3%, 5% or 10% in difference), and keeping only one or two of the similar logic functions or configuration programing memory (CPM) as representative configuration programing memory (CPM) in the SRAM or DRAM cells in the HBM IC chips 251 in the logic drive 300 as illustrated in FIGS. 15A-15O and NAND flash memory cells in the NVM IC chips 250 in the logic drive 300 as illustrated in FIGS. 15A-15O, and storing all other similar logic functions or configuration programing memory (CPMs) in the NAND flash memory cells in the NVM IC chips 250 in the logic drives 300 as illustrated in FIGS. 15A-15O or in the memory storage device external of the logic drive 300, while not in the SRAM or DRAM cells in the HBM IC chips 251 in the logic drive 300. Alternatively, representative configuration programing memory (CPM) (data or information), e.g., average data or information of all similar memories, and standard deviation from the representative CPM, may be generated and kept in the SRAM or DRAM cells in the HBM IC chips 251 in the logic drive 300 as illustrated in FIGS. 15A-15O and the NAND flash memory cells in the NVM IC chips 250 in the logic drive 300 as illustrated in FIGS. 15A-15O, and storing all similar logic functions or configuration programing memory (CPMs) in the NAND flash memory cells in the NVM IC chips 250 in the logic drive 300 as illustrated in FIGS. 15A-15O or in the memory storage device external of the logic drive 300, while not in the SRAM or DRAM cells in the HBM IC chips 250 in the logic drive 300.

II. Learning Processes:

Based on $S_n$ ($IU_n$, $L_n$, $CPM_n$, $DIM_n$), performing an algorithm to select or screen (memorize) useful, significant and important integral units, logics, CPMs and DIMs, and delete (forget) non-useful, non-significant or non-important integral units, logics, CPMs or DIMs. The selection or screening algorithm may be based on a given statistical method, for example, based on the frequency of use of integral units, logics, CPMs and/or DIMs in the previous $n^{th}$ events. Another example, the Bayesian inference may be used for generating $S_{n+1}$($IU_{n+1}$, $L_{n+1}$, $CPM_{n+1}$, $DIM_{n+1}$).

The algorithm and criteria provide learning processes for the system/machine states after events. The plasticity, elasticity and integrality of the FOIT logic drive provide capabilities suitable for applications in machine learning and artificial intelligence.

Another aspect of the disclosure provides a reconfigurable plastic (elastic) and/or integral architecture for system/machine computing or processing using integral and alterable memory units and logic units, in addition to the sequential, parallel, pipelined or Von Neumann computing or processing system architecture and/or algorithm. The standard commodity logic devices 300-1 and 300-2 are of plasticity (or elasticity) and integrality, comprising integral and alterable configuration programing memory (CPM) to alter or reconfigure its logic functions.

Referring to FIGS. 36A-36C, the properties of the plasticity (or elasticity) and integrality of the standard commodity logic drives 300-1 and 300-2 are similar or analogous to that of a human brain. The brain or nerves have plasticity (or elasticity) and integrality. Many aspects of brain or nerves can be altered (or are "plastic" or "elastic") and reconfigured through adulthood. The standard commodity logic drives 300-1 and 300-2 may provide capabilities to alter or reconfigure the logic functions and/or computing (or processing) architecture (or algorithm) for a given hardware by altering or reconfiguring the configuration programing memory (CPM) (data or information) stored in the FPGA IC chips 200-1 through 200-4 in a single-die type or in the operation modules 190 or stored in the non-volatile IC chips 250 as seen in FIGS. 15A-15O. In the standard commodity logic drives 300-1 and 300-2, the data information memory (DIM) (data or information) may be stored in SRAM cells or DRAM cells of their HBM IC chips 251, VMIC chip 324, DRAM IC chips 321, or memory chips 687 in their memory modules 159 in a single-module type as illustrated in FIG. 23 or in the operation modules 190 as illustrated in FIGS. 24A-24G, or may be stored in NAND flash memory cells in one or more of their NVM IC chips 250, as illustrated in FIGS. 15A-15O.

Referring to FIGS. 36A-36C, the logic functions and/or computing (or processing) architecture (or algorithm) follows the configuration programing memory (CPM) in the near-by memories on or of the FPGA IC chips 200-1 through 200-4. The data or information input to or output from the logic functions programmed by the configuration programing memory (CPM) may be stored in the data memory (DIM). A certain region of the data information memory (DIMA) is monitored by a reconfiguration circuit. The reconfiguration circuit may be set in the FPGA IC chips 200-1 through 200-4. Alternatively, the reconfiguration circuit may be set in the dedicated control chip 260, dedicated I/O chips 265, the dedicated control and I/O chip 266, IAC chip 402, DCIAC chip 267, DCDI/OIAC chip 268 or DPIIC chips 410 of the logic drives 300-1 and 300-2. If the number, in which the data are changed or flipped, of memories in the DIMA (after one event or accumulated events) exceeds a given percent (for example, equal to or greater than 1%, 5%, 10%, 20%, or 50%), the reconfiguration circuit will alter or reconfigure the configuration programing memory (CPM) to be loaded to the FPGA IC chips 200-1 through 200-4, and hence alter or reconfigure the logic functions and/or computing (or processing) or the architecture (or algorithm) of the standard commodity logic drives 300-1 and 300-2. That means using the programmable interconnection and programmable look-up table in the standard commodity logic drives 300-1 and 300-2 to alter or reconfigure the logic functions and/or computing/processing and/or architecture (or algorithm) of the standard commodity FPGA IC chips 200-1 through 200-4 according to the altered configuration programing memory (CPM) stored in the standard commodity FPGA IC chips 200-1 through 200-4 in the standard commodity logic drives 300-1 and 300-2 or stored in the NVM IC chips 250 in the standard commodity logic drives 300-1 and 300-2. Therefore, a significant change in the data information memory (DIM) may cause a change in the logic functions and/or computing/processing and/or architecture (or algorithm) of the FPGA IC chip 200 in the operation module 190.

For more elaboration, FIG. 36E is a block diagram illustrating an algorithm or flowchart for self-reconfiguration logic function in accordance with an embodiment of the present application. Referring to FIGS. 36A, 36B and 36E, in a step S311, for each of the standard commodity logic drives 300-1 and 300-2, configuration programing memory (CPM) for the programming codes or resulting values for programming the programmable interconnection and programmable look-up table of its FPGA IC chips 200 in a single-die type or in the operation modules 190 may be stored in the non-volatile memory cells 870, 880 or 907 or SS RRAM cells 907 of its FPGA IC chips 200 as illustrated in FIG. 8A-8G, 9A-9H, 10A-10I or 11A-11E.

Next, in a step S312, for said each of the standard commodity logic drives 300-1 and 300-2, the configuration programing memory (CPM) stored in the non-volatile memory cells 870, 880 or 907 or SS RRAM cells 907 of its FPGA IC chips 200 may be loaded to the memory cells 362 and 490 of its FPGA IC chips 200 to program the programmable interconnection and programmable look-up table of its FPGA IC chips 200.

Next, in a step S313, for said each of the standard commodity logic drives 300-1 and 300-2, an input signal S stored in its HBM IC chips 251, its VMIC chip 324, its DRAM IC chips 321, or the memory chips 687 in its memory modules 159 in a single-module type or in its operation modules 190 for data information memory (DIM) may be input to one of its FPGA IC chips 200 and said one of its FPGA IC chips 200 may generate an output signal O based on the input signal S as seen in a step S314, wherein the output signal O may be stored in its HBM IC chips 251, its VMIC chip 324, its DRAM IC chips 321, or the memory chips 687 in its memory modules 159 in a single-module type or in its operation modules 190 for data information memory (DIM).

Next, in a step S315, for said each of the standard commodity logic drives 300-1 and 300-2, a detected or sensed signal F may be generated in an event E to be stored in its HBM IC chips 251, its VMIC chip 324, its DRAM IC chips 321, or the memory chips 687 in its memory modules 159 in a single-module type or in its operation modules 190 for data information memory (DIM). The detected or sensed signal F may be input to said one of its FPGA IC chips 200.

Next, in a step S316, for said each of the standard commodity logic drives 300-1 and 300-2, the reconfiguration circuit may be provided in said one of its FPGA IC chips 200 or its dedicated control chip 260, its dedicated I/O chips 265, its dedicated control and I/O chip 266, its IAC chip 402, its DCIAC chip 267, its DCDI/OIAC chip 268 or its DPIIC chips 410 to determine changed data of the data memory in a certain region (DIMA) by comparing the detected or sensed signal F and the output signal O. The number Mn of the memory cells storing the changed data of the data memory in the certain region (DIMA) is counted.

Next, in a step S317, a step for determining whether the number Mn is greater than a set value Mset is performed. In the step 317, when the number Mn is determined to be greater than or equal to the set value Mset, the event E may be considered as a grand event. Next, the step S311 continues and the configuration programing memory (CPM) for the programming codes or resulting values for programming the programmable interconnection and programmable look-up table of its FPGA IC chips 200 in a single-die type or in the operation modules 190 may be updated and altered to be stored in the non-volatile memory cells 870, 880 or 907 of its FPGA IC chips 200 as illustrated in FIG. 8A-8G, 9A-9H, 10A-10I or 11A-11E.

When the number Mn is determined to be less than the set value Mset, the event E may not be considered as a grand event, a step S318 continues. In the step S318, the number Mn counted in the step S316 in this cycle is added to the previous sum or accumulated value of Mn counted in previous cycles into an updated sum or accumulated value MN. Next, in a step S319, a step for determining whether the accumulated value MN is greater than a threshold value Mt is performed. In the step S319, when the accumulated value MN is determined to be greater than or equal to the threshold value Mt, the step S311 continues and the configuration programing memory (CPM) for the programming codes or resulting values for programming the programmable interconnection and programmable look-up table of its FPGA IC chips 200 in a single-die type or in the operation modules 190 may be updated and altered to be stored in the non-volatile memory cells 870, 880 or 907 of its FPGA IC chips 200 as illustrated in FIG. 8A-8G, 9A-9H, 10A-10I or 11A-11E. In the step S319, when the accumulated value MN is determined to be less than the threshold value Mt, the step S313 continues.

An example of plasticity, elasticity and integrality is taken using the programmable logic block LB3, as illustrated in FIGS. 36A-36C, as GPS (Global Positioning System) functions, as below:

The programmable logic block LB3 is, for example, functioning as GPS, remembering routes and enabling to drive to various locations. A driver and/or machine/system was planning to drive from San Francisco to San Jose, and the programmable logic block LB3 may functions as:

(1) In a first event E1, the driver and/or machine/system looked up a map and found two Freeways 101 and 280 to get to San Jose from San Francisco. The machine/system used the logic units LB31 and LB32 for computing and processing the first event E1 and memorized a first logic configuration L1 for the first event E1 and the related data, information or outcomes of the first event E1. That was: the machine/system (a) formulated the logic units LB31 and LB32 at the first logic configuration L1 based on a first set of configuration programming memories CPM1 in the configuration programming memory (CPM) cells 362-1, 362-2, 362-3, 362-4, 490-1 and 490-2 of the programmable logic block LB3 and (b) stored a first set of data information memories (DIM1) in the HBM IC chips 251, VMIC chip 324, DRAM IC chips 321, or memory chips 687 in the memory modules 159 in a single-module type or in the operation modules 190, in the standard commodity logic drive 300-1. The integral state of GPS functions in the programmable logic block LB3 after the first event E1 may be defined as S1LB3 relating to the first logic configuration L1 for the first event E1, the first set of configuration programing memory CPM1 and the first set of data information memory DIM1.

(2) In a second event E2, the driver and/or machine/system decided to take Freeway 101 to get to San Jose from San Francisco. The machine/system used the logic units LB31 and LB33 for computing and processing the second event E2 and memorized a second logic configuration L2 for the second event E2 and the related data, information or outcomes of the second event E2. That was: the machine/system (a) formulated the logic units LB31 and LB33 at the second logic configuration L2 based on a second set of configuration programming memory CPM2 in the configuration programming memory (CPM) cells 362-1, 362-2, 362-3, 362-4, 490-1 and 490-3 of the programmable logic block LB3 and/or the first set of data information memory DIM1 and (b) stored a second set of data information memory (DIM2) in the HBM IC chips 251, VMIC chip 324, DRAM IC chips 321, or memory chips 687 in the memory modules 159 in a single-module type or in the operation modules 190, in the standard commodity logic drive 300-1. The integral state of GPS functions in the programmable logic block LB3 after the second event E2 may be defined as S2LB3 relating to the second logic configuration L2 for the second event E2, the second set of configuration programing memory CPM2 and the second set of data information memory DIM2. The second set of data information memory DIM2 may include newly added information relating to the second event E2 and the data and information reorganized based on the first set of data information memory DIM1, and thereby keeps useful and important information of the first event E1.

(3) In a third event E3, the driver and/or machine/system drove from San Francisco to San Jose through Freeway 101. The machine/system used the logic units LB31, LB32 and LB33 for computing and processing the third event E3 and memorized a third logic configuration L3 for the third event E3 and the related data, information or outcomes of the third event E3. That was: the machine/system (a) formulated the logic units LB31, LB32 and LB33 at the third logic configuration L3 based on a third set of configuration programming memory CPM3 in the configuration programming memory (CPM) cells 362-1, 362-2, 362-3, 362-4, 490-1, 490-2 and 490-3 of the programmable logic block LB3 and/or the second set of data information memory DIM2 and (b) stored a third set of data information memory (DIM3) in the HBM IC chips 251, VMIC chip 324, DRAM IC chips 321, or memory chips 687 in the memory modules 159 in a single-module type or in the operation modules 190, in the standard commodity logic drive 300-1. The integral state of GPS functions in the programmable logic block LB3 after the third event E3 may be defined as S3LB3 relating to the third logic configuration L3 for the third event E3, the third set of configuration programing memory CPM3 and the third set of data information memory DIM3. The third set of data information memory DIM3 may include newly added information relating to the third event E3 and the data and information reorganized based on the first and second sets of data information memories DIM1 and DIM2, and thereby keeps useful and important information of the first and second events E1 and E2.

(4) In a fourth event E4 after two months of the third event E3, the driver and/or machine/system drove from San Francisco to San Jose through Freeway 280. The machine/system used the logic units LB31, LB32, LB33 and LB34 for computing and processing the fourth event E4 and memorized a fourth logic configuration L4 for the fourth event E4 and the related data, information or outcomes of the fourth event E4. That was: the machine/system (a) formulated the logic units LB31, LB32, LB33 and LB34 at the fourth logic configuration L4 based on a fourth set of configuration programming memory (CPM4) in the configuration programming memory (CPM) cells 362-1, 362-2, 362-3, 362-4, 490-1, 490-2, 490-3 and 490-4 of the programmable logic block LB3 and/or the third set of data information memory DIM3 and (b) stored a fourth set of data information memory (DIM4) in the HBM IC chips 251, VMIC chip 324, DRAM IC chips 321, or memory chips 687 in the memory modules 159 in a single-module type or in the operation modules 190, in the standard commodity logic drive 300-1. The integral state of GPS functions in the programmable logic block LB3 after the fourth event E4 may be defined as S4LB3 relating to the fourth logic configuration L4 for the fourth event E4, the fourth set of configuration programing memory CPM4 and the fourth set of data information memory DIM4. The fourth set of data information memory DIM4 may include newly added information relating to the fourth event E4 and the data and information reorganized based on the first, second and third sets of data information memories DIM1, DIM2 and DIM3, and thereby keeps useful and important information of the first, second and third events E1, E2 and E3.

(5) In a fifth event E5 after one week of the fourth event E4, the driver and/or machine/system drove from San Francisco to Cupertino through Freeway 280. Cupertino was in the middle way of the route in the fourth event E4. The machine/system used the logic units LB31, LB32, LB33 and LB34 at the fourth logic configuration L4 for computing and processing the fifth event E5 and memorized the fourth logic configuration L4 for the fifth event E5 and the related data, information or outcomes of the fifth event E5. That was: the machine/system (a) formulated the logic units LB31, LB32, LB33 and LB34 at the fourth logic configuration L4 based on the fourth set of configuration programming memory CPM4 in the configuration programming memory (CPM) cells 362-1, 362-2, 362-3, 362-4, 490-1, 490-2, 490-3 and 490-4 of the programmable logic block LB3 and/or the fourth set of data information memory DIM4 and (b) stored a fifth set of data information memory DIM5 in the HBM IC chips 251, VMIC chip 324, DRAM IC chips 321, or memory chips 687 in the memory modules 159 in a single-module type or in the operation modules 190, in the standard commodity logic drive 300-1. The integral state of GPS functions in the programmable logic block LB3 after the fifth event E5 may be defined as S5LB3 relating to the fourth logic configuration L4 for the fifth event E5, the fourth set of configuration programing memory CPM4 and the fifth set of data information memory DIM5. The fifth set of data information memory DIM5 may include newly added information relating to the fifth event E5 and the data and information reorganized based on the first through fourth sets of data information memories DIM1-DIM4, and thereby keeps useful and important information of the first through fourth events E1-E4.

(6) In a sixth event E6 after six months of the fifth event E5, the driver and/or machine/system was planning to drive from San Francisco to Los Angeles. The driver and/or machine/system looked up a map and found two Freeways 101 and 5 to get to Los Angeles from San Francisco. The machine/system used the logic unit LB31 of the programmable logic block LB3 and the logic unit LB41 of the programmable logic block LB4 for computing and processing the sixth event E6 and memorized a sixth logic configuration L6 for the sixth event E6 and the related data, information or outcomes of the sixth event E6. The programmable logic block LB4 may have the same architecture as the programmable logic block LB3 illustrated in FIG. 36C, but the four logic units LB31, LB32, LB33 and LB34 in the programmable logic block LB3 are renumbered as LB41, LB42, LB43 and LB44 in the programmable logic block LB4 respectively. That was: the machine/system (a) formulated the logic units LB31 and LB41 at the sixth logic configuration L6 based on a sixth set of configuration programing memory CPM6 in the configuration programming memory (CPM) cells 362-1, 362-2, 362-3, 362-4 and 490-1 of the programmable logic block LB3 and those of the programmable logic block LB4 and/or the fifth set of data information memory DIM5 and (b) stored a sixth set of data information memory DIM6 in the HBM IC chips 251, VMIC chip 324, DRAM IC chips 321, or memory chips 687 in the memory modules 159 in a single-module type or in the operation modules 190, in the standard commodity logic drive 300-1. The integral state of GPS functions in the programmable logic blocks LB3 and LB4 after the sixth event E6 may be defined as S6LB3&4 relating to the sixth logic configuration L6 for the sixth event E6, the sixth set of configuration programing memory CPM6 and the sixth set of data information memory DIM6. The sixth set of data information memory DIM6 may include newly added information relating to the sixth event E6 and the data and information reorganized based on the first through fifth sets of data information memories DIM1-DIM5, and thereby keeps useful and important information of the first through fifth events E1-E5.

(7) In a seventh event E7, the driver and/or machine/system decided to take Freeway 5 to get to Los Angeles from San Francisco. The machine/system used the logic units LB31 and LB33 at the second logic configuration L2 and/or the sixth set of data information memory DIM6 for computing and processing the seventh event E7 and memorized the second logic configuration L2 for the seventh event E7 and the related data, information or outcomes of the seventh event E7. That was: the machine/system (a) used the sixth set of data information memory DIM6 for logic processing with the logic units LB31 and LB33 at the second logic configuration L2 based on the second set of configuration programing memory CPM2 in the configuration programming memory (CPM) cells 362-1, 362-2, 362-3, 362-4, 490-1 and 490-3 of the programmable logic block LB3 and (b) stored a seventh set of data information memory DIM7 in the HBM IC chips 251, VMIC chip 324, DRAM IC chips 321, or memory chips 687 in the memory modules 159 in a single-module type or in the operation modules 190, in the standard commodity logic drive 300-1. The integral state of GPS functions in the programmable logic block LB3 after the seventh event E7 may be defined as S7LB3 relating to the second logic configuration L2 for the seventh event E7, the second set of configuration programing memory CPM2 and the seventh set of data information memory DIM7. The seventh set of data information memory DIM7 may include newly added information relating to the seventh event E7 and the data and information reorganized based on the first through sixth sets of data information memories DIM1-DIM6, and thereby keeps useful and important information of the first through sixth events E1-E6.

(8) In an eighth event E8 after two weeks of the seventh event E7, the driver and/or machine/system drove from San Francisco to Los Angeles through Freeway 5. The machine/system used the logic units LB32, LB33 and LB34 of the programmable logic block LB3 and the logic units LB41 and LB42 of the programmable logic block LB4 for computing and processing the eighth event E8 and memorized an eighth logic configuration L8 of the eighth event E8 and the related data, information or outcomes of the eighth event E8. The machine/system used the logic units LB32, LB33 and LB34 of the programmable logic block LB3 and the logic units LB41 and LB42 of the programmable logic block LB4 for computing and processing the eighth event E8 and memorized the eighth logic configuration L8 for the eighth event E8 and the related data, information or outcomes of the eighth event E8. The programmable logic block LB4 may have the same architecture as the programmable logic block LB3 illustrated in FIG. 36C, but the four logic units are renumbered as LB41, LB42, LB43 and LB44 in the programmable logic block LB4 respectively. FIG. 36D is a schematic diagram for a reconfigurable plastic, elastic and/or integral architecture for the eighth event E8 in accordance with an embodiment of the present application. Referring to FIGS. 36A-36D, the cross-point switch 379 of the programmable logic block LB3 may have its top terminal switched not to couple to the logic unit LB31 (not shown in FIG. 36D but shown in FIG. 36C) but to a first portion of the FISC 20 and SISC 29 of the second semiconductor chip 200-2, like one of the dendrites 481 of the neurons for the programmable logic block LB3. The cross-point switch 379 of the programmable logic block LB4 may have its right terminal switched not to couple to the logic unit LB44 (not shown) but to a second portion of the FISC 20 and SISC 29 of the second semiconductor chip 200-2, like one of the dendrites 481 of the neurons for the programmable logic block LB4, connecting to the first portion of the FISC 20 and SISC 29 of the second semiconductor chip 200-2 through a third portion of the FISC 20 and SISC 29 of the second semiconductor chip 200-2. The cross-point switch 379 of the programmable logic block LB4 may have its bottom terminal switched not to couple to the logic unit LB43 (now shown) but to a fourth portion of the FISC 20 and SISC 29 of the second semiconductor chip 200-2, like one of the dendrites 481 of the neurons for the programmable logic block LB4. That was: the machine/system (a) formulated the logic units LB32, LB33, LB34, LB41 and LB42 at the eighth logic configuration L8 based on an eighth set of configuration programming memory CPM8 in the configuration programming memory (CPM) cells 362-1, 362-2, 362-3, 362-4, 490-2, 490-3 and 490-4 of the programmable logic block LB3 and the configuration programming memory (CPM) cells 362-1, 362-2, 362-3, 362-4, 490-1 and 490-2 of the programmable logic block LB4 and/or the seventh set of data information memory DIM7 and (b) stored an eighth set of data information memory DIM8 in the HBM IC chips 251, VMIC chip 324, DRAM IC chips 321, or memory chips 687 in the memory modules 159 in a single-module type or in the operation modules 190, in the standard commodity logic drive 300-1. The integral state of GPS functions in the programmable logic blocks LB3 and LB4 after the eighth event E8 may be defined as S8LB3&4 relating to the eighth logic configuration L8 for the eighth event E8, the eighth set of configuration programming memory CPM8 and the eighth set of data information memory DIM8. The eighth set of data information memory DIM8 may include newly added information relating to the eighth event E8 and the data and information reorganized based on the first through seventh sets of data information memories DIM1-DIM7, and thereby keeps useful and important information of the first through seventh events E1-E7.

(9) The event E8 is quite different from the previous first through seventh events E1-E7, and is categorized as a grand event E9, resulting in an integral state S9LB3. In the grand event E9 for grand reconfiguration after the first through eighth events E1-E8, the driver and/or machine/system may reconfigure the first through eighth logic configurations L1-L8 into a ninth logic configuration L9 to formulate the logic units LB31, LB32, LB33 and LB34 of the programmable logic block LB3 at the ninth logic configuration L9 based on a ninth set of configuration programing memory CPM9 in the configuration programming memory (CPM) cells 362-1, 362-2, 362-3, 362-4, 490-1, 490-2, 490-3 and 490-4 of the programmable logic block LB3 and/or the first through eighth sets of data information memories DIM1-DIM8 for the GPS functions for the locations in the California area between San Francisco and Los Angeles.

The machine/system may perform the grand reconfiguration with a certain given criteria. The grand reconfiguration is like the human brain reconfiguration after a deep sleep. The grand reconfiguration comprises condense or concise processes and learning processes, mentioned as below:

In the condense or concise processes for reconfiguration of data information memory (DIM) in the event E9, the machine/system may check the first through eighth sets of data information memory DIM1-DIM8 to find identical sets of data information memory (DIM), and then keep one of the identical sets of data information memory (DIM), deleting the other(s) of the identical sets of data information memory (DIM). Furthermore, the machine/system may check the first through eighth sets of data information memory DIM1-DIM8 to find similar sets of data information memory (DIM), which have similarity within a given percentage x % in difference, wherein x may be equal to or smaller than 1, 2, 3, 5 or 10, and then keep one or two of the similar sets of data information memory (DIM), deleting the other(s) of the similar sets of data information memory (DIM). Alternatively, a representative set of data information memory (DIM) may be generated for the similar sets of data information memory (DIM) and then the similar sets of data information memory (DIM) may be deleted.

In the condense or concise processes for reconfiguration of configuration programming memory (CPM) in the event E9, the machine/system may check the first through eighth sets of configuration programming memory CPM1-CPM8 for a specific logic function to find identical sets of configuration programming memory (CPM) for the specific logic function, and then keep one of the identical sets of configuration programming memory (CPM) for the specific logic function, deleting the other(s) of the identical sets of configuration programming memory (CPM) for the specific logic function. Furthermore, the machine/system may check the first through eighth sets of configuration programming memory CPM1-CPM8 for the specific logic function to find similar sets of configuration programming memory (CPM) for the specific logic function, which have similarity within a given percentage x % in difference, wherein x may be equal to or smaller than 1, 2, 3, 5 or 10, and then keep one or two of the similar sets of configuration programming memory (CPM) for the specific logic function, deleting the other(s) of the similar sets of configuration programming memory (CPM) for the specific logic function. Alternatively, a representative set of configuration programming memory (CPM) for the specific logic function may be generated for the similar sets of configuration programming memory (CPM) for the specific logic function and then the similar sets of configuration programming memory (CPM) for the specific logic function may be deleted.

In the learning processes in the event E9, an algorithm may be performed to (1) the configuration programming memories CPM1-CPM4, CPM6 and CPM8 for the logic configurations L1-L4, L6 and L8 and (2) the data information memory DIM1-DIM8, for optimizing, e.g., selecting or screening, the configuration programming memories CPM1-CPM4, CPM6 and CPM8 into useful, significant and important ones as the ninth set of configuration programing memory CPM9 and optimizing, e.g., selecting or screening, the data information memories DIM1-DIM8 into useful, significant and important ones as the ninth set of data information memory DIM9. Further, the algorithm may be performed to (1) the configuration programming memories CPM1-CPM4, CPM6 and CPM8 for the logic configurations L1-L4, L6 and L8 and (2) the data information memories DIM1-DIM8 for deleting non-useful, non-significant or non-important ones of the configuration programming memories CPM1-CPM4, CPM6 and CPM8 and deleting non-useful, non-significant or non-important ones of the data information memories DIM1-DIM8. The algorithm may be performed based on a statistical method, e.g., the frequency of use of the configuration programming memories CPM1-

CPM4, CPM6 and CPM8 in the events E1-E8 and/or the frequency of use of the data information memories DIM1-DIM8 in the events E1-E8.

Combinations of POP Assembly for Logic Drive and Memory Drive

As mentioned above, the FOIT logic drive 300 may be packaged with the semiconductor chips 100 as illustrated in FIGS. 15A-15O. A plurality of the logic drive 300 may be incorporated with one or more memory drives 310 into a module. The memory drives 310 are configured to store data or applications. The memory drives 310 may be divided into two types, one of which is a non-volatile memory drive 322, and the other one of which is a volatile memory drive 323, as seen in FIGS. 37A-37K. FIGS. 37A-37K are schematically views showing multiple combinations of POP assemblies for logic and memory drives in accordance with embodiments of the present application. The structure for the memory drives 310 and the process for forming the same may be referred to the illustration for FIGS. 19A through 35D but the semiconductor chips 100 are non-volatile memory chips for the non-volatile memory drive 322; the semiconductor chips 100 are volatile memory chips for the volatile memory drive 323.

Figure 37A:
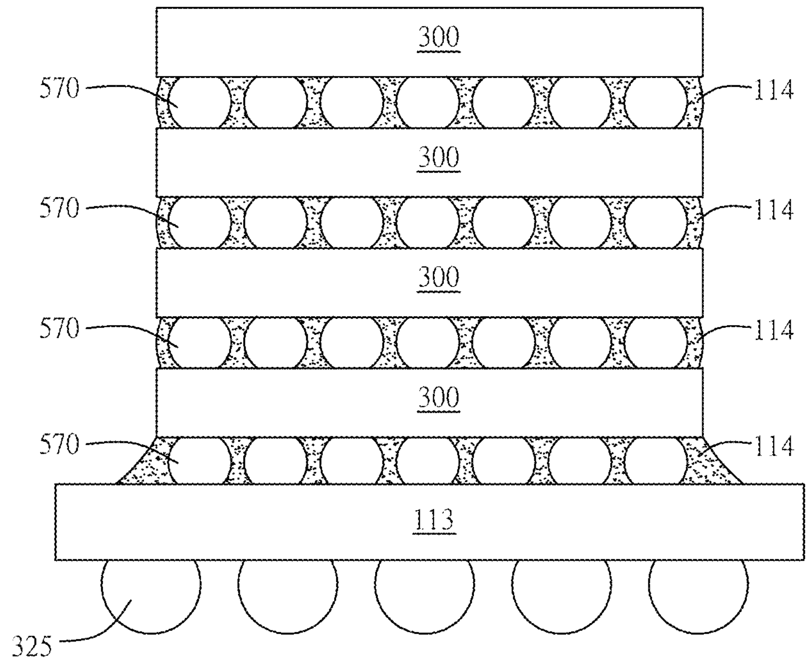
FIGS. 37A-37K are schematically views showing multiple combinations of POP assemblies for logic and memory drives in accordance with embodiments of the present application.

Referring to FIG. 37A, the POP assembly may be stacked with only the FOIT logic drives 300 on the substrate unit 113 in accordance with the process as illustrated in FIGS. 19A through 35D. An upper one of the FOIT logic drives 300 may have the metal pillars or bumps 570 mounted onto its metal pads 77*e* of a lower one of the FOIT logic drives 300 at the backside thereof, but a bottommost one of the FOIT logic drives 300 may have the metal pillars or bumps 570 mounted onto its metal pads 109 of the substrate unit 113 at the topside thereof.

Figure 37B:
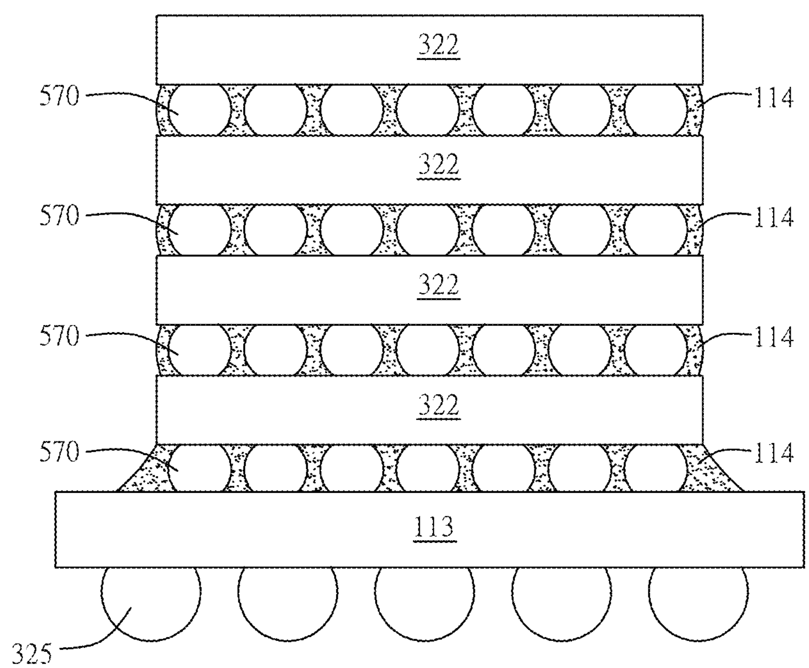

Referring to FIG. 37B, the POP assembly may be stacked with only the FOIT non-volatile memory drives 322 on the substrate unit 113 in accordance with the process as illustrated in FIGS. 19A through 35D. An upper one of the FOIT non-volatile memory drives 322 may have its metal pillars or bumps 570 mounted onto the metal pads 77*e* of a lower one of the FOIT non-volatile memory drives 322 at the backside thereof, but a bottommost one of the FOIT non-volatile memory drives 322 may have its metal pillars or bumps 570 mounted onto the metal pads 109 of the substrate unit 113 at the topside thereof.

Figure 37C:
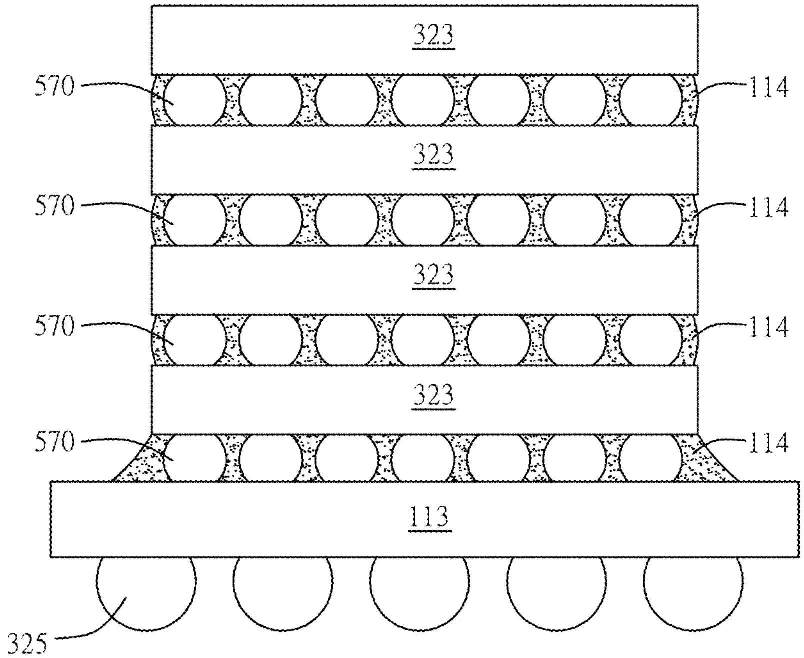

Referring to FIG. 37C, the POP assembly may be stacked with only the FOIT volatile memory drives 323 on the substrate unit 113 in accordance with the process as illustrated in FIGS. 19A through 35D. An upper one of the FOIT volatile memory drives 323 may have its metal pillars or bumps 570 mounted onto the metal pads 77*e* of a lower one of the FOIT volatile memory drives 323 at the backside thereof, but a bottommost one of the FOIT volatile memory drives 323 may have its metal pillars or bumps 570 mounted onto the metal pads 109 of the substrate unit 113 at the topside thereof.

Figure 37D:
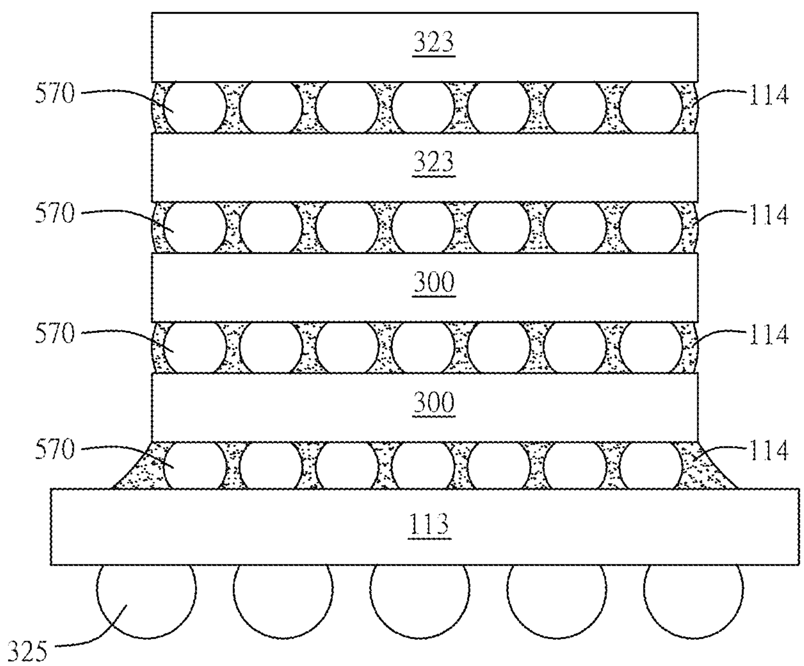

Referring to FIG. 37D, the POP assembly may be stacked with a group of the FOIT logic drives 300 and a group of the FOIT volatile memory drives 323 in accordance with the process as illustrated in FIGS. 19A through 35D. The group of the FOIT logic drives 300 may be arranged over the substrate unit 113 and under the group of the FOIT volatile memory drives 323. For example, a group of two FOIT logic drives 300 may be arranged over the substrate unit 113 and under a group of two FOIT volatile memory drives 323. A first one of the FOIT logic drives 300 may have its metal pillars or bumps 570 mounted onto the metal pads 109 of the substrate unit 113 at the topside thereof, a second one of the FOIT logic drives 300 may have its metal pillars or bumps 570 mounted onto the metal pads 77*e* of the first one of the FOIT logic drives 300 at the backside thereof, a first one of the FOIT volatile memory drives 323 may have its metal pillars or bumps 570 mounted onto the metal pads 77*e* of the second one of the FOIT logic drives 300 at the backside thereof, and a second one of the FOIT volatile memory drives 323 may have its metal pillars or bumps 570 mounted onto the metal pads 77*e* of the first one of the FOIT volatile memory drives 323 at the backside thereof.

Figure 37E:
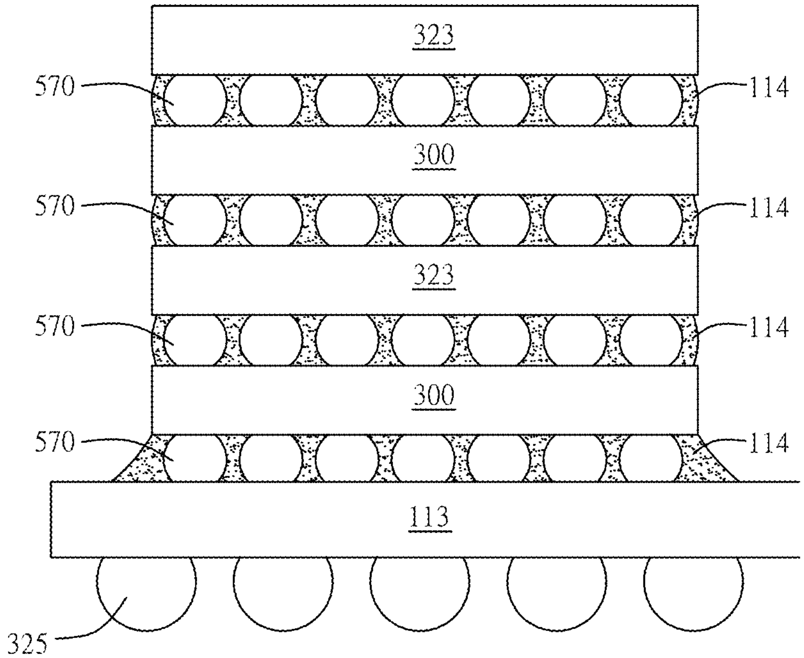

Referring to FIG. 37E, the POP assembly may be alternately stacked with the FOIT logic drives 300 and the FOIT volatile memory drives 323 in accordance with the process as illustrated in FIGS. 19A through 35D. For example, a first one of the FOIT logic drives 300 may have its metal pillars or bumps 570 mounted onto the metal pads 109 of the substrate unit 113 at the topside thereof, a first one of the FOIT volatile memory drives 323 may have its metal pillars or bumps 570 mounted onto the metal pads 77*e* of the first one of the FOIT logic drives 300 at the backside thereof, a second one of the FOIT logic drives 300 may have its metal pillars or bumps 570 mounted onto the metal pads 77*e* of the first one of the FOIT volatile memory drives 323 at the backside thereof, and a second one of the FOIT volatile memory drives 323 may have its metal pillars or bumps 570 mounted onto the metal pads 77*e* of the second one of the FOIT logic drives 300 at the backside thereof.

Figure 37F:
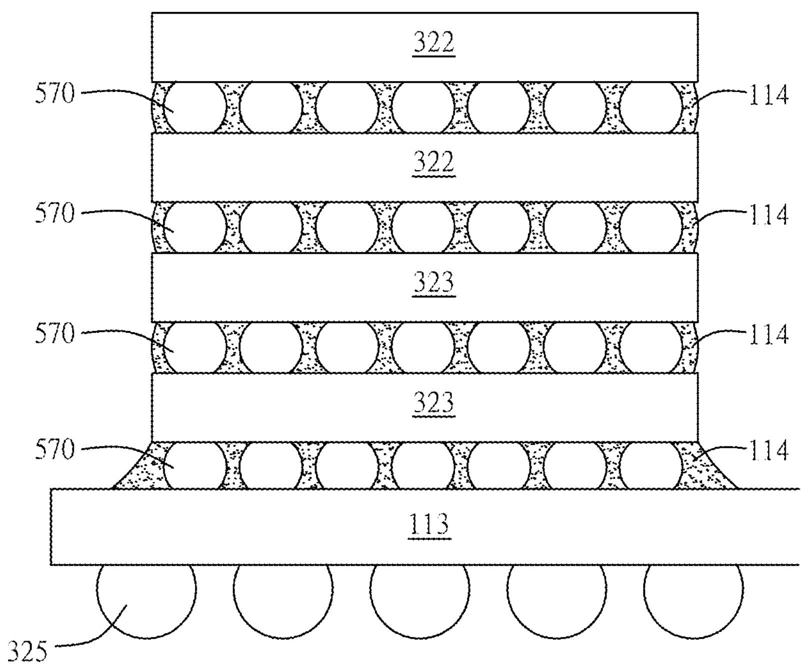

Referring to FIG. 37F, the POP assembly may be stacked with a group of the FOIT non-volatile memory drives 322 and a group of the FOIT volatile memory drives 323 in accordance with the process as illustrated in FIGS. 19A through 35D. The group of the FOIT volatile memory drives 323 may be arranged over the substrate unit 113 and under the group of the FOIT non-volatile memory drives 322. For example, a group of two FOIT volatile memory drives 323 may be arranged over the substrate unit 113 and under a group of two FOIT non-volatile memory drives 322. A first one of the FOIT volatile memory drives 323 may have its metal pillars or bumps 570 mounted onto the metal pads 109 of the substrate unit 113 at the topside thereof, a second one of the FOIT volatile memory drives 323 may have its metal pillars or bumps 570 mounted onto the metal pads 77*e* of the first one of the FOIT volatile memory drives 323 at the backside thereof, a first one of the FOIT non-volatile memory drives 322 may have its metal pillars or bumps 570 mounted onto the metal pads 77*e* of the second one of the FOIT volatile memory drives 323 at the backside thereof, and a second one of the FOIT non-volatile memory drives 322 may have its metal pillars or bumps 570 mounted onto the metal pads 77*e* of the first one of the FOIT non-volatile memory drives 322 at the backside thereof.

Figure 37G:
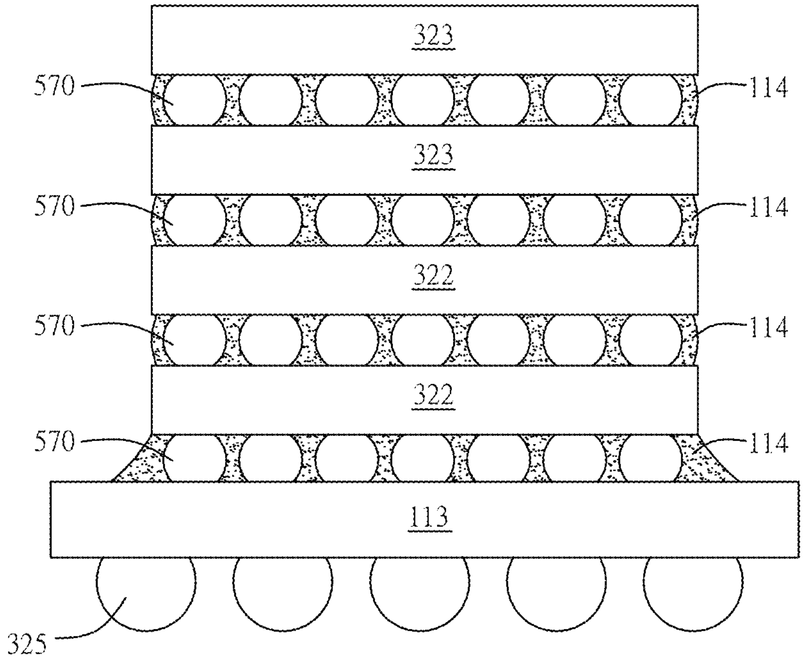
Figure 37H:
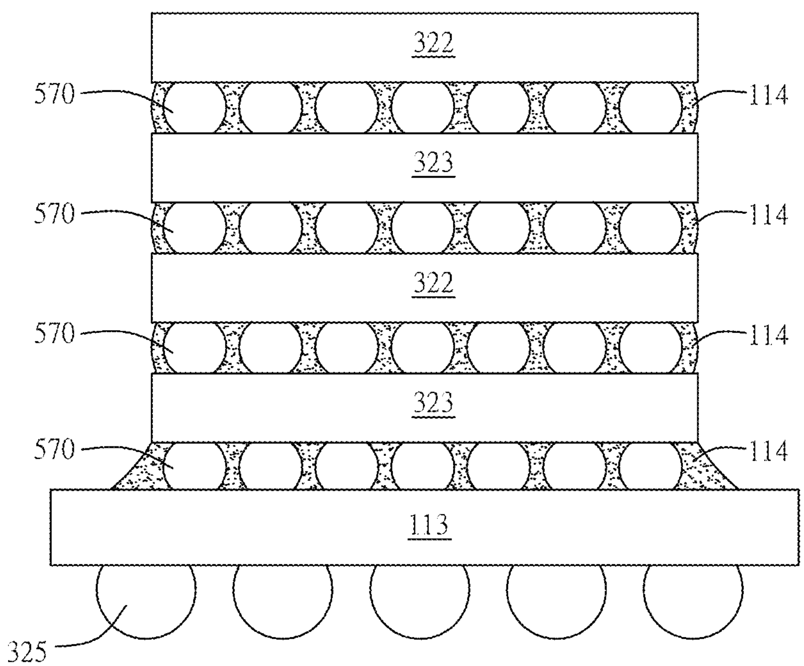

Referring to FIG. 37G, the POP assembly may be stacked with a group of the FOIT non-volatile memory drives 322 and a group of the FOIT volatile memory drives 323 in accordance with the process as illustrated in FIGS. 19A through 35D. The group of the FOIT non-volatile memory drives 322 may be arranged over the substrate unit 113 and under the group of the FOIT volatile memory drives 323. For example, a group of two FOIT non-volatile memory drives 322 may be arranged over the substrate unit 113 and under a group of two FOIT volatile memory drives 323. A first one of the FOIT non-volatile memory drives 322 may have its metal pillars or bumps 570 mounted onto the metal pads 109 of the substrate unit 113 at the topside thereof, a second one of the FOIT non-volatile memory drives 322 may have its metal pillars or bumps 570 mounted onto the metal pads 77*e* of the first one of the FOIT non-volatile memory drives 322 at the backside thereof, a first one of the FOIT volatile memory drives 323 may have its metal pillars or bumps 570 mounted onto the metal pads 77*e* of the second one of the FOIT non-volatile memory drives 322 at the backside thereof, and a second one of the FOIT volatile memory drives 323 may have its metal pillars or bumps 570 mounted onto the metal pads 77*e* of the first one of the FOIT volatile memory drives 323 at the backside thereof.

Referring to FIG. 39H, the POP assembly may be alternately stacked with the FOIT volatile memory drives 323 and the FOIT non-volatile memory drives 322 in accordance with the process as illustrated in FIGS. 19A through 35D. For example, a first one of the FOIT volatile memory drives 323 may have its metal pillars or bumps 570 mounted onto the metal pads 109 of the substrate unit 113 at the topside thereof, a first one of the FOIT non-volatile memory drives 322 may have its metal pillars or bumps 570 mounted onto the metal pads 77*e* of the first one of the FOIT volatile memory drives 323 at the backside thereof, a second one of the FOIT volatile memory drives 323 may have its metal pillars or bumps 570 mounted onto the metal pads 77*e* of the first one of the FOIT non-volatile memory drives 322 at the backside thereof, and a second one of the FOIT non-volatile memory drives 322 may have its metal pillars or bumps 570 mounted onto the metal pads 77*e* of the second one of the FOIT volatile memory drives 323 at the backside thereof.

Figure 37J:
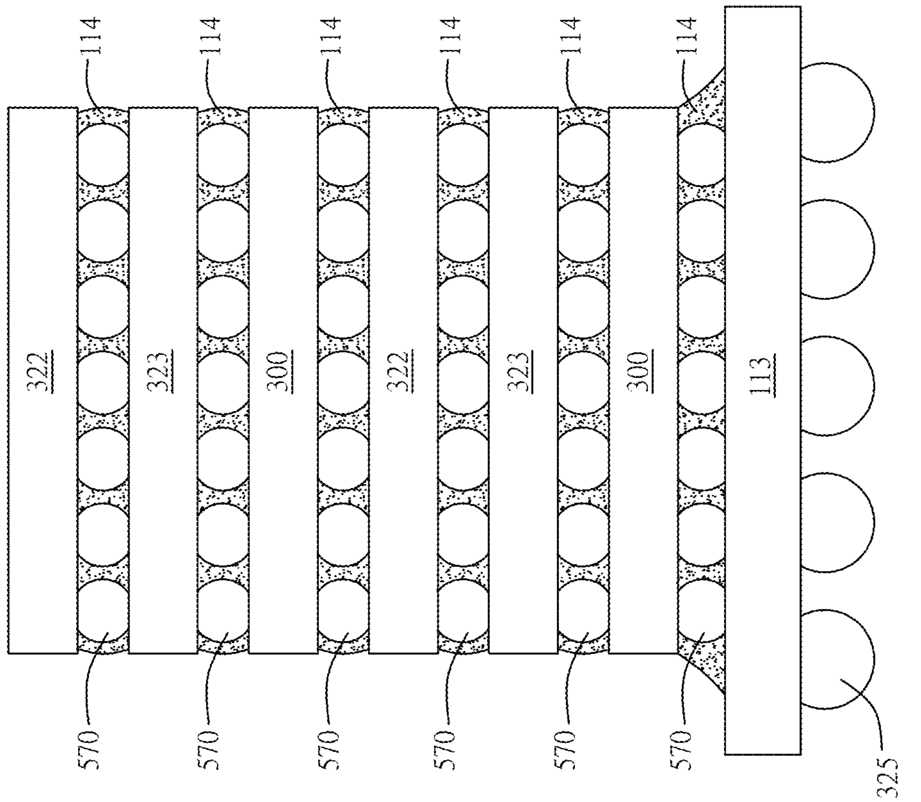
Figure 37I:
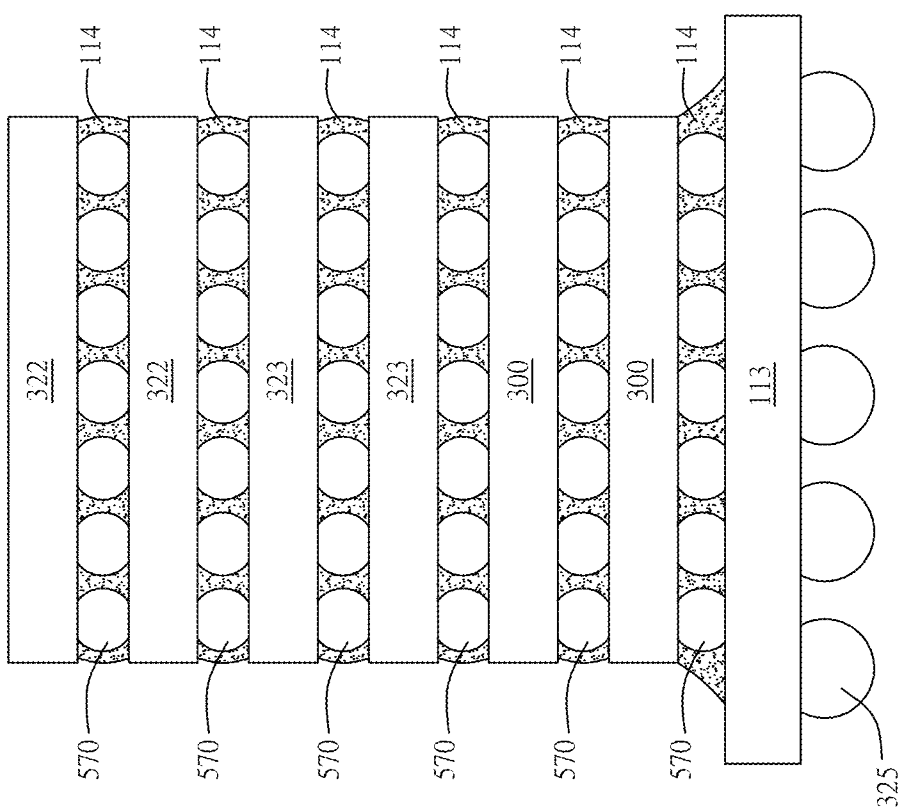

Referring to FIG. 37I, the POP assembly may be stacked with a group of the FOIT logic drives 300, a group of the FOIT non-volatile memory drives 322 and a group of the FOIT volatile memory drives 323 in accordance with the process as illustrated in FIGS. 19A through 35D. The group of the FOIT logic drives 300 may be arranged over the substrate unit 113 and under the group of the FOIT volatile memory drives 323, and the group of the FOIT volatile memory drives 323 may be arranged over the group of the FOIT logic drives 300 and under the group of the FOIT non-volatile memory drives 322. For example, a group of two FOIT logic drives 300 may be arranged over the substrate unit 113 and under a group of two FOIT volatile memory drives 323, and the group of two FOIT volatile memory drives 323 may be arranged over the group of two FOIT logic drives 300 and under a group of two FOIT non-volatile memory drives 322. A first one of the FOIT logic drives 300 may have its metal pillars or bumps 570 mounted onto the metal pads 109 of the substrate unit 113 at the topside thereof, a second one of the FOIT logic drives 300 may have its metal pillars or bumps 570 mounted onto the metal pads 77*e* of the first one of the FOIT logic drives 300 at the backside thereof, a first one of the FOIT volatile memory drives 323 may have its metal pillars or bumps 570 mounted onto the metal pads 77*e* of the second one of the FOIT logic drives 300 at the backside thereof, a second one of the FOIT volatile memory drives 323 may have its metal pillars or bumps 570 mounted onto the metal pads 77*e* of the first one of the FOIT volatile memory drives 323 at the backside thereof, a first one of the FOIT non-volatile memory drives 322 may have its metal pillars or bumps 570 mounted onto the metal pads 77*e* of the second one of the FOIT volatile memory drives 323 at the backside thereof, and a second one of the FOIT non-volatile memory drives 322 may have its metal pillars or bumps 570 mounted onto the metal pads 77*e* of the first one of the FOIT non-volatile memory drives 322 at the backside thereof.

Referring to FIG. 37J, the POP assembly may be alternately stacked with the FOIT logic drives 300, the FOIT volatile memory drives 323 and the FOIT non-volatile memory drives 322 in accordance with the process as illustrated in FIGS. 19A through 35D. For example, a first one of the FOIT logic drives 300 may have its metal pillars or bumps 570 mounted onto the metal pads 109 of the substrate unit 113 at the topside thereof, a first one of the FOIT volatile memory drives 323 may have its metal pillars or bumps 570 mounted onto the metal pads 77*e* of the first one of the FOIT logic drives 300 at the backside thereof, a first one of the FOIT non-volatile memory drives 322 may have its metal pillars or bumps 570 mounted onto the metal pads 77*e* of the first one of the FOIT volatile memory drives 323 at the backside thereof, a second one of the FOIT logic drives 300 may have its metal pillars or bumps 570 mounted onto the metal pads 77*e* of the first one of the FOIT non-volatile memory drives 322 at the backside thereof, a second one of the FOIT volatile memory drives 323 may have its metal pillars or bumps 570 mounted onto the metal pads 77*e* of the second one of the FOIT logic drives 300 at the backside thereof, and a second one of the FOIT non-volatile memory drives 322 may have its metal pillars or bumps 570 mounted onto the metal pads 77*e* of the second one of the FOIT volatile memory drives 323 at the backside thereof.

Figure 37K:
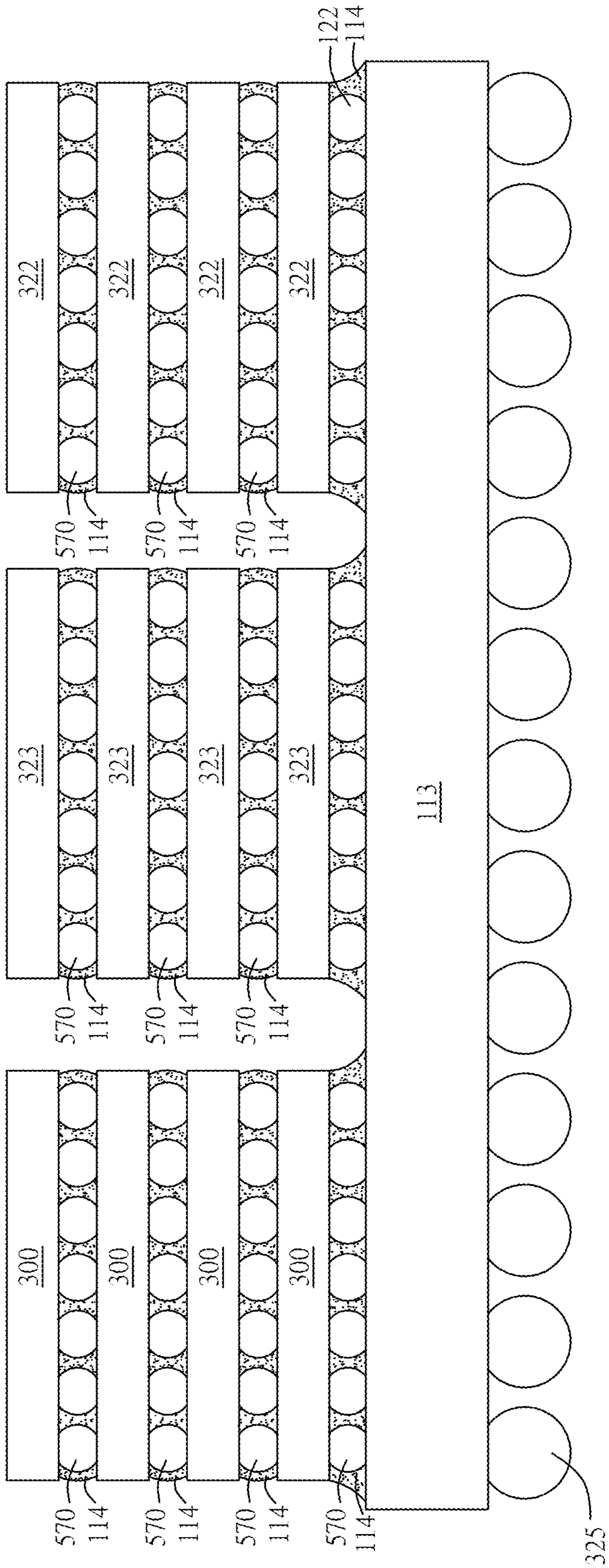

Referring to FIG. 37K, the POP assembly may be stacked with three stacks, one of which is stacked with only the FOIT logic drives 300 on the substrate unit 113 in accordance with the process as illustrated in FIGS. 19A through 35D, another of which is stacked with only the FOIT non-volatile memory drives 322 on the substrate unit 113 in accordance with the process as illustrated in FIGS. 19A through 35D, and the other of which is stacked with only the FOIT volatile memory drives 323 on the substrate unit 113 in accordance with the process as illustrated in FIGS. 19A through 35D. With respect to the process for forming the same, after the three stacks of the FOIT logic drives 300, the FOIT non-volatile memory drives 322 and the FOIT volatile memory drives 323 are stacked on a circuit carrier or substrate, like the one 110 as seen in FIG. 34A, the solder balls 325 are planted on a backside of the circuit carrier or substrate and then the circuit carrier or structure 110 may be separated, cut or diced into multiple individual substrate units 113, such as printed circuit boards (PCB) or BGA (Ball-Grid-array) substrates, by a laser cutting process or by a mechanical cutting process.

Figure 37L:
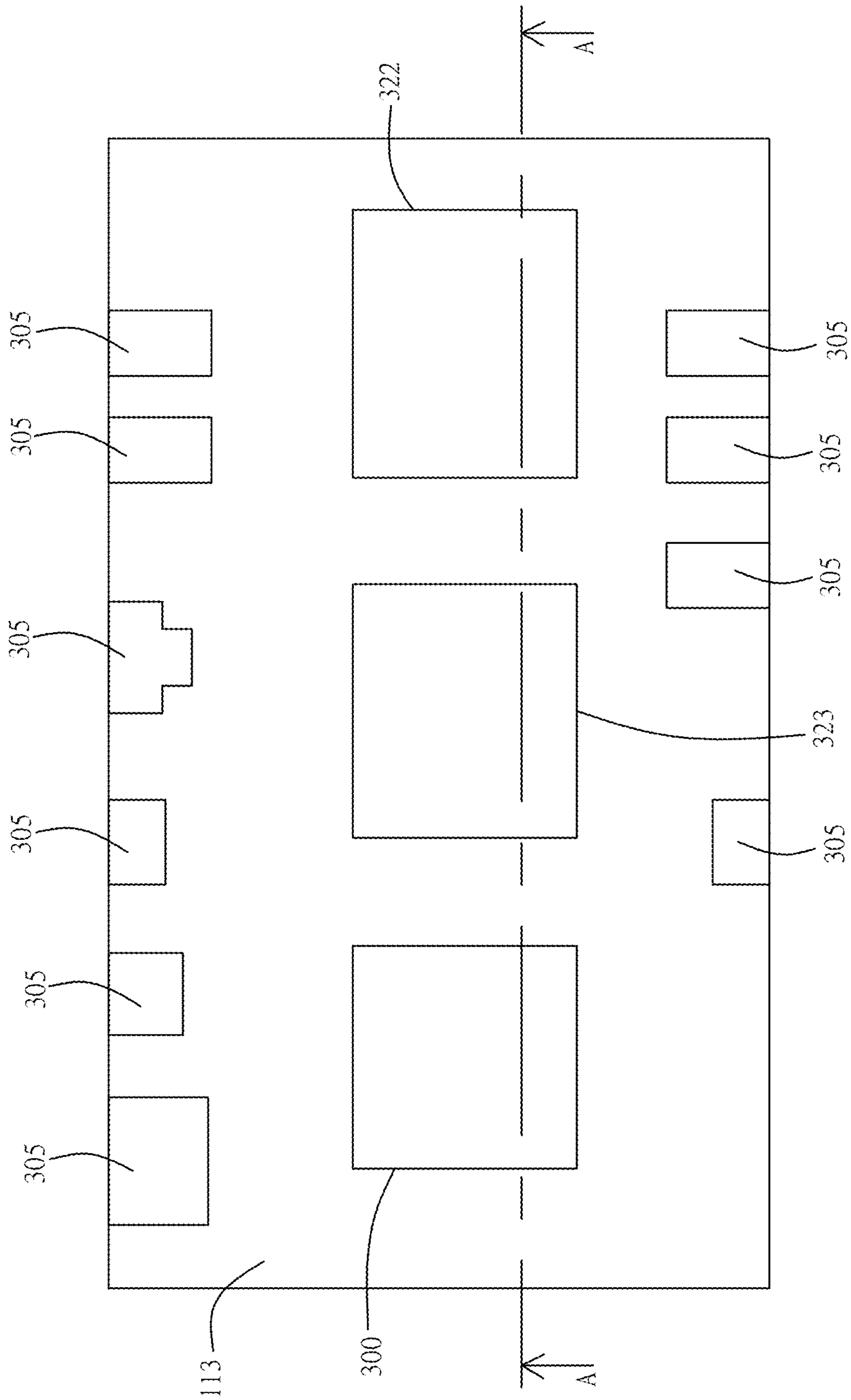
FIG. 37L is a schematically top view of multiple POP assemblies, which is a schematically cross-sectional view along a cut line A-A shown in FIG. 37K.

FIG. 37L is a schematically top view of multiple POP assemblies, which is a schematically cross-sectional view along a cut line A-A shown in FIG. 37K. Furthermore, multiple I/O ports 305 may be mounted onto the substrate unit 113 to have one or more universal-serial-bus (USB) plugs, high-definition-multimedia-interface (HDMI) plugs, audio plugs, internet plugs, power plugs and/or video-graphic-array (VGA) plugs inserted therein.

Application for Logic Drive

Figure 38A:
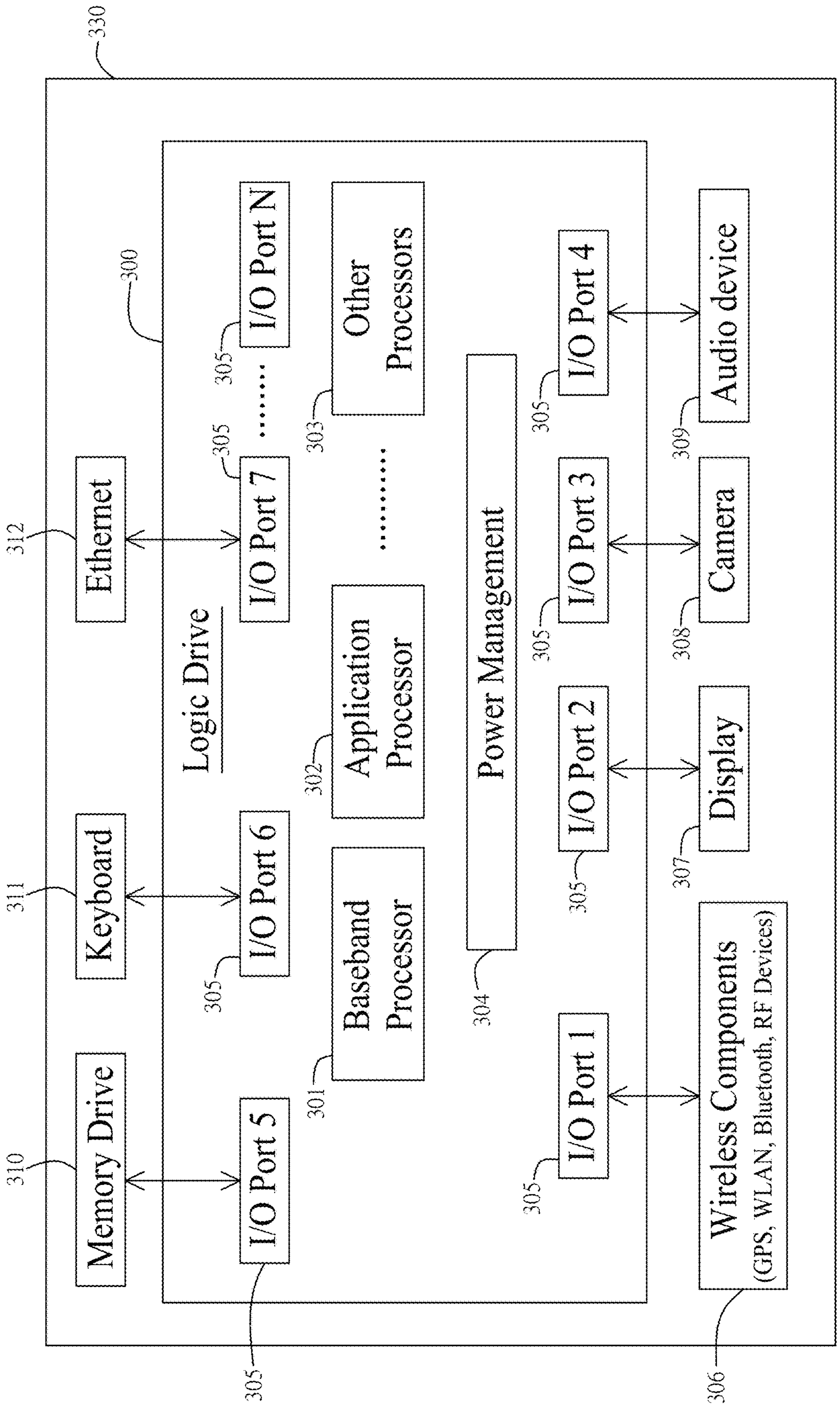
FIGS. 38A-38C are schematically views showing various applications for logic and memory drives in accordance with multiple embodiments of the present application.
Figure 38B:
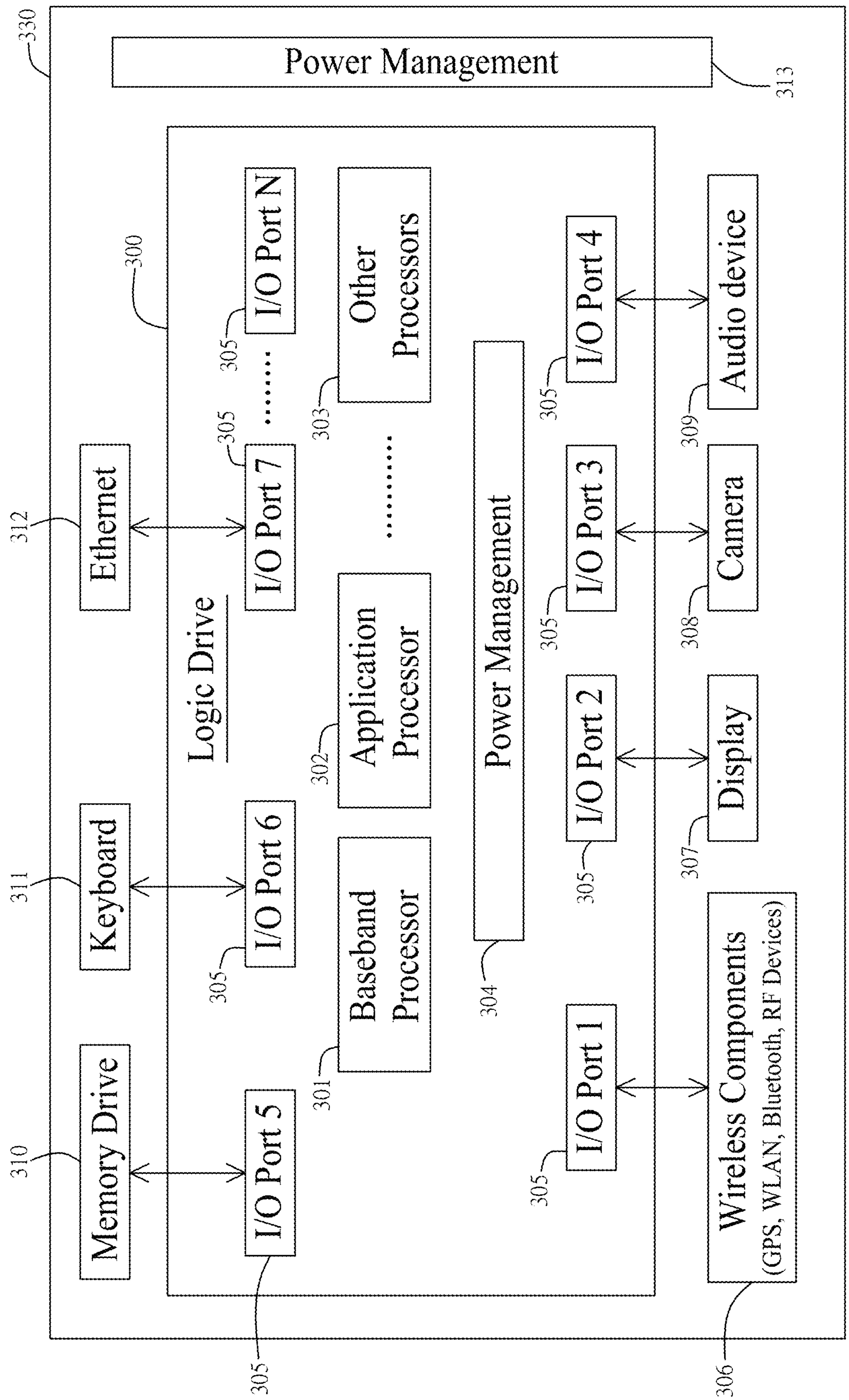
Figure 38C:
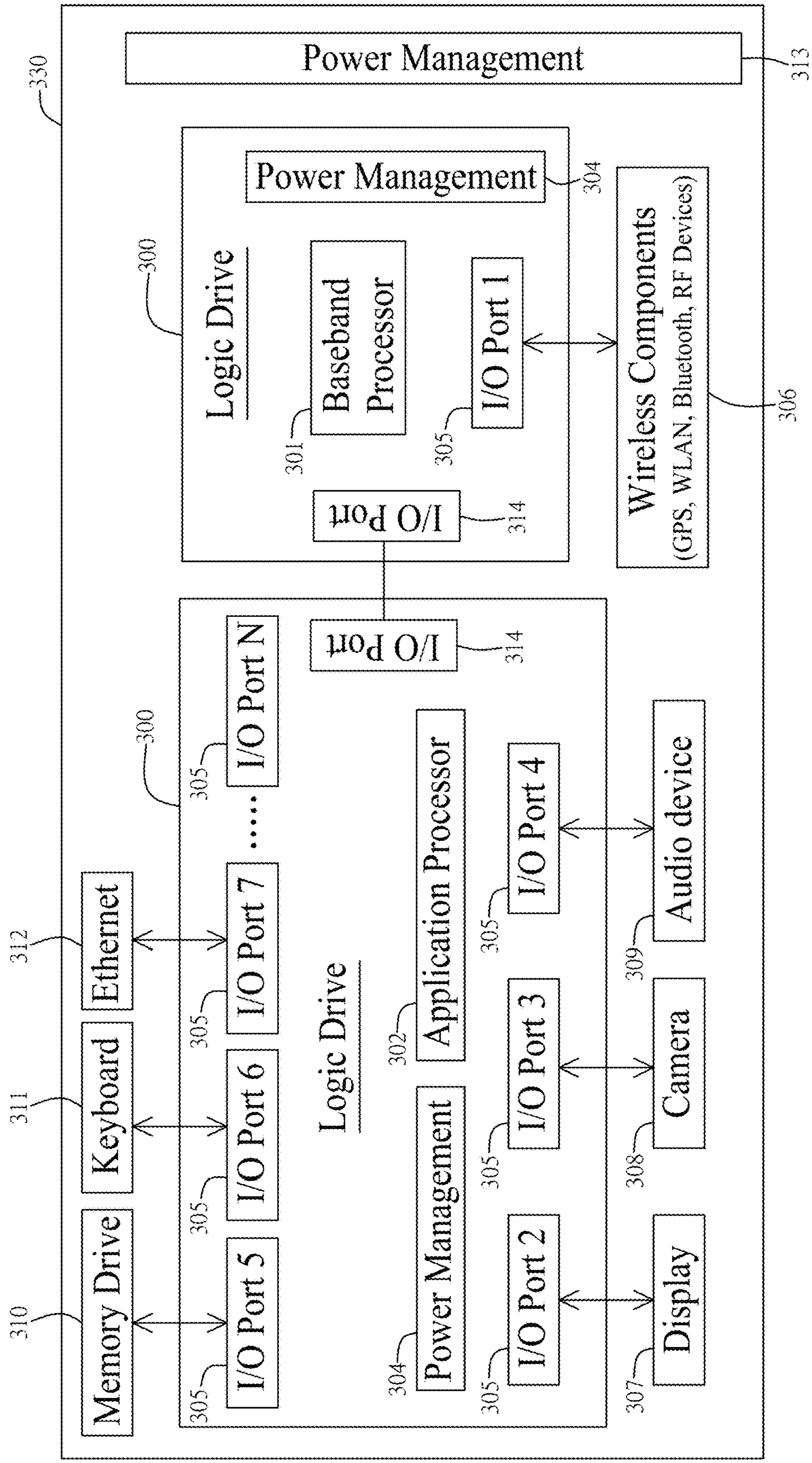

The current system design, manufactures and/or product business may be changed into a commodity system/product business, like current commodity DRAM, or flash memory business, by using the standard commodity logic drive 300. A system, computer, processor, smart-phone, or electronic equipment or device may become a standard commodity hardware comprises mainly the memory drive 310 and the logic drive 300. FIGS. 38A-38C are schematically views showing various applications for logic and memory drives in accordance with multiple embodiments of the present application. Referring to FIGS. 38A-38C, the logic drive 300 in the aspect of the disclosure may have big enough or adequate number of inputs/outputs (I/Os) to support multiple I/O ports 305 used for programming all or most applications. The logic drive 300 may have I/Os, provided by the metal bumps 570, to support required I/O ports for programming, for example, to perform all or any combinations of functions of Artificial Intelligence (AI), machine learning, deep learning, big data, Internet Of Things (IOT), industry computing, Virtual Reality (VR), Augmented Reality (AR), car electronics, Graphic Processing (GP), Digital Signal Processing (DSP), Micro Controlling (MC), and/or Central Processing (CP), and etc. The logic drive 300 may be configured for (1) programming or configuring Inputs/Outputs (I/Os) for software or application developers to load application software or program codes stored in the memory drive 310 to program or configure the logic drive 300 through the I/O ports 305 or connectors connecting or coupling to the I/Os of the logic drive 300; and (2) executing the I/Os for the users to perform their instructions through the I/O ports 305 or connectors connecting or coupling to the I/Os of the logic drive 300, for example, generating a Microsoft Word file, or a PowerPoint presentation file, or an Excel file. The I/O ports 305 or connectors connecting or coupling to the corresponding I/Os of the logic drive 300 may comprise one or multiple (2, 3, 4, or more than 4) Universal Serial Bus (USB) ports, one or more IEEE 1394 ports, one or more Ethernet ports, one or more high-definition-multimedia-interface (HDMI) ports, one or more video-graphic-array (VGA) ports, one or more power-supply ports, one or more audio ports or serial ports, for example, RS-232 or COM (communication) ports, wireless transceiver I/Os, and/or Bluetooth transceiver I/Os, and etc. The I/O ports 305 or connector may be placed, located, assembled, or connected onto a substrate, film or board, such as printed circuit board (PCB), silicon substrate with interconnection schemes, metal substrate with interconnection schemes, glass substrate with interconnection schemes, ceramic substrate with interconnection schemes, or the flexible film 126 with interconnection schemes. The logic drive 300 is assembled on the substrate, film or board using its metal pillars or bumps 570, similar to the flip-chip assembly of the chip packaging technology, or the Chip-On-Film (COF) assembly technology used in the LCD driver packaging technology.

FIG. 38A is a schematically view showing an application for logic and memory drives in accordance with an embodiment of the present application. Referring to FIG. 38A, a laptop or desktop computer, mobile or smart phone or artificial-intelligence (AI) robot 330 may include the logic drive 300 that may be programmed for multiple processors including a baseband processor 301, application processor 302 and other processors 303, wherein the application processor 302 may include a central processing unit (CPU), southbridge, northbridge and graphical processing unit (GPU), and the other processors 303 may include a radio frequency (RF) processor, wireless connectivity processor and/or liquid-crystal-display (LCD) control module. The logic drive 300 may further include a function of power management 304 to put each of the processors 301, 302 and 303 into the lowest power demand state available via software. Each of the I/O ports 305 may connect a subset of the metal pillars or bumps 570 of the logic drive 300 to various external devices. For example, these I/O ports 305 may include I/O port 1 for connection to wireless communication components 306, such as global-positioning-system (GPS) component, wireless-local-area-network (WLAN) component, bluetooth components or RF devices, of the computer, phone or robot 330. These I/O ports 305 may include I/O port 2 for connection to various display devices 307, such as LCD display device or organic-light-emitting-diode (OLED) display device, of the computer, phone or robot 330. These I/O ports 305 may include I/O port 3 for connection to a camera 308 of the computer, phone or robot 330. These I/O ports 305 may include I/O port 4 for connection to various audio devices 309, such as microphone or speaker, of the computer, phone or robot 330. These I/O ports 305 or connectors connecting or coupling to the corresponding I/Os of the logic drive may include I/O port 5, such as Serial Advanced Technology Attachment (SATA) ports or Peripheral Components Interconnect express (PCIe) ports, for communication with the memory drive, disk or device 310, such as hard disk drive, flash drive and/or solid-state drive, of the computer, phone or robot 330. These I/O ports 305 may include I/O port 6 for connection to a keyboard 311 of the computer, phone or robot 330. These I/O ports 305 may include I/O port 7 for connection to Ethernet networking 312 of the computer, phone or robot 330.

Alternatively, FIG. 38B is a schematically view showing an application for logic and memory drives in accordance with an embodiment of the present application. The scheme shown in FIG. 38B is similar to that illustrated in FIG. 38A, but the difference therebetween is that the computer, phone or robot 330 is further provided with a power-management chip 313 therein but outside the logic drive 300, wherein the power-management chip 313 is configured to put each of the logic drive 300, wireless communication components 306, display devices 307, camera 308, audio devices 309, memory drive, disk or device 310, keyboard 311 and Ethernet networking 312 into the lowest power demand state available via software.

Alternatively, FIG. 38C is a schematically view showing an application for logic and memory drives in accordance with an embodiment of the present application. Referring to FIG. 38C, a laptop or desktop computer, mobile or smart phone or artificial-intelligence (AI) robot 331 in another embodiment may include a plurality of the logic drive 300 that may be programmed for multiple processors. For example, a first one, i.e., left one, of the logic drives 300 may be programmed for the baseband processor 301; a second one, i.e., right one, of the logic drives 300 may be programmed for the application processor 302 including a central processing unit (CPU), southbridge, northbridge and graphical processing unit (GPU). The first one of the logic drives 300 may further include a function of power management 304 to put the baseband processor 301 into the lowest power demand state available via software. The second one of the logic drives 300 may further include a function of power management 304 to put the application processor 302 into the lowest power demand state available via software. The first and second ones of the logic drives 300 may further include various I/O ports 305 for various connections to various devices. For example, these I/O ports 305 may include I/O port 1 set on the first one of the logic drives 300 for connection to wireless communication components 306, such as global-positioning-system (GPS) component, wireless-local-area-network (WLAN) component, bluetooth components or RF devices, of the computer, phone or robot 330. These I/O ports 305 may include I/O port 2 set on the second one of the logic drives 300 for connection to various display devices 307, such as LCD display device or organic-light-emitting-diode (OLED) display device, of the computer, phone or robot 330. These I/O ports 305 may include I/O port 3 set on the second one of the logic drives 300 for connection to a camera 308 of the computer, phone or robot 330. These I/O ports 305 may include I/O port 4 set on the second one of the logic drives 300 for connection to various audio devices 309, such as microphone or speaker, of the computer, phone or robot 330. These I/O ports 305 may include I/O port 5 set on the second one of the logic drives 300 for connection to a memory drive, disk or device 310, such as hard disk or solid-state disk or drive (SSD), of the computer, phone or robot 330. These I/O ports 305 may include I/O port 6 set on the second one of the logic drives 300 for connection to a keyboard 311 of the computer, phone or robot 330. These I/O ports 305 may include I/O port 7 set on the second one of the logic drives 300 for connection to Ethernet networking 312 of the computer, phone or robot 330. Each of the first and second ones of the logic drives 300 may have dedicated I/O ports 314 for data transmission between the first and second ones of the logic drives 300. The computer, phone or robot 330 is further provided with a power-management chip 313 therein but outside the first and second ones of the logic drives 300, wherein the power-management chip 313 is configured to put each of the first and second ones of the logic drives 300, wireless communication components 306, display devices 307, camera 308, audio devices 309, memory drive, disk or device 310, keyboard 311 and Ethernet networking 312 into the lowest power demand state available via software.

Memory Drive

Figure 39A:
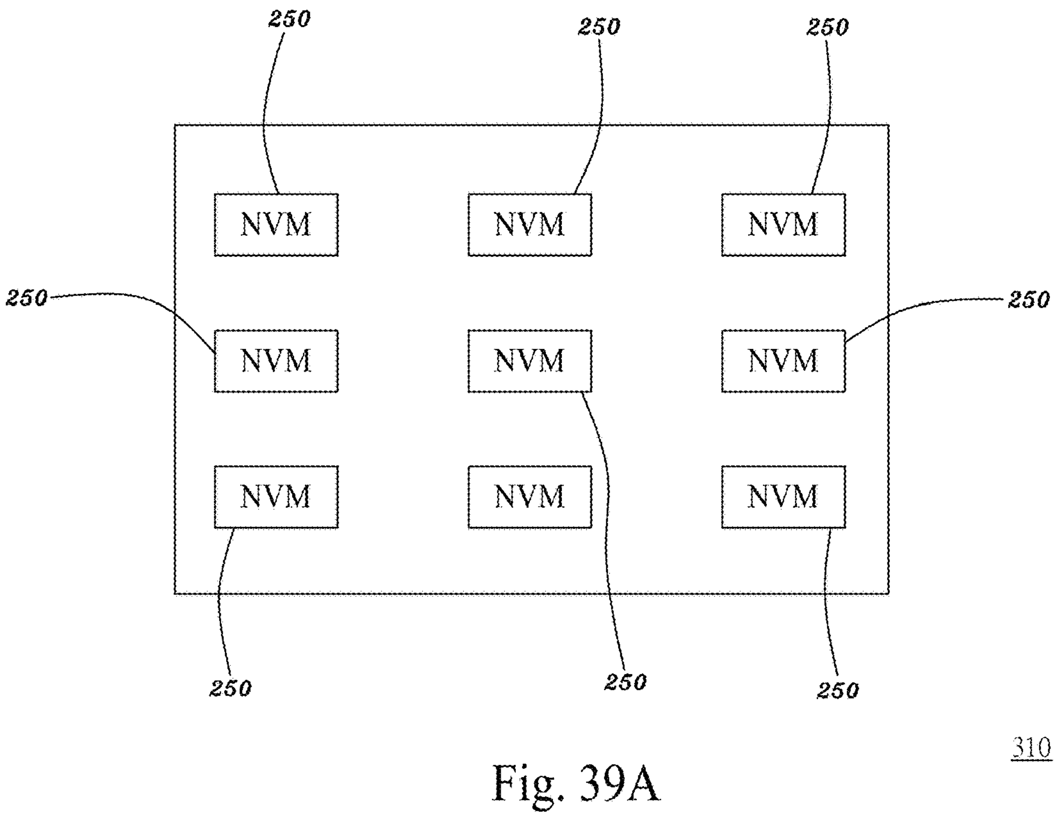
FIGS. 39A-39F are schematically top views showing various standard commodity memory drives in accordance with an embodiment of the present application.

The disclosure also relates to a standard commodity memory drive, package, package drive, device, module, disk, disk drive, solid-state disk, or solid-state drive 310 (to be abbreviated as "drive" below, that is when "drive" is mentioned below, it means and reads as "drive, package, package drive, device, module, disk, disk drive, solid-state disk, or solid-state drive"), in a multi-chip package comprising plural standard commodity non-volatile memory IC chips 250 for use in data storage, as seen in FIG. 39A. FIG. 39A is a schematically top view showing a standard commodity memory drive in accordance with an embodiment of the present application. Referring to FIG. 39A, a first type of memory drive 310 may be a non-volatile memory drive 322, which may be used for the drive-to-drive assembly as seen in FIGS. 37A-37K, packaged with multiple high speed, high bandwidth, wide bitwidth non-volatile memory (NVM) IC chips 250 for the semiconductor chips 100 arranged in an array, wherein the architecture of the memory drive 310 and the process for forming the same may be referred to that of the logic drive 300 and the process for forming the same, but the difference therebetween is the semiconductor chips 100 are arranged as shown in FIG. 39A. Each of the high speed, high bandwidth, wide bitwidth non-volatile memory IC chips 250 may be NAND flash chip in a bare-die format or in a multi-chip flash package format. Data stored in the non-volatile memory IC chips 250 of the standard commodity memory drive 310 are kept even if the memory drive 310 is powered off. Alternatively, the high speed, high bandwidth, wide bitwidth non-volatile memory IC chips 250 may be Non-Volatile Random-Access-Memory (NVRAM) IC chips in a bare-die format or in a package format. The NVRAM may be a Ferroelectric RAM (FRAM), Magnetoresistive RAM (MRAM), Resistive RAM (RRAM) or Phase-change RAM (PRAM). Each of the NAND flash chips 250 may have a standard memory density, capacity or size of greater than or equal to 64 Mb, 512 Mb, 1 Gb, 4 Gb, 16 Gb, 64 Gb, 128 Gb, 256 Gb, or 512 Gb, wherein "b" is bits. Each of the NAND flash chips 250 may be designed and fabricated using advanced NAND flash technology nodes or generations, for example, more advanced than or equal to 45 nm, 28 nm, 20 nm, 16 nm, and/or 10 nm, wherein the advanced NAND flash technology may comprise Single Level Cells (SLC) or multiple level cells (MLC) (for example, Double Level Cells DLC, or triple Level cells TLC) in a 2D-NAND or a 3D NAND structure. The 3D NAND structures may comprise multiple stacked layers or levels of NAND cells, for example, greater than or equal to 4, 8, 16, 32 stacked layers or levels of NAND cells. Accordingly, the standard commodity memory drive 310 may have a standard non-volatile memory density, capacity or size of greater than or equal to 8 MB, 64 MB, 128 GB, 512 GB, 1 GB, 4 GB, 16 GB, 64 GB, 256 GB, or 512 GB, wherein "B" is bytes, each byte has 8 bits.

Figure 39B:
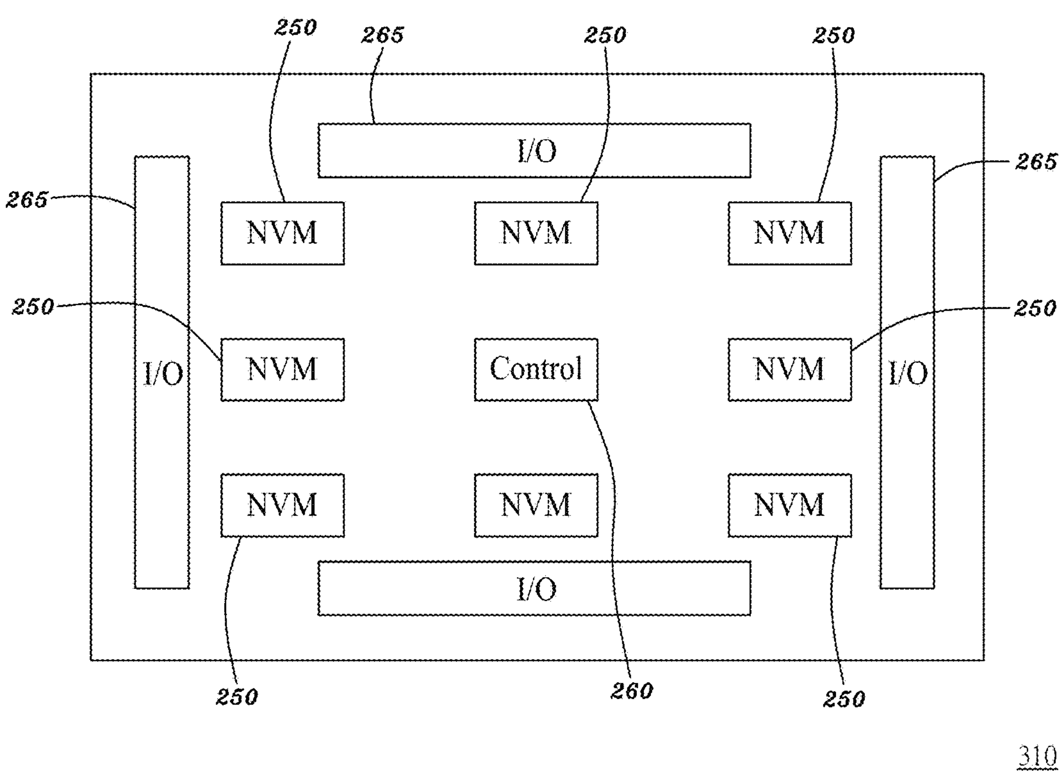

FIG. 39B is a schematically top view showing another standard commodity memory drive in accordance with an embodiment of the present application. Referring to FIG. 39B, a second type of memory drive 310 may be a non-volatile memory drive 322, which may be used for the drive-to-drive assembly as seen in FIGS. 37A-37K, packaged with multiple non-volatile memory IC chips 250 as illustrated in FIG. 39A, multiple dedicated I/O chips 265 and a dedicated control chip 260 for the semiconductor chips 100, wherein the non-volatile memory IC chips 250 and dedicated control chip 260 may be arranged in an array. The architecture of the memory drive 310 and the process for forming the same may be referred to that of the logic drive 300 and the process for forming the same, but the difference therebetween is the semiconductor chips 100 are arranged as shown in FIG. 39B. The dedicated control chip 260 may be surrounded by the non-volatile memory IC chips 250. Each of the dedicated I/O chips 265 may be arranged along a side of the memory drive 310. The specification of the non-volatile memory IC chip 250 may be referred to that as illustrated in FIG. 39A. The specification of the dedicated control chip 260 packaged in the memory drive 310 may be referred to that of the dedicated control chip 260 packaged in the logic drive 300 as illustrated in FIG. 15A. The specification of the dedicated I/O chip 265 packaged in the memory drive 310 may be referred to that of the dedicated I/O chip 265 packaged in the logic drive 300 as illustrated in FIGS. 15A-15O.

Figure 39C:
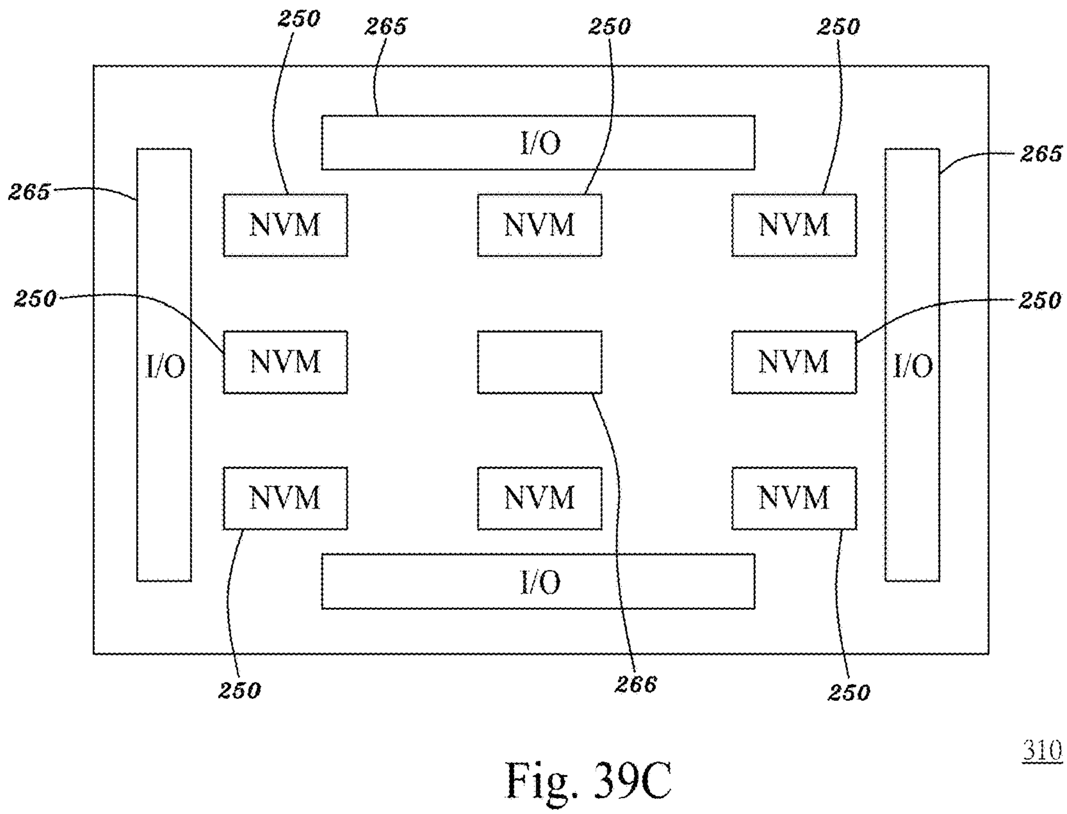

FIG. 39C is a schematically top view showing another standard commodity memory drive in accordance with an embodiment of the present application. Referring to FIG. 39C, the dedicated control chip 260 and dedicated I/O chips 265 have functions that may be combined into a single chip 266, i.e., dedicated control and I/O chip, to perform above-mentioned functions of the control and I/O chips 260 and 265. A third type of memory drive 310 may be a non-volatile memory drive 322, which may be used for the drive-to-drive assembly as seen in FIGS. 37A-37K, packaged with multiple non-volatile memory IC chips 250 as illustrated in FIG. 39A, multiple dedicated I/O chips 265 and a dedicated control and I/O chip 266 for the semiconductor chips 100, wherein the non-volatile memory IC chips 250 and dedicated control and I/O chip 266 may be arranged in an array. The architecture of the memory drive 310 and the process for forming the same may be referred to that of the logic drive 300 and the process for forming the same, but the difference therebetween is the semiconductor chips 100 are arranged as shown in FIG. 39C. The dedicated control and I/O chip 266 may be surrounded by the non-volatile memory IC chips 250. Each of the dedicated I/O chips 265 may be arranged along a side of the memory drive 310. The specification of the non-volatile memory IC chip 250 may be referred to that as illustrated in FIG. 39A. The specification of the dedicated control and I/O chip 266 packaged in the memory drive 310 may be referred to that of the dedicated control and I/O chip 266 packaged in the logic drive 300 as illustrated in FIG. 15B. The specification of the dedicated I/O chip 265 packaged in the memory drive 310 may be referred to that of the dedicated I/O chip 265 packaged in the logic drive 300 as illustrated in FIGS. 15A-15O.

Figure 39D:
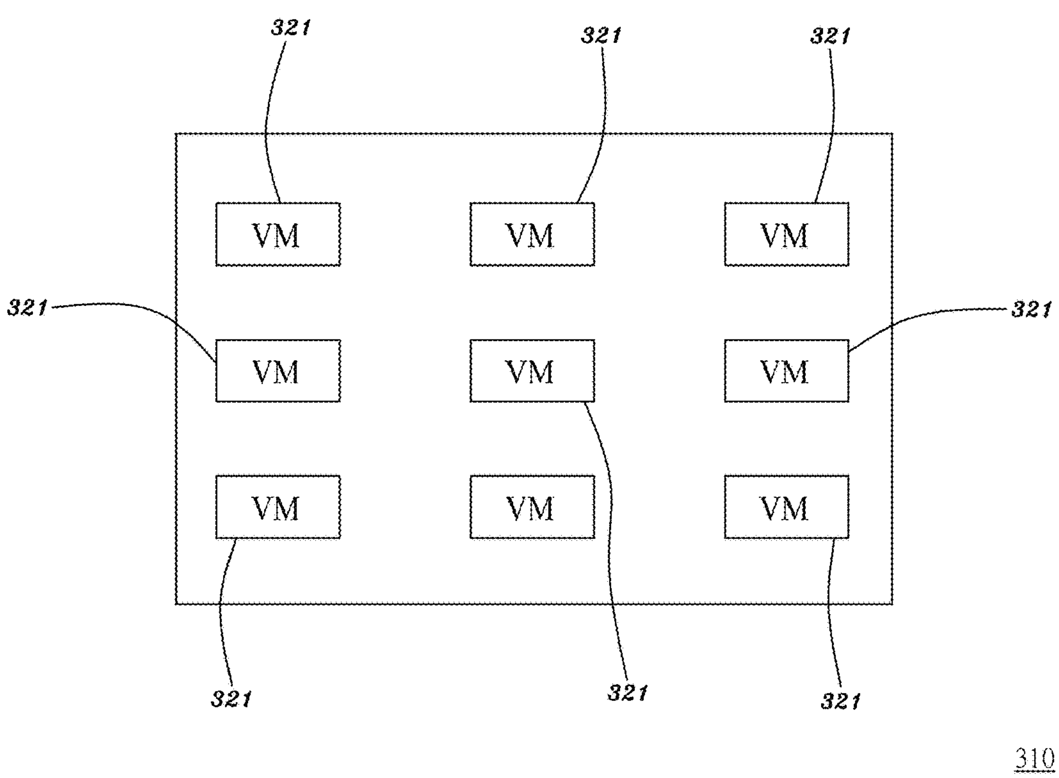

FIG. 39D is a schematically top view showing a standard commodity memory drive in accordance with an embodiment of the present application. Referring to FIG. 34D, a fourth type of memory drive 310 may be a volatile memory drive 323, which may be used for the drive-to-drive assembly as seen in FIGS. 37A-37K, packaged with multiple volatile memory (VM) IC chips 324, such as high speed, high bandwidth, wide bitwidth DRAM IC chips as illustrated for the one 321 packaged in the logic drive 300 as illustrated in FIGS. 15A-15O or high speed, high bandwidth, wide bitwidth cache SRAM chips, for the semiconductor chips 100 arranged in an array, wherein the architecture of the memory drive 310 and the process for forming the same may be referred to that of the logic drive 300 and the process for forming the same, but the difference therebetween is the semiconductor chips 100 are arranged as shown in FIG. 39D. In a case, all of the volatile memory (VM) IC chips 324 of the memory drive 310 may be DRAM IC chips 321. Alternatively, all of the volatile memory (VM) IC chips 324 of the memory drive 310 may be SRAM chips. Alternatively, all of the volatile memory (VM) IC chips 324 of the memory drive 310 may be a combination of DRAM IC chips and SRAM chips.

Figure 39E:
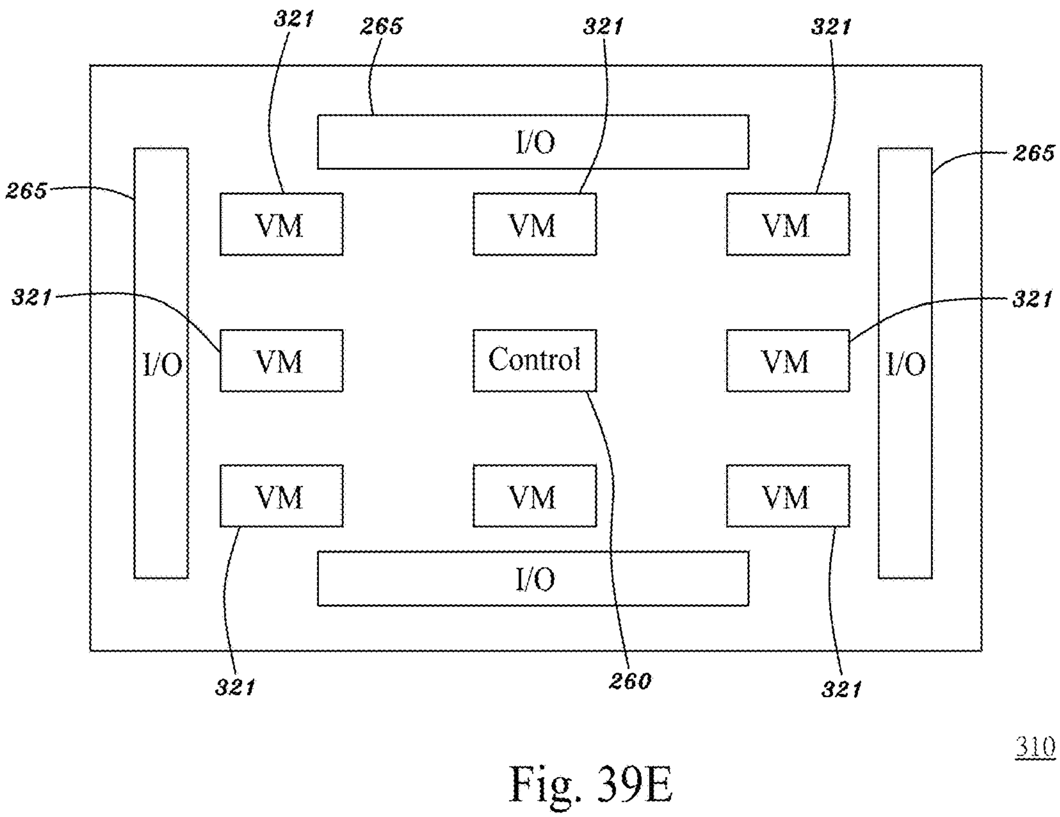

FIG. 39E is a schematically top view showing another standard commodity memory drive in accordance with an embodiment of the present application. Referring to FIG. 39E, a fifth type of memory drive 310 may be a volatile memory drive 323, which may be used for the drive-to-drive assembly as seen in FIGS. 37A-37K, packaged with multiple volatile memory (VM) IC chips 324, such as high speed, high bandwidth, wide bitwidth DRAM IC chips or high speed, high bandwidth, wide bitwidth cache SRAM chips, multiple dedicated I/O chips 265 and a dedicated control chip 260 for the semiconductor chips 100, wherein the volatile memory (VM) IC chips 324 and dedicated control chip 260 may be arranged in an array, wherein the architecture of the memory drive 310 and the process for forming the same may be referred to that of the logic drive 300 and the process for forming the same, but the difference therebetween is the semiconductor chips 100 are arranged as shown in FIG. 39E. In this case, the locations for mounting each of the DRAM IC chips 321 may be changed for mounting a SRAM chip. The dedicated control chip 260 may be surrounded by the volatile memory chips such as DRAM IC chips 321 or SRAM chips. Each of the dedicated I/O chips 265 may be arranged along a side of the memory drive 310. In a case, all of the volatile memory (VM) IC chips 324 of the memory drive 310 may be DRAM IC chips 321. Alternatively, all of the volatile memory (VM) IC chips 324 of the memory drive 310 may be SRAM chips. Alternatively, all of the volatile memory (VM) IC chips 324 of the memory drive 310 may be a combination of DRAM IC chips and SRAM chips. The specification of the dedicated control chip 260 packaged in the memory drive 310 may be referred to that of the dedicated control chip 260 packaged in the logic drive 300 as illustrated in FIG. 15A. The specification of the dedicated I/O chip 265 packaged in the memory drive 310 may be referred to that of the dedicated I/O chip 265 packaged in the logic drive 300 as illustrated in FIGS. 15A-15O.

Figure 39F:
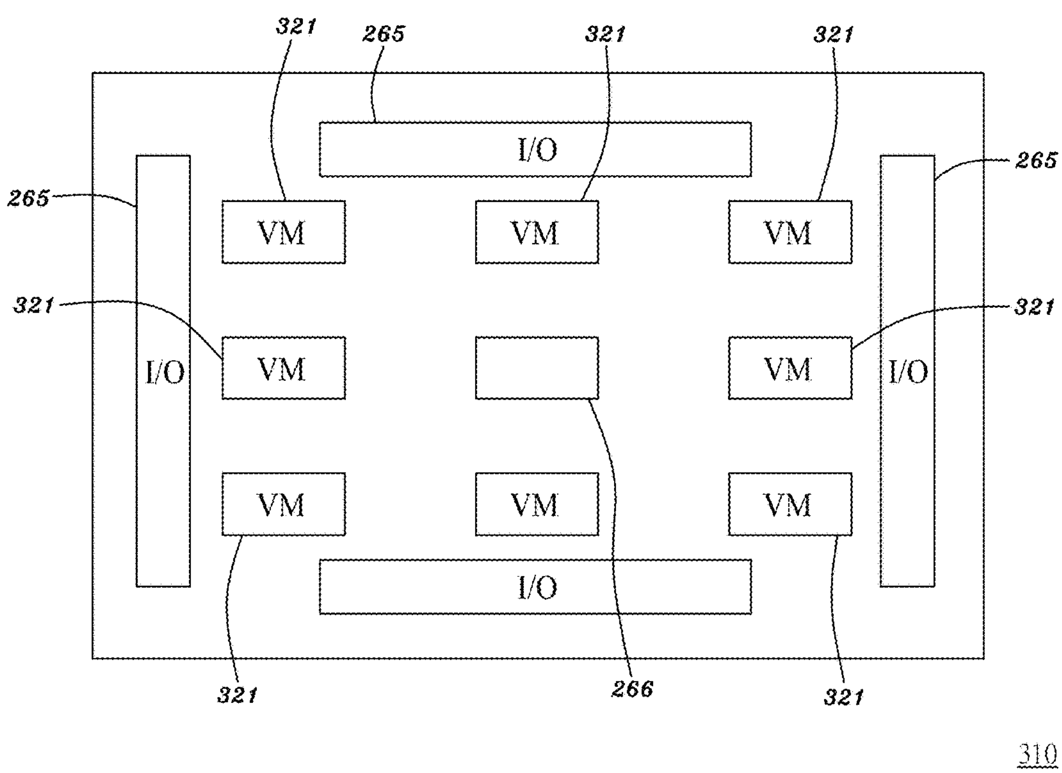

FIG. 39F is a schematically top view showing another standard commodity memory drive in accordance with an embodiment of the present application. Referring to FIG. 39F, the dedicated control chip 260 and dedicated I/O chips 265 have functions that may be combined into a single chip 266, i.e., dedicated control and I/O chip, to perform above-mentioned functions of the control and I/O chips 260 and 265. A sixth type of memory drive 310 may be a volatile memory drive 323, which may be used for the drive-to-drive assembly as seen in FIGS. 37A-37K, packaged with multiple volatile memory (VM) IC chips 324, such as high speed, high bandwidth, wide bitwidth DRAM IC chips as illustrated for the one 321 packaged in the logic drive 300 as illustrated in FIGS. 15A-15O or high speed, high bandwidth, wide bitwidth cache SRAM chips, multiple dedicated I/O chips 265 and the dedicated control and I/O chip 266 for the semiconductor chips 100, wherein the volatile memory (VM) IC chips 324 and dedicated control and I/O chip 266 may be arranged in an array as shown in FIG. 39F. The dedicated control and I/O chip 266 may be surrounded by the volatile memory chips such as DRAM IC chips 321 or SRAM chips. In a case, all of the volatile memory (VM) IC chips 324 of the memory drive 310 may be DRAM IC chips 321. Alternatively, all of the volatile memory (VM) IC chips 324 of the memory drive 310 may be SRAM chips. Alternatively, all of the volatile memory (VM) IC chips 324 of the memory drive 310 may be a combination of DRAM IC chips and SRAM chips. The architecture of the memory drive 310 and the process for forming the same may be referred to that of the logic drive 300 and the process for forming the same, but the difference therebetween is the semiconductor chips 100 are arranged as shown in FIG. 39F. Each of the dedicated I/O chips 265 may be arranged along a side of the memory drive 310. The specification of the dedicated control and I/O chip 266 packaged in the memory drive 310 may be referred to that of the dedicated control and I/O chip 266 packaged in the logic drive 300 as illustrated in FIG. 15B. The specification of the dedicated I/O chip 265 packaged in the memory drive 310 may be referred to that of the dedicated I/O chip 265 packaged in the logic drive 300 as illustrated in FIGS. 15A-15O. The specification of the DRAM IC chips 321 packaged in the memory drive 310 may be referred to that of the DRAM IC chips 321 packaged in the logic drive 300 as illustrated in FIGS. 15A-15O.

Alternatively, another type of memory drive 310 may include a combination of non-volatile memory (NVM) IC chips 250 and volatile memory chips. For example, referring to FIGS. 39A-39C, some of the locations for mounting the NVM IC chips 250 may be altered for mounting the volatile memory chips, such as high speed, high bandwidth, wide bitwidth DRAM IC chips 321 or high speed, high bandwidth, wide bitwidth SRAM chips.

FOISD-to-FOISD Assembly for Logic and Memory Drives

Figure 40A:
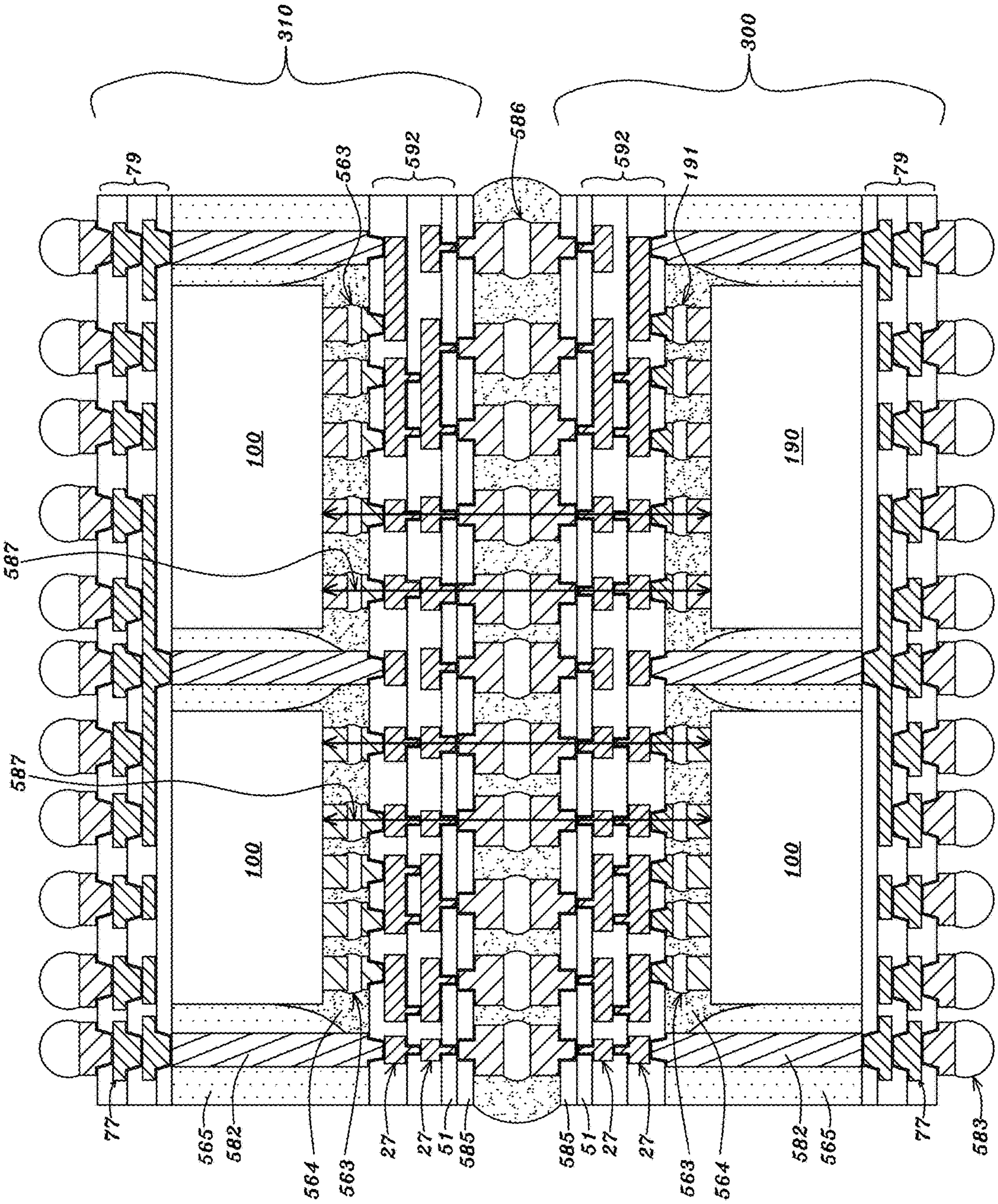
FIGS. 40A-40D are cross-sectional views showing various assemblies for multiple COIP logic and memory drives in accordance with an embodiment of the present application.

Alternatively, FIGS. 40A-40D are cross-sectional views showing various assemblies for FOIT logic and memory drives in accordance with an embodiment of the present application. Referring to FIG. 40A, the FOIT memory drive 310 may have its metal bumps 570 provided with the solder bumps 569 to be bonded respectively to the solder bumps 569 of the metal bumps 570 of the FOIT logic drive 300 to form multiple bonded contacts 586 between the FOIT memory and logic drives 310 and 300. For example, one of the logic and memory drives 300 and 310 may be provided with the metal pillars or bumps 570 of the fourth type having the solder balls or bumps 569 as illustrated in FIG. 26B to be bonded to the copper layer 568, as seen in FIG. 26B, of the metal pillars or bumps 570 of the first type of the other of the logic and memory drives 300 and 310 so as to form the bonded contacts 586 between the memory and logic drives 310 and 300.

For high speed, high bandwidth and wide bitwidth communications between one of the semiconductor chips 100, e.g., non-volatile or volatile memory chip 250 or 324 as illustrated in FIGS. 39A-39F, of the FOIT memory drive 310 and one of the semiconductor chips 100, e.g., FPGA IC chip 200 in a single-die type or in the operation module 190 or PCIC chip 269 as illustrated in FIGS. 15A-15O, of the FOIT logic drive 300, said one of the semiconductor chips 100 of the FOIT memory drive 310 may be aligned with and positioned vertically over said one of the semiconductor chips 100 and/or operation modules 190 of the FOIT logic drive 300.

Referring to FIG. 40A, the FOIT memory drive 310 may include multiple first stacked portions provided by the interconnection metal layers 27 of its FOISD 592, wherein each of the first stacked portions may be aligned with and positioned vertically over one of the bonded contacts 586 and positioned between said one of its semiconductor chips 100 and said one of the bonded contacts 586. Further, for the FOIT memory drive 310, multiple of its bonded contacts 563 may be aligned with and stacked on or over its first stacked portions respectively and positioned between said one of its semiconductor chips 100 and/or operation modules 190 and its first stacked portions to connect said one of its semiconductor chips 100 and/or operation modules 190 to its first stacked portions respectively.

Referring to FIG. 40A, the FOIT logic drive 300 may include multiple second stacked portions provided by the interconnection metal layers 27 of its FOISD 592, wherein each of the second stacked portions may be aligned with and stacked under or below one of the bonded contacts 586 and positioned between said one of its semiconductor chips 100 and said one of the bonded contacts 586. Further, for the FOIT logic drive 300, multiple of its bonded contacts 563 or 191 may be aligned with and stacked under or below its second stacked portions respectively and positioned between said one of its semiconductor chips 100 and its second stacked portions to connect said one of its semiconductor chips 100 to its second stacked portions respectively.

Accordingly, referring to FIG. 40A, from bottom to top, one of the bonded contacts 563 or 191 of the FOIT logic drive 300, one of the second stacked portions of the FOISD 592 of the FOIT logic drive 300, one of the bonded contacts 586, one of the first stacked portions of the FOISD 592 of the FOIT memory drive 310 and one of the bonded contacts 563 of the FOIT memory drive 310 may be stacked together in a vertical direction to form a vertical stacked path 587 between said one of the semiconductor chips 100 and/or operation modules 190 of the FOIT logic drive 300 and said one of the semiconductor chips 100 of the FOIT memory drive 310 for signal transmission or power or ground delivery. In an aspect, a plurality of the vertical stacked path 587 having the number equal to or greater than 64, 128, 256, 512, 1024, 2048, 4096, 8K, or 16K, for example, may be connected between said one of the semiconductor chips 100 and/or operation modules 190 of the FOIT logic drive 300 and said one of the semiconductor chips 100 of the FOIT memory drive 310 for parallel signal transmission or power or ground delivery.

Referring to FIG. 40A, said one of the semiconductor chips 100 of the FOIT logic drive 300 may include the small I/O circuits 203 as seen in FIG. 5B having the driving capability, loading, output capacitance or input capacitance between 0.05 pF and 2 pF or between 0.05 pF and 1 pF, or smaller than 2 pF or 1 pF, each of which may couple to one of the vertical stacked paths 587 through one of its I/O pads 372, and said one of the semiconductor chips 100 of the FOIT memory drive 310 may include the small I/O circuits 203 as seen in FIG. 5B having the driving capability, loading, output capacitance or input capacitance between 0.05 pF and 2 pF or between 0.05 pF and 1 pF, each of which may couple to said one of the vertical stacked paths 587 through one of its I/O pads 372. For example, each of the small I/O circuits 203 may be composed of the small ESD protection circuit 373, small receiver 375, and small driver 374.

Alternatively, referring to FIG. 40A, the FPGA IC chip 200 of said one of the operation modules 190 of the FOIT logic drive 300 may include the small I/O circuits 203 as seen in FIG. 5B having the driving capability, loading, output capacitance or input capacitance between 0.05 pF and 2 pF or between 0.05 pF and 1 pF, or smaller than 2 pF or 1 pF, each of which may couple to one of the vertical stacked paths 587 through one of its I/O pads 372, and said one of the semiconductor chips 100 of the FOIT memory drive 310 may include the small I/O circuits 203 as seen in FIG. 5B having the driving capability, loading, output capacitance or input capacitance between 0.05 pF and 2 pF or between 0.05 pF and 1 pF, each of which may couple to said one of the vertical stacked paths 587 through one of its I/O pads 372.

Referring to FIG. 40A, each of the FOIT logic and memory drives 300 and 310 may have the metal bumps 583 formed on the metal pads 77*e* of its BISD 79 for connecting said each of the FOIT logic and memory drives 300 and 310 to an external circuitry. For each of the FOIP logic and memory drives 300 and 310, one of its metal bumps 583 may (1) couple to one of its semiconductor chips 100 and/or operation modules 190 through the interconnection metal layers 77 of its BISD 79, one or more of its TPVs 582, the interconnection metal layers 27 of its FOISD 592 and one or more of its bonded contacts 563 or 191 in sequence, (2) couple to one of the semiconductor chips 100 of the other of the FOIT logic and memory drives 300 and 310 through the interconnection metal layers 77 of its BISD 79, one or more of its TPVs 582, the interconnection metal layers 27 of its FOISD 592, one or more of the bonded contacts 586, the interconnection metal layers 27 of the FOISD 592 of the other of the FOIT logic and memory drives 300 and 310, and one or more of the bonded contacts 563 or 191 of the other of the FOIT logic and memory drives 300 and 310 in sequence, or (3) couple to one of the metal bumps 583 of the other of the FOIT logic and memory drives 300 and 310 through the interconnection metal layers 77 of its BISD 79, one or more of its TPVs 582, the interconnection metal layers 27 its FOISD 592, one or more of the bonded contacts 586, the interconnection metal layers 27 of the FOISD 592 of the other of the FOIT logic and memory drives 300 and 310, one or more of the TPVs 582 of the other of the FOIT logic and memory drives 300 and 310, and the interconnection metal layers 77 of the BISD 79 of the other of the FOIT logic and memory drives 300 and 310 in sequence.

Figure 40B:
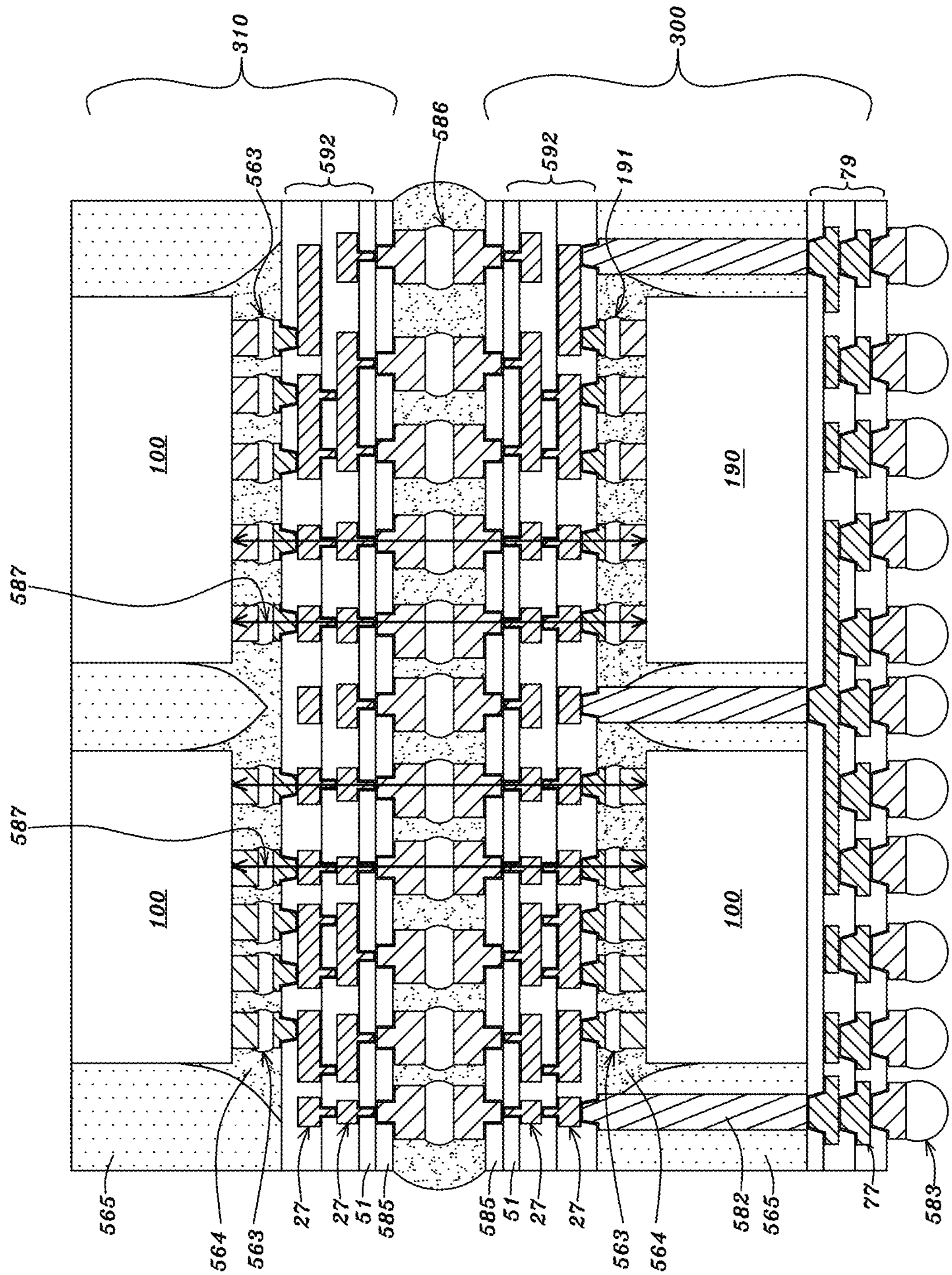
Figure 40C:
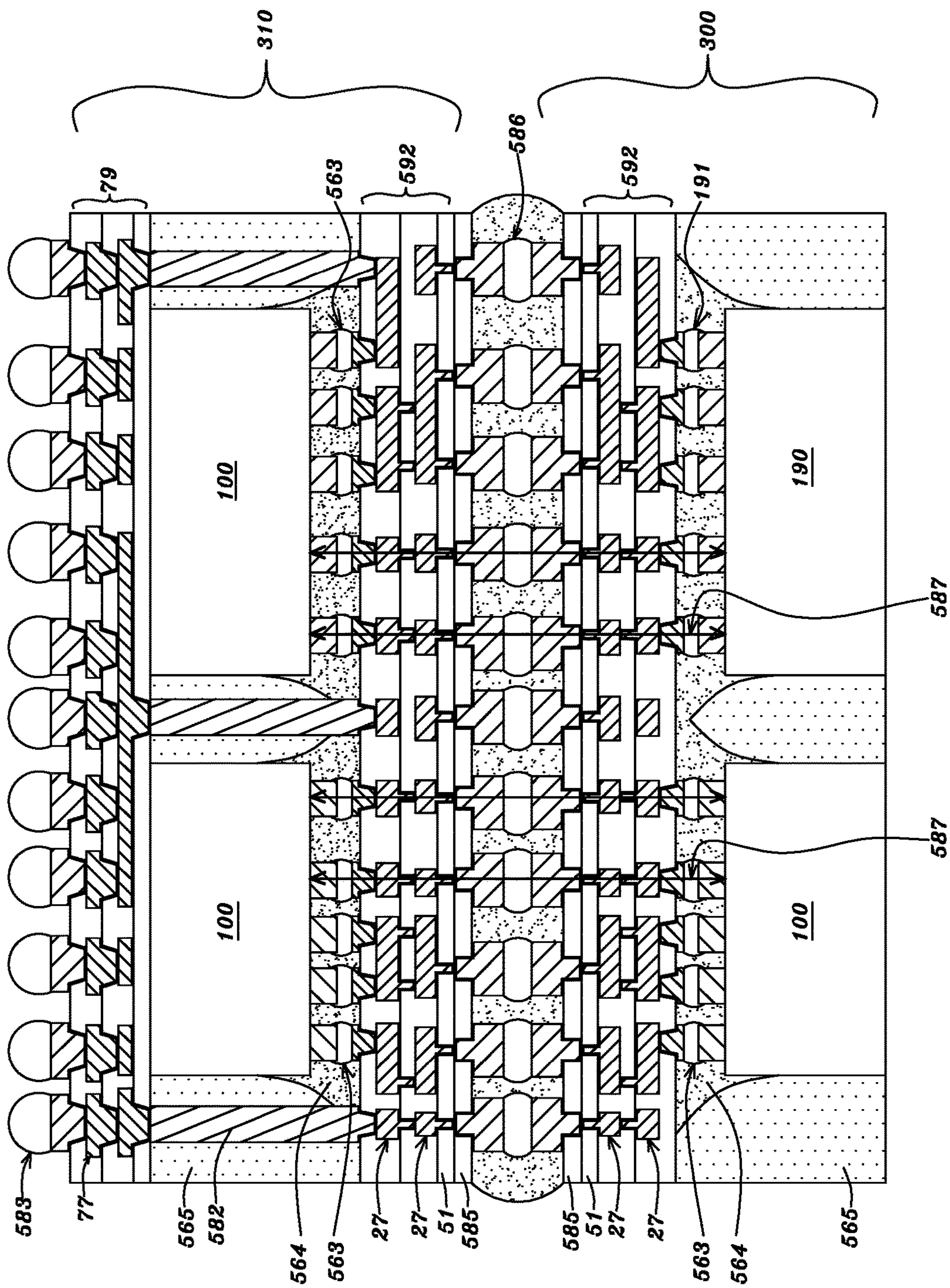
Figure 40D:
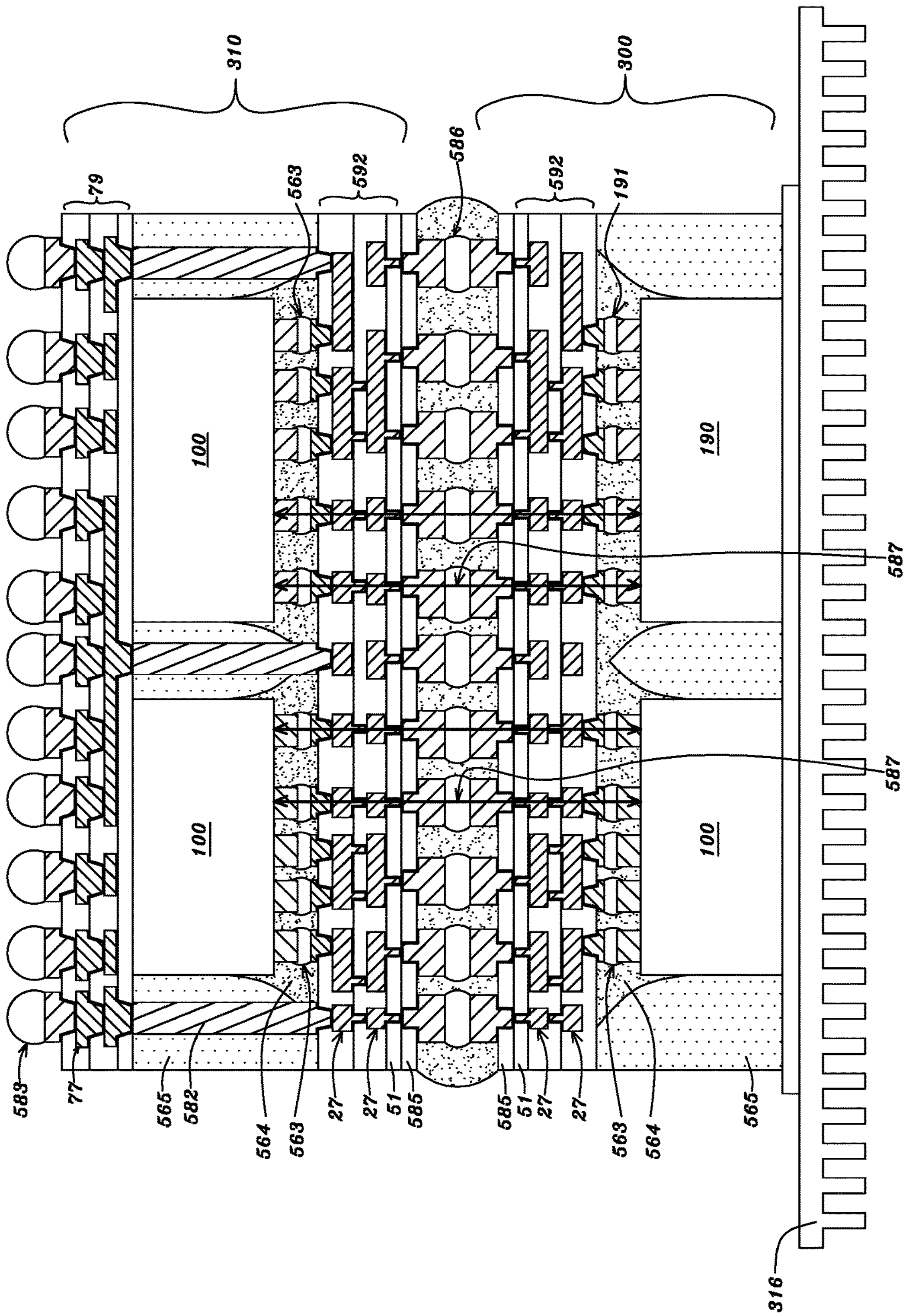

Alternatively, referring to FIGS. 40B, 40C and 40D, their structures are similar to that shown in FIG. 40A. For an element indicated by the same reference number shown in FIGS. 40A-40D, the specification of the element as seen in FIGS. 40B, 40C and 40D may be referred to that of the element as illustrated in FIG. 40A. The difference between the structures shown in FIGS. 40A and 40B is that the FOIT memory drive 310 may not be provided with the metal bumps 583, BISD 79 and TPVs 582 for external connection and each of the semiconductor chips 100 of the FOIT memory drive 310 may have a backside exposed to the ambient of the FOIT memory drive 310. The difference between the structures shown in FIGS. 40A and 40C is that the FOIT logic drive 300 may not be provided with the metal bumps 583, BISD 79 and TPVs 582 for external connection and each of the semiconductor chips 100 and/or operation modules 190 of the FOIT logic drive 300 may have a backside exposed to the ambient of the FOIT logic drive 300. The difference between the structures shown in FIGS. 40A and 40D is that the FOIT logic drive 300 may not be provided with the metal bumps 583, BISD 79 and TPVs 582 for external connection and each of the semiconductor chips 100 and/or operation modules 190 of the FOIT logic drive 300 may have a backside joining a heat sink 316 made of copper or aluminum for example.

Referring to FIGS. 40A-40D, for an example of parallel signal transmission, the vertical stacked paths 587 in parallel may be arranged between said one of the semiconductor chip 100, e.g. graphic-procession-unit (GPU) chip as illustrated in FIGS. 15F-15O, of the FOIT logic drive 300 and one of the semiconductor chips 100, e.g., high speed, high bandwidth, wide bitwidth cache SRAM chip, DRAM IC chip, or NVMIC chip for MRAM or RRAM as illustrated in FIGS. 39A-39F, of the FOIT memory drive 310 with a data bit width of equal to or greater than 64, 128, 256, 512, 1024, 2048, 4096, 8K, or 16K. Alternatively, for an example of parallel signal transmission, the vertical stacked paths 587 in parallel may be arranged between one of the semiconductor chip 100, e.g. tensor-procession-unit (TPU) chip as illustrated in FIGS. 15F-15O, of the FOIT logic drive 300 and one of the semiconductor chips 100, e.g., high speed, high bandwidth, wide bitwidth cache SRAM chip, DRAM IC chip, or NVM chip for MRAM or RRAM as illustrated in FIGS. 39A-39F, of the FOIT memory drive 310 with a data bit width of equal to or greater than 64, 128, 256, 512, 1024, 2048, 4096, 8K, or 16K. Alternatively, for an example of parallel signal transmission, the vertical stacked paths 587 in parallel may be arranged between one of the semiconductor chip 100, e.g. FPGA IC chip 200 in a single-die type as illustrated in FIGS. 15F-15O, of the FOIT logic drive 300 and one of the semiconductor chips 100, e.g., high speed, high bandwidth, wide bitwidth cache SRAM chip, DRAM IC chip, or NVM chip for MRAM or RRAM as illustrated in FIGS. 39A-39F, of the FOIT memory drive 310 with a data bit width of equal to or greater than 64, 128, 256, 512, 1024, 2048, 4096, 8K, or 16K. Alternatively, for an example of parallel signal transmission, the vertical stacked paths 587 in parallel may be arranged between the FPGA IC chip 200 of one of the operation modules 190, as illustrated in FIGS. 15L-15O, of the FOIT logic drive 300 and one of the semiconductor chips 100, e.g., high speed, high bandwidth, wide bitwidth cache SRAM chip, DRAM IC chip, or NVM chip for MRAM or RRAM as illustrated in FIGS. 39A-39F, of the FOIT memory drive 310 with a data bit width of equal to or greater than 64, 128, 256, 512, 1024, 2048, 4096, 8K, or 16K.

Figure 40E:
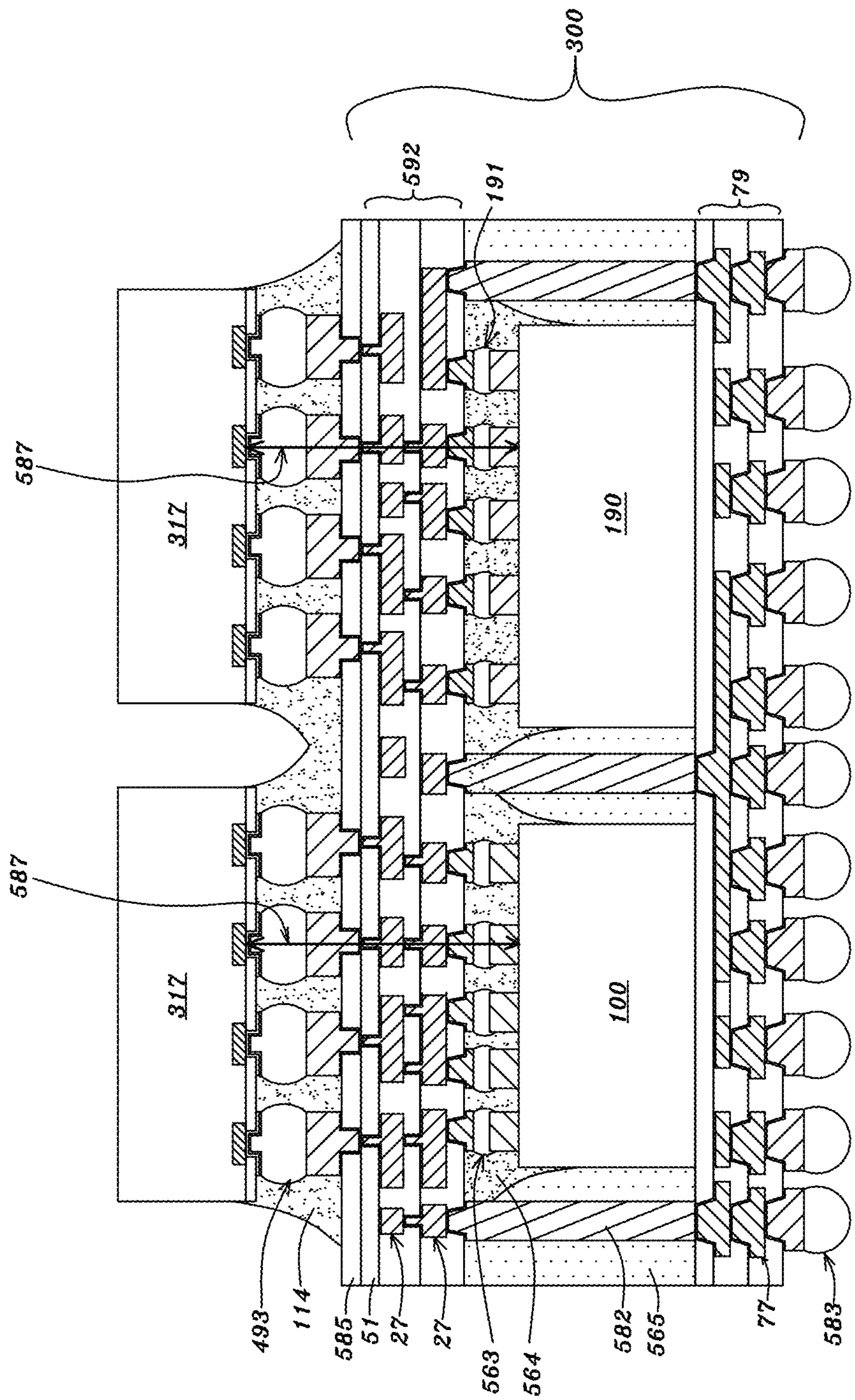
FIGS. 40E and 40F are cross-sectional views showing a COIP logic drive assembled with one or more memory IC chips in accordance with an embodiment of the present application.
Figure 40F:
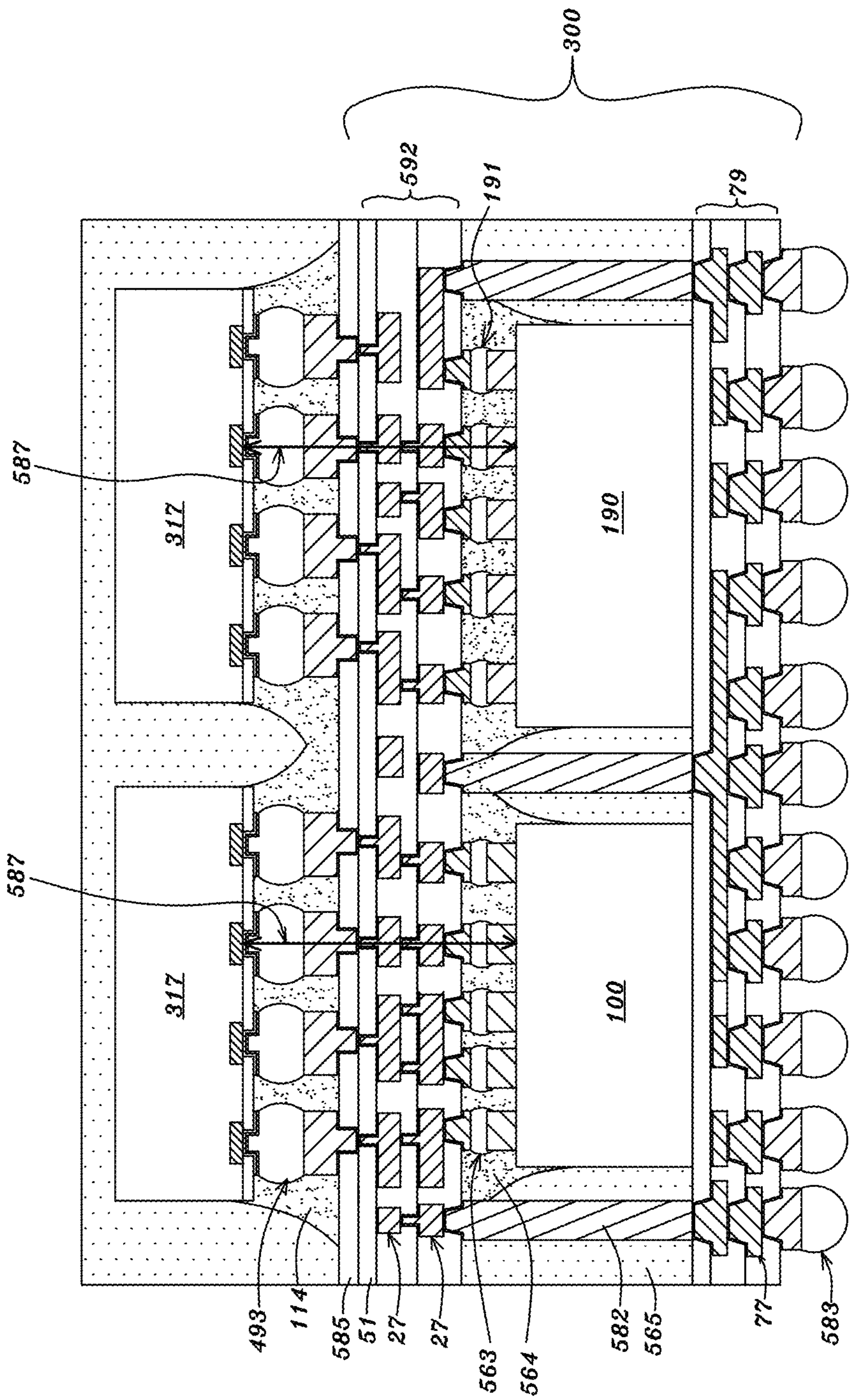

Alternatively, FIGS. 40E and 40F are cross-sectional views showing a FOIT logic drive assembled with one or more memory IC chips in accordance with an embodiment of the present application. Referring to FIG. 40E, each of one or more memory IC chips 317, such as high speed, high bandwidth, wide bitwidth cache SRAM chip, DRAM IC chip, or NVM IC chip for MRAM or RRAM, may be provided with multiple electrical contacts, such as tin-containing bumps or pads or copper bumps or pads, on an active surface thereof to be bonded to the solder bumps 569 of the solder bumps 570 of the FOIT logic drive 300 to form multiple bonded contacts 586 between the FOIT logic drive 300 and said each of the one or more memory IC chips 317.

For a first case, referring to FIGS. 40E and 40F, each of the memory IC chips 317 may have the micro-pillars or micro-bumps 34 of the first type to be bonded to the first type of metal bumps or pillars 570 of the FOIT logic drive 300. For example, the first type of micro-pillars or micro-bumps 34 of said each of the memory IC chips 317 may have the solder bumps 33 to be bonded onto the electroplated copper layer of the metal bumps or pillars 570 of the first type of the FOIT logic drive 300 into multiple bonded contacts 493 between said each of the memory IC chips 317 and the FOIT logic drive 300. Each of the micro-pillars or micro-bumps 34 of the first type of said each of the memory IC chips 317 may have its metal layer 32 formed with the electroplated copper layer having a thickness greater than that of the electroplated copper layer of the metal layer 568 of each of the metal bumps or pillars 570 of the first type of the FOIT logic drive 300.

For a second case, referring to FIGS. 40E and 40F, each of the memory IC chips 317 may have the micro-pillars or micro-bumps 34 of the second type to be bonded to the second type of metal bumps or pillars 570 of the FOIT logic drive 300. For example, the second type of micro-pillars or micro-bumps 34 of said each of the memory IC chips 317 may have the electroplated metal layer 32, e.g. copper layer, to be bonded onto the solder balls or bumps of the metal bumps or pillars 570 of the second type of the FOIT logic drive 300 into multiple bonded contacts 493 between said each of the memory IC chips 317 and the FOIT logic drive 300.

For a third case, referring to FIGS. 40E and 40F, each of the memory IC chips 317 may have the micro-pillars or micro-bumps 34 of the second type to be bonded to the fourth type of metal bumps or pillars 570 of the FOIT logic drive 300. For example, the second type of micro-pillars or micro-bumps 34 of said each of the memory IC chips 317 may have the electroplated metal layer 32, e.g. copper layer, to be bonded onto the solder bumps 569 of the metal bumps or pillars 570 of the fourth type of the FOIT logic drive 300 into multiple bonded contacts 493 between said each of the memory IC chips 317 and the FOIT logic drive 300. Each of the micro-pillars or micro-bumps 34 of the second type of said each of the memory IC chips 317 may have its metal layer 32 formed with the electroplated copper layer having a thickness greater than that of the electroplated copper layer of the metal layer 568 of each of the metal bumps or pillars 570 of the fourth type of the FOIT logic drive 300.

For a fourth case, referring to FIGS. 40E and 40F, each of the memory IC chips 317 may have the micro-pillars or micro-bumps 34 of the first type to be bonded to the second type of metal bumps or pillars 570 of the FOIT logic drive 300. For example, the first type of micro-pillars or micro-bumps 34 of said each of the memory IC chips 317 may have the solder bumps 33 to be bonded onto the solder balls or bumps of the metal bumps or pillars 570 of the second type of the FOIT logic drive 300 into multiple bonded contacts 493 between said each of the memory IC chips 317 and the FOIT logic drive 300.

For a fifth case, referring to FIGS. 40E and 40F, each of the memory IC chips 317 may have the micro-pillars or micro-bumps 34 of the first type to be bonded to the fourth type of metal bumps or pillars 570 of the FOIT logic drive 300. For example, the first type of micro-pillars or micro-bumps 34 of said each of the memory IC chips 317 may have the solder bumps 33 to be bonded onto the solder bumps 569 of the metal bumps or pillars 570 of the fourth type of the FOIT logic drive 300 into multiple bonded contacts 493 between said each of the memory IC chips 317 and the FOIT logic drive 300. Each of the micro-pillars or micro-bumps 34 of the first type of said each of the memory IC chips 317 may have its metal layer 32 formed with the electroplated copper layer having a thickness greater than that of the electroplated copper layer of the metal layer 568 of each of the metal bumps or pillars 570 of the fourth type of the FOIT logic drive 300.

Next, referring to FIGS. 40E and 40F, an underfill 114, such as polymer, may be optionally filled into a gap between the FOIT logic drive 300 and said each of the memory chips 317, covering a sidewall of each of the bonded contacts 493.

For high speed, high bandwidth and wide bitwidth communications between one of the memory IC chips 317 and one of the semiconductor chips 100, e.g., FPGA IC chip 200 in a single-die type or PCIC chip 269 as illustrated in FIGS. 15A-15O, of the FOIT logic drive 300 or between one of the memory IC chips 317 and the standard commodity FPGA IC chip 200 in one of the operation modules 190, as illustrated in FIGS. 15L-15O, of the FOIT logic drive 300, said one of the memory IC chips 317 may be aligned with and positioned vertically over said one of the semiconductor chips 100 of the FOIT logic drive 300 or said one of the operation modules 190. The bonded contacts 493 between said one of the memory IC chips 317 and said one of the semiconductor chips 100 or between said one of the memory IC chips 317 and said one of the operation modules 190 may have a group aligned with and positioned vertically over the second stacked portions of the FOIT logic drive 300 respectively for data or signal transmission or power/ground delivery between said one of the memory IC chips 317 and said one of the semiconductor chips 100 of the FOIT logic drive 300 or between said one of the memory IC chips 317 and said one of the operation modules 190 of the FOIT logic drive 300, wherein each of the second stacked portions is positioned between said one of the memory IC chips 317 and said one of the semiconductor chips 100 of the FOIT logic drive 300 or between said one of the memory IC chips 317 and said one of the operation modules 190 of the FOIT logic drive 300. Thus, one of the bonded contacts 493 and one of the second stacked portions may be stacked together to form a stacked path 587.

In an aspect, referring to FIGS. 40E and 40F, a plurality of the vertical stacked path 587 having the number equal to or greater than 64, 128, 256, 512, 1024, 2048, 4096, 8K, or 16K, for example, may be connected between said one of the semiconductor chips 100 of the FOIT logic drive 300 and said one of the memory IC chips 317 for parallel signal transmission or power or ground delivery or between the standard commodity FPGA IC chip 200 of said one of the operation modules 190 of the FOIT logic drive 300 and said one of the memory IC chips 317 for parallel signal transmission or power or ground delivery. In an aspect, each of the semiconductor chips 100 and standard commodity FPGA IC chips 200 of the operation modules 190 of the FOIT logic drive 300 may include the small I/O circuits 203 as seen in FIG. 5B having the driving capability, loading, output capacitance or input capacitance between 0.05 pF and 2 pF or between 0.05 pF and 1 pF, or smaller than 2 pF or 1 pF, each of which may couple to one of the vertical stacked paths 587 through one of its I/O pads 372, and said one of the memory IC chips 317 may include the small I/O circuits 203 as seen in FIG. 5B having the driving capability, loading, output capacitance or input capacitance between 0.05 pF and 2 pF or between 0.05 pF and 1 pF, each of which may couple to said one of the vertical stacked paths 587 through one of its I/O pads 372. For example, each of the small I/O circuits 203 may be composed of the small ESD protection circuit 373, small receiver 375, and small driver 374.

Referring to FIGS. 40E and 40F, the FOIT logic drive 300 may have the metal bumps 583 formed on the metal pads 77*e* of its BISD 79 for connecting the FOIT logic drive 300 to an external circuitry. For the FOIT logic drive 300, one of its metal bumps 583 may (1) couple to one of its semiconductor chips 100 and operation modules 190 through the interconnection metal layers 77 of its BISD 79, one or more of its TPVs 582, the interconnection metal layers 27 of its FOISD 592 and one or more of its bonded contacts 563 in sequence, and/or (2) couple to one of the memory IC chips 317 through the interconnection metal layers 77 of its BISD 79, one or more of its TPVs 582, the interconnection metal layers 27 of its FOISD 592 and one or more of the bonded contacts 493 in sequence.

Alternatively, referring to FIG. 40F, its structure is similar to that shown in FIG. 40E. For an element indicated by the same reference number shown in FIGS. 40E and 40F, the specification of the element as seen in FIG. 35F may be referred to that of the element as illustrated in FIG. 40E. The difference between the structures shown in FIGS. 40E and 40F is that a polymer layer 318, such as resin, is formed by molding to cover the memory IC chips 317. Alternatively, the underfill 114 may be skipped and the polymer layer 318 may be further filled into a gap between the FOIT logic drive 300 and each of the memory IC chips 317, covering a sidewall of each of the bonded contacts 493.

Referring to FIGS. 40E and 40F, for an example of parallel signal transmission, the vertical stacked paths 587 in parallel may be arranged between said one of the semiconductor chip 100, e.g. GPU chip as illustrated in FIGS. 15F-15O, of the FOIT logic drive 300 and one of the memory IC chips 317, e.g., high speed, high bandwidth, wide bitwidth cache SRAM chip, DRAM IC chip, or NVM IC chip for MRAM or RRAM, with a data bit width of equal to or greater than 64, 128, 256, 512, 1024, 2048, 4096, 8K, or 16K. Alternatively, for an example of parallel signal transmission, the vertical stacked paths 587 in parallel may be arranged between one of the semiconductor chip 100, e.g. tensor-procession-unit (TPU) chip as illustrated in FIGS. 15F-15O, of the FOIT logic drive 300 and one of the memory IC chips 317, e.g., high speed, high bandwidth, wide bitwidth cache SRAM chip, DRAM IC chip, or NVM IC chip for MRAM or RRAM, with a data bit width of equal to or greater than 64, 128, 256, 512, 1024, 2048, 4096, 8K, or 16K. Alternatively, for an example of parallel signal transmission, the vertical stacked paths 587 in parallel may be arranged between one of the semiconductor chip 100, e.g. FPGA IC chip 200 in a single-die type as illustrated in FIGS. 15F-15O, of the FOIT logic drive 300 and one of the memory IC chips 317, e.g., high speed, high bandwidth, wide bitwidth cache SRAM chip, DRAM IC chip, or NVM chip for MRAM or RRAM, with a data bit width of equal to or greater than 64, 128, 256, 512, 1024, 2048, 4096, 8K, or 16K. Alternatively, for an example of parallel signal transmission, the vertical stacked paths 587 in parallel may be arranged between the FPGA IC chip 200 of one of the memory IC chips 317, as illustrated in FIGS. 15L-15O, of the FOIT logic drive 300 and one of the memory IC chips 317, e.g., high speed, high bandwidth, wide bitwidth cache SRAM chip, DRAM IC chip, or NVM chip for MRAM or RRAM, with a data bit width of equal to or greater than 64, 128, 256, 512, 1024, 2048, 4096, 8K, or 16K.

Internet or Network Between Data Centers and Users

Figure 41:
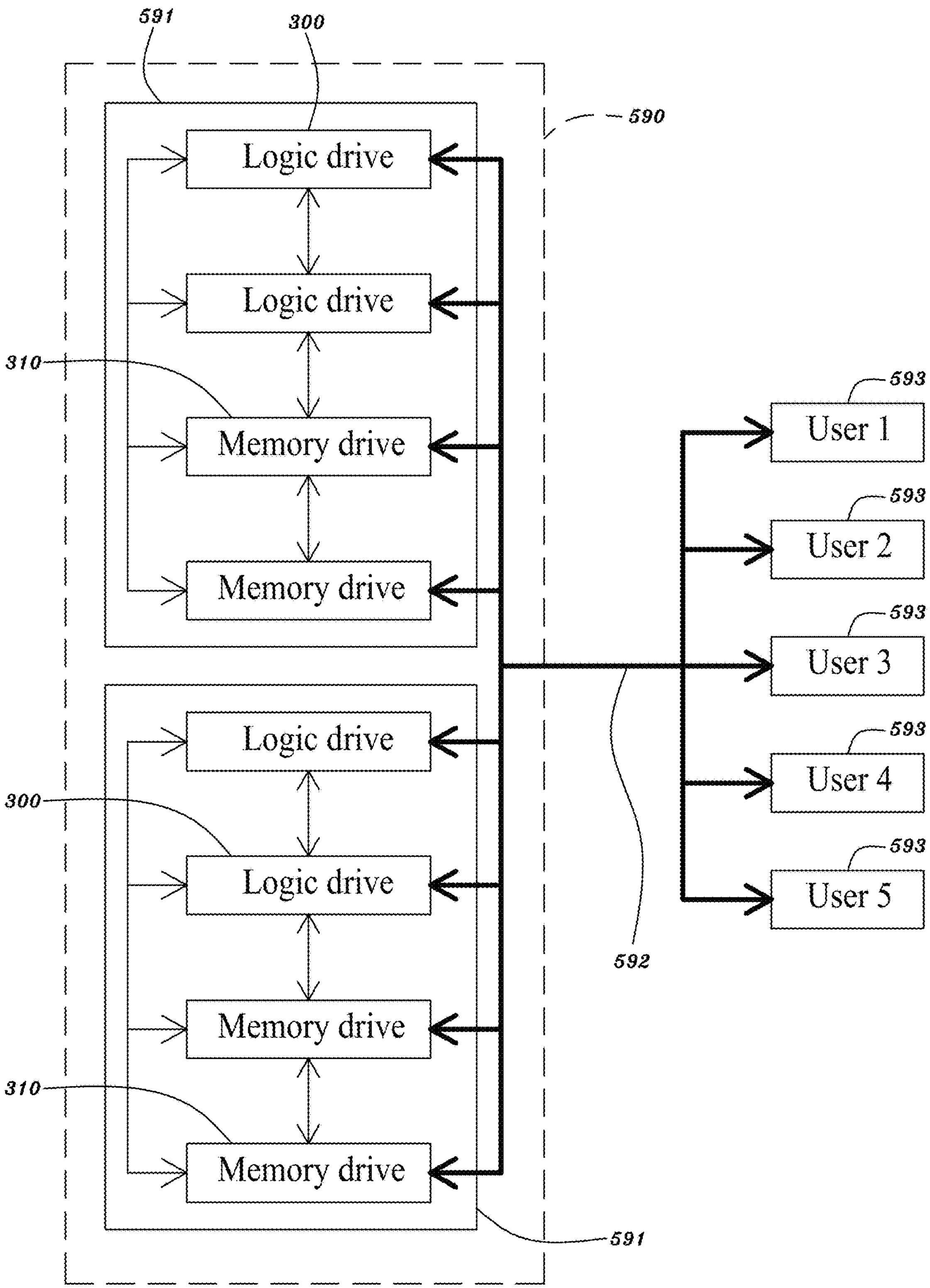
FIG. 41 is a block diagram illustrating networks between multiple data centers and multiple users in accordance with an embodiment of the present application.

FIG. 41 is a block diagram illustrating networks between multiple data centers and multiple users in accordance with an embodiment of the present application. Referring to FIG. 41, in the cloud 590 are multiple data centers 591 connected to each other or one another via the internet or networks 592. In each of the data centers 591 may be a plurality of one of the above-mentioned standard commodity logic drives 300 and/or a plurality of one of the above-mentioned memory drives 310 allowed for one or more of user devices 593, such as computers, smart phones or laptops, to offload and/or accelerate service-oriented functions of all or any combinations of functions of artificial intelligence (AI), machine learning, deep learning, big data, internet of things (IOT), industry computing, virtual reality (VR), augmented reality (AR), car electronics, graphic processing (GP), video streaming, digital signal processing (DSP), micro controlling (MC), and/or central processing (CP) when said one or more of the user devices 593 is connected via the internet or networks to the standard commodity logic drives 300 and/or memory drives 310 in one of the data centers 591 in the cloud 590. In each of the data centers 591, the standard commodity logic drives 300 may couple to each other or one another via local circuits of said each of the data centers 591 and/or the internet or networks 592 and to the memory drives 310 via local circuits of said each of the data centers 591 and/or the internet or networks 592, wherein the memory drives 310 may couple to each other or one another via local circuits of said each of the data centers 591 and/or the internet or networks 592. Accordingly, the standard commodity logic drives 300 and memory drives 310 in the data centers 591 in the cloud 590 may be used as an infrastructure-as-a-service (IaaS) resource for the user devices 593. Similarly to renting virtual memories (VMs) in a cloud, the field programmable gate arrays (FPGAs), which may be considered as virtual logics (VL), may be rented by users. In a case, each of the standard commodity logic drives 300 in one or more of the data centers 591 may include the FPGA IC chips 200 fabricated using a semiconductor IC process technology node more advanced than 28 nm technology node. A software program may be written on the user devices 593 in a common programing language, such as Java, C++, C #, Scala, Swift, Matlab, Assembly Language, Pascal, Python, Visual Basic, PL/SQL or JavaScript language. The software program may be uploaded by one of the user devices 590 via the internet or networks 592 to the cloud 590 to program the standard commodity logic drives 300 in the data centers 591 or cloud 590. The programmed logic drives 300 in the cloud 590 may be used by said one or another of the user devices 593 for an application via the internet or networks 592.

CONCLUSION AND ADVANTAGES

Accordingly, the current logic ASIC or COT IC chip business may be changed into a commodity logic IC chip business, like the current commodity DRAM, or commodity flash memory IC chip business, by using the standard commodity logic drive 300. Since the performance, power consumption, and engineering and manufacturing costs of the standard commodity logic drive 300 may be better or equal to that of the ASIC or COT IC chip for a same innovation or application, the standard commodity logic drive 300 may be used as an alternative for designing an ASIC or COT IC chip. The current logic ASIC or COT IC chip design, manufacturing and/or product companies (including fabless IC design and product companies, IC foundry or contracted manufactures (may be product-less), and/or vertically-integrated IC design, manufacturing and product companies) may become companies like the current commodity DRAM, or flash memory IC chip design, manufacturing, and/or product companies; or like the current DRAM module design, manufacturing, and/or product companies; or like the current flash memory module, flash USB stick or drive, or flash solid-state drive or disk drive design, manufacturing, and/or product companies. The current logic ASIC or COT IC chip design and/or manufacturing companies (including fabless IC design and product companies, IC foundry or contracted manufactures (may be product-less), vertically-integrated IC design, manufacturing and product companies) may become companies in the following business models: (1) designing, manufacturing, and/or selling the standard commodity FPGA IC chips 200; and/or (2) designing, manufacture, and/or selling the standard commodity logic drives 300. Aperson, user, customer, or software developer, or application developer may purchase the standard commodity logic drive 300 and write software codes to program them for his/her desired applications, for example, in applications of Artificial Intelligence (AI), machine learning, deep learning, big data, Internet Of Things (IOT), industry computing, Virtual Reality (VR), Augmented Reality (AR), car electronics, Graphic Processing (GP), Digital Signal Processing (DSP), Micro Controlling (MC), and/or Central Processing (CP). The logic drive 300 may be programed to perform functions like a graphic chip, or a baseband chip, or an Ethernet chip, or a wireless (for example, 802.11ac) chip, or an AI chip. The logic drive 300 may be alternatively programmed to perform functions of all or any combinations of functions of Artificial Intelligence (AI), machine learning, deep learning, big data, Internet Of Things (IOT), industry computing, Virtual Reality (VR), Augmented Reality (AR), car electronics, Graphic Processing (GP), Digital Signal Processing (DSP), Micro Controlling (MC), and/or Central Processing (CP).

The disclosure provides a standard commodity logic drive in a multi-chip package comprising plural FPGA IC chips and one or more non-volatile memory IC chips for use in different applications requiring logic, computing and/or processing functions by field programming. Uses of the standard commodity logic drive is analogues to uses of a standard commodity data storage solid-state disk (drive), data storage hard disk (drive), data storage floppy disk, Universal Serial Bus (USB) flash drive, USB drive, USB stick, flash-disk, or USB memory, and differs in that the latter has memory functions for data storage, while the former has logic functions for processing and/or computing.

For another aspect, in accordance with the disclosure, the standard commodity logic drive may be arranged in a hot-pluggable device to be inserted into and couple to a host device in a power-on mode such that the logic drive in the hot-pluggable device may operate with the host device.

For another aspect, the disclosure provides the method to reduce Non-Recurring Engineering (NRE) expenses for implementing an innovation or an application in semiconductor IC chips or to accelerate workload processing by using the standard commodity logic drive. A person, user, or developer with an innovation or an application concept or idea or an aim for accelerating workload processing needs to purchase the standard commodity logic drive and develops or writes software codes or programs to load into the standard commodity logic drive to implement his/her innovation or application concept or idea. Compared to the implementation by developing a logic ASIC or COT IC chip, the NRE cost may be reduced by a factor of larger than 2, 5, or 10. For advanced semiconductor technology nodes or generations (for example more advanced than or below 30 nm or 20 nm), the NRE cost for designing an ASIC or COT chip increases greatly, more than US $5M, US $10M or even exceeding US $20M, US $50M, or US $100M. The cost of a photo mask set for an ASIC or COT chip at the 16 nm technology node or generation may be over US $2M, US$5M, or US $10M. Implementing the same or similar innovation or application using the logic drive may reduce the NRE cost down to smaller than US $10M or even less than US $7M, US $5M, US $3M or US $1M. The aspect of the disclosure inspires the innovation and lowers the barrier for implementing the innovation in IC chips designed and fabricated using an advanced IC technology node or generation, for example, a technology node or generation more advanced than or below 20 nm or 10 nm.

For another aspect, the disclosure provides the method to change the current logic ASIC or COT IC chip business into a commodity logic IC chip business, like the current commodity DRAM, or commodity flash memory IC chip business, by using the standardized commodity logic drive. Since the performance, power consumption, and engineering and manufacturing costs of the standardized commodity logic drive may be better or equal to that of the ASIC or COT IC chip for a same innovation or application or an aim for accelerating workload processing, the standardized commodity logic drive may be used as an alternative for designing an ASIC or COT IC chip. The current logic ASIC or COT IC chip design, manufacturing and/or product companies (including fabless IC design and product companies, IC foundry or contracted manufactures (may be product-less), and/or vertically-integrated IC design, manufacturing and product companies) may become companies like the current commodity DRAM, or flash memory IC chip design, manufacturing, and/or product companies; or like the current DRAM module design, manufacturing, and/or product companies; or like the current flash memory module, flash USB stick or drive, or flash solid-state drive or disk drive design, manufacturing, and/or product companies. The current logic ASIC or COT IC chip design and/or manufacturing companies (including fabless IC design and product companies, IC foundry or contracted manufactures (may be product-less), vertically-integrated IC design, manufacturing and product companies) may become companies in the following business models: (1) designing, manufacturing, and/or selling the standard commodity FPGA IC chips; and/or (2) designing, manufacture, and/or selling the standard commodity logic drives. A person, user, customer, or software developer, or application developer may purchase the standardized commodity logic drive and write software codes to program them for his/her desired applications, for example, in applications of Artificial Intelligence (AI), machine learning, deep learning, big data, Internet Of Things (IOT), industry computing, Virtual Reality (VR), Augmented Reality (AR), car electronics, Graphic Processing (GP), Digital Signal Processing (DSP), Micro Controlling (MC), and/or Central Processing (CP). The logic drive may be programed to perform functions like a graphic chip, or a baseband chip, or an Ethernet chip, or a wireless (for example, 802.11ac) chip, or an AI chip. The logic drive may be alternatively programmed to perform functions of all or any combinations of functions of Artificial Intelligence (AI), machine learning, deep learning, big data, Internet Of Things (IOT), industry computing, Virtual Reality (VR), Augmented Reality (AR), car electronics, Graphic Processing (GP), Digital Signal Processing (DSP), Micro Controlling (MC), and/or Central Processing (CP).

For another aspect, the disclosure provides the method to change the logic ASIC or COT IC chip hardware business into a software business by using the standard commodity logic drive. Since the performance, power consumption, and engineering and manufacturing costs of the standard commodity logic drive may be better or equal to that of the ASIC or COT IC chip for a same innovation or application or an aim for accelerating workload processing, the current ASIC or COT IC chip design companies or suppliers may become software developers or suppliers; they may adapt the following business models: (1) become software companies to develop and sell software for their innovation or application, and let their customers to install software in the customers' own standard commodity logic drive; and/or (2) still hardware companies by selling hardware without performing ASIC or COT IC chip design and production. They may install their in-house developed software for the innovation or application in the non-volatile memory chips in the purchased standard commodity logic drive; and sell the program-installed logic drive to their customers. They may write software codes into the standard commodity logic drive (that is, loading the software codes in the non-volatile memory IC chip or chips in or of the standard commodity logic drive) for their desired applications, for example, in applications of Artificial Intelligence (AI), machine learning, Internet Of Things (IOT), industry computing, Virtual Reality (VR), Augmented Reality (AR), Graphic Processing, Digital Signal Processing, micro controlling, and/or Central Processing. A design, manufacturing, and/or product companies for a system, computer, processor, smart-phone, or electronic equipment or device may become companies to (1) design, manufacture and/or sell the standard commodity hardware comprising the memory drive and the logic drive; in this case, the companies are still hardware companies; (2) develop system and application software for users to install in the users' own standard commodity hardware; in this case, the companies become software companies; (3) install the third party's developed system and application software or programs in the standard commodity hardware and sell the software-loaded hardware; and in this case, the companies are still hardware companies.

For another aspect, the disclosure provides the method to change the current logic ASIC or COT IC chip hardware business into a network business by using the standardized commodity logic drive. Since the performance, power consumption, and engineering and manufacturing costs of the standardized commodity logic drive may be better or equal to that of the ASIC or COT IC chip for a same innovation or application or an aim for accelerating workload processing, the standardized commodity logic drive may be used as an alternative for designing an ASIC or COT IC chip. The commodity logic drive comprising standard commodity FPGA chips may be used in a datacenter or cloud in networks for innovation or application or an aim for accelerating workload processing. The commodity logic drive attached to the networks may serve to offload and accelerate service-oriented functions of all or any combinations of functions of Artificial Intelligence (AI), machine learning, deep learning, big data, Internet Of Things (IOT), industry computing, Virtual Reality (VR), Augmented Reality (AR), car electronics, Graphic Processing (GP), Video Streaming, Digital Signal Processing (DSP), Micro Controlling (MC), and/or Central Processing (CP). The commodity logic drive used in the data center or cloud in the networks offers FPGAs as an IaaS resource to cloud users. Using the commodity logic drive in the data center or cloud, users can rent FPGAs, similarly to renting Virtual Memories (VMs) in the cloud. The commodity logic drive used in the data center or cloud is the Virtual Logics (VLs) just like Virtual Memories (VMs).

For another aspect, the disclosure provides a development kit or tool for a user or developer to implement an innovation or an application using the standard commodity logic drive. The user or developer with innovation or application concept or idea may purchase the standard commodity logic drive and use the corresponding development kit or tool to develop or to write software codes or programs to load into the non-volatile memory of the standard commodity logic drive for implementing his/her innovation or application concept or idea.

Figure 42:
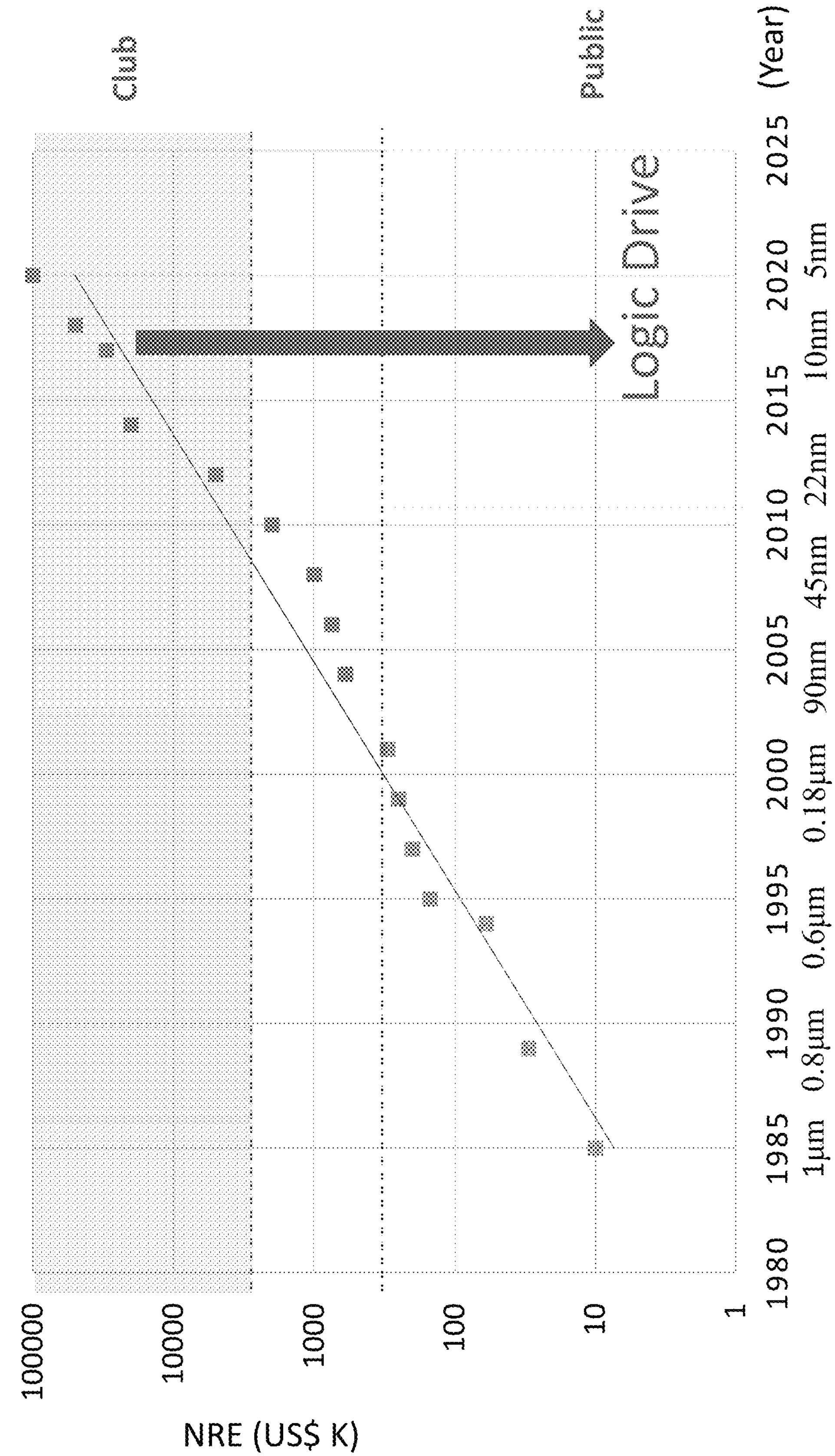
FIG. 42 is a chart showing a trend of relationship between non-recurring engineering (NRE) costs and technology nodes.

For another aspect, the disclosure provides a "public innovation platform" for innovators to easily and cheaply implement or realize their innovation in semiconductor IC chips using advanced IC technology nodes more advanced than 28 nm, for example, 20 nm, 16 nm, 10 nm, 7 nm, 5 nm or 3 nm IC technology nodes. FIG. 42 is a chart showing a trend of relationship between non-recurring engineering (NRE) costs and technology nodes. Referring to FIG. 42, in early days, 1990's, innovators could implement their innovation by designing IC chips and fabricate the IC chips in a semiconductor foundry fab using technology nodes at 1 um, 0.8 um, 0.5 um, 0.35 um, 0.18 um or 0.13 um, at a cost of about several hundred thousands of US dollars. The IC foundry fab was then the "public innovation platform". However, when IC technology nodes migrate to a technology node more advanced than 28 nm, for example, 20 nm, 16 nm, 10 nm, 7 nm, 5 nm or 3 nm IC technology nodes, only a few giant system or IC design companies, not the public innovators, can afford to use the semiconductor IC foundry fab. It costs about or over 10 million US dollars to develop and implement an IC chip using these advanced technology nodes. The semiconductor IC foundry fab is now not "public innovation platform" anymore, they are "club innovation platform" for club innovators. The concept of the disclosed logic drives, comprising standard commodity FPGA IC chips, provides public innovators "public innovation platform" back to semiconductor IC industry again; just as in 1990's. The innovators can implement or realize their innovation by using logic drives and writing software programs in common programing languages, for example, C, Java, C++, C #, Scala, Swift, Matlab, Assembly Language, Pascal, Python, Visual Basic, PL/SQL or JavaScript languages, at cost of less than 500K or 300K US dollars. The innovators can use their own commodity logic drives or they can rent logic drives in data centers or clouds through networks.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A multi-chip package comprising:

a first interconnection scheme comprising a first insulating dielectric layer, a first interconnection metal layer on the first insulating dielectric layer and a second insulating dielectric layer on the first interconnection metal layer;

a chip-on-chip package over the first interconnection scheme, wherein the chip-on-chip package comprises a first semiconductor chip over the first interconnection scheme and a second semiconductor chip over the first semiconductor chip, wherein the second semiconductor chip couples to the first semiconductor chip, wherein the first semiconductor chip comprises a first silicon substrate, a first transistor at a surface of the first silicon substrate, and a first through silicon via (TSV) in the first silicon substrate, wherein the first through silicon via (TSV) vertically extends through the first silicon substrate, wherein the first interconnection metal layer is across an edge of the chip-on-chip package, wherein the first interconnection metal layer couples to the first through silicon via (TSV);

a first polymer layer on the second insulating dielectric layer and in a space outside of the chip-on-chip package and extending in a horizontal direction from a sidewall of the chip-on-chip package, wherein the first polymer layer contacts an area of the sidewall of the chip-on-chip package, wherein the area extends upwards to a horizontal level defined by a top surface of the chip-on-chip package; and a metal post in the first polymer layer, wherein the metal post vertically extends in the first polymer layer, wherein the metal post comprises a copper layer having a thickness between 5 and 300 micrometers, wherein the metal post couples to the second semiconductor chip through, in sequence, the first interconnection metal layer and first through silicon via (TSV).

2. The multi-chip package of claim 1, wherein the first semiconductor chip further comprises a second interconnection scheme over the surface of the first silicon substrate at a top of the first silicon substrate, wherein the second interconnection scheme comprises a second interconnection metal layer over the surface of the first silicon substrate, a third interconnection metal layer over the second interconnection metal layer and a third insulating dielectric layer between the second and third interconnection metal layers, wherein the first through silicon via (TSV) couples to the second interconnection metal layer.

3. The multi-chip package of claim 2, wherein the first semiconductor chip further comprises a second through silicon via (TSV) in the first silicon substrate, wherein the second through silicon via (TSV) vertically extends through the first silicon substrate, wherein the second through silicon via (TSV) couples to the transistor through the second interconnection metal layer.

4. The multi-chip package of claim 2, wherein the first semiconductor chip further comprises a fourth insulating dielectric layer on a bottom surface of the first silicon substrate, wherein an opening in the fourth insulating dielectric layer is vertically under a bottom surface of the first through silicon via (TSV), and a metal pad on the bottom surface of the first through silicon via (TSV), in the opening and on a bottom surface of the fourth insulating dielectric layer, wherein the first interconnection metal layer couples to the metal pad.

5. The multi-chip package of claim 4, wherein the metal pad comprises a nickel layer having a thickness between 1 and 10 micrometers.

6. The multi-chip package of claim 4, wherein the metal pad comprises a copper layer having a thickness between 1 and 10 micrometers.

7. The multi-chip package of claim 1, wherein the chip-on-chip package further comprises a metal interconnect between the first and second semiconductor chips, wherein the metal interconnect comprises a solder, wherein the first through silicon via (TSV) couples to the second semiconductor chip through the metal interconnect.

8. The multi-chip package of claim 1, wherein the first interconnection scheme further comprises a metal pad on a top surface of the first interconnection metal layer under an opening in the second insulating dielectric layer, wherein the metal pad comprises a copper layer having a thickness between 1 and 10 micrometers, wherein the metal pad couples to the first through silicon via (TSV).

9. The multi-chip package of claim 1 further comprising a chip package over a top surface of the first polymer layer, the top surface of the chip-on-chip package and a top surface of the metal post, and a metal interconnect between the chip package and the top surface of the metal post, wherein the chip package couples to the metal post through the metal interconnect, wherein the metal interconnect comprises a solder.

10. The multi-chip package of claim 1 further comprising a second interconnection scheme over a top surface of the first polymer layer, the top surface of the chip-on-chip package and a top surface of the metal post, wherein the second interconnection scheme comprises a third insulating dielectric layer on the top surface of the first polymer layer and over the top surface of the chip-on-chip package, and a second interconnection metal layer on the third insulating dielectric layer and over the top surface of the chip-on-chip package, wherein an opening in the third insulating dielectric layer is over the top surface of the metal post, wherein the second interconnection metal layer couples to the metal post through the opening.

11. The multi-chip package of claim 1, wherein a top surface of the first polymer layer and the top surface of the chip-on-chip package are coplanar.

12. The multi-chip package of claim 1, wherein the first semiconductor chip is a field-programmable-gate-array (FPGA) integrated-circuit (IC) chip.

13. The multi-chip package of claim 1, wherein the second semiconductor chip is a dynamic-random-access-memory (DRAM) chip.

14. The multi-chip package of claim 1 further comprising a metal interconnect between the chip-on-chip package and the first interconnection scheme, wherein the first interconnection metal layer couples to the first through silicon via (TSV) through the metal interconnect, wherein the metal post couples to the second semiconductor chip through, in sequence, the first interconnection metal layer, metal interconnect and first through silicon via (TSV), wherein the metal interconnect comprises a solder.

15. The multi-chip package of claim 1, wherein the polymer layer comprises a molding compound.

16. A multi-chip package comprising:

a first interconnection scheme comprising a first insulating dielectric layer, a first interconnection metal layer on the first insulating dielectric layer and a second insulating dielectric layer on the first interconnection metal layer;

a chip-on-chip package over the first interconnection scheme, wherein the chip-on-chip package comprises a first semiconductor chip over the first interconnection scheme and a second semiconductor chip over the first semiconductor chip, wherein the second semiconductor chip couples to the first semiconductor chip, wherein the first interconnection metal layer is across an edge of the chip-on-chip package, wherein the first semiconductor chip comprises a first silicon substrate, a first transistor at a top surface of the first silicon substrate, a through silicon via (TSV) in the first silicon substrate and a second interconnection scheme over the top surface of the first silicon substrate, wherein the through silicon via (TSV) vertically extends through the first silicon substrate, wherein the second interconnection scheme comprises a second interconnection metal layer over the top surface of the first silicon substrate, a third interconnection metal layer over the second interconnection metal layer and a third insulating dielectric layer between the second and third interconnection metal layers, wherein the first semiconductor chip further comprises a fourth insulating dielectric layer on a bottom surface of the first silicon substrate, wherein a first opening in the fourth insulating dielectric layer is vertically under a bottom surface of the through silicon via (TSV), and a first metal pad on the bottom surface of the through silicon via (TSV), in the first opening, and on a bottom surface of the fourth insulating dielectric layer, wherein the first metal pad couples to the second interconnection metal layer through the through silicon via (TSV);

a first metal interconnect between the chip-on-chip package and the first interconnection scheme, wherein the first interconnection metal layer couples to the first metal pad through the first metal interconnect;

a first polymer layer on the second insulating dielectric layer and in a space outside of the chip-on-chip package and extending in a horizontal direction from a sidewall of the chip-on-chip package, wherein the first polymer layer contacts an area of the sidewall of the chip-on-chip package, wherein the area extends upwards to a horizontal level defined by a top surface of the chip-on-chip package; and a metal post in the first polymer layer, wherein the metal post vertically extends through in the first polymer layer, wherein the metal post comprises a copper layer having a thickness between 5 and 300 micrometers, wherein the metal post couples to the chip-on-chip package through, in sequence, the first interconnection metal layer and first metal interconnect.

17. The multi-chip package of claim 16, wherein the chip-on-chip package further comprises a second metal interconnect between the first and second semiconductor chips, wherein the second metal interconnect comprises a solder, wherein the third interconnection metal layer couples to the second semiconductor chip through the second metal interconnect.

18. The multi-chip package of claim 16, wherein the first interconnection scheme further comprises a second metal pad on a top surface of the first interconnection metal layer under a second opening in the second insulating dielectric layer, wherein the second metal pad comprises a copper layer having a thickness between 1 and 10 micrometers, wherein the second metal pad couples to the first metal pad through the first metal interconnect.

19. The multi-chip package of claim 16 further comprising a chip package over a top surface of the first polymer layer, the top surface of the chip-on-chip package and a top surface of the metal post, and a second metal interconnect between the chip package and the top surface of the metal post, wherein the chip package couples to the metal post through the second metal interconnect, wherein the second metal interconnect comprises a solder.

20. The multi-chip package of claim 16 further comprising a third interconnection scheme over a top surface of the first polymer layer, the top surface of the chip-on-chip package and a top surface of the metal post, wherein the third interconnection scheme comprises a fifth insulating dielectric layer on the top surface of the first polymer layer and over the top surface of the chip-on-chip package, and a fourth interconnection metal layer on the fifth insulating dielectric layer and over the top surface of the chip-on-chip package, wherein a second opening in the fifth insulating dielectric layer is over the top surface of the metal post, wherein the fourth interconnection metal layer couples to the metal post through the second opening.

21. The multi-chip package of claim 16, wherein the first metal pad comprises a nickel layer having a thickness between 1 and 10 micrometers.

22. The multi-chip package of claim 16, wherein the first metal pad comprises a copper layer having a thickness between 1 and 10 micrometers.

23. The multi-chip package of claim 16, wherein the first semiconductor chip is a field-programmable-gate-array (FPGA) integrated-circuit (IC) chip.

24. The multi-chip package of claim 16, wherein the second semiconductor chip is a dynamic-random-access-memory (DRAM) chip.

25. The multi-chip package of claim 16, wherein the metal post couples to the second semiconductor chip through, in sequence, the first interconnection metal layer, first metal interconnect, first metal pad, through silicon via (TSV), second interconnection metal layer and third interconnection metal layer.

26. The multi-chip package of claim 16, wherein a top surface of the first polymer layer and the top surface of the chip-on-chip package are coplanar.

27. The multi-chip package of claim 16, wherein the first polymer layer comprises a molding compound.

28. The multi-chip package of claim 16, wherein the chip-on-chip package further comprises a second polymer layer over the first semiconductor chip and in a space outside of the second semiconductor chip and extending in a horizontal direction from a sidewall of the second semiconductor chip, wherein an edge of the second polymer layer aligns, in a vertical direction, with an edge of the first semiconductor chip.

29. The multi-chip package of claim 16, wherein the second semiconductor chip comprises a second silicon substrate and a second transistor at a bottom surface of the second silicon substrate.

30. The multi-chip package of claim 16, wherein the metal post, first interconnection metal layer and first metal interconnect are connected together for use as a ground portion coupling to the through silicon via (TSV).

31. The multi-chip package of claim 30, wherein the ground portion comprises a ground bus.

32. The multi-chip package of claim 30 further comprising a metal bump under the first interconnection scheme and at a bottom of the multi-chip package, wherein the metal bump couples to the ground portion.

33. The multi-chip package of claim 30 further comprising a plurality of metal bumps under the first interconnection scheme and at a bottom of the multi-chip package, wherein the plurality of metal bumps couple to the ground portion.

34. The multi-chip package of claim 1, wherein the chip-on-chip package further comprises a second polymer layer over the first semiconductor chip and in a space outside of the second semiconductor chip and extending in a horizontal direction from a sidewall of the second semiconductor chip, wherein an edge of the second polymer layer aligns, in a vertical direction, with an edge of the first semiconductor chip.

35. The multi-chip package of claim 1, wherein the second semiconductor chip comprises a second silicon substrate and a second transistor at a bottom surface of the second silicon substrate, wherein the surface of the first silicon substrate providing the first transistor is at a top side of the first silicon substrate.

36. The multi-chip package of claim 1 further comprising a metal interconnect between the chip-on-chip package and the first interconnection scheme, wherein the first interconnection metal layer couples to the first through silicon via (TSV) through the metal interconnect, wherein the metal post couples to the second semiconductor chip through, in sequence, the first interconnection metal layer, metal interconnect and first through silicon via (TSV).

37. The multi-chip package of claim 1, wherein an opening in the second insulating dielectric layer is vertically under the metal post, wherein the first interconnection metal layer is on a bottom surface of the metal post and on a bottom surface of the second insulating dielectric layer, wherein the metal post couples to the first interconnection metal layer through the opening in the second insulating dielectric layer.

38. The multi-chip package of claim 1, wherein the metal post and first interconnection metal layer are connected together for use as a ground portion coupling to the second semiconductor chip through the first through silicon via (TSV).

39. The multi-chip package of claim 38, wherein the ground portion comprises a ground bus.

40. The multi-chip package of claim 38 further comprising a metal bump under the first interconnection scheme and at a bottom of the multi-chip package, wherein the metal bump couples to the ground portion.

41. The multi-chip package of claim 38 further comprising a plurality of metal bumps under the first interconnection scheme and at a bottom of the multi-chip package, wherein the plurality of metal bumps couple to the ground portion.

42. The multi-chip package of claim 1, wherein a top surface of the first polymer layer and a top surface of the metal post are coplanar.

43. The multi-chip package of claim 16, wherein a top surface of the first polymer layer and a top surface of the metal post are coplanar.

* * * * *